US011201299B2

(12) United States Patent
Lu et al.

(10) Patent No.: US 11,201,299 B2
(45) **Date of Patent: *Dec. 14, 2021**

(54) ORGANIC ELECTROLUMINESCENT MATERIALS AND DEVICES

(71) Applicant: Universal Display Corporation, Ewing, NJ (US)

(72) Inventors: Tongxiang (Aaron) Lu, Ewing, NJ (US); George Fitzgerald, Ewing, NJ (US); Paul M. Lahti, Ewing, NJ (US); Morgan C. MacInnis, Ewing, NJ (US); Daniel W. Silverstein, Ewing, NJ (US); Peter Wolohan, Ewing, NJ (US); Diana Drennan, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 450 days.

This patent is subject to a terminal disclaimer.

(21) Appl. No.: 15/952,797

(22) Filed: Apr. 13, 2018

(65) Prior Publication Data

US 2018/0331291 A1 Nov. 15, 2018

Related U.S. Application Data

(60) Provisional application No. 62/501,134, filed on May 4, 2017.

(51) Int. Cl.

*H01L 51/00* (2006.01)
*C09K 11/06* (2006.01)

(Continued)

(52) U.S. Cl.

CPC ........ *H01L 51/009* (2013.01); *C07F 15/0033* (2013.01); *C09K 11/025* (2013.01);

(Continued)

(58) Field of Classification Search

None

See application file for complete search history.

(56) References Cited

U.S. PATENT DOCUMENTS

| | | | |
|---|---|---|---|
| 4,769,292 | A | 9/1988 | Tang |
| 5,061,569 | A | 10/1991 | Vanslyke |

(Continued)

FOREIGN PATENT DOCUMENTS

| | | | |
|---|---|---|---|
| CN | 108137634 | A | 6/2018 |
| EP | 0650955 | | 5/1995 |

(Continued)

OTHER PUBLICATIONS

Machine translation of JP-2008013616, translation generated May 2020, 101 pages. (Year: 2020).*

(Continued)

*Primary Examiner* — Robert S Loewe

(74) *Attorney, Agent, or Firm* — Riverside Law LLP

(57) ABSTRACT

The present invention includes novel heterocyclic materials for use as blue phosphorescent materials in OLED devices. The novel materials include two fused 5-membered aromatic or pseudoaromatic rings, which are bonded with 6 membered aromatic rings to serve as chelation ligands for a transition metal. The novel materials were determined computationally to have appropriate triplet energies for use as blue emitters and to possess sufficient chemical stability for use in devices.

20 Claims, 2 Drawing Sheets

(51) Int. Cl.

| | |
|---|---|
| ***C09K 11/02*** | (2006.01) |
| ***C07F 15/00*** | (2006.01) |
| *H01L 51/50* | (2006.01) |

(52) U.S. Cl.

CPC .......... *C09K 11/06* (2013.01); *H01L 51/0052* (2013.01); *H01L 51/0054* (2013.01); *H01L 51/0058* (2013.01); *H01L 51/0067* (2013.01); *H01L 51/0071* (2013.01); *H01L 51/0072* (2013.01); *H01L 51/0074* (2013.01); *H01L 51/0085* (2013.01); *H01L 51/0087* (2013.01); *H01L 51/0088* (2013.01); *H01L 51/0091* (2013.01); *C09K 2211/1051* (2013.01); *C09K 2211/185* (2013.01); *H01L 51/5004* (2013.01); *H01L 51/5016* (2013.01); *H01L 51/5056* (2013.01); *H01L 51/5072* (2013.01); *H01L 51/5088* (2013.01); *H01L 51/5096* (2013.01); *H01L 2251/552* (2013.01)

(56) References Cited

U.S. PATENT DOCUMENTS

| | | | | |
|---|---|---|---|---|
| 5,247,190 | A | 9/1993 | Friend | |
| 5,703,436 | A | 12/1997 | Forrest | |
| 5,707,745 | A | 1/1998 | Forrest | |
| 5,834,893 | A | 11/1998 | Bulovic | |
| 5,844,363 | A | 12/1998 | Gong | |
| 6,013,982 | A | 1/2000 | Thompson | |
| 6,087,196 | A | 7/2000 | Sturm | |
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 6,528,187 | B1 | 3/2003 | Okada | |
| 6,687,266 | B1 | 2/2004 | Ma | |
| 6,835,469 | B2 | 12/2004 | Kwong | |
| 6,921,915 | B2 | 7/2005 | Takiguchi | |
| 7,087,321 | B2 | 8/2006 | Kwong | |
| 7,090,928 | B2 | 8/2006 | Thompson | |
| 7,154,114 | B2 | 12/2006 | Brooks | |
| 7,250,226 | B2 | 7/2007 | Tokito | |
| 7,279,704 | B2 | 10/2007 | Walters | |
| 7,332,232 | B2 | 2/2008 | Ma | |
| 7,338,722 | B2 | 3/2008 | Thompson | |
| 7,393,599 | B2 | 7/2008 | Thompson | |
| 7,396,598 | B2 | 7/2008 | Takeuchi | |
| 7,431,968 | B1 | 10/2008 | Shtein | |
| 7,445,855 | B2 | 11/2008 | Mackenzie | |
| 7,534,505 | B2 | 5/2009 | Lin | |
| 7,968,146 | B2 | 6/2011 | Wagner | |
| 8,409,729 | B2 | 4/2013 | Zeng | |
| 2002/0034656 | A1 | 3/2002 | Thompson | |
| 2002/0134984 | A1 | 9/2002 | Igarashi | |
| 2002/0158242 | A1 | 10/2002 | Son | |
| 2003/0138657 | A1 | 7/2003 | Li | |
| 2003/0152802 | A1 | 8/2003 | Tsuboyama | |
| 2003/0162053 | A1 | 8/2003 | Marks | |
| 2003/0175553 | A1 | 9/2003 | Thompson | |
| 2003/0230980 | A1 | 12/2003 | Forrest | |
| 2004/0036077 | A1 | 2/2004 | Ise | |
| 2004/0137267 | A1 | 7/2004 | Igarashi | |
| 2004/0137268 | A1 | 7/2004 | Igarashi | |
| 2004/0174116 | A1 | 9/2004 | Lu | |
| 2005/0025993 | A1 | 2/2005 | Thompson | |
| 2005/0112407 | A1 | 5/2005 | Ogasawara | |
| 2005/0238919 | A1 | 10/2005 | Ogasawara | |
| 2005/0244673 | A1 | 11/2005 | Satoh | |
| 2005/0260441 | A1 | 11/2005 | Thompson | |
| 2005/0260449 | A1 | 11/2005 | Walters | |
| 2006/0008670 | A1 | 1/2006 | Lin | |
| 2006/0202194 | A1 | 9/2006 | Jeong | |
| 2006/0240279 | A1 | 10/2006 | Adamovich | |
| 2006/0251923 | A1 | 11/2006 | Lin | |
| 2006/0263635 | A1 | 11/2006 | Ise | |
| 2006/0280965 | A1 | 12/2006 | Kwong | |
| 2007/0190359 | A1 | 8/2007 | Knowles | |
| 2007/0278938 | A1 | 12/2007 | Yabunouchi | |
| 2008/0015355 | A1 | 1/2008 | Schafer | |
| 2008/0018221 | A1 | 1/2008 | Egen | |
| 2008/0106190 | A1 | 5/2008 | Yabunouchi | |
| 2008/0124572 | A1 | 5/2008 | Mizuki | |
| 2008/0220265 | A1 | 9/2008 | Xia | |
| 2008/0297033 | A1 | 12/2008 | Knowles | |
| 2009/0008605 | A1 | 1/2009 | Kawamura | |
| 2009/0009065 | A1 | 1/2009 | Nishimura | |
| 2009/0017330 | A1 | 1/2009 | Iwakuma | |
| 2009/0030202 | A1 | 1/2009 | Iwakuma | |
| 2009/0039776 | A1 | 2/2009 | Yamada | |
| 2009/0045730 | A1 | 2/2009 | Nishimura | |
| 2009/0045731 | A1 | 2/2009 | Nishimura | |
| 2009/0101870 | A1 | 4/2009 | Prakash | |
| 2009/0108737 | A1 | 4/2009 | Kwong | |
| 2009/0115316 | A1 | 5/2009 | Zheng | |
| 2009/0165846 | A1 | 7/2009 | Johannes | |
| 2009/0167162 | A1 | 7/2009 | Lin | |
| 2009/0179554 | A1 | 7/2009 | Kuma | |
| 2013/0026452 | A1 | 1/2013 | Kottas | |
| 2013/0119354 | A1 | 5/2013 | Ma | |
| 2014/0054564 | A1 | 2/2014 | Kim | |
| 2014/0097406 | A1 * | 4/2014 | Cheon | H01L 51/0005 257/40 |
| 2015/0105556 | A1 | 4/2015 | Li | |
| 2015/0318487 | A1 | 11/2015 | Ito | |
| 2017/0040552 | A1 * | 2/2017 | Xia | H05B 33/14 |
| 2019/0241590 | A1 * | 8/2019 | Shi | C09D 11/03 |

FOREIGN PATENT DOCUMENTS

| | | | | | |
|---|---|---|---|---|---|
| EP | 1238981 | | | 9/2002 | |
| EP | 1725079 | | | 11/2006 | |
| EP | 2034538 | | | 3/2009 | |
| EP | 2551932 | | | 1/2013 | |
| EP | 2977378 | | | 1/2016 | |
| JP | 200511610 | | | 1/2005 | |
| JP | 2007123392 | | | 5/2007 | |
| JP | 2007254297 | | | 10/2007 | |
| JP | 2008013616 | A | * | 1/2008 | C09K 11/06 |
| JP | 2008013616 | A | | 1/2008 | |
| JP | 2008074939 | A | | 4/2008 | |
| JP | 2009076624 | A | * | 4/2009 | H01L 51/50 |
| JP | 2009076826 | | | 4/2009 | |
| JP | 2009076826 | A | * | 4/2009 | H01L 51/50 |
| JP | 2010135467 | | | 6/2010 | |
| JP | 2012164731 | A | * | 8/2012 | H01L 51/50 |
| JP | 2012240952 | | | 12/2012 | |
| JP | 6319096 | | * | 11/2013 | H01L 51/50 |
| WO | 0139234 | | | 5/2001 | |
| WO | 0202714 | | | 1/2002 | |
| WO | 0215645 | | | 2/2002 | |
| WO | 03040257 | | | 5/2003 | |
| WO | 03060956 | | | 7/2003 | |
| WO | 2004093207 | | | 10/2004 | |
| WO | 2004107822 | | | 12/2004 | |
| WO | 2004111066 | | | 12/2004 | |
| WO | 2005014551 | | | 2/2005 | |
| WO | 2005019373 | | | 3/2005 | |
| WO | 2005030900 | | | 4/2005 | |
| WO | 2005089025 | | | 9/2005 | |
| WO | 2005123873 | | | 12/2005 | |
| WO | 2006009024 | | | 1/2006 | |
| WO | 2006056418 | | | 6/2006 | |
| WO | 2006072002 | | | 7/2006 | |
| WO | 2006082742 | | | 8/2006 | |
| WO | 2006098120 | | | 9/2006 | |
| WO | 2006100298 | | | 9/2006 | |
| WO | 2006103874 | | | 10/2006 | |
| WO | 2006114966 | | | 11/2006 | |
| WO | 2006132173 | | | 12/2006 | |
| WO | 2007002683 | | | 1/2007 | |
| WO | 2007004380 | | | 1/2007 | |
| WO | 2007063754 | | | 6/2007 | |

(56) References Cited

FOREIGN PATENT DOCUMENTS

| | | | |
|---|---|---|---|
| WO | 2007063796 | 6/2007 | |
| WO | 2008044723 | 4/2008 | |
| WO | 2008056746 | 5/2008 | |
| WO | 2008057394 | 5/2008 | |
| WO | 2008101842 | 8/2008 | |
| WO | 2008132085 | 11/2008 | |
| WO | 2009000673 | 12/2008 | |
| WO | 2009003898 | 1/2009 | |
| WO | 2009008311 | 1/2009 | |
| WO | 2009018009 | 2/2009 | |
| WO | 2009021126 A2 | 2/2009 | |
| WO | 2009050290 | 4/2009 | |
| WO | 2009062578 | 5/2009 | |
| WO | 2009063833 | 5/2009 | |
| WO | 2009066778 | 5/2009 | |
| WO | 2009066779 | 5/2009 | |
| WO | 2009086028 | 7/2009 | |
| WO | 2009100991 | 8/2009 | |
| WO | 2010011390 | 1/2010 | |
| WO | 2010086089 | 8/2010 | |
| WO | 2010111175 | 9/2010 | |
| WO | 2010126234 | 11/2010 | |
| WO | 2014097865 A1 | 6/2014 | |
| WO | 2014156922 | 10/2014 | |
| WO | 2015087739 | 6/2015 | |
| WO | 2015199628 | 12/2015 | |
| WO | WO-2017092545 A1 * | 6/2017 | ............ C09D 11/30 |

OTHER PUBLICATIONS

Machine translation of JP-6319096, translation generated May 2020, 90 pages. (Year: 2020).*
Mitsumori et al. "Synthesis, properties, and LED performance of higly luminscent metal complexes containing indolizino[3,4,5-ab] isoindoles" J. Mater. Chem. 2009, 19, 5826-5836. (Year: 2009).*
Machine translation of JP-2009076624, translation generated Sep. 2020, 113 pages. (Year: 2020).*
Machine translation of JP-2009076826, translation generated Dec. 2020, 47 pages. (Year: 2020).*
Wong, Wai-Yeung, "Multifunctional Iridium Complexes Based on Carbazole Modules as Highly Efficient Electrophosphors," Angew. Chern. Int. Ed., 45:7800-7803 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode: an Isoindole Derivative," Chem. Mater., 15(16):3148-3151 (2003).
Okumoto, Kenji et al., "Green Fluorescent Organic Light-Emitting Device with External Quantum Efficiency of Nearly 10%," Appl. Phys. Lett., 89:063504-1-063504-3 (2006).
Paulose, Betty Marie Jennifer S, et al., "First Examples of Alkenyl Pyridines as Organic Ligands for Phosphorescent Iridium Complexes," Adv. Mater., 16(22):2003-2007 (2004).
Tang, C.W. and VanSlyke, S.A., "Organic Electroluminescent Diodes," Appl. Phys. Lett., 51(12):913-915 (1987).
T. Ostergard et al., "Langmuir-Blodgett Light-Emitting Diodes Of Poly(3-Hexylthiophene): Electro-Optical Characteristics Related to Structure," Synthetic Metals, 87:171-177 (1997).
Tung, Yung-Liang et al., "Organic Light-Emitting Diodes Based on Charge-Neutral Ru II PHosphorescent Emitters," Adv. Mater., 17(8):1059-1064 (2005).
Van Slyke, S. A. et al., "Organic Electroluminescent Devices with Improved Stability," Appl. Phys. Lett, 69(15 ):2160-2162 (1996).
Wong, Keith Man-Chung et al., "A Novel Class of Phosphorescent Gold(III) Alkynyl-Based Organic Light-Emitting Devices with Tunable Colour," Chem. Commun., 2906-2908 (2005).
Adachi, Chihaya et al., "Organic Electroluminescent Device Having a Hole Conductor as an Emitting Layer," Appl. Phys. Lett., 55(15):1489-1491 (1989).
Baldo et al., "Highly Efficient Phosphorescent Emission from Organic Electroluminescent Devices," Nature, vol. 395,151-154, (1998).
Gao, Zhiqiang et al., "Bright-Blue Electroluminescence From a Silyl-Substituted ter-(phenylene-vinylene) derivative," Appl. Phys. Lett., 74(6):865-867 (1999).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Wang, Y. et al., "Highly Efficient Electroluminescent Materials Based on Fluorinated Organometallic Iridium Compounds," Appl. Phys. Lett., 79(4):449-451 (2001).
Kwong, Raymond C et al., "High Operational Stability of Electrophosphorescent Devices," Appl. Phys. Lett., 81 (1):162-164 (2002).
Holmes, R.J. et al., "Blue Organic Electrophosphorescence Using Exothermic Host-Guest Energy Transfer," Appl. Phys. Lett., 82(15):2422-2424 (2003).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Sun, Yiru and FORREST, Stephen R., "High-Efficiency White Organic Light Emitting Devices with Three Separate Phosphorescent Emission Layers," Appl. Phys. Lett., 91:263503-1-263503-3 (2007).
Adachi, Chihaya et al., "High-Efficiency Red Electrophosphorescence Devices," Appl. Phys. Lett., 78(11):1622-1624 (2001).
Hamada, Yuji et al., "High Luminance in Organic Electroluminescent Devices with Bis(10-hydroxybenzo[h]quinolinato)beryllium as an Emitter," Chem. Lett., 905-906 (1993).
Nishida, Jun-ichi et al., "Preparation, Characterization, and Electroluminescence Characteristics of a-Diimine-type Platinum(II) Complexes with Perfluorinated Phenyl Groups as Ligands," Chem. Lett., 34(4):592-593 (2005).
Baldo et al., "Very high-efficiency green organic light-emitting devices based on electrophosphorescence," Appl. Phys. Lett., vol. 75, No. 3, 4-6 (1999).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Niu, Yu-Hua et al., "Highly Efficient Electrophosphorescent Devices with Saturated Red Emission from a Neutral Osmium Complex," Chem. Mater., 17(13):3532-3536 (2005).
Lo, Shih-Chun et al., "Blue Phosphorescence from Iridium(III) Complexes at Room Temperature," Chem. Mater., 18(21):5119-5129 (2006).
Takizawa, Shin-ya et al., "Phosphorescent Iridium Complexes Based on 2-Phenylimidazo[1,2-a]pyridine Ligands: Tuning of Emission Color toward the Blue Region and Application to Polymer Light-Emitting Devices," Inorg. Chem., 46(10):4308-4319 (2007).
Lamansky, Sergey et al., "Synthesis and Characterization of Phosphorescent Cyclometalated Iridium Complexes," Inorg. Chem., 40(7):1704-1711 (2001).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Noda, Tetsuya and Shirota,Yasuhiko, "5,6-Bis(dinnesitylboryl)-2,2'-bithiophene and 5,5"-Bis(dimesitylbory1)-2,2':5',2"-terthiophene as a Novel Family of Electron-Transporting Amorphous Molecular Materials," J. Am. Chem. Soc., 120 (37):9714-9715 (1998).
Sakamoto, Youichi et al., "Synthesis, Characterization, and Electron-Transport Property of Perfluorinated Phenylene Dendrimers," J. Am. Chem. Soc., 122(8):1832-1833 (2000).
Adachi, Chihaya et al., "Nearly 100% Internal Phosphorescence Efficiency in an Organic Light Emitting Device," J. Appl. Phys., 90(10):5048-5051 (2001).

(56) References Cited

OTHER PUBLICATIONS

Shirota, Yasuhiko et al., "Starburst Molecules Based on p-Electron Systems as Materials for Organic Electroluminescent Devices," Journal of Luminescence, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kido, Junji et al.,"1,2,4-Triazole Derivative as an Electron Transport Layer in Organic Electroluminescent Devices," Jpn. J. Appl. Phys., 32:L917-L920 (1993).

Guo, Tzung-Fang et al., "Highly Efficient Electrophosphorescent Polymer Light-Emitting Devices," Organic Electronics, 1:15-20 (2000).

Palilis, Leonidas C., "High Efficiency Molecular Organic Light-Emitting Diodes Based On Silole Derivatives And Their Exciplexes," Organic Electronics, 4:113-121 (2003).

Ikeda, Hisao et al., "P-185: Low-Drive-Voltage OLEDs with a Buffer Layer Having Molybdenum Oxide," SID Symposium Digest, 37:923-926 (2006).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Salbeck, J. et al., "Low Molecular Organic Glasses for Blue Electroluminescence," Synthetic Metals, 91:209-215 (1997).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Hung, L.S. et al., "Anode Modification in Organic Light-Emitting Diodes by Low-Frequency Plasma Polymerization of CHF3,"Appl. Phys. Lett., 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

* cited by examiner

ORGANIC ELECTROLUMINESCENT MATERIALS AND DEVICES

CROSS-REFERENCE TO RELATED APPLICATIONS

This application claims priority to U.S. Patent Application Ser. No. 62/501,134, filed May 4, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

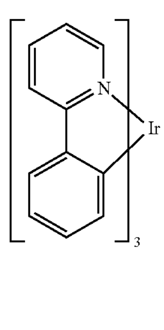

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

There is a need in the art for novel heterocyclic materials for use as blue phosphorescent materials in OLED devices. The present invention addresses this need in the art.

SUMMARY

According to an embodiment, a compound is provided that has the structure of Formula I shown below:

Formula I

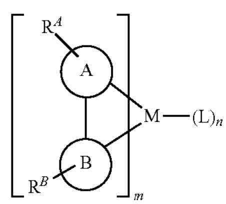

wherein A is a fused ring system comprising a six-membered ring, which is fused to a five-membered ring, wherein the five-membered ring is fused to a second five-membered ring;

wherein B is a five-membered or six-membered carbocyclic or heterocyclic ring;

wherein A and B are connected by a single bond;

wherein each $R^A$ and $R^B$ independently represents mono to the possible maximum number of substitution, or no substitution;

wherein each $R^A$ and $R^B$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein M is a metal having an atomic weight greater than 40;

wherein A is coordinated to M by a non-carbene dative bond;

wherein B is coordinated to M by a polar covalent bond;

wherein M is bonded to one of the five-membered rings of A;

wherein L is a substituted or unsubstituted cyclometalated ligand, and each L can be the same or different; and wherein m is at least 1, and m+n is the maximum number of ligands that may be attached to M.

According to another embodiment, an organic light emitting diode/device (OLED) is also provided. The OLED can include an anode, a cathode, and an organic layer, disposed between the anode and the cathode. The organic layer can include a compound of Formula I. According to yet another embodiment, the organic light emitting device is incorporated into one or more devices selected from a consumer product, an electronic component module, and/or a lighting panel.

According to yet another embodiment, a formulation containing a compound of Formula I is provided.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
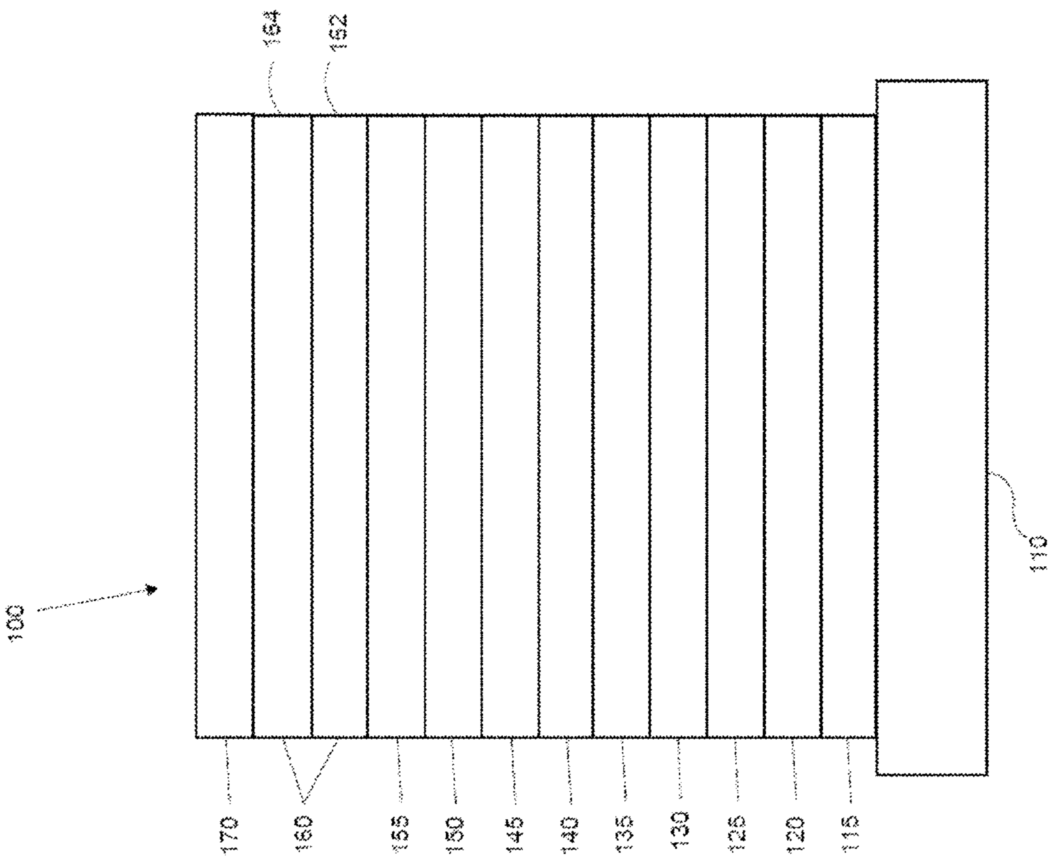
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
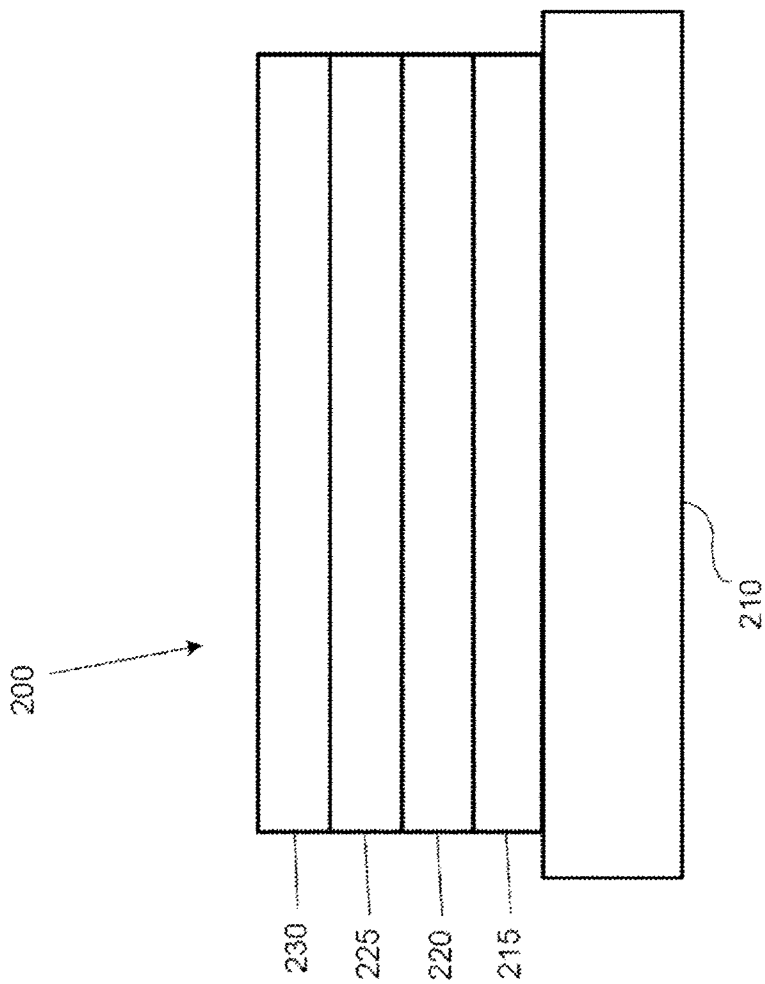
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

Compounds of the Invention

The present invention includes novel heterocyclic materials for use as blue phosphorescent materials in OLED devices. The novel materials include two fused 5-membered aromatic or pseudoaromatic rings, which are bonded with 6 membered aromatic rings to serve as chelation ligands for a transition metal. The novel materials were determined computationally to have appropriate triplet energies for use as blue emitters and to possess sufficient chemical stability for use in devices.

In one aspect, the present invention includes a compound of Formula I:

Formula I

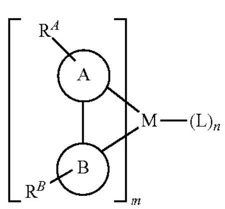

wherein A is a fused ring system comprising a six-membered ring, which is fused to a five-membered ring, wherein the five-membered ring is fused to a second five-membered ring;

wherein B is a five-membered or six-membered carbocyclic or heterocyclic ring;

wherein A and B are connected by a single bond;

wherein each $R^A$ and $R^B$ independently represents mono to the possible maximum number of substitution, or no substitution;

wherein each $R^A$ and $R^B$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein M is a metal having an atomic weight greater than 40;

wherein A is coordinated to M by a non-carbene dative bond;

wherein B is coordinated to M by a polar covalent bond;

wherein M is bonded to one of the five-membered rings of A;

wherein L is a substituted or unsubstituted cyclometalated ligand, and each L can be the same or different; and wherein m is at least 1, and m+n is the maximum number of ligands that may be attached to M.

In one embodiment, each $R^A$ and $R^B$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

In one embodiment, B is a six-membered aromatic ring. In one embodiment, B is benzene.

In one embodiment, M is selected from the group consisting of Ir, Rh, Re, Ru, Os, Pt, Au, and Cu. In one embodiment, M is Ir or Pt.

In one embodiment, the compound is homoleptic. In one embodiment, the compound is heteroleptic.

In one embodiment, the M-fused ring system is selected from the group consisting of:

I

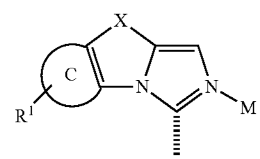

II

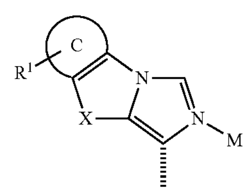

III

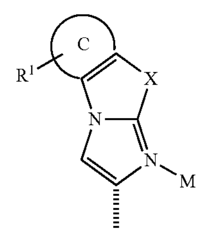

IV

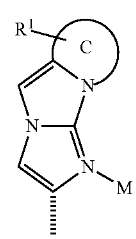

V

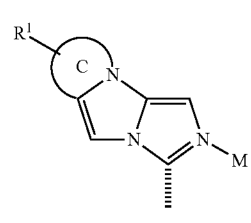

-continued

VI

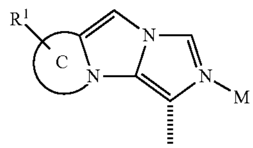

VII

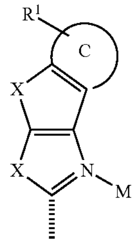

VIII

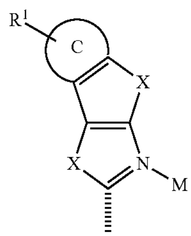

IX

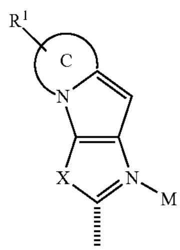

X

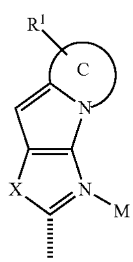

XI

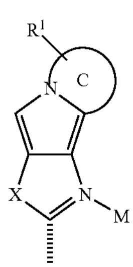

-continued

XII

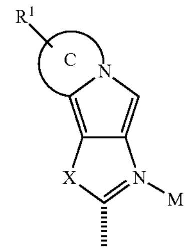

XIII

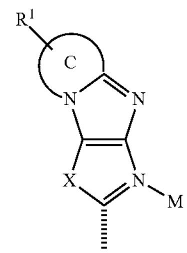

and

XIV

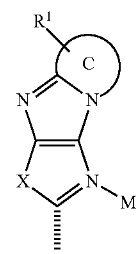

wherein C is a six-membered aromatic ring;

wherein $R^1$ represent mono to the maximum possible number of substitution, or no substitution;

wherein each X is independently selected from the group consisting of O, S, Se, NR, CRR', SiRR', BR, and PR;

wherein $R^1$, R, and R' are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein any adjacent substituents in $R^1$, R, and R' are optionally joined or fused to form a ring; and wherein the dashed line represents the bond to ring B.

In one embodiment, each $R^1$, R, and R' is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

In one embodiment, X is NR. In one embodiment, X is selected from the group consisting of O, S, and Se. In one embodiment, X is selected from the group consisting of CRR', SiRR', BR, and PR.

In one embodiment, ring C comprises at least five carbons.

In one embodiment, the compound comprises a structure selected from the group consisting of:

-continued
L1
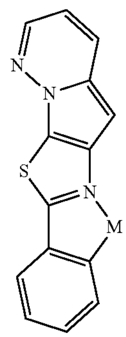
L2
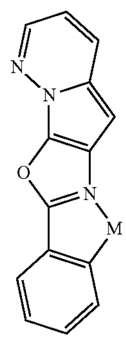
L3
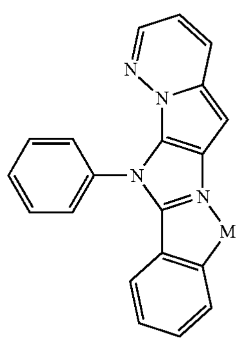
L4
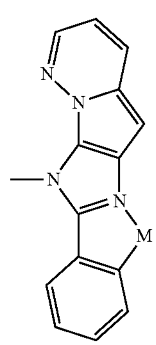
L5
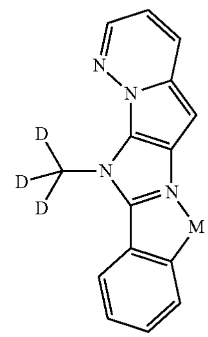
L6
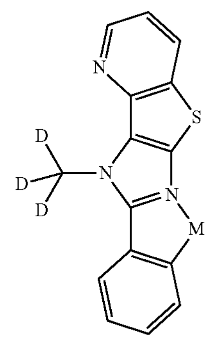
L7
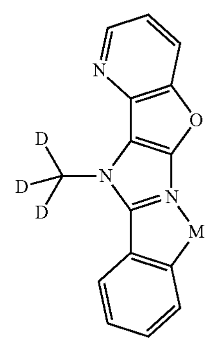
L8
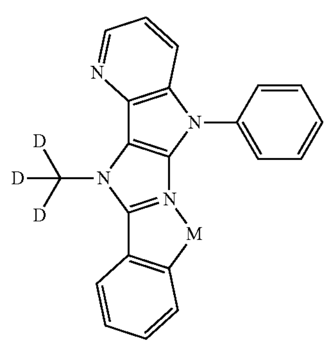

-continued
L9
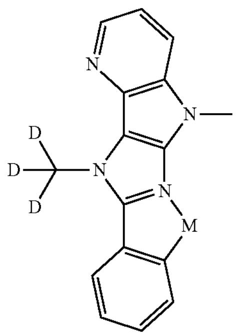
L10
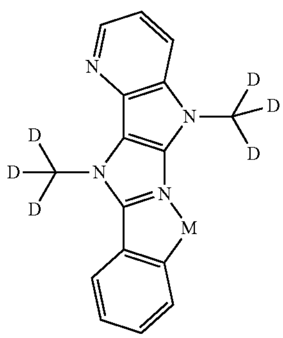
L11
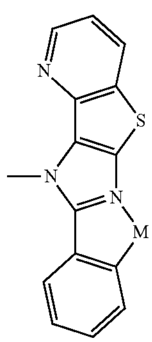
L12
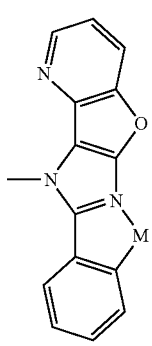
-continued
L13
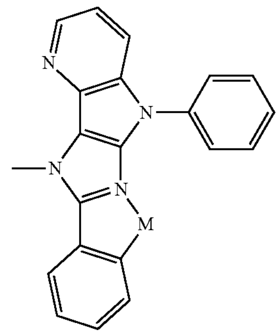
L14
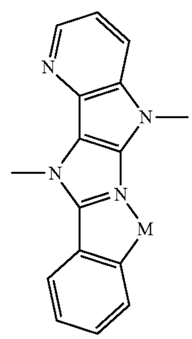
L15
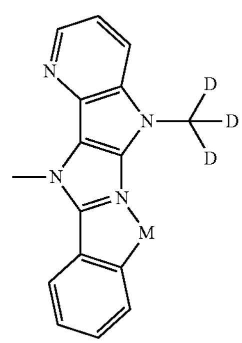
L16
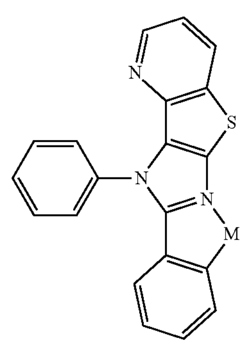

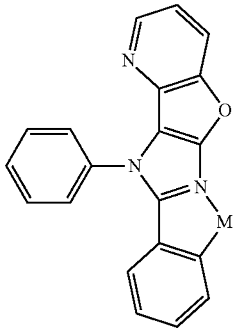
L17
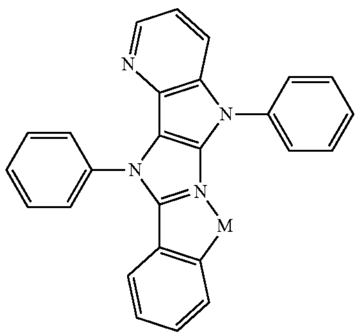
L18
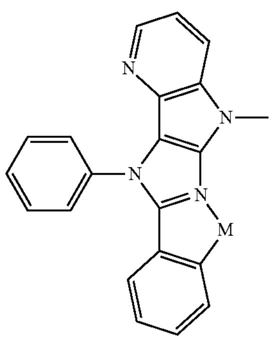
L19
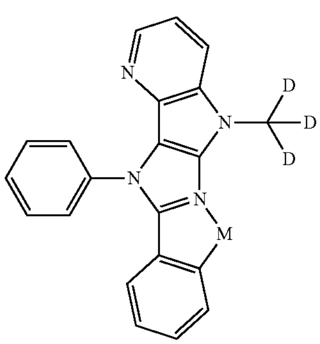
L20
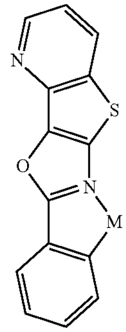
L21
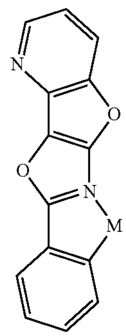
L22
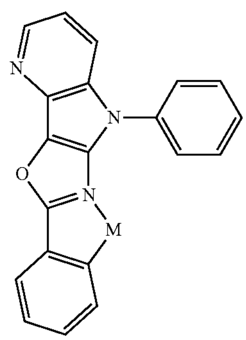
L23
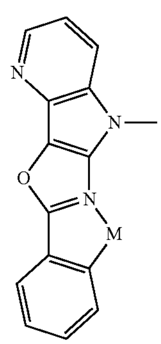
L24

-continued
L25
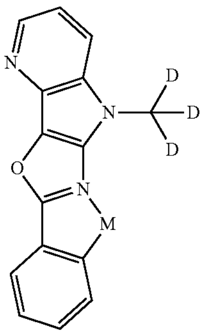
L26
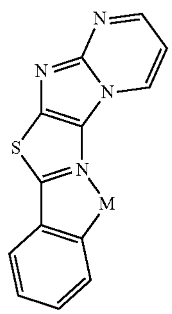
L27
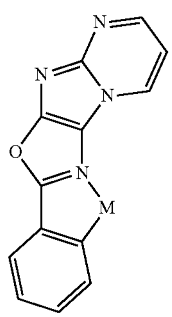
L28
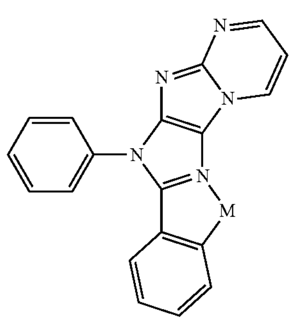
L29
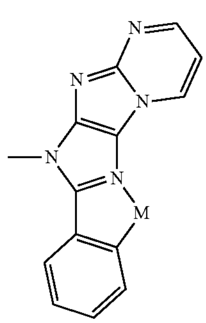
-continued
L30
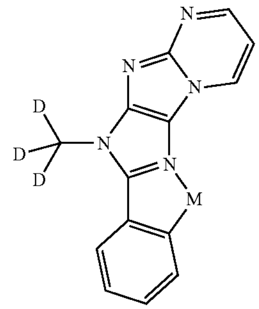
L31
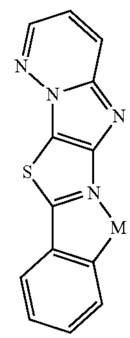
L32
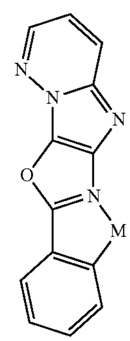
L33
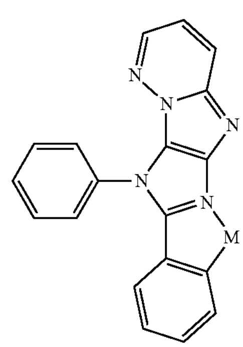

-continued
L34
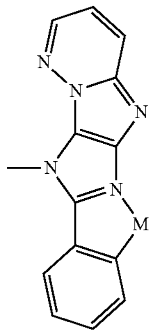
L35
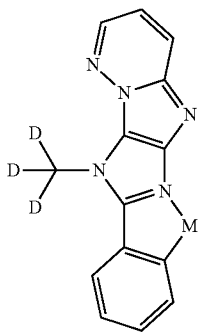
L36
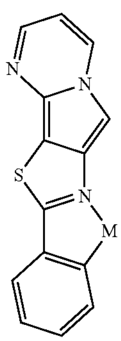
L37
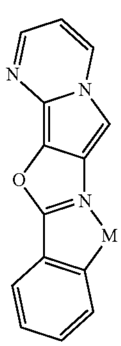
-continued
L38
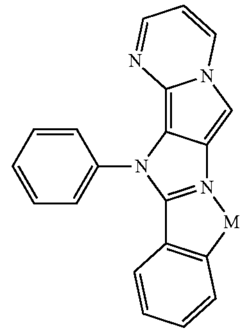
L39
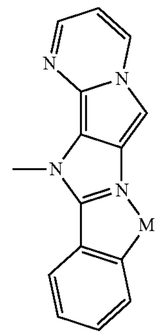
L40
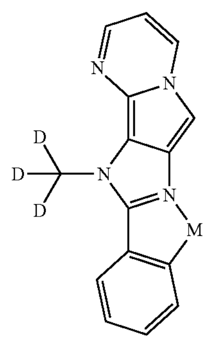
L41
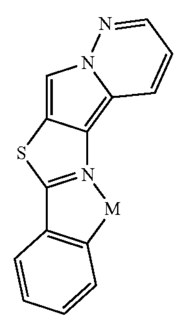
L42
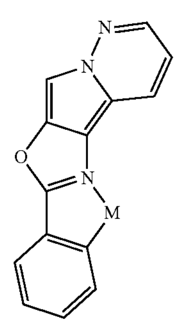

-continued
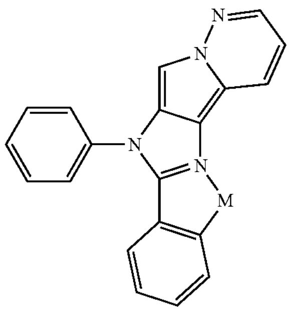
L43
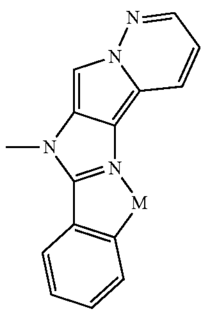
L44
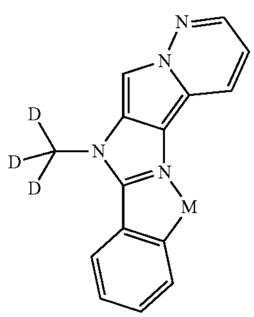
L45
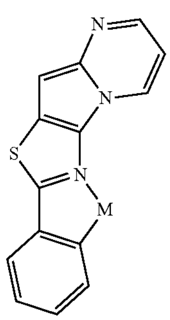
L46
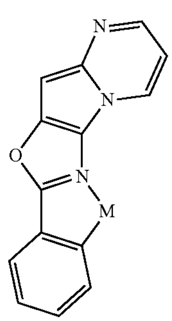
L47
-continued
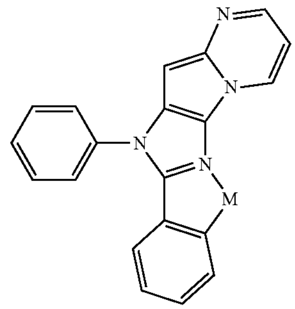
L48
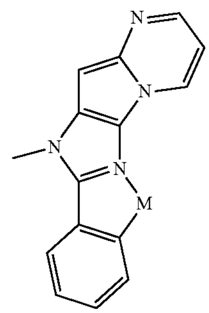
L49
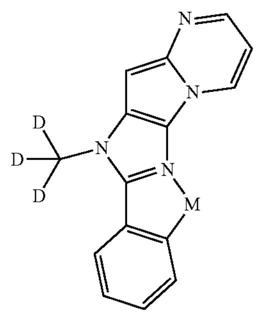
L50
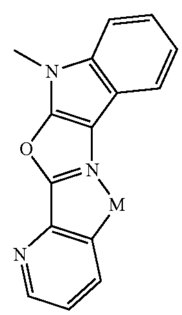
L51
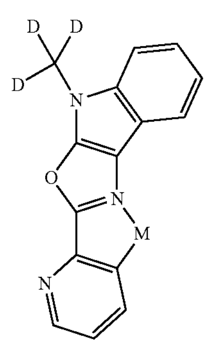
L52

-continued
L53
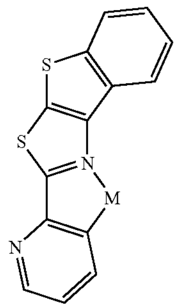
L54
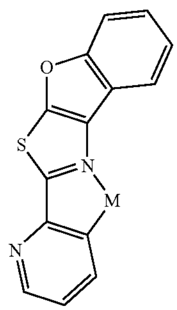
L55
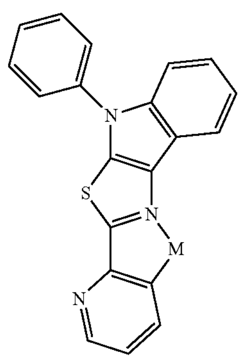
L56
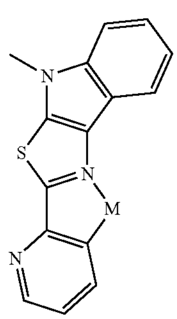
L57
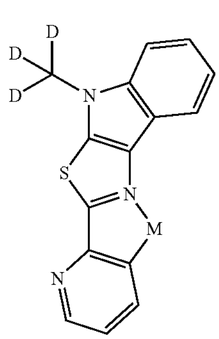
-continued
L58
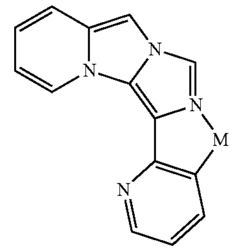
L59
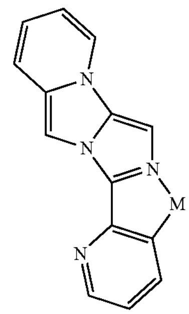
L60
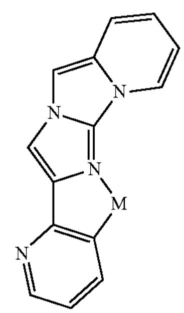
L61
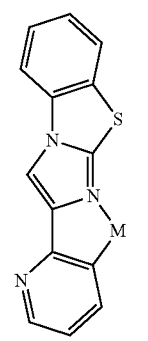
L62
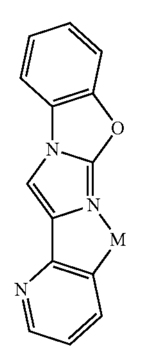

-continued
L63
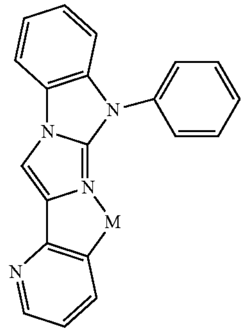
L64
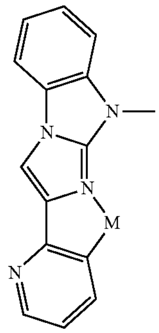
L65
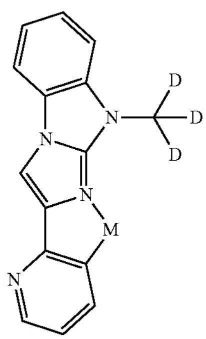
L66
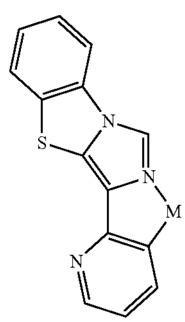
L67
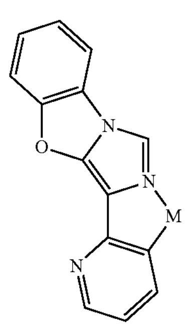
-continued
L68
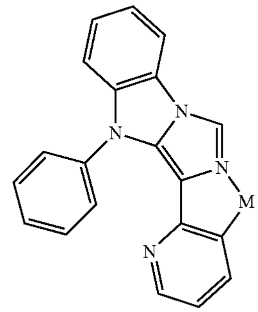
L69
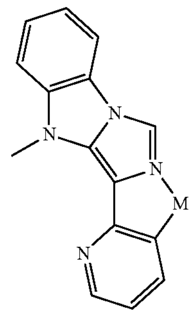
L70
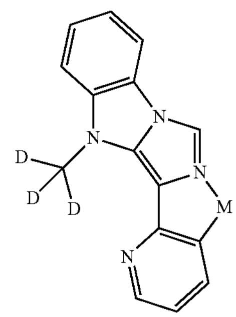
L71
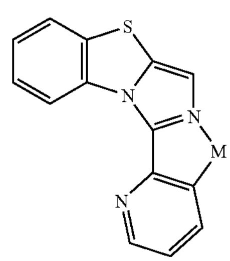
L72
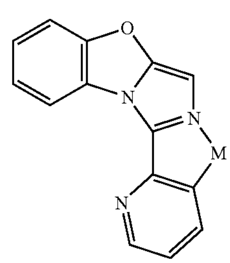

-continued
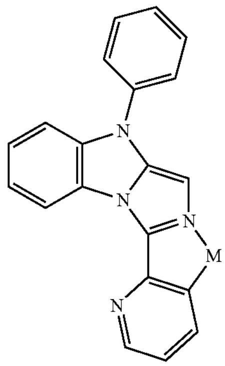
L73
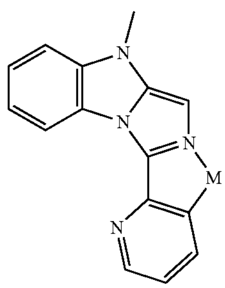
L74
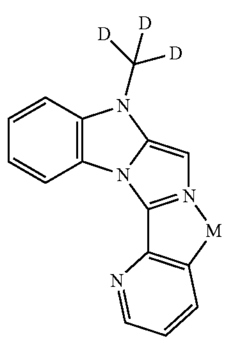
L75
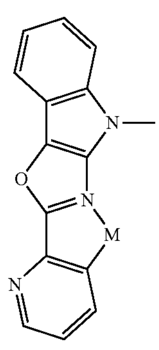
L76
-continued
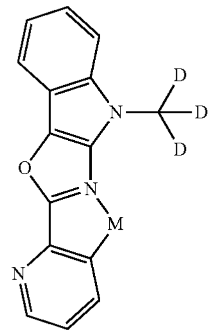
L77
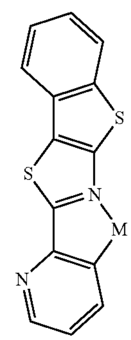
L78
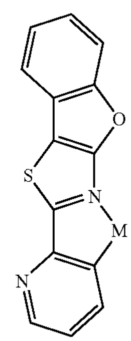
L79
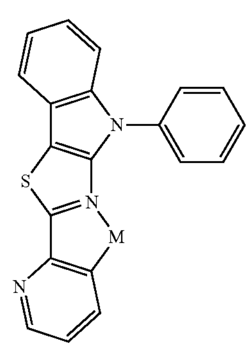
L80

-continued
L81
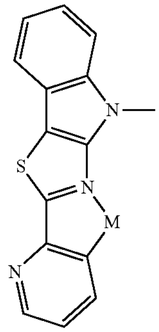
L82
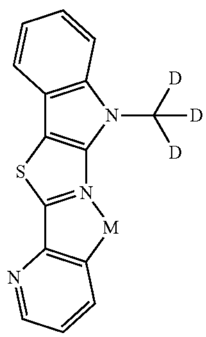
L83
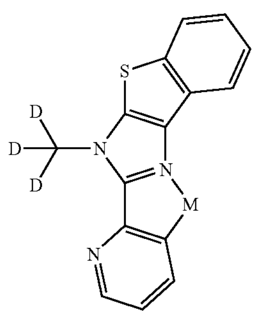
L84
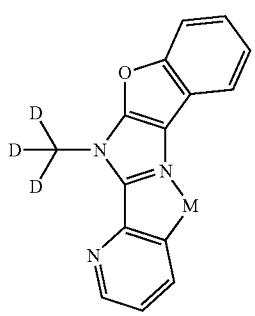
L85
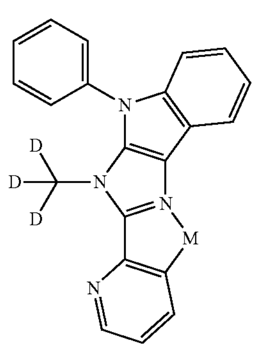
-continued
L86
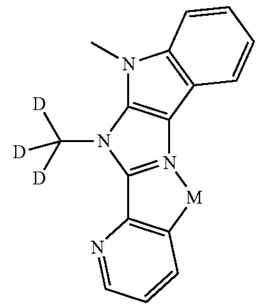
L87
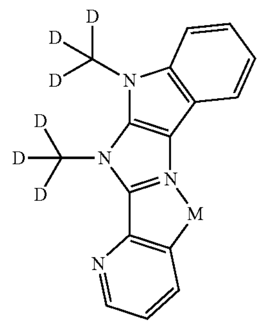
L88
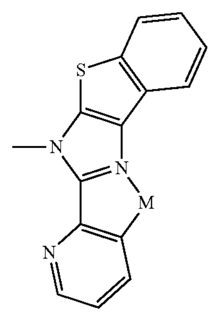
L89
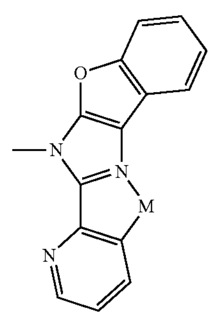
L90
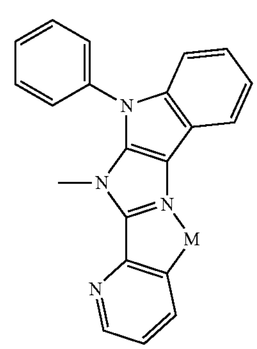

-continued
L91
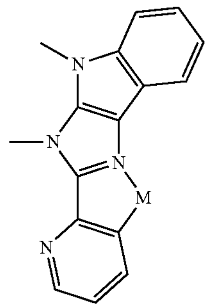
L92
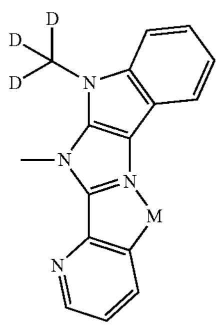
L93
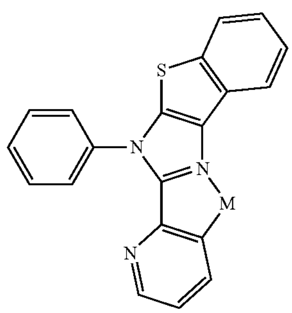
L94
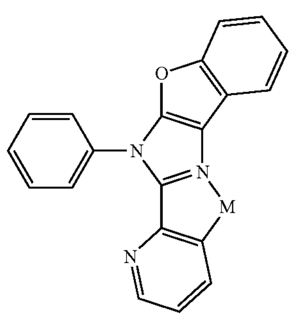
L95
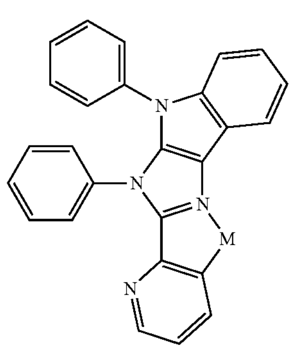
-continued
L96
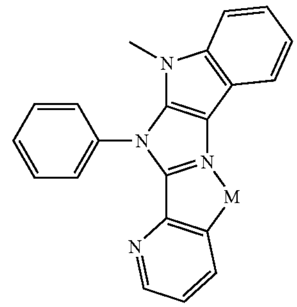
L97
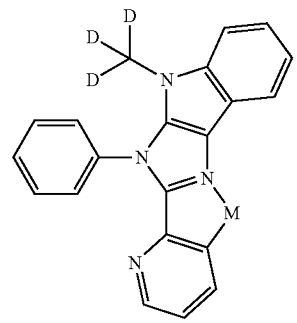
L98
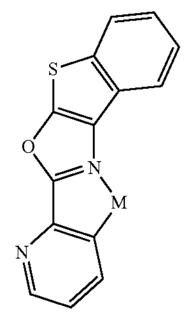
L99
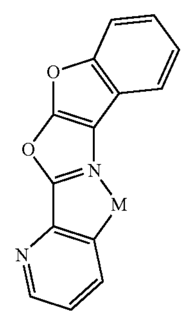
L100
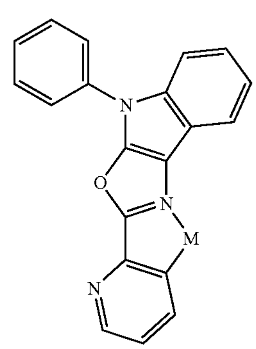

L101
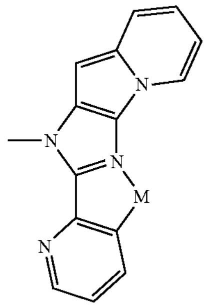
L102
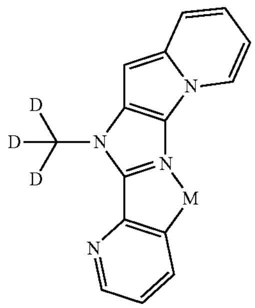
L103
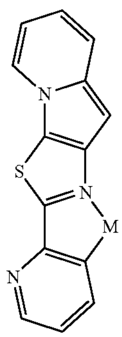
L104
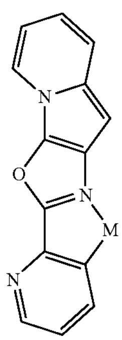
L105
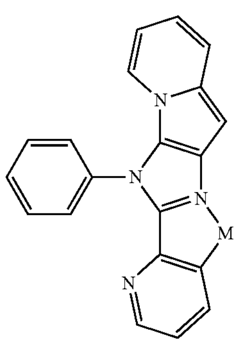
L106
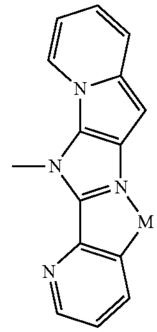
L107
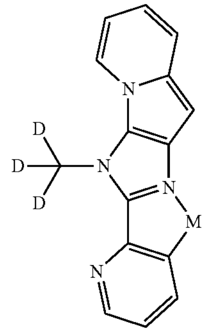
L108
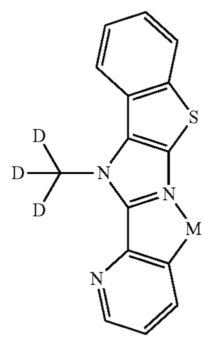
L109
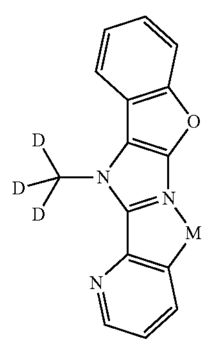

-continued
L110
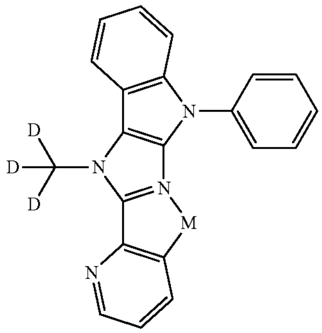
L111
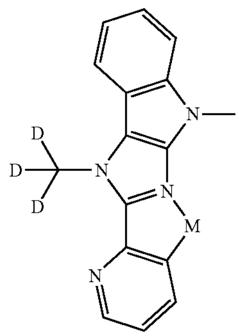
L112
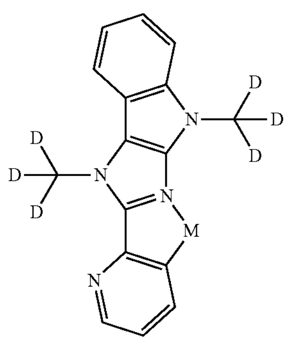
L113
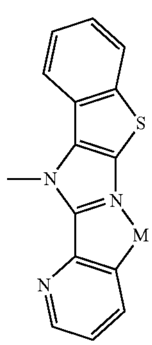
-continued
L114
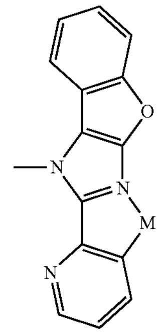
L115
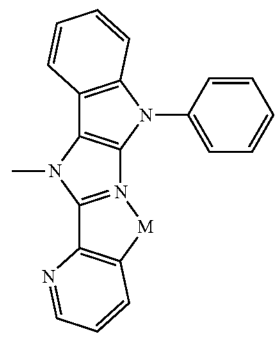
L116
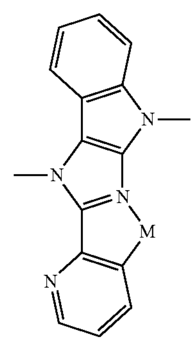
L117
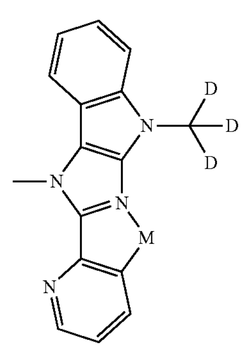

-continued
L118
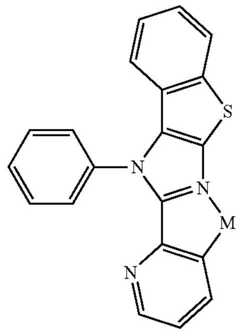
L119
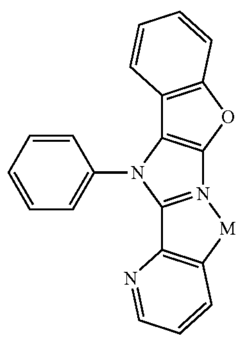
L120
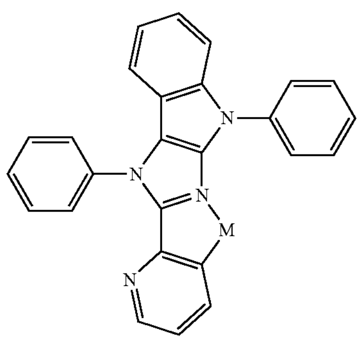
L121
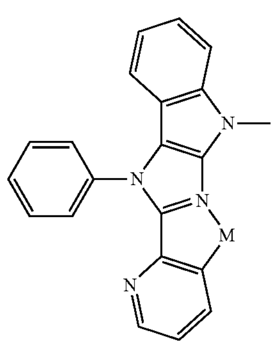
-continued
L122
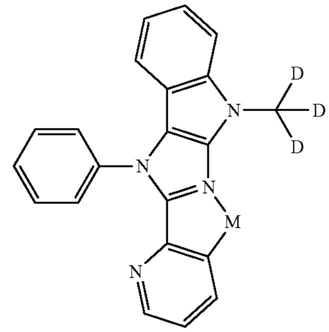
L123
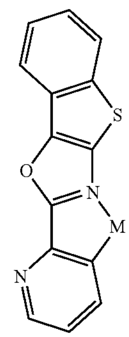
L124
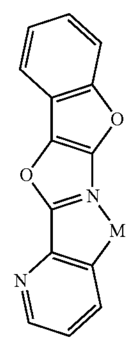
L125
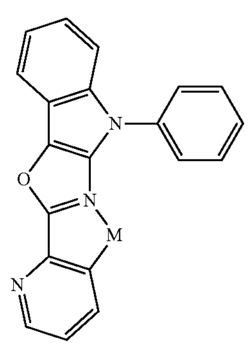

-continued
L126
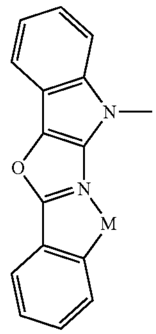
L127
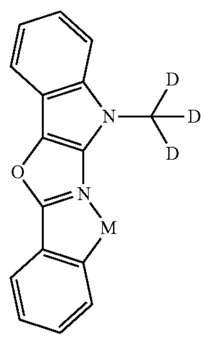
L128
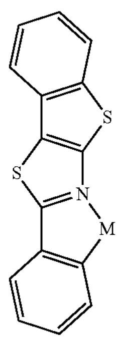
L129
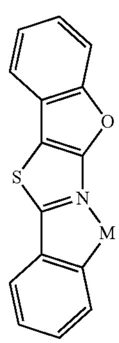
-continued
L130
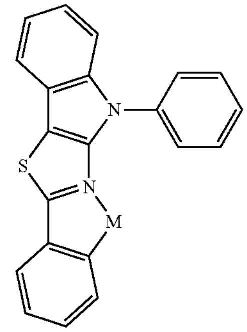
L131
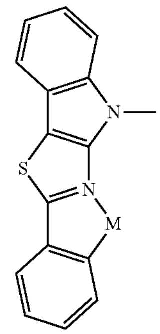
L132
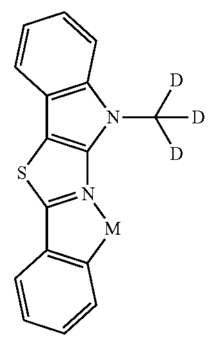
L133
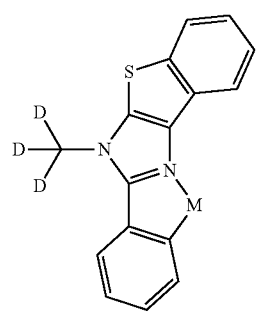
L134
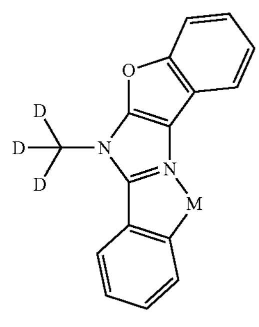

-continued
L135
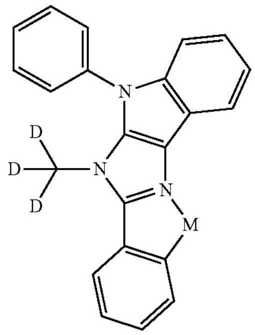
L136
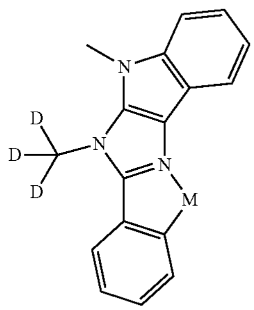
L137
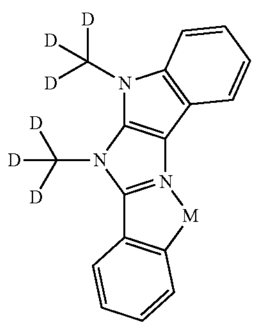
L138
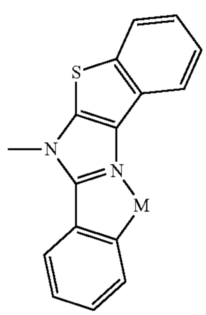
L139
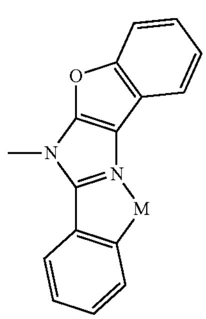
-continued
L140
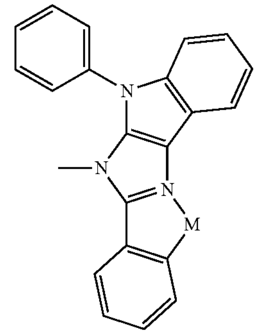
L141
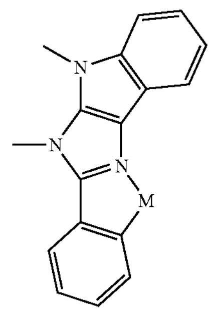
L142
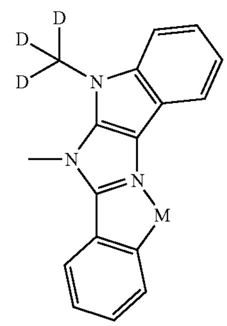
L143
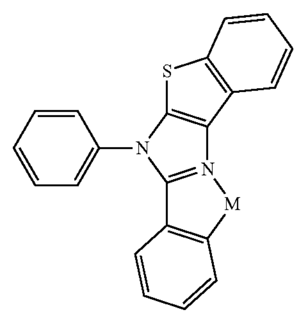
L144
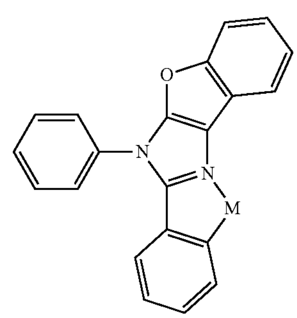

L145
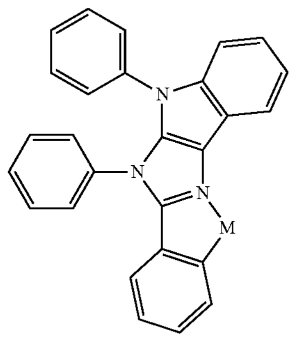
L146
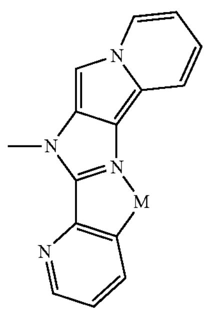
L147
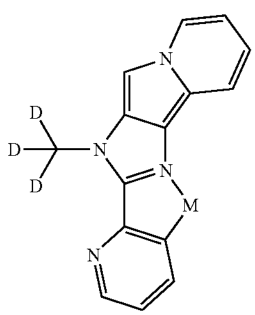
L148
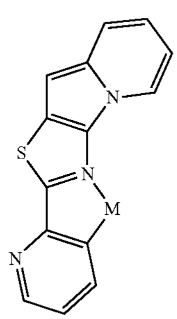
L149
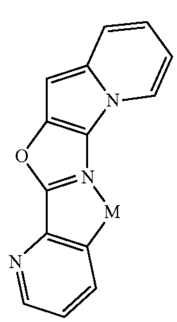
L150
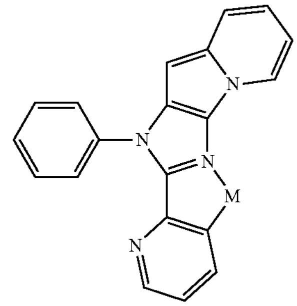
L151
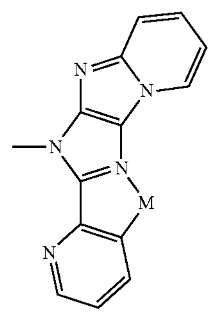
L152
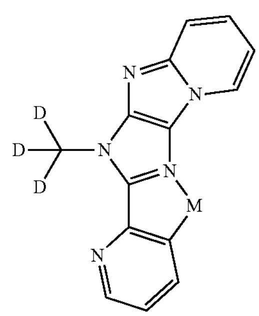
L153
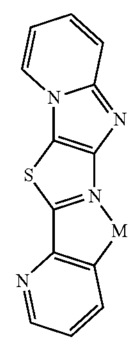
L154
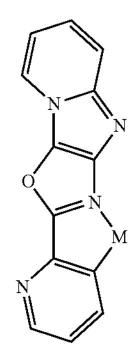

-continued
L155
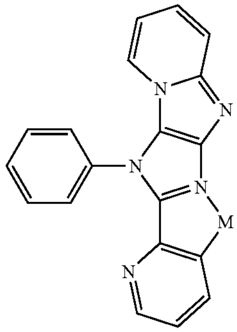
L156
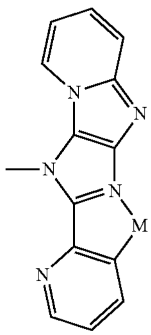
L157
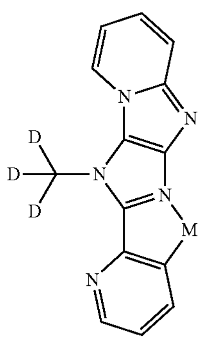
L158
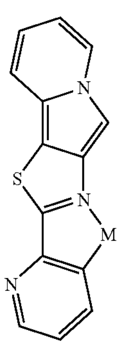
-continued
L159
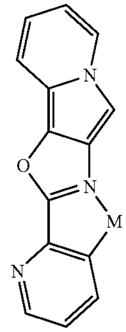
L160
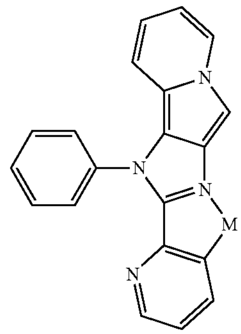
L161
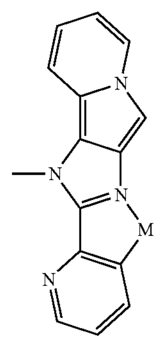
L162
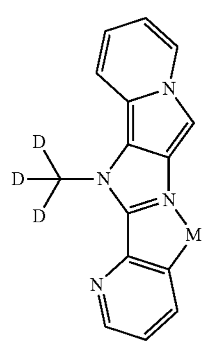

-continued
L163
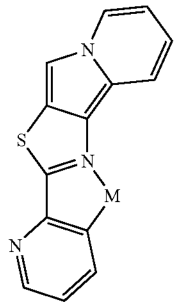
L164
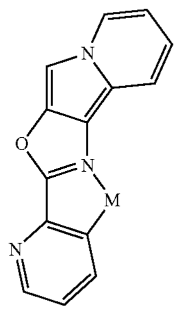
L165
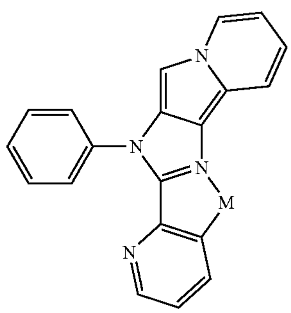
L166
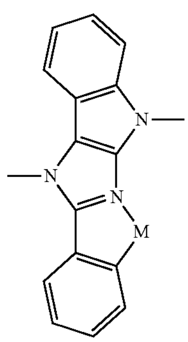
L167
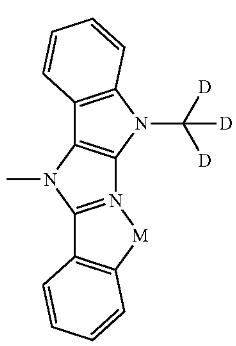
-continued
L168
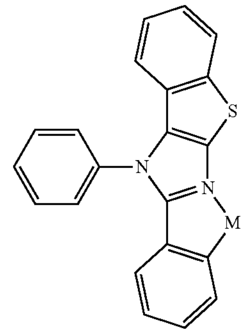
L169
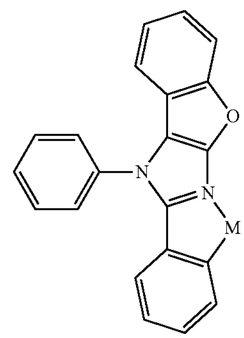
L170
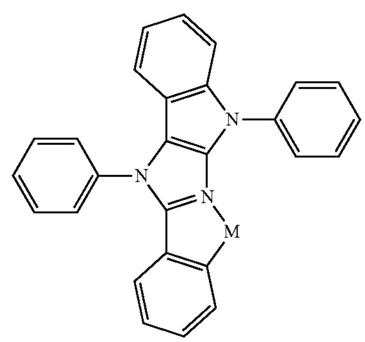
L171
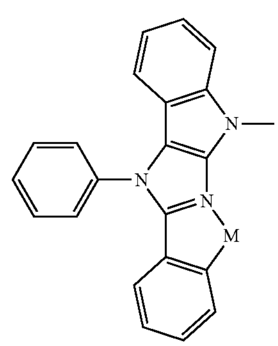

-continued
L172
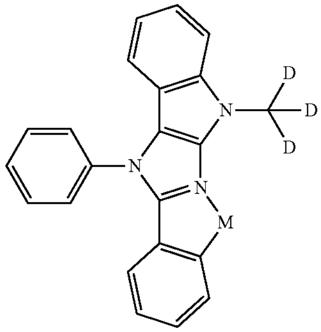
L173
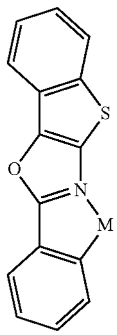
L174
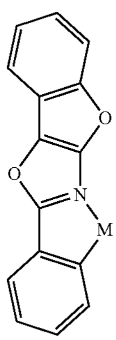
L175
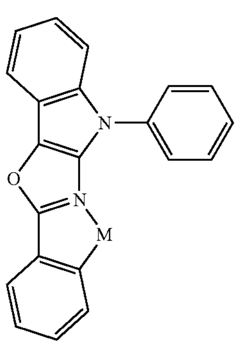
-continued
L176
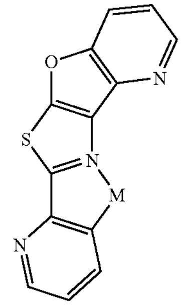
L177
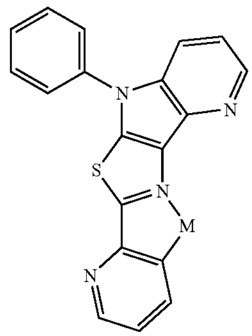
L178
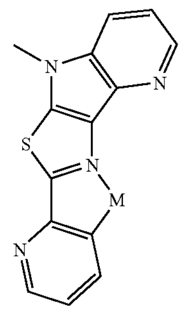
L179
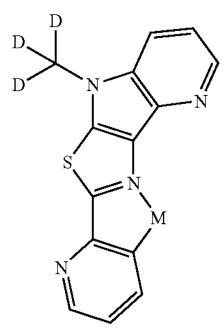
L180
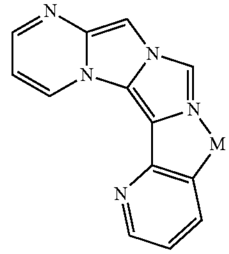

-continued
L181
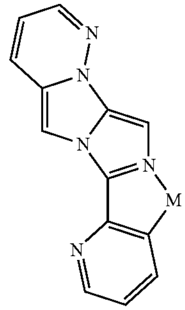
L182
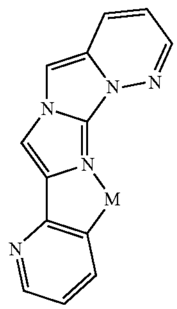
L183
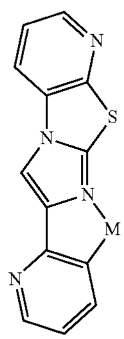
L184
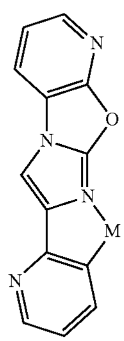
L185
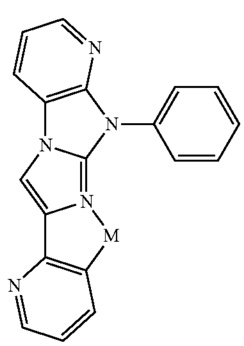
-continued
L186
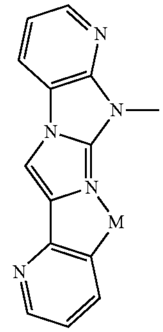
L187
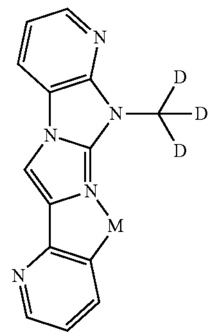
L188
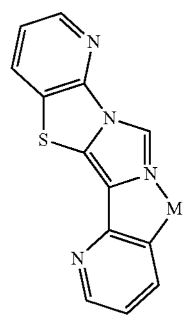
L189
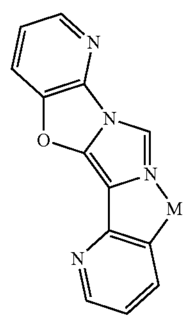
L190
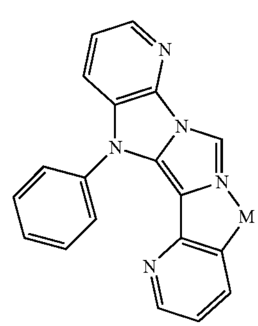

-continued
L191
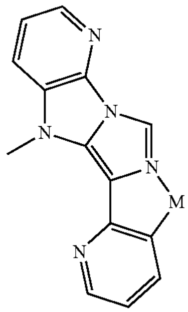
L192
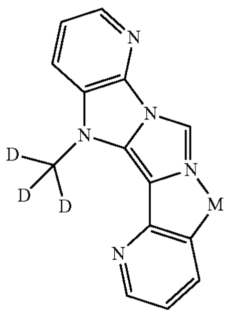
L193
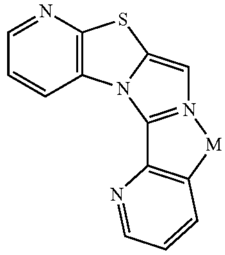
L194
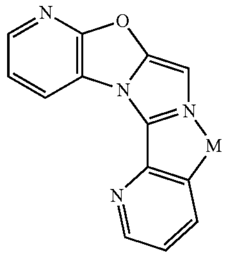
L195
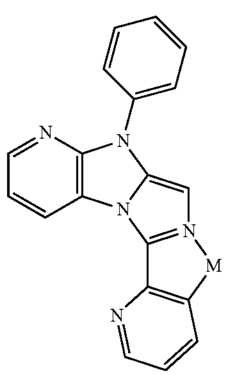
-continued
L196
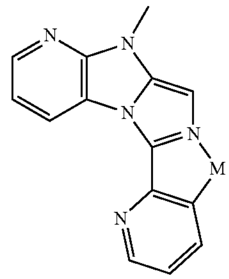
L197
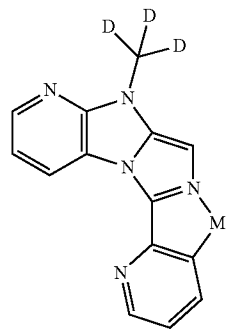
L198
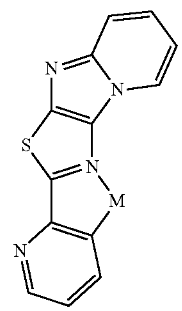
L199
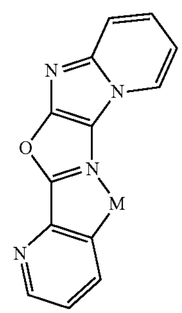
L200
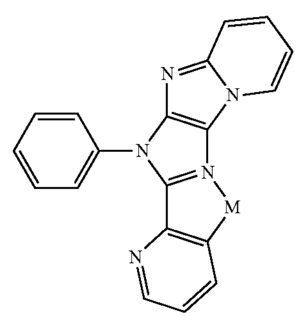

-continued
L201
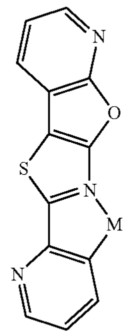
L202
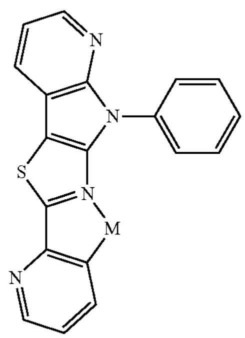
L203
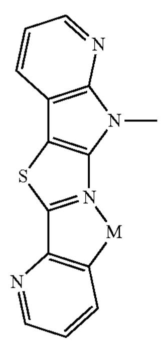
L204
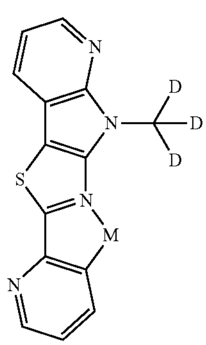
-continued
L205
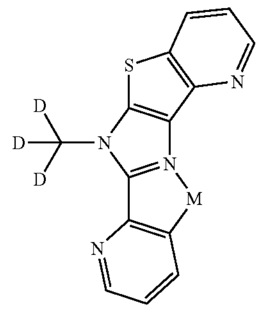
L206
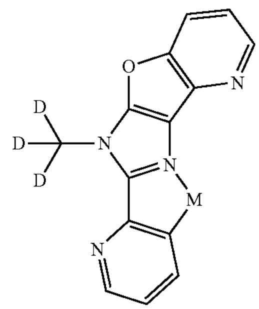
L207
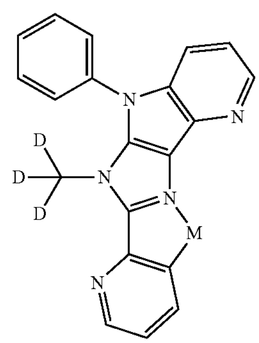
L208
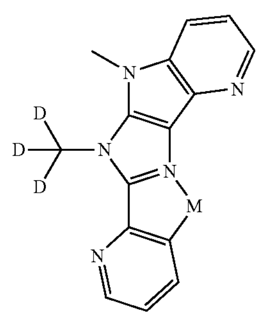
L209
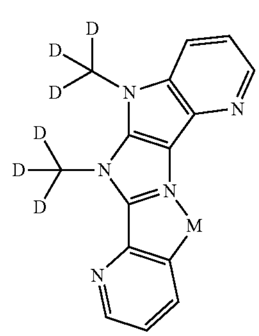

L210
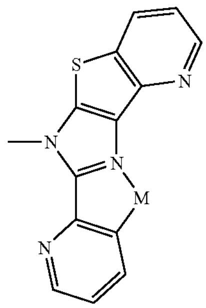
L211
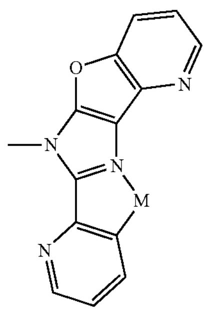
L212
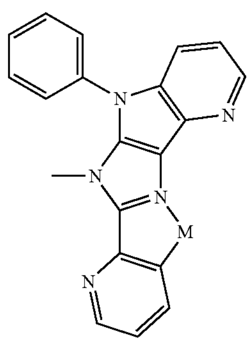
L213
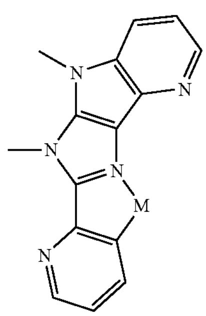
L214
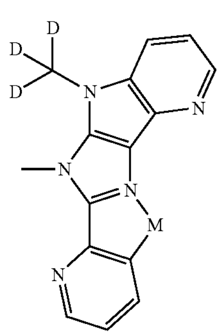
L215
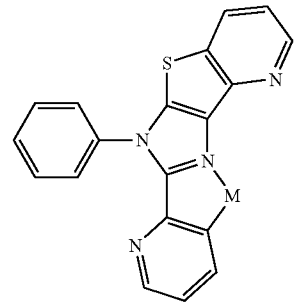
L216
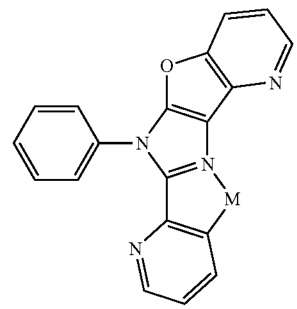
L217
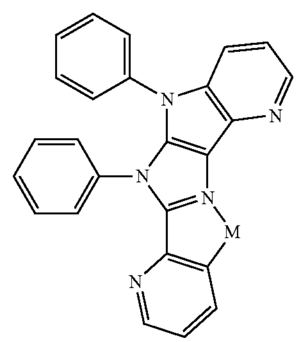
L218
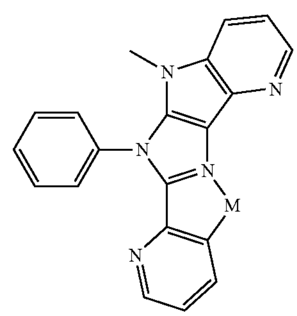
L219
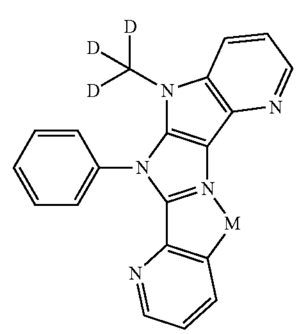

-continued
L220
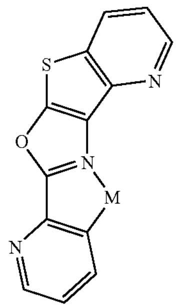
L221
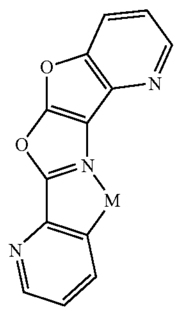
L222
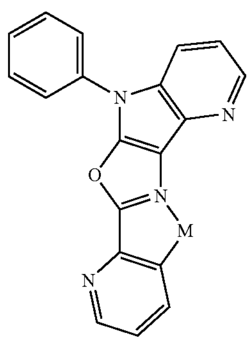
L223
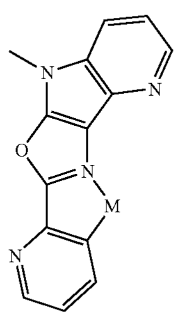
L224
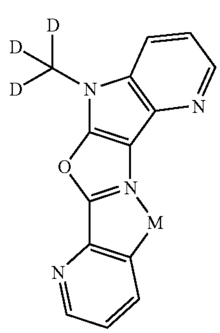
-continued
L225
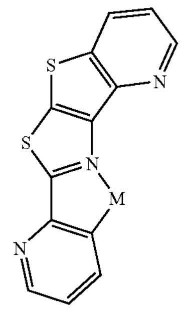
L226
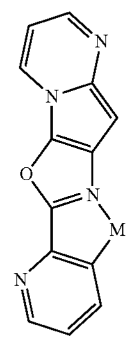
L227
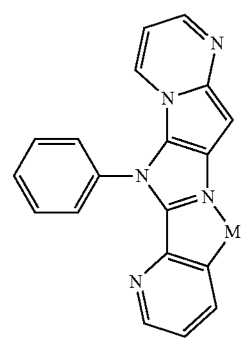
L228
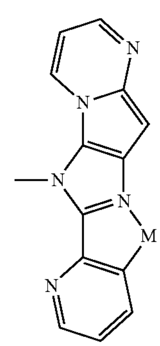

-continued
L229
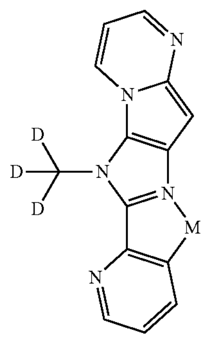
L230
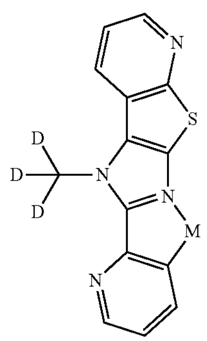
L231
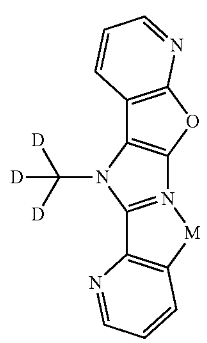
L232
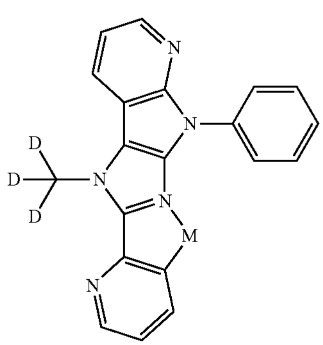
-continued
L233
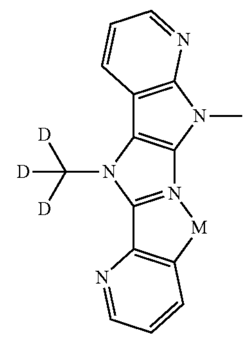
L234
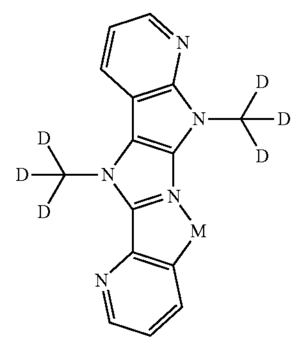
L235
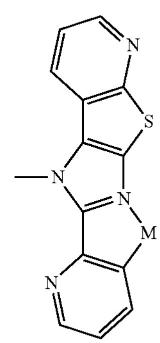
L236
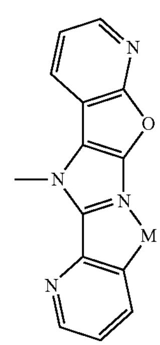

L237
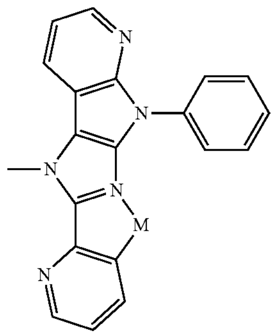
L238
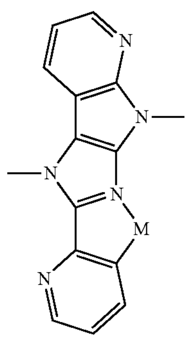
L239
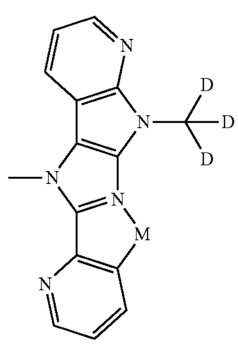
L240
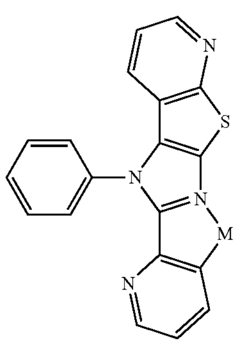
L241
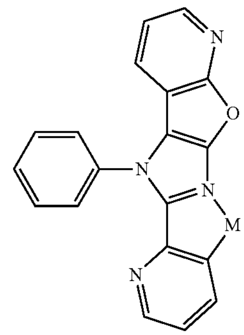
L242
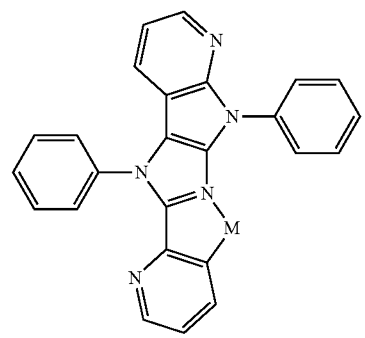
L243
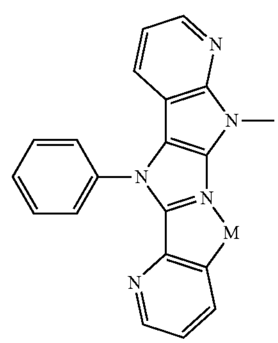
L244
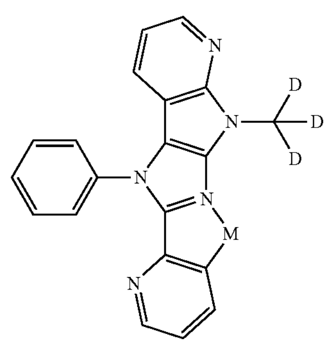

-continued
L245
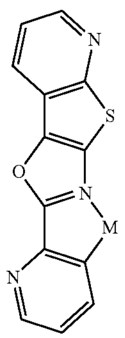
L246
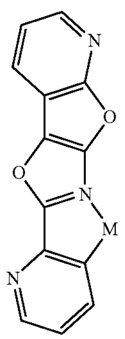
L247
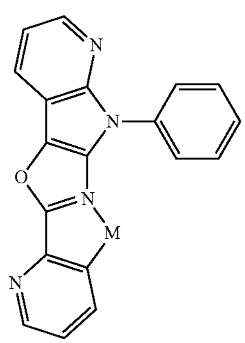
L248
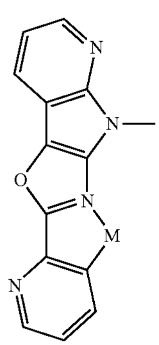
-continued
L249
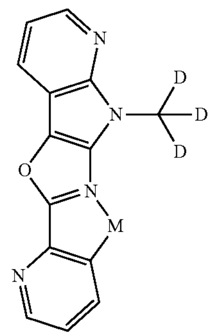
L250
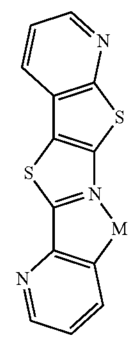
L251
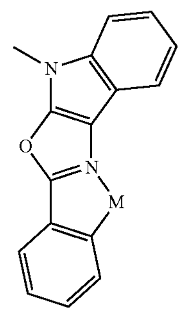
L252
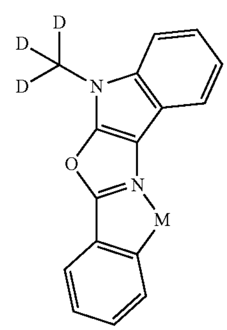
L253
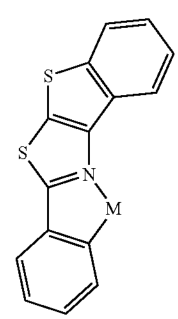

-continued
L254
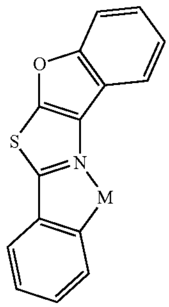
L255
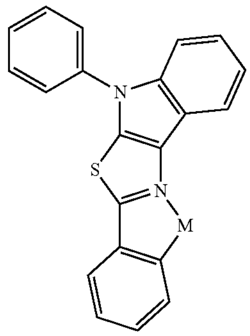
L256
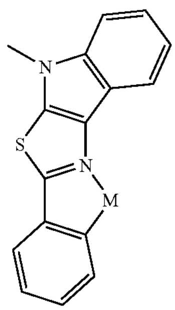
L257
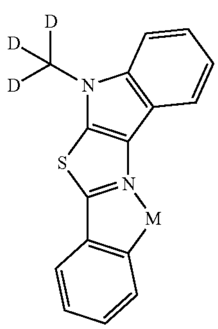
L258
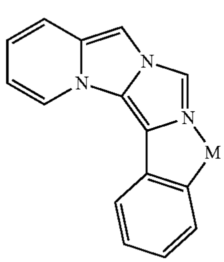
-continued
L259
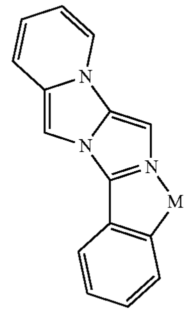
L260
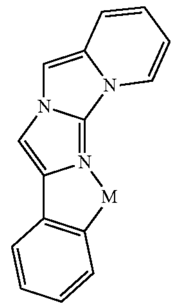
L261
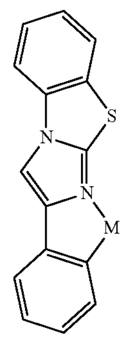
L262
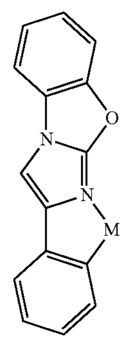
L263
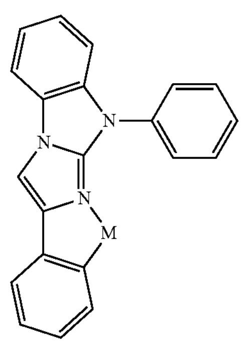

-continued
L264
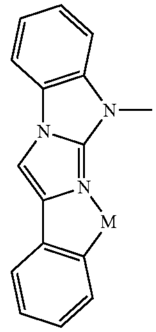
L265
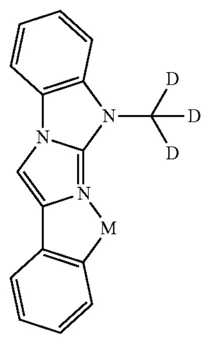
L266
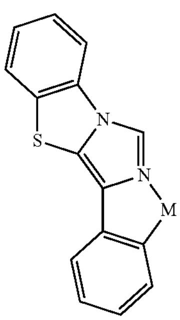
L267
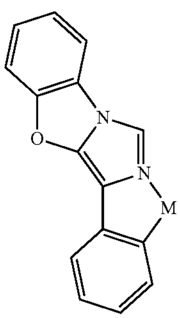
L268
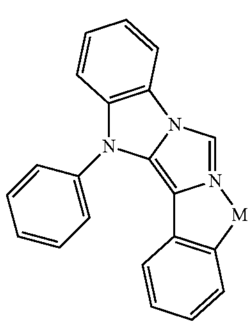
-continued
L269
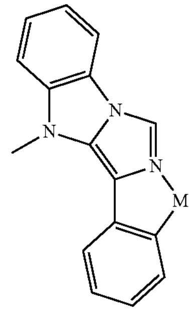
L270
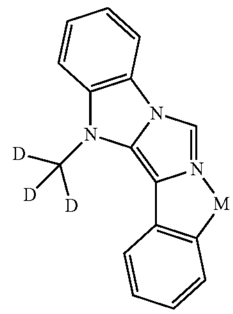
L271
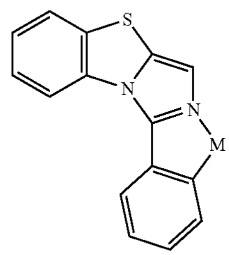
L272
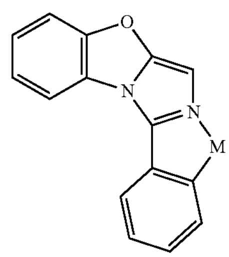
L273
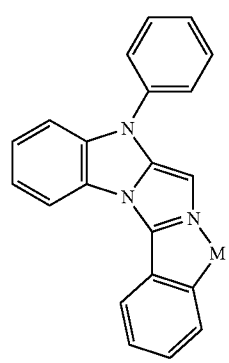

-continued
L274
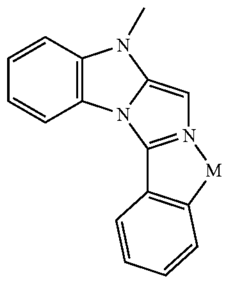
L275
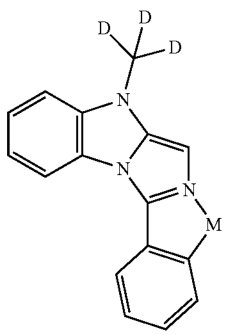
L276
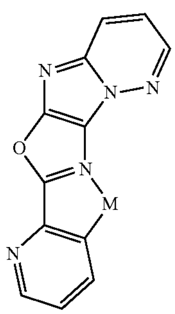
L277
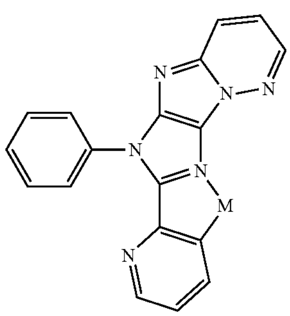
L278
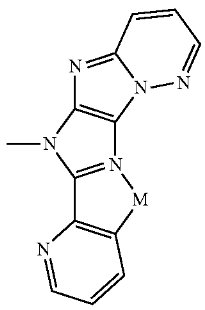
-continued
L279
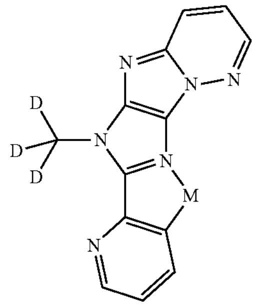
L280
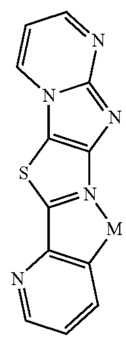
L281
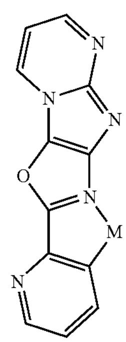
L282
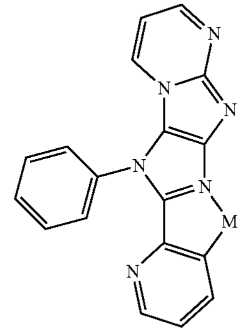

L283
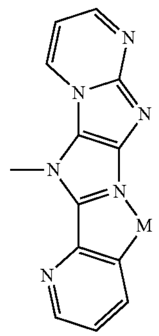
L284
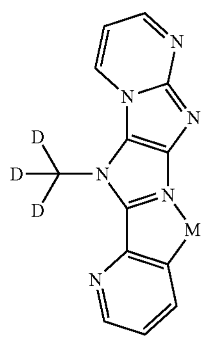
L285
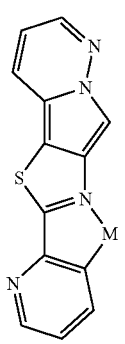
L286
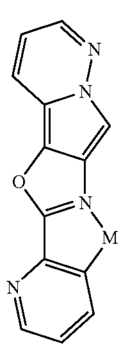
L287
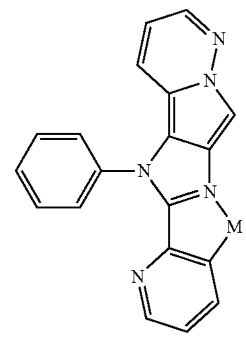
L288
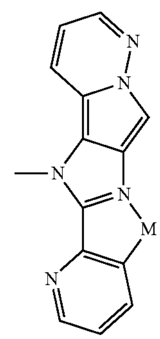
L289
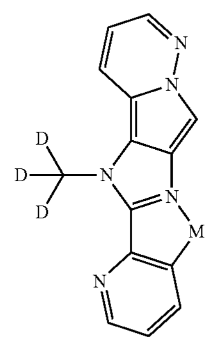
L290
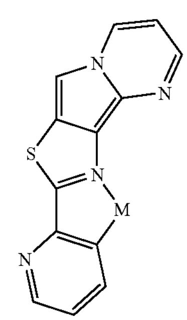
L291
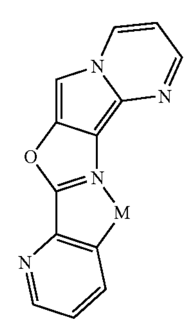

-continued
L292
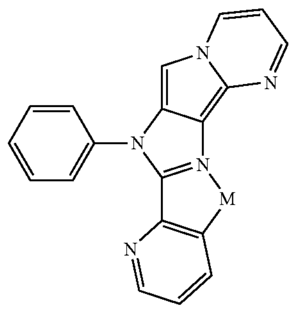
L293
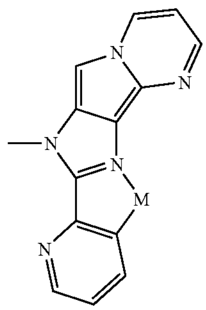
L294
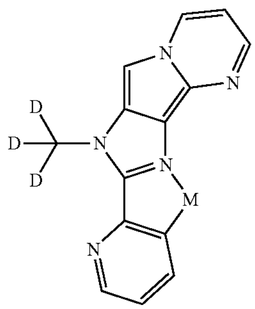
L295
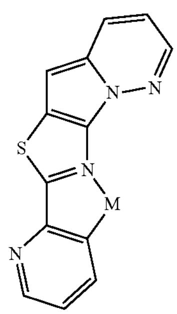
L296
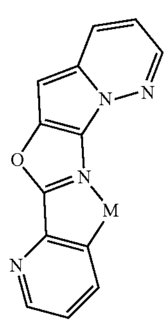
-continued
L297
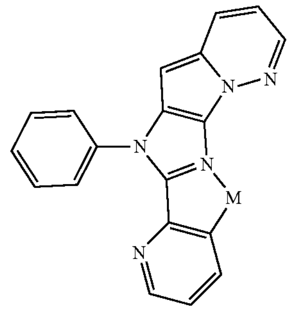
L298
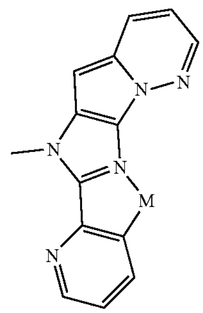
L299
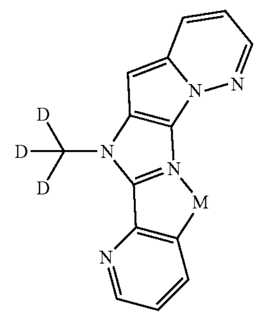
L300
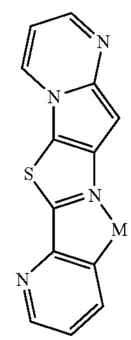
L301
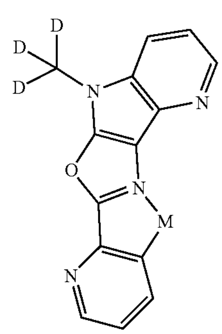

-continued
L302
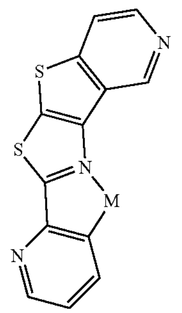
L303
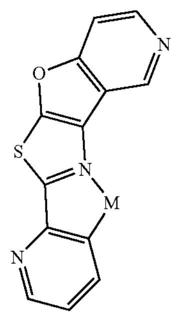
L304
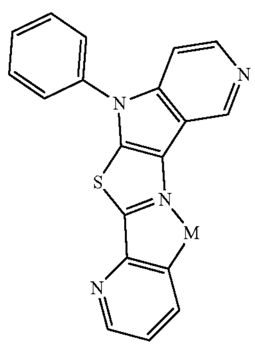
L305
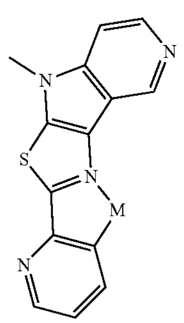
L306
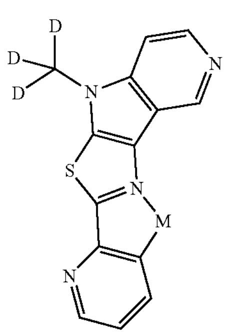
-continued
L307
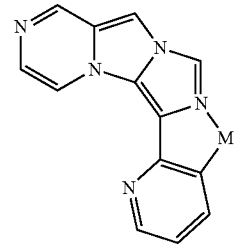
L308
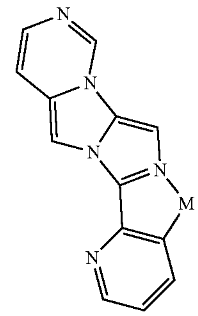
L309
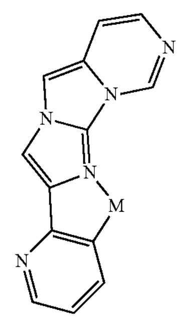
L310
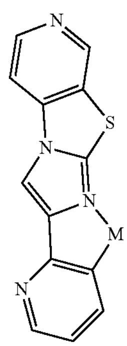
L311
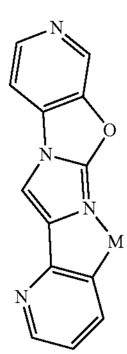

-continued
L312
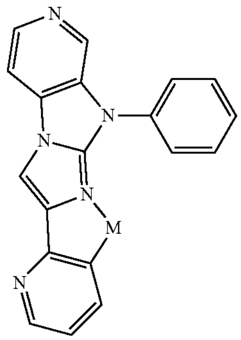
L313
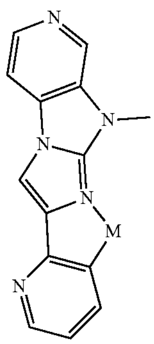
L314
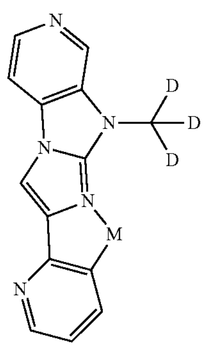
L315
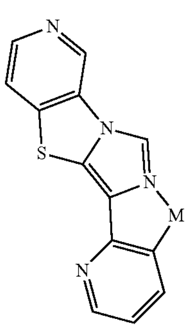
-continued
L316
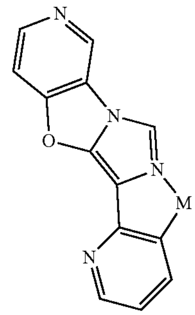
L317
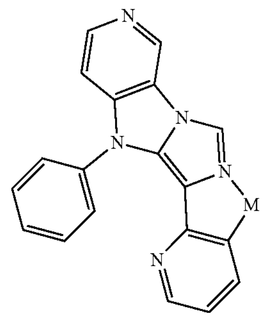
L318
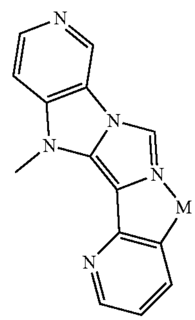
L319
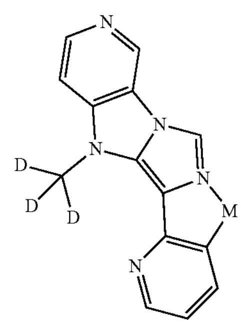
L320
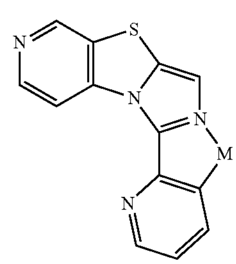

-continued
L321
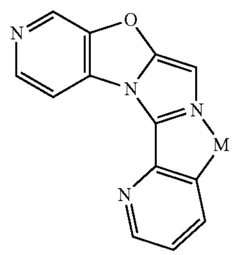
L322
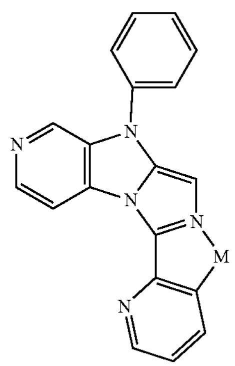
L323
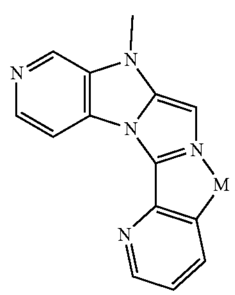
L324
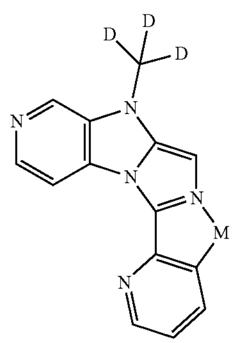
L325
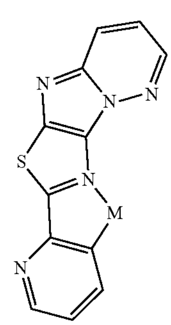
-continued
L326
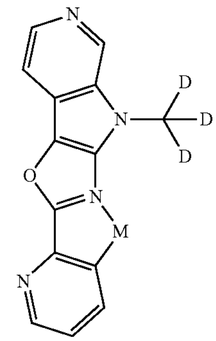
L327
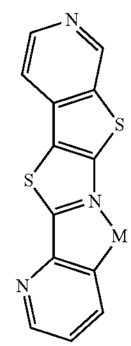
L328
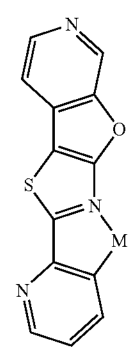
L329
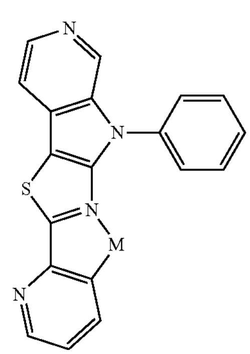

-continued
L330
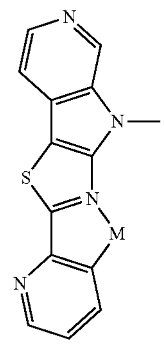
L331
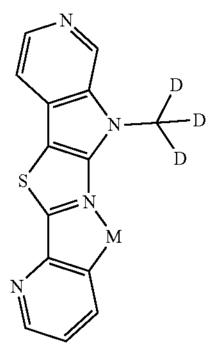
L332
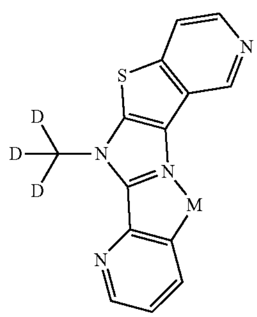
L333
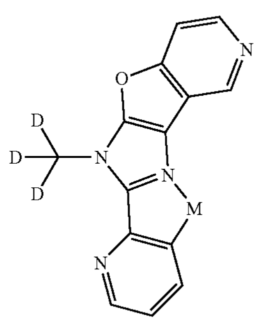
L334
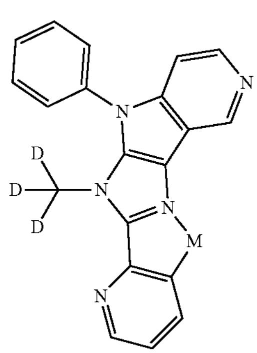
-continued
L335
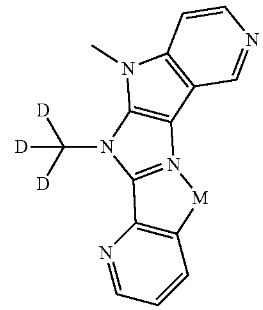
L336
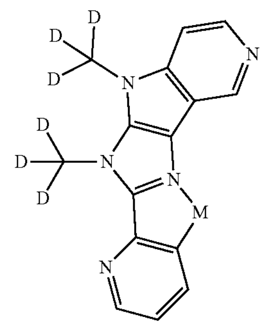
L337
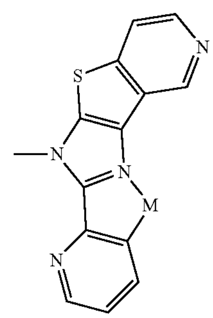
L338
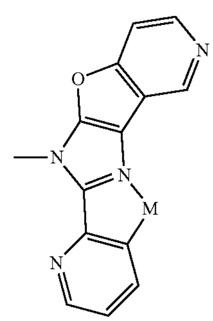
L339
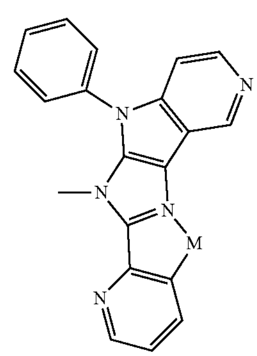

L340
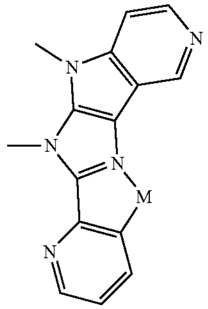
L341
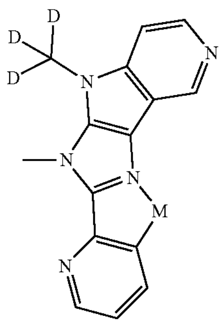
L342
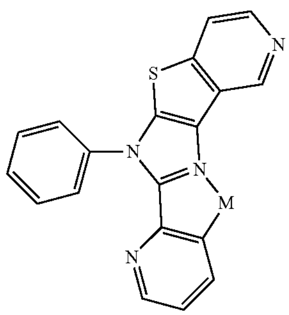
L343
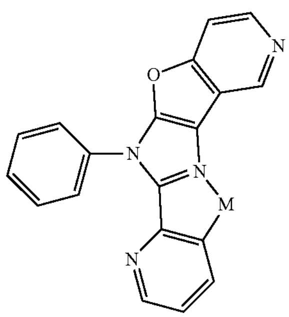
L344
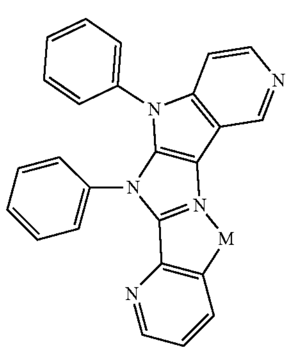
L345
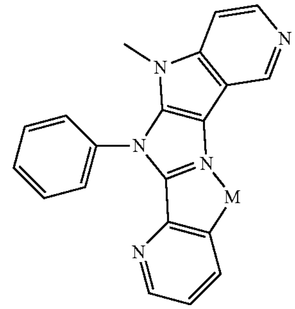
L346
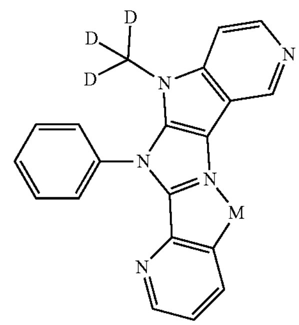
L347
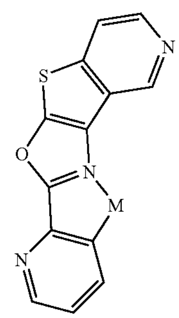
L348
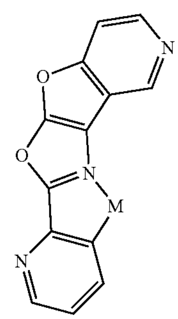
L349
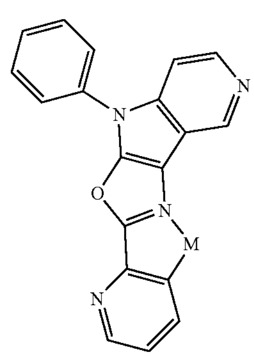

-continued
L350
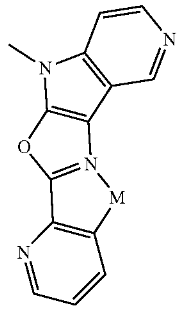
L351
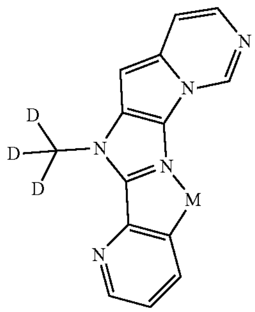
L352
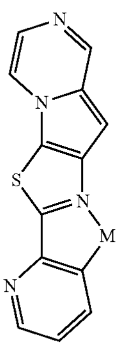
L353
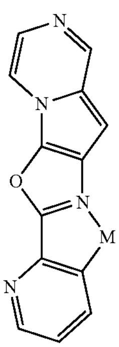
L354
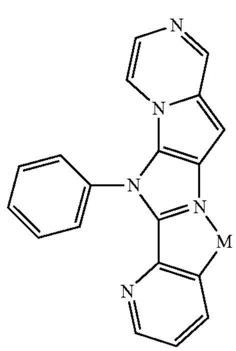
-continued
L355
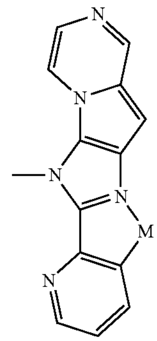
L356
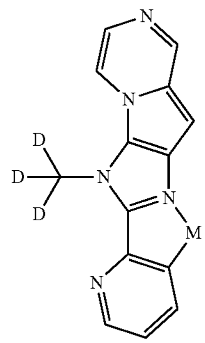
L357
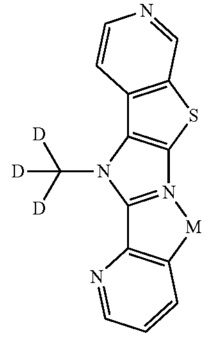
L358
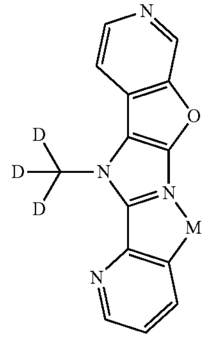

L359
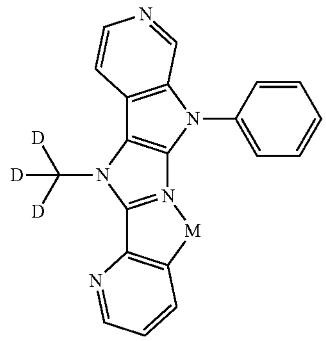
L360
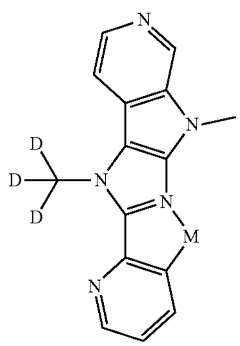
L361
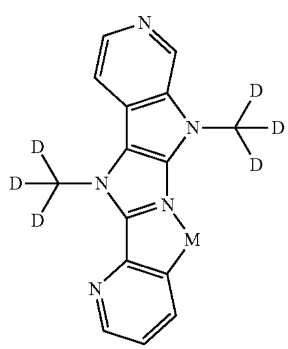
L362
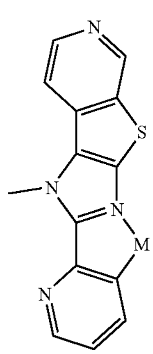
L363
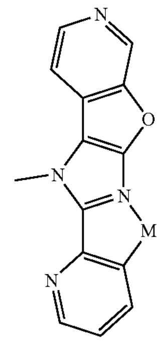
L364
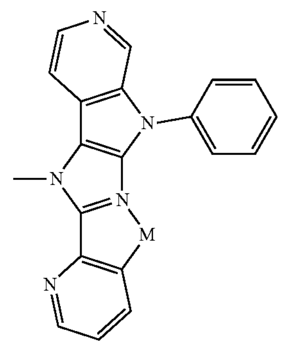
L365
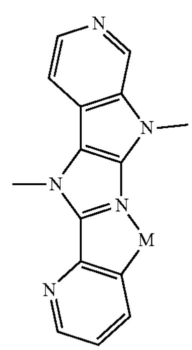
L366
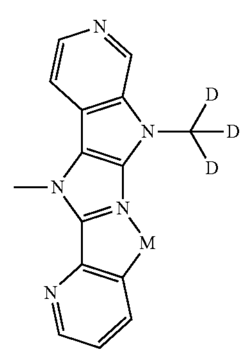

-continued
L367
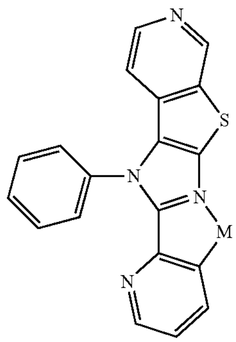
L368
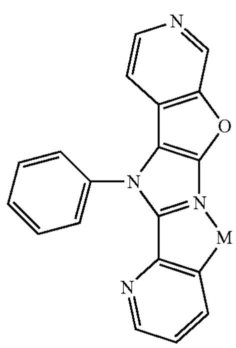
L369
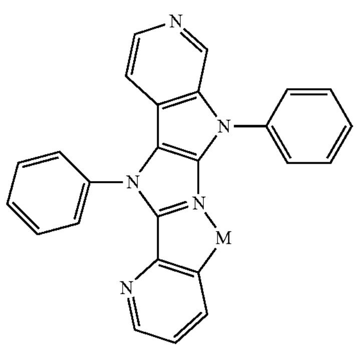
L370
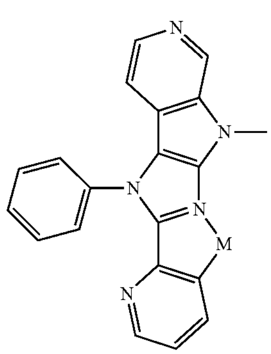
-continued
L371
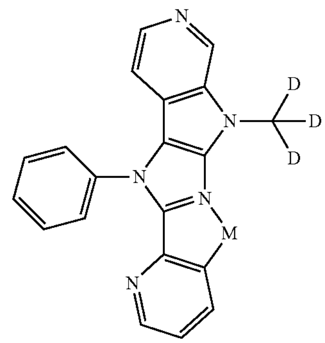
L372
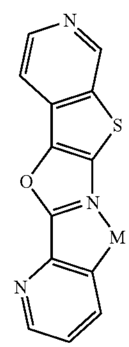
L373
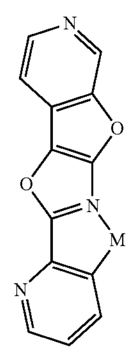
L374
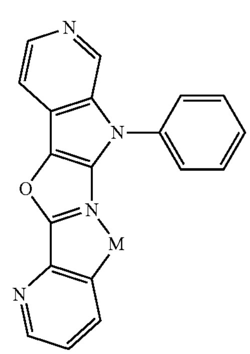

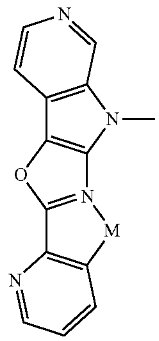
L375
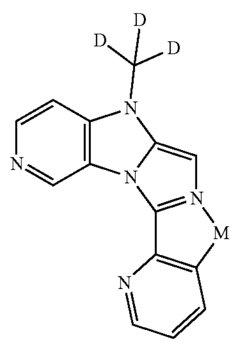
L376
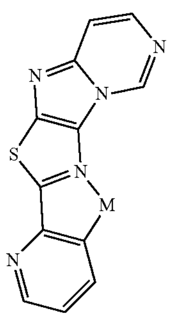
L377
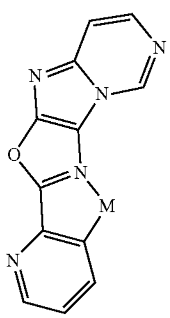
L378
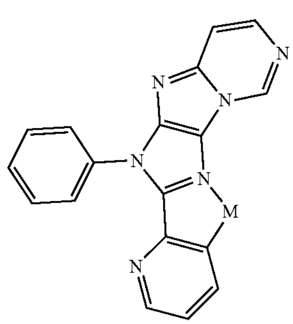
L379
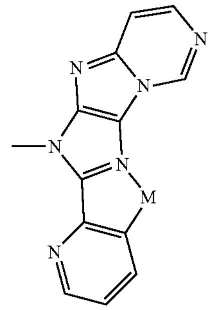
L380
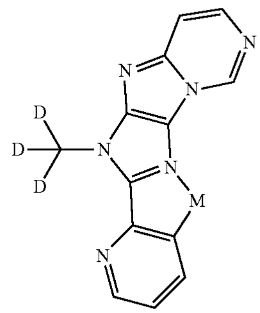
L381
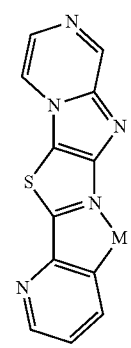
L382
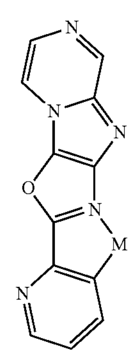
L383

-continued
L384
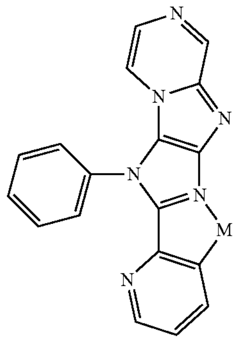
L385
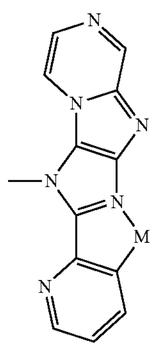
L386
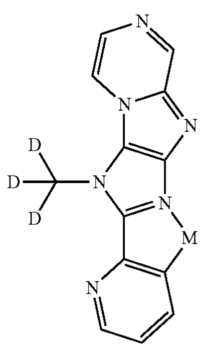
L387
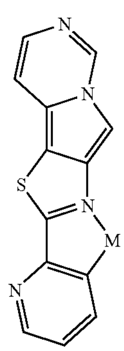
-continued
L388
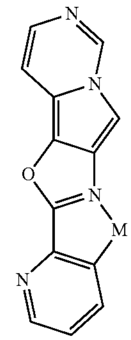
L389
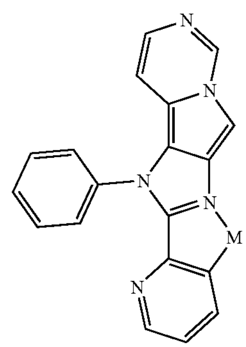
L390
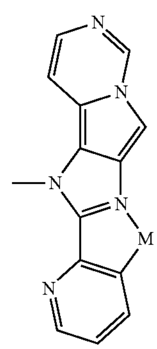
L391
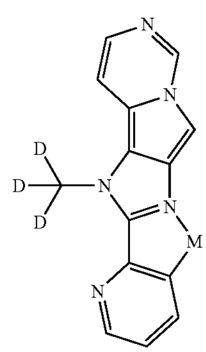

L392
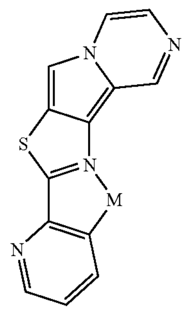
L393
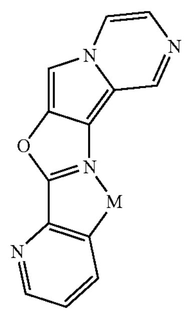
L394
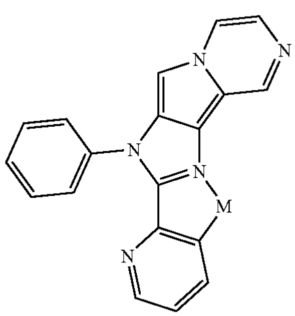
L395
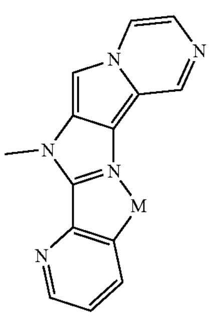
L396
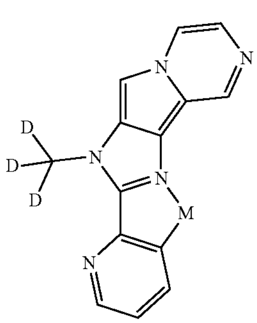
L397
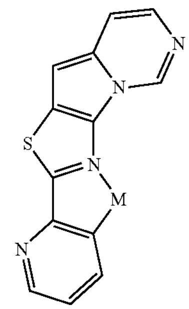
L398
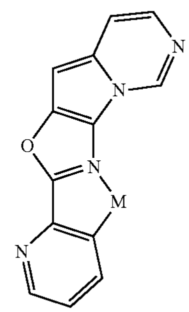
L399
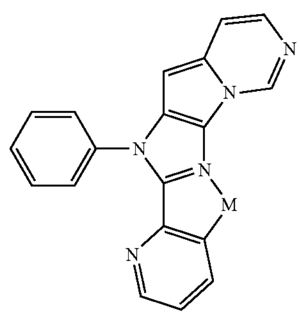
L400
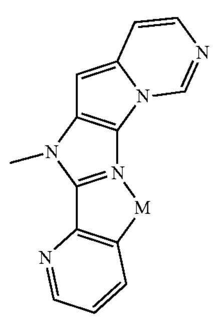
L401
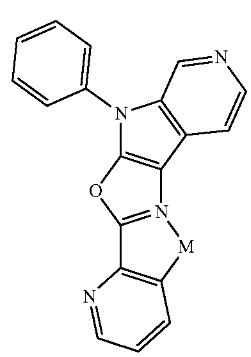

-continued
L402
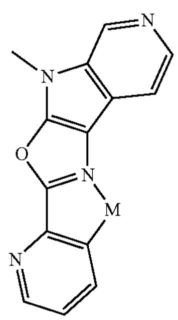
L403
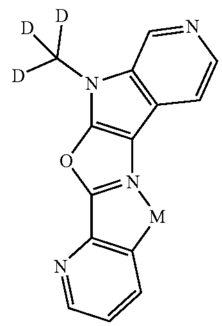
L404
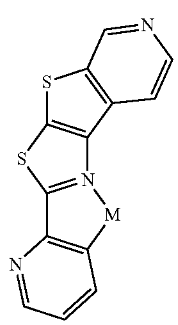
L405
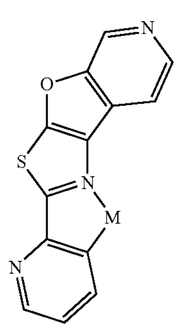
L406
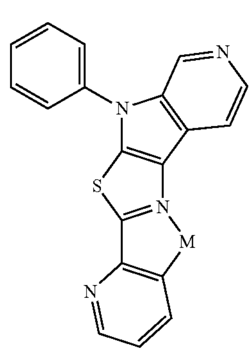
-continued
L407
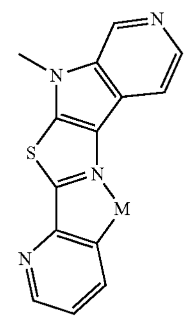
L408
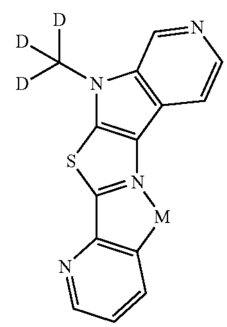
L409
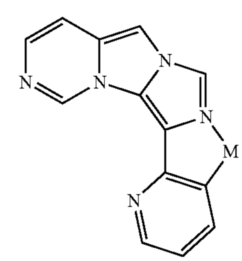
L410
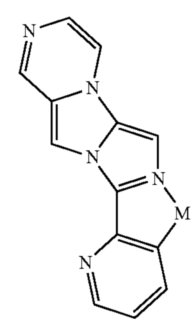
L411
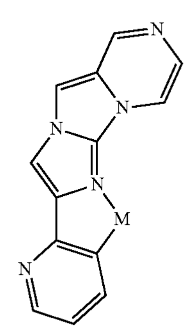

-continued
L412
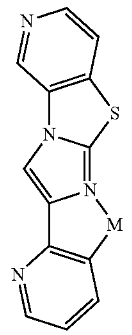
L413
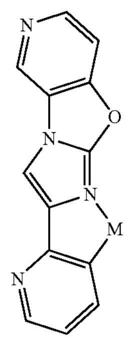
L414
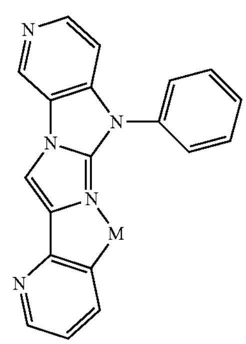
L415
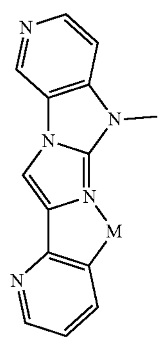
-continued
L416
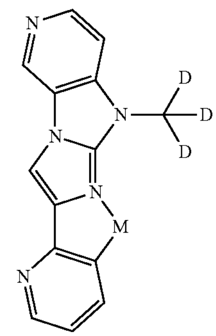
L417
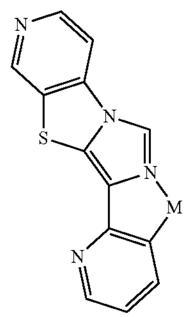
L418
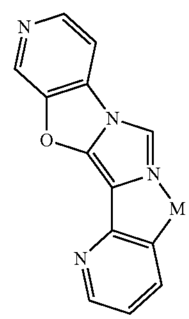
L419
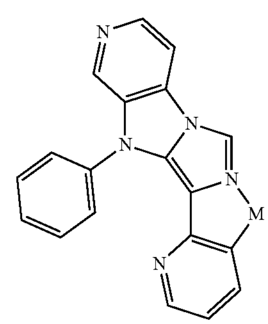
L420
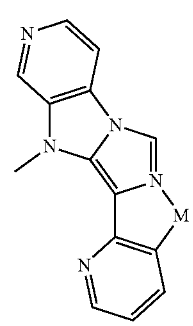

-continued
L421
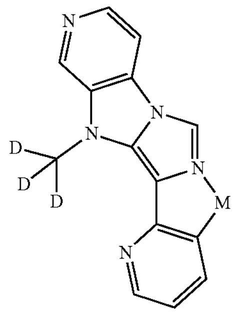
L422
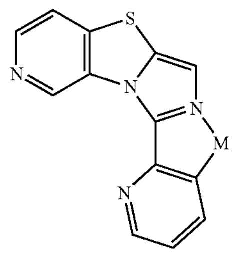
L423
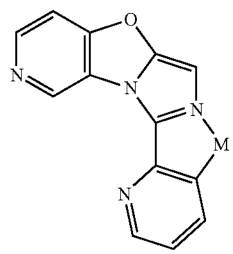
L424
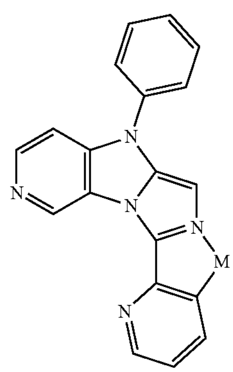
L425
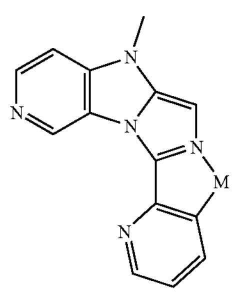
-continued
L426
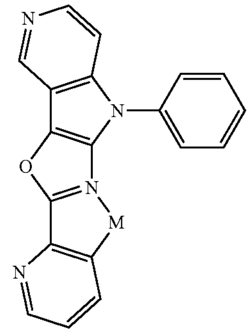
L427
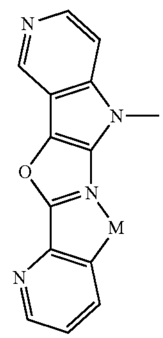
L428
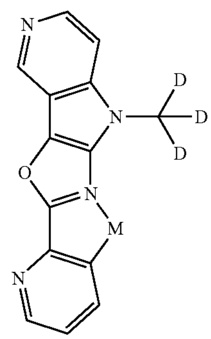
L429
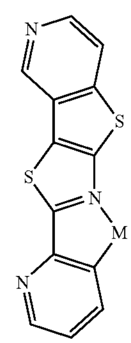

-continued
L430
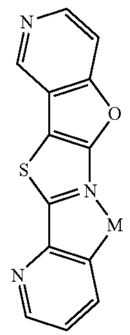
L431
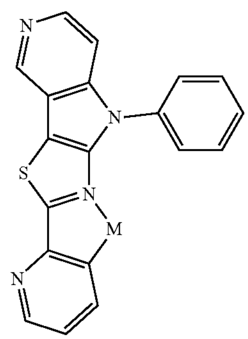
L432
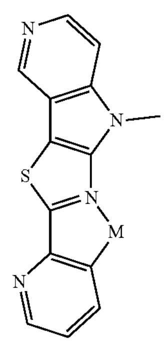
L433
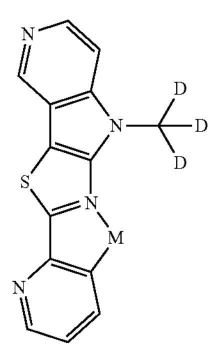
-continued
L434
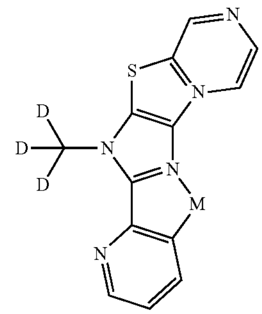
L435
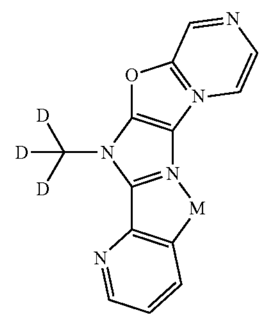
L436
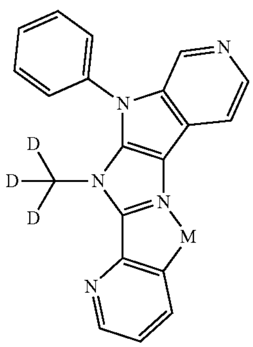
L437
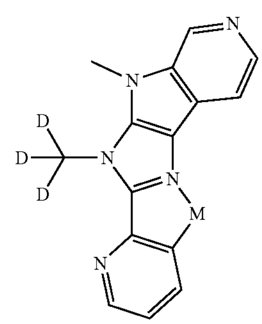
L438
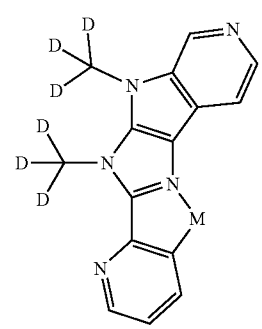

-continued
L439
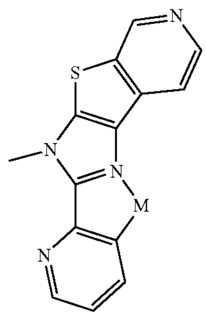
L440
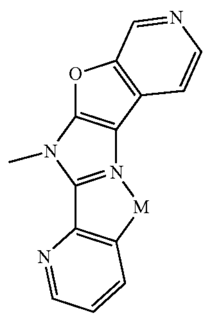
L441
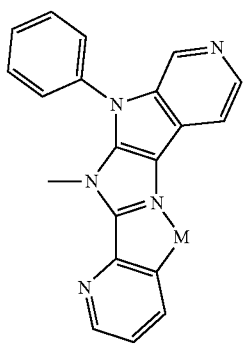
L442
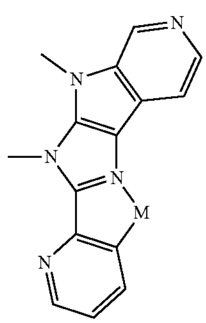
L443
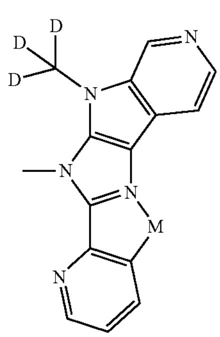
-continued
L444
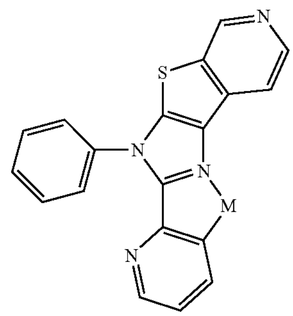
L445
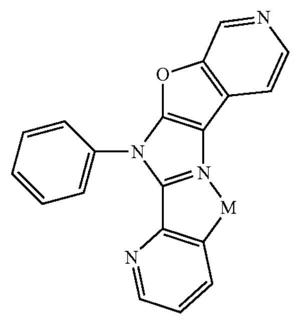
L446
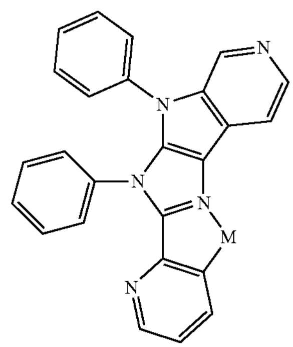
L447
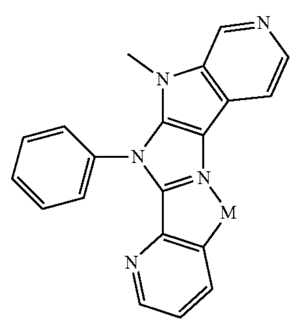
L448
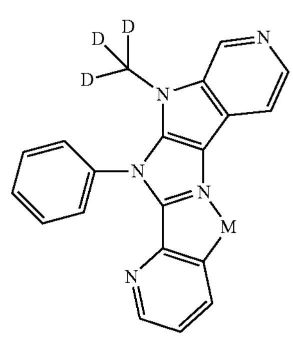

-continued
L449
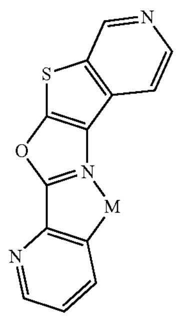
L450
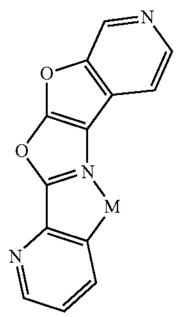
L451
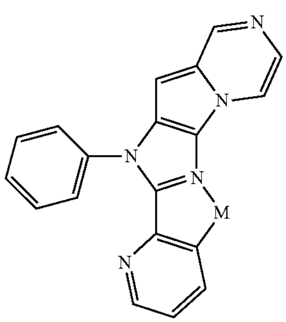
L452
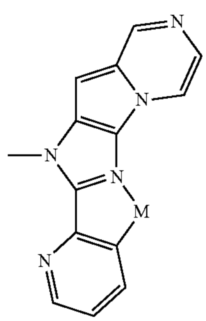
L453
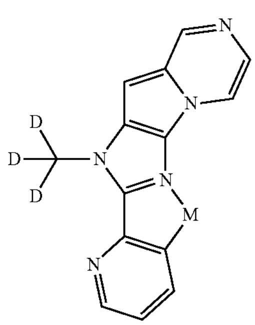
-continued
L454
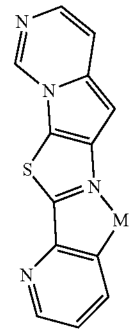
L455
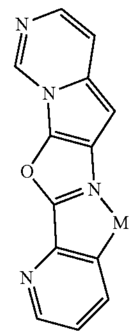
L456
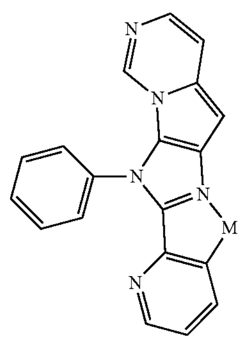
L457
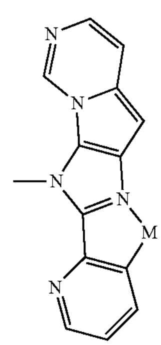

-continued
L458
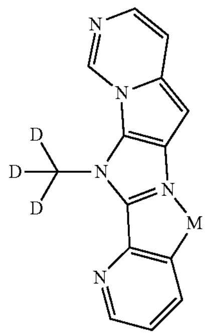
L459
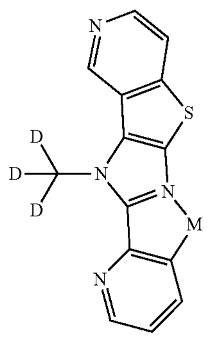
L460
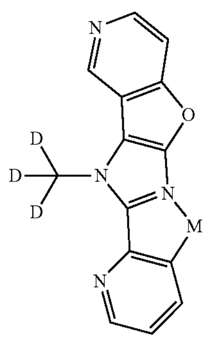
L461
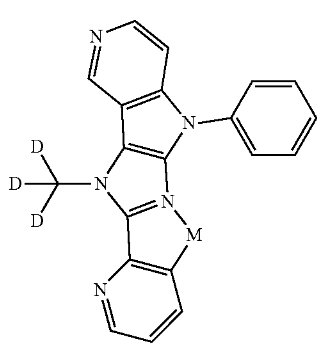
-continued
L462
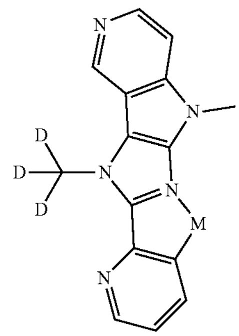
L463
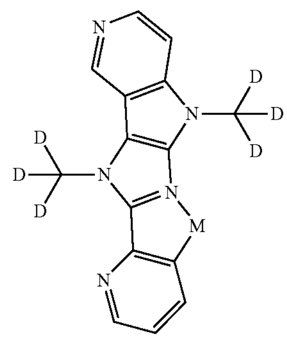
L464
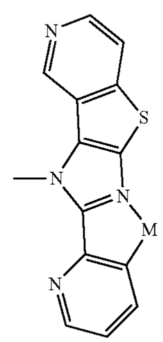
L465
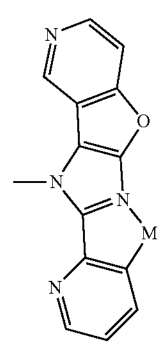

-continued
L466
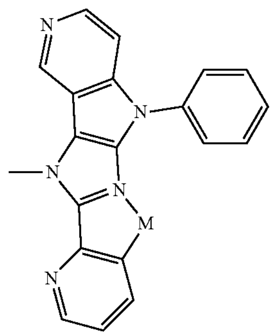
L467
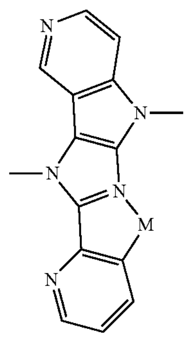
L468
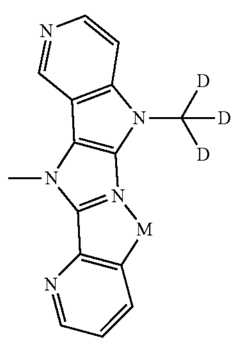
L469
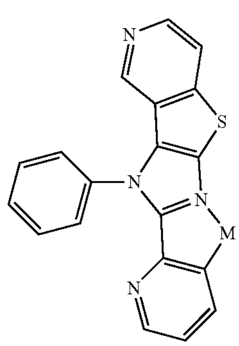
-continued
L470
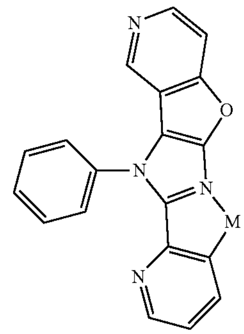
L471
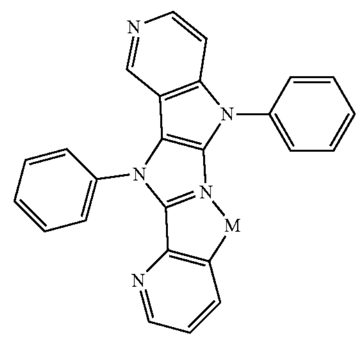
L472
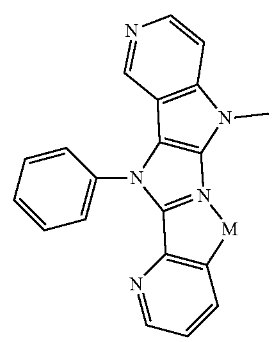
L473
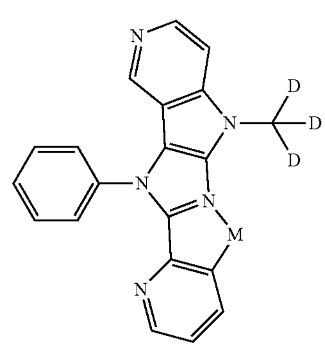

-continued
L474
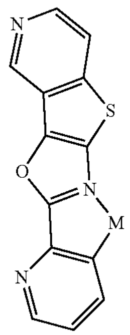
L475
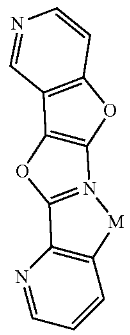
L476
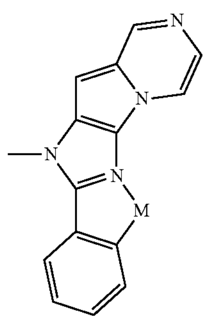
L477
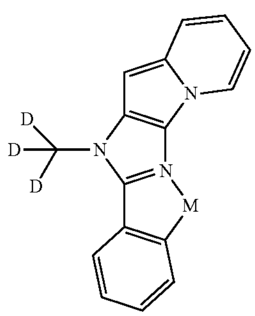
L478
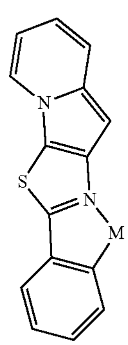
-continued
L479
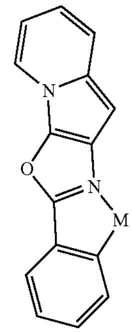
L480
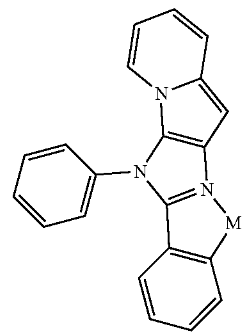
L481
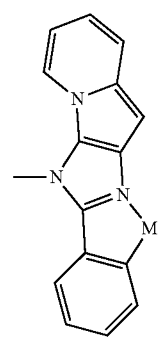
L482
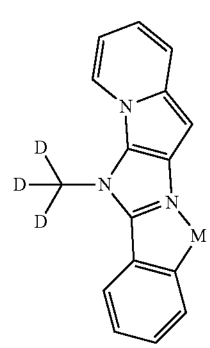

-continued
L483
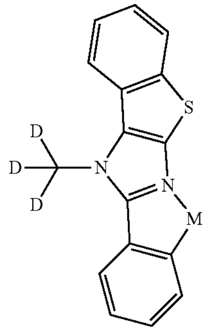
L484
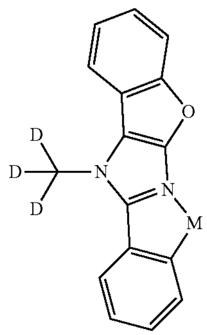
L485
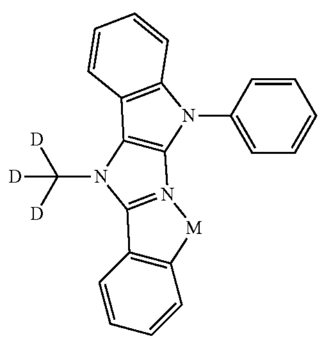
L486
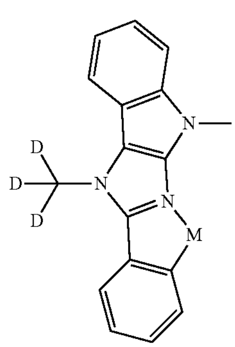
-continued
L487
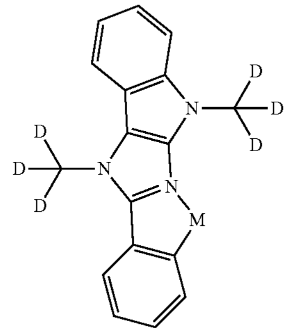
L488
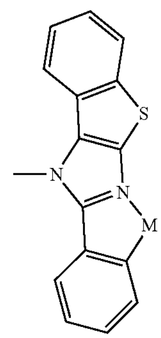
L489
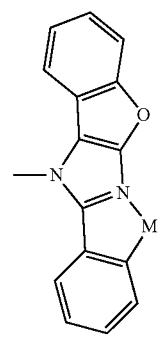
L490
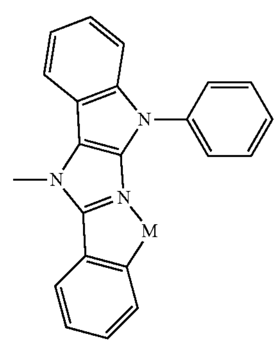

L491
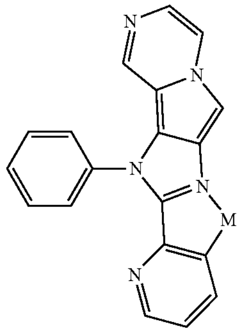
L492
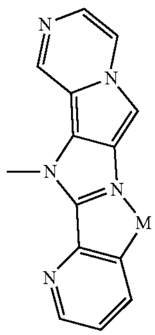
L493
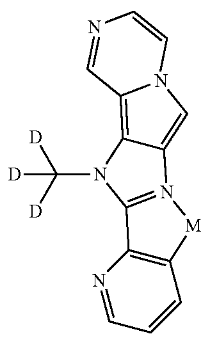
L494
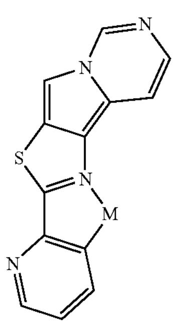
L495
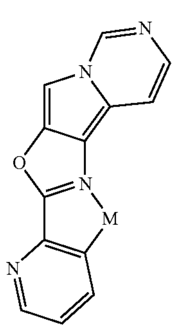
L496
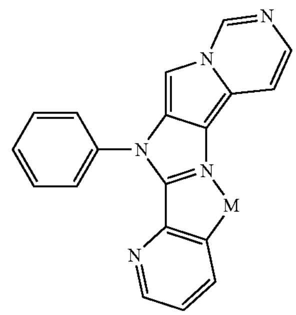
L497
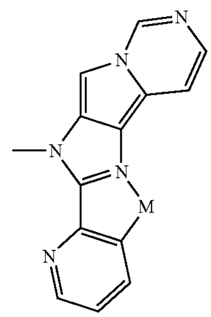
L498
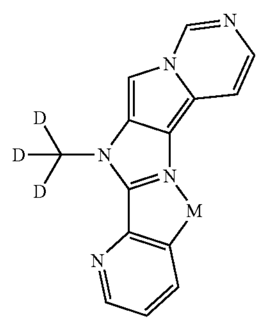
L499
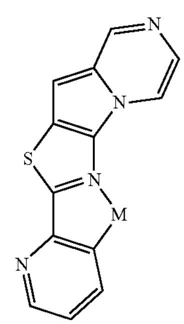
L500
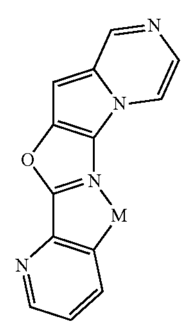

L501
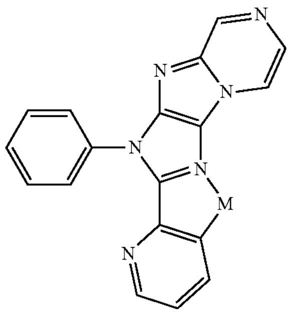
L502
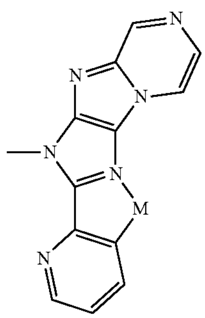
L503
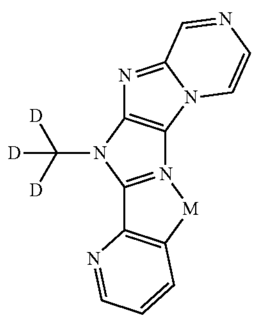
L504
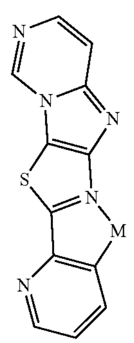
L505
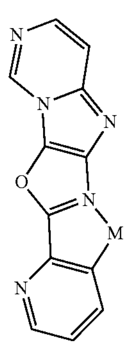
L506
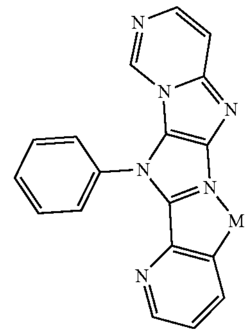
L507
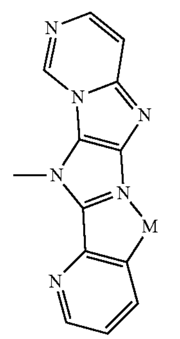
L508
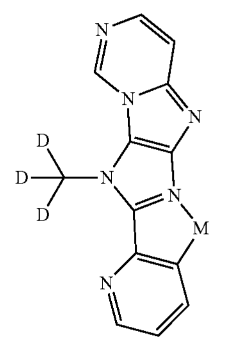
L509
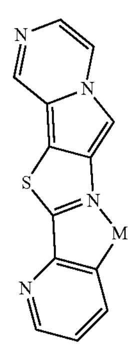

-continued
L510
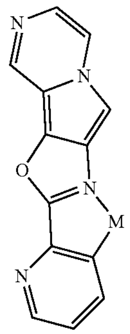
L511
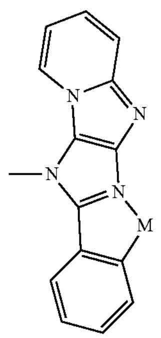
L512
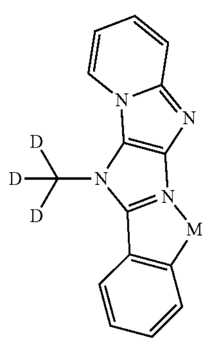
L513
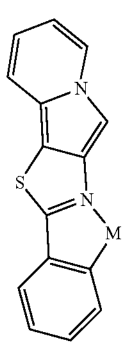
-continued
L514
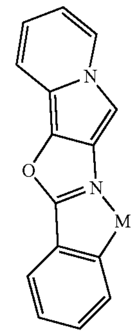
L515
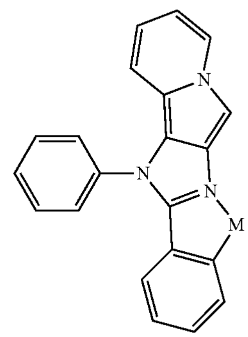
L516
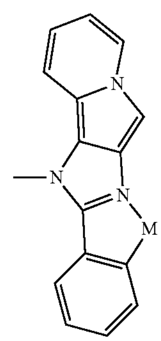
L517
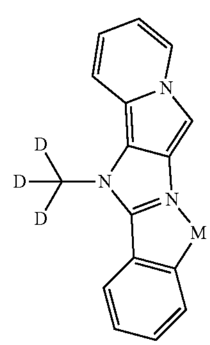

-continued
L518
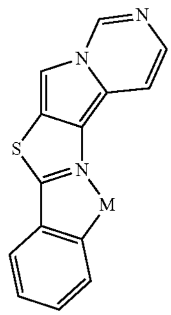
L519
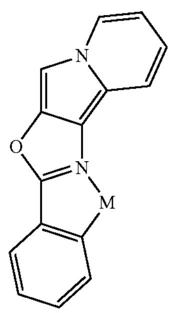
L520
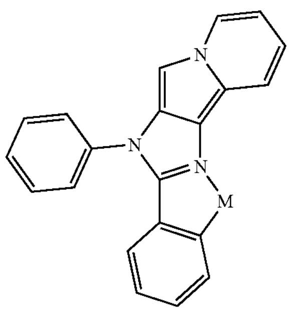
L521
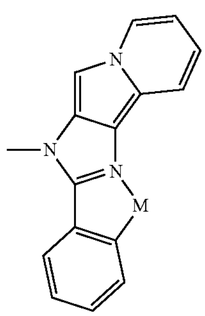
L522
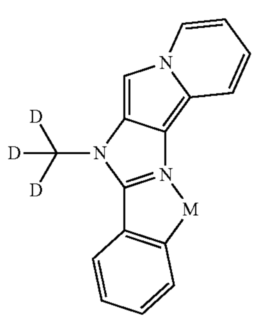
-continued
L523
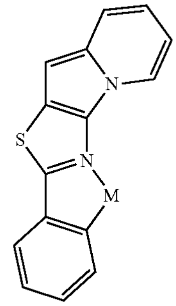
L524
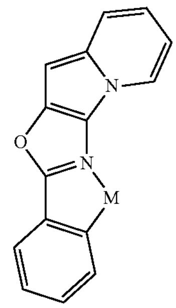
L525
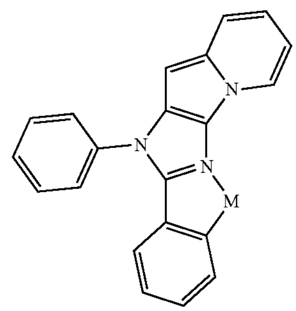
L526
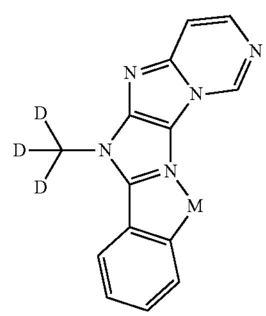
L527
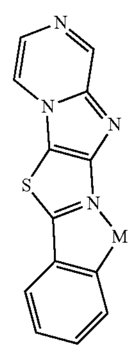

-continued
L528
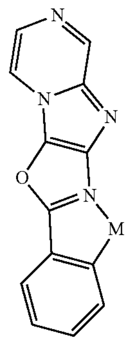
L529
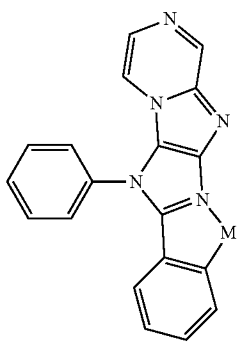
L530
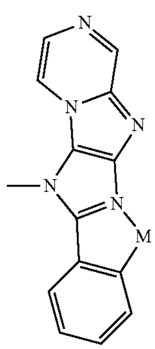
L531
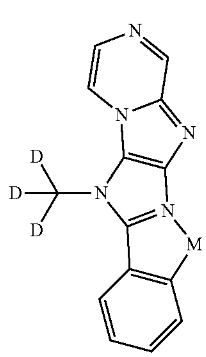
-continued
L532
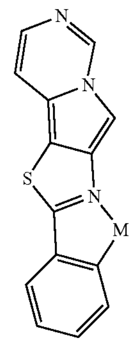
L533
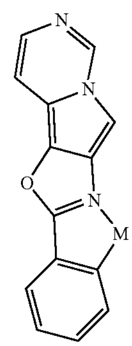
L534
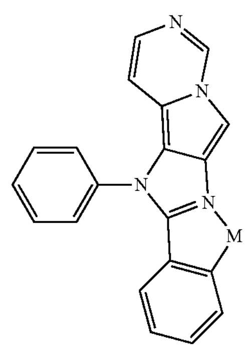
L535
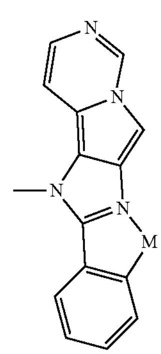

L536
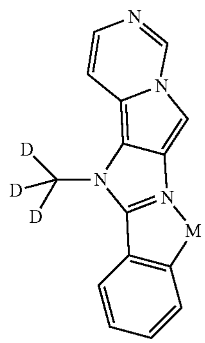
L537
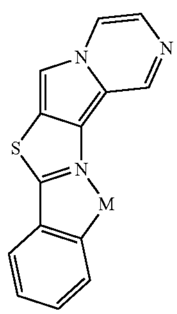
L538
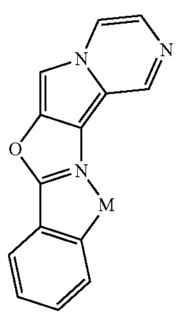
L539
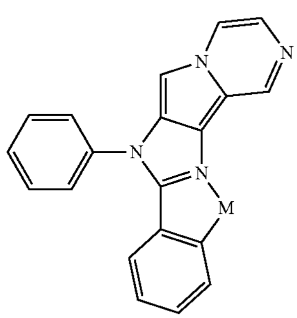
L540
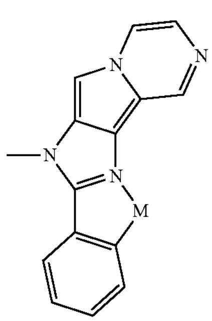
L541
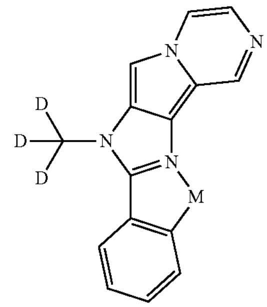
L542
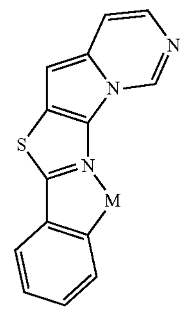
L543
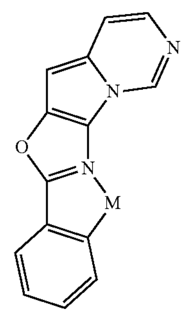
L544
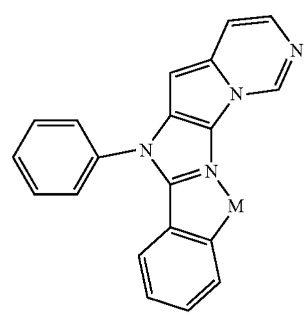
L545
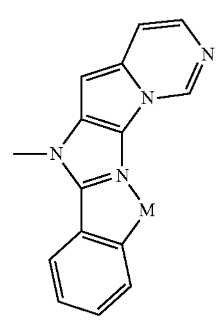

L546
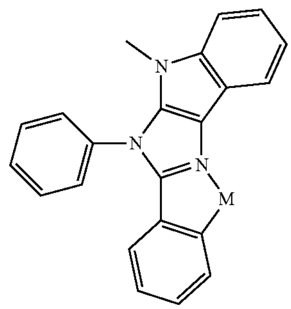
L547
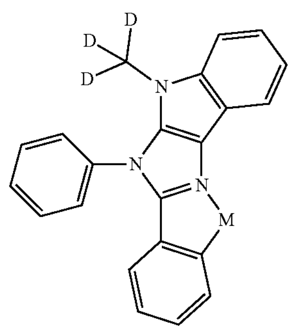
L548
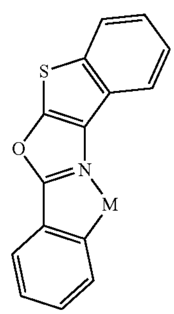
L549
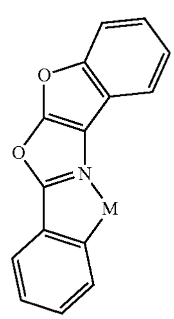
L550
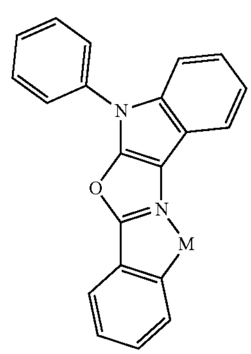
L551
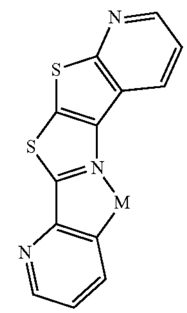
L552
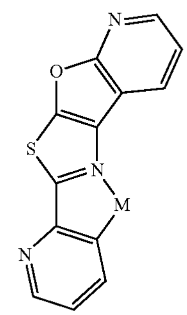
L553
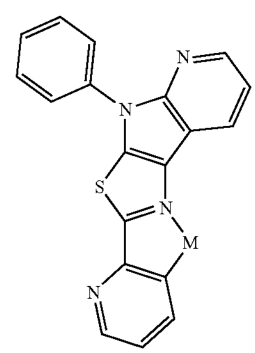
L554
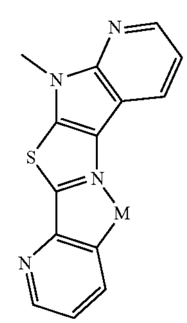
L555
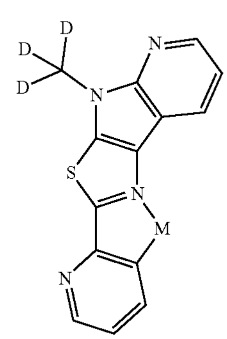

-continued
L556
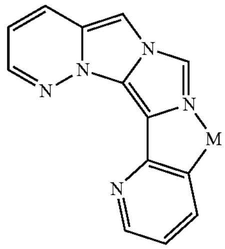
L557
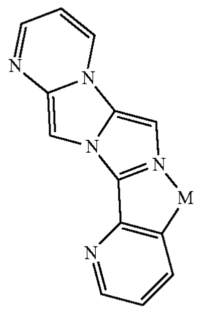
L558
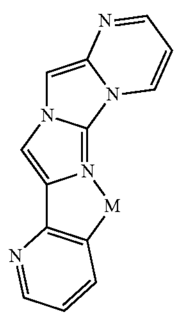
L559
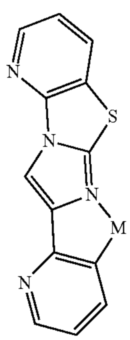
L560
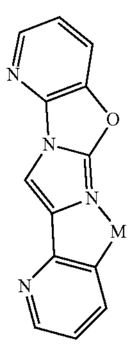
-continued
L561
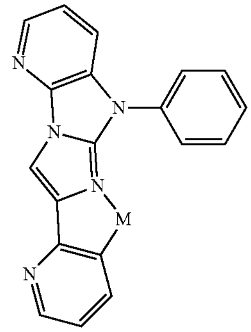
L562
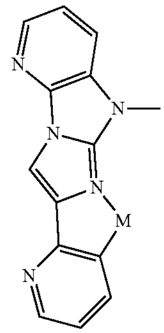
L563
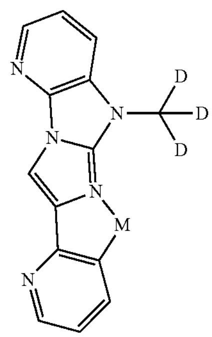
L564
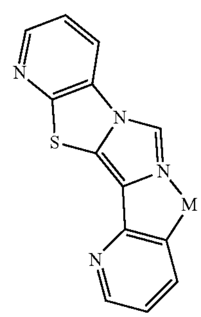
L565
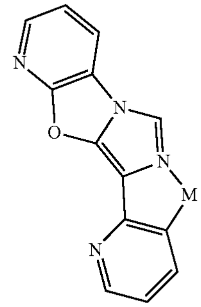

-continued
L566
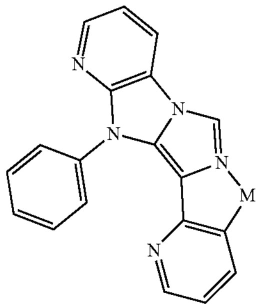
L567
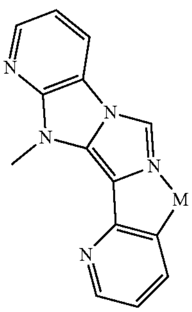
L568
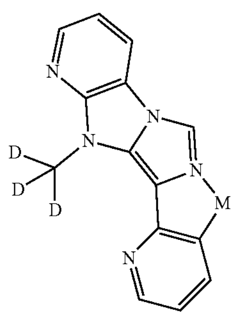
L569
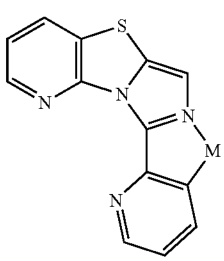
L570
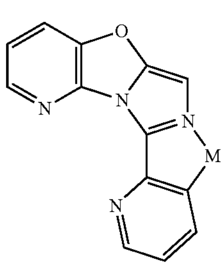
-continued
L571
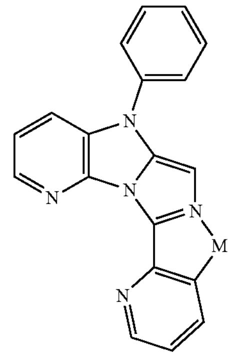
L572
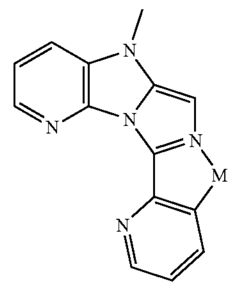
L573
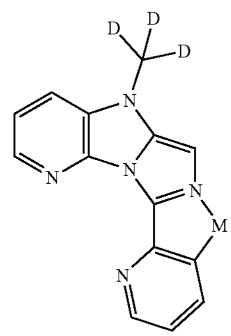
L574
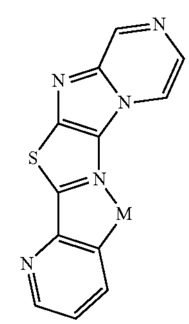
L575
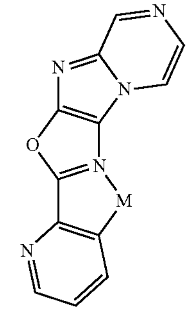

-continued
L576
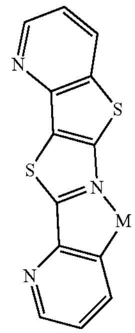
L577
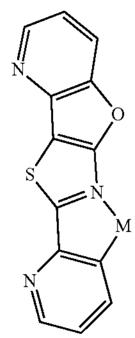
L578
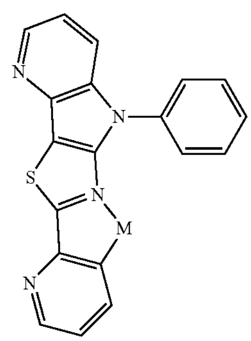
L579
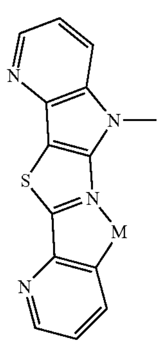
-continued
L580
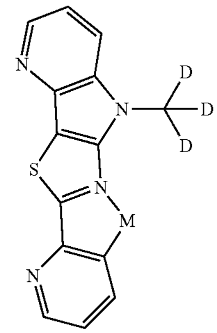
L581
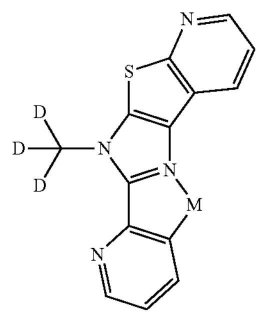
L582
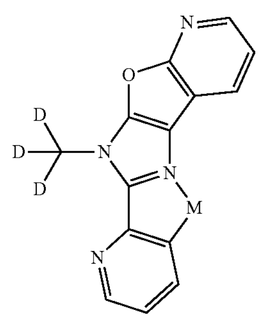
L583
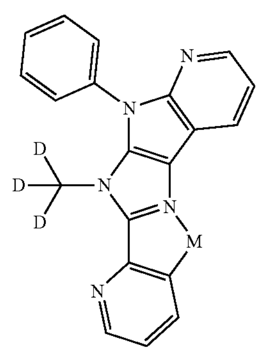
L584
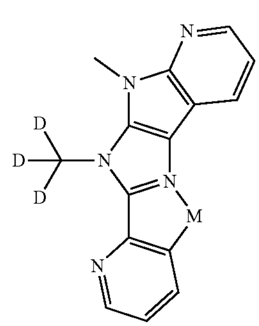

-continued
L585
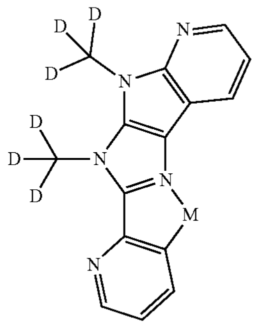
L586
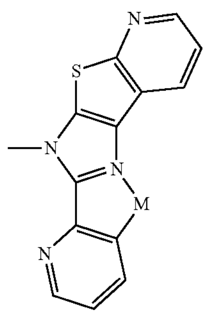
L587
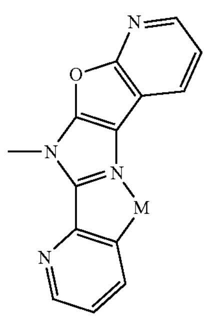
L588
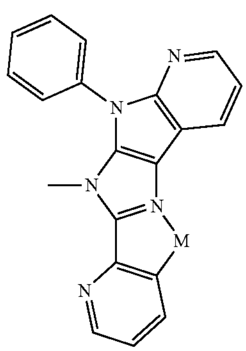
L589
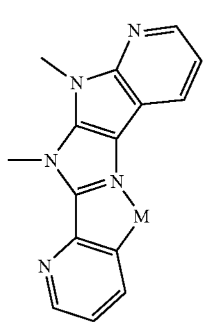
L590
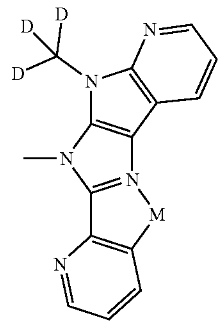
L591
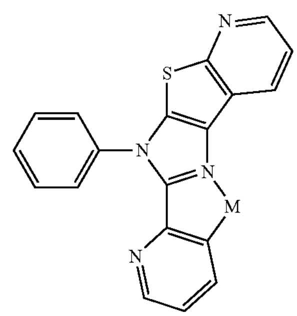
L592
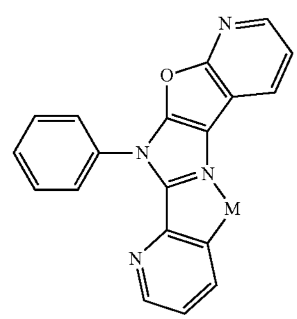
L593
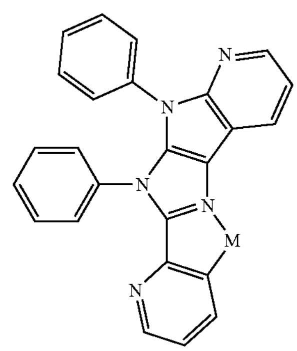
L594
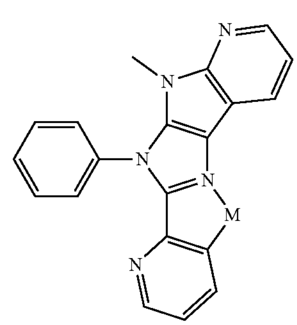

L595
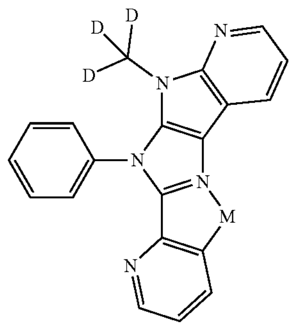
L596
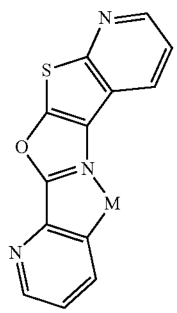
L597
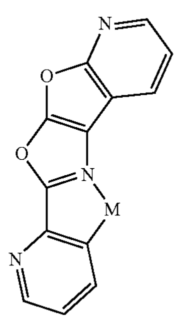
L598
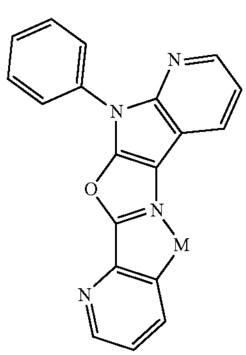
L599
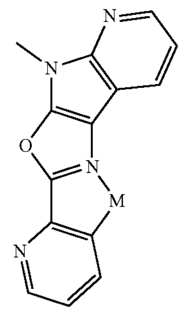
L600
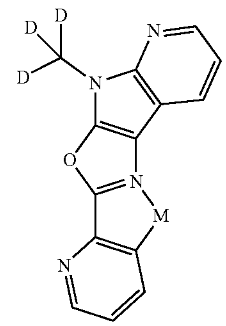
L601
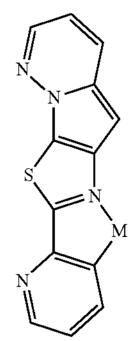
L602
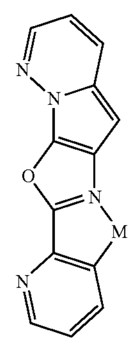
L603
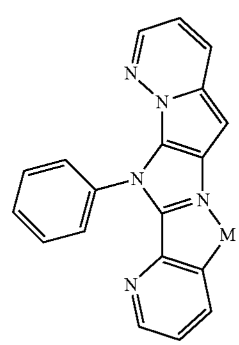

-continued
L604
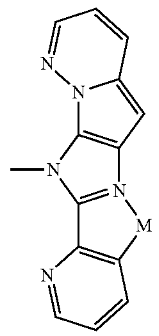
L605
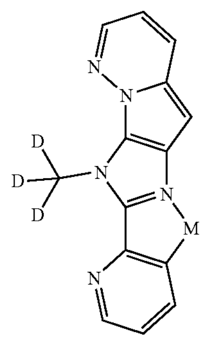
L606
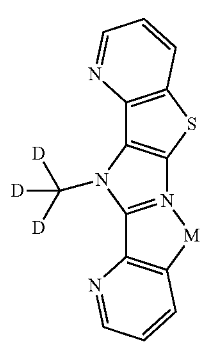
L607
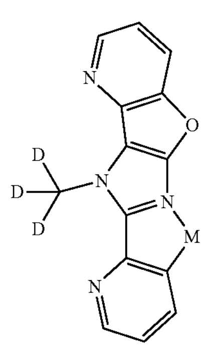
-continued
L608
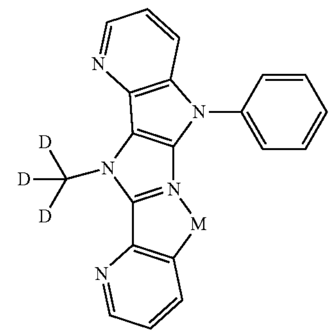
L609
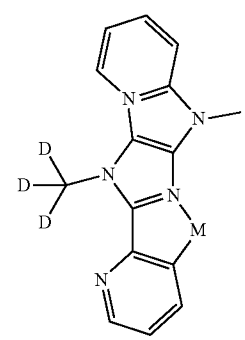
L610
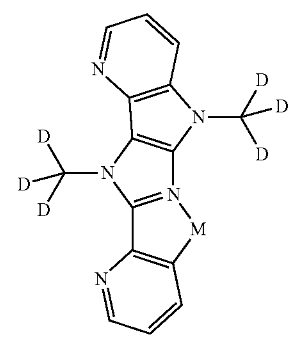
L611
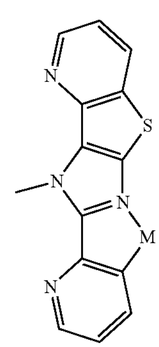

-continued
L612
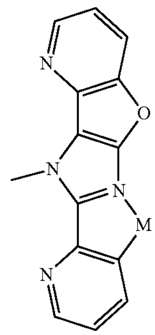
L613
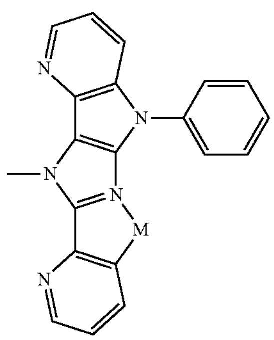
L614
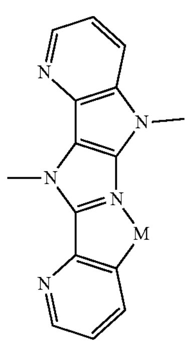
L615
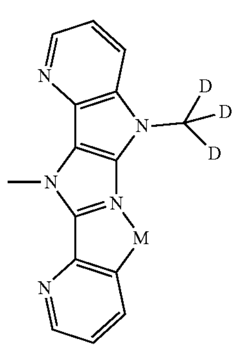
-continued
L616
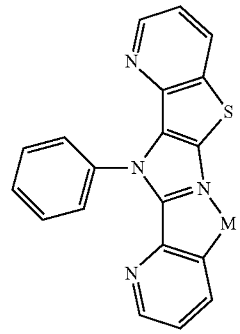
L617
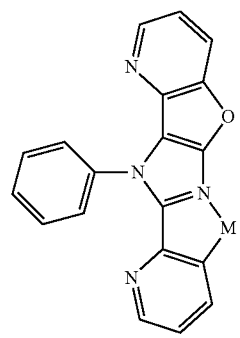
L618
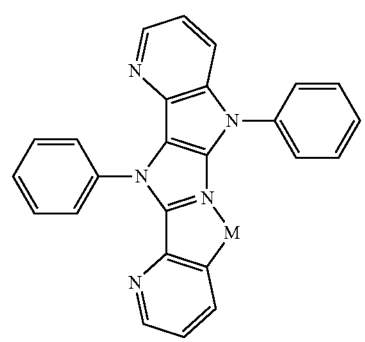
L619
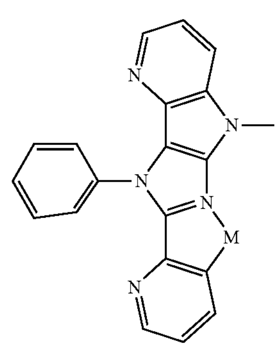

-continued
L620
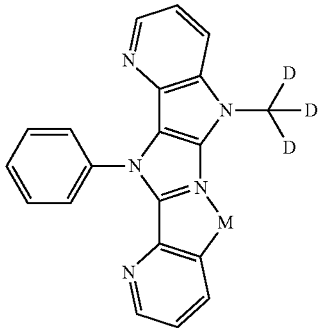
L621
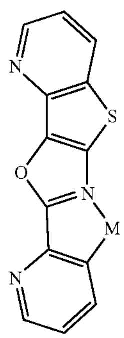
L622
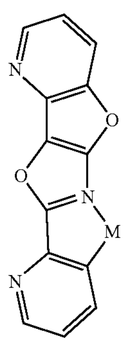
L623
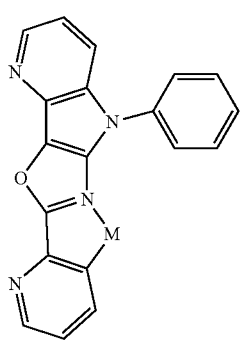
-continued
L624
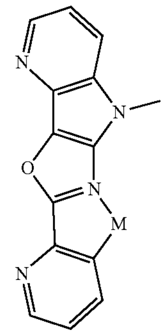
L625
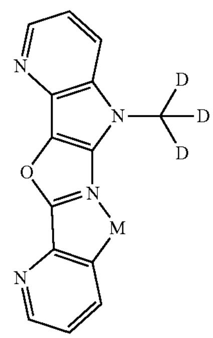
L626
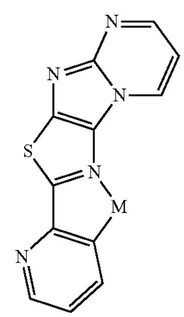
L627
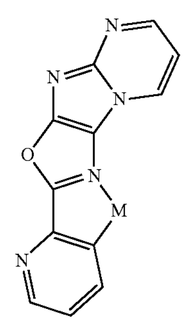
L628
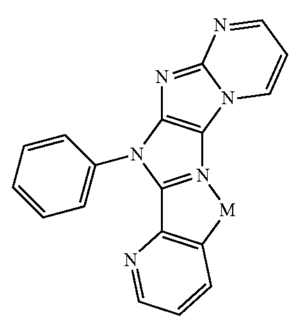

-continued
L629
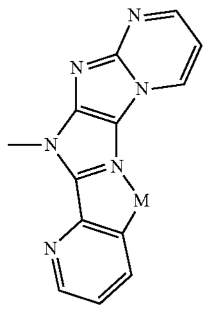
L630
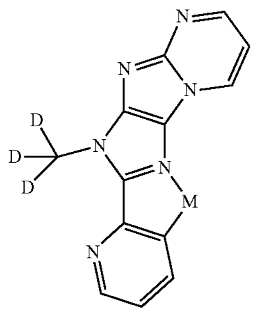
L631
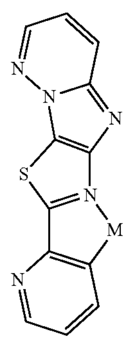
L632
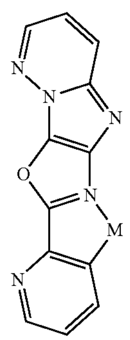
L633
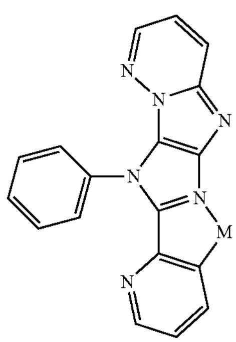
-continued
L634
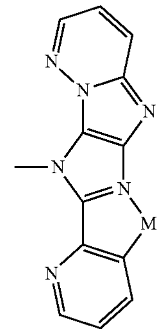
L635
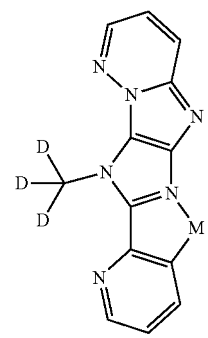
L636
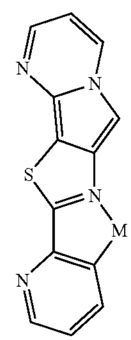
L637
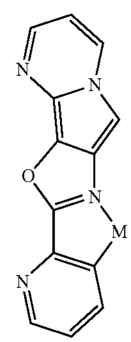

-continued
L638
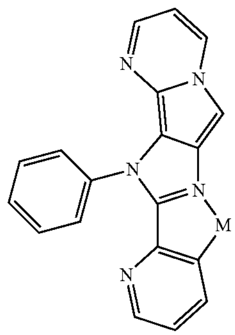
L639
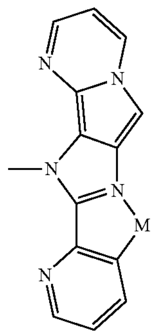
L640
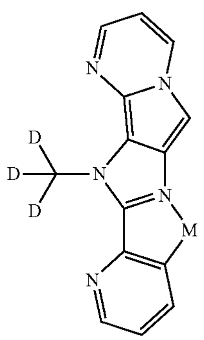
L641
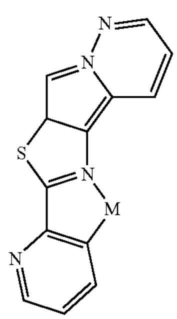
L642
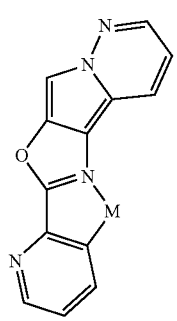
-continued
L643
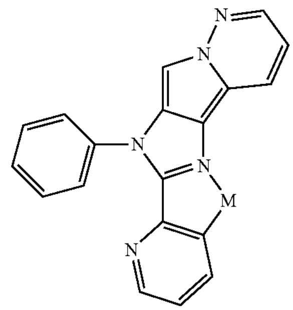
L644
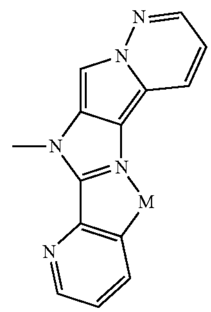
L645
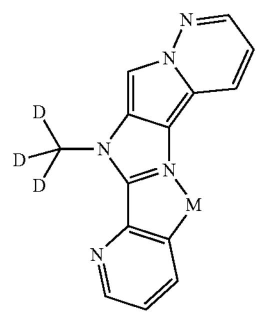
L646
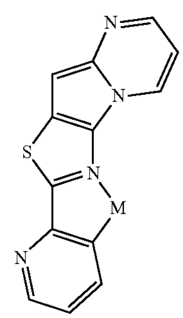
L647
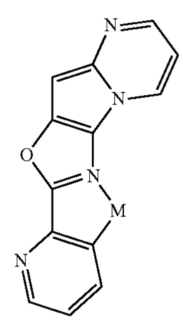

-continued
L648
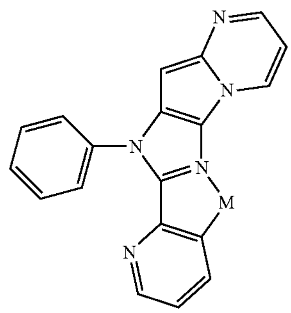
L649
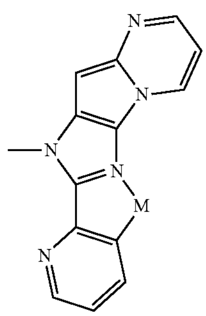
L650
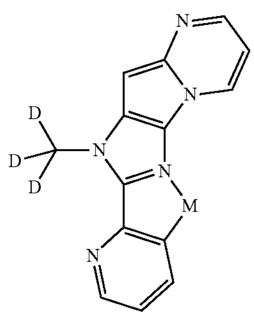
L651
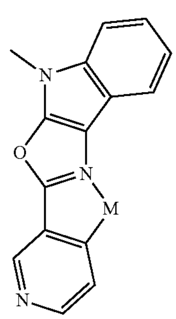
L652
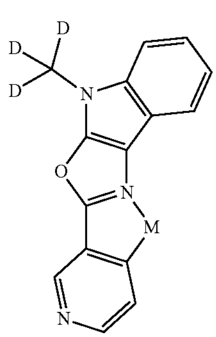
-continued
L653
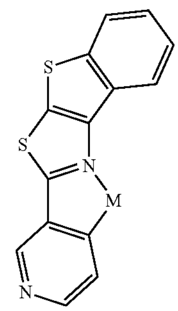
L654
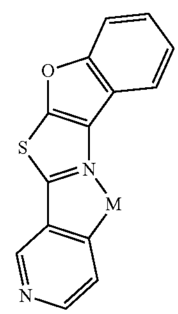
L655
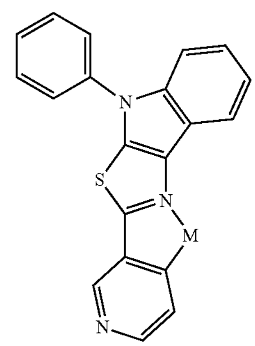
L656
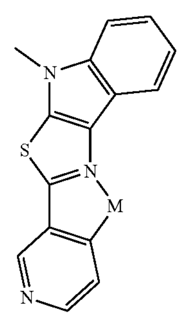
L657
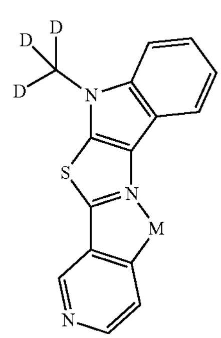

-continued
L658
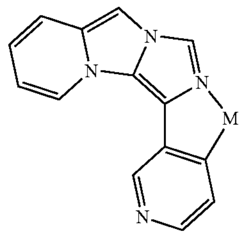
L659
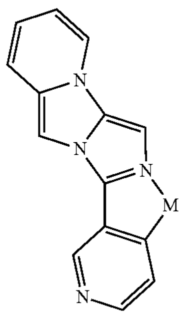
L660
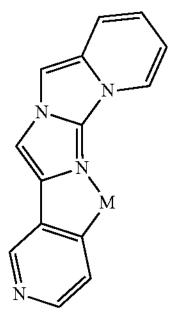
L661
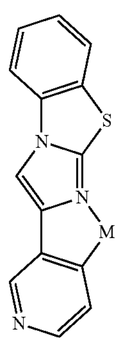
L662
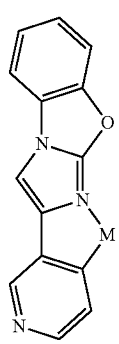
-continued
L663
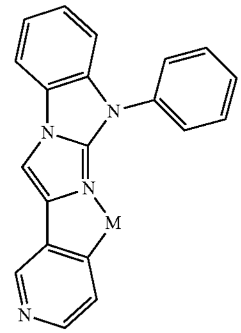
L664
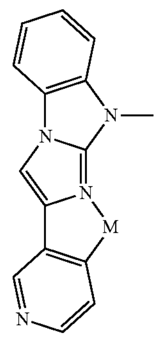
L665
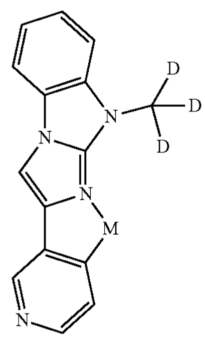
L666
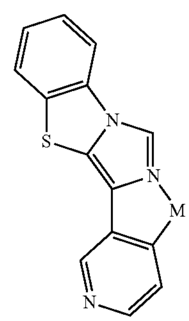
L667
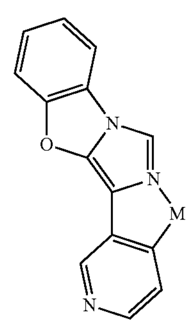

L668
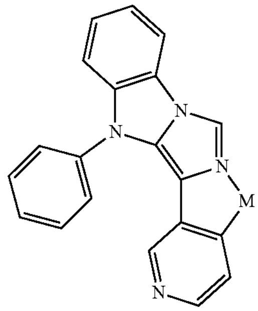
L669
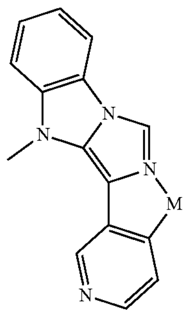
L670
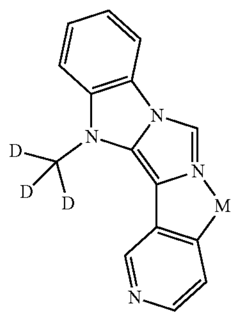
L671
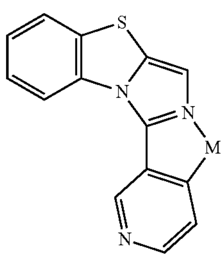
L672
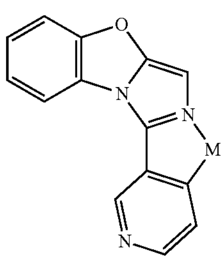
L673
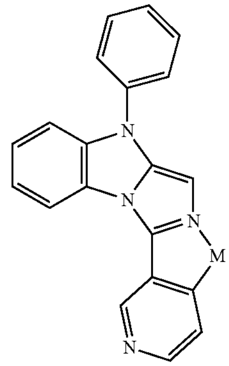
L674
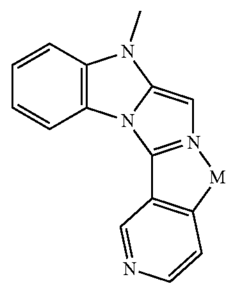
L675
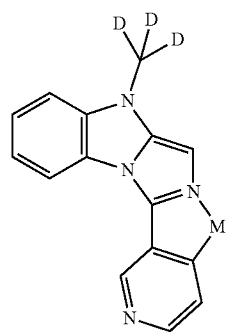
L676
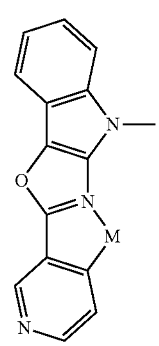

-continued
L677
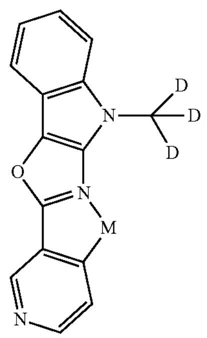
L678
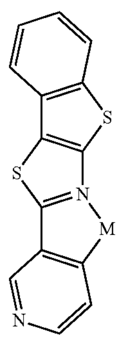
L679
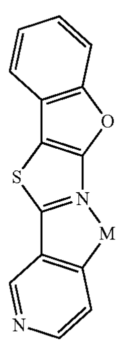
L680
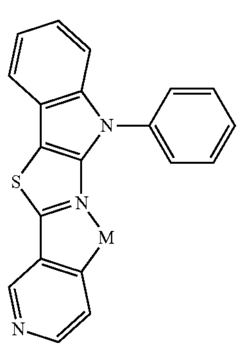
-continued
L681
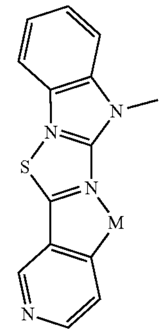
L682
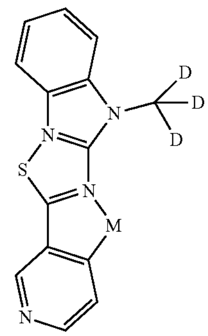
L683
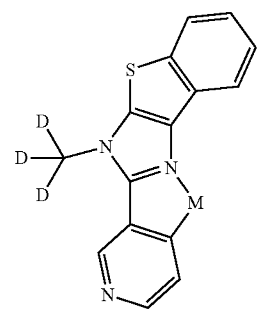
L684
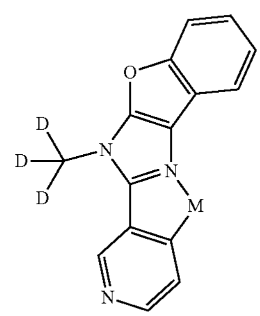
L685
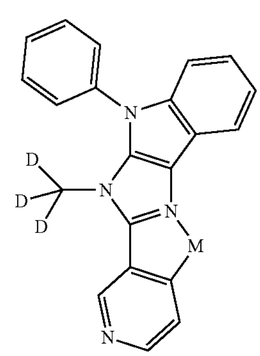

-continued
L686
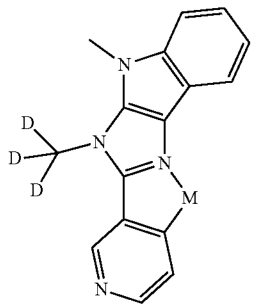
L687
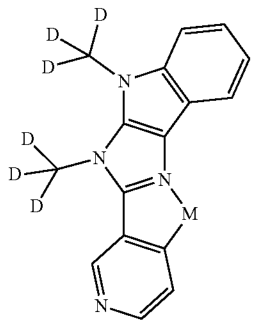
L688
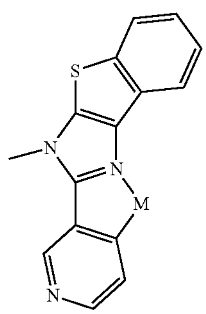
L689
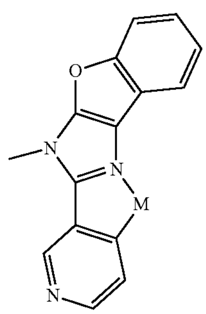
L690
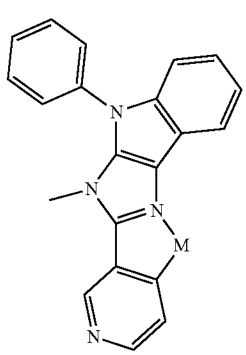
-continued
L691
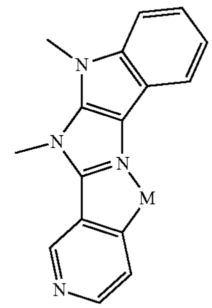
L692
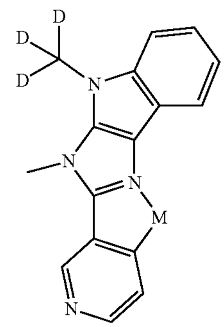
L693
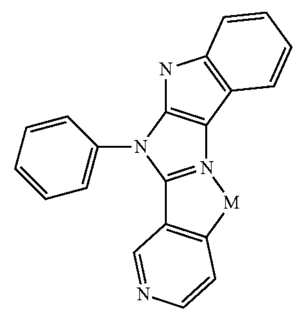
L694
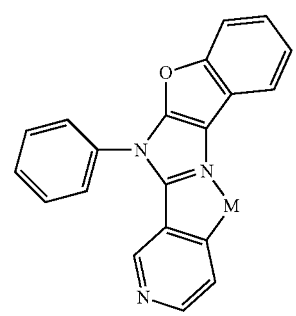
L695
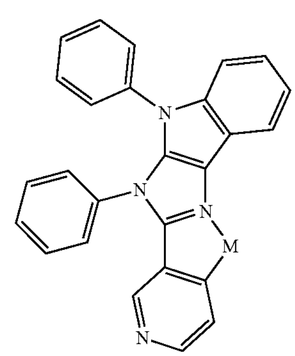

-continued
L696
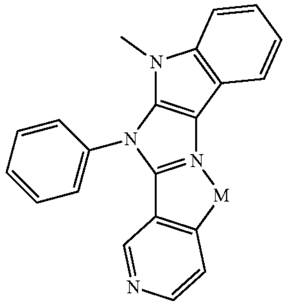
L697
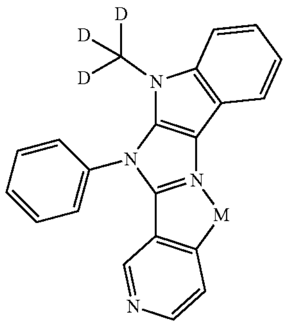
L698
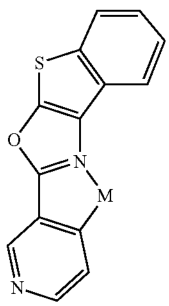
L699
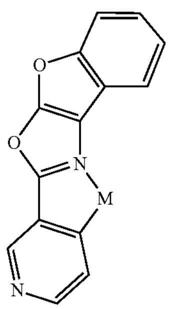
L700
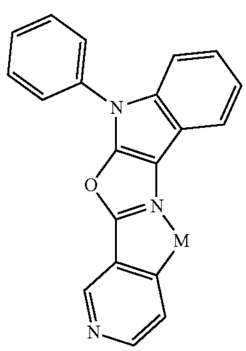
-continued
L701
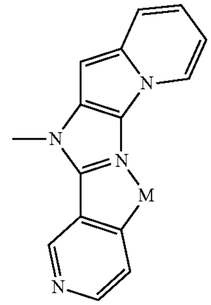
L702
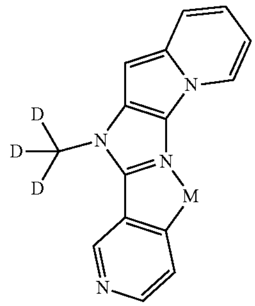
L703
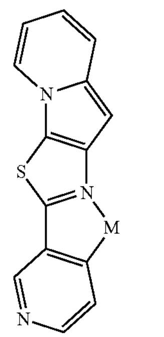
L704
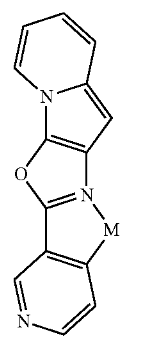
L705
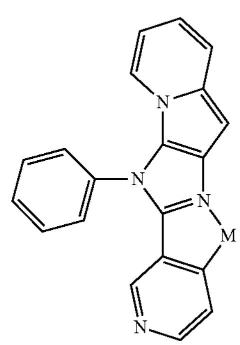

-continued
L706
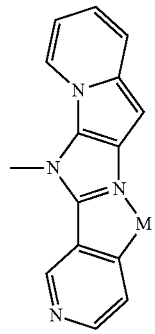
L707
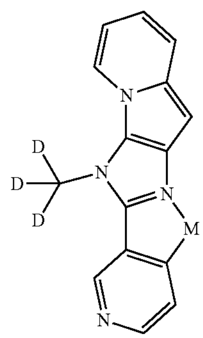
L708
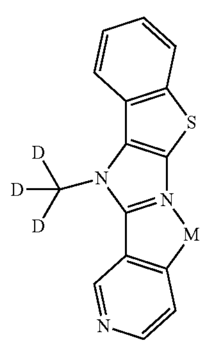
L709
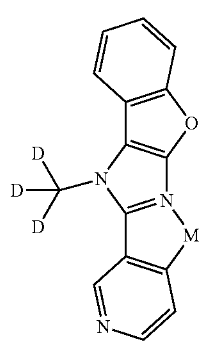
-continued
L710
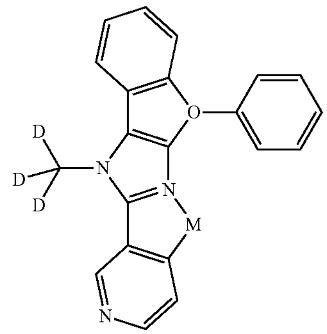
L711
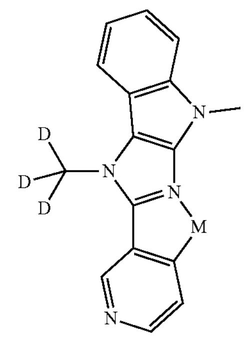
L712
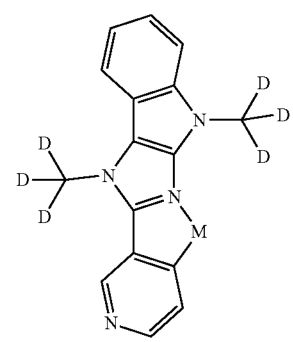
L713
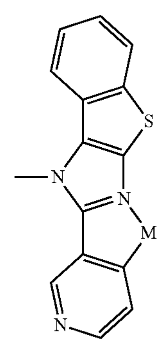

-continued
L714
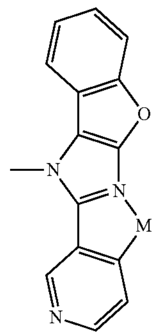
L715
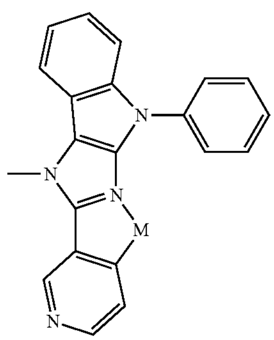
L716
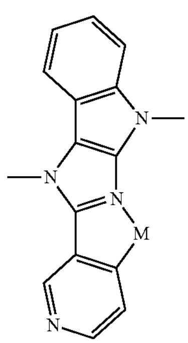
L717
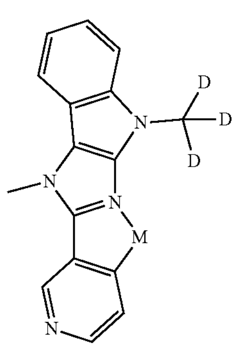
-continued
L718
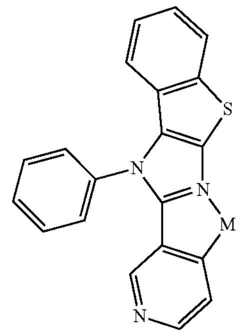
L719
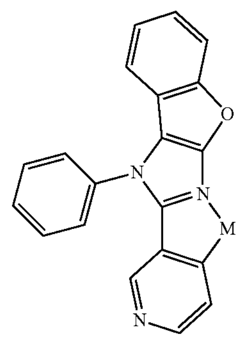
L720
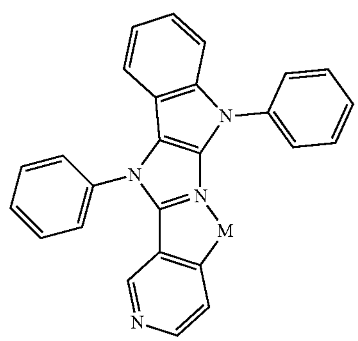
L721
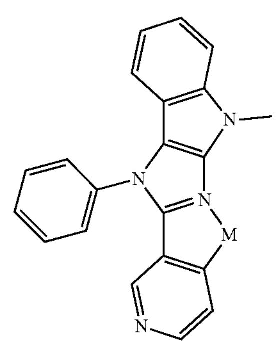

-continued
L722
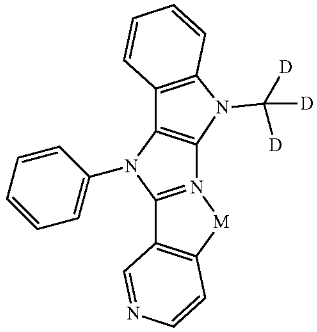
L723
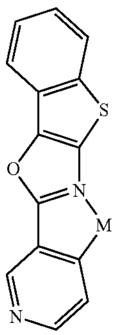
L724
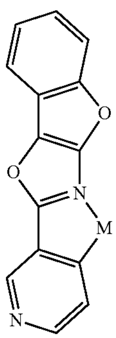
L725
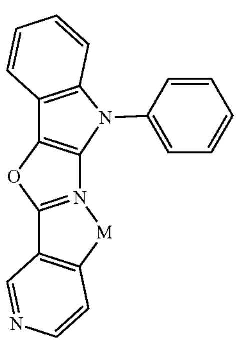
L726
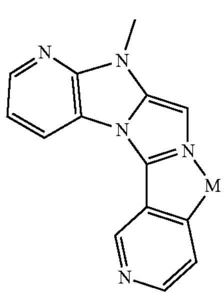
-continued
L727
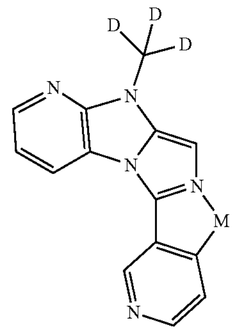
L728
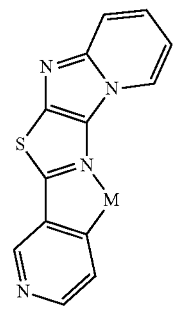
L729
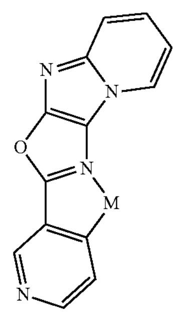
L730
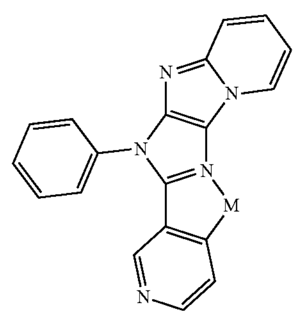
L731
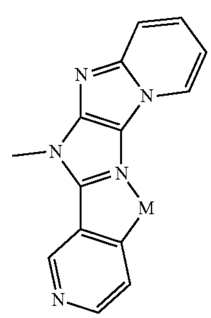

-continued
L732
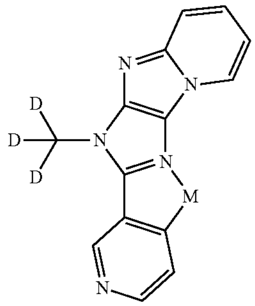
L733
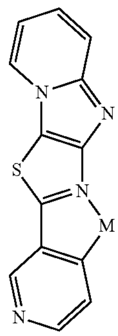
L734
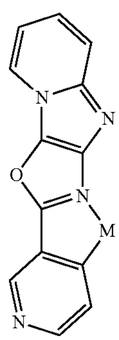
L735
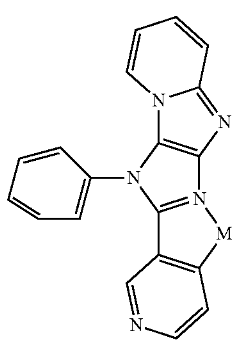
-continued
L736
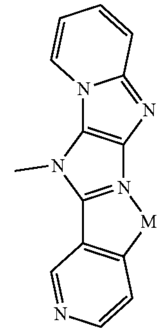
L737
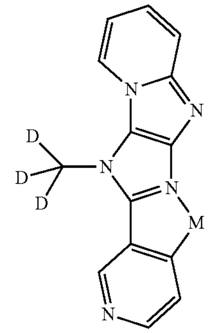
L738
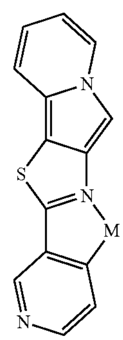
L739
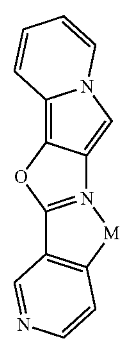

-continued
L740
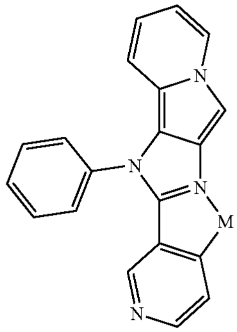
L741
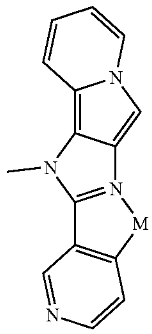
L742
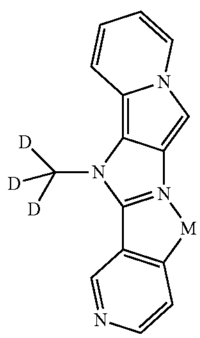
L743
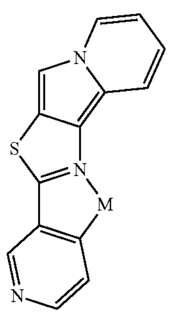
L744
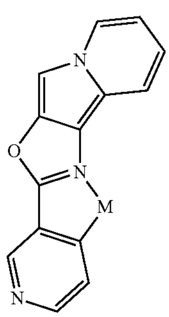
-continued
L745
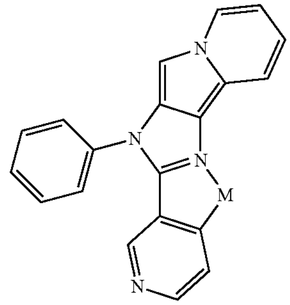
L746
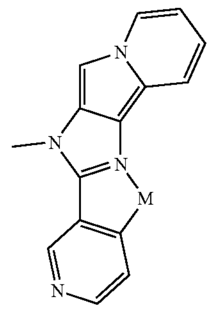
L747
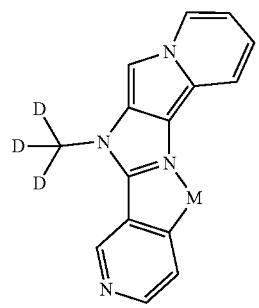
L748
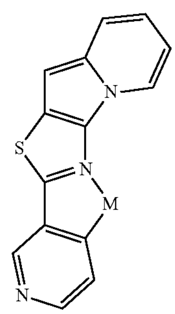
L749
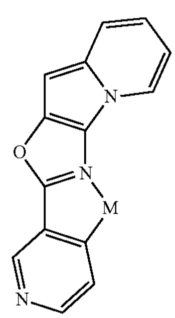

L750
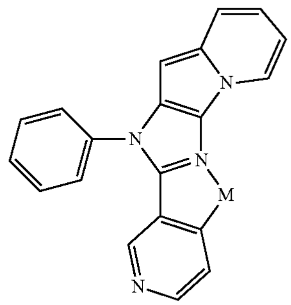
L751
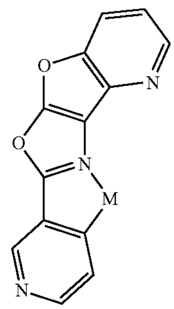
L752
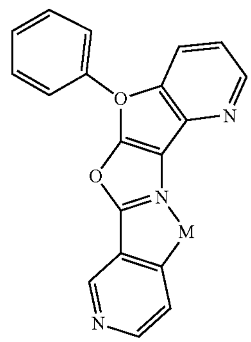
L753
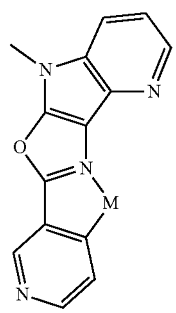
L754
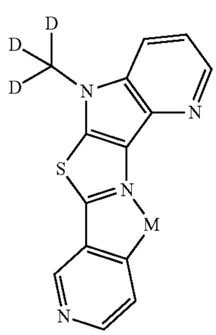
L755
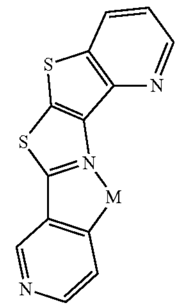
L756
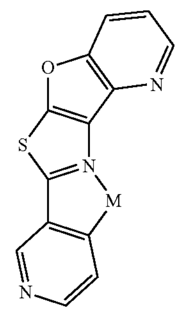
L757
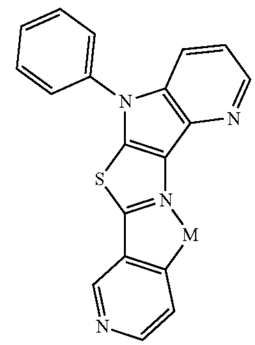
L758
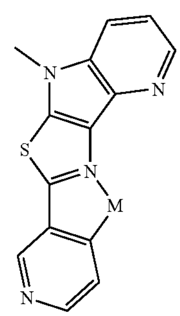
L759
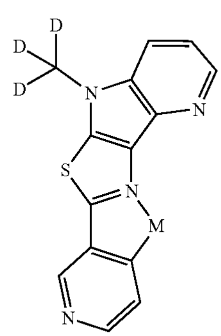

L760
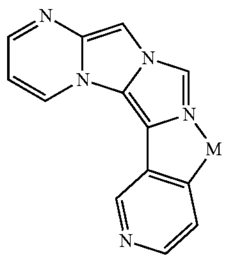
L761
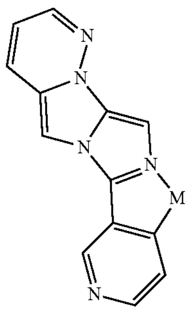
L762
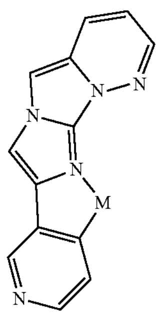
L763
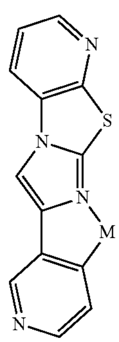
L764
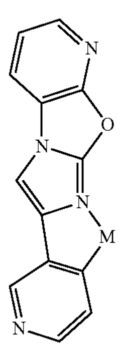
L765
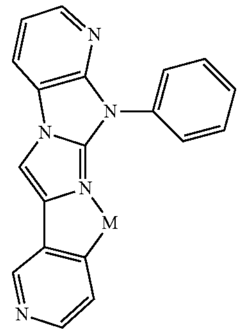
L766
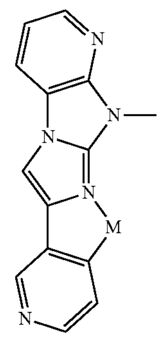
L767
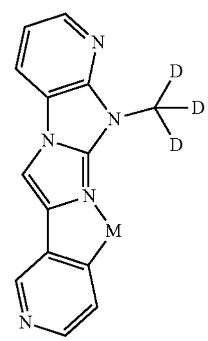
L768
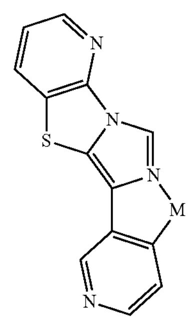
L769
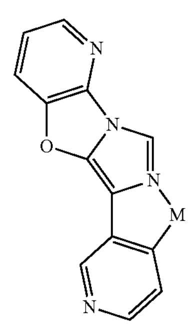

-continued
L770
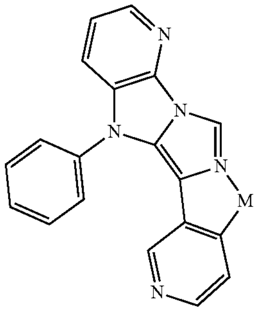
L771
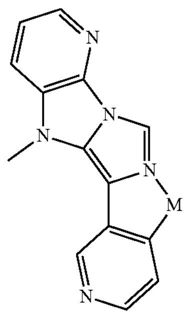
L772
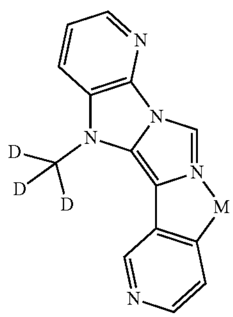
L773
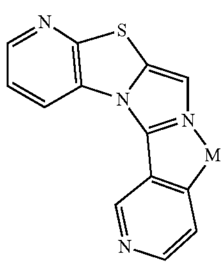
L774
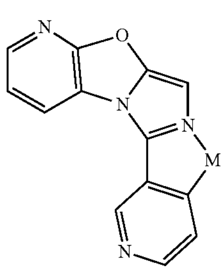
-continued
L775
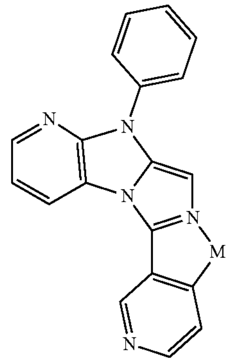
L776
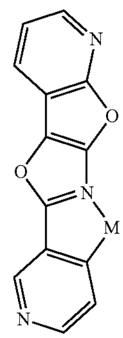
L777
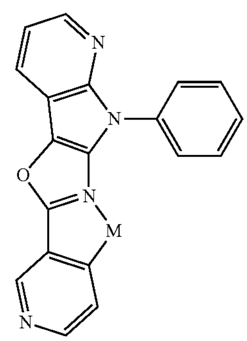
L778
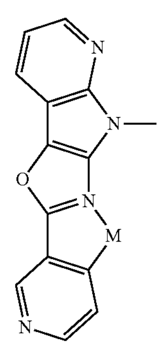

-continued
L779
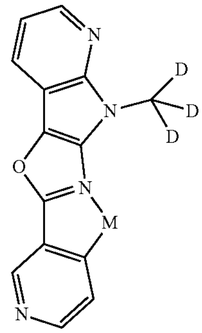
L780
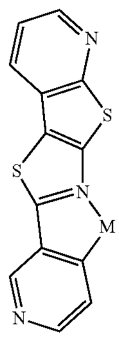
L781
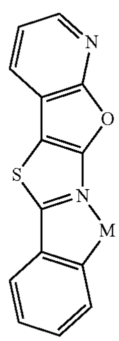
L782
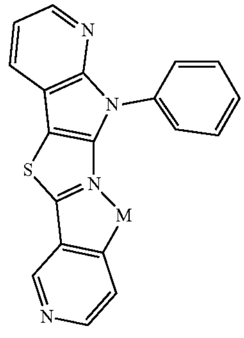
-continued
L783
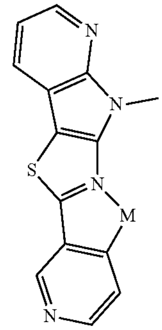
L784
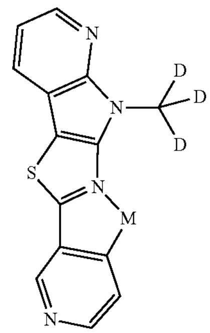
L785
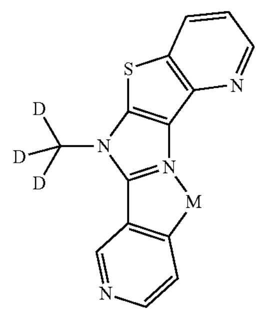
L786
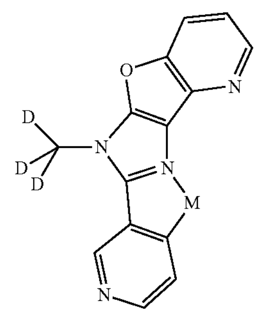
L787
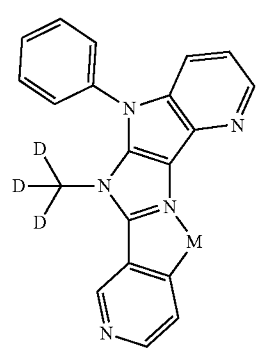

-continued
L788
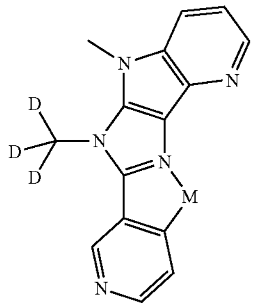
L789
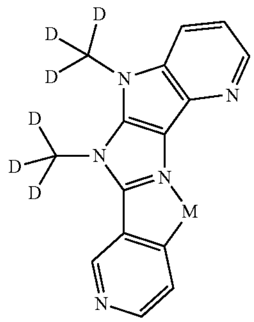
L790
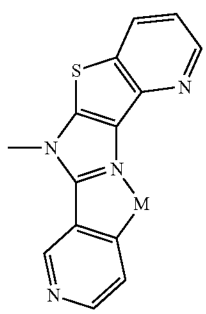
L791
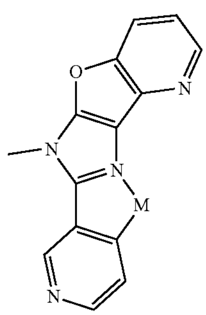
L792
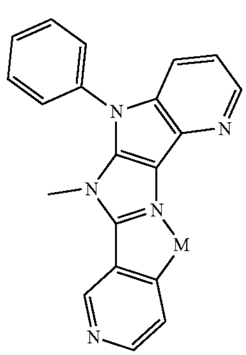
-continued
L793
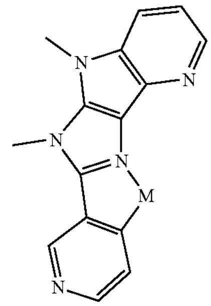
L794
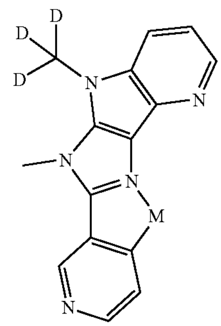
L795
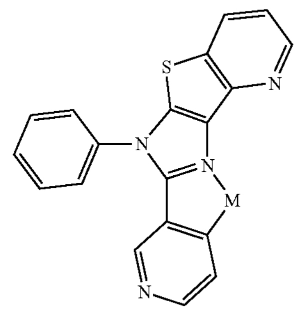
L796
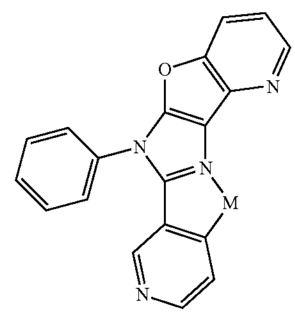
L797
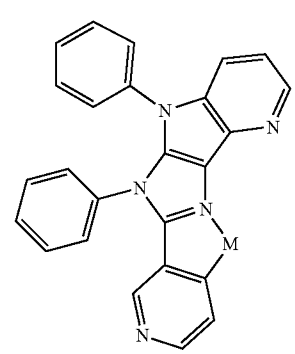

-continued
L798
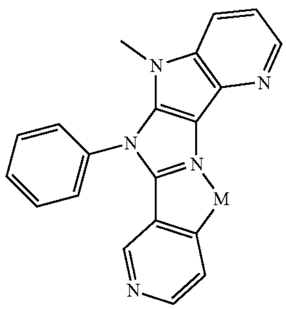
L799
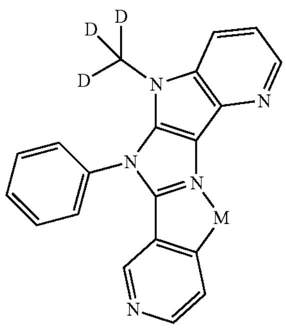
L800
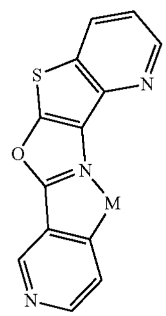
L801
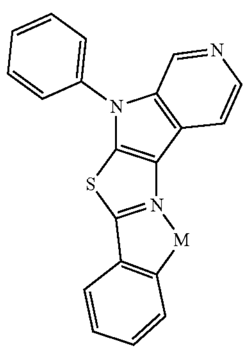
L802
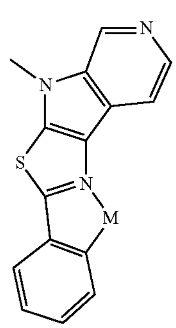
-continued
L803
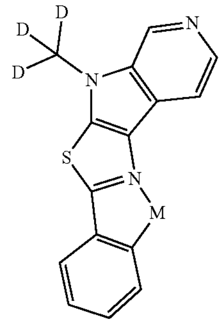
L804
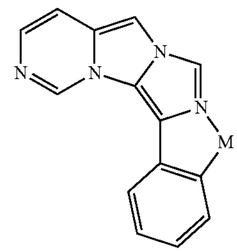
L805
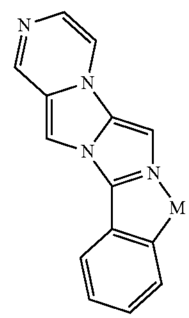
L806
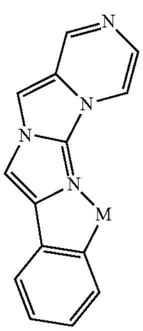
L807
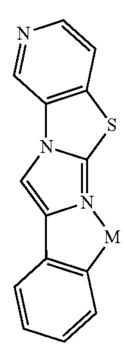

-continued
L808
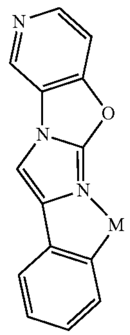
L809
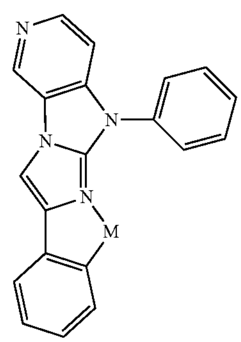
L810
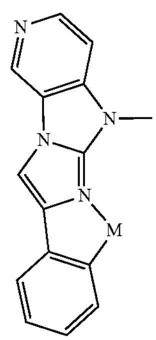
L811
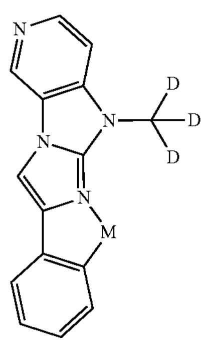
-continued
L812
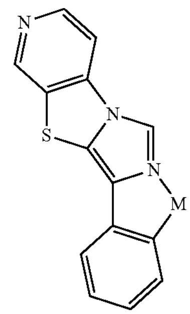
L813
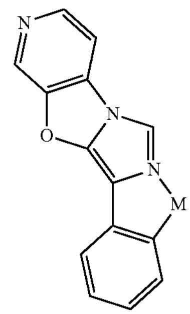
L814
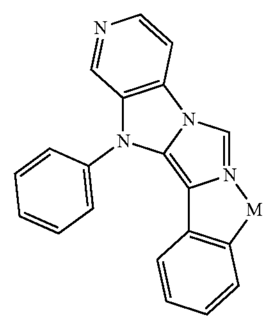
L815
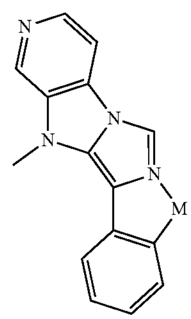
L816
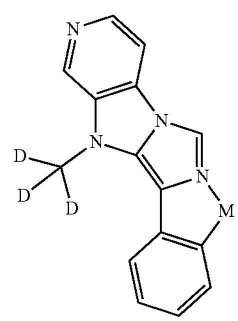

-continued
L817
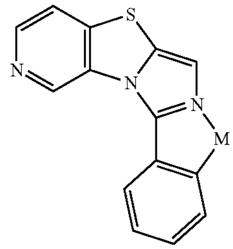
L818
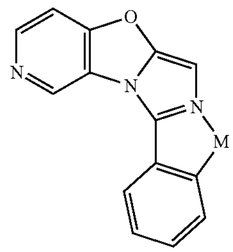
L819
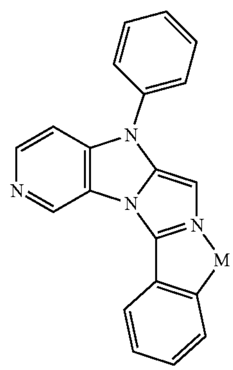
L820
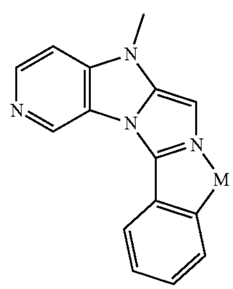
L821
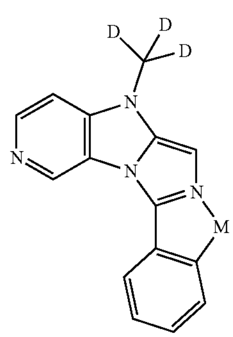
-continued
L822
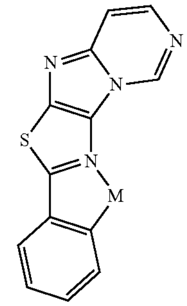
L823
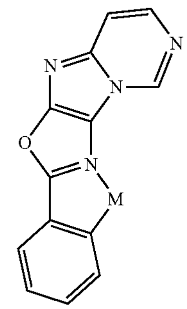
L824
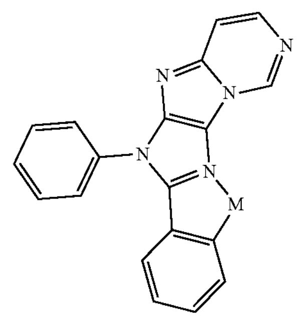
L825
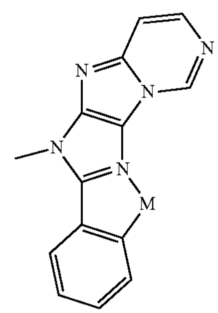
L826
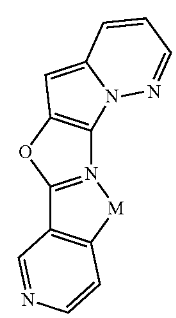

-continued
L827
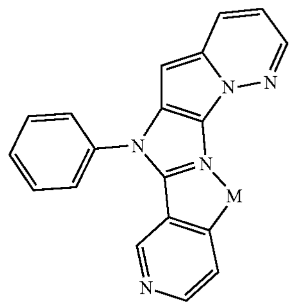
L828
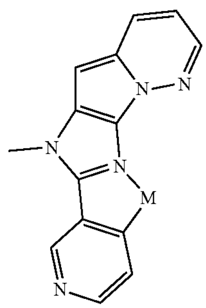
L829
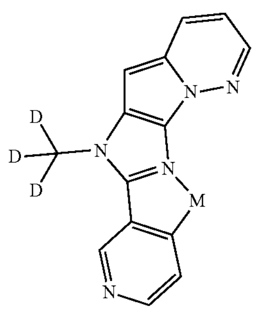
L830
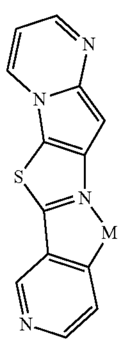
L831
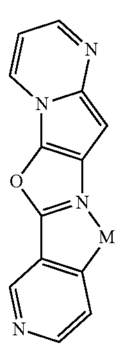
-continued
L832
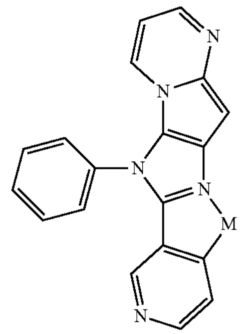
L833
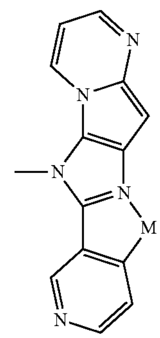
L834
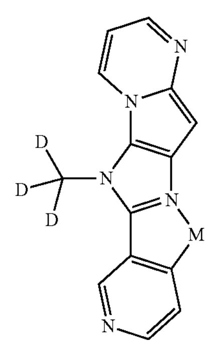
L835
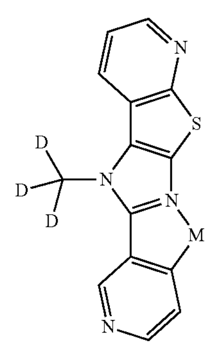

L836
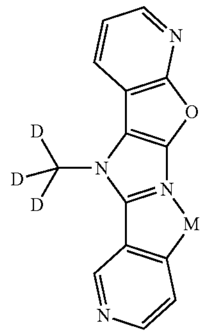
L840
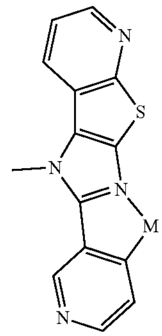
L837
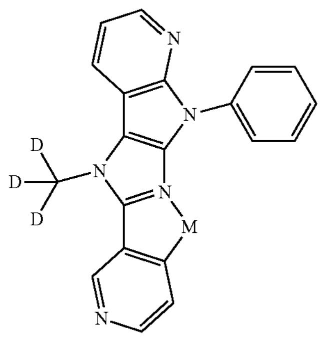
L841
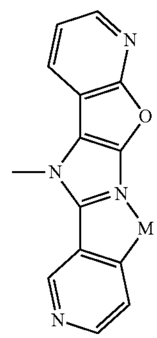
L838
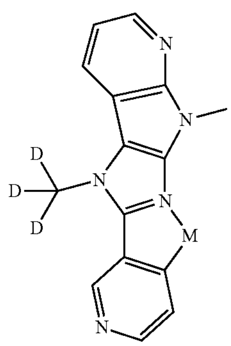
L842
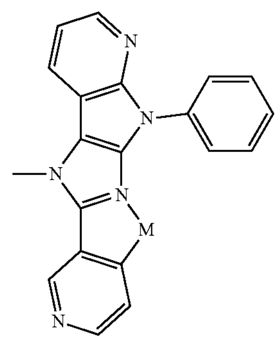
L839
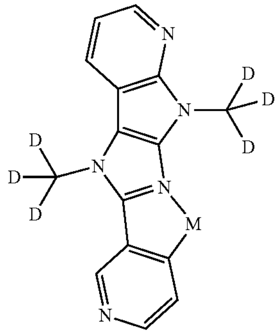
L843
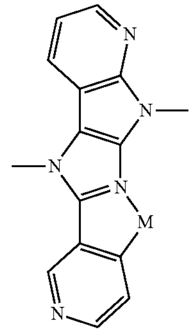

-continued
L844
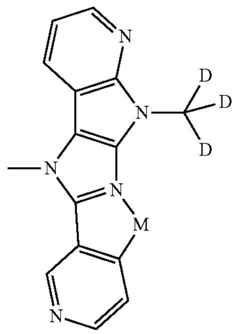
L845
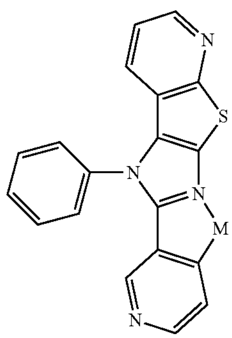
L846
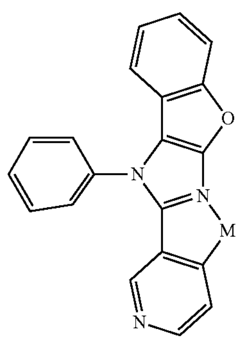
L847
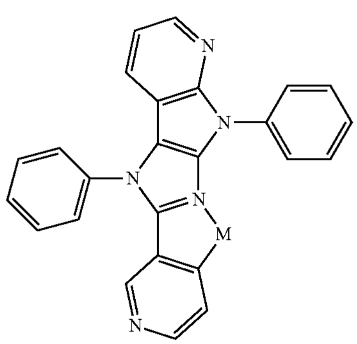
-continued
L848
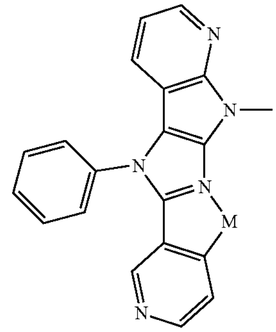
L849
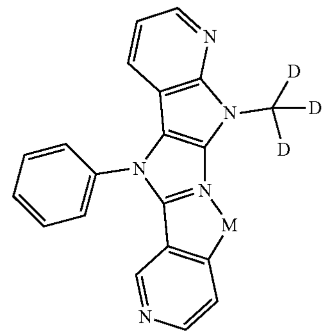
L850
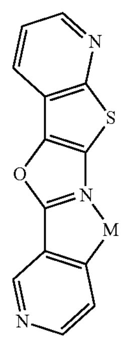
L851
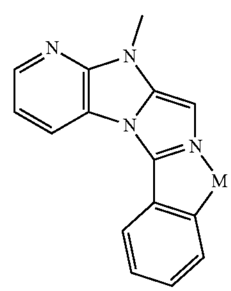
L852
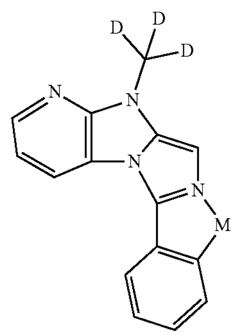

L853
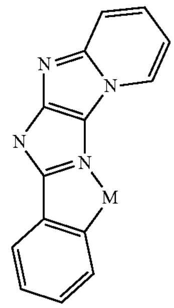
L854
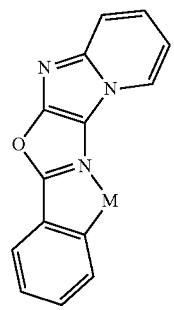
L855
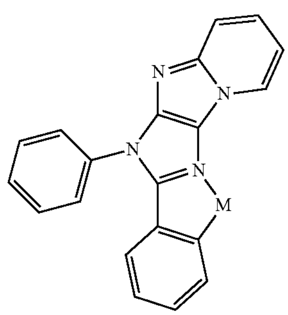
L856
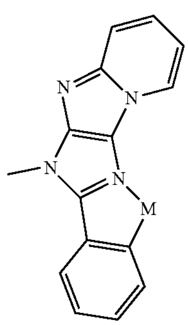
L857
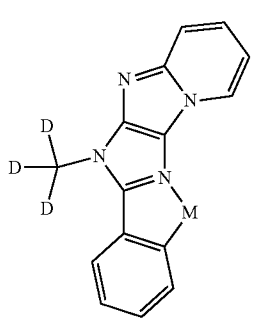
L858
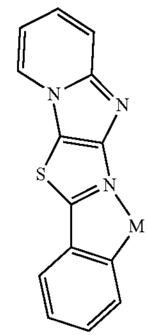
L859
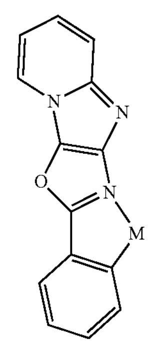
L860
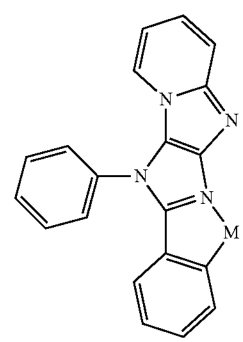
L861
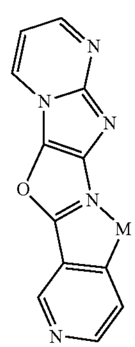

-continued
L862
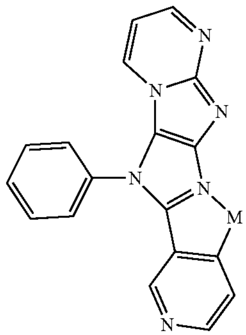
L863
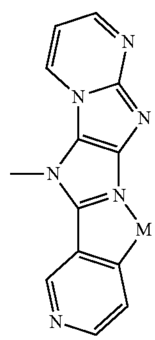
L864
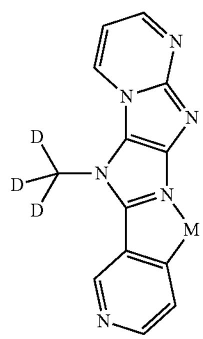
L865
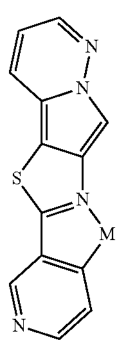
-continued
L866
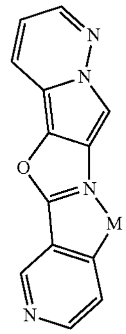
L867
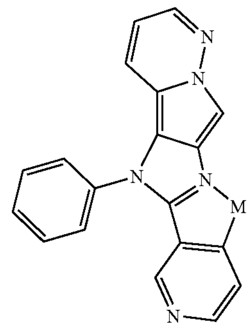
L868
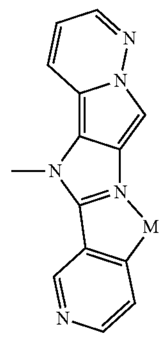
L869
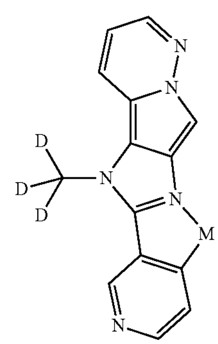
L870
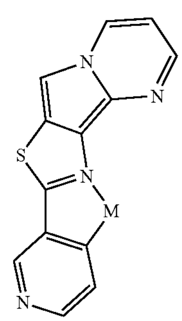

-continued
L871
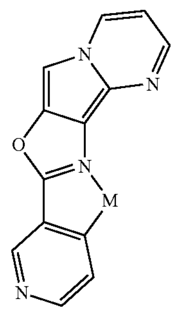
L872
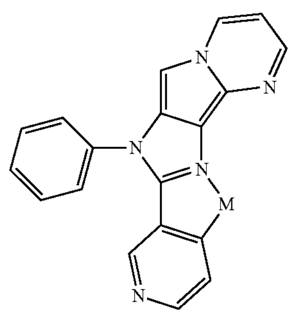
L873
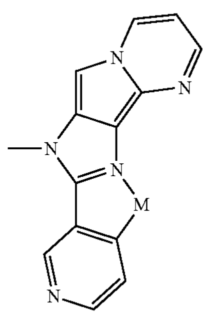
L874
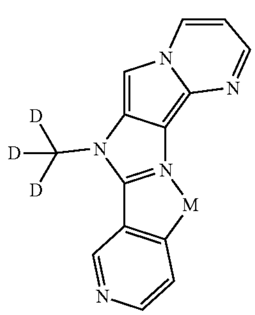
L875
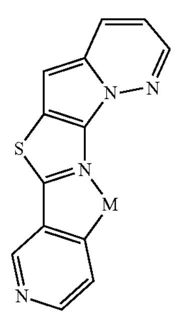
-continued
L876
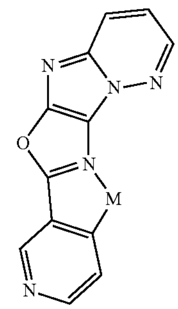
L877
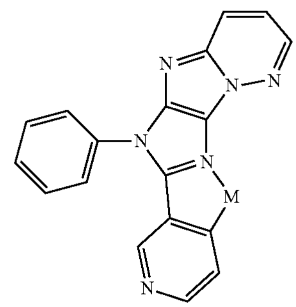
L878
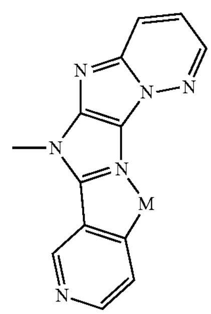
L879
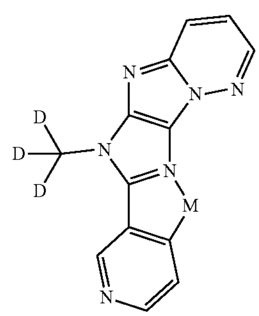
L880
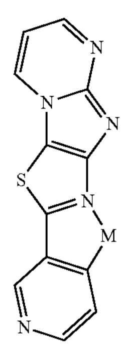

L881
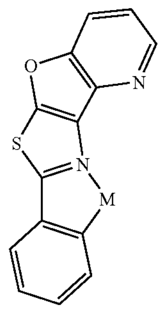
L882
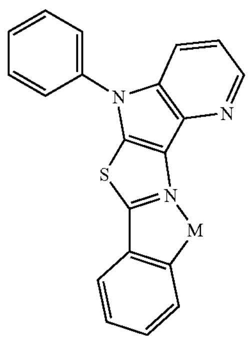
L883
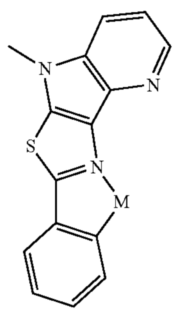
L884
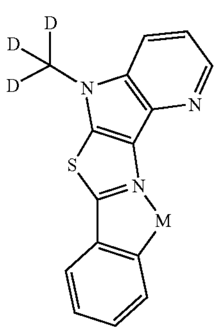
L885
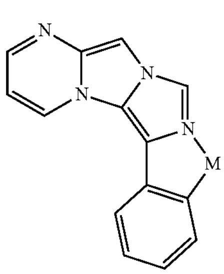
L886
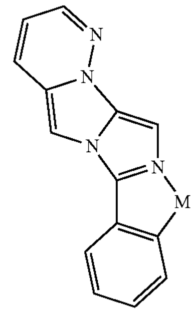
L887
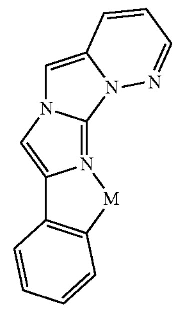
L888
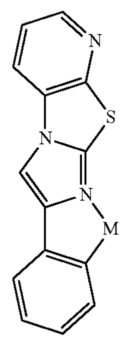
L889
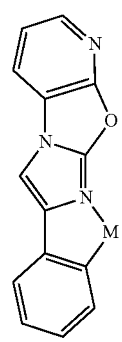
L890
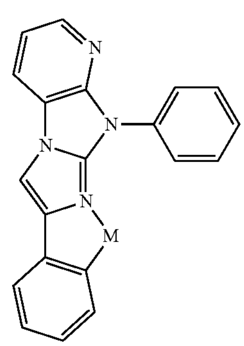

-continued
L891
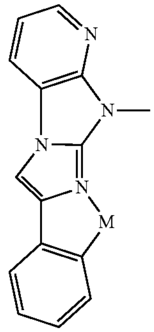
L892
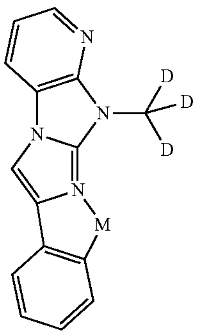
L893
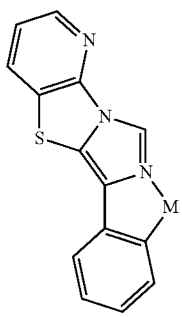
L894
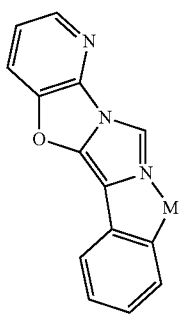
L895
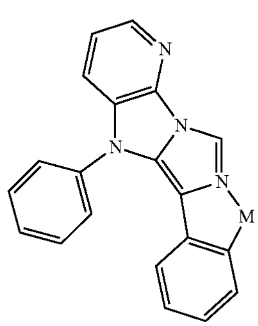
-continued
L896
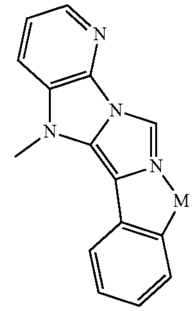
L897
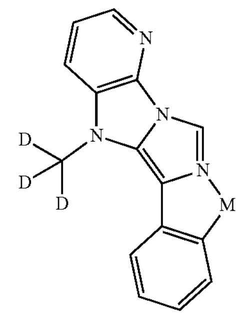
L898
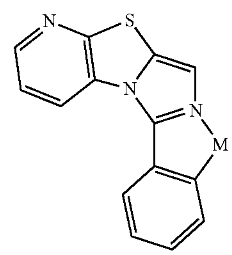
L899
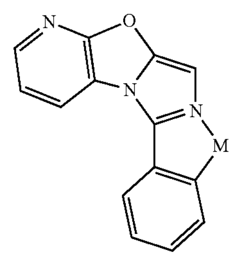
L900
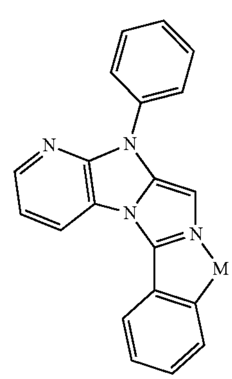

-continued
L901
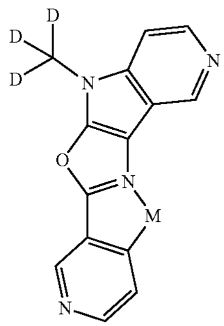
L902
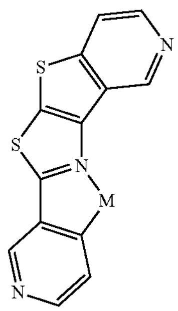
L903
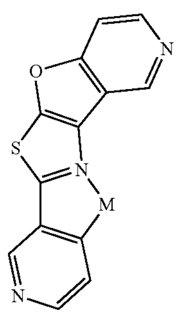
L904
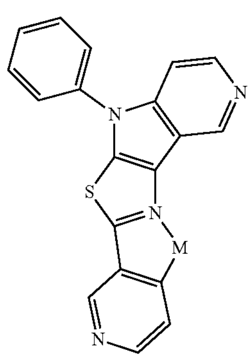
L905
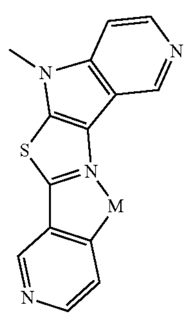
-continued
L906
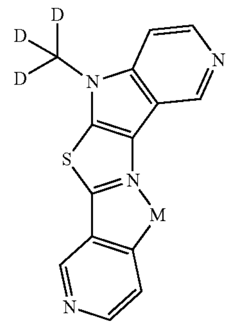
L907
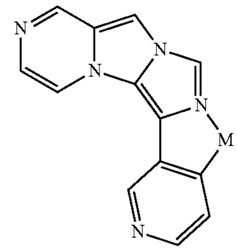
L908
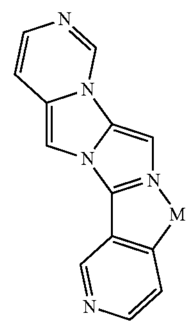
L909
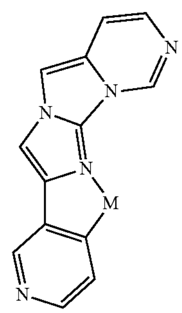
L910
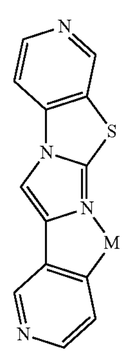

-continued
L911
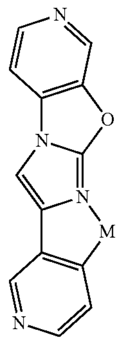
L912
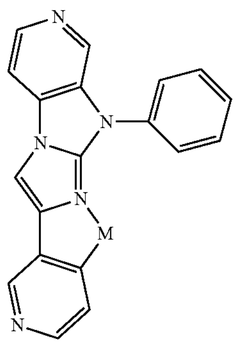
L913
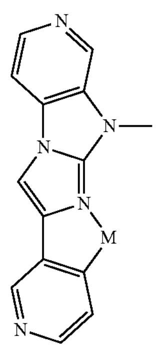
L914
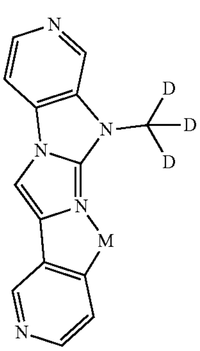
-continued
L915
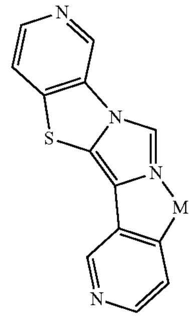
L916
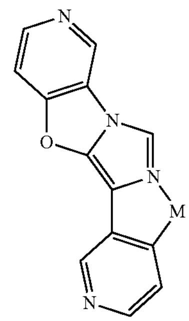
L917
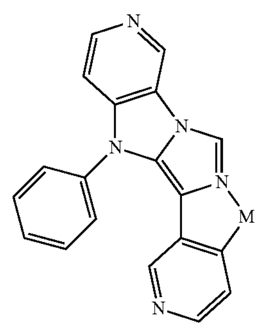
L918
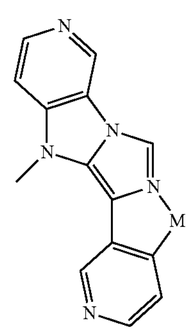

L919
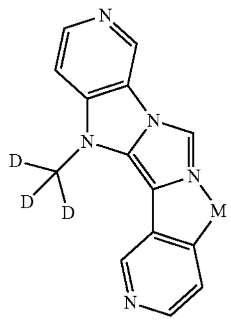
L920
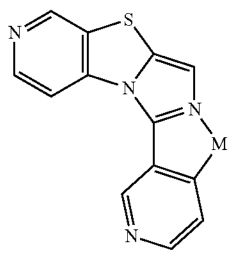
L921
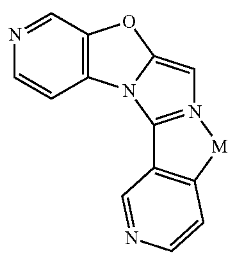
L922
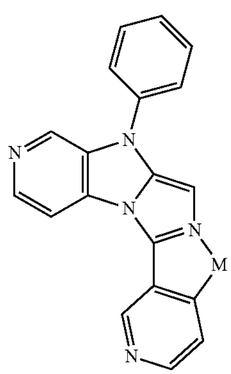
L923
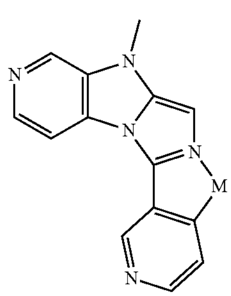
L924
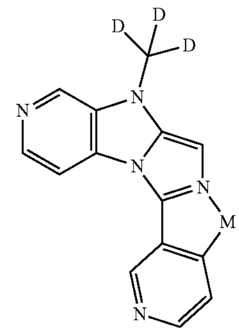
L925
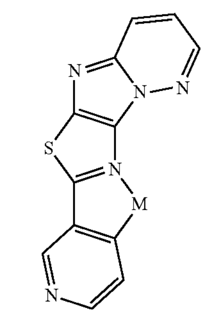
L926
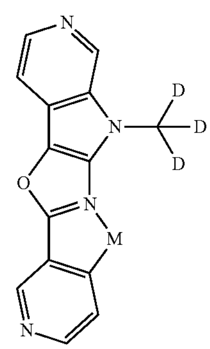
L927
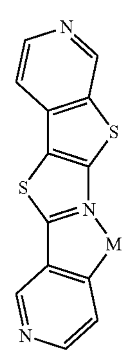

L928
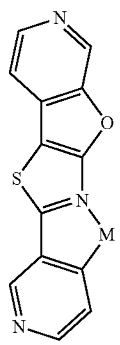
L929
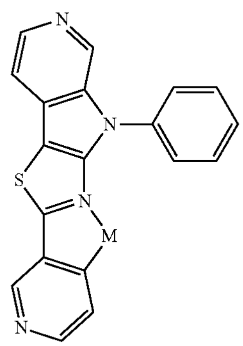
L930
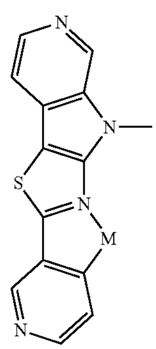
L931
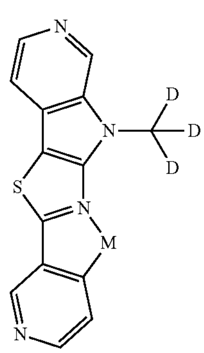
L932
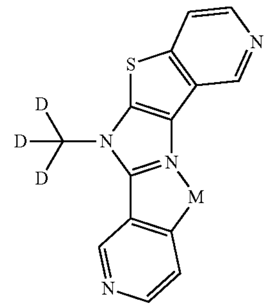
L933
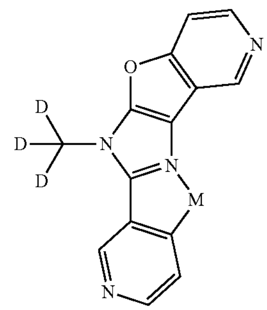
L934
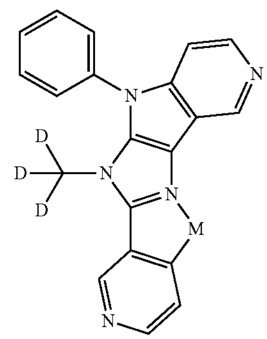
L935
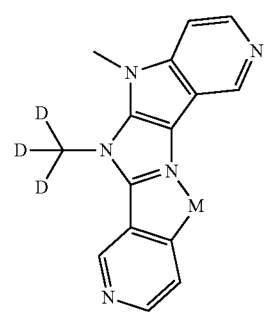
L936
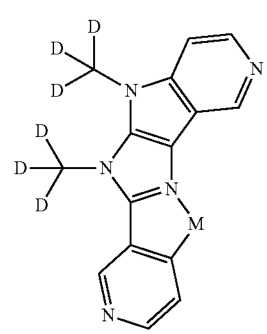

-continued
L937
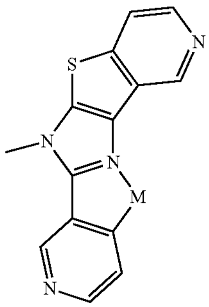
L938
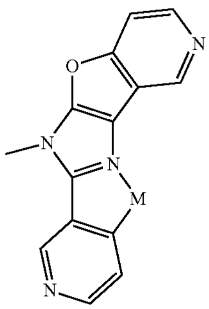
L939
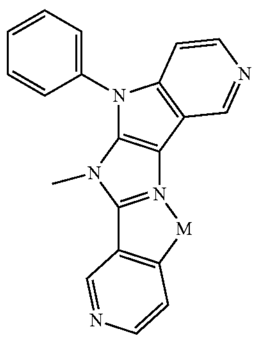
L940
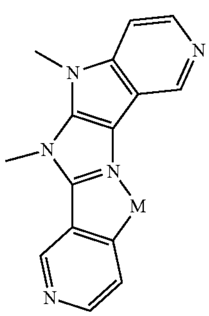
L941
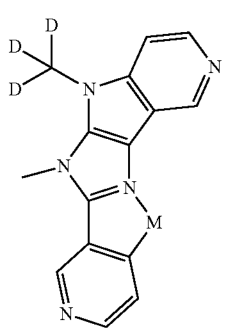
-continued
L942
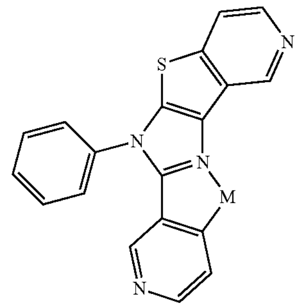
L943
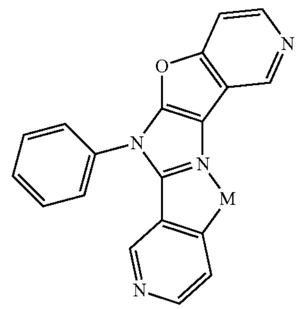
L944
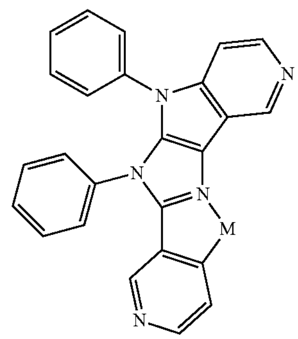
L945
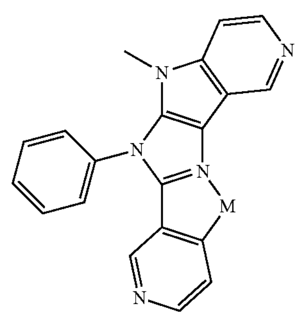
L946
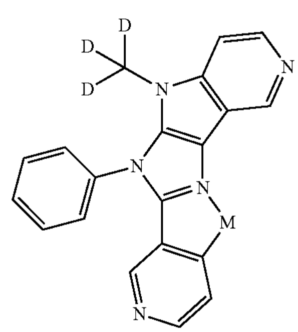

-continued
L947
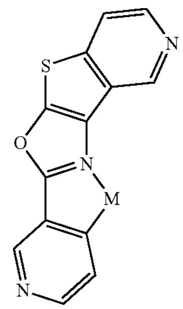
L948
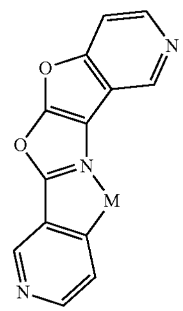
L949
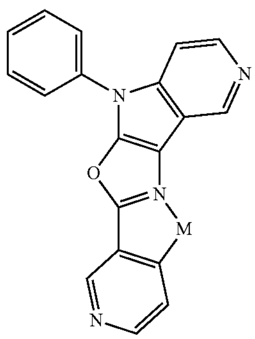
L950
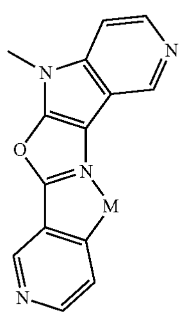
L951
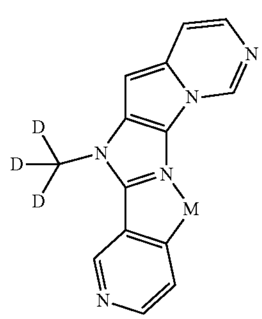
-continued
L952
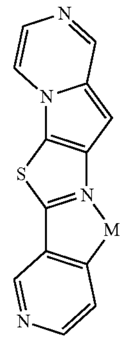
L953
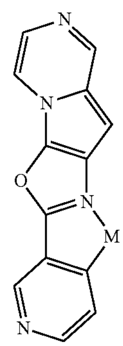
L954
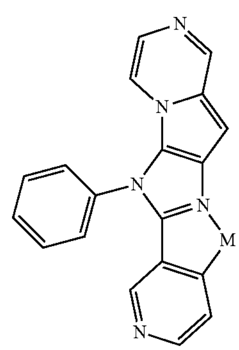
L955
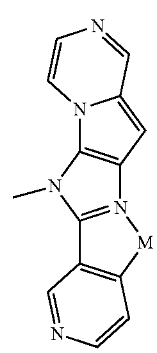

-continued
L956
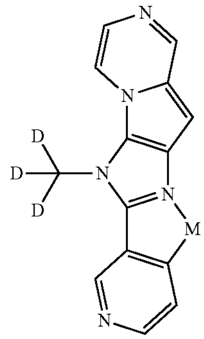
L957
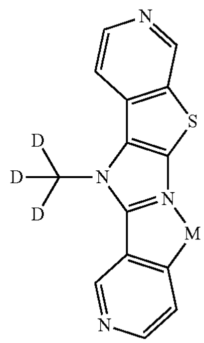
L958
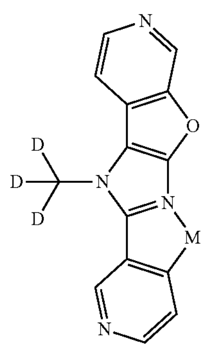
L959
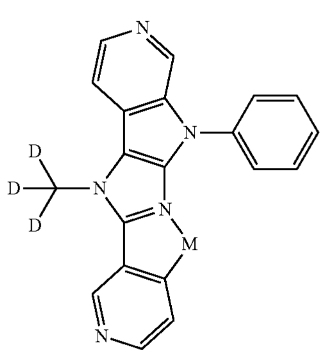
-continued
L960
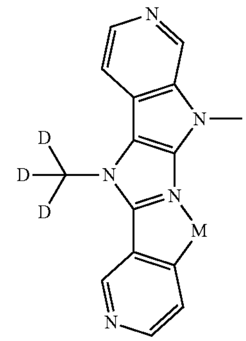
L961
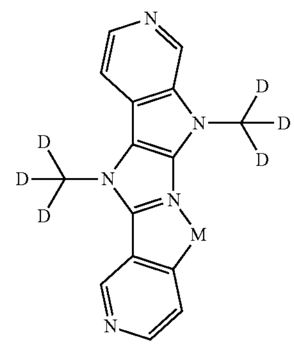
L962
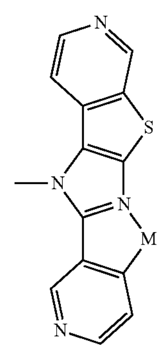
L963
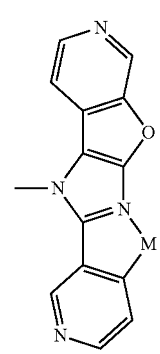

-continued
L964
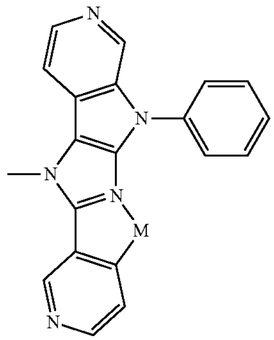
L965
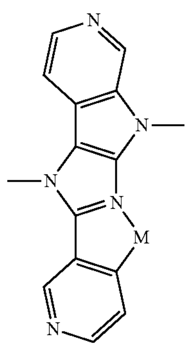
L966
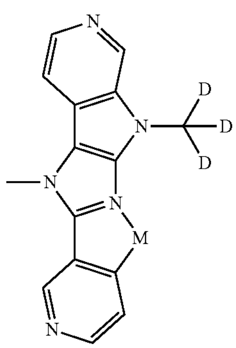
L967
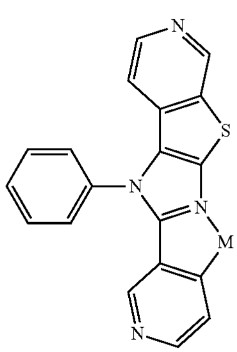
-continued
L968
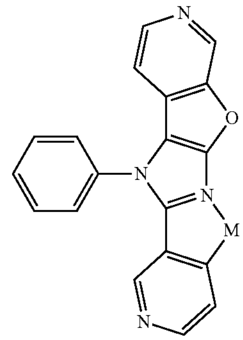
L969
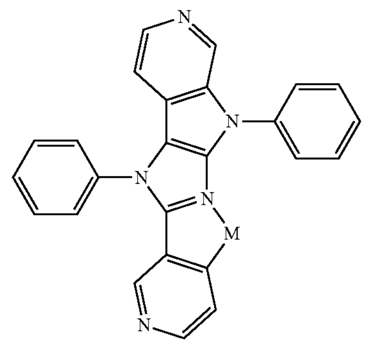
L970
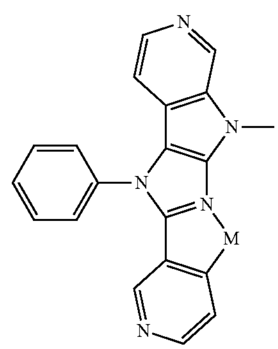
L971
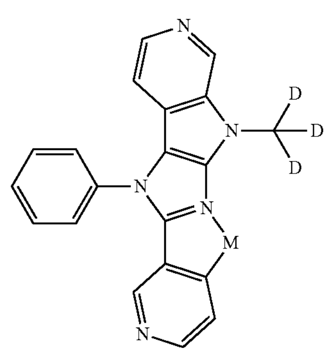

L972
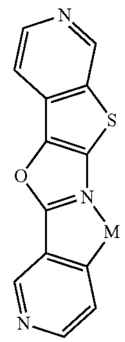
L973
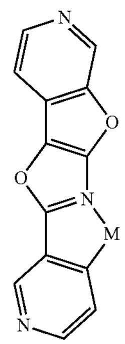
L974
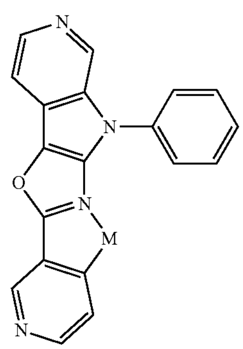
L975
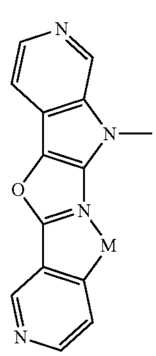
L976
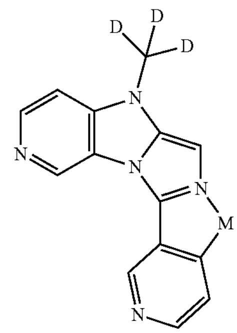
L977
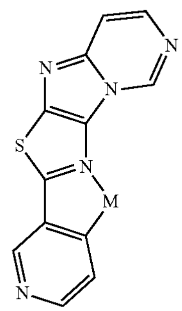
L978
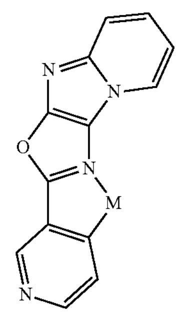
L979
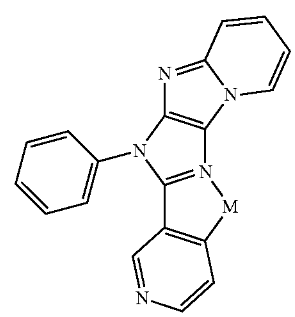
L980
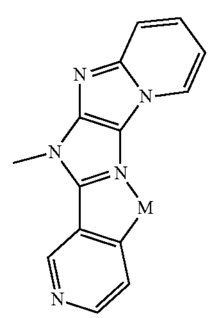

-continued
L981
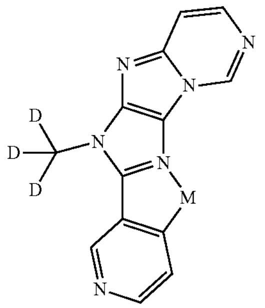
L982
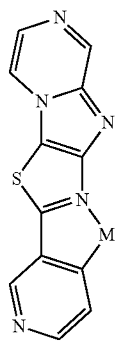
L983
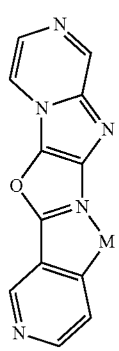
L984
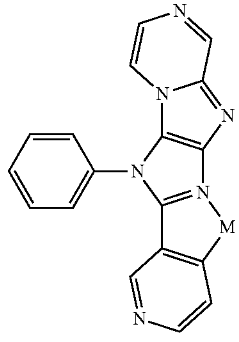
-continued
L985
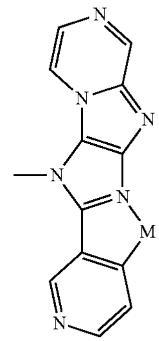
L986
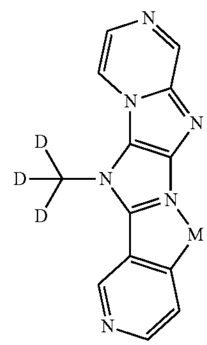
L987
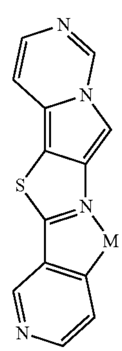
L988
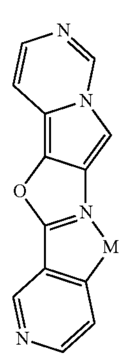

-continued
L989
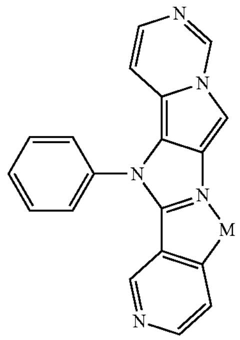
L990
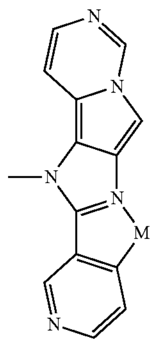
L991
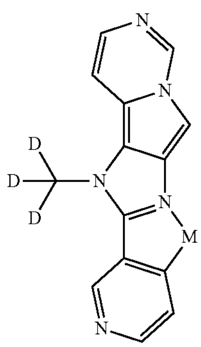
L992
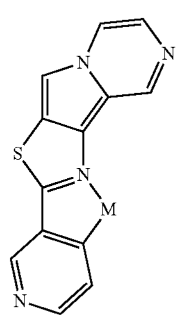
L993
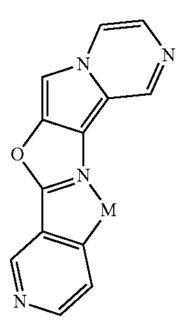
-continued
L994
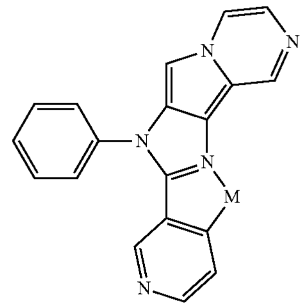
L995
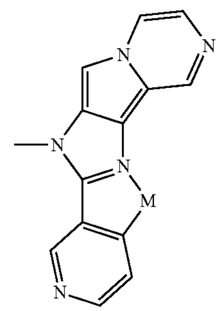
L996
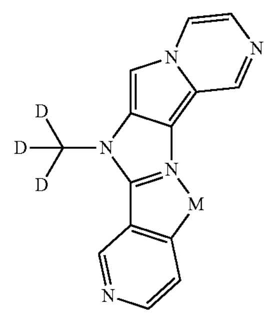
L997
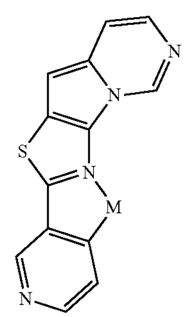
L998
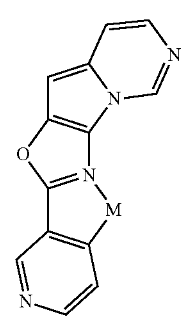

-continued
L999
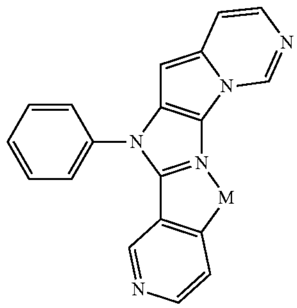
L1000
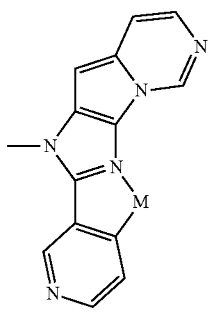
L1001
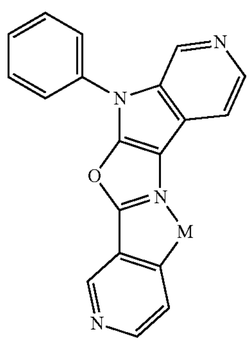
L1002
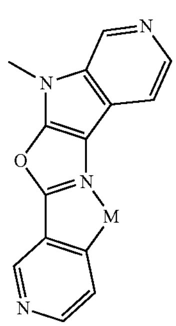
L1003
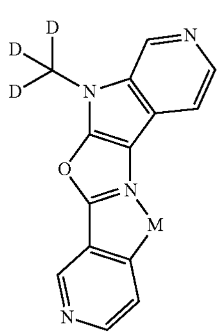
-continued
L1004
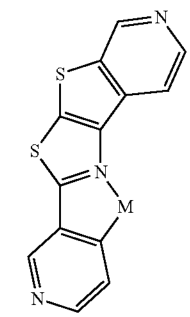
L1005
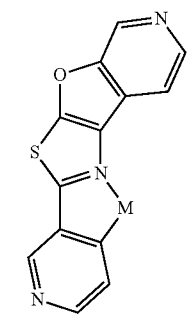
L1006
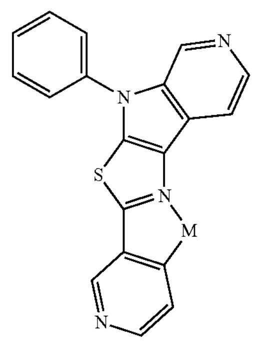
L1007
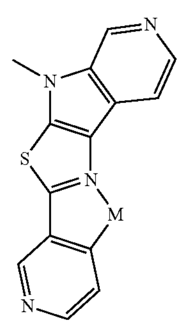
L1008
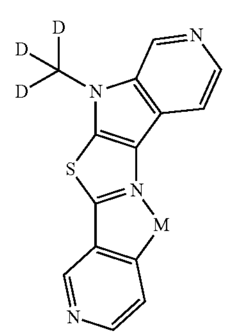

-continued
L1009
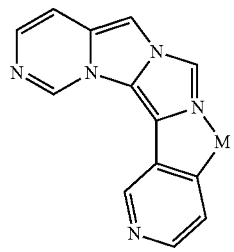
L1010
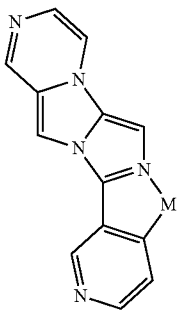
L1011
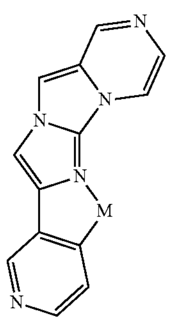
L1012
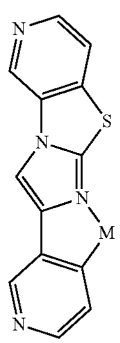
L1013
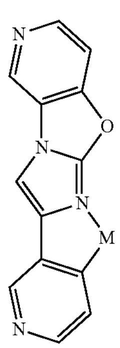
-continued
L1014
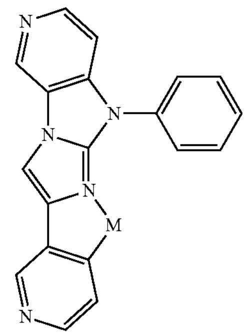
L1015
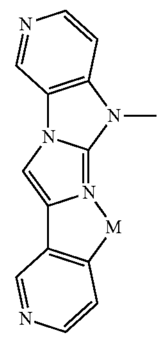
L1016
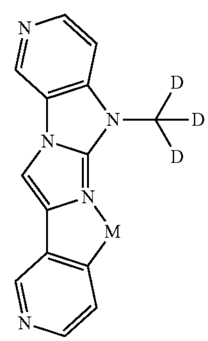
L1017
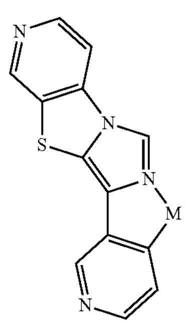
L1018
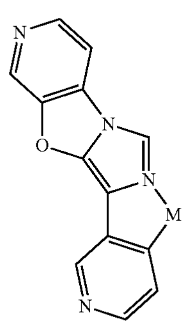

-continued
L1019
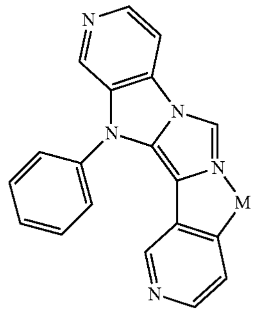
L1020
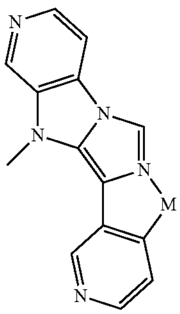
L1021
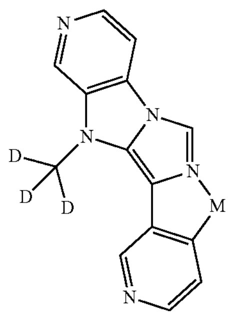
L1022
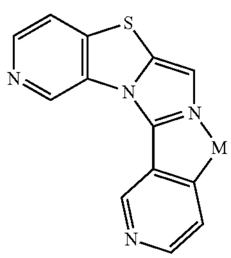
L1023
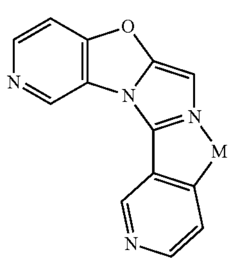
-continued
L1024
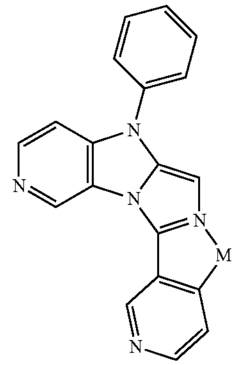
L1025
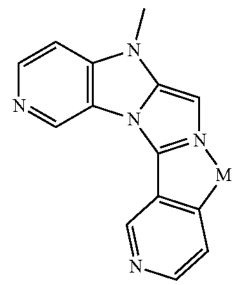
L1026
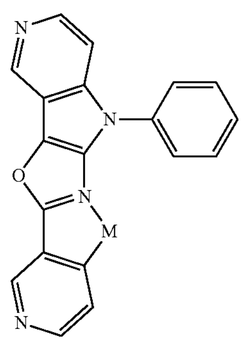
L1027
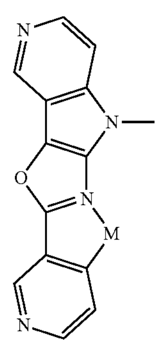

L1028
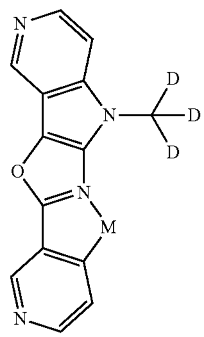
L1029
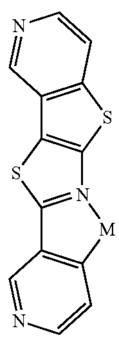
L1030
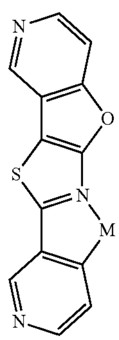
L1031
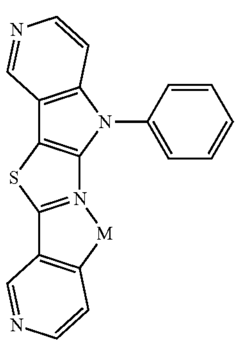
L1032
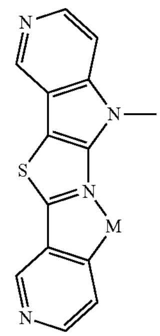
L1033
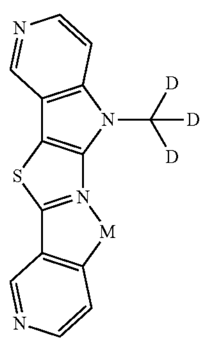
L1034
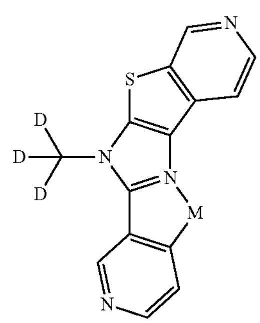
L1035
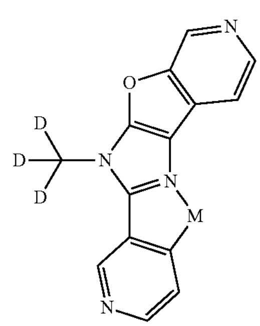

-continued
L1036
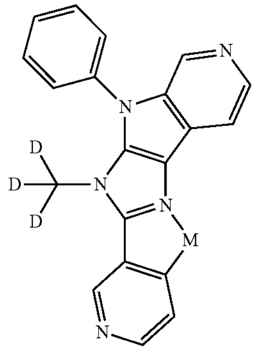
L1037
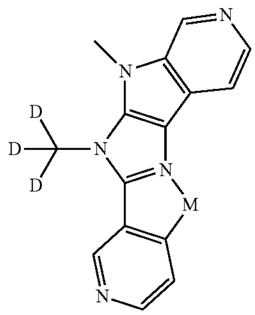
L1038
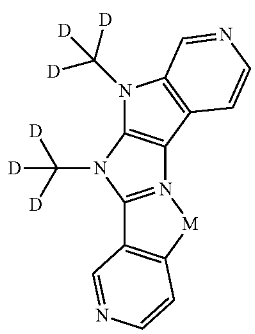
L1039
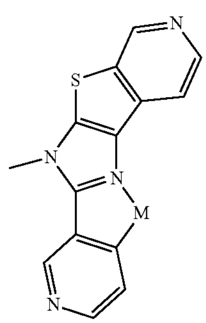
L1040
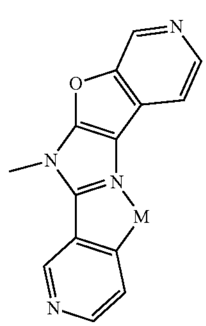
-continued
L1041
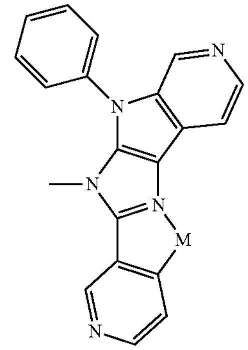
L1042
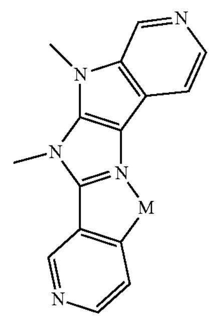
L1043
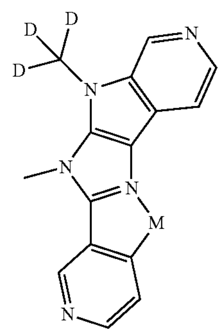
L1044
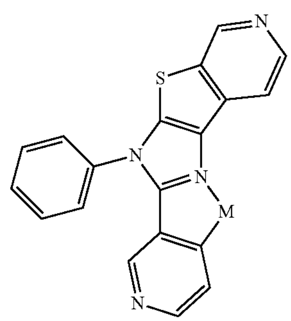
L1045
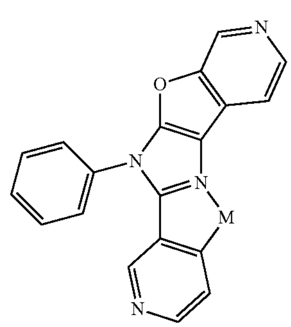

-continued
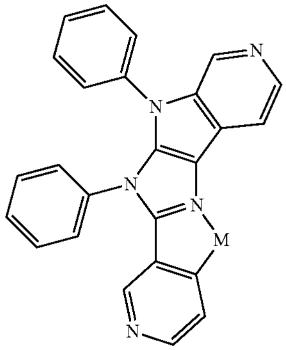
L1046
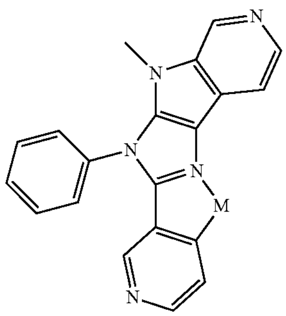
L1047
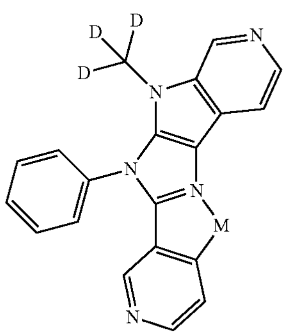
L1048
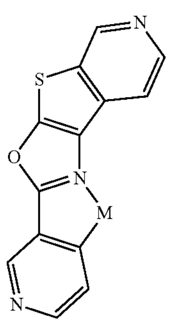
L1049
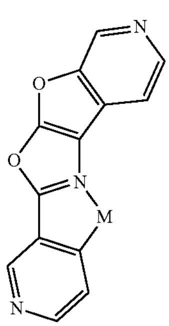
L1050
-continued
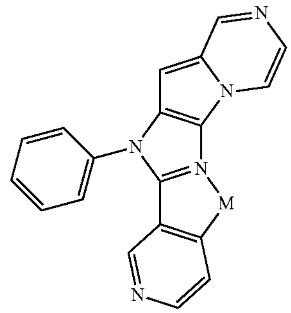
L1051
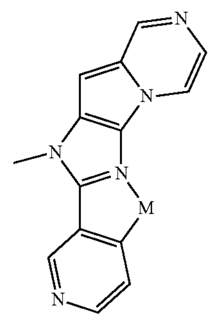
L1052
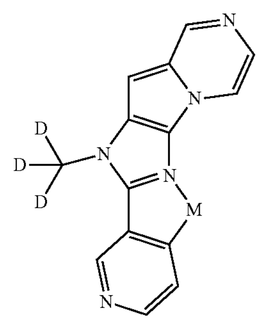
L1053
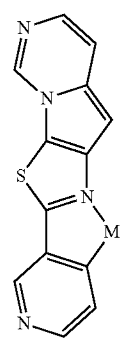
L1054
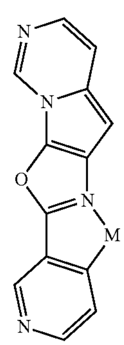
L1055

L1056
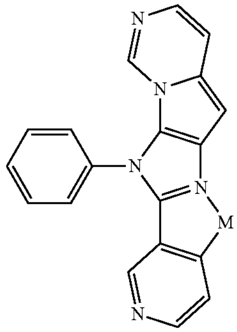
L1057
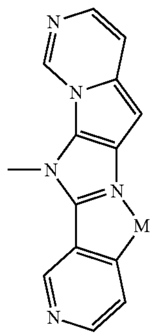
L1058
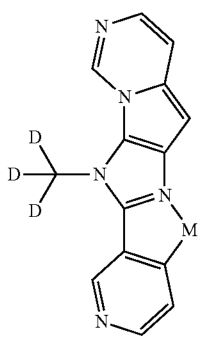
L1059
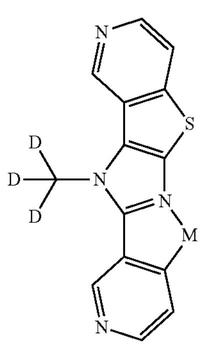
L1060
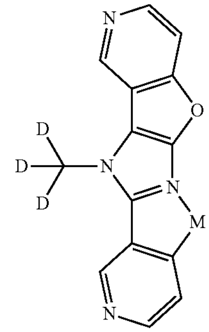
L1061
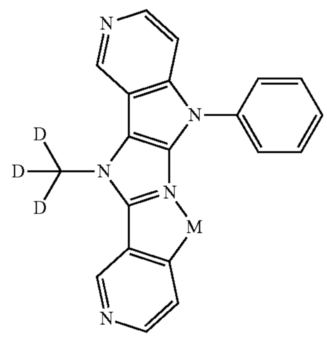
L1062
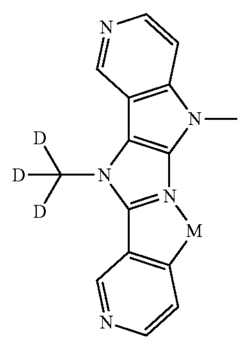
L1063
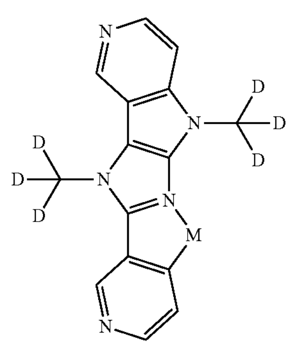

L1064
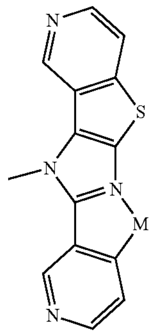
L1065
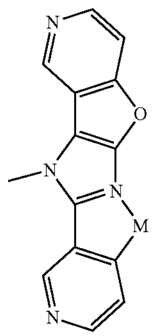
L1066
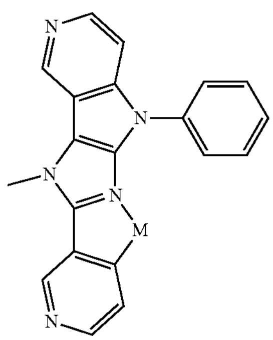
L1067
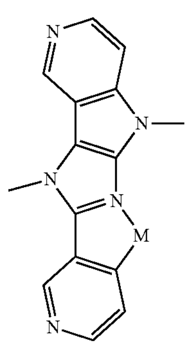
L1068
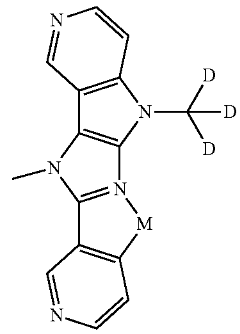
L1069
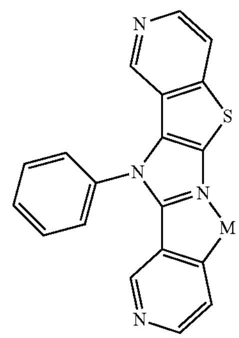
L1070
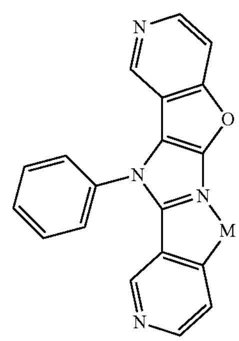
L1071
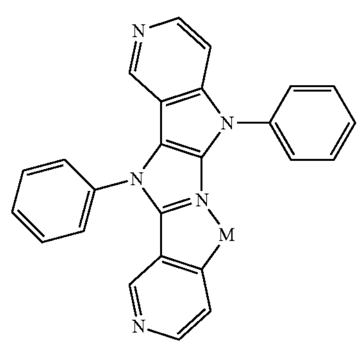

L1072
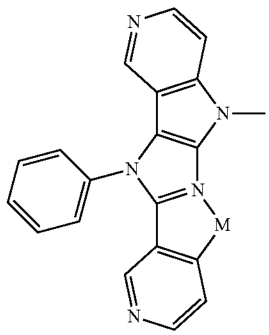
L1073
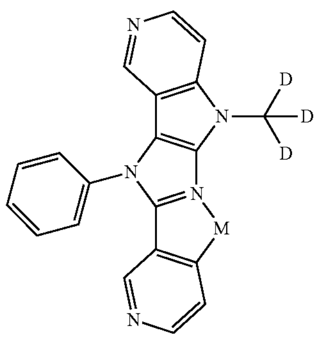
L1074
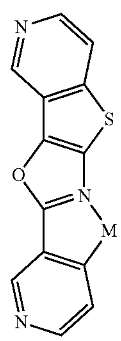
L1075
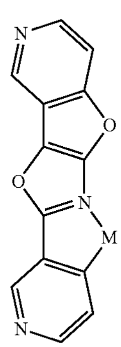
L1076
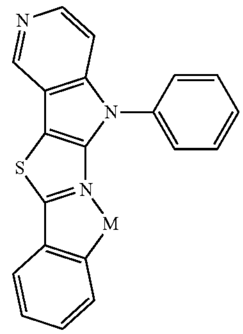
L1077
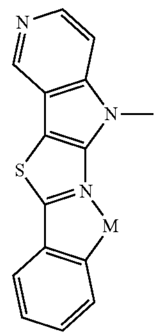
L1078
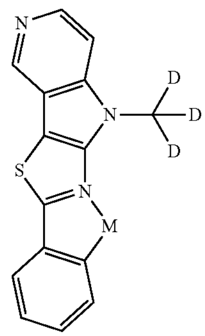
L1079
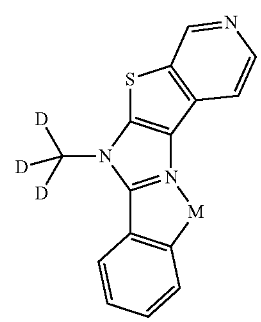
L1080
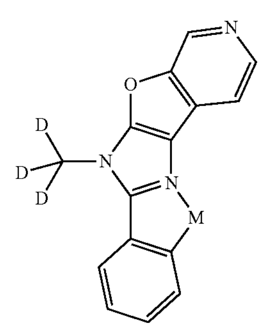

-continued
L1081
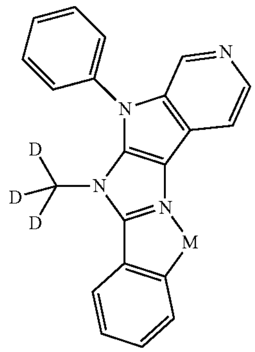
L1082
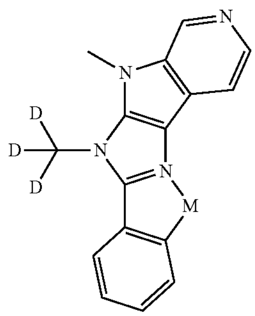
L1083
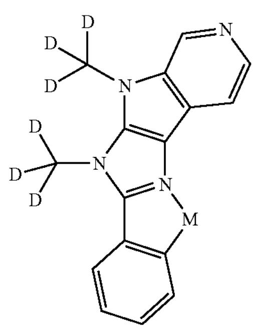
L1084
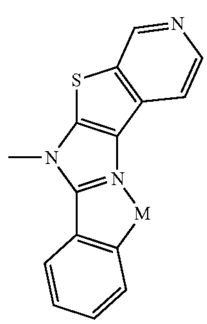
L1085
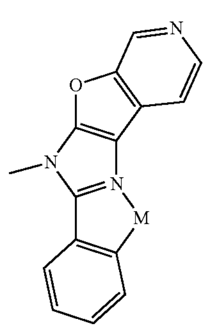
-continued
L1086
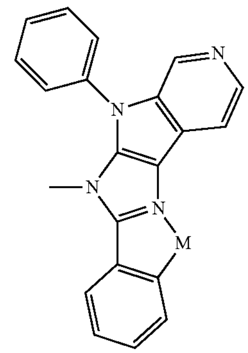
L1087
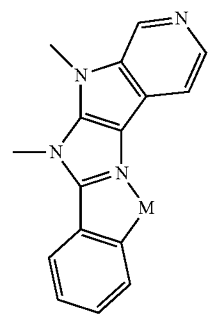
L1088
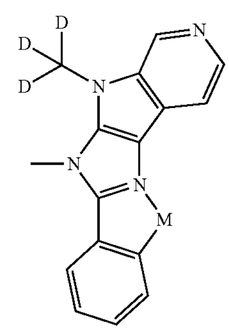
L1089
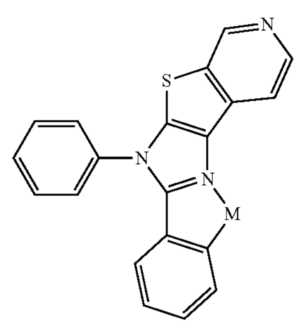
L1090
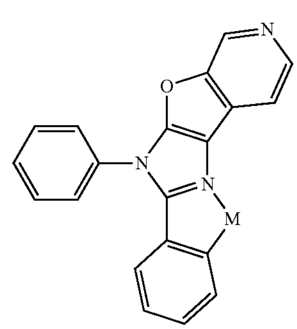

-continued
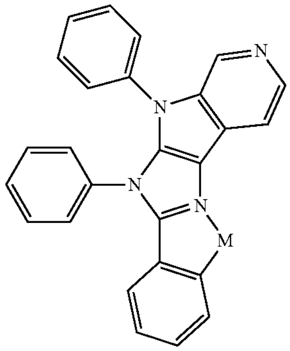
L1091
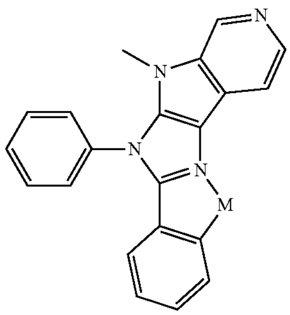
L1092
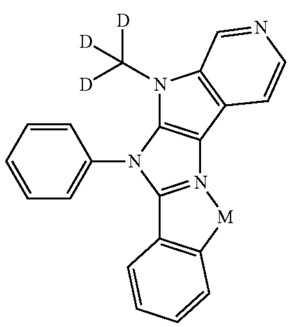
L1093
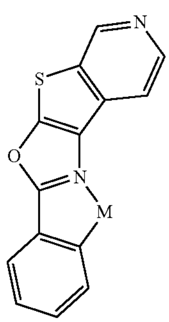
L1094
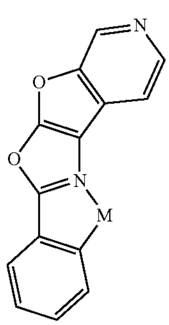
L1095
-continued
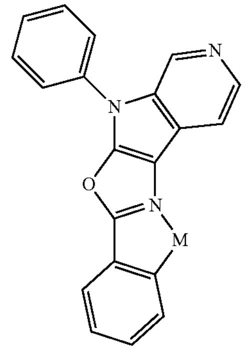
L1096
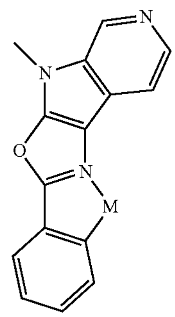
L1097
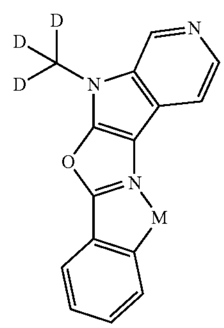
L1098
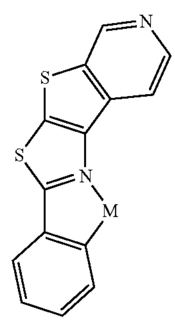
L1099
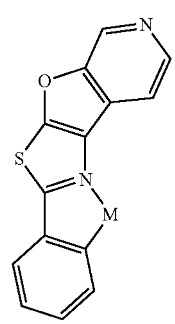
L1100

-continued
L1101
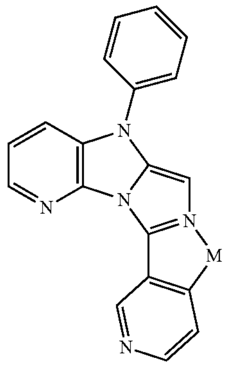
L1102
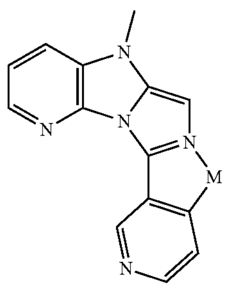
L1103
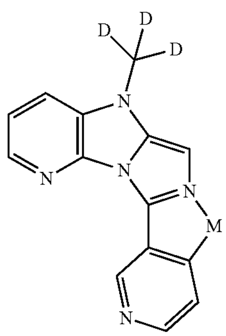
L1104
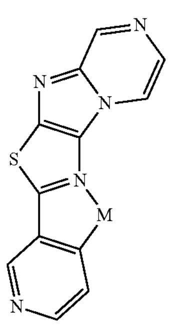
L1105
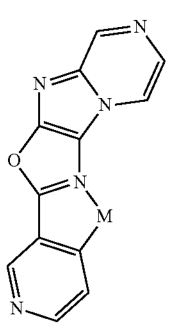
-continued
L1106
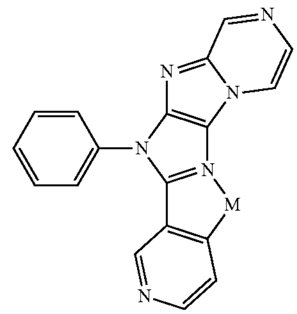
L1107
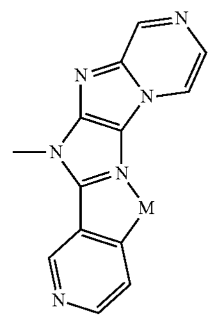
L1108
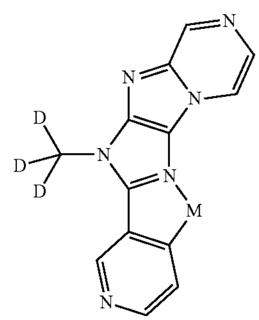
L1109
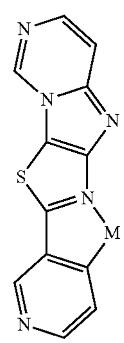
L1110
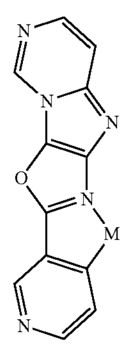

-continued
L1111
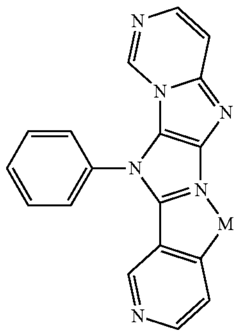
L1112
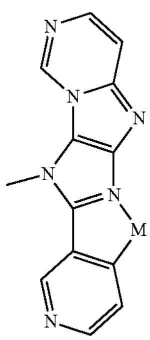
L1113
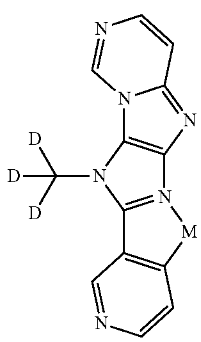
L1114
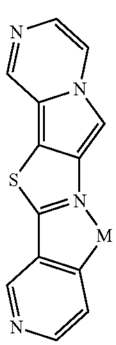
-continued
L1115
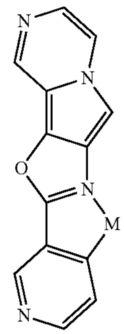
L1116
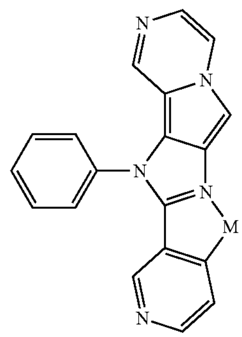
L1117
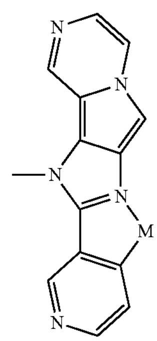
L1118
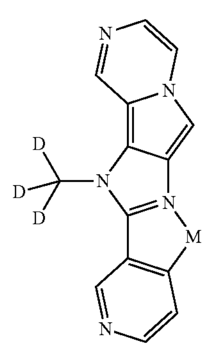

-continued
L1119
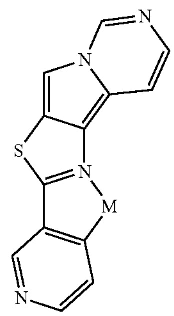
L1120
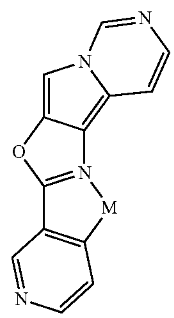
L1121
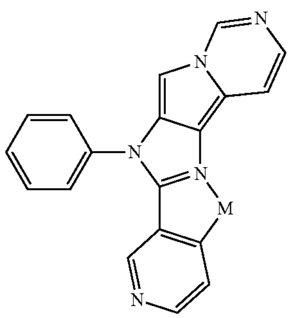
L1122
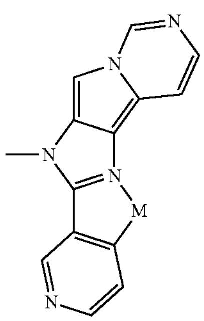
L1123
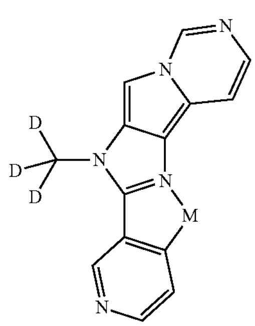
-continued
L1124
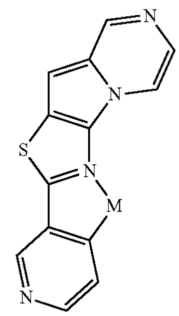
L1125
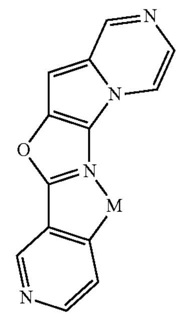
L1126
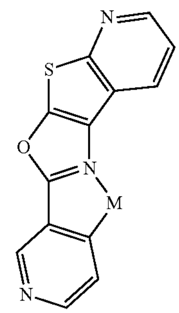
L1127
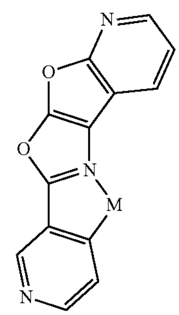
L1128
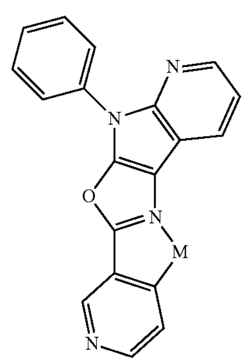

-continued
L1129
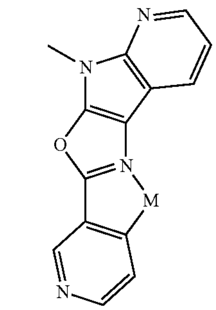
L1130
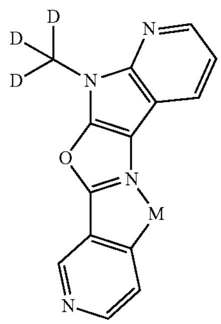
L1131
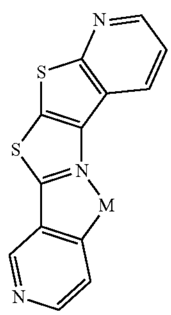
L1132
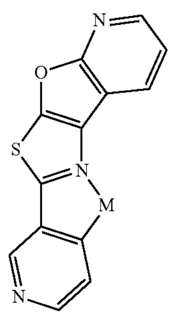
L1133
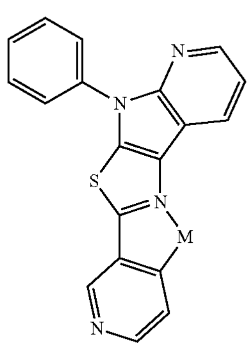
-continued
L1134
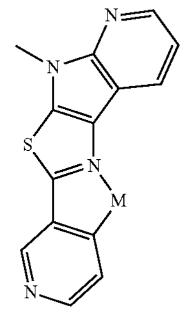
L1135
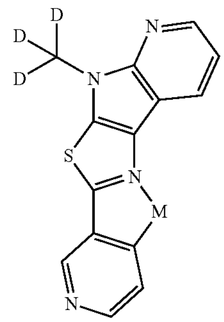
L1136
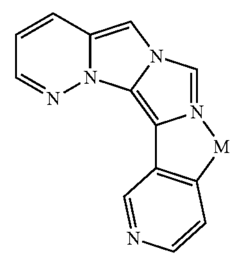
L1137
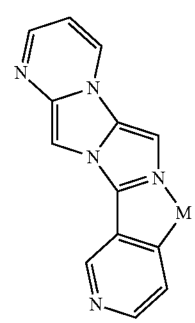
L1138
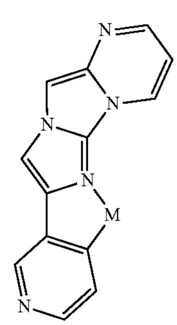

L1139
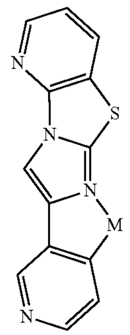
L1140
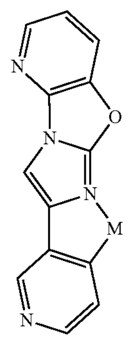
L1141
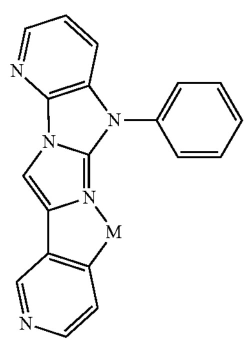
L1142
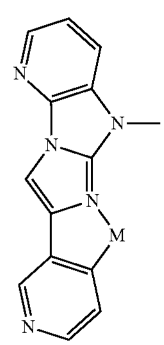
L1143
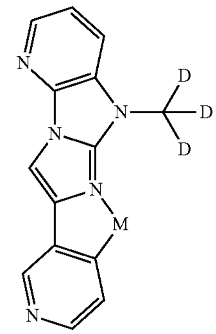
L1144
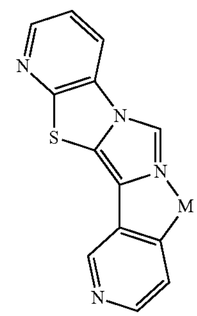
L1145
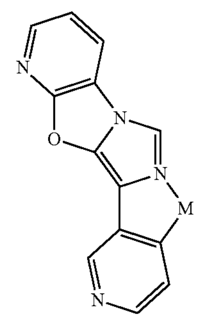
L1146
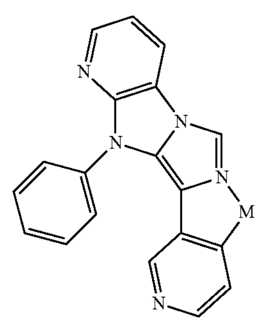
L1147
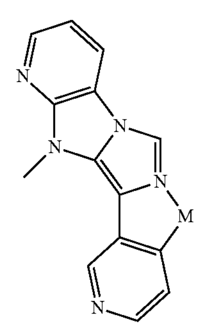

-continued
L1148
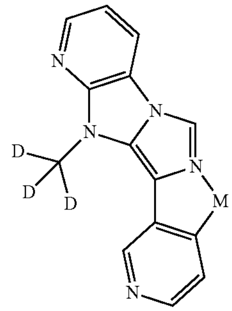
L1149
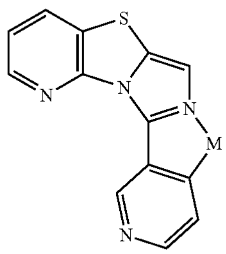
L1150
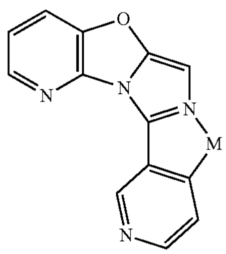
L1151
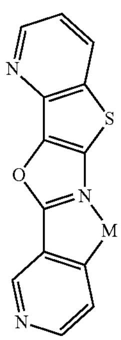
L1152
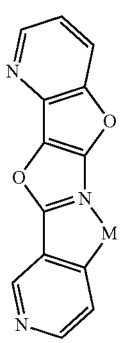
-continued
L1153
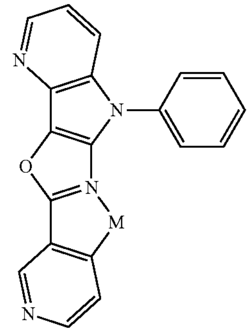
L1154
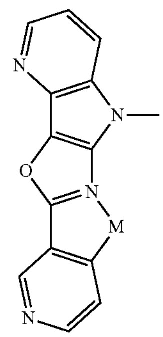
L1155
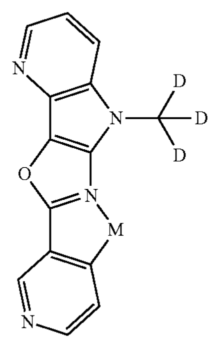
L1156
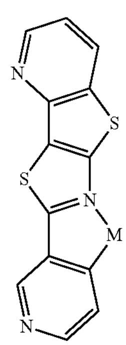

L1157
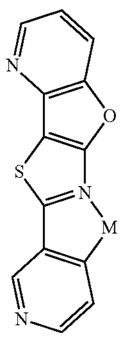
L1158
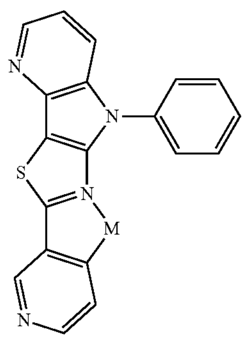
L1159
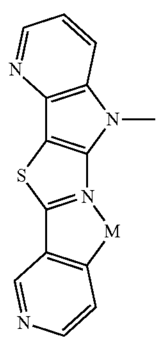
L1160
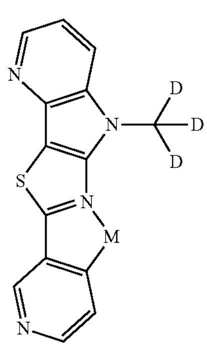
L1161
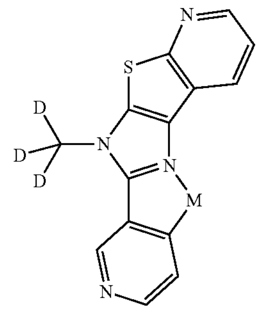
L1162
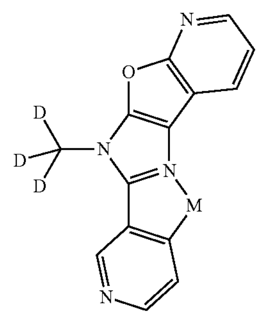
L1163
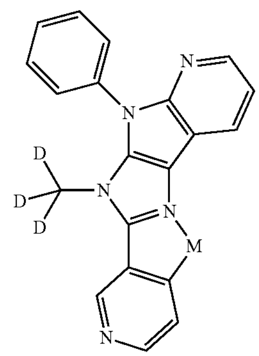
L1164
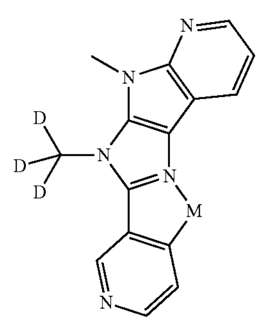
L1165
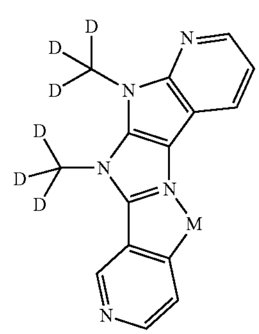

-continued
L1166
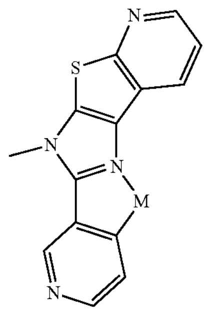
L1167
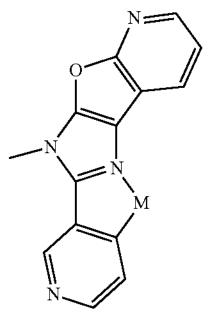
L1168
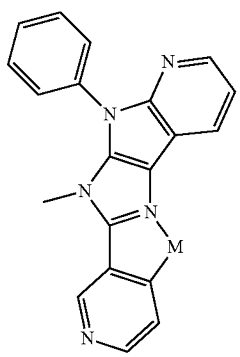
L1169
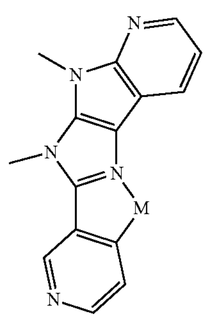
L1170
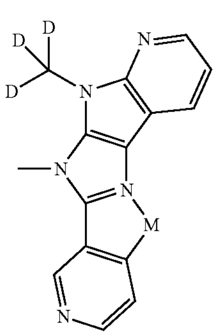
-continued
L1171
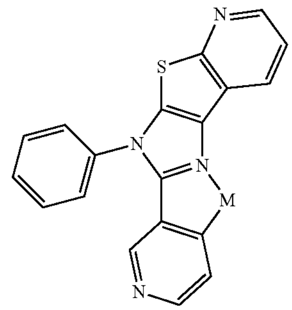
L1172
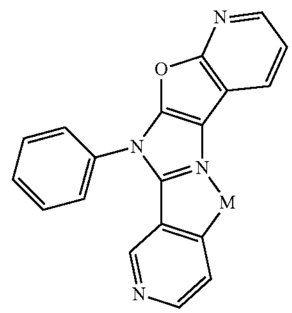
L1173
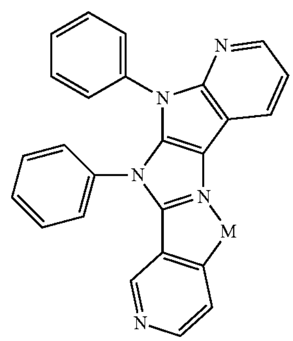
L1174
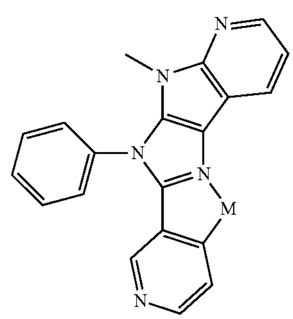
L1175
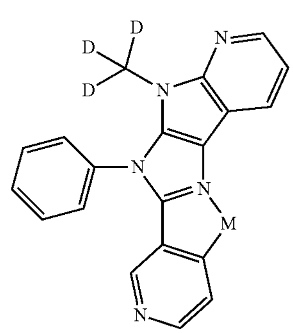

L1176
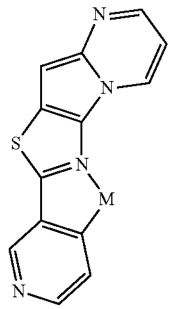
L1177
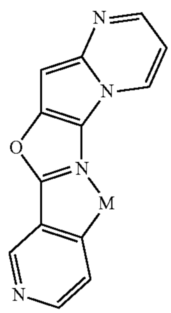
L1178
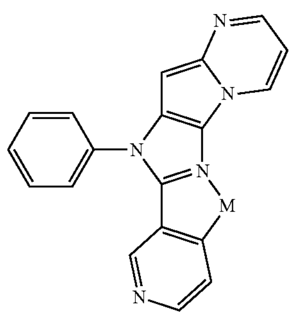
L1179
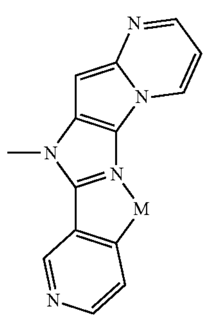
L1180
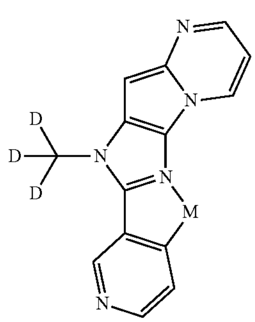
L1181
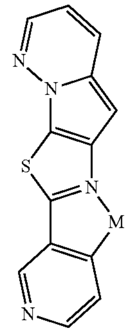
L1182
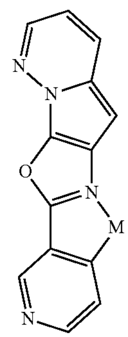
L1183
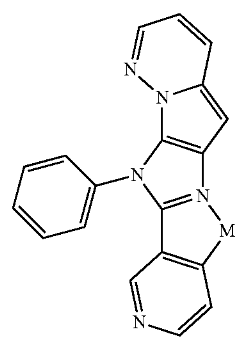
L1184
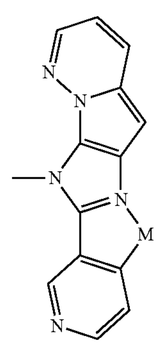

L1185
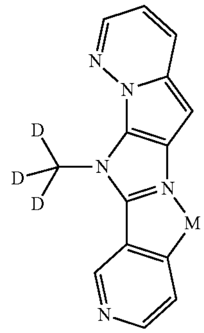
L1186
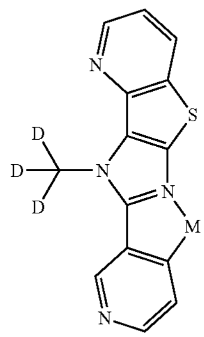
L1187
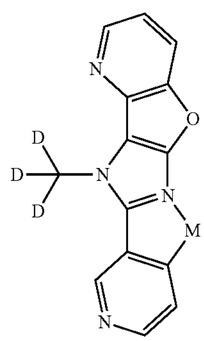
L1188
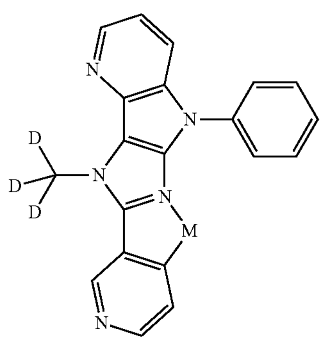
L1189
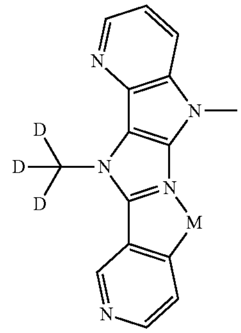
L1190
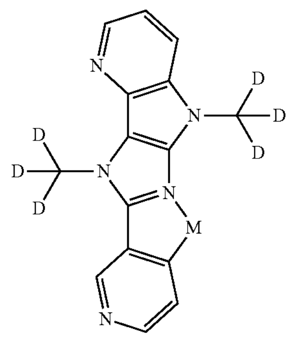
L1191
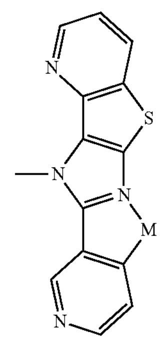
L1192
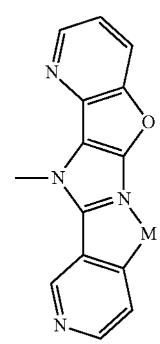

L1193
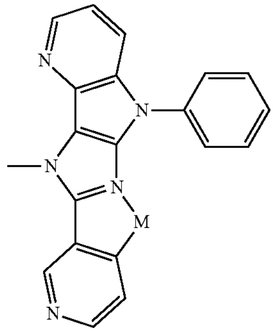
L1194
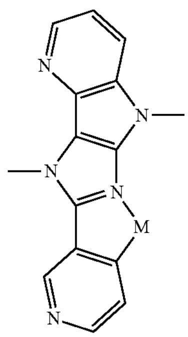
L1195
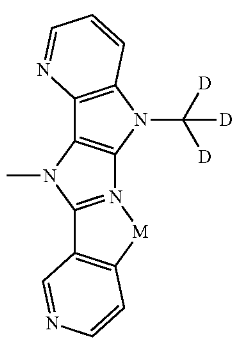
L1196
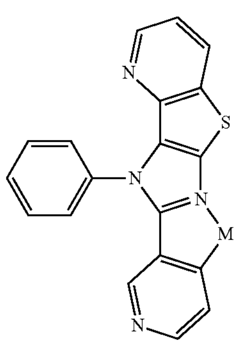
L1197
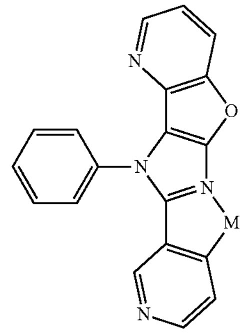
L1198
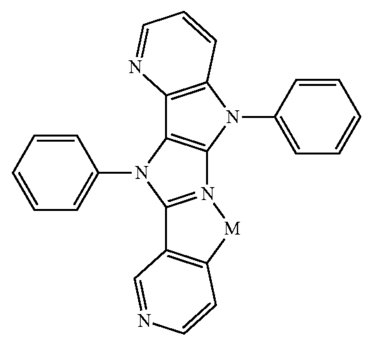
L1199
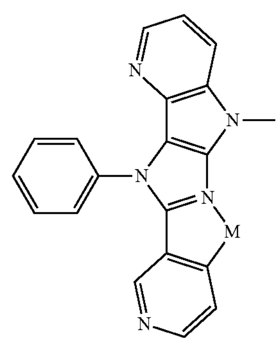
L1200
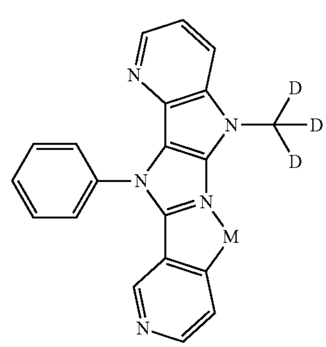

L1201
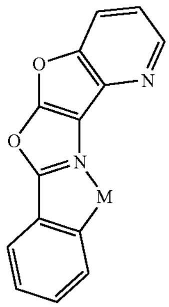
L1202
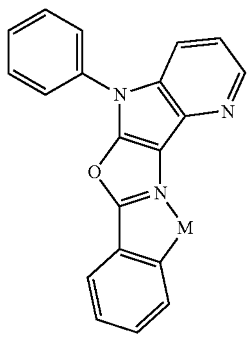
L1203
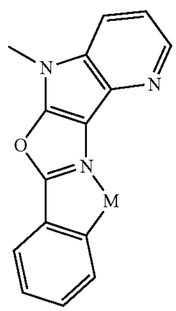
L1204
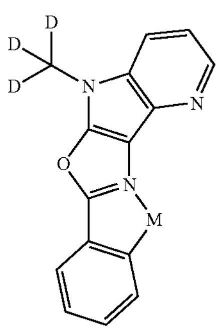
L1205
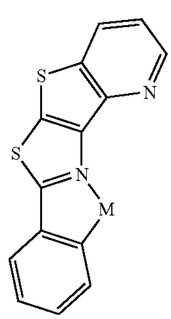
L1206
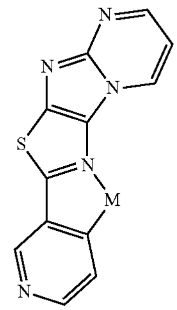
L1207
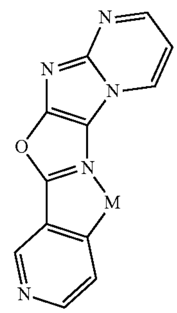
L1208
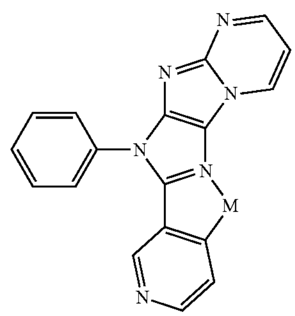
L1209
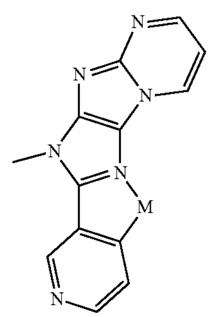
L1210
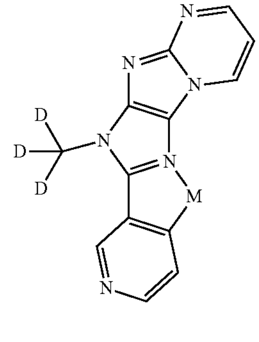

L1211
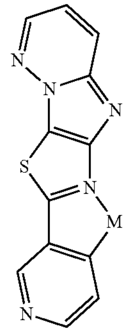
L1212
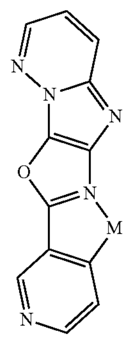
L1213
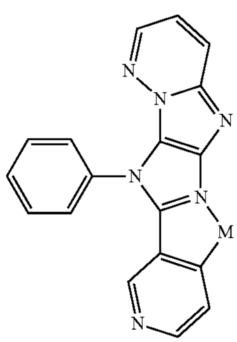
L1214
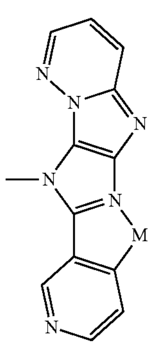
L1215
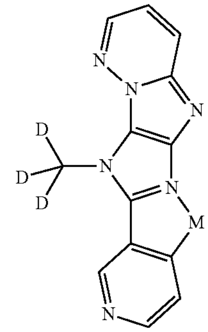
L1216
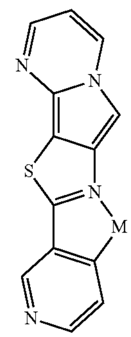
L1217
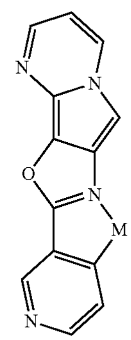
L1218
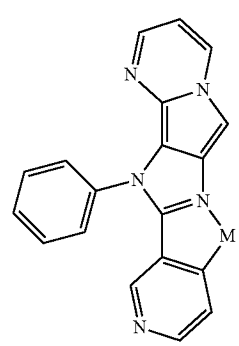

-continued
L1219
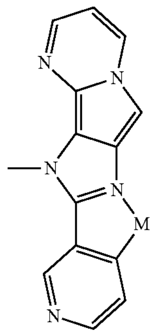
L1220
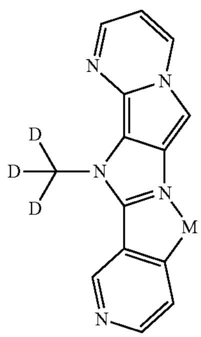
L1221
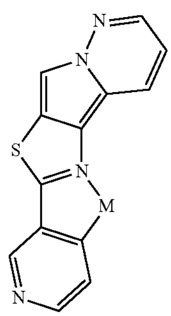
L1222
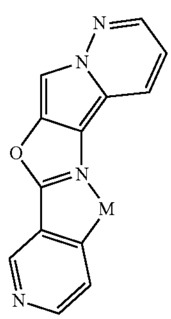
L1223
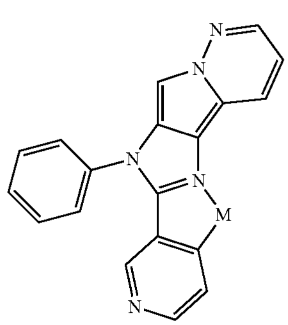
-continued
L1224
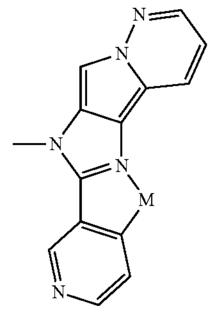
L1225
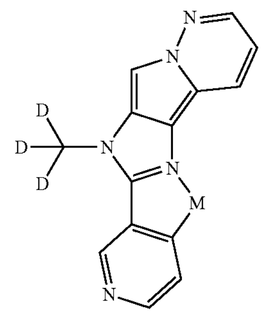
L1226
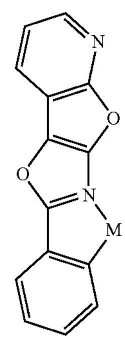
L1227
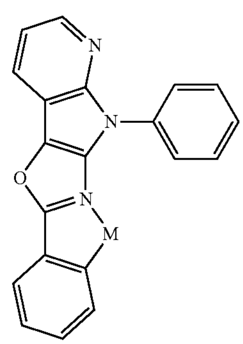
L1228
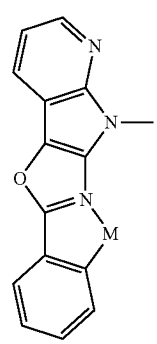

-continued
L1229
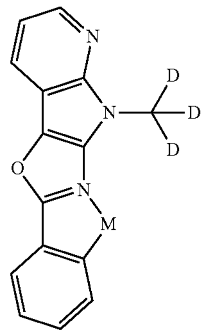
L1230
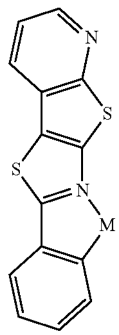
L1231
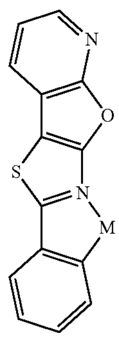
L1232
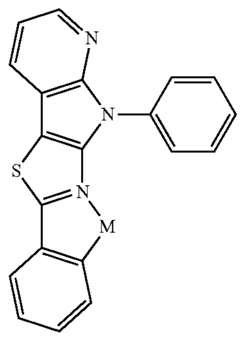
-continued
L1233
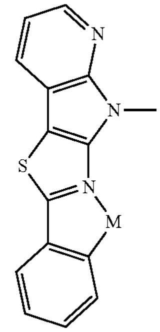
L1234
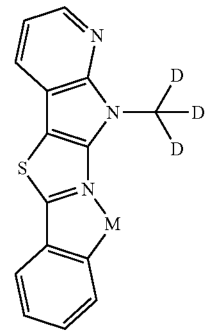
L1235
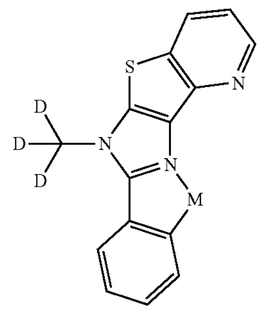
L1236
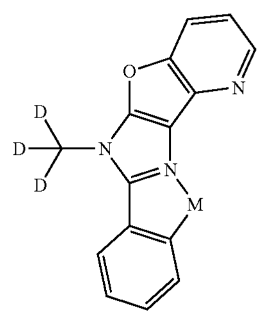
L1237
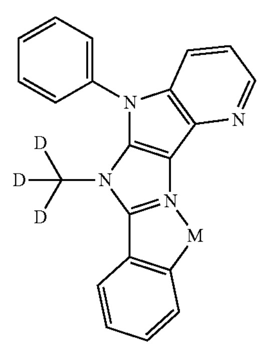

L1238
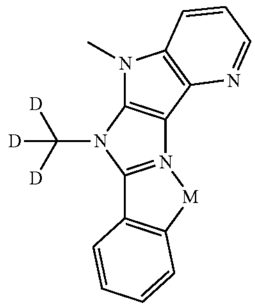
L1239
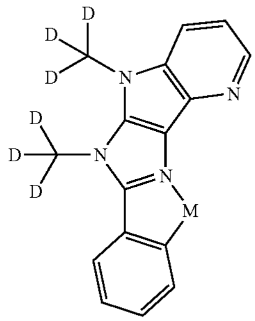
L1240
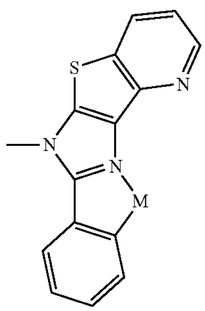
L1241
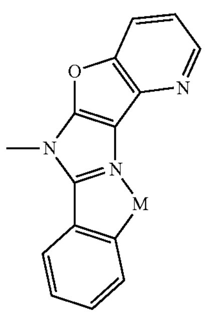
L1242
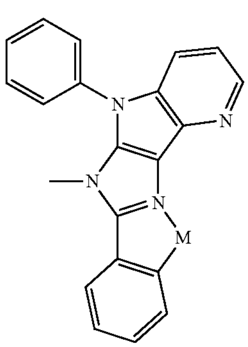
L1243
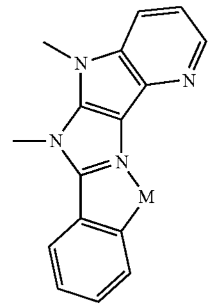
L1244
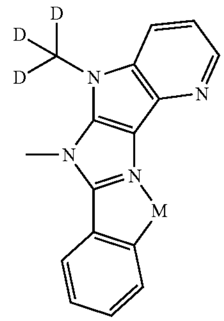
L1245
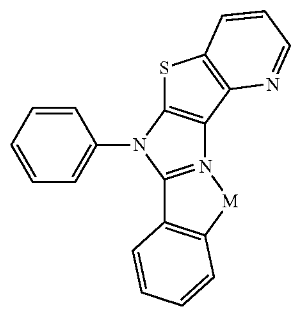
L1246
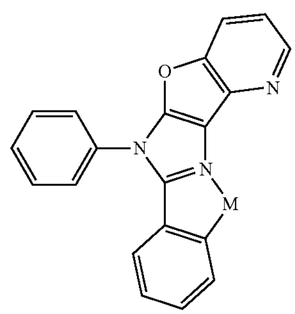
L1247
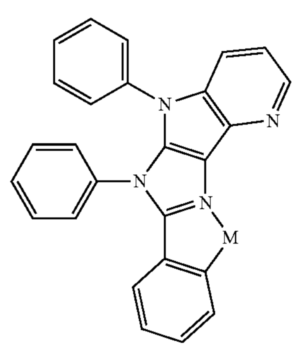

L1248
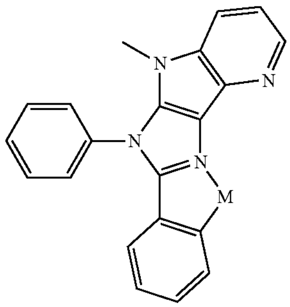
L1249
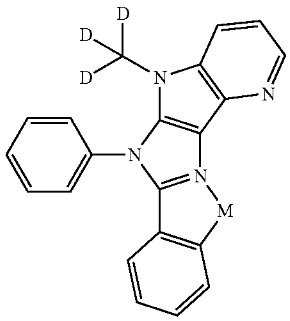
L1250
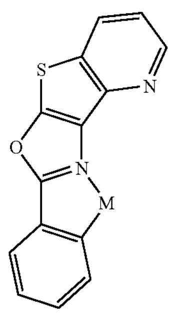
L1251
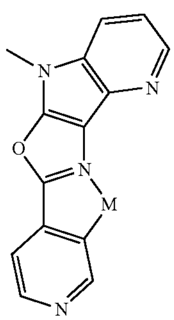
L1252
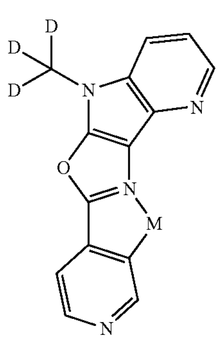
L1253
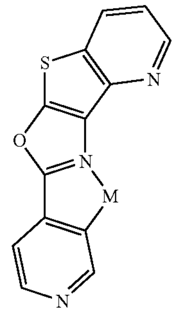
L1254
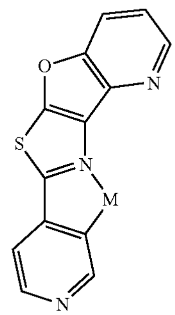
L1255
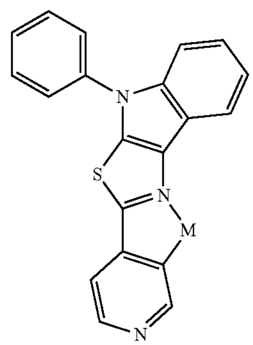
L1256
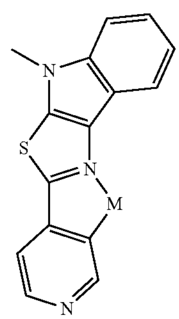
L1257
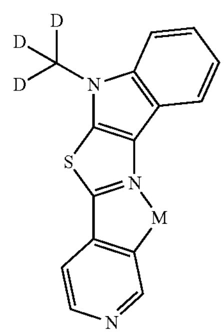

L1258
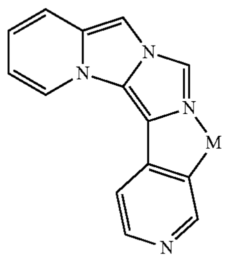
L1259
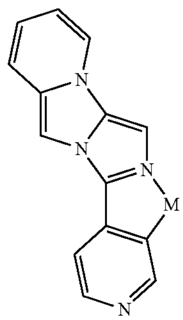
L1260
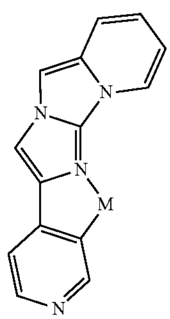
L1261
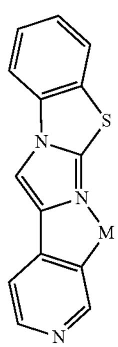
L1262
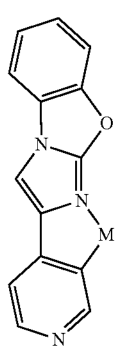
L1263
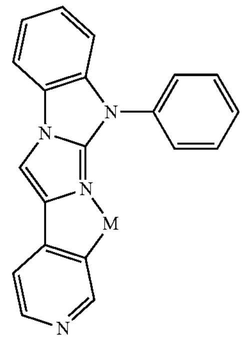
L1264
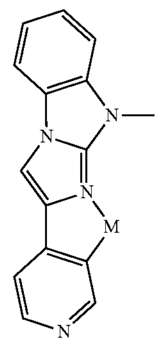
L1265
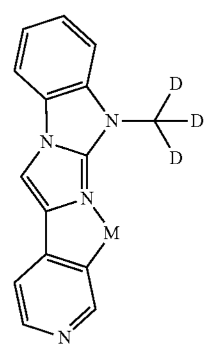
L1266
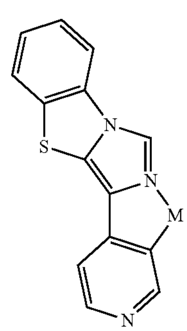

-continued
L1267
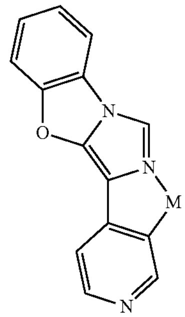
L1268
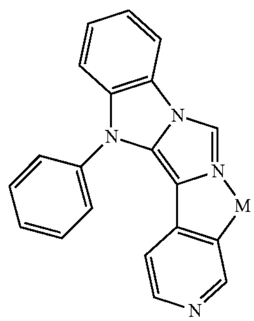
L1269
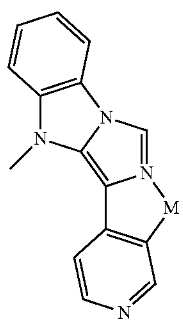
L1270
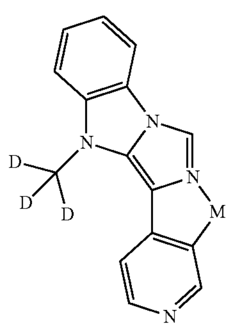
L1271
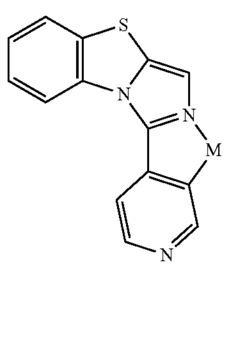
-continued
L1272
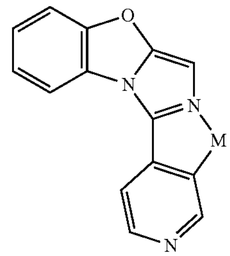
L1273
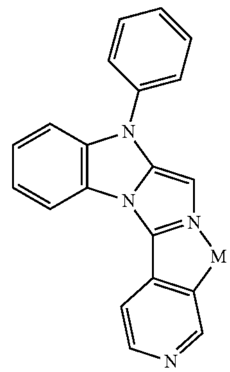
L1274
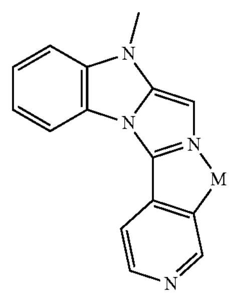
L1275
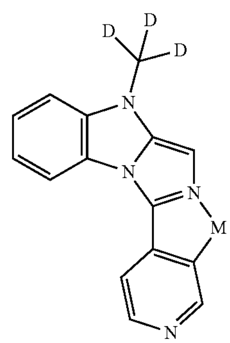
L1276
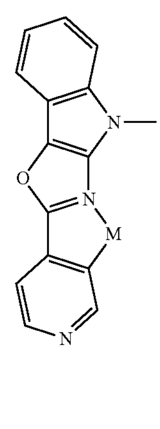

L1277
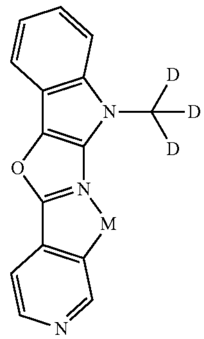
L1278
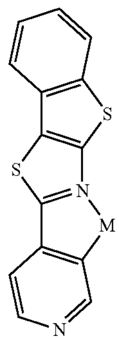
L1279
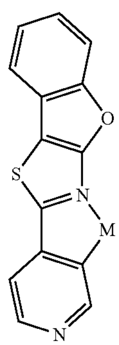
L1280
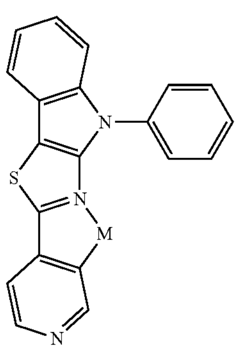
L1281
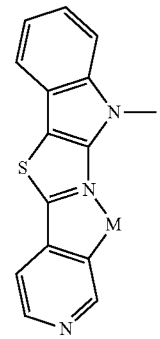
L1282
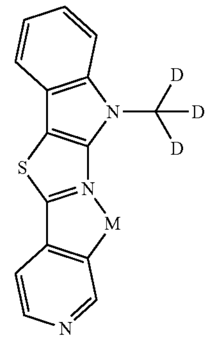
L1283
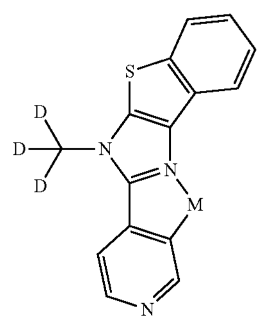
L1284
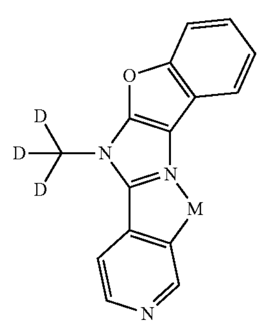

-continued
L1285
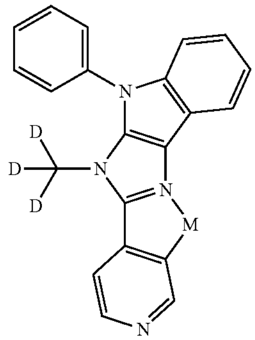
L1286
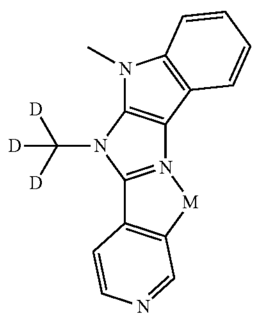
L1287
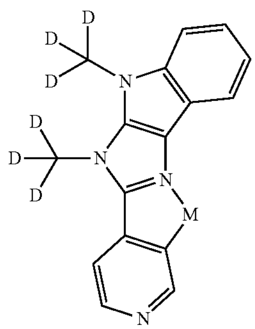
L1288
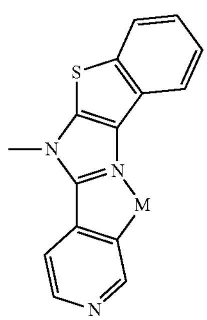
L1289
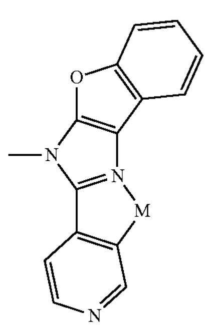
-continued
L1290
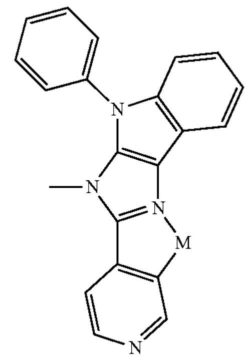
L1291
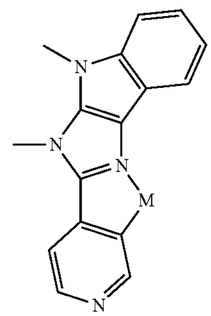
L1292
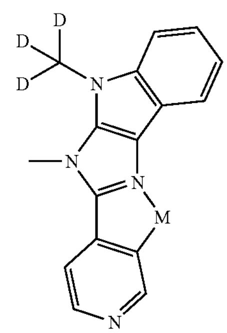
L1293
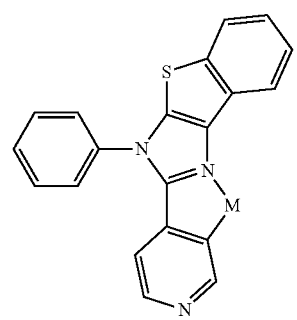
L1294
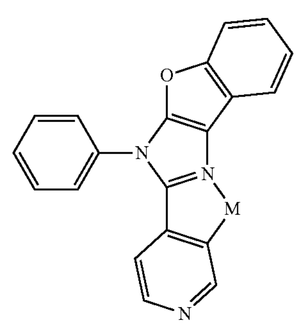

-continued
L1295
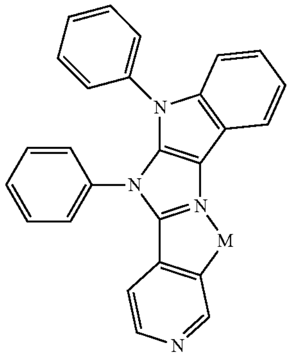
L1296
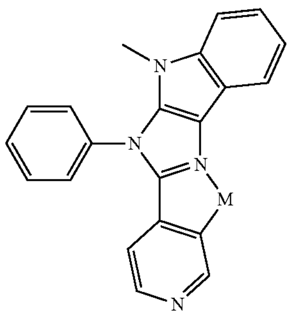
L1297
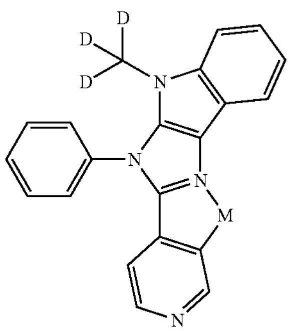
L1298
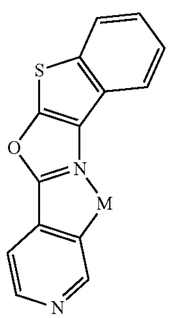
L1299
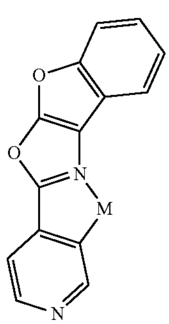
-continued
L1300
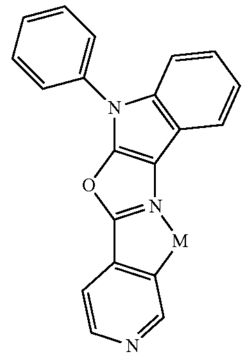
L1301
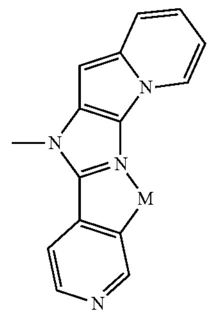
L1302
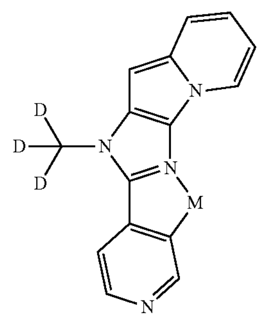
L1303
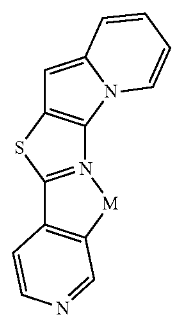
L1304
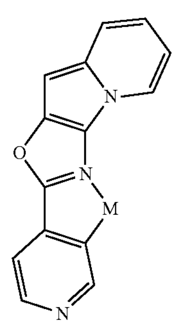

-continued
L1305
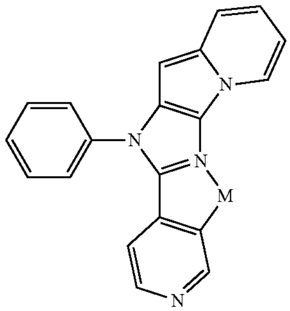
L1306
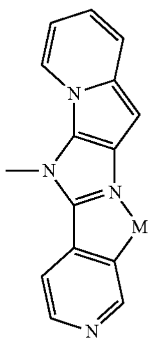
L1307
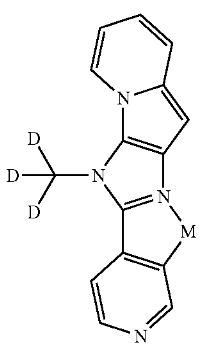
L1308
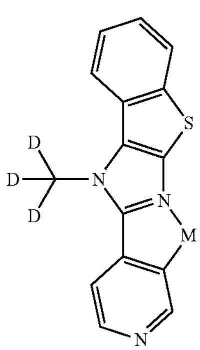
-continued
L1309
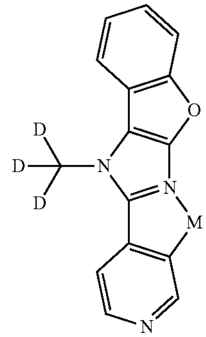
L1310
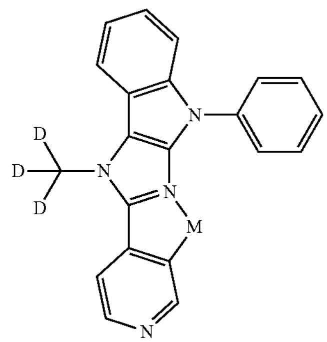
L1311
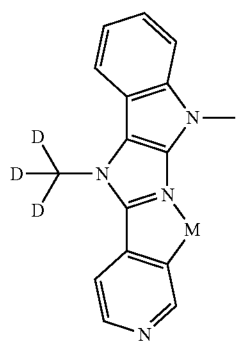
L1312
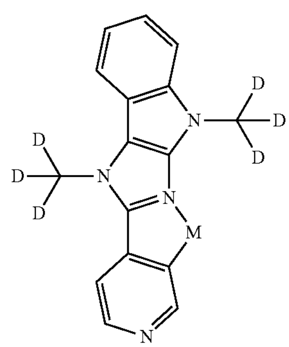

-continued
L1313
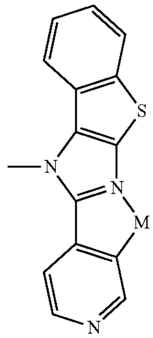
L1314
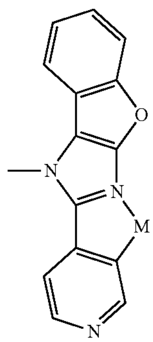
L1315
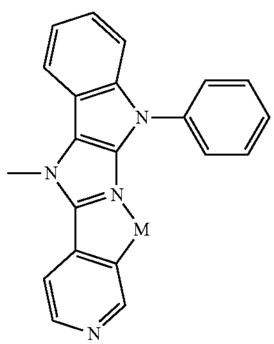
L1316
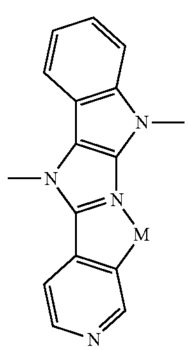
-continued
L1317
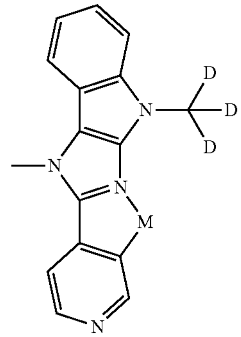
L1318
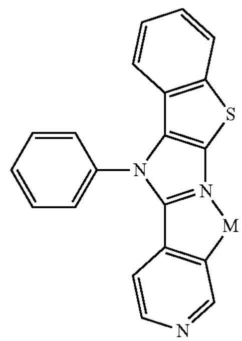
L1319
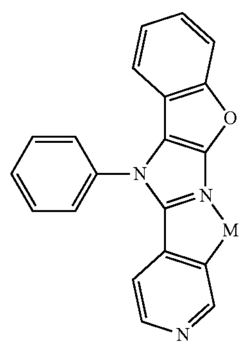
L1320
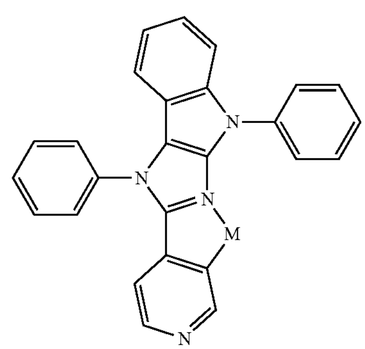

-continued
L1321
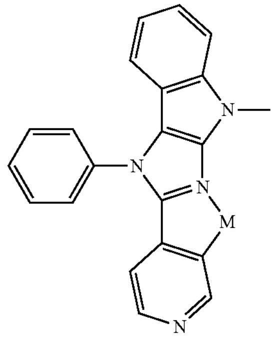
L1322
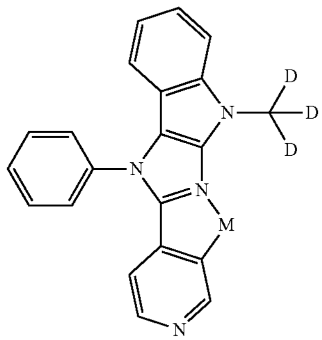
L1323
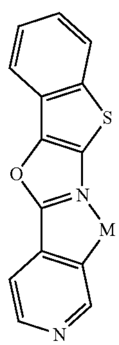
L1324
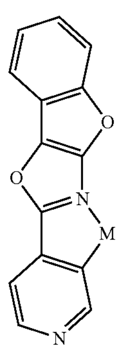
-continued
L1325
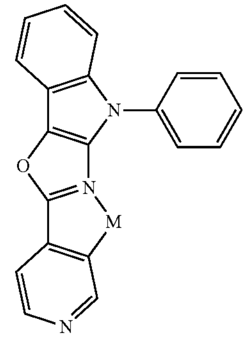
L1326
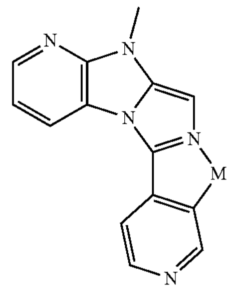
L1327
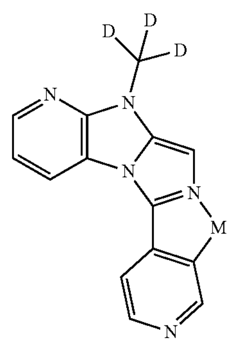
L1328
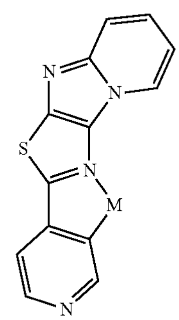
L1329
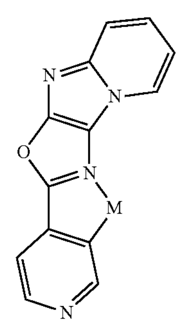

-continued
L1330
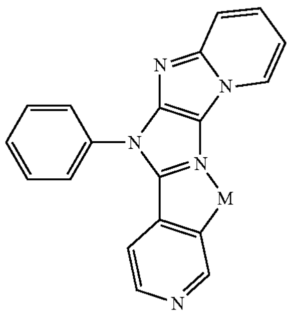
L1331
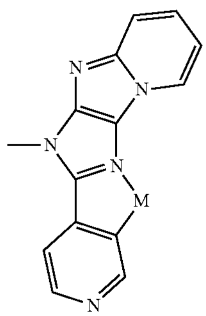
L1332
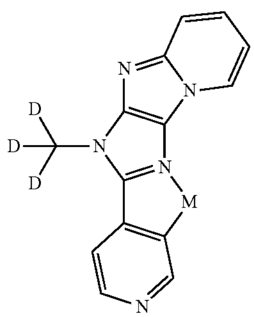
L1333
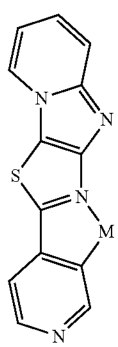
L1334
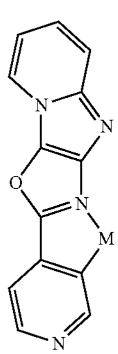
-continued
L1335
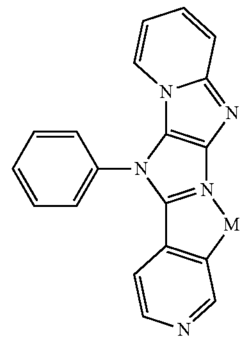
L1336
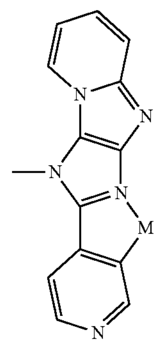
L1337
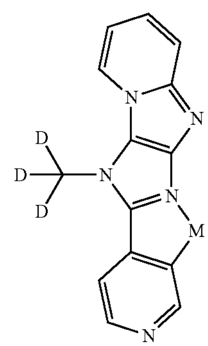
L1338
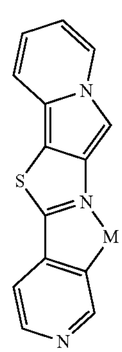

-continued
L1339
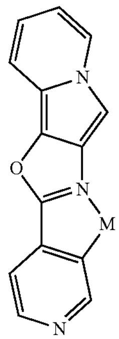
L1340
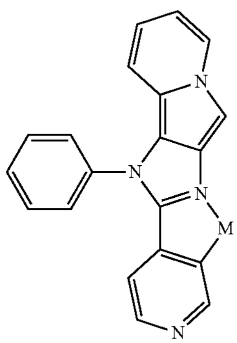
L1341
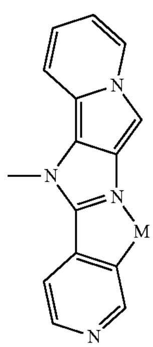
L1342
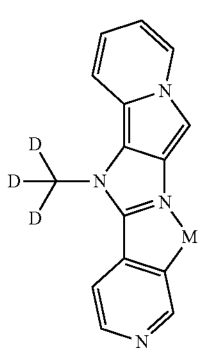
-continued
L1343
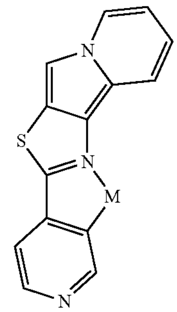
L1344
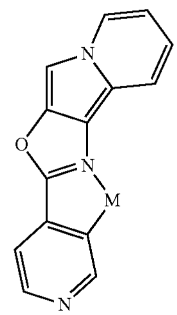
L1345
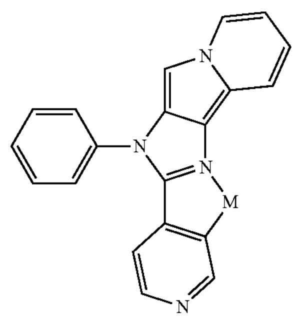
L1346
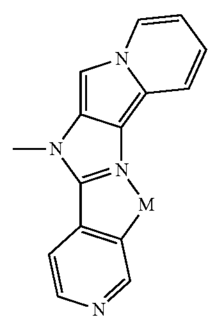
L1347
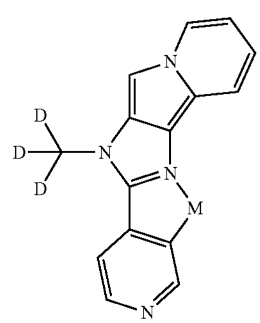

-continued
L1348
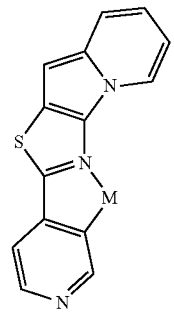
L1349
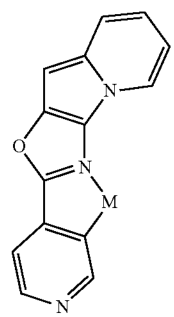
L1350
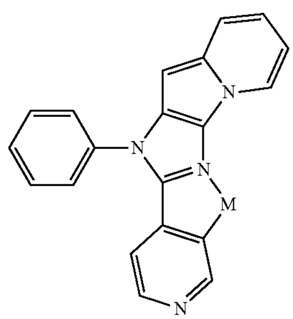
L1351
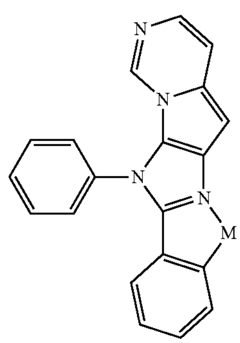
L1352
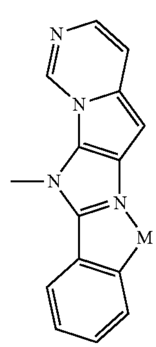
-continued
L1353
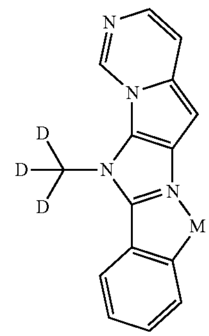
L1354
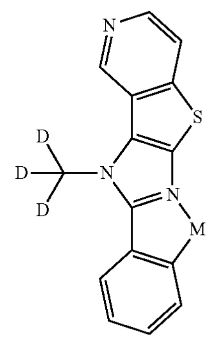
L1355
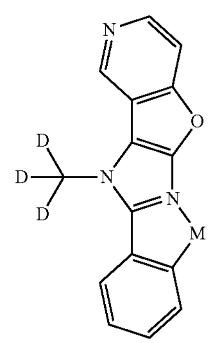
L1356
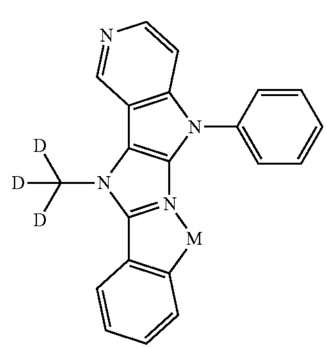

-continued
L1357
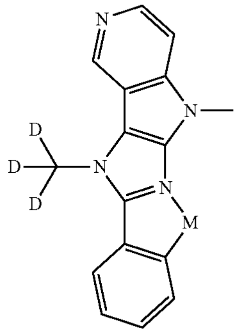
L1358
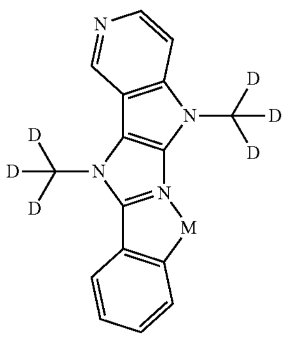
L1359
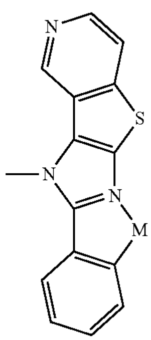
L1360
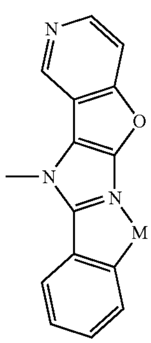
-continued
L1361
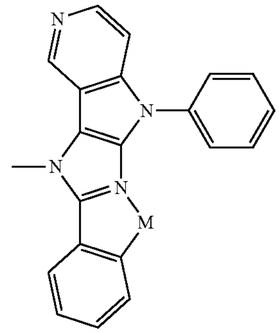
L1362
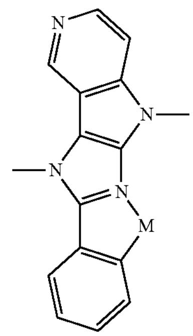
L1363
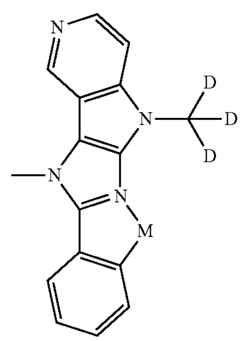
L1364
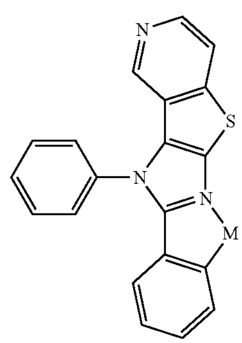

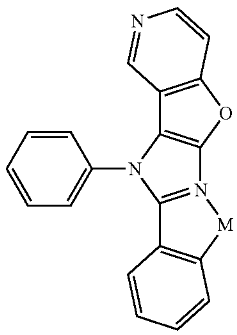
L1365
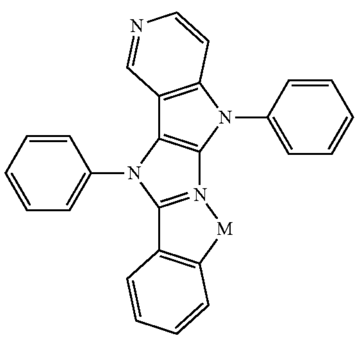
L1366
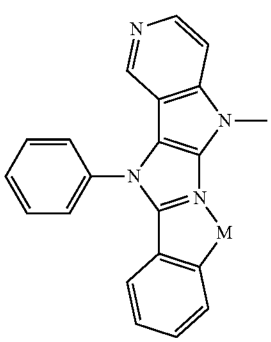
L1367
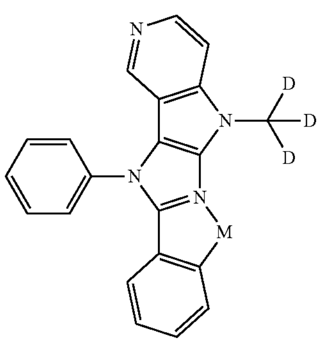
L1368
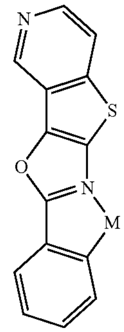
L1369
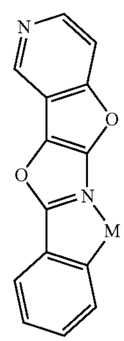
L1370
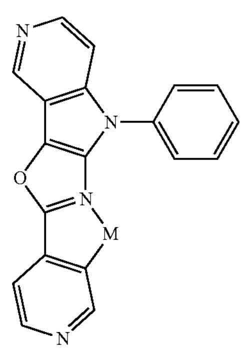
L1371
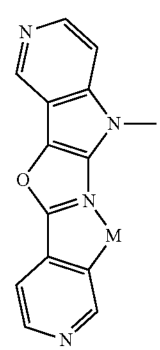
L1372

L1373
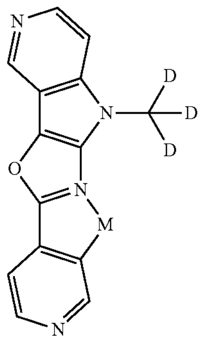
L1374
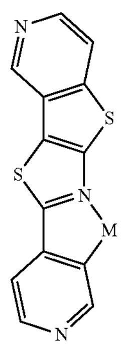
L1375
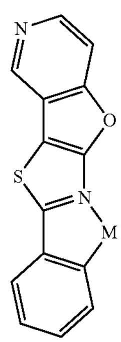
L1376
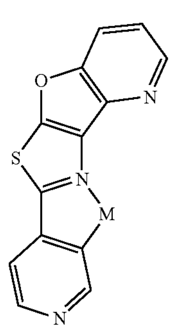
L1377
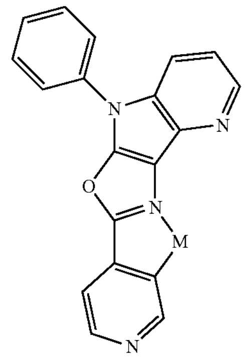
L1378
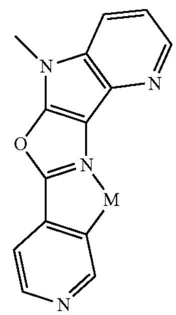
L1379
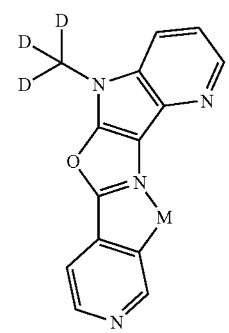
L1380
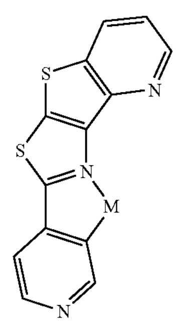
L1381
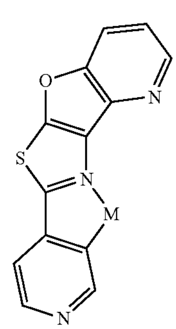

L1382
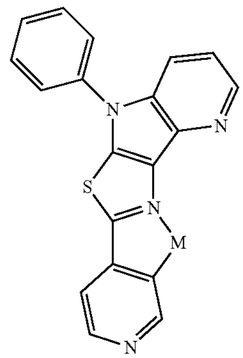
L1383
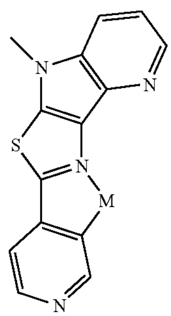
L1384
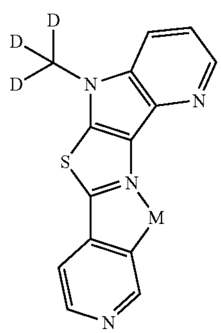
L1385
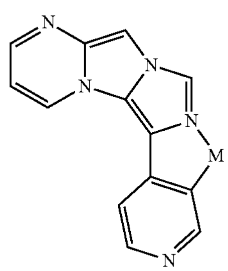
L1386
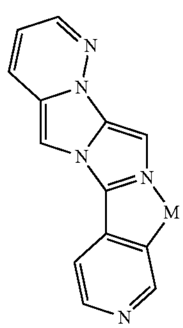
L1387
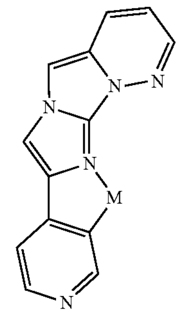
L1388
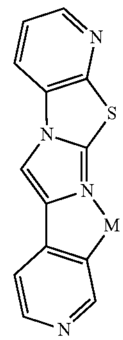
L1389
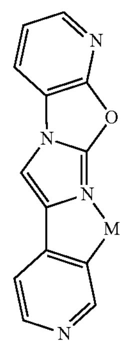
L1390
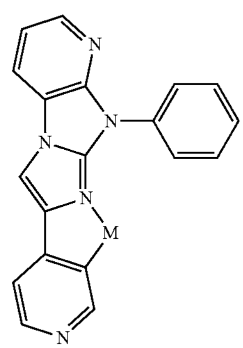

-continued
L1391
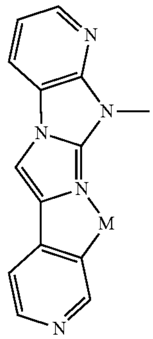
L1392
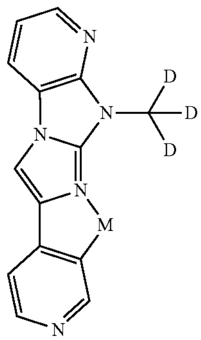
L1393
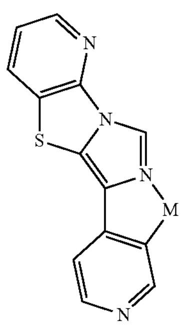
L1394
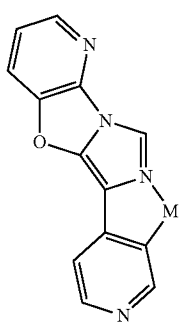
L1395
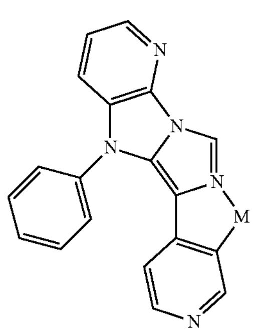
-continued
L1396
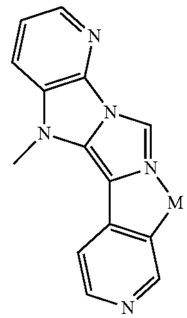
L1397
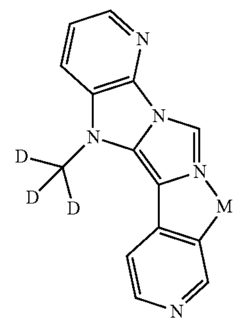
L1398
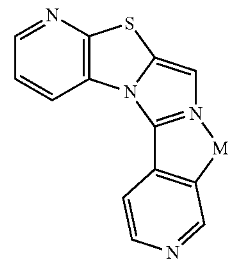
L1399
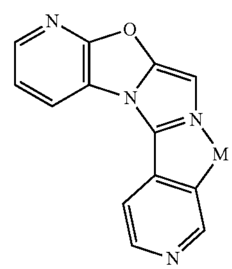
L1400
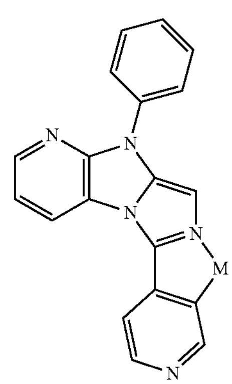

-continued
L1401
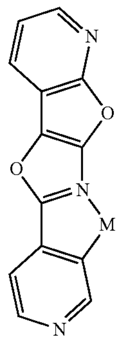
L1402
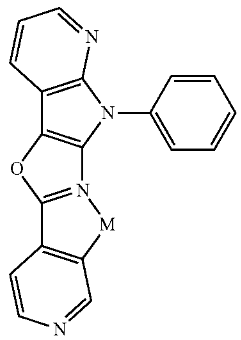
L1403
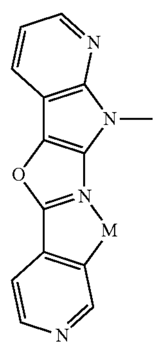
L1404
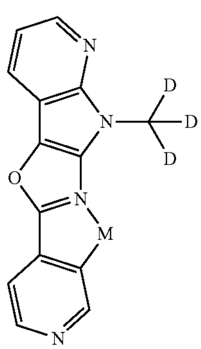
-continued
L1405
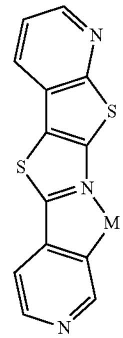
L1406
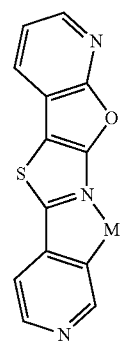
L1407
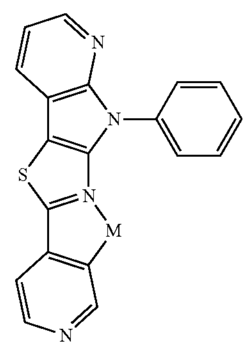
L1408
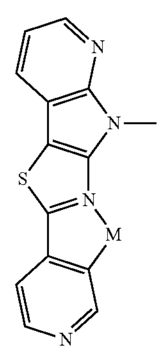

-continued
L1409
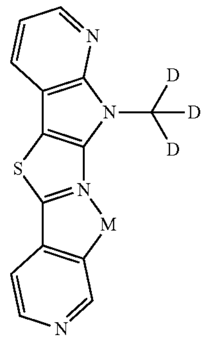
L1410
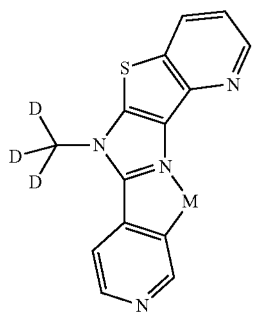
L1411
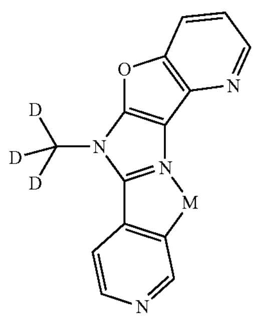
L1412
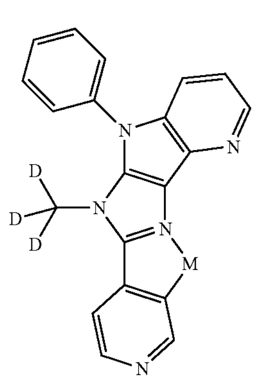
-continued
L1413
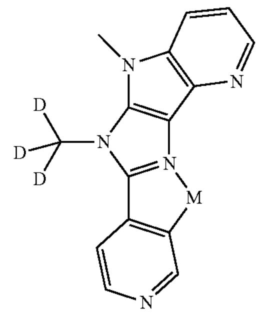
L1414
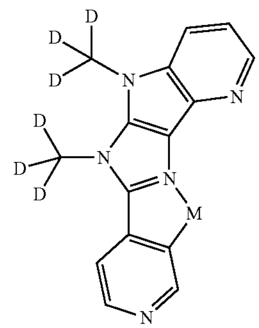
L1415
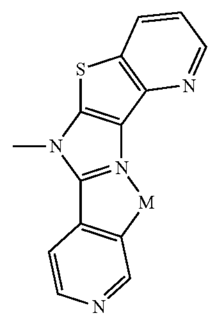
L1416
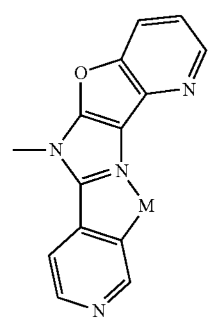
L1417
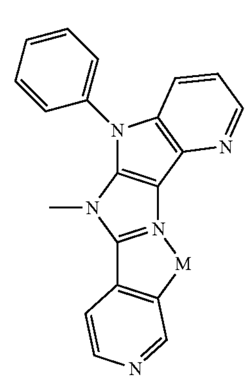

L1418
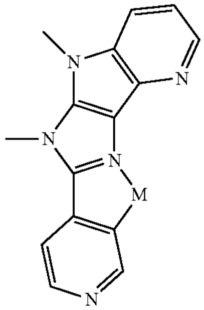
L1419
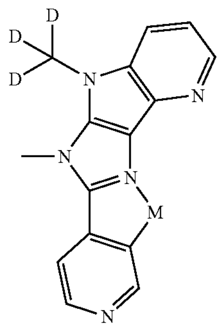
L1420
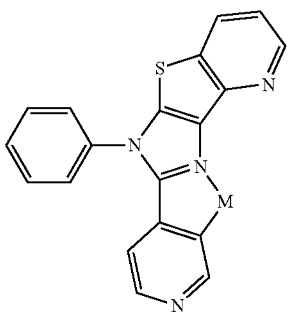
L1421
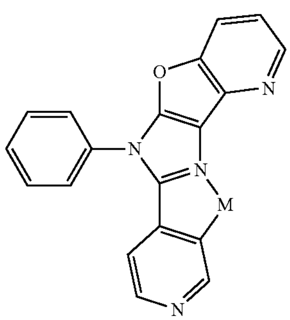
L1422
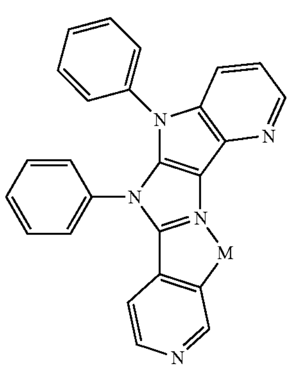
L1423
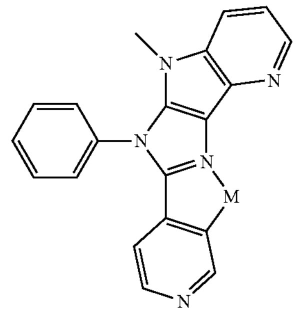
L1424
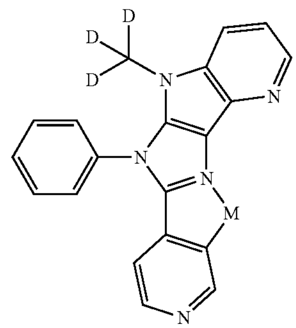
L1425
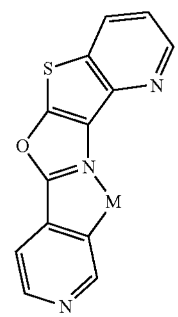
L1426
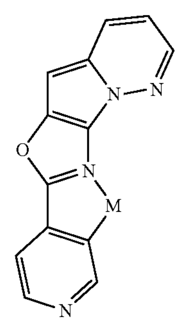
L1427
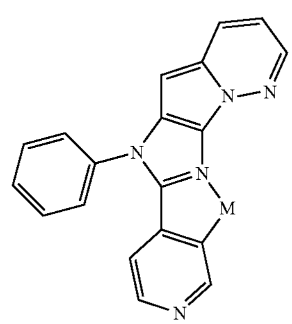

-continued
L1428
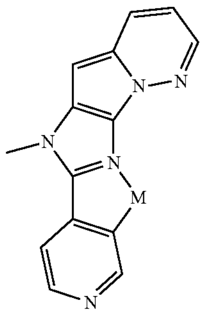
L1429
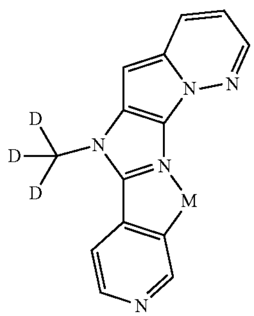
L1430
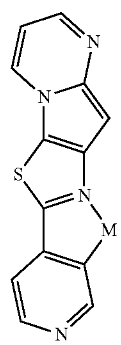
L1431
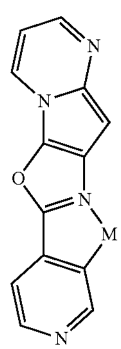
-continued
L1432
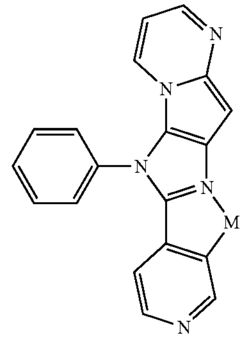
L1433
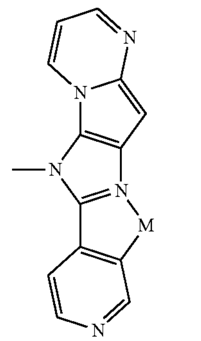
L1434
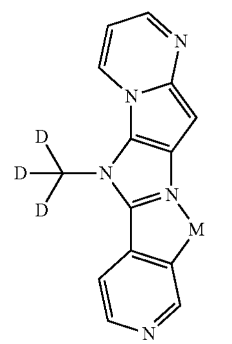
L1435
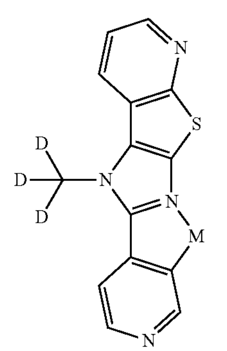

-continued
L1436
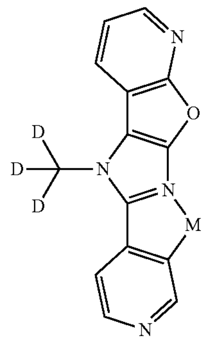
L1437
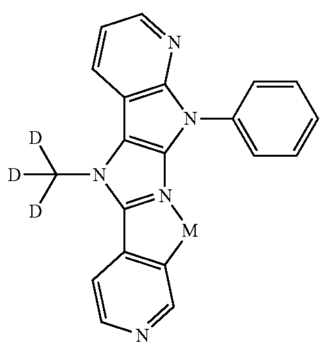
L1438
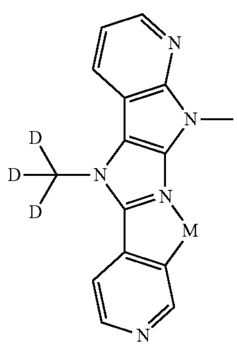
L1439
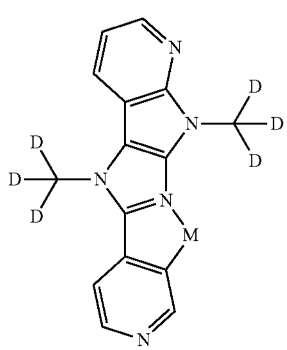
-continued
L1440
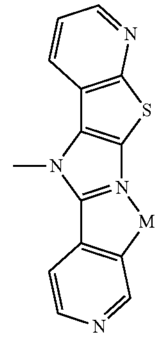
L1441
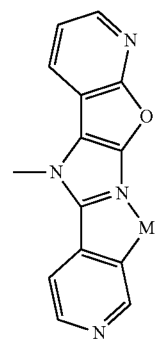
L1442
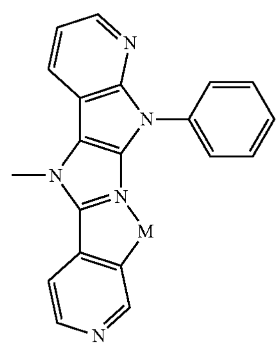
L1443
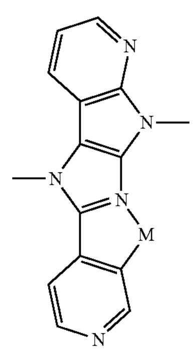

-continued
L1444
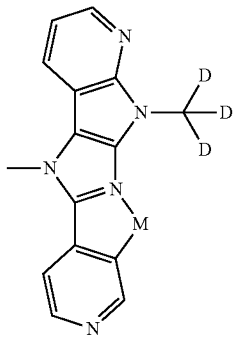
L1445
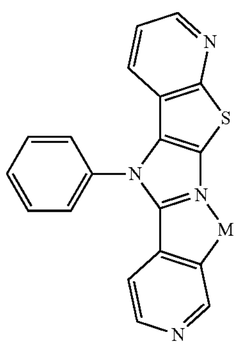
L1446
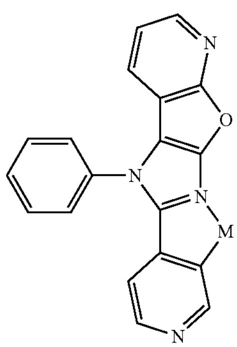
L1447
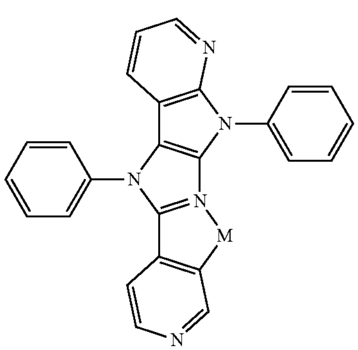
-continued
L1448
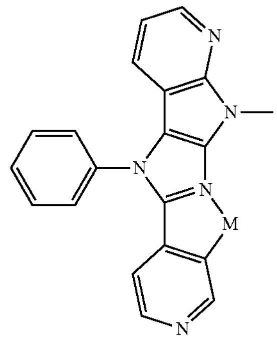
L1449
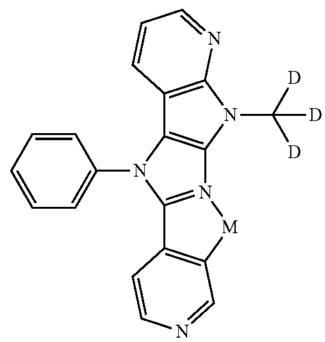
L1450
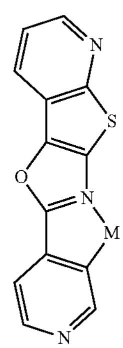
L1451
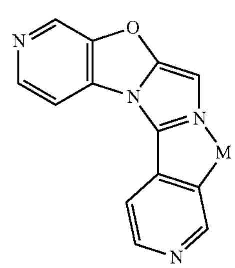

-continued
L1452
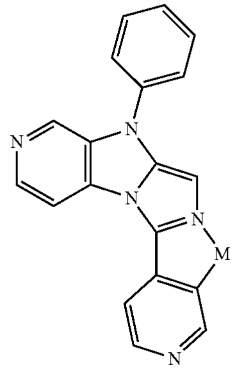
L1453
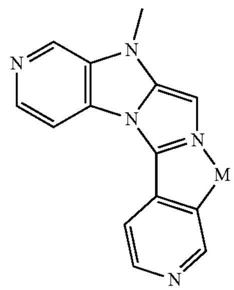
L1454
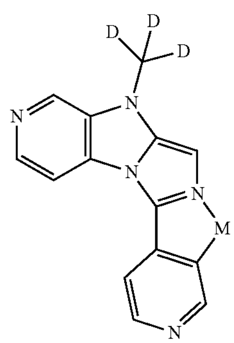
L1455
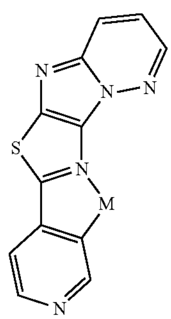
L1456
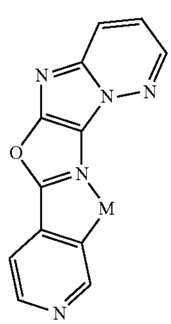
-continued
L1457
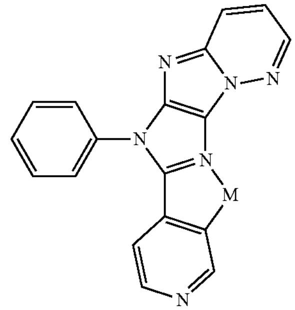
L1458
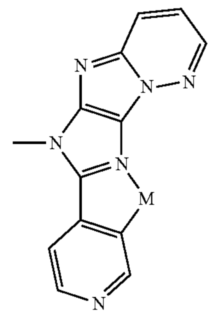
L1459
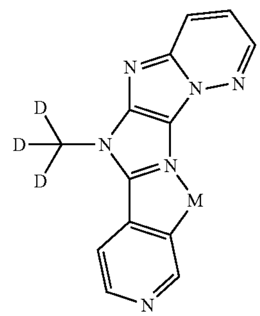
L1460
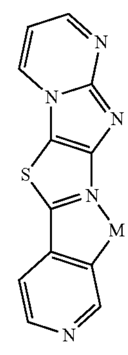
L1461
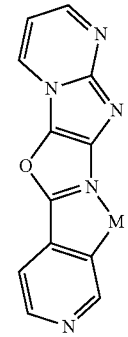

-continued
L1462
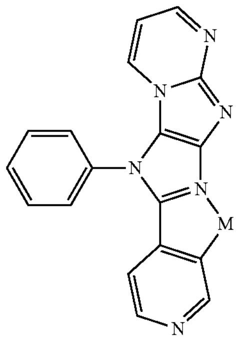
L1463
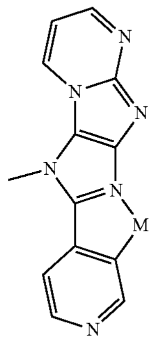
L1464
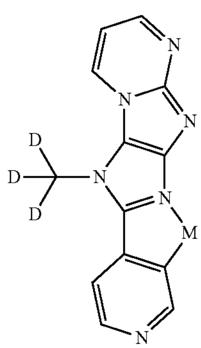
L1465
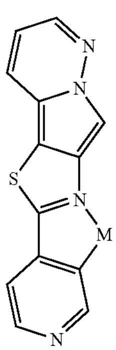
-continued
L1466
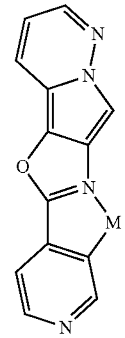
L1467
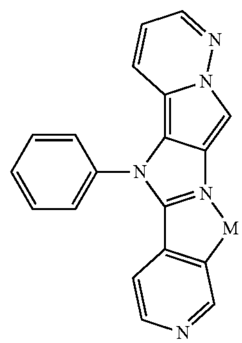
L1468
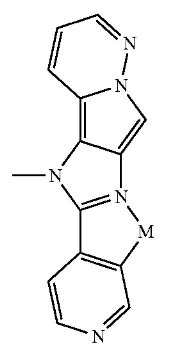
L1469
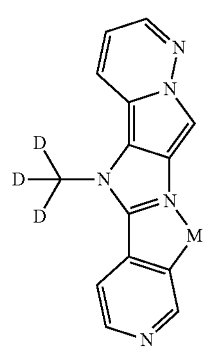

-continued
L1470
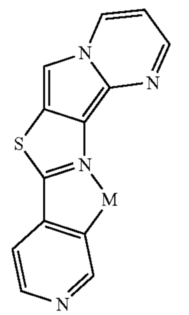
L1471
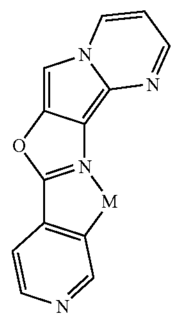
L1472
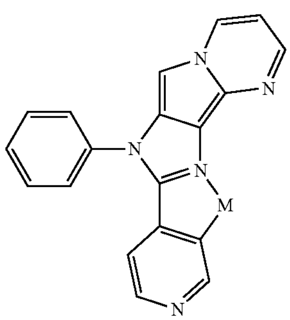
L1473
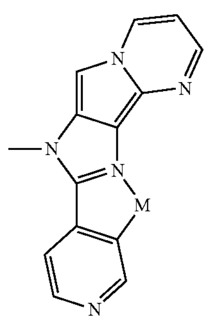
L1474
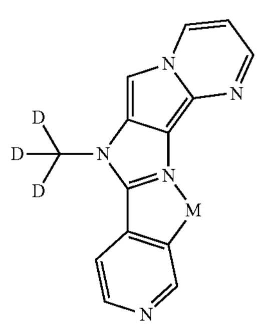
-continued
L1475
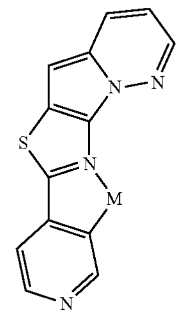
L1476
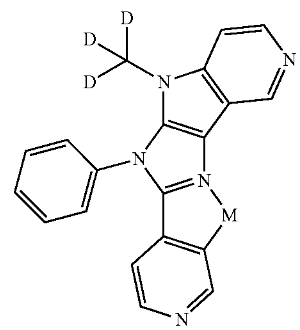
L1477
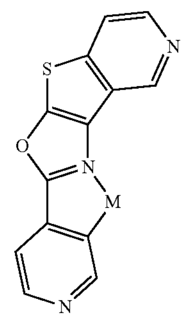
L1478
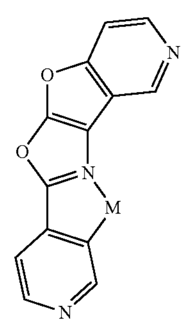
L1479
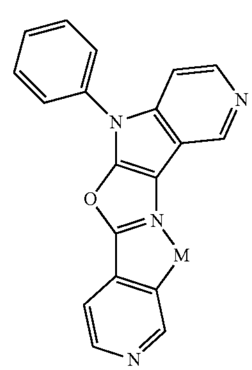

L1480
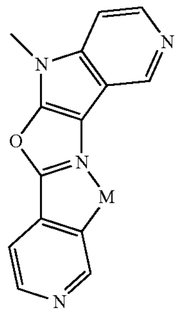
L1481
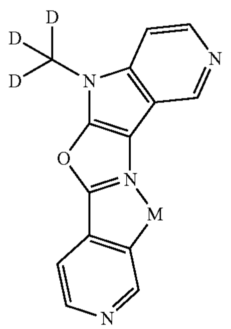
L1482
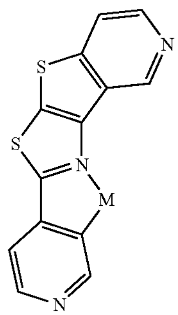
L1483
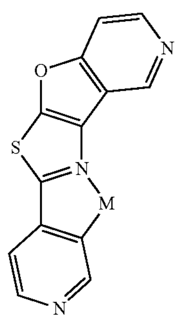
L1484
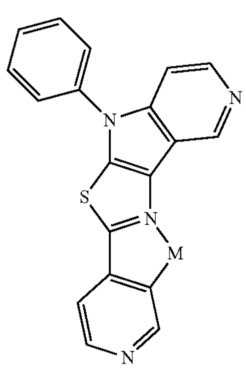
L1485
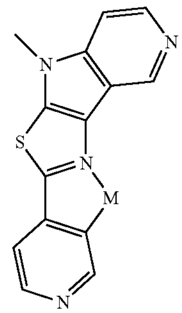
L1486
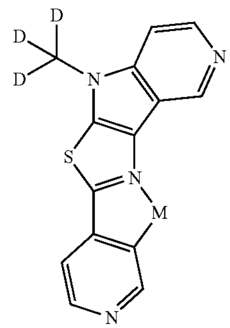
L1487
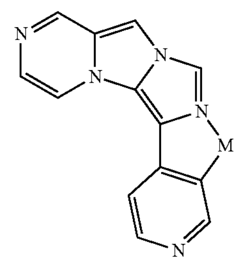
L1488
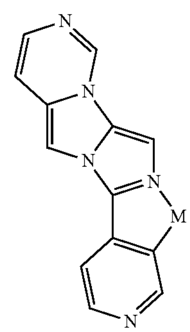
L1489
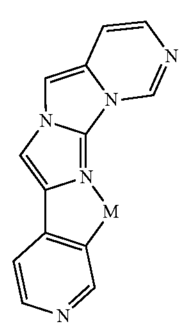

-continued
L1490
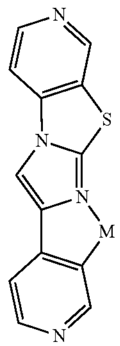
L1491
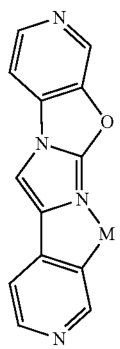
L1492
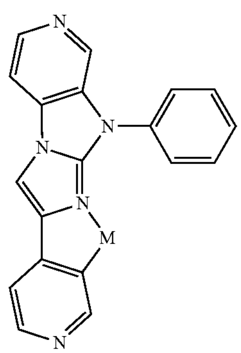
L1493
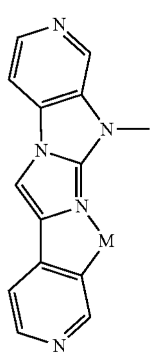
-continued
L1494
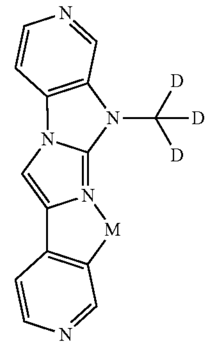
L1495
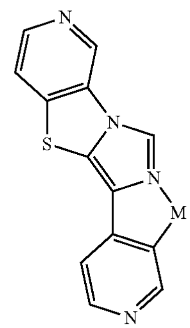
L1496
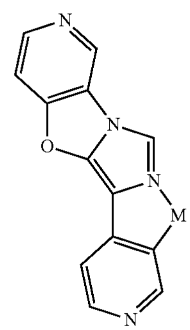
L1497
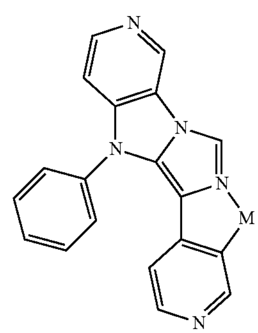

L1498
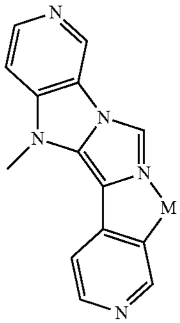
L1499
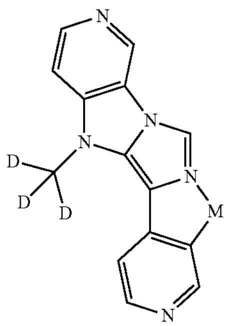
L1500
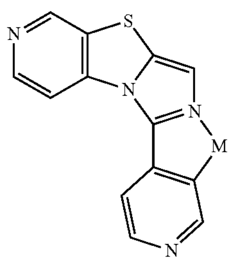
L1501
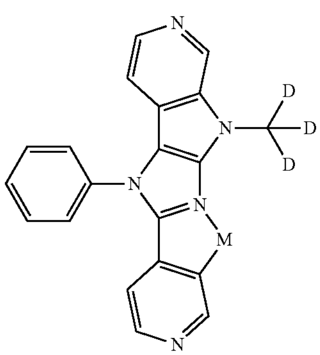
L1502
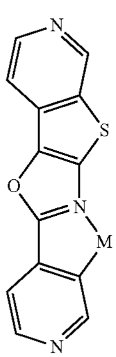
L1503
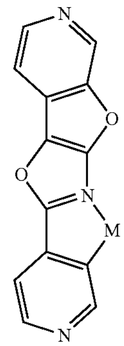
L1504
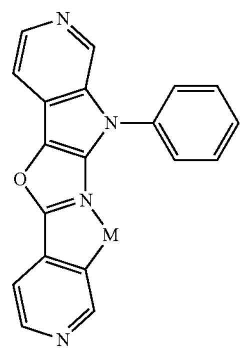
L1505
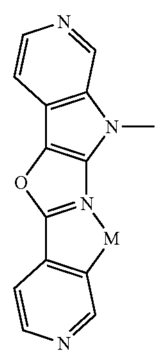
L1506
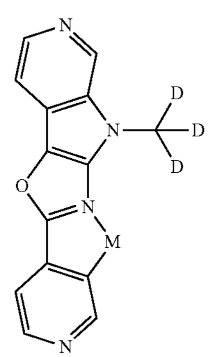

-continued
L1507
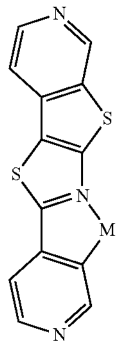
L1508
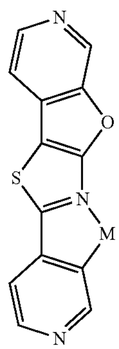
L1509
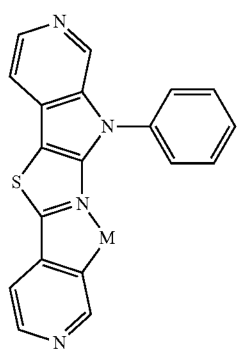
L1510
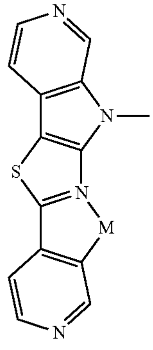
-continued
L1511
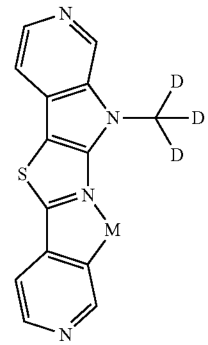
L1512
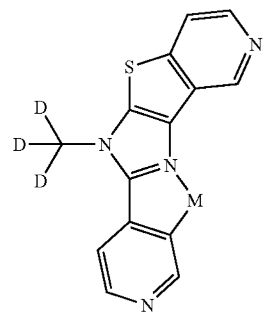
L1513
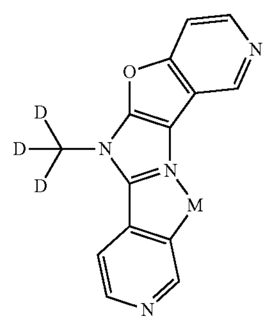
L1514
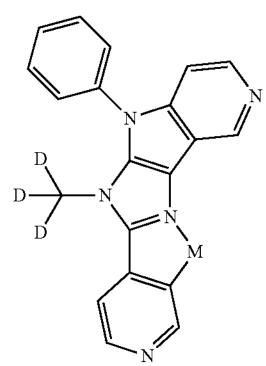

-continued
L1515
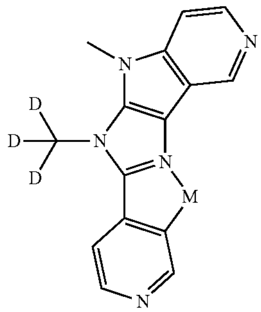
L1516
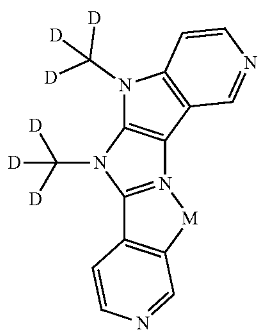
L1517
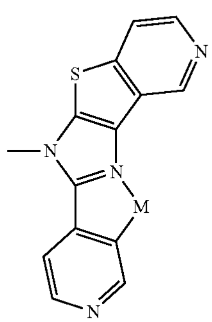
L1518
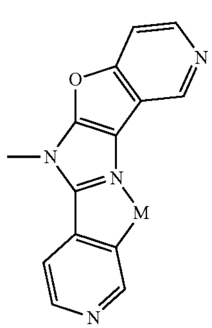
-continued
L1519
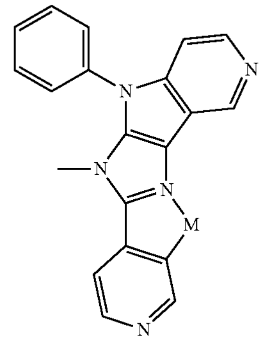
L1520
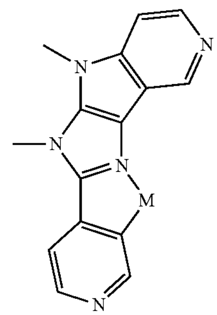
L1521
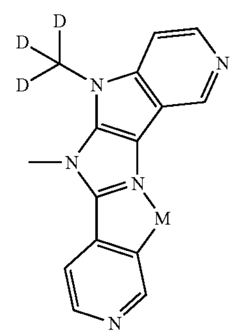
L1522
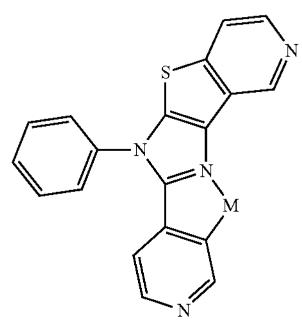
L1523
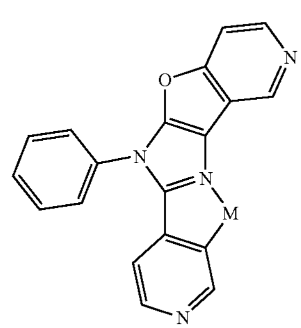

-continued
L1524
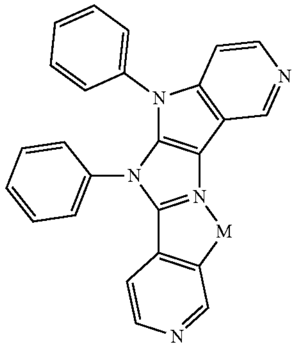
L1525
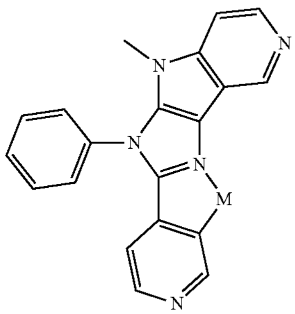
L1526
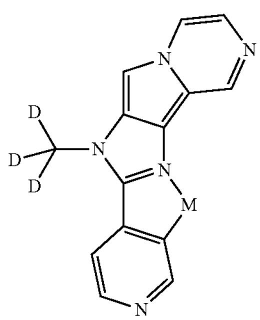
L1527
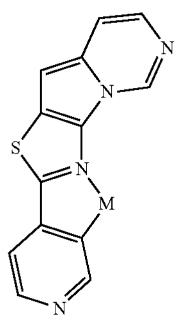
L1528
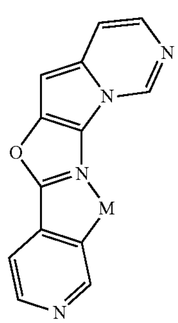
-continued
L1529
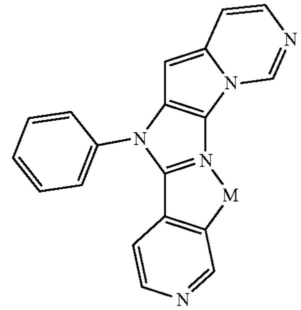
L1530
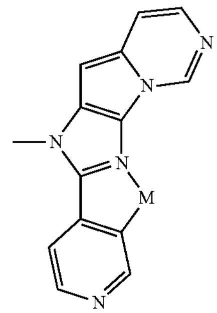
L1531
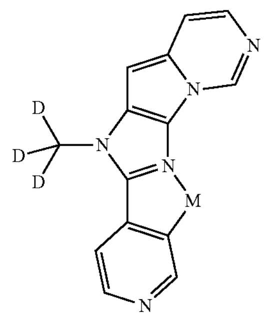
L1532
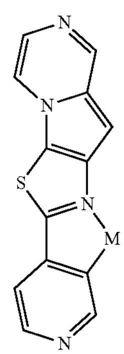
L1533
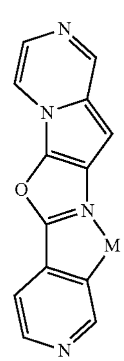

-continued
L1534
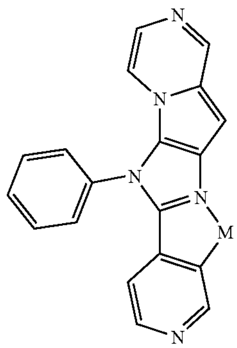
L1535
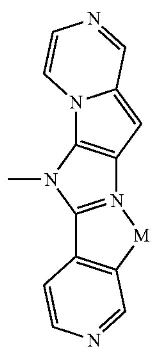
L1536
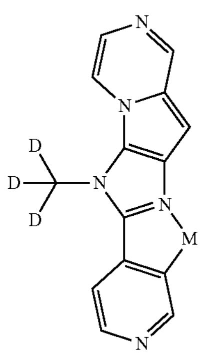
L1537
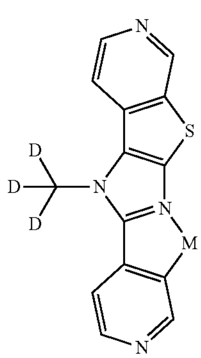
-continued
L1538
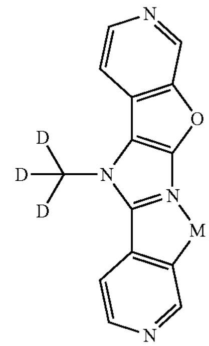
L1539
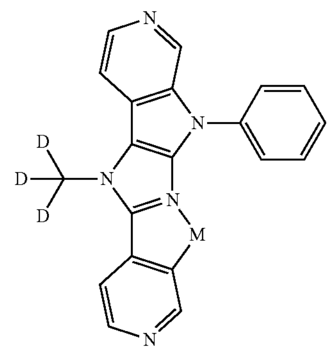
L1540
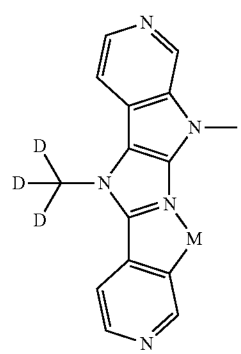
L1541
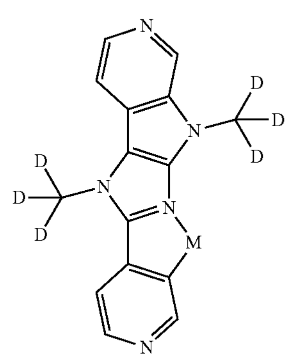

-continued
L1542
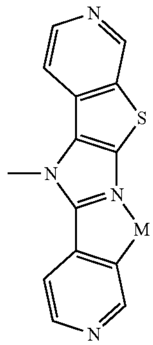
L1543
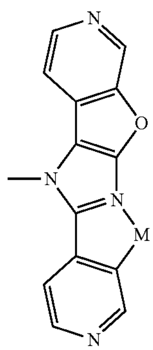
L1544
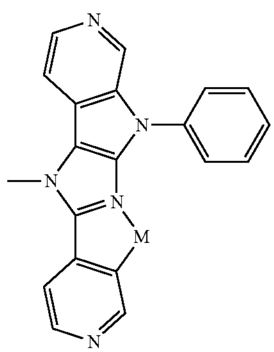
L1545
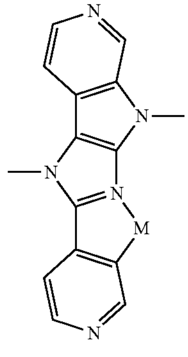
-continued
L1546
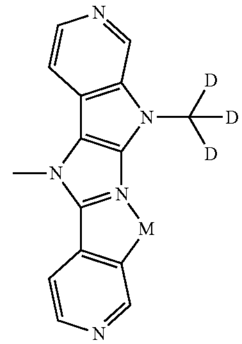
L1547
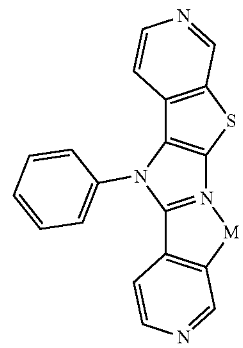
L1548
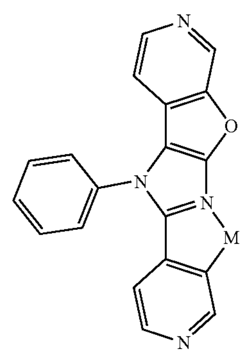
L1549
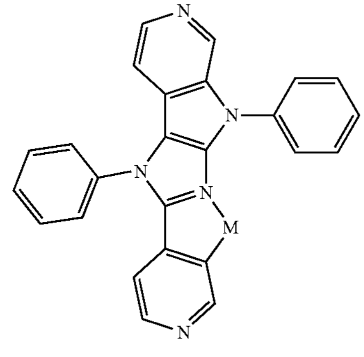

L1550
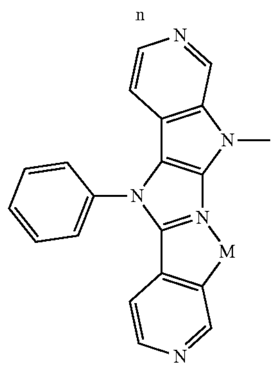
L1551
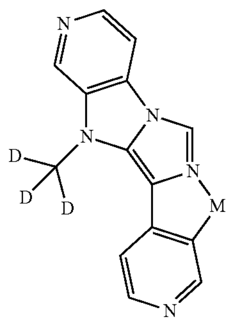
L1552
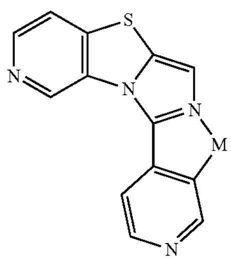
L1553
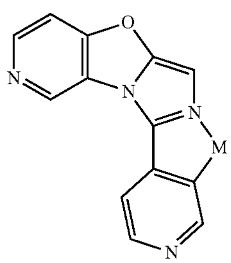
L1554
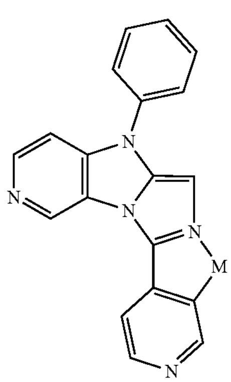
L1555
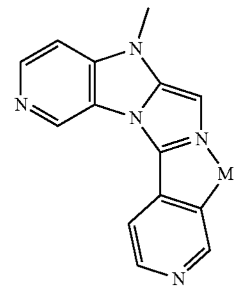
L1556
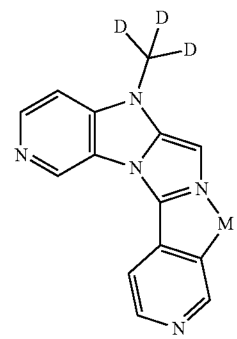
L1557
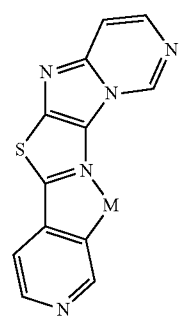
L1558
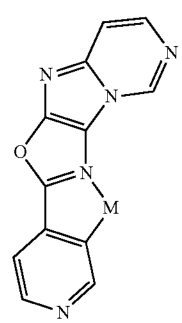
L1559
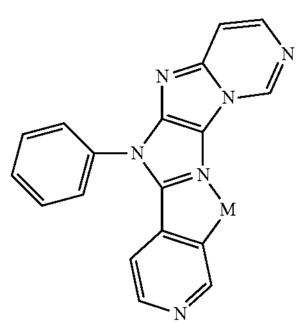

-continued
L1560
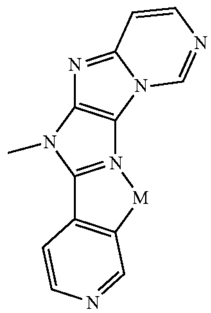
L1561
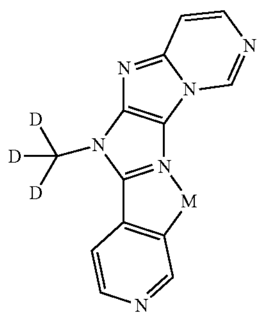
L1562
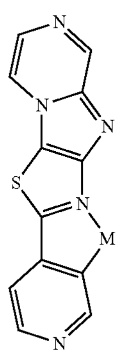
L1563
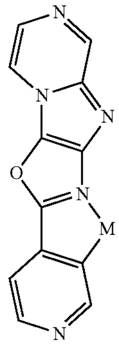
-continued
L1564
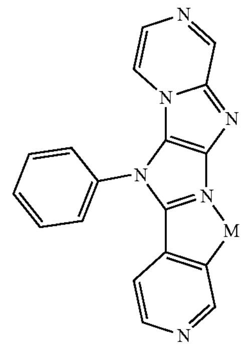
L1565
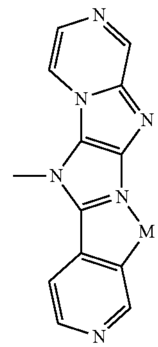
L1566
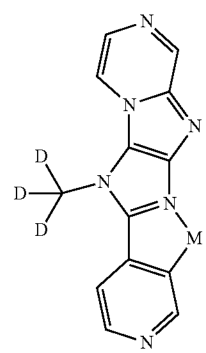
L1567
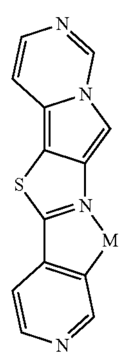

-continued
L1568
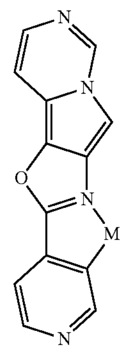
L1569
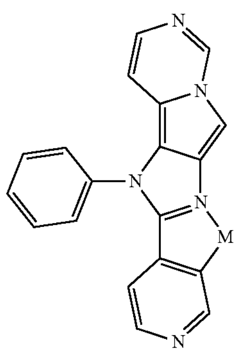
L1570
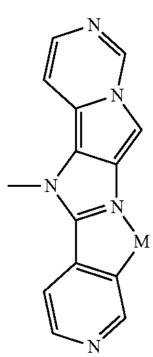
L1571
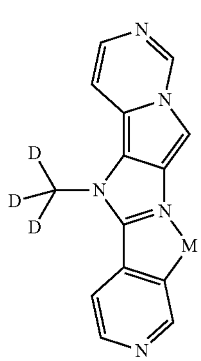
-continued
L1572
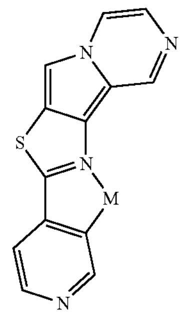
L1573
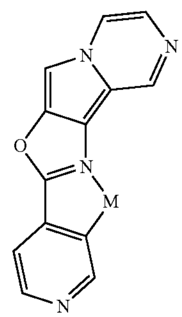
L1574
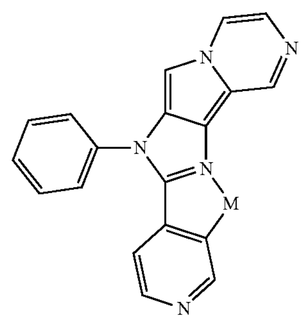
L1575
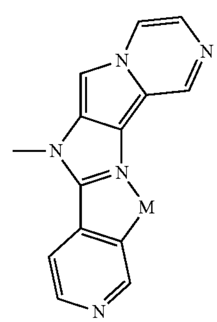
L1576
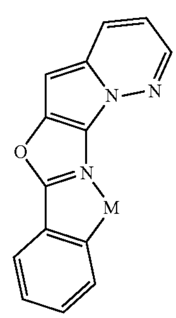

L1577
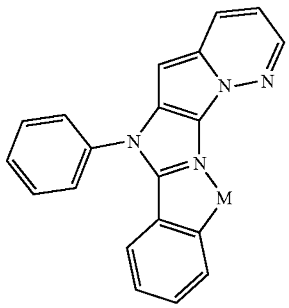
L1578
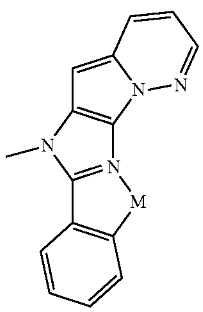
L1579
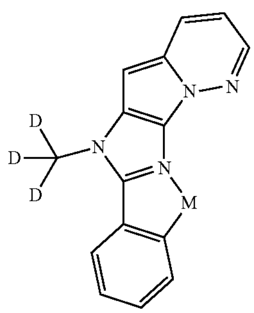
L1580
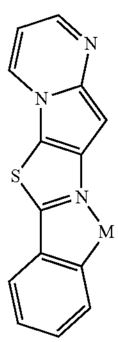
L1581
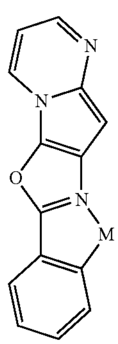
L1582
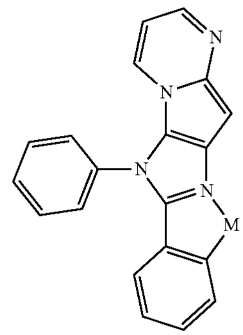
L1583
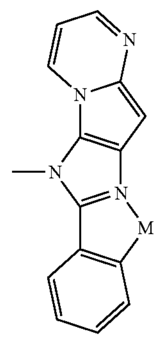
L1584
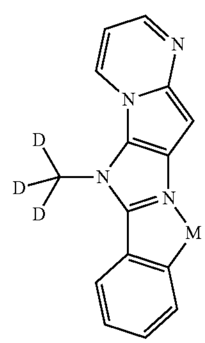
L1585
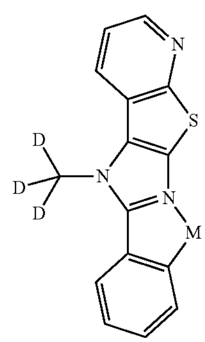

-continued
L1586
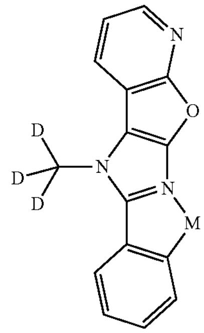
L1587
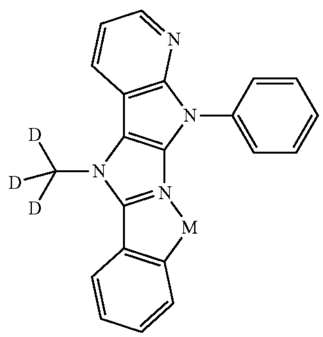
L1588
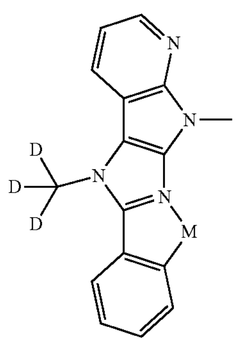
L1589
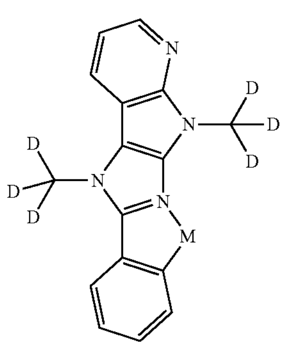
-continued
L1590
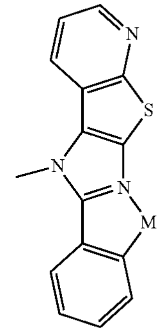
L1591
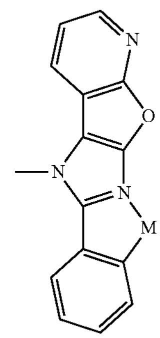
L1592
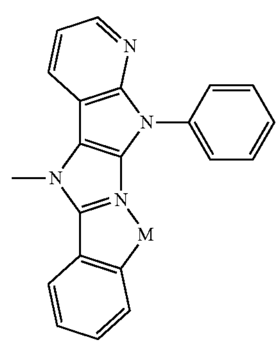
L1593
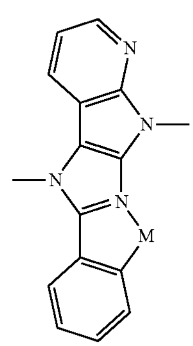

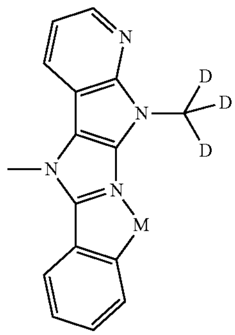
L1594
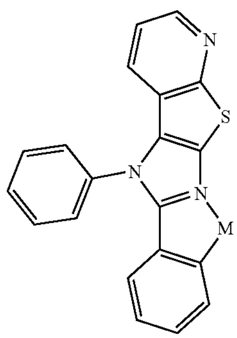
L1595
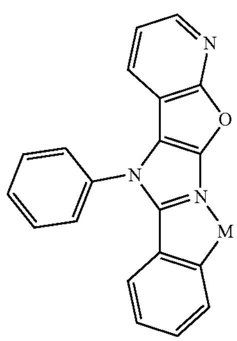
L1596
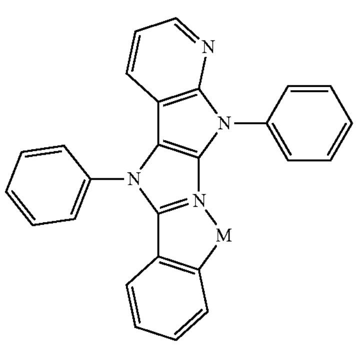
L1597
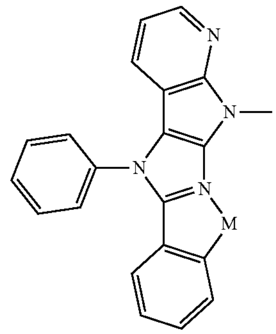
L1598
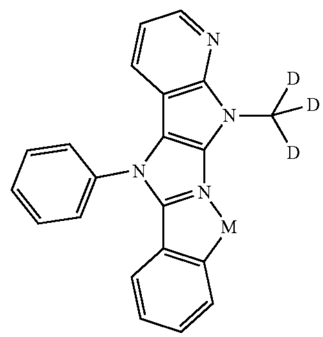
L1599
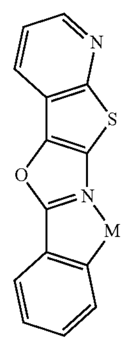
L1600
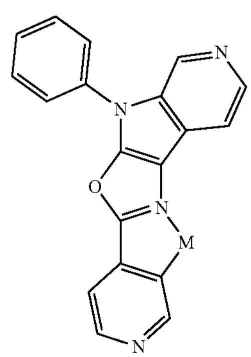
L1601

-continued
L1602
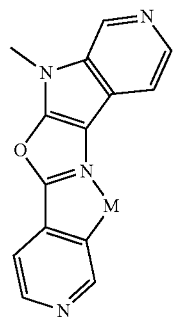
L1603
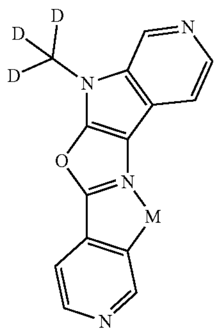
L1604
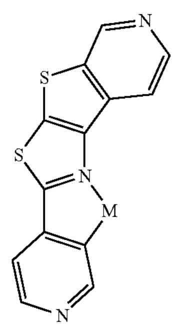
L1605
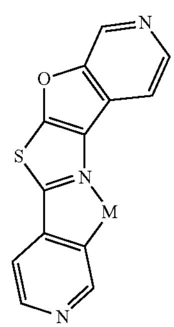
L1606
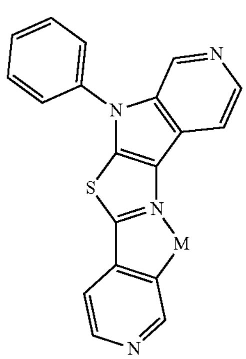
-continued
L1607
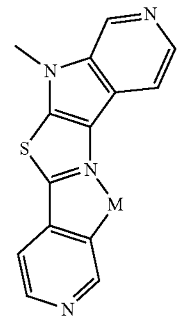
L1608
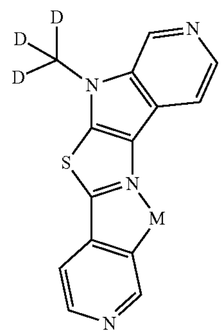
L1609
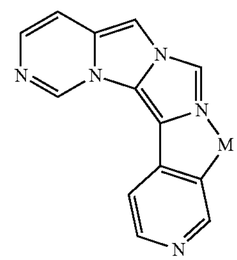
L1610
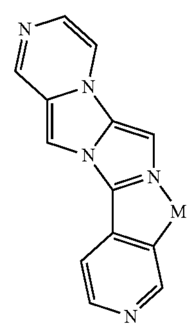
L1611
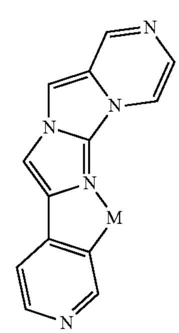

-continued
L1612
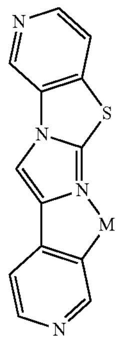
L1613
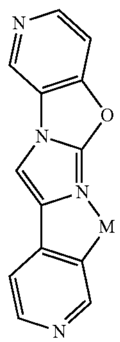
L1614
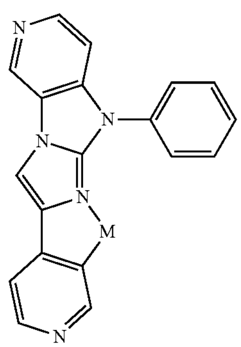
L1615
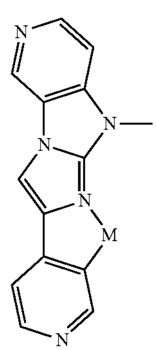
-continued
L1616
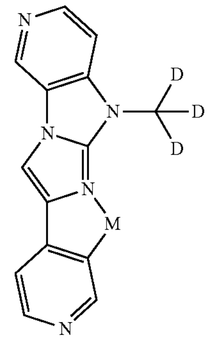
L1617
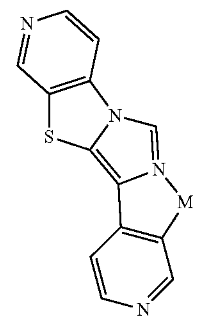
L1618
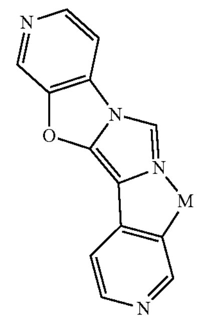
L1619
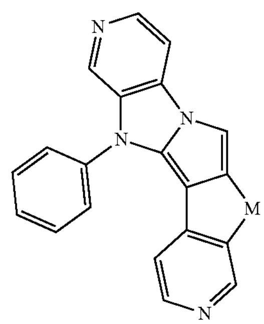
L1620
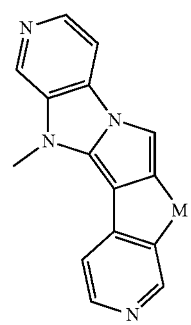

-continued
L1621
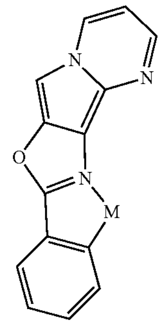
L1622
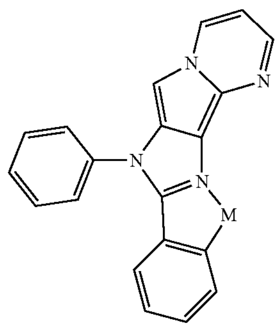
L1623
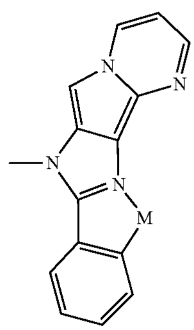
L1624
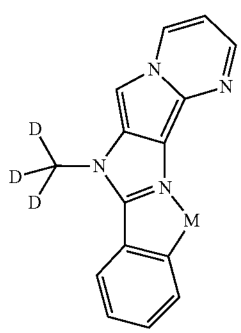
L1625
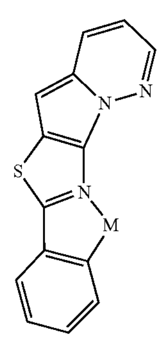
-continued
L1626
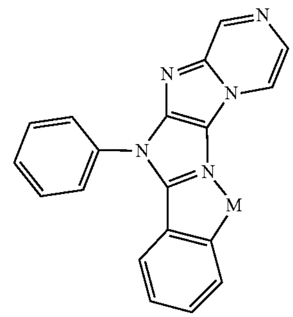
L1627
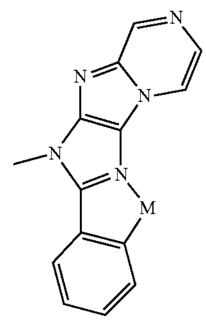
L1628
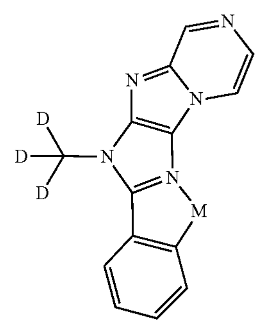
L1629
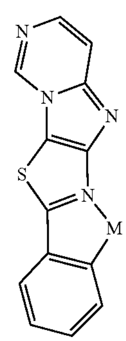
L1630
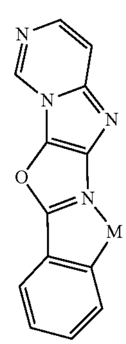

-continued
L1631
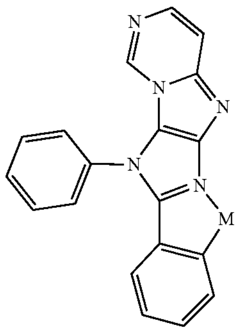
L1632
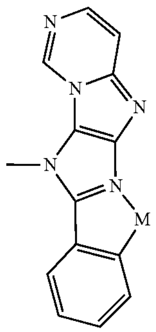
L1633
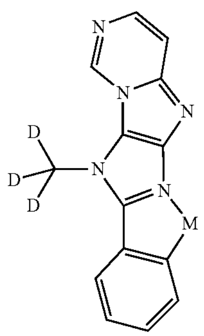
L1634
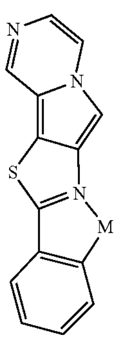
-continued
L1635
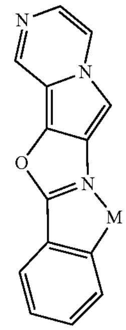
L1636
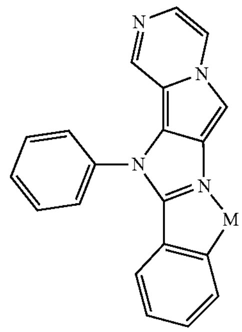
L1637
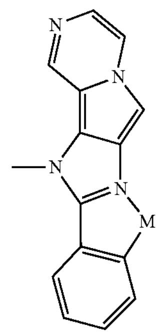
L1638
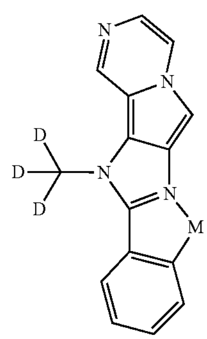
L1639
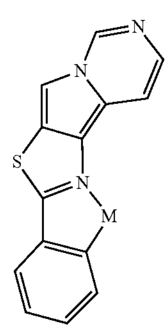

L1640
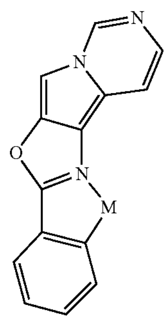
L1645
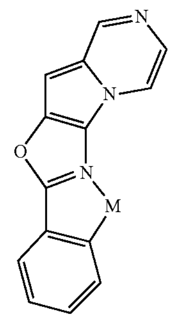
L1641
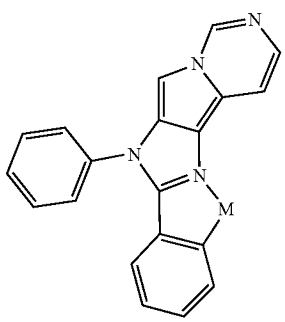
L1646
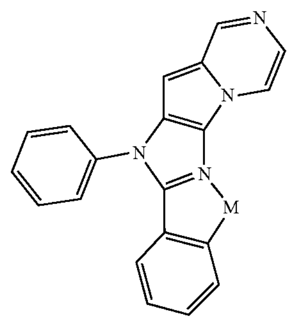
L1642
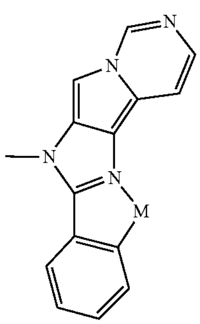
L1647
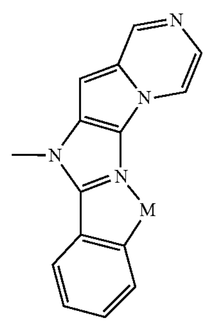
L1643
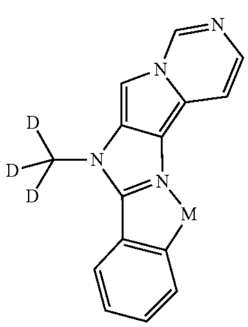
L1648
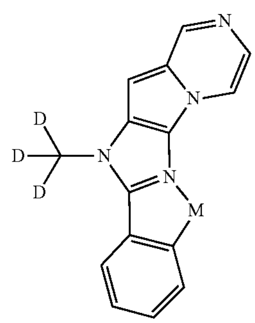
L1644
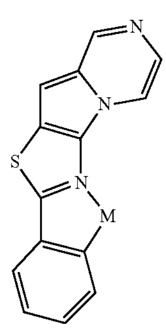
L1649
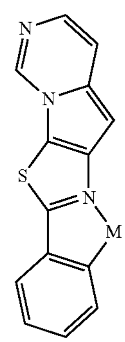

-continued
L1650
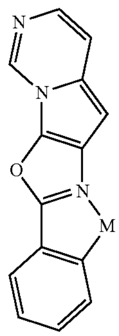
L1651
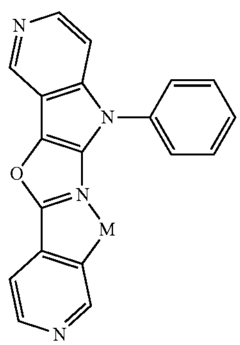
L1652
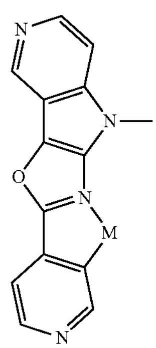
L1653
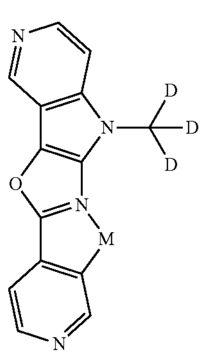
-continued
L1654
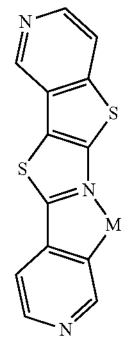
L1655
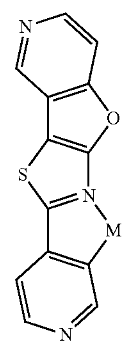
L1656
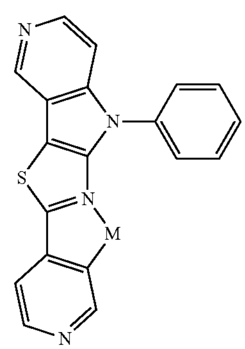
L1657
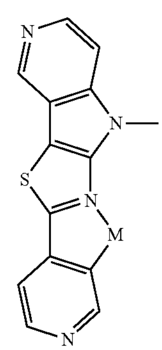

-continued
L1658
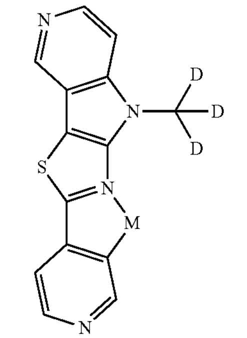
L1659
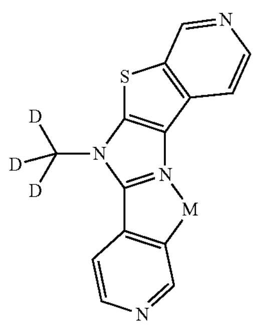
L1660
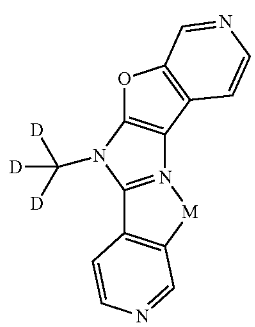
L1661
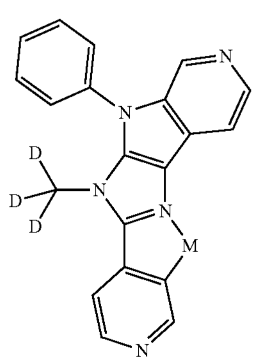
-continued
L1662
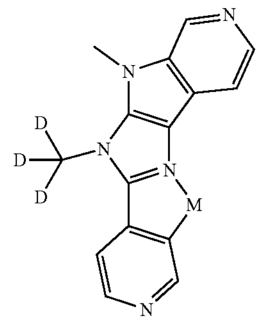
L1663
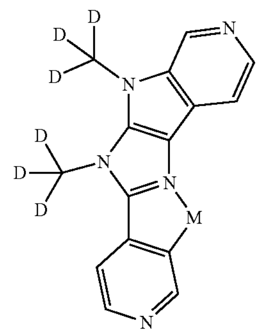
L1664
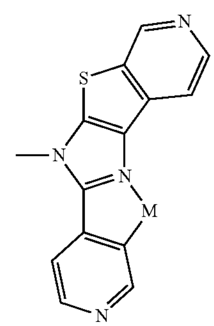
L1665
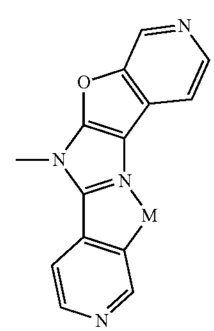
L1666
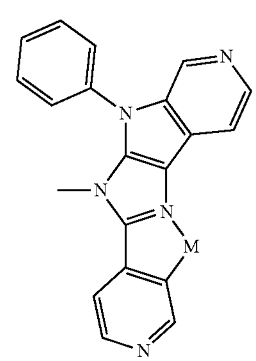

-continued
L1667
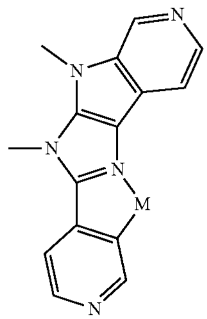
L1668
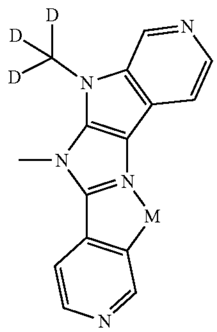
L1669
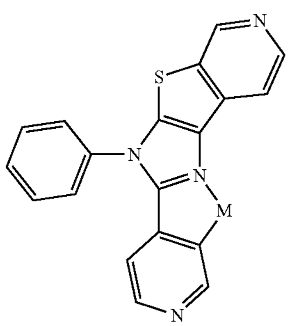
L1670
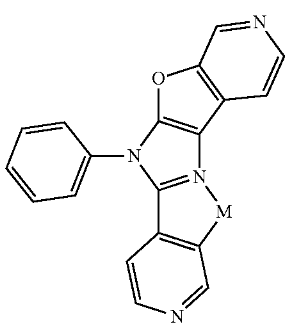
L1671
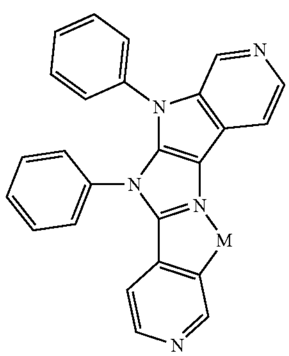
-continued
L1672
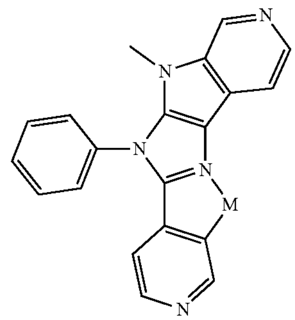
L1673
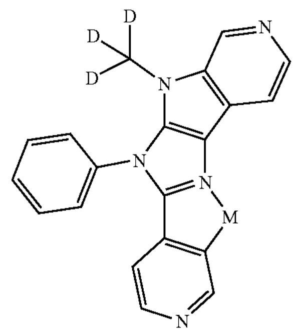
L1674
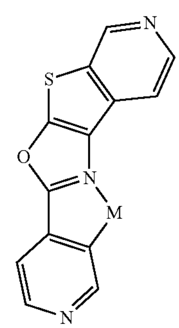
L1675
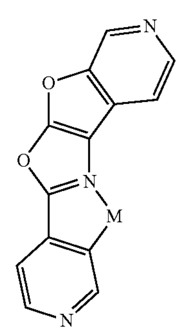
L1676
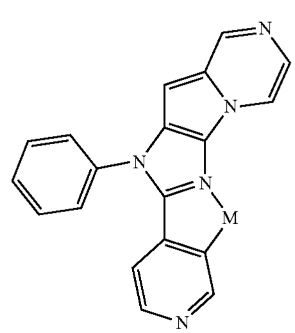

-continued
L1677
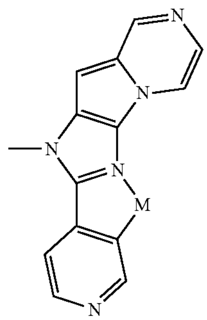
L1678
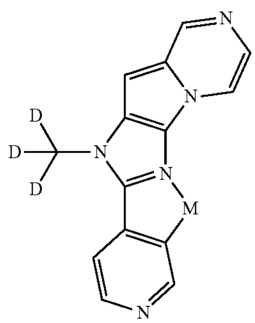
L1679
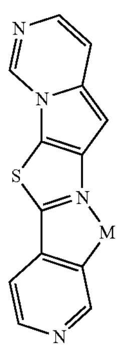
L1680
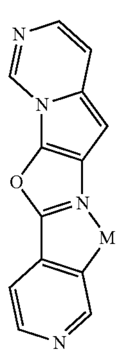
-continued
L1681
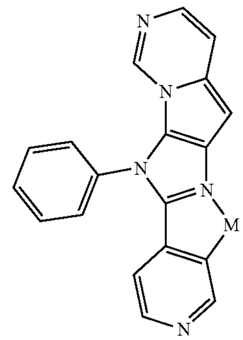
L1682
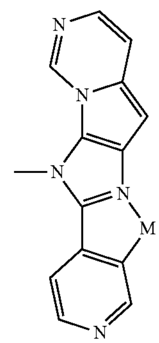
L1683
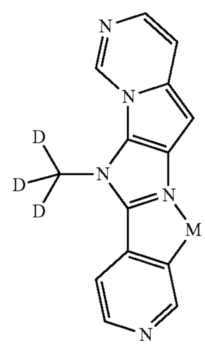
L1684
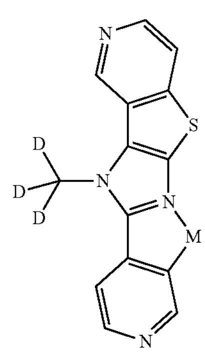

L1685
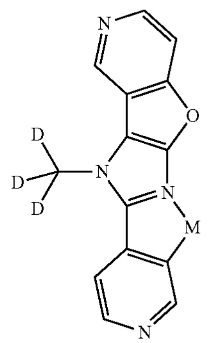
L1686
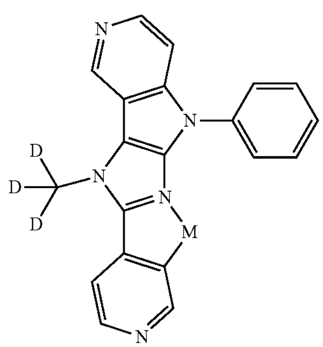
L1687
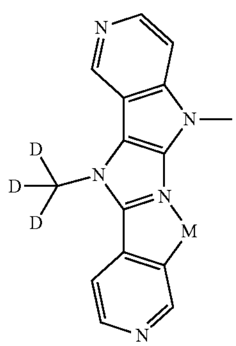
L1688
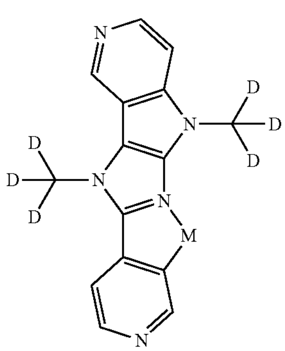
L1689
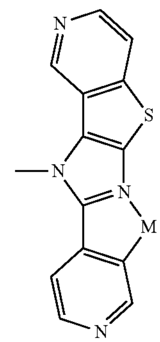
L1690
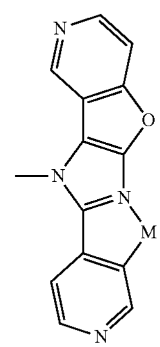
L1691
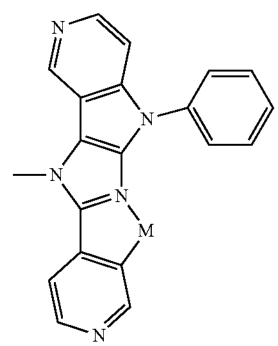
L1692
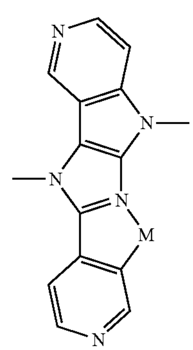

L1693
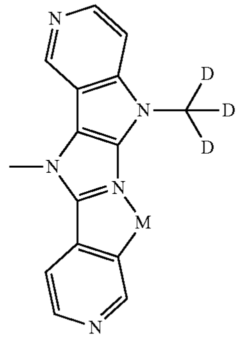
L1694
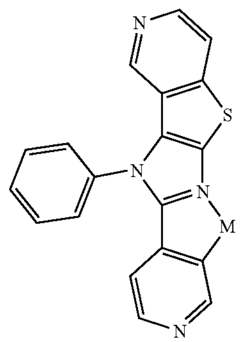
L1695
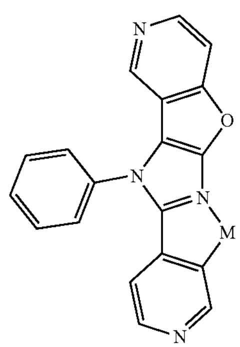
L1696
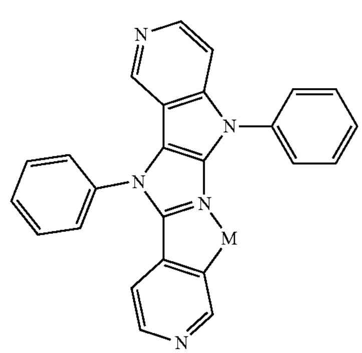
L1697
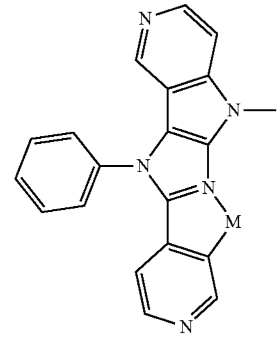
L1698
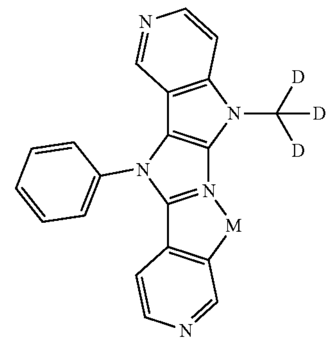
L1699
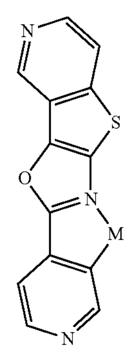
L1700
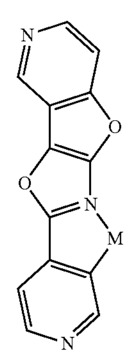

-continued
L1701
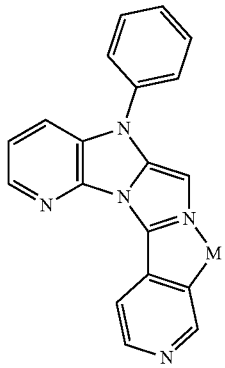
L1702
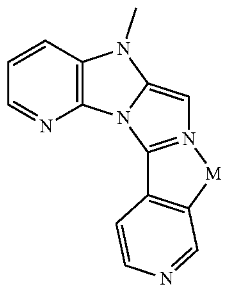
L1703
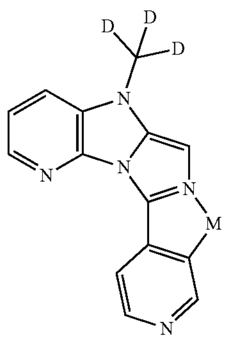
L1704
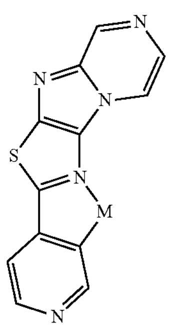
L1705
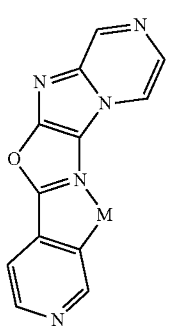
-continued
L1706
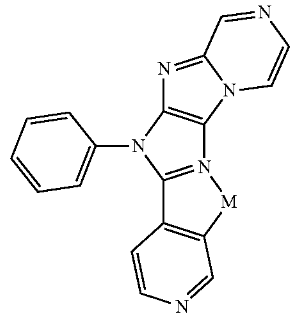
L1707
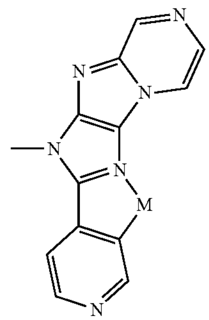
L1708
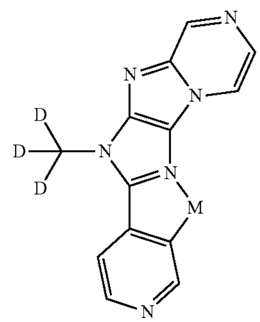
L1709
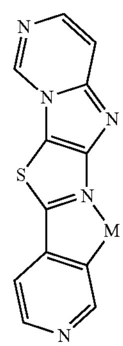
L1710
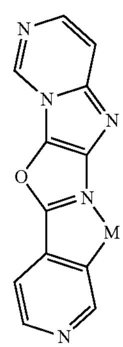

-continued
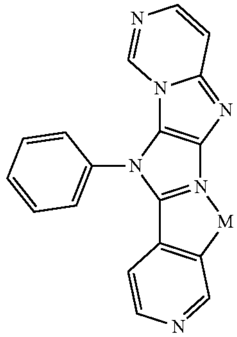
L1711
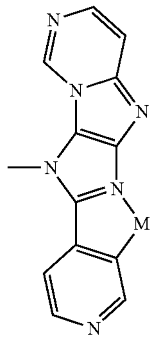
L1712
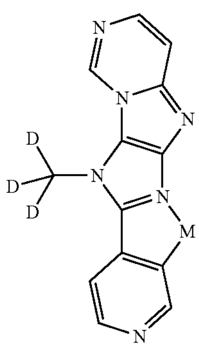
L1713
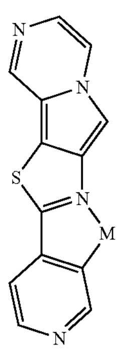
L1714
-continued
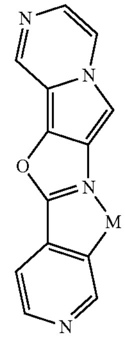
L1715
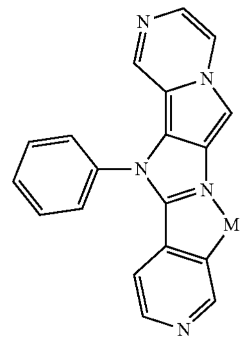
L1716
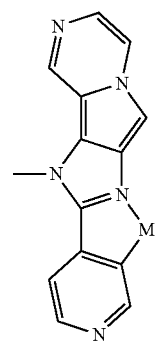
L1717
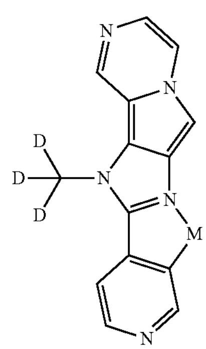
L1718

-continued
L1719
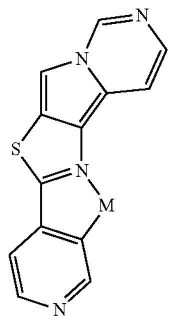
L1720
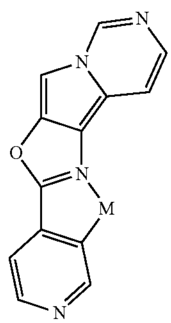
L1721
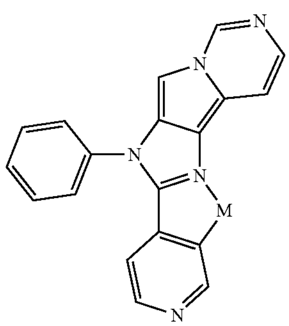
L1722
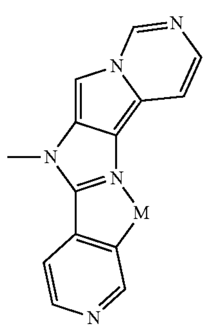
L1723
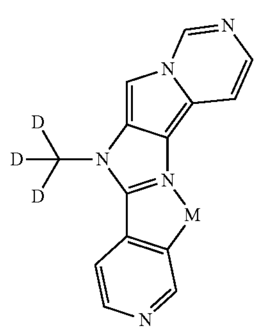
-continued
L1724
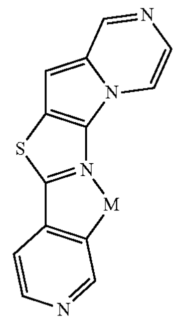
L1725
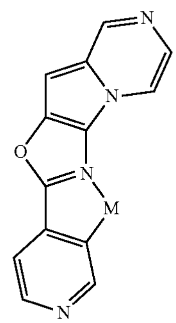
L1726
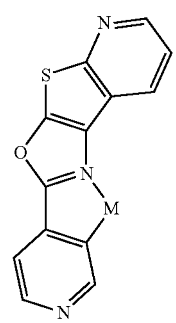
L1727
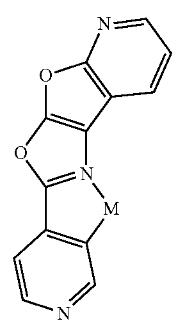
L1728
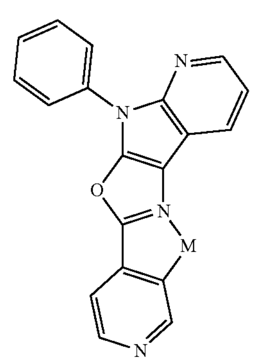

-continued
L1729
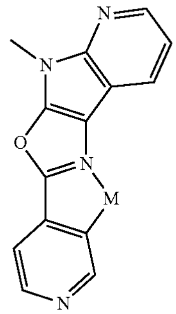
L1730
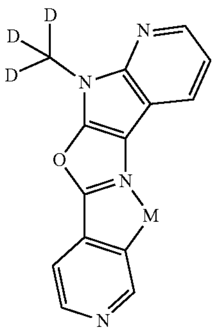
L1731
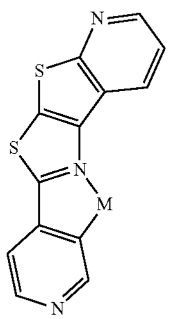
L1732
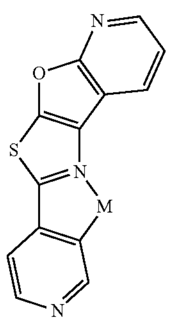
L1733
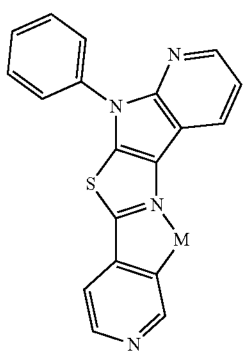
-continued
L1734
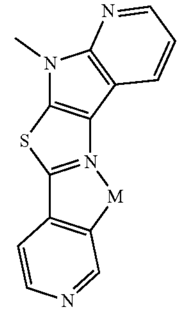
L1735
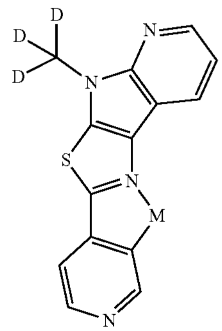
L1736
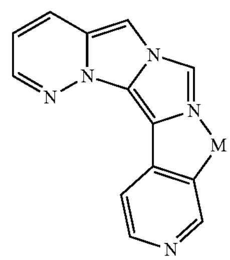
L1737
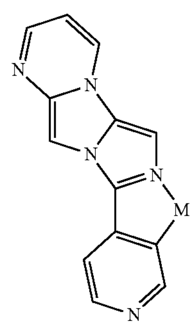
L1738
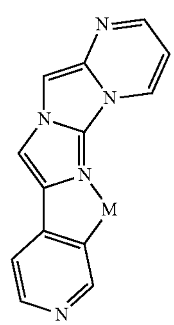

-continued
L1739
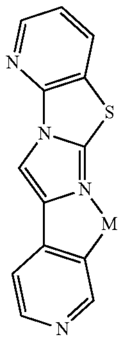
L1740
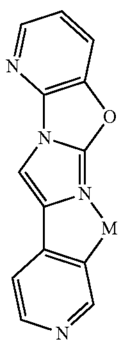
L1741
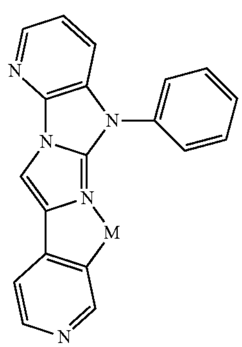
L1742
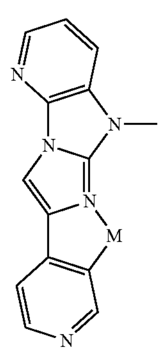
-continued
L1743
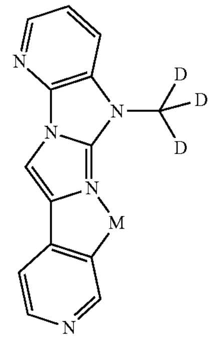
L1744
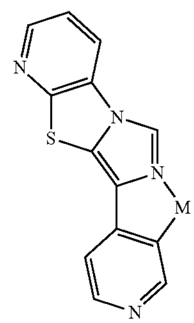
L1745
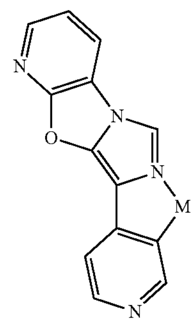
L1746
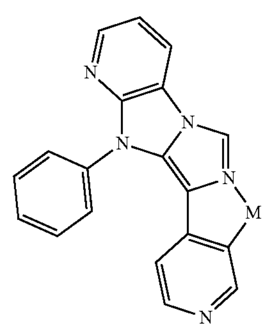
L1747
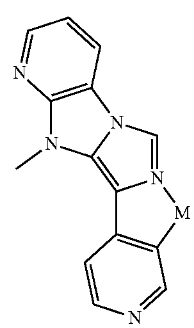

-continued
L1748
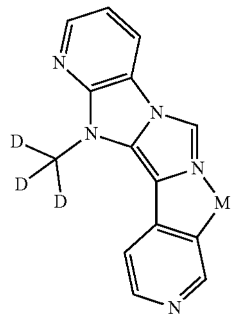
L1749
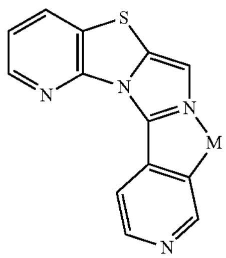
L1750
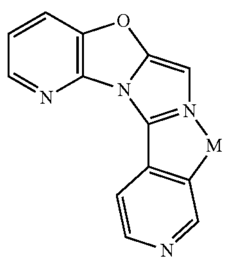
L1751
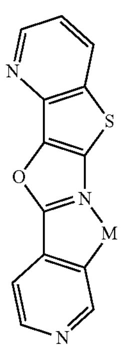
L1752
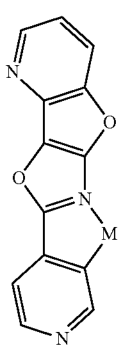
-continued
L1753
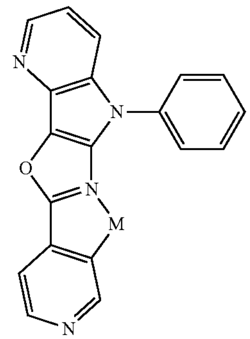
L1754
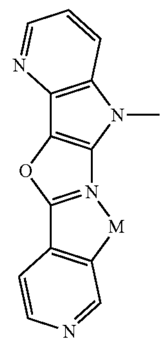
L1755
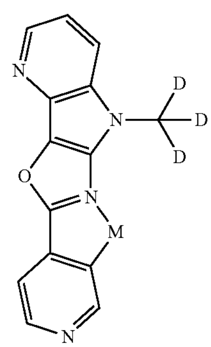
L1756
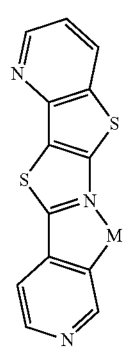

-continued
L1757
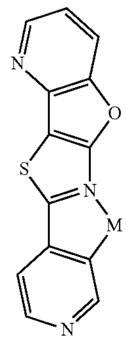
L1758
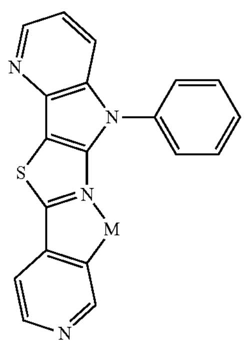
L1759
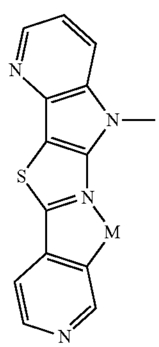
L1760
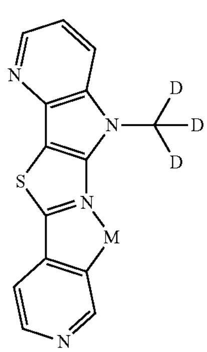
-continued
L1761
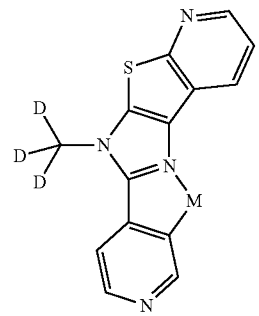
L1762
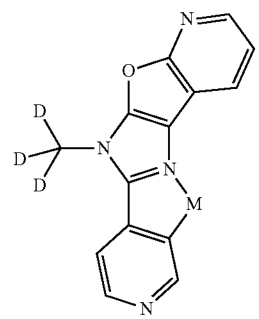
L1763
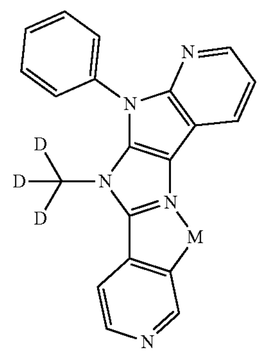
L1764
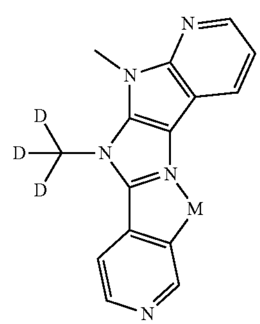
L1765
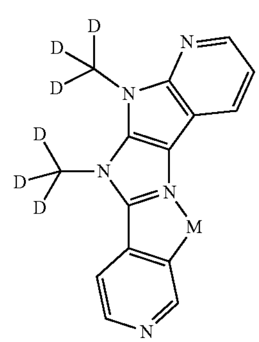

-continued
L1766
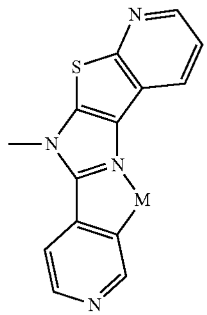
L1767
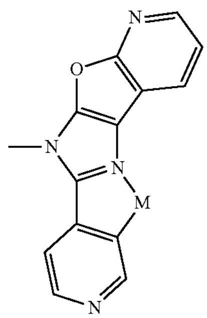
L1768
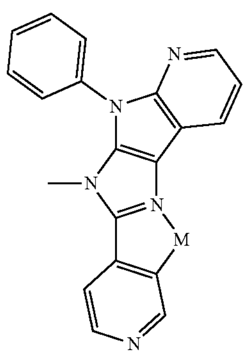
L1769
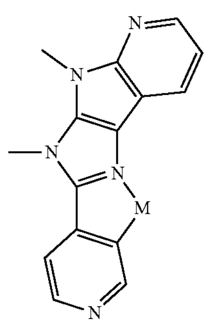
L1770
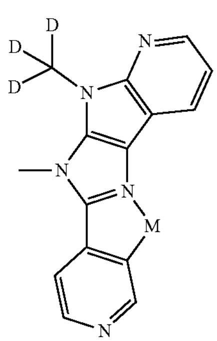
-continued
L1771
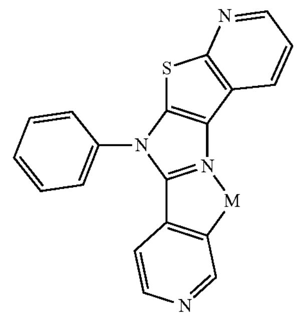
L1772
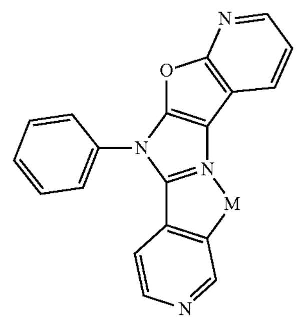
L1773
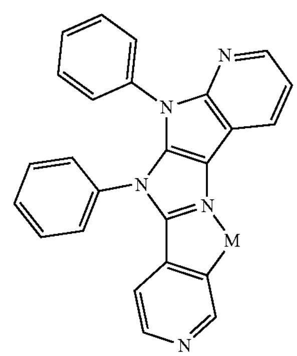
L1774
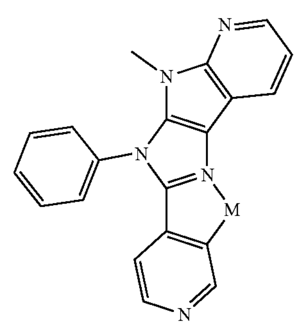
L1775
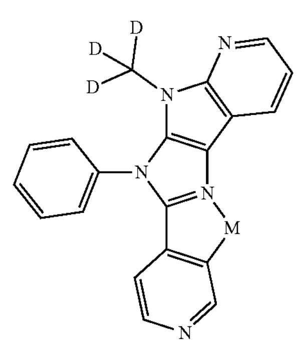

-continued
L1776
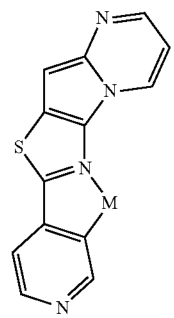
L1777
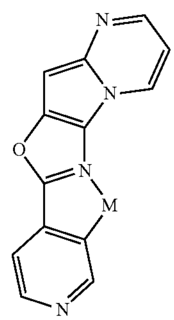
L1778
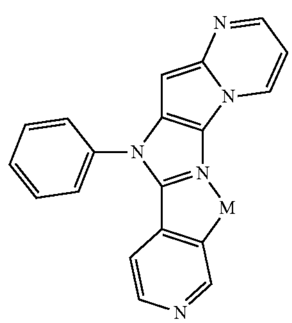
L1779
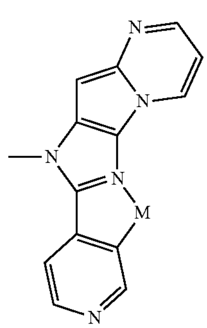
L1780
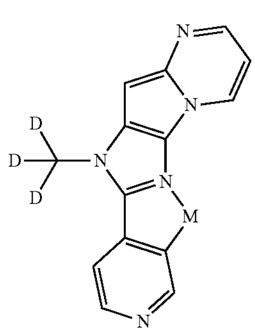
-continued
L1781
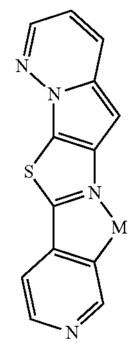
L1782
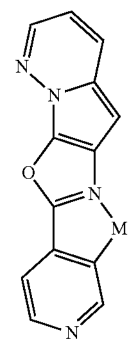
L1783
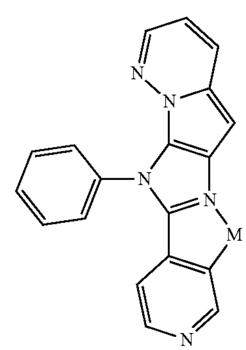
L1784
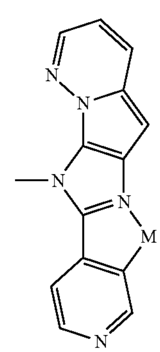

L1785
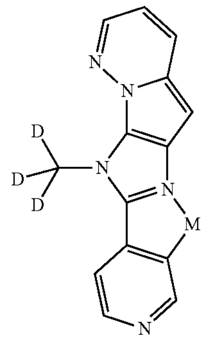
L1786
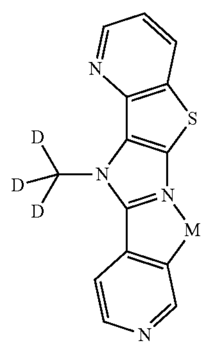
L1787
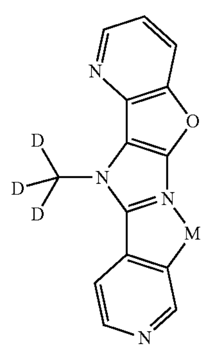
L1788
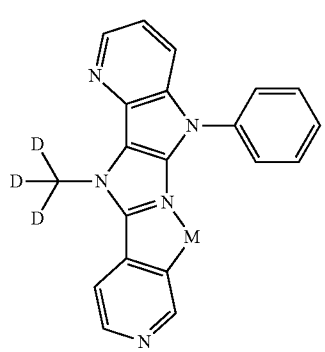
L1789
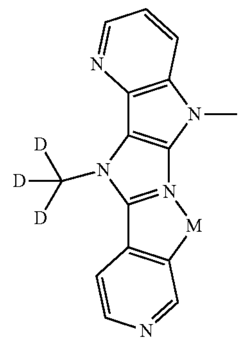
L1790
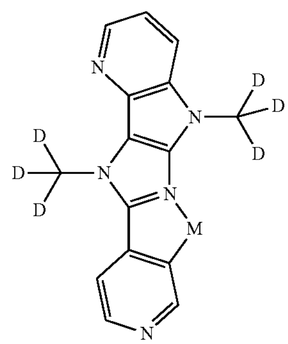
L1791
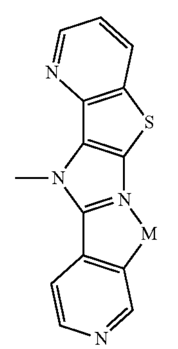
L1792
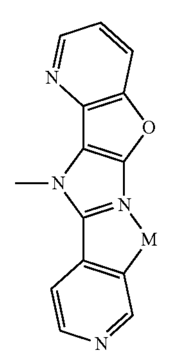

-continued
L1793
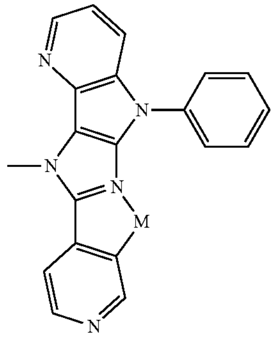
L1794
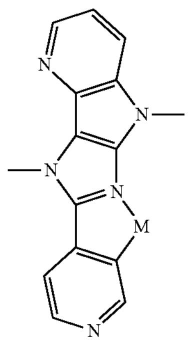
L1795
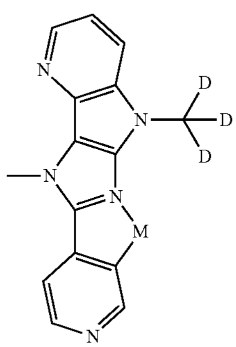
L1796
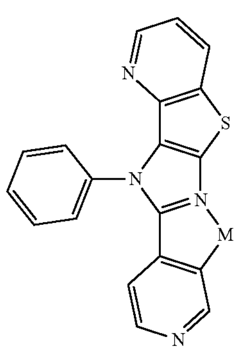
-continued
L1797
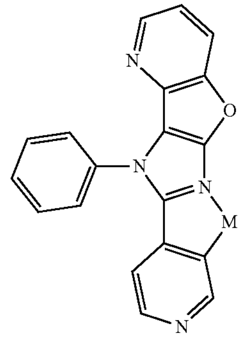
L1798
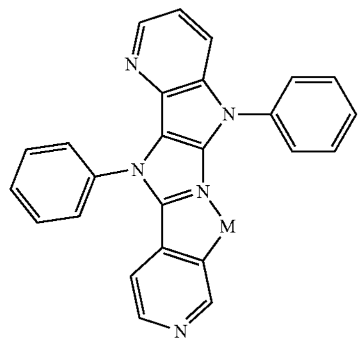
L1799
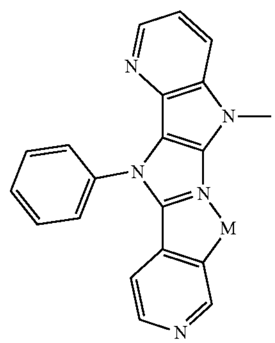
L1800
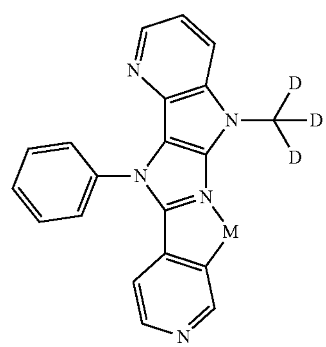
L1801
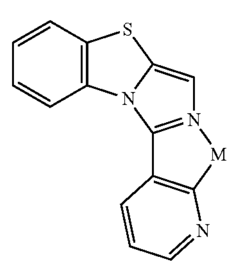

-continued
L1802
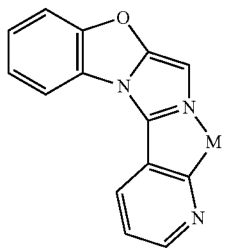
L1803
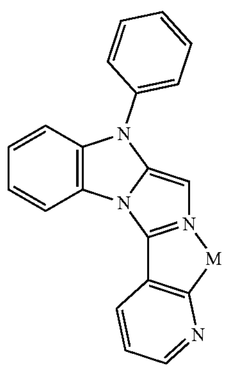
L1804
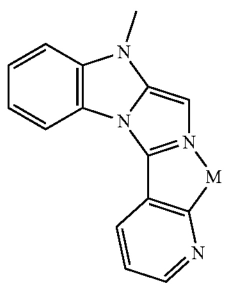
L1805
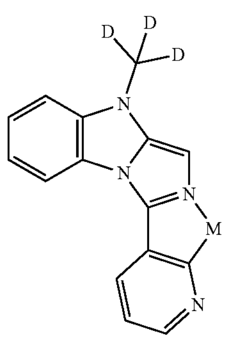
L1806
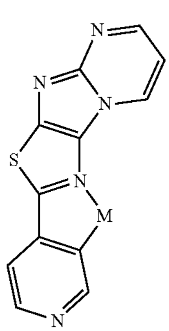
-continued
L1807
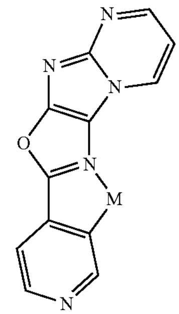
L1808
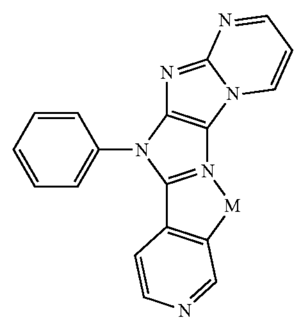
L1809
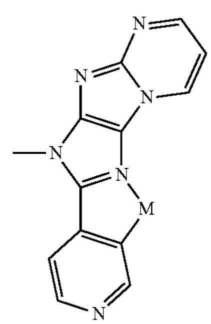
L1810
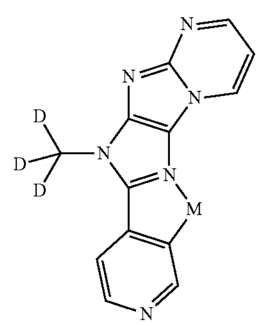
L1811
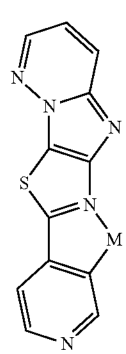

-continued
L1812
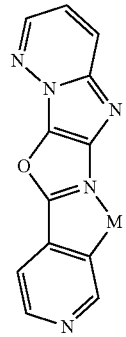
L1813
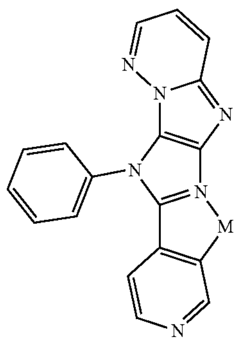
L1814
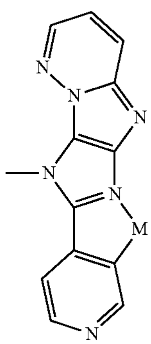
L1815
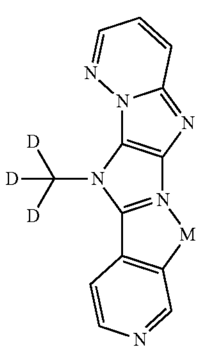
L1816
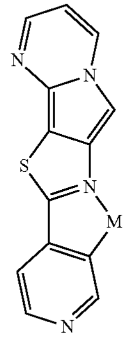
L1817
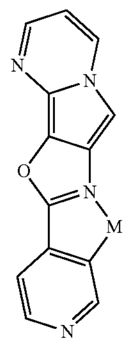
L1818
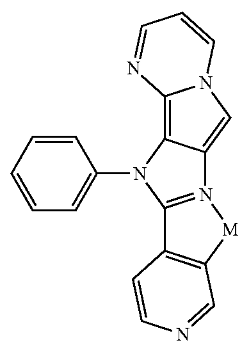
L1819
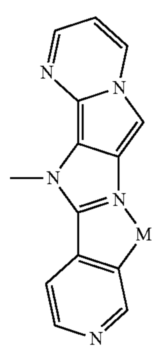

-continued
L1820
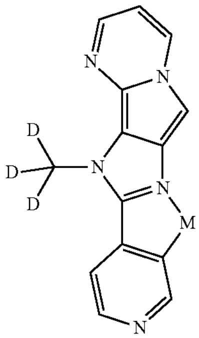
L1821
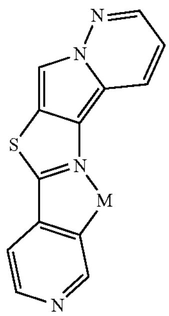
L1822
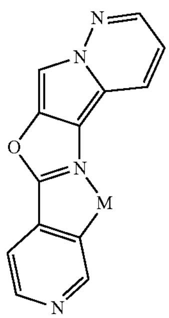
L1823
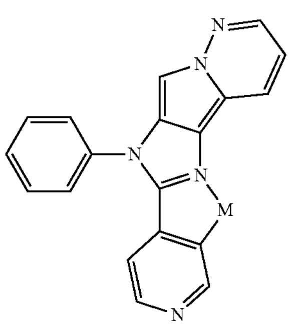
L1824
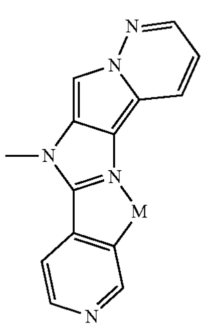
-continued
L1825
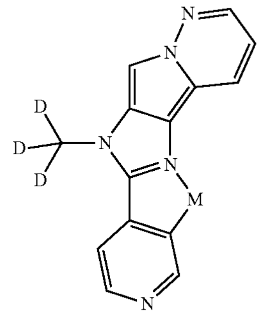
L1826
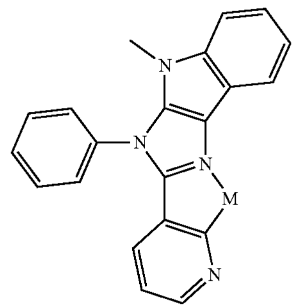
L1827
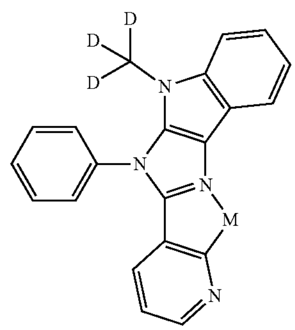
L1828
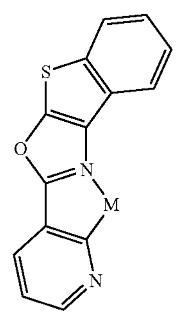
L1829
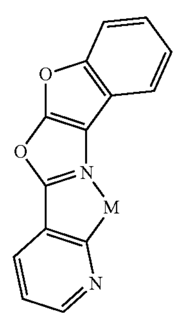

-continued
L1830
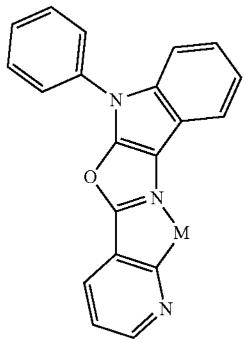
L1831
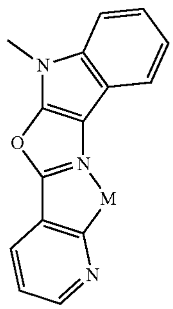
L1832
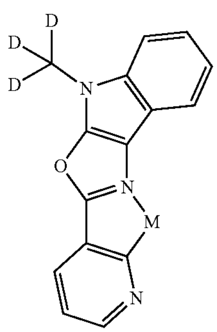
L1833
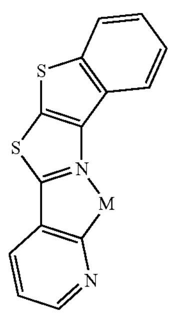
L1834
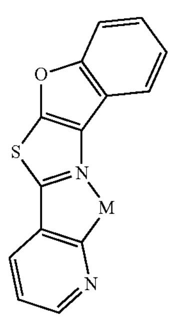
-continued
L1835
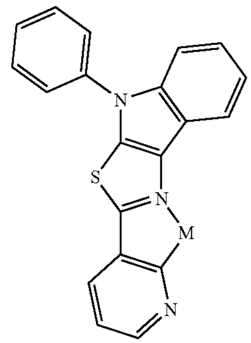
L1836
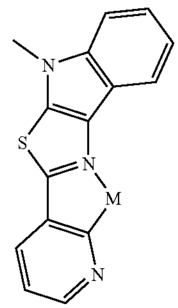
L1837
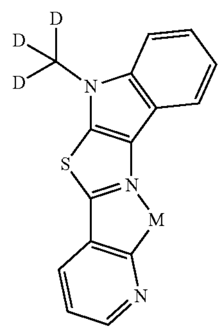
L1838
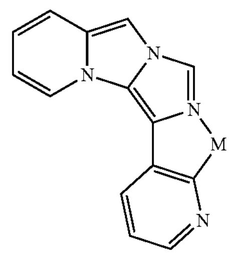
L1839
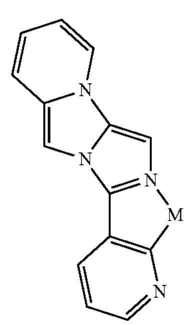

-continued
L1840
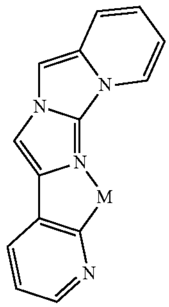
L1841
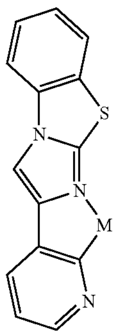
L1842
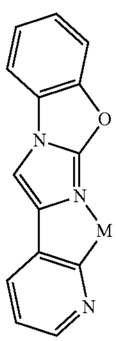
L1843
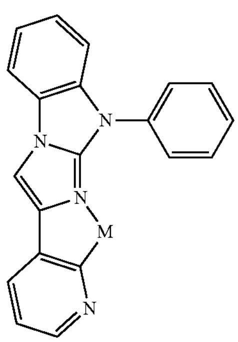
-continued
L1844
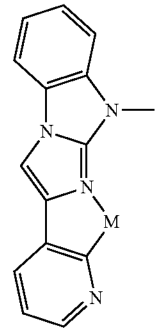
L1845
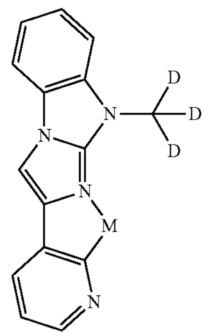
L1846
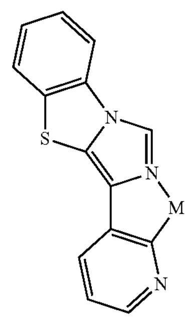
L1847
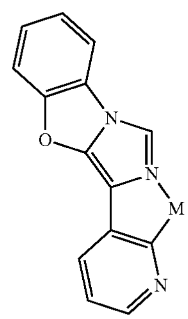
L1848
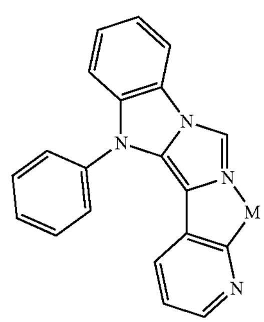

-continued
L1849
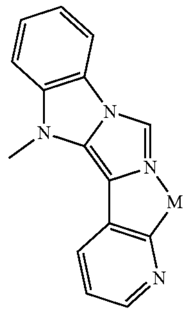
L1850
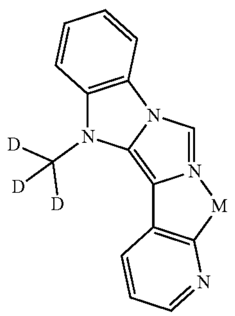
L1851
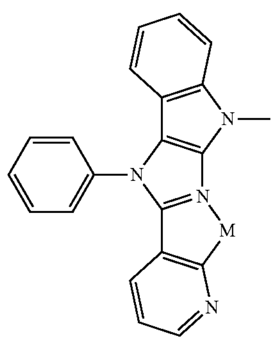
L1852
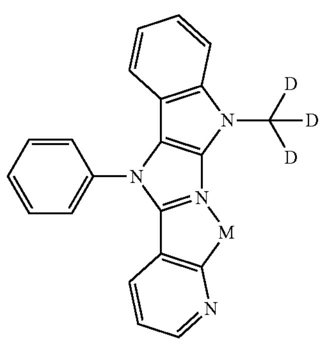
L1853
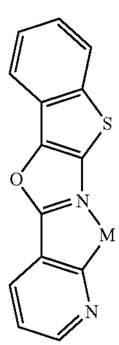
-continued
L1854
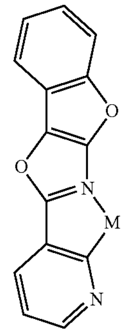
L1855
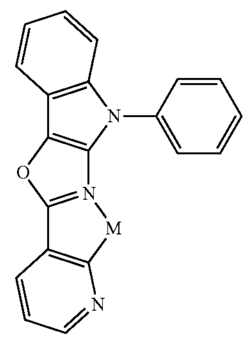
L1856
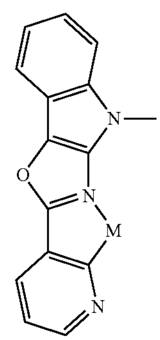
L1857
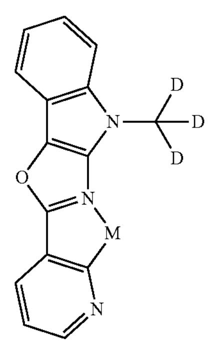

-continued
L1858
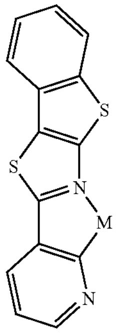
L1859
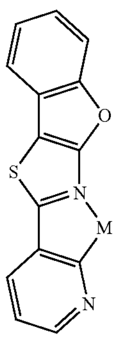
L1860
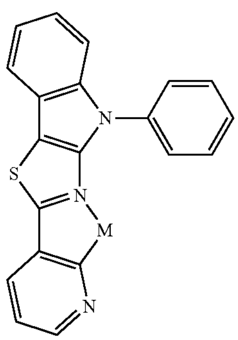
L1861
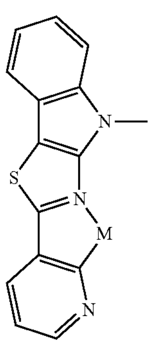
-continued
L1862
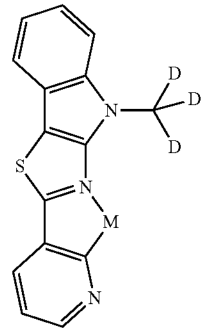
L1863
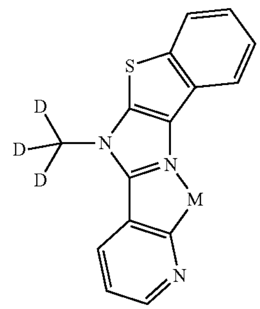
L1864
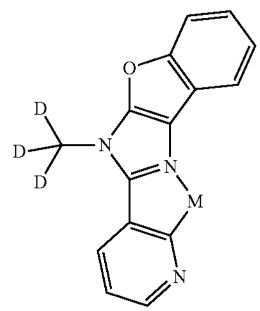
L1865
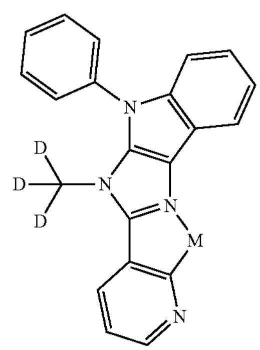
L1866
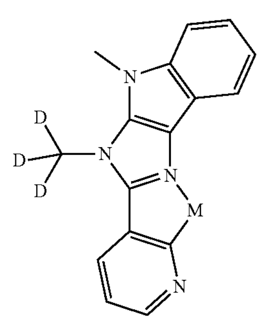

-continued
L1867
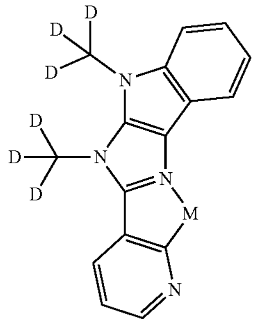
L1868
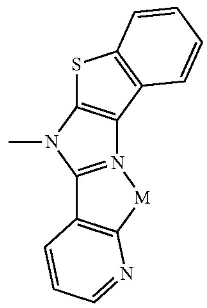
L1869
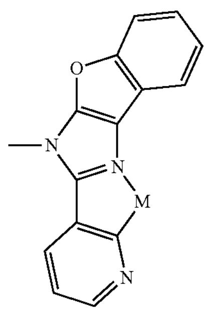
L1870
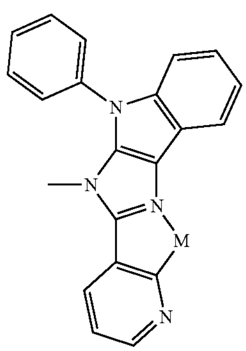
L1871
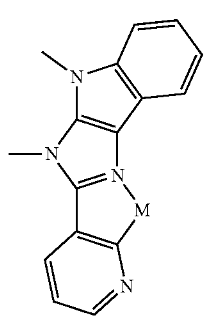
-continued
L1872
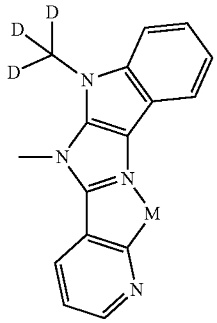
L1873
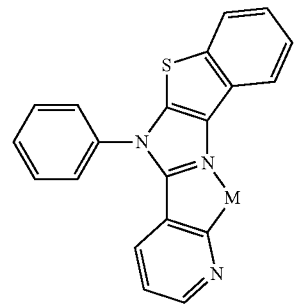
L1874
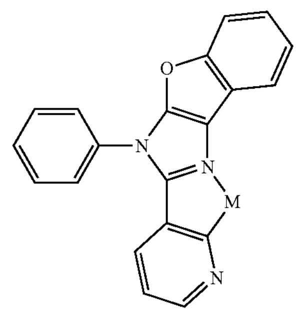
L1875
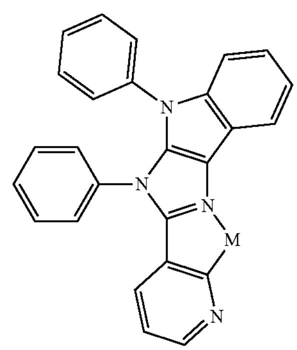
L1876
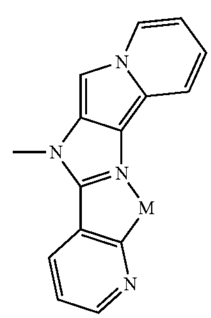

-continued
L1877
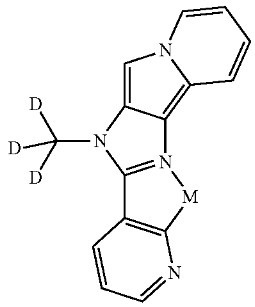
L1878
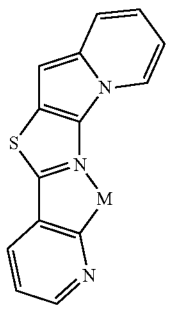
L1879
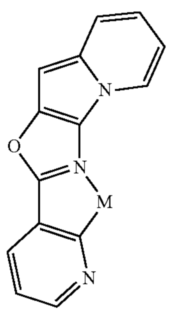
L1880
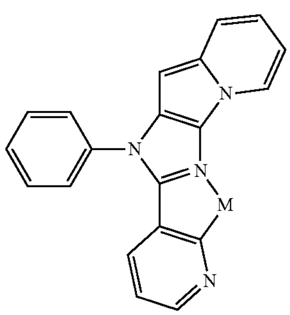
L1881
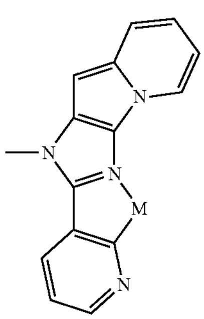
-continued
L1882
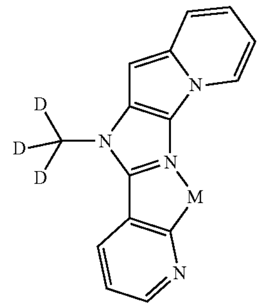
L1883
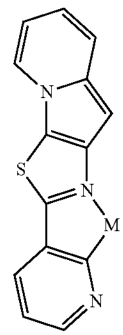
L1884
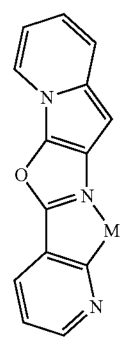
L1885
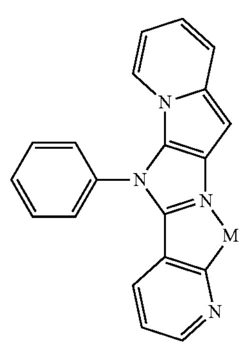

-continued
L1886
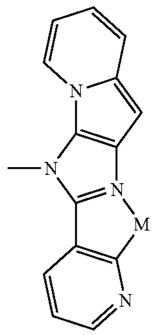
L1887
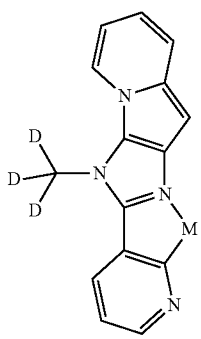
L1888
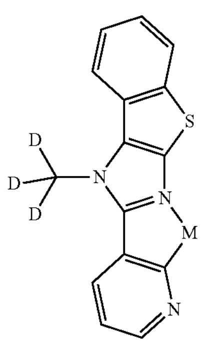
L1889
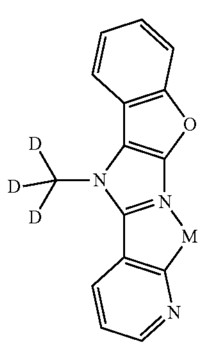
-continued
L1890
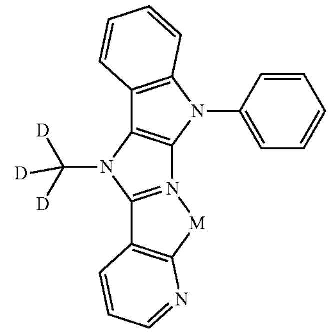
L1891
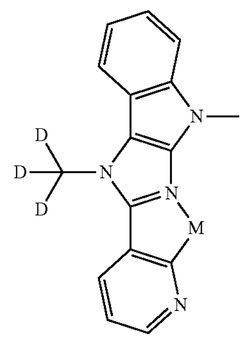
L1892
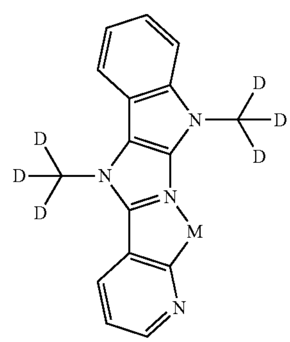
L1893
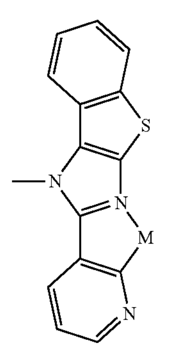

L1894
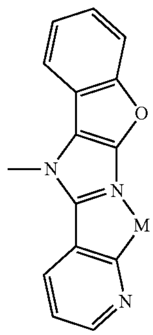
L1895
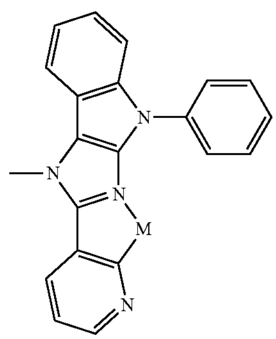
L1896
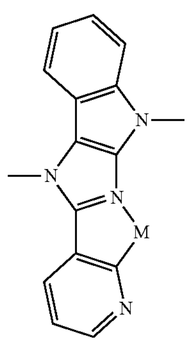
L1897
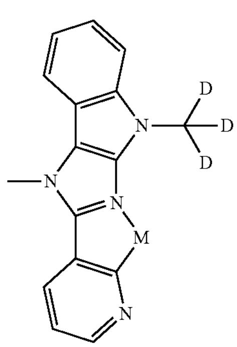
L1898
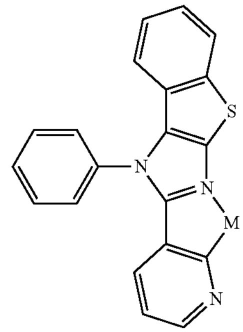
L1899
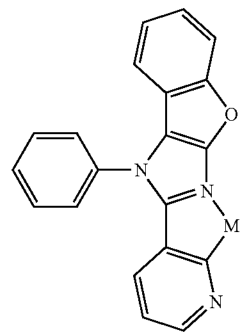
L1900
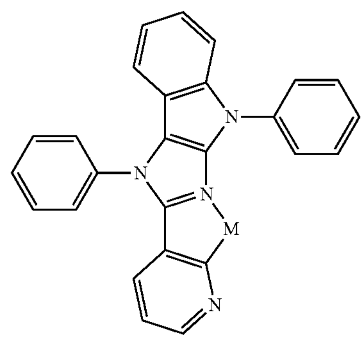
L1901
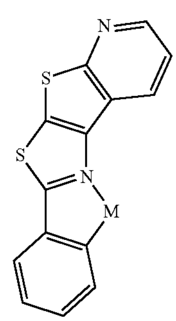
L1902
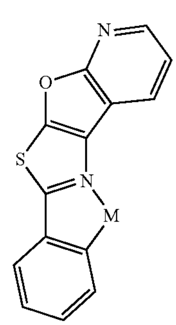

-continued
L1903
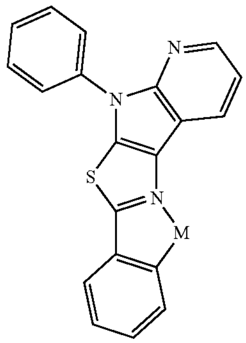
L1904
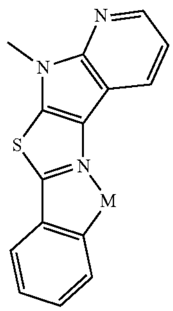
L1905
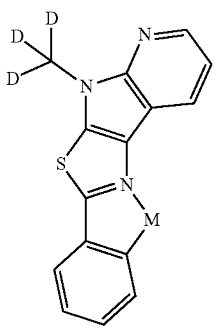
L1906
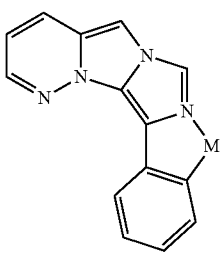
L1907
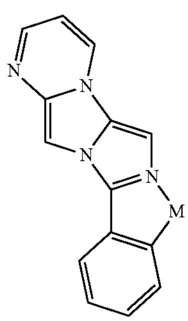
-continued
L1908
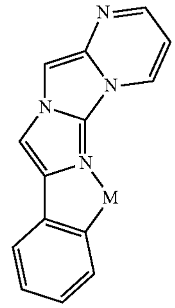
L1909
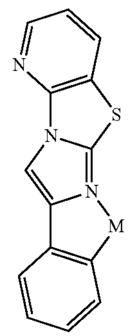
L1910
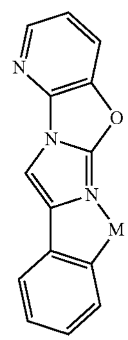
L1911
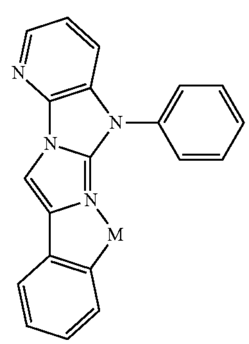

L1912
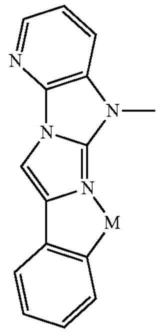
L1913
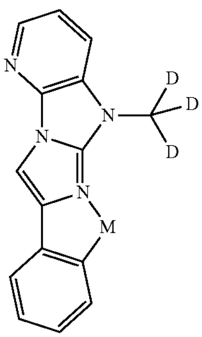
L1914
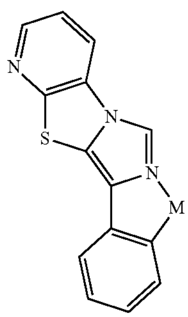
L1915
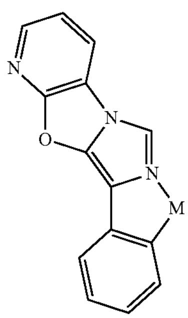
L1916
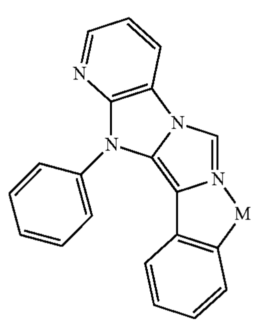
L1917
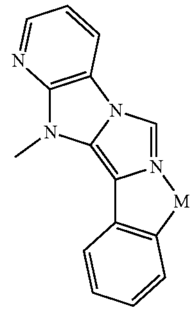
L1918
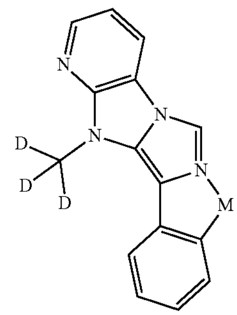
L1919
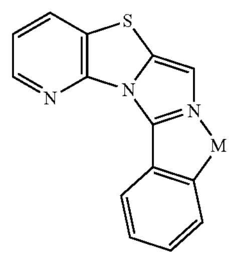
L1920
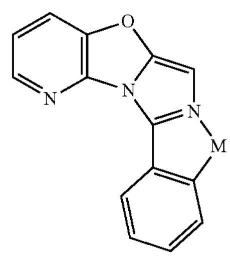
L1921
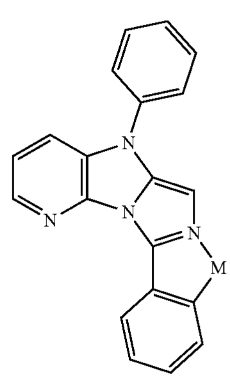

-continued
L1922
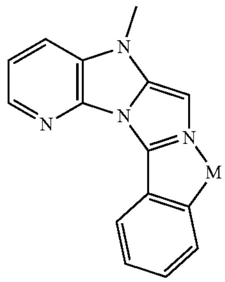
L1923
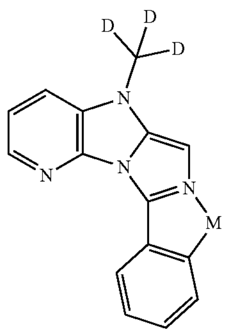
L1924
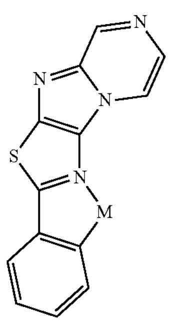
L1925
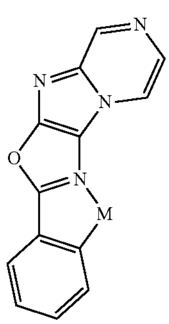
L1926
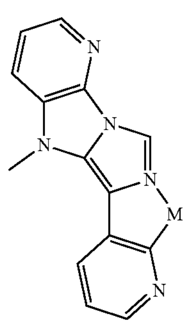
-continued
L1927
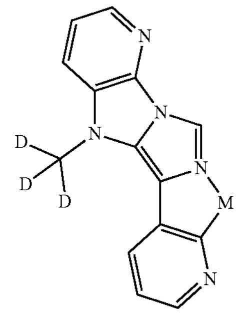
L1928
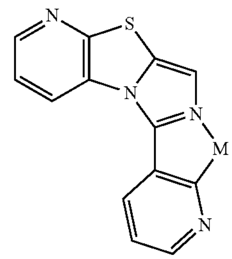
L1929
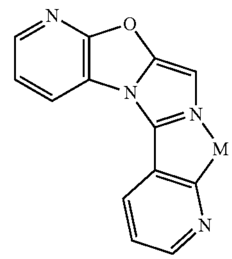
L1930
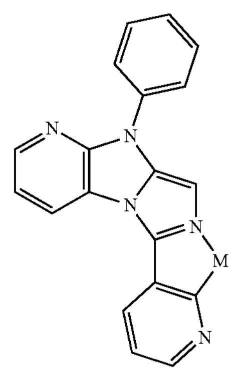
L1931
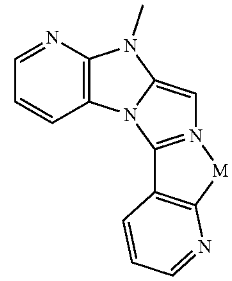

-continued
L1932
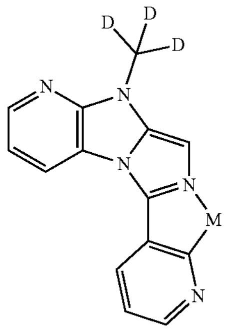
L1933
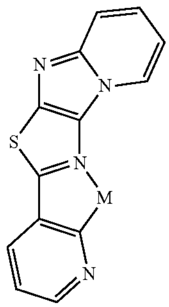
L1934
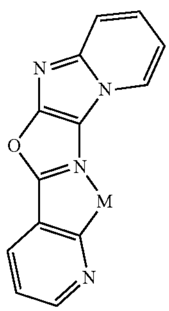
L1935
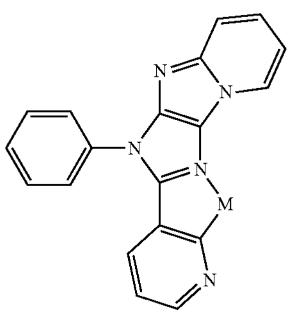
L1936
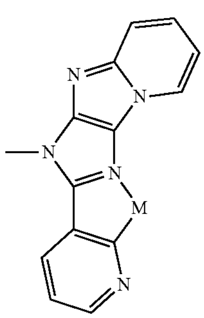
-continued
L1937
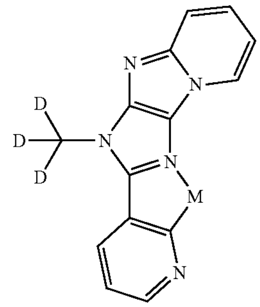
L1938
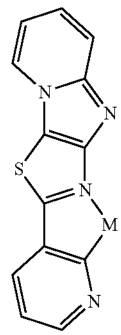
L1939
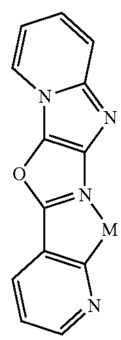
L1940
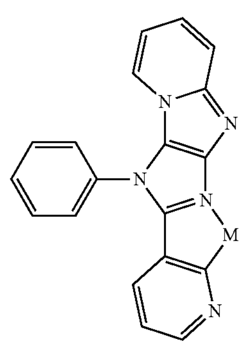

-continued
L1941
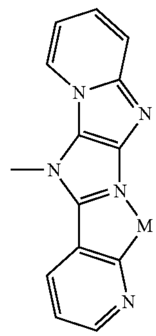
L1942
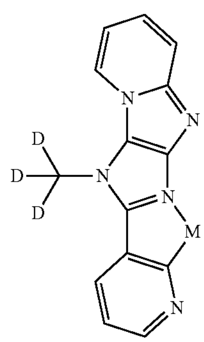
L1943
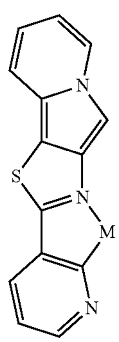
L1944
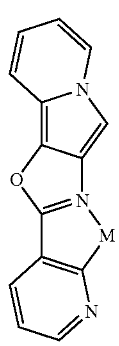
-continued
L1945
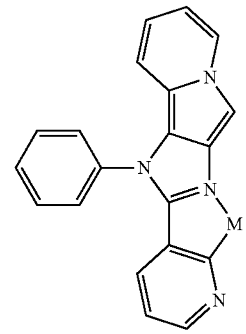
L1946
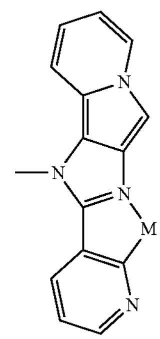
L1947
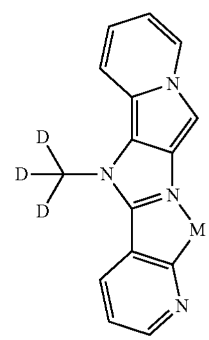
L1948
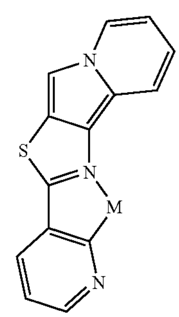
L1949
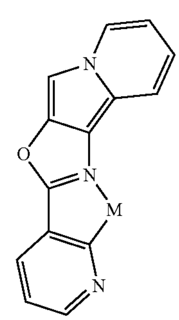

L1950
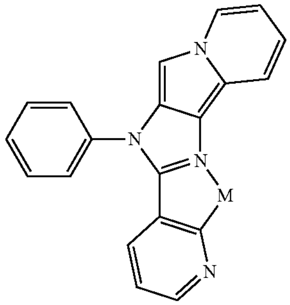
L1951
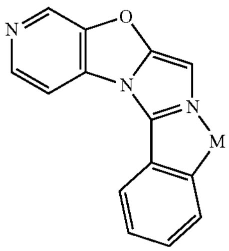
L1952
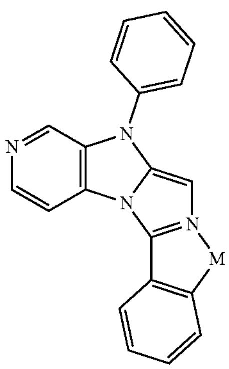
L1953
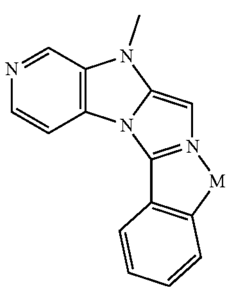
L1954
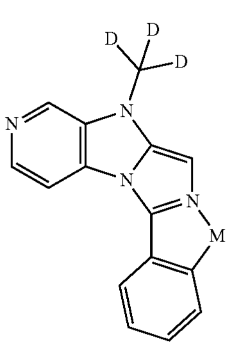
L1955
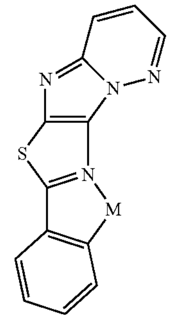
L1956
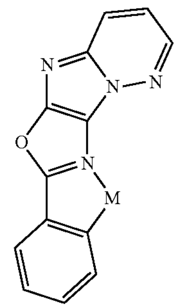
L1957
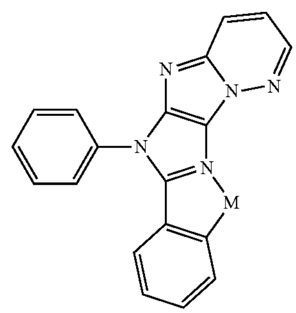
L1958
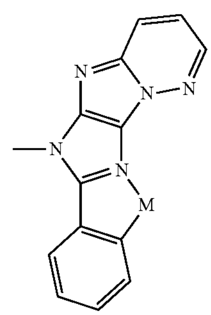
L1959
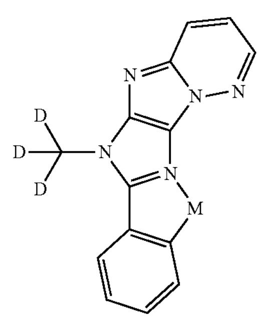

-continued
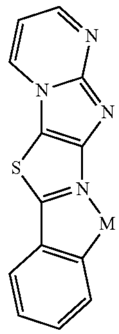
L1960
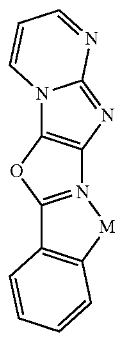
L1961
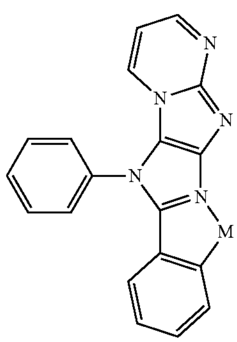
L1962
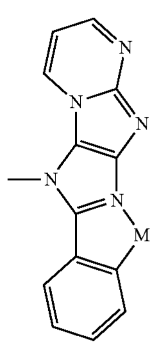
L1963
-continued
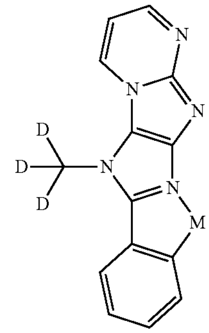
L1964
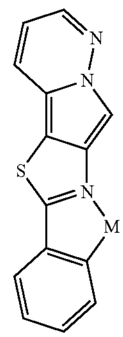
L1965
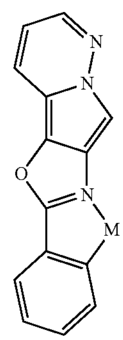
L1966
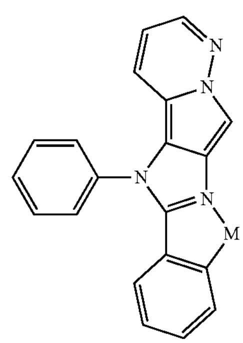
L1967

-continued
L1968
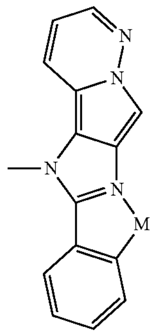
L1969
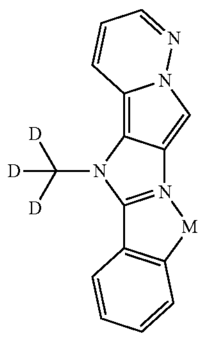
L1970
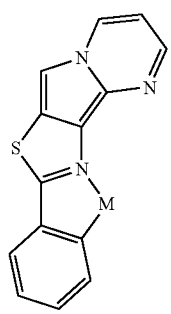
L1971
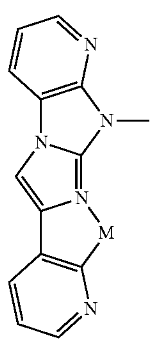
-continued
L1972
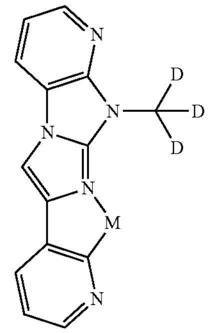
L1973
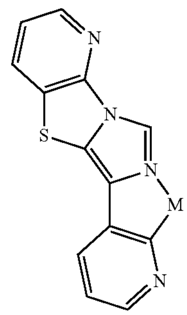
L1974
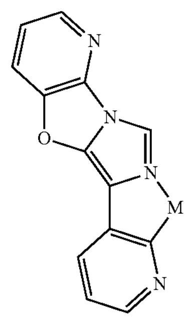
L1975
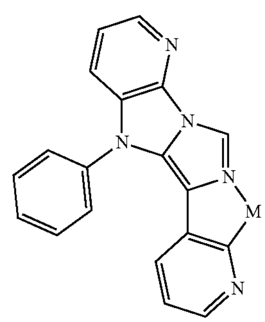
L1976
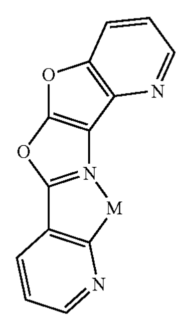

-continued
L1977
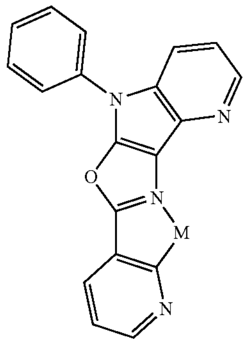
L1978
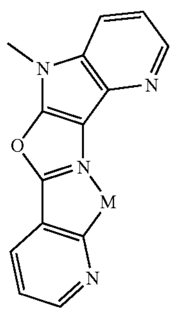
L1979
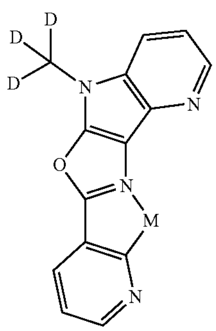
L1980
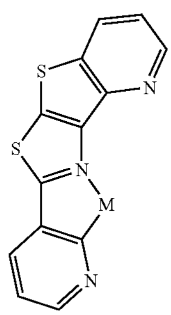
L1981
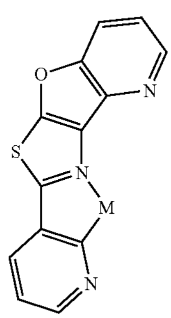
-continued
L1982
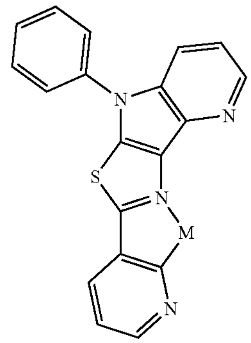
L1983
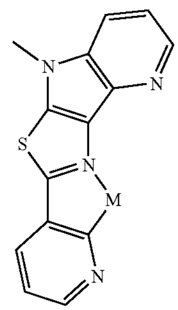
L1984
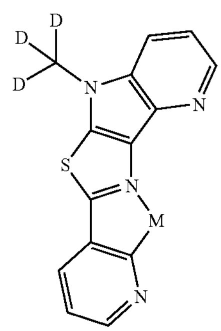
L1985
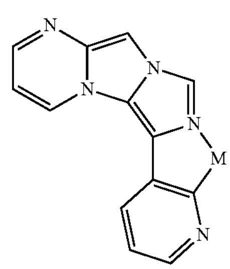
L1986
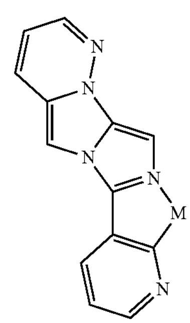

-continued
L1987
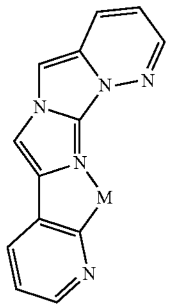
L1988
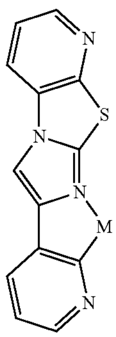
L1989
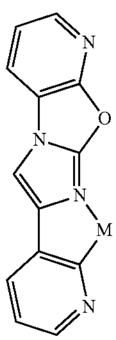
L1990
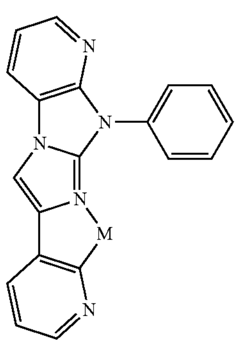
-continued
L1991
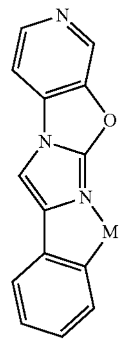
L1992
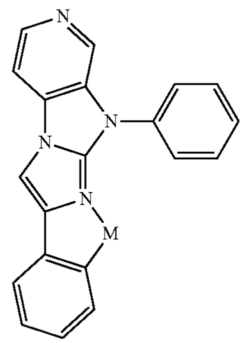
L1993
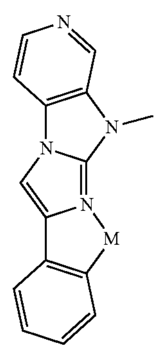
L1994
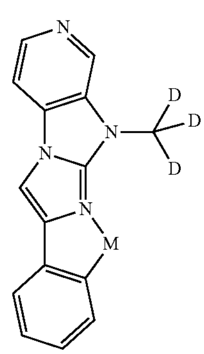

-continued
L1995
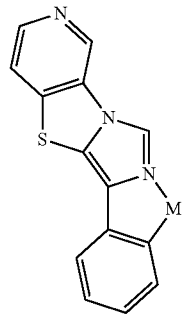
L1996
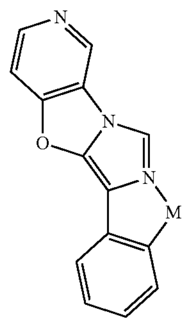
L1997
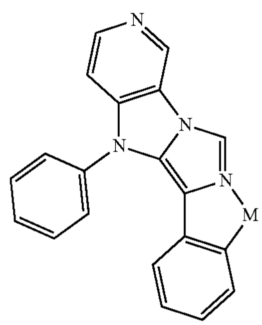
L1998
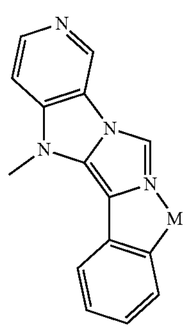
L1999
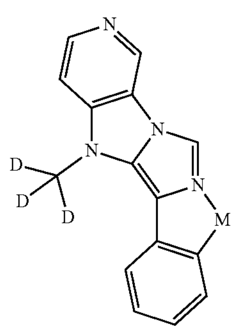
-continued
L2000
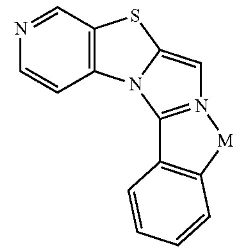
L2001
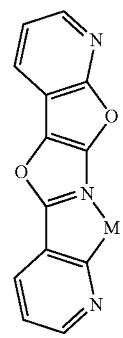
L2002
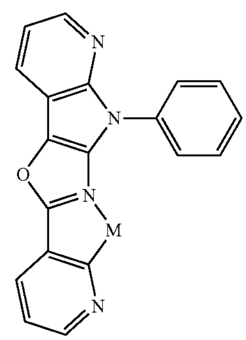
L2003
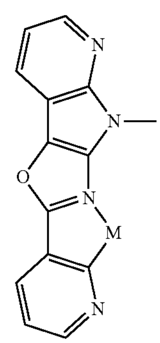
L2004
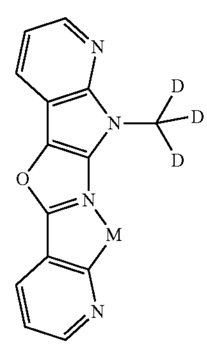

-continued
L2005
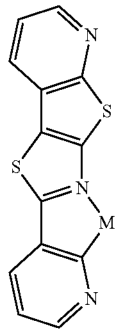
L2006
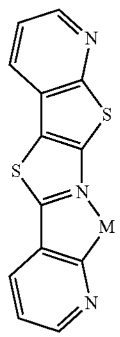
L2007
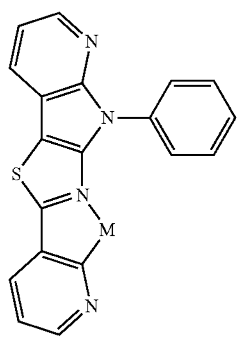
L2008
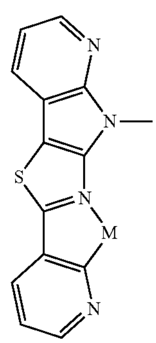
-continued
L2009
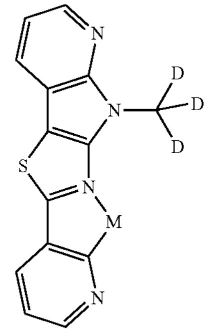
L2010
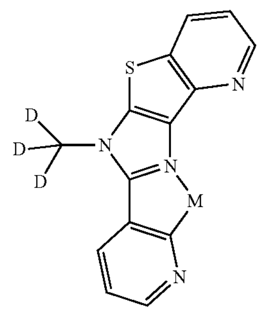
L2011
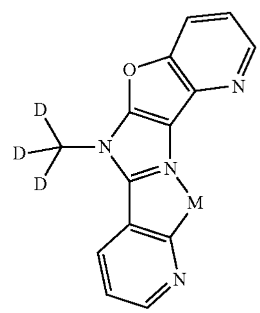
L2012
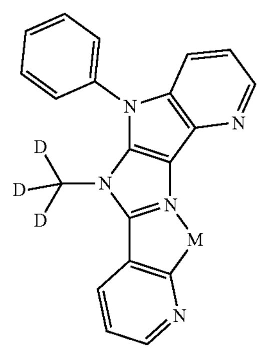
L2013
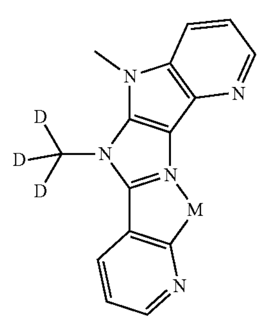

-continued
L2014
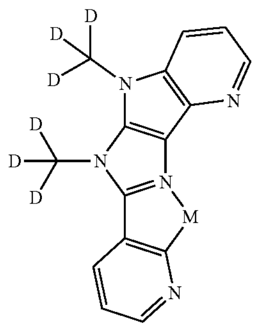
L2015
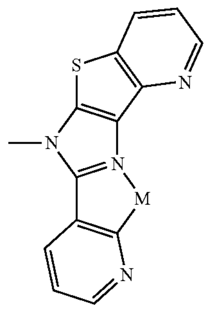
L2016
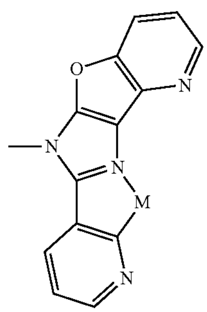
L2017
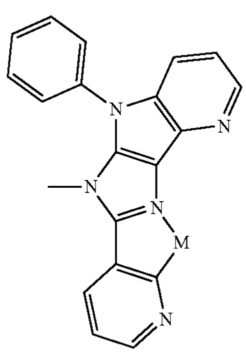
L2018
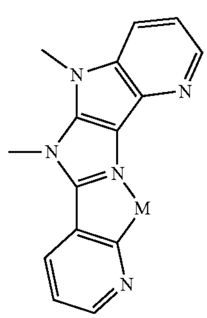
-continued
L2019
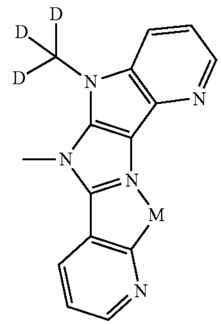
L2020
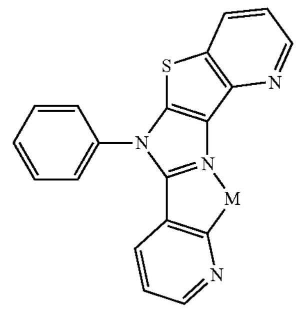
L2021
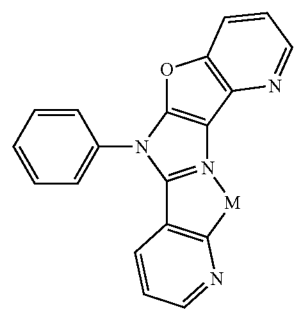
L2022
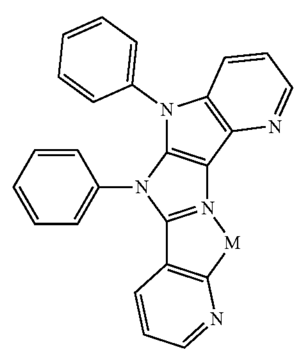
L2023
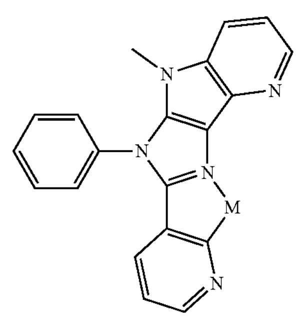

-continued
L2024
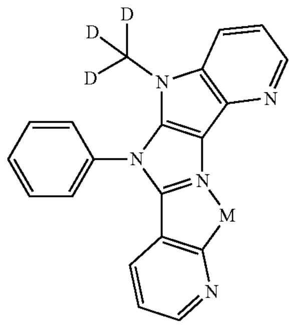
L2025
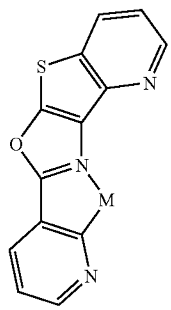
L2026
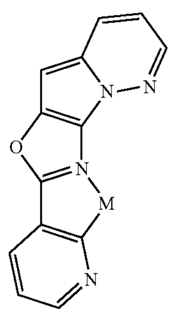
L2027
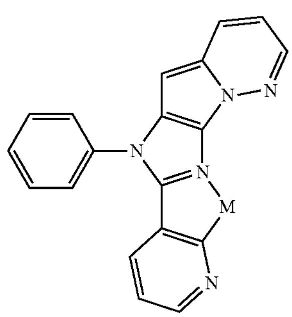
L2028
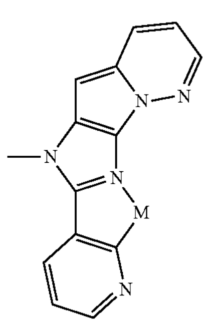
-continued
L2029
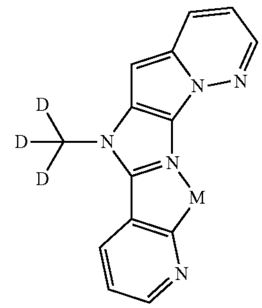
L2030
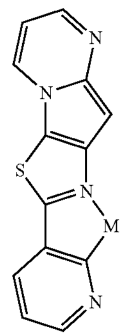
L2031
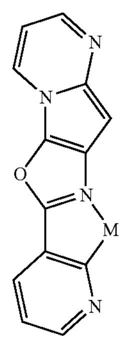
L2032
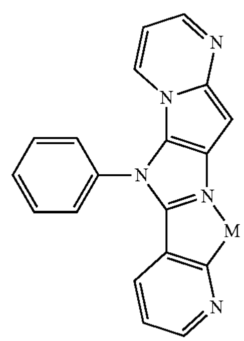

-continued
L2033
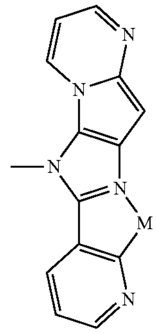
L2034
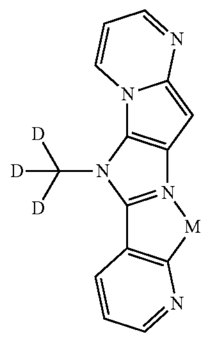
L2035
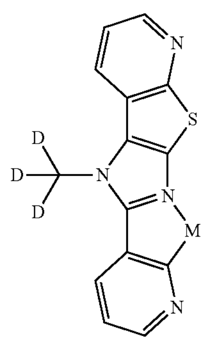
L2036
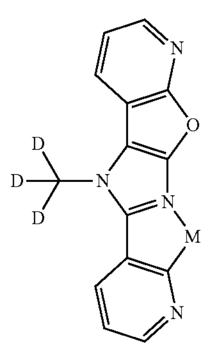
-continued
L2037
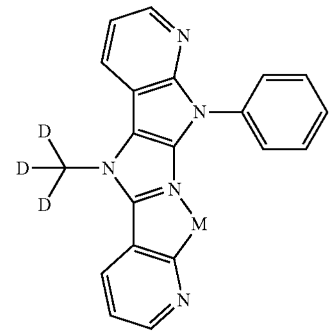
L2038
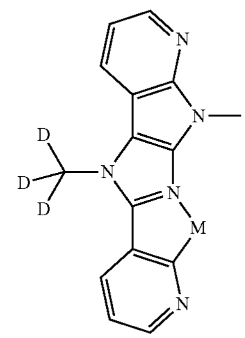
L2039
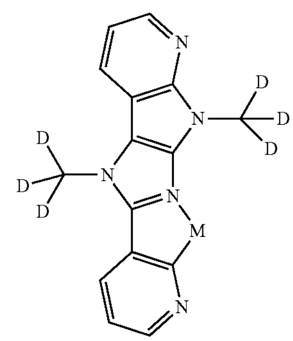
L2040
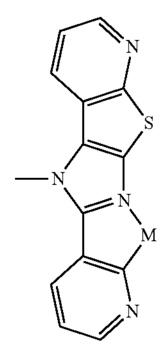

-continued
L2041
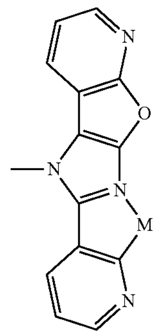
L2042
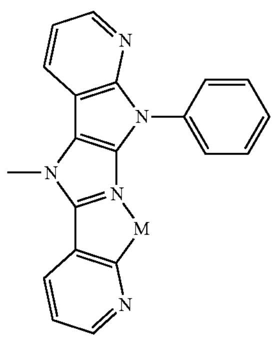
L2043
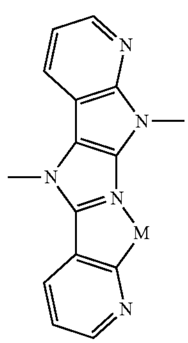
L2044
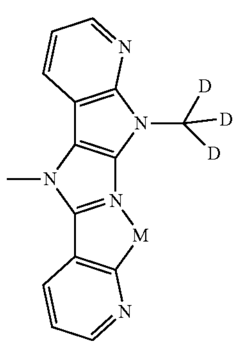
-continued
L2045
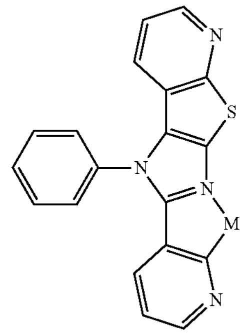
L2046
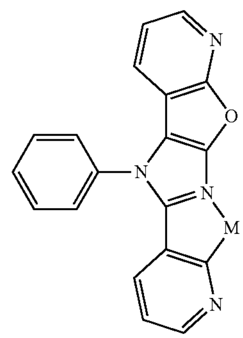
L2047
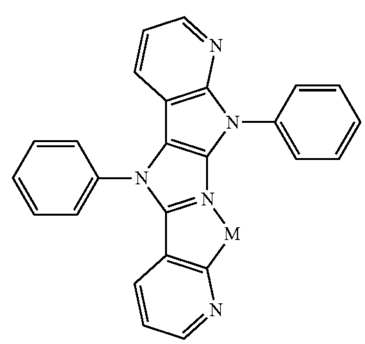
L2048
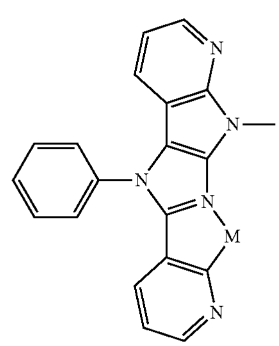

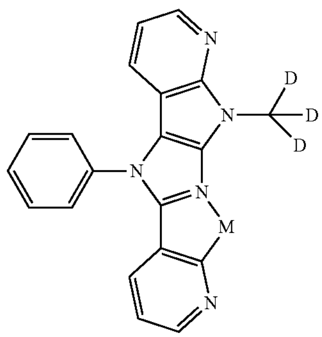
L2049
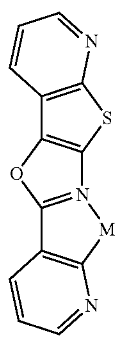
L2050
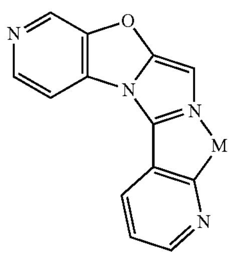
L2051
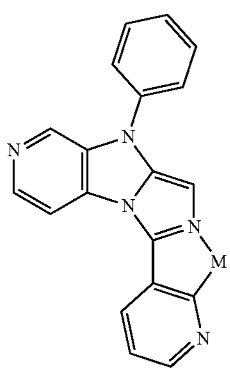
L2052
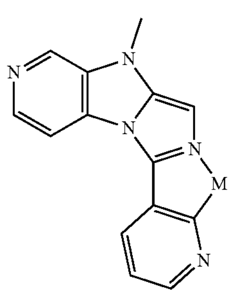
L2053
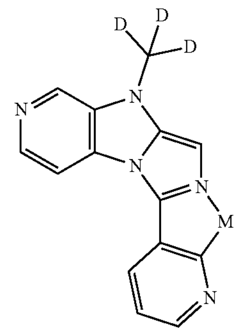
L2054
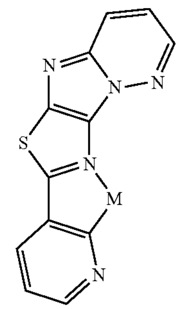
L2055
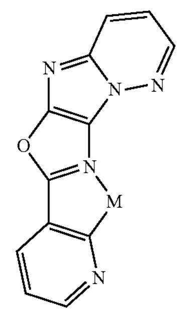
L2056
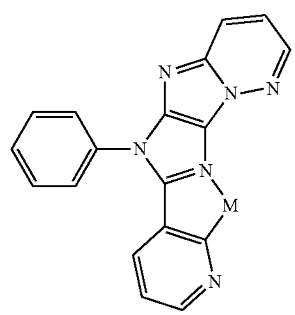
L2057
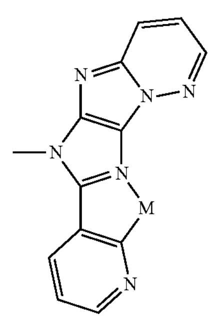
L2058

-continued
L2059
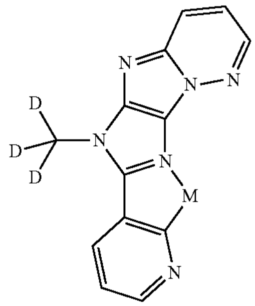
L2060
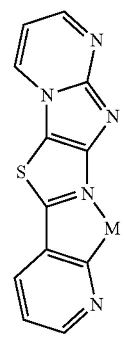
L2061
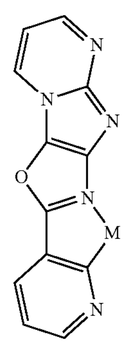
L2062
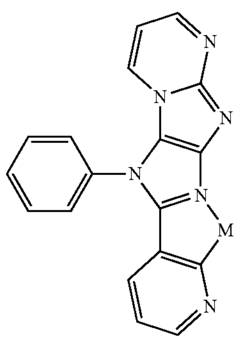
-continued
L2063
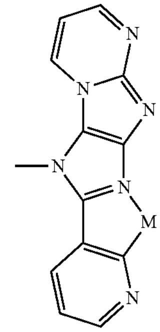
L2064
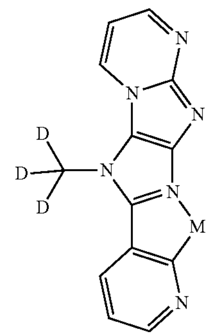
L2065
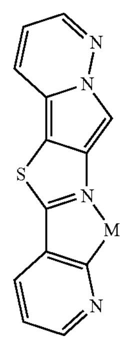
L2066
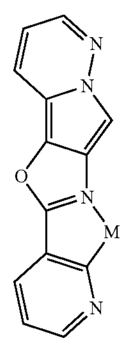

-continued
L2067
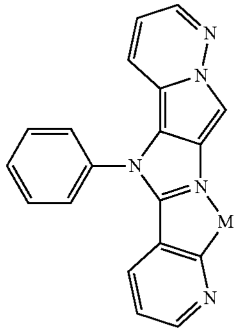
L2068
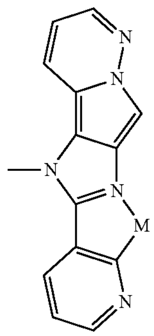
L2069
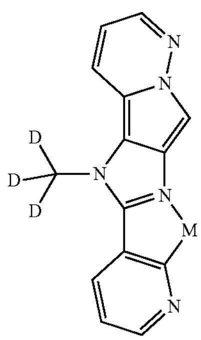
L2070
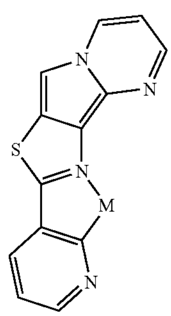
L2071
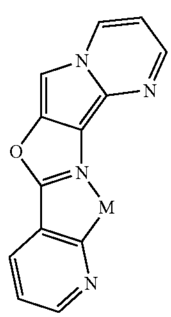
-continued
L2072
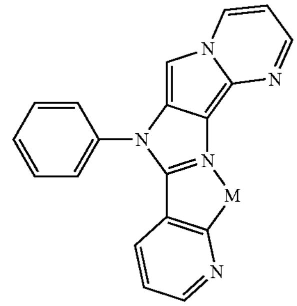
L2073
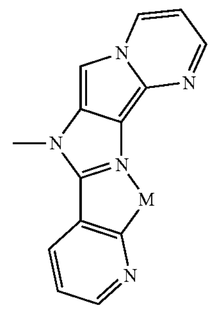
L2074
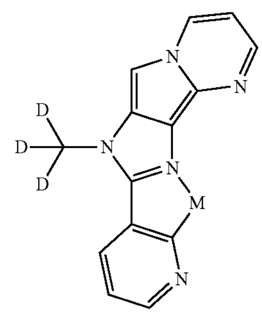
L2075
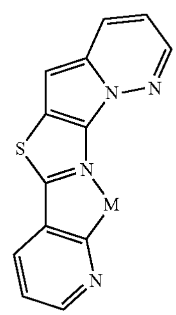
L2076
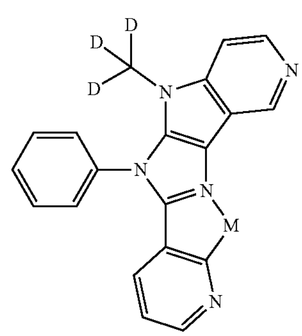

-continued
L2077
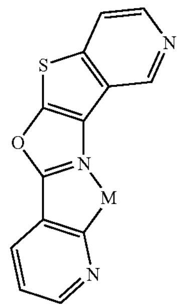
L2078
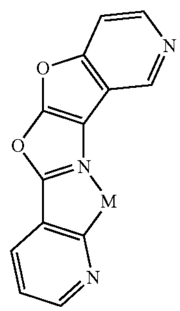
L2079
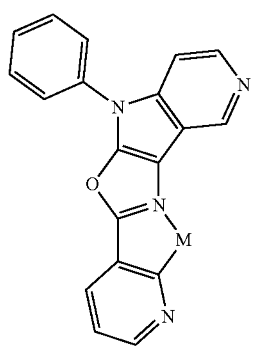
L2080
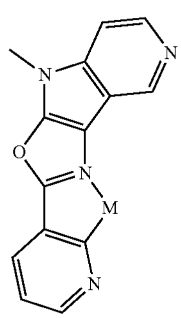
L2081
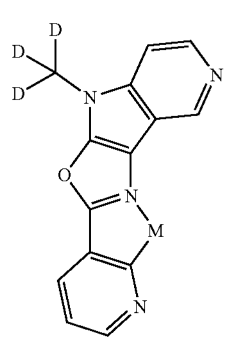
-continued
L2082
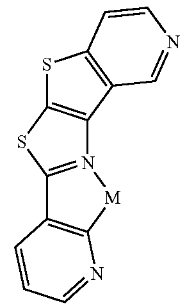
L2083
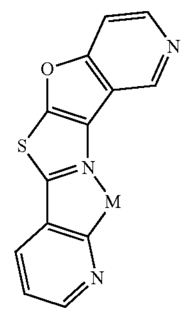
L2084
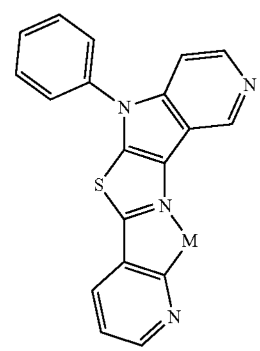
L2085
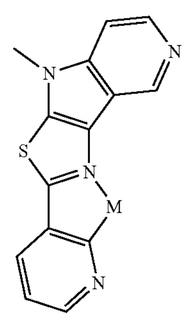
L2086
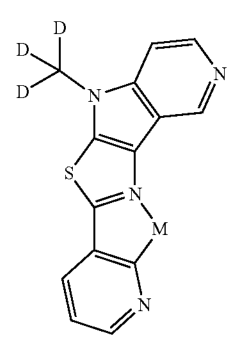

L2087
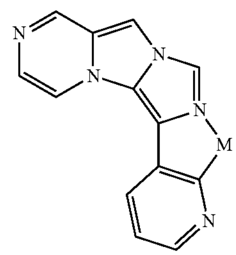
L2088
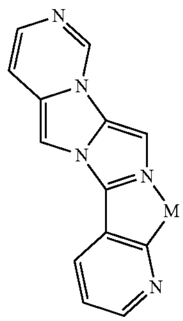
L2089
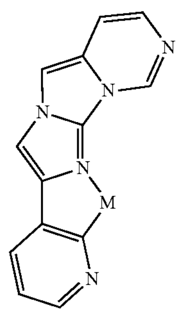
L2090
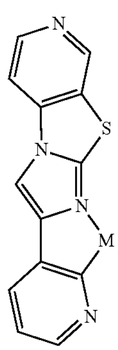
L2091
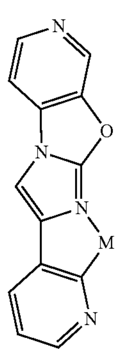
L2092
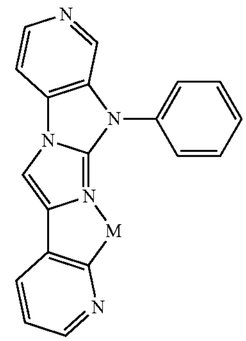
L2093
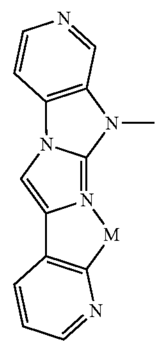
L2094
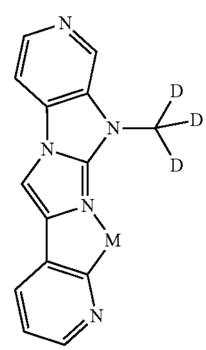
L2095
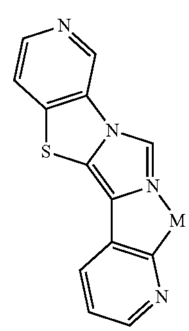

-continued
L2096
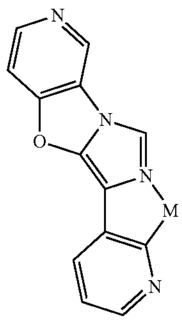
L2097
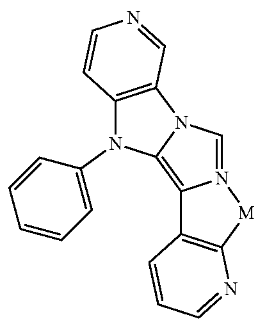
L2098
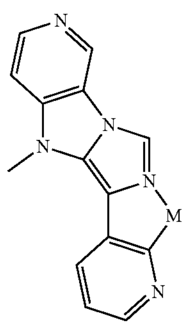
L2099
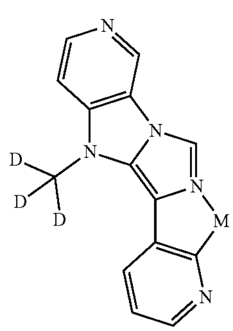
L2100
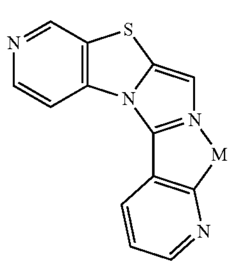
-continued
L2101
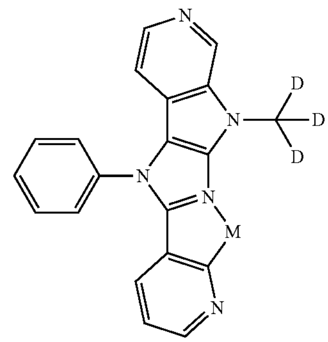
L2102
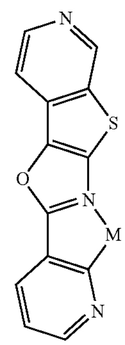
L2103
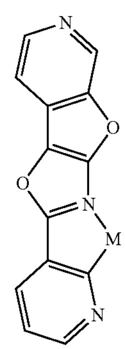
L2104
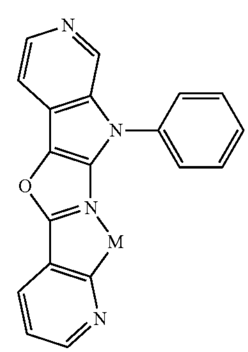

-continued
L2105
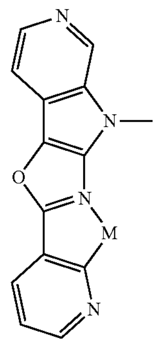
L2106
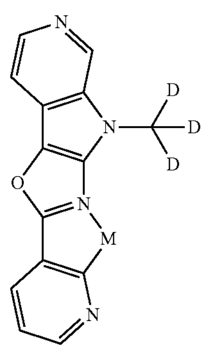
L2107
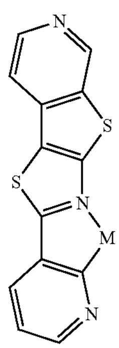
L2108
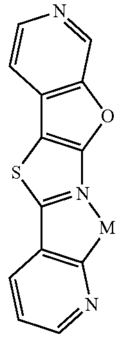
-continued
L2109
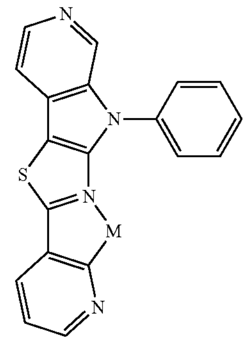
L2110
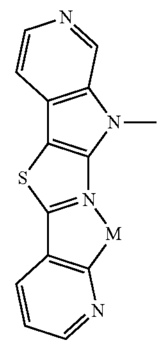
L2111
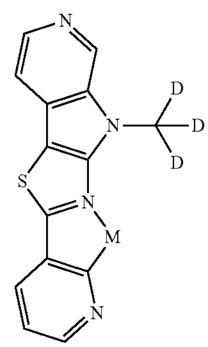
L2112
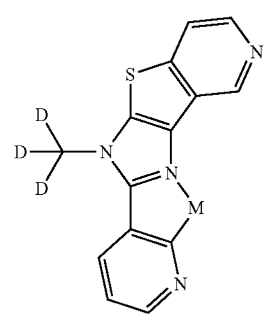
L2113
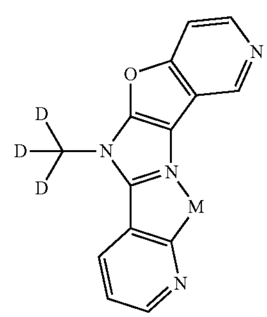

L2114
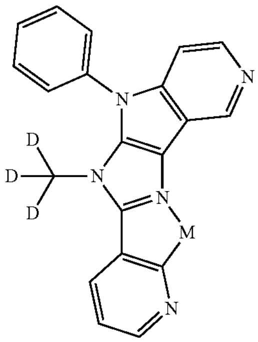
L2115
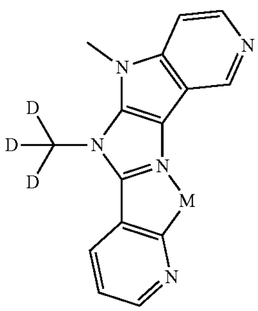
L2116
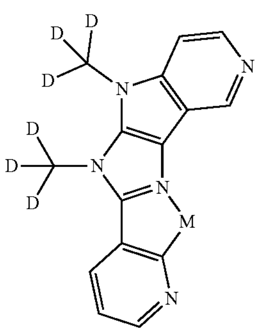
L2117
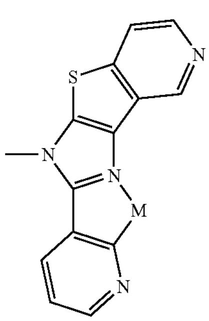
L2118
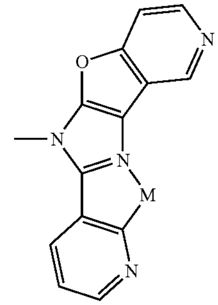
L2119
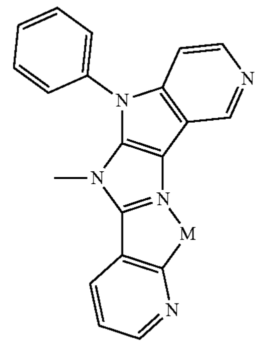
L2120
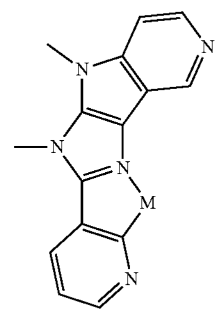
L2121
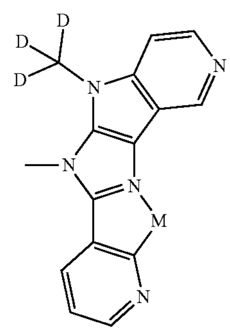
L2122
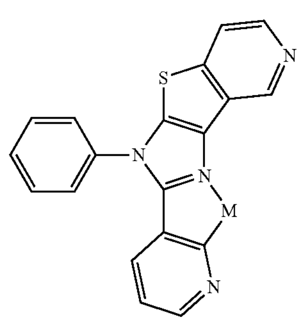

L2123
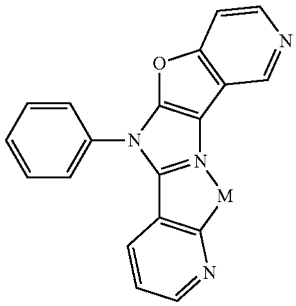
L2124
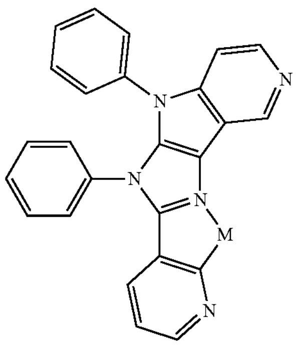
L2125
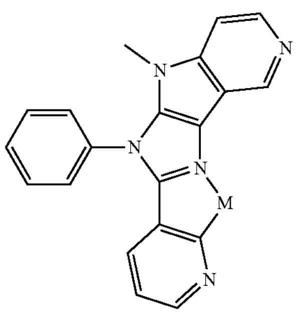
L2126
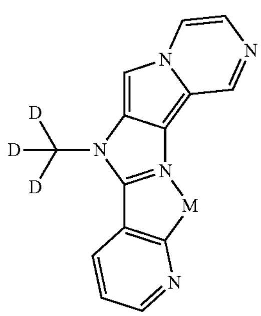
L2127
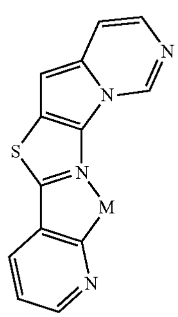
L2128
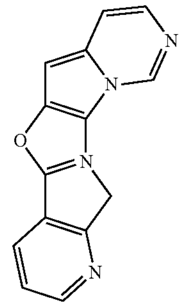
L2129
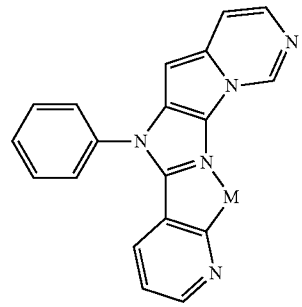
L2130
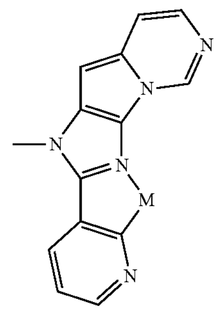
L2131
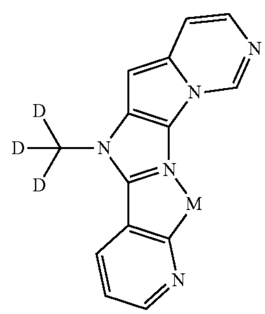
L2132
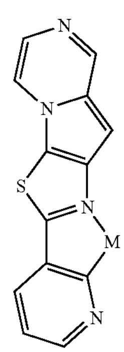

L2133
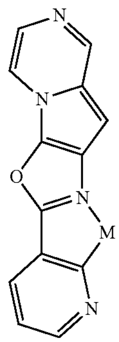
L2134
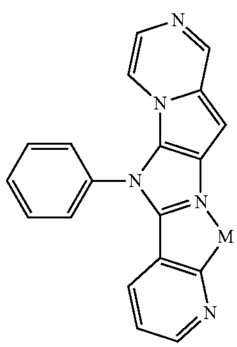
L2135
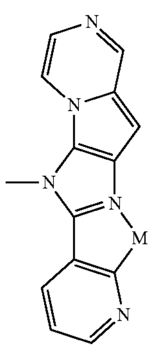
L2136
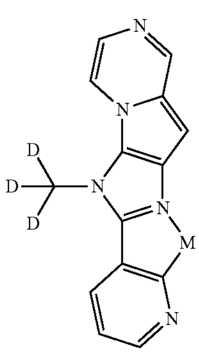
L2137
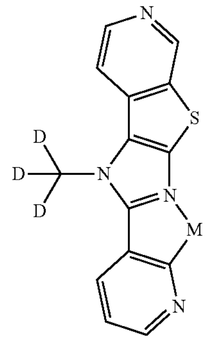
L2138
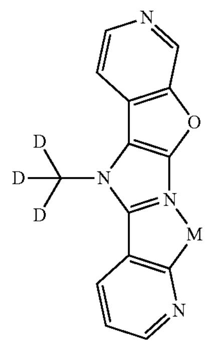
L2139
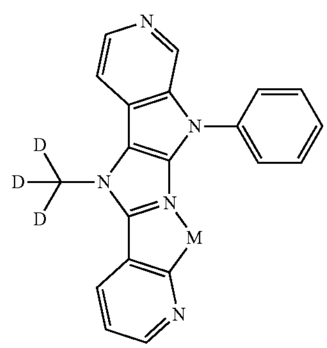
L2140
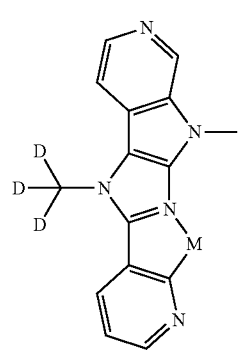

L2141
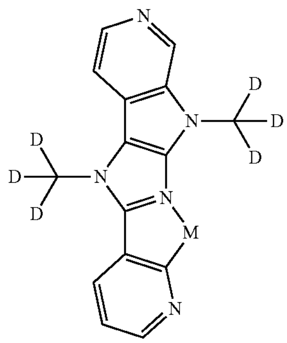
L2142
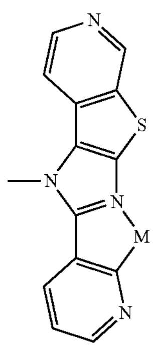
L2143
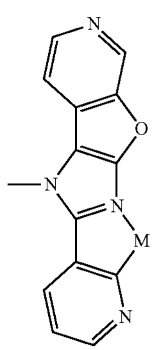
L2144
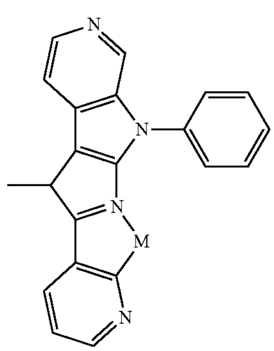
L2145
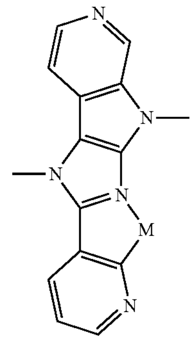
L2146
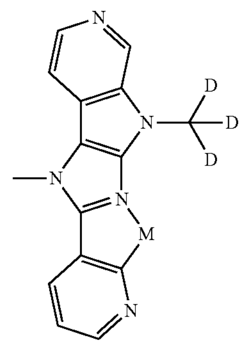
L2147
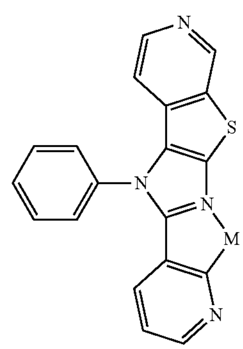
L2148
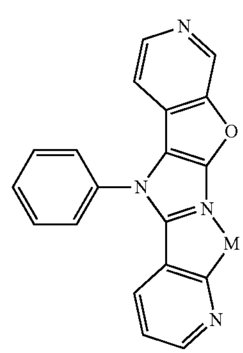

-continued
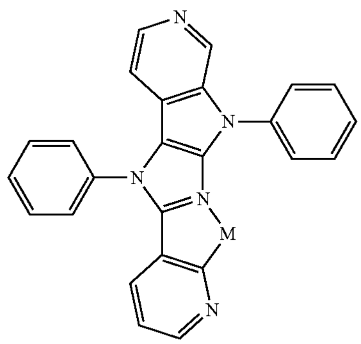
L2149
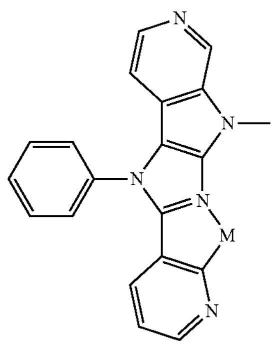
L2150
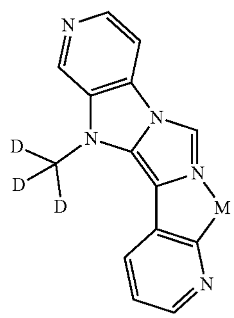
L2151
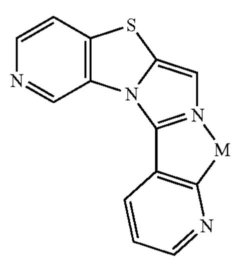
L2152
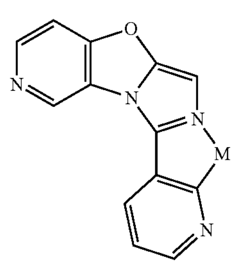
L2153
-continued
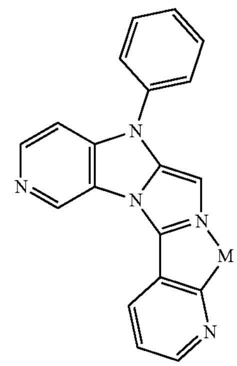
L2154
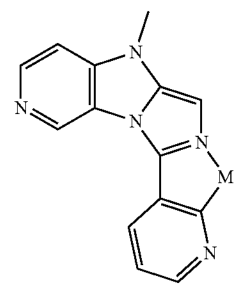
L2155
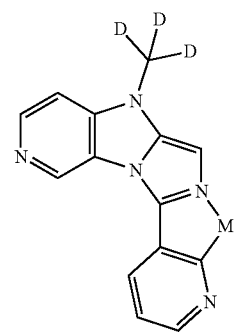
L2156
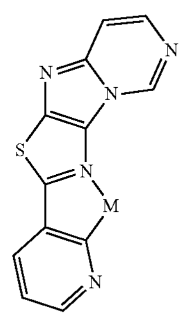
L2157
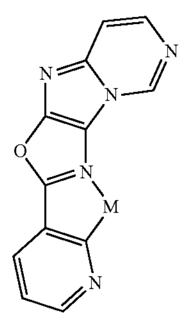
L2158

-continued
L2159
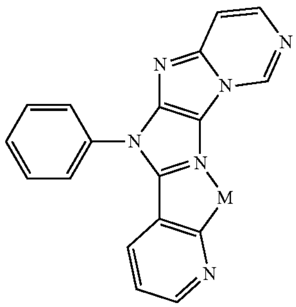
L2160
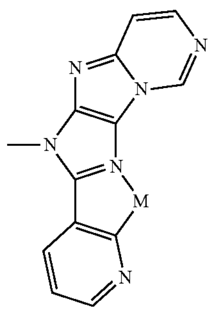
L2161
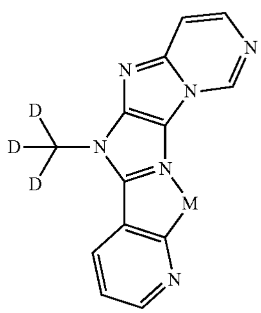
L2162
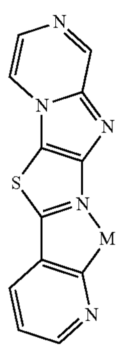
L2163
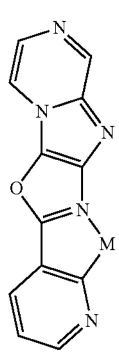
-continued
L2164
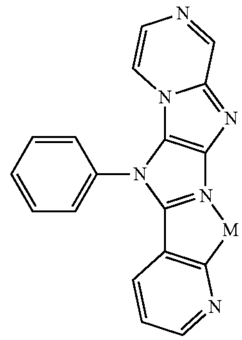
L2165
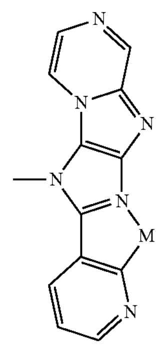
L2166
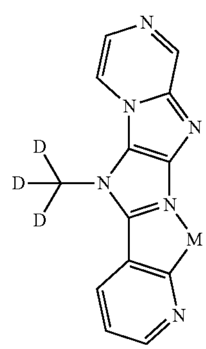
L2167
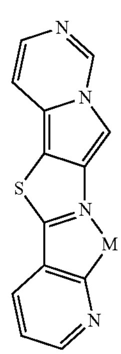

-continued
L2168
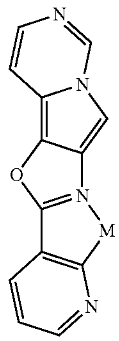
L2169
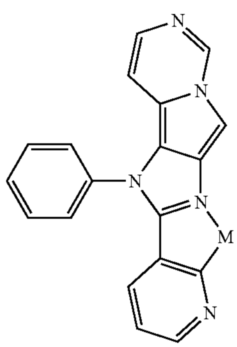
L2170
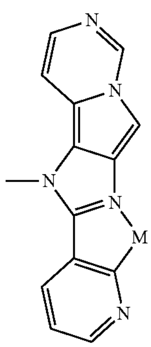
L2171
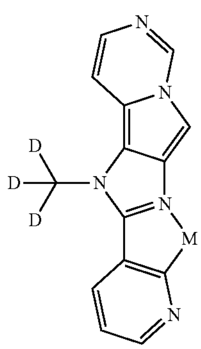
-continued
L2172
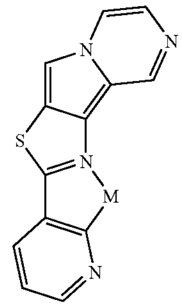
L2173
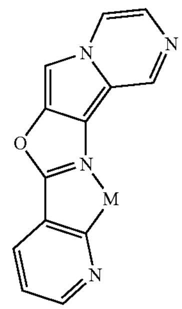
L2174
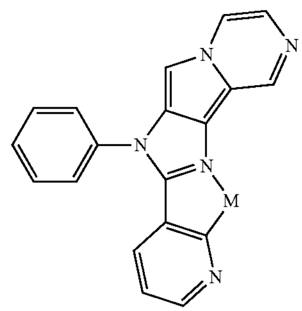
L2175
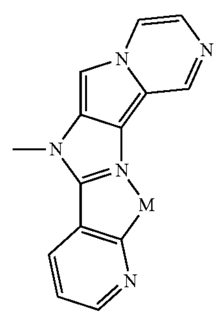
L2176
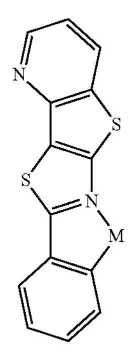

L2177
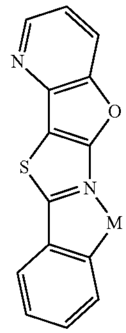
L2178
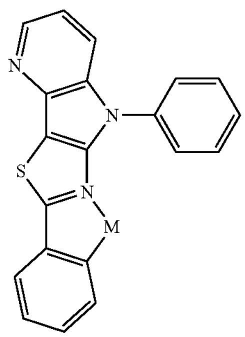
L2179
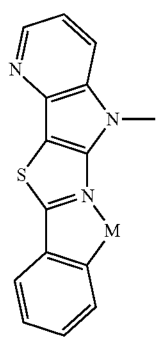
L2180
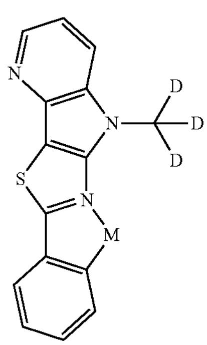
L2181
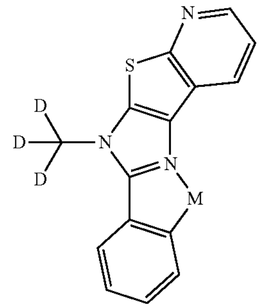
L2182
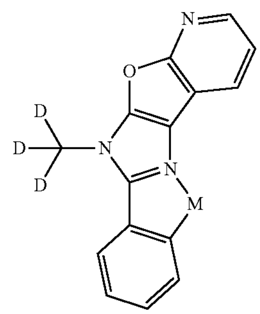
L2183
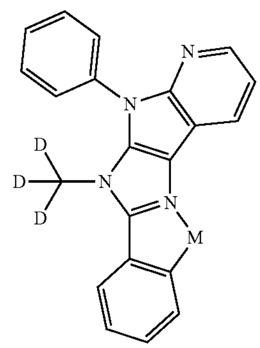
L2184
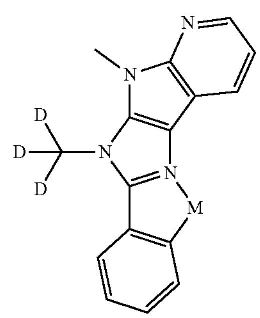
L2185
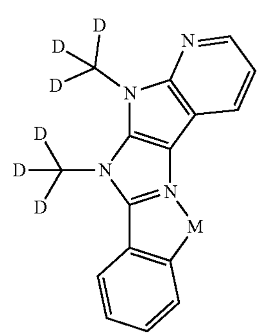

-continued
L2186
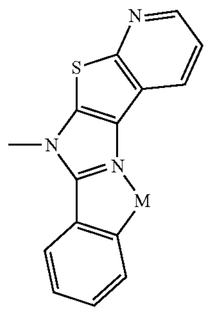
L2187
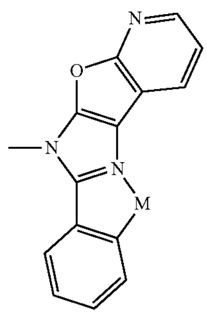
L2188
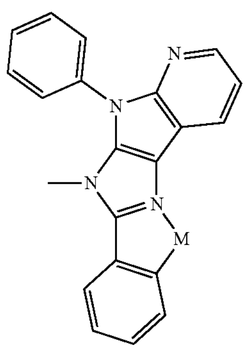
L2189
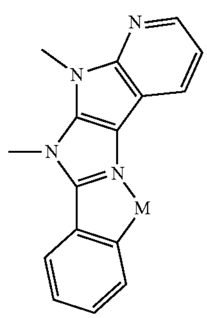
L2190
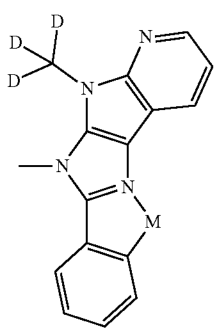
-continued
L2191
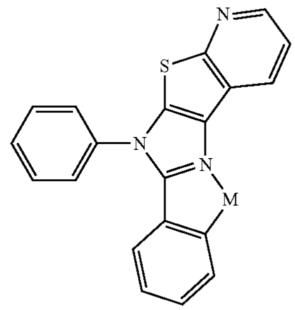
L2192
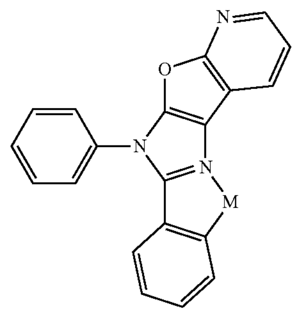
L2193
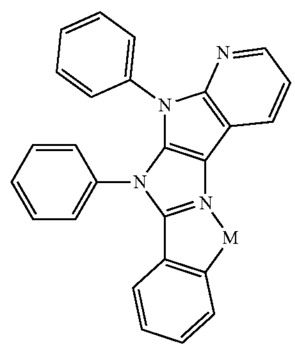
L2194
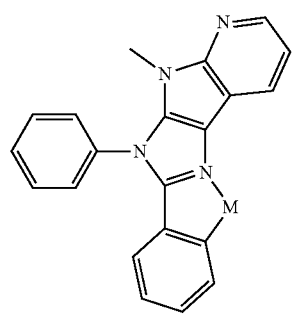
L2195
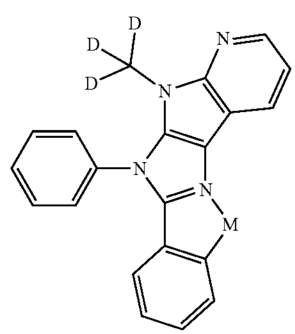

-continued
L2196
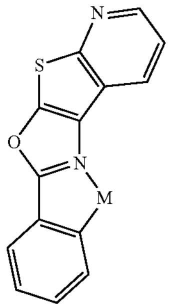
L2197
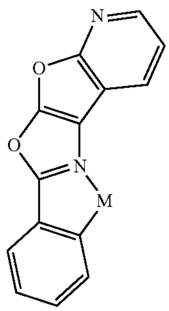
L2198
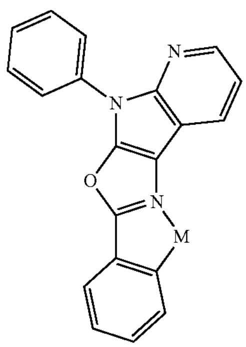
L2199
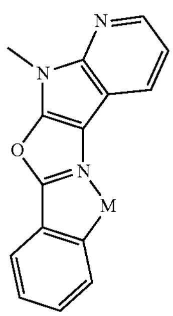
L2200
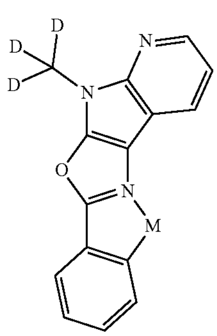
-continued
L2201
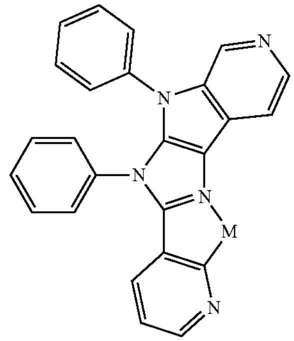
L2202
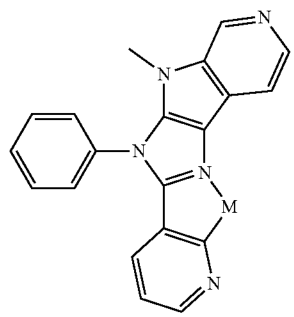
L2203
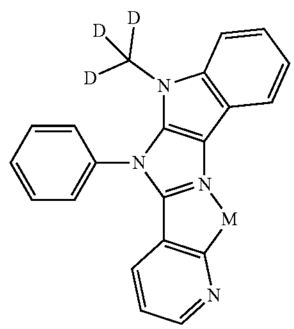
L2204
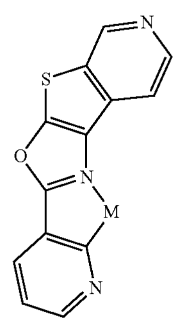
L2205
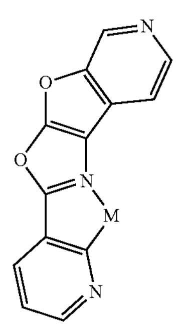

-continued
L2206
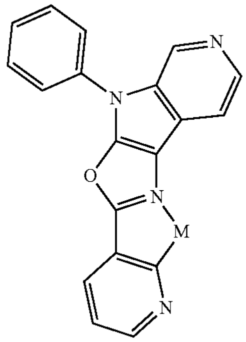
L2207
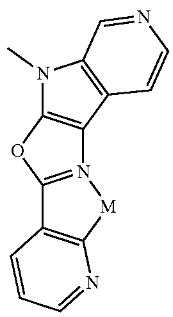
L2208
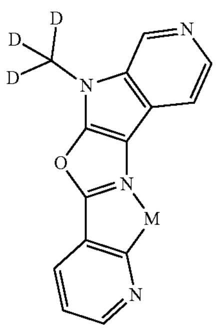
L2209
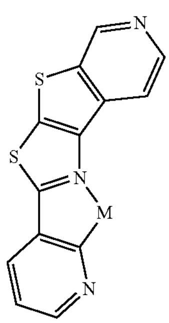
L2210
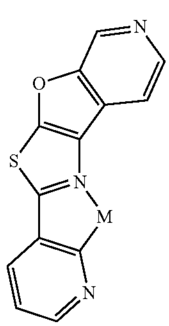
-continued
L2211
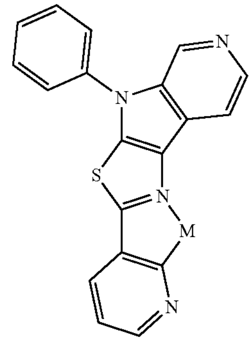
L2212
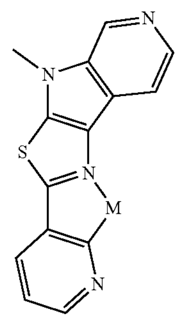
L2213
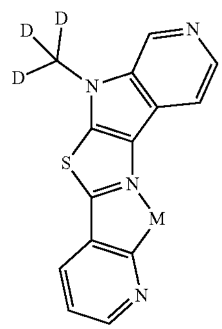
L2214
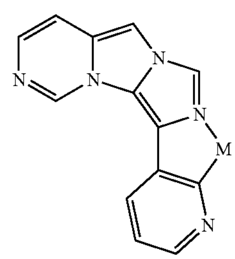
L2215
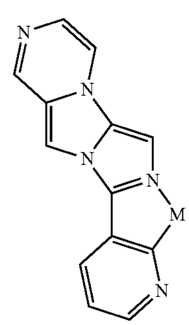

-continued
L2216
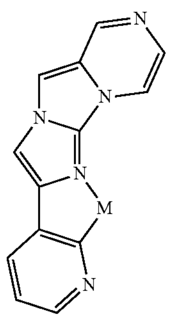
L2217
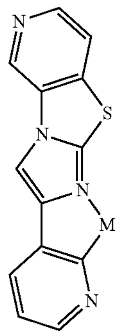
L2218
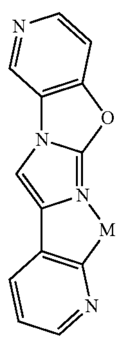
L2219
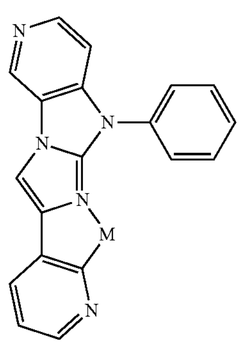
-continued
L2220
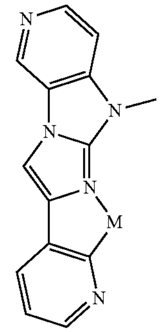
L2221
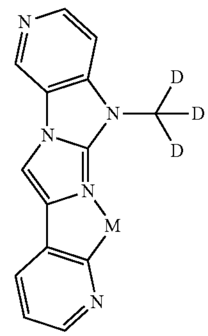
L2222
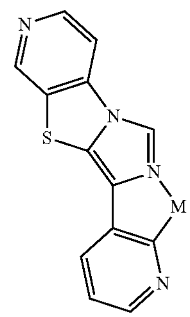
L2223
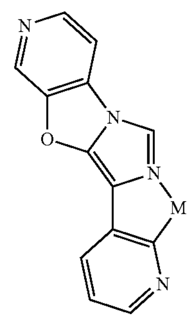
L2224
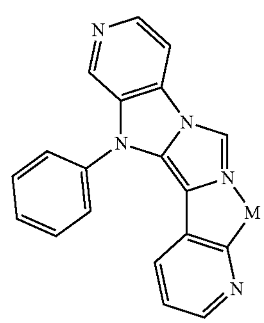

-continued
L2225
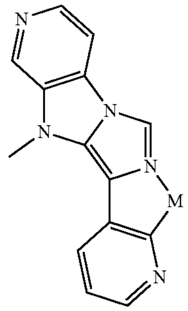
L2226
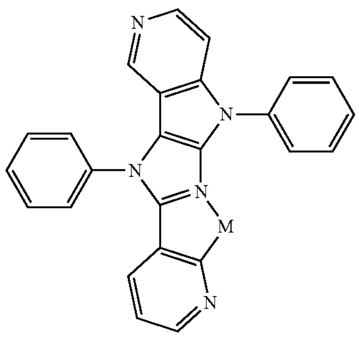
L2227
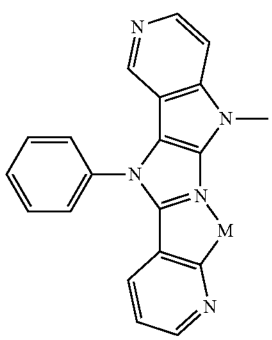
L2228
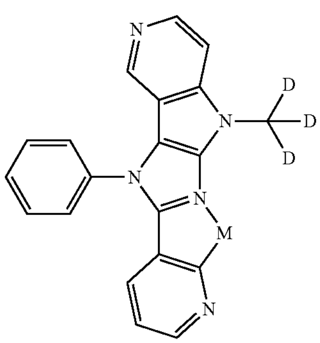
-continued
L2229
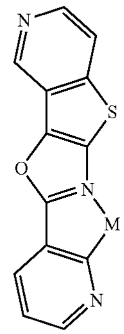
L2230
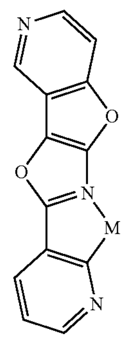
L2231
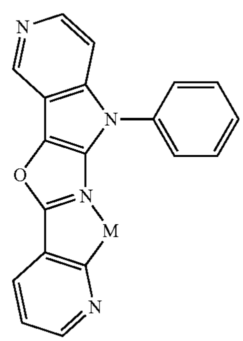
L2232
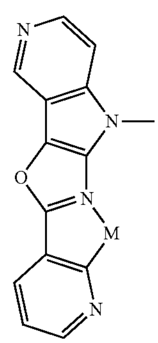

-continued
L2233
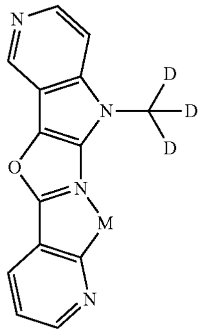
L2234
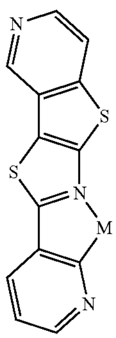
L2235
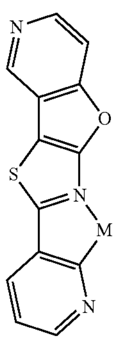
L2236
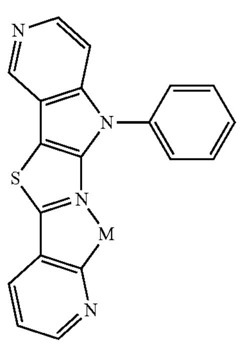
L2237
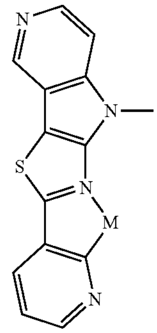
L2238
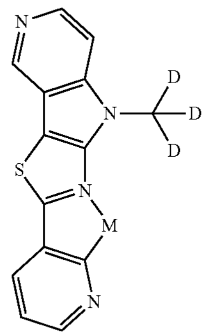
L2239
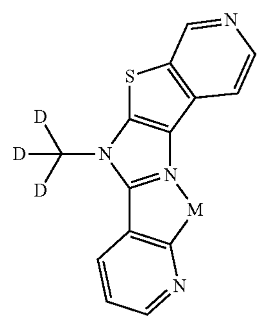
L2240
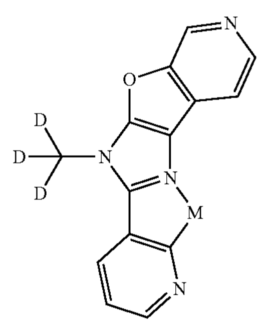
L2241
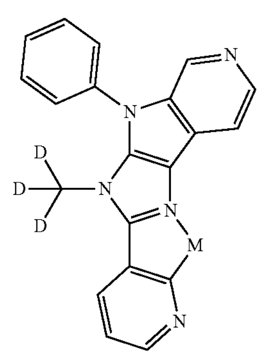

-continued
L2242
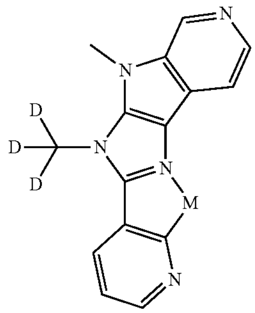
L2243
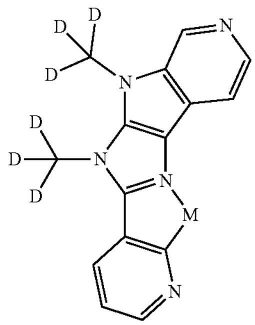
L2244
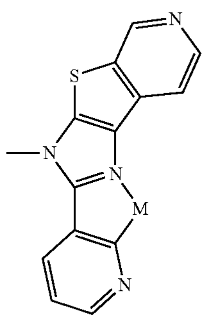
L2245
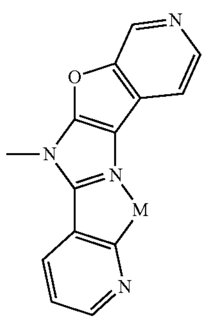
L2246
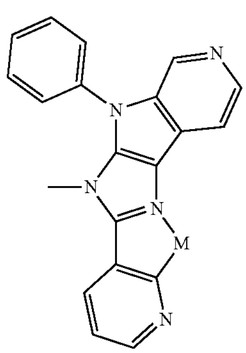
-continued
L2247
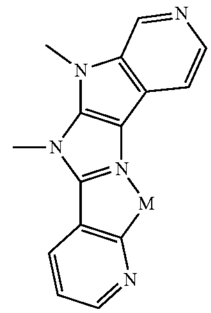
L2248
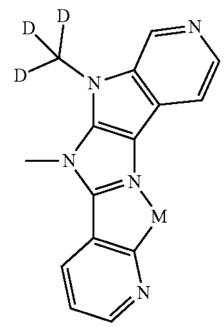
L2249
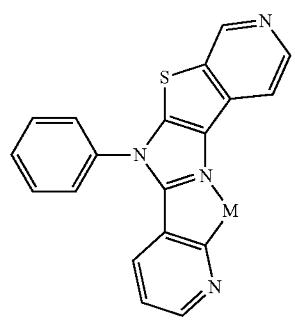
L2250
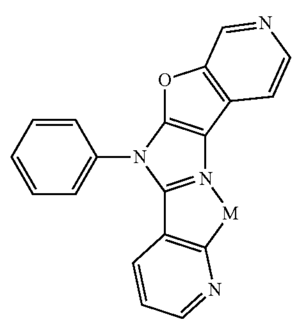
L2251
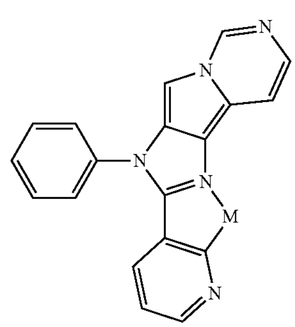

-continued
L2252
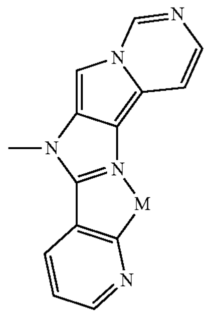
L2253
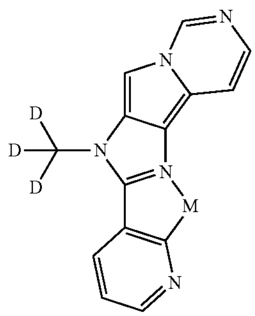
L2254
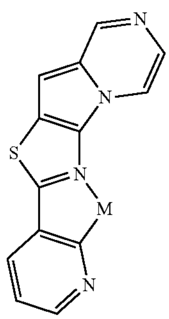
L2255
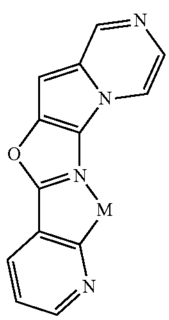
L2256
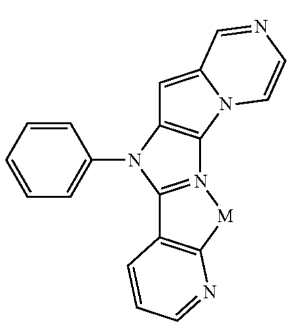
-continued
L2257
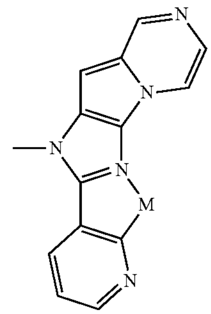
L2258
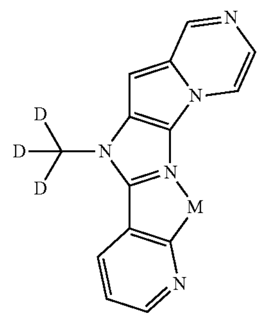
L2259
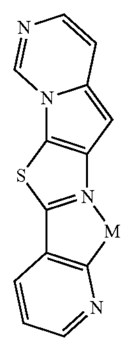
L2260
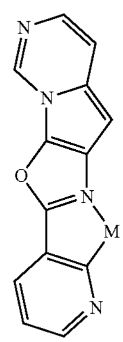
L2261
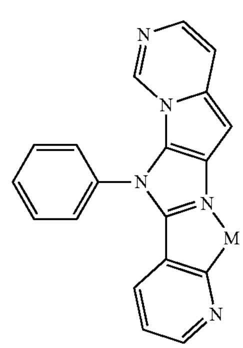

L2262
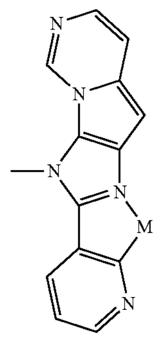
L2263
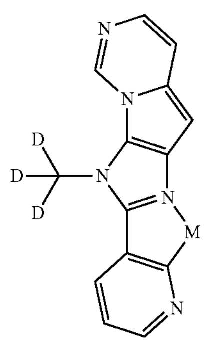
L2264
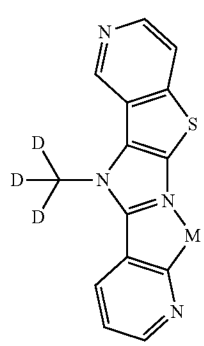
L2265
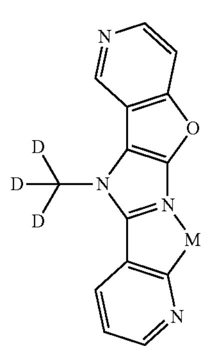
L2266
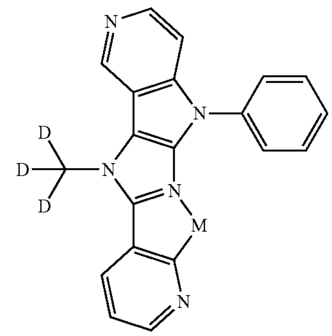
L2267
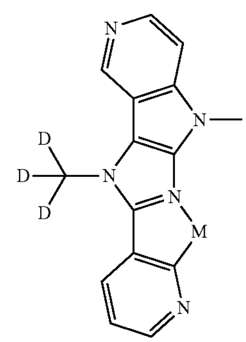
L2268
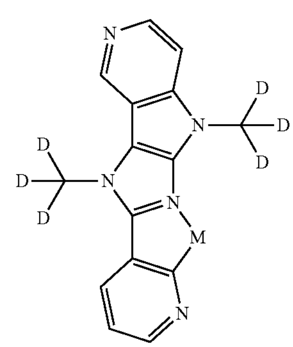
L2269
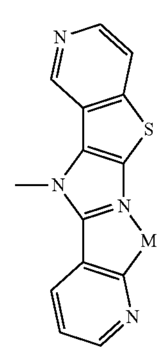

-continued
L2270
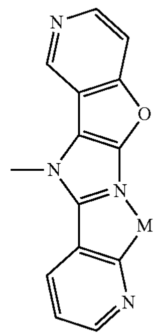
L2271
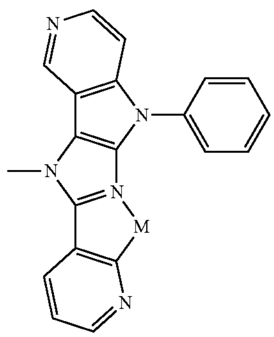
L2272
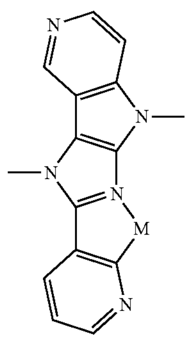
L2273
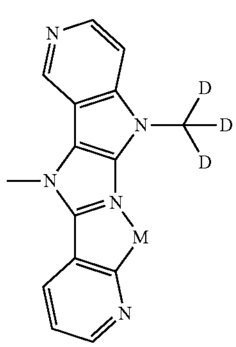
-continued
L2274
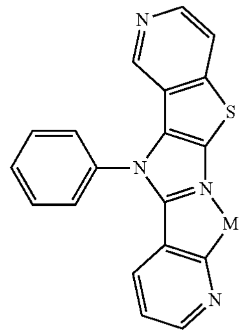
L2275
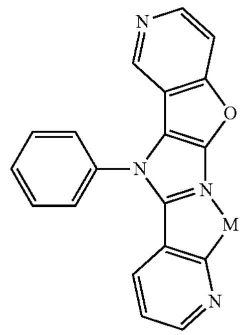
L2276
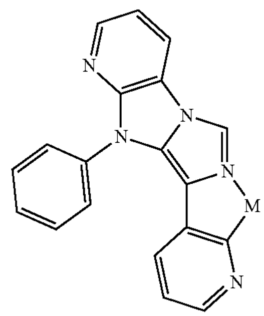
L2277
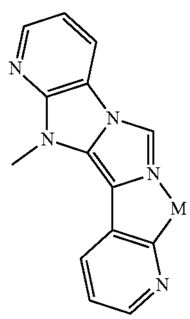
L2278
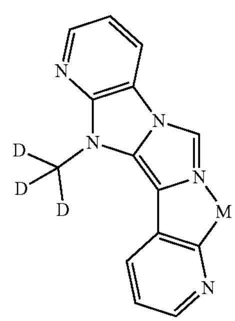

-continued
L2279
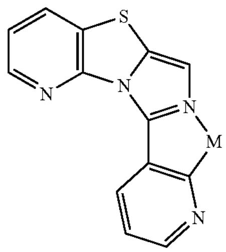
L2280
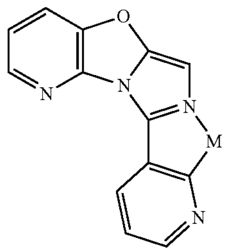
L2281
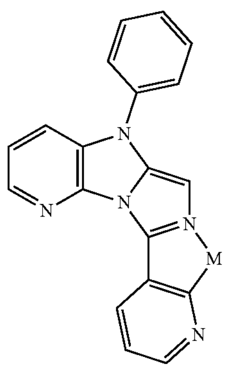
L2282
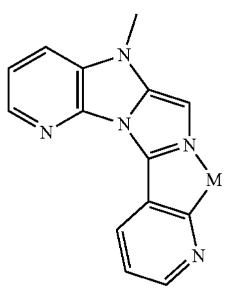
L2283
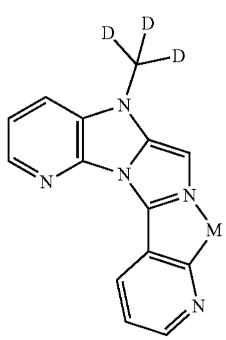
-continued
L2284
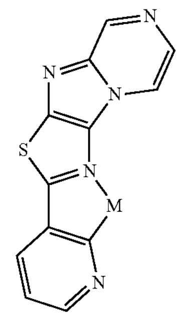
L2285
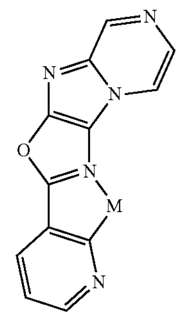
L2286
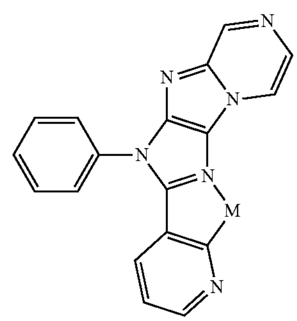
L2287
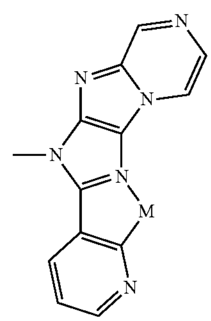
L2288
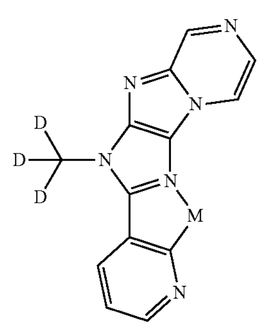

L2289
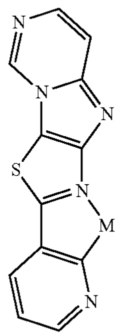
L2290
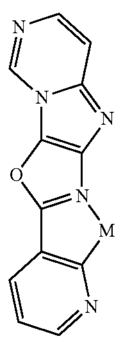
L2291
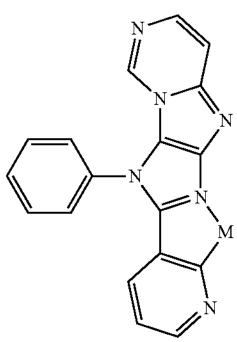
L2292
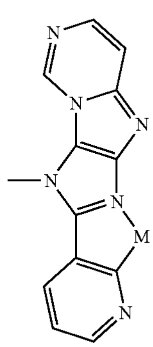
L2293
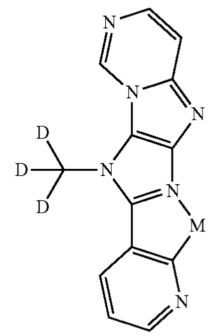
L2294
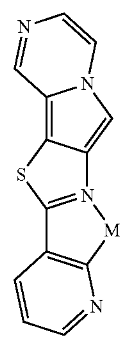
L2295
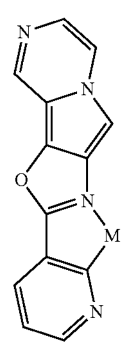
L2296
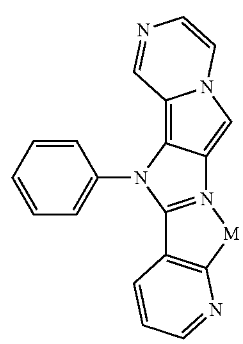

-continued
L2297
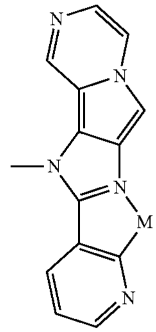
L2298
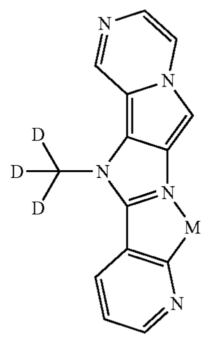
L2299
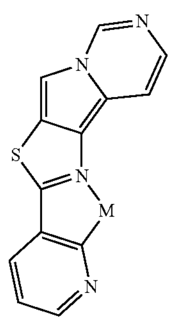
L2300
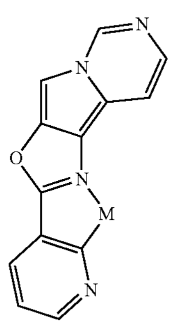
L2301
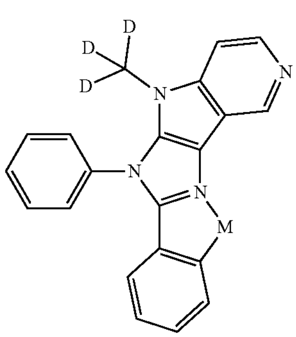
-continued
L2302
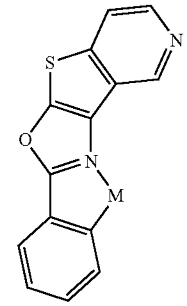
L2303
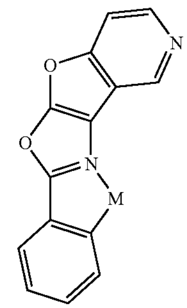
L2304
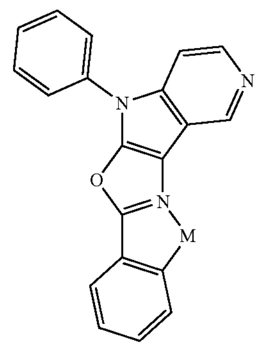
L2305
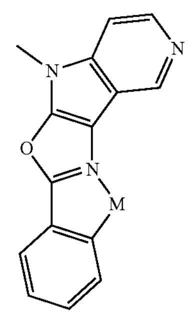
L2306
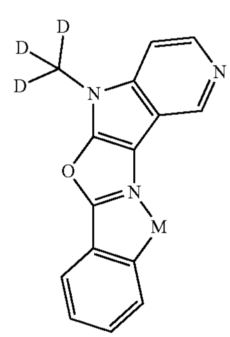

L2307
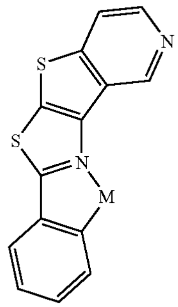
L2308
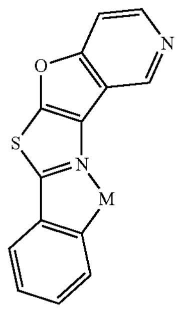
L2309
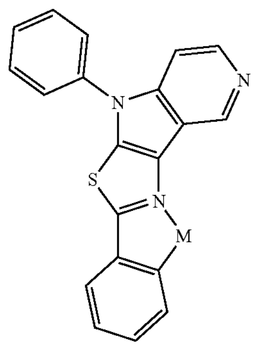
L2310
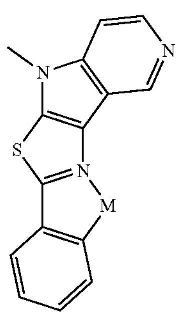
L2311
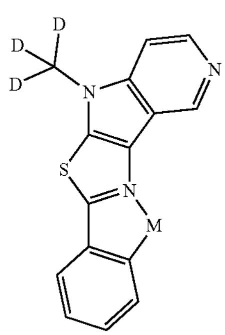
L2312
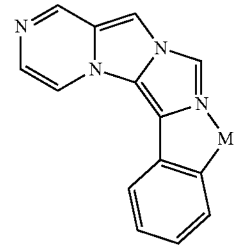
L2313
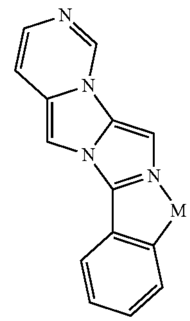
L2314
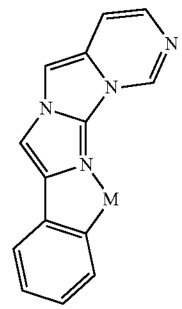
L2315
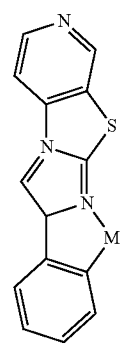
L2316
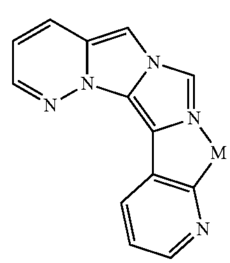

L2317
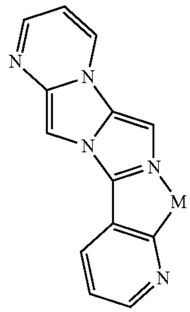
L3218
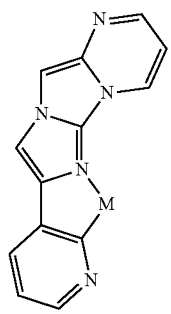
L2319
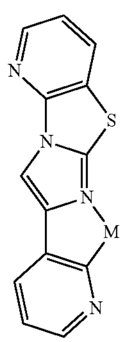
L2320
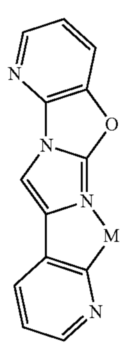
L2321
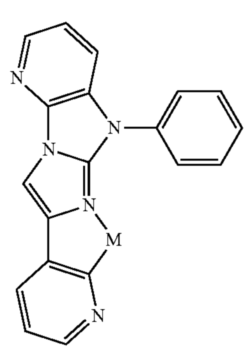
L2322
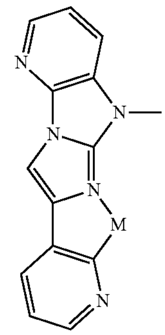
L2323
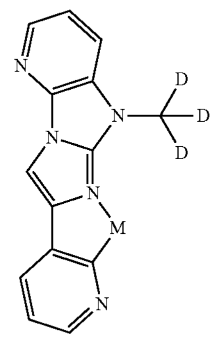
L2324
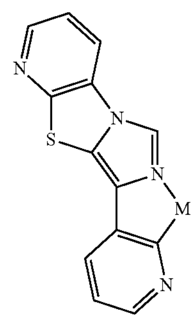
L2325
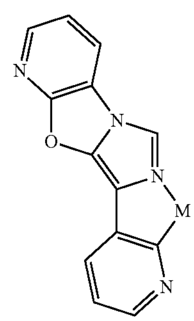
L2326
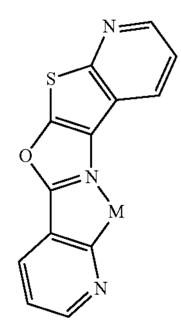

-continued
L2327
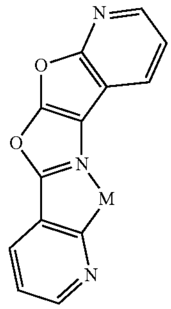
L2328
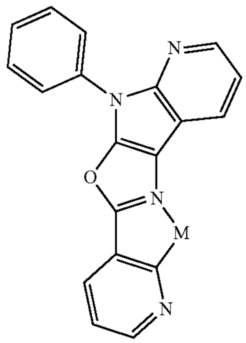
L2329
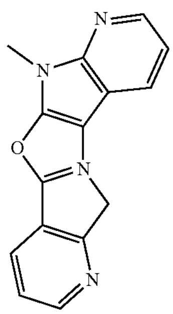
L2330
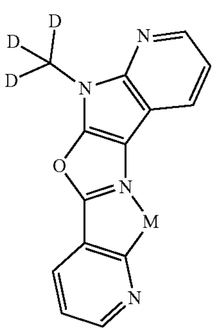
L2331
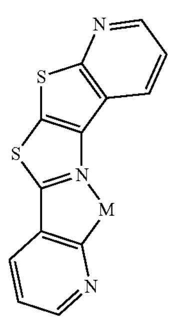
-continued
L2332
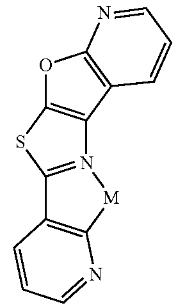
L2333
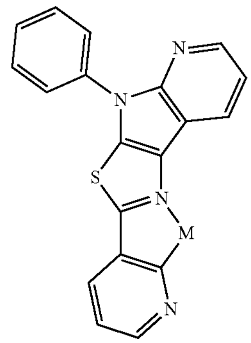
L2334
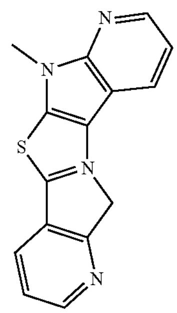
L2335
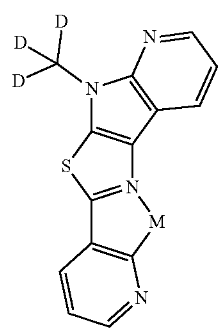
L2336
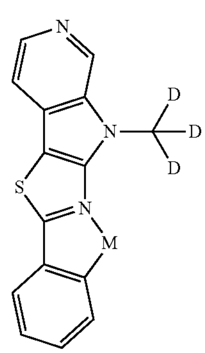

-continued
L2337
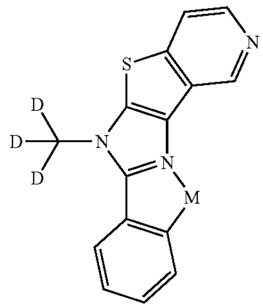
L2338
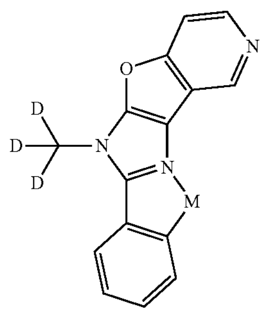
L2339
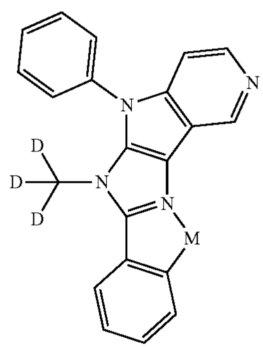
L2340
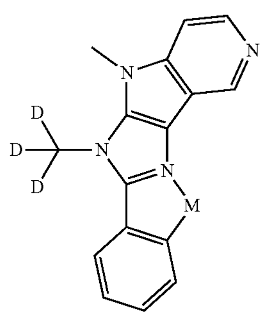
L2341
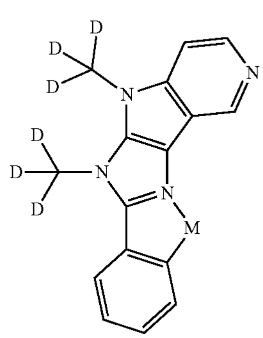
-continued
L2342
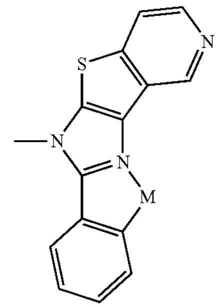
L2343
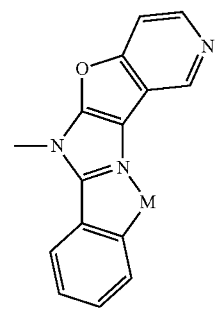
L2344
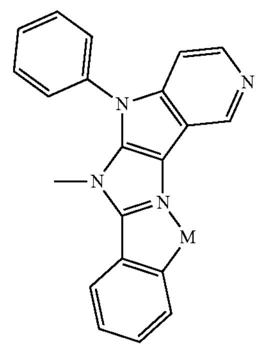
L2345
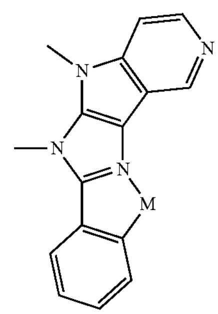
L2346
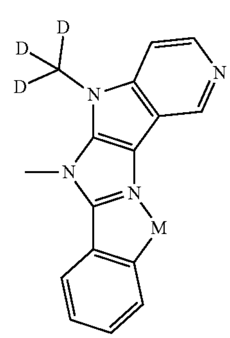

-continued
L2347
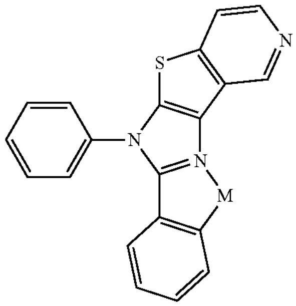
L2348
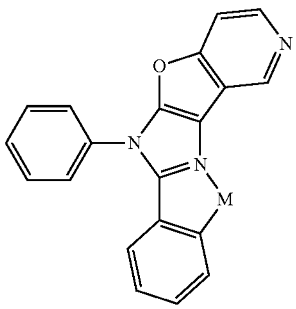
L2349
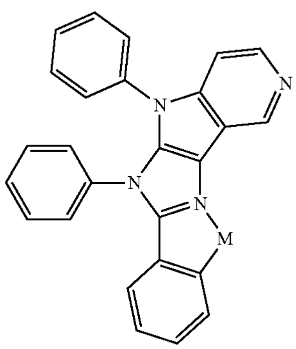
L2350
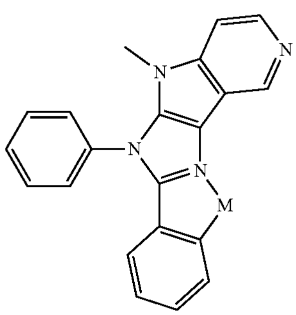
L2351
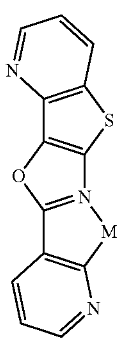
-continued
L2352
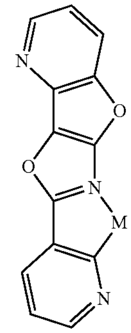
L2353
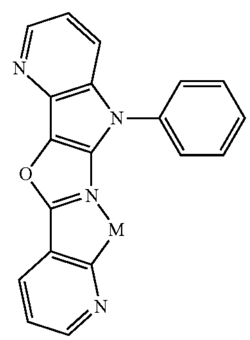
L2354
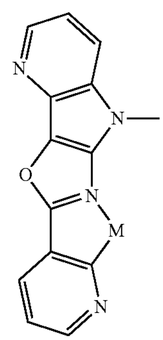
L2355
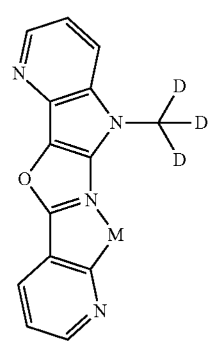

-continued
L2356
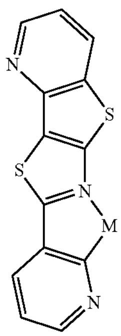
L2357
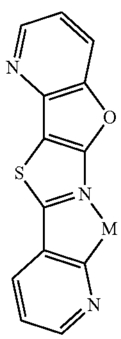
L2358
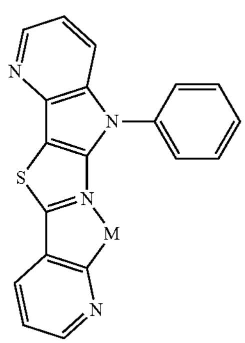
L2359
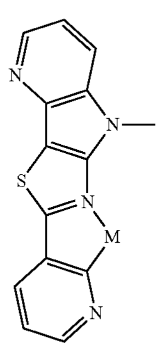
-continued
L2360
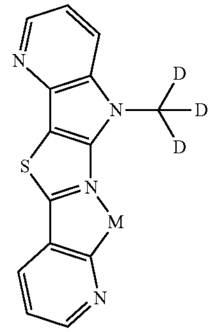
L2361
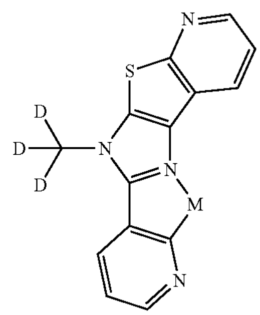
L2362
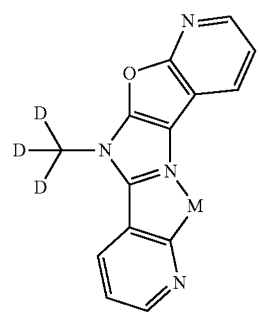
L2363
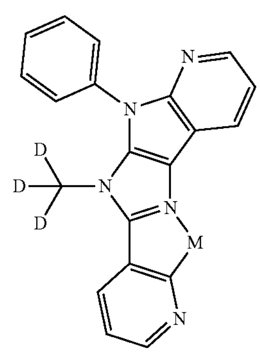
L2364
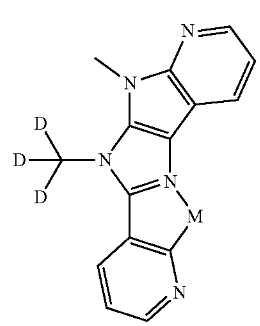

L2365
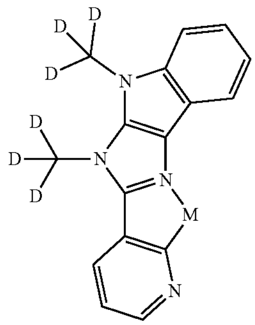
L2366
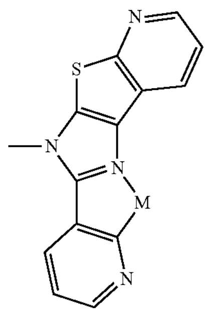
L2367
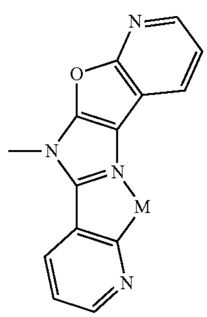
L2368
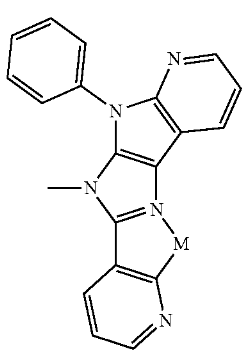
L2369
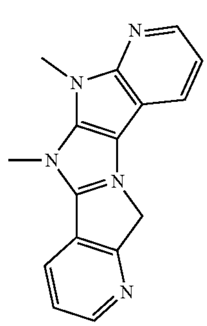
L2370
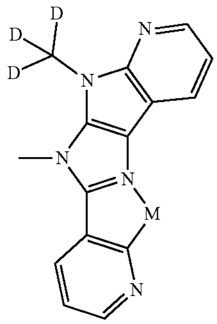
L2371
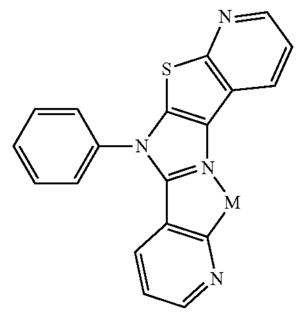
L2372
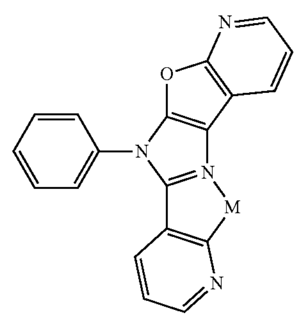
L2373
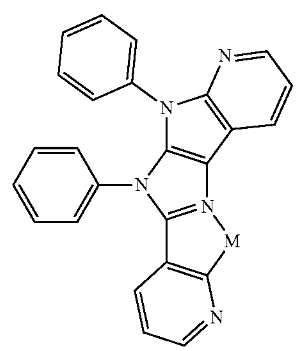
L2374
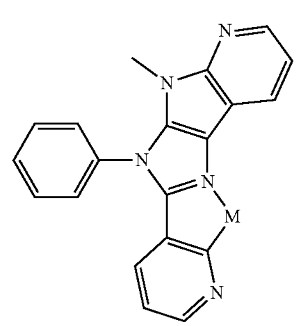

L2375
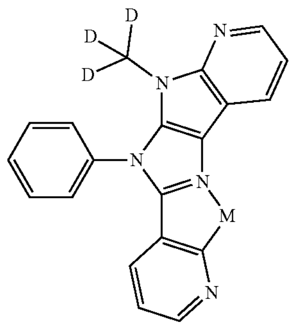
L2376
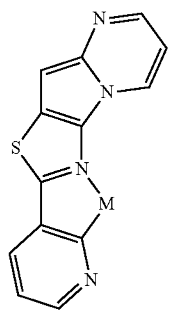
L2377
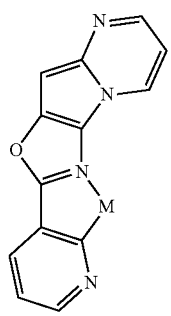
L2378
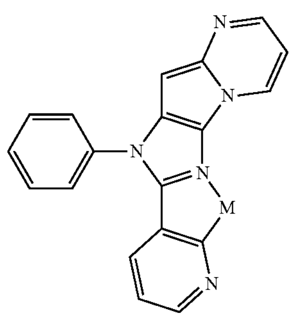
L2379
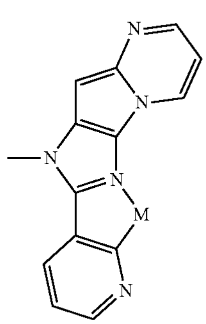
L2380
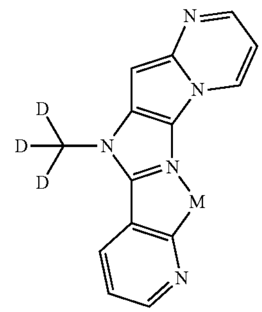
L2381
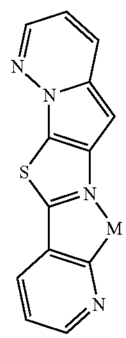
L2382
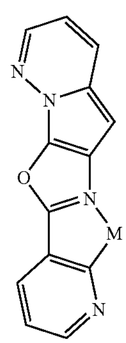
L2383
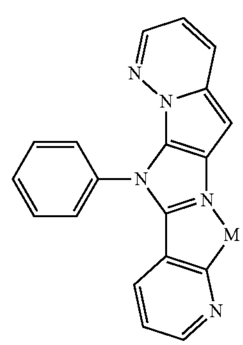

-continued
L2384
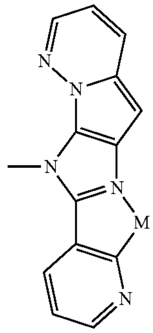
L2385
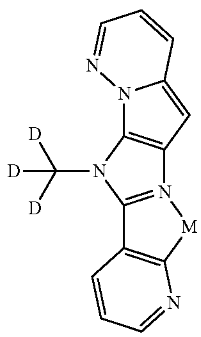
L2386
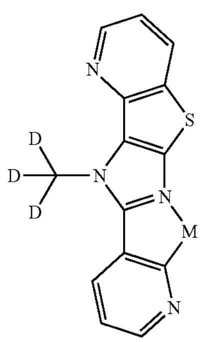
L2387
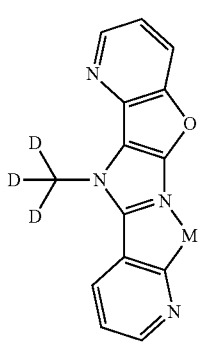
-continued
L2388
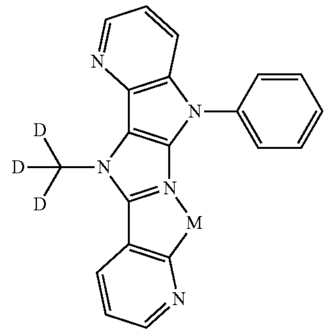
L2389
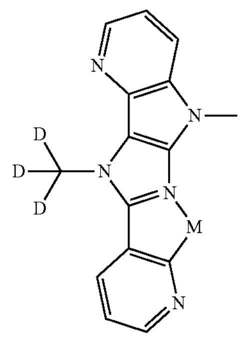
L2390
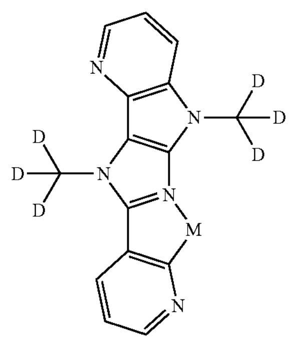
L2391
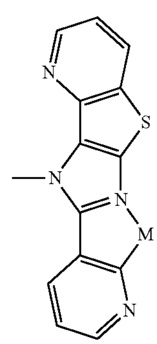

L2392
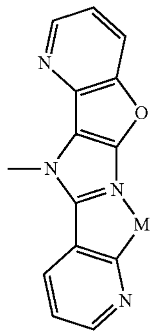
L2393
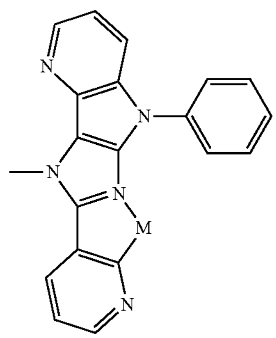
L2394
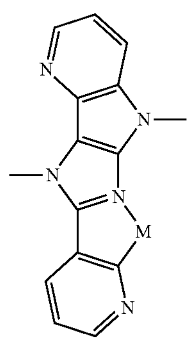
L2395
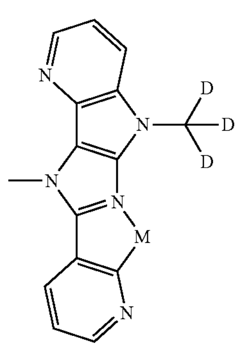
L2396
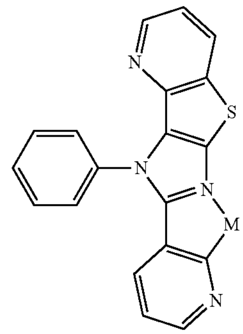
L2397
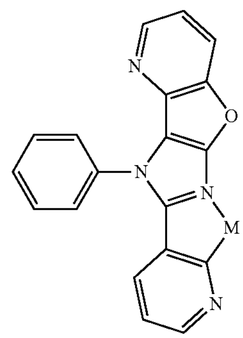
L2398
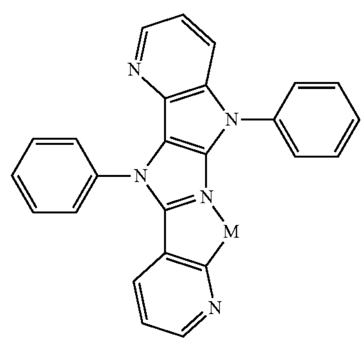
L2399
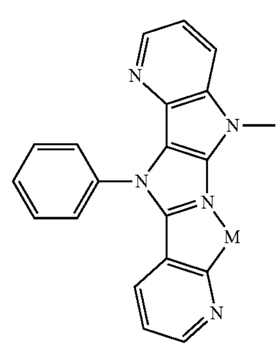

L2400
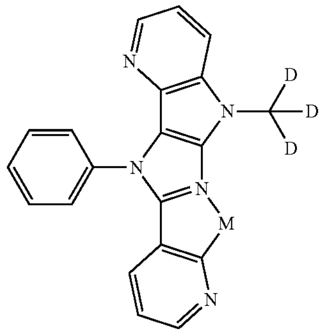
L2401
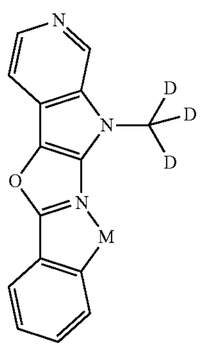
L2402
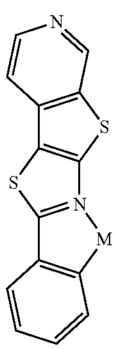
L2403
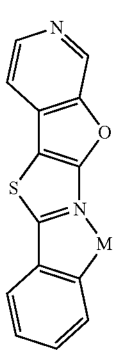
L2404
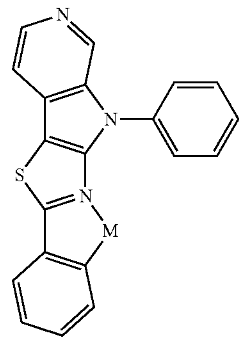
L2405
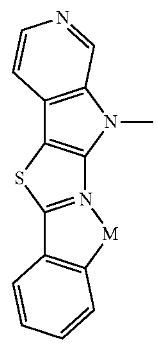
L2406
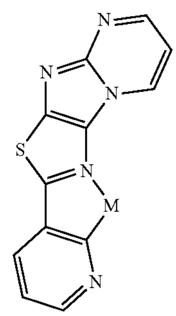
L2407
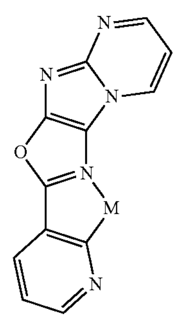
L2408
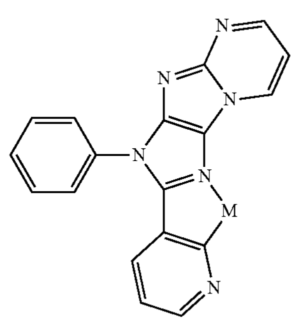

L2409
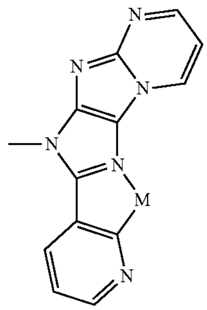
L2410
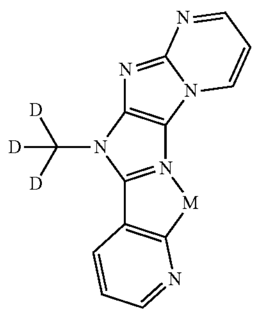
L2411
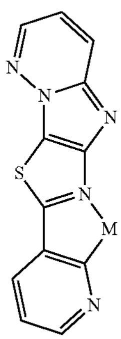
L2412
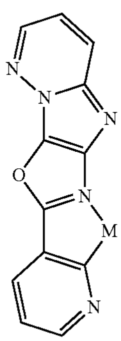
L2413
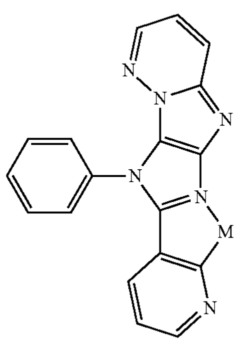
L2414
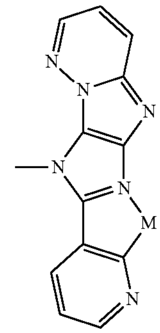
L2415
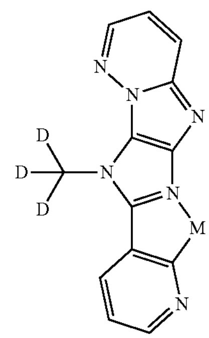
L2416
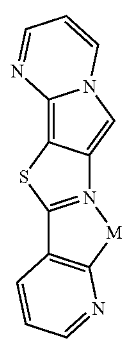
L2417
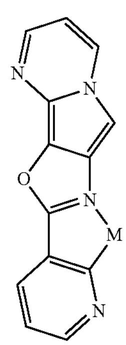

-continued
L2418
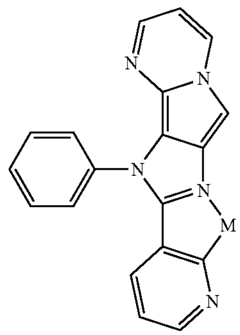
L2419
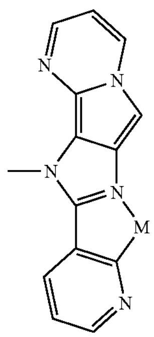
L2420
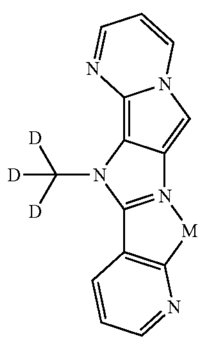
L2421
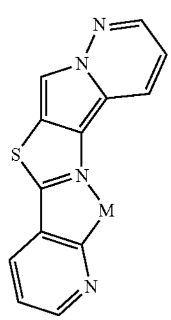
L2422
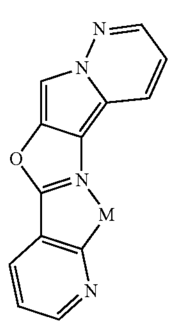
-continued
L2423
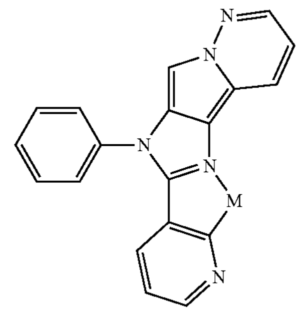
L2424
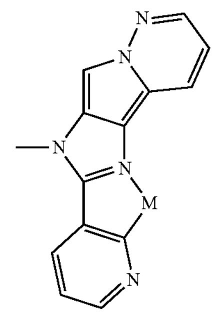
L2425
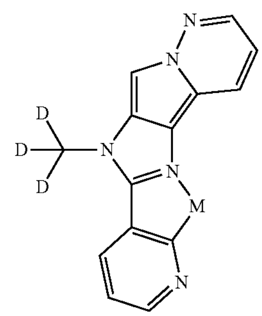
L2426
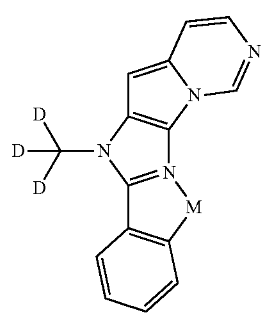
L2427
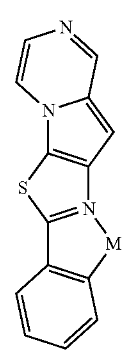

-continued
L2428
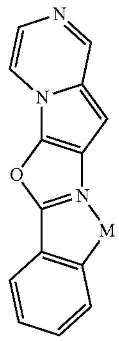
L2429
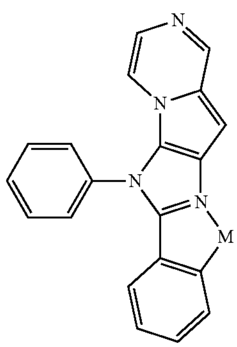
L2430
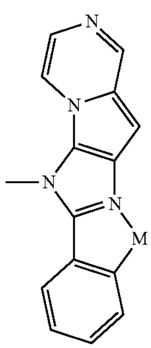
L2431
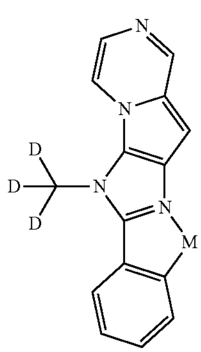
-continued
L2432
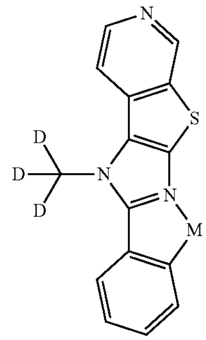
L2433
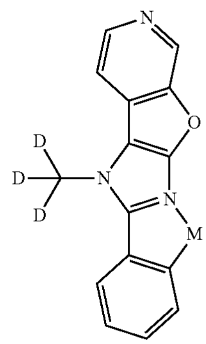
L2434
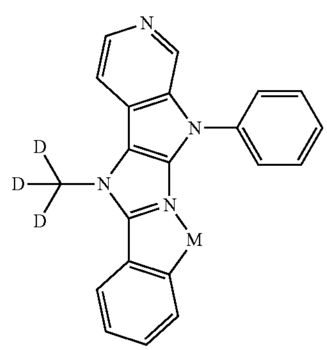
L2435
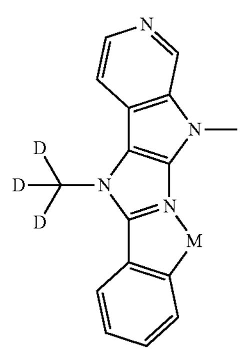

L2436
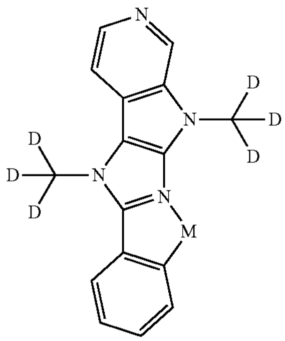
L2437
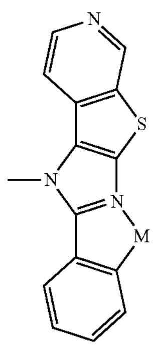
L2438
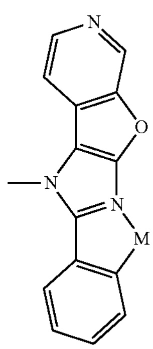
L2439
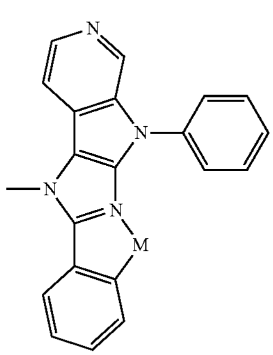
-continued
L2440
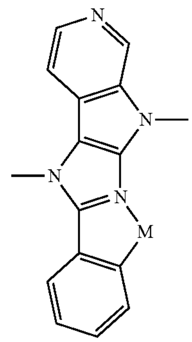
L2441
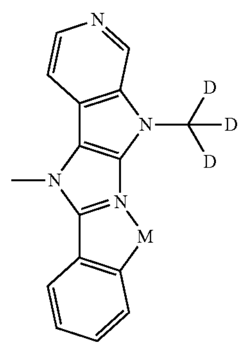
L2442
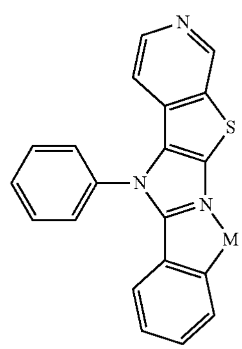
L2443
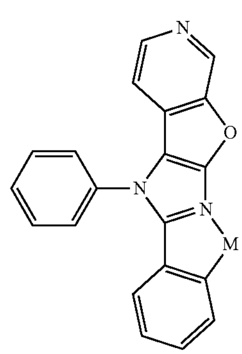

-continued
L2444
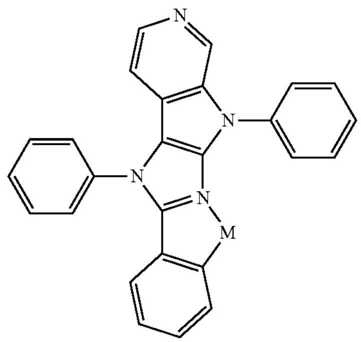
L2445
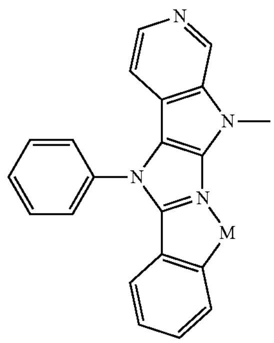
L2446
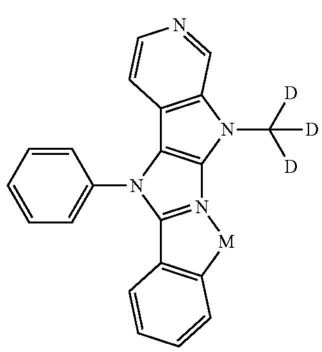
L2447
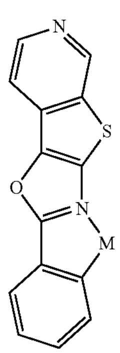
-continued
L2448
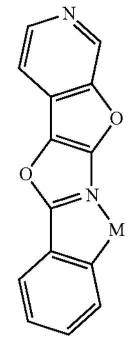
L2449
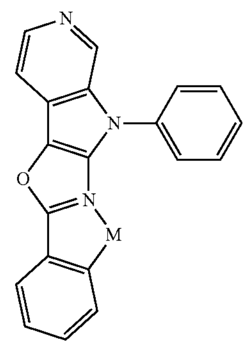
L2450
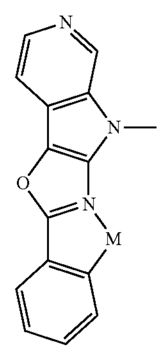
In one embodiment each L is independently selected from the group consisting of:
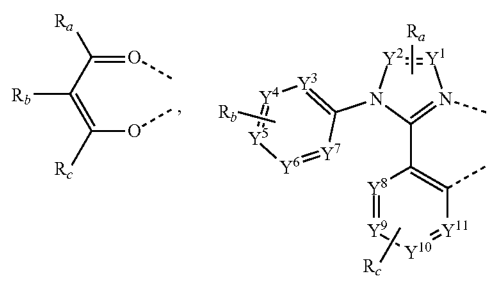

-continued
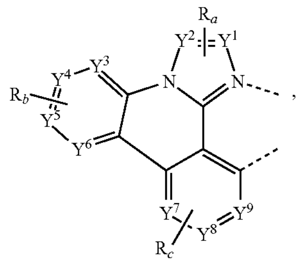
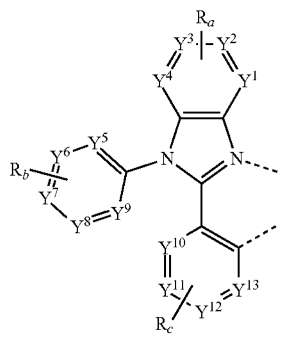
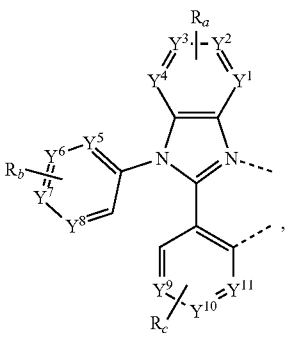
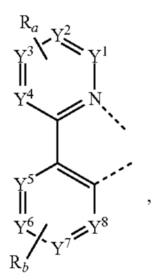
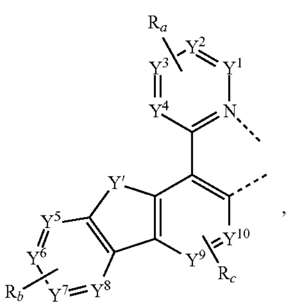
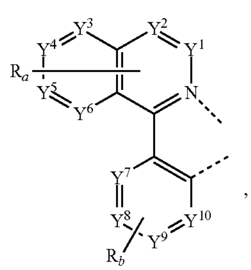
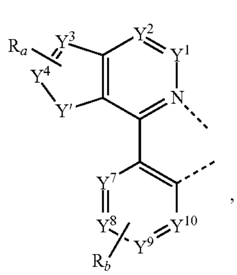
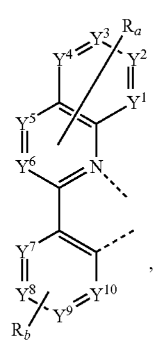
-continued
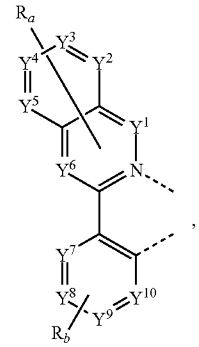
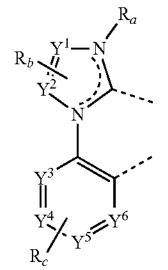
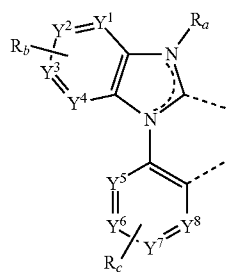
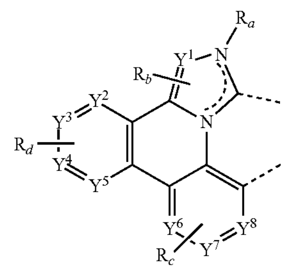
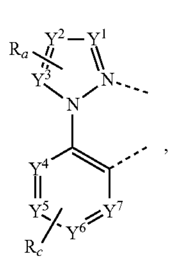
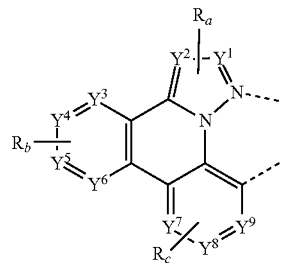
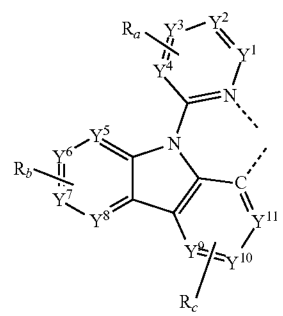
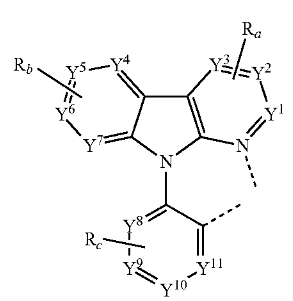
and -continued

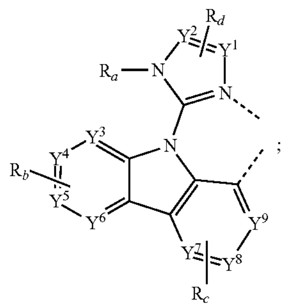

wherein each $Y^1$ to $Y^{13}$ are independently selected from the group consisting of carbon and nitrogen;

wherein Y' is selected from the group consisting of B $R_e$, N $R_e$, P $R_e$, O, S, Se, C═O, S═O, $SO_2$, $CR_eR_f$RR, $SiR_eR_f$, and $G_eR_eR_f$;

wherein $R_e$ and $R_f$ are optionally fused or joined to form a ring;

wherein each $R_a$, $R_b$, $R_c$, and $R_d$ may independently represent from mono substitution to the maximum possible number of substitution, or no substitution;

wherein each $R_a$, $R_b$, $R_c$, $R_d$, $R_e$ and $R_f$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and wherein any two adjacent substituents of $R_a$, $R_b$, $R_c$, and $R_d$ are optionally fused or joined to form a ring or form a multidentate ligand.

In one embodiment, each L is independently selected from the group consisting of:

$L_{B1}$

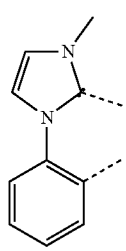

$L_{B2}$

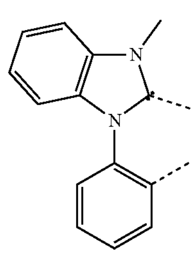

-continued $L_{B3}$

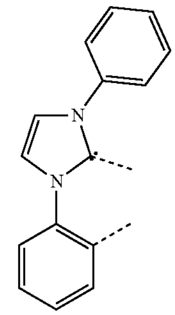

$L_{B4}$

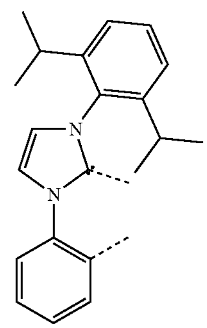

$L_{B5}$

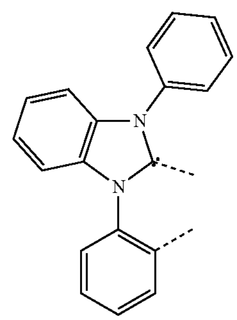

$L_{B6}$

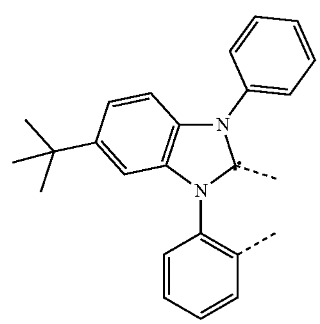

$L_{B7}$

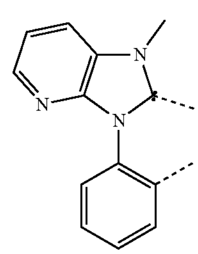

-continued
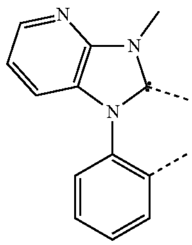
$L_{B8}$
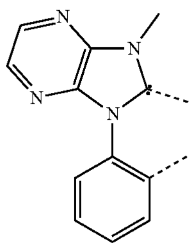
$L_{B9}$
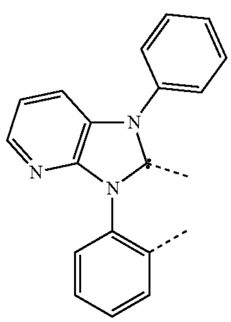
$L_{B10}$
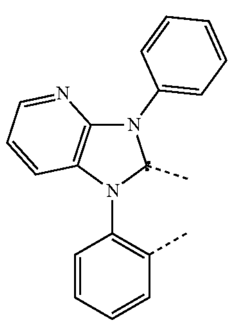
$L_{B11}$
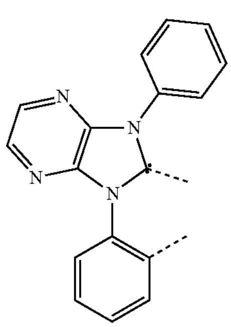
$L_{B12}$
-continued
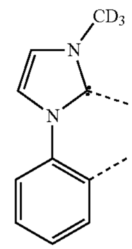
$L_{B13}$
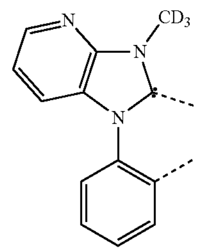
$L_{B14}$
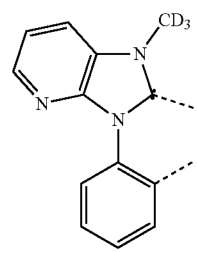
$L_{B15}$
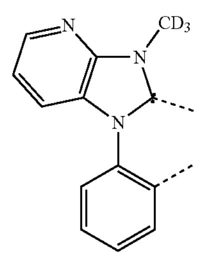
$L_{B16}$
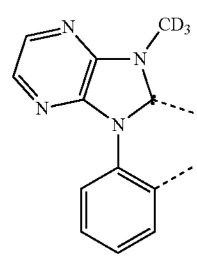
$L_{B17}$
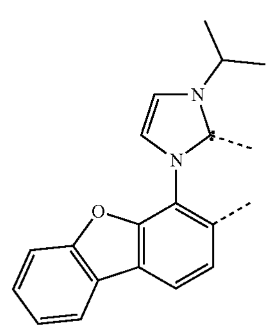
$L_{B18}$ -continued
$L_{B19}$
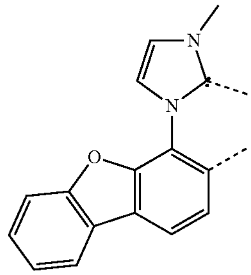
$L_{B20}$
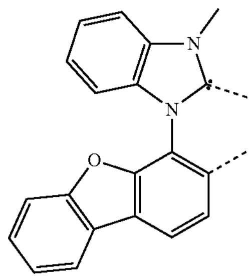
$L_{B21}$
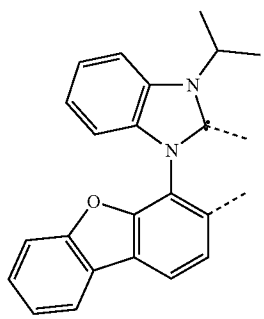
$L_{B22}$
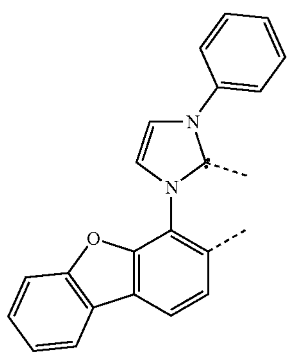
$L_{B23}$
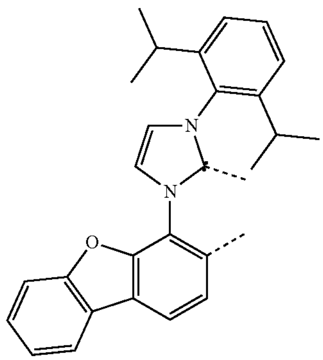
-continued
$L_{B24}$
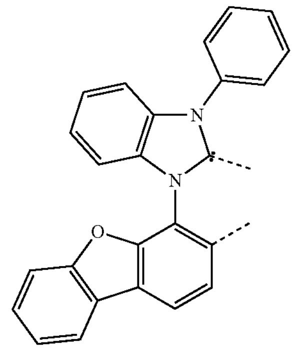
$L_{B25}$
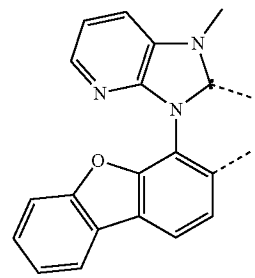
$L_{B26}$
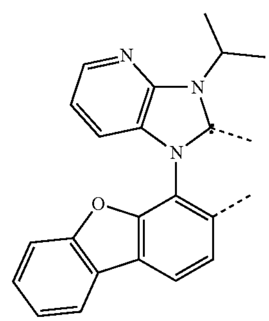
$L_{B27}$
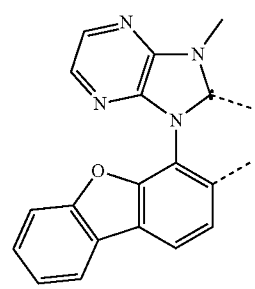
$L_{B28}$
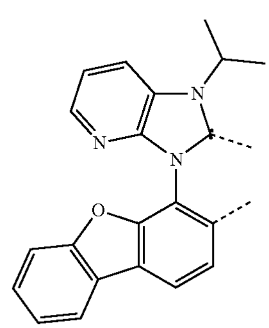

-continued
$L_{B29}$
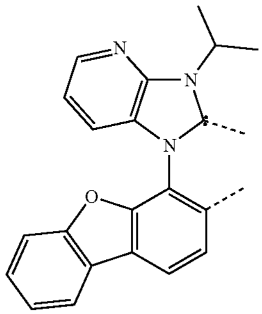
$L_{B30}$
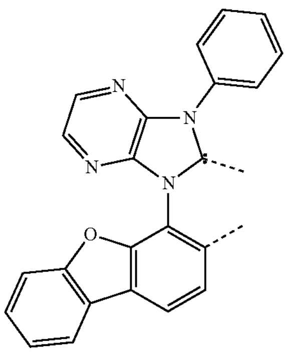
$L_{B31}$
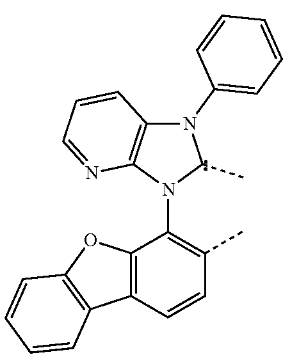
$L_{B32}$
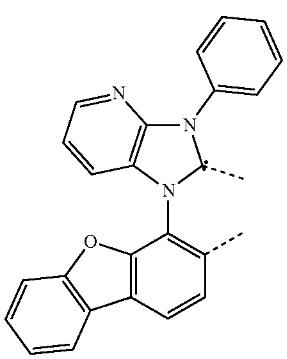
-continued
$L_{B33}$
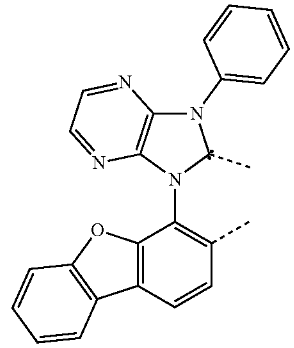
$L_{B34}$
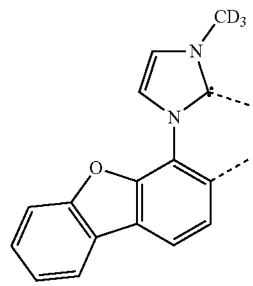
$L_{B35}$
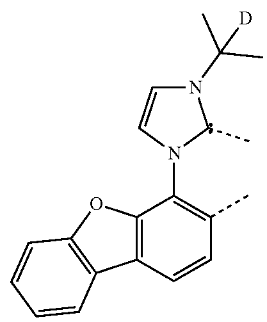
$L_{B36}$
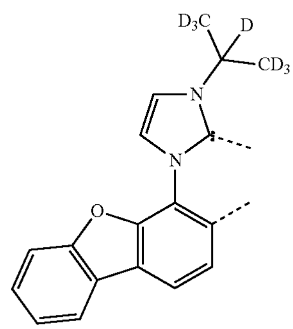
$L_{B37}$
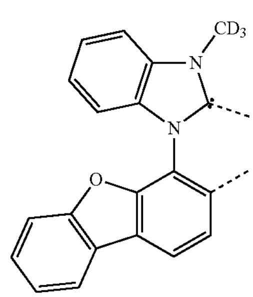

-continued
$L_{B38}$
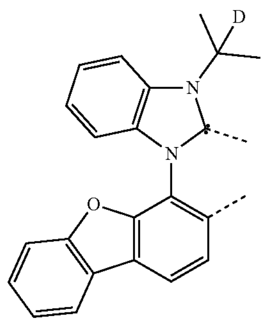
$L_{B39}$
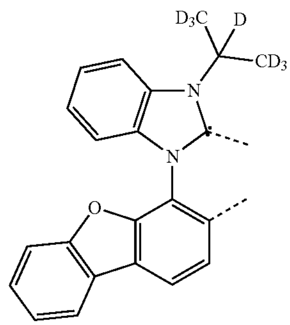
$L_{B40}$
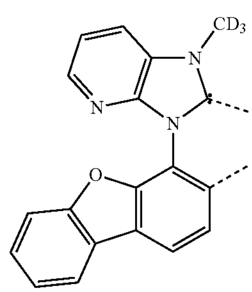
$L_{B41}$
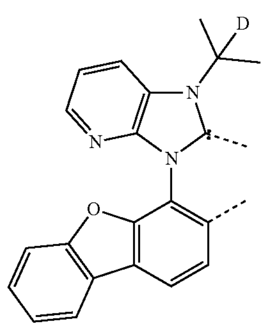
$L_{B42}$
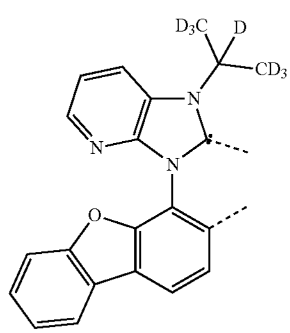
-continued
$L_{B43}$
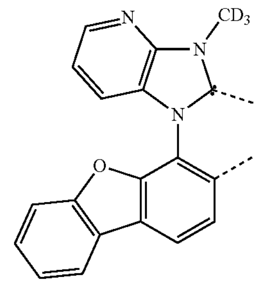
$L_{B44}$
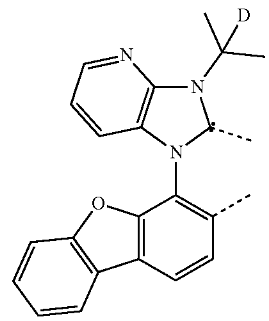
$L_{B45}$
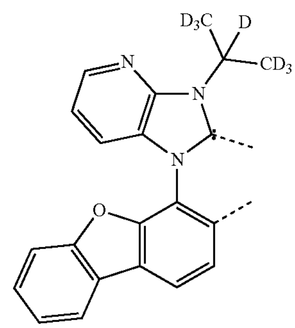
$L_{B46}$
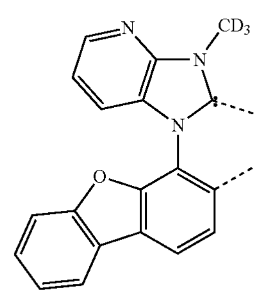
$L_{B47}$
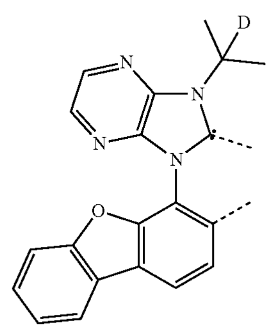

-continued
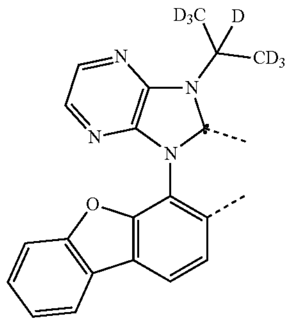
$L_{B48}$
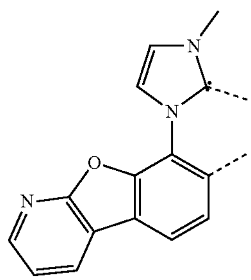
$L_{B49}$
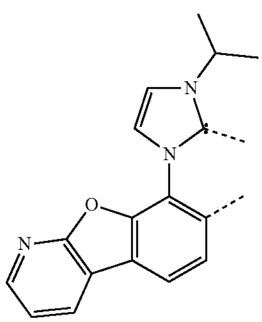
$L_{B50}$
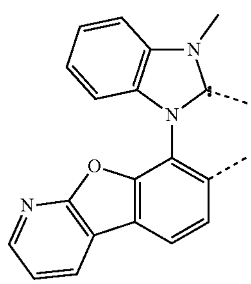
$L_{B51}$
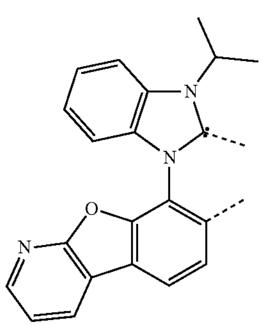
$L_{B52}$
-continued
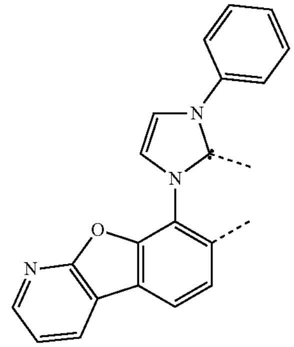
$L_{B53}$
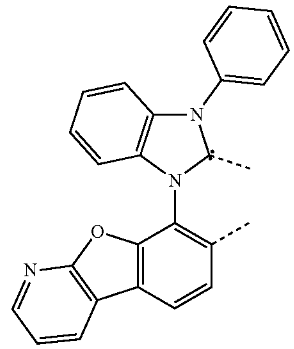
$L_{B54}$
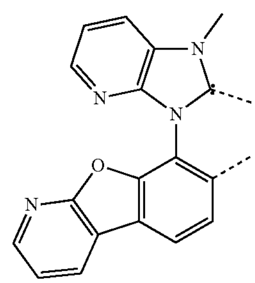
$L_{B55}$
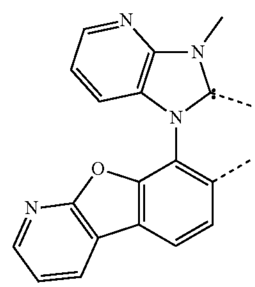
$L_{B56}$
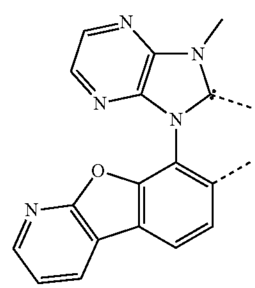
$L_{B57}$ -continued
$L_{B58}$
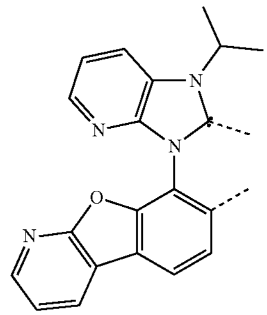
$L_{B59}$
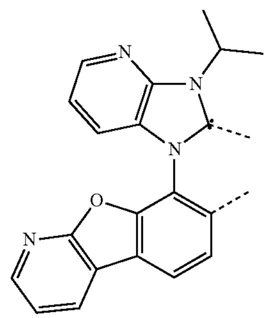
$L_{B60}$
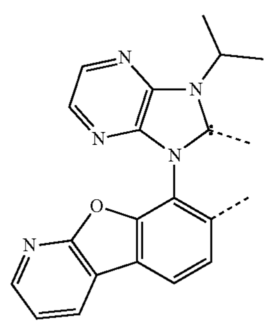
$L_{B61}$
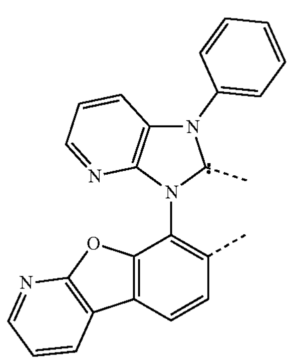
-continued
$L_{B62}$
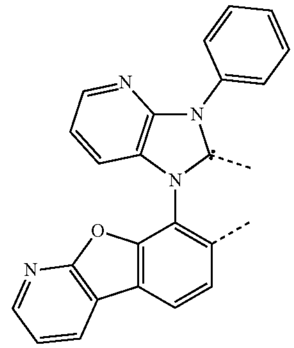
$L_{B63}$
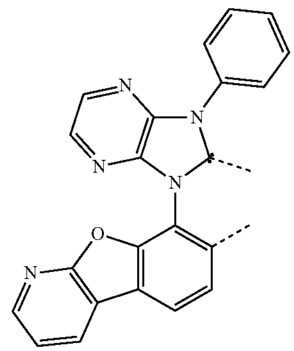
$L_{B64}$
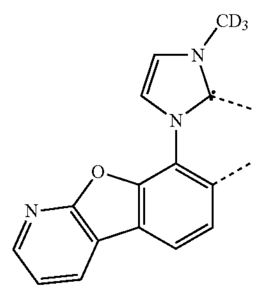
$L_{B65}$
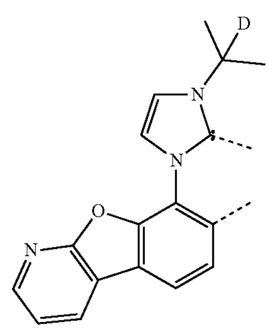
$L_{B66}$
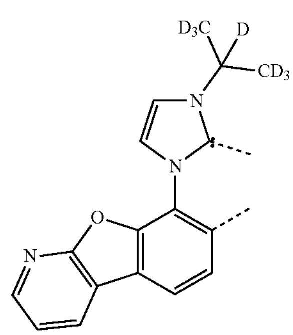

-continued
$L_{B67}$
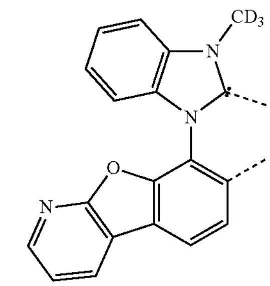
$L_{B68}$
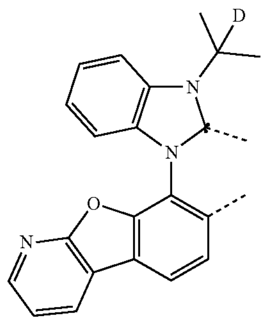
$L_{B69}$
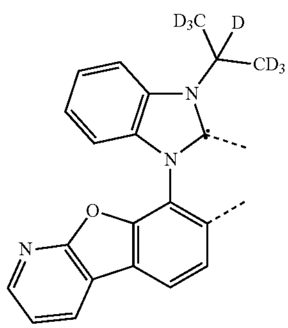
$L_{B70}$
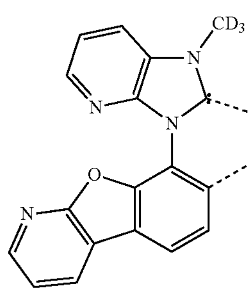
$L_{B71}$
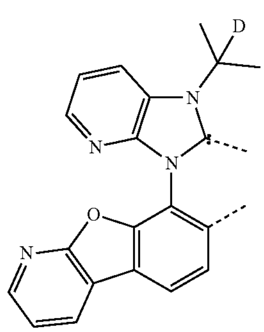
-continued
$L_{B72}$
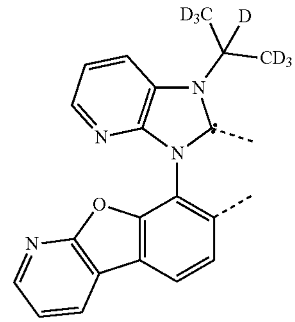
$L_{B73}$
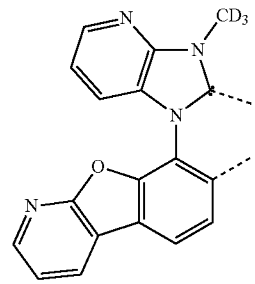
$L_{B74}$
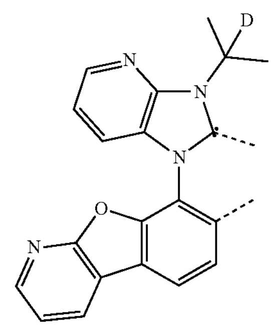
$L_{B75}$
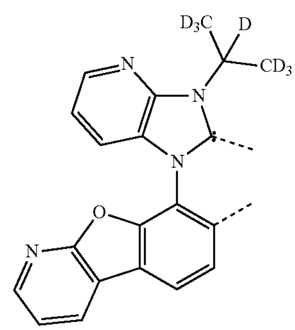
$L_{B76}$
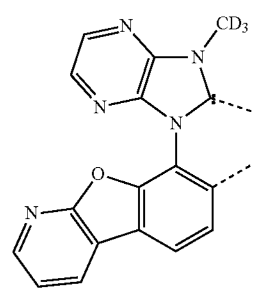

-continued
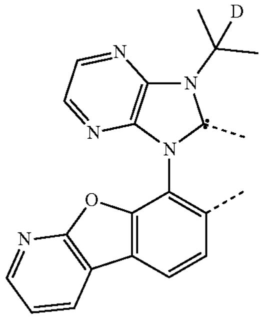
$L_{B77}$
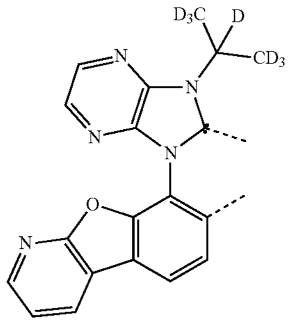
$L_{B78}$
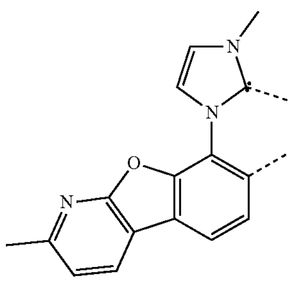
$L_{B79}$
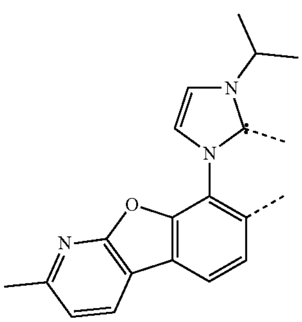
$L_{B80}$
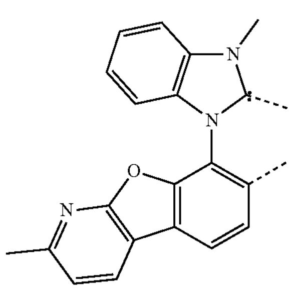
$L_{B81}$
-continued
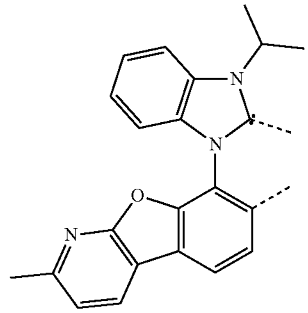
$L_{B82}$
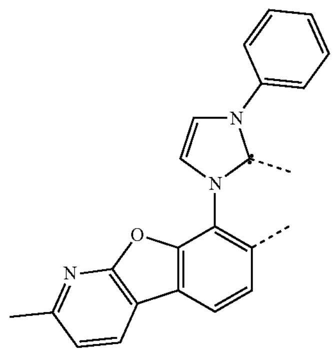
$L_{B83}$
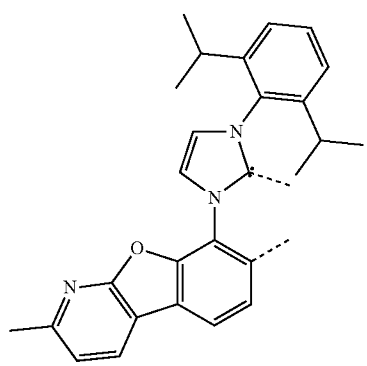
$L_{B84}$
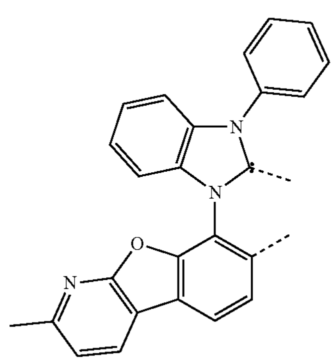
$L_{B85}$ -continued
$L_{B86}$
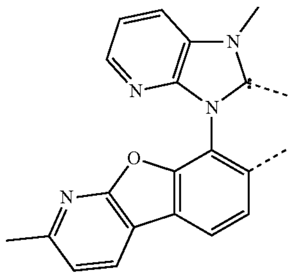
$L_{B87}$
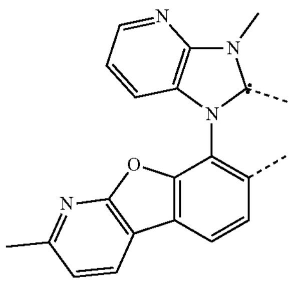
$L_{B88}$
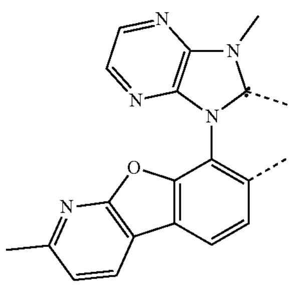
$L_{B89}$
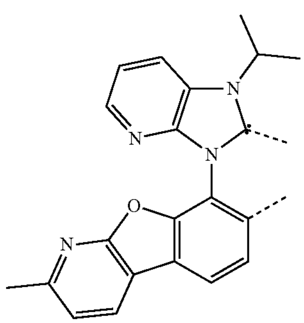
$L_{B90}$
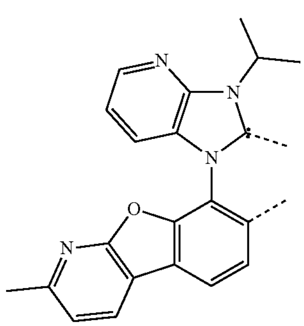
-continued
$L_{B91}$
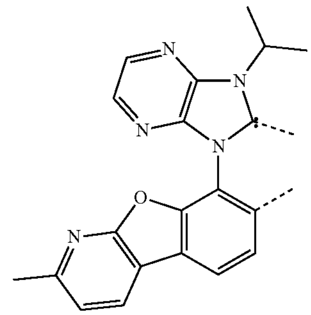
$L_{B92}$
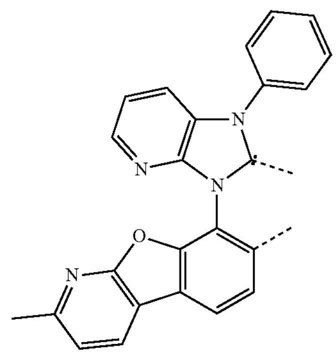
$L_{B93}$
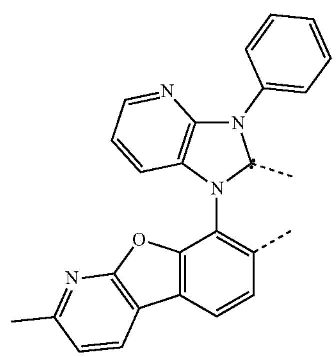
$L_{B94}$
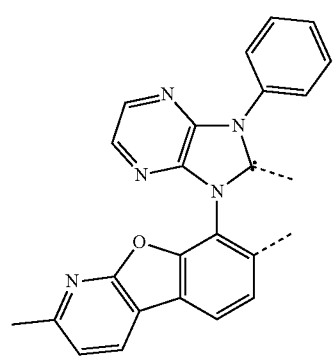

-continued
$L_{B95}$
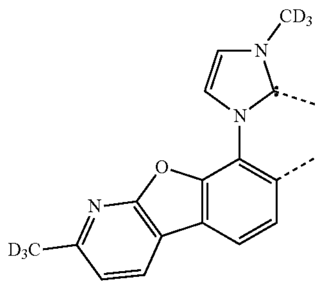
$L_{B96}$
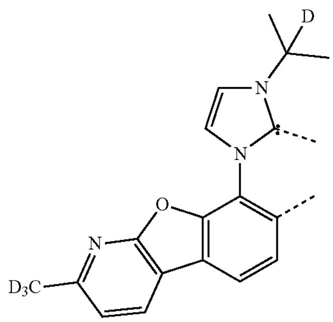
$L_{B97}$
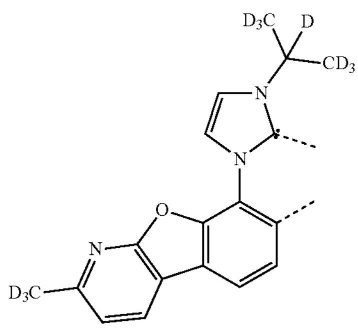
$L_{B98}$
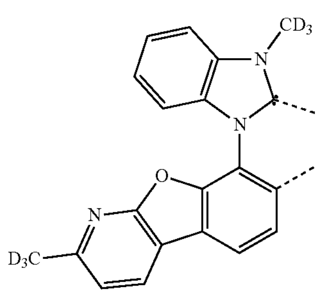
$L_{B99}$
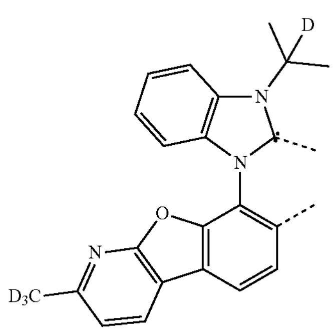
-continued
$L_{B100}$
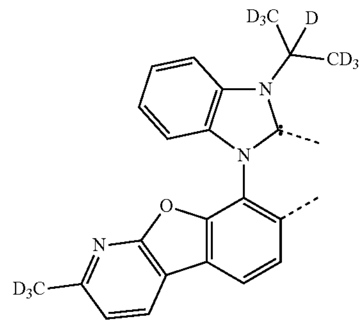
$L_{B101}$
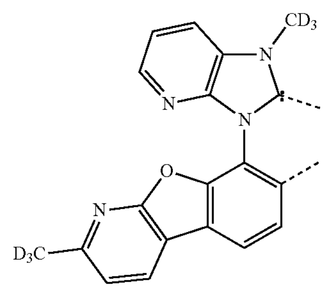
$L_{B102}$
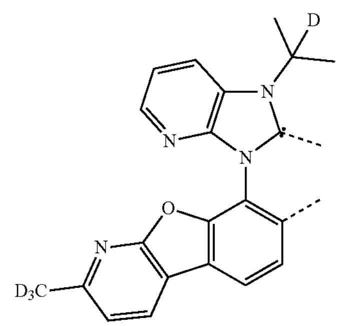
$L_{B103}$
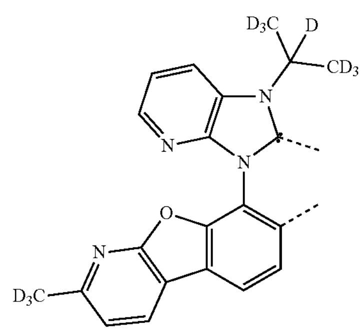
$L_{B104}$
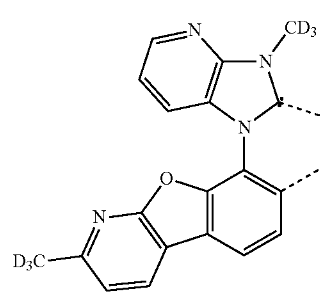

-continued
$L_{B105}$
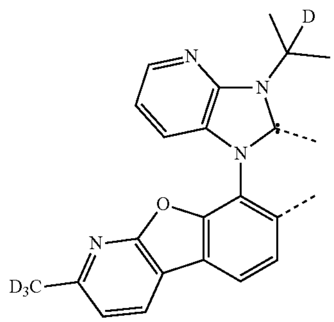
$L_{B106}$
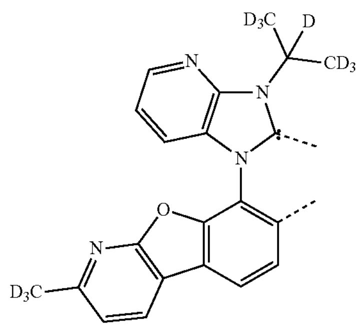
$L_{B107}$
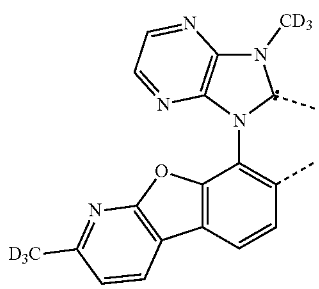
$L_{B108}$
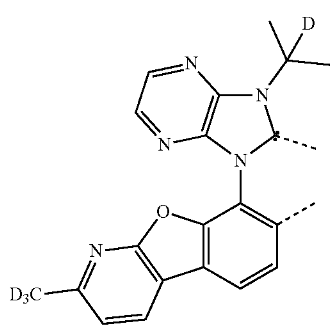
$L_{B109}$
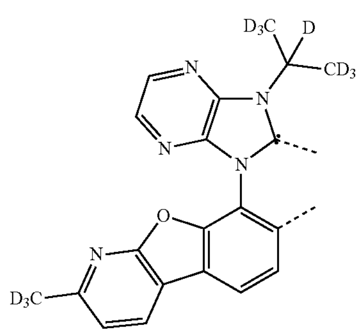
-continued
$L_{B110}$
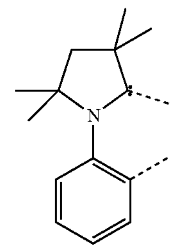
$L_{B111}$
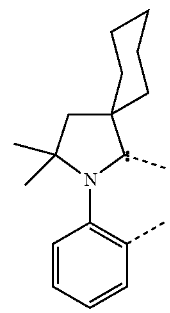
$L_{B112}$
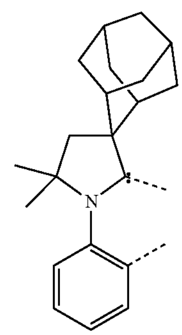
$L_{B113}$
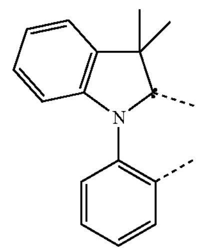
$L_{B114}$
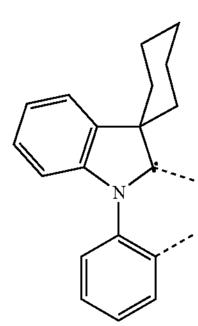

$L_{B115}$
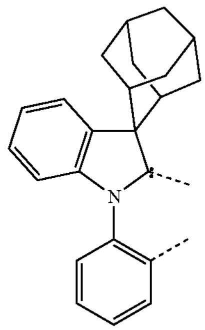
$L_{B116}$
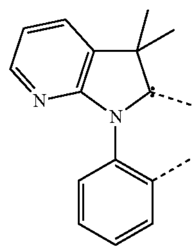
$L_{B117}$
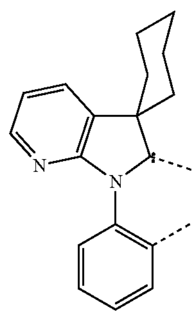
$L_{B118}$
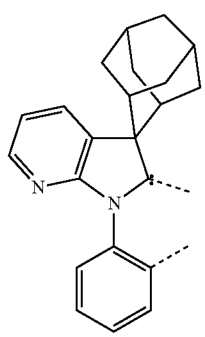
$L_{B119}$
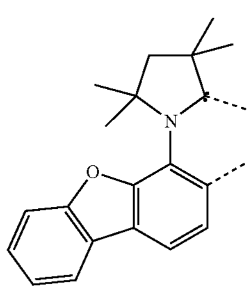
$L_{B120}$
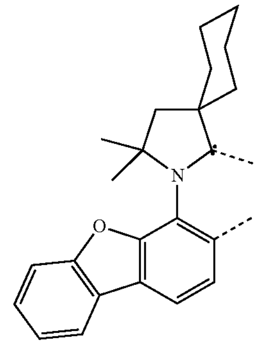
$L_{B121}$
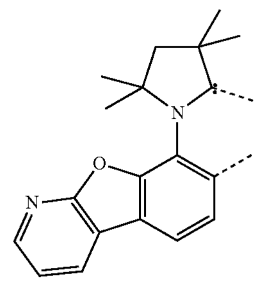
$L_{B122}$
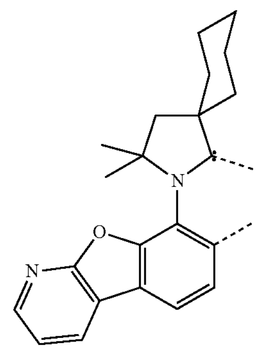
$L_{B123}$
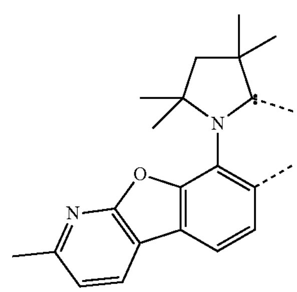
$L_{B124}$
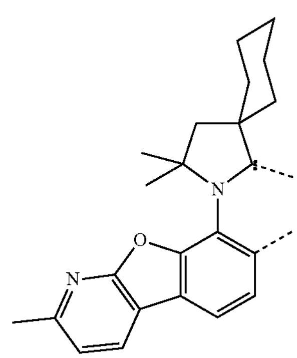

-continued
$L_{B125}$
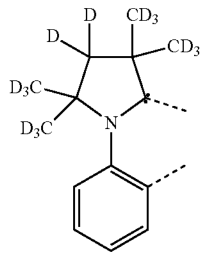
$L_{B126}$
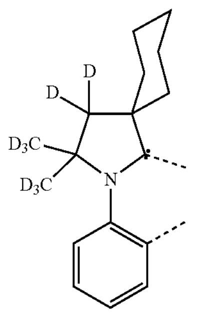
$L_{B127}$
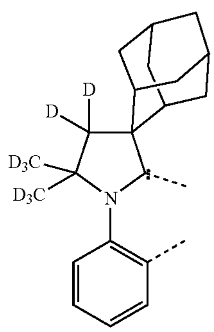
$L_{B128}$
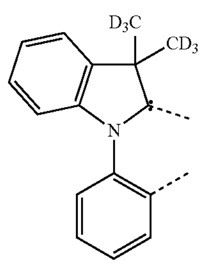
$L_{B129}$
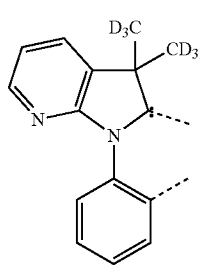
-continued
$L_{B130}$
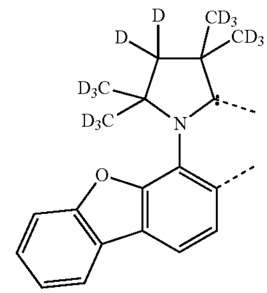
$L_{B131}$
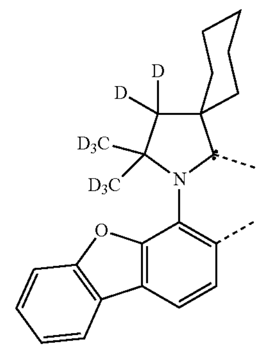
$L_{B132}$
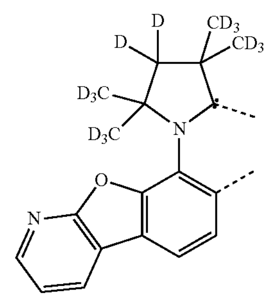
$L_{B133}$
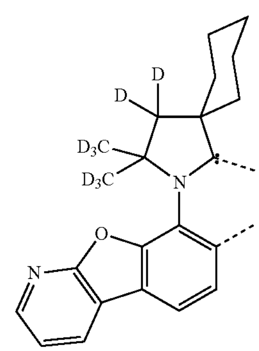
$L_{B134}$
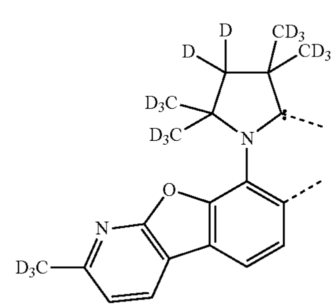

$L_{B135}$
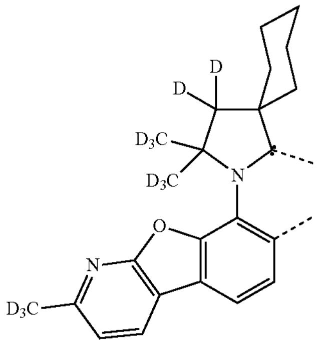
$L_{B136}$
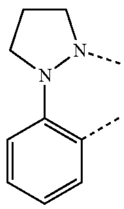
$L_{B137}$
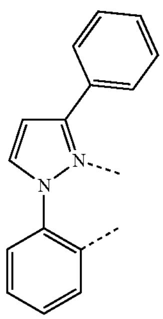
$L_{B138}$
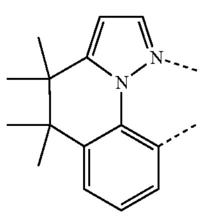
$L_{B139}$
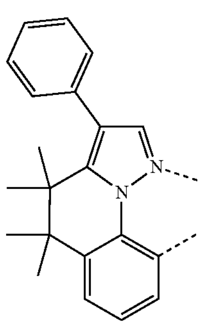
$L_{B140}$
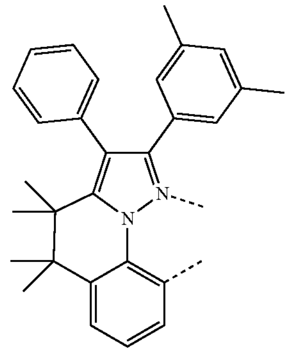
$L_{B141}$
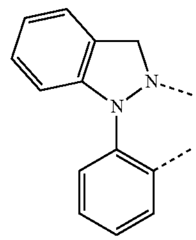
$L_{B142}$
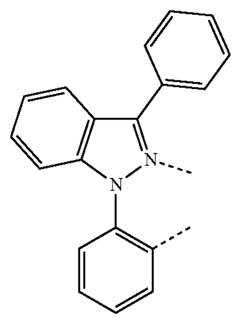
$L_{B143}$
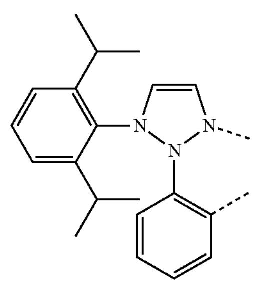
$L_{B144}$
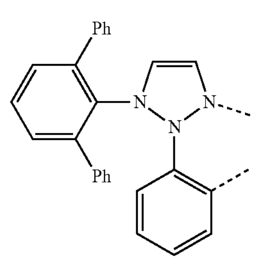

$L_{B145}$
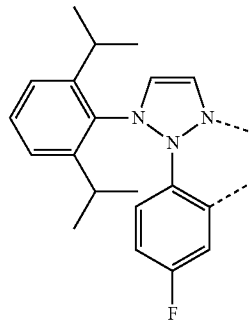
$L_{B146}$
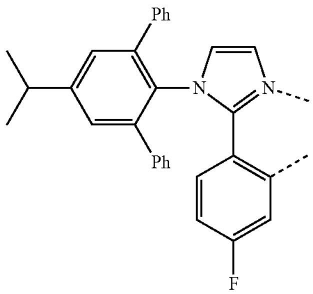
$L_{B147}$
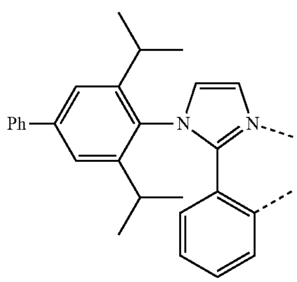
$L_{B148}$
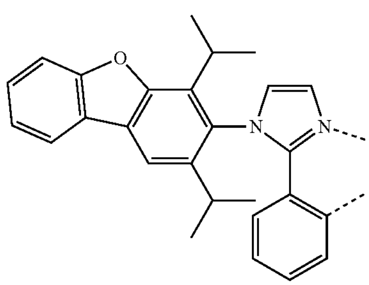
$L_{B149}$
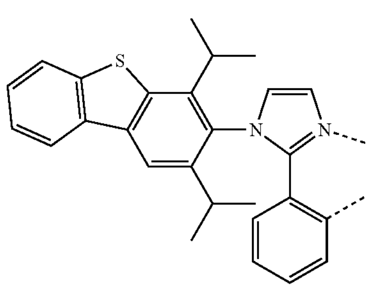
$L_{B150}$
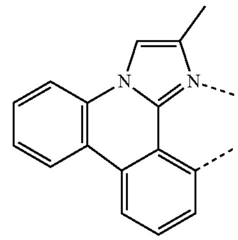
$L_{B151}$
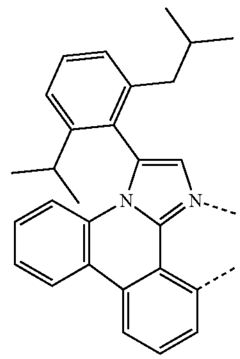
$L_{B152}$
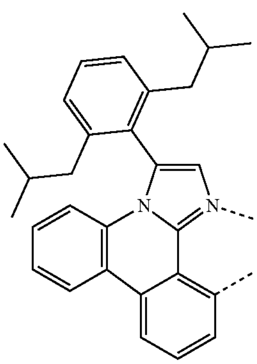
$L_{B153}$
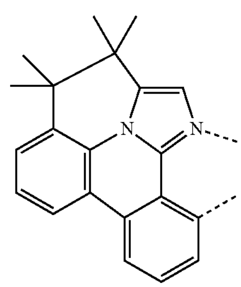
$L_{B154}$
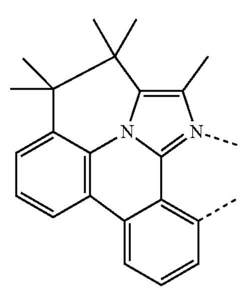

$L_{B155}$
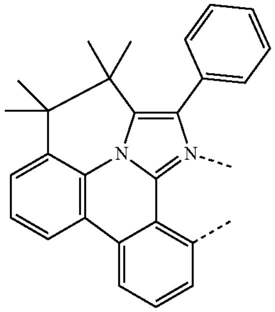
$L_{B156}$
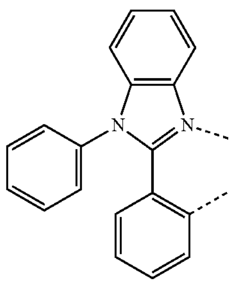
$L_{B157}$
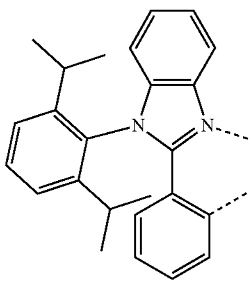
$L_{B158}$
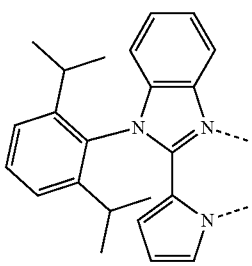
$L_{B159}$
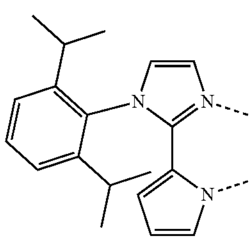
$L_{B160}$
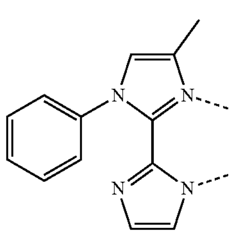
$L_{B161}$
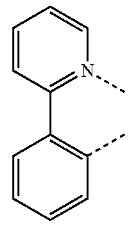
$L_{B162}$
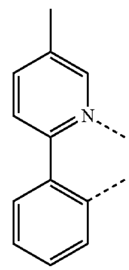
$L_{B163}$
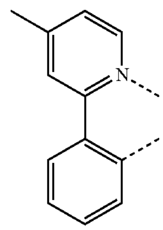
$L_{B164}$
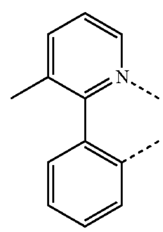
$L_{B165}$
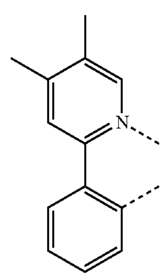
$L_{B166}$
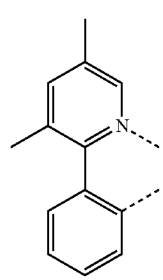

-continued
$L_{B167}$
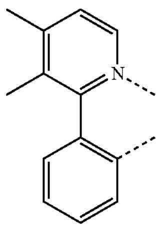
$L_{B168}$
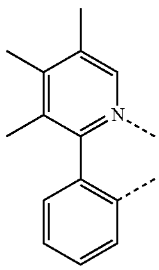
$L_{B169}$
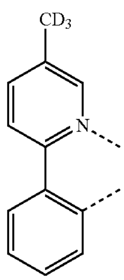
$L_{B170}$
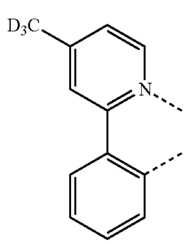
$L_{B171}$
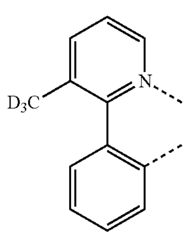
$L_{B172}$
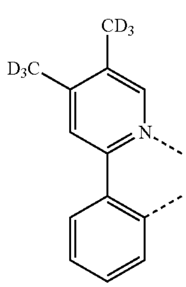
-continued
$L_{B173}$
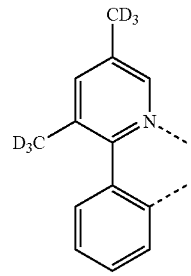
$L_{B174}$
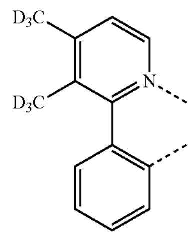
$L_{B175}$
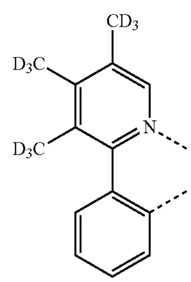
$L_{B176}$
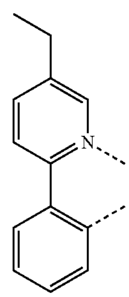
$L_{B177}$
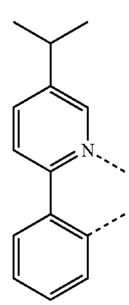

$L_{B178}$
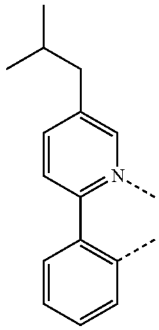
$L_{B179}$
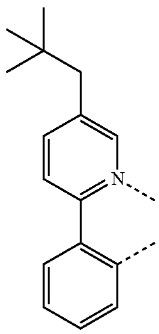
$L_{B180}$
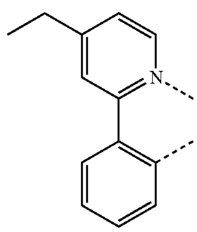
$L_{B181}$
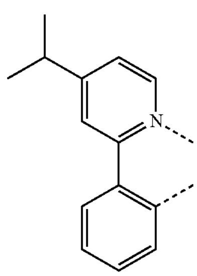
$L_{B182}$
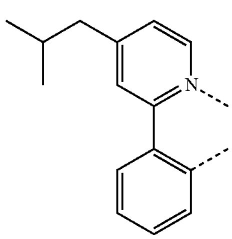
$L_{B183}$
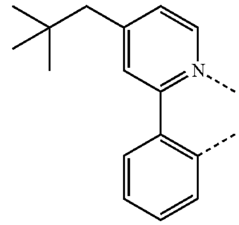
$L_{B184}$
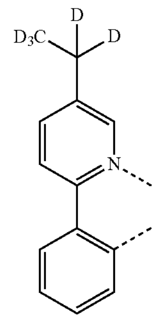
$L_{B185}$
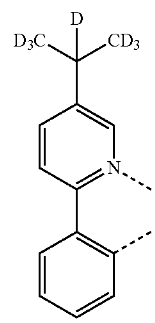
$L_{B186}$
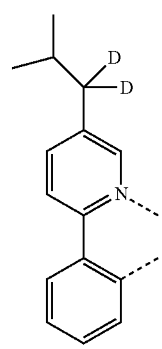
$L_{B187}$
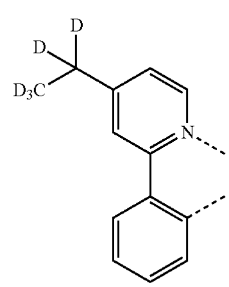

-continued
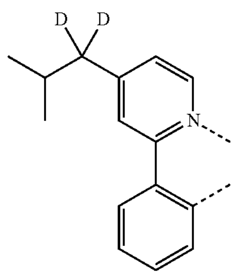
$L_{B188}$
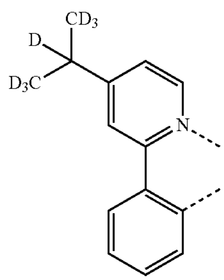
$L_{B189}$
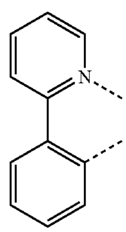
$L_{B190}$
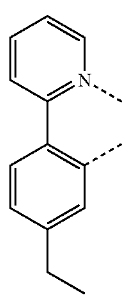
$L_{B191}$
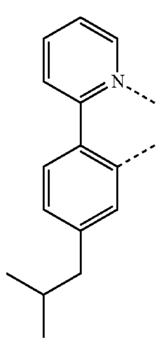
$L_{B192}$
-continued
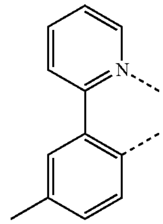
$L_{B193}$
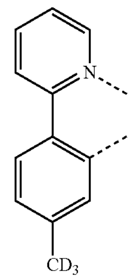
$L_{B194}$
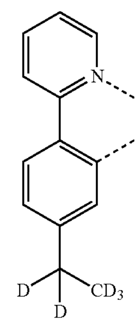
$L_{B195}$
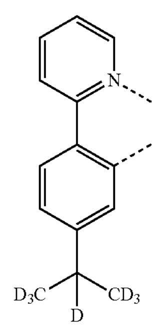
$L_{B196}$
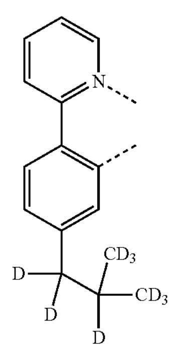
$L_{B197}$ -continued
$L_{B198}$
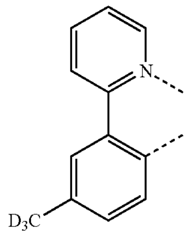
$L_{B199}$
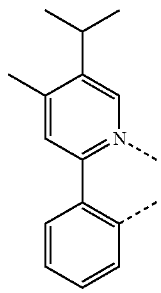
$L_{B200}$
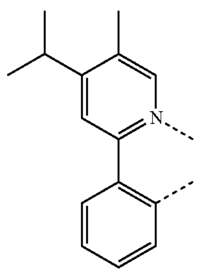
$L_{B201}$
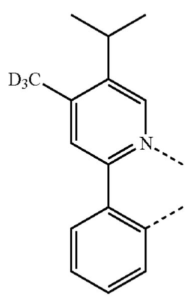
$L_{B202}$
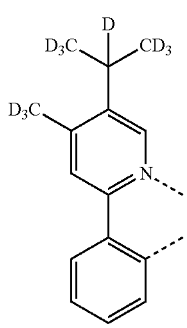
-continued
$L_{B203}$
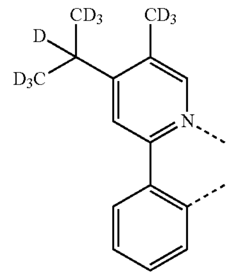
$L_{B204}$
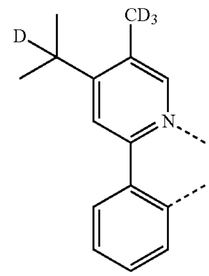
$L_{B205}$
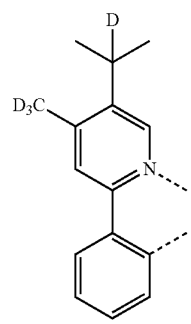
$L_{B206}$
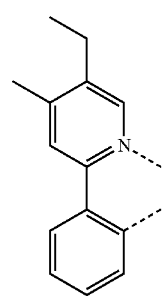
$L_{B207}$
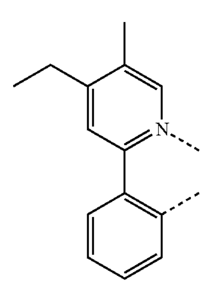

-continued
$L_{B208}$
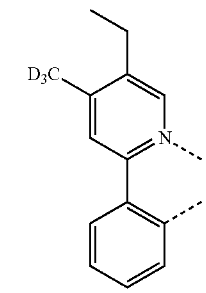
$L_{B209}$
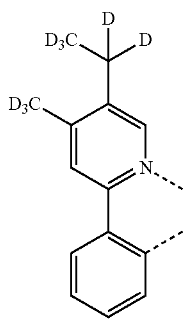
$L_{B210}$
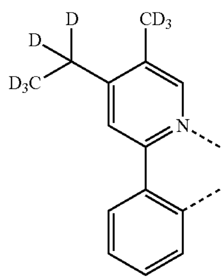
$L_{B211}$
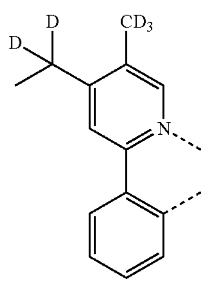
$L_{B212}$
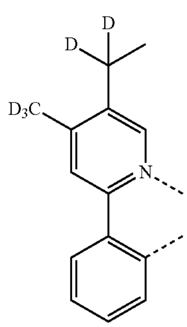
-continued
$L_{B213}$
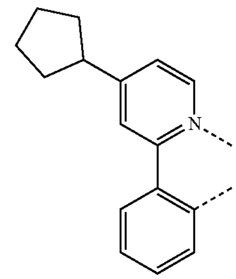
$L_{B214}$
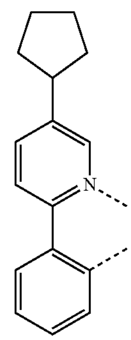
$L_{B215}$
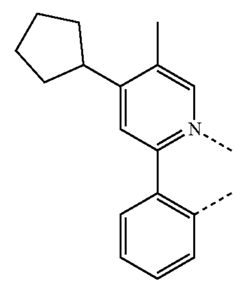
$L_{B216}$
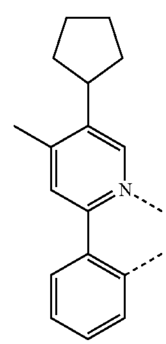
$L_{B217}$
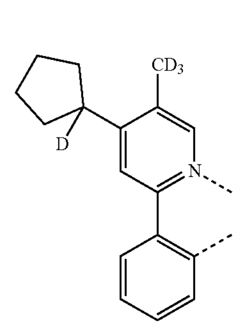

-continued
$L_{B218}$
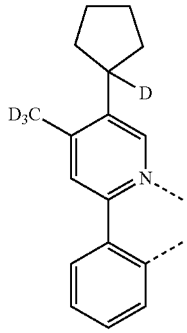
$L_{B219}$
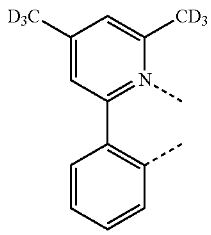
$L_{B220}$
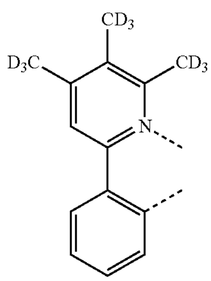
$L_{B221}$
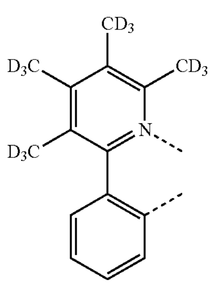
$L_{B222}$
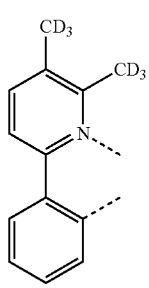
-continued
$L_{B223}$
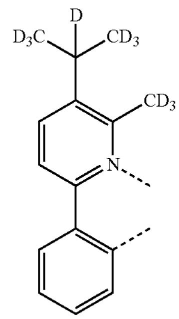
$L_{B224}$
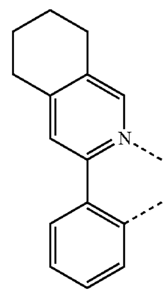
$L_{B225}$
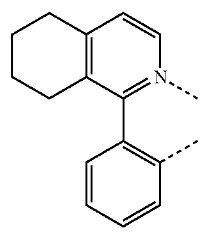
$L_{B226}$
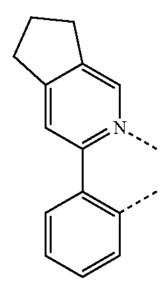
$L_{B227}$
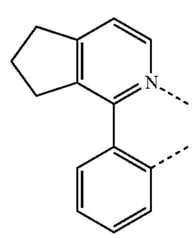

-continued
$L_{B228}$
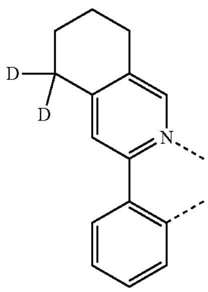
$L_{B229}$
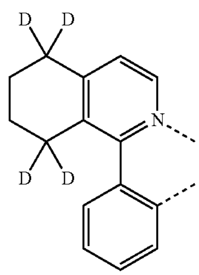
$L_{B230}$
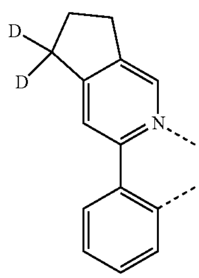
$L_{B231}$
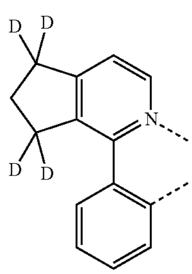
$L_{B232}$
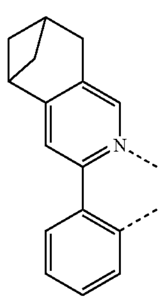
-continued
$L_{B233}$
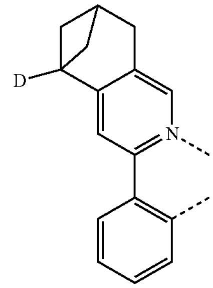
$L_{B234}$
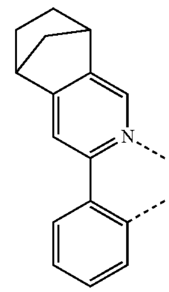
$L_{B235}$
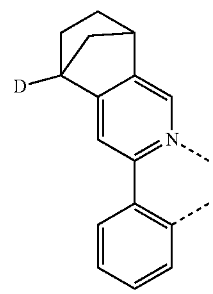
$L_{B236}$
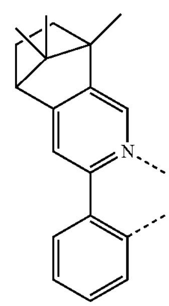
$L_{B237}$
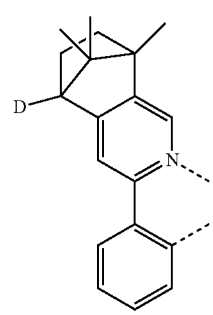

-continued
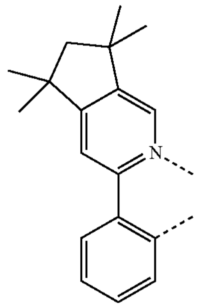
$L_{B238}$
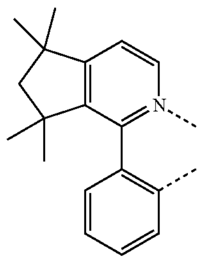
$L_{B239}$
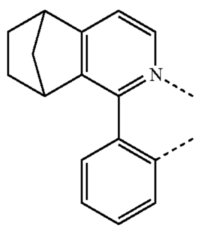
$L_{B240}$
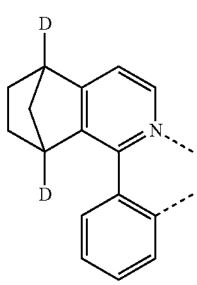
$L_{B241}$
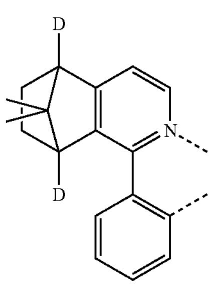
$L_{B242}$
-continued
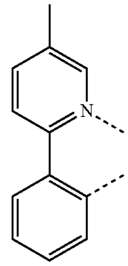
$L_{B243}$
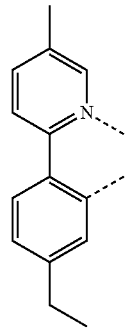
$L_{B244}$
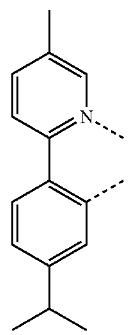
$L_{B245}$
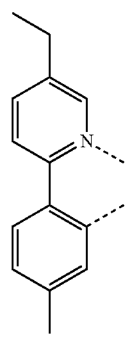
$L_{B246}$
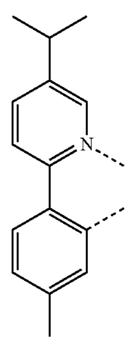
$L_{B247}$ -continued
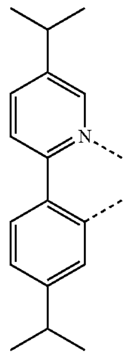
$L_{B248}$
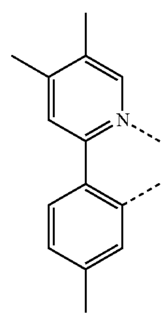
$L_{B249}$
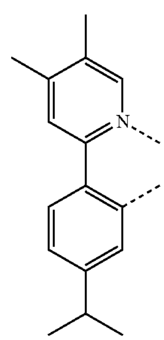
$L_{B250}$
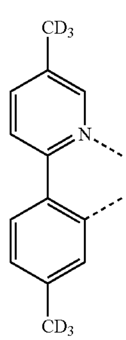
$L_{B251}$
-continued
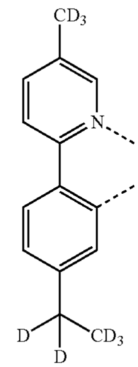
$L_{B252}$
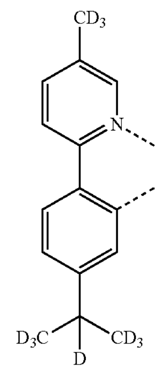
$L_{B253}$
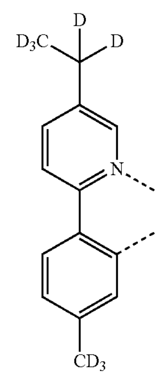
$L_{B254}$
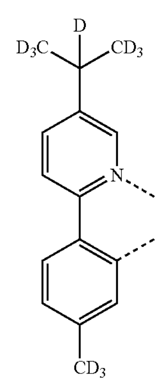
$L_{B255}$ $L_{B256}$
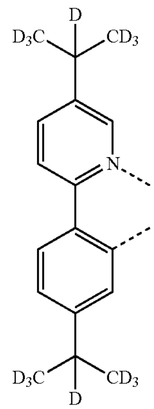
$L_{B257}$
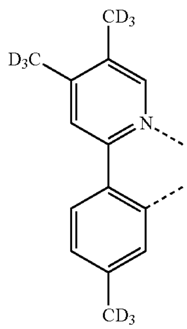
$L_{B258}$
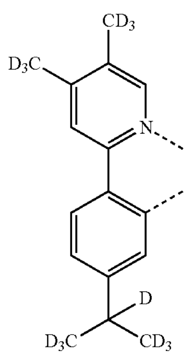
$L_{B259}$
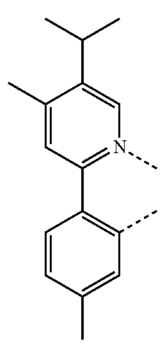
$L_{B260}$
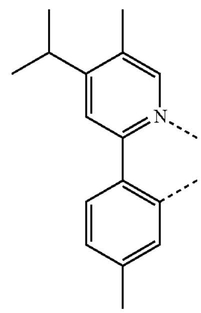
$L_{B261}$
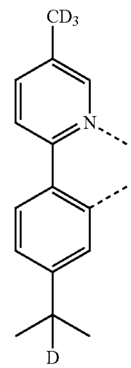
$L_{B262}$
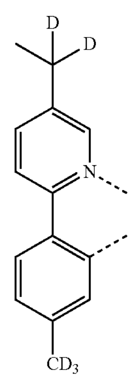
$L_{B263}$
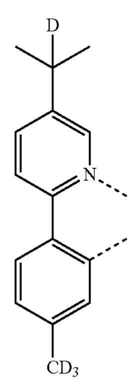

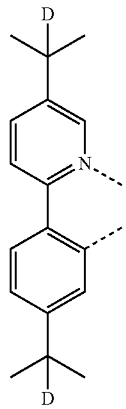
$L_{B264}$
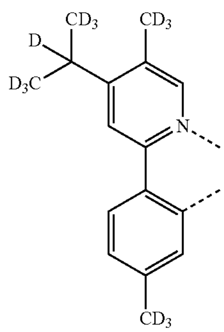
$L_{B265}$
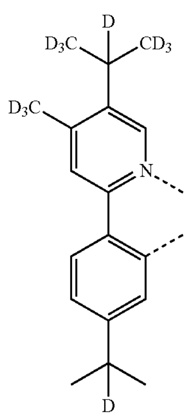
$L_{B266}$
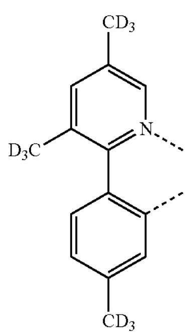
$L_{B267}$
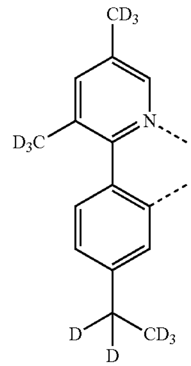
$L_{B268}$
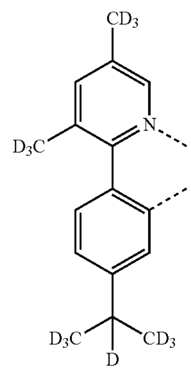
$L_{B269}$
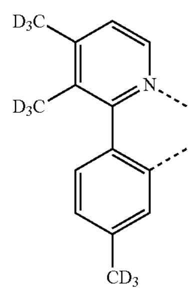
$L_{B270}$
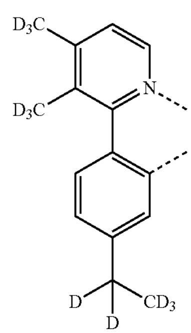
$L_{B271}$ -continued
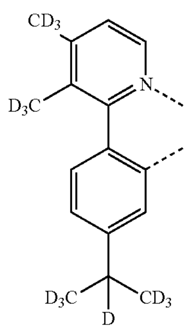
$L_{B272}$
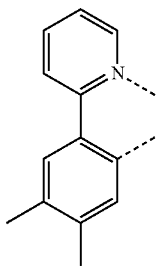
$L_{B273}$
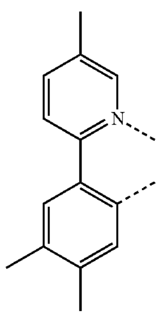
$L_{B274}$
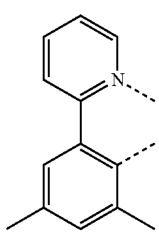
$L_{B275}$
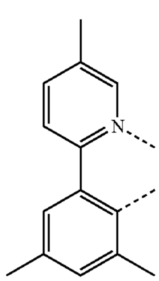
$L_{B276}$
-continued
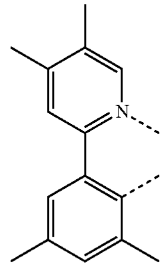
$L_{B277}$
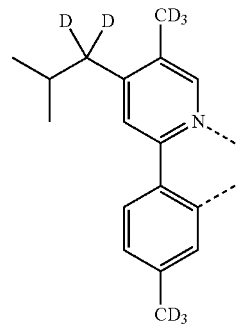
$L_{B278}$
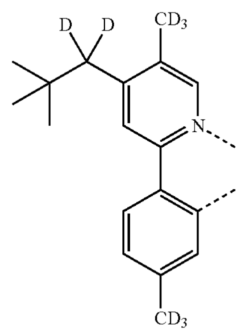
$L_{B279}$
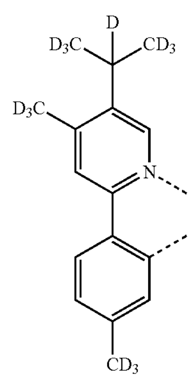
$L_{B280}$
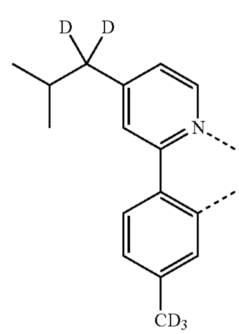
$L_{B281}$ -continued
$L_{B282}$
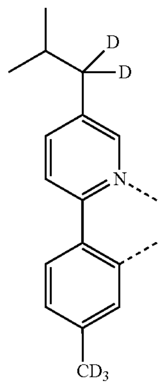
$L_{B283}$
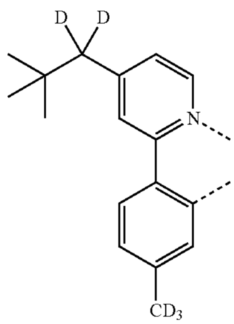
$L_{B284}$
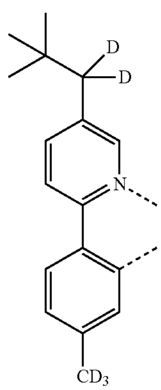
$L_{B285}$
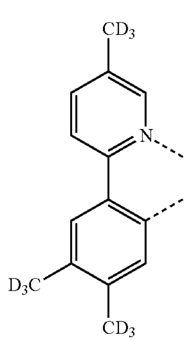
-continued
$L_{B286}$
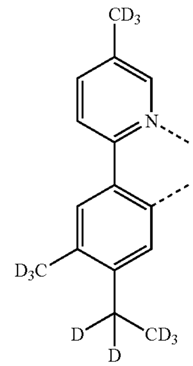
$L_{B287}$
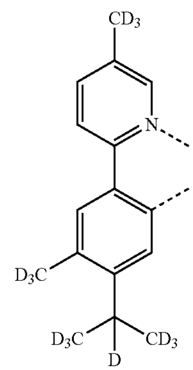
$L_{B288}$
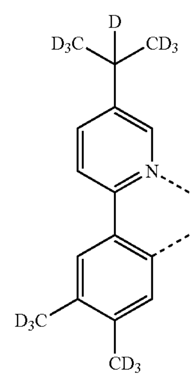
$L_{B289}$
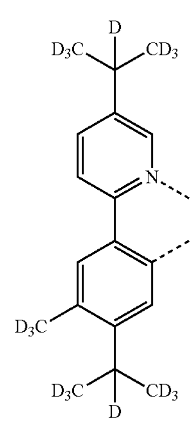

-continued
L$_{B290}$
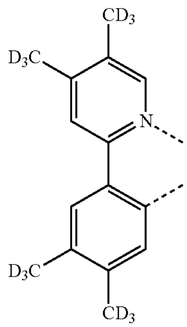
L$_{B291}$
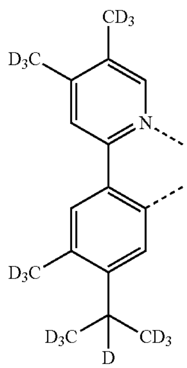
L$_{B292}$
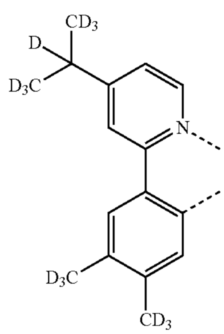
L$_{B293}$
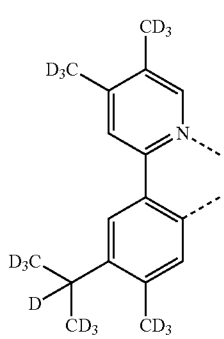
-continued
L$_{B294}$
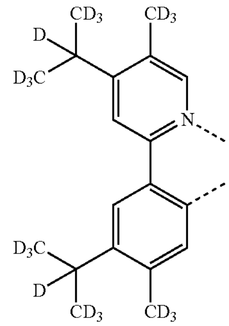
L$_{B295}$
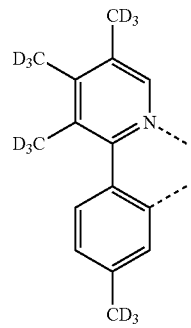
L$_{B296}$
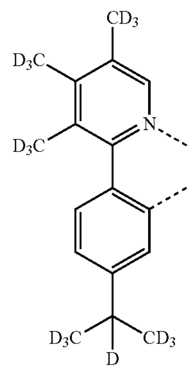
L$_{B297}$
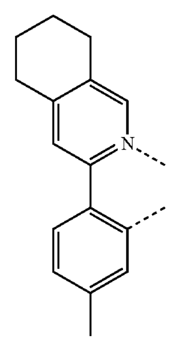
L$_{B298}$
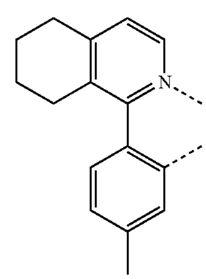

-continued
L$_{B299}$
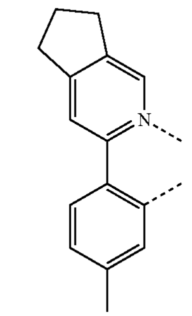
L$_{B300}$
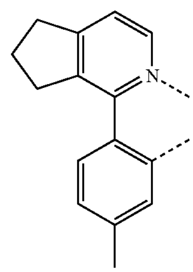
L$_{B301}$
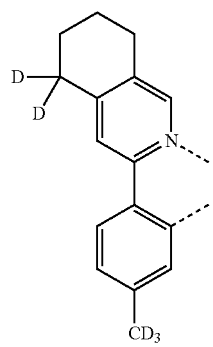
L$_{B302}$
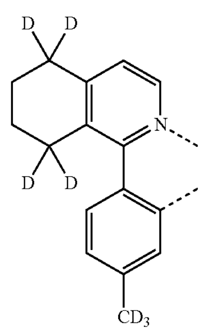
L$_{B303}$
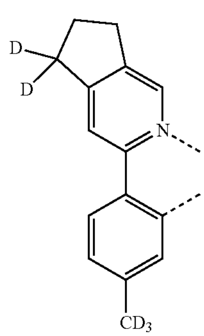
-continued
L$_{B304}$
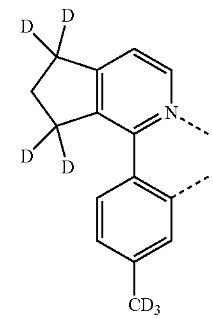
L$_{B305}$
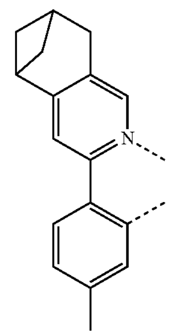
L$_{B306}$
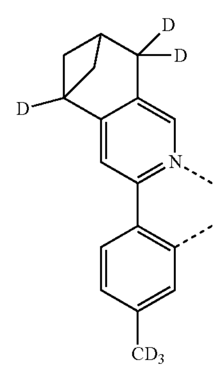
L$_{B307}$
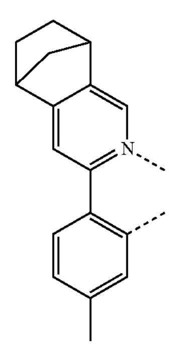

-continued
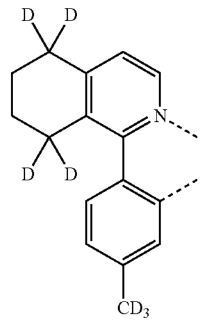
$L_{B308}$
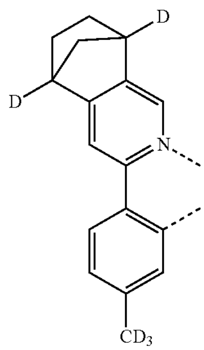
$L_{B308}$
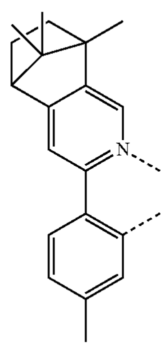
$L_{B309}$
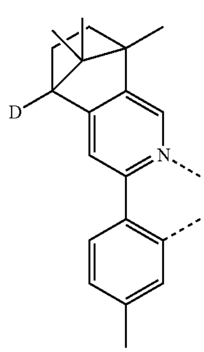
$L_{B310}$
-continued
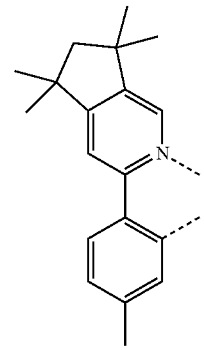
$L_{B311}$
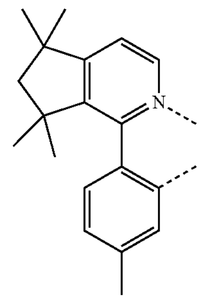
$L_{B312}$
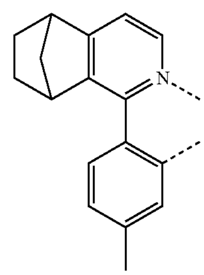
$L_{B313}$
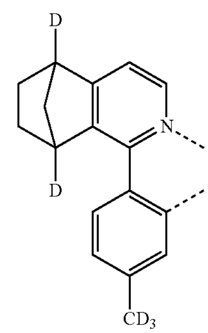
$L_{B314}$
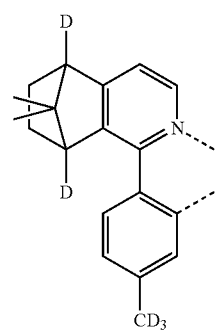
$L_{B315}$

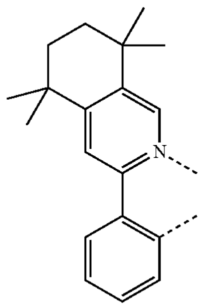
$L_{B316}$
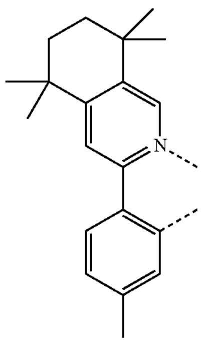
$L_{B317}$
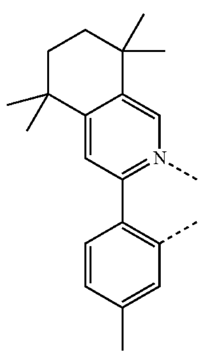
$L_{B318}$
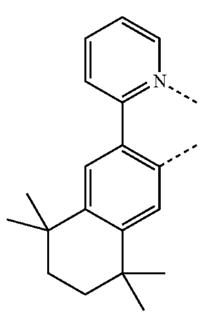
$L_{B319}$
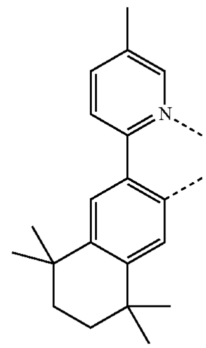
$L_{B320}$
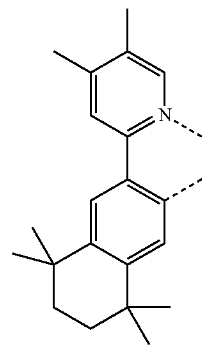
$L_{B321}$
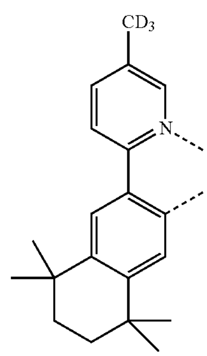
$L_{B322}$
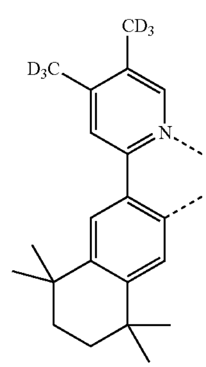
$L_{B323}$ $L_{B324}$
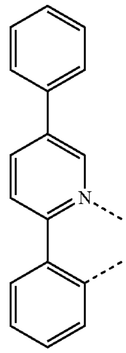
$L_{B325}$
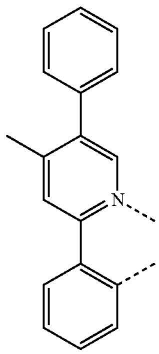
$L_{B326}$
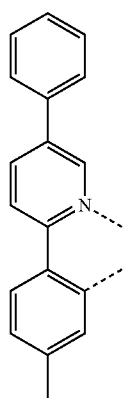
$L_{B327}$
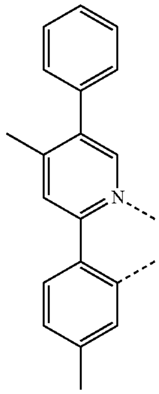
$L_{B328}$
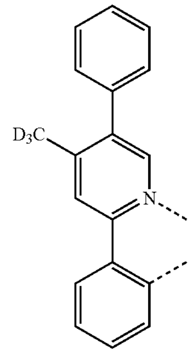
$L_{B329}$
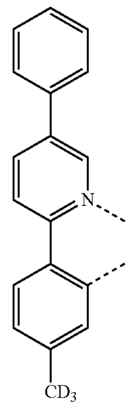
$L_{B330}$
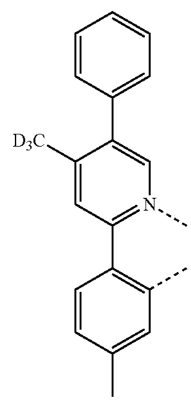
$L_{B331}$
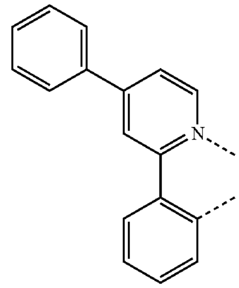

-continued
$L_{B332}$
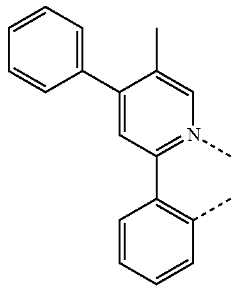
$L_{B333}$
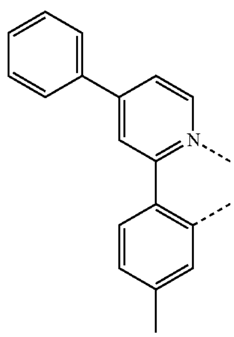
$L_{B334}$
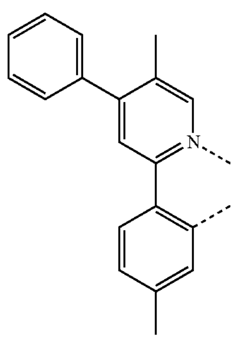
$L_{B335}$
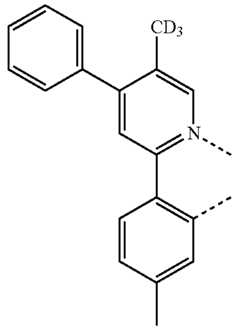
-continued
$L_{B336}$
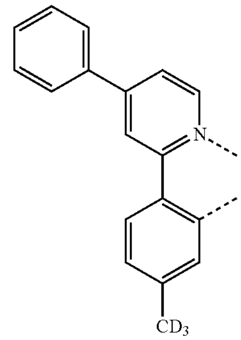
$L_{B337}$
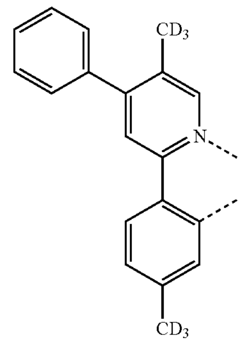
$L_{B338}$
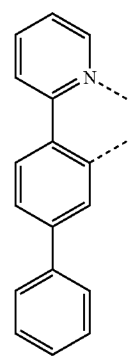
$L_{B339}$
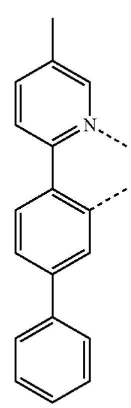

-continued
$L_{B340}$
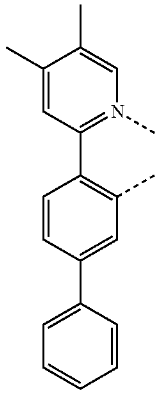
$L_{B341}$
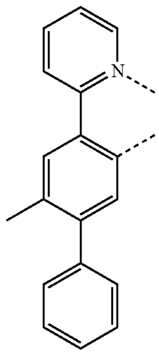
$L_{B342}$
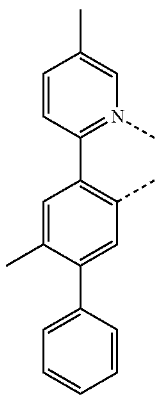
$L_{B343}$
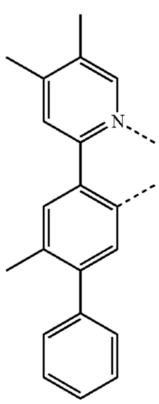
-continued
$L_{B344}$
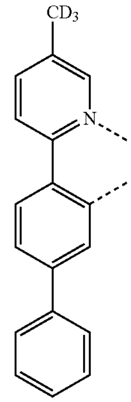
$L_{B345}$
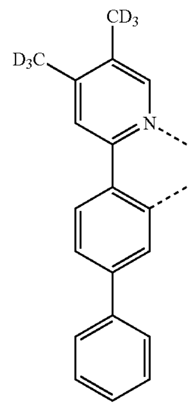
$L_{B346}$
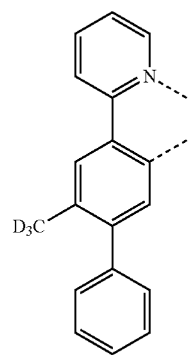
$L_{B347}$
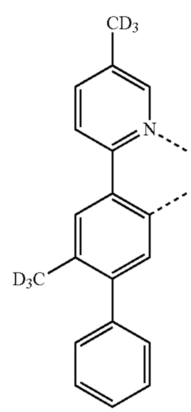

-continued
$L_{B348}$
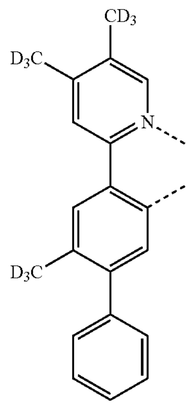
$L_{B349}$
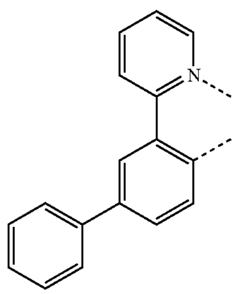
$L_{B350}$
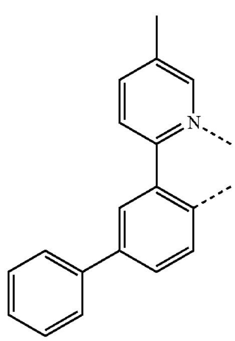
$L_{B351}$
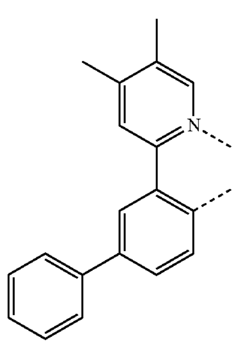
-continued
$L_{B352}$
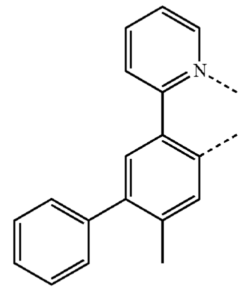
$L_{B353}$
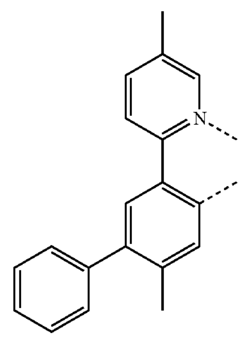
$L_{B354}$
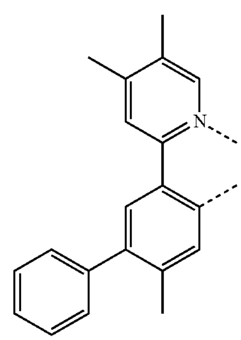
$L_{B355}$
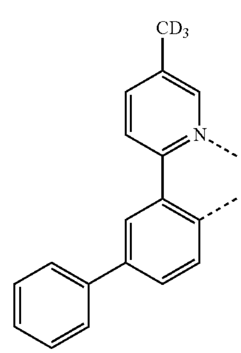

-continued
L$_{B356}$
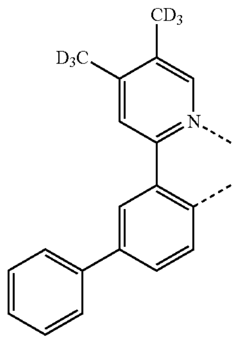
L$_{B357}$
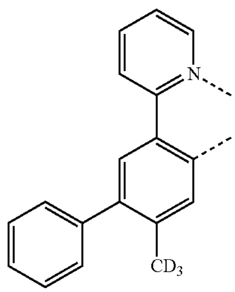
L$_{B358}$
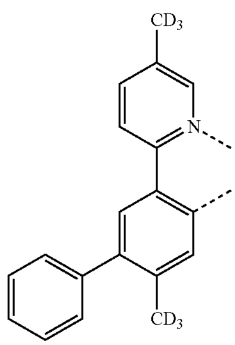
L$_{B359}$
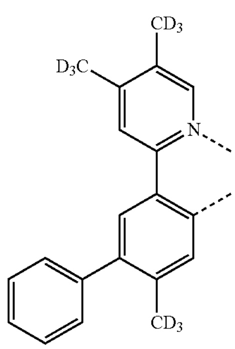
L$_{B360}$
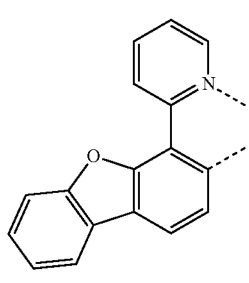
-continued
L$_{B361}$
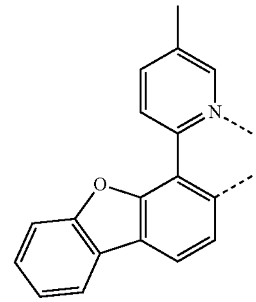
L$_{B362}$
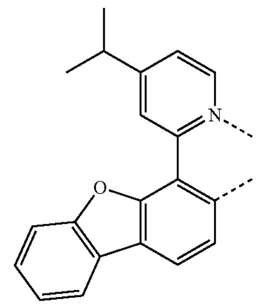
L$_{B363}$
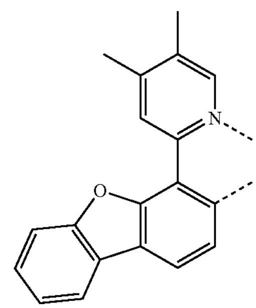
L$_{B364}$
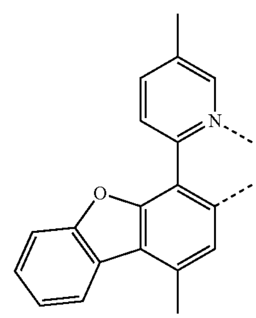
L$_{B365}$
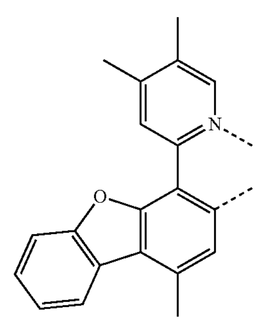

$L_{B366}$
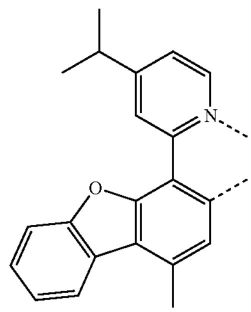
$L_{B367}$
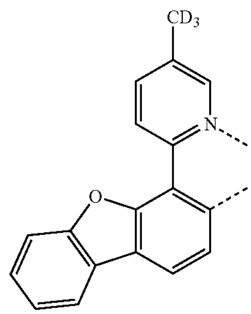
$L_{B368}$
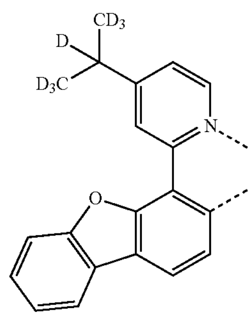
$L_{B369}$
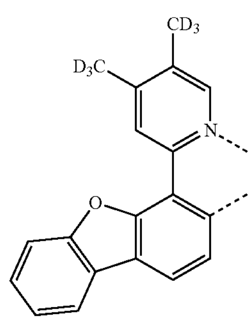
$L_{B370}$
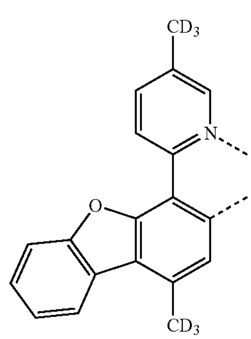
$L_{B371}$
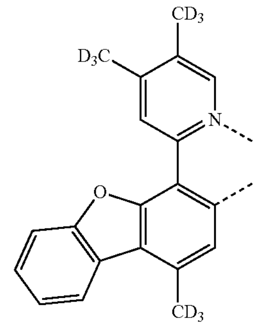
$L_{B372}$
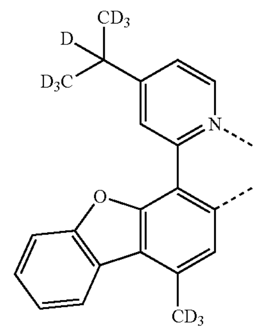
$L_{B373}$
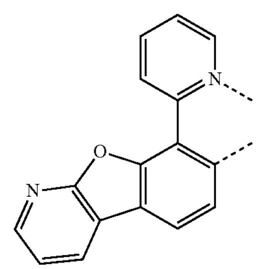
$L_{B374}$
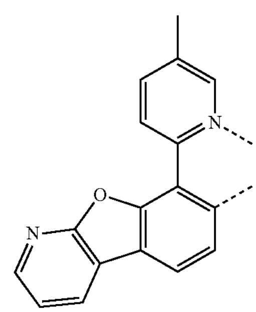
$L_{B375}$
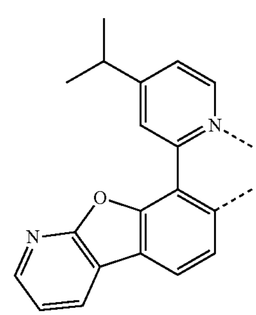

-continued
$L_{B376}$
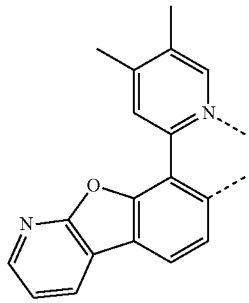
$L_{B377}$
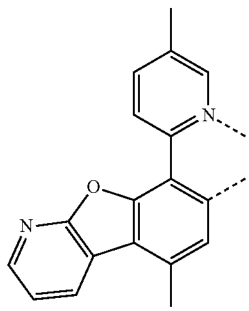
$L_{B377}$
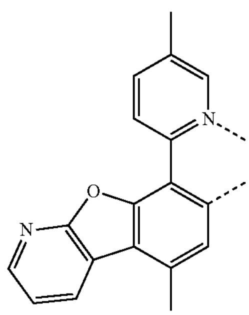
$L_{B378}$
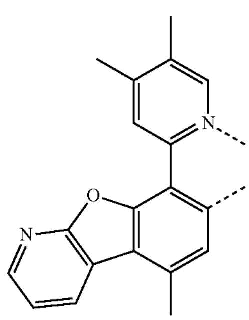
$L_{B379}$
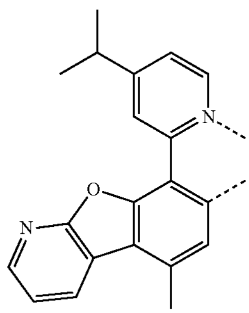
-continued
$L_{B380}$
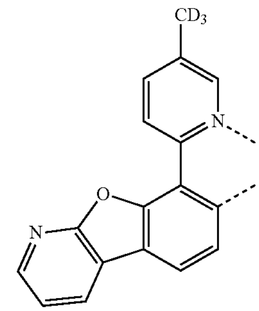
$L_{B381}$
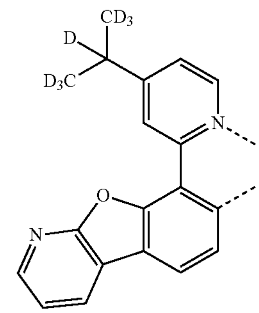
$L_{B382}$
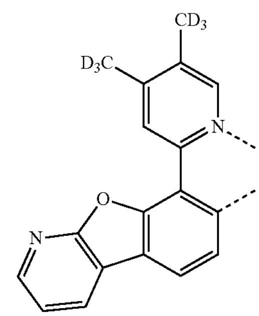
$L_{B383}$
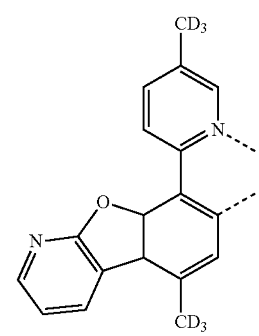
$L_{B384}$
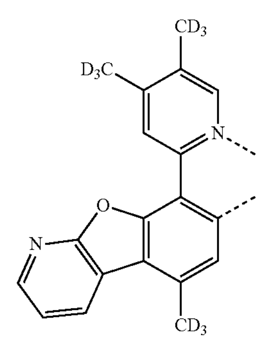

$L_{B385}$
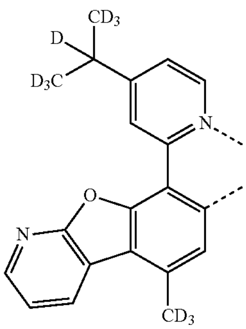
$L_{B386}$
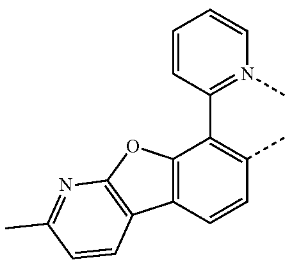
$L_{B387}$
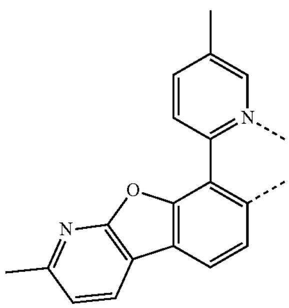
$L_{B388}$
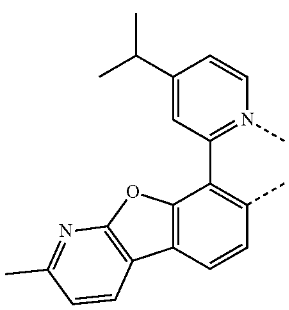
$L_{B389}$
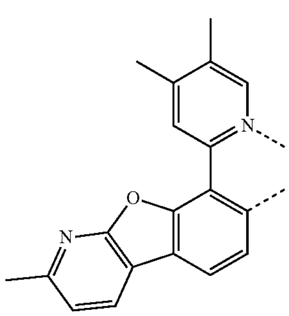
$L_{B390}$
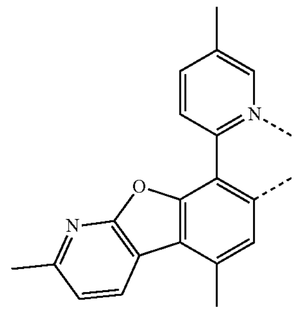
$L_{B391}$
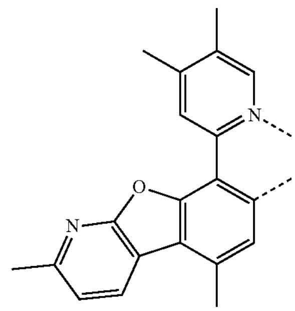
$L_{B392}$
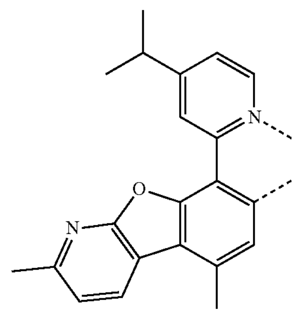
$L_{B393}$
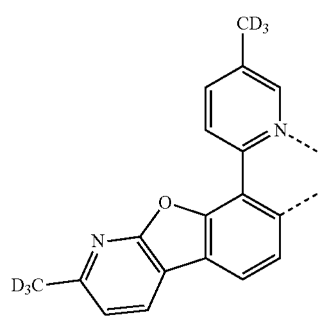
$L_{B394}$
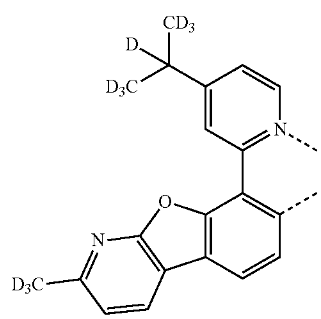

-continued
$L_{B395}$
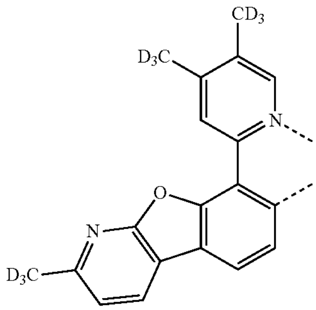
$L_{B396}$
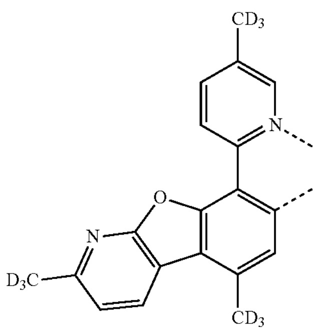
$L_{B397}$
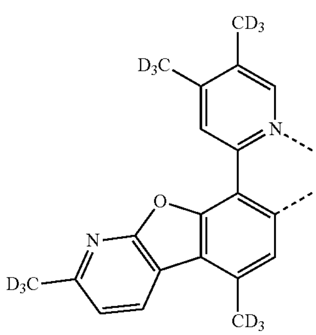
$L_{B398}$
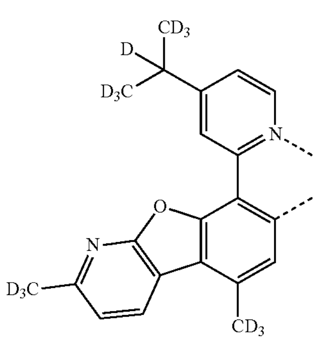
-continued
$L_{B399}$
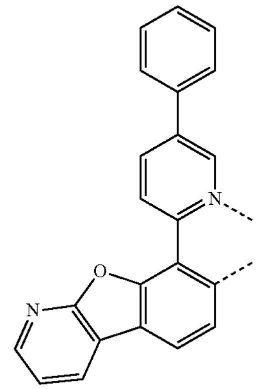
$L_{B400}$
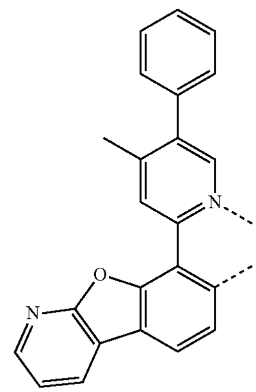
$L_{B401}$
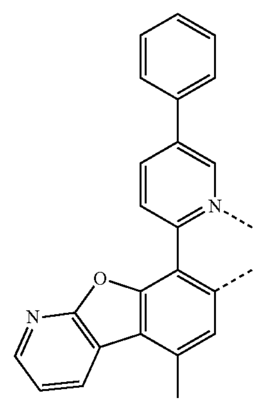
$L_{B402}$
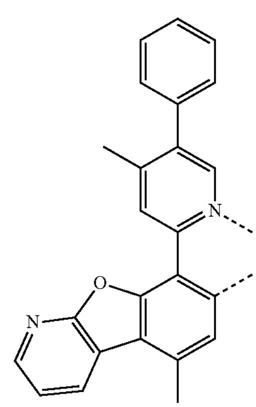

-continued
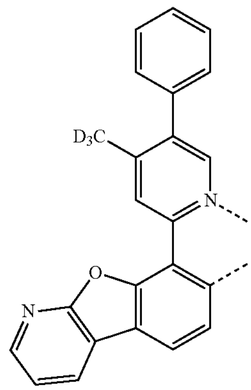
$L_{B403}$
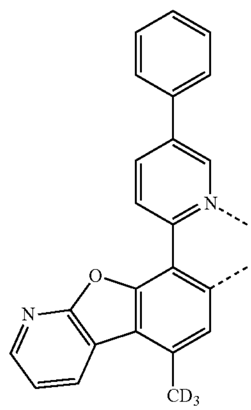
$L_{B404}$
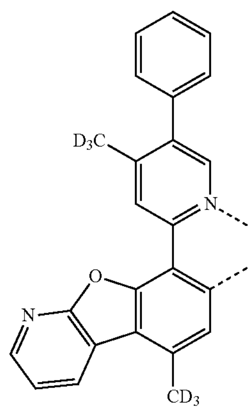
$L_{B405}$
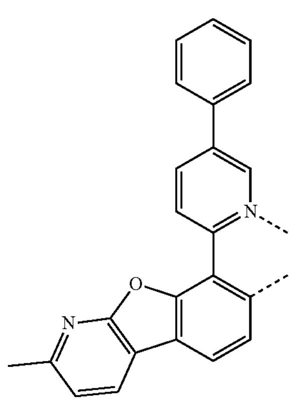
$L_{B406}$
-continued
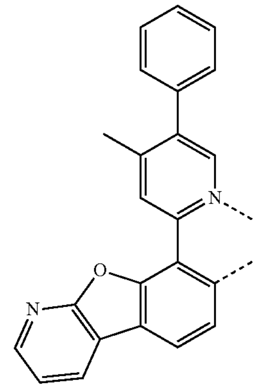
$L_{B407}$
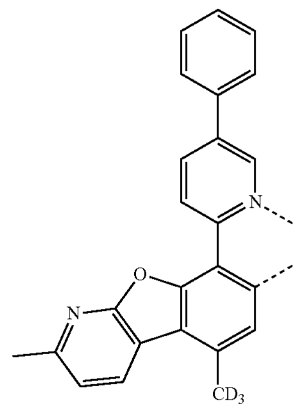
$L_{B408}$
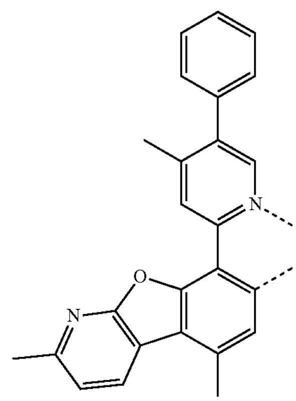
$L_{B409}$
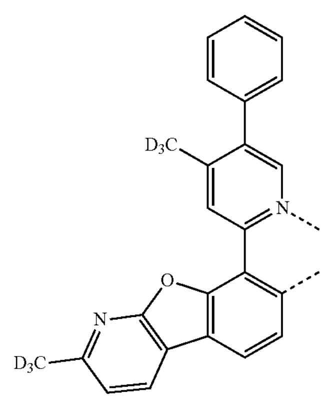
$L_{B410}$ -continued
$L_{B411}$
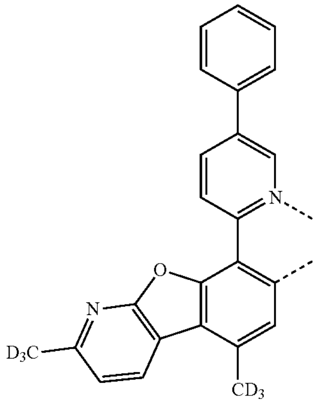
$L_{B412}$
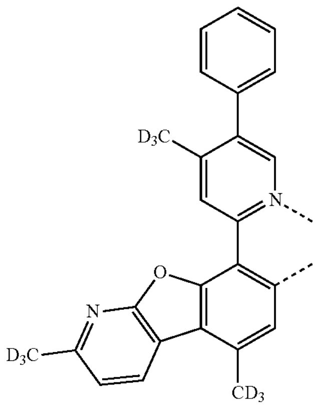
$L_{B413}$
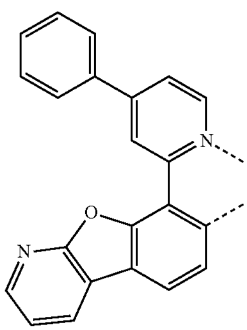
$L_{B414}$
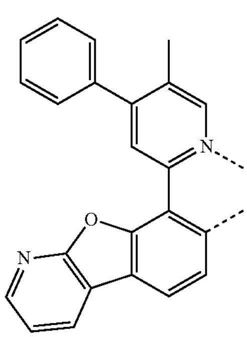
-continued
$L_{B415}$
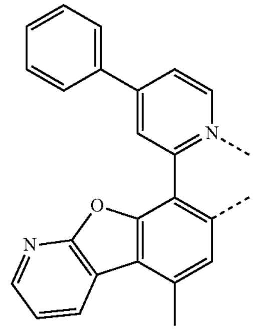
$L_{B416}$
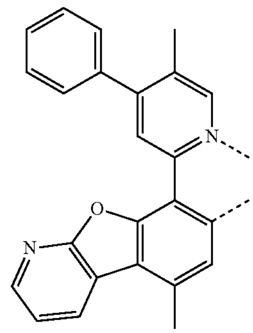
$L_{B417}$
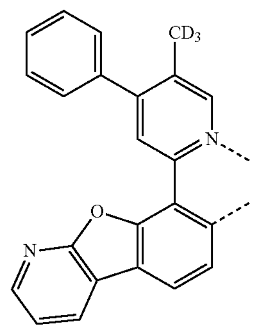
$L_{B418}$
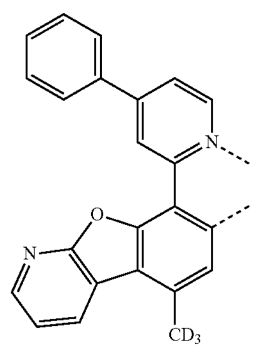

-continued
$L_{B419}$
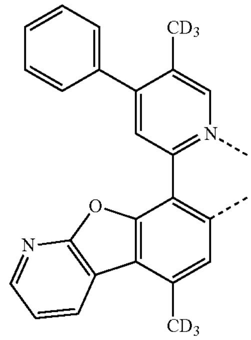
$L_{B420}$
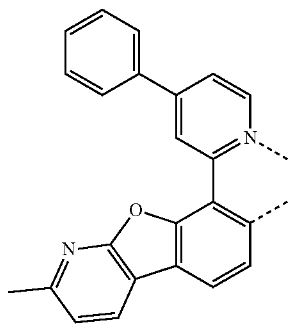
$L_{B421}$
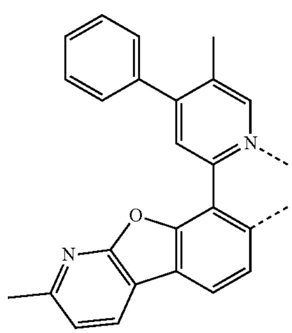
$L_{B422}$
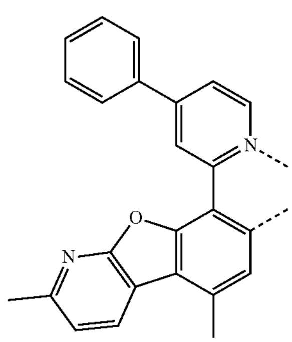
-continued
$L_{B423}$
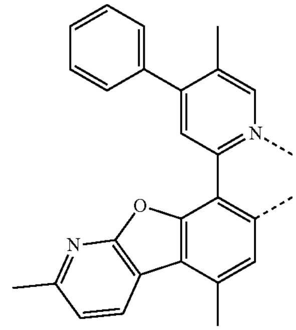
$L_{B424}$
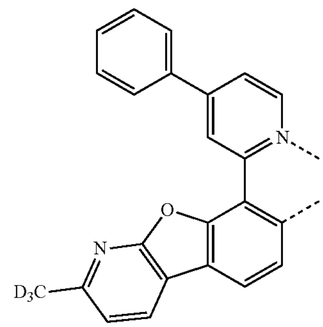
$L_{B425}$
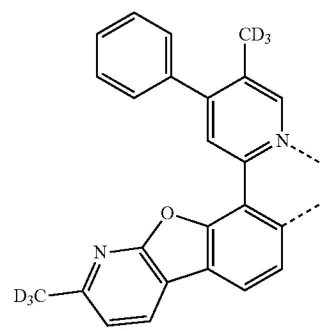
$L_{B426}$
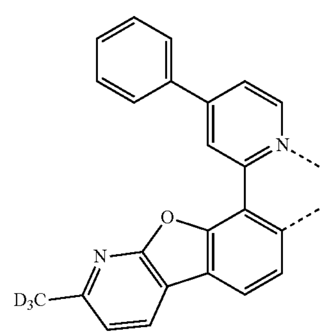

-continued
$L_{B427}$
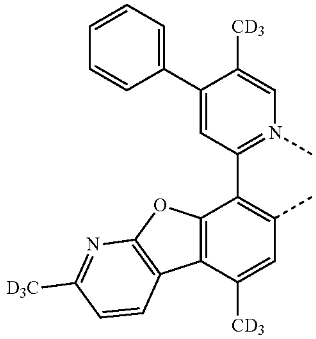
$L_{B428}$
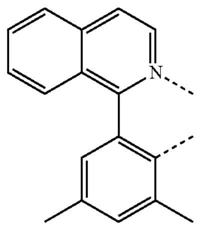
$L_{B429}$
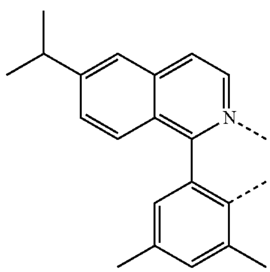
$L_{B430}$
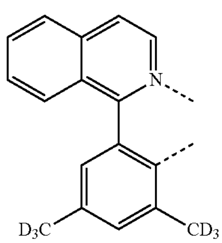
$L_{B431}$
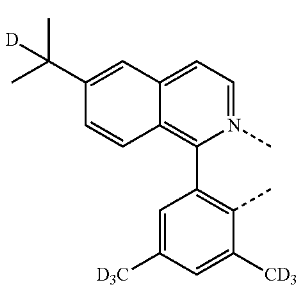
-continued
$L_{B432}$
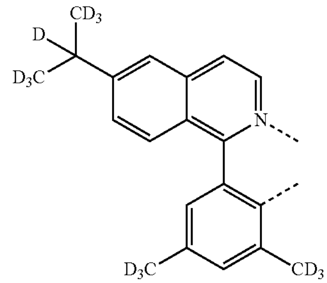
$L_{B433}$
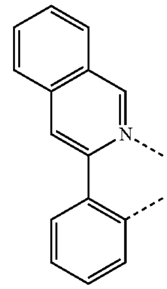
$L_{B434}$
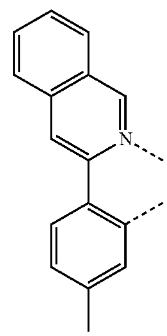
$L_{B435}$
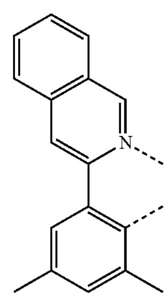
$L_{B436}$
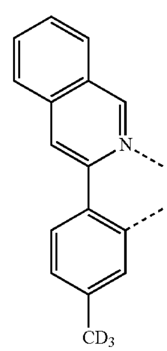

-continued
$L_{B437}$
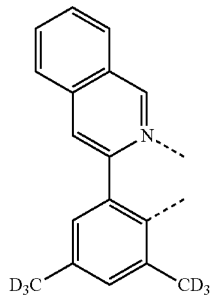
$L_{B438}$
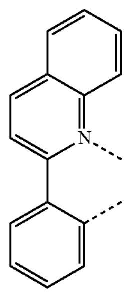
$L_{B439}$
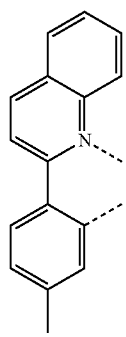
$L_{B440}$
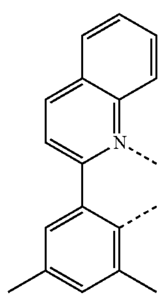
$L_{B441}$
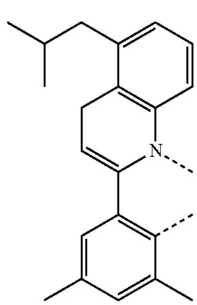
-continued
$L_{B442}$
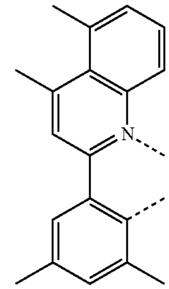
$L_{B443}$
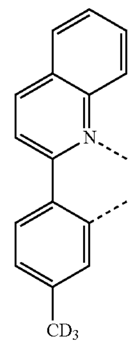
$L_{B444}$
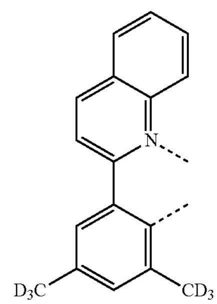
$L_{B445}$
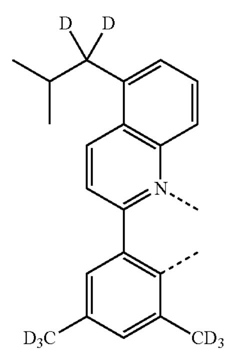
$L_{B446}$
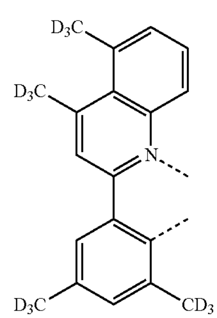

-continued
$L_{B447}$
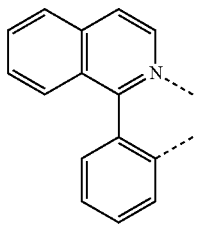
$L_{B448}$
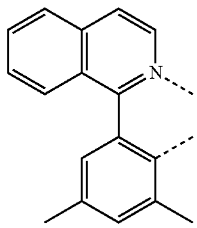
$L_{B449}$
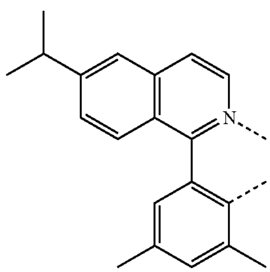
$L_{B450}$
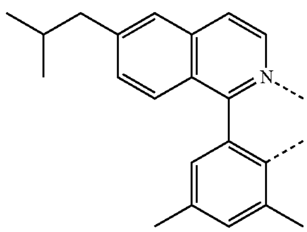
$L_{B451}$
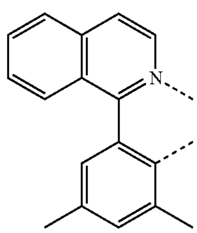
$L_{B452}$
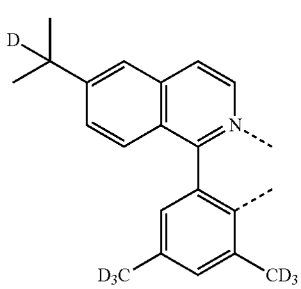
-continued
$L_{B453}$
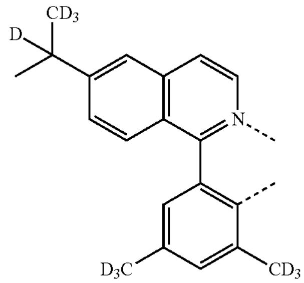
$L_{B454}$
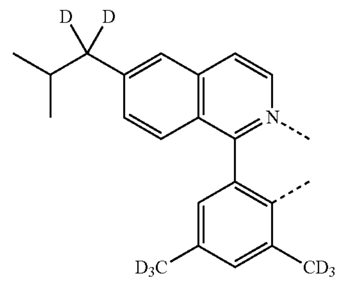
$L_{B455}$
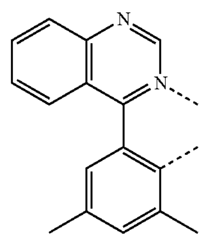
$L_{B456}$
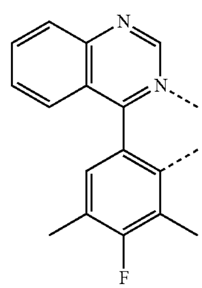
$L_{B457}$
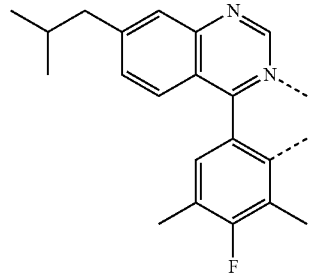

$L_{B458}$
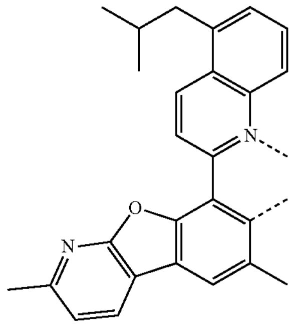
$L_{B459}$
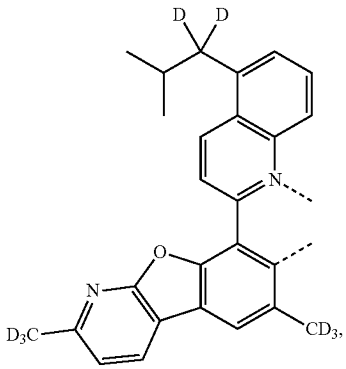
and
$L_{B460}$
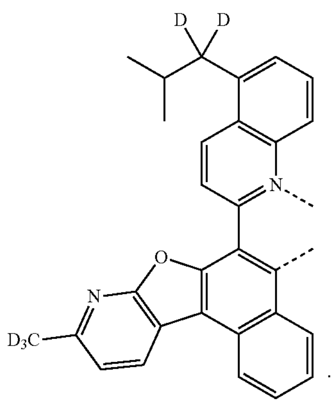
In one embodiment, each L is independently selected from the group consisting of:
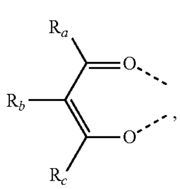
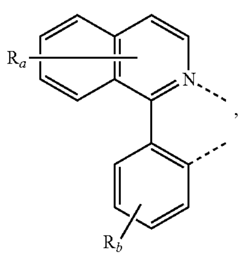
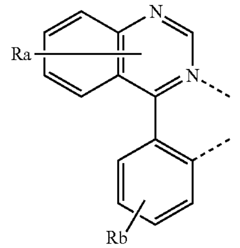
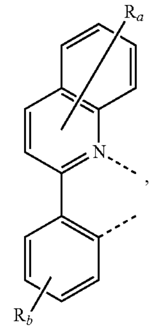
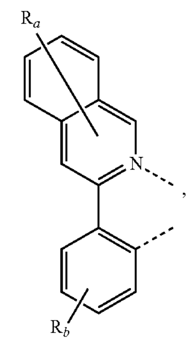
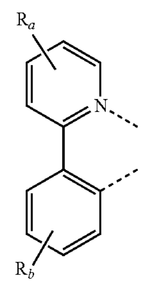
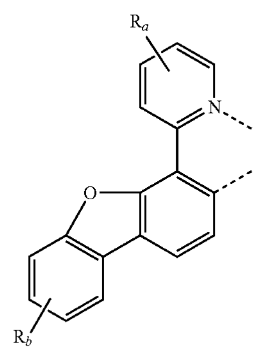
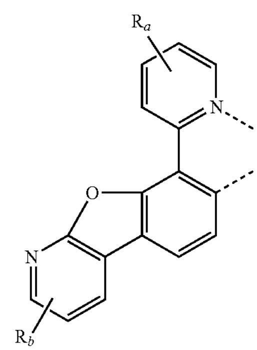
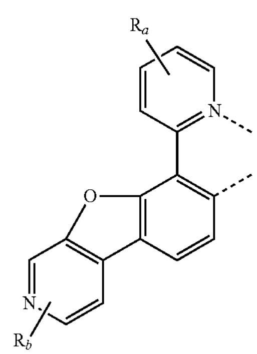
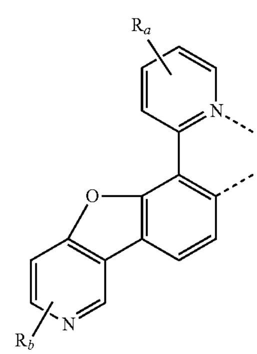

-continued
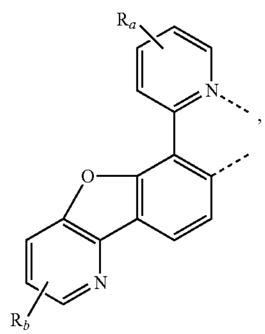
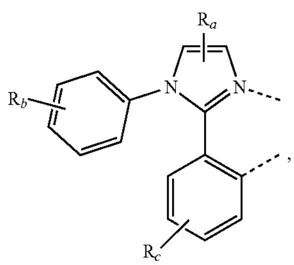
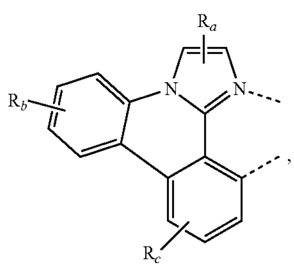
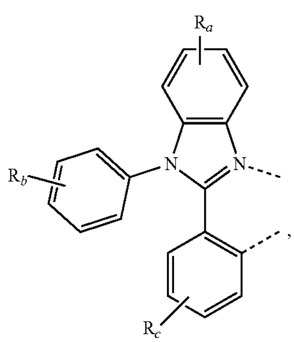
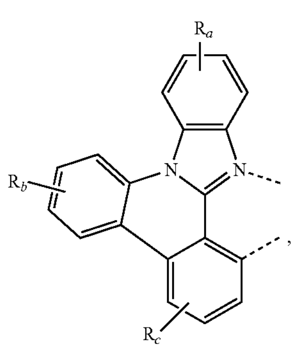
-continued
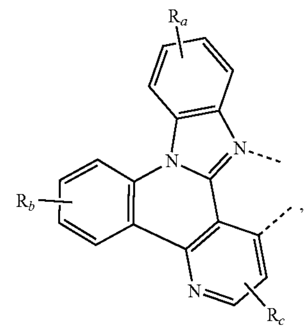
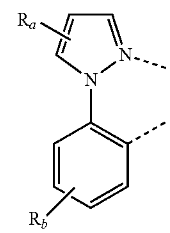
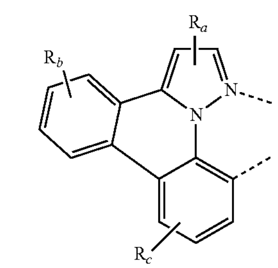
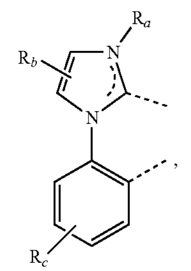
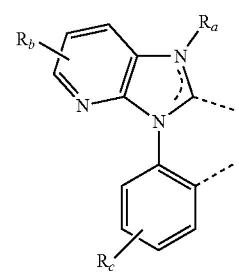
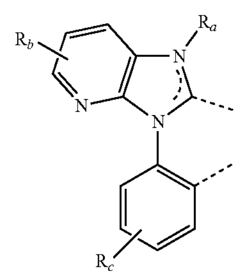
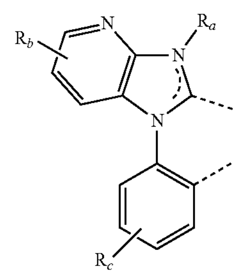
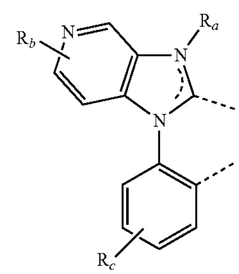
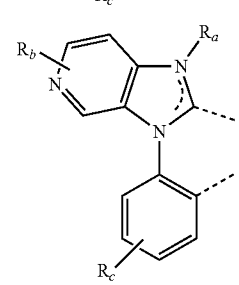
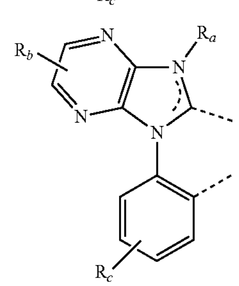
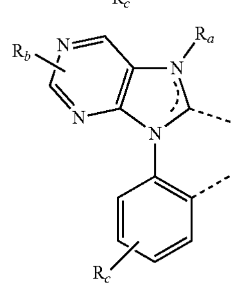
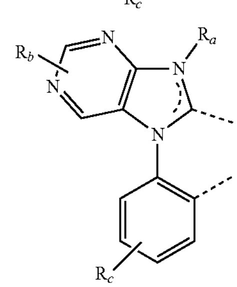
and -continued

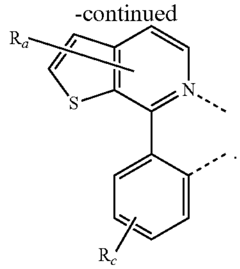

According to another aspect of the present disclosure, an OLED is also provided. The OLED includes an anode, a cathode, and an organic layer disposed between the anode and the cathode. The organic layer may include a host and a phosphorescent dopant. The organic layer can include a compound of Formula I, and its variations as described herein.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the present invention relates to an emissive region or an emissive layer. The emissive region or emissive layer can include a compound of the present invention. In one embodiment, the compound of the present invention is an emissive dopant or a non-emissive dopant.

In some embodiments of the emissive region, the emissive region further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

In some embodiment of the emissive region, the emissive region further comprises a host, wherein the host is selected from the group consisting of:

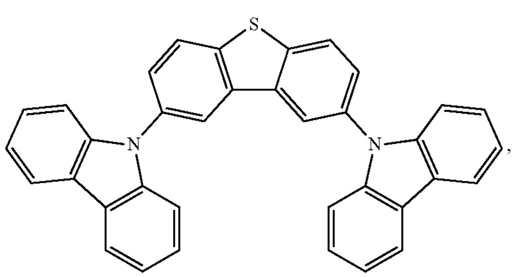

-continued

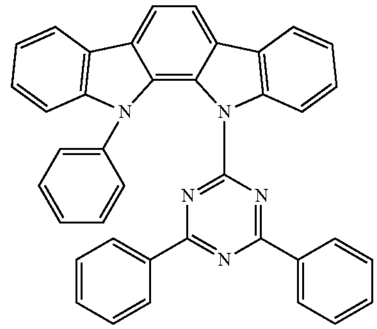

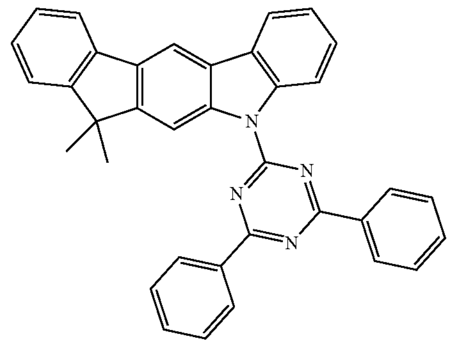

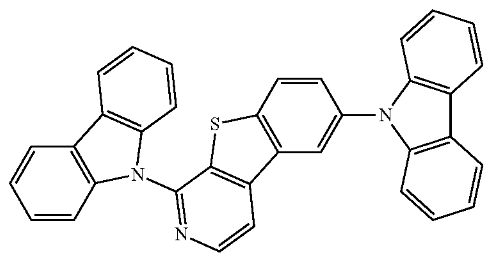

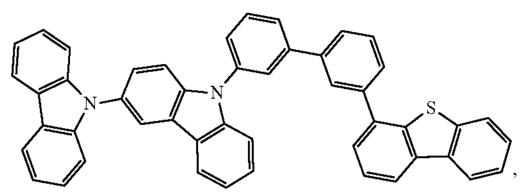

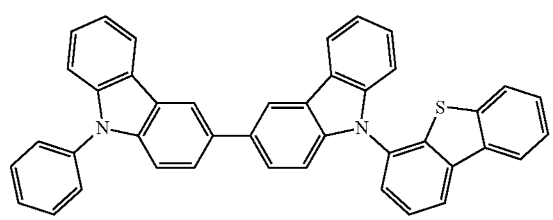

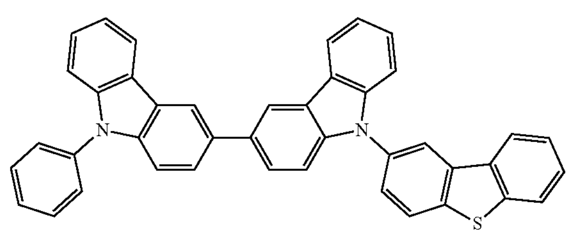

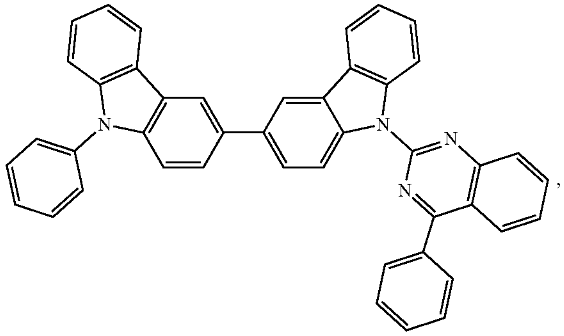
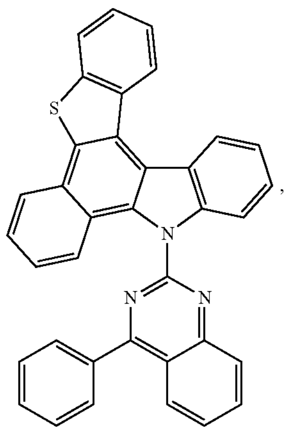
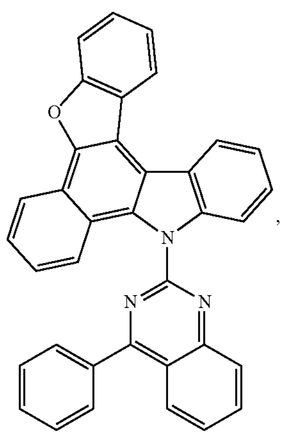
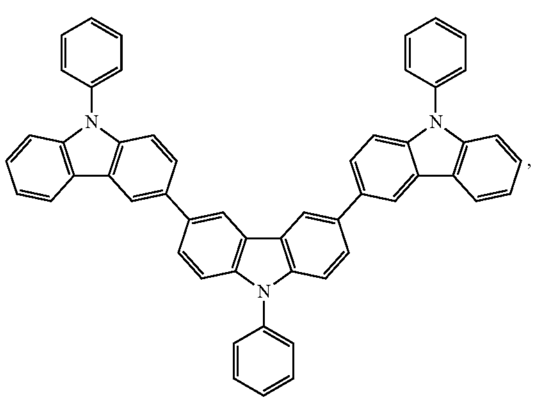
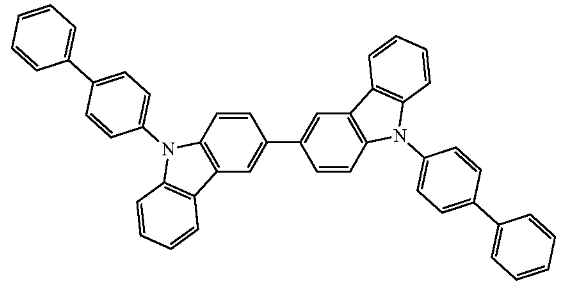
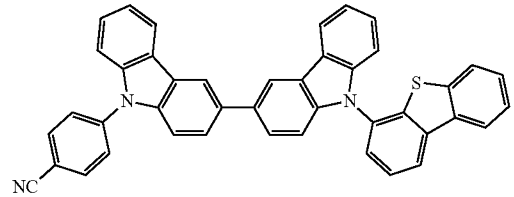
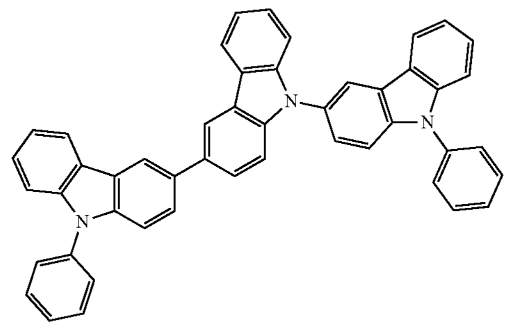
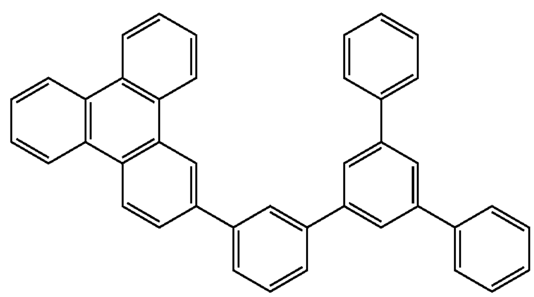
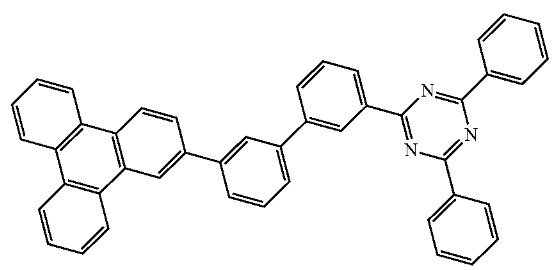
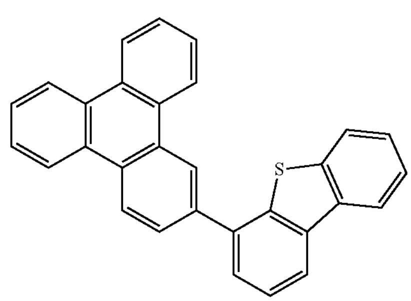

-continued

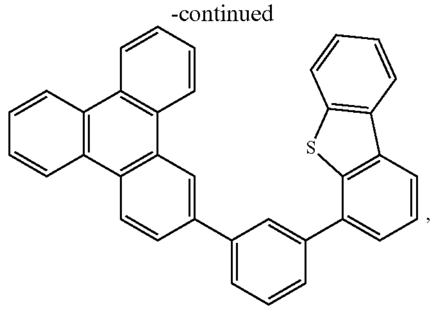

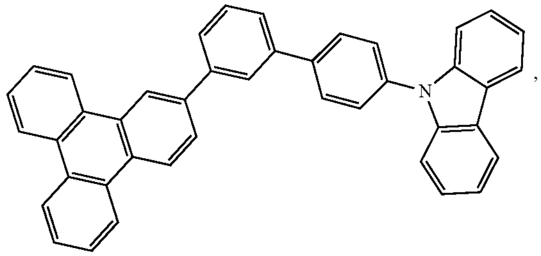

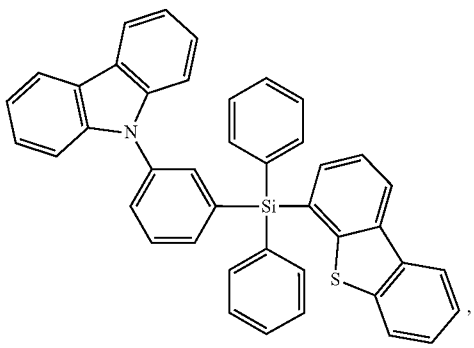

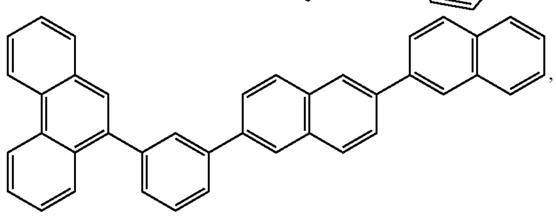

and combinations thereof.

In some embodiments, the compound can be an emissive dopant. In some embodiments, the compound can produce emissions via phosphorescence, fluorescence, and thermally activated delayed fluorescence, i.e., TADF (also referred to as E-type delayed fluorescence), triplet-triplet annihilation, or combinations of these processes.

According to another aspect, a formulation comprising the compound described herein is also disclosed.

The OLED disclosed herein can be incorporated into one or more of a consumer product, an electronic component module, and a lighting panel.

In one embodiment, the consumer product is selected from the group consisting of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

The organic layer can be an emissive layer and the compound can be an emissive dopant in some embodiments, while the compound can be a non-emissive dopant in other embodiments. In one embodiment, the organic layer further comprises a host, wherein the host comprises a metal complex.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $CnH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1$-$Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example, a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

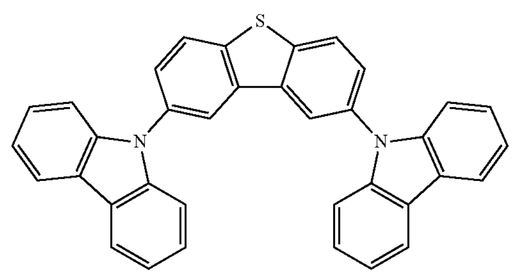

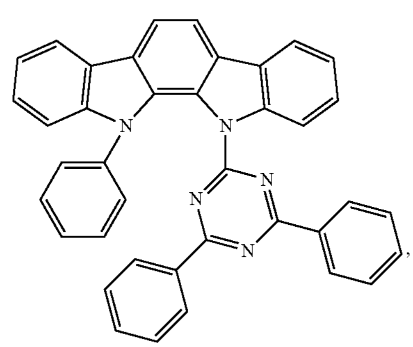

-continued
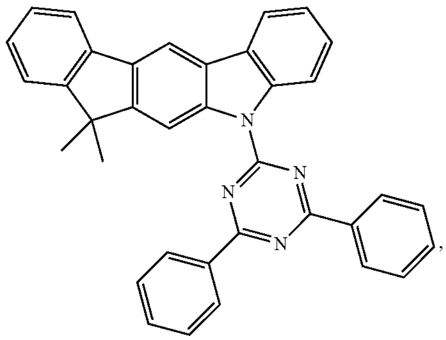
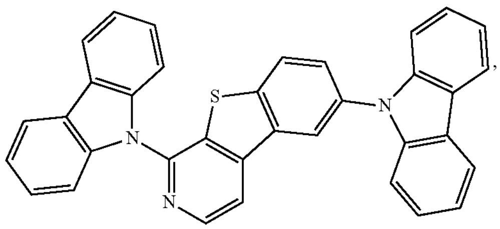
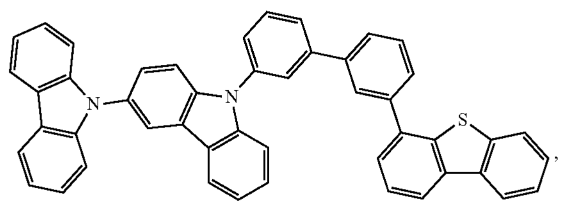
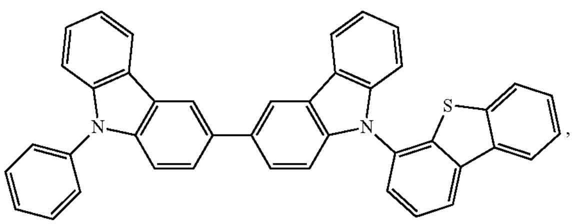
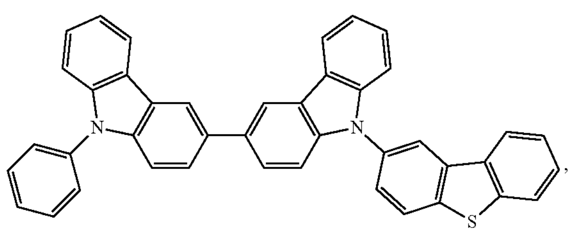
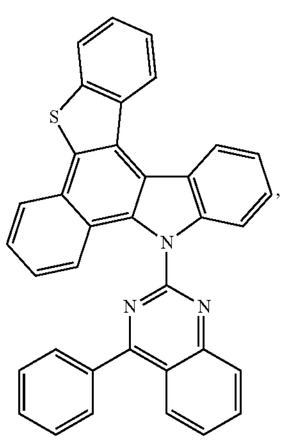
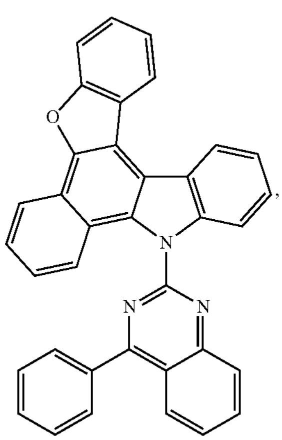
-continued
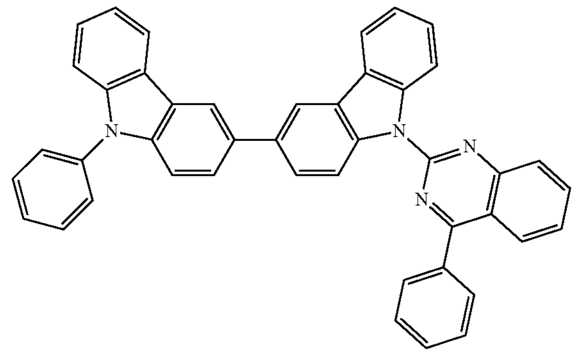
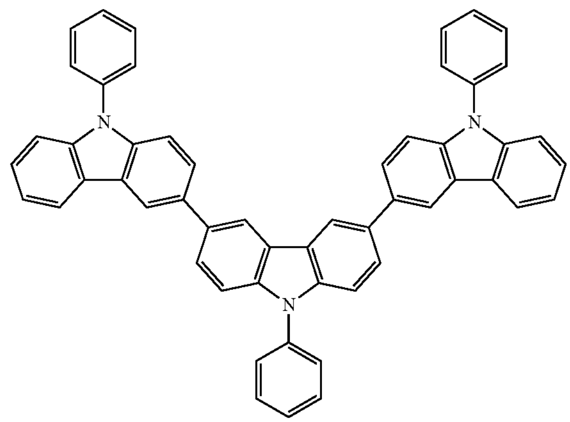
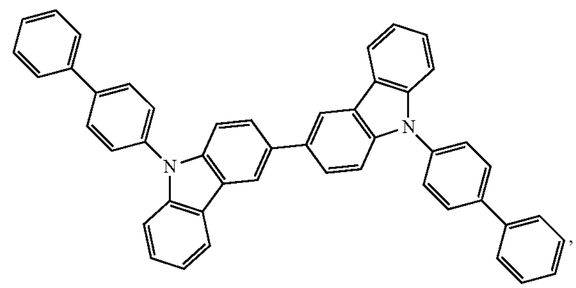
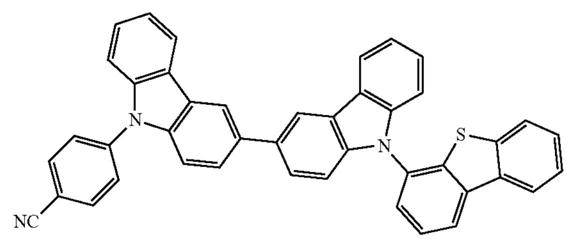
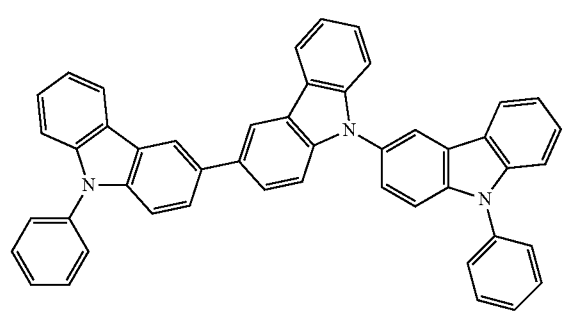

-continued

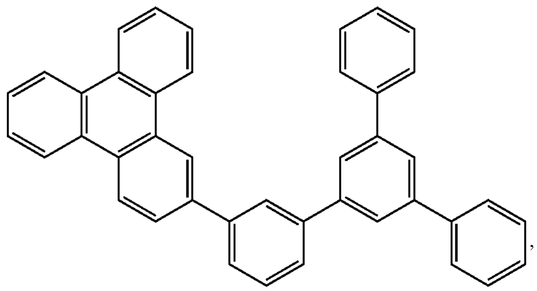

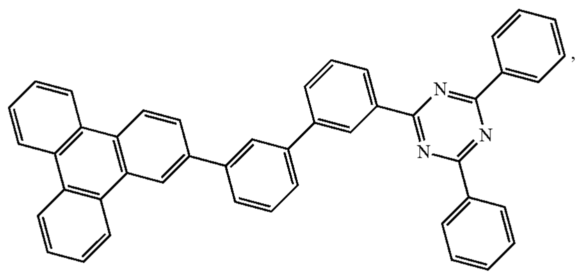

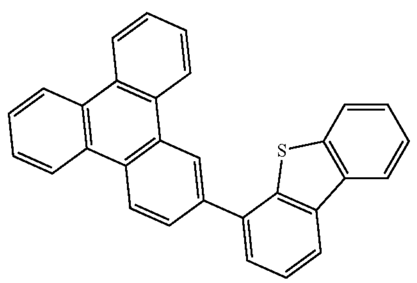

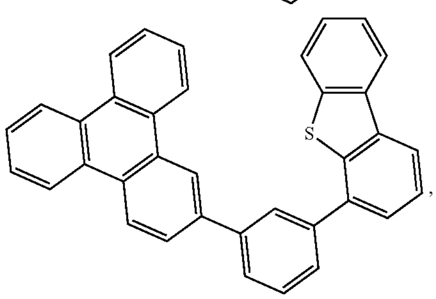

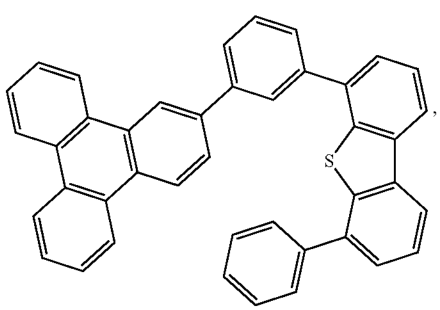

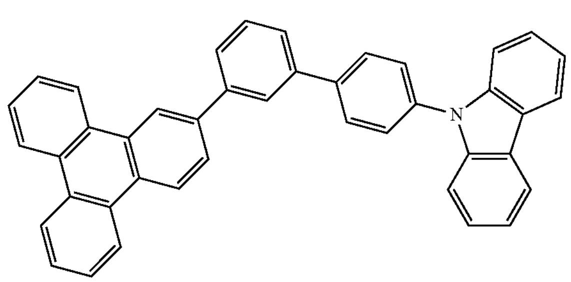

-continued

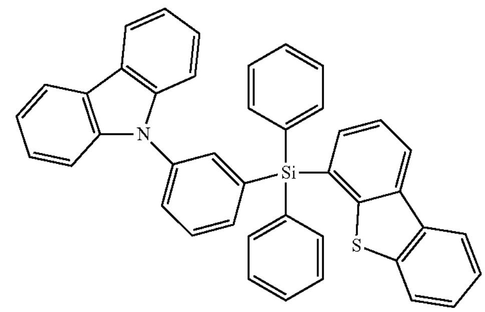

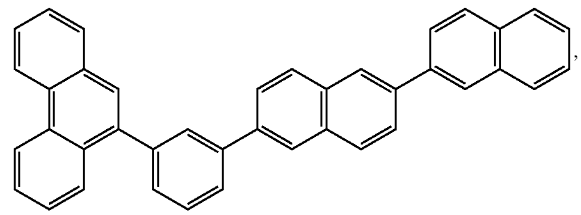

and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

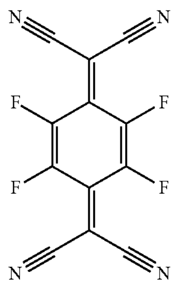

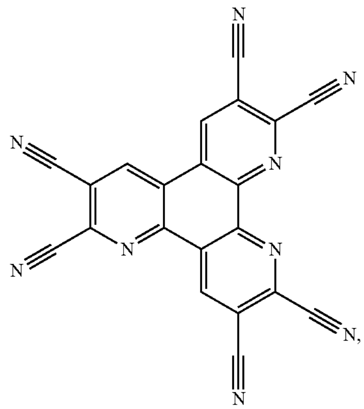

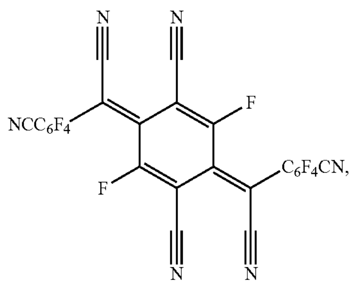

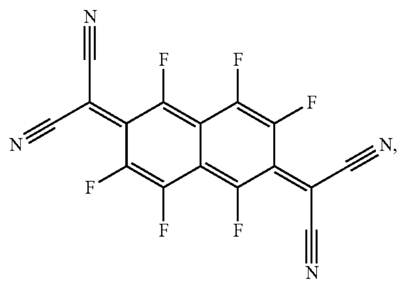

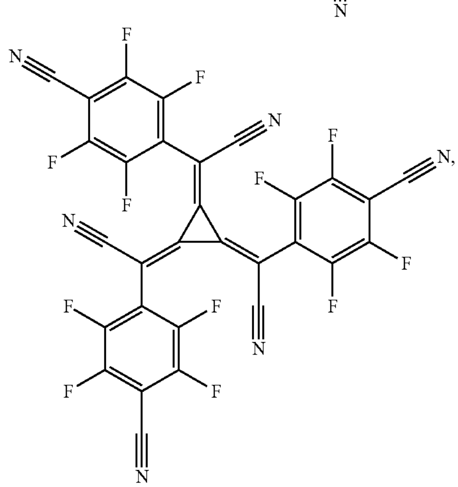

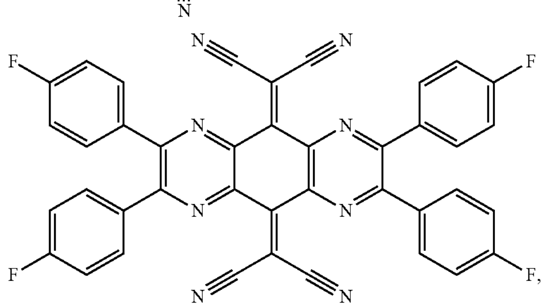

-continued

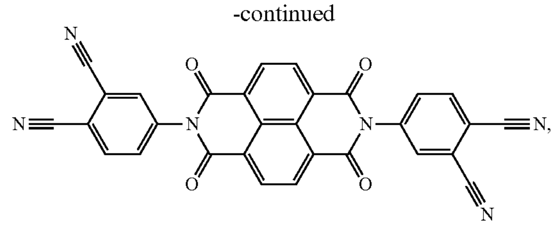

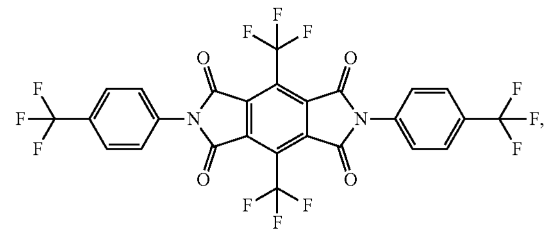

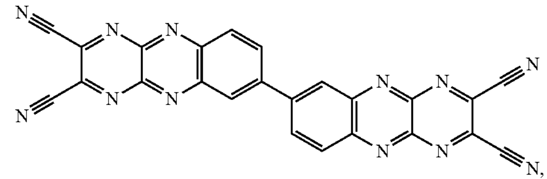

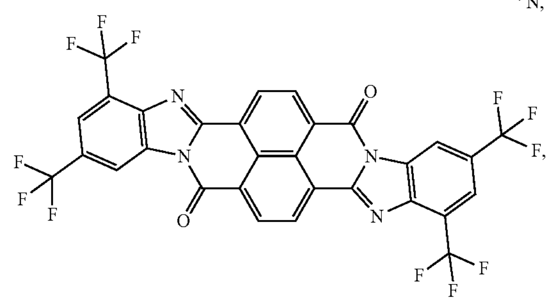

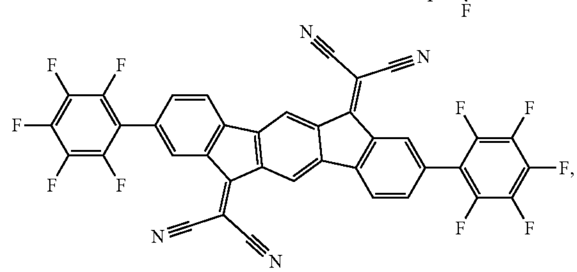

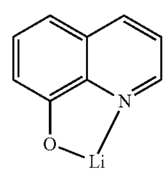

, and

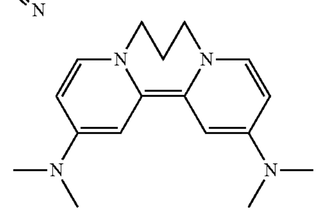

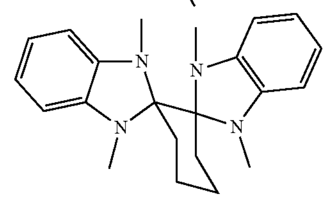

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

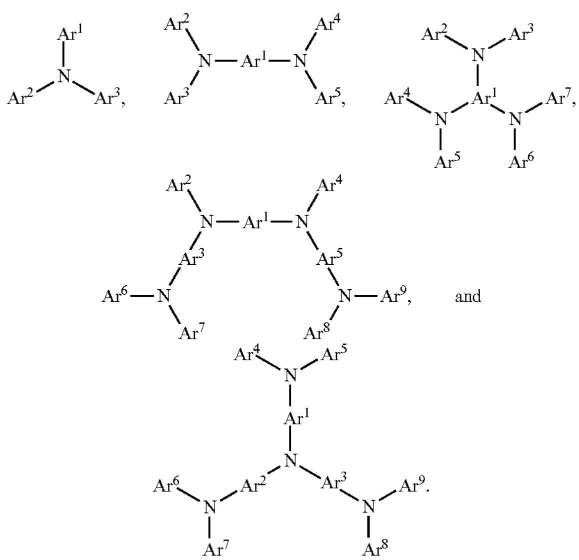

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

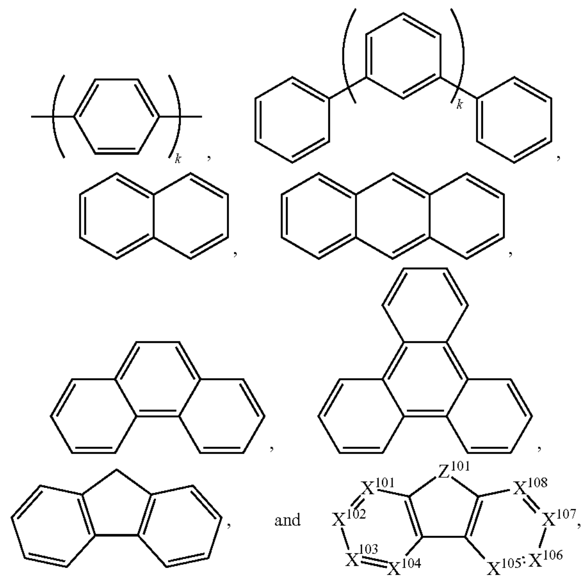

wherein k is an integer from 1 to 20; $X^{108}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

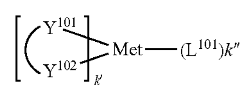

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.
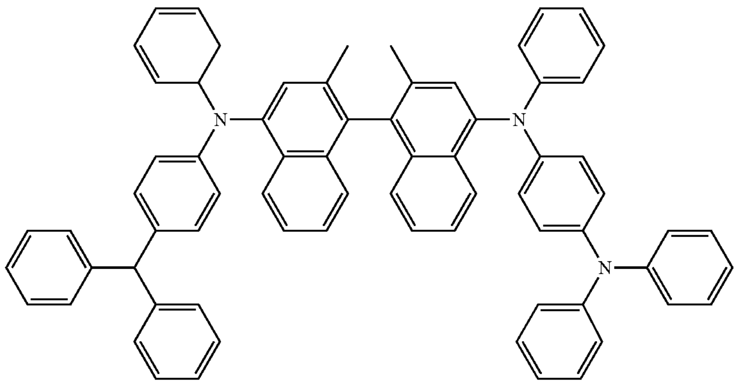
,
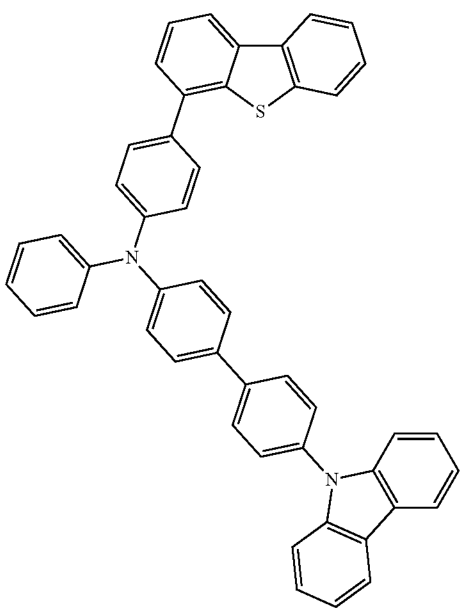
, -continued
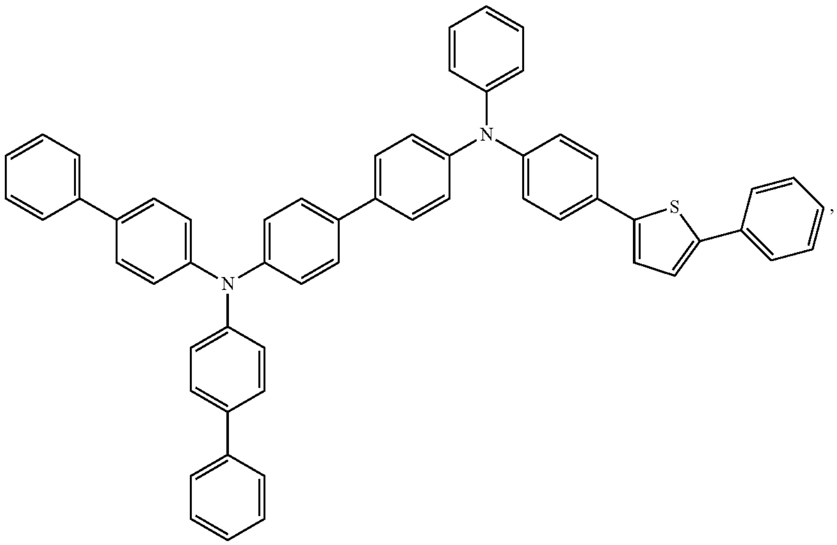
,
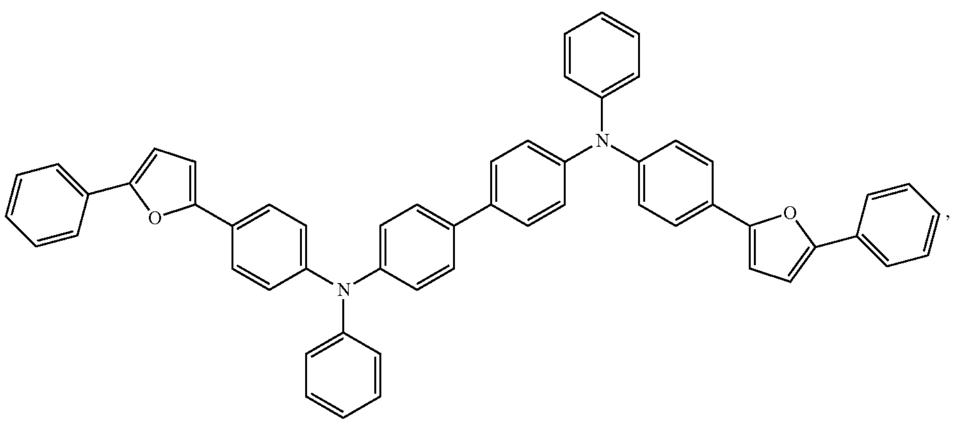
,
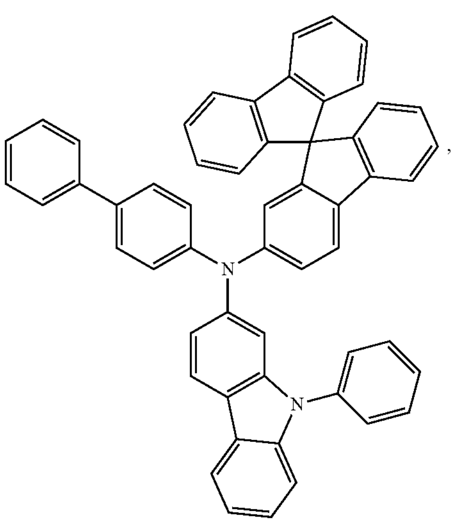
,
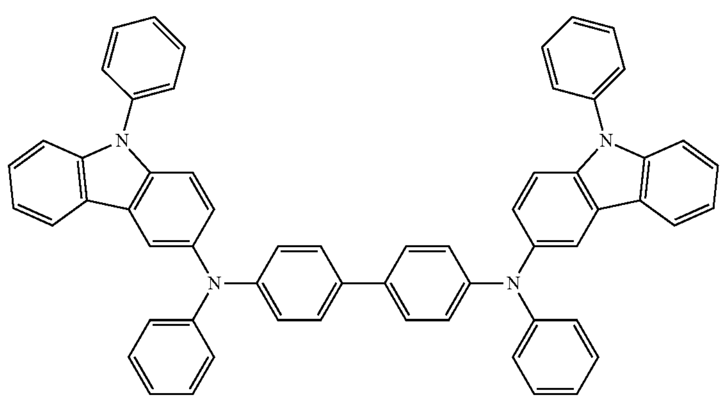
, -continued
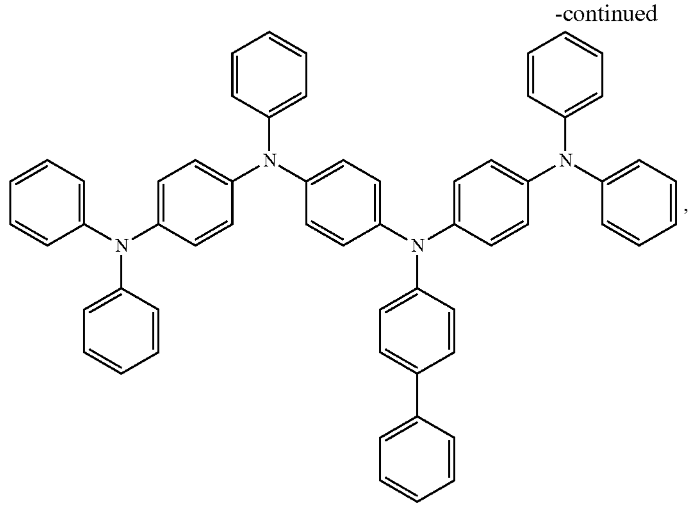
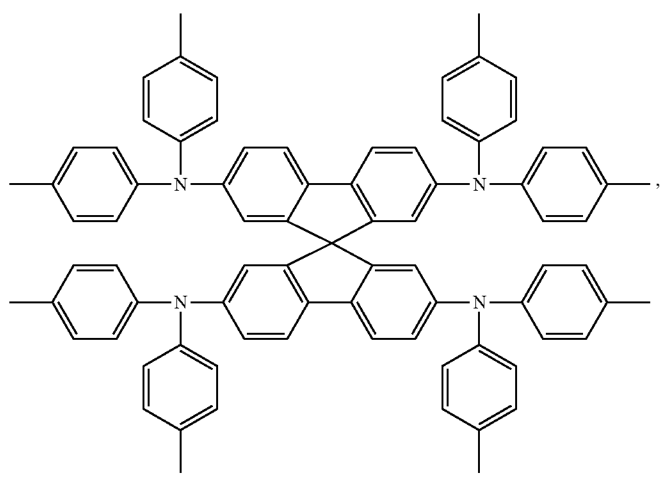
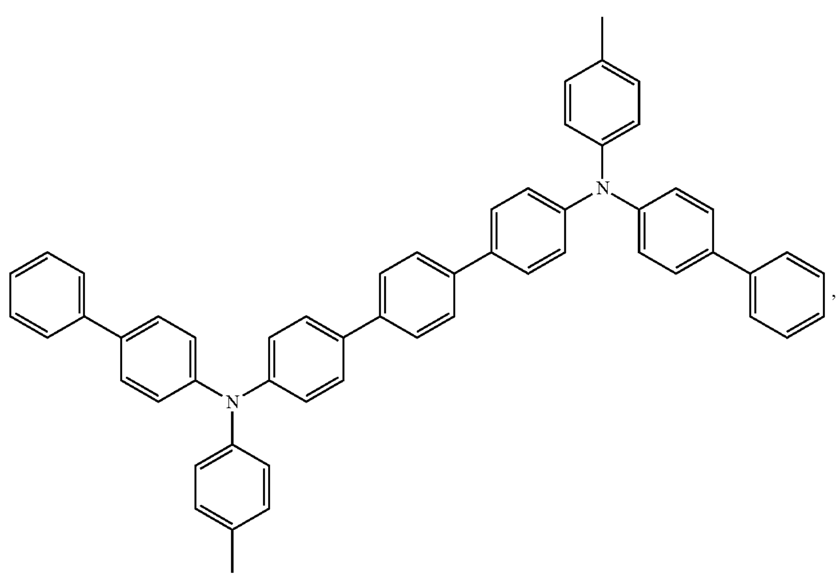

-continued
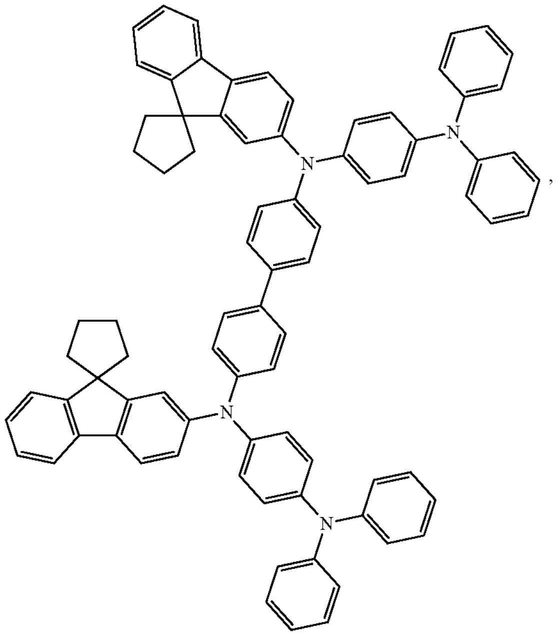
,
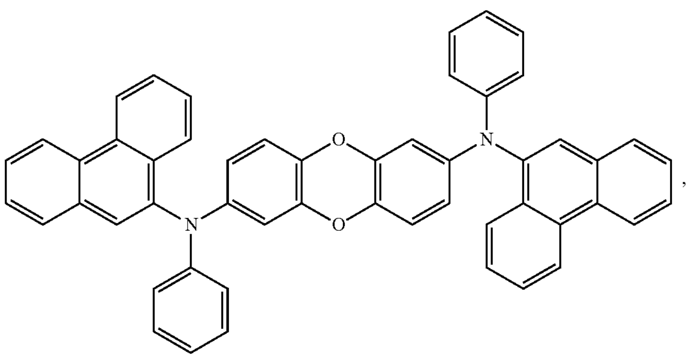
,
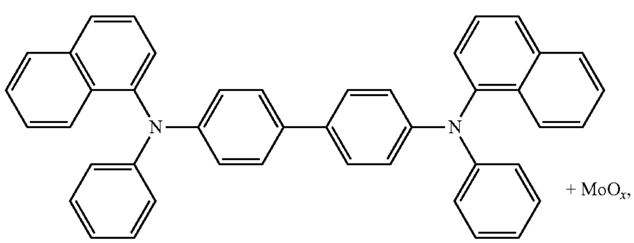
+ $MoO_x$,
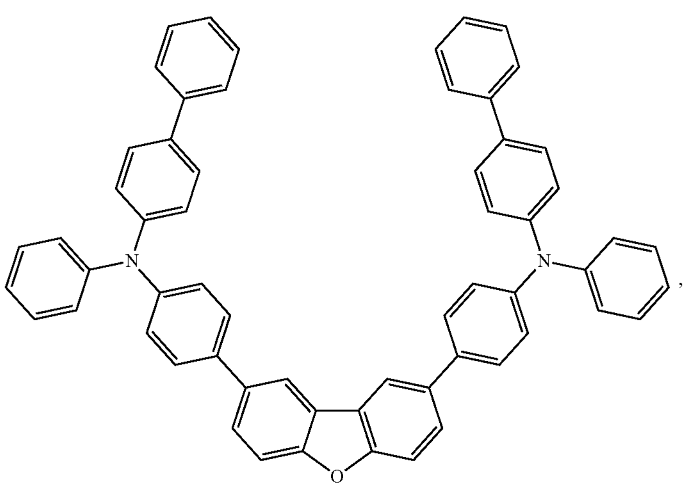
,
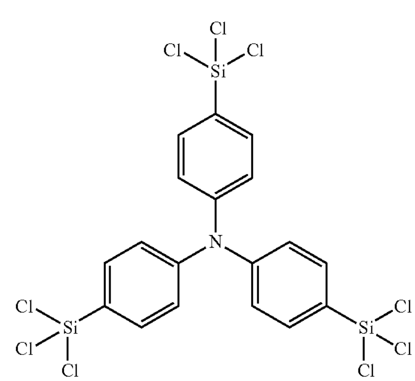
, -continued
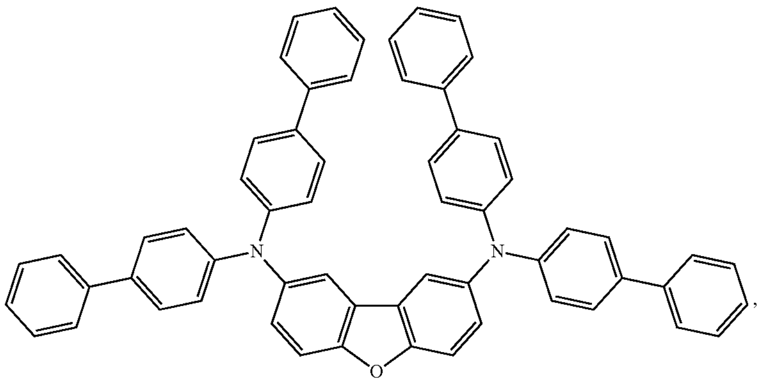
,
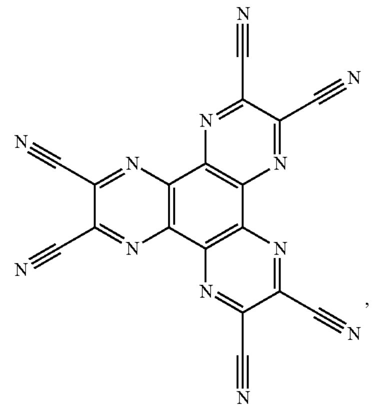
,
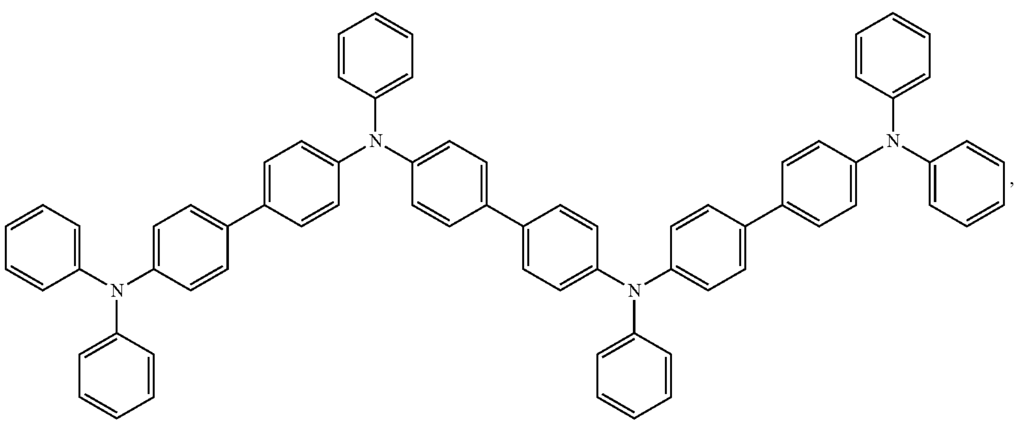
,
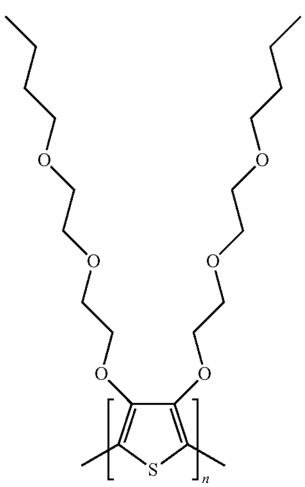
,
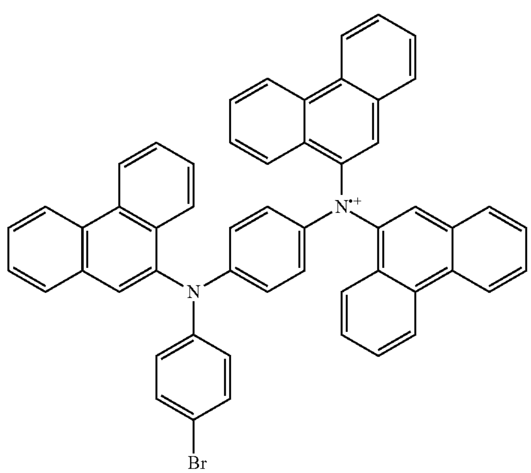
, -continued
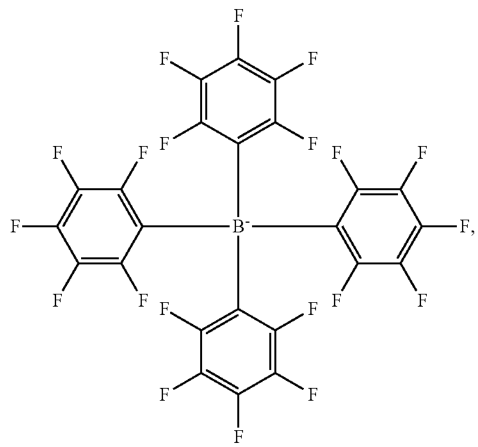
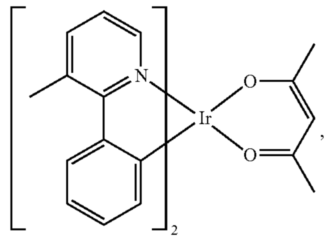
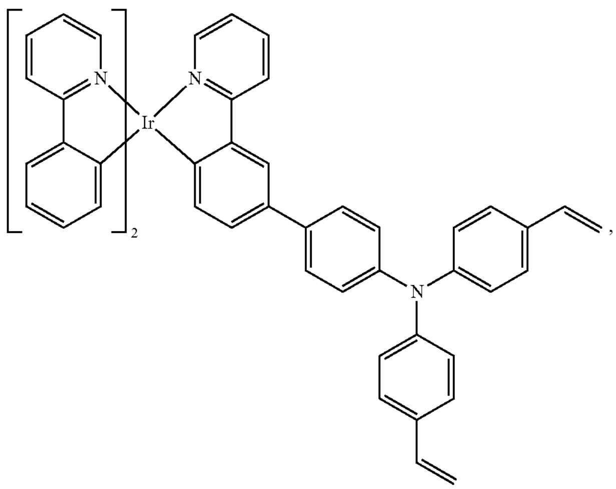
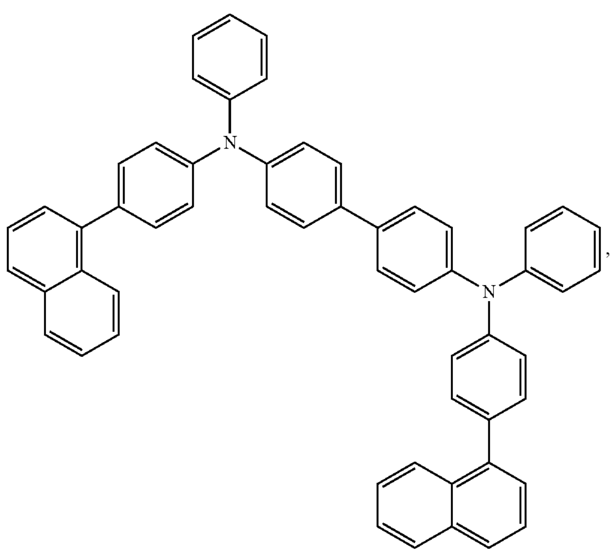

-continued
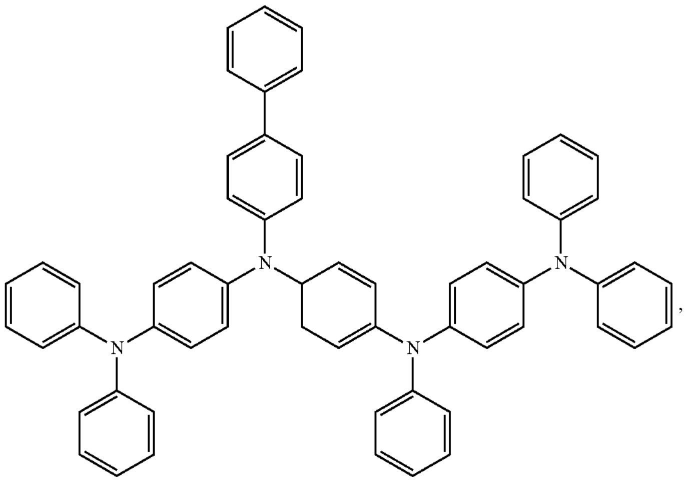
,
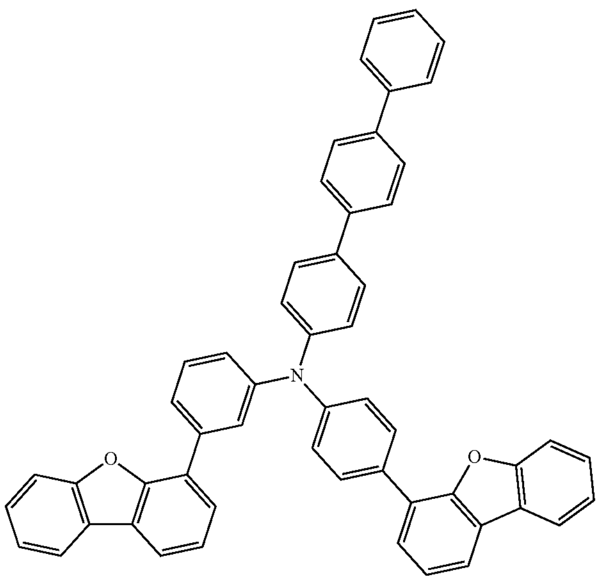
,
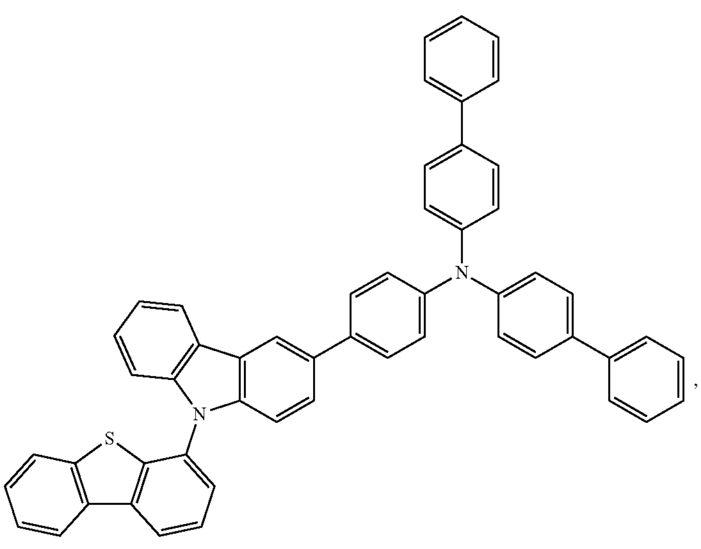
,

-continued
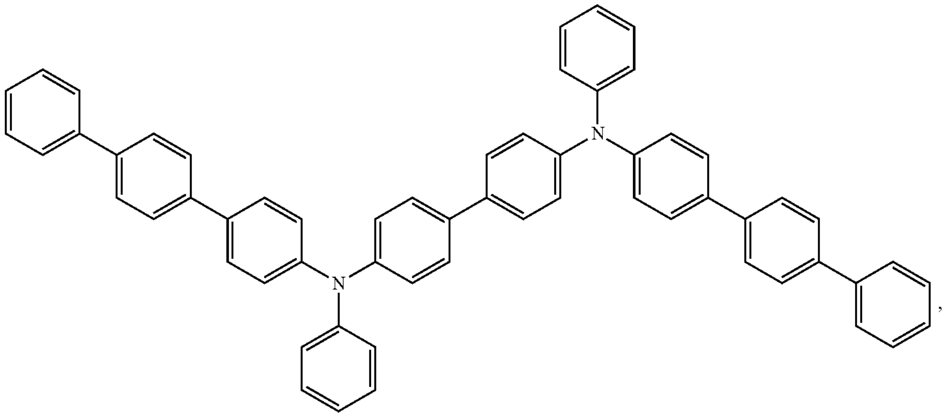
,
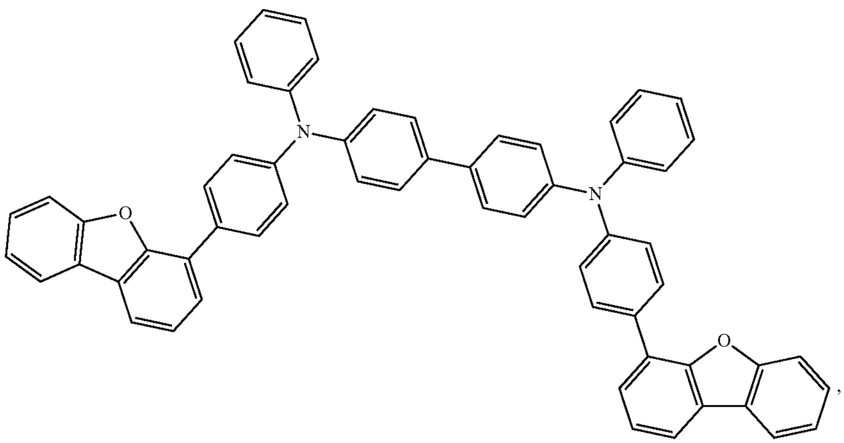
,
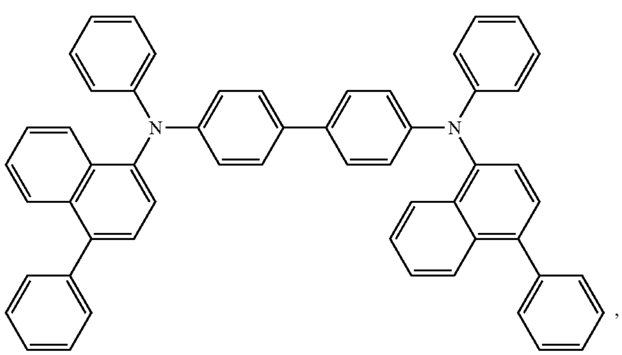
,

-continued
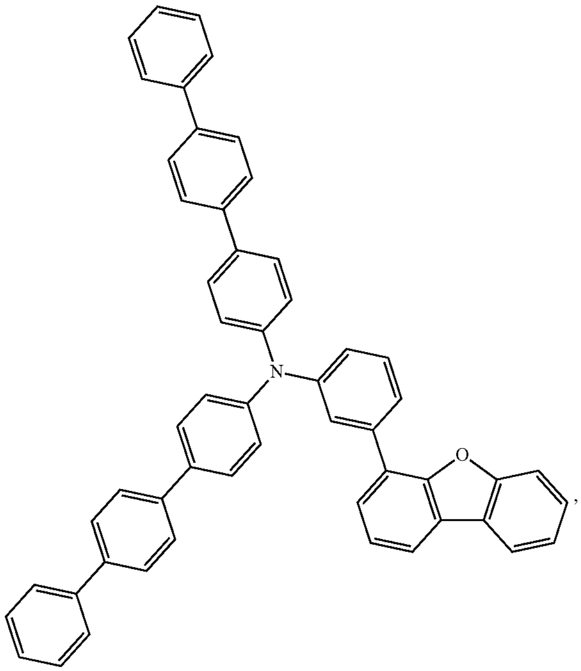
,
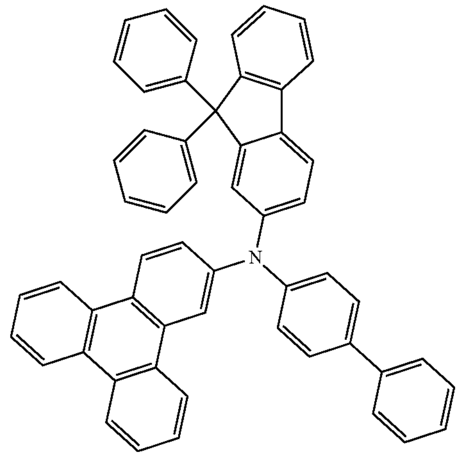
,
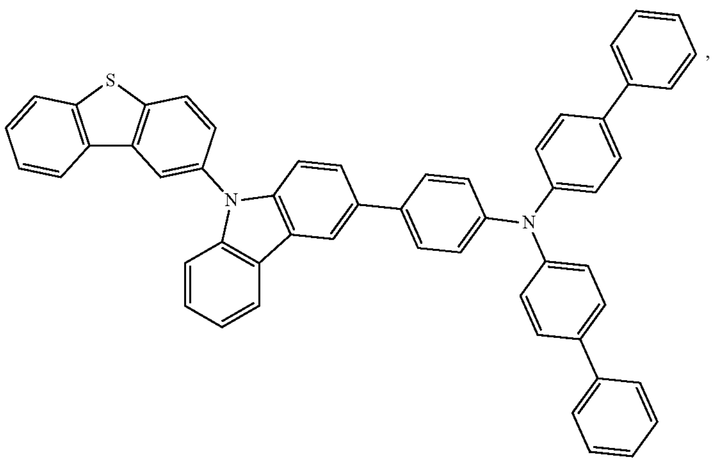
,
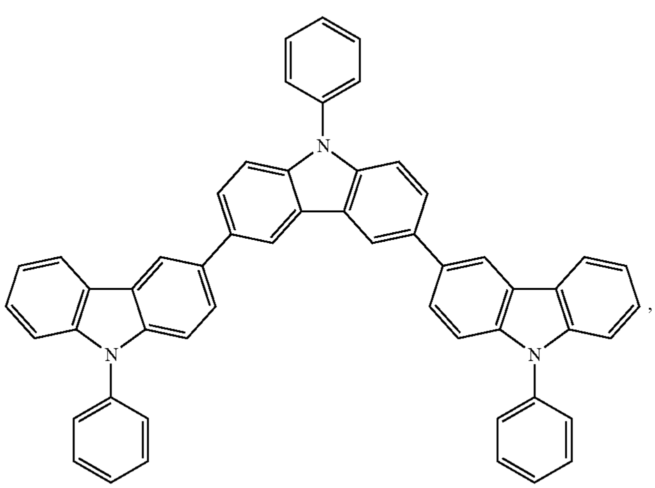
,
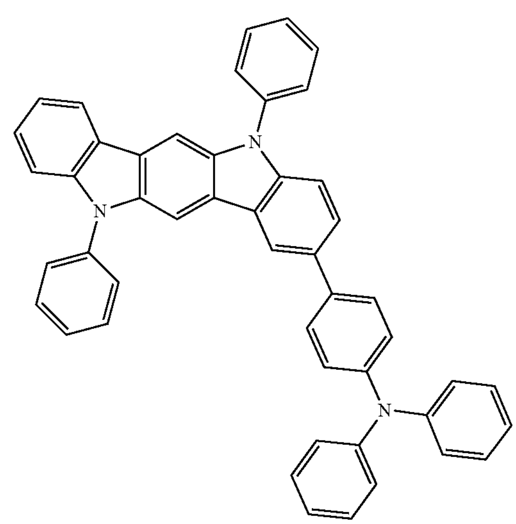
, -continued
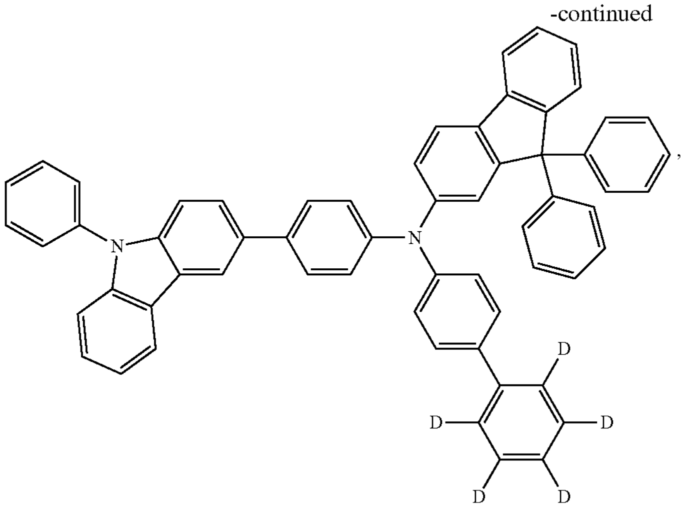
,
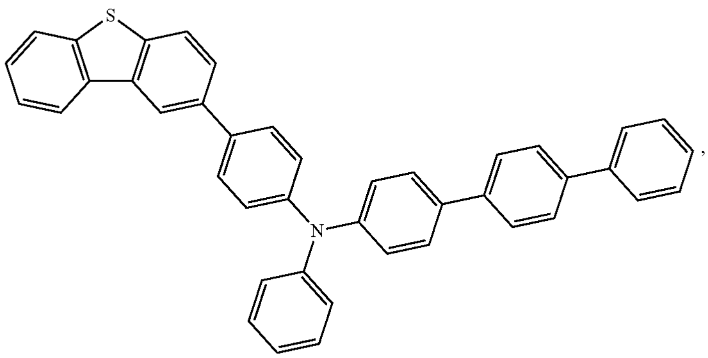
,
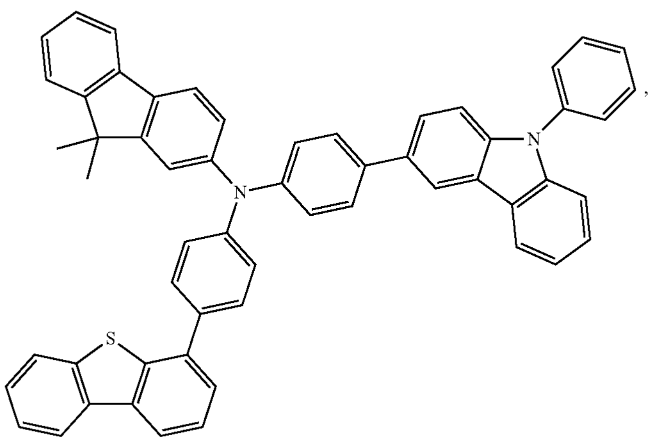
,
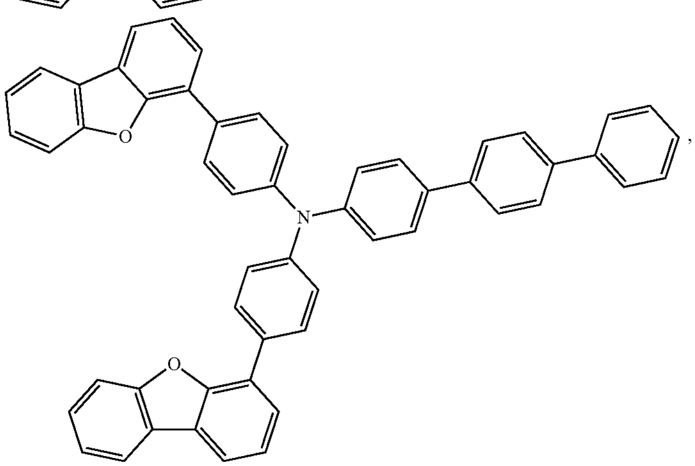
, -continued
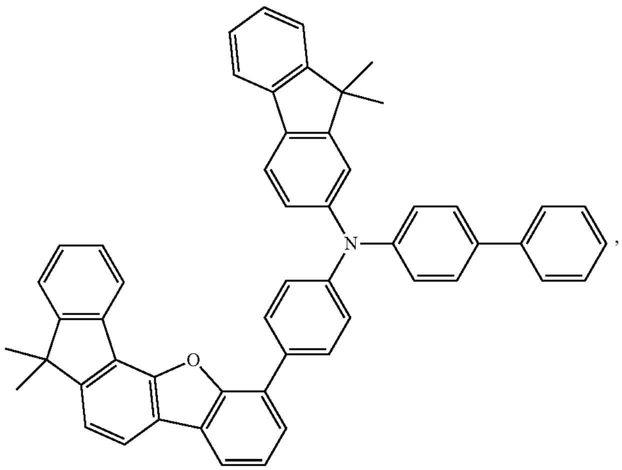
,
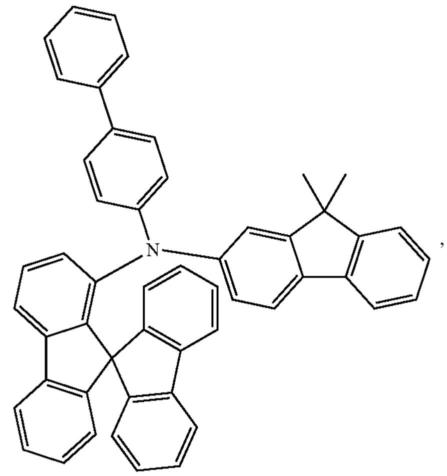
,
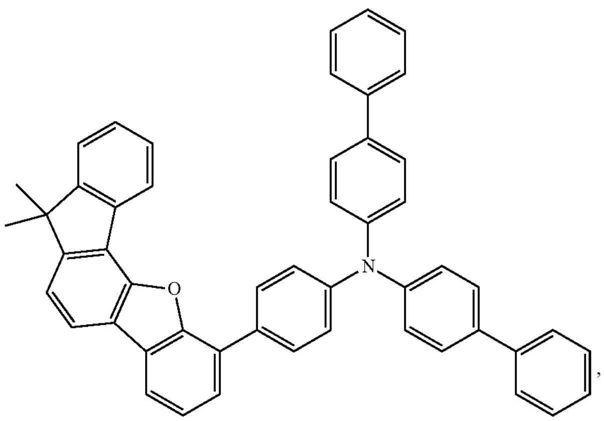
,
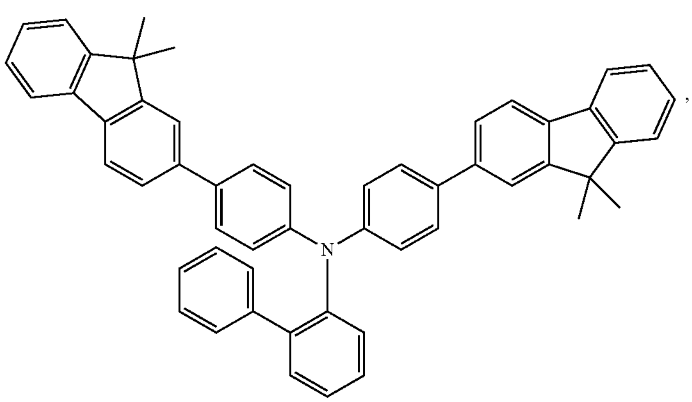
, -continued
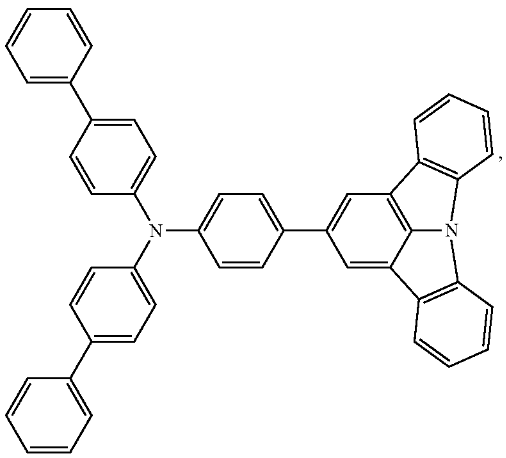
,
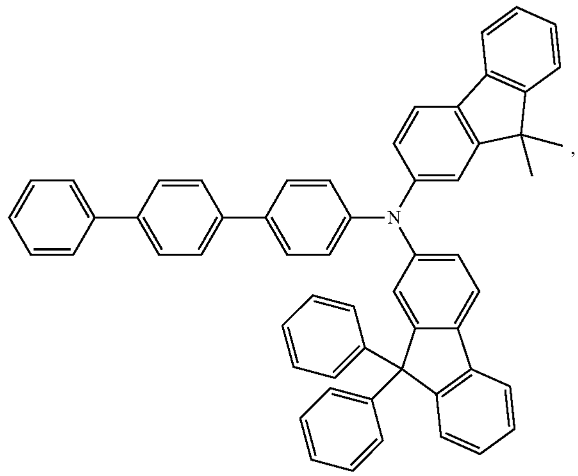
,
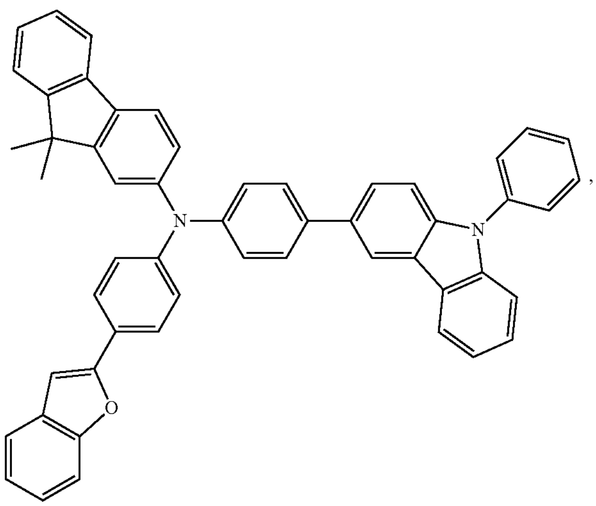
,
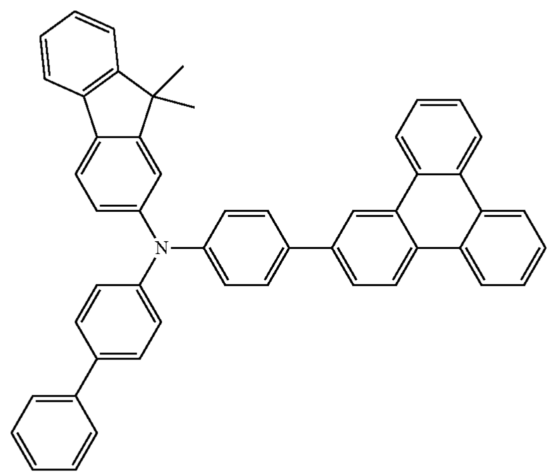
,
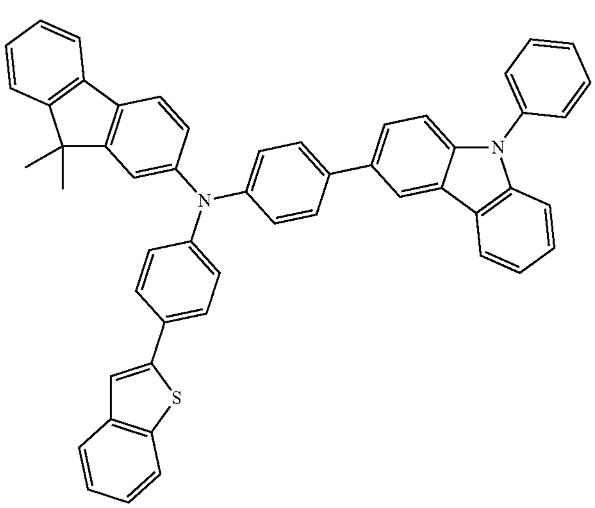
, -continued
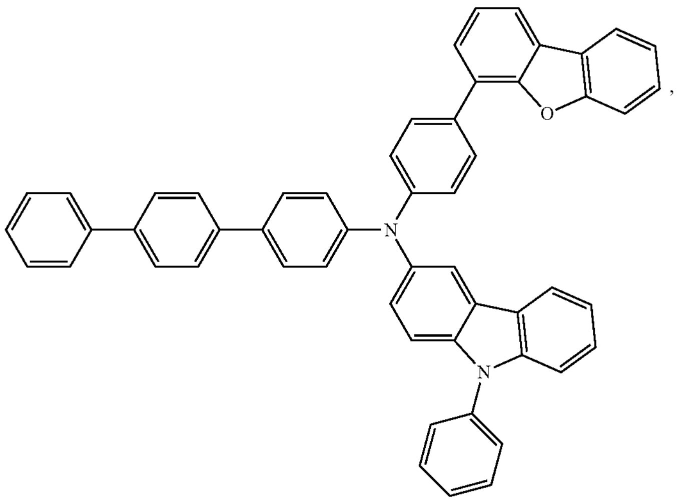
,
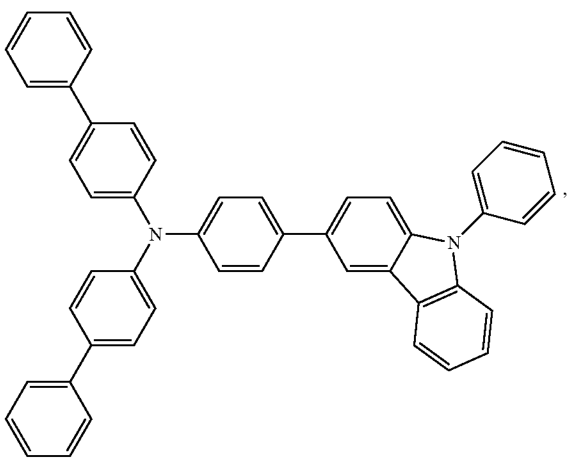
,
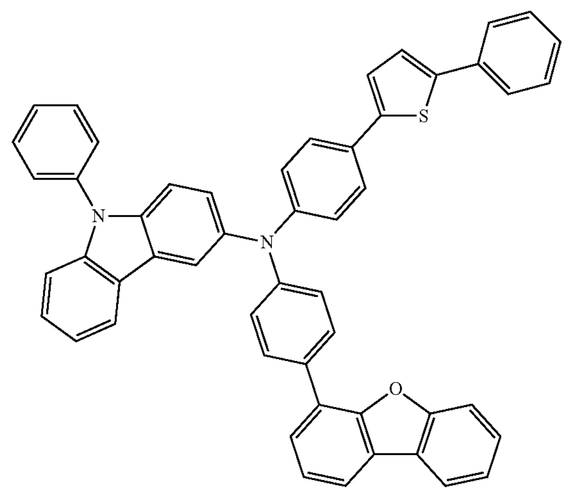
,
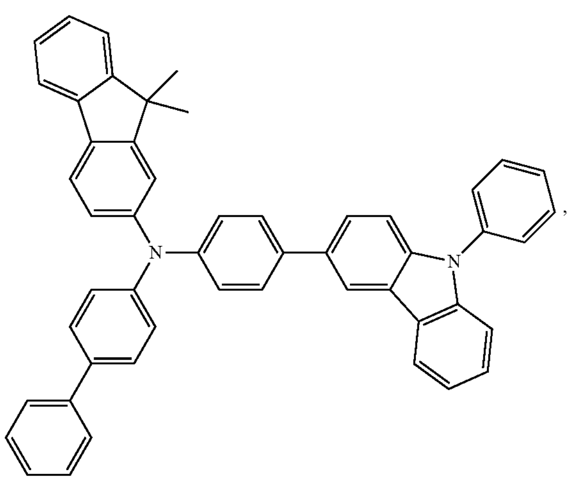
,
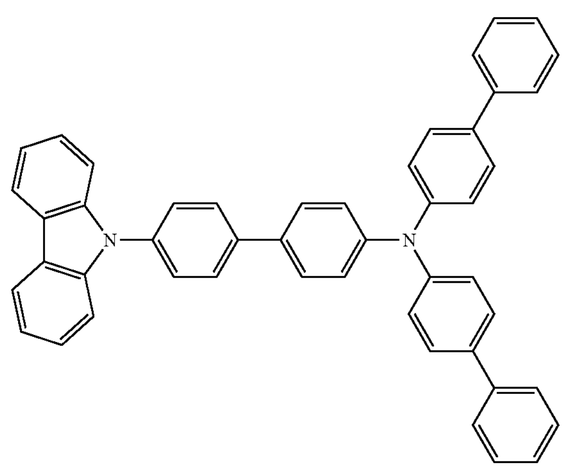
, -continued
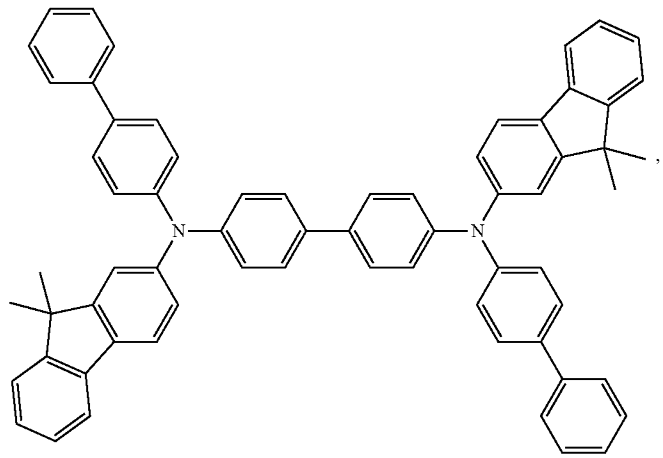
,
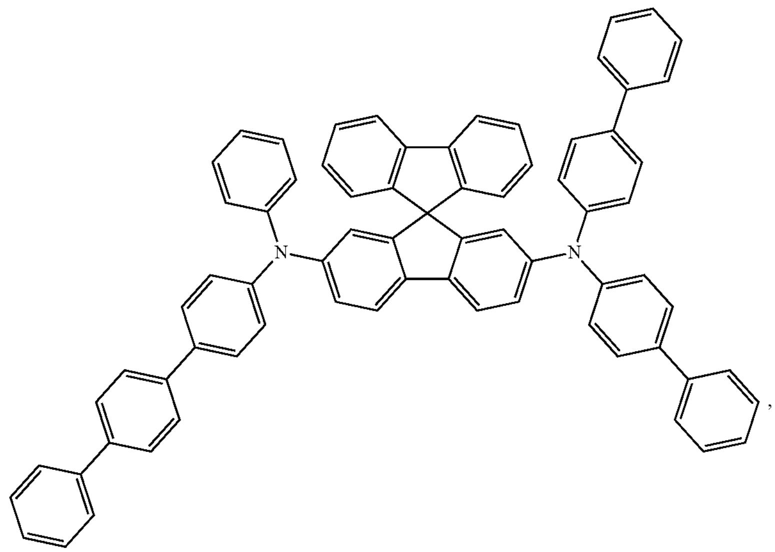
,
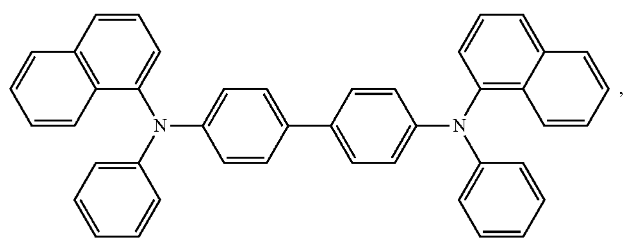
,
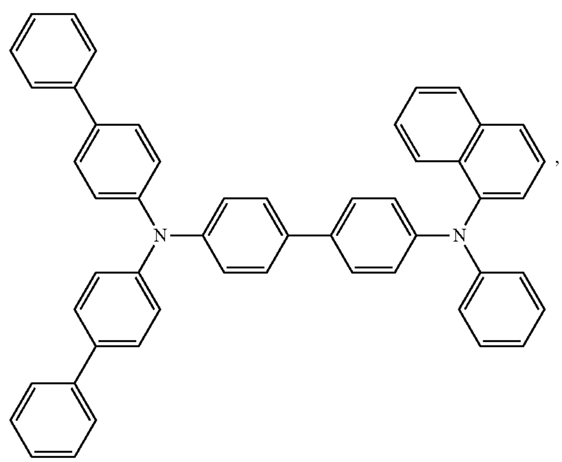
,
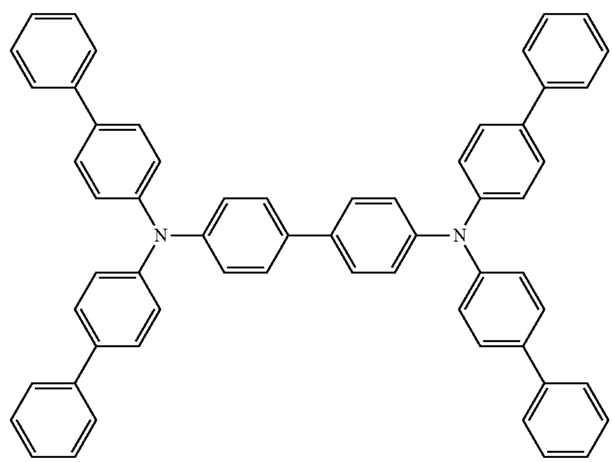
, -continued
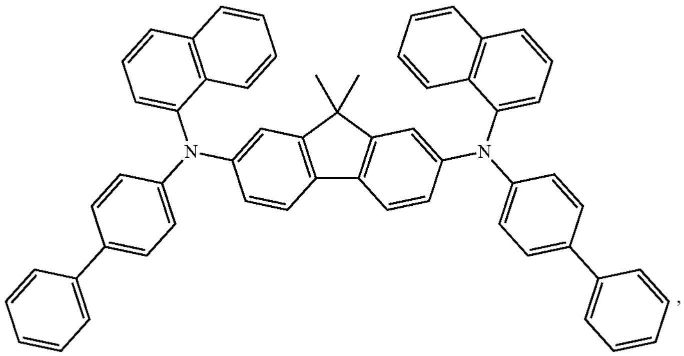
,
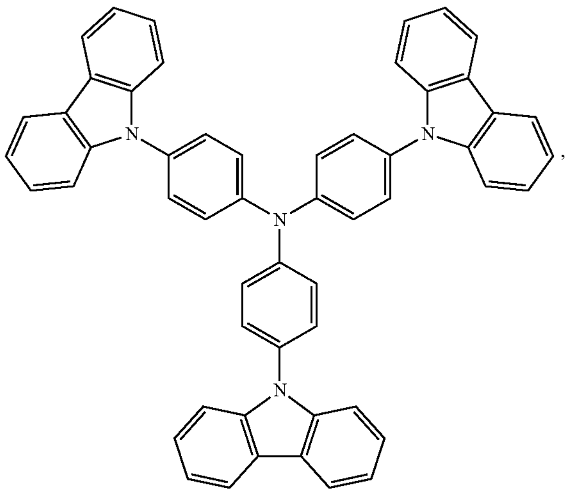
,
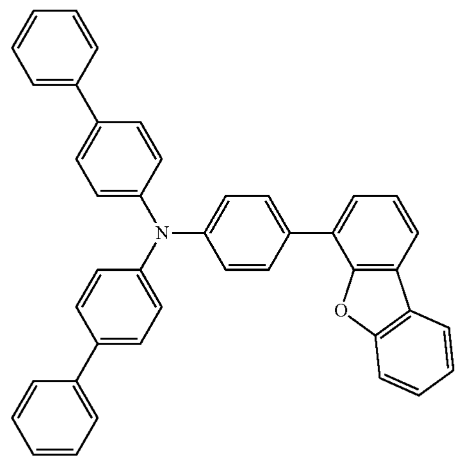
,
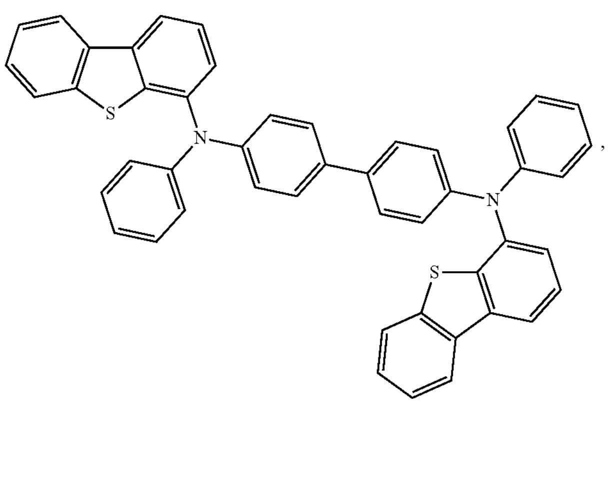
,
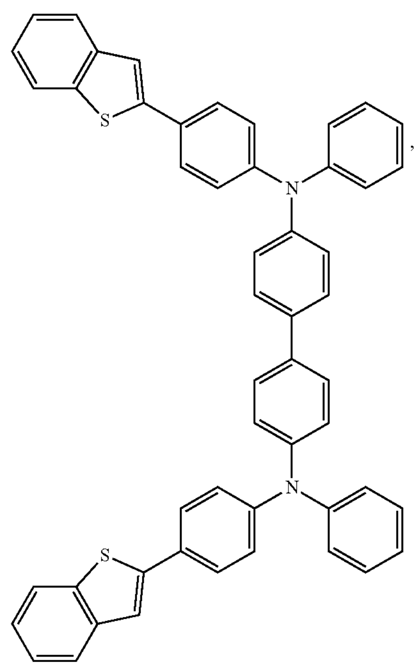
, and -continued

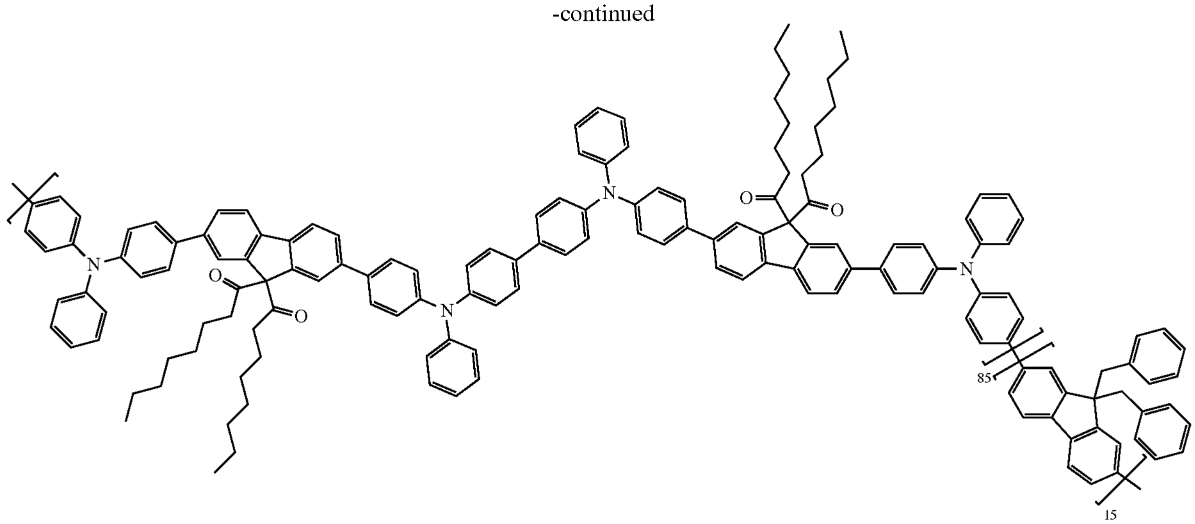

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria are satisfied.

Examples of metal complexes used as host are preferred to have the following general formula:

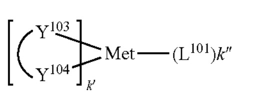

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

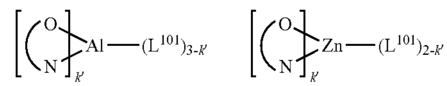

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

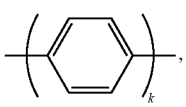
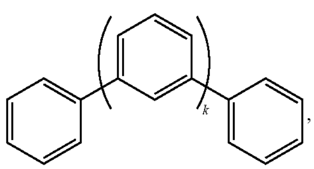
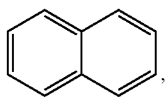
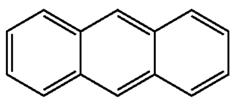
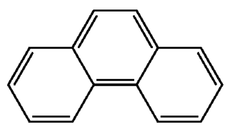
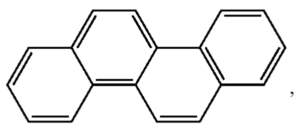
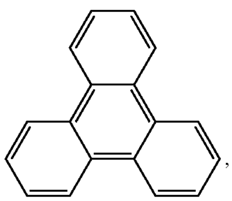
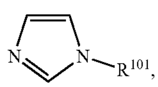
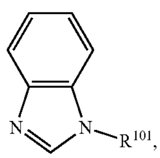
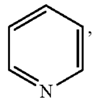
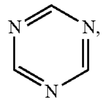
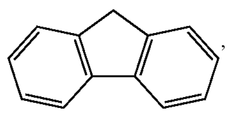
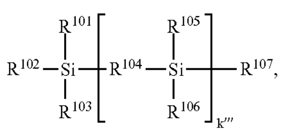
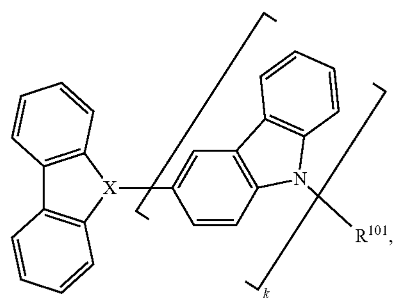
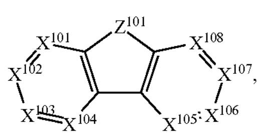
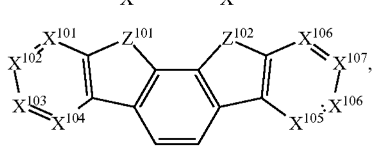
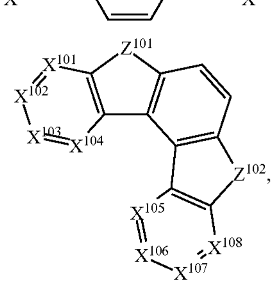

-continued

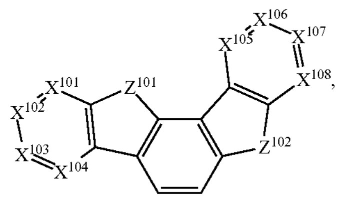
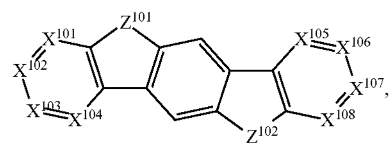
and

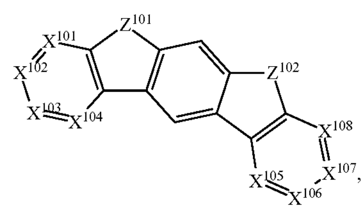

wherein each of $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ars mentioned above. k is an integer from 0 to 20 or 1 to 20; k''' is an integer from 0 to 20. $X^{101}$ to $X^{108}$ is selected from C (including CH) or N. $Z^{101}$ and $Z^{102}$ is selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

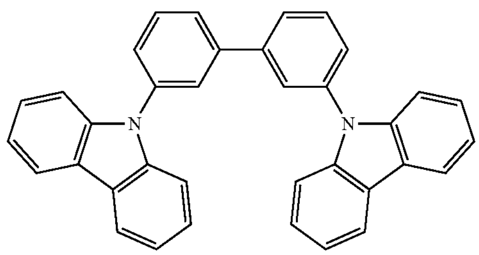
,
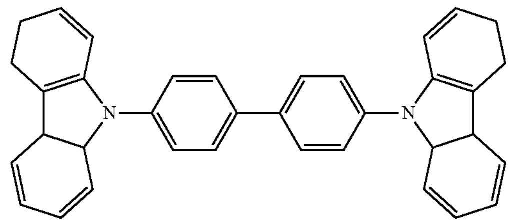
,
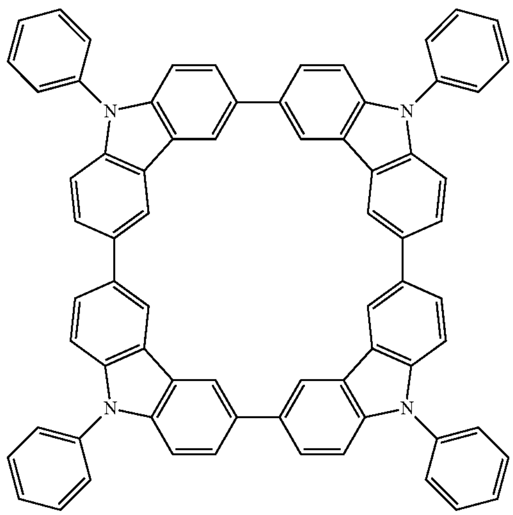
,
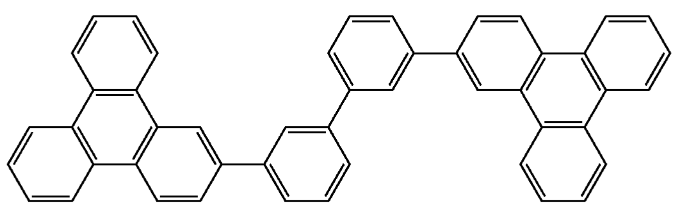
,
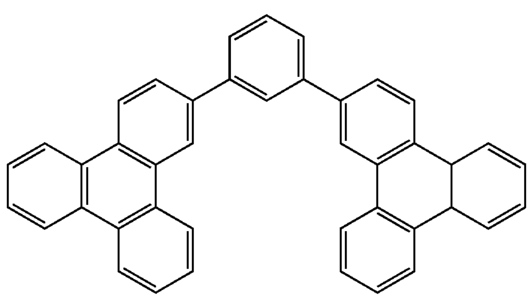
,
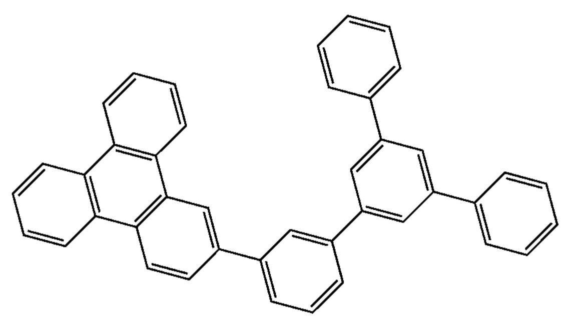
,
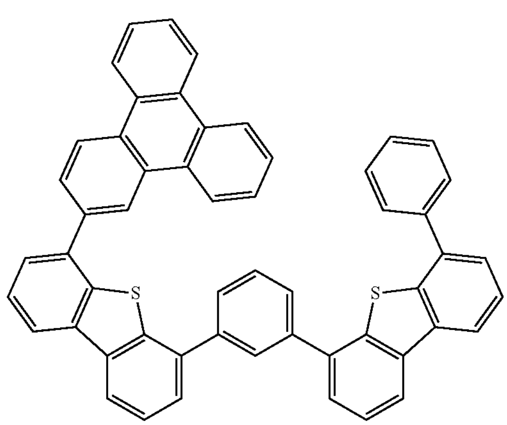
,
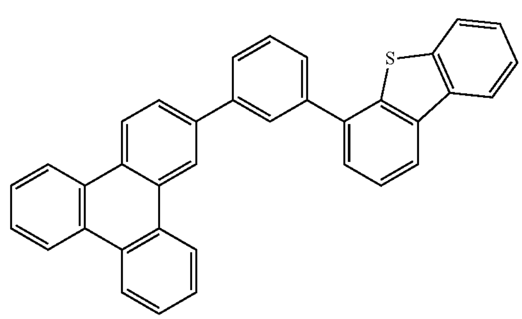
, -continued
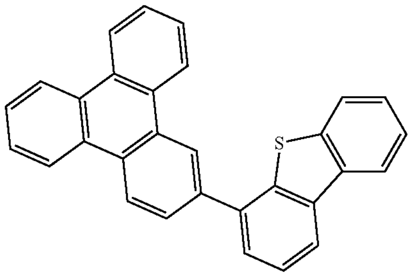
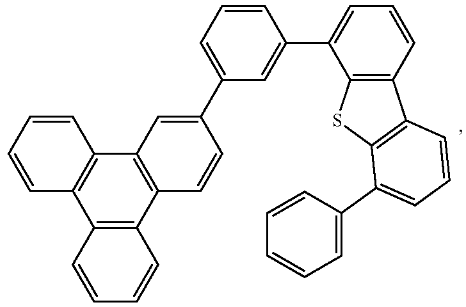
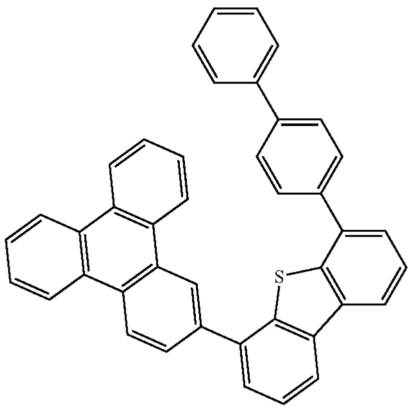
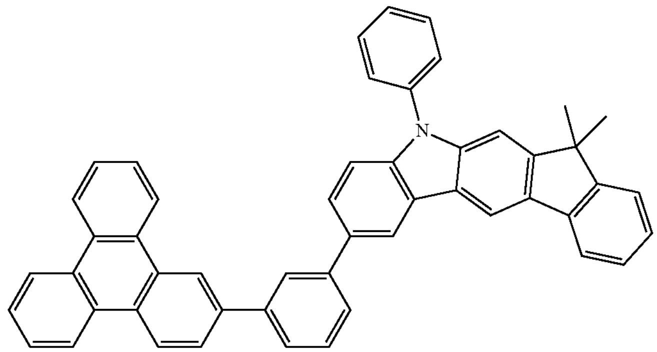
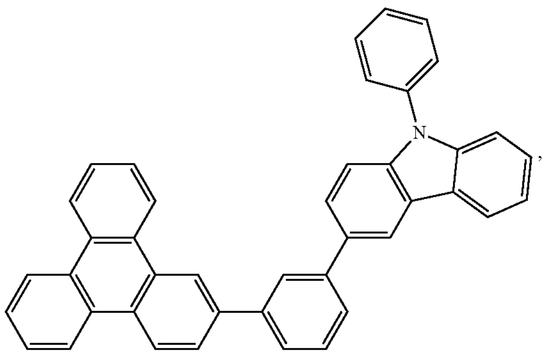
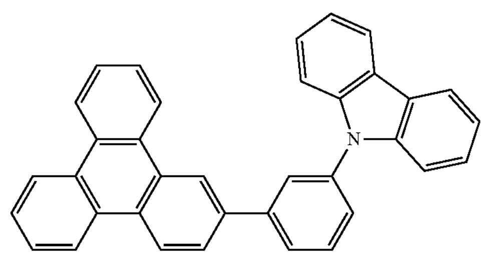
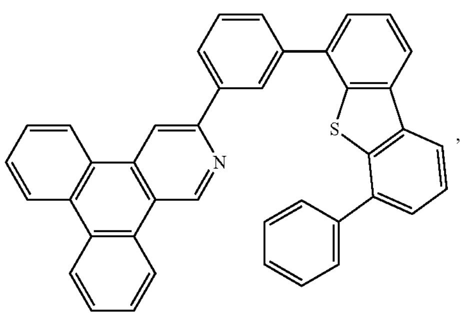
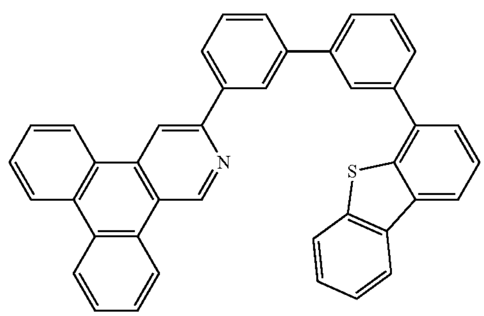
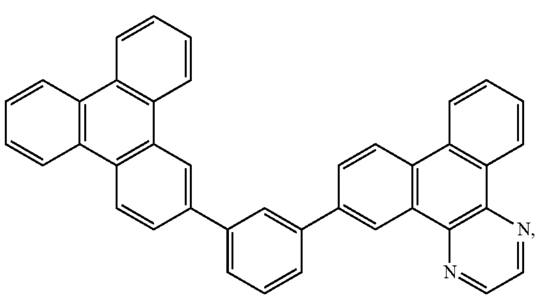
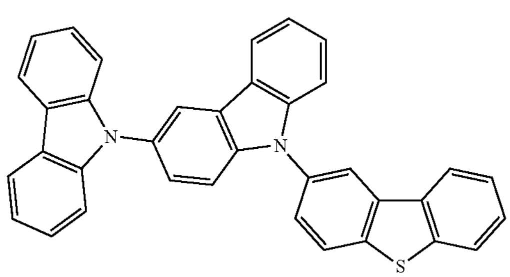

-continued
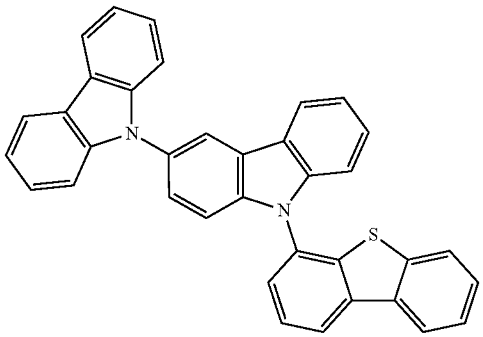
,
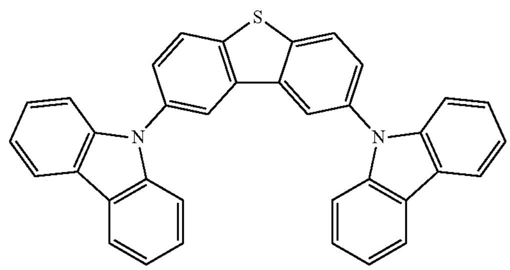
,
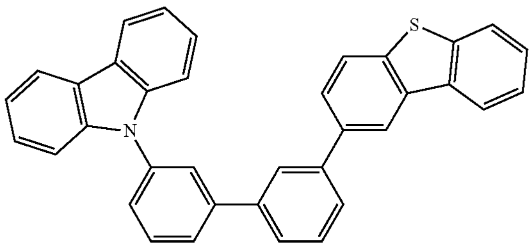
,
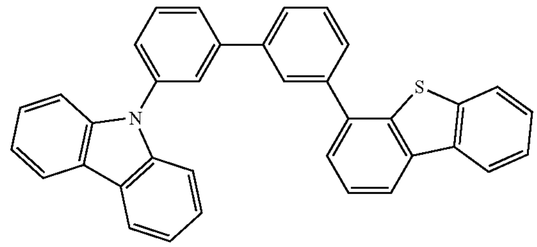
,
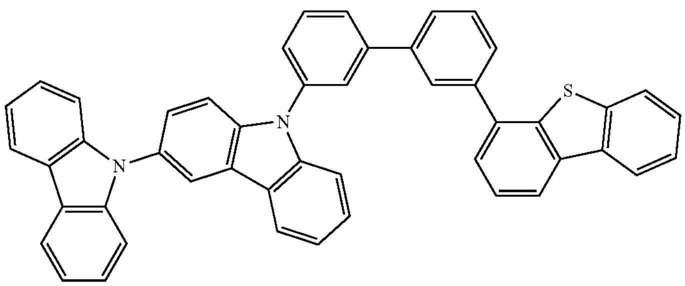
,
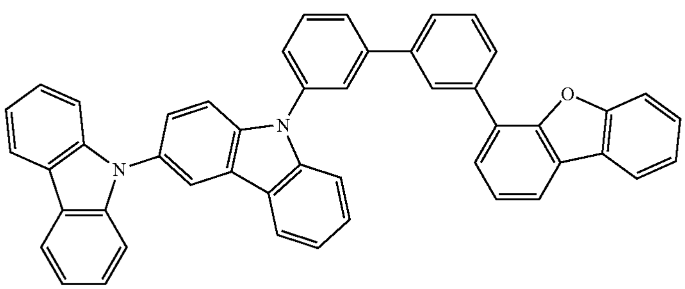
,
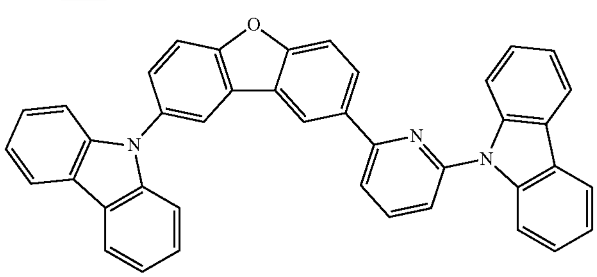
,
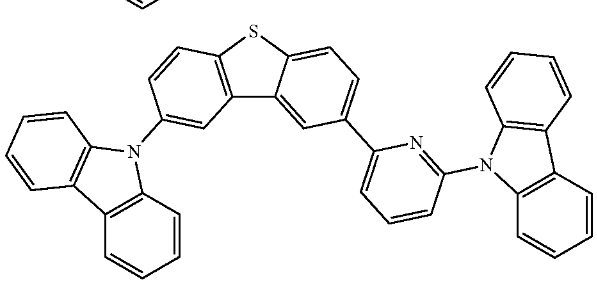
, -continued
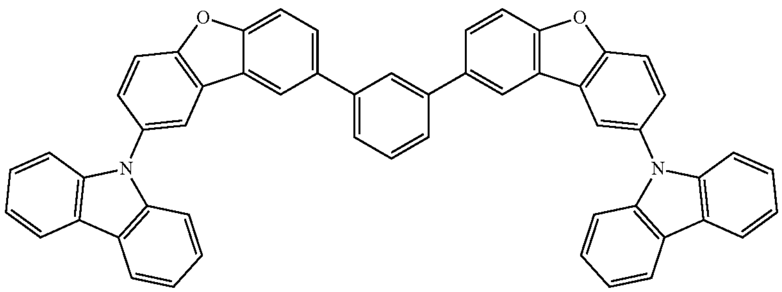
,
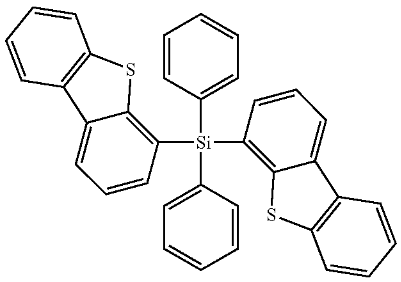
,
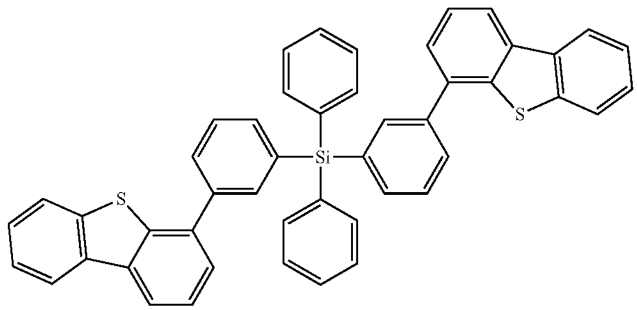
,
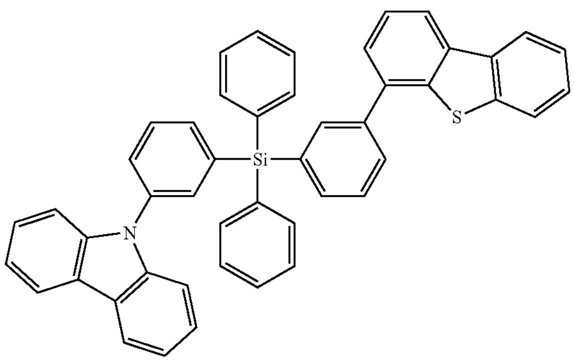
,
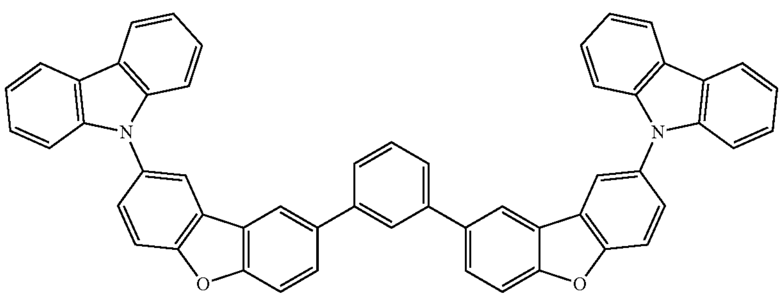
,
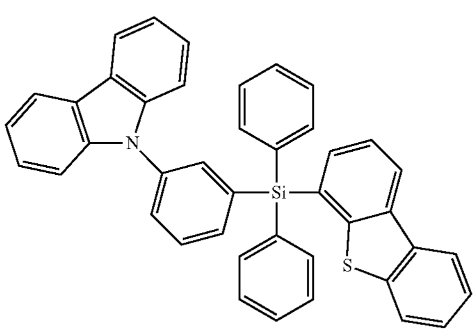
,
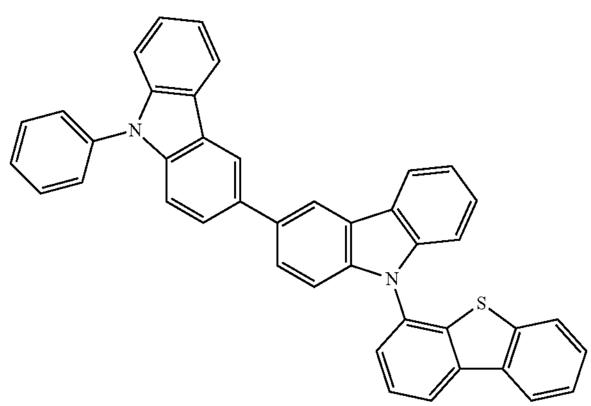
, -continued
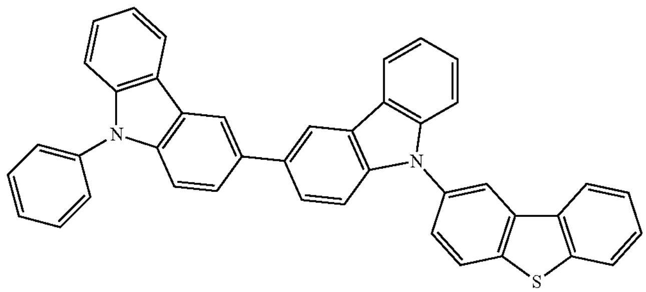
,
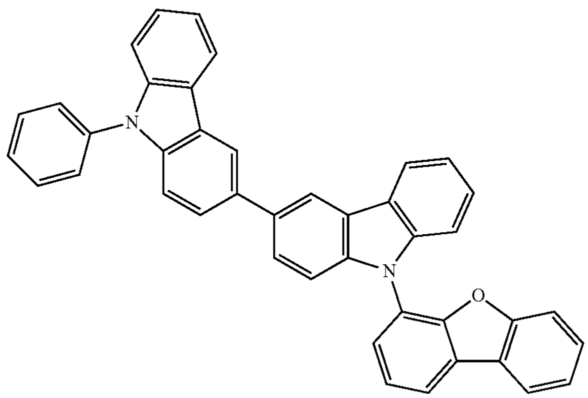
,
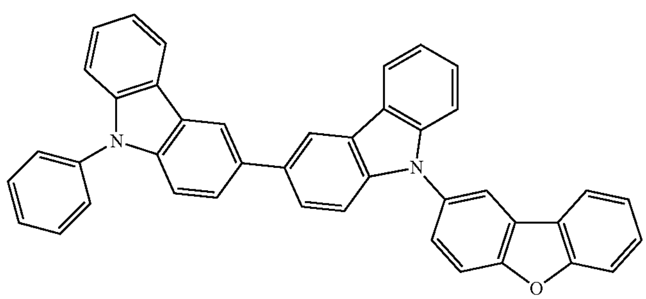
,
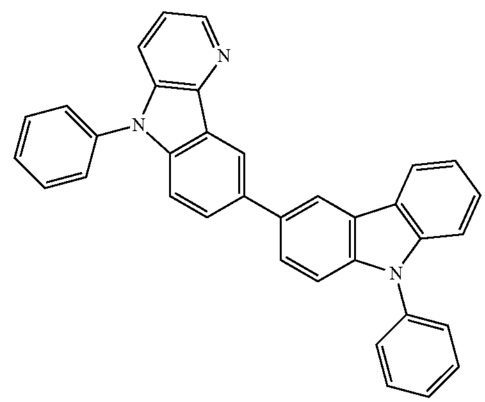
,
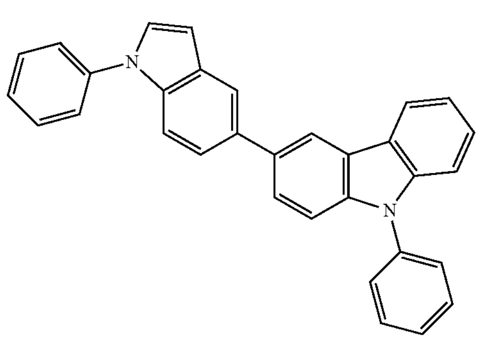
,
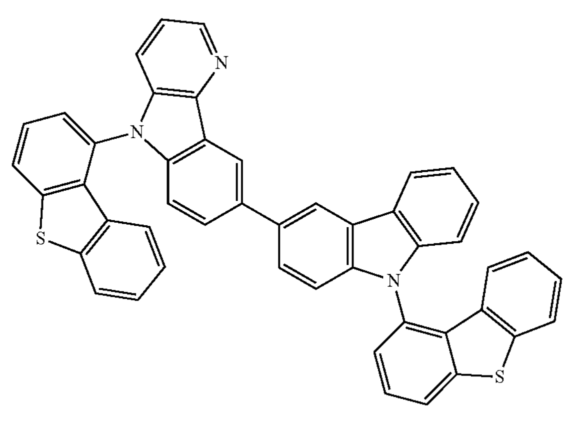
, -continued
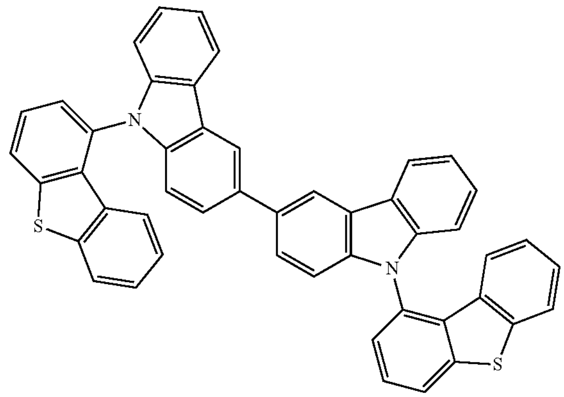
,
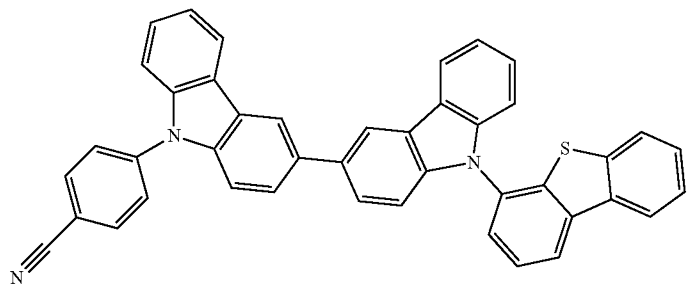
,
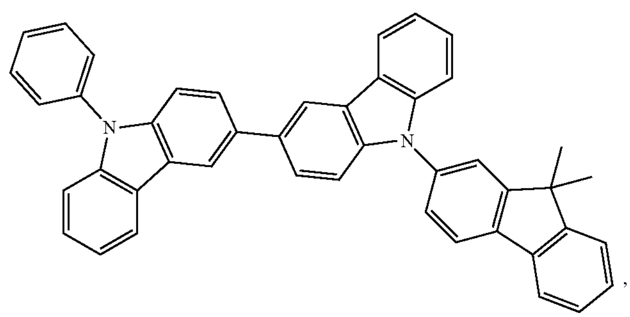
,
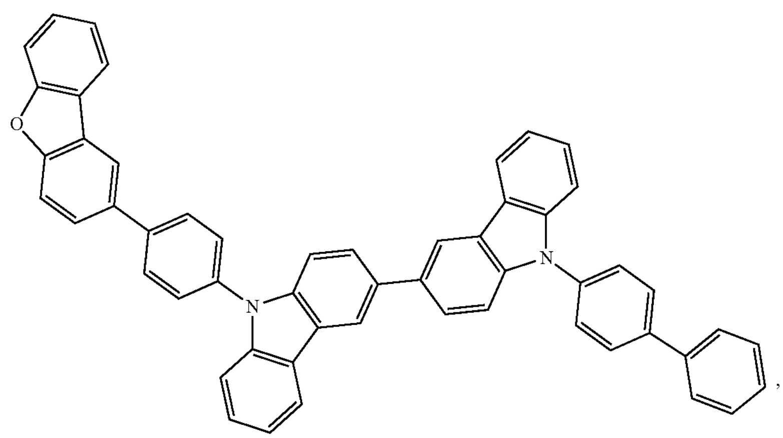
, -continued
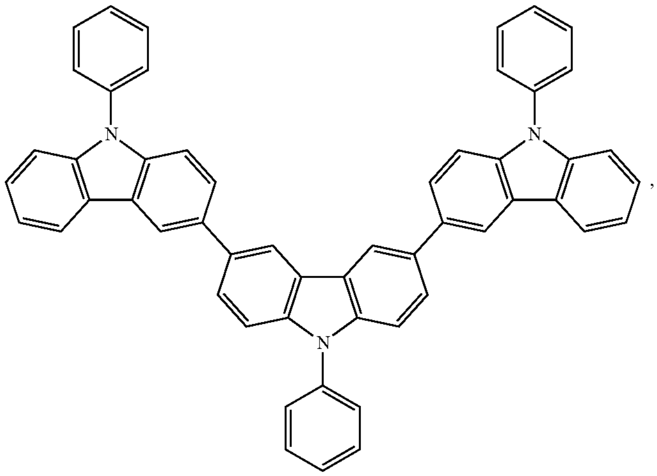
,
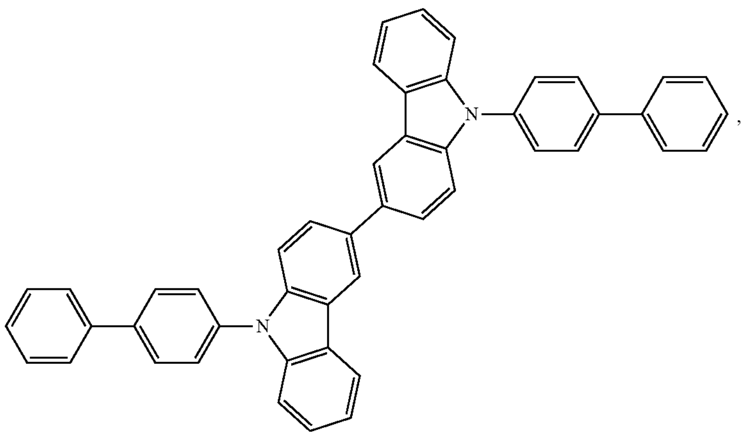
,
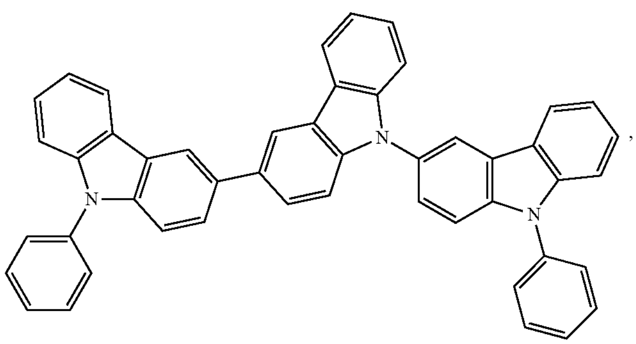
,
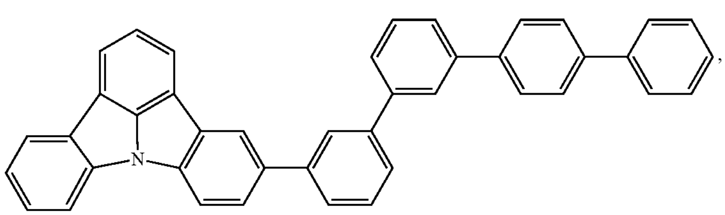
, -continued
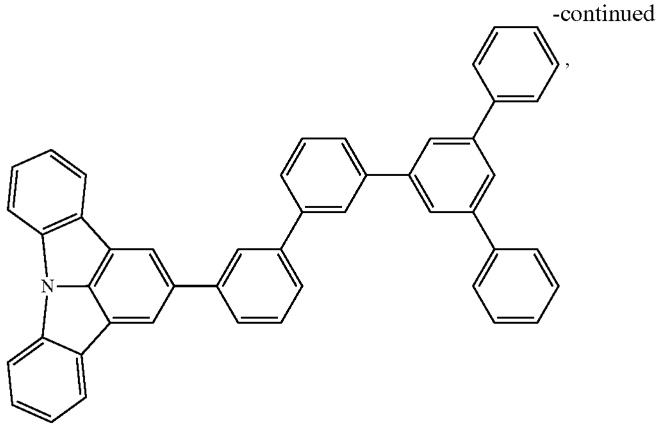
,
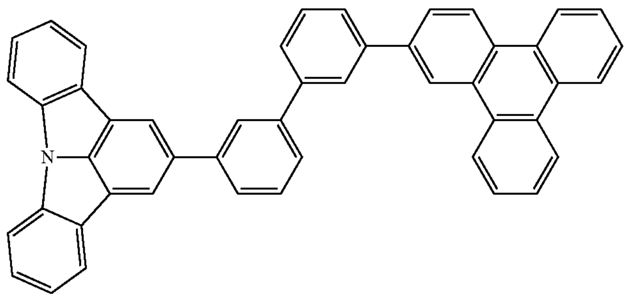
,
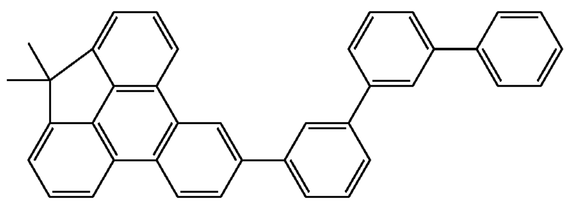
,
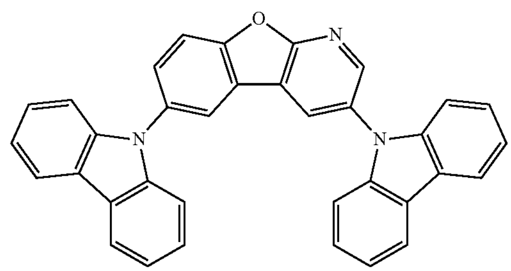
,
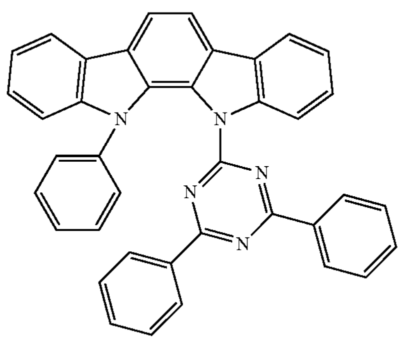
,
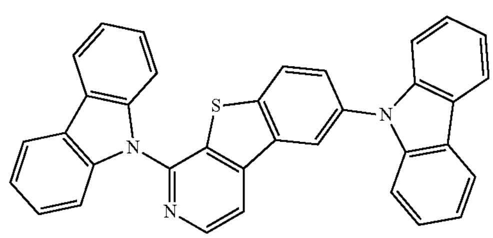
,
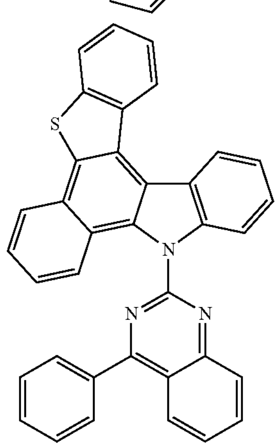
,
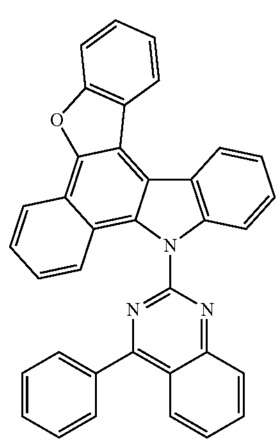
,
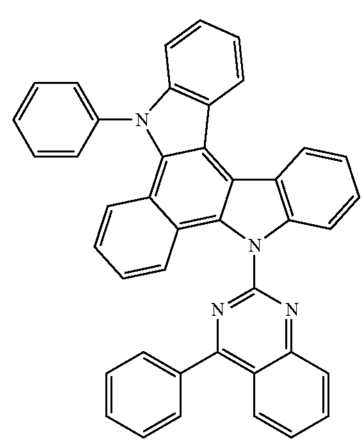
, -continued
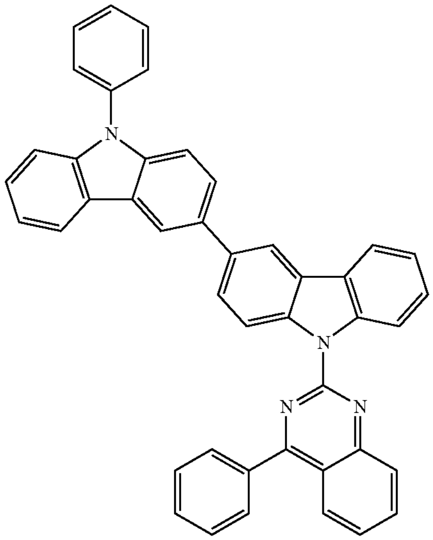
,
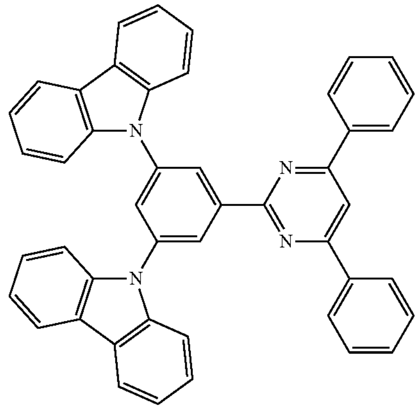
,
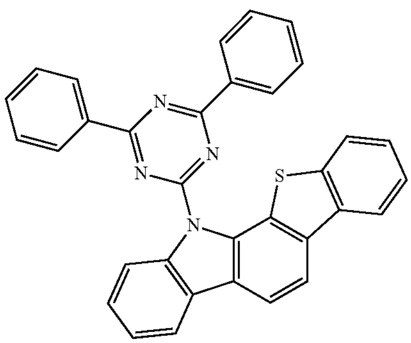
,
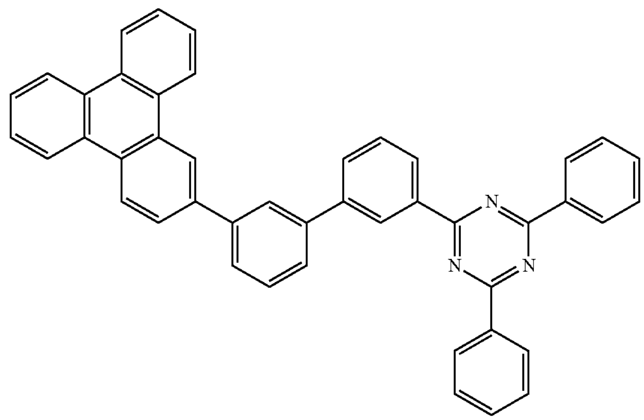
,
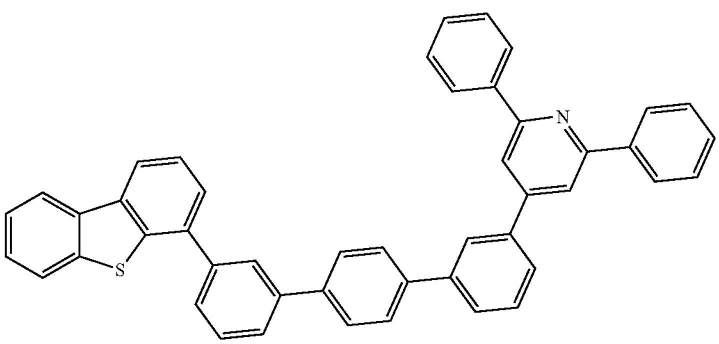
,
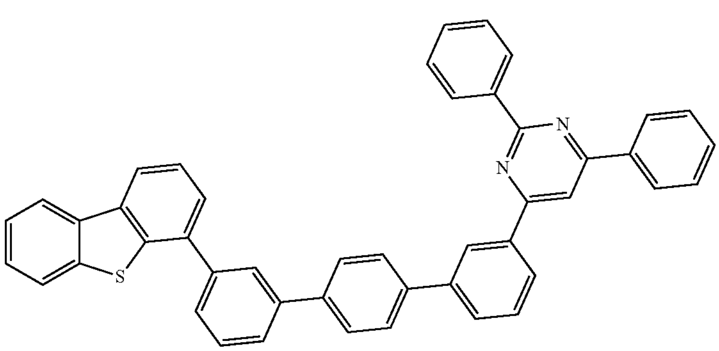
, -continued
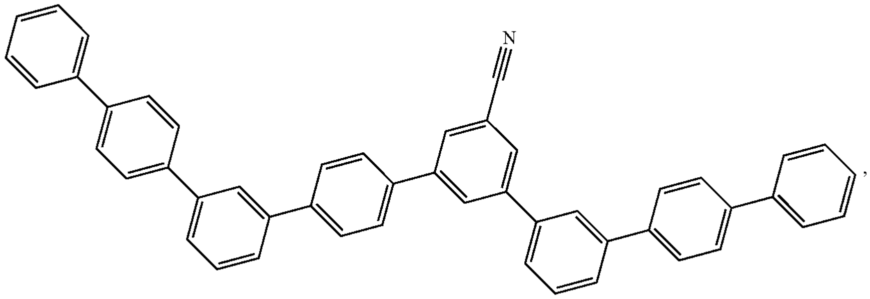
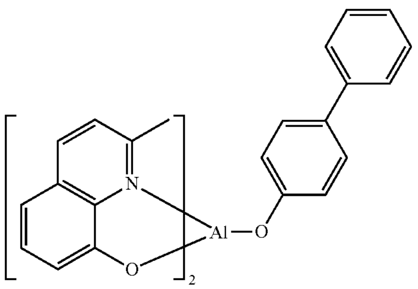
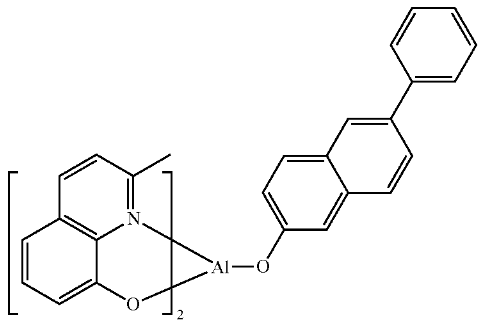
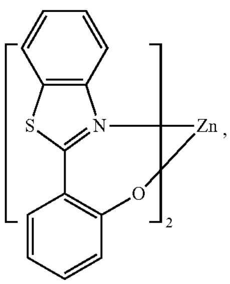
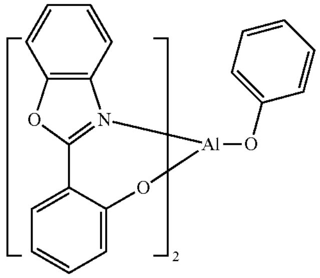
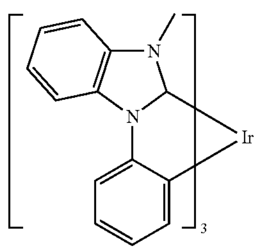
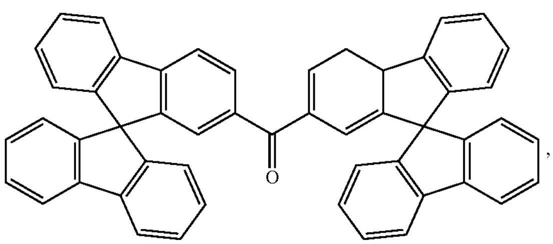
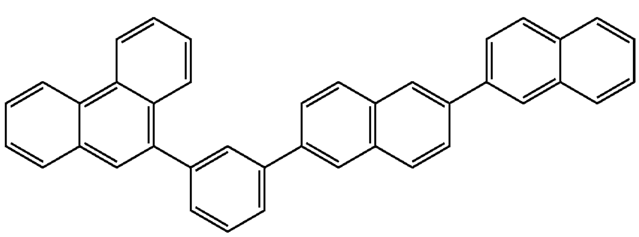
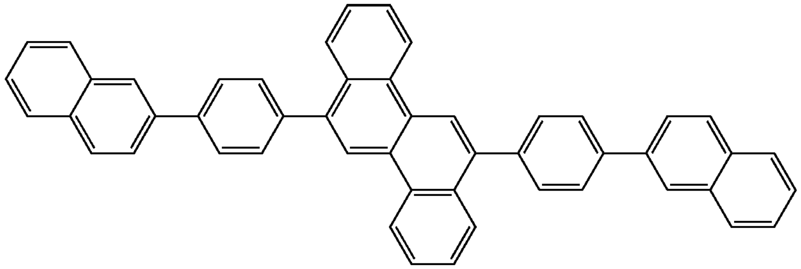
and -continued

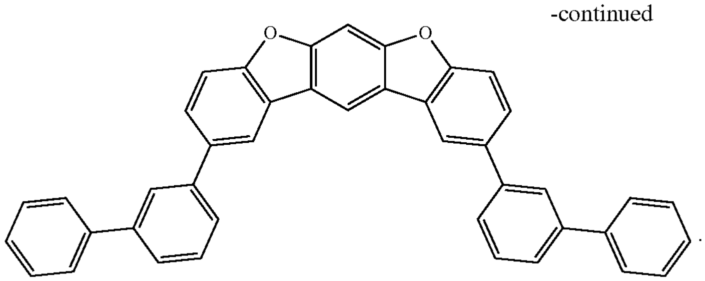

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

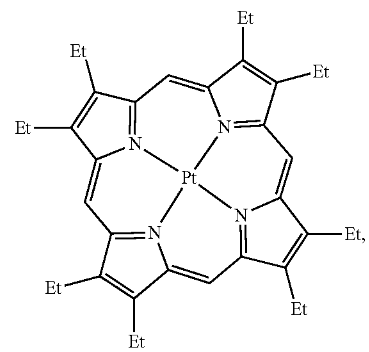

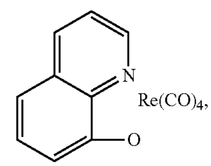

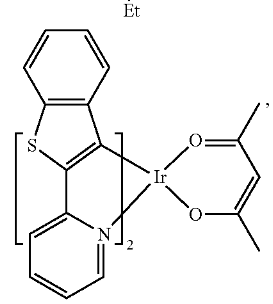

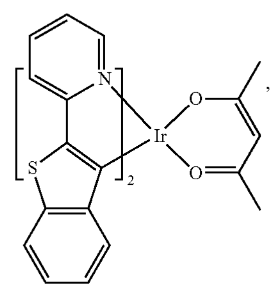

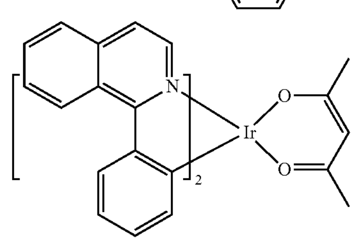

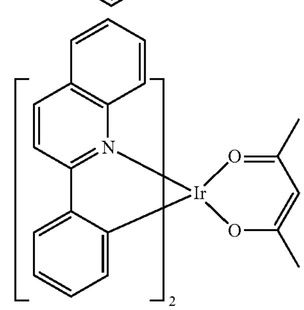

-continued
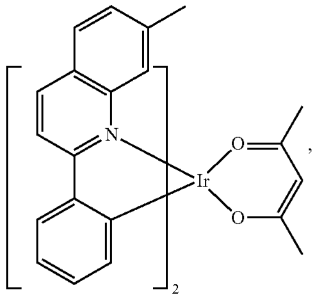
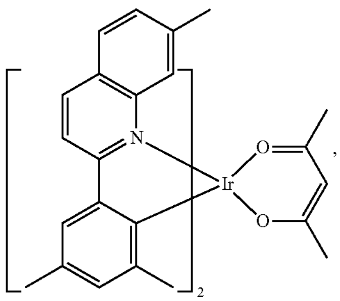
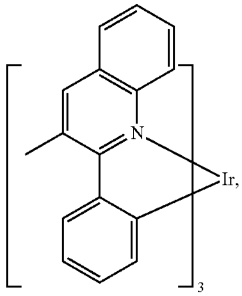
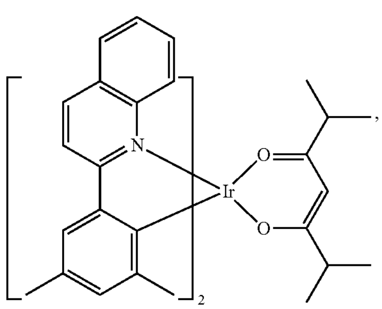
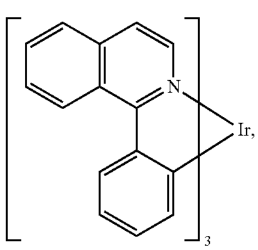
-continued
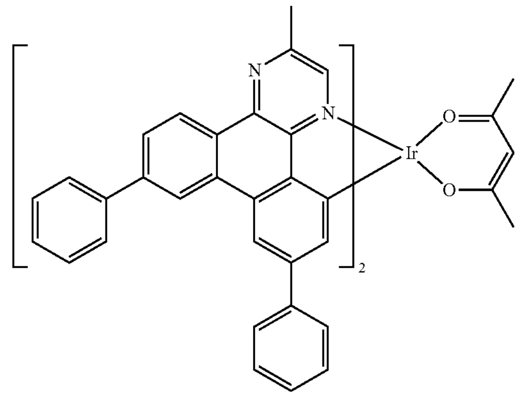
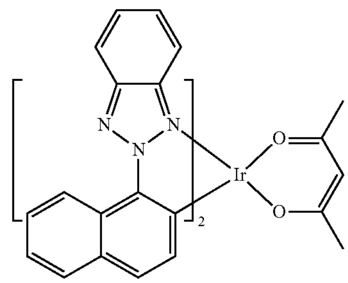
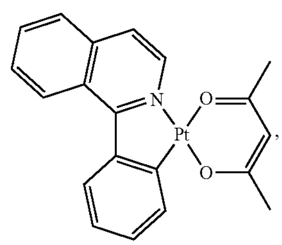
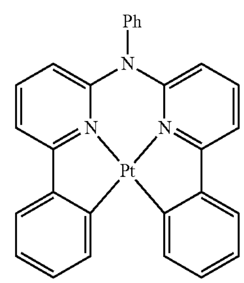
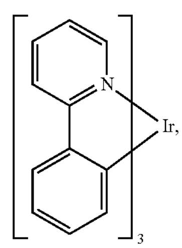
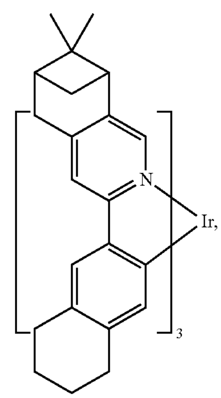
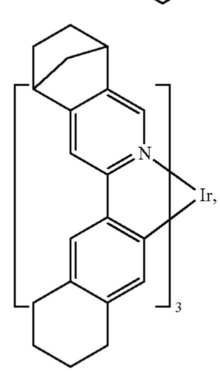

-continued
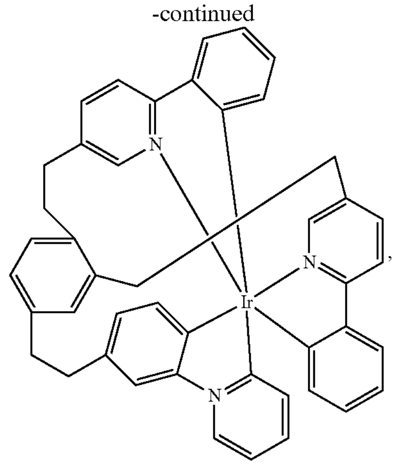
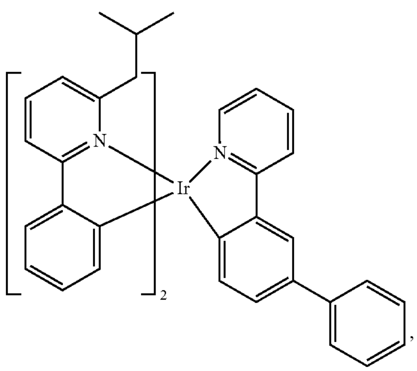
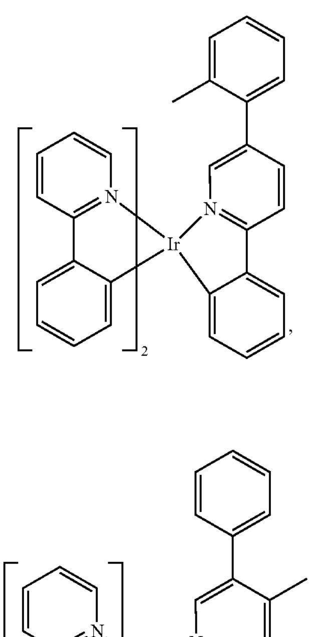
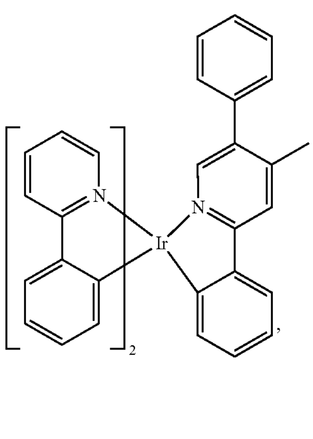
-continued
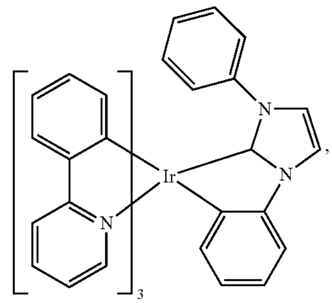
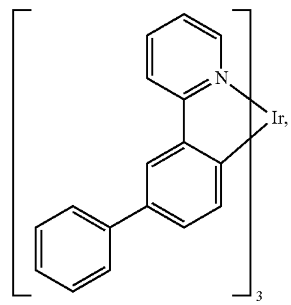
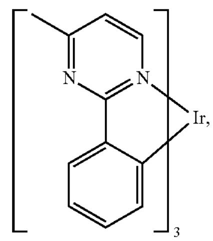
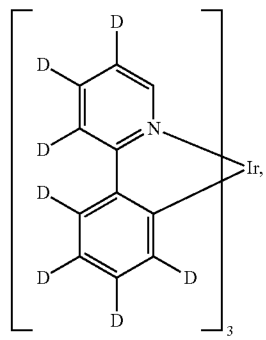
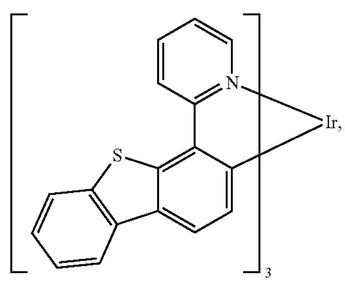
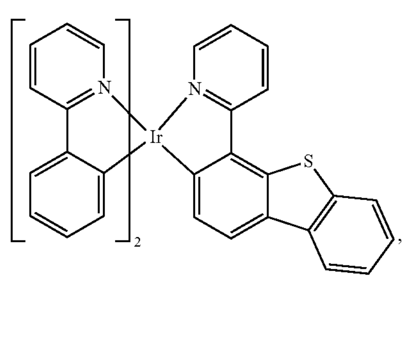

-continued
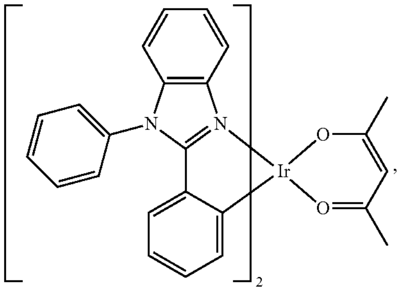
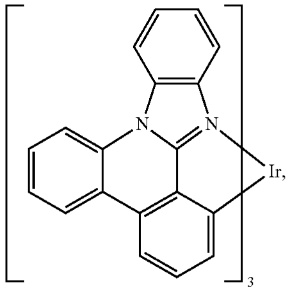
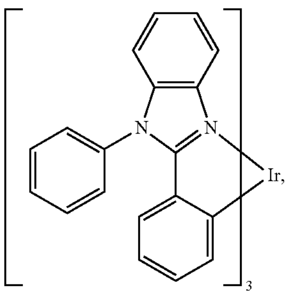
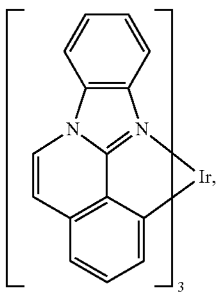
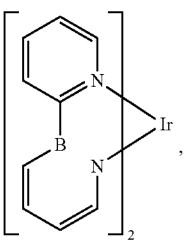
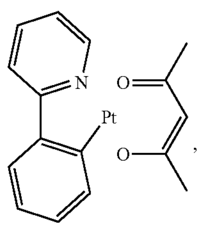
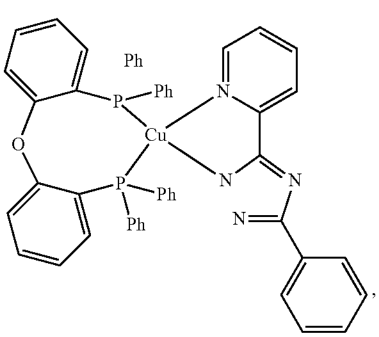
-continued
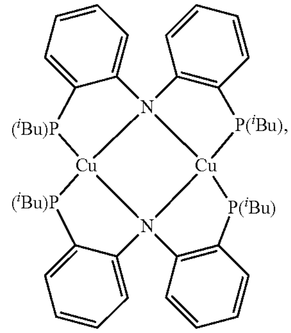
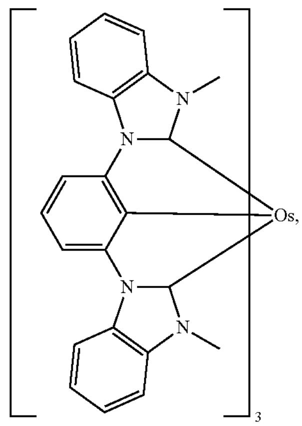
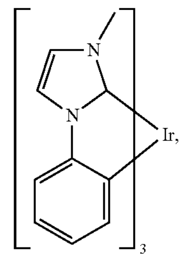
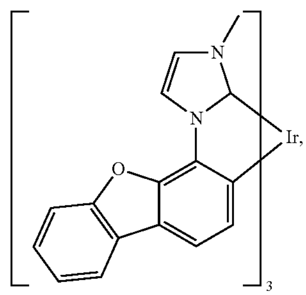
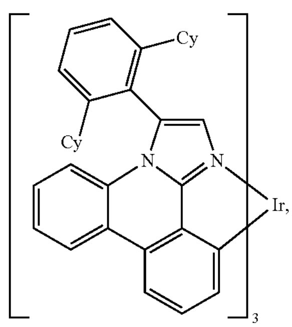
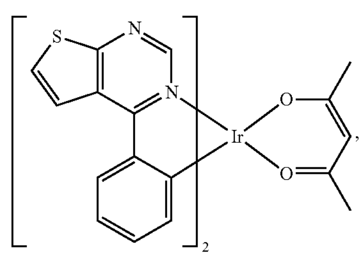

-continued
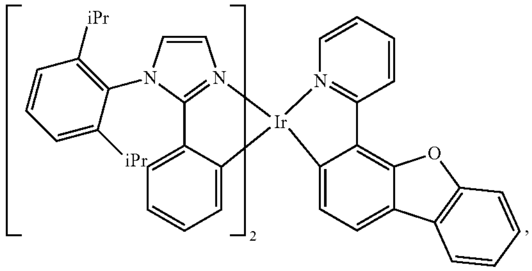
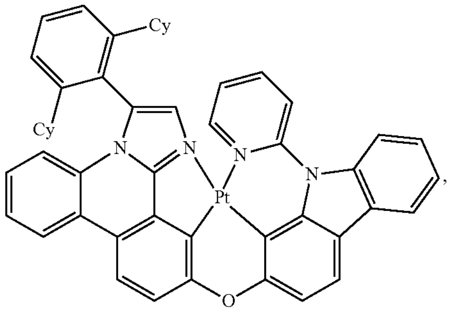
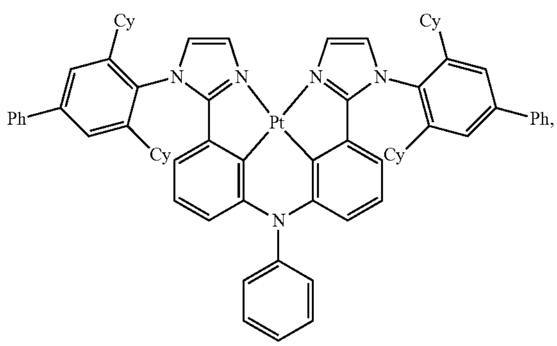
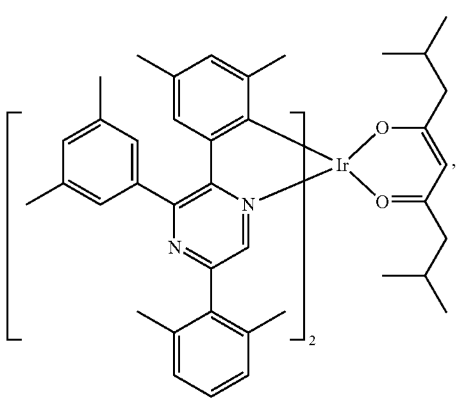
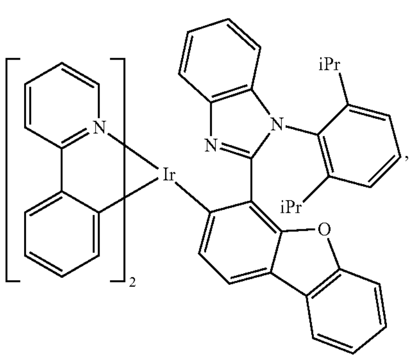
-continued
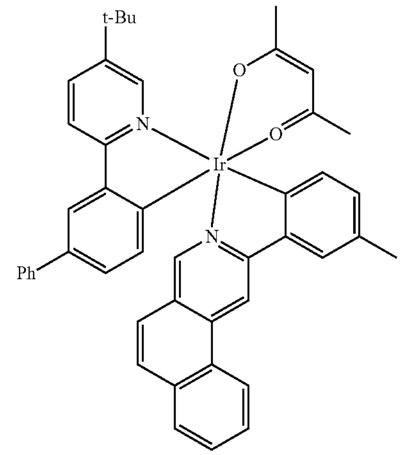
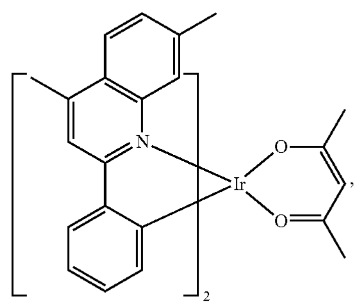
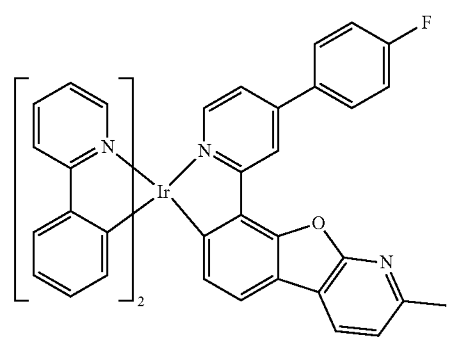
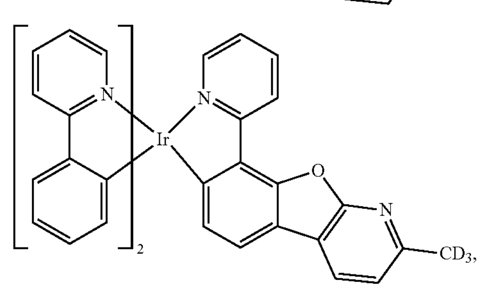
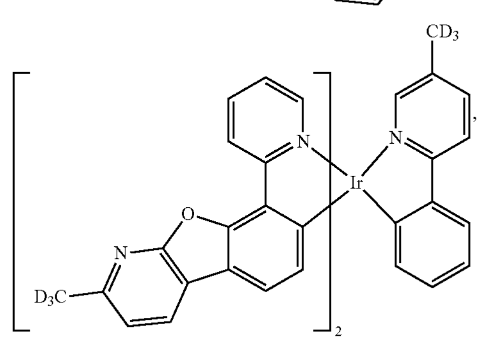

-continued
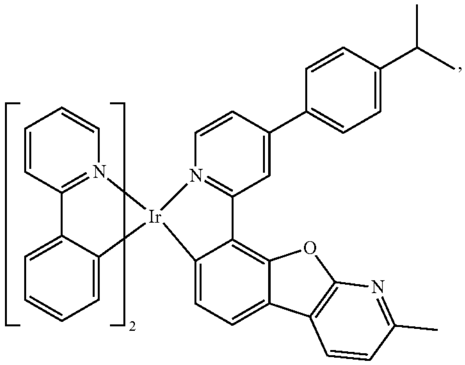
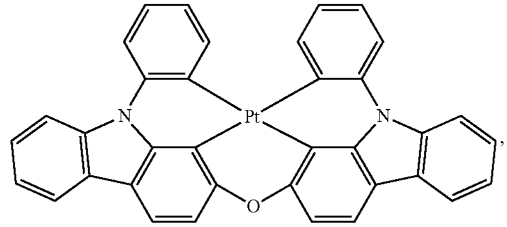
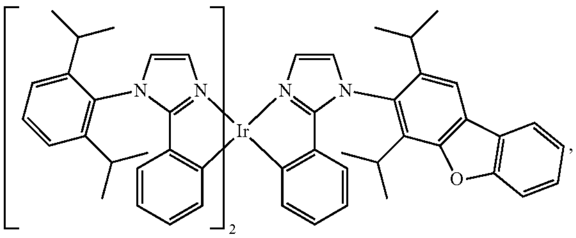
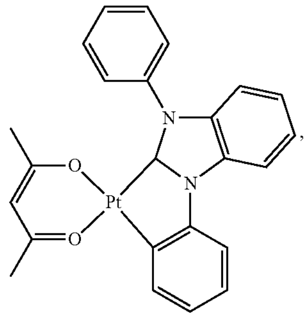
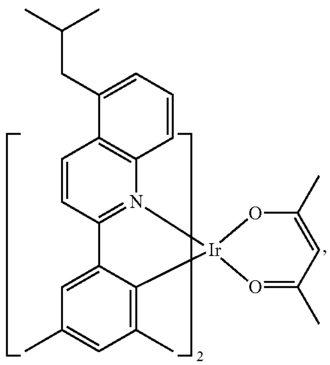
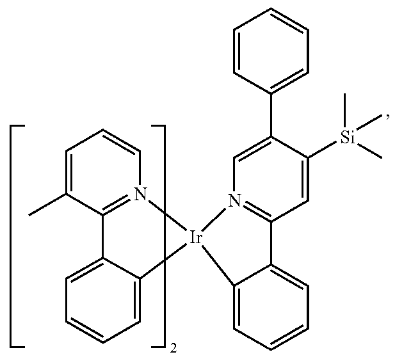
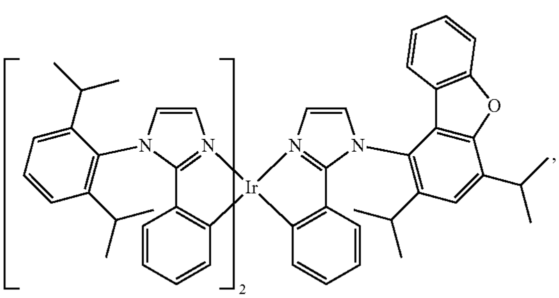
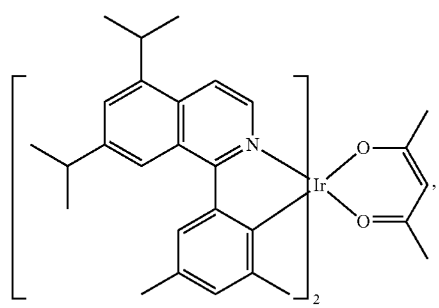
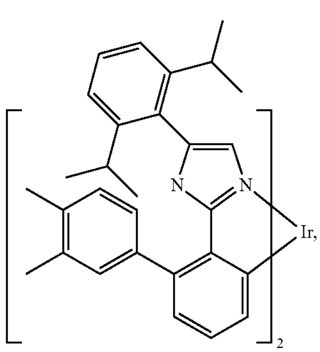
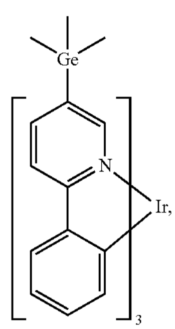
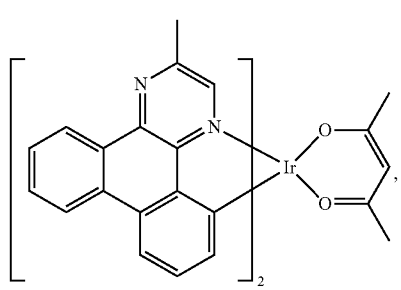

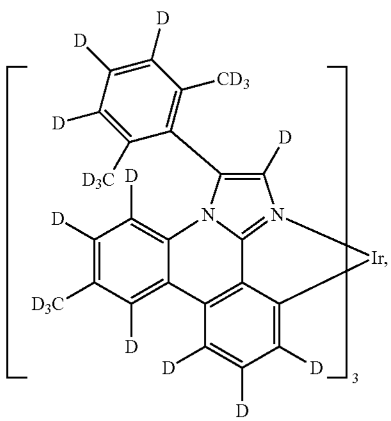
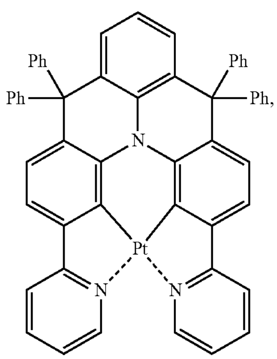
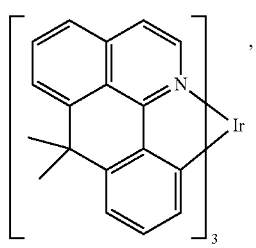
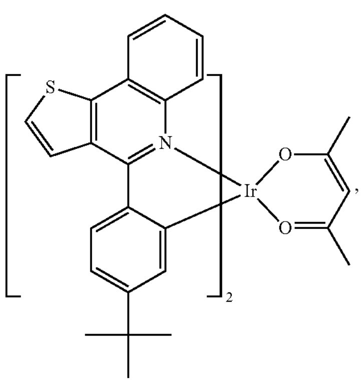
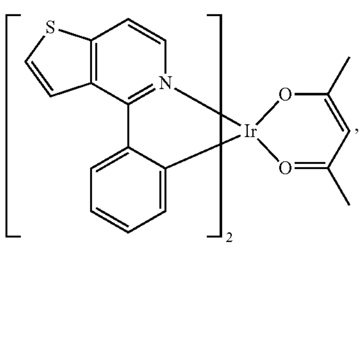
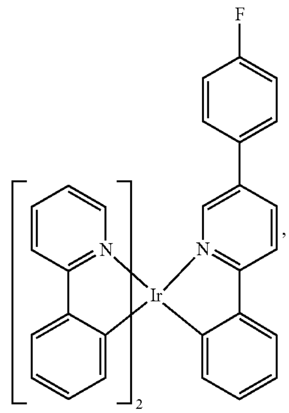
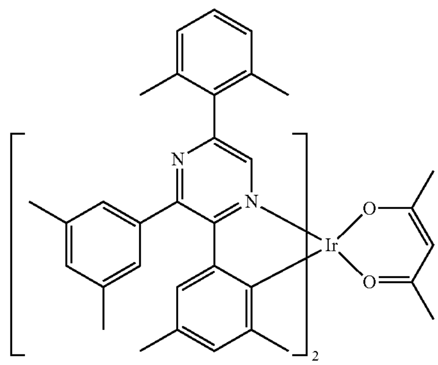
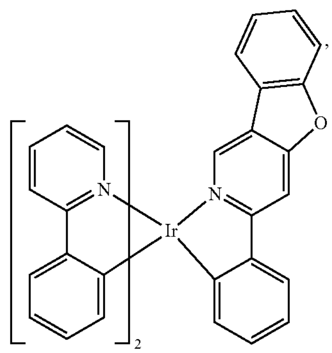
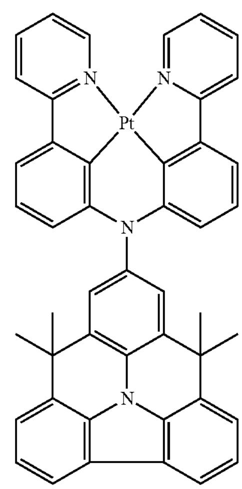
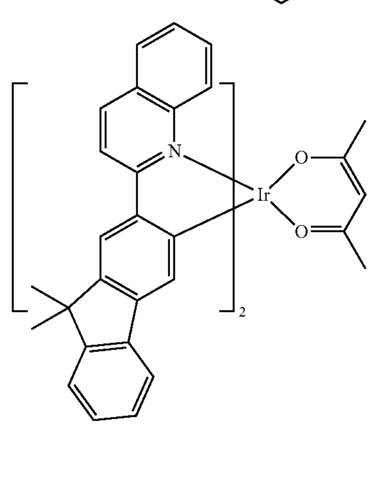

-continued
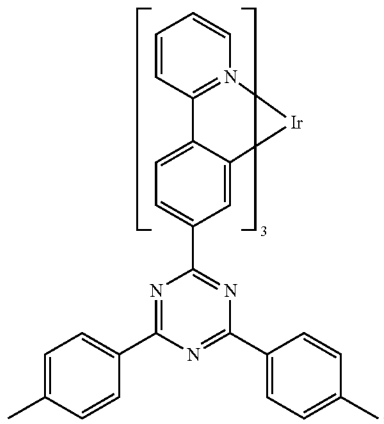
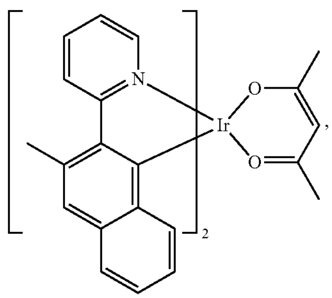
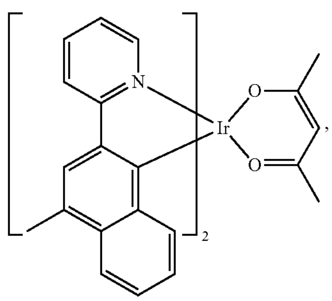
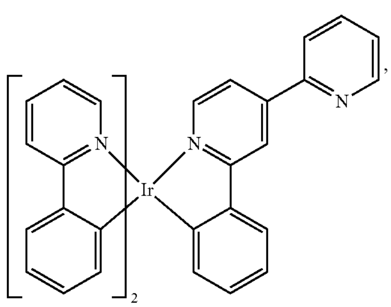
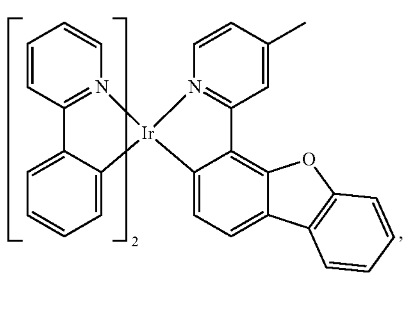
-continued
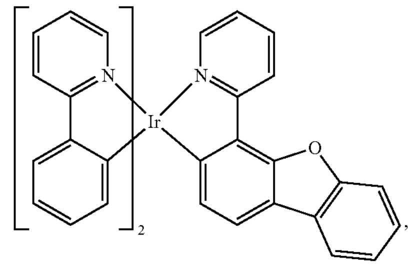
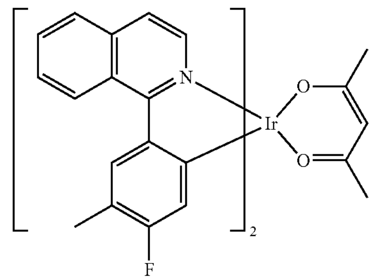
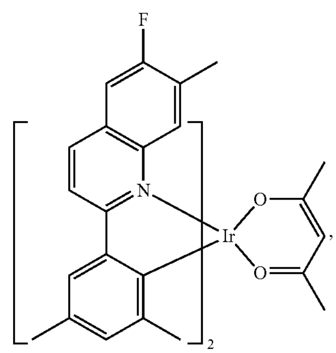
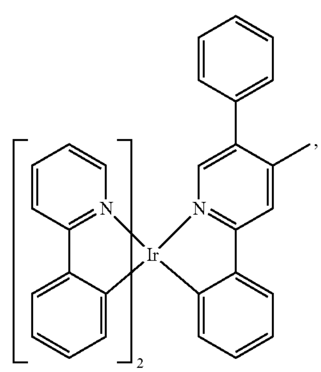
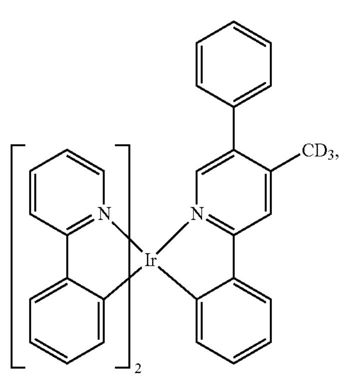

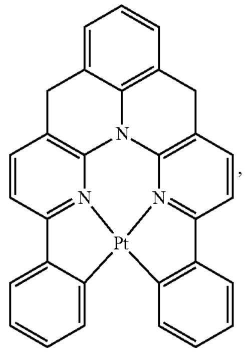
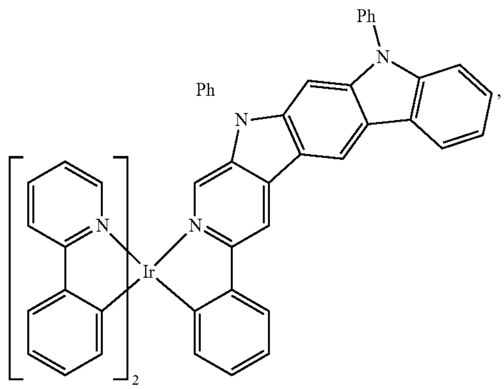
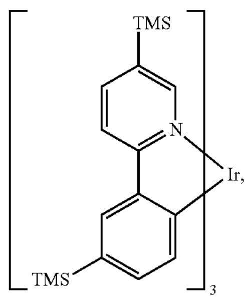
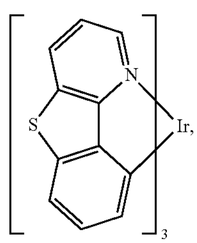
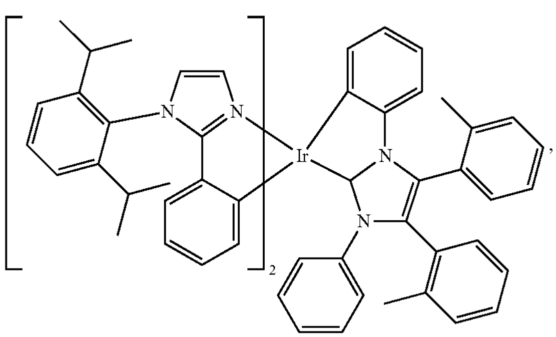
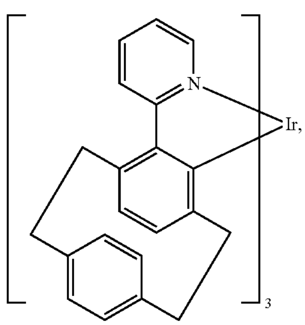
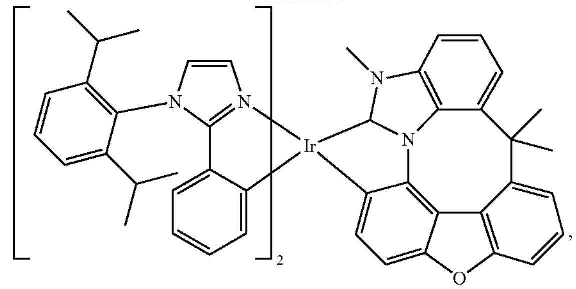
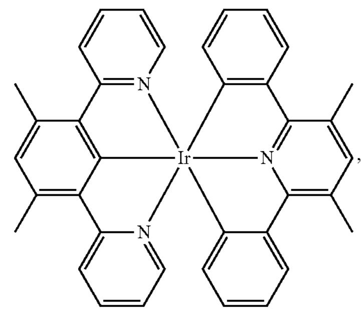
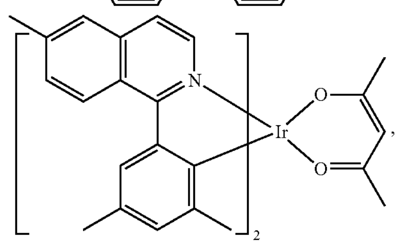
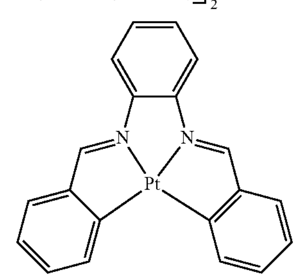
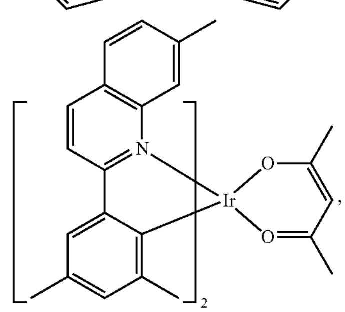
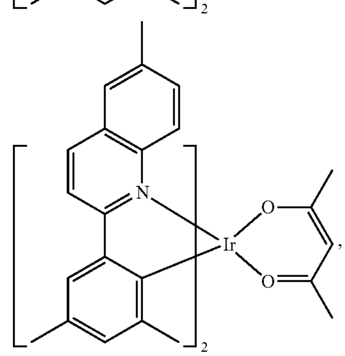

-continued
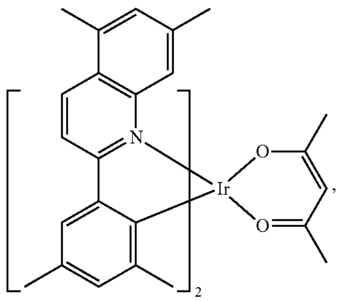
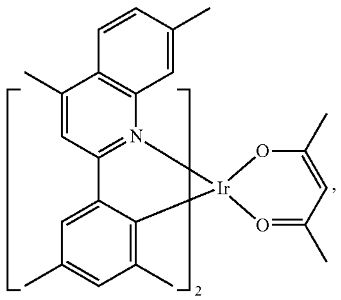
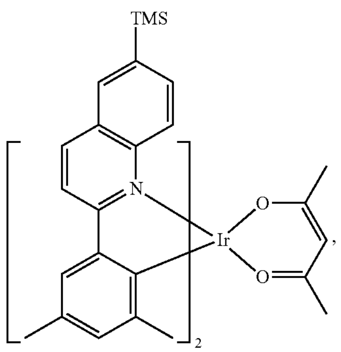
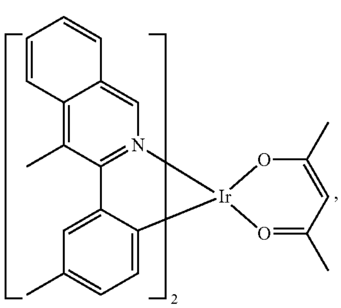
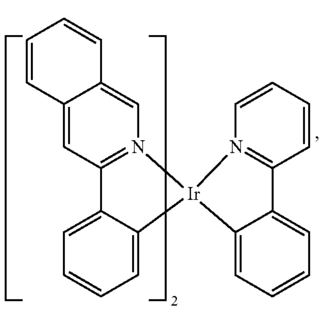
-continued
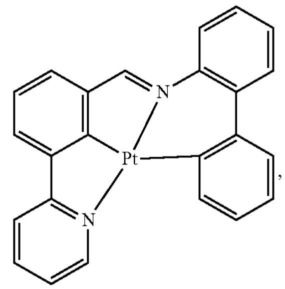
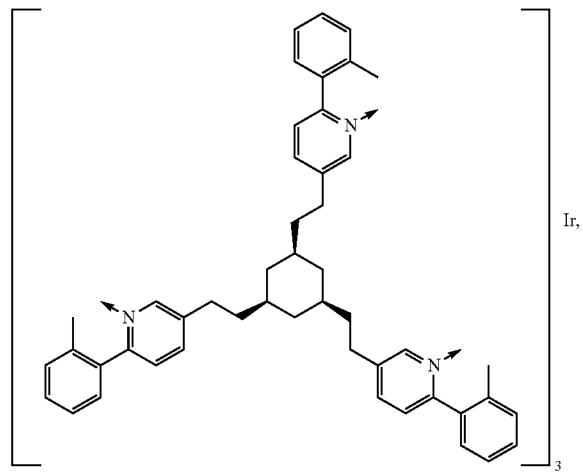
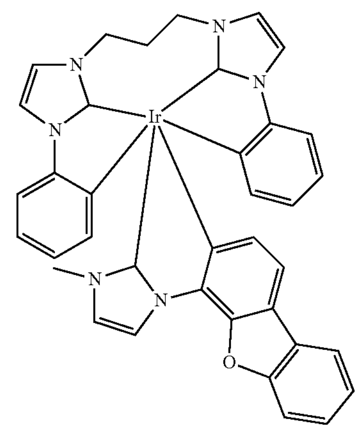
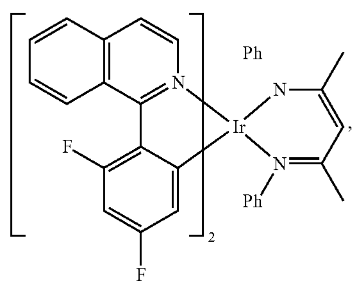

-continued
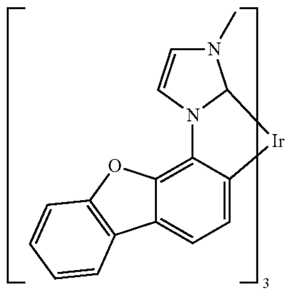
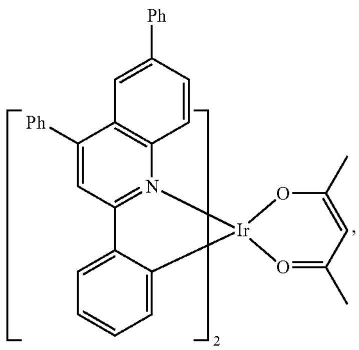
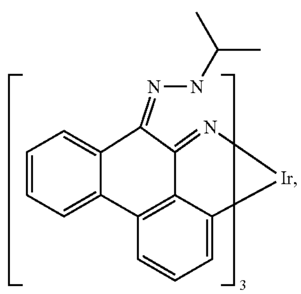
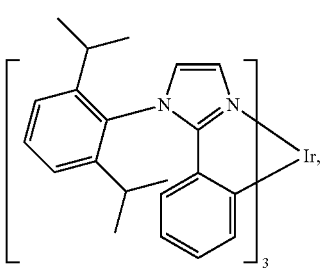
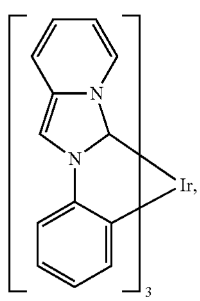
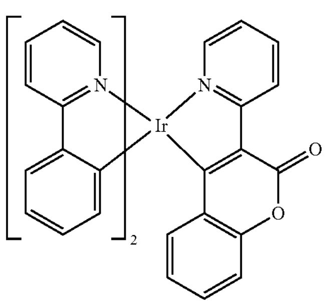
-continued
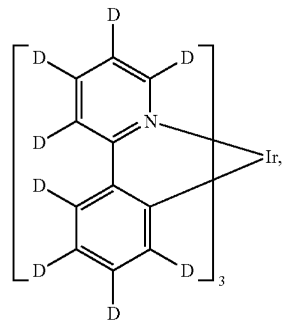
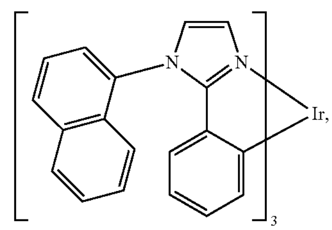
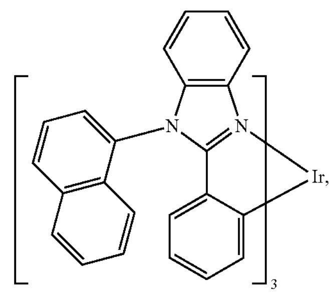
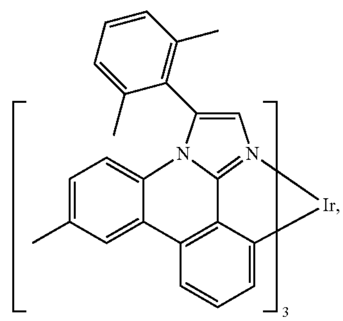
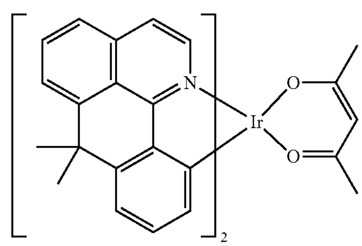
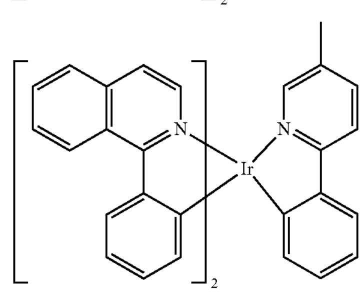

-continued

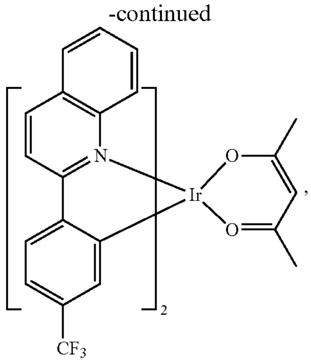

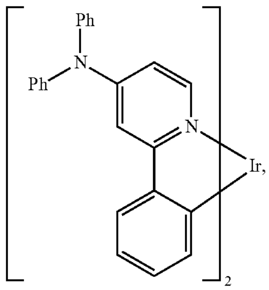

and

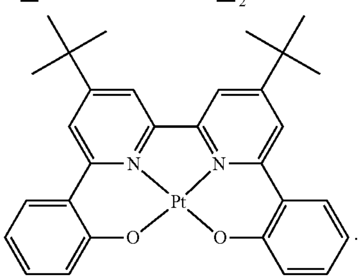

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

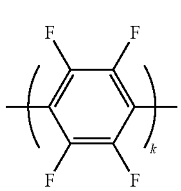

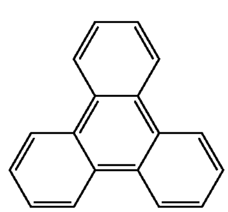

-continued

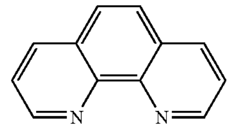

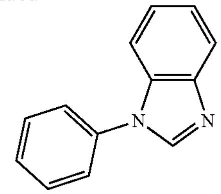

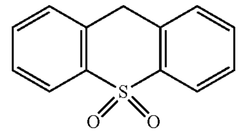

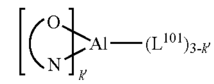

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

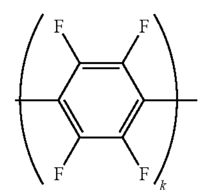

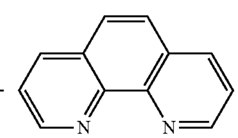

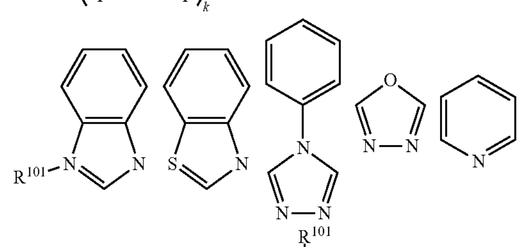

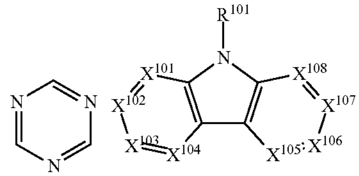

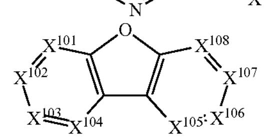

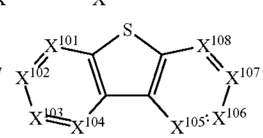

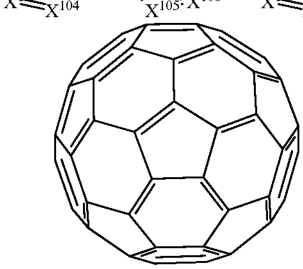

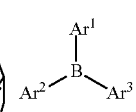

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ars mentioned above. $Ar^1$ to $Ar^3$ has the similar definition as Ars mentioned above. k is an integer from 1 to 20. $X^{101}$ to $X^{108}$ is selected from C (including CH) or N.

In another aspect, the metal complexes used in ETL contains, but not limit to the following general formula:

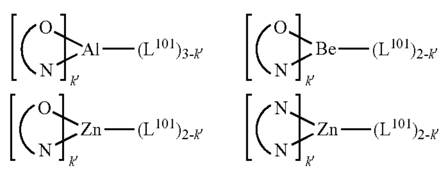

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

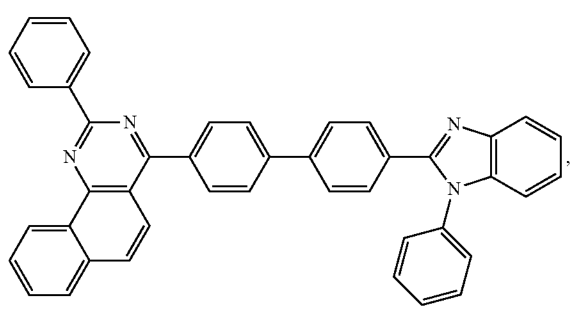

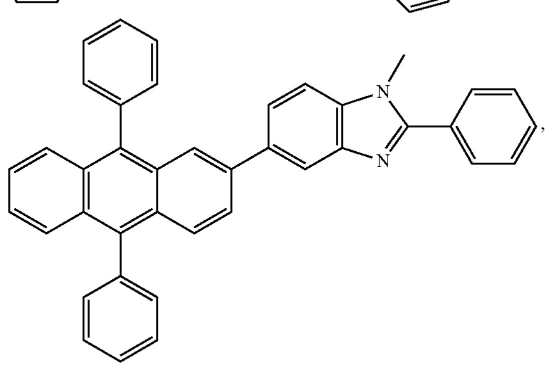

-continued

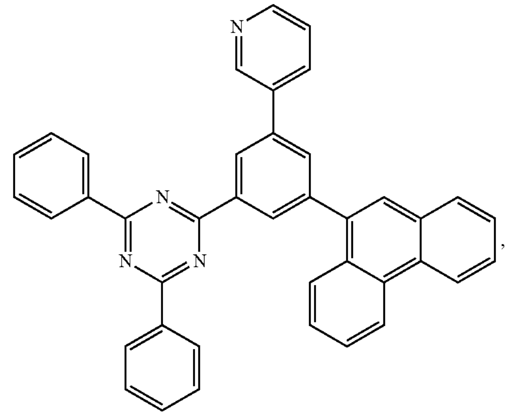

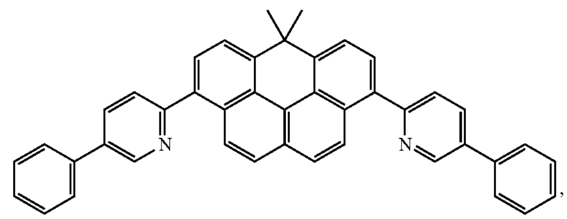

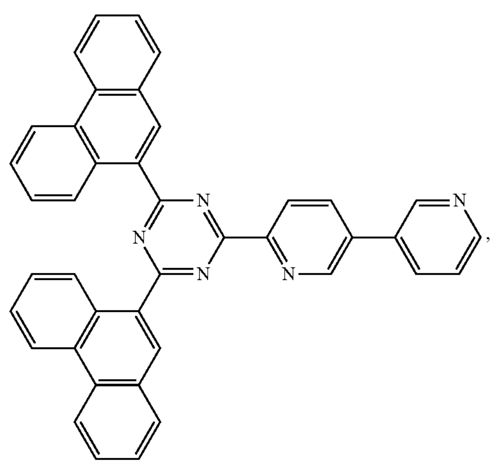

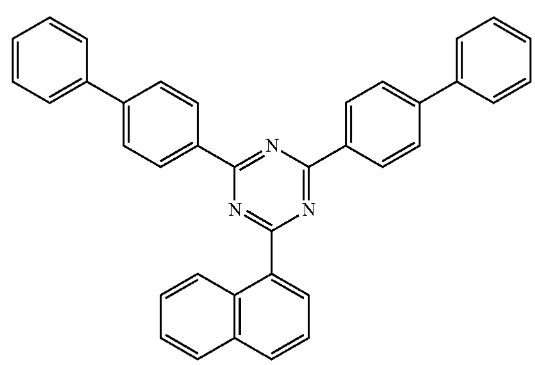

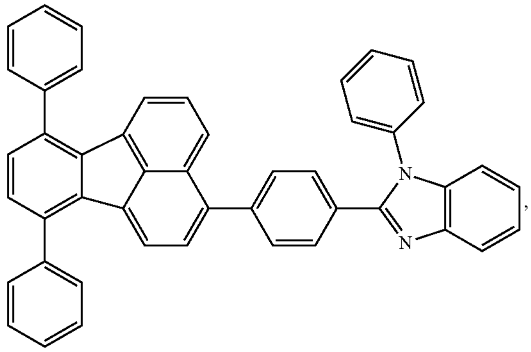
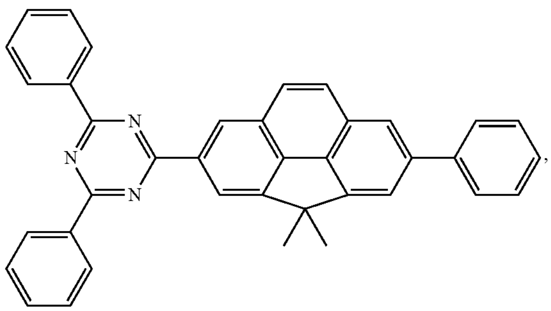
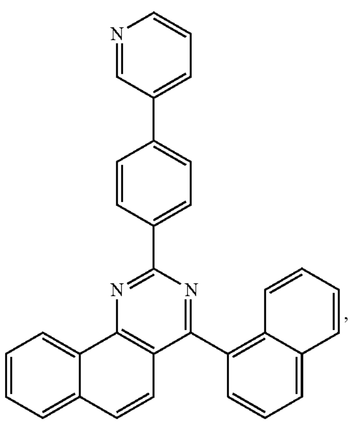
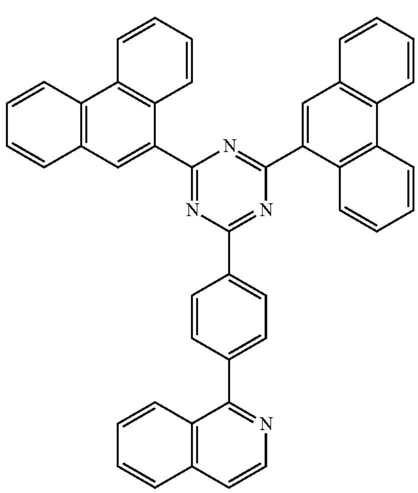
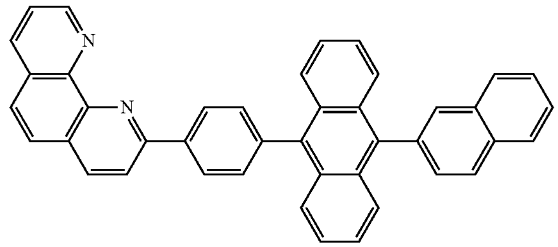
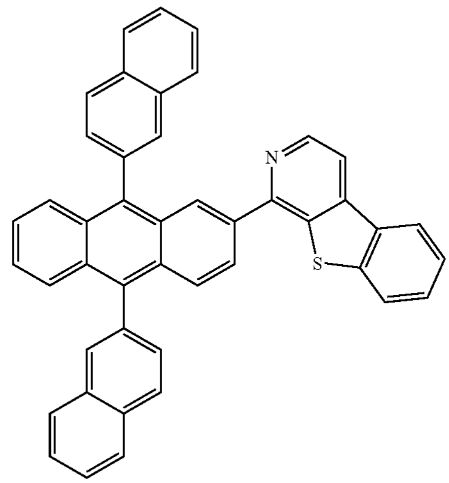
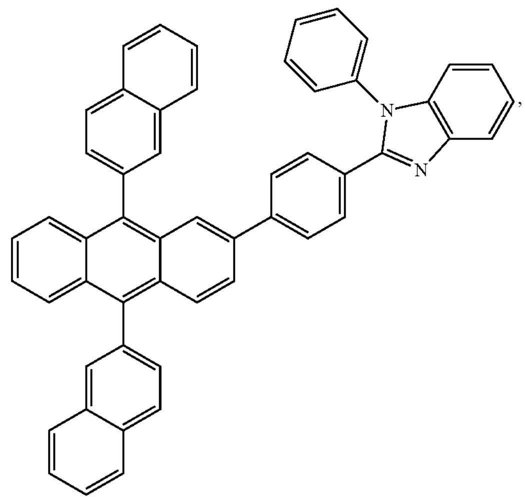
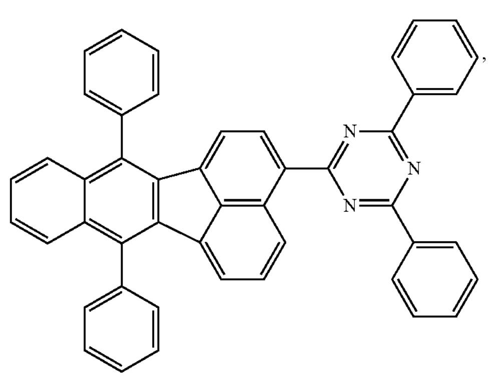

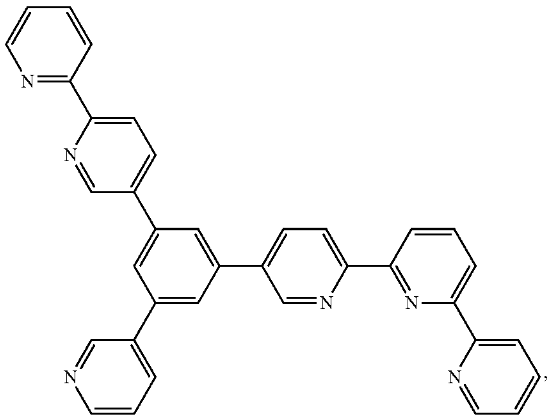
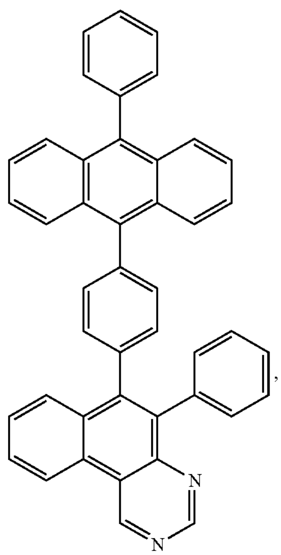
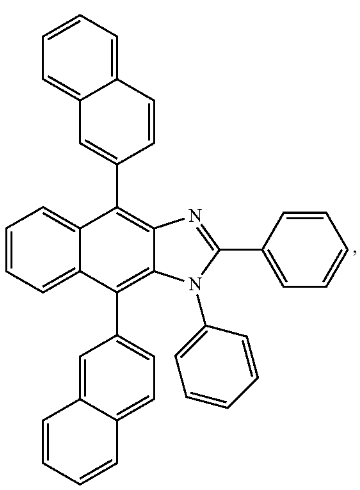
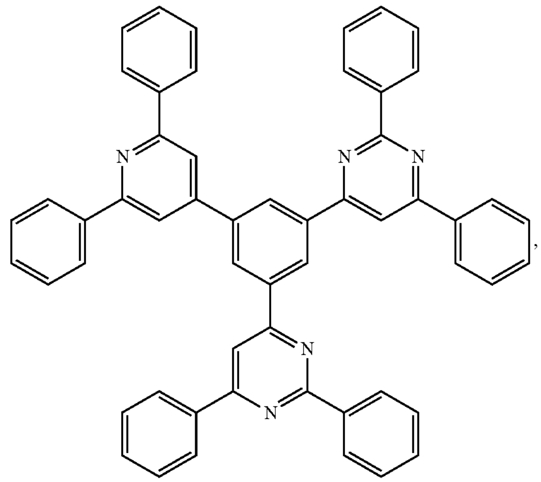
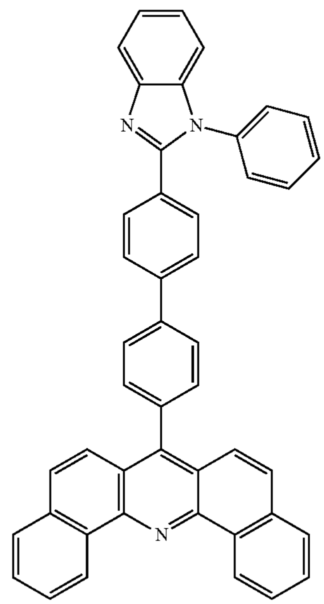
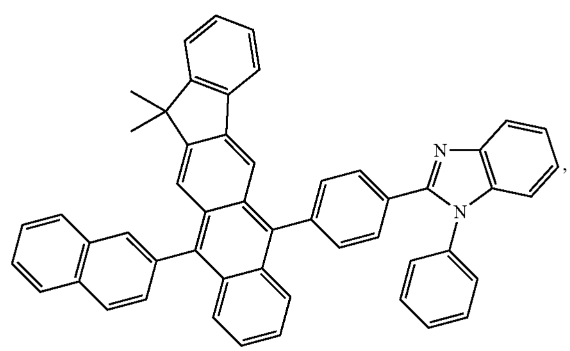

-continued
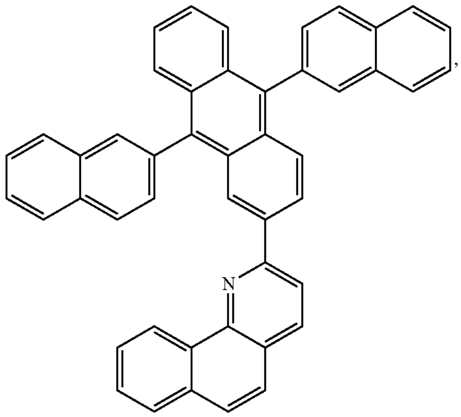
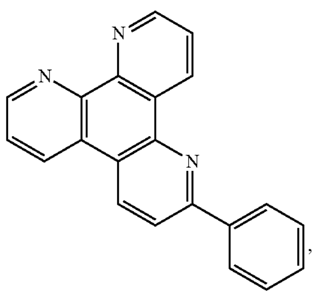
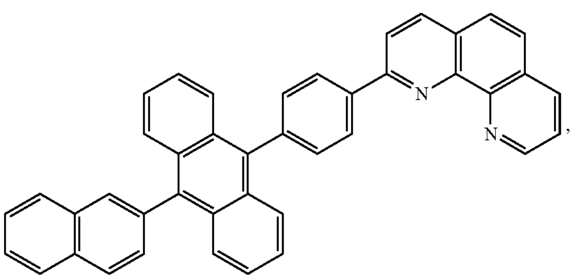
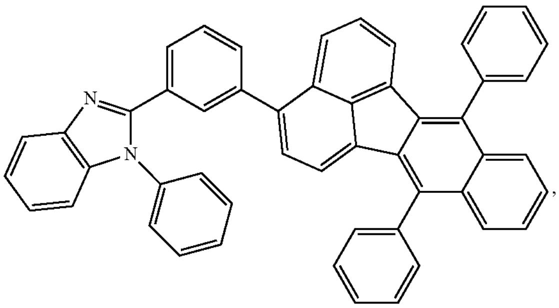
-continued
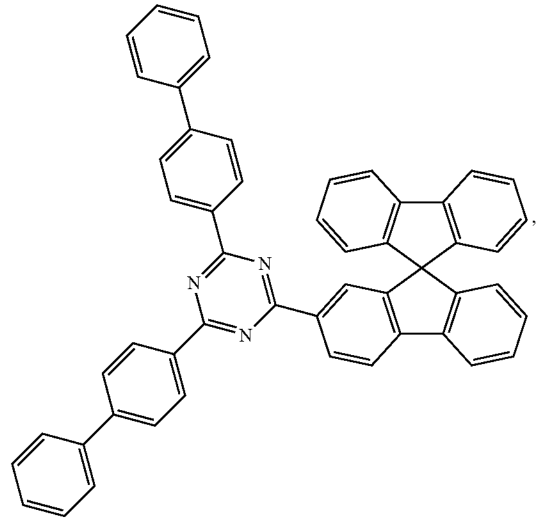
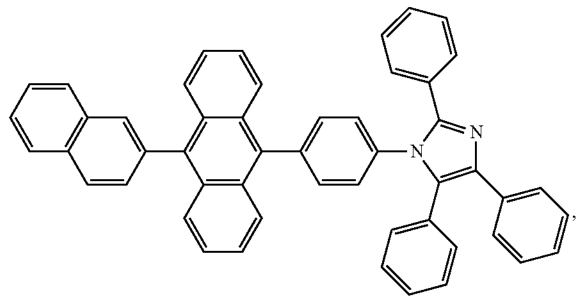
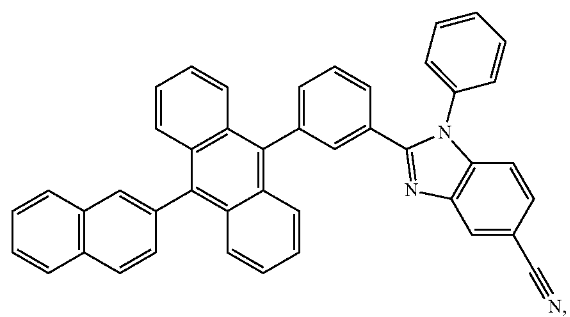
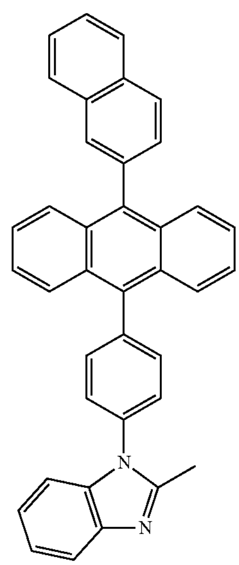

-continued

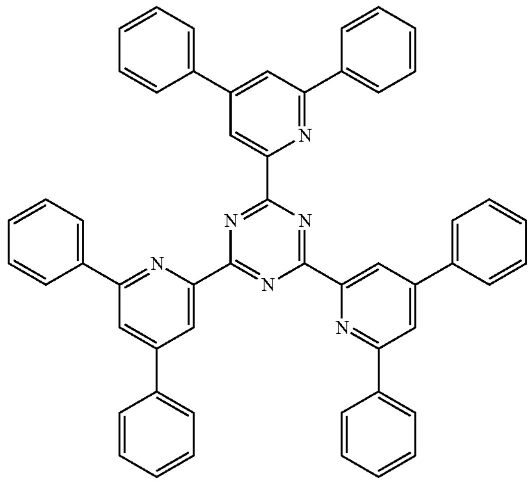

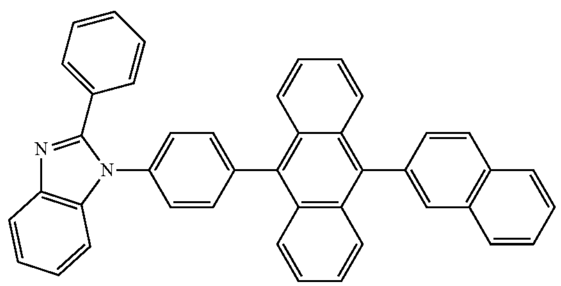

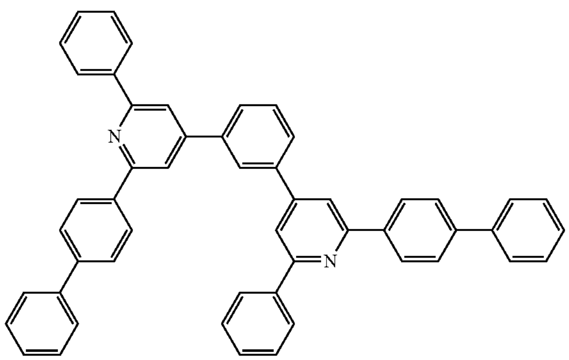

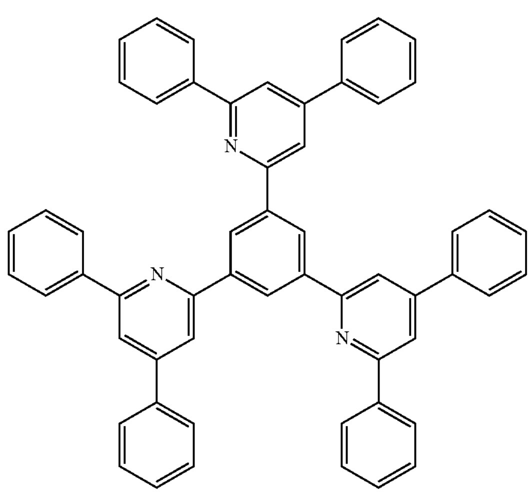

-continued

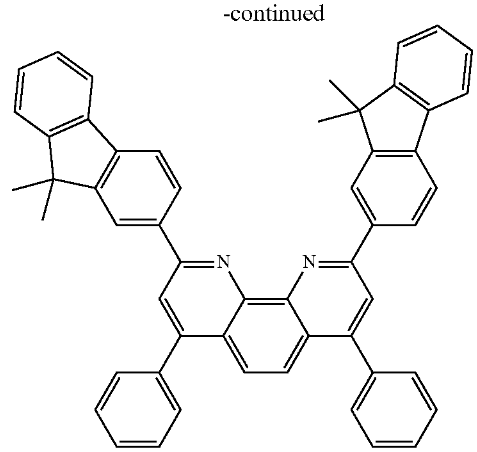

and

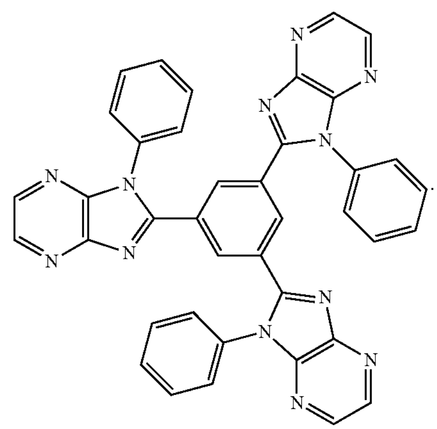

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Synthesis of the Dimer of L10

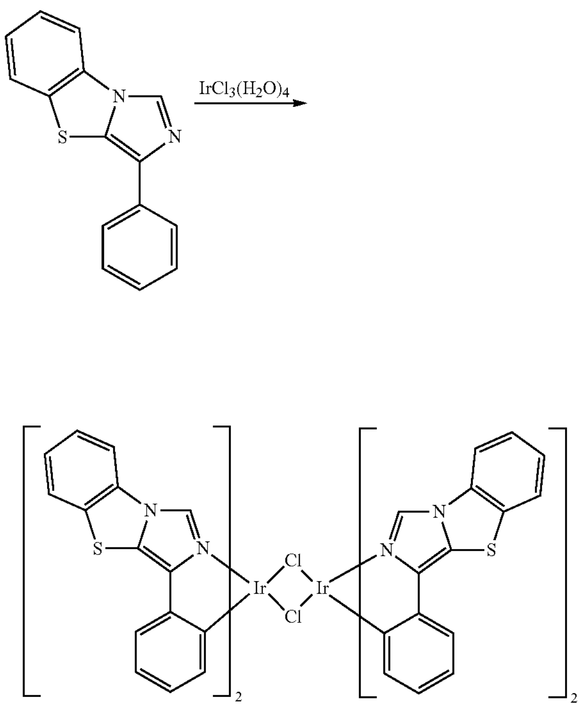

3-phenylbenzo[d]imidazo[5,1-b]thiazole (3.99 g, 15.94 mmol) and iridium(III) chloride tetrahydrate (2.56 g, 6.92 mmol) were added to a 250 mL flask with a stirbar. The reaction was heated to reflux overnight. The reaction was allowed to cool to r.t. and MeOH was added. The solid was collected on a frit to give a white solid (5.0 g, 99%). $^1$H NMR ($cd_2cl_2$, 400 MHz): δ 8.68 (s, 1H), 7.59 (d, 1H), 7.24 (m, 1H), 7.12 (m, 1H), 6.95 (m, 2H), 6.82 (m, 1H), 6.48 (m, 1H), 6.08 (m, 1H).

Synthesis of the Cation of L10

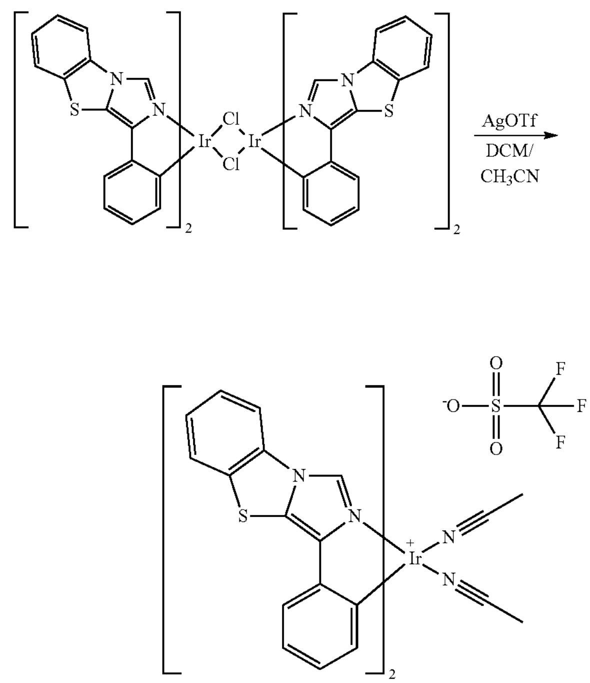

Iridium dimer (473 mg, 0.326 mmol) and oxo((trifluoromethyl)sulfonyl)silver (167 mg, 0.651 mmol) were added to a 100 mL flask with a stirbar. DCM (3 mL) and $NCCH_3$ (0.4 mL) were then added and the solution was allowed to stir at r.t. for several hours. After several hours the solvent was removed in vacuo. The material was dissolved in DCM and the solution was filtered through Celite. The filtrate was pumped to give a white solid (540 mg, 90%). $^1$H NMR ($cd_2cl_2$, 400 MHz): δ 9.18 (s, 1H), 8.19 (d, 1H), 7.85 (d, 1H), 7.68-7.48 (overlapping signals, 2H), 7.15 (m, 1H), 6.90 (t, 1H), 6.61 (t, 1H), 6.20 (d, 1H), 1.55 (br s, 6H).

Synthesis of a Heteroleptic Complex of L10

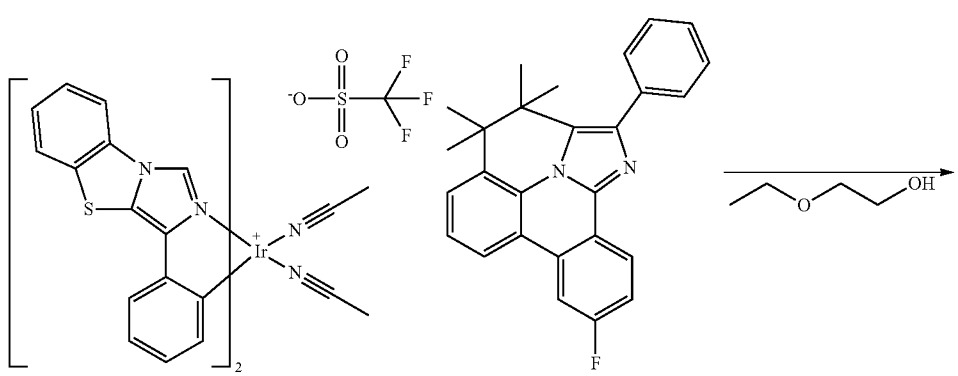

-continued

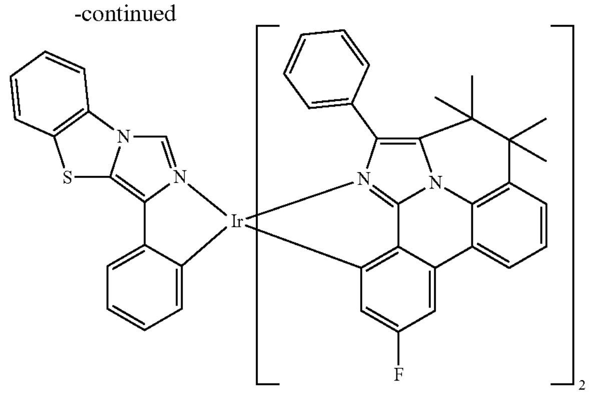

Reactant 1 (89.7 mg, 0.098 mmol) and 9-fluoro-3,3,4,4-tetramethyl-2-phenyl-3,4-dihydrodibenzo[b,ij]imidazo[2,1,5-de]quinolizine (77 mg, 0.195 mmol) were added to a 25 mL Schlenk tube with a stirbar and cycled onto the line via three vacuum/nitrogen backfill cycles. 2-ethoxyethanol (2 ml) was added and the reaction was degassed for 10 mins. The reaction was heated to 135° C. overnight. The reaction was cooled to r.t. and saturated $Na_2CO_3$/water and DCM were added. The aqueous layer was extracted three times with DCM. The organic layers were combined, dried over $MgSO_4$, and coated onto Celite. Purified via normal phase chromatography (eluent 1:1 heptanes:dichloromethane) to give a yellow solid (36 mg, 30%). LCMS: 1228.3 m/z $^1$H NMR (dmso-$d_6$, 400 MHz): δ 8.44 (d, 1H), 8.42 (d, 1H), 7.96 (m, 1H), 7.87 (d, 1H), 7.73 (m, 1H), 7.71 (s, 1H), 7.70-7.54 (overlapping signals, 6H), 7.51-7.39 (m, 2H), 7.11 (t, 1H), 6.8 (br signal, 3H), 6.85 (dd, 1H), 6.75 (td, 1H), 6.58 (br m, 2H), 6.42 (td, 1H), 6.28 (dd, 1H), 6.21 (m, 2H), 6.14 (br m, 2H), 5.96 (tt, 1H), 1.35-0.68 (overlapping signals, 24H). $^{19}$F NMR ($cd_2cl_2$, 376.5 MHz): d−111.3 (m, 1F), −111.9 (m, 1F). $\lambda_{max}$ (2-MeTHF, PMMA): 452 nm.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound of Formula I

Formula I

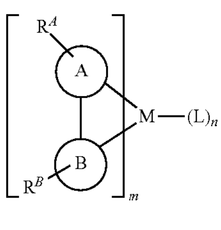

wherein A is a fused ring system comprising a six-membered ring, which is fused to a five-membered ring, wherein the five-membered ring is fused to a second five-membered ring and the second five-membered ring is not a pyrazole ring;

wherein B is a five-membered or six-membered carbocyclic or heterocyclic ring;

wherein A and B are connected by a single bond between a carbon atom of A and an atom of B;

wherein each $R^A$ and $R^B$ independently represents mono to the possible maximum number of substitution, or no substitution;

wherein each $R^A$ and $R^B$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein M is a metal having an atomic weight greater than 40;

wherein A is coordinated to M by a non-carbene dative bond;

wherein B is coordinated to M by a polar covalent bond between a carbon atom and M;

wherein M is bonded to one of the five-membered rings of A;

wherein L is a substituted or unsubstituted cyclometalated ligand, and each L can be the same or different; and wherein m is at least 1, and m+n is the maximum number of ligands that may be attached to M.

2. The compound of claim 1, wherein each $R^A$ and $R^B$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

3. The compound of claim 1, wherein B is a six-membered aromatic ring.

4. The compound of claim 1, wherein M is selected from the group consisting of Ir, Rh, Re, Ru, Os, Pt, Au, and Cu.

5. The compound of claim 1, wherein M is Ir or Pt.

6. The compound of claim 1, wherein B is benzene.

7. The compound of claim 1, wherein the M-A fused ring system is selected from the group consisting of:

I

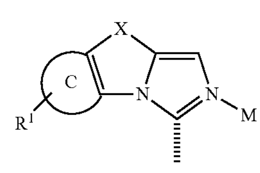

-continued
II
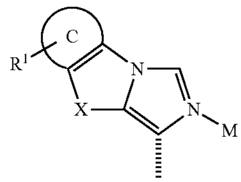
III
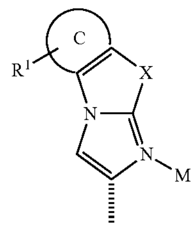
IV
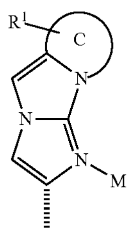
V
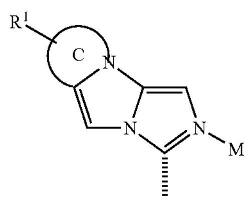
VI
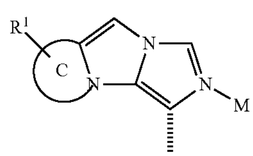
VII
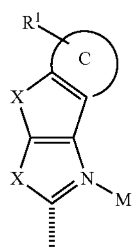
VIII
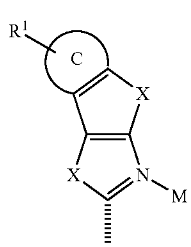
-continued
IX
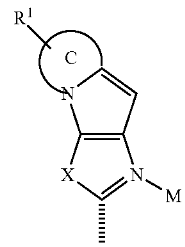
X
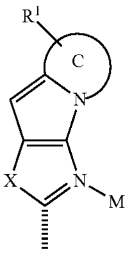
XI
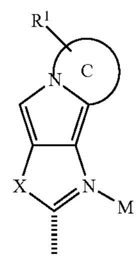
XII
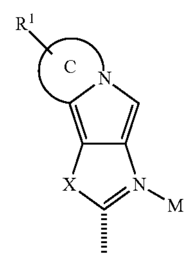
XIII
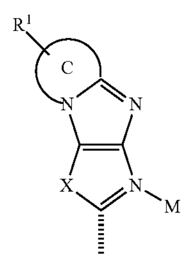
and
XIV
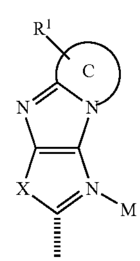
wherein C is a six-membered aromatic ring;
wherein $R^1$ represent mono to the maximum possible number of substitution, or no substitution;

wherein each X is independently selected from the group consisting of O, S, Se, NR, CRR', SiRR', BR, and PR;

wherein $R^1$, R, and R' are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein any adjacent substituents in $R^1$, R, and R' are optionally joined or fused to form a ring; and wherein the dashed line represents the bond to ring B.

8. The compound of claim 7, wherein each $R^1$, R, and R' is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

9. The compound of claim 7, wherein ring C comprises at least five carbons.

10. The compound of claim 1, wherein the compound comprises a structure selected from the group consisting of:

L1

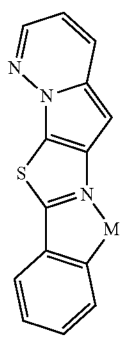

L2

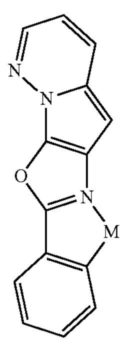

L3

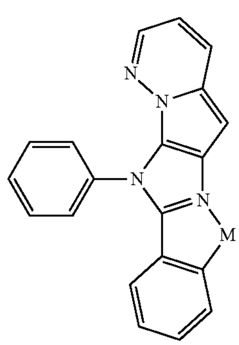

-continued

L4

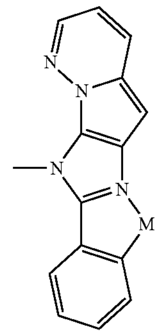

L5

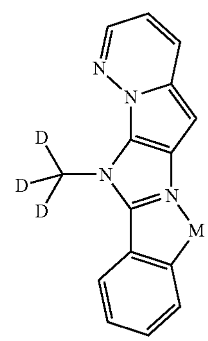

L6

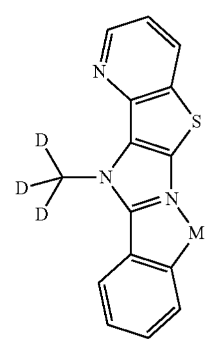

L7

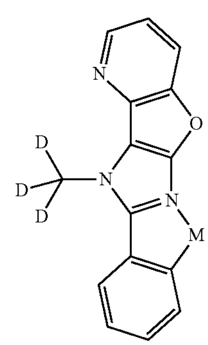

-continued
L8
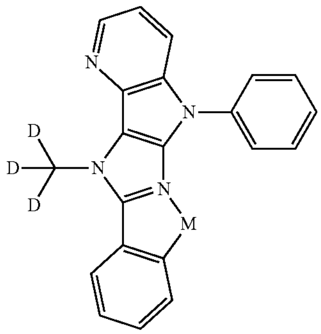
L9
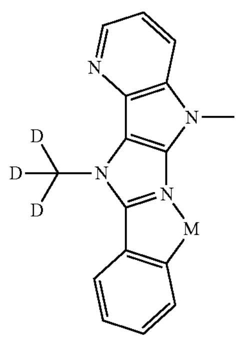
L10
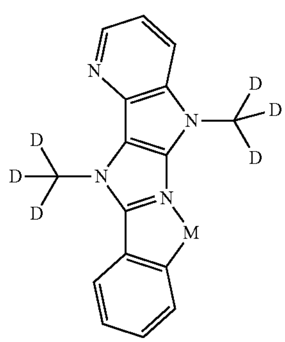
L11
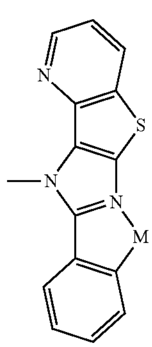
-continued
L12
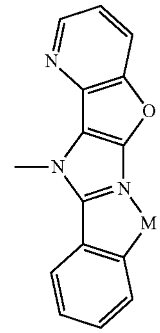
L13
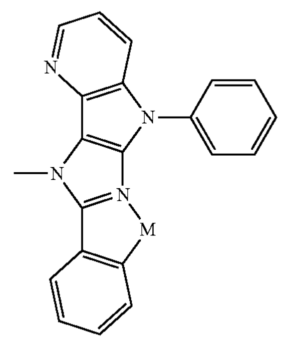
L14
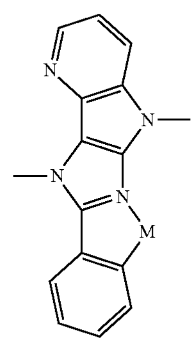
L15
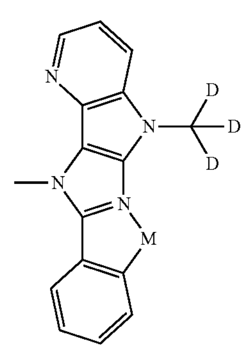

-continued
L16
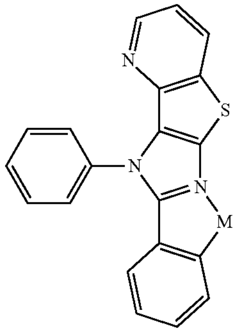
L17
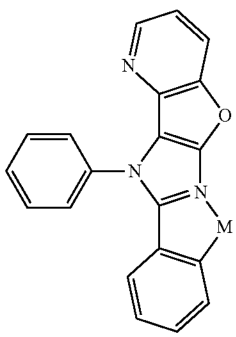
L18
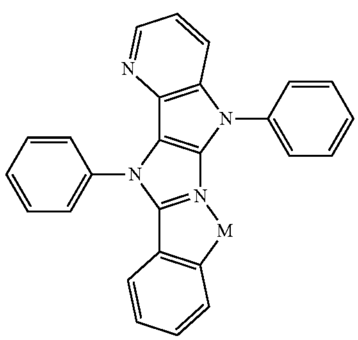
L19
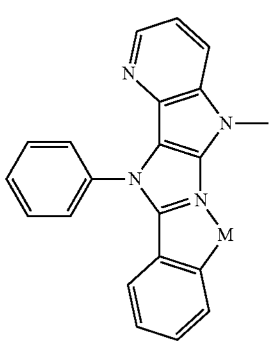
-continued
L20
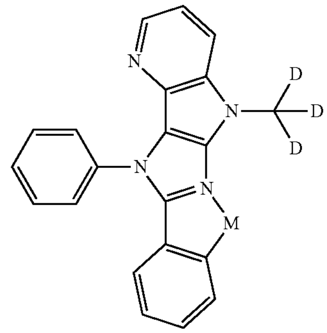
L21
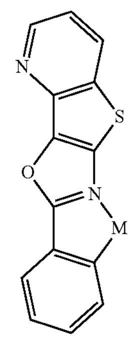
L22
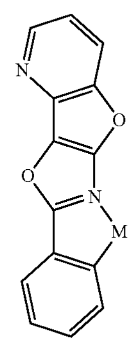
L23
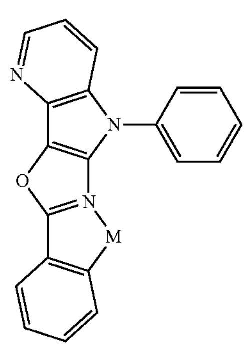

-continued
L24
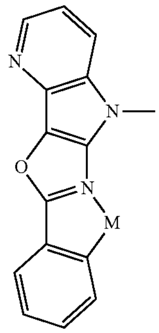
L25
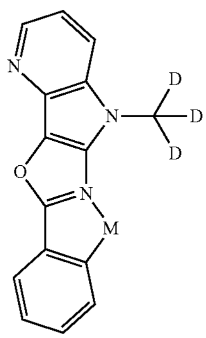
L26
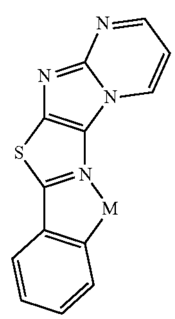
L27
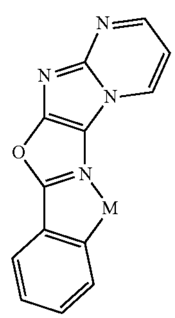
L28
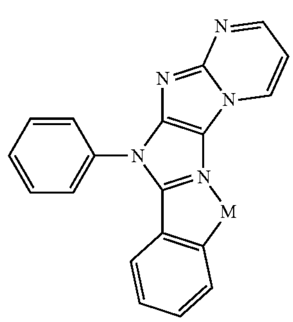
-continued
L29
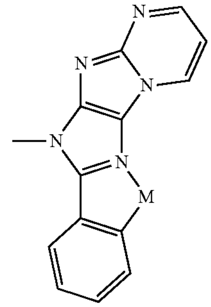
L30
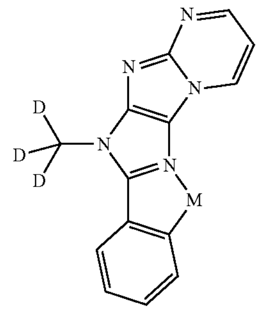
L31
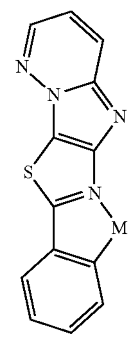
L32
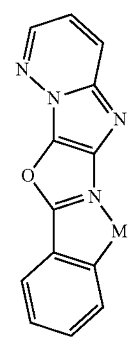
L33
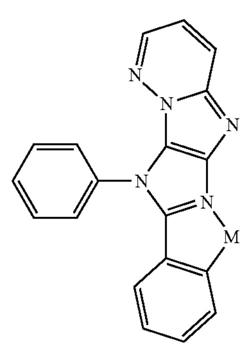

-continued
L34
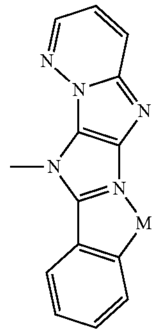
L35
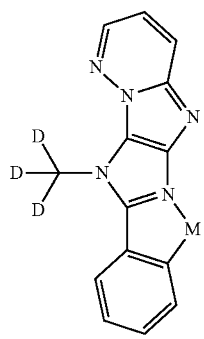
L36
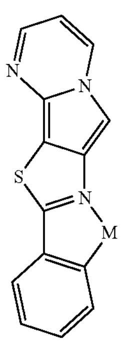
L37
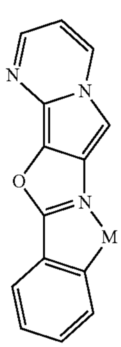
-continued
L38
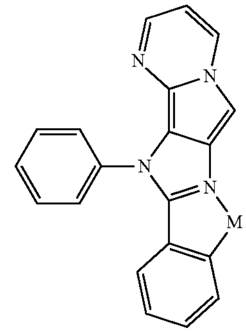
L39
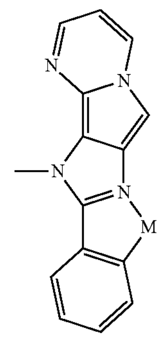
L40
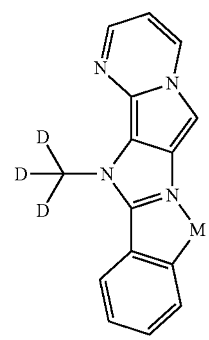
L41
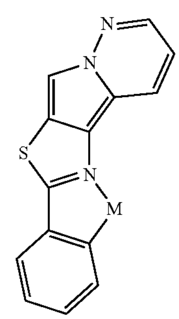
L42
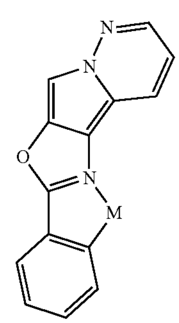

-continued
L43
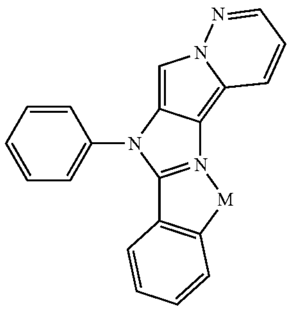
L44
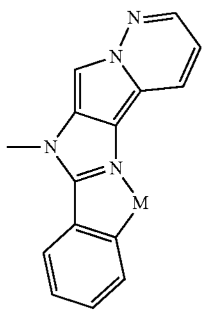
L45
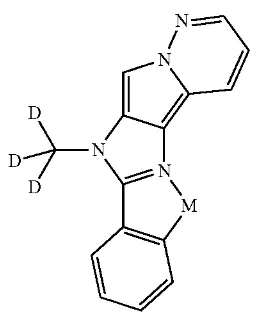
L46
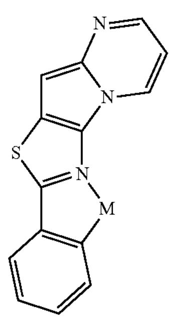
L47
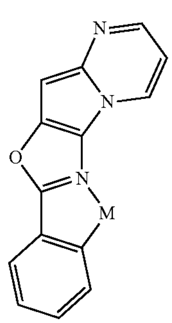
-continued
L48
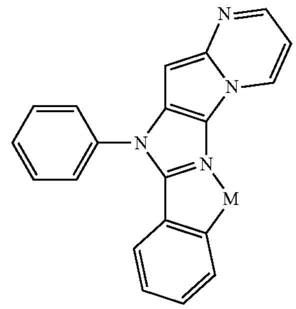
L49
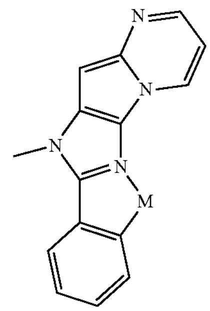
L50
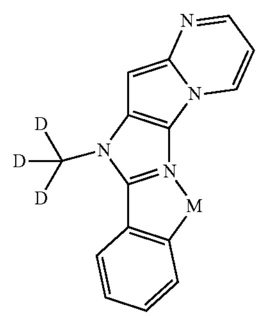
L51
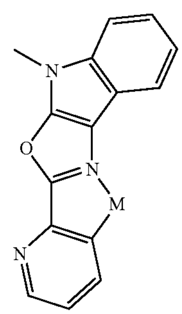
L52
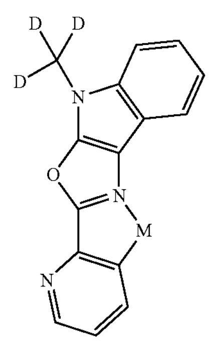

-continued
L53
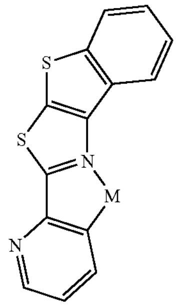
L54
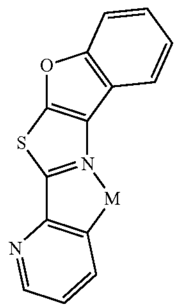
L55
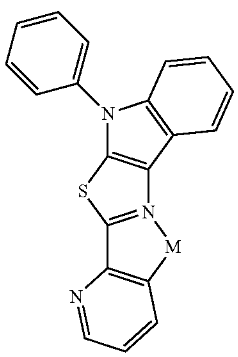
L56
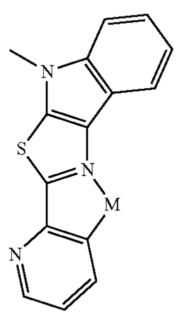
L57
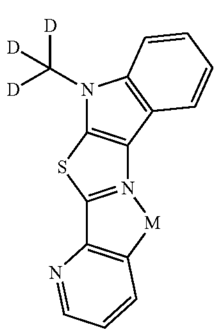
-continued
L58
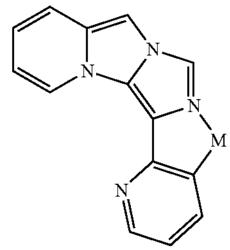
L59
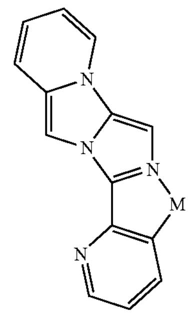
L60
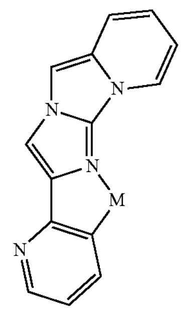
L61
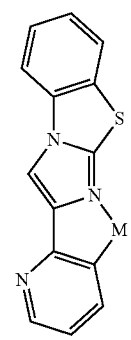
L62
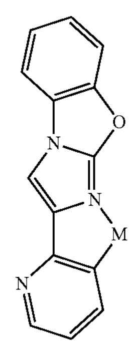

L63
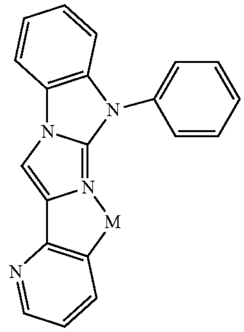
L64
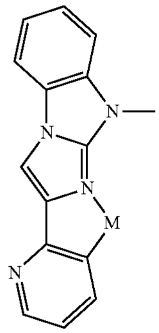
L65
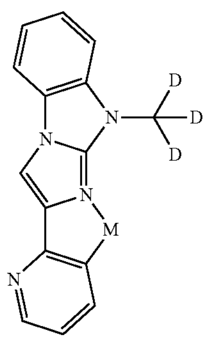
L66
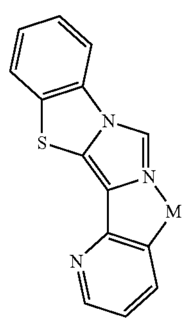
L67
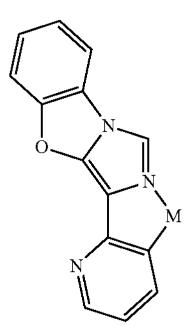
L68
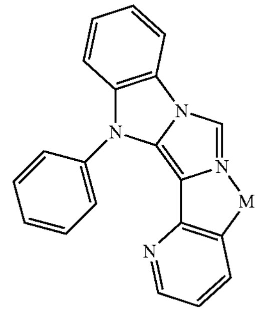
L69
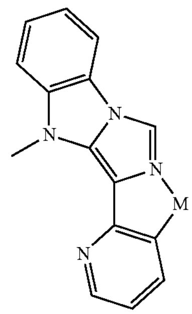
L70
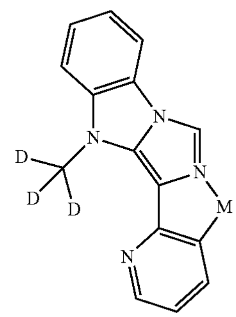
L71
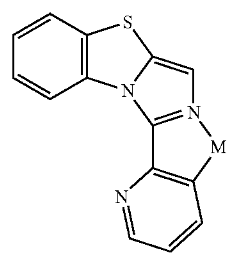
L72
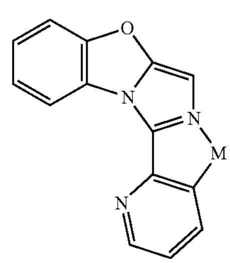

-continued
L73
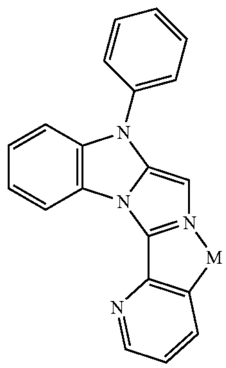
L74
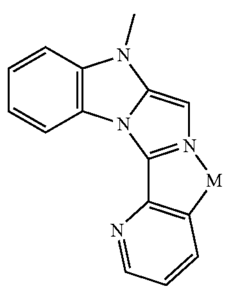
L75
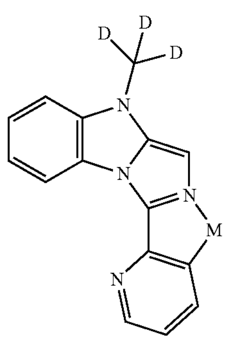
L76
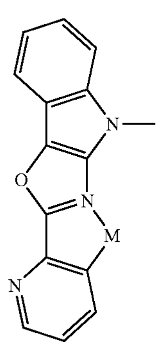
-continued
L77
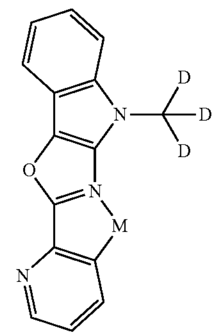
L78
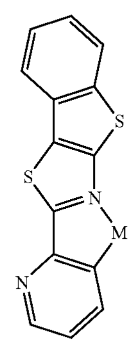
L79
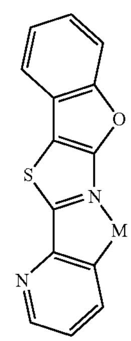
L80
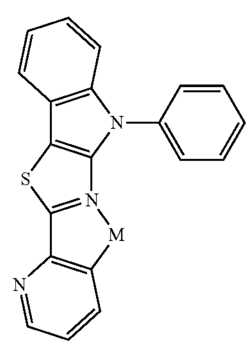

-continued
L81
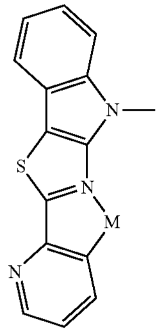
L82
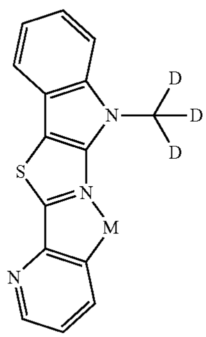
L83
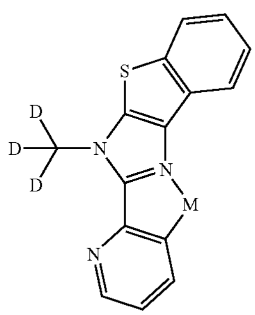
L84
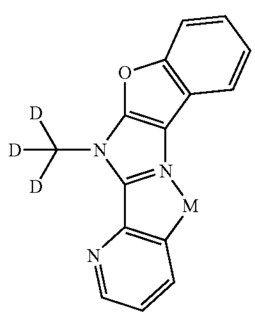
L85
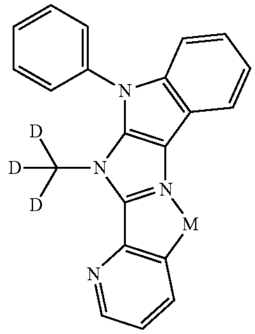
-continued
L86
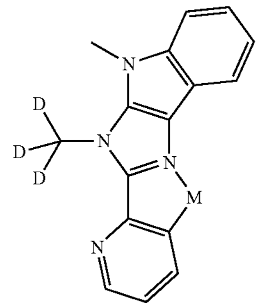
L87
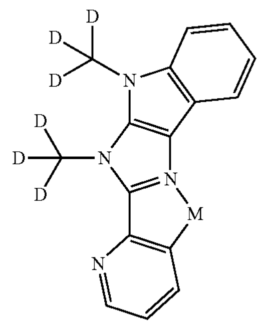
L88
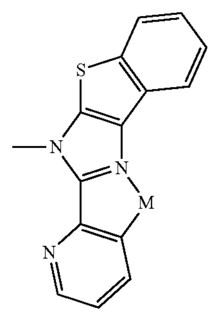
L89
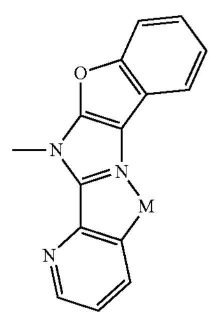
L90
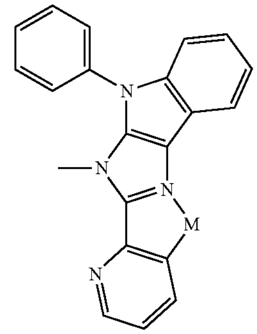

-continued
L91
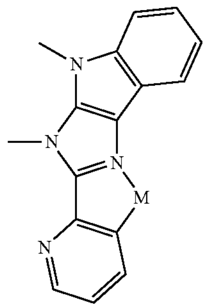
L92
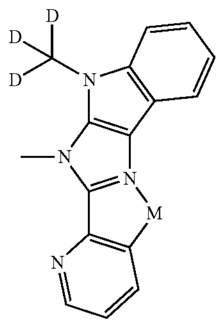
L93
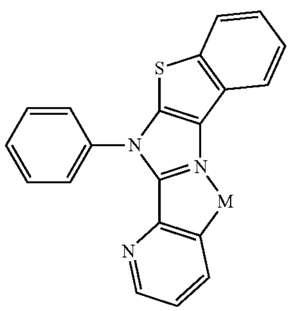
L94
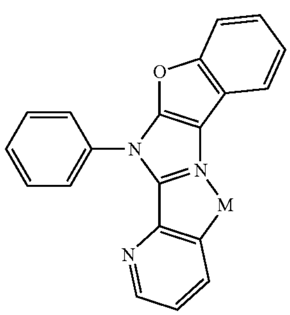
L95
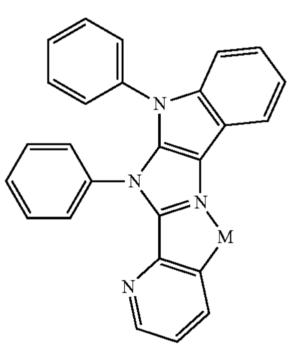
-continued
L96
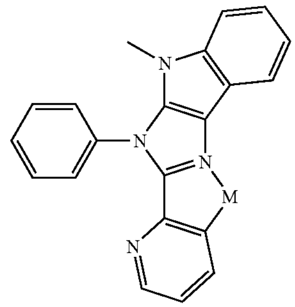
L97
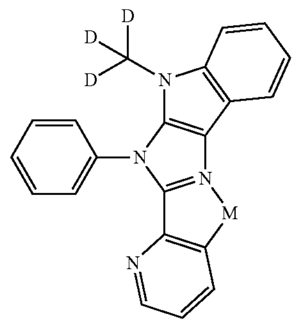
L98
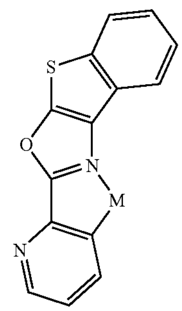
L99
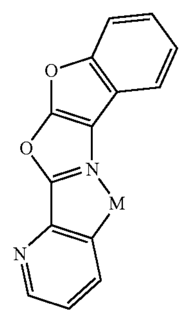
L100
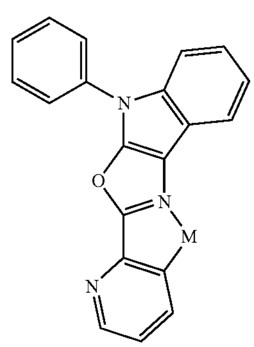

-continued
L101
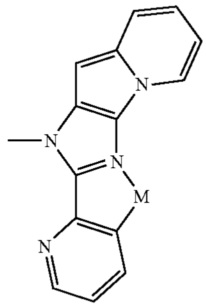
L102
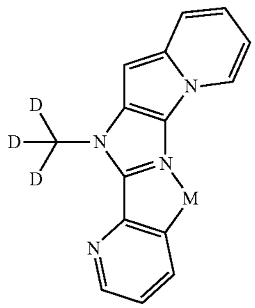
L103
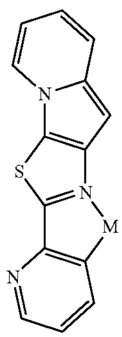
L104
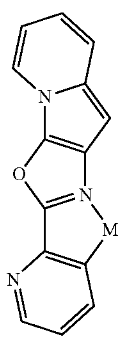
L105
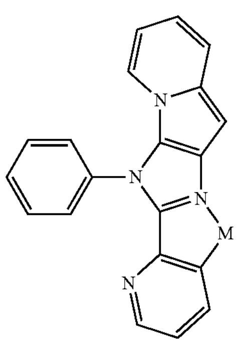
-continued
L106
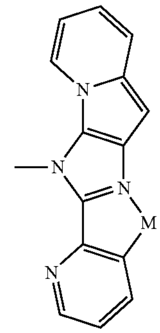
L107
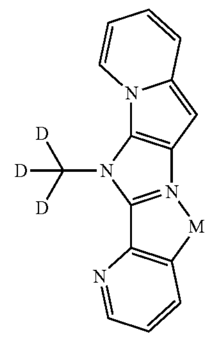
L108
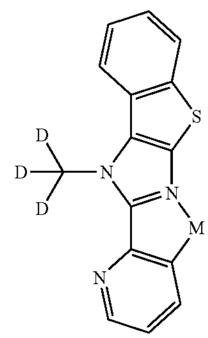
L109
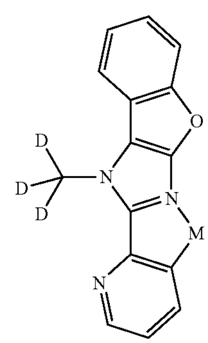

-continued
L110
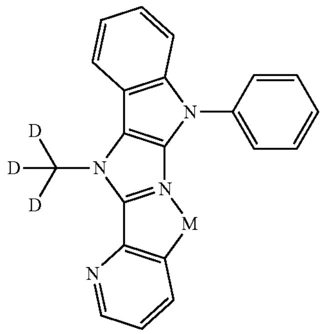
L111
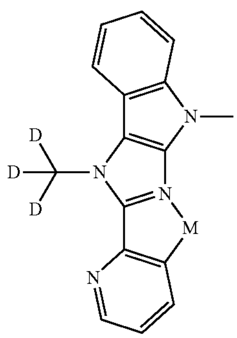
L112
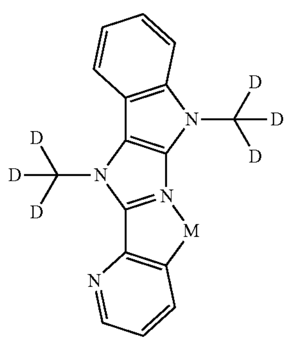
L113
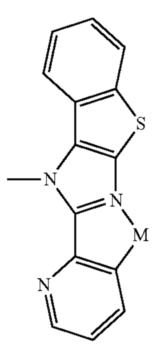
-continued
L114
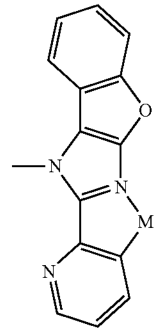
L115
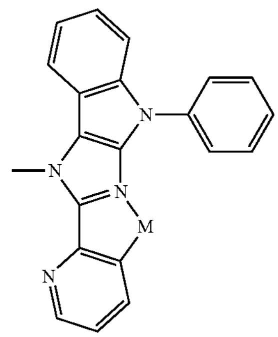
L116
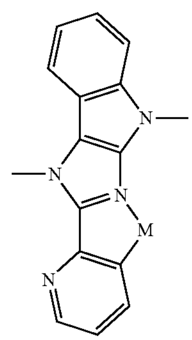
L117
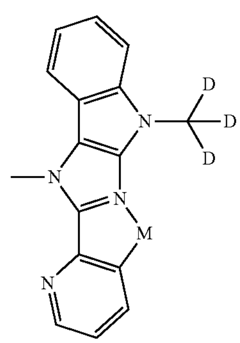

-continued
L118
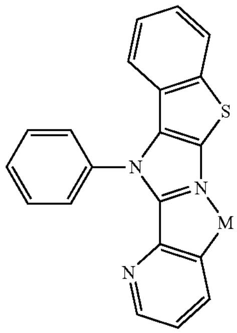
L119
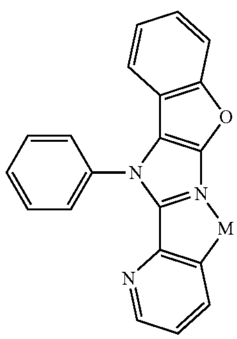
L120
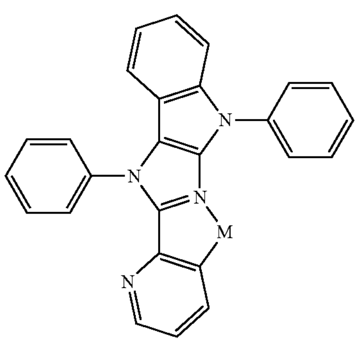
L121
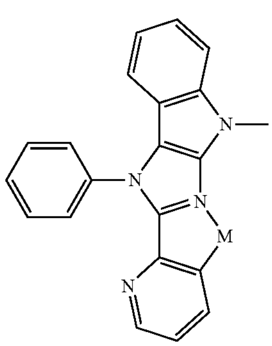
-continued
L122
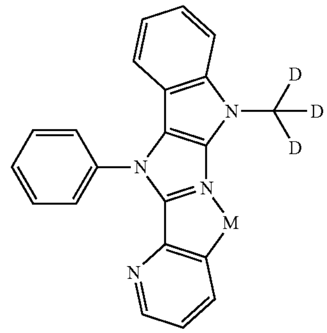
L123
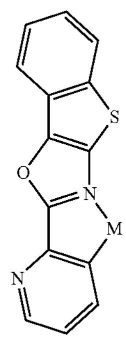
L124
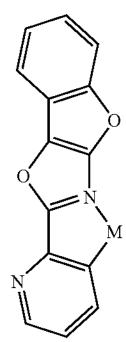
L125
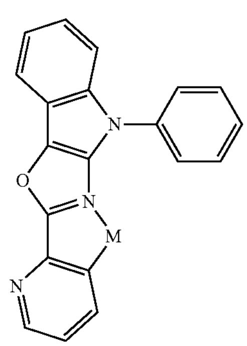

-continued
L126
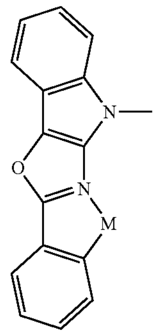
L127
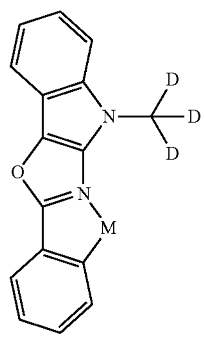
L128
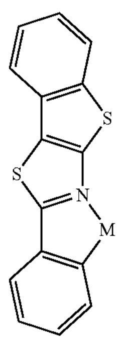
L129
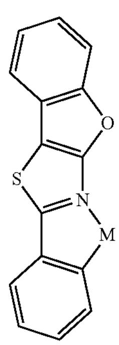
-continued
L130
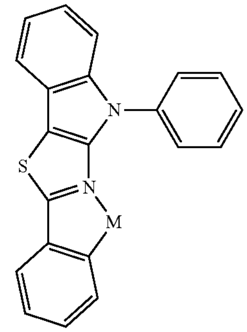
L131
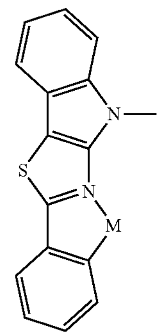
L132
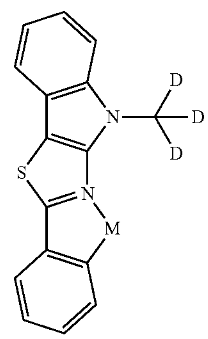
L133
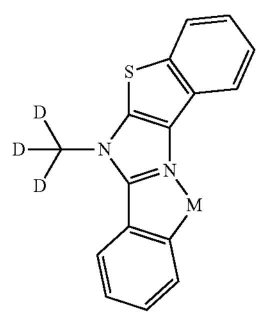
L134
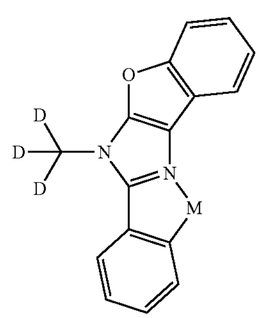

-continued
L135
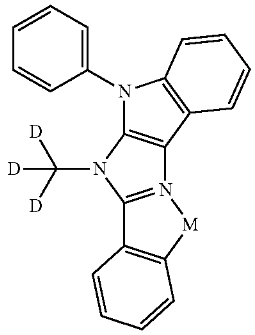
L136
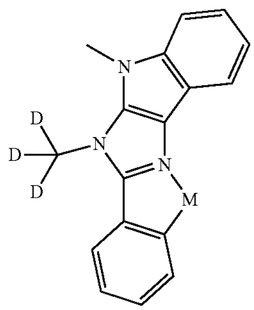
L137
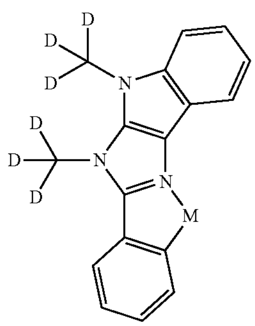
L138
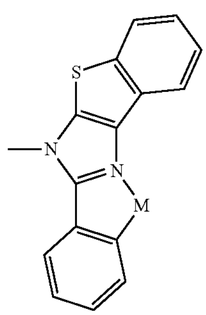
L139
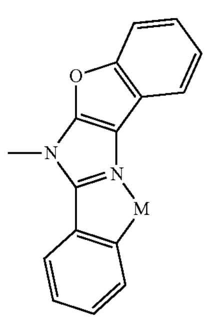
-continued
L140
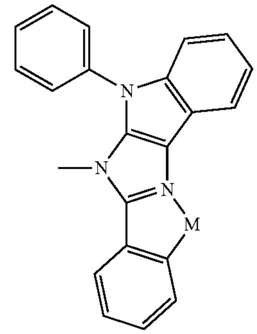
L141
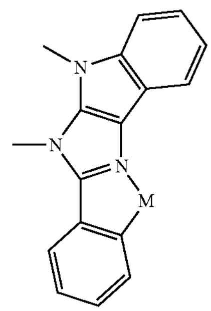
L142
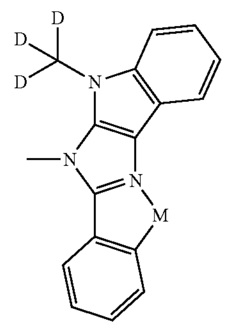
L143
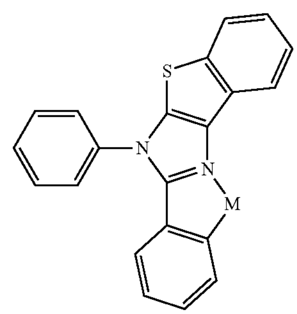
L144
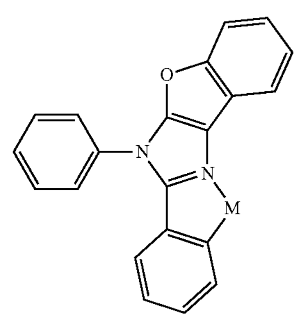

-continued
L145
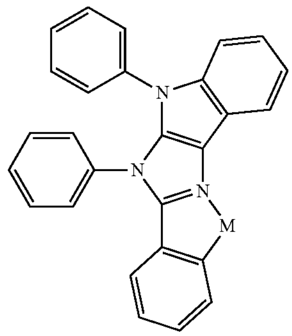
L146
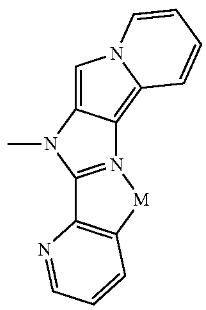
L147
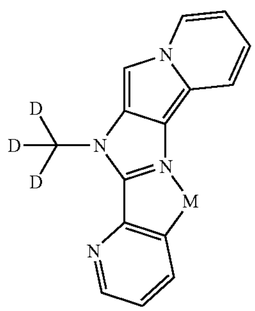
L148
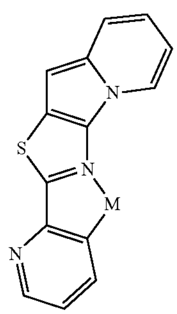
L149
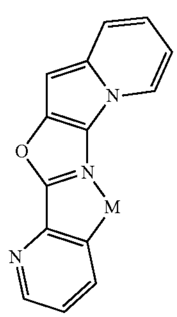
-continued
L150
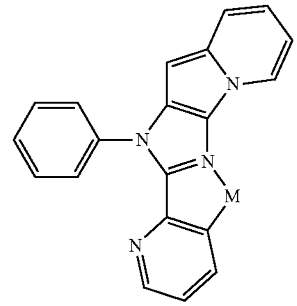
L151
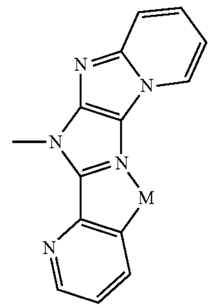
L152
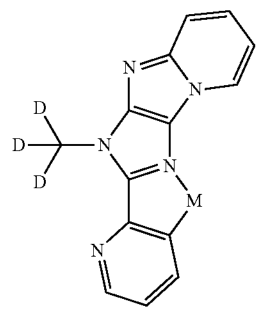
L153
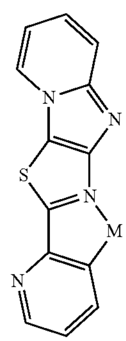
L154
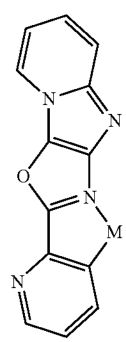

-continued
L155
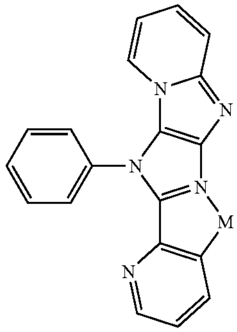
L156
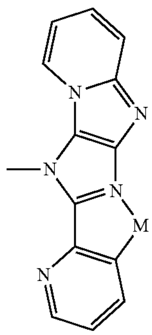
L157
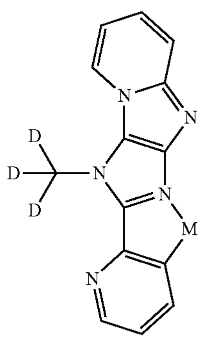
L158
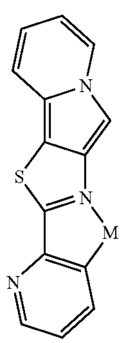
-continued
L159
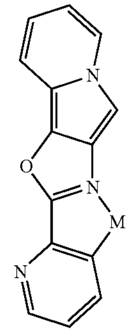
L160
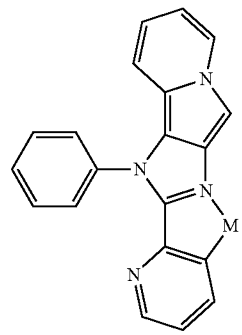
L161
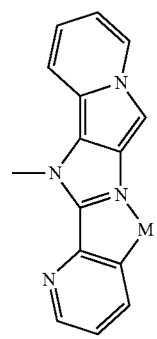
L162
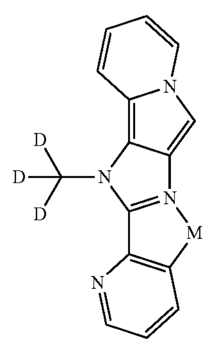

-continued
L163
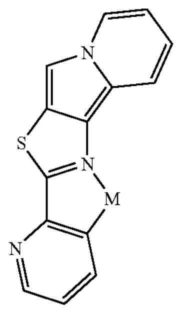
L164
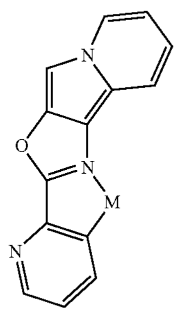
L165
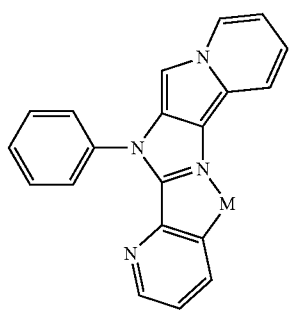
L166
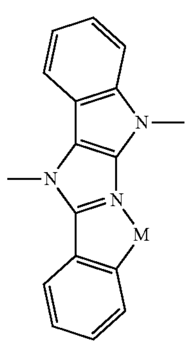
L167
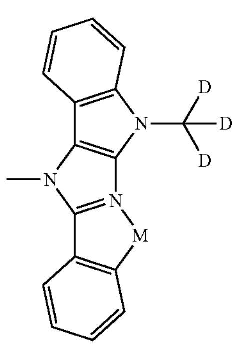
-continued
L168
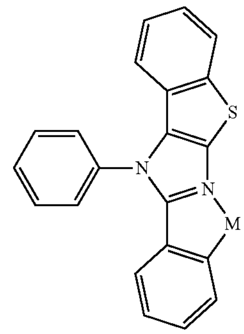
L169
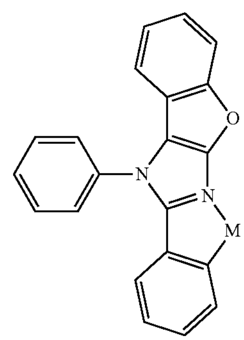
L170
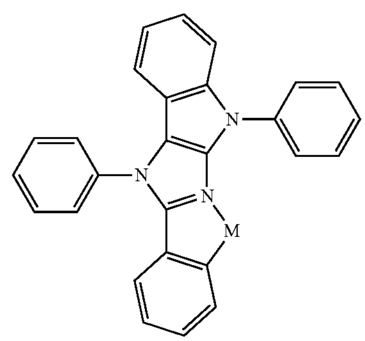
L171
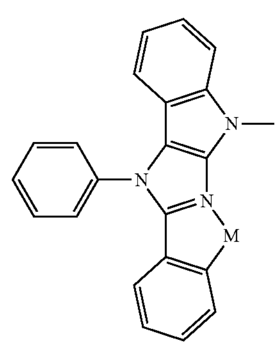

L172
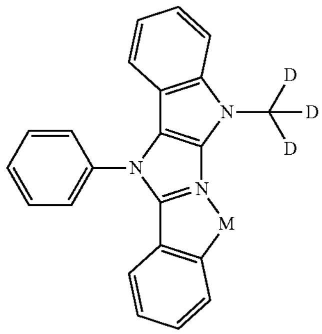
L173
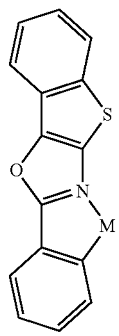
L174
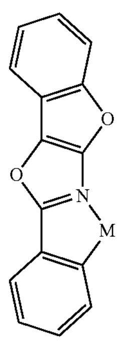
L175
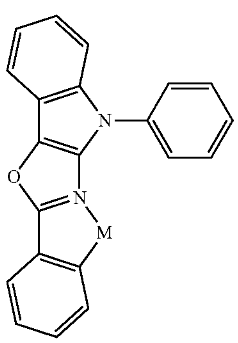
L176
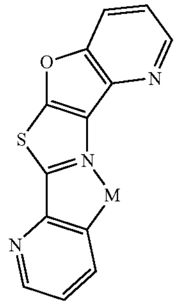
L177
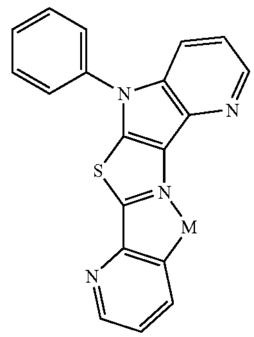
L178
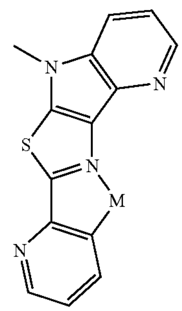
L179
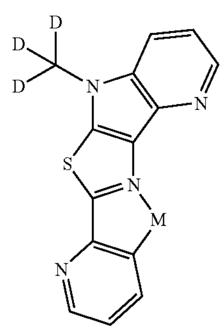
L180
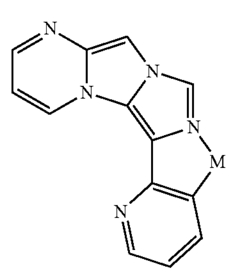

-continued
L181
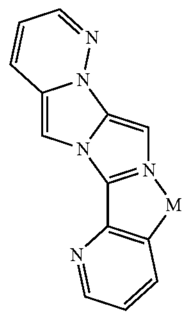
L182
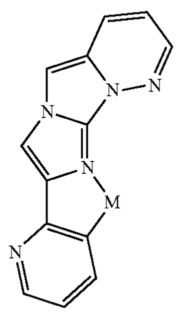
L183
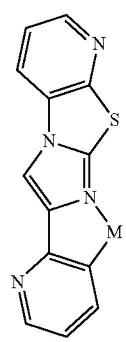
L184
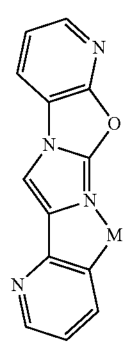
L185
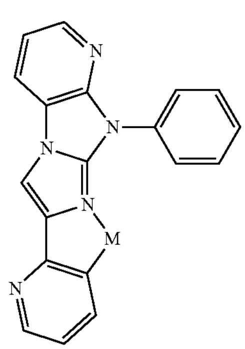
-continued
L186
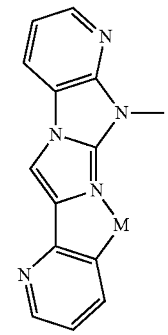
L187
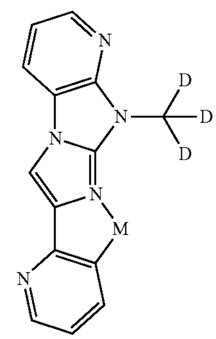
L188
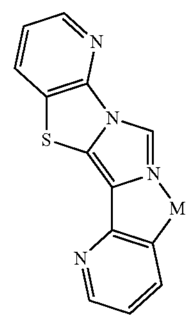
L189
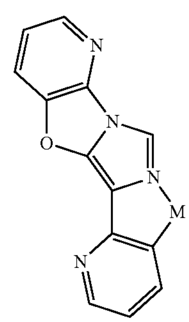
L190
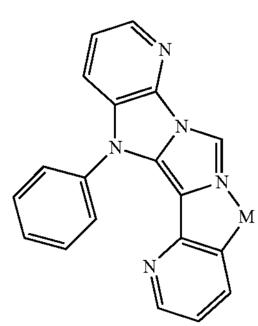

L191
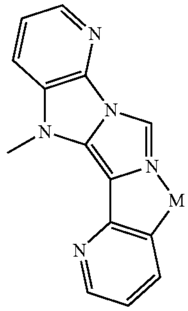
L192
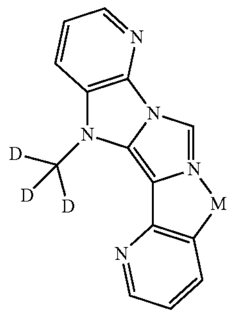
L193
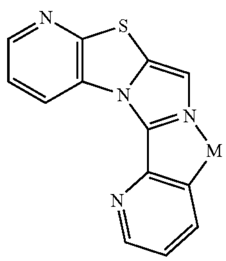
L194
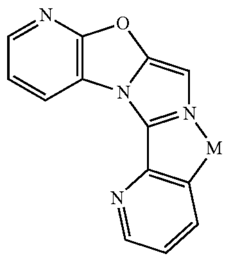
L195
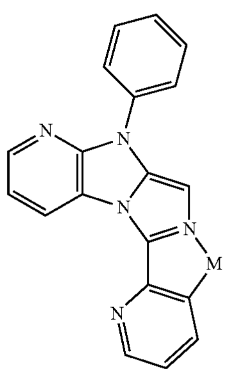
L196
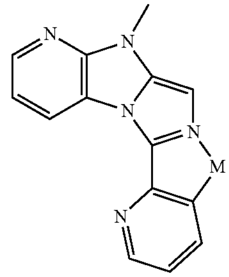
L197
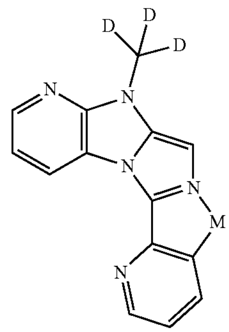
L198
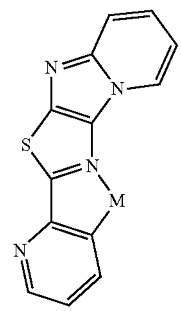
L199
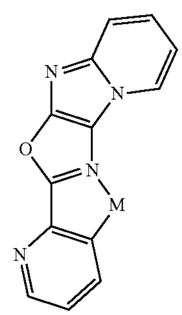
L200
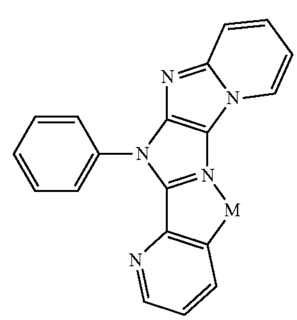

-continued
L201
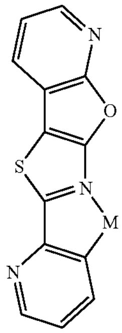
L202
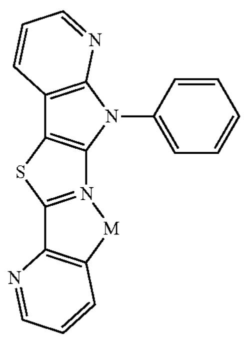
L203
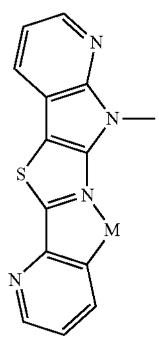
L204
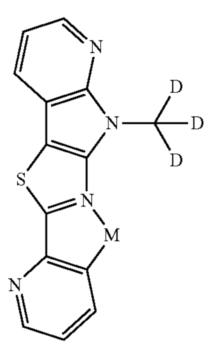
-continued
L205
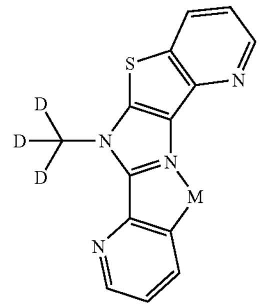
L206
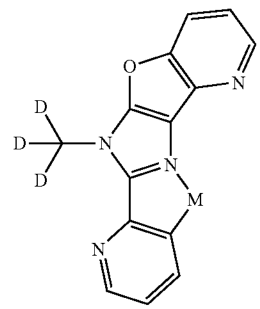
L207
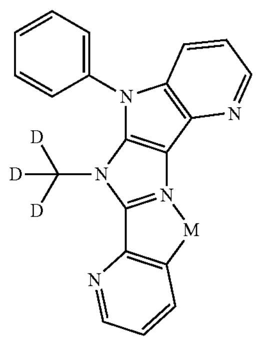
L208
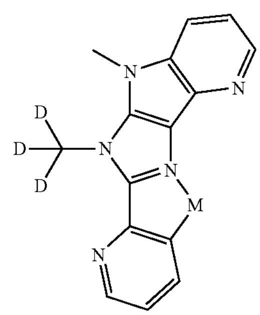
L209
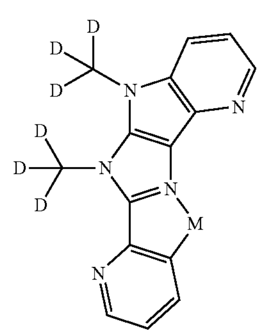

-continued
L210
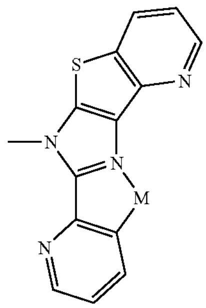
L211
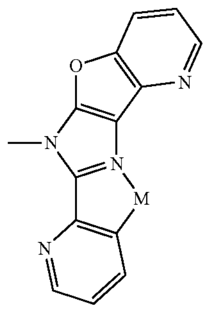
L212
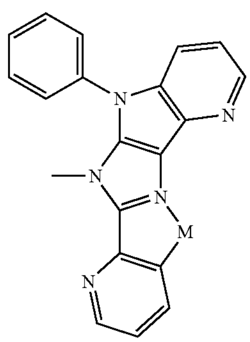
L213
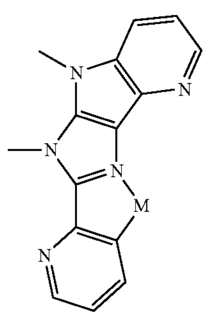
L214
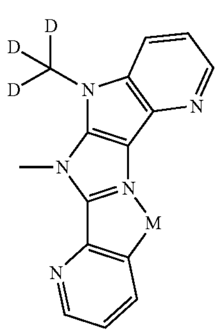
-continued
L215
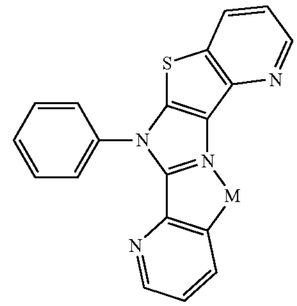
L216
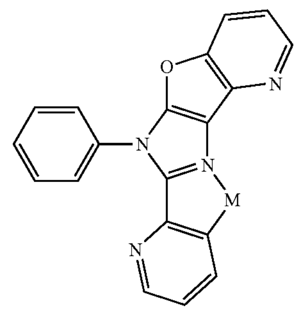
L217
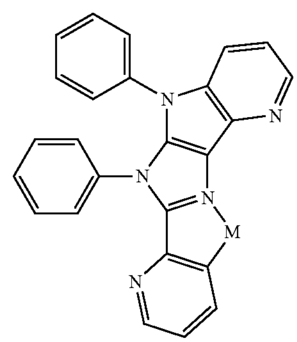
L218
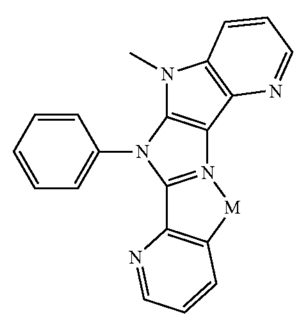
L219
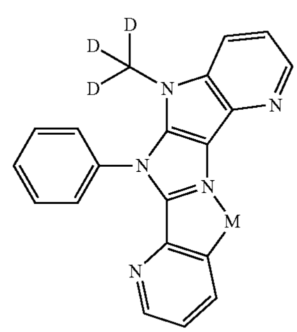

-continued
L220
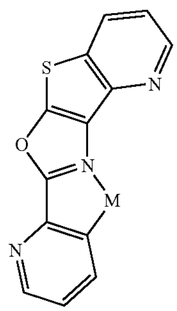
L221
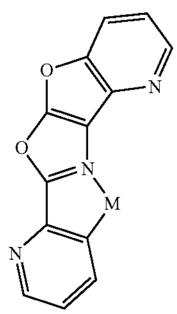
L222
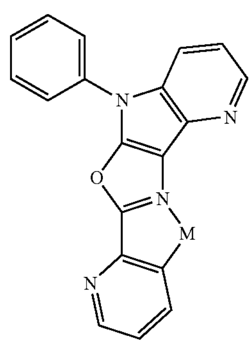
L223
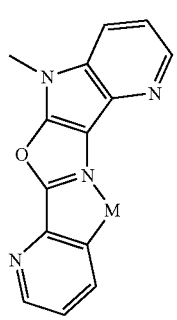
L224
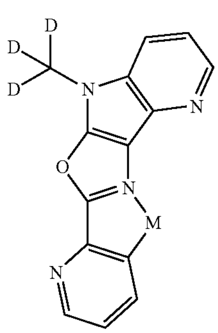
-continued
L225
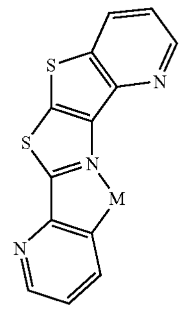
L226
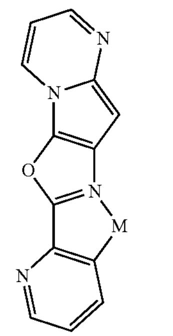
L227
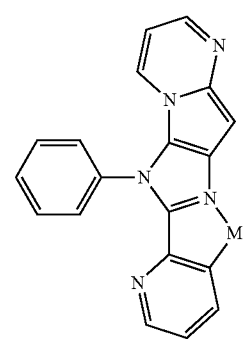
L228
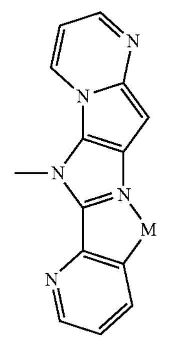

-continued
L229
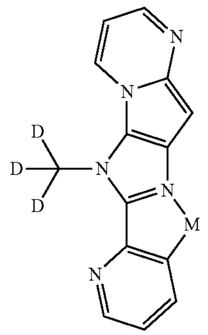
L230
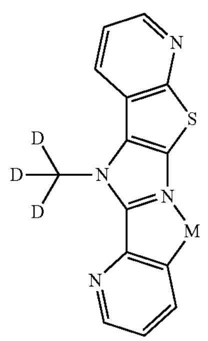
L231
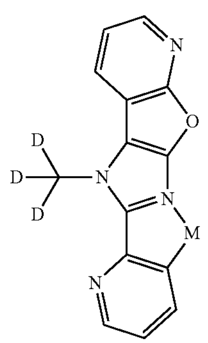
L232
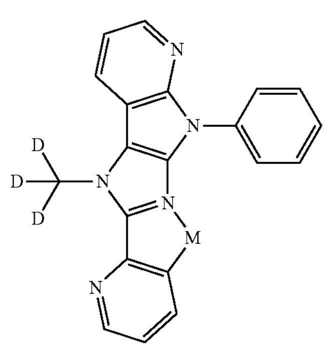
-continued
L233
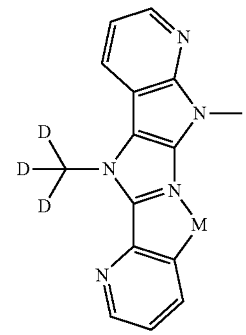
L234
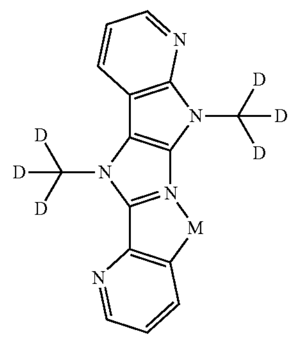
L235
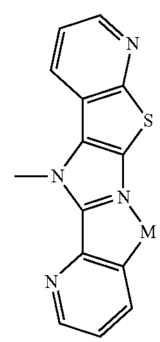
L236
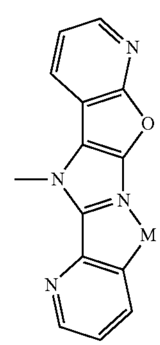

-continued
L237
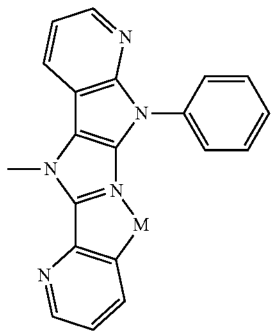
L238
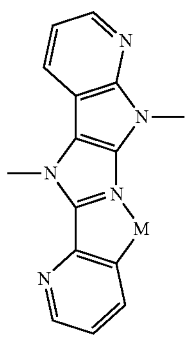
L239
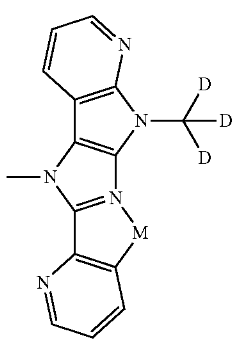
L240
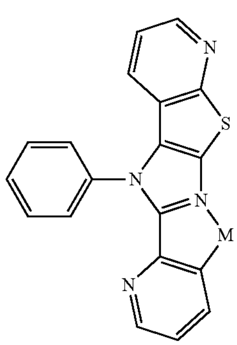
-continued
L241
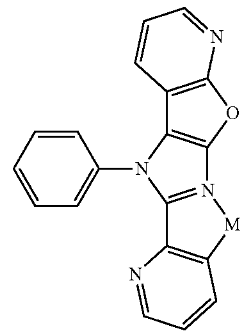
L242
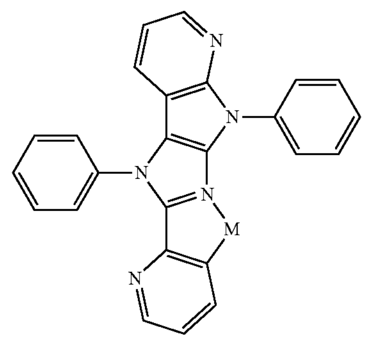
L243
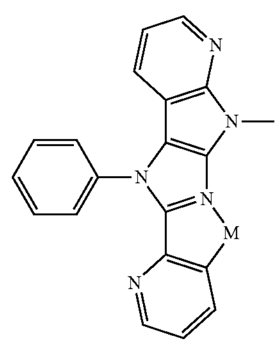
L244
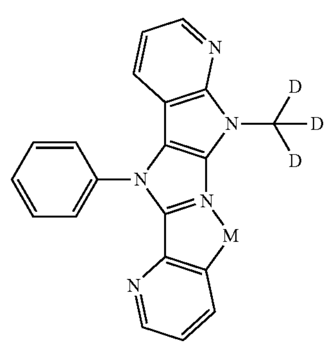

-continued
L245
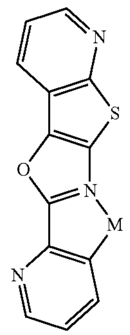
L246
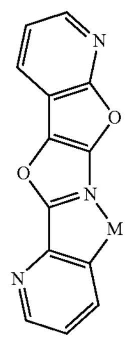
L247
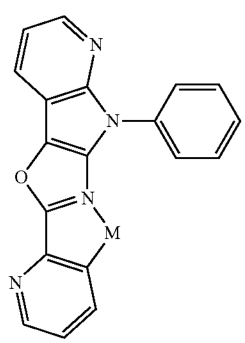
L248
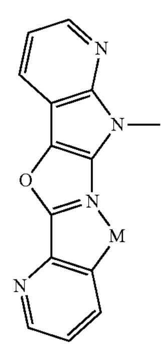
-continued
L249
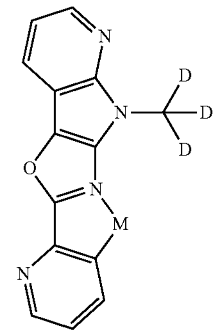
L250
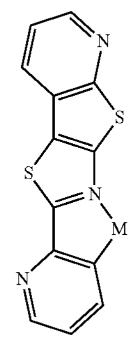
L251
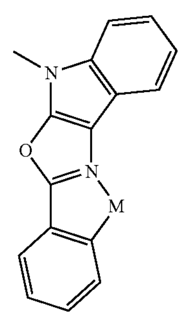
L252
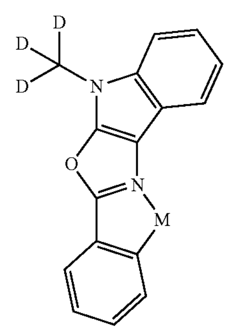
L253
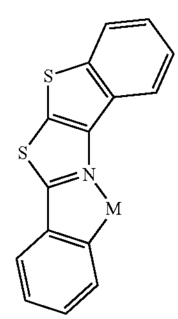

-continued
L254
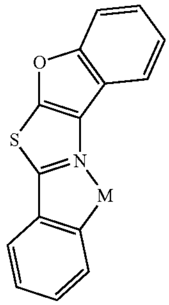
L255
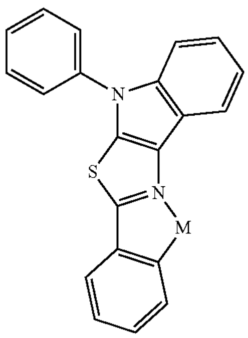
L256
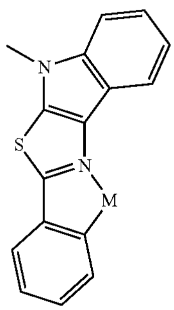
L257
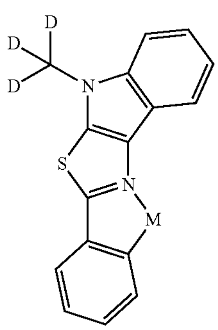
L258
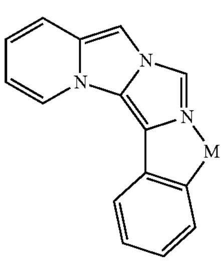
-continued
L259
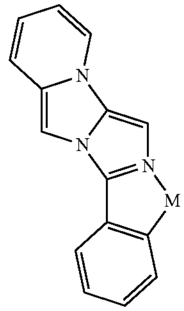
L260
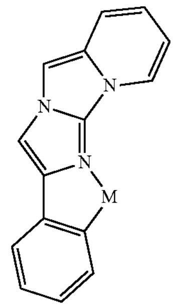
L261
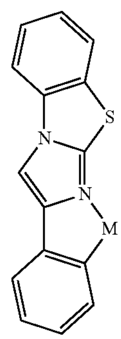
L262
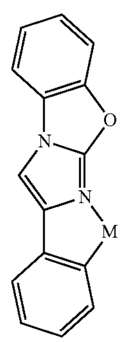
L263
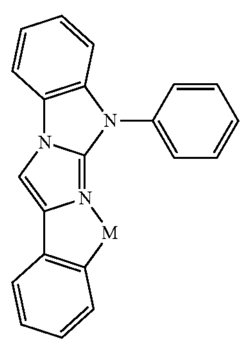

-continued
L264
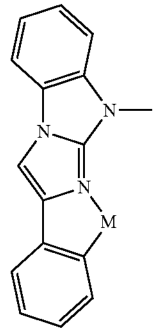
L265
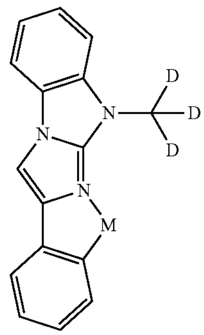
L266
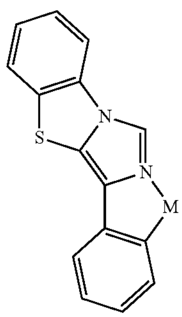
L267
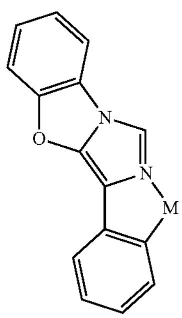
L268
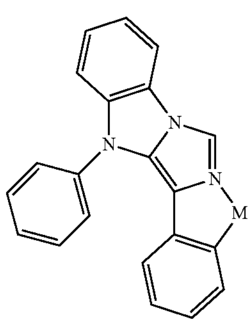
-continued
L269
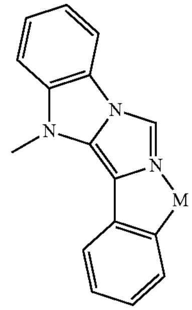
L270
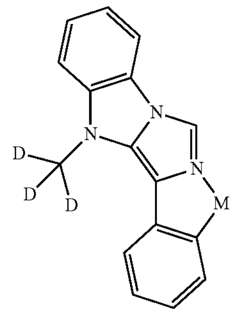
L271
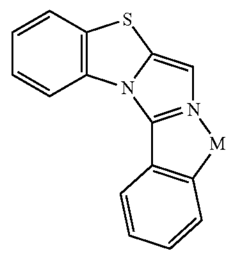
L272
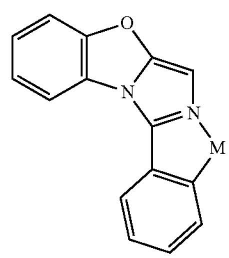
L273
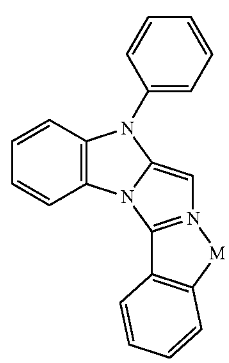

L274
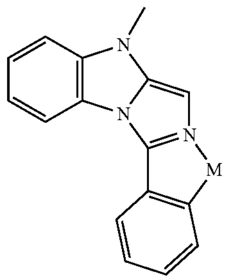
L275
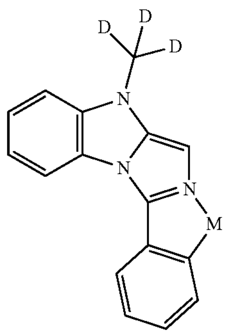
L276
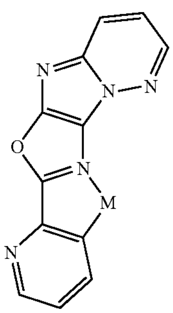
L277
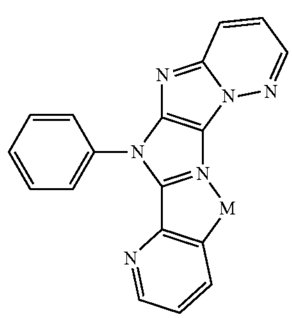
L278
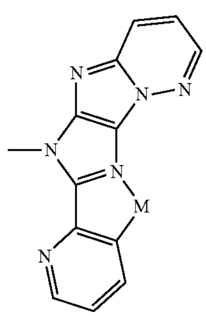
L279
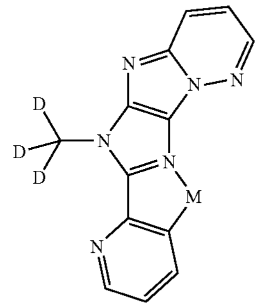
L280
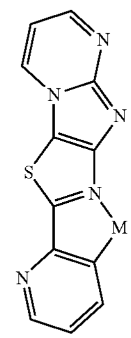
L281
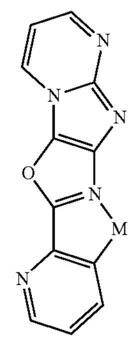
L282
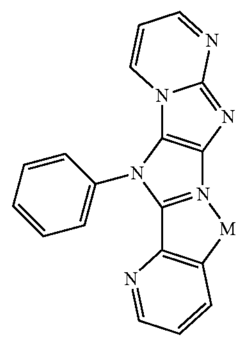

-continued
L283
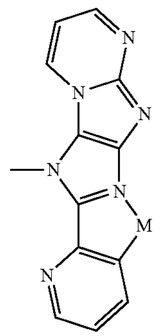
L284
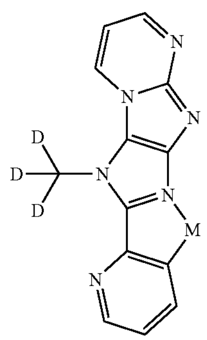
L285
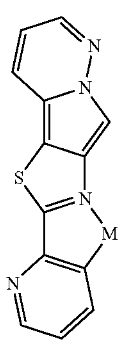
L286
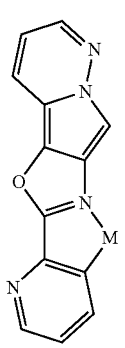
-continued
L287
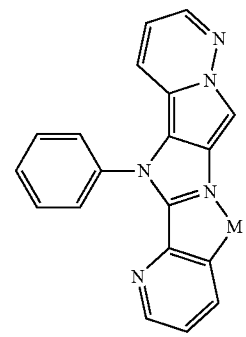
L288
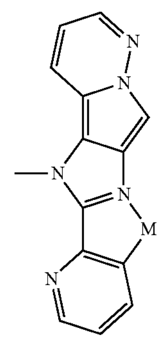
L289
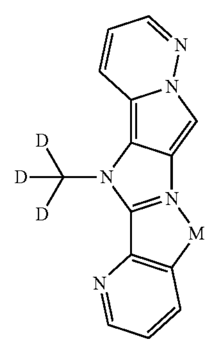
L290
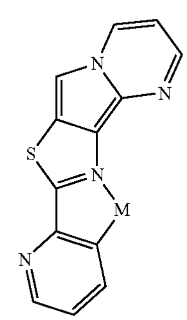
L291
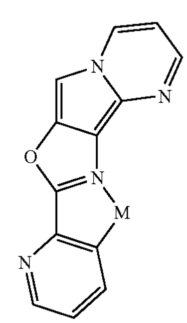

-continued
L292
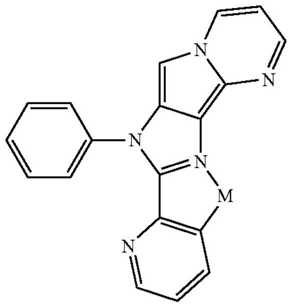
L293
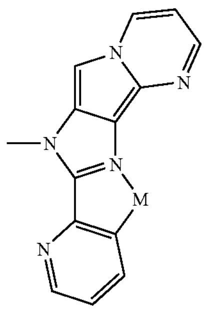
L294
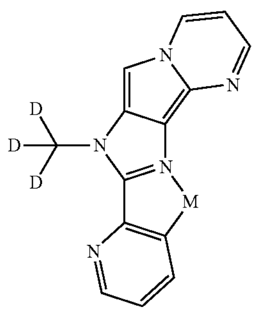
L295
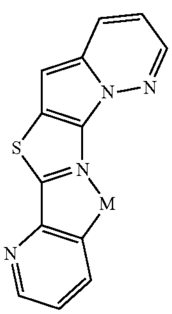
L296
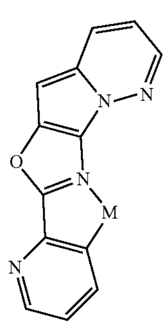
-continued
L297
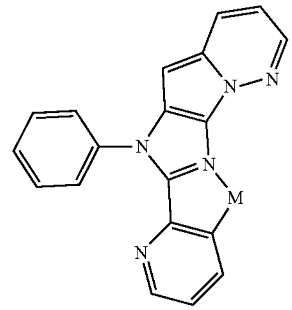
L298
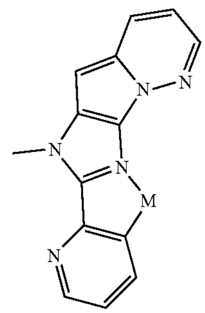
L299
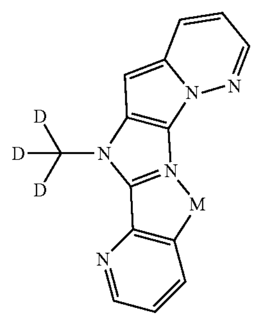
L300
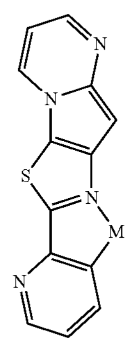
L301
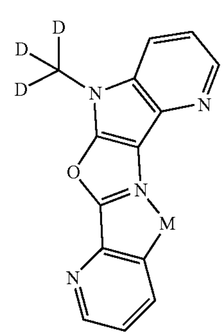

L302
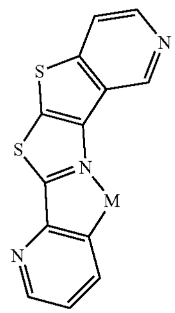
L303
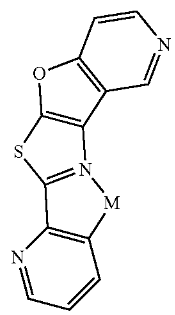
L304
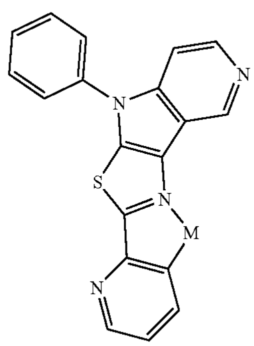
L305
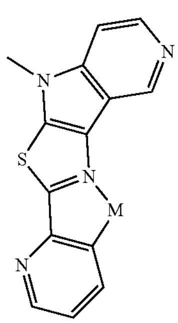
L306
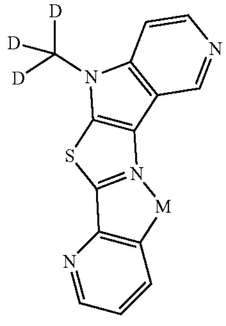
L307
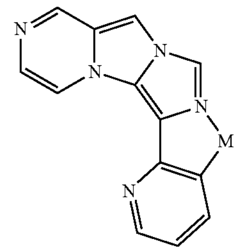
L308
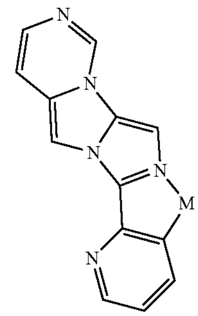
L309
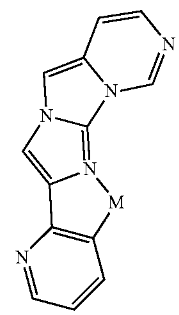
L310
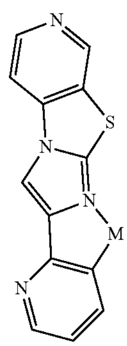
L311
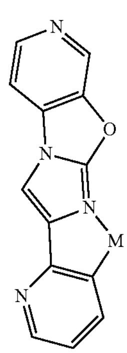

-continued
L312
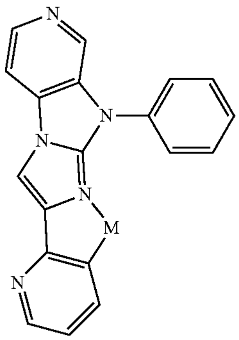
L313
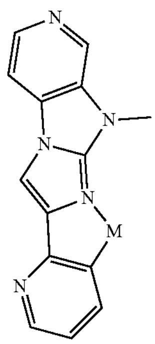
L314
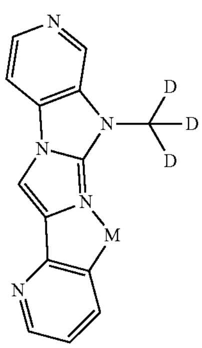
L315
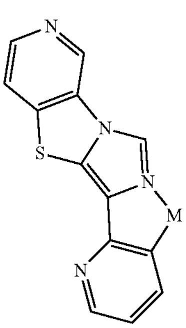
-continued
L316
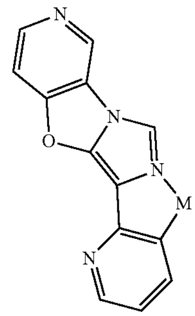
L317
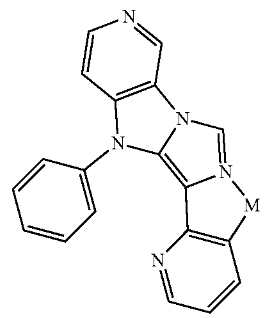
L318
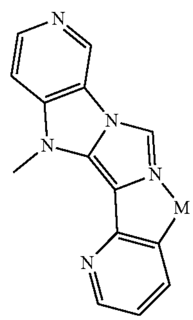
L319
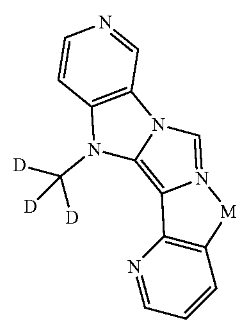
L320
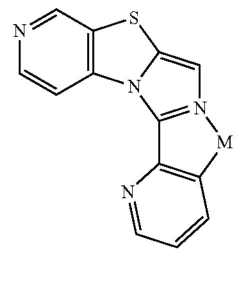

-continued
L321
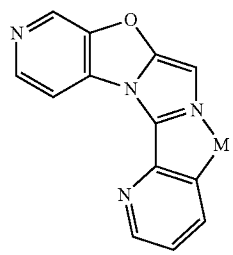
L322
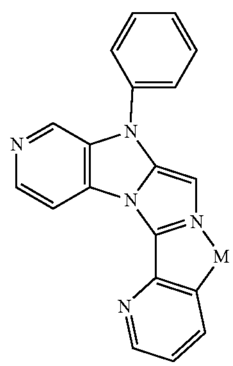
L323
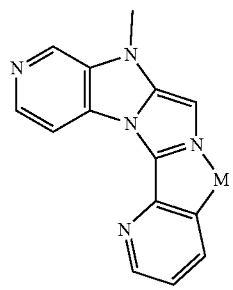
L324
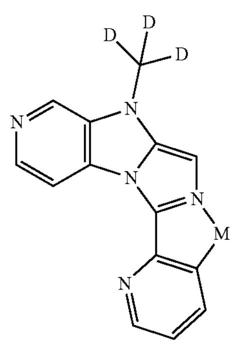
L325
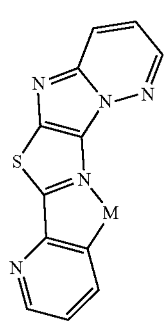
-continued
L326
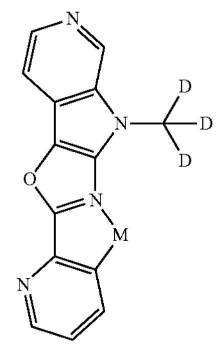
L327
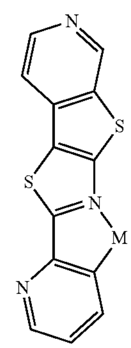
L328
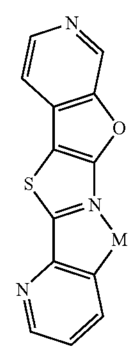
L329
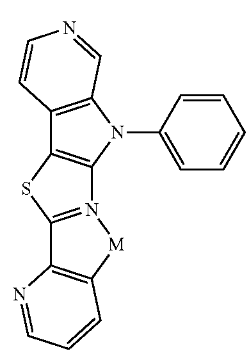

-continued
L330
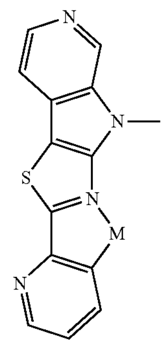
L331
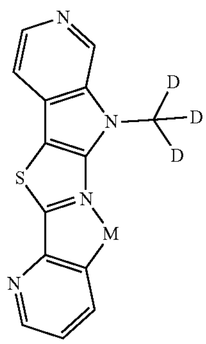
L332
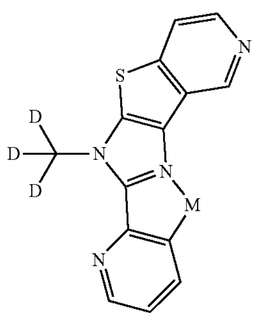
L333
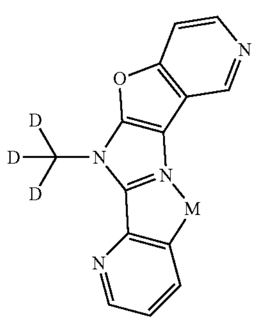
L334
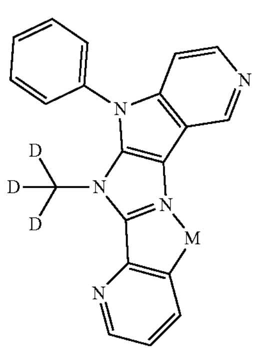
-continued
L335
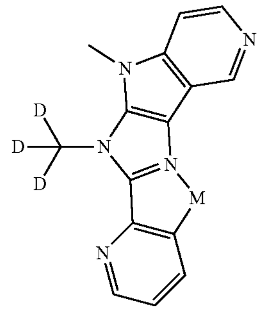
L336
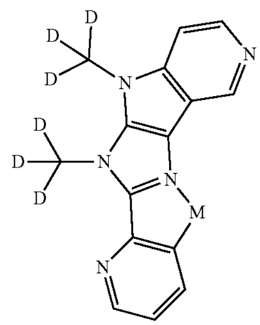
L337
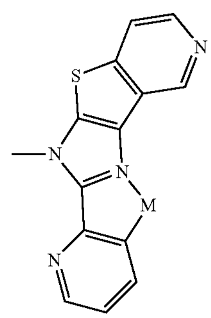
L338
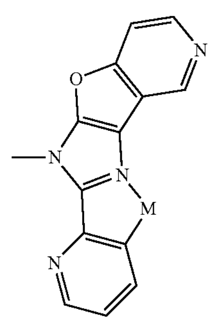
L339
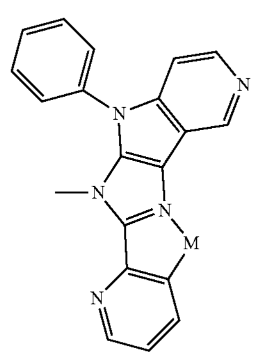

-continued
L340
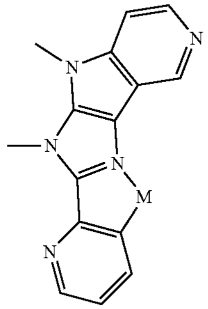
L341
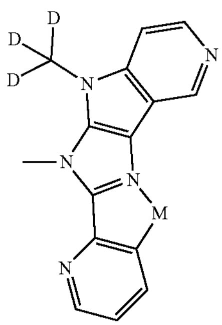
L342
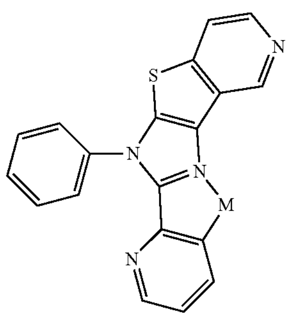
L343
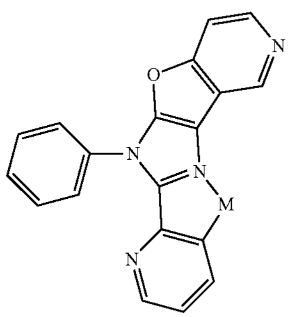
L344
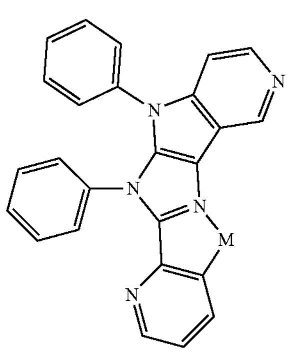
-continued
L345
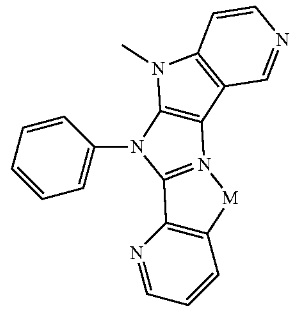
L346
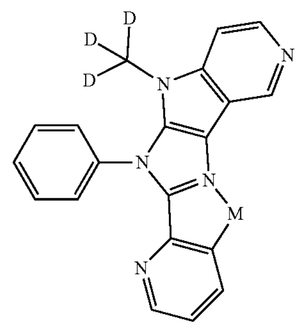
L347
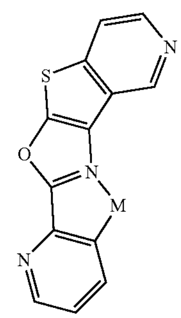
L348
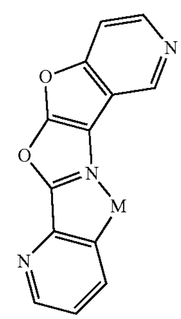
L349
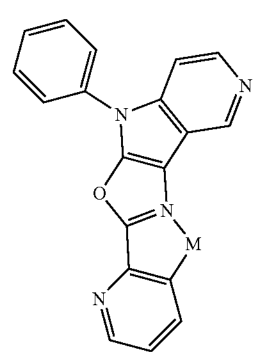

-continued
L350
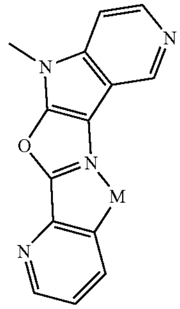
L351
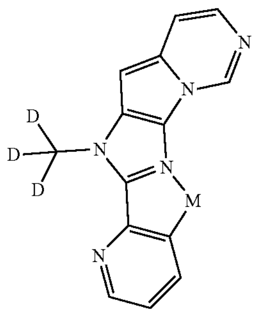
L352
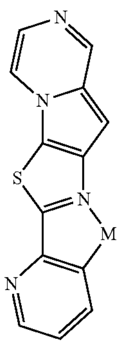
L353
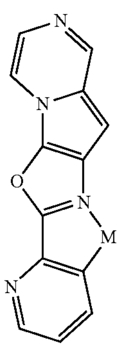
L354
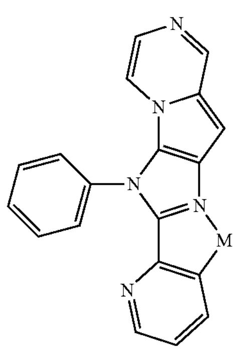
-continued
L355
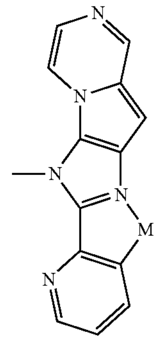
L356
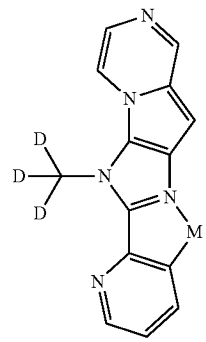
L357
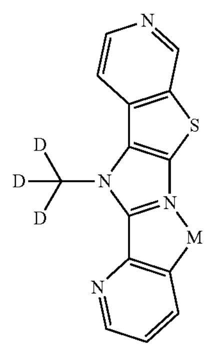
L358
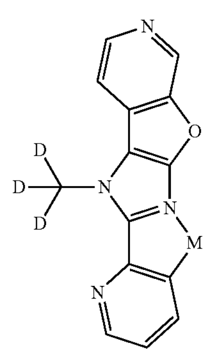

-continued
L359
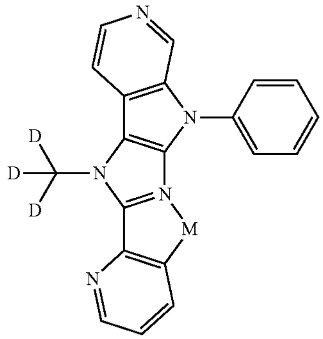
L360
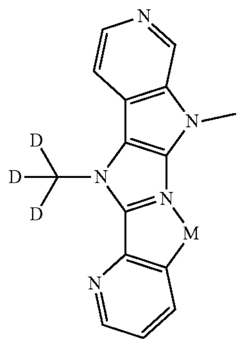
L361
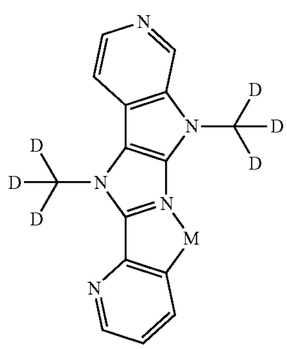
L362
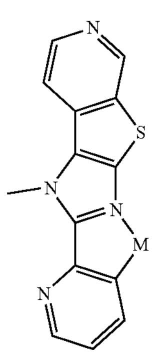
-continued
L363
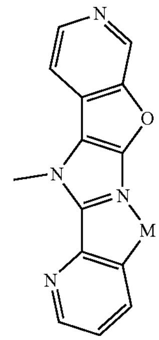
L364
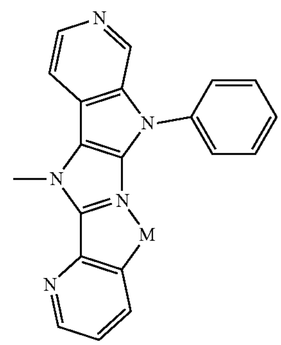
L365
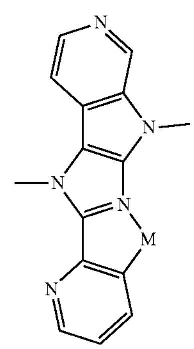
L366
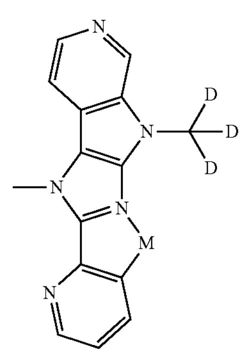

-continued
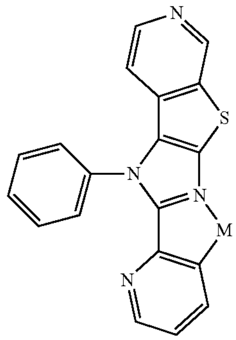
L367
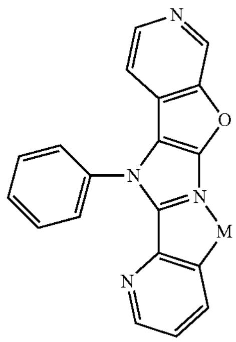
L368
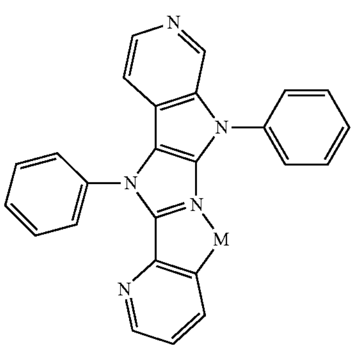
L369
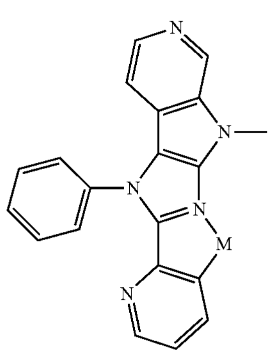
L370
-continued
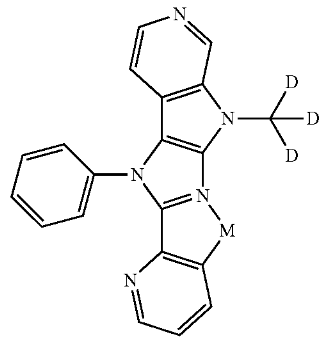
L371
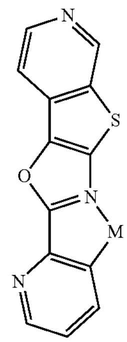
L372
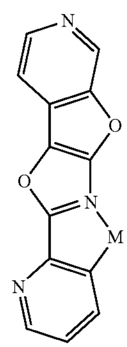
L373
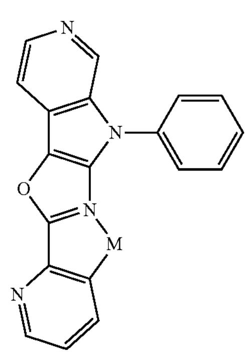
L374

-continued
L375
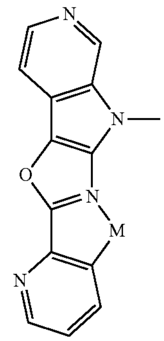
L376
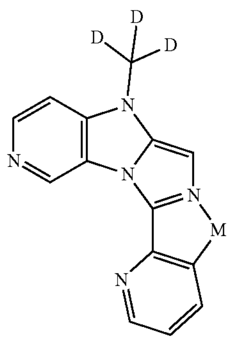
L377
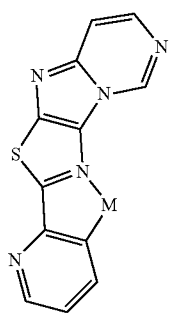
L378
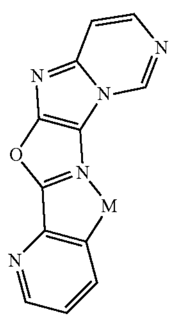
L379
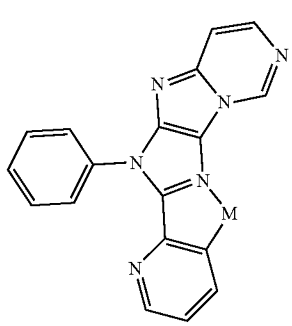
-continued
L380
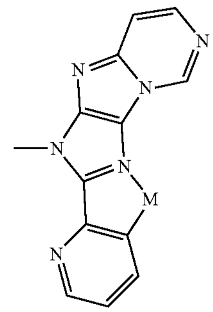
L381
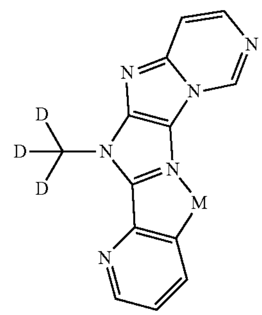
L382
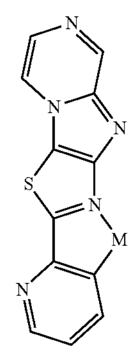
L383
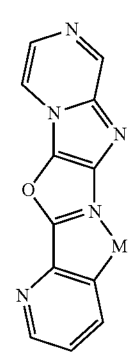

-continued
L384
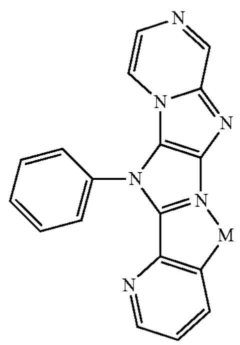
L385
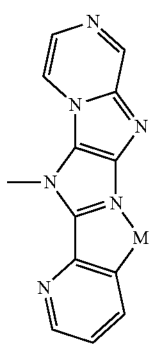
L386
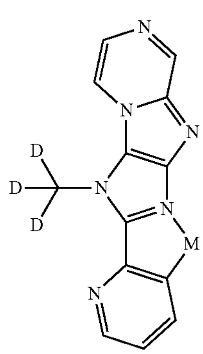
L387
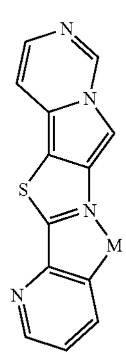
-continued
L388
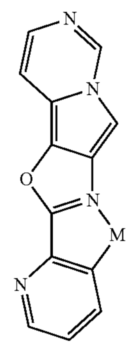
L389
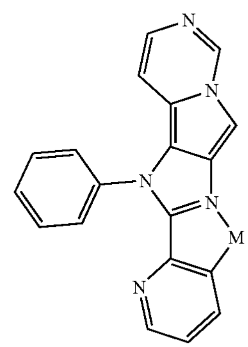
L390
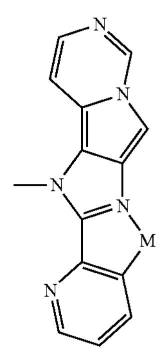
L391
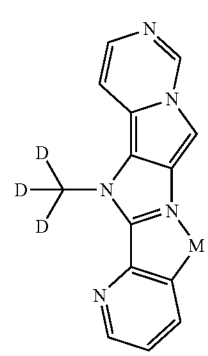

-continued
L392
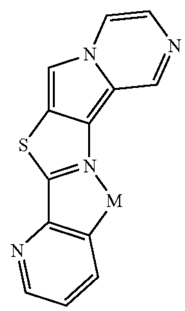
L393
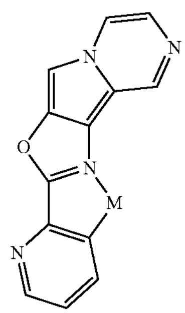
L394
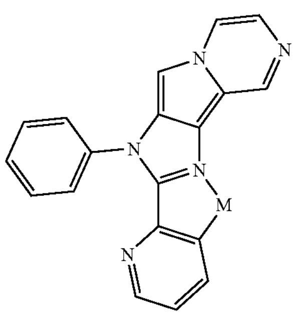
L395
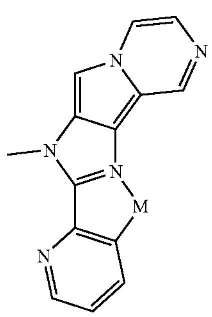
L396
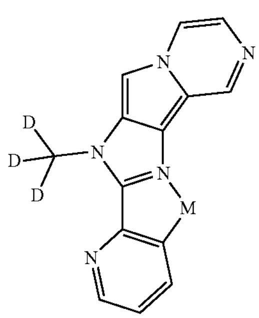
-continued
L397
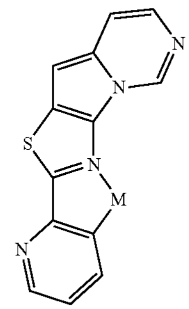
L398
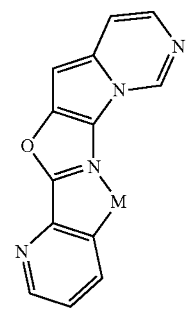
L399
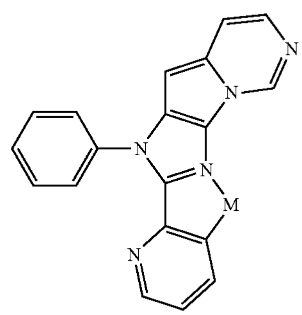
L400
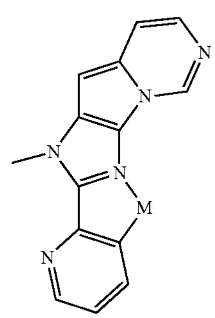
L401
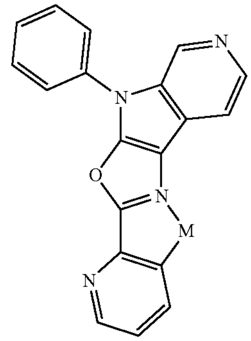

-continued
L402
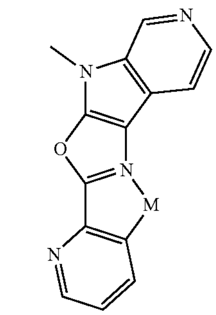
L403
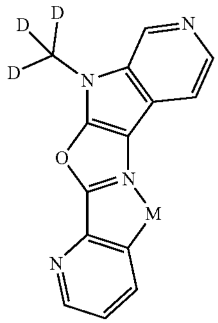
L404
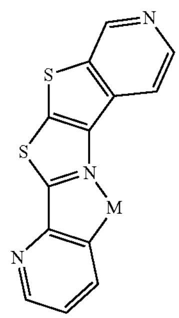
L405
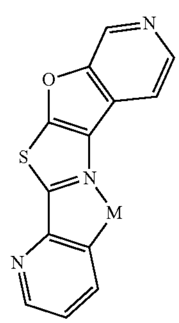
L406
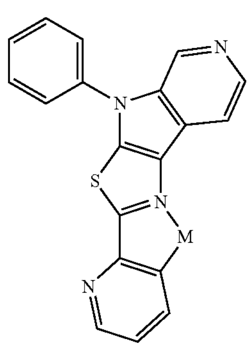
-continued
L407
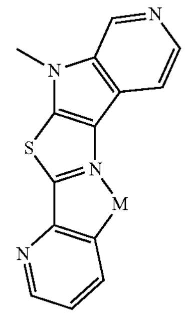
L408
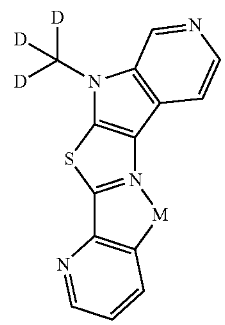
L409
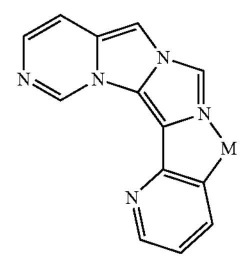
L410
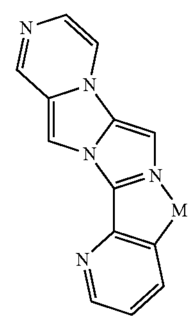
L411
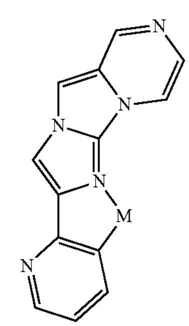

-continued
L412
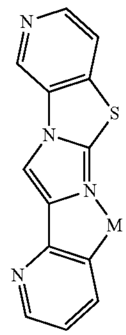
L413
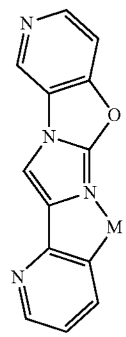
L414
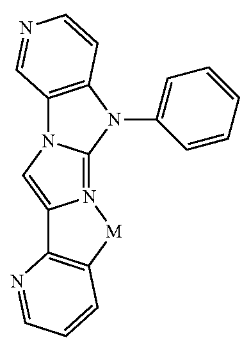
L415
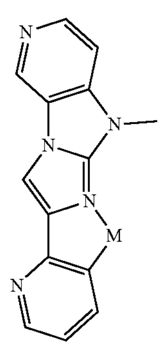
-continued
L416
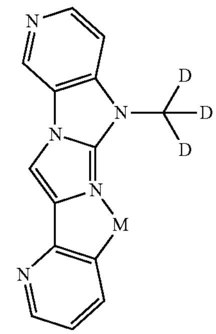
L417
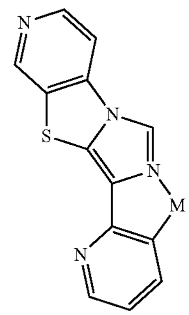
L418
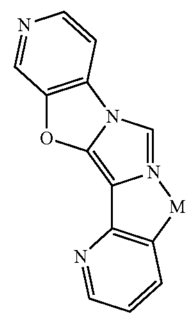
L419
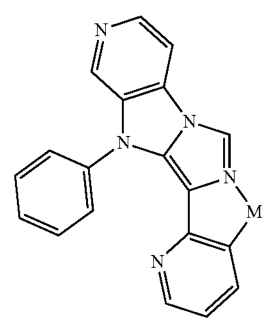
L420
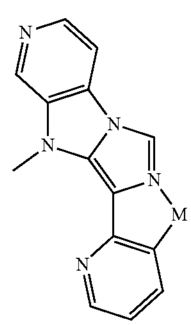

-continued
L421
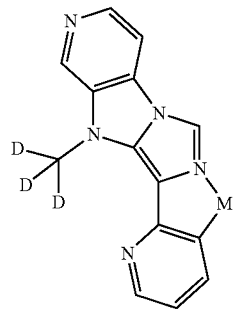
L422
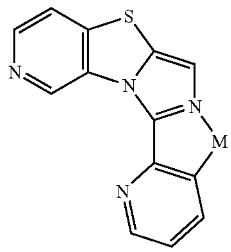
L423
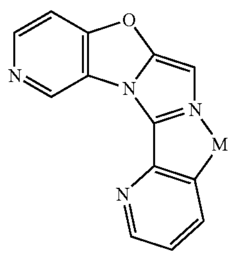
L424
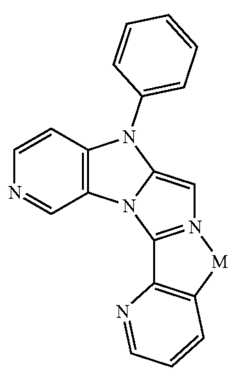
L425
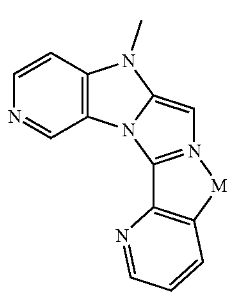
-continued
L426
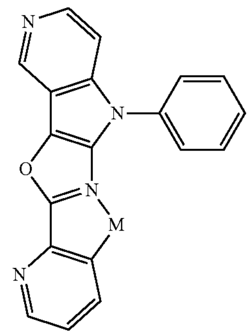
L427
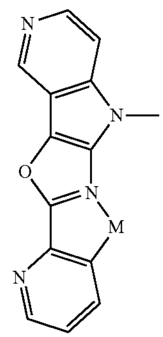
L428
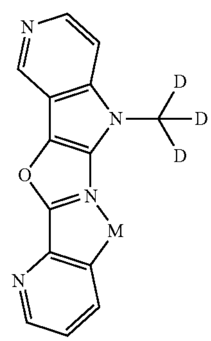
L429
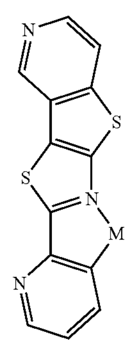

L430
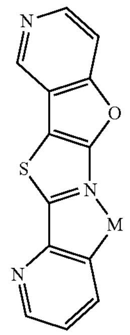
L431
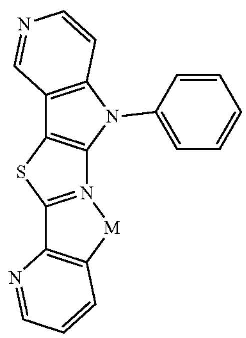
L432
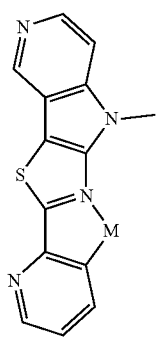
L433
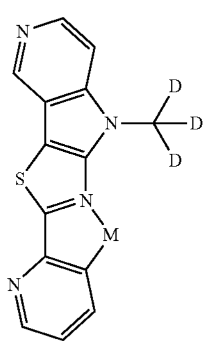
L434
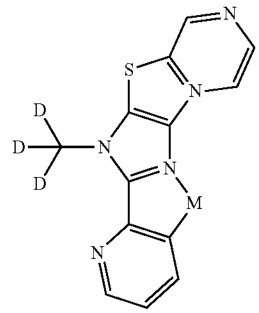
L435
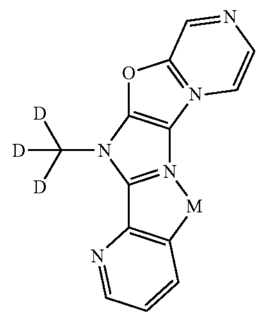
L436
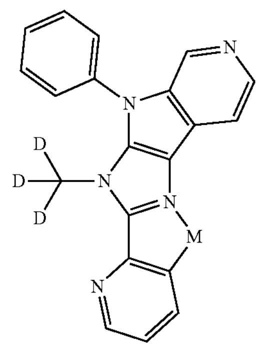
L437
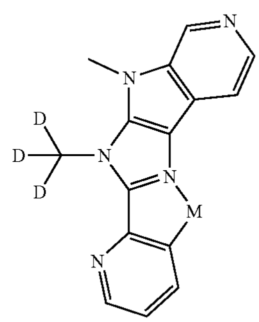
L438
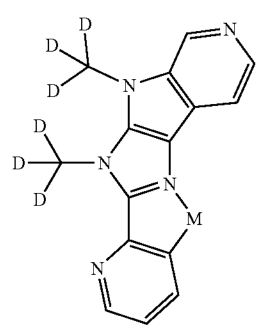

-continued
L439
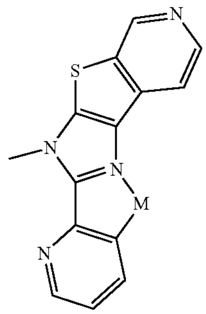
L440
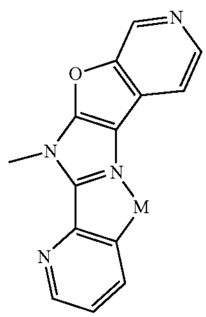
L441
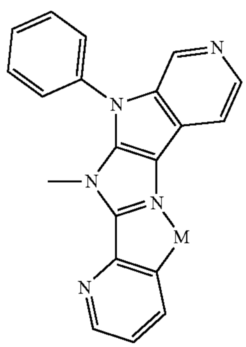
L442
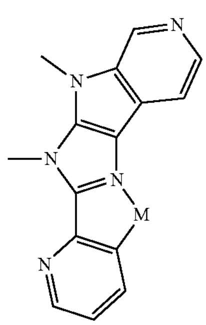
L443
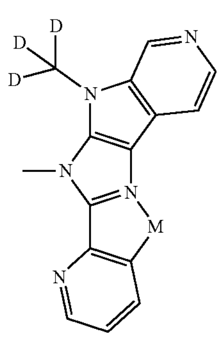
-continued
L444
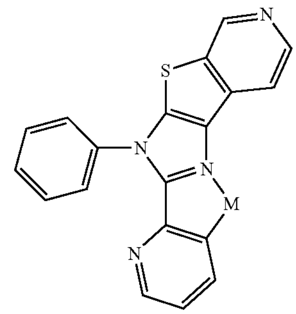
L445
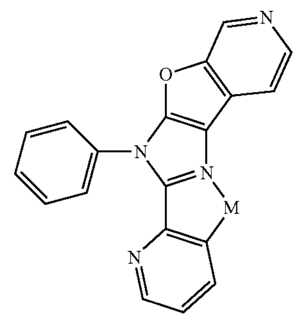
L446
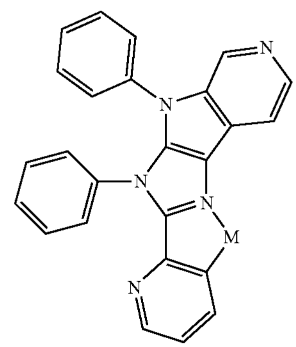
L447
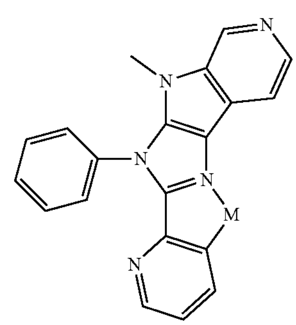
L448
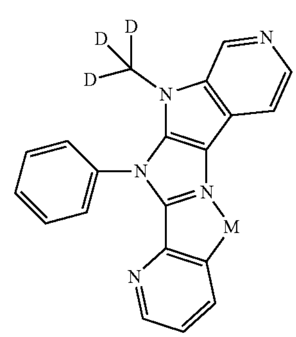

-continued
L449
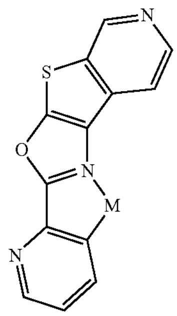
L450
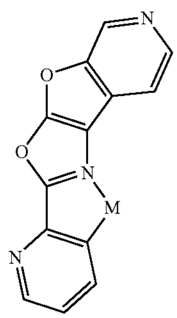
L451
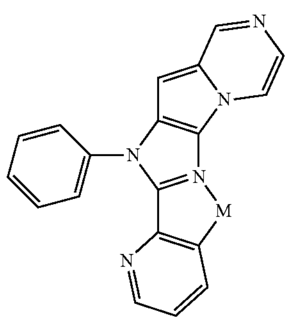
L452
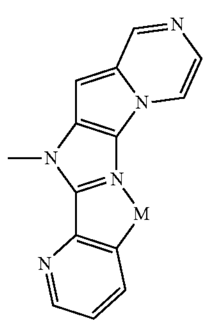
L453
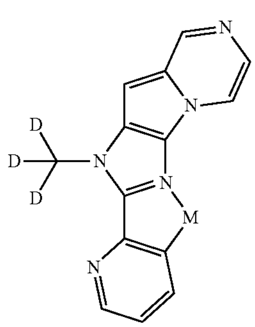
-continued
L454
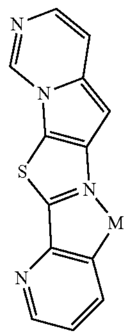
L455
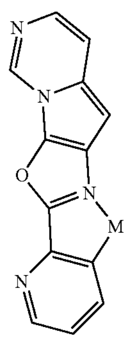
L456
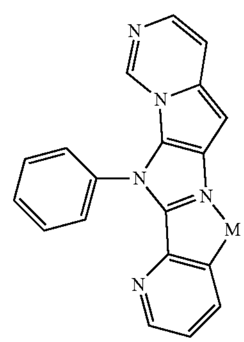
L457
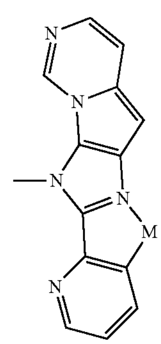

-continued
L458
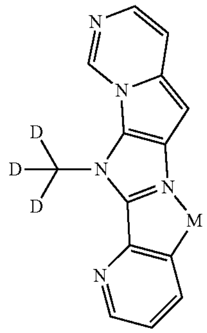
L459
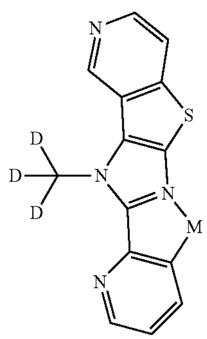
L460
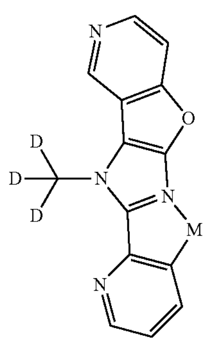
L461
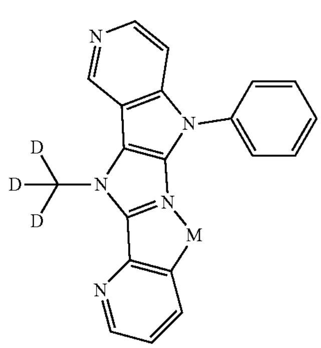
-continued
L462
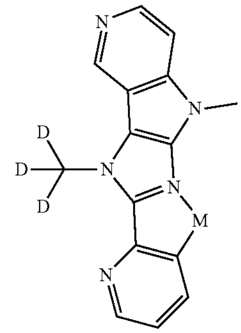
L463
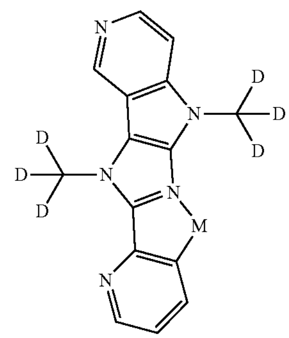
L464
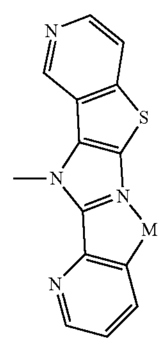
L465
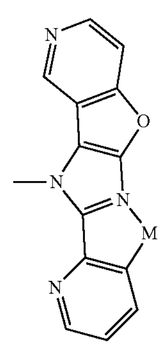

L466
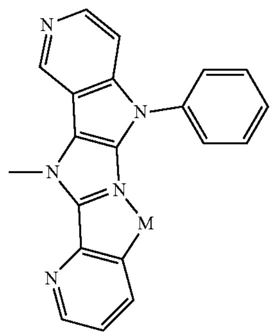
L467
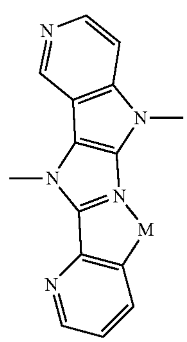
L468
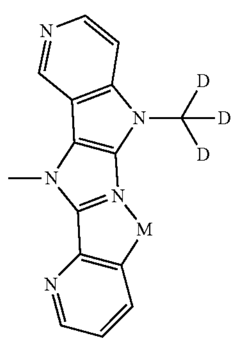
L469
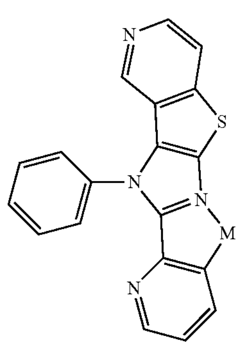
L470
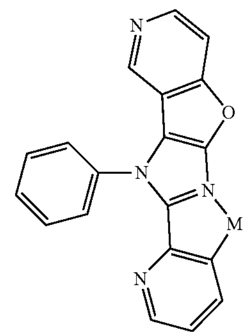
L471
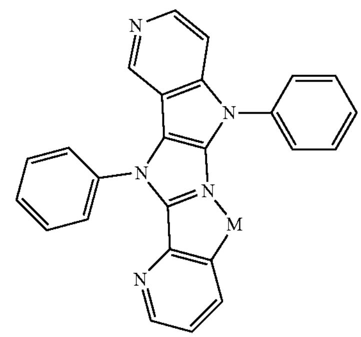
L472
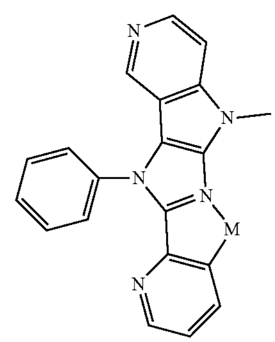
L473
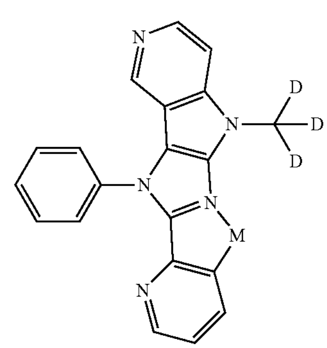

L474
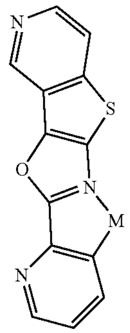
L475
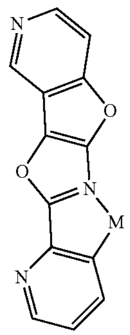
L476
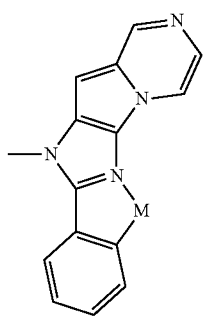
L477
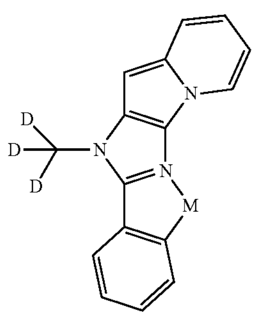
L478
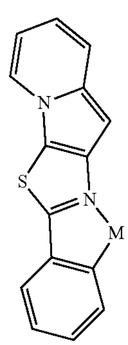
L479
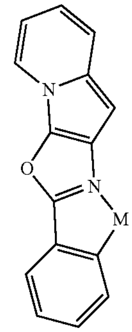
L480
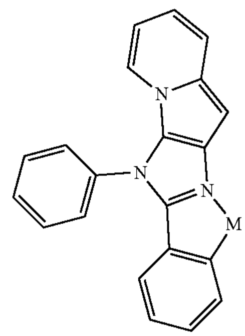
L481
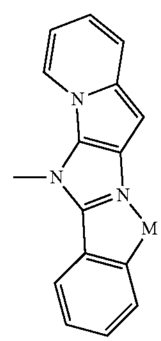
L482
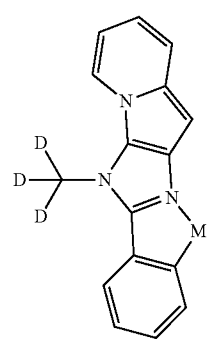

-continued
L483
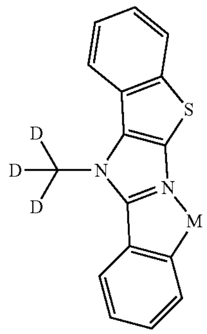
L484
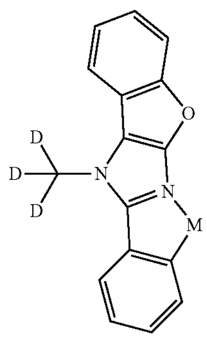
L485
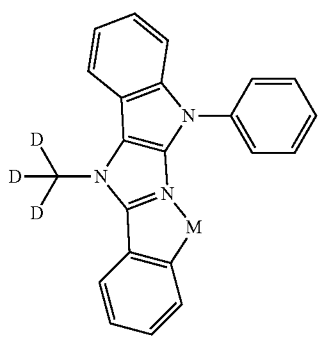
L486
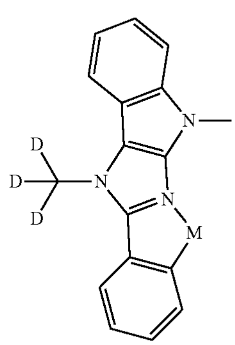
-continued
L487
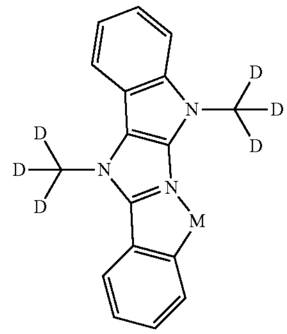
L488
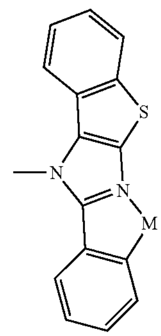
L489
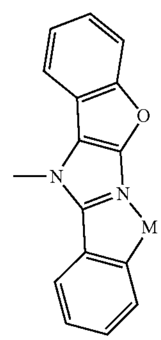
L490
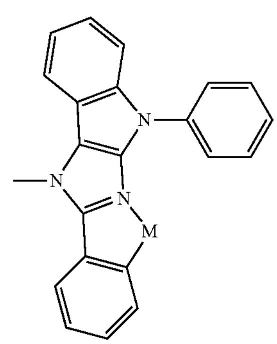

L491
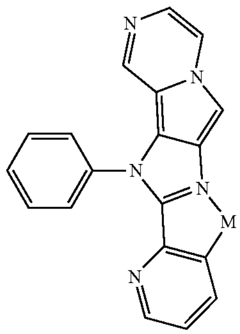
L492
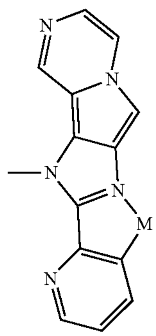
L493
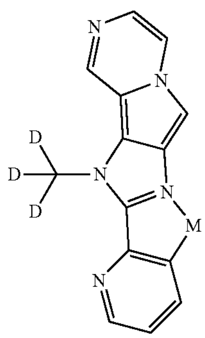
L494
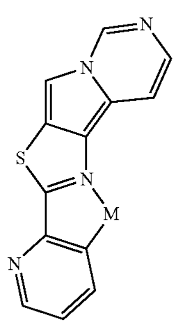
L495
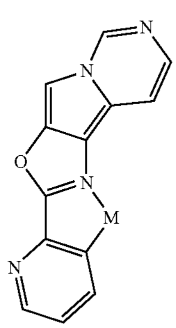
L496
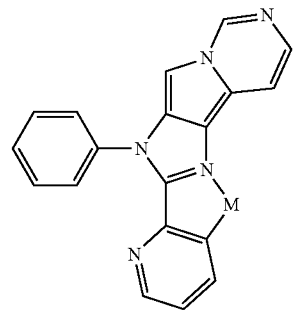
L497
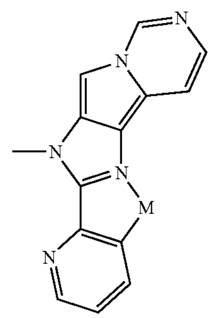
L498
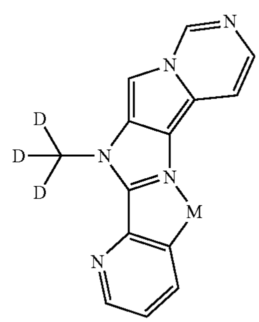
L499
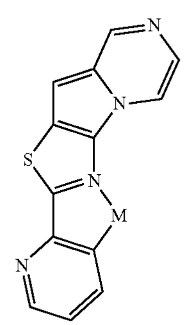
L500
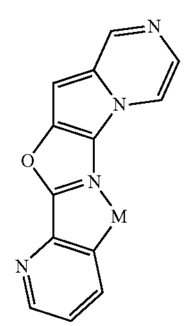

-continued
L501
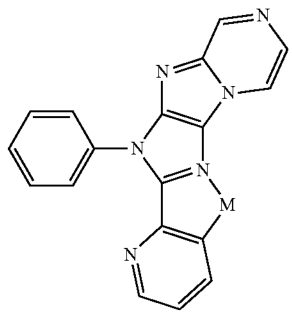
L502
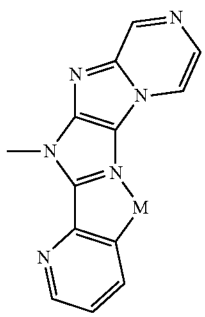
L503
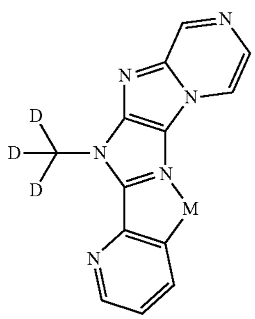
L504
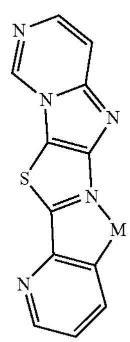
L505
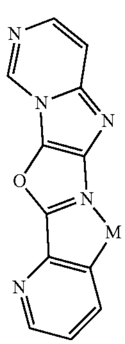
-continued
L506
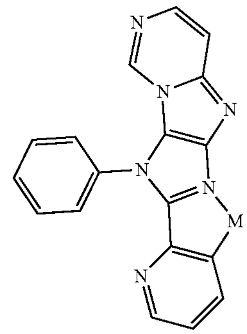
L507
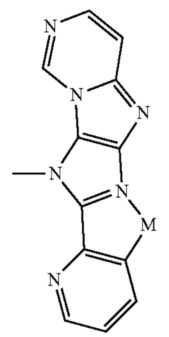
L508
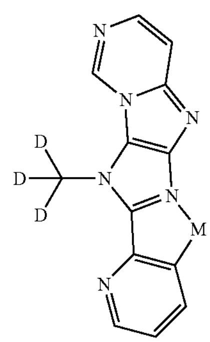
L509
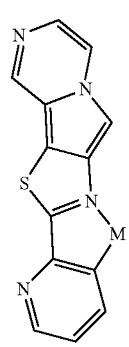

-continued
L510
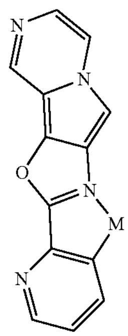
L511
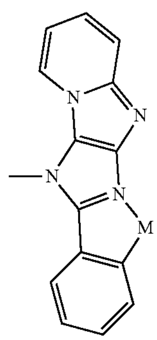
L512
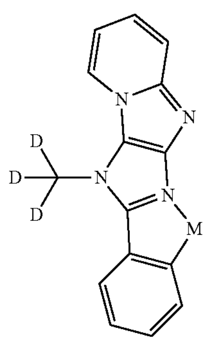
L513
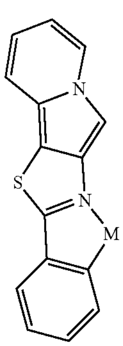
-continued
L514
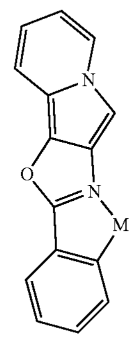
L515
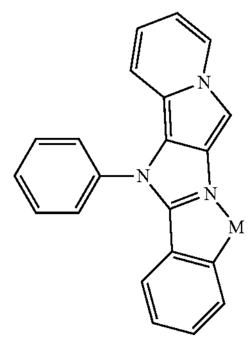
L516
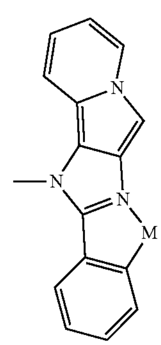
L517
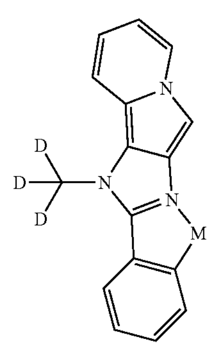

-continued
L518
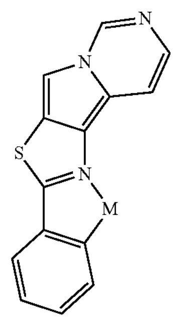
L519
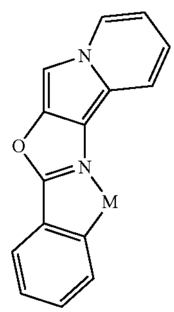
L520
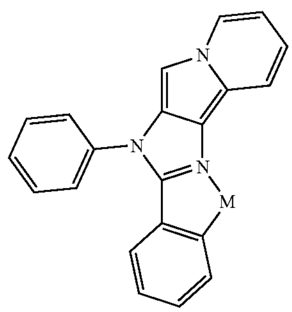
L521
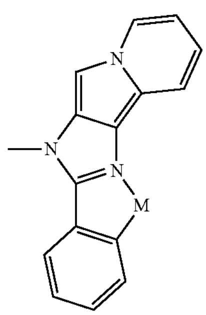
L522
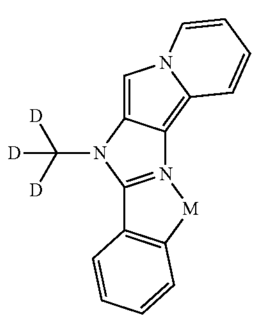
-continued
L523
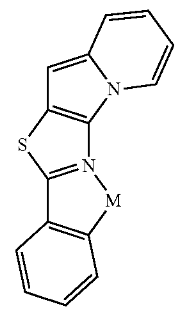
L524
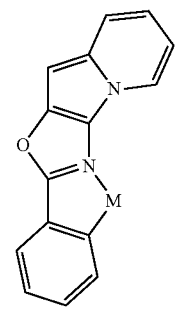
L525
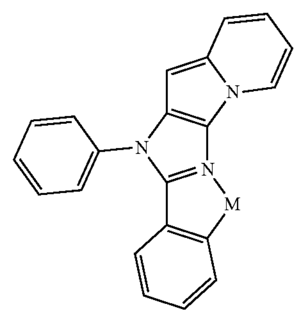
L526
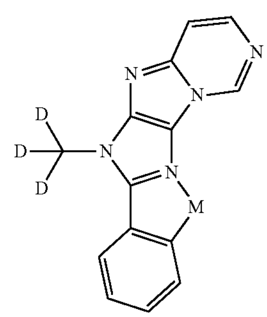
L527
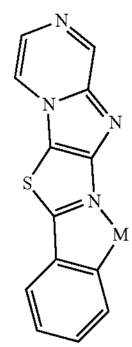

-continued
L528
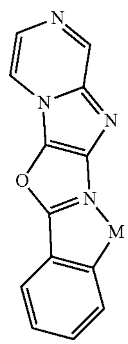
L529
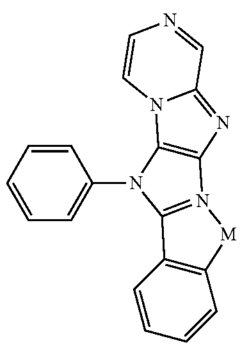
L530
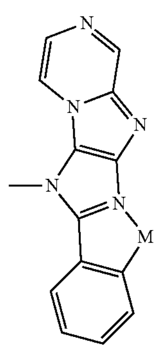
L531
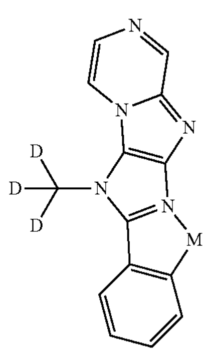
-continued
L532
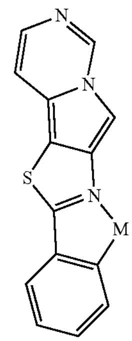
L533
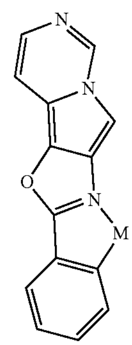
L534
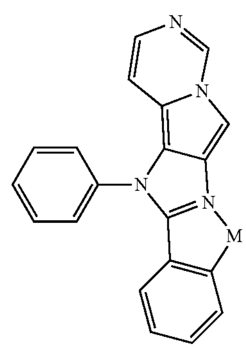
L535
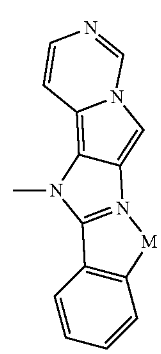

L536
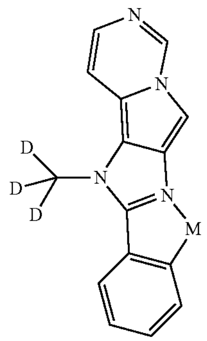
L537
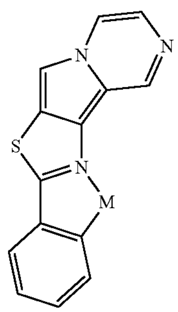
L538
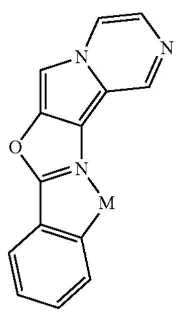
L539
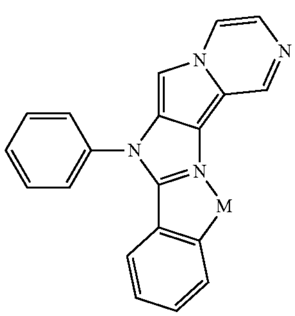
L540
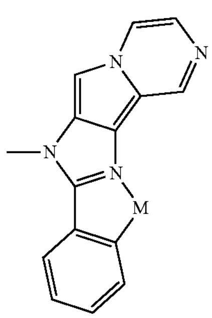
L541
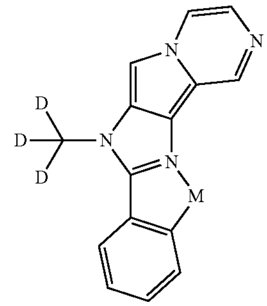
L542
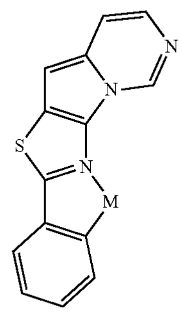
L543
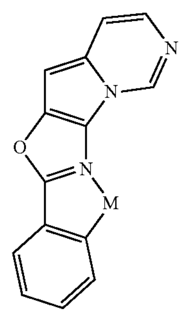
L544
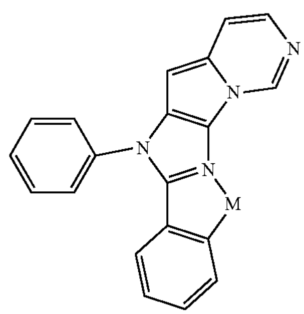
L545
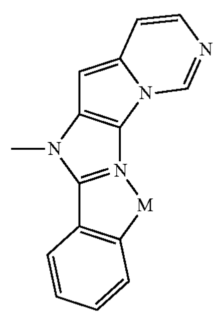

-continued
L546
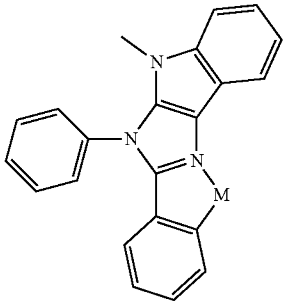
L547
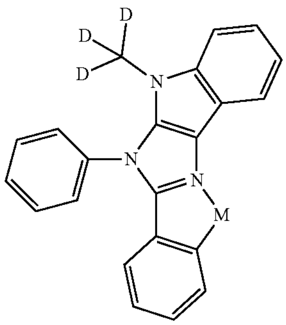
L548
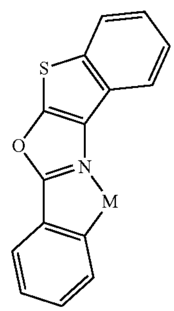
L549
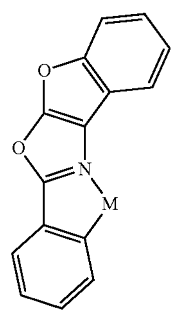
L550
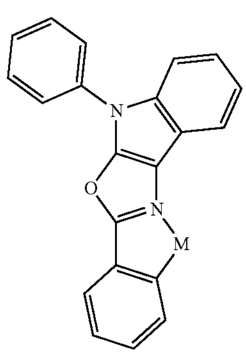
-continued
L551
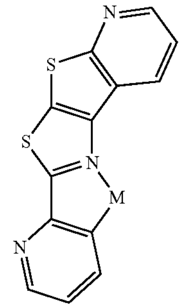
L552
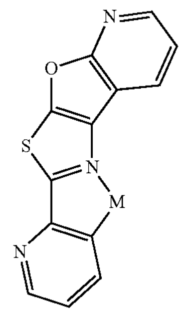
L553
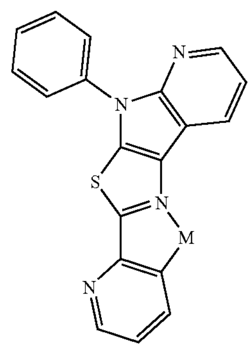
L554
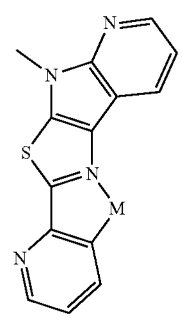
L555
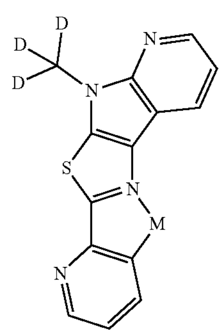

L556
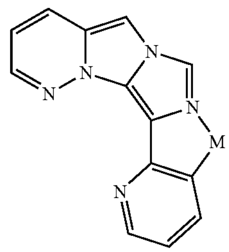
L557
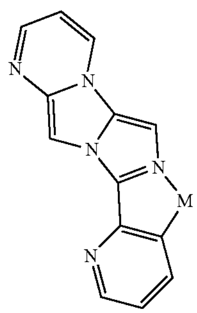
L558
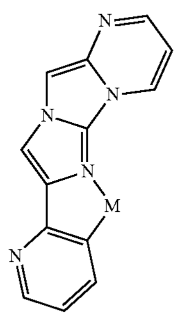
L559
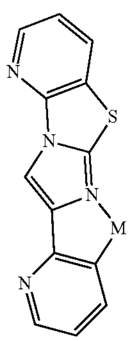
L560
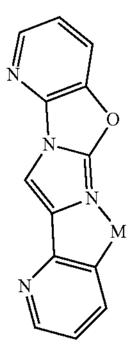
L561
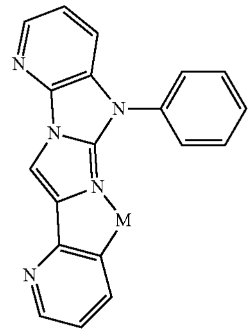
L562
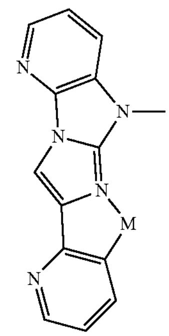
L563
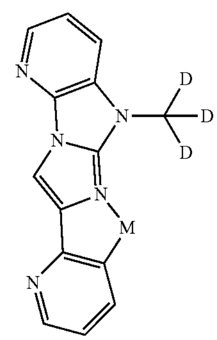
L564
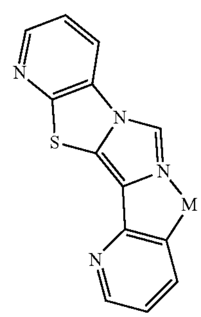
L565
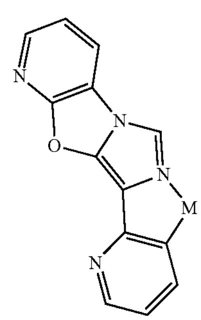

-continued
L566
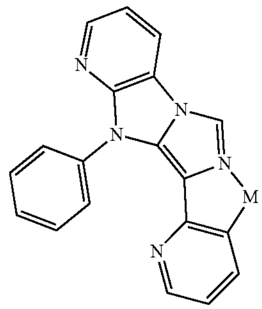
L567
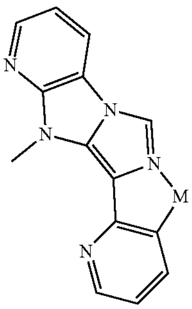
L568
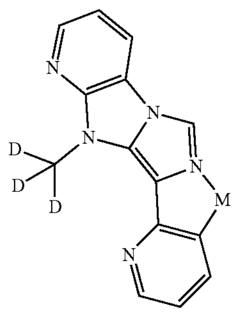
L569
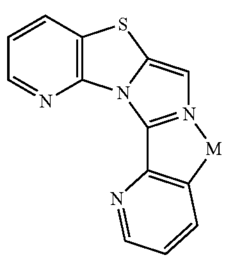
L570
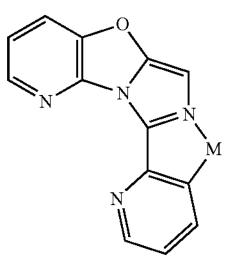
-continued
L571
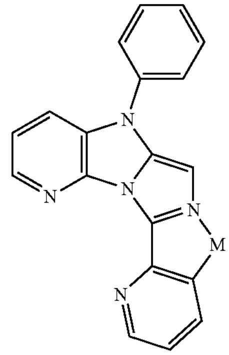
L572
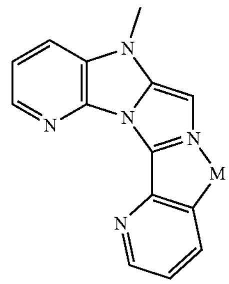
L573
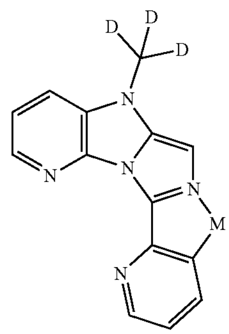
L574
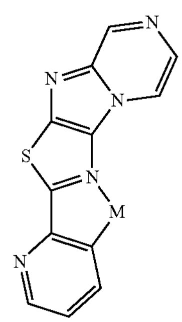
L575
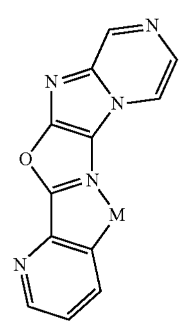

-continued
L576
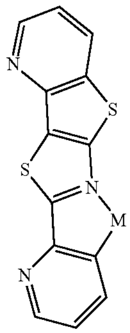
L577
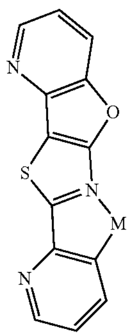
L578
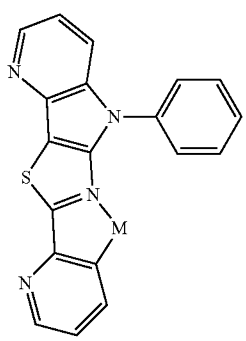
L579
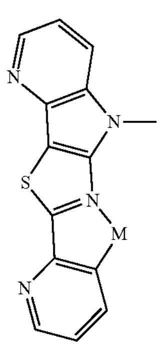
-continued
L580
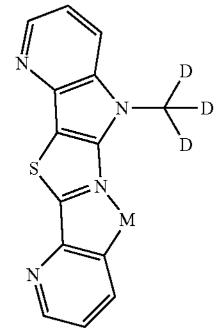
L581
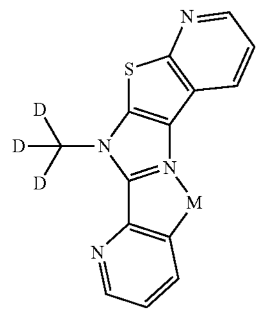
L582
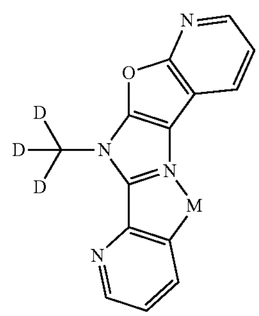
L583
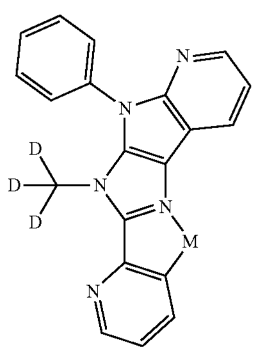
L584
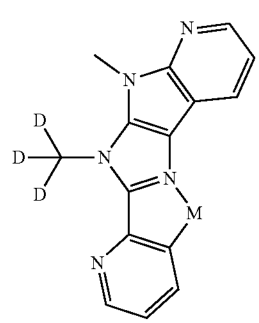

-continued
L585
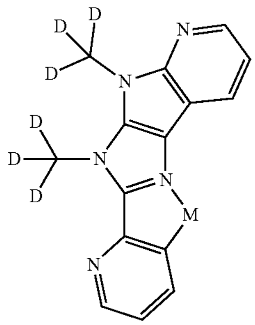
L586
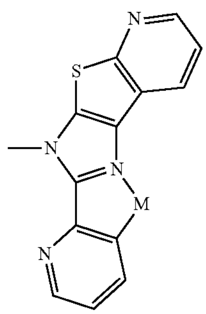
L587
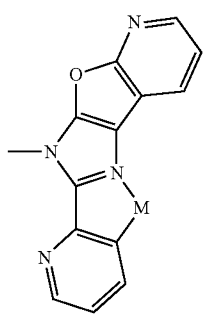
L588
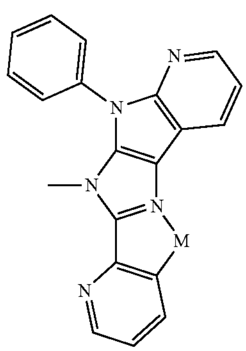
L589
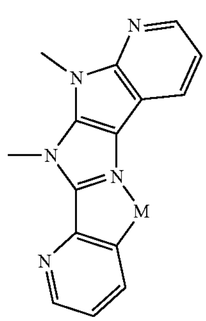
-continued
L590
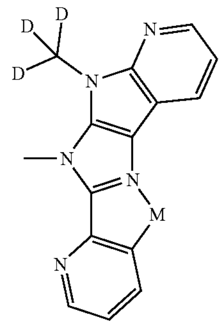
L591
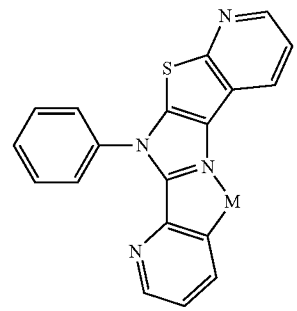
L592
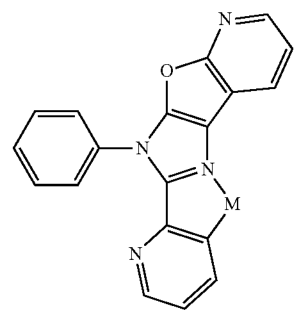
L593
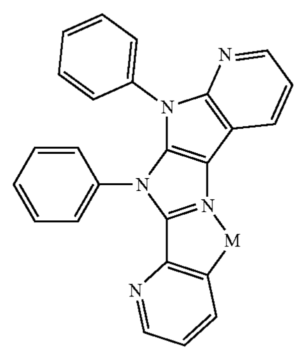
L594
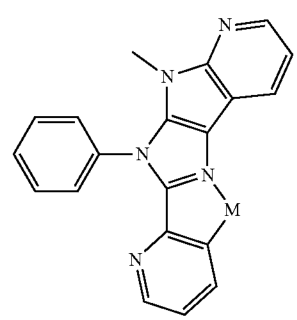

-continued
L595
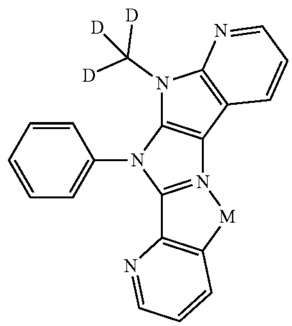
L596
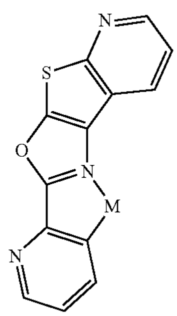
L597
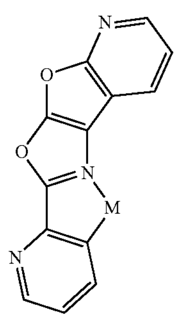
L598
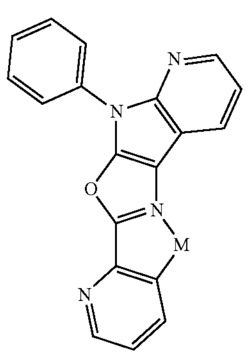
-continued
L599
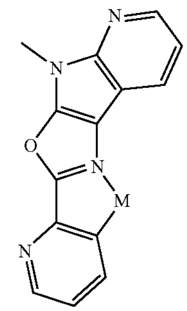
L600
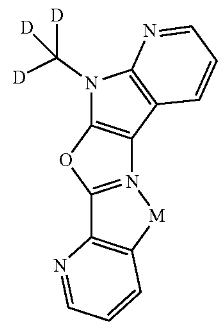
L601
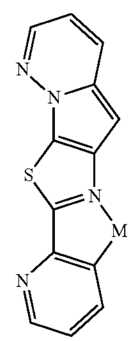
L602
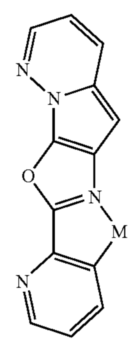
L603
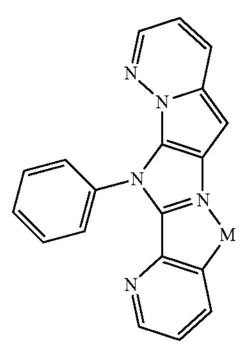

-continued
L604
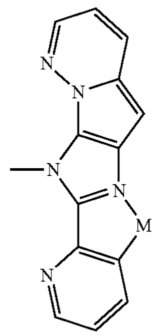
L605
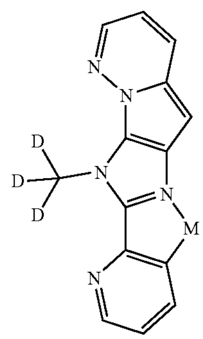
L606
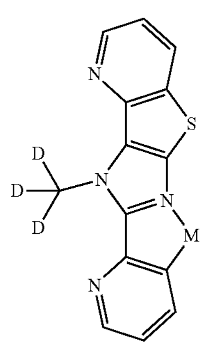
L607
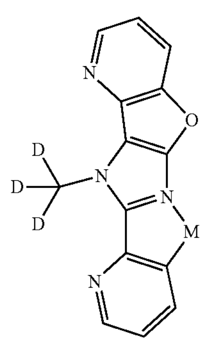
-continued
L608
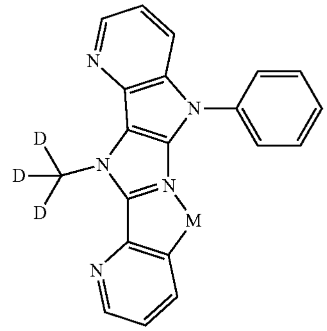
L609
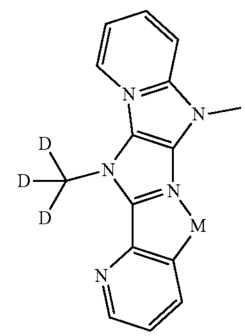
L610
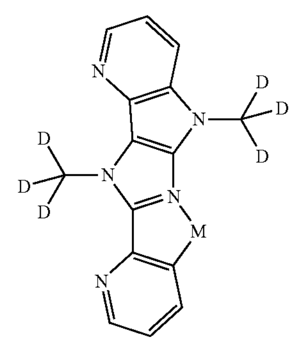
L611
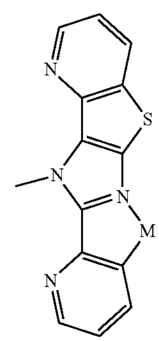

-continued
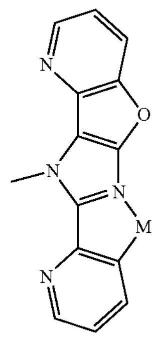
L612
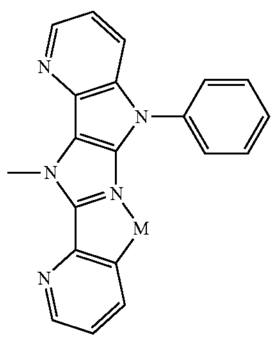
L613
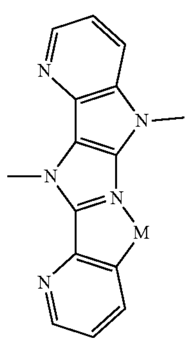
L614
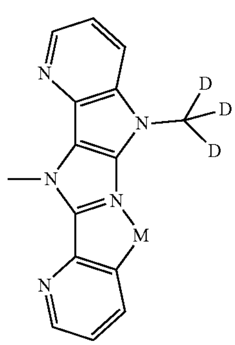
L615
-continued
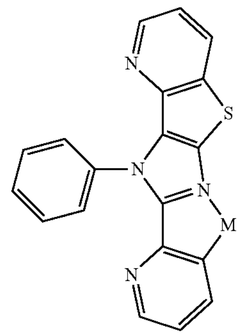
L616
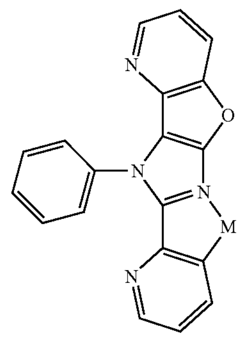
L617
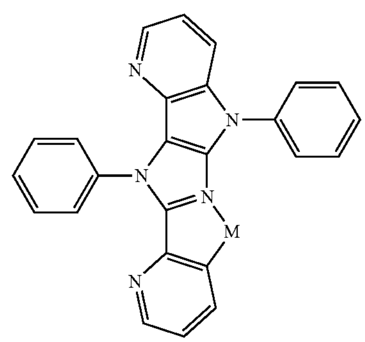
L618
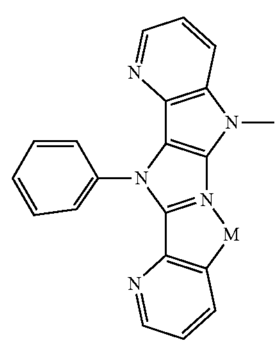
L619

-continued
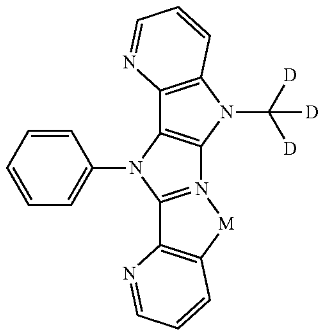
L620
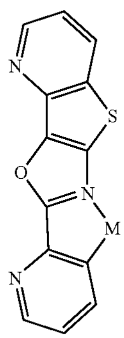
L621
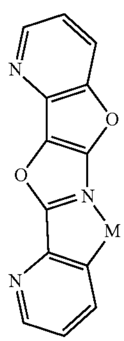
L622
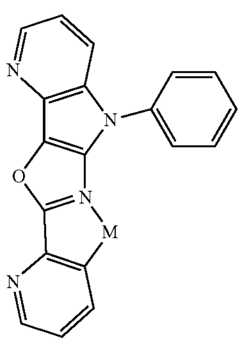
L623
-continued
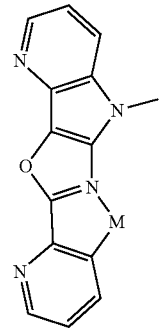
L624
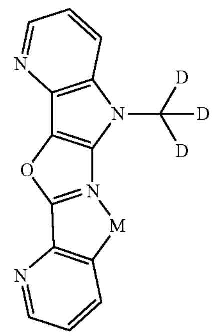
L625
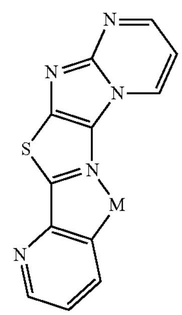
L626
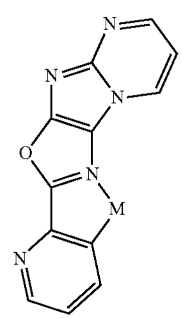
L627
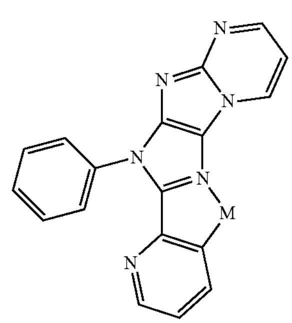
L628

L629
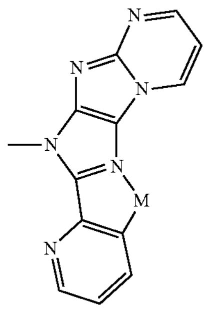
L630
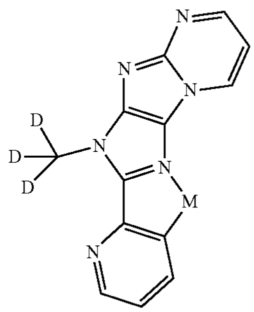
L631
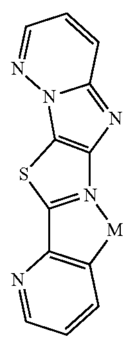
L632
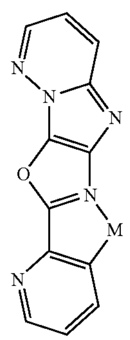
L633
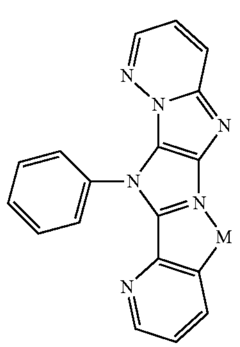
L634
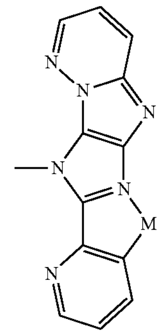
L635
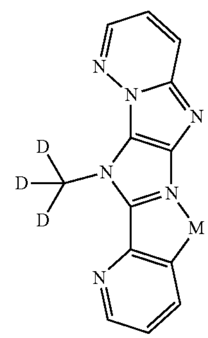
L636
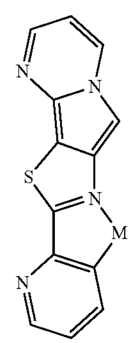
L637
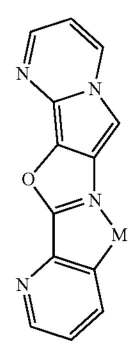

L638
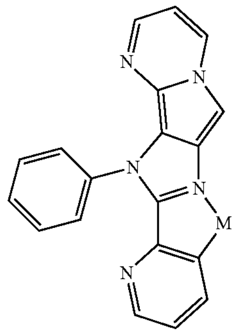
L639
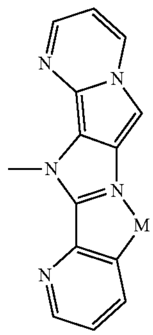
L640
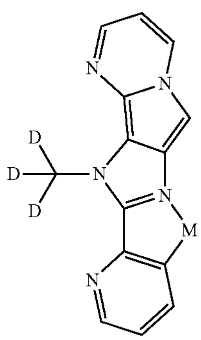
L641
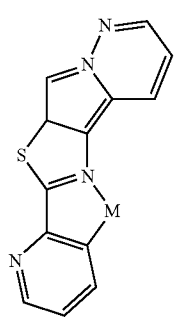
L642
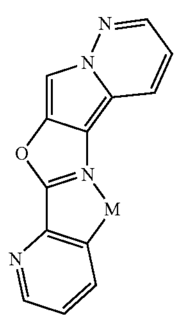
L643
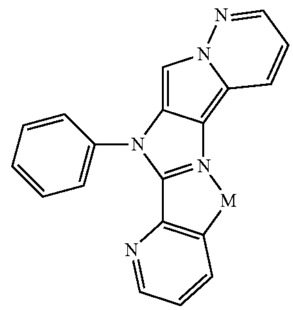
L644
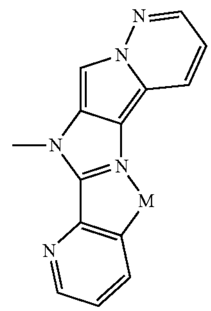
L645
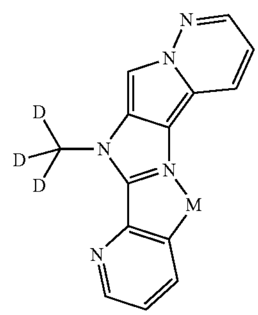
L646
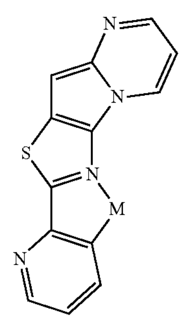
L647
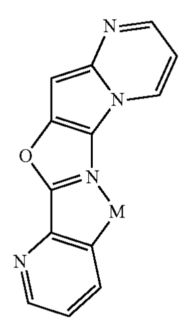

L648
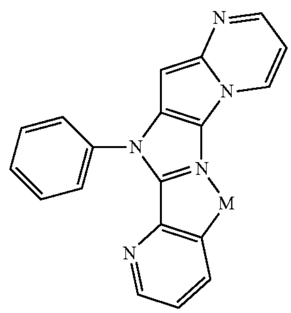
L649
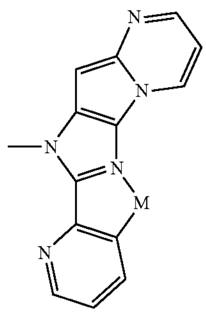
L650
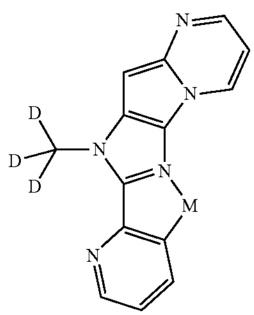
L651
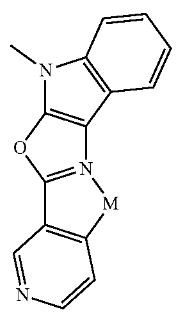
L652
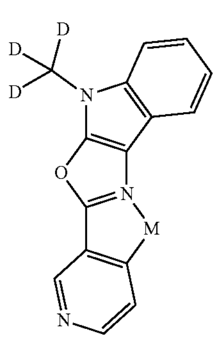
L653
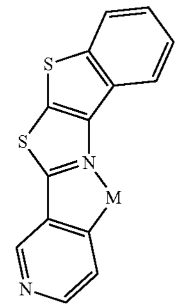
L654
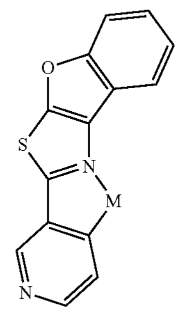
L655
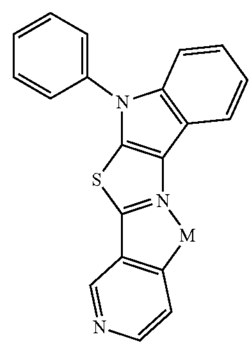
L656
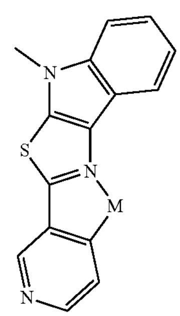
L657
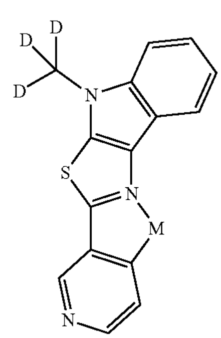

-continued
L658
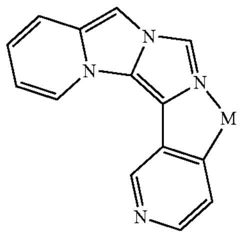
L659
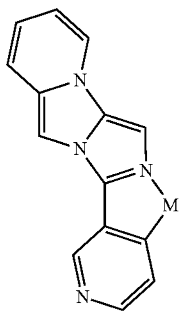
L660
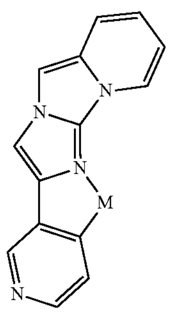
L661
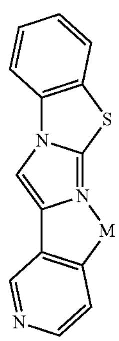
L662
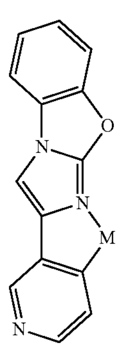
-continued
L663
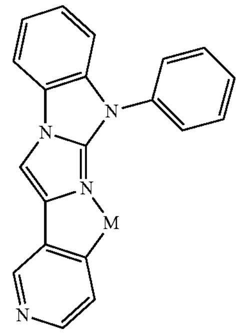
L664
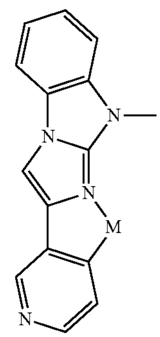
L665
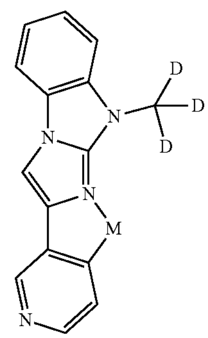
L666
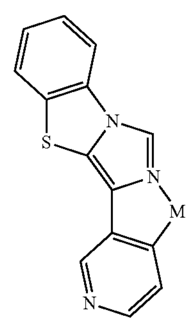
L667
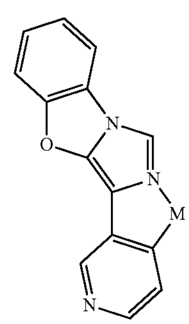

-continued
L668
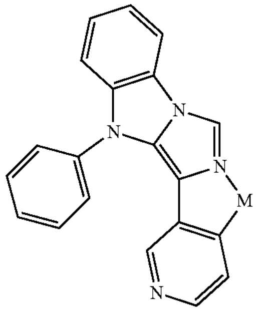
L669
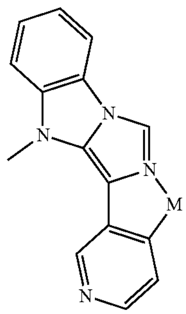
L670
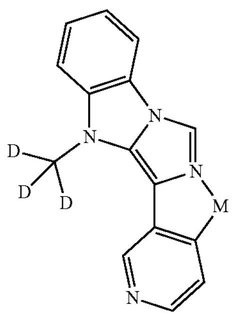
L671
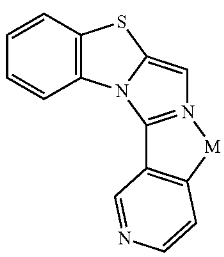
L672
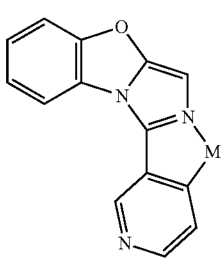
-continued
L673
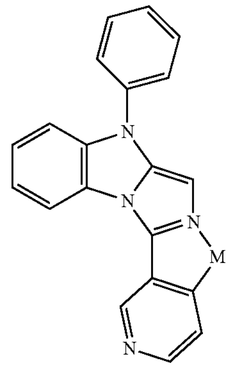
L674
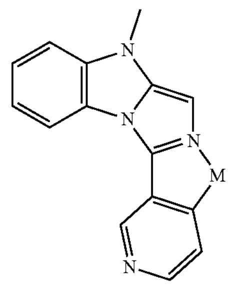
L675
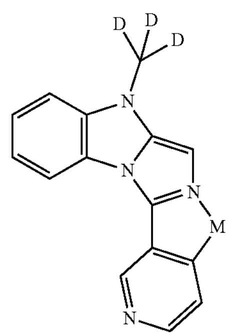
L676
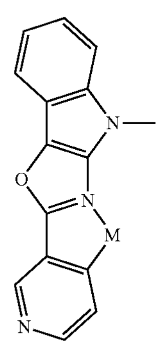

-continued
L677
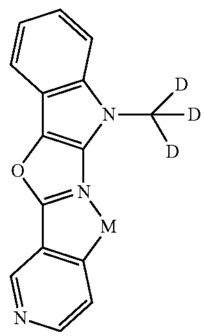
L678
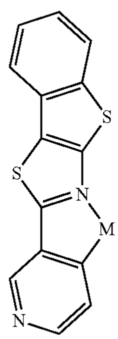
L679
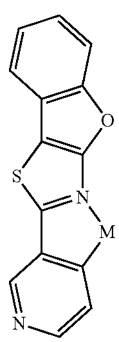
L680
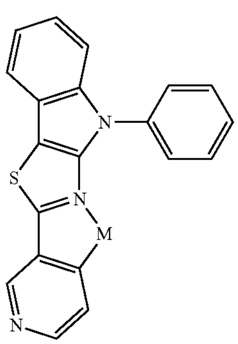
-continued
L681
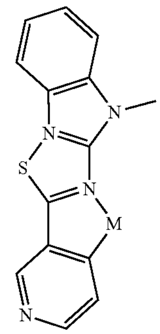
L682
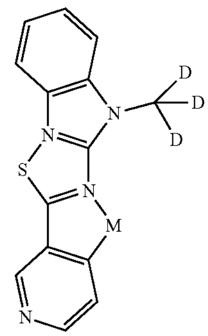
L683
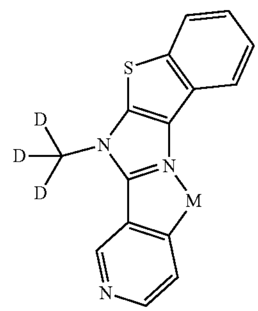
L684
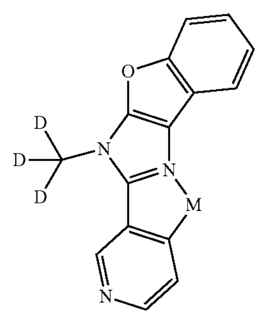
L685
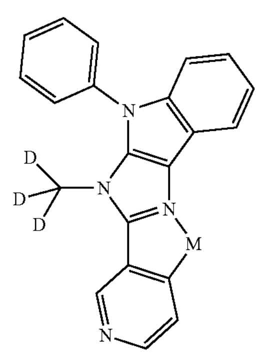

-continued
L686
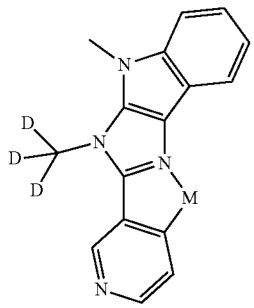
L687
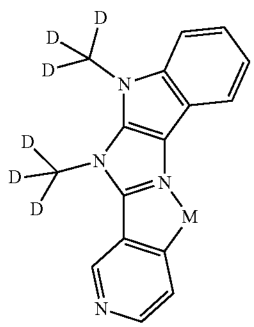
L688
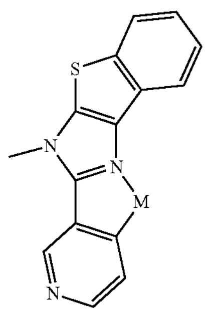
L689
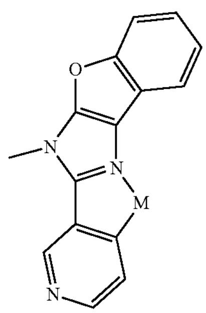
L690
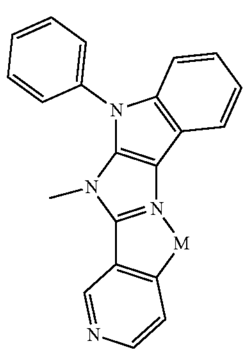
-continued
L691
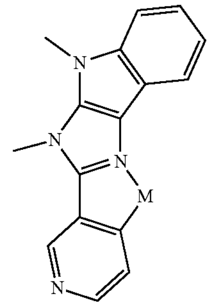
L692
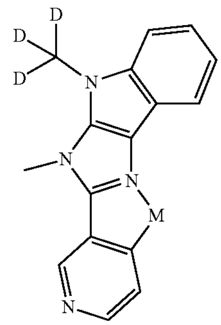
L693
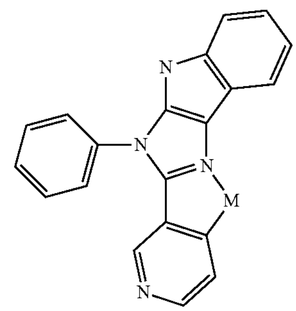
L694
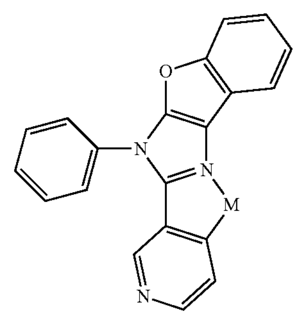
L695
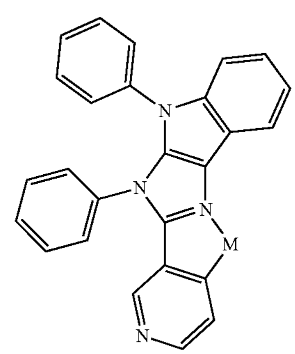

-continued
L696
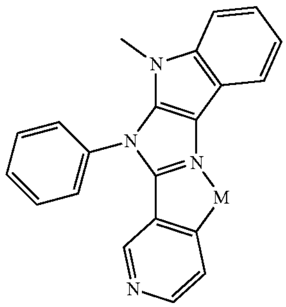
L697
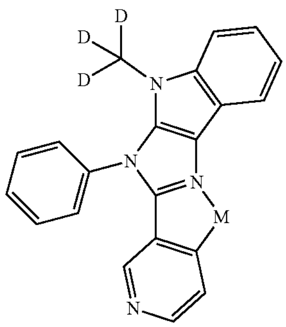
L698
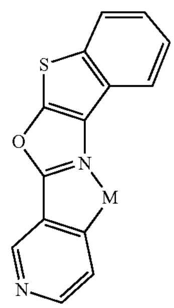
L699
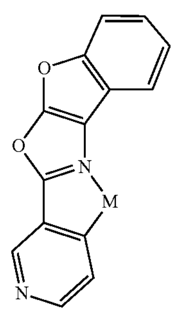
L700
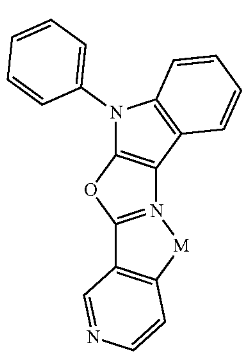
-continued
L701
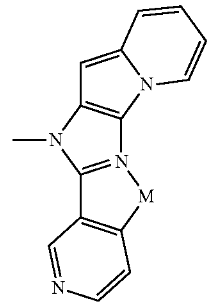
L702
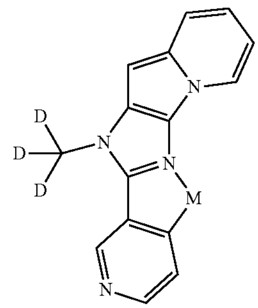
L703
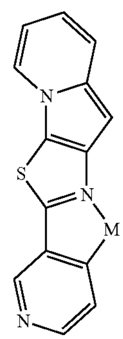
L704
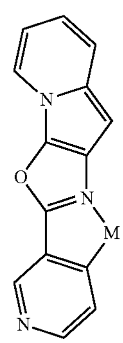
L705
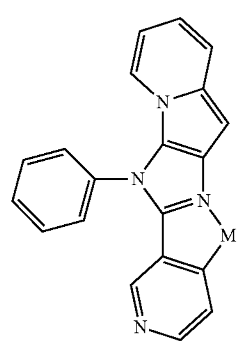

-continued
L706
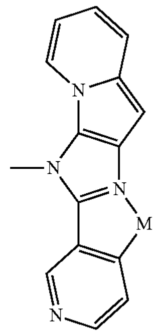
L707
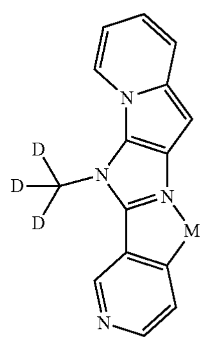
L708
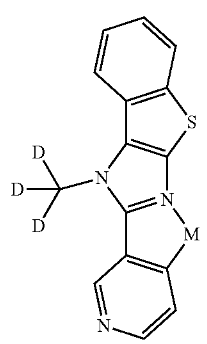
L709
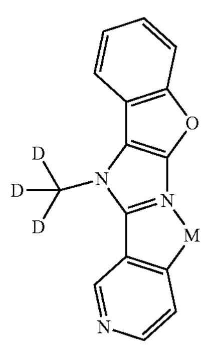
-continued
L710
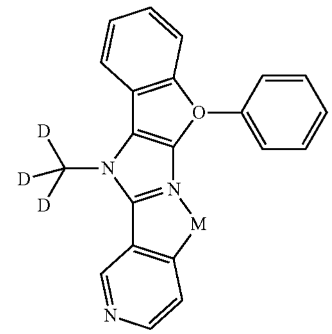
L711
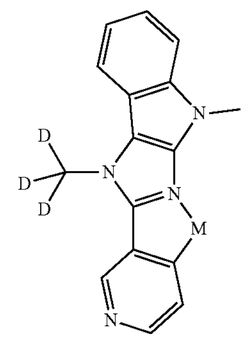
L712
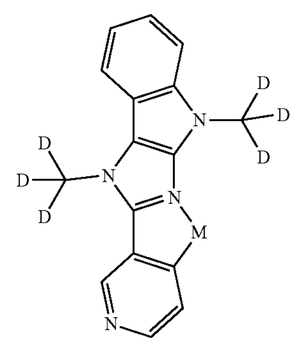
L713
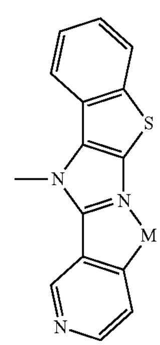

-continued
L714
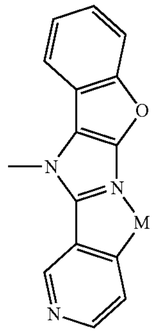
L715
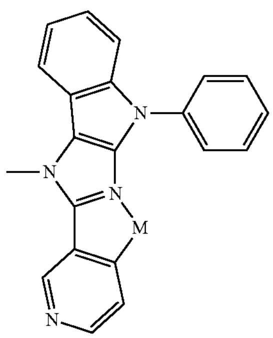
L716
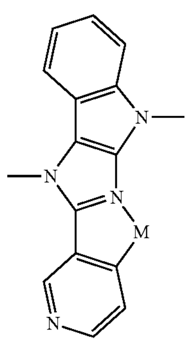
L717
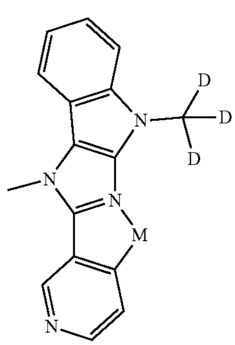
-continued
L718
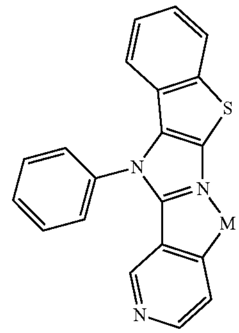
L719
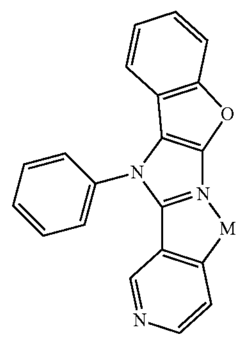
L720
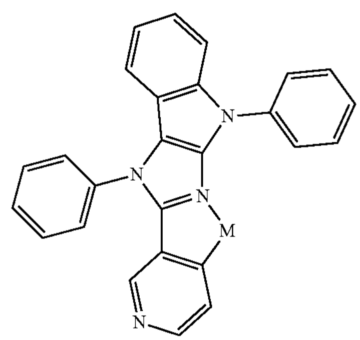
L721
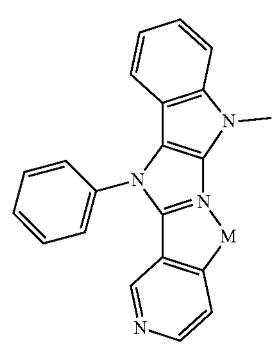

L722
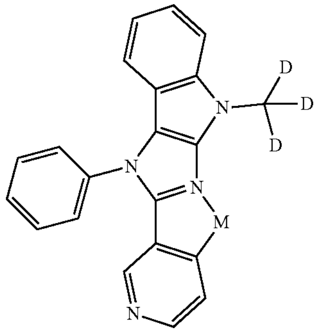
L723
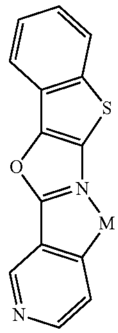
L724
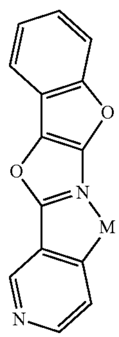
L725
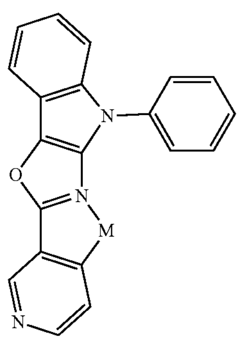
L726
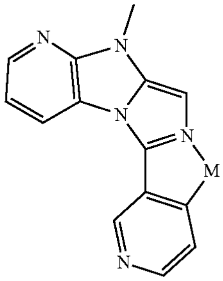
L727
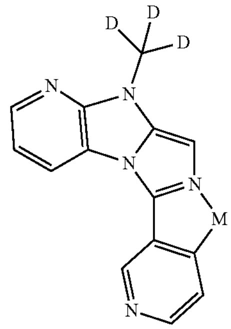
L728
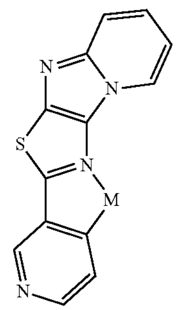
L729
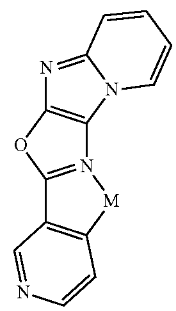
L730
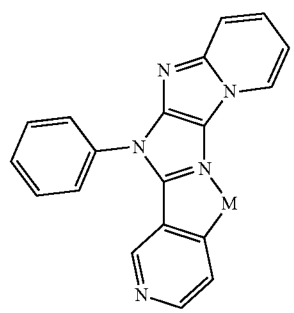
L731
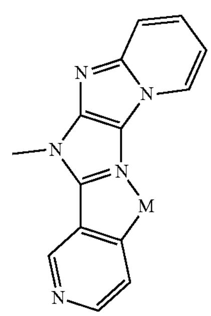

L732
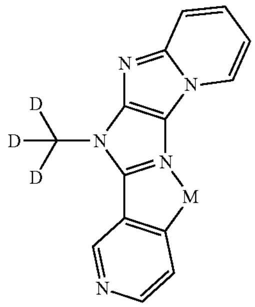
L733
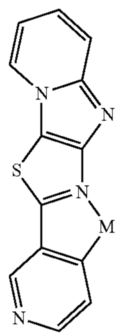
L734
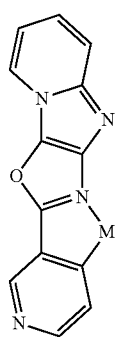
L735
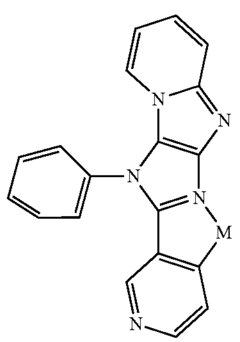
L736
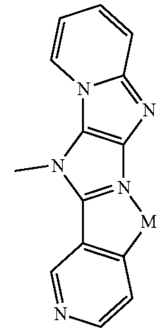
L737
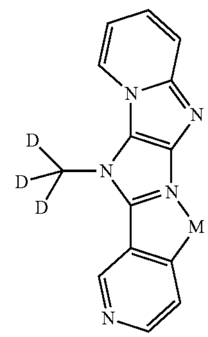
L738
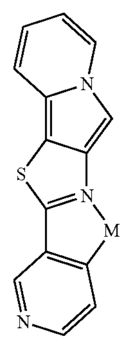
L739
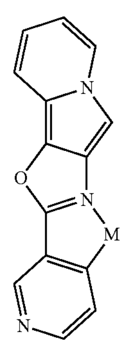

-continued
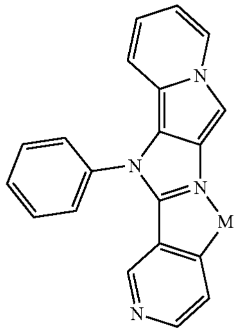
L740
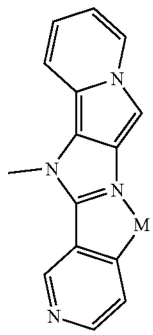
L741
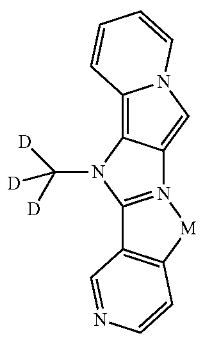
L742
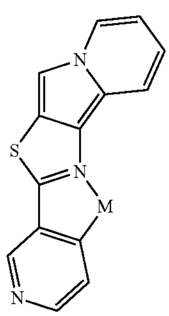
L743
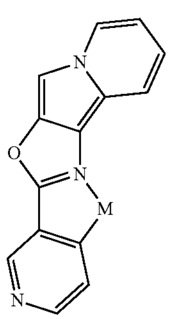
L744
-continued
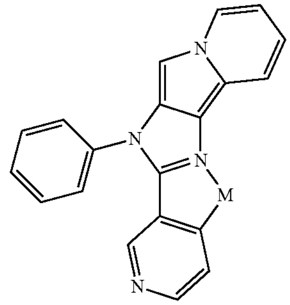
L745
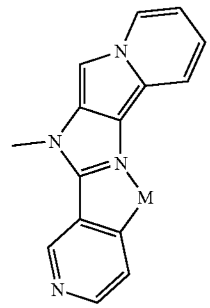
L746
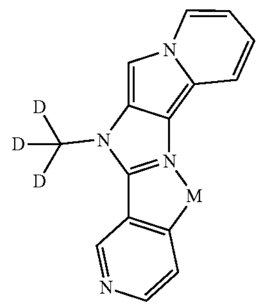
L747
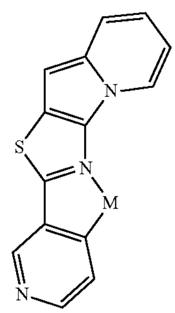
L748
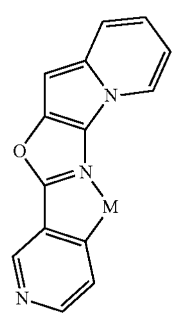
L749

-continued
L750
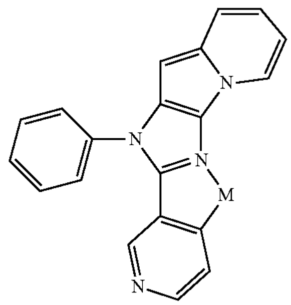
L751
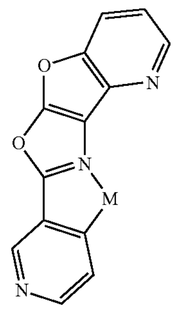
L752
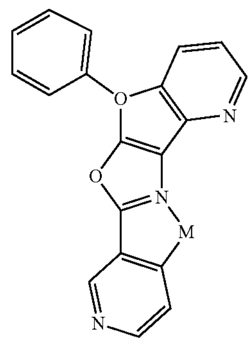
L753
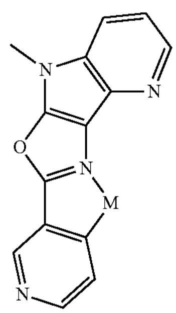
L754
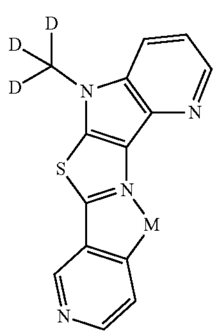
-continued
L755
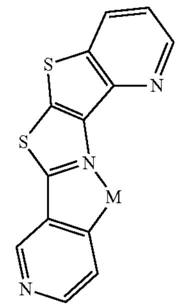
L756
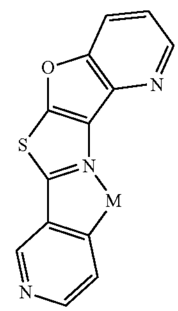
L757
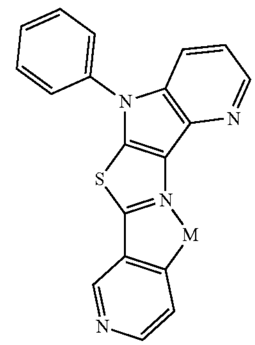
L758
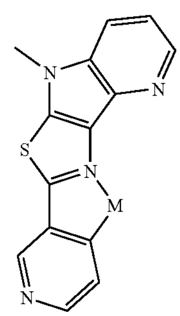
L759
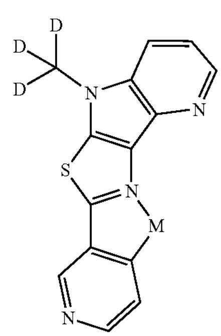

-continued
L760
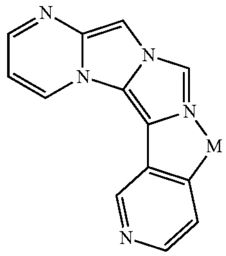
L761
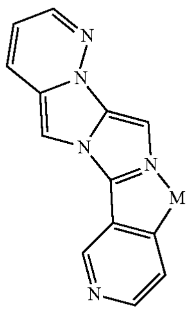
L762
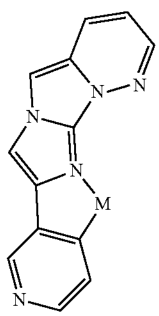
L763
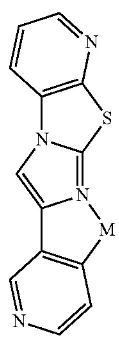
L764
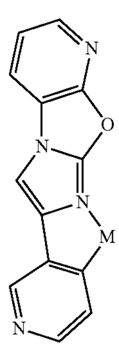
-continued
L765
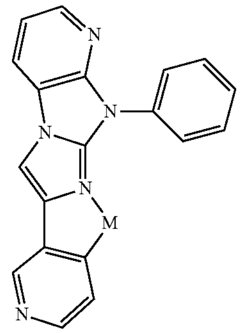
L766
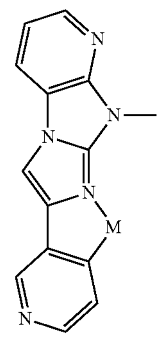
L767
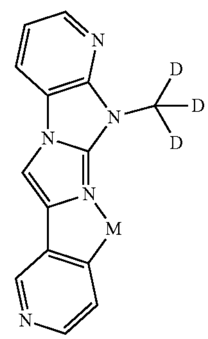
L768
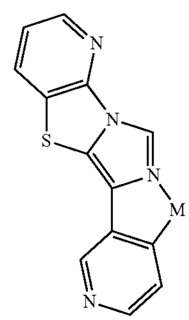
L769
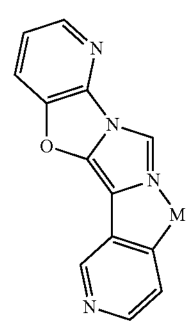

-continued
L770
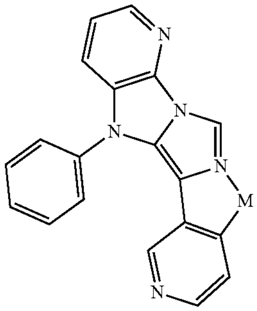
L771
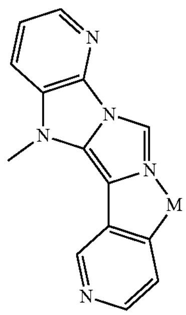
L772
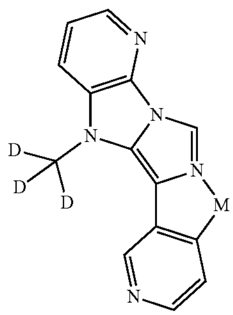
L773
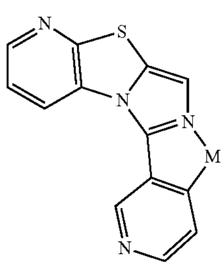
L774
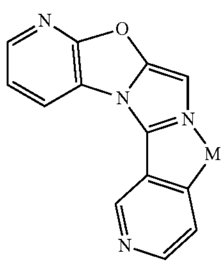
-continued
L775
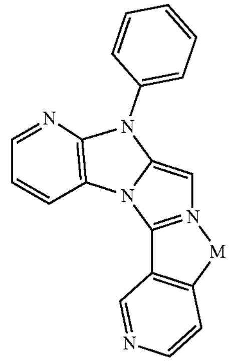
L776
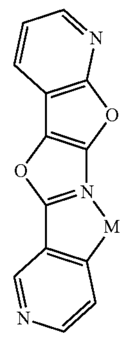
L777
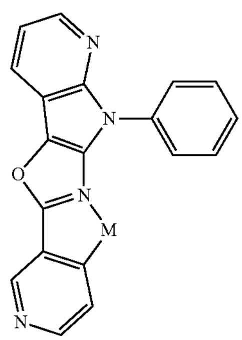
L778
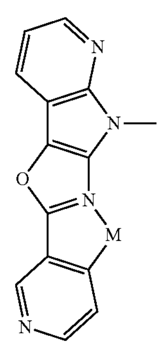

-continued
L779
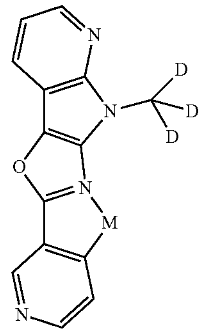
L780
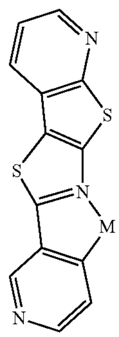
L781
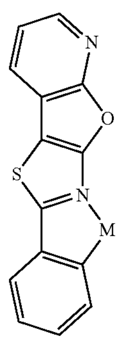
L782
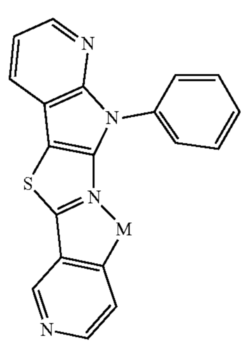
-continued
L783
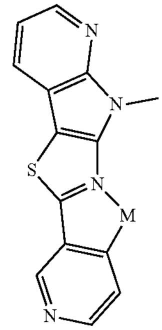
L784
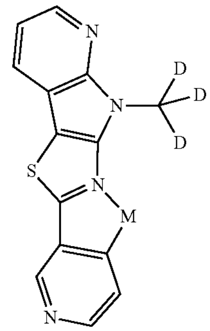
L785
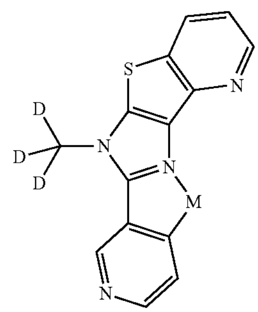
L786
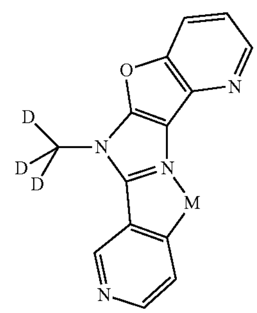
L787
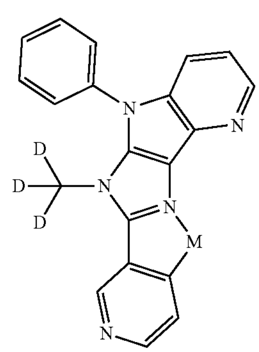

L788
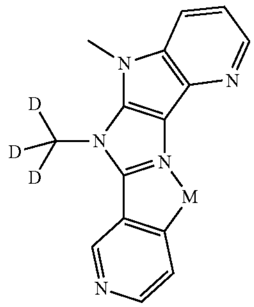
L789
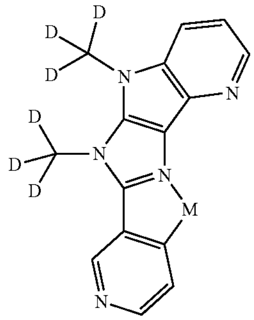
L790
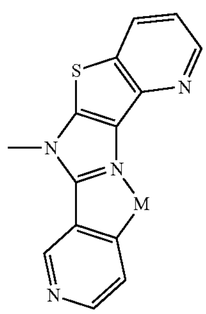
L791
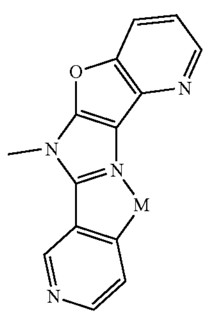
L792
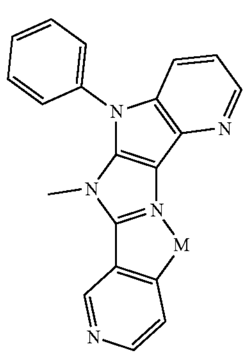
L793
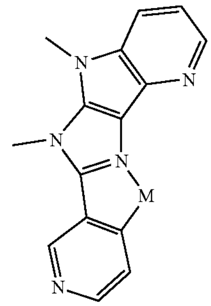
L794
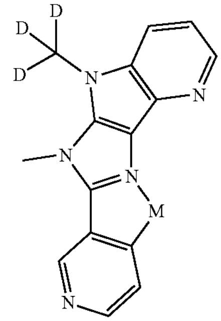
L795
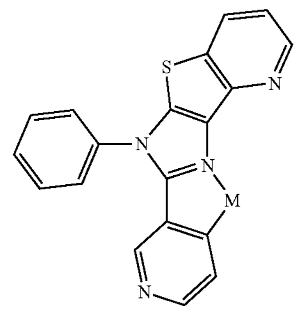
L796
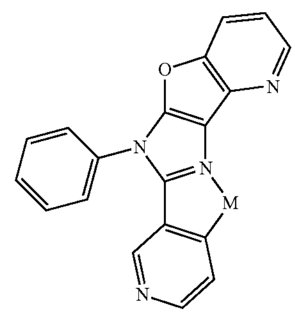
L797
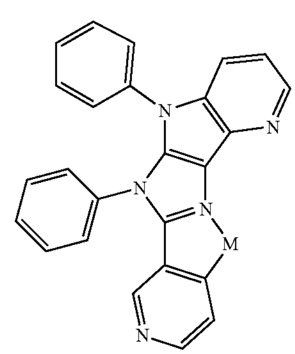

-continued
L798
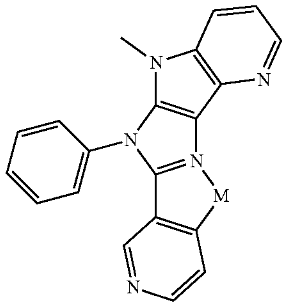
L799
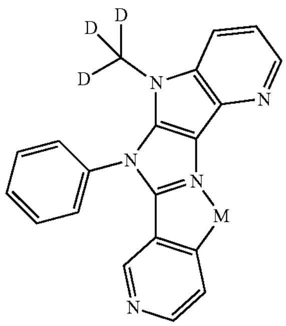
L800
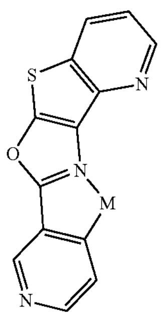
L801
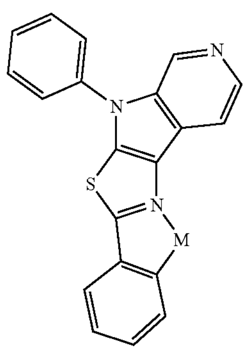
L802
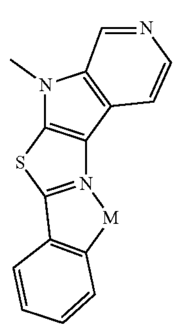
-continued
L803
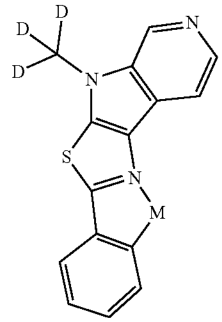
L804
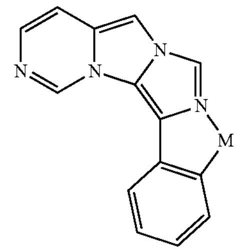
L805
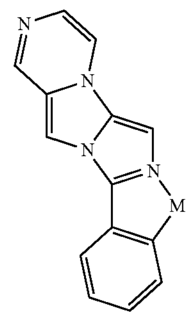
L806
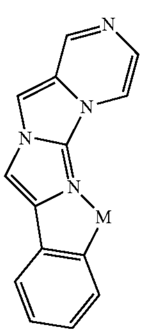
L807
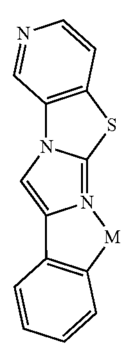

L808
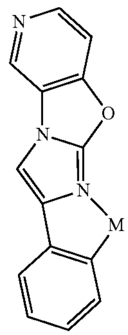
L809
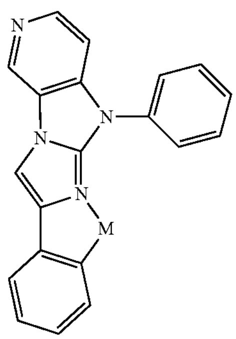
L810
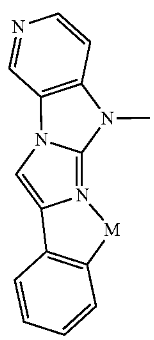
L811
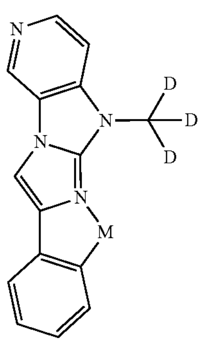
L812
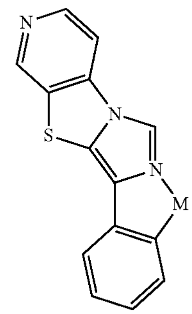
L813
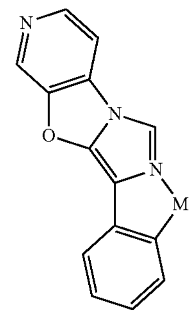
L814
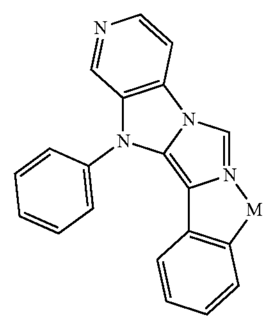
L815
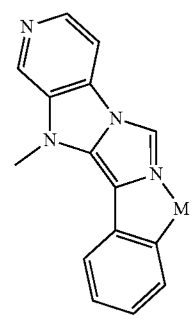
L816
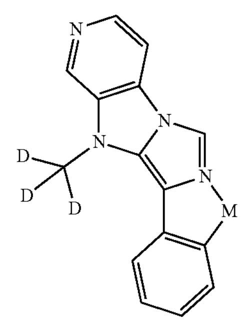

-continued
L817
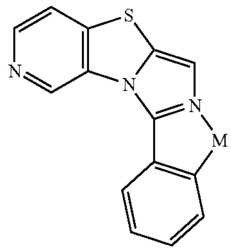
L818
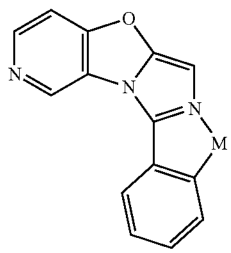
L819
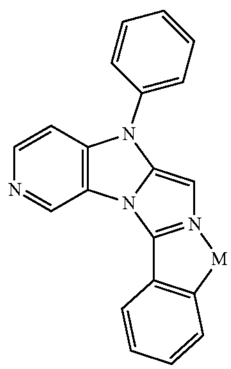
L820
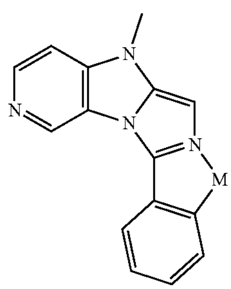
L821
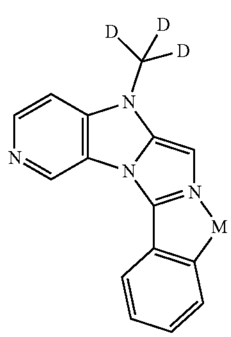
-continued
L822
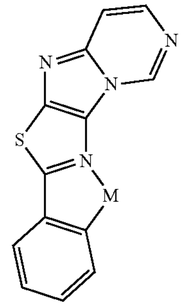
L823
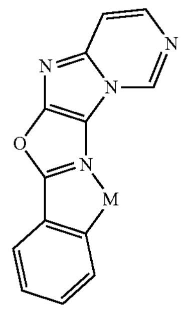
L824
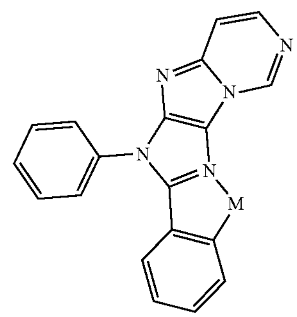
L825
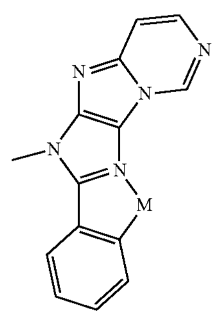
L826
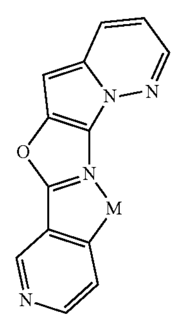

-continued
L827
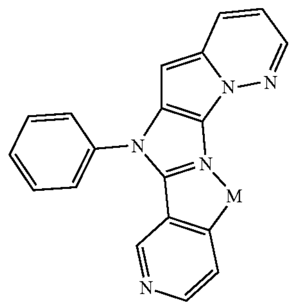
L828
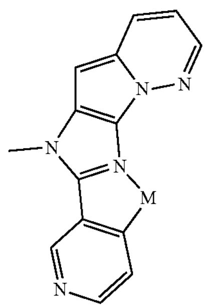
L829
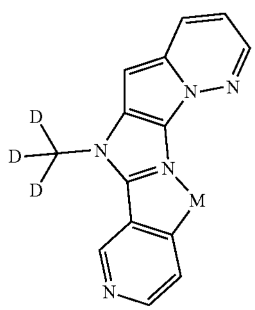
L830
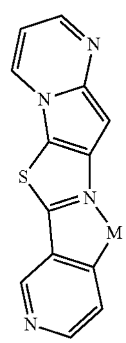
L831
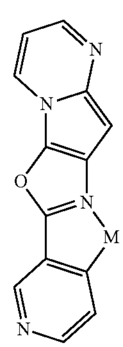
-continued
L832
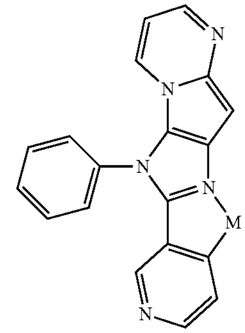
L833
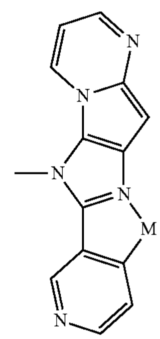
L834
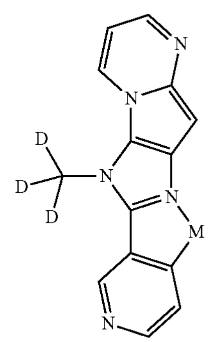
L835
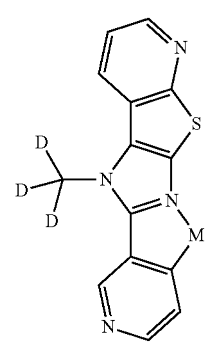

L836
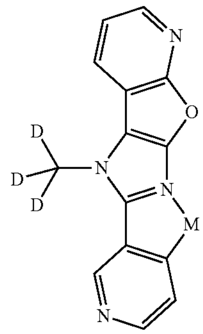
L837
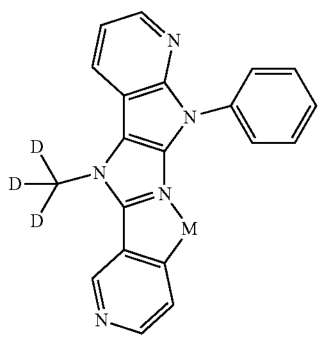
L838
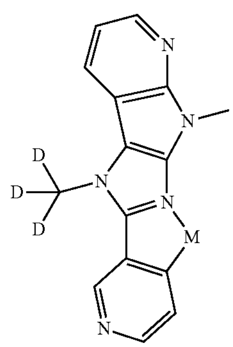
L839
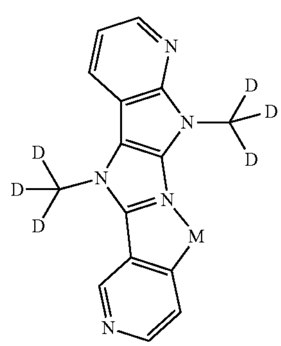
L840
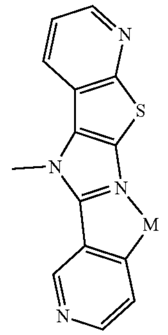
L841
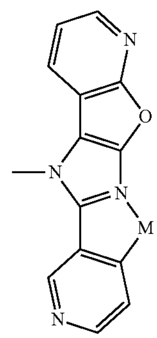
L842
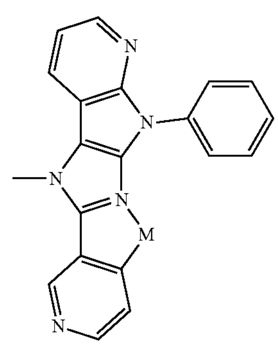
L843
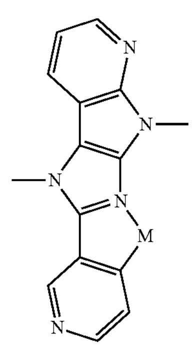

L844
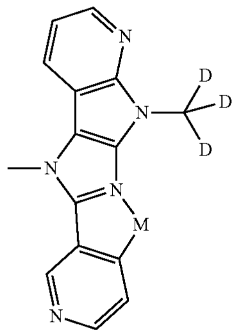
L845
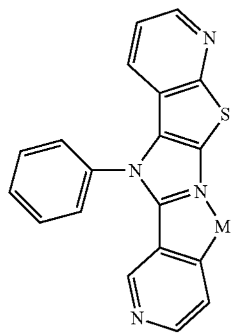
L846
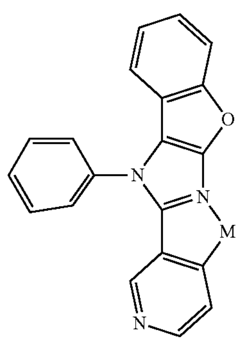
L847
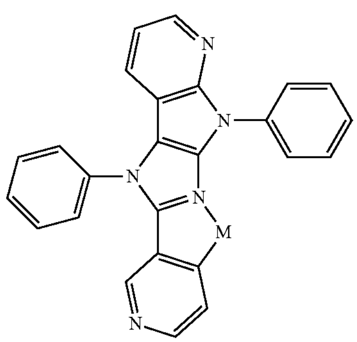
L848
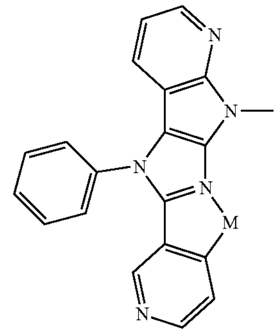
L849
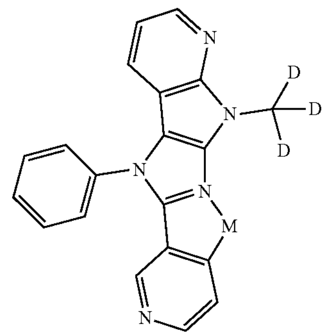
L850
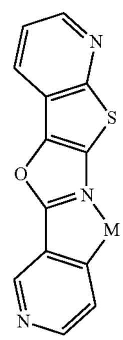
L851
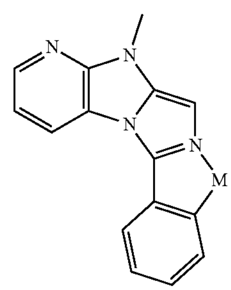
L852
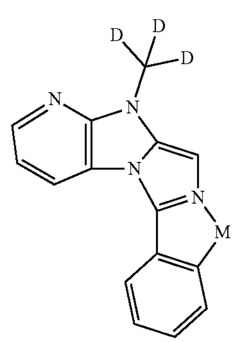

-continued
L853
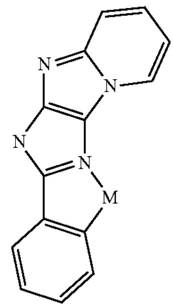
L854
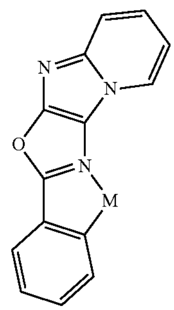
L855
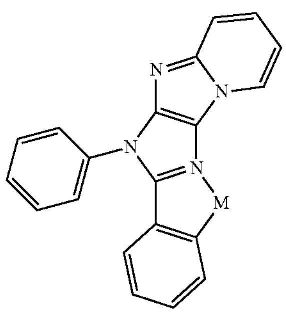
L856
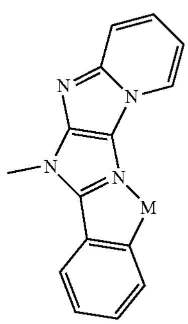
L857
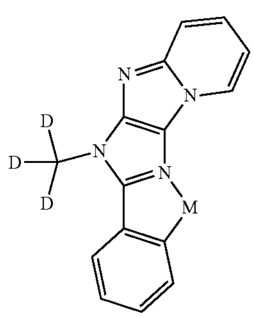
-continued
L858
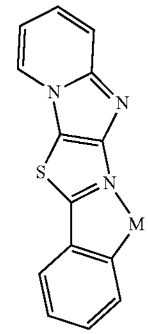
L859
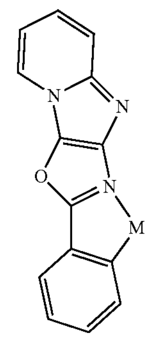
L860
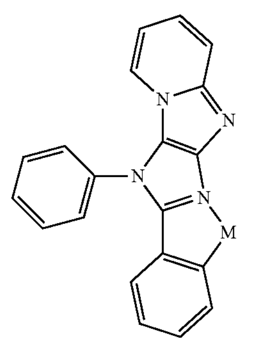
L861
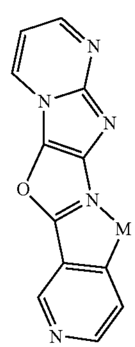

-continued
L862
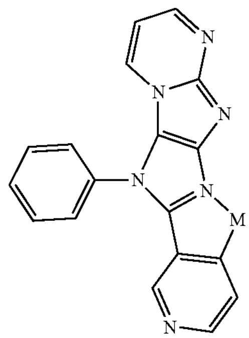
L863
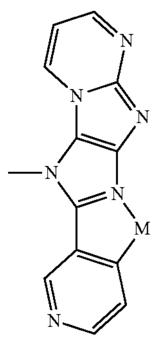
L864
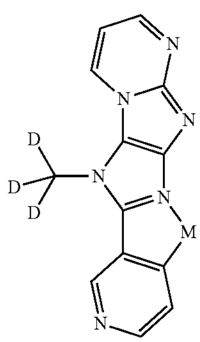
L865
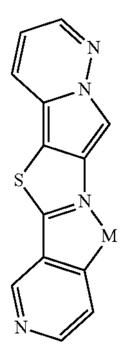
-continued
L866
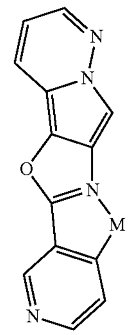
L867
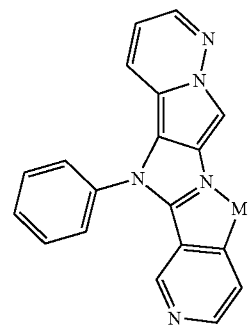
L868
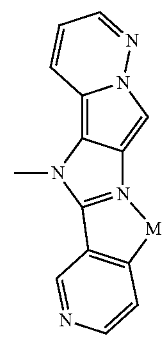
L869
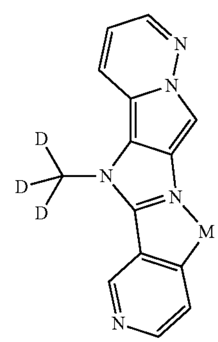
L870
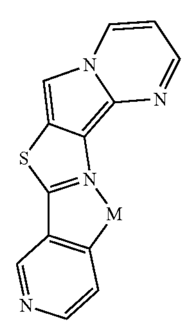

-continued
L871
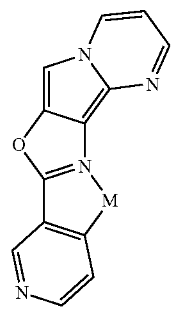
L872
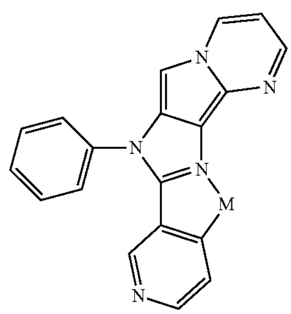
L873
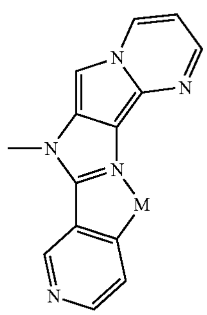
L874
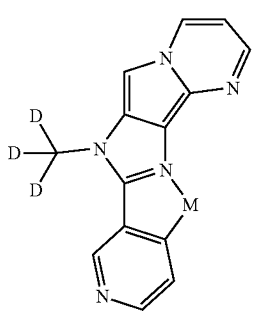
L875
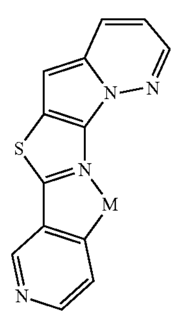
-continued
L876
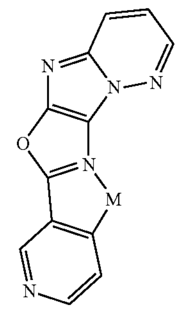
L877
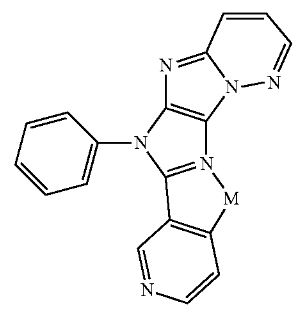
L878
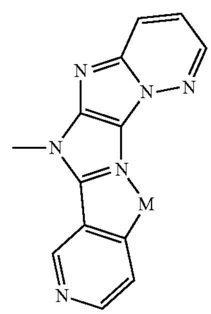
L879
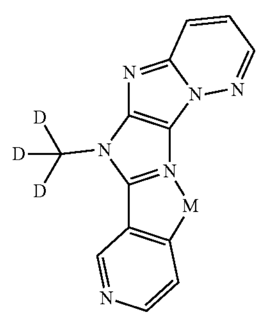
L880
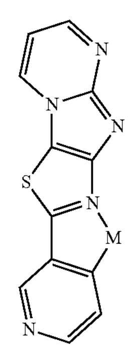

-continued
L881
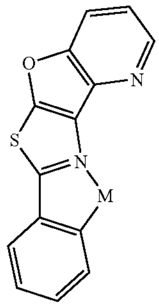
L882
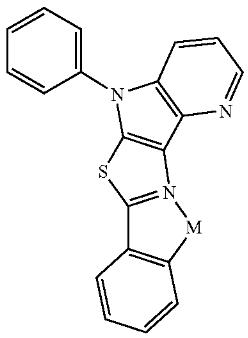
L883
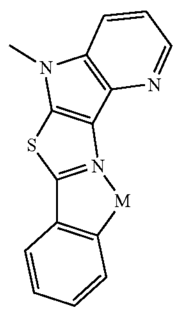
L884
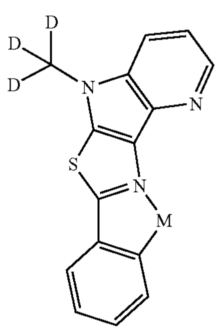
L885
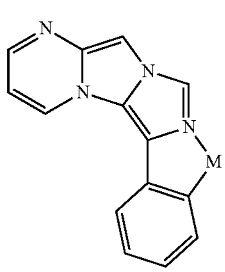
-continued
L886
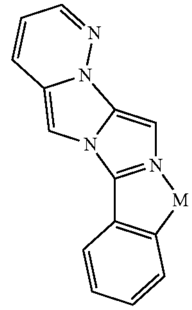
L887
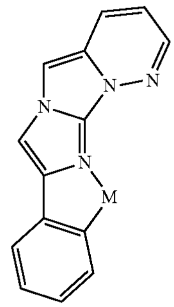
L888
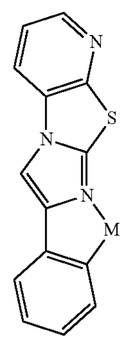
L889
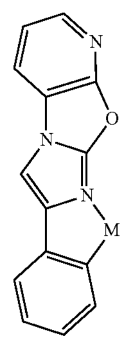
L890
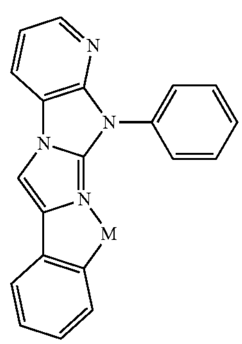

-continued
L891
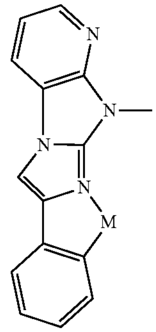
L892
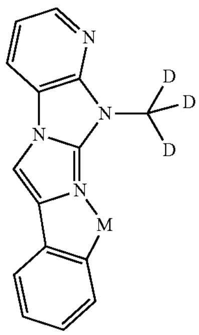
L893
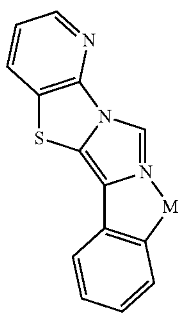
L894
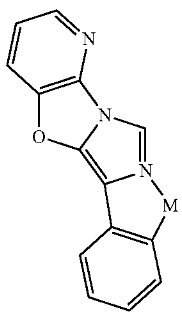
L895
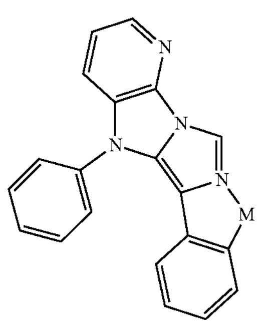
-continued
L896
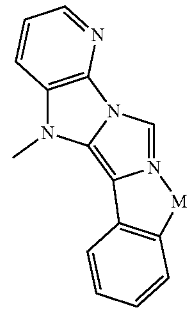
L897
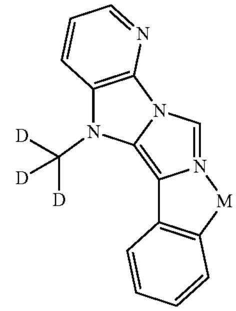
L898
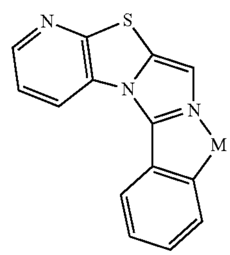
L899
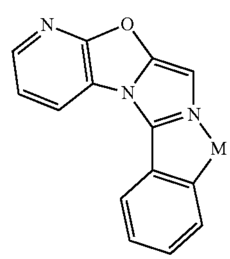
L900
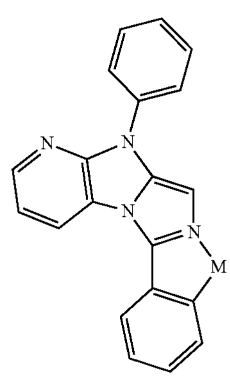

-continued
L901
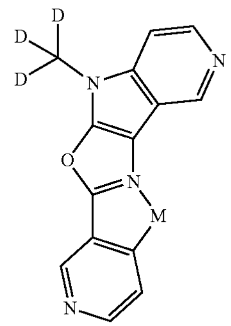
L902
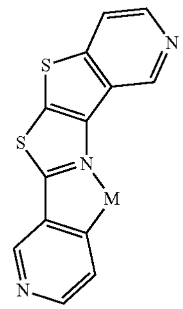
L903
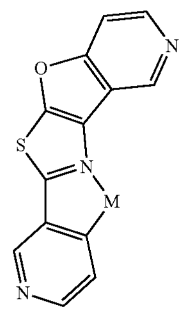
L904
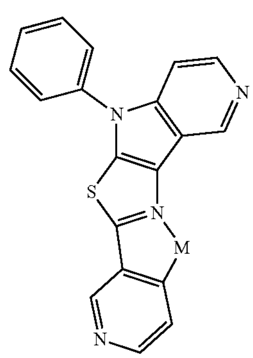
L905
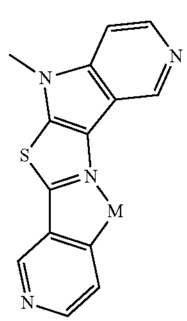
-continued
L906
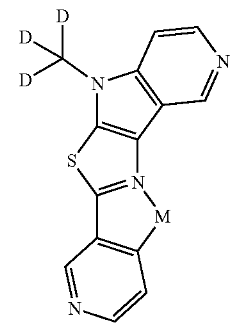
L907
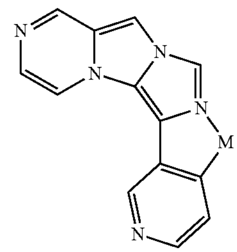
L908
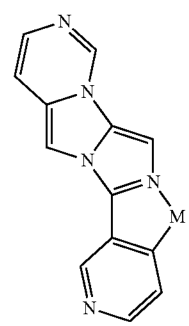
L909
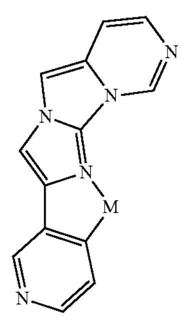
L910
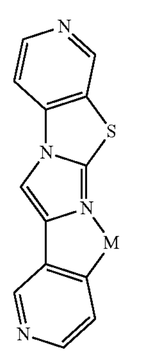

-continued
L911
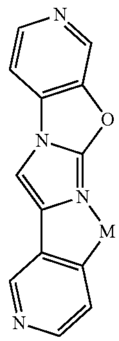
L912
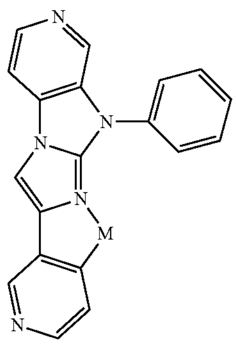
L913
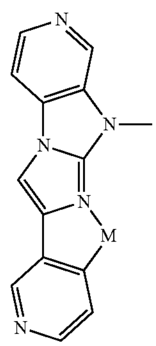
L914
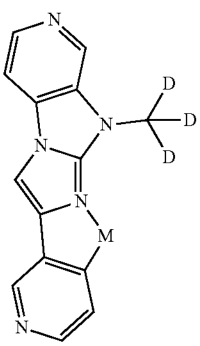
-continued
L915
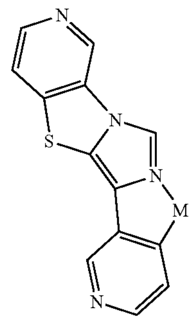
L916
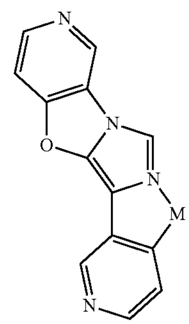
L917
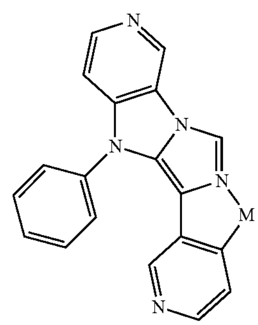
L918
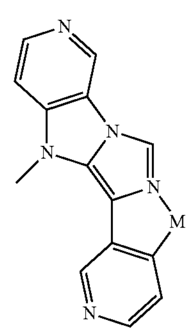

L919
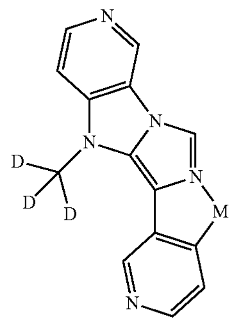
L920
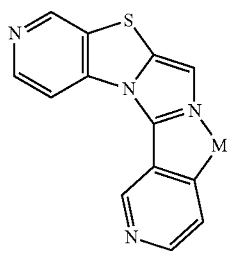
L921
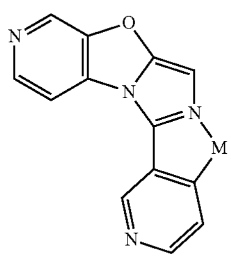
L922
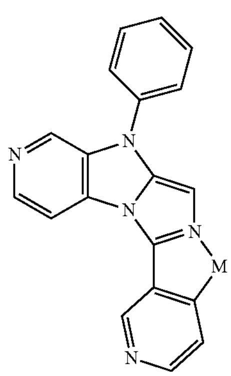
L923
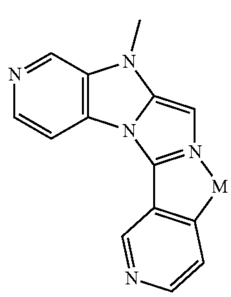
L924
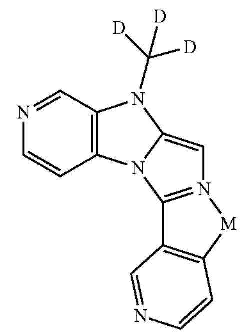
L925
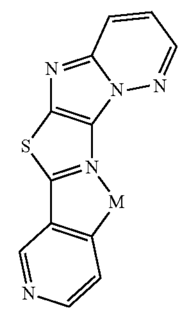
L926
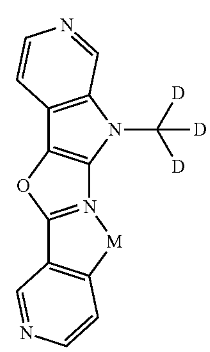
L927
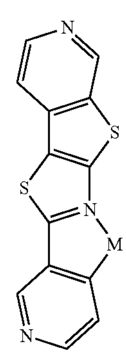

-continued
L928
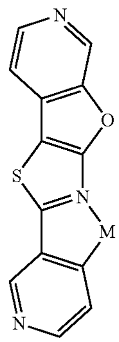
L929
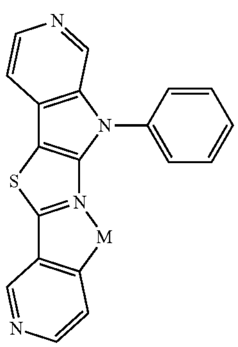
L930
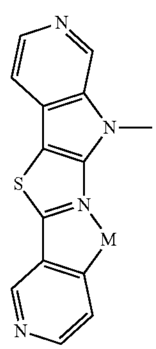
L931
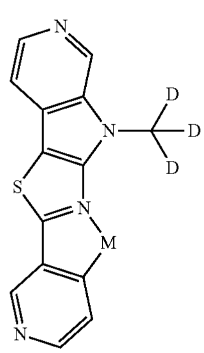
-continued
L932
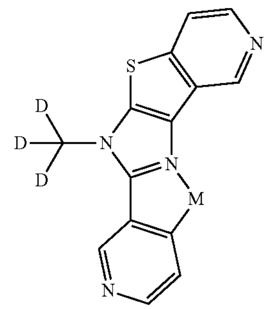
L933
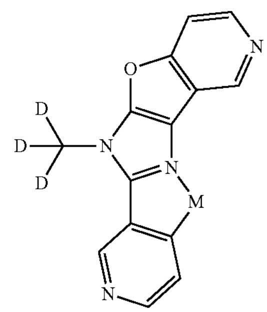
L934
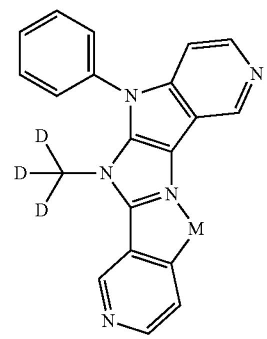
L935
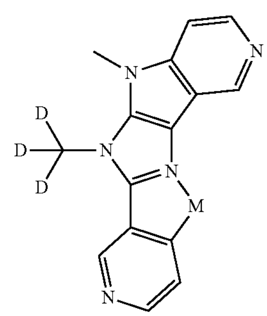
L936
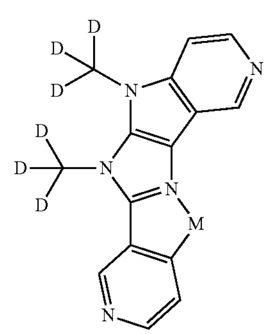

L937
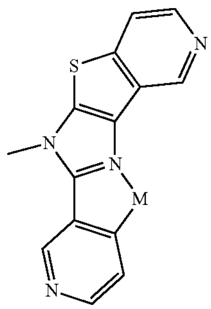
L938
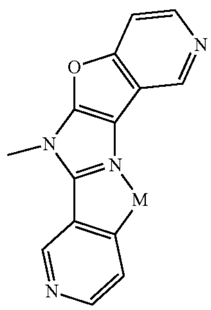
L939
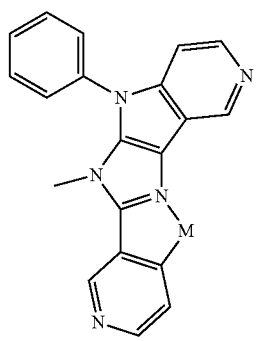
L940
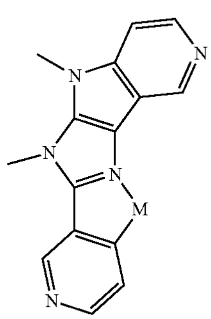
L941
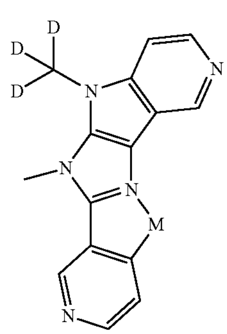
L942
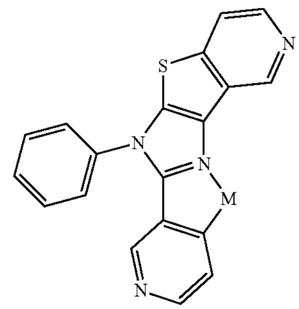
L943
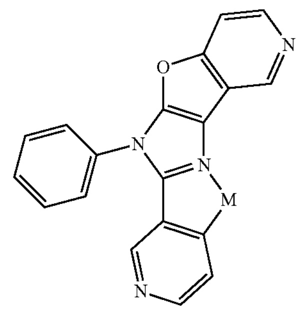
L944
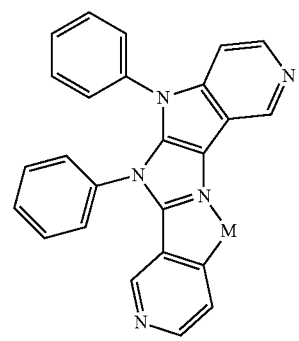
L945
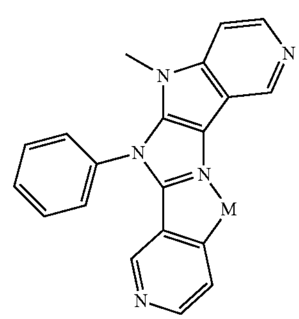
L946
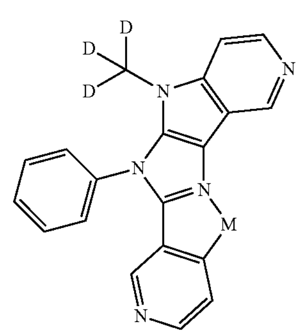

L947
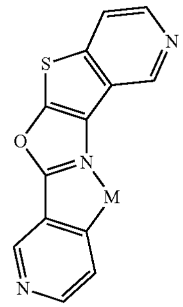
L948
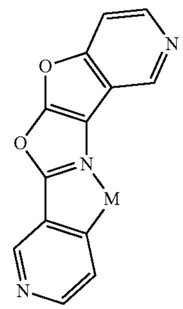
L949
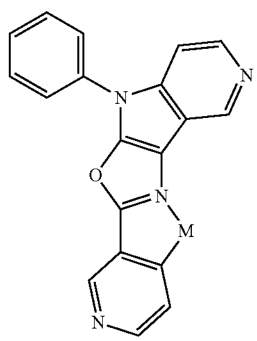
L950
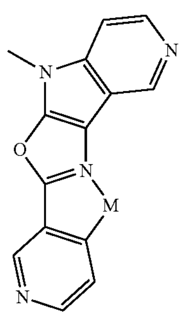
L951
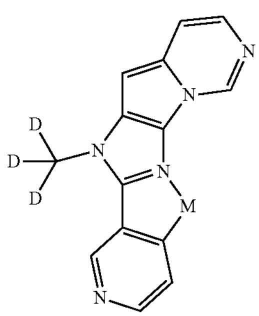
L952
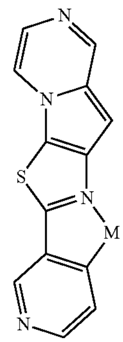
L953
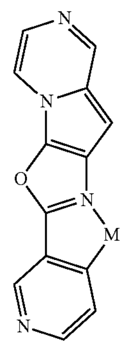
L954
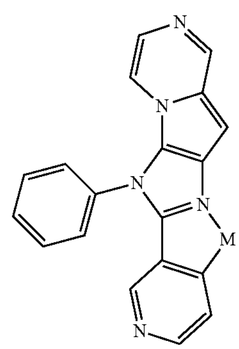
L955
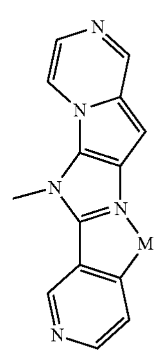

-continued
L956
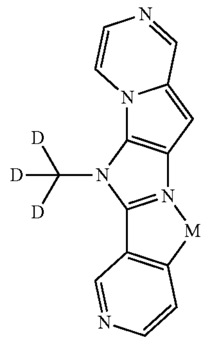
L957
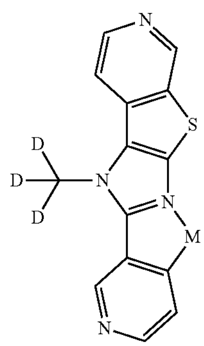
L958
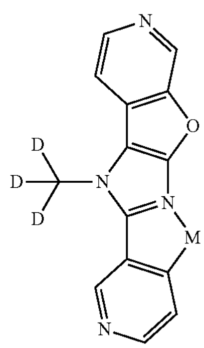
L959
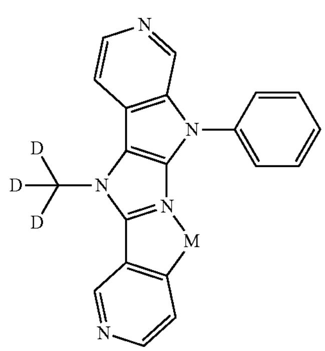
-continued
L960
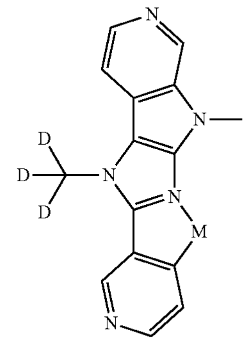
L961
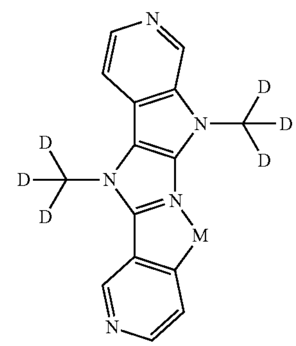
L962
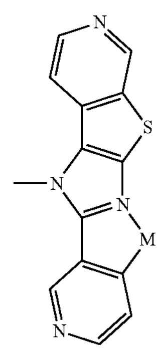
L963
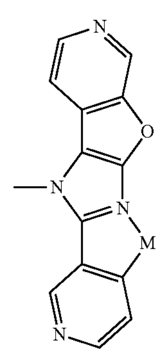

-continued
L964
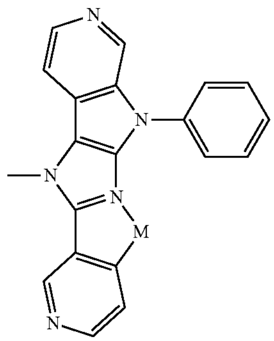
L965
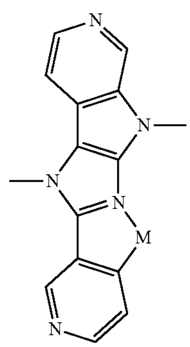
L966
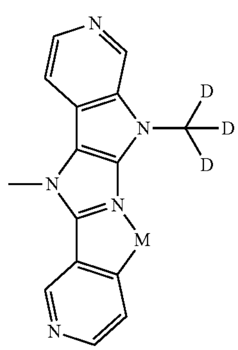
L967
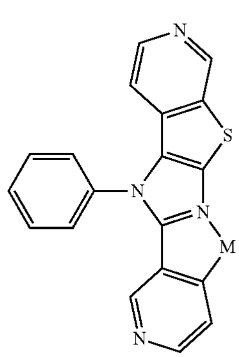
-continued
L968
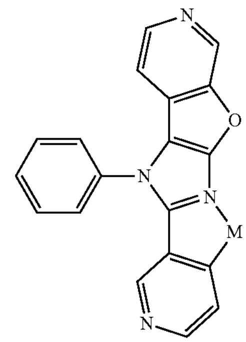
L969
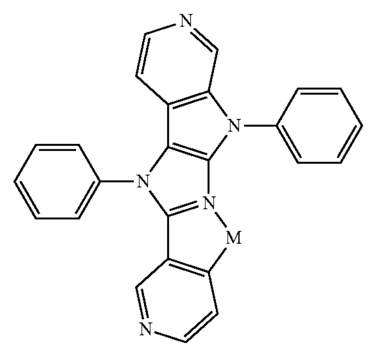
L970
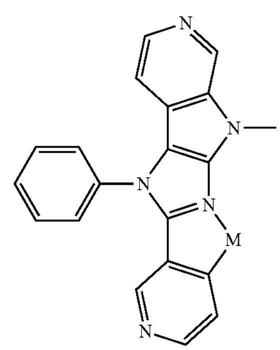
L971
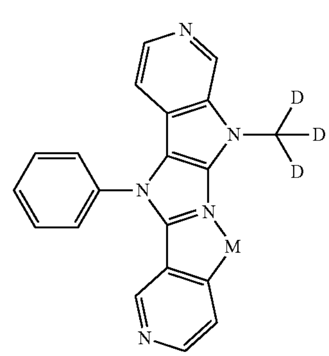

L972
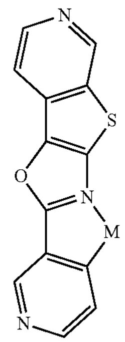
L973
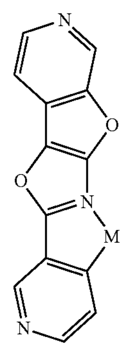
L974
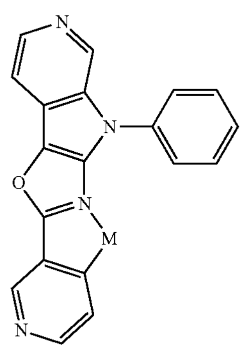
L975
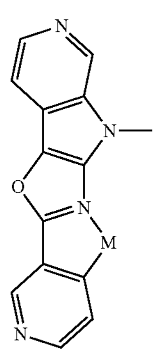
L976
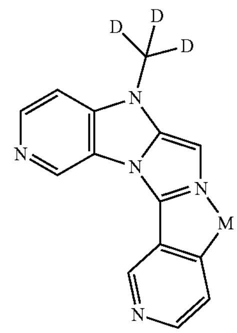
L977
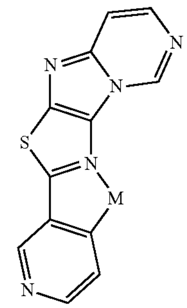
L978
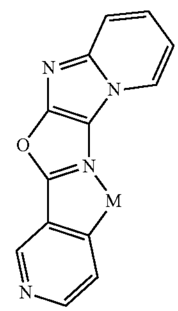
L979
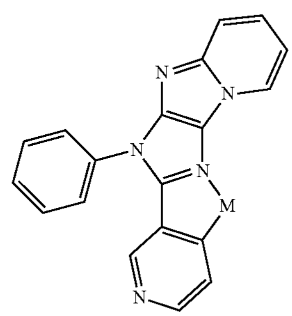
L980
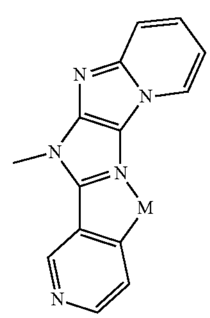

-continued
L981
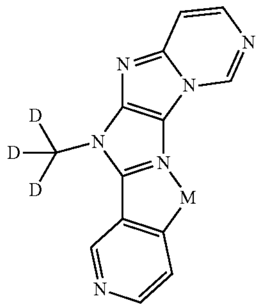
L982
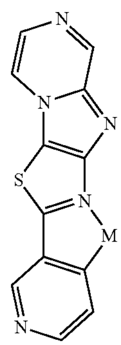
L983
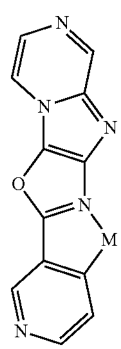
L984
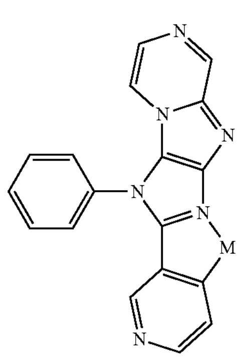
-continued
L985
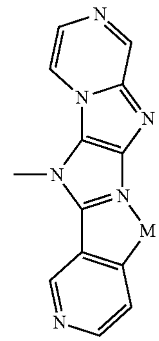
L986
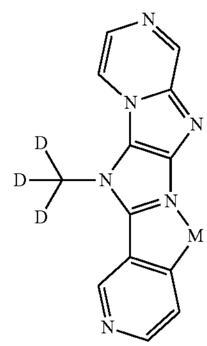
L987
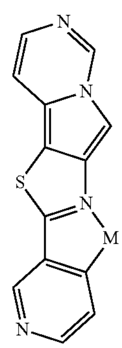
L988
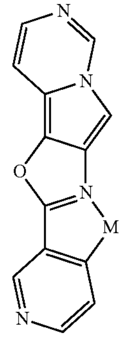

-continued
L989
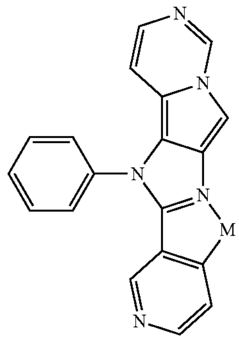
L990
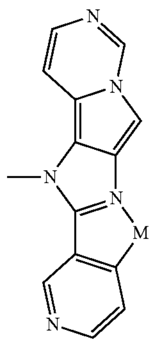
L991
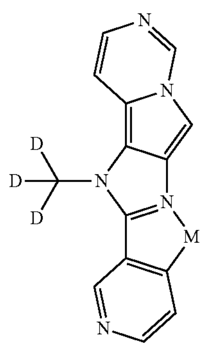
L992
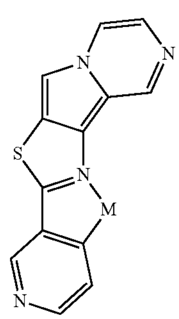
L993
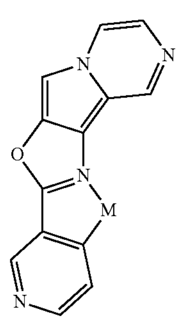
-continued
L994
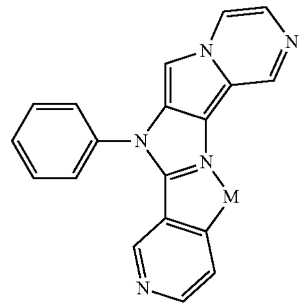
L995
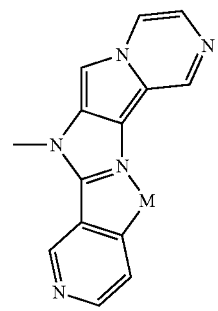
L996
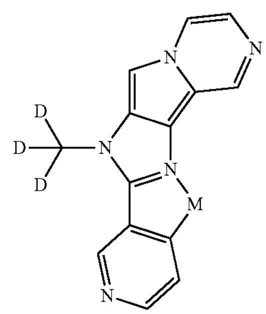
L997
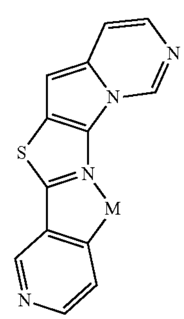
L998
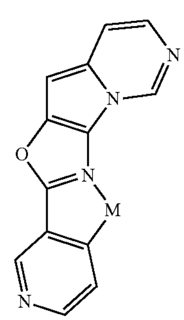

-continued
L999
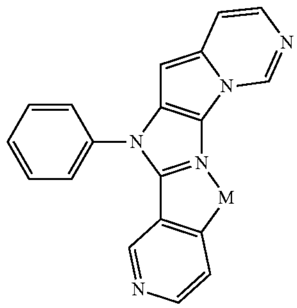
L1000
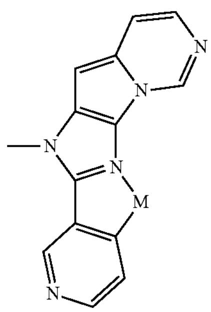
L1001
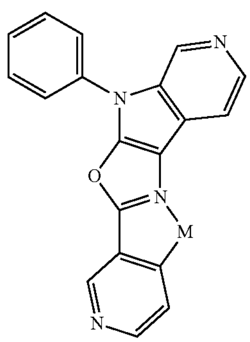
L1002
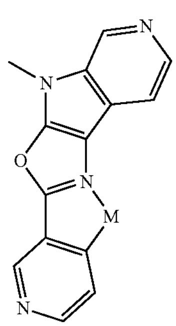
L1003
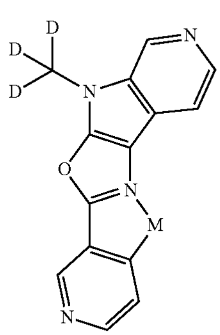
-continued
L1004
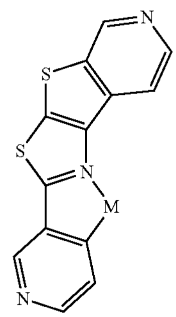
L1005
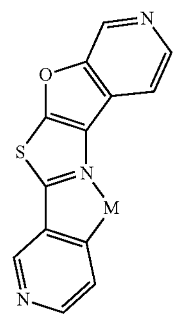
L1006
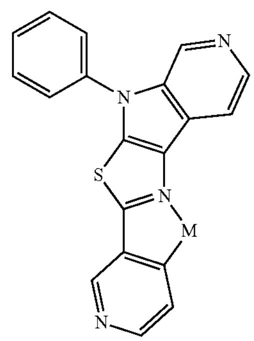
L1007
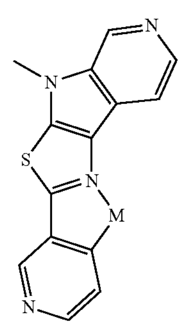
L1008
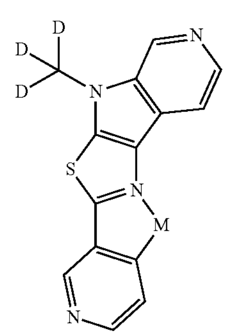

-continued
L1009
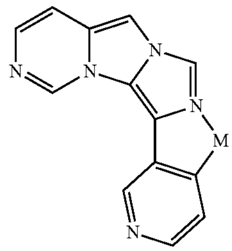
L1010
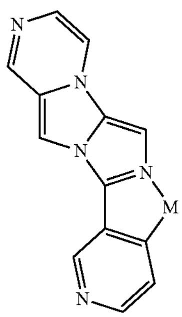
L1011
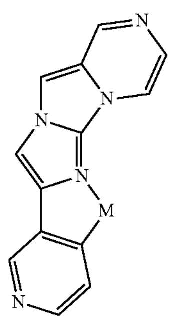
L1012
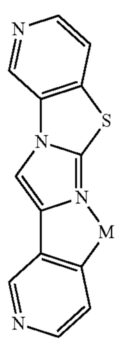
L1013
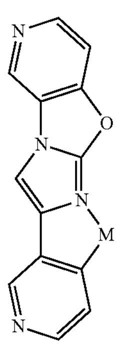
-continued
L1014
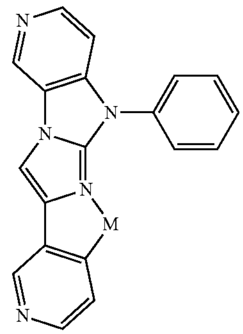
L1015
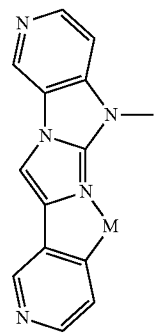
L1016
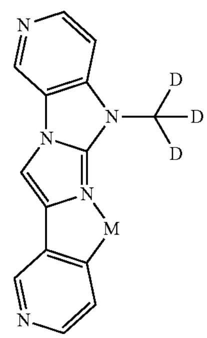
L1017
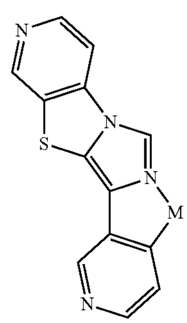
L1018
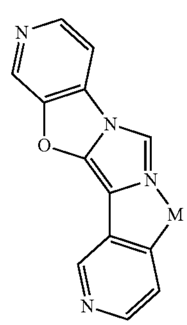

L1019
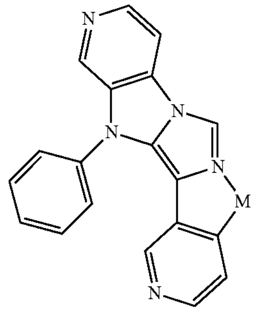
L1020
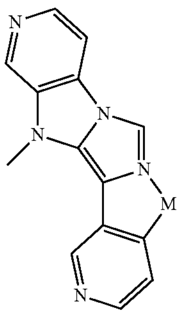
L1021
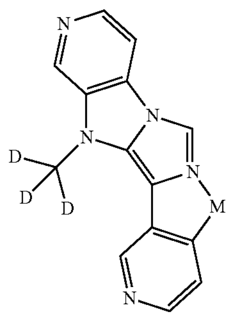
L1022
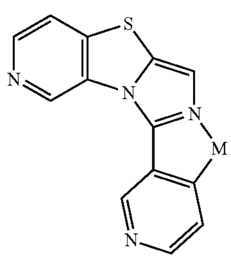
L1023
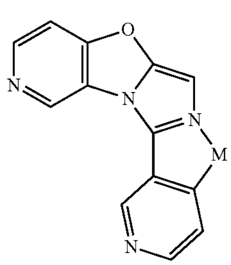
L1024
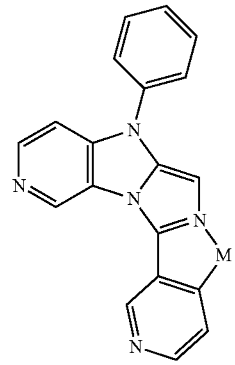
L1025
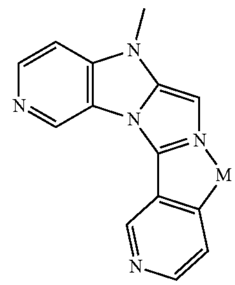
L1026
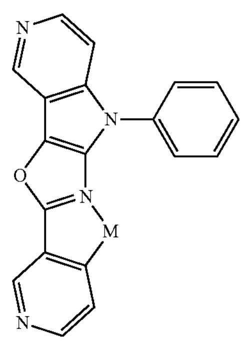
L1027
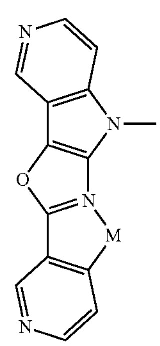

-continued
L1028
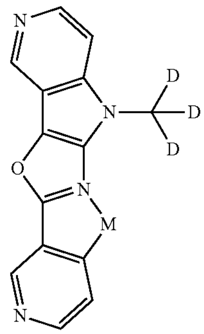
L1029
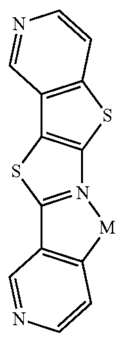
L1030
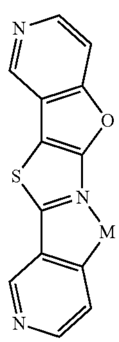
L1031
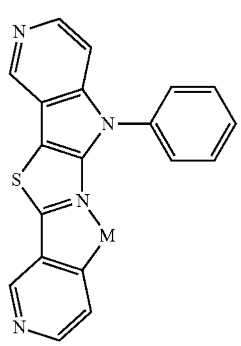
-continued
L1032
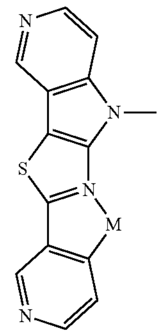
L1033
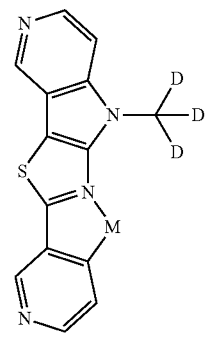
L1034
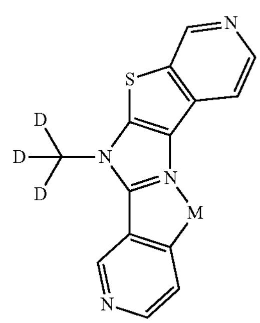
L1035
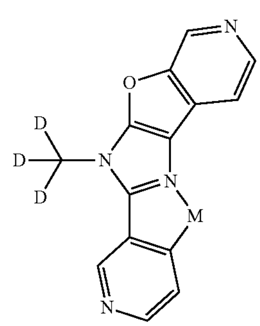

-continued
L1036
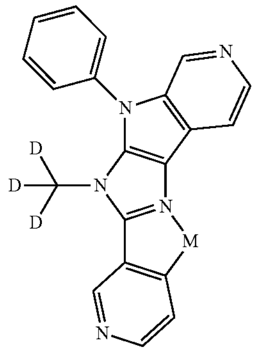
L1037
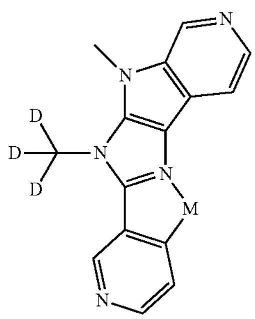
L1038
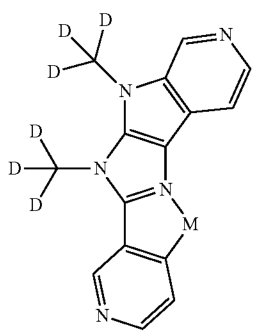
L1039
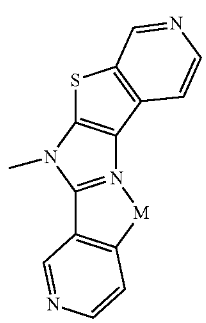
L1040
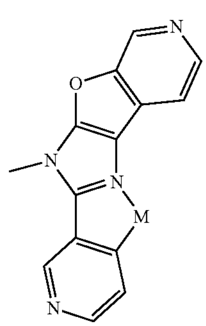
-continued
L1041
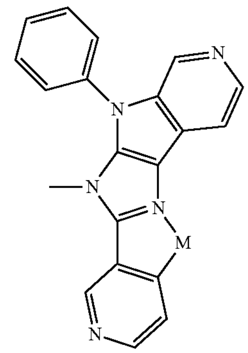
L1042
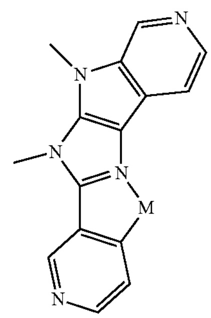
L1043
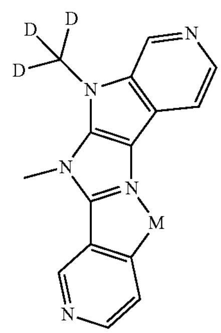
L1044
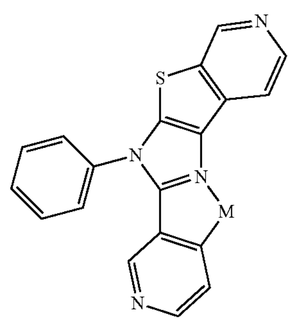
L1045
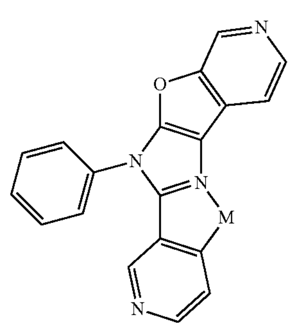

-continued
L1046
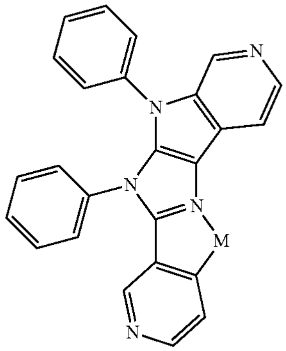
L1047
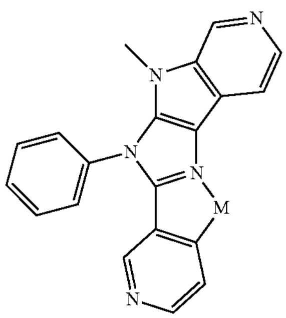
L1048
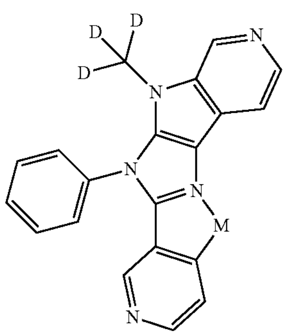
L1049
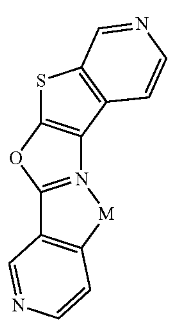
L1050
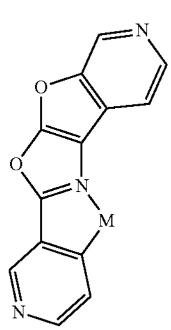
-continued
L1051
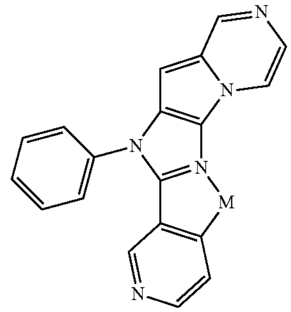
L1052
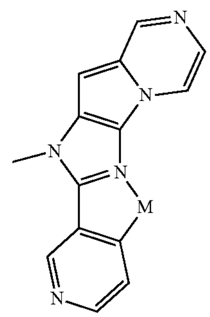
L1053
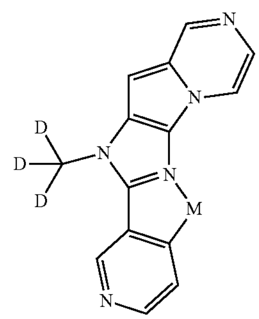
L1054
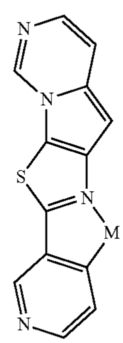
L1055
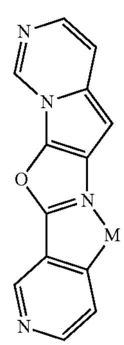

-continued
L1056
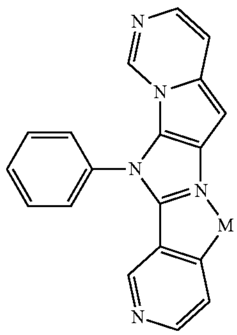
L1057
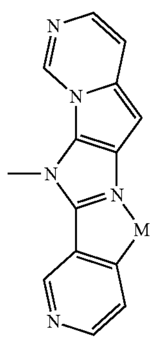
L1058
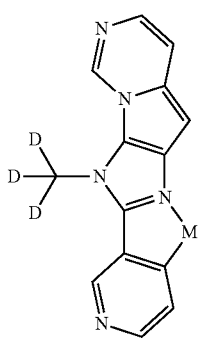
L1059
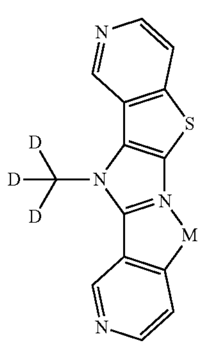
-continued
L1060
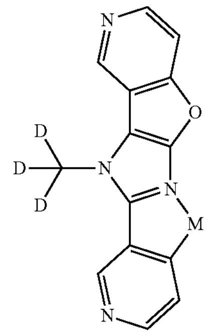
L1061
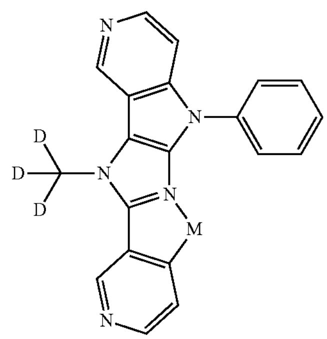
L1062
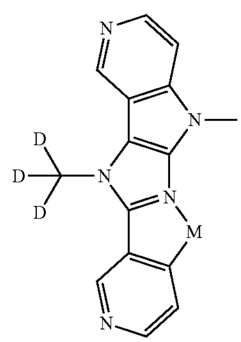
L1063
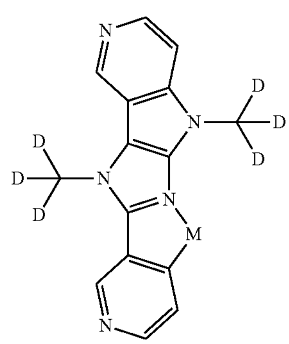

L1064
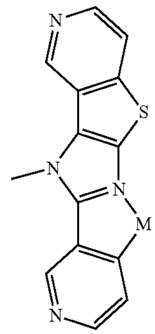
L1065
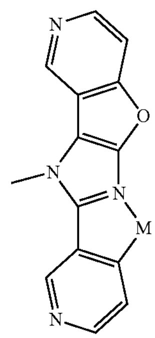
L1066
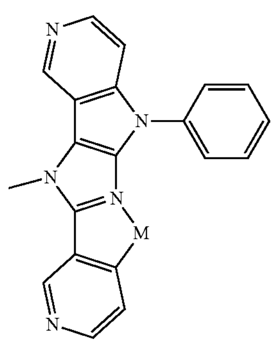
L1067
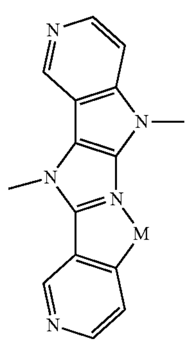
L1068
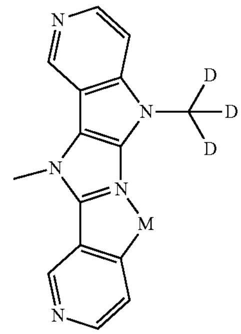
L1069
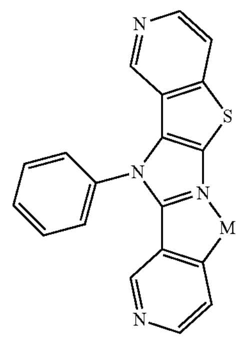
L1070
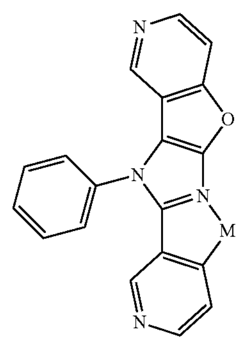
L1071
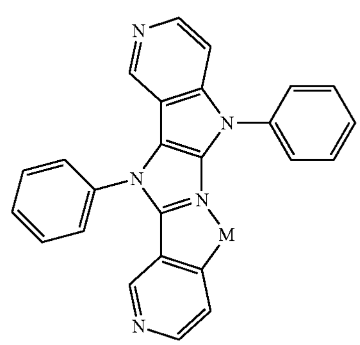

-continued
L1072
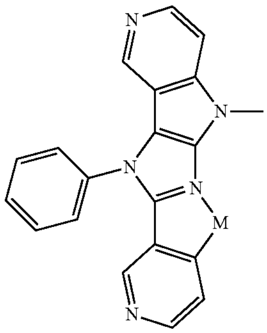
L1073
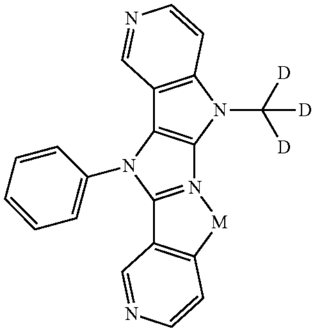
L1074
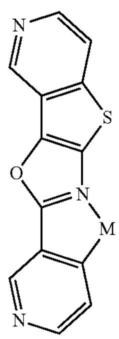
L1075
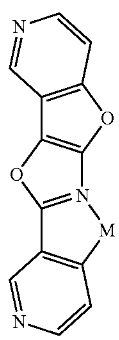
-continued
L1076
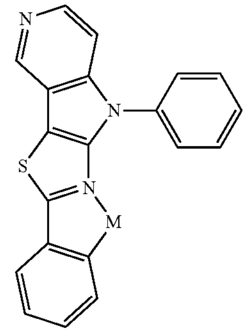
L1077
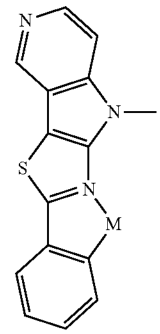
L1078
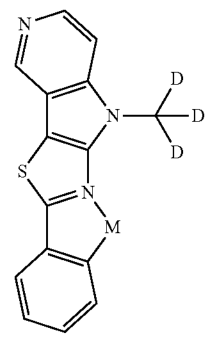
L1079
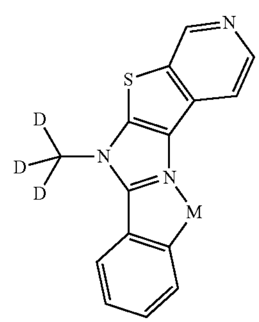
L1080
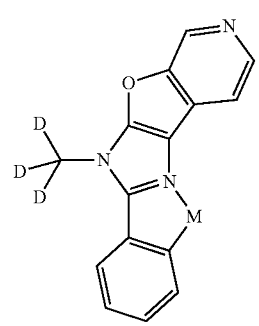

-continued
L1081
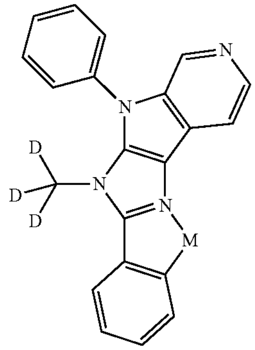
L1082
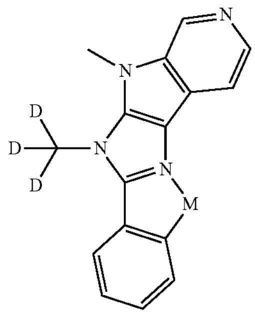
L1083
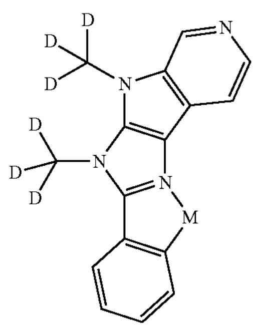
L1084
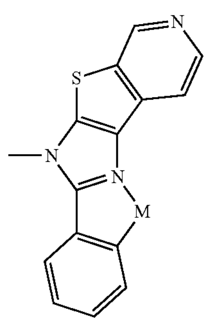
L1085
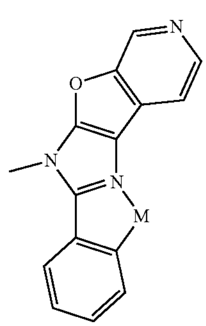
-continued
L1086
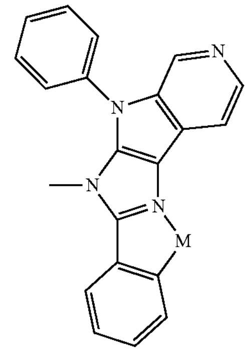
L1087
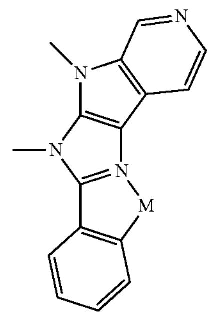
L1088
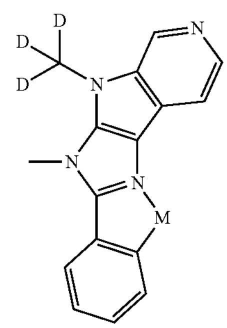
L1089
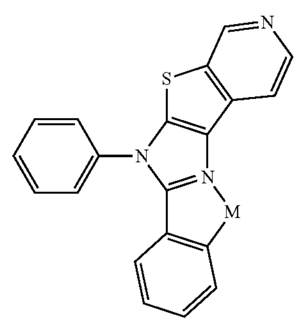
L1090
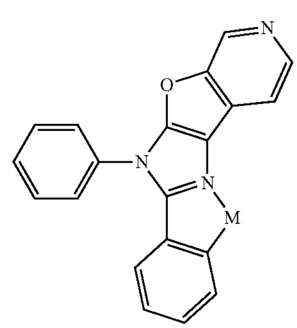

-continued
L1091
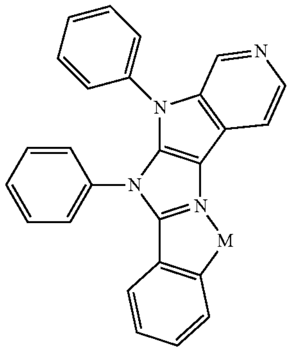
L1092
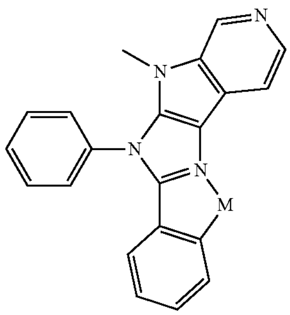
L1093
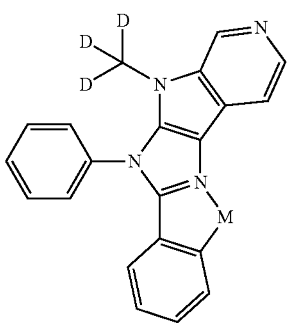
L1094
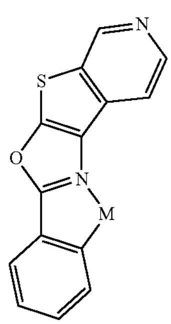
L1095
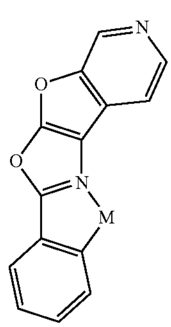
-continued
L1096
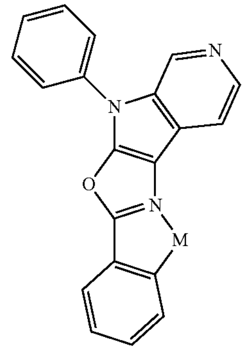
L1097
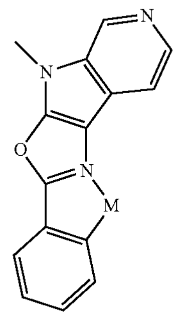
L1098
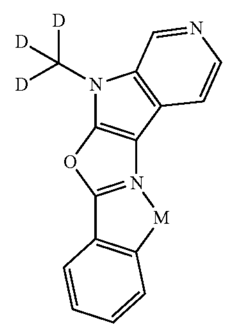
L1099
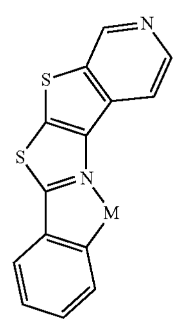
L1100
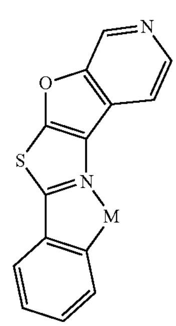

-continued
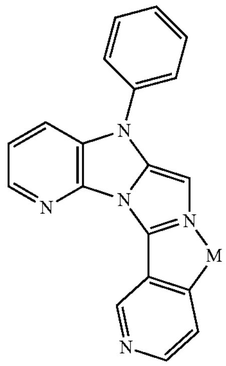
L1101
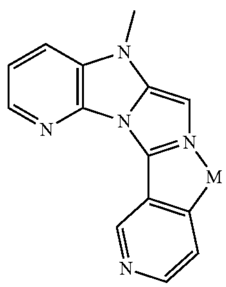
L1102
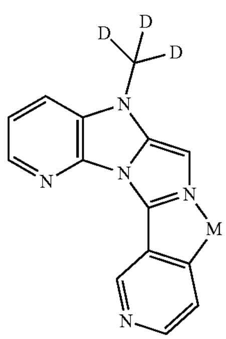
L1103
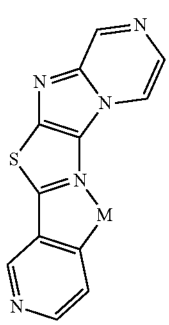
L1104
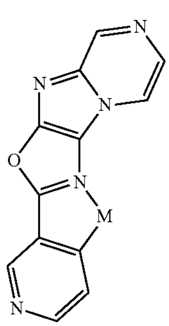
L1105
-continued
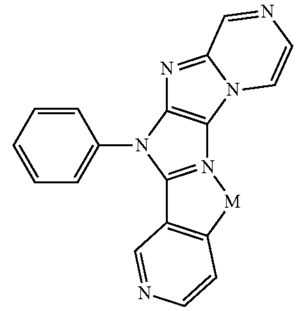
L1106
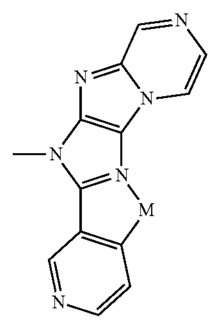
L1107
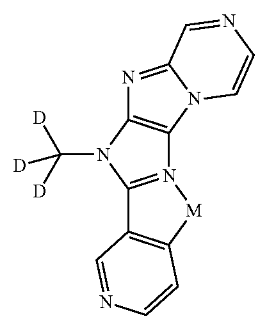
L1108
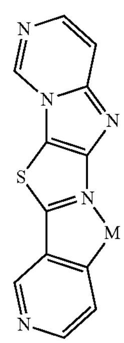
L1109
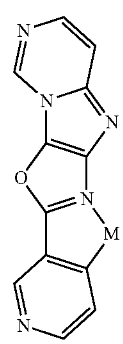
L1110

-continued
L1111
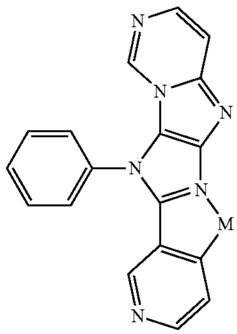
L1112
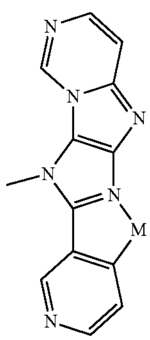
L1113
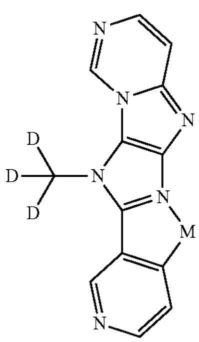
L1114
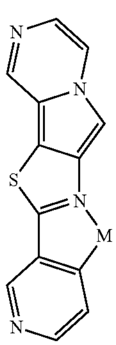
-continued
L1115
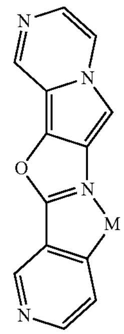
L1116
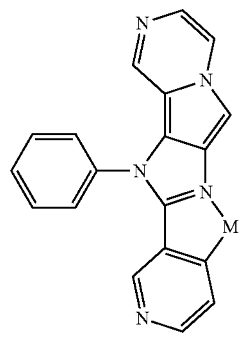
L1117
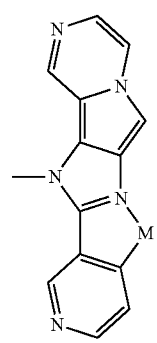
L1118
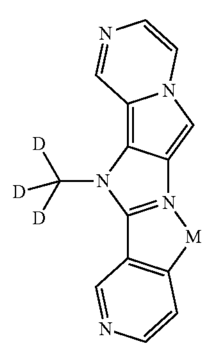

-continued
L1119
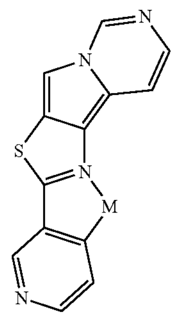
L1120
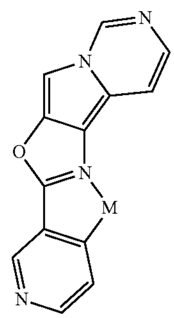
L1121
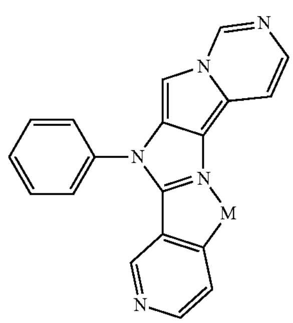
L1122
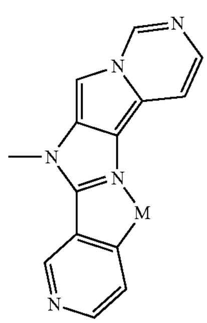
L1123
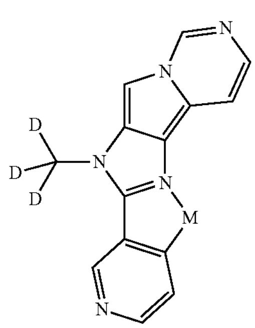
-continued
L1124
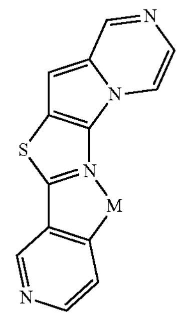
L1125
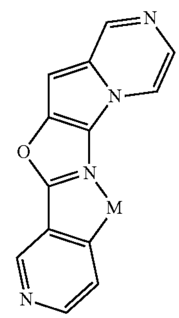
L1126
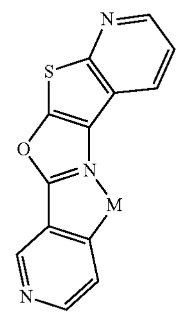
L1127
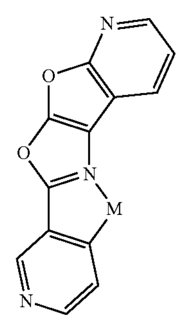
L1128
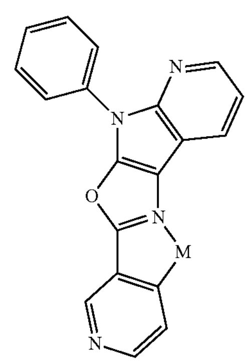

-continued
L1129
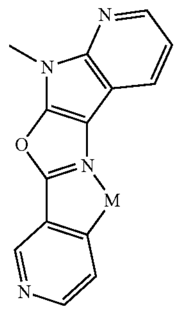
L1130
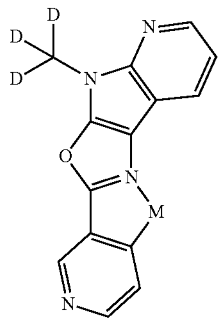
L1131
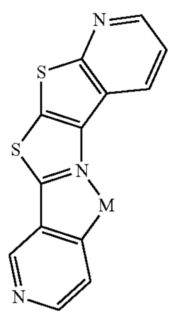
L1132
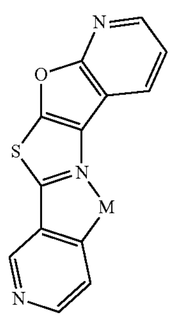
L1133
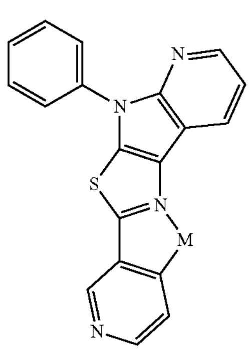
-continued
L1134
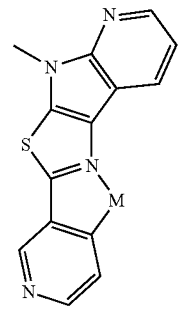
L1135
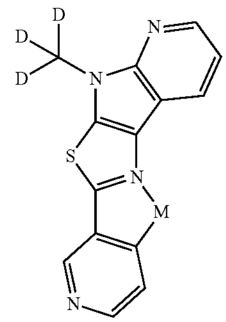
L1136
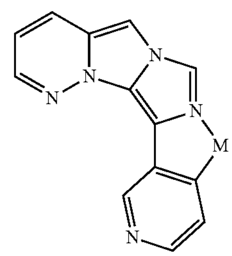
L1137
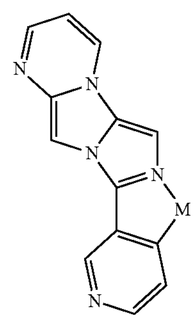
L1138
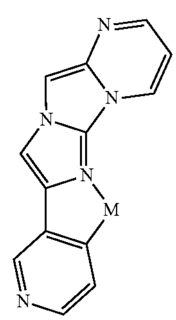

-continued
L1139
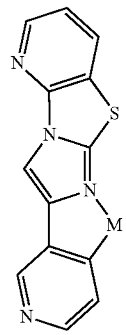
L1140
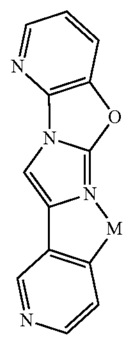
L1141
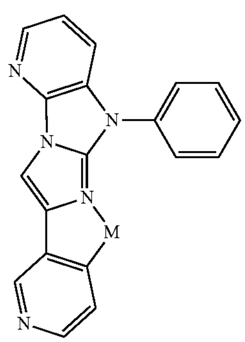
L1142
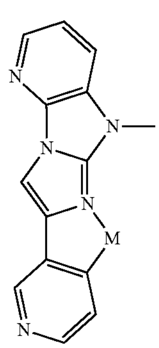
-continued
L1143
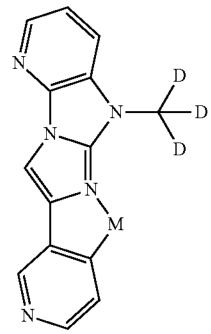
L1144
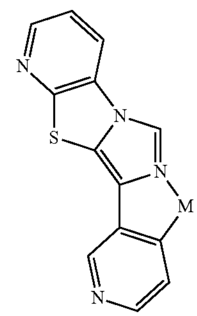
L1145
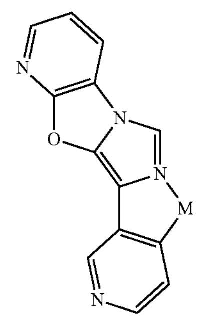
L1146
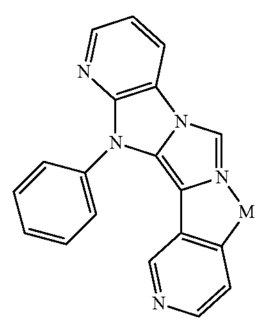
L1147
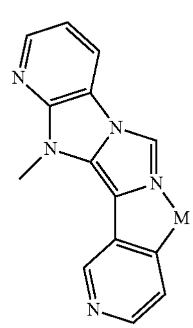

-continued
L1148
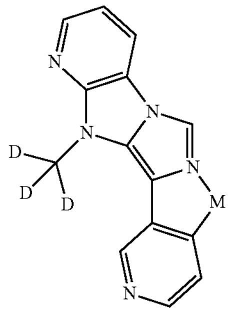
L1149
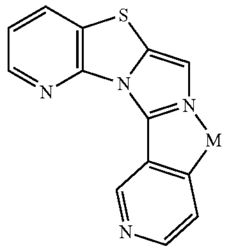
L1150
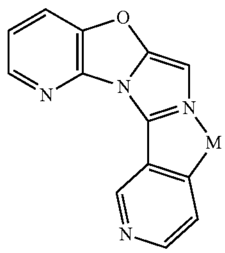
L1151
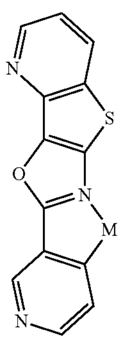
L1152
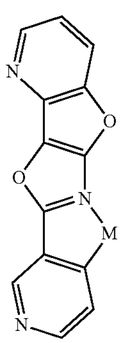
-continued
L1153
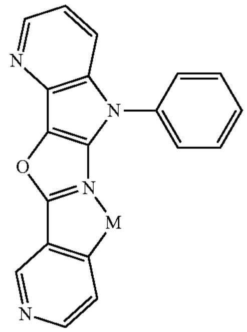
L1154
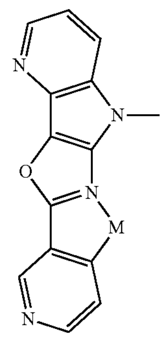
L1155
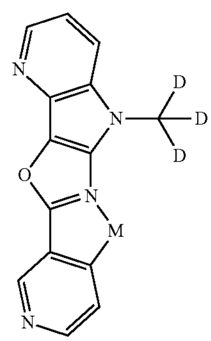
L1156
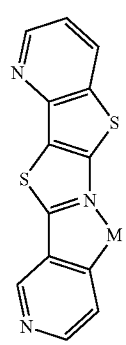

L1157
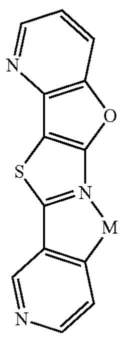
L1158
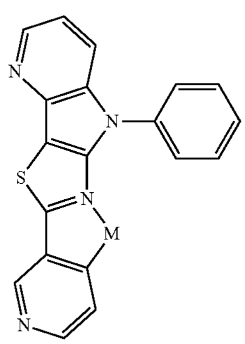
L1159
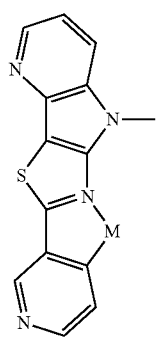
L1160
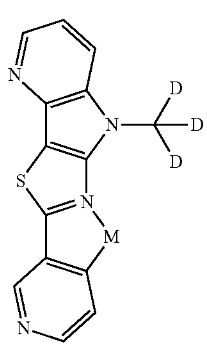
L1161
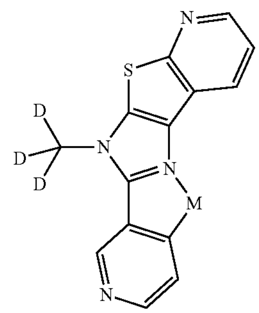
L1162
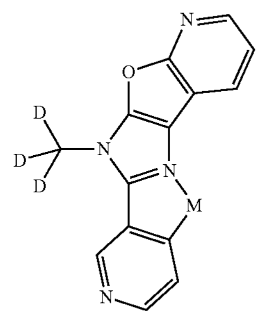
L1163
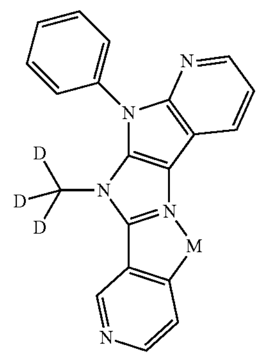
L1164
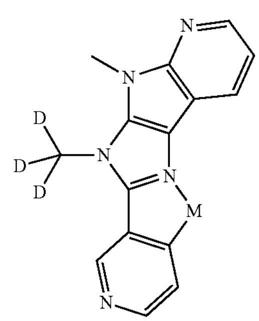
L1165
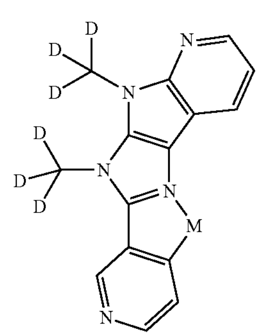

L1166
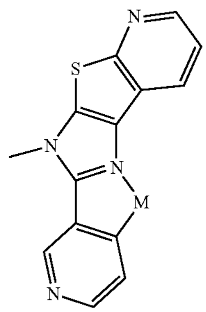
L1167
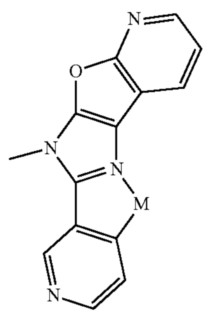
L1168
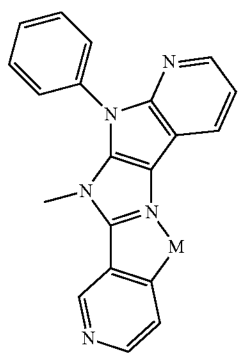
L1169
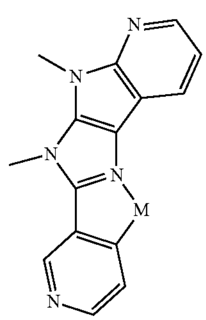
L1170
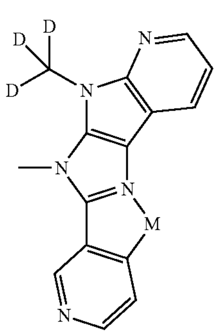
L1171
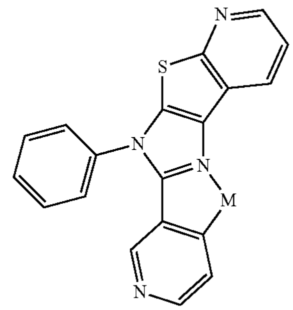
L1172
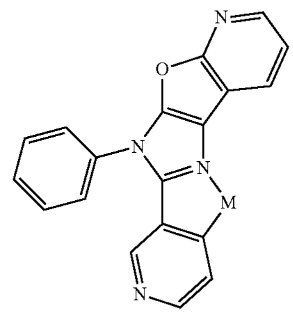
L1173
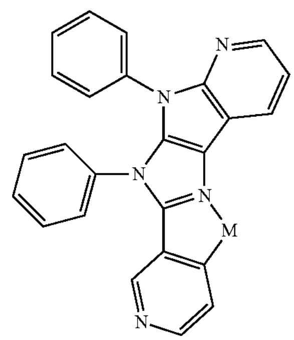
L1174
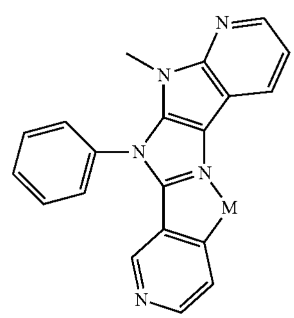
L1175
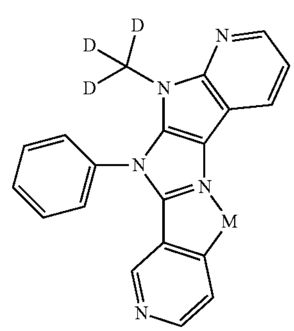

L1176
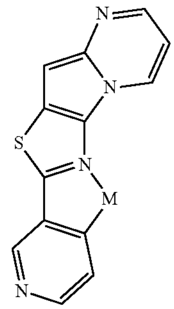
L1177
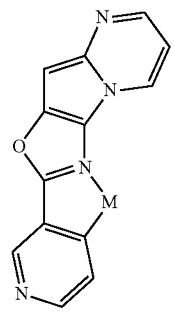
L1178
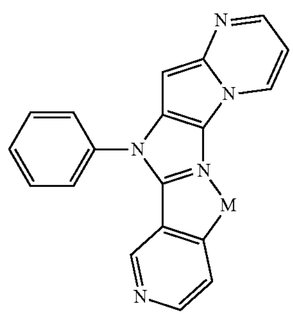
L1179
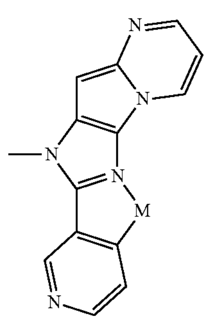
L1180
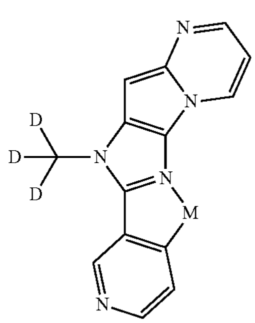
L1181
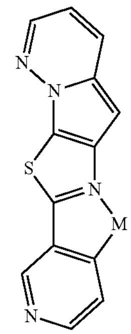
L1182
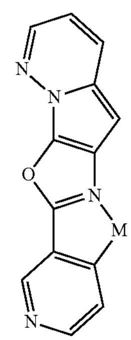
L1183
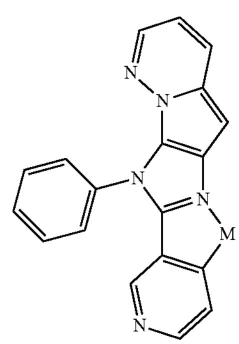
L1184
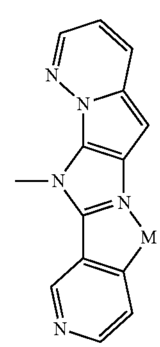

-continued
L1185
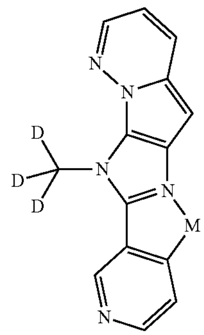
L1186
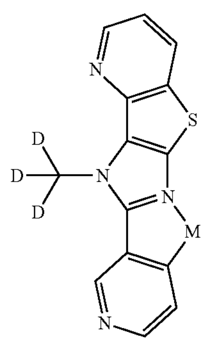
L1187
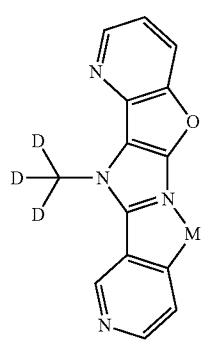
L1188
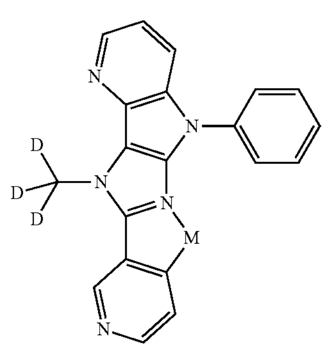
-continued
L1189
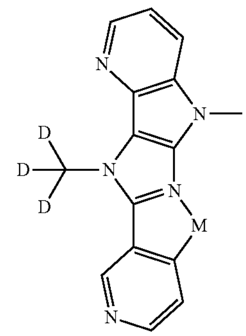
L1190
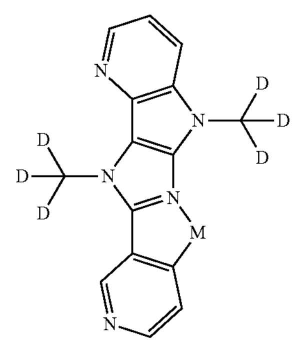
L1191
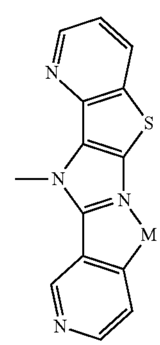
L1192
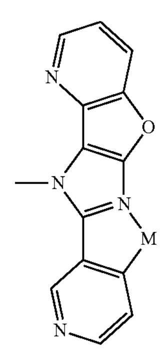

L1193
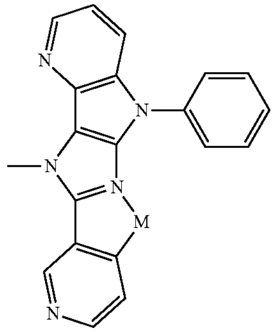
L1194
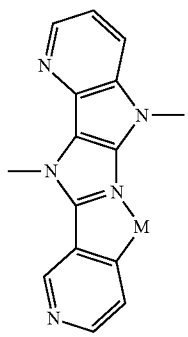
L1195
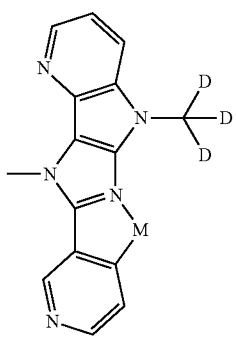
L1196
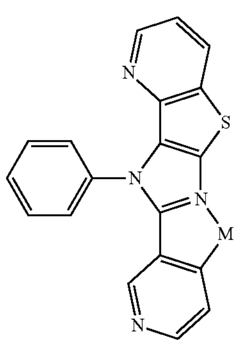
L1197
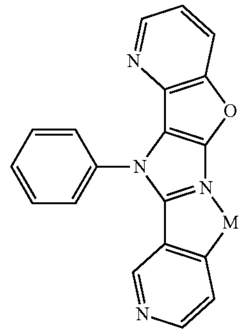
L1198
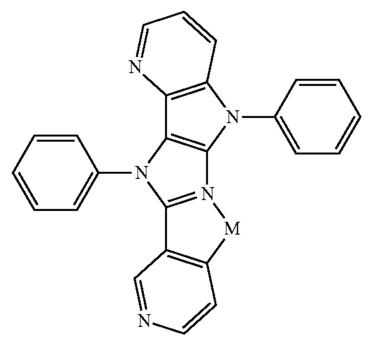
L1199
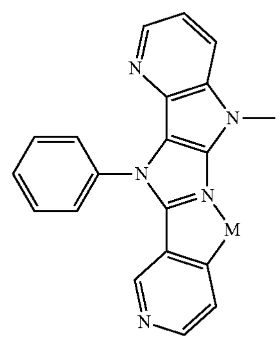
L1200
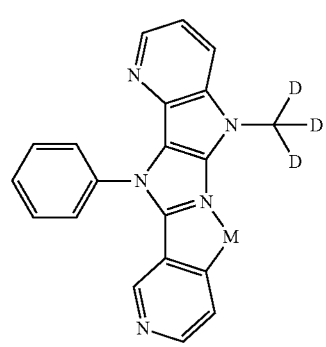

-continued
L1201
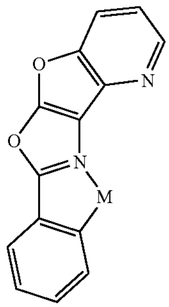
L1202
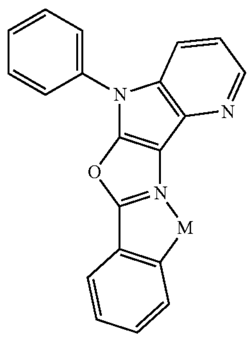
L1203
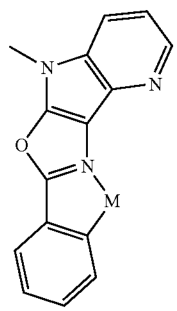
L1204
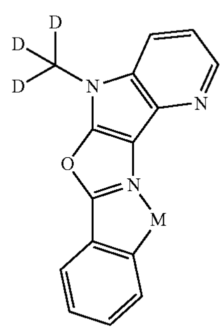
L1205
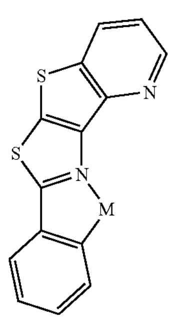
-continued
L1206
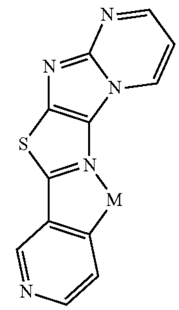
L1207
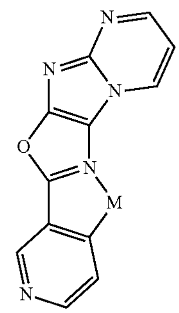
L1208
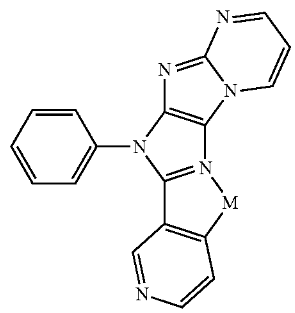
L1209
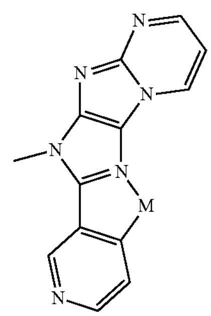
L1210
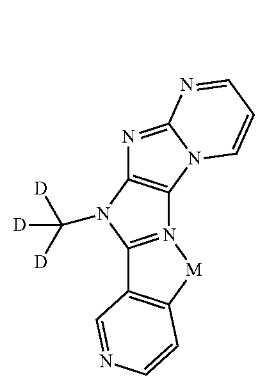

-continued
L1211
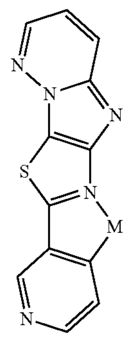
L1212
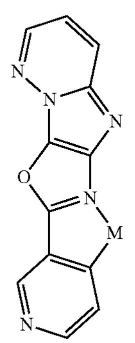
L1213
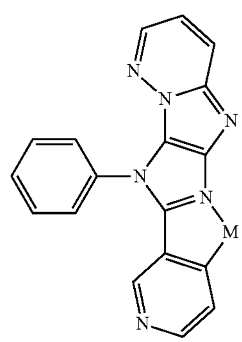
L1214
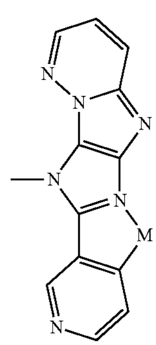
-continued
L1215
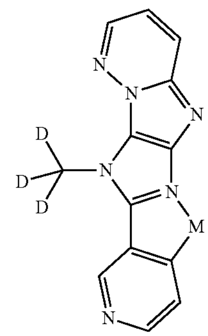
L1216
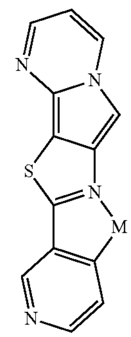
L1217
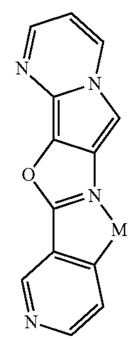
L1218
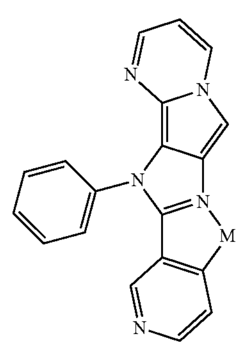

-continued
L1219
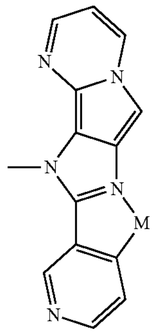
L1220
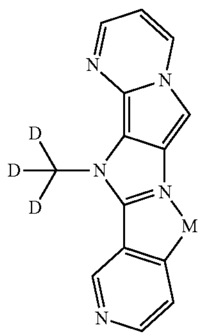
L1221
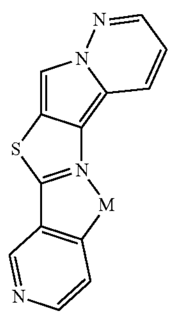
L1222
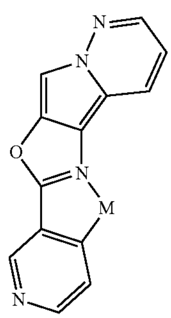
L1223
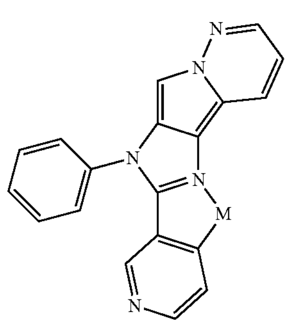
-continued
L1224
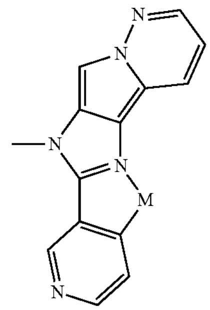
L1225
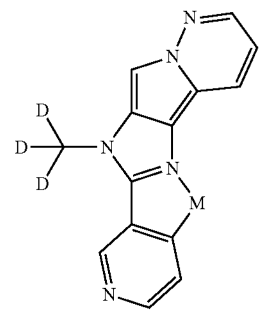
L1226
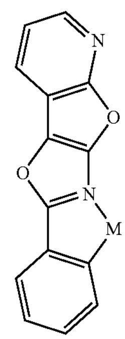
L1227
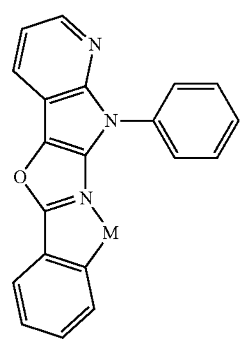
L1228
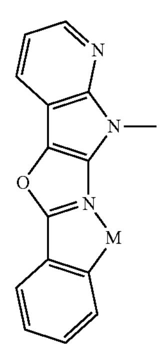

-continued
L1229
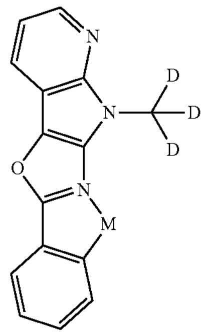
L1230
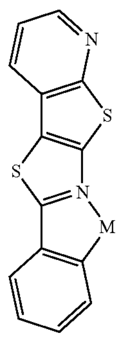
L1231
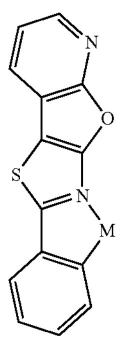
L1232
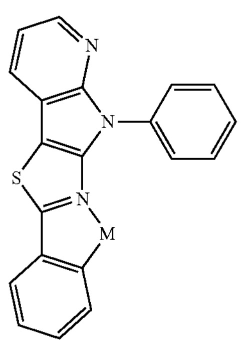
-continued
L1233
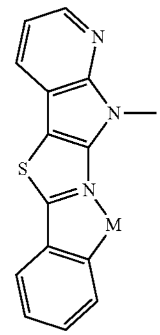
L1234
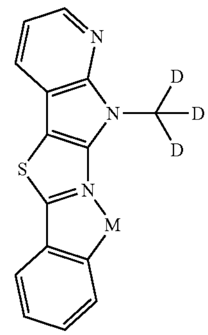
L1235
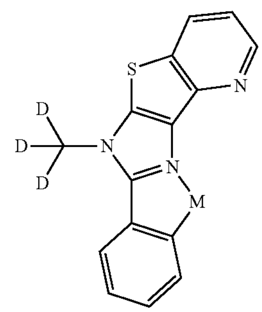
L1236
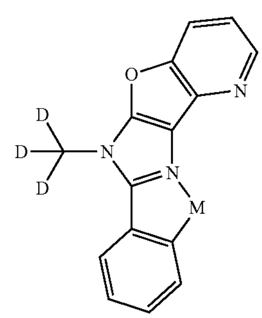
L1237
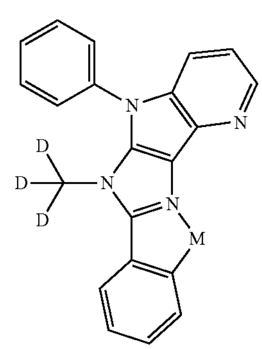

L1238
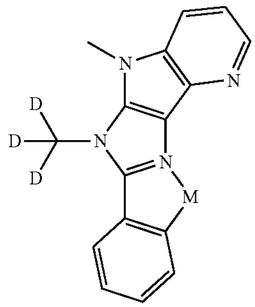
L1239
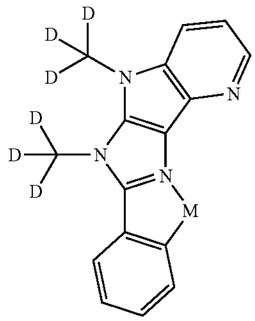
L1240
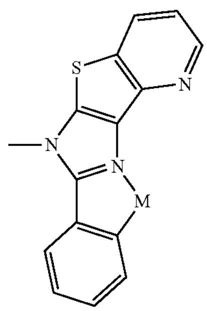
L1241
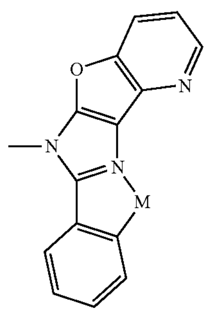
L1242
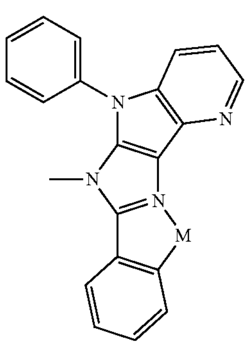
L1243
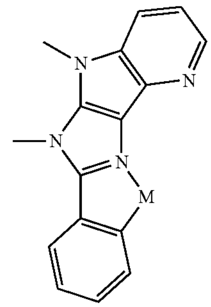
L1244
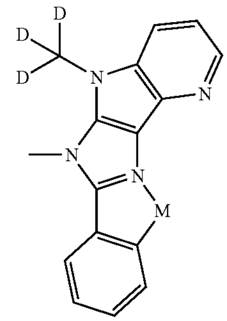
L1245
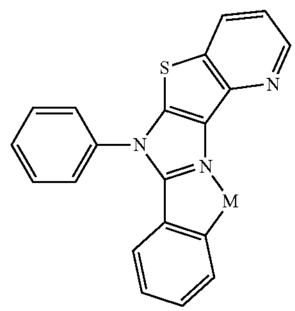
L1246
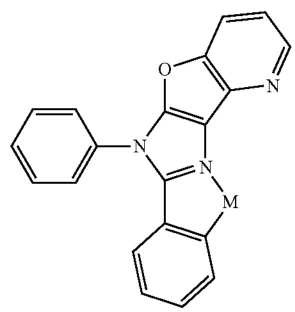
L1247
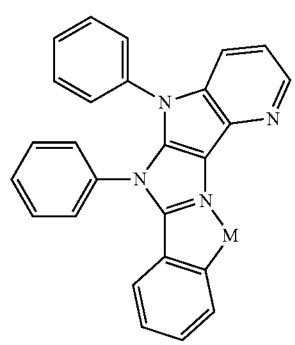

-continued
L1248
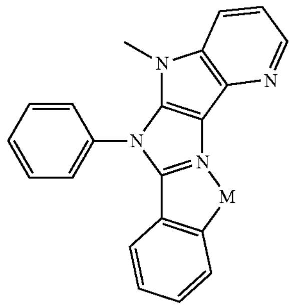
L1249
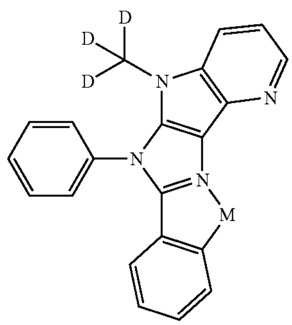
L1250
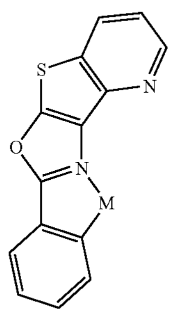
L1251
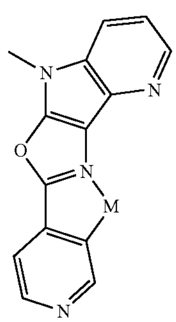
L1252
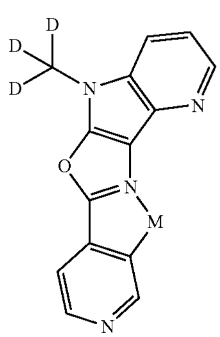
-continued
L1253
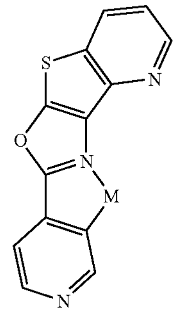
L1254
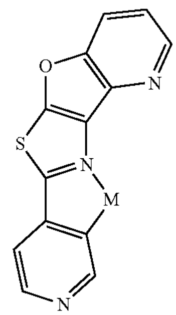
L1255
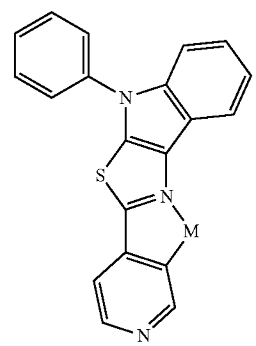
L1256
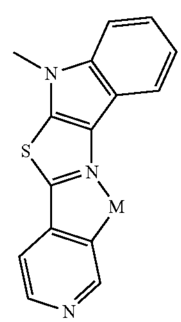
L1257
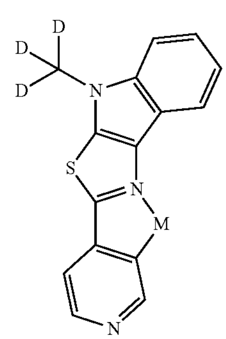

-continued
L1258
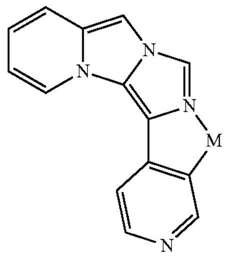
L1259
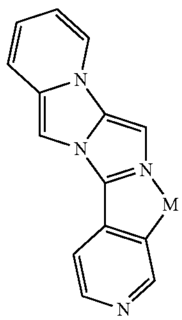
L1260
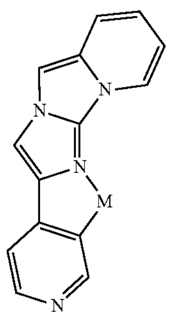
L1261
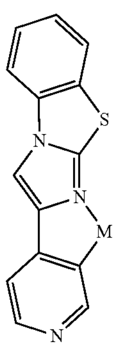
L1262
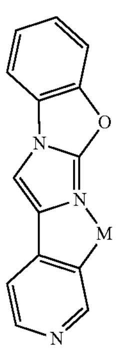
-continued
L1263
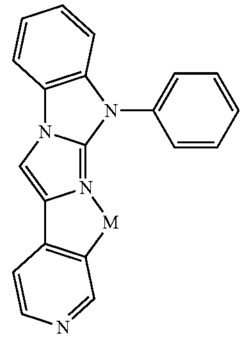
L1264
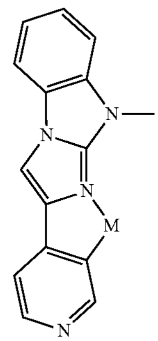
L1265
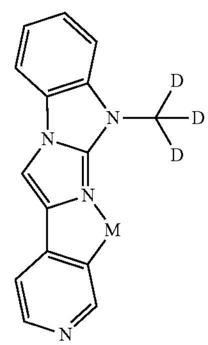
L1266
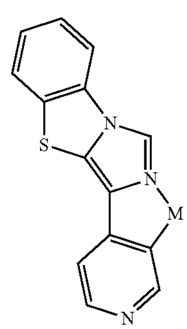

-continued
L1267
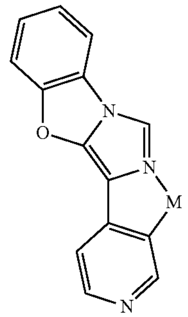
L1268
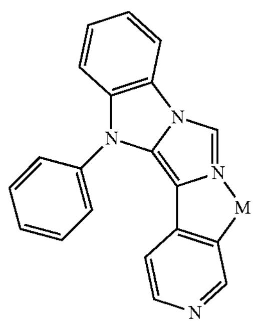
L1269
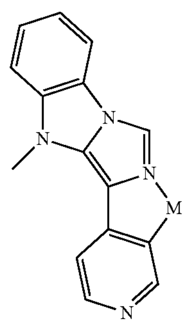
L1270
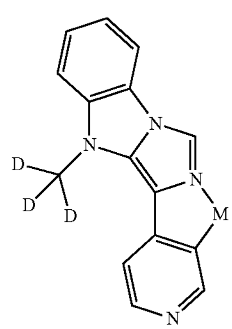
L1271
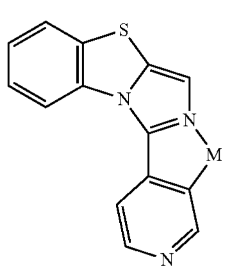
-continued
L1272
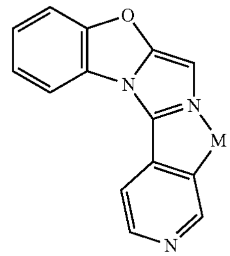
L1273
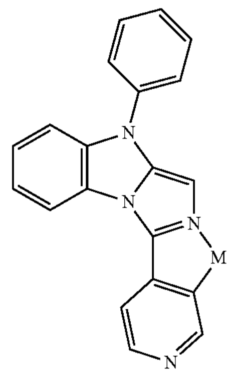
L1274
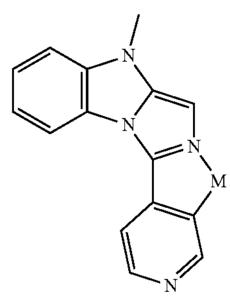
L1275
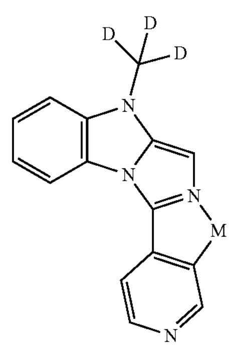
L1276
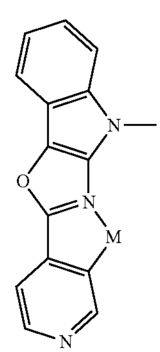

-continued
L1277
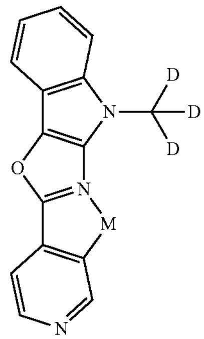
L1278
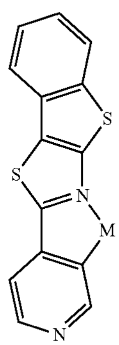
L1279
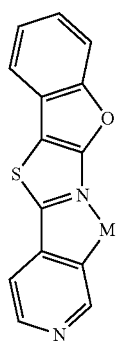
L1280
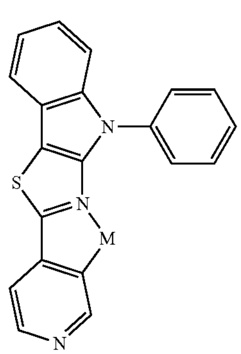
-continued
L1281
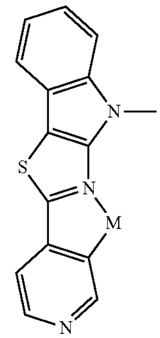
L1282
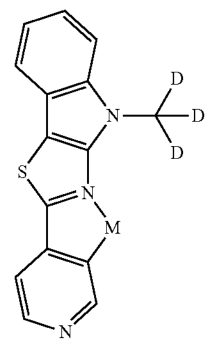
L1283
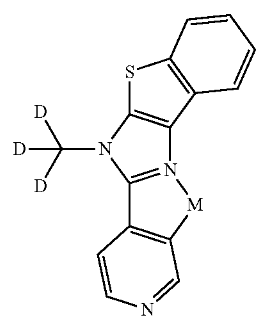
L1284
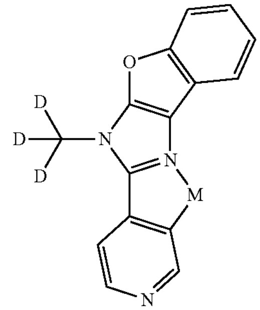

-continued
L1285
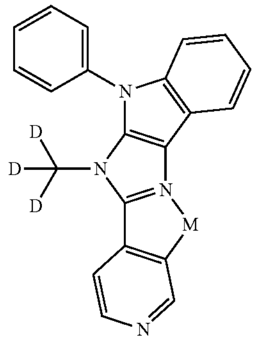
L1286
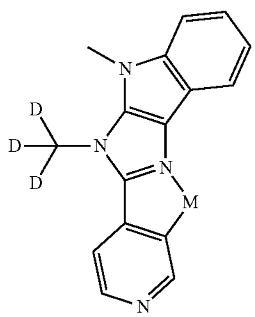
L1287
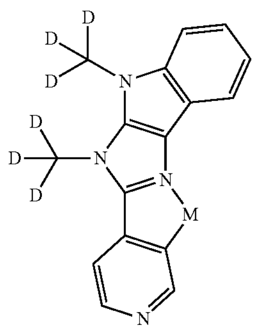
L1288
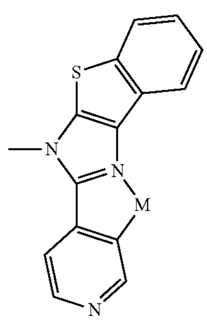
L1289
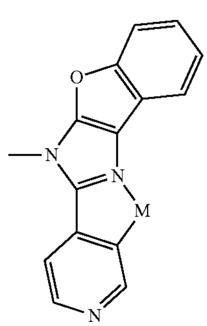
-continued
L1290
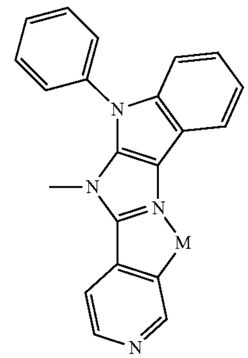
L1291
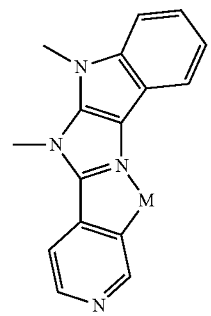
L1292
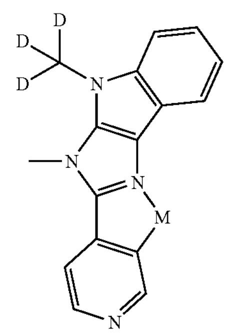
L1293
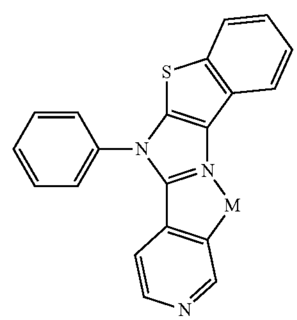
L1294
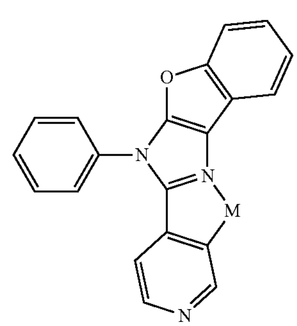

-continued
L1295
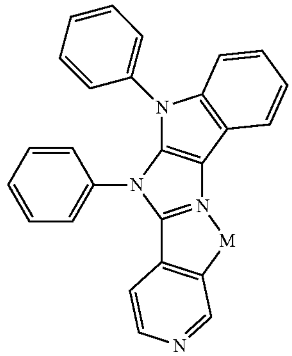
L1296
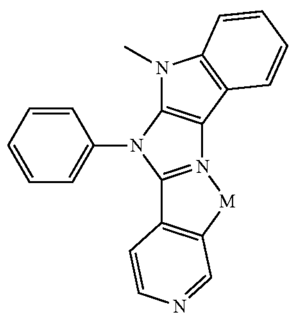
L1297
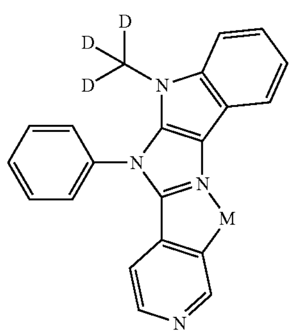
L1298
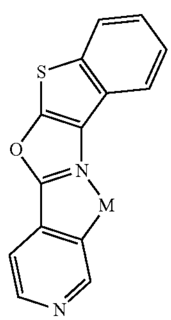
L1299
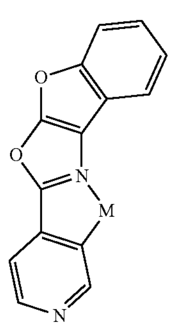
-continued
L1300
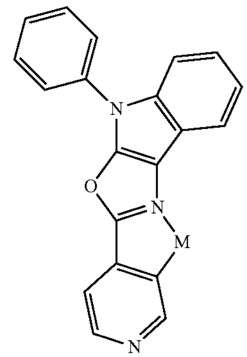
L1301
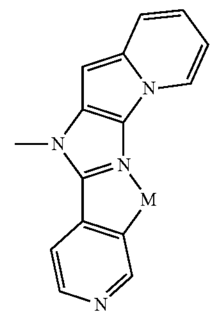
L1302
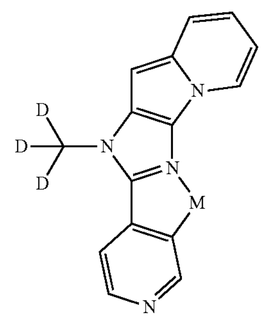
L1303
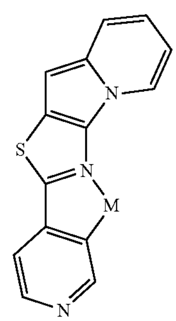
L1304
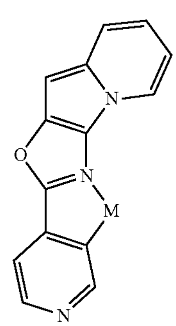

L1305
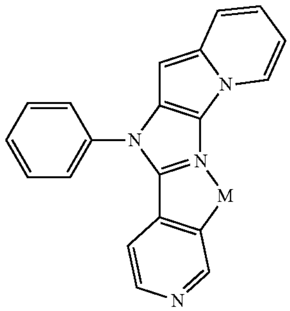
L1306
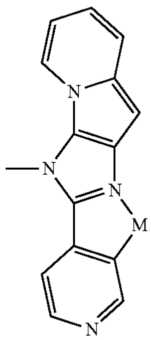
L1307
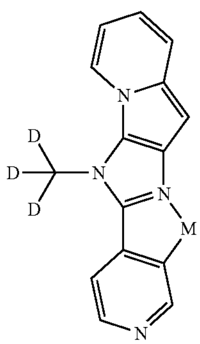
L1308
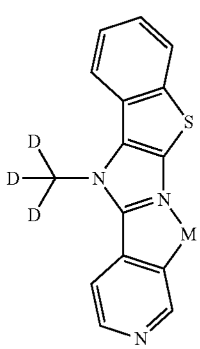
L1309
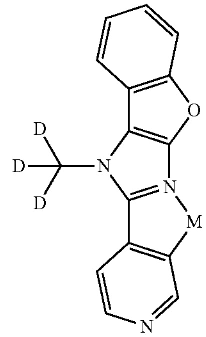
L1310
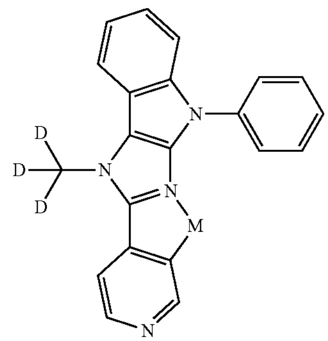
L1311
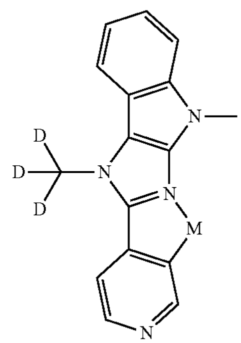
L1312
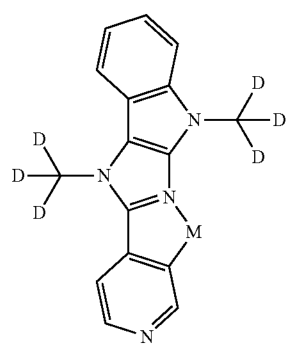

-continued
L1313
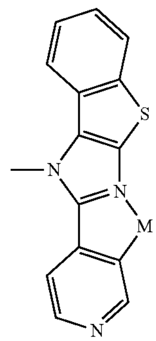
L1314
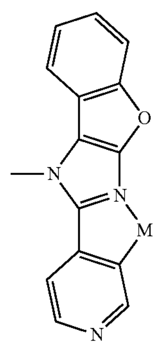
L1315
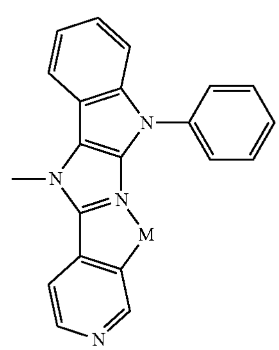
L1316
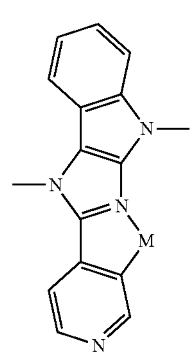
-continued
L1317
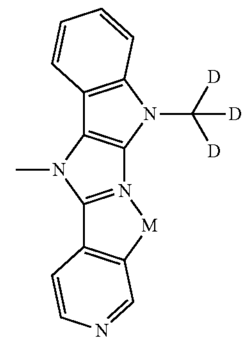
L1318
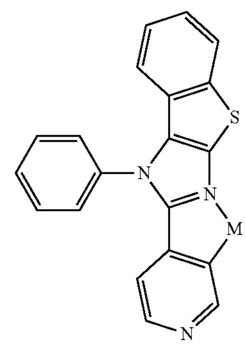
L1319
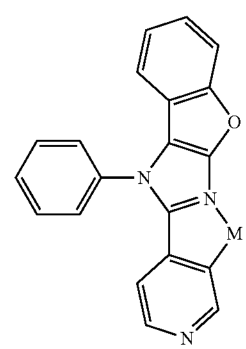
L1320
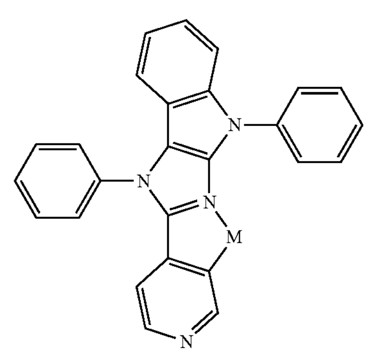

-continued
L1321
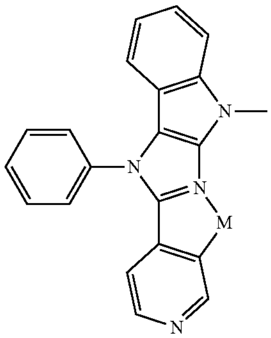
L1322
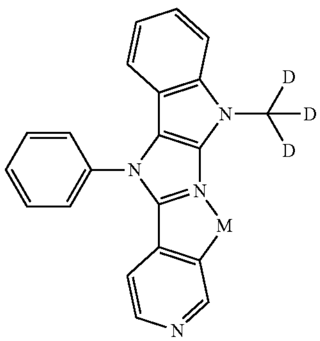
L1323
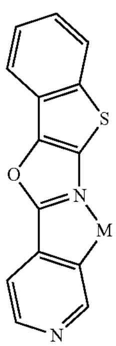
L1324
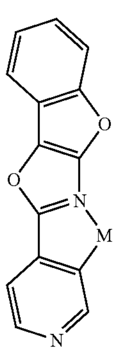
-continued
L1325
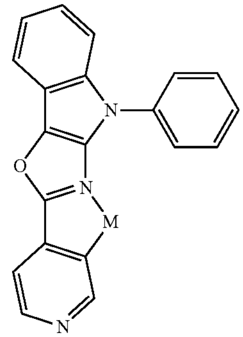
L1326
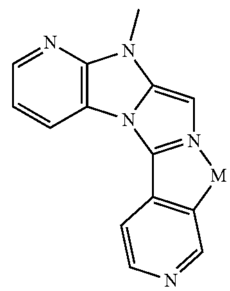
L1327
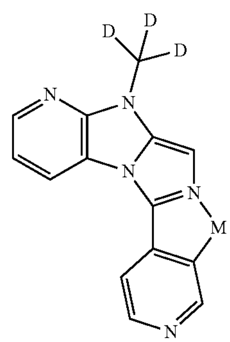
L1328
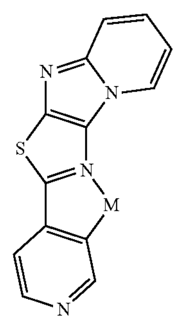
L1329
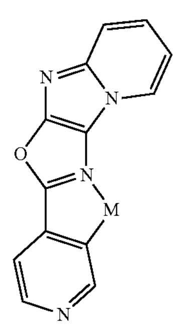

-continued
L1330
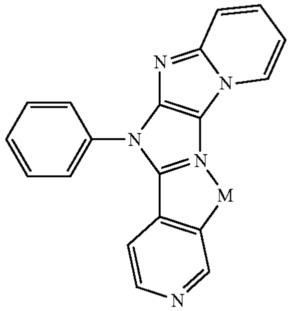
L1331
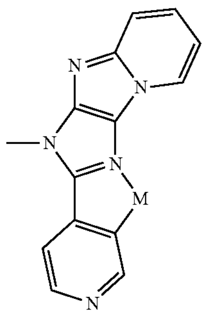
L1332
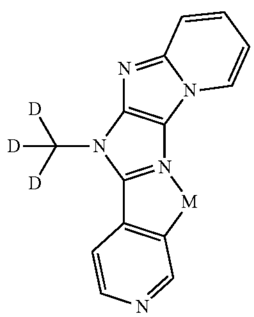
L1333
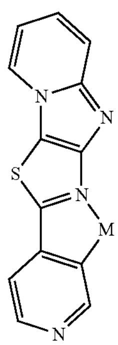
L1334
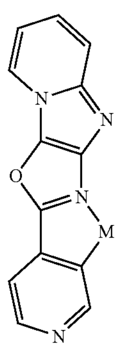
-continued
L1335
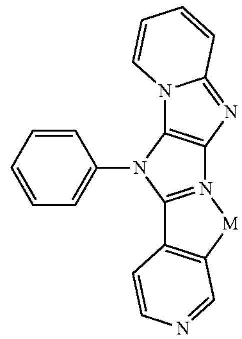
L1336
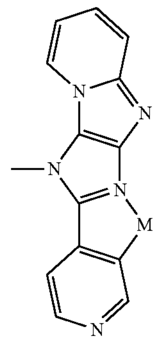
L1337
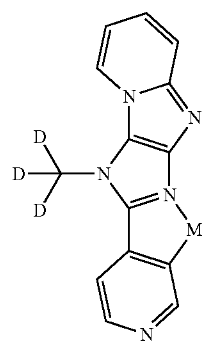
L1338
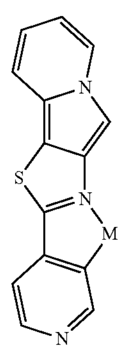

L1339
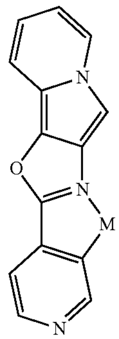
L1340
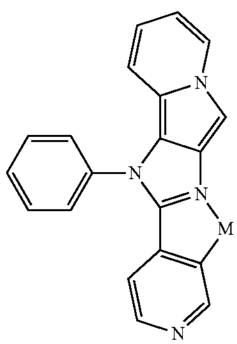
L1341
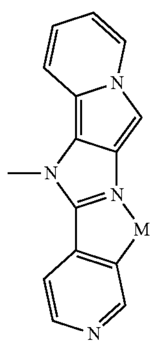
L1342
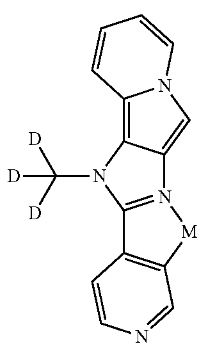
L1343
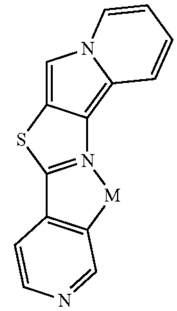
L1344
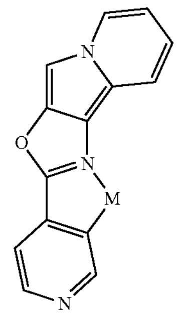
L1345
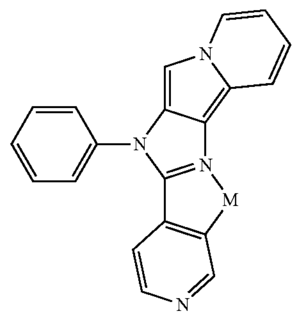
L1346
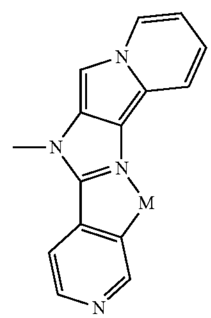
L1347
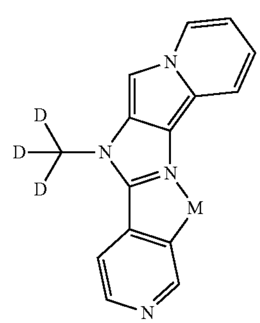

-continued
L1348
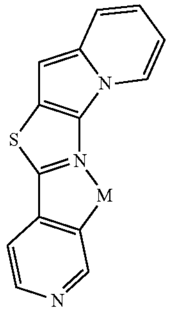
L1349
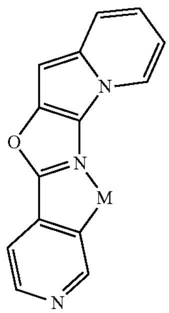
L1350
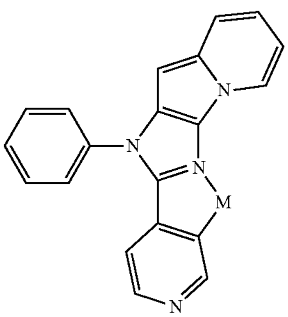
L1351
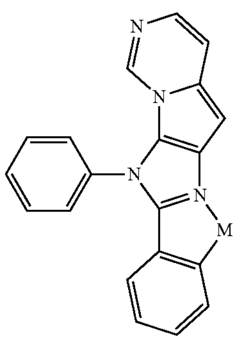
L1352
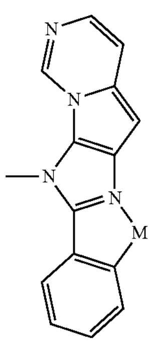
-continued
L1353
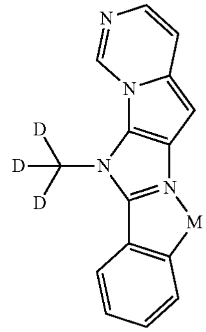
L1354
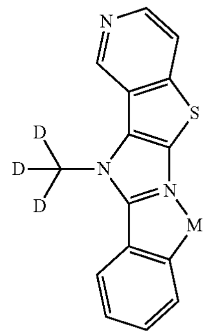
L1355
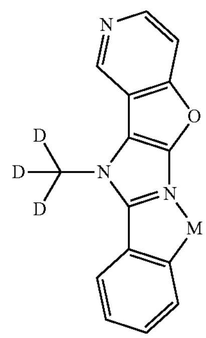
L1356
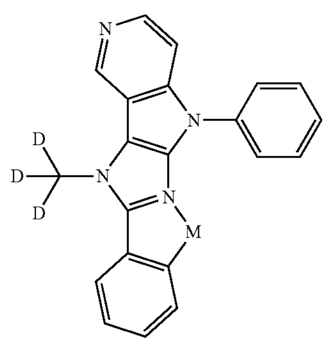

-continued
L1357
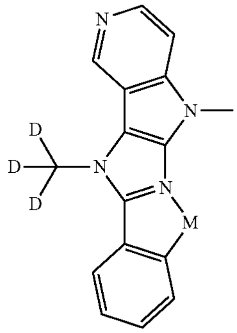
L1358
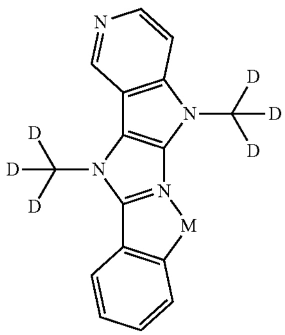
L1359
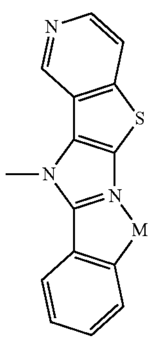
L1360
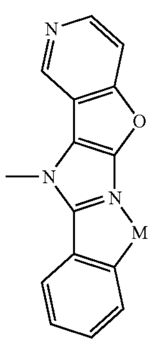
-continued
L1361
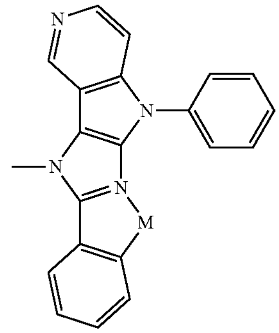
L1362
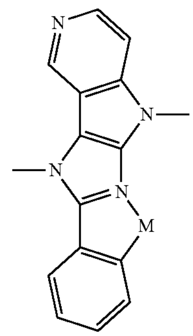
L1363
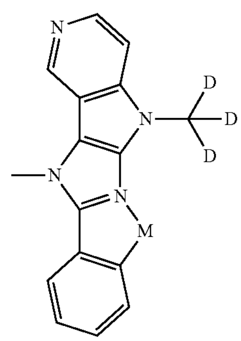
L1364
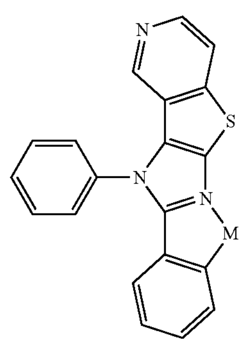

-continued
L1365
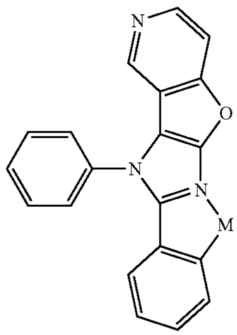
L1366
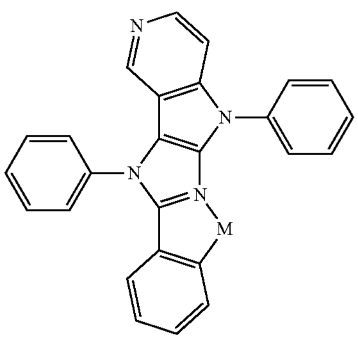
L1367
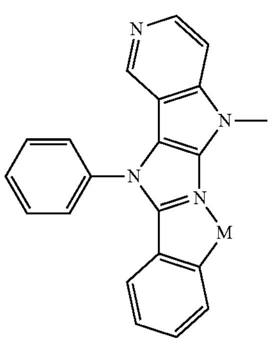
L1368
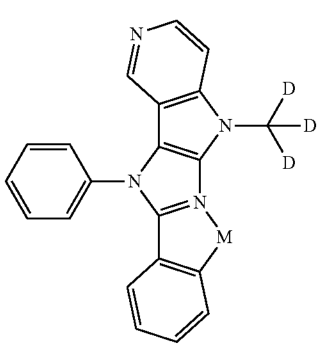
-continued
L1369
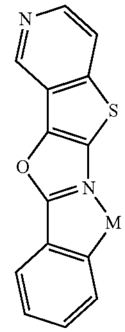
L1370
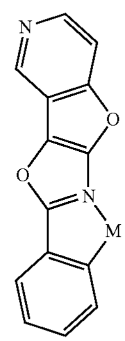
L1371
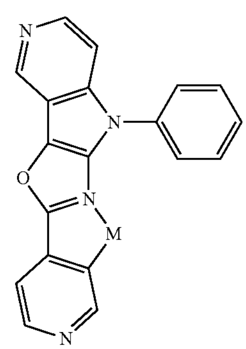
L1372
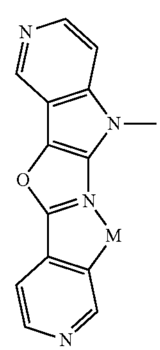

-continued
L1373
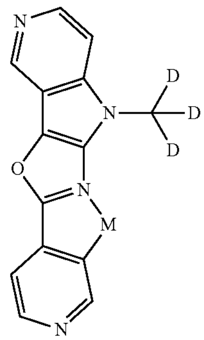
L1374
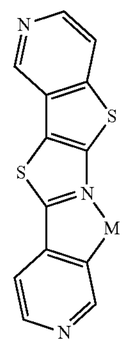
L1375
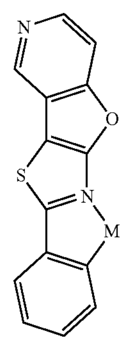
L1376
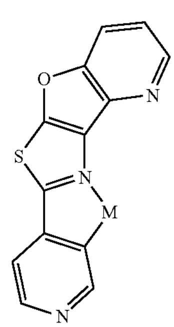
-continued
L1377
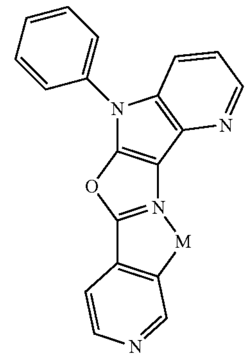
L1378
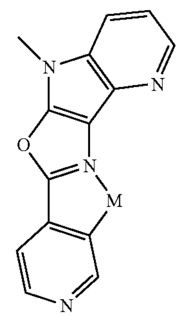
L1379
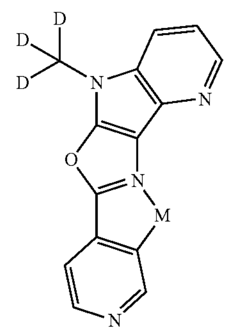
L1380
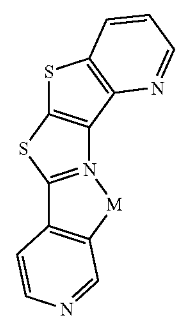
L1381
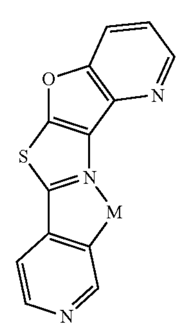

L1382
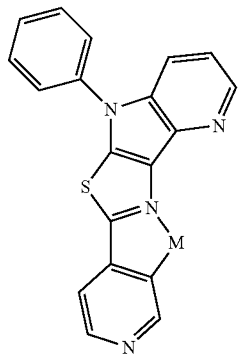
L1383
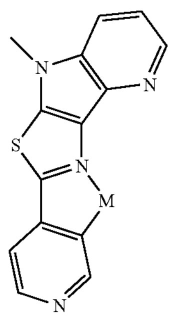
L1384
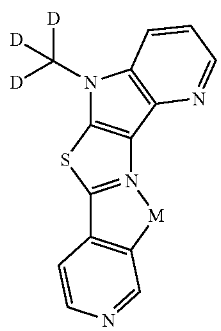
L1385
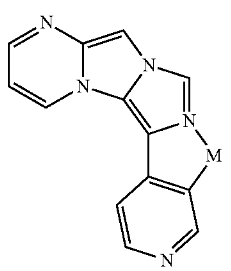
L1386
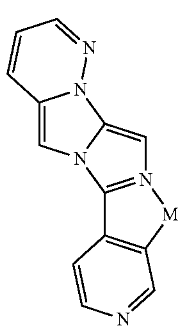
L1387
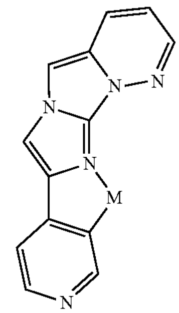
L1388
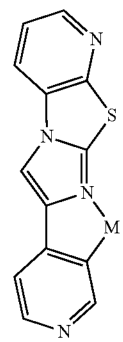
L1389
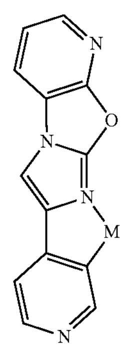
L1390
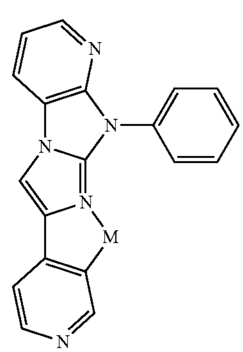

-continued
L1391
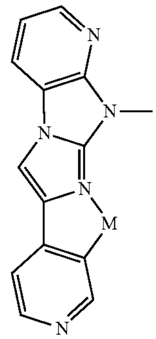
L1392
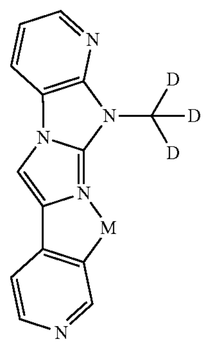
L1393
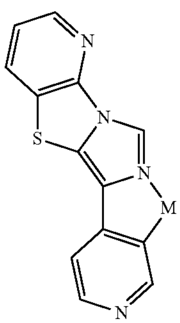
L1394
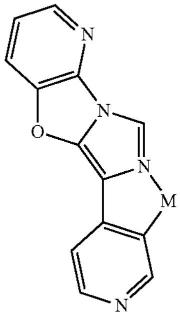
L1395
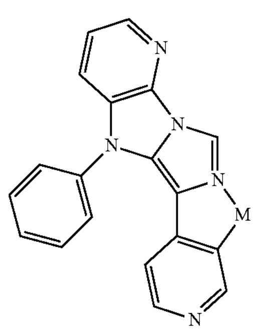
-continued
L1396
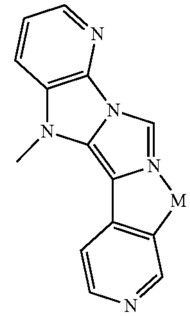
L1397
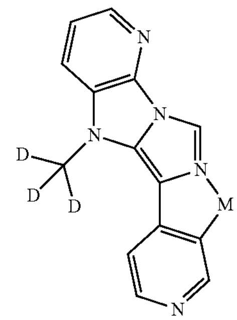
L1398
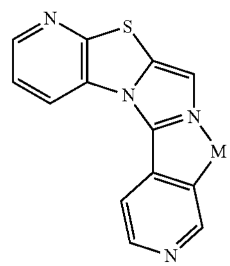
L1399
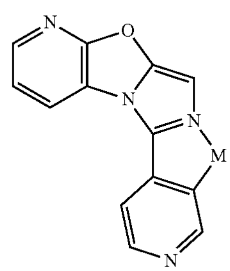
L1400
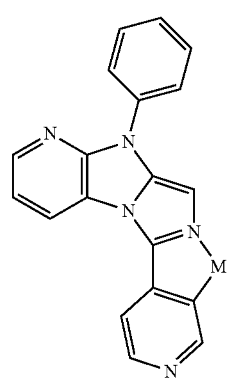

-continued
L1401
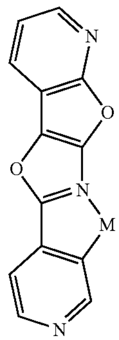
L1402
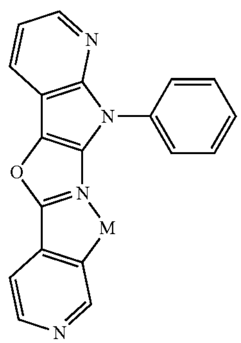
L1403
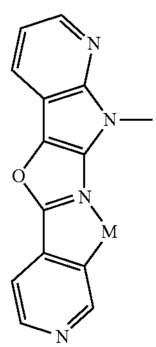
L1404
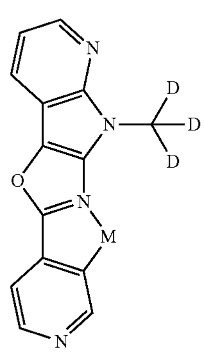
-continued
L1405
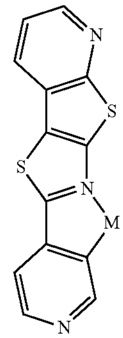
L1406
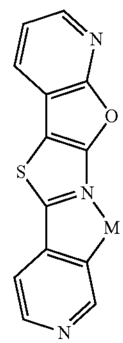
L1407
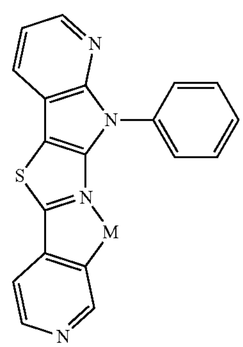
L1408
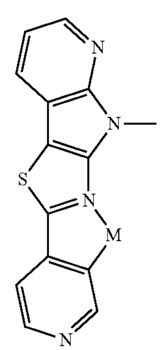

-continued
L1409
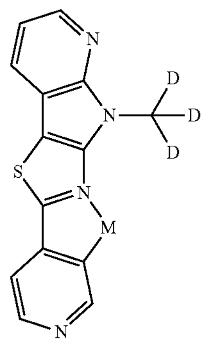
L1410
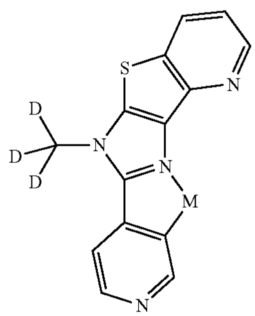
L1411
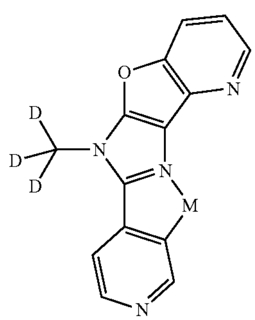
L1412
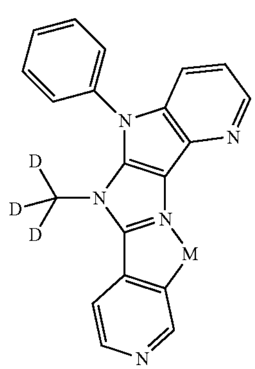
-continued
L1413
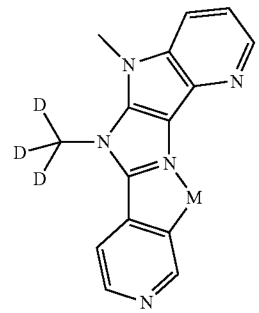
L1414
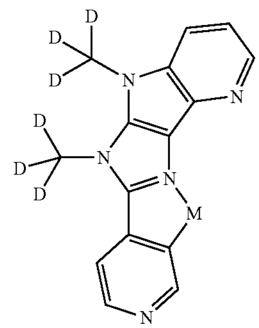
L1415
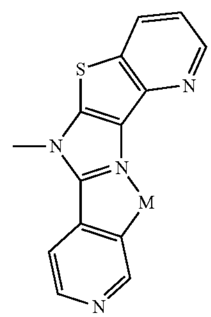
L1416
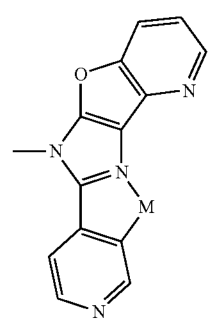
L1417
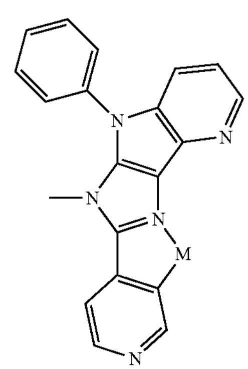

L1418
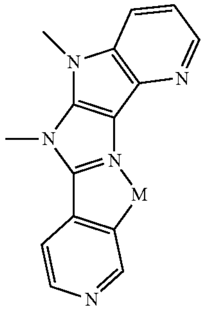
L1419
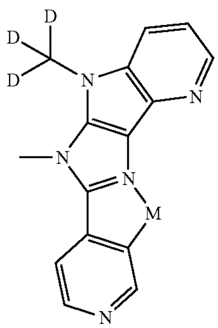
L1420
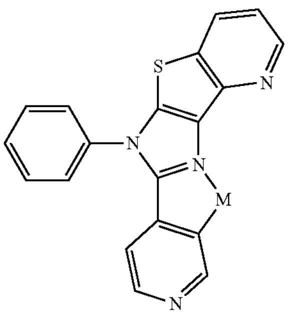
L1421
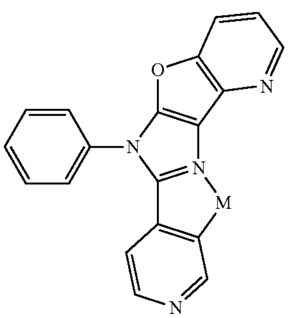
L1422
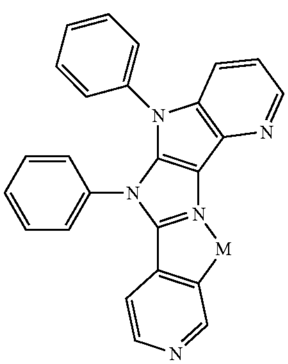
L1423
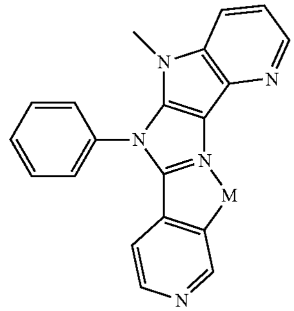
L1424
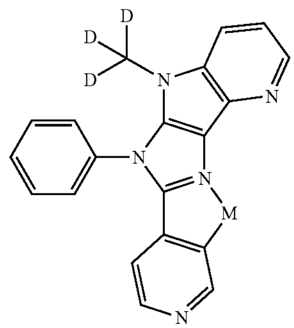
L1425
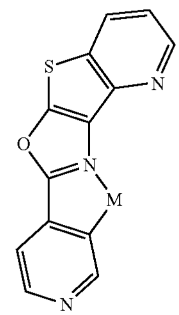
L1426
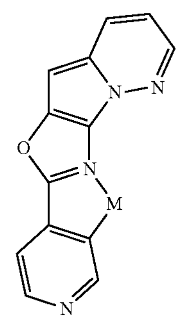
L1427
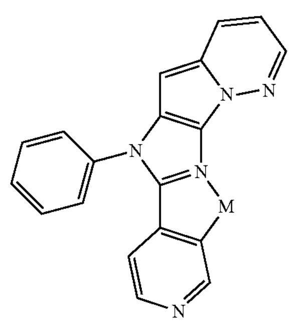

-continued
L1428
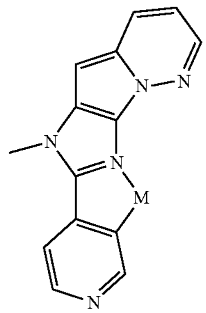
L1429
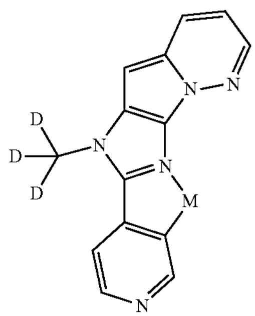
L1430
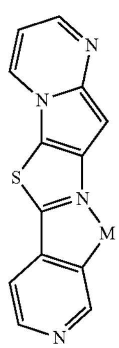
L1431
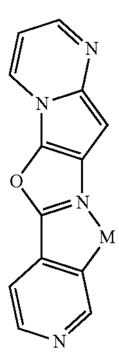
-continued
L1432
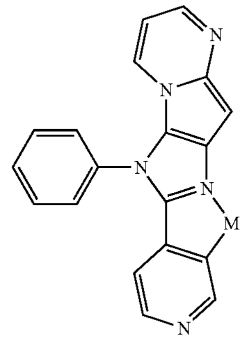
L1433
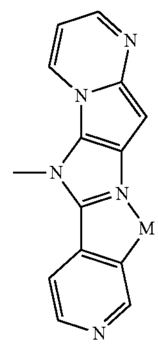
L1434
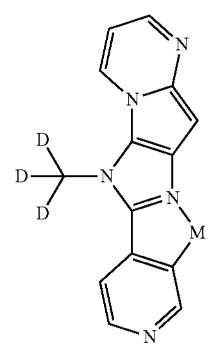
L1435
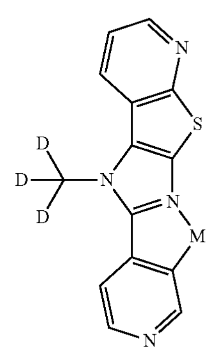

L1436
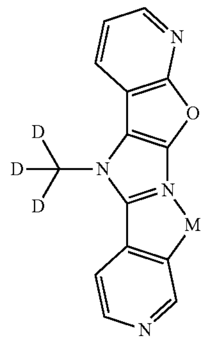
L1437
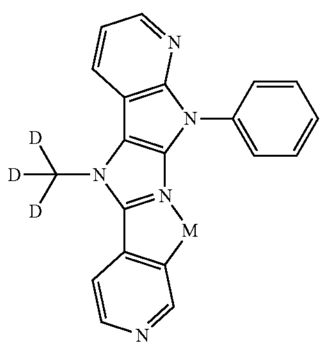
L1438
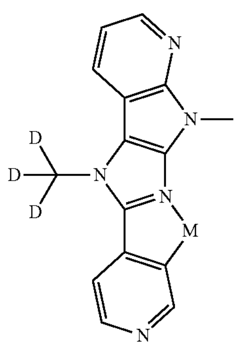
L1439
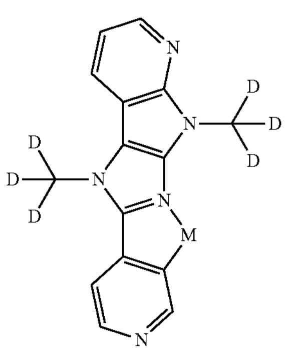
L1440
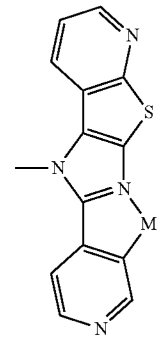
L1441
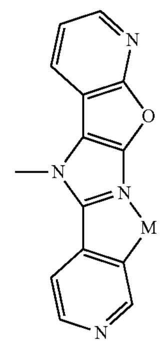
L1442
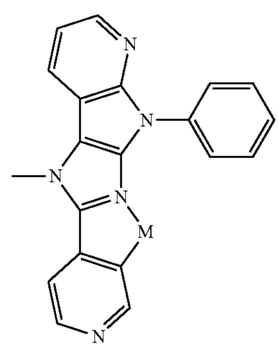
L1443
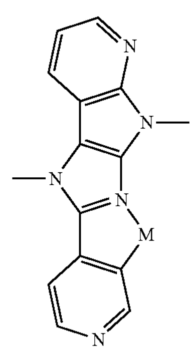

-continued
L1444
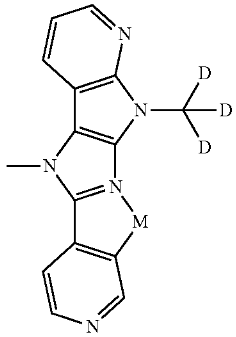
L1445
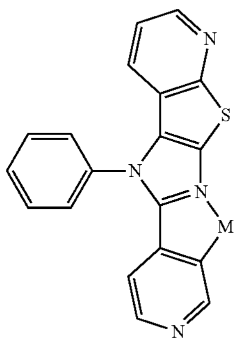
L1446
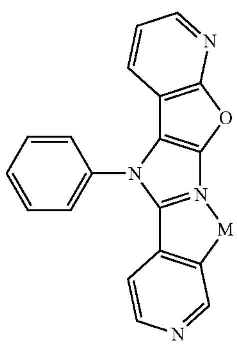
L1447
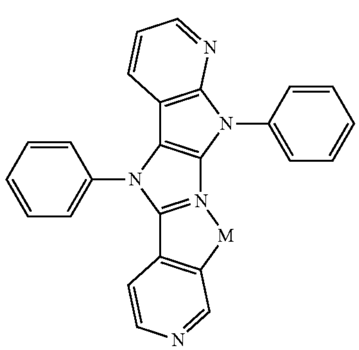
-continued
L1448
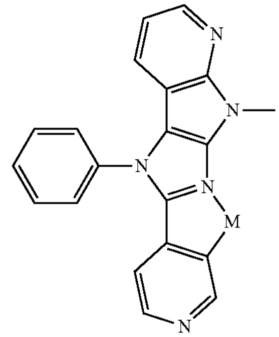
L1449
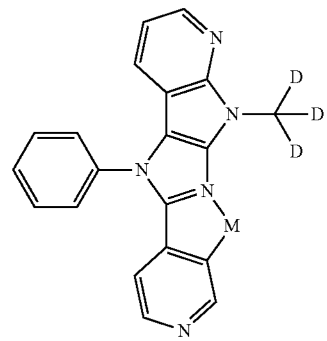
L1450
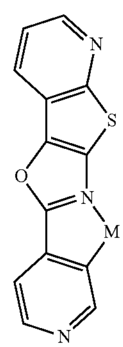
L1451
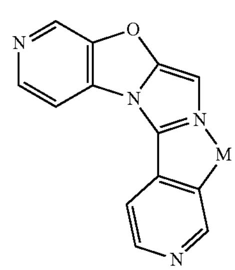

L1452
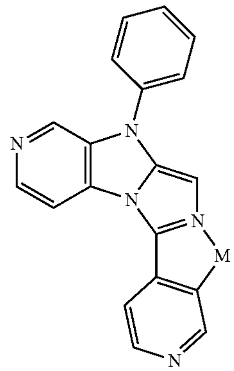
L1453
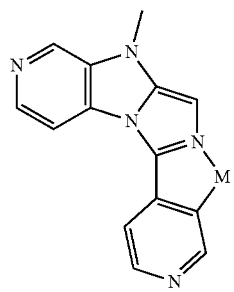
L1454
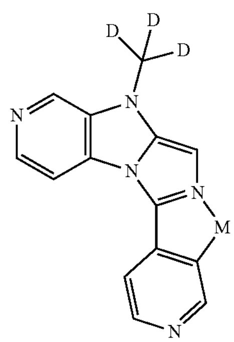
L1455
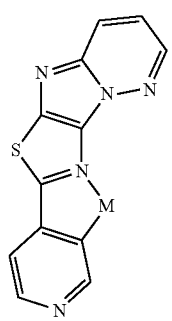
L1456
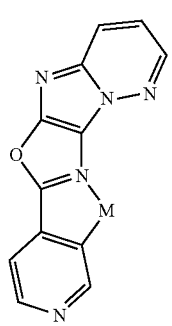
L1457
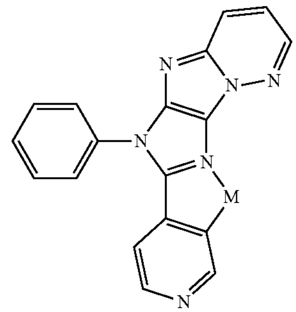
L1458
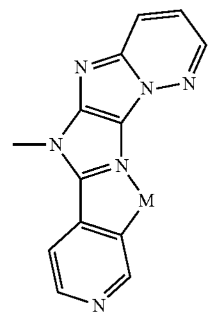
L1459
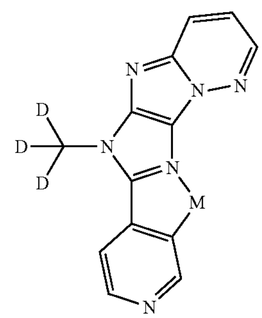
L1460
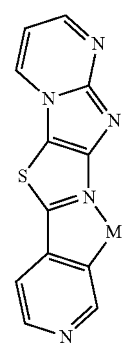
L1461
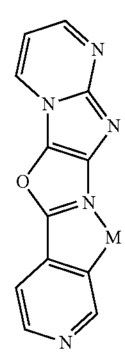

L1462
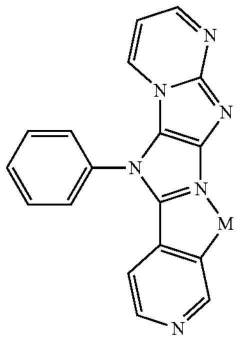
L1463
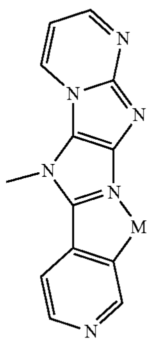
L1464
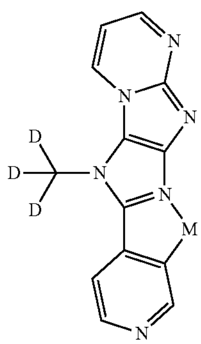
L1465
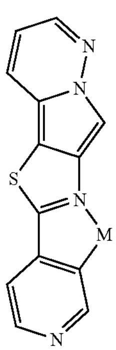
L1466
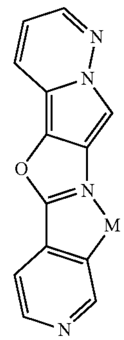
L1467
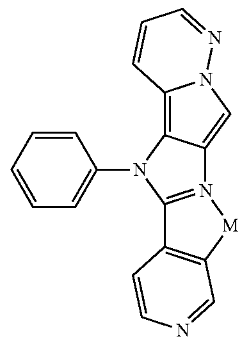
L1468
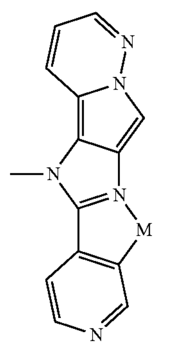
L1469
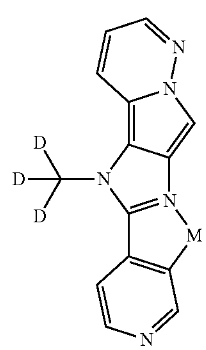

-continued
L1470
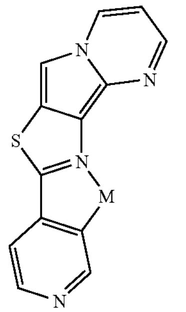
L1471
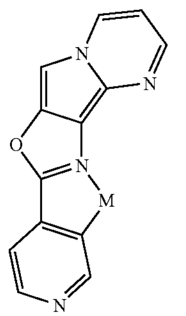
L1472
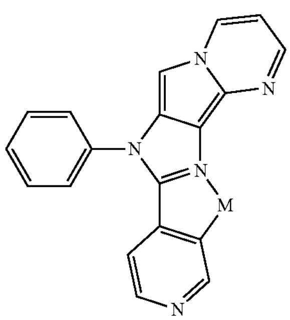
L1473
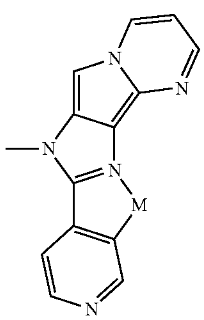
L1474
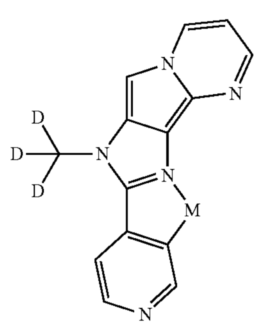
-continued
L1475
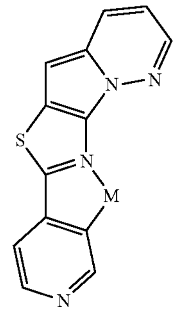
L1476
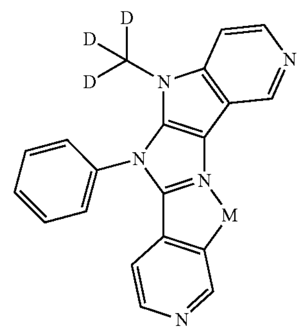
L1477
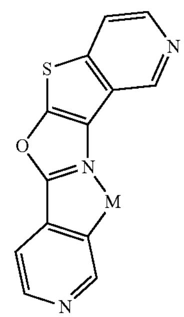
L1478
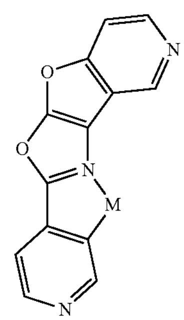
L1479
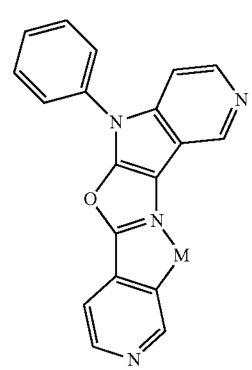

L1480
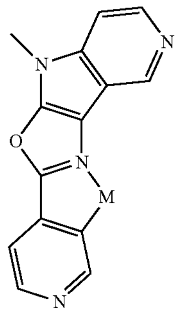
L1481
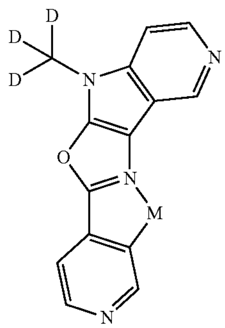
L1482
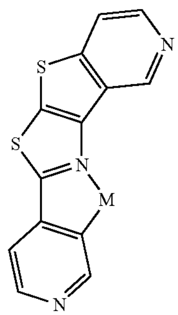
L1483
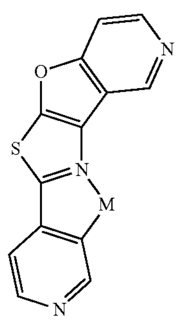
L1484
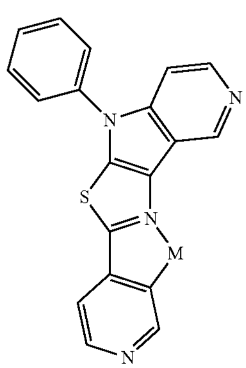
L1485
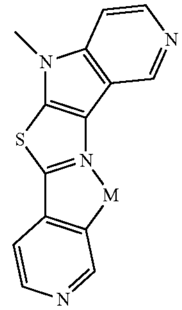
L1486
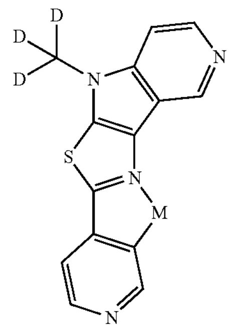
L1487
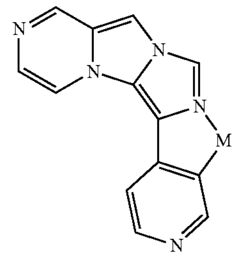
L1488
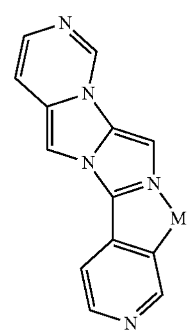
L1489
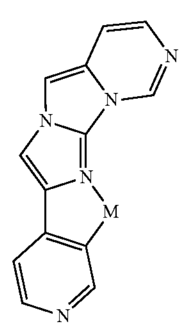

-continued
L1490
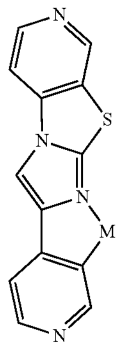
L1491
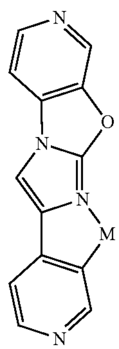
L1492
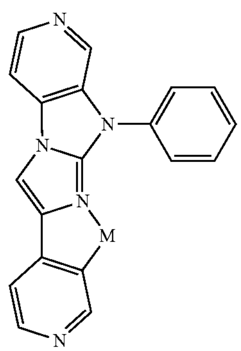
L1493
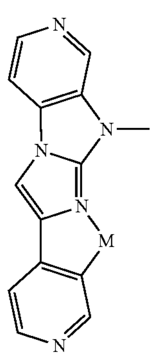
L1494
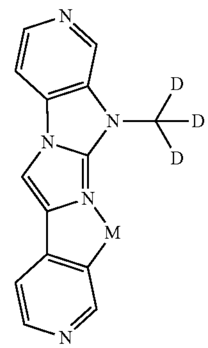
L1495
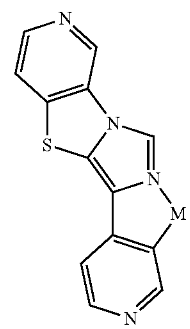
L1496
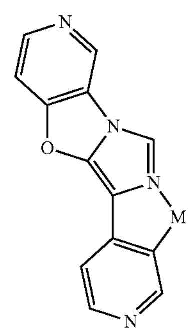
L1497
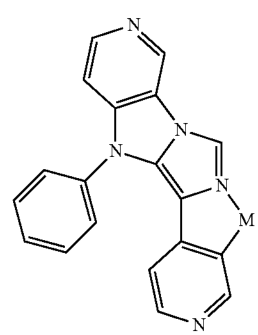

-continued
L1498
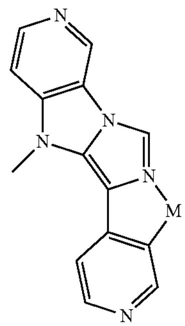
L1499
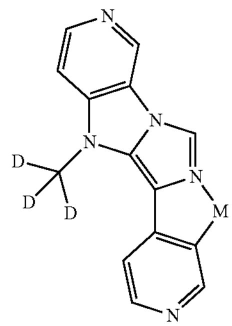
L1500
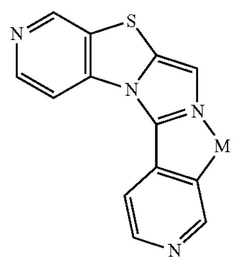
L1501
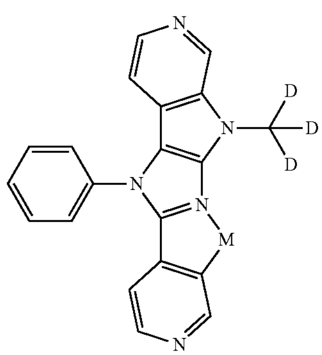
L1502
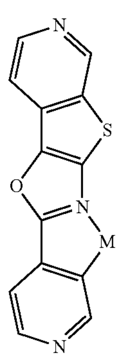
-continued
L1503
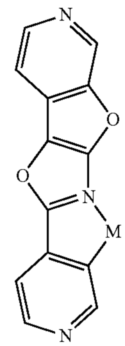
L1504
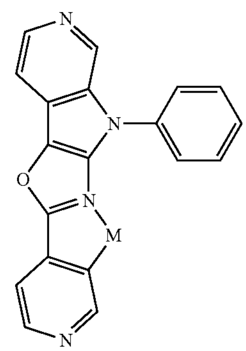
L1505
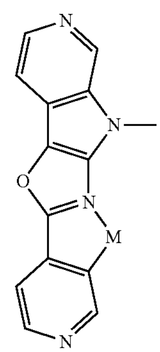
L1506
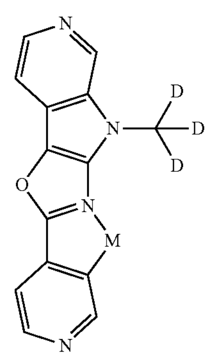

-continued
L1507
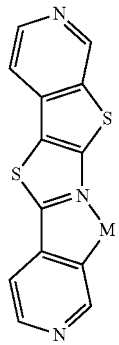
L1508
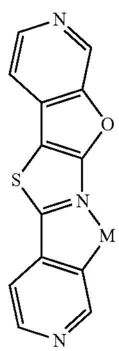
L1509
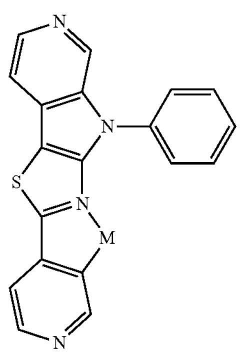
L1510
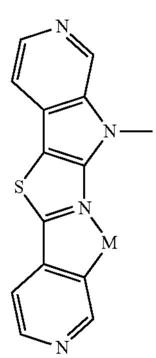
-continued
L1511
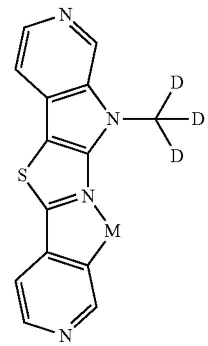
L1512
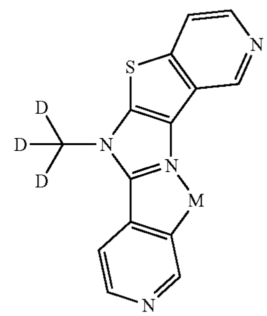
L1513
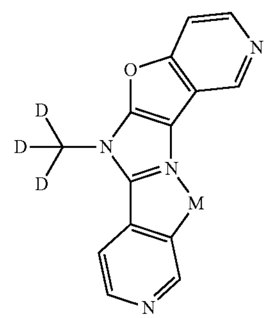
L1514
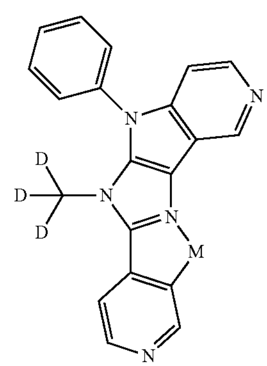

-continued
L1515
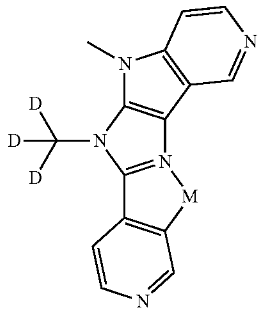
L1516
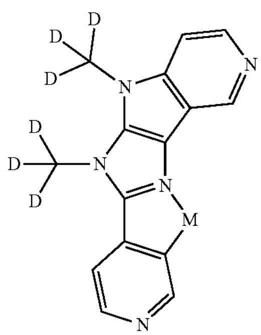
L1517
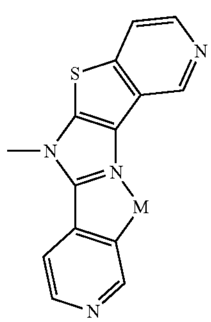
L1518
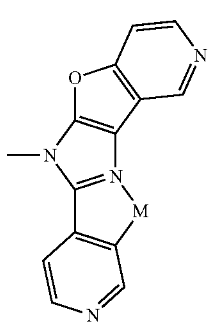
-continued
L1519
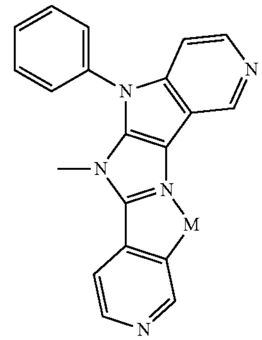
L1520
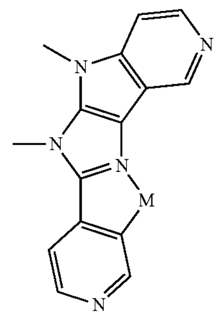
L1521
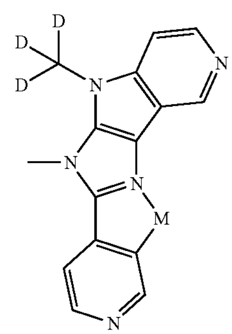
L1522
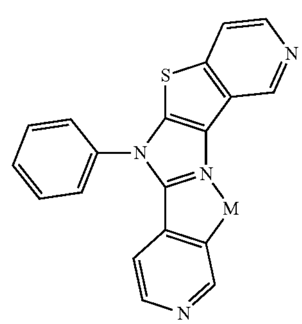
L1523
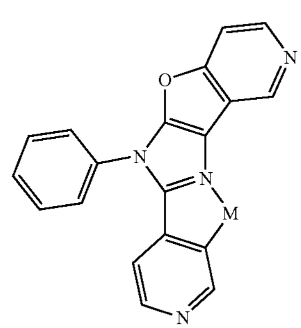

L1524
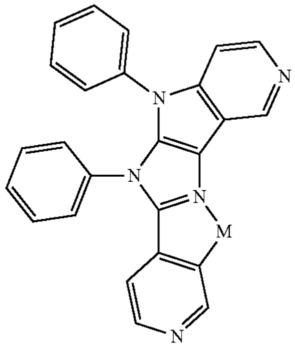
L1525
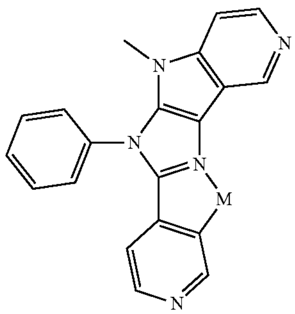
L1526
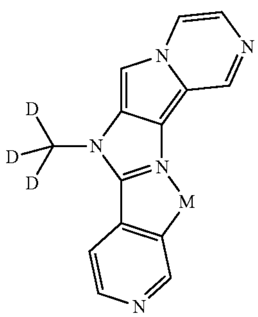
L1527
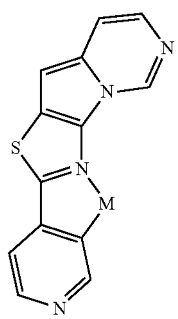
L1528
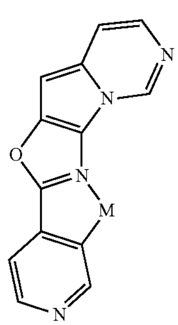
L1529
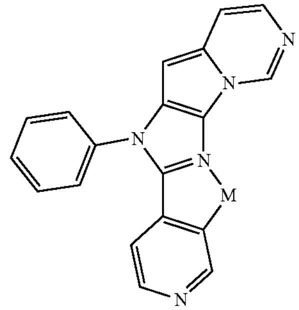
L1530
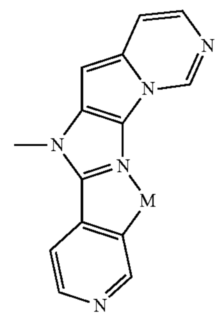
L1531
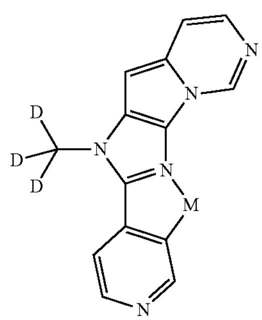
L1532
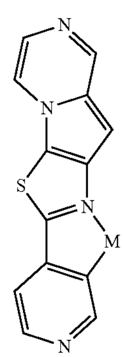
L1533
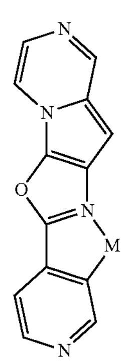

-continued
L1534
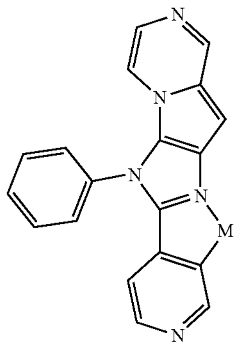
L1535
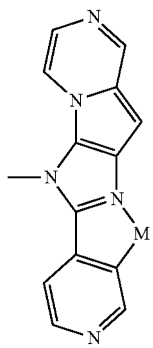
L1536
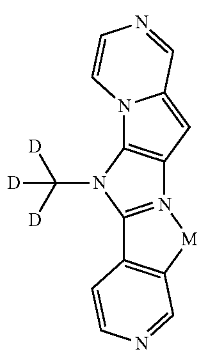
L1537
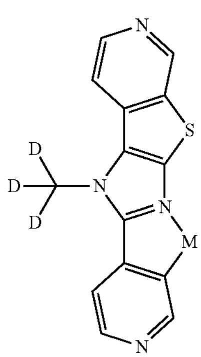
-continued
L1538
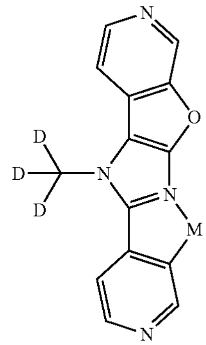
L1539
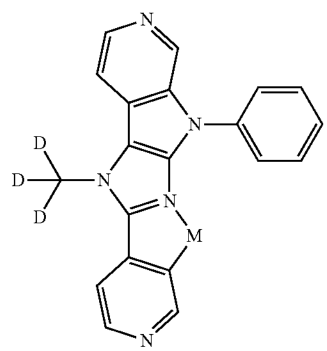
L1540
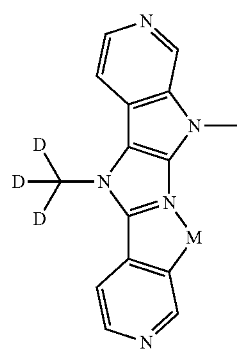
L1541
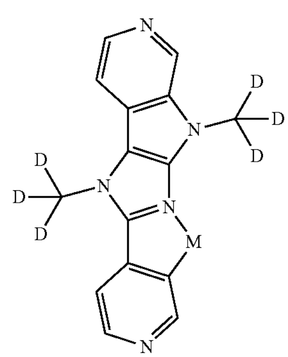

-continued
L1542
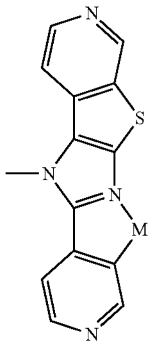
L1543
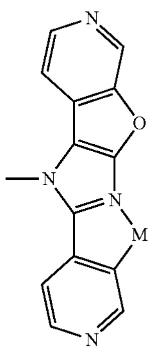
L1544
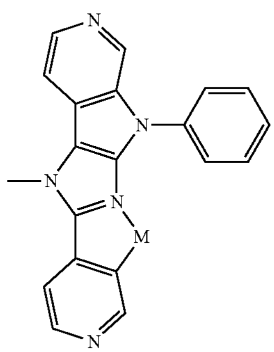
L1545
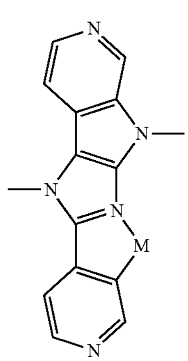
-continued
L1546
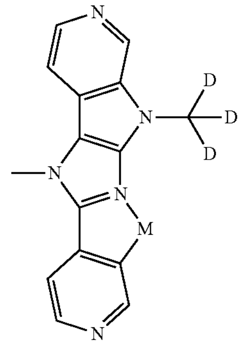
L1547
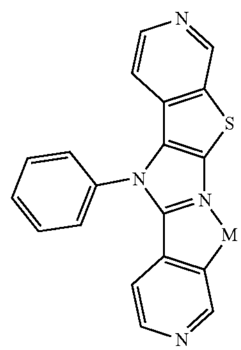
L1548
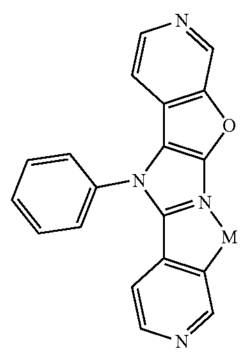
L1549
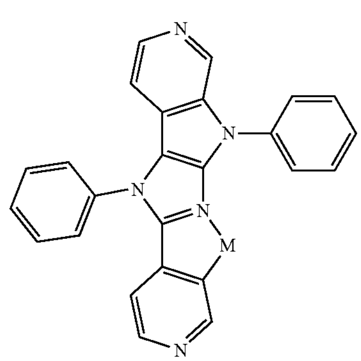

-continued
L1550
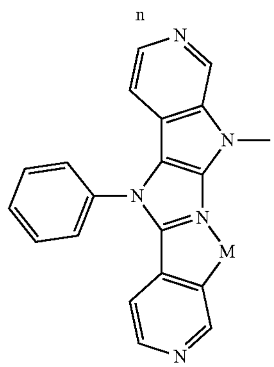
L1551
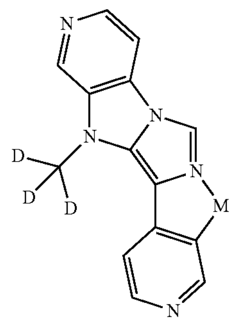
L1552
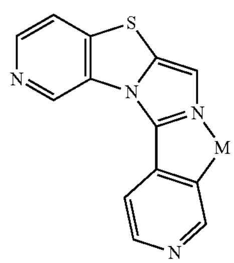
L1553
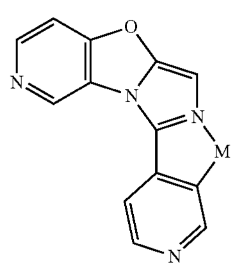
L1554
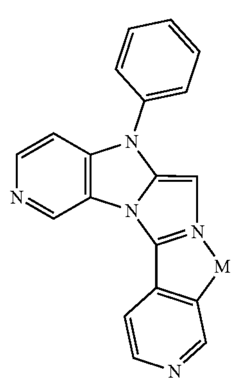
-continued
L1555
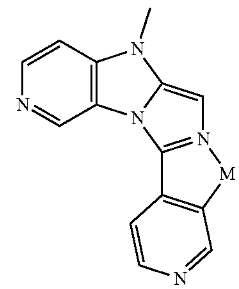
L1556
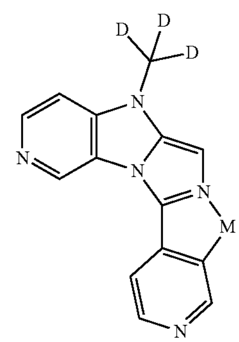
L1557
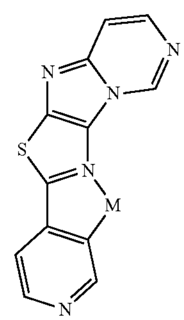
L1558
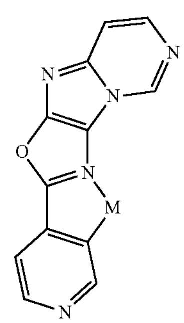
L1559
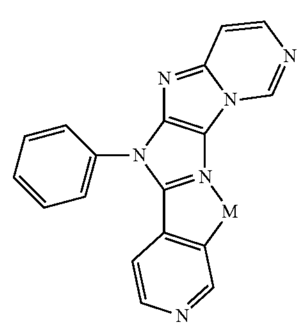

L1560
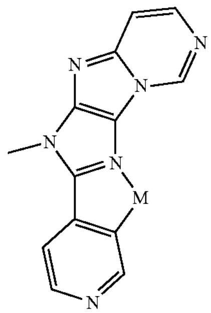
L1561
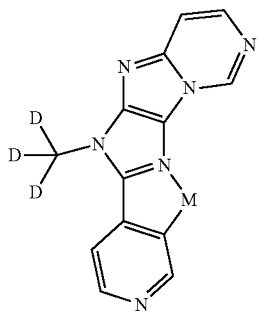
L1562
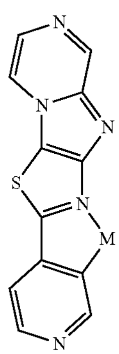
L1563
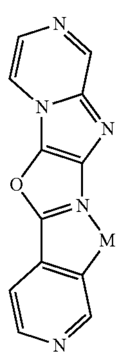
L1564
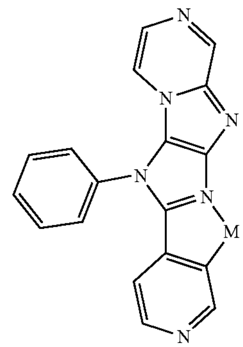
L1565
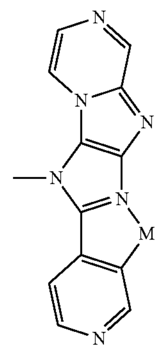
L1566
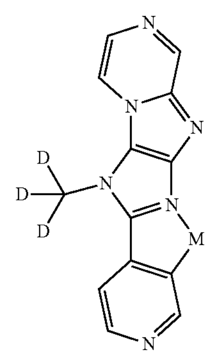
L1567
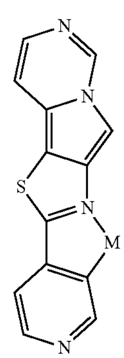

-continued
L1568
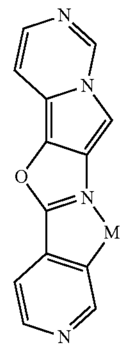
L1569
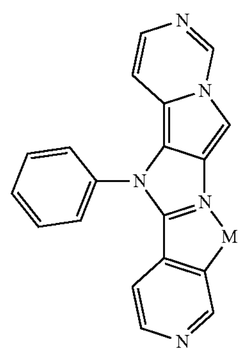
L1570
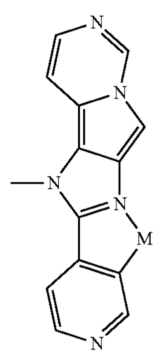
L1571
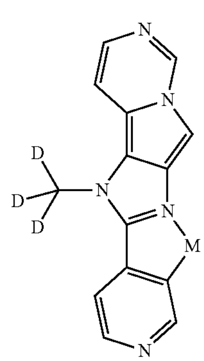
-continued
L1572
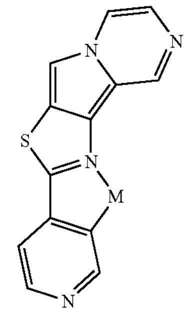
L1573
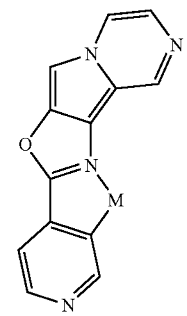
L1574
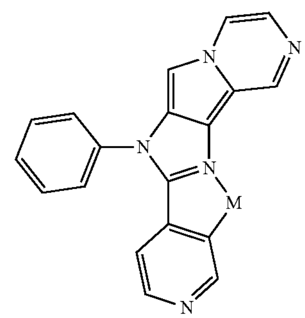
L1575
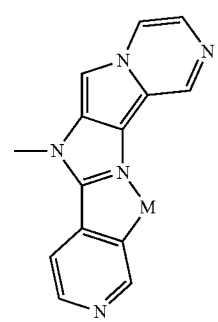
L1576
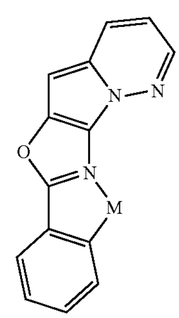

-continued
L1577
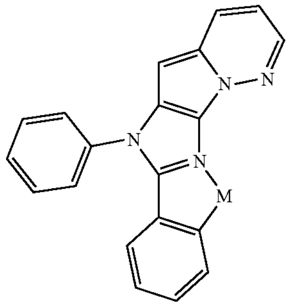
L1578
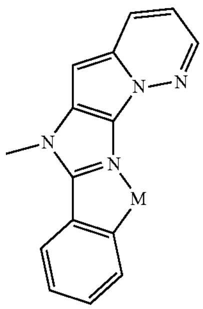
L1579
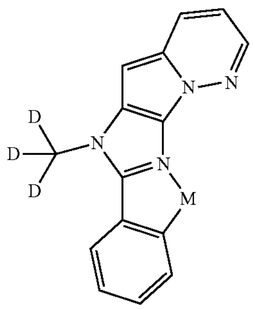
L1580
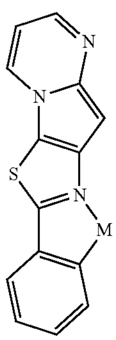
L1581
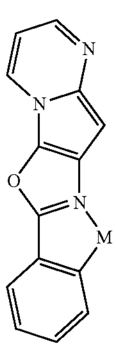
-continued
L1582
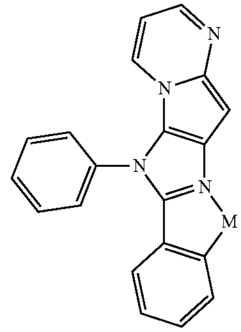
L1583
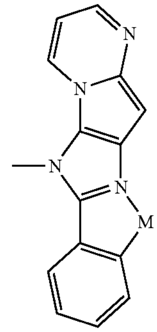
L1584
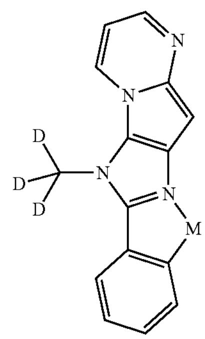
L1585
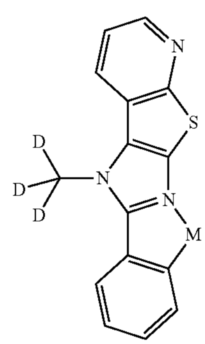

-continued
L1586
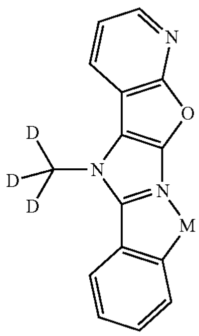
L1587
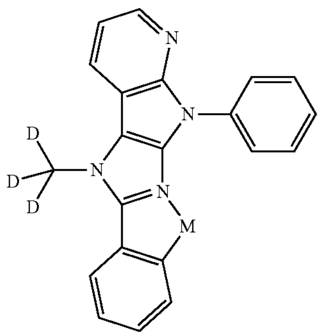
L1588
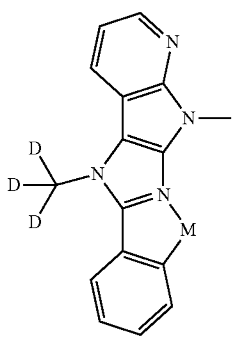
L1589
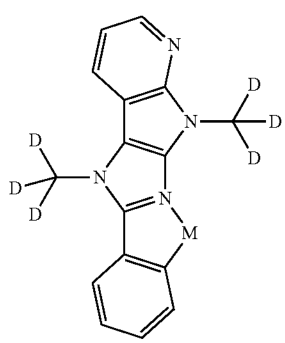
-continued
L1590
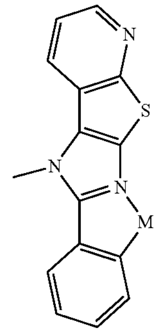
L1591
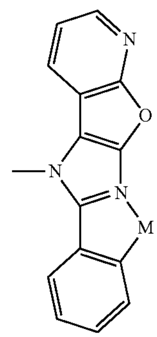
L1592
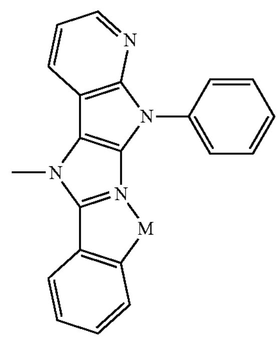
L1593
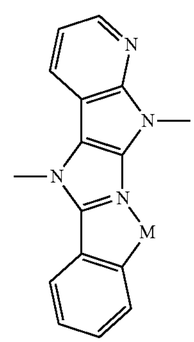

-continued
L1594
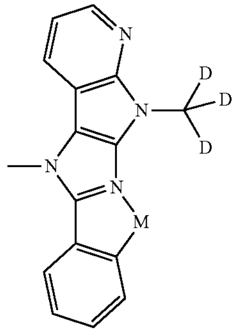
L1595
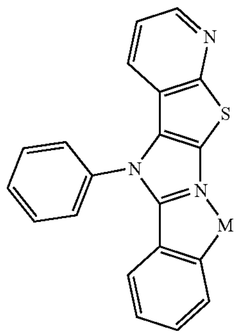
L1596
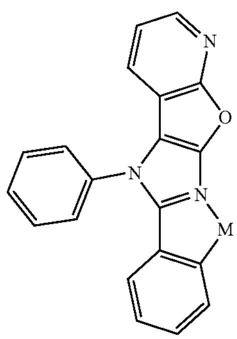
L1597
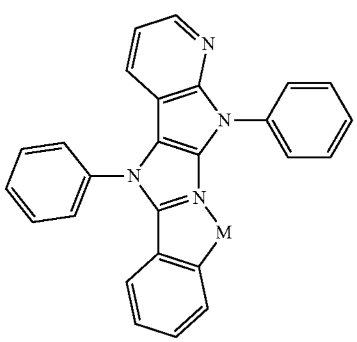
-continued
L1598
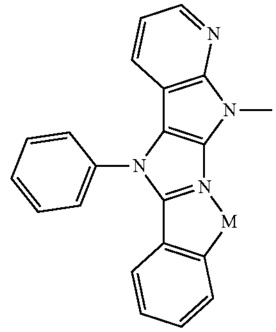
L1599
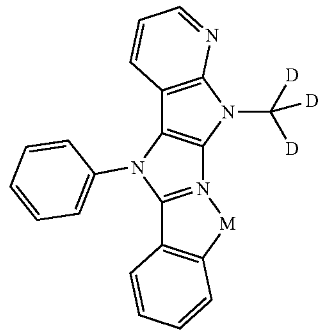
L1600
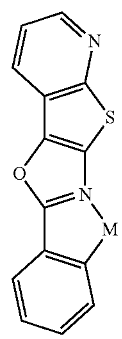
L1601
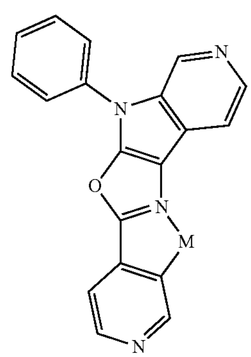

-continued
L1602
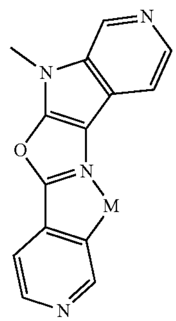
L1603
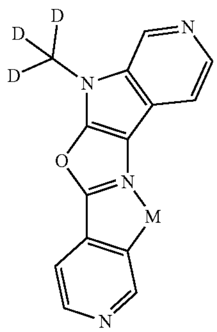
L1604
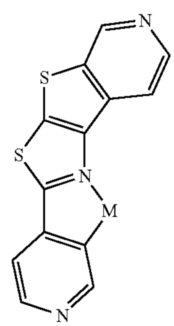
L1605
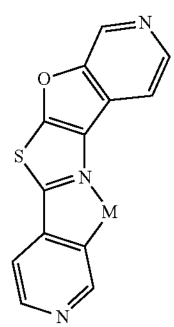
L1606
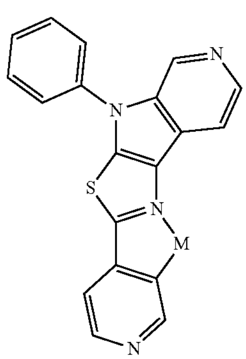
-continued
L1607
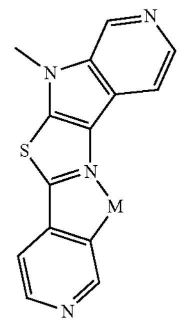
L1608
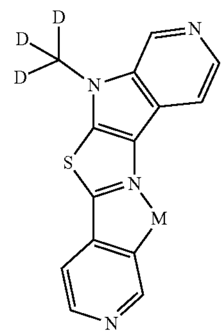
L1609
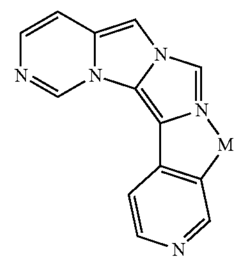
L1610
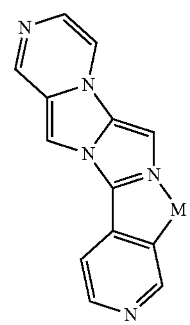
L1611
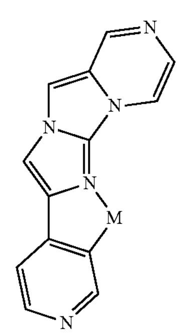

L1612
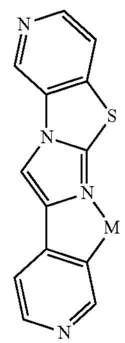
L1613
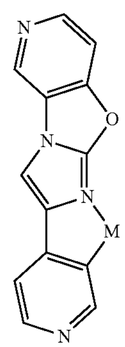
L1614
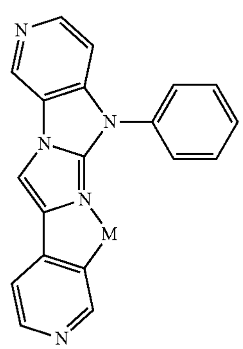
L1615
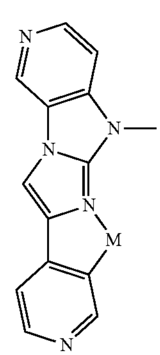
L1616
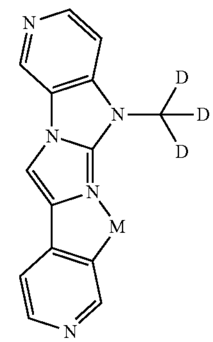
L1617
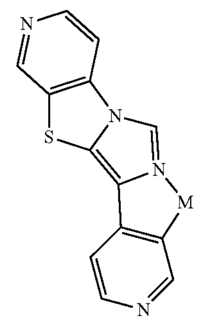
L1618
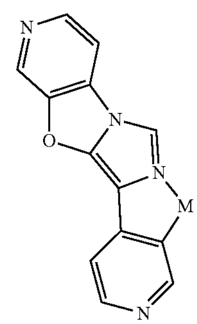
L1619
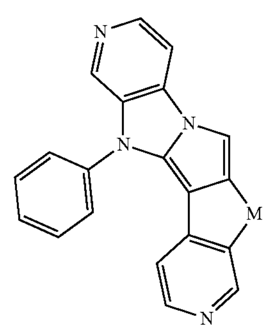
L1620
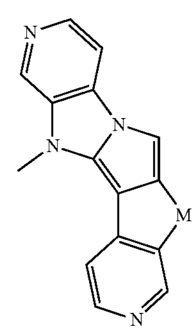

-continued
L1621
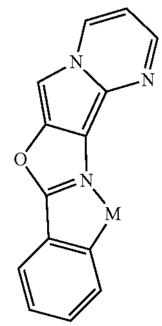
L1622
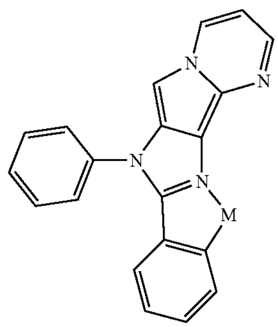
L1623
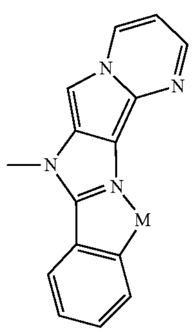
L1624
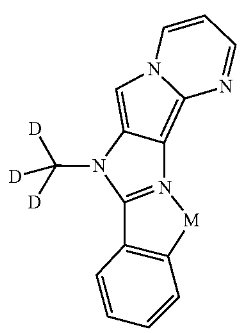
L1625
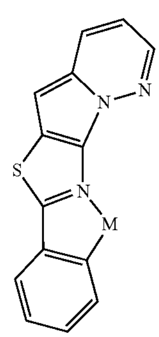
-continued
L1626
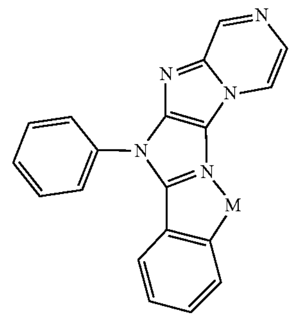
L1627
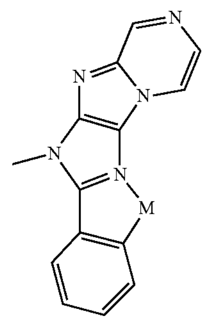
L1628
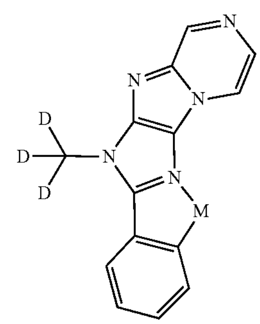
L1629
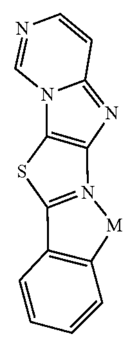
L1630
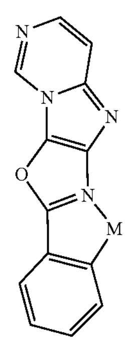

-continued
L1631
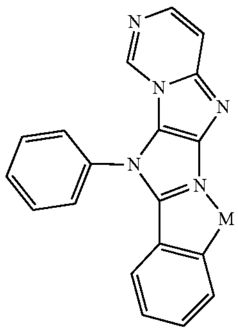
L1632
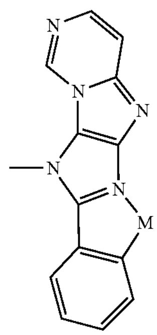
L1633
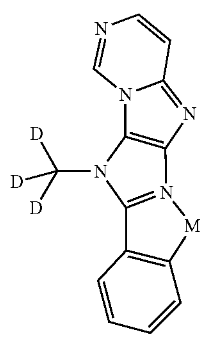
L1634
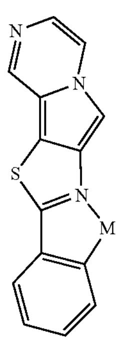
-continued
L1635
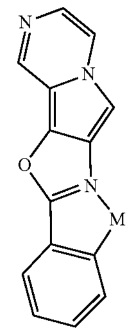
L1636
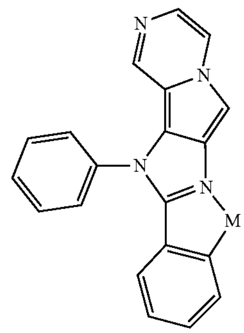
L1637
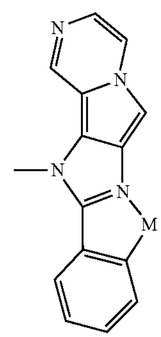
L1638
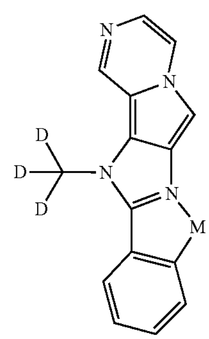
L1639
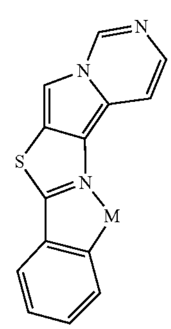

-continued
L1640
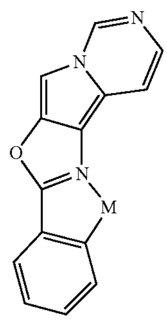
L1641
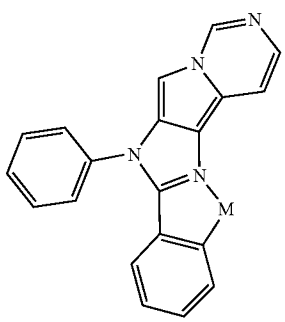
L1642
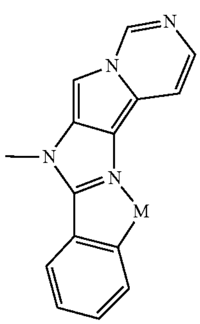
L1643
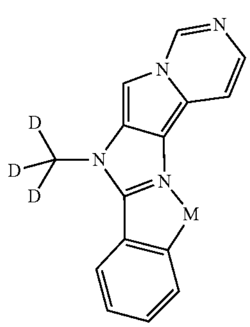
L1644
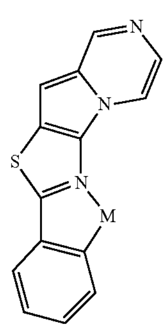
-continued
L1645
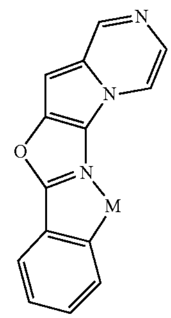
L1646
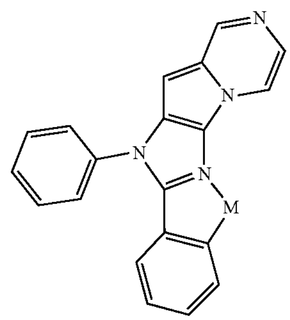
L1647
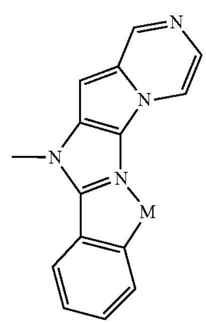
L1648
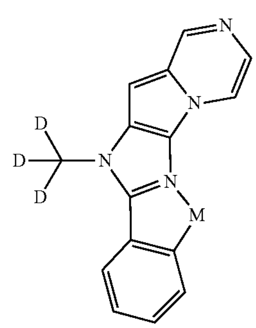
L1649
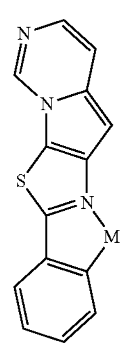

-continued
L1650
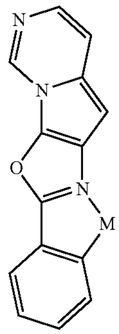
L1651
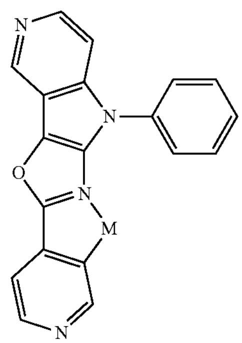
L1652
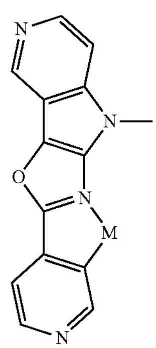
L1653
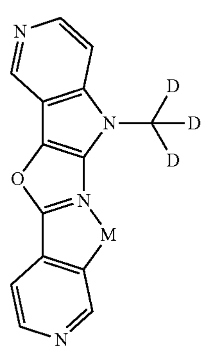
-continued
L1654
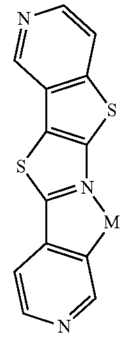
L1655
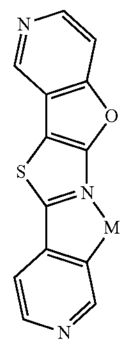
L1656
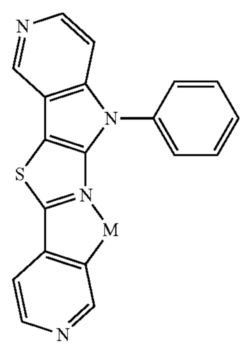
L1657
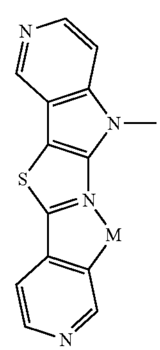

L1658
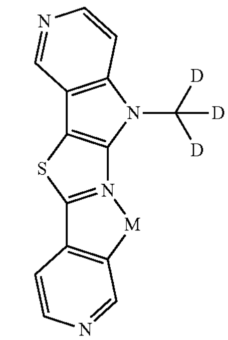
L1659
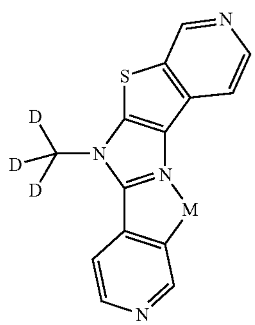
L1660
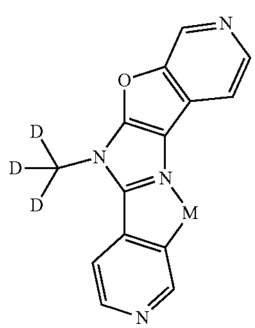
L1661
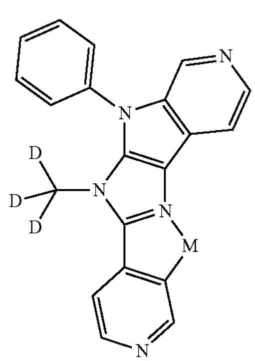
L1662
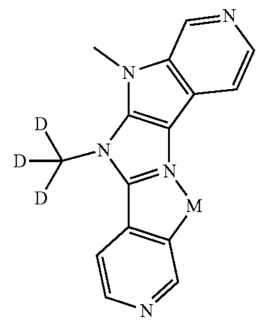
L1663
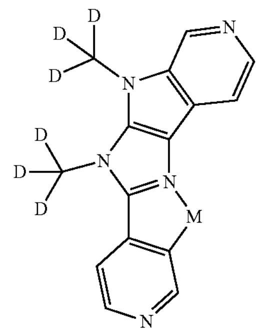
L1664
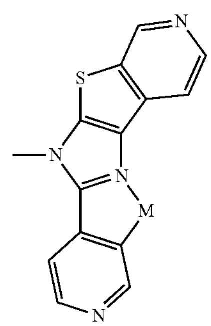
L1665
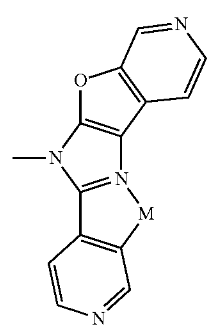
L1666
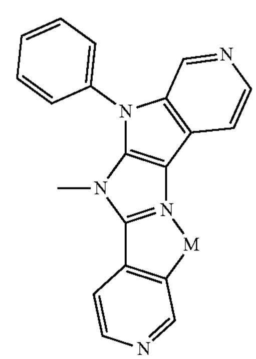

-continued
L1667
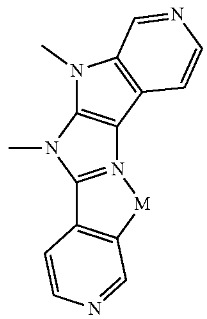
L1668
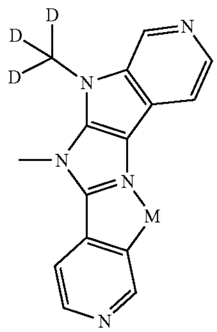
L1669
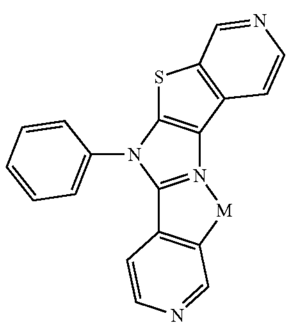
L1670
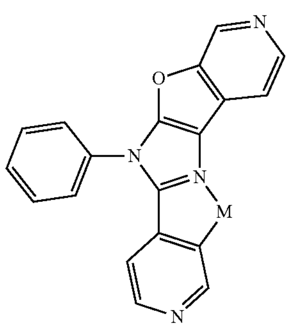
L1671
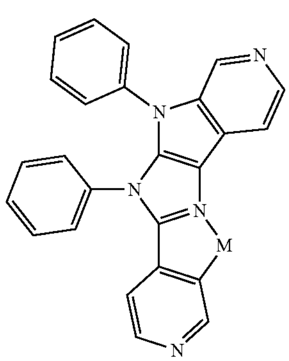
-continued
L1672
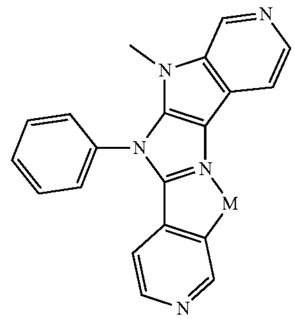
L1673
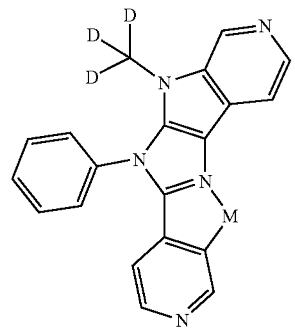
L1674
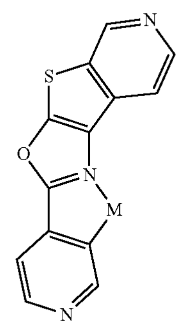
L1675
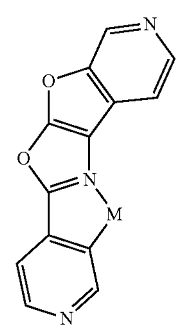
L1676
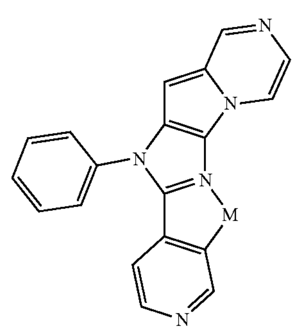

L1677
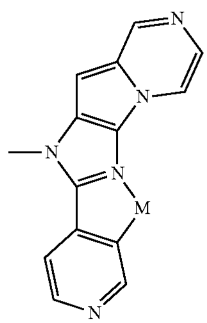
L1678
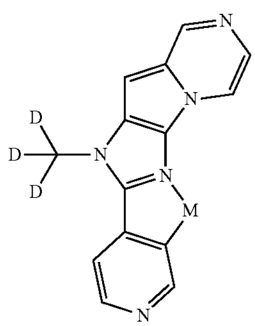
L1679
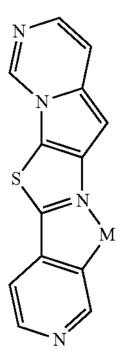
L1680
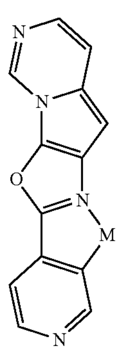
L1681
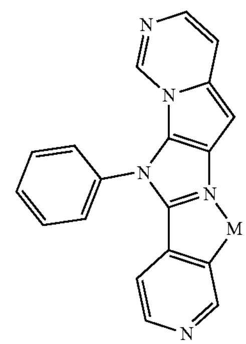
L1682
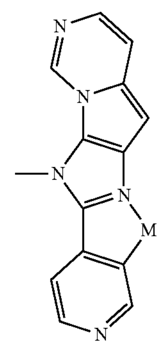
L1683
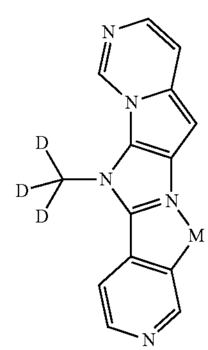
L1684
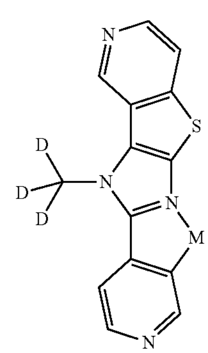

-continued
L1685
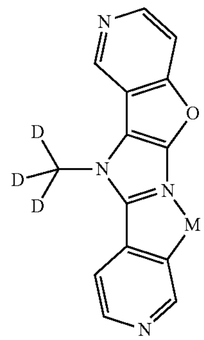
L1686
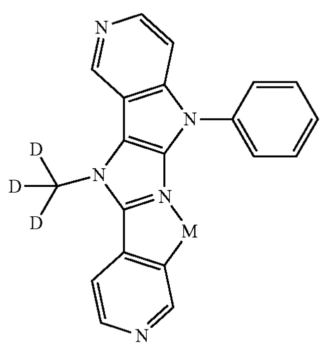
L1687
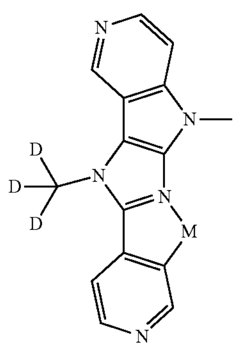
L1688
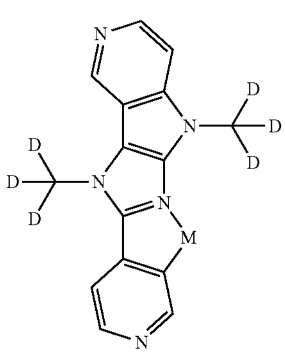
-continued
L1689
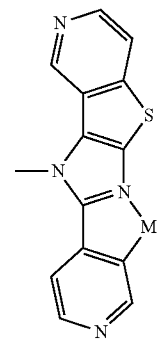
L1690
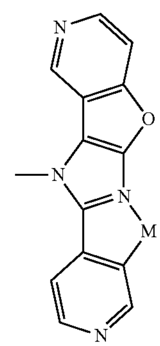
L1691
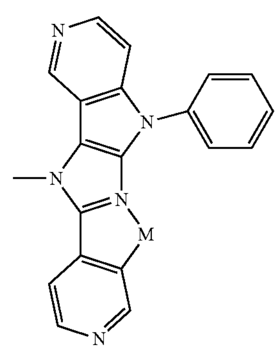
L1692
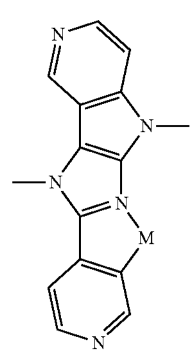

L1693
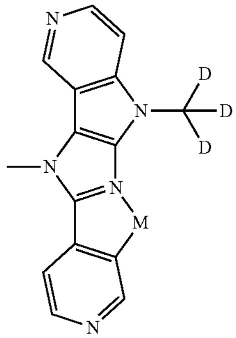
L1694
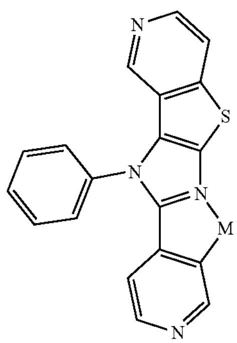
L1695
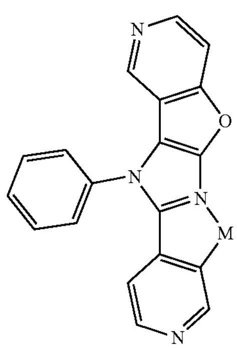
L1696
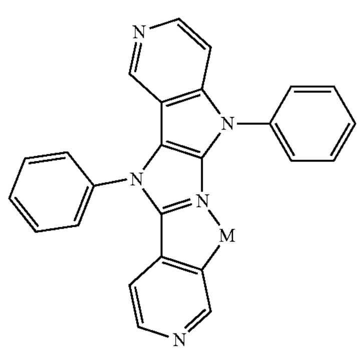
L1697
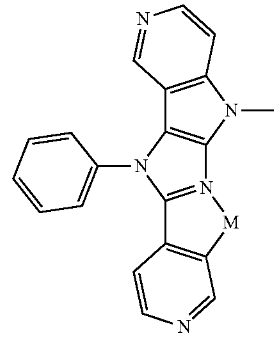
L1698
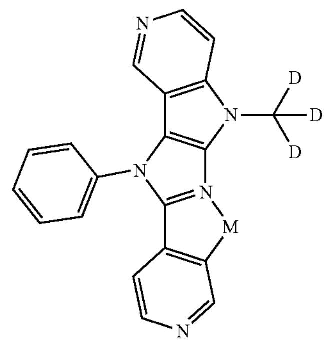
L1699
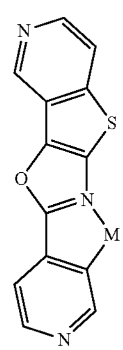
L1700
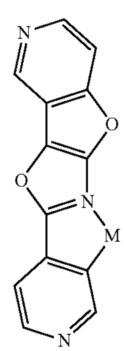

-continued
L1701
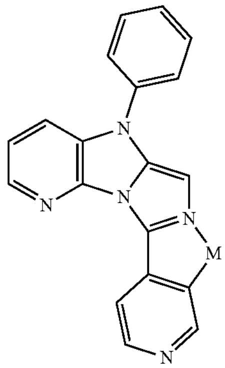
L1702
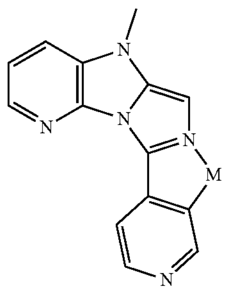
L1703
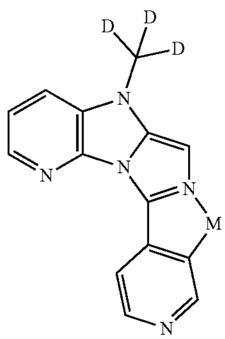
L1704
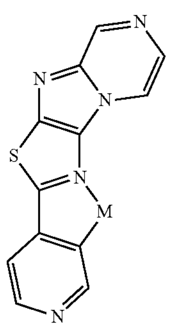
L1705
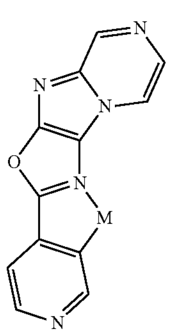
-continued
L1706
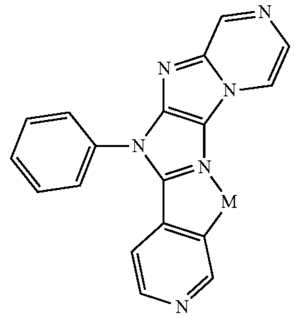
L1707
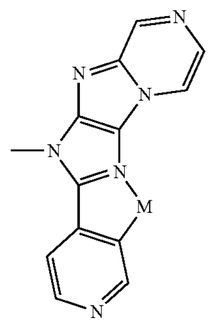
L1708
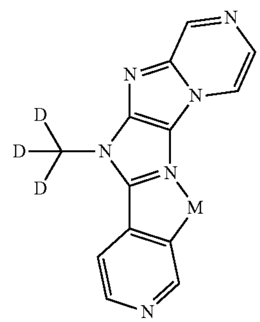
L1709
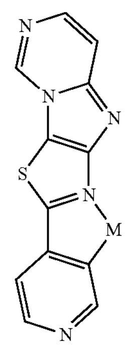
L1710
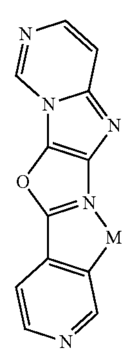

L1711
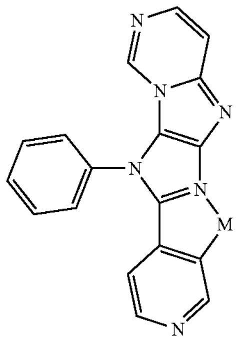
L1712
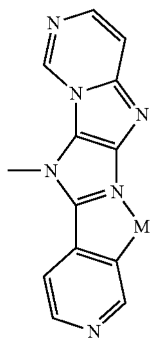
L1713
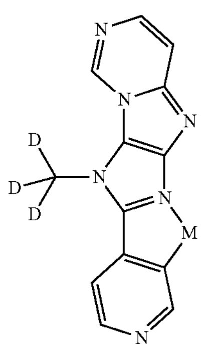
L1714
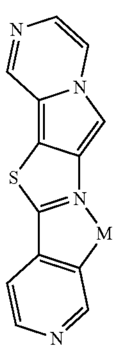
L1715
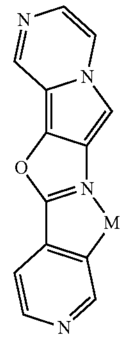
L1716
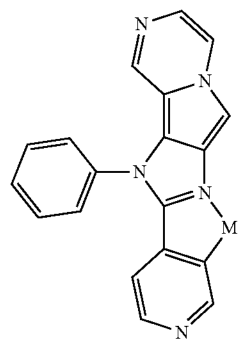
L1717
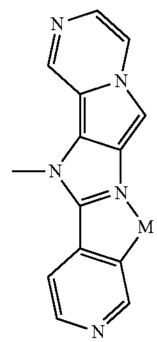
L1718
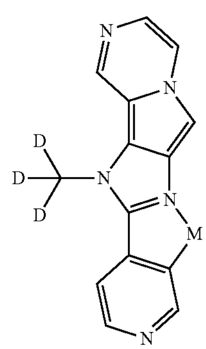

-continued
L1719
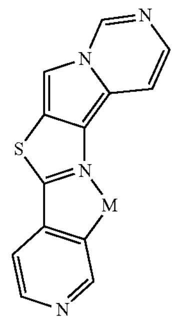
L1720
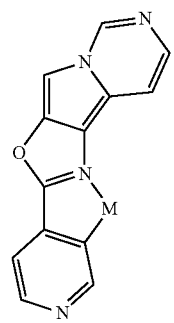
L1721
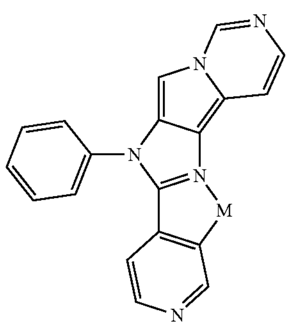
L1722
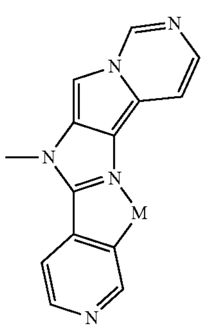
L1723
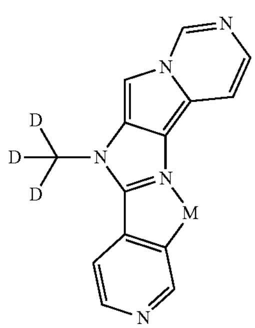
-continued
L1724
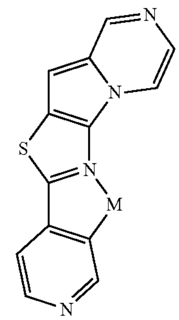
L1725
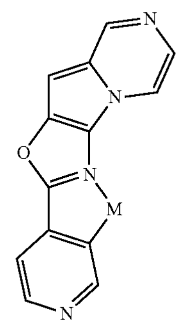
L1726
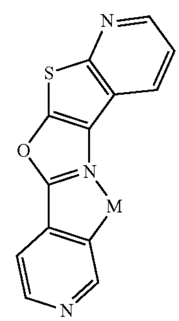
L1727
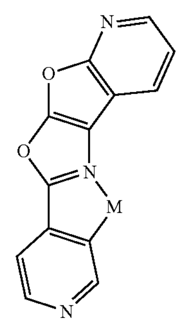
L1728
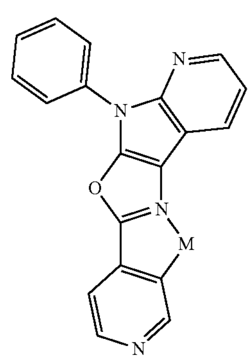

-continued
L1729
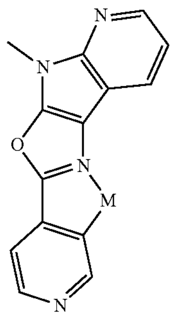
L1730
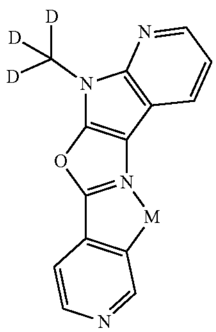
L1731
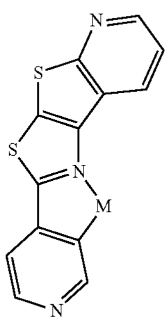
L1732
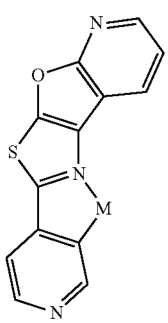
L1733
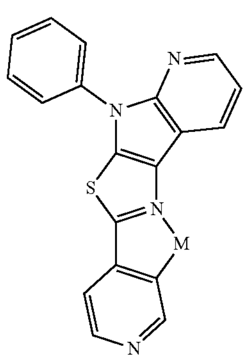
-continued
L1734
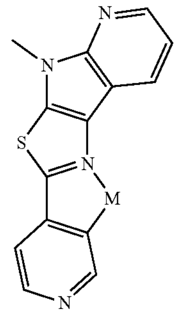
L1735
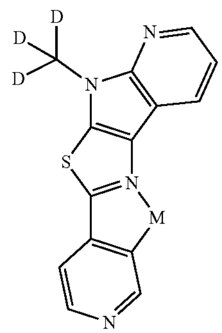
L1736
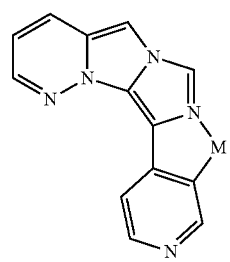
L1737
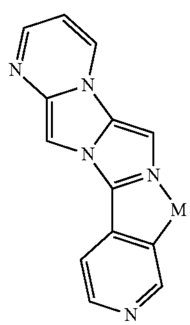
L1738
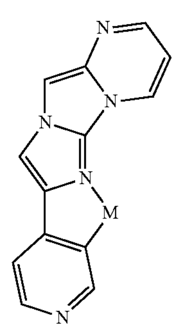

-continued
L1739
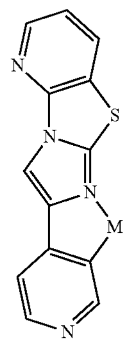
L1740
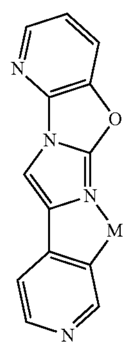
L1741
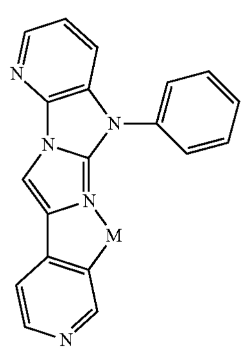
L1742
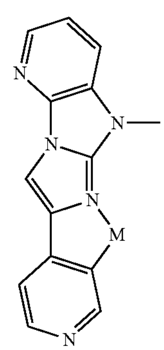
-continued
L1743
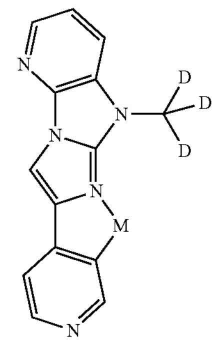
L1744
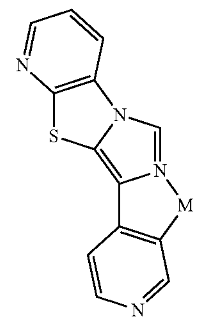
L1745
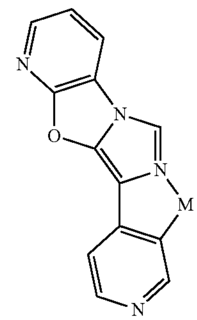
L1746
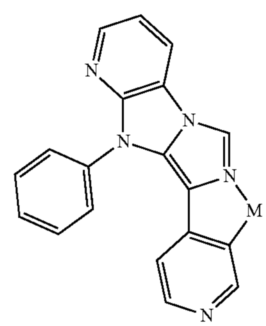
L1747
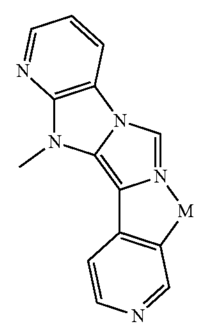

-continued
L1748
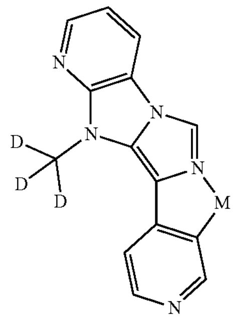
L1749
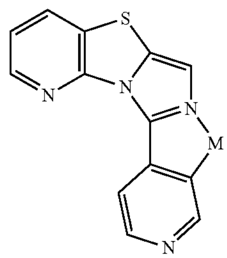
L1750
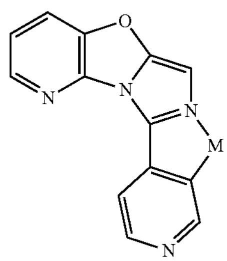
L1751
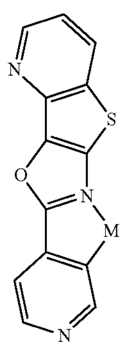
L1752
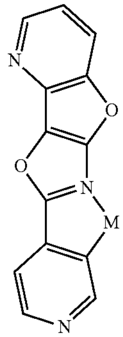
-continued
L1753
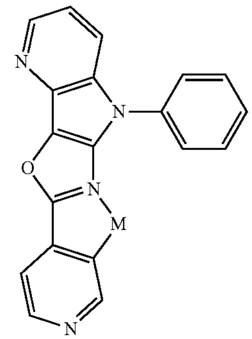
L1754
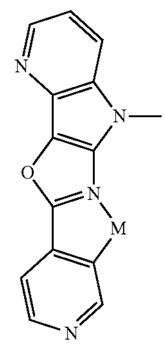
L1755
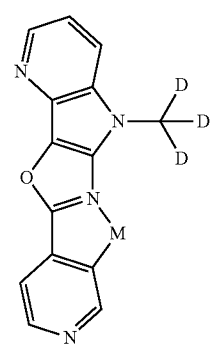
L1756
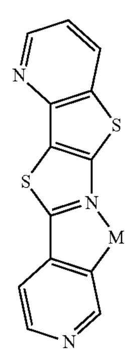

-continued
L1757
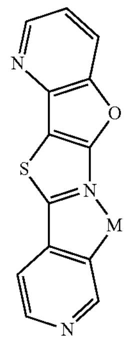
L1758
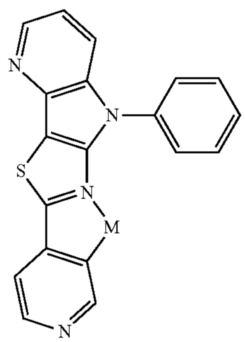
L1759
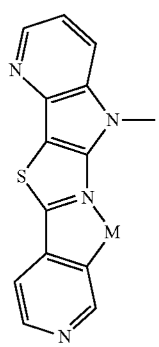
L1760
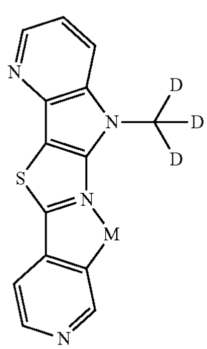
-continued
L1761
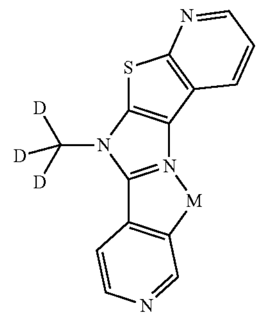
L1762
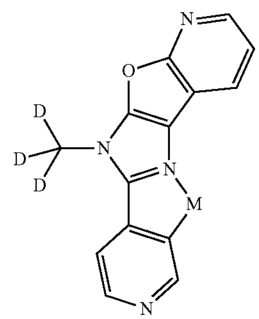
L1763
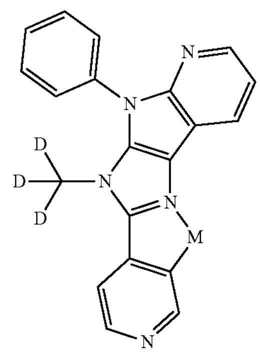
L1764
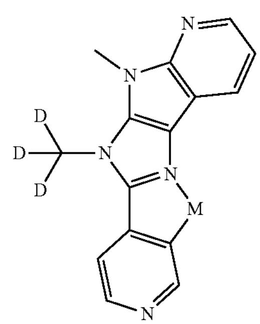
L1765
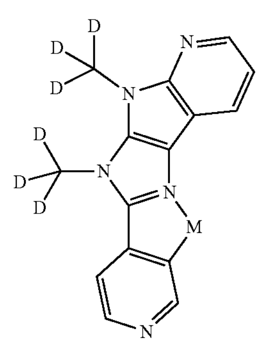

L1766
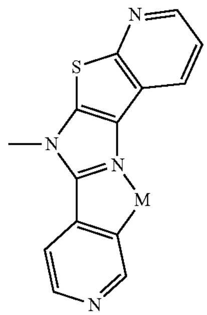
L1767
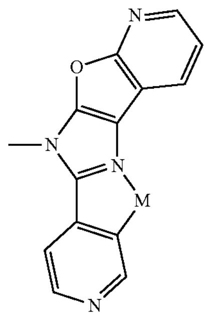
L1768
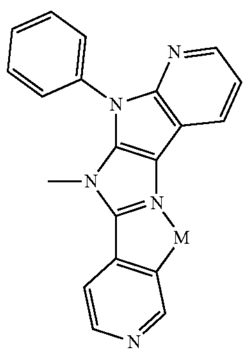
L1769
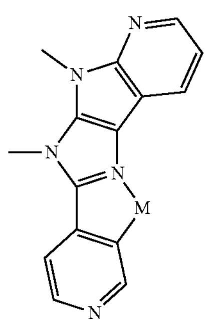
L1770
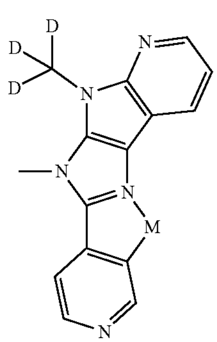
L1771
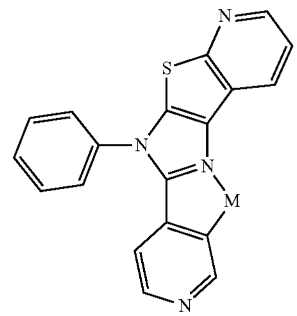
L1772
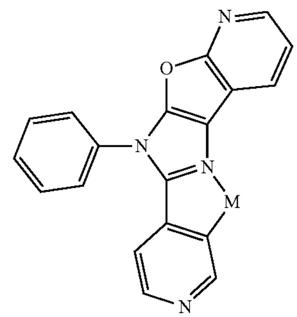
L1773
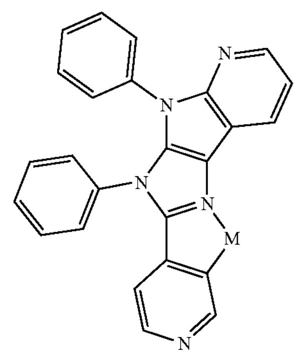
L1774
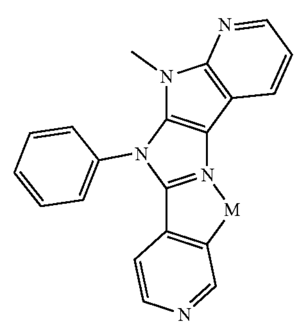
L1775
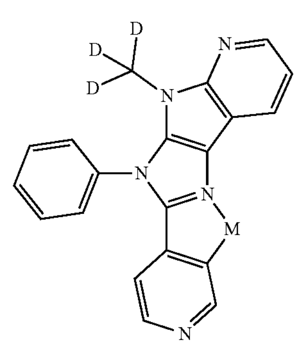

-continued
L1776
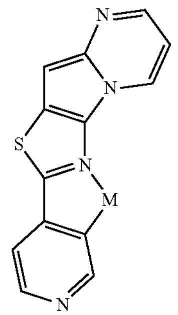
L1777
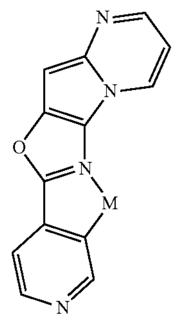
L1778
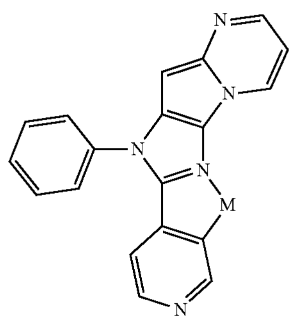
L1779
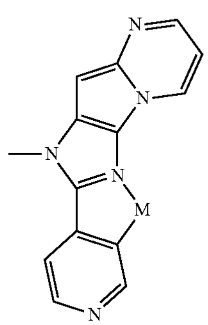
L1780
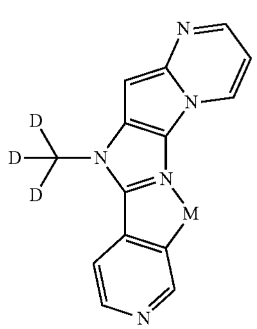
-continued
L1781
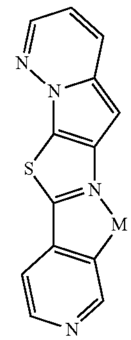
L1782
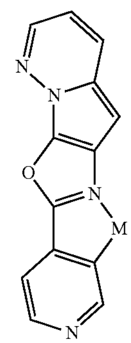
L1783
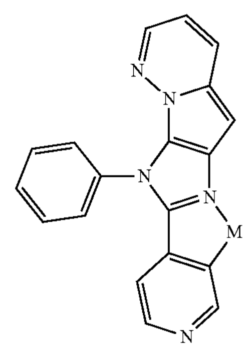
L1784
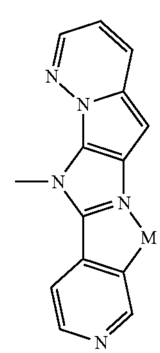

-continued
L1785
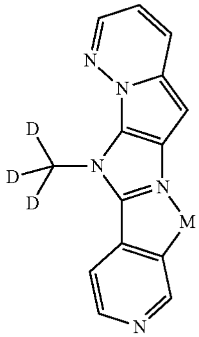
L1786
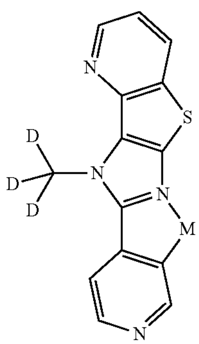
L1787
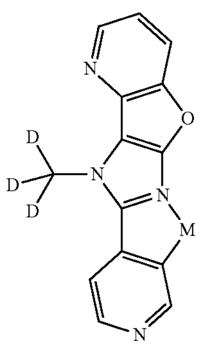
L1788
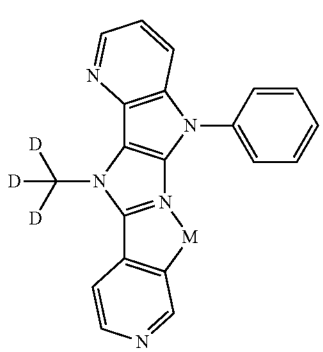
L1789
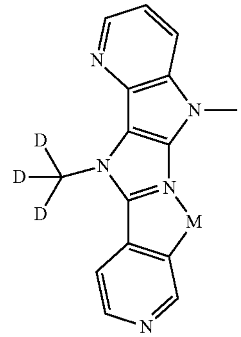
L1790
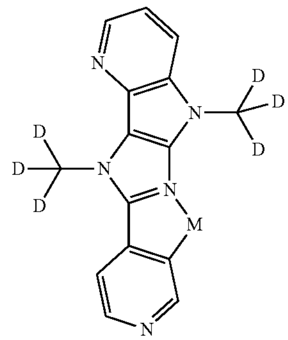
L1791
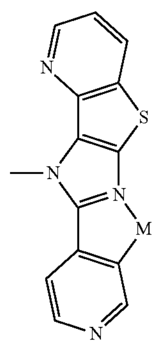
L1792
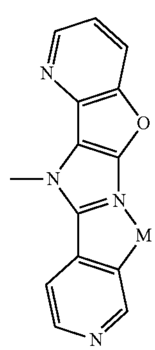

-continued
L1793
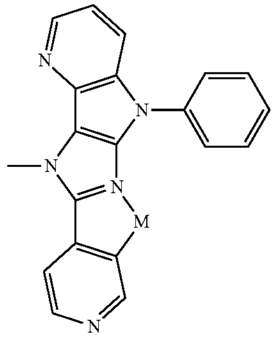
L1794
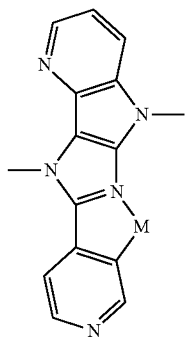
L1795
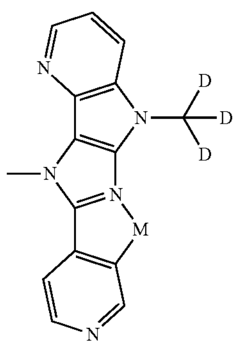
L1796
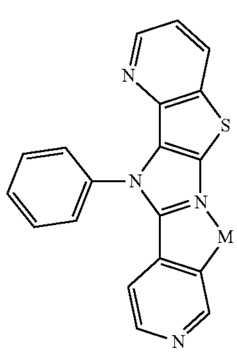
-continued
L1797
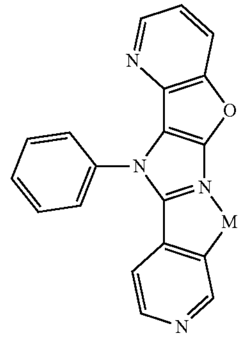
L1798
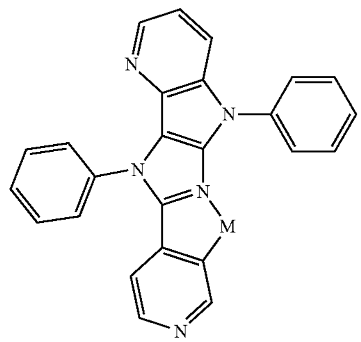
L1799
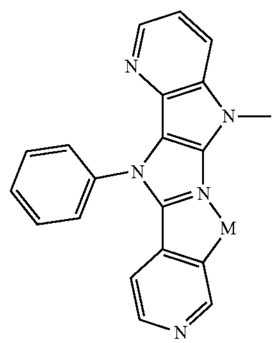
L1800
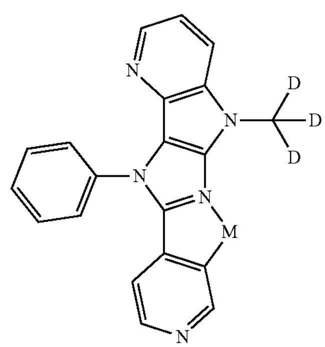
L1801
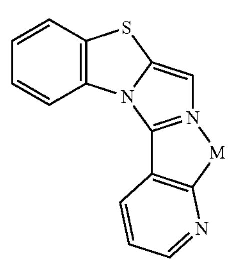

-continued
L1802
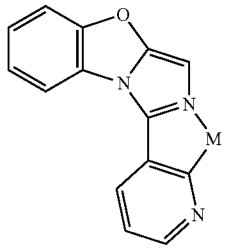
L1803
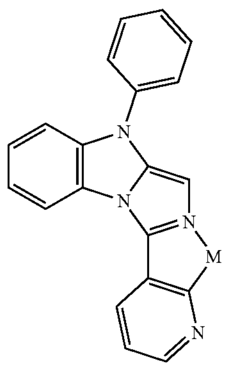
L1804
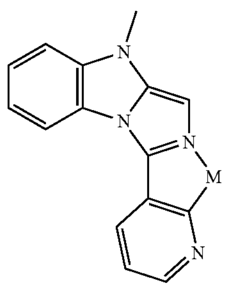
L1805
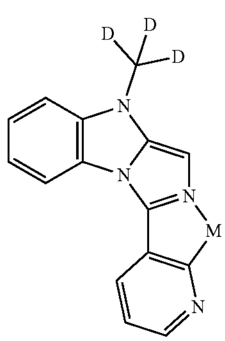
L1806
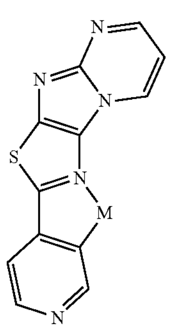
-continued
L1807
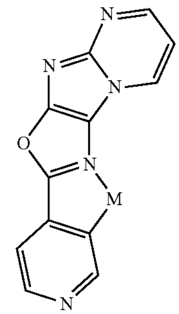
L1808
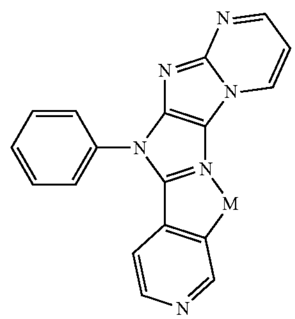
L1809
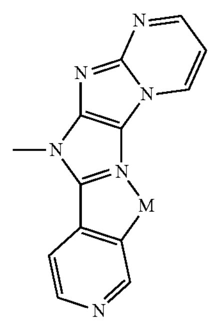
L1810
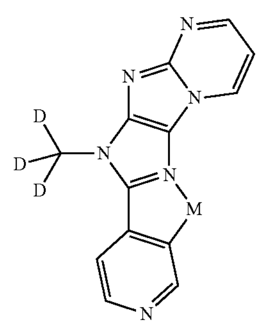
L1811
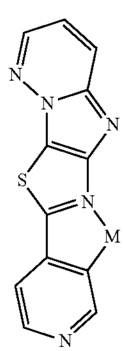

-continued
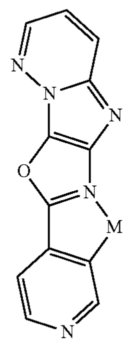
L1812
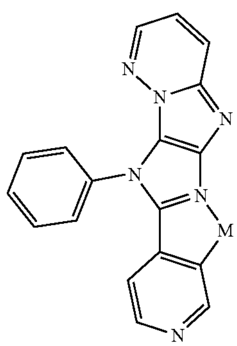
L1813
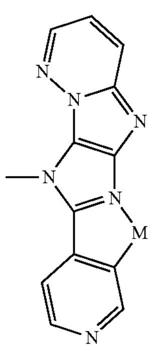
L1814
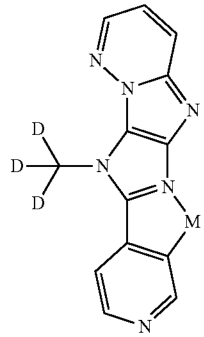
L1815
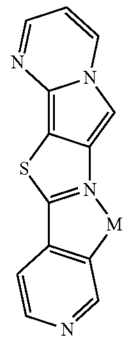
L1816
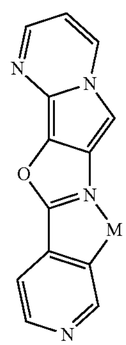
L1817
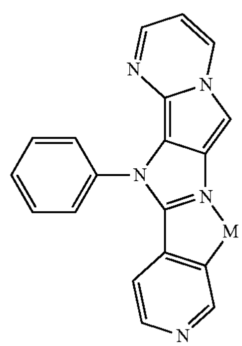
L1818
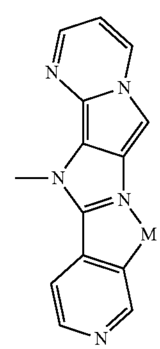
L1819

-continued
L1820
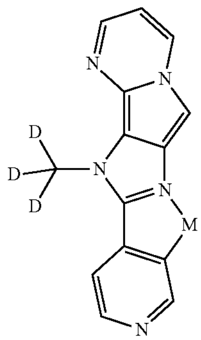
L1821
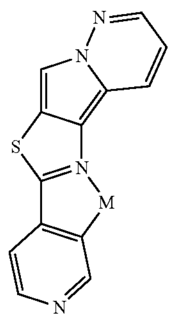
L1822
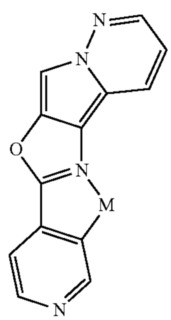
L1823
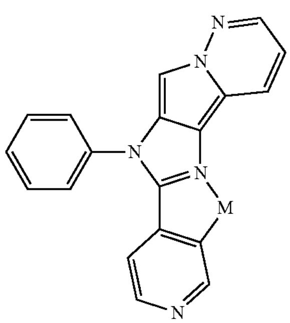
L1824
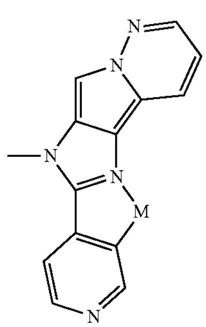
-continued
L1825
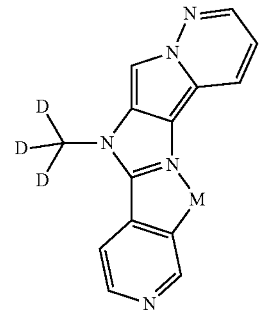
L1826
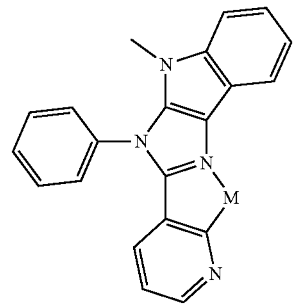
L1827
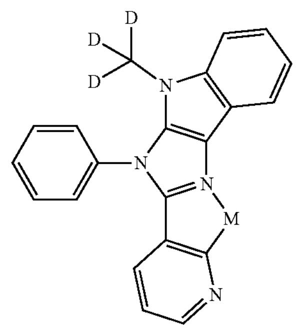
L1828
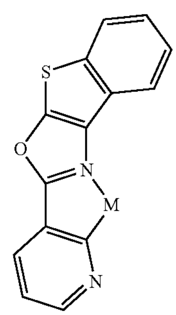
L1829
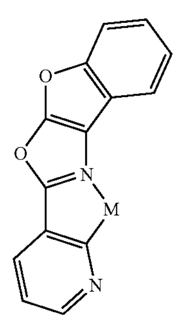

L1830
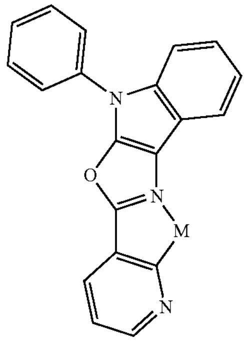
L1831
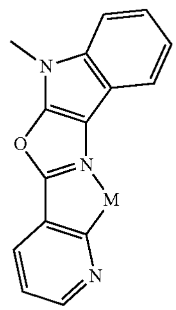
L1832
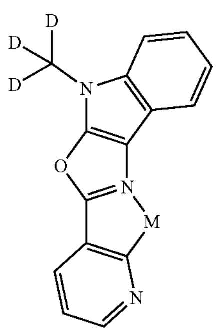
L1833
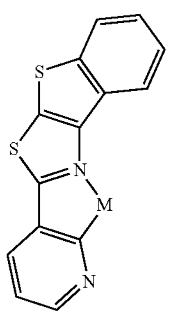
L1834
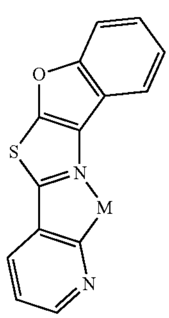
L1835
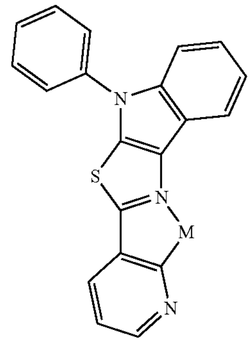
L1836
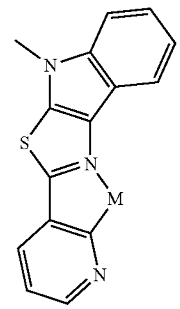
L1837
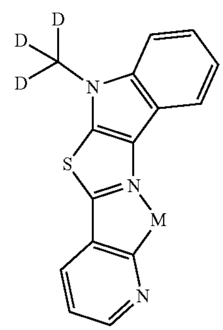
L1838
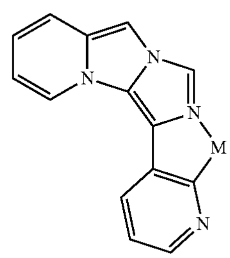
L1839
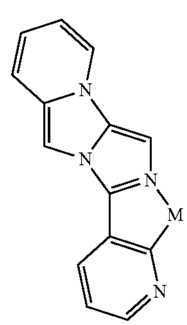

-continued
L1840
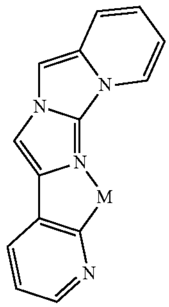
L1841
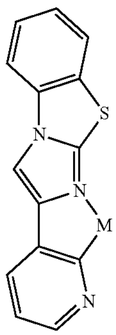
L1842
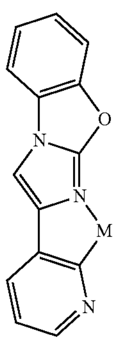
L1843
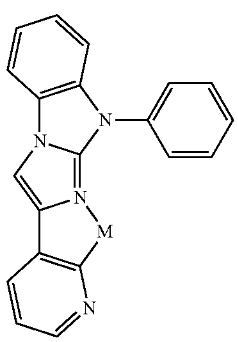
-continued
L1844
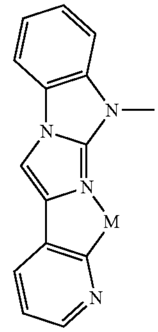
L1845
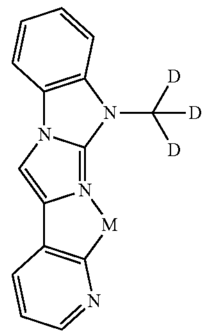
L1846
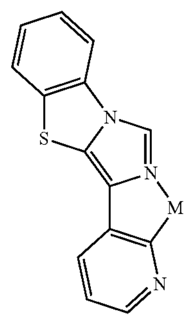
L1847
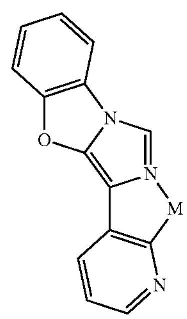
L1848
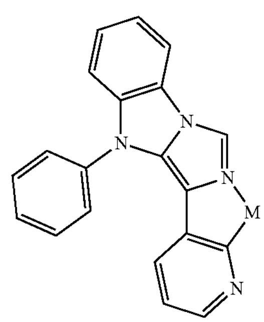

L1849
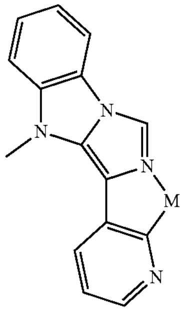
L1850
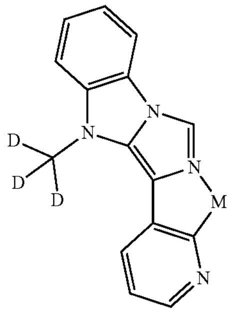
L1851
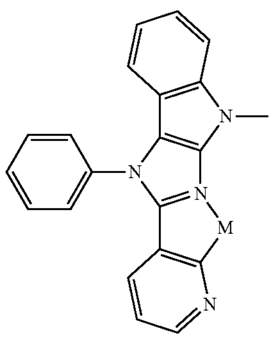
L1852
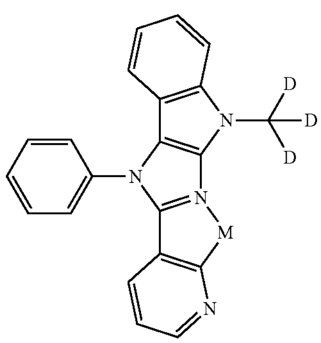
L1853
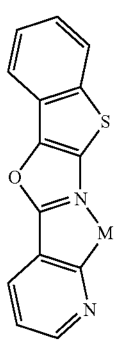
L1854
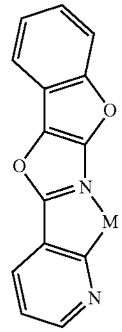
L1855
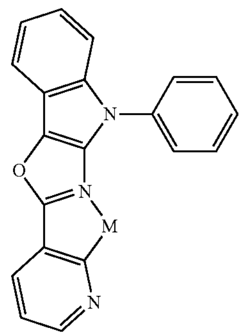
L1856
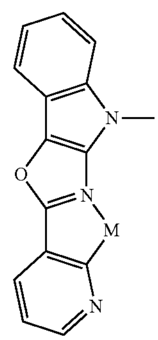
L1857
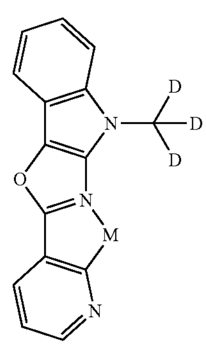

-continued
L1858
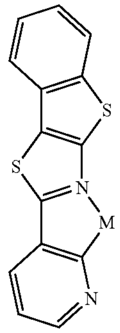
L1859
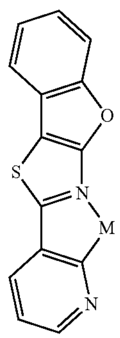
L1860
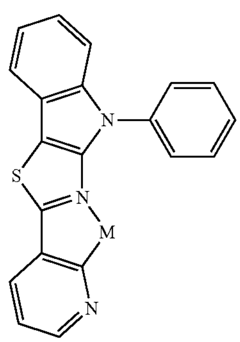
L1861
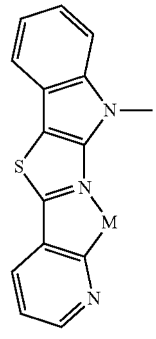
-continued
L1862
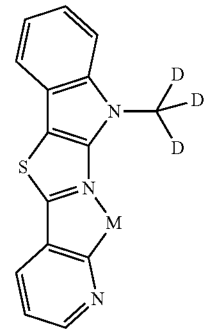
L1863
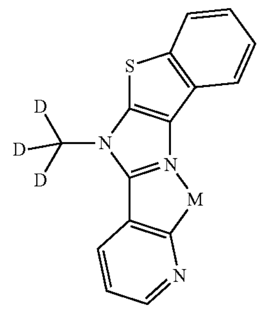
L1864
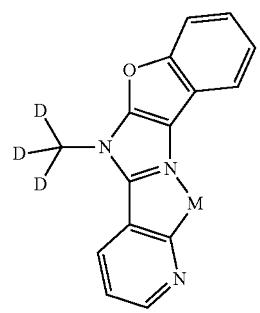
L1865
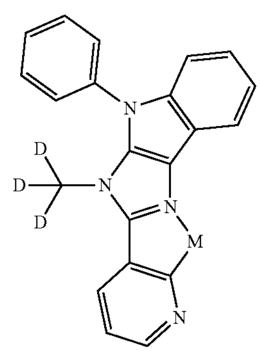
L1866
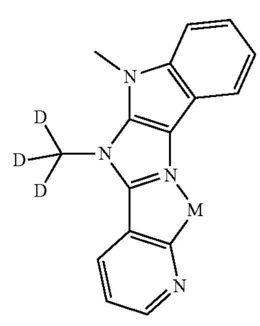

L1867
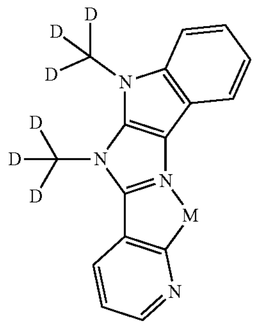
L1868
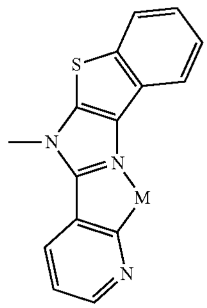
L1869
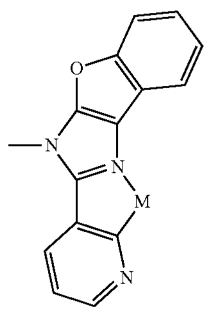
L1870
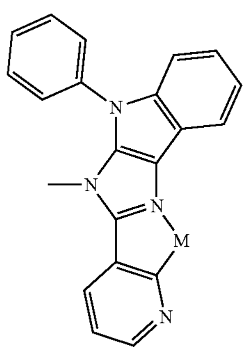
L1871
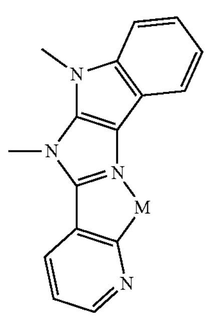
L1872
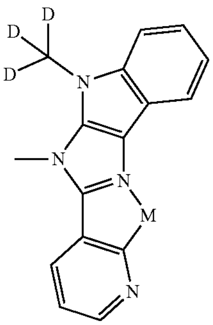
L1873
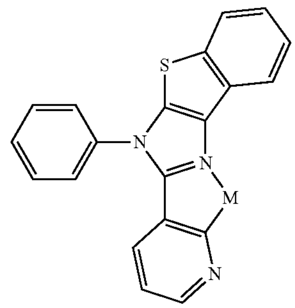
L1874
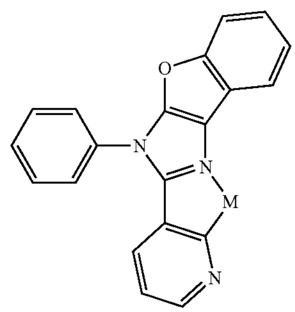
L1875
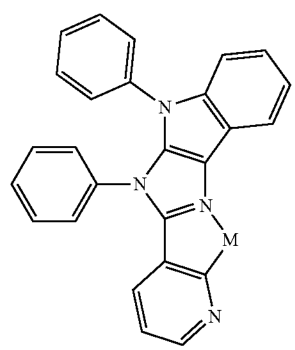
L1876
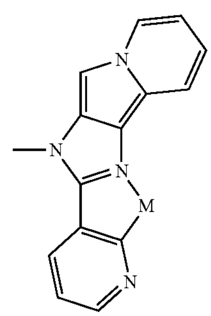

-continued
L1877
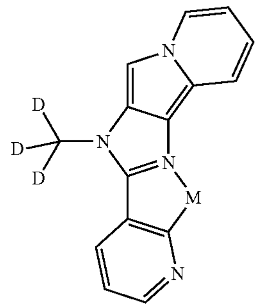
L1878
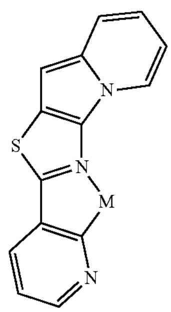
L1879
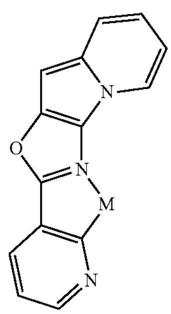
L1880
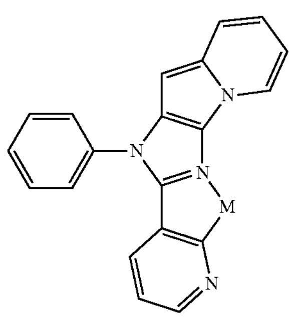
L1881
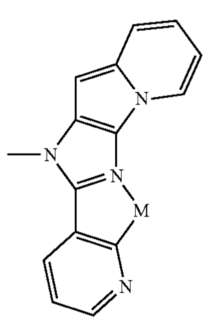
-continued
L1882
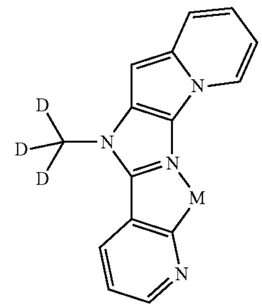
L1883
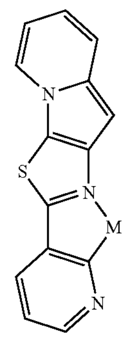
L1884
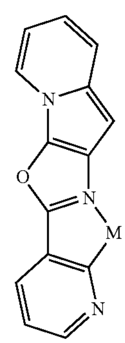
L1885
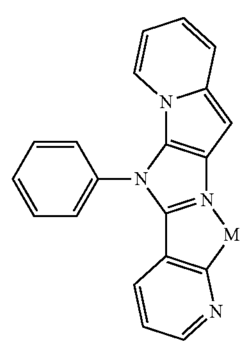

L1886
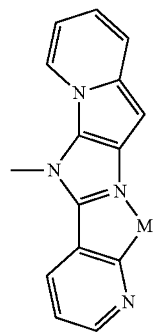
L1887
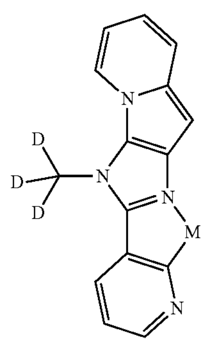
L1888
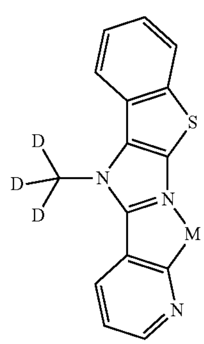
L1889
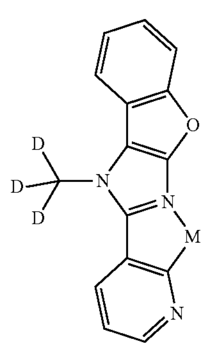
L1890
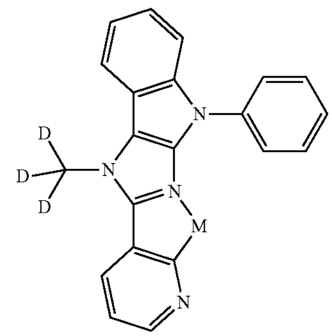
L1891
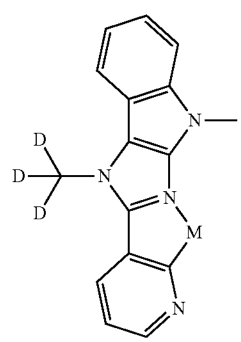
L1892
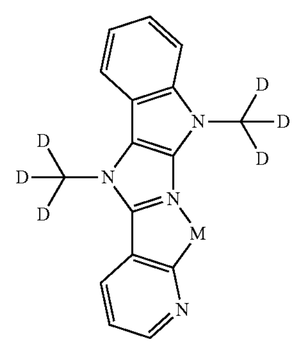
L1893
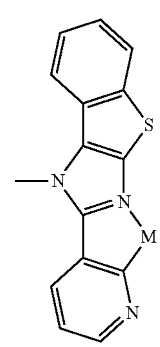

-continued
L1894
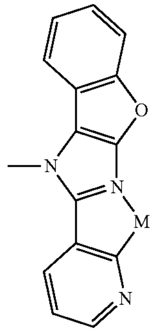
L1895
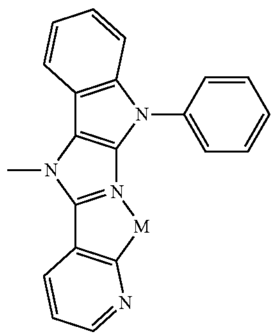
L1896
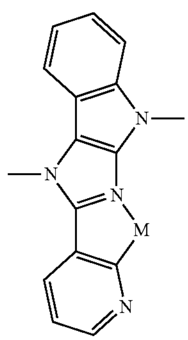
L1897
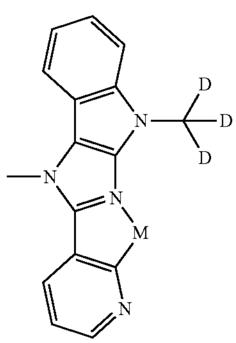
-continued
L1898
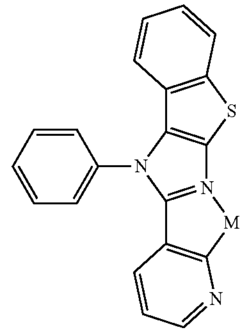
L1899
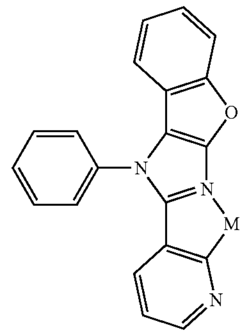
L1900
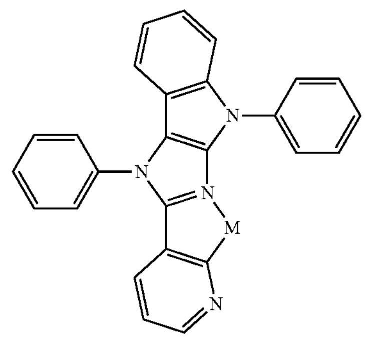
L1901
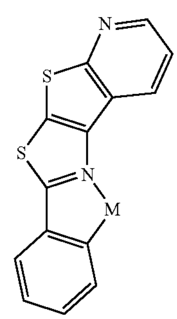
L1902
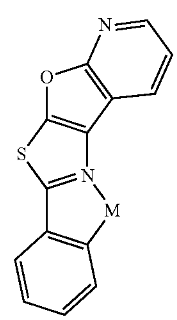

-continued
L1903
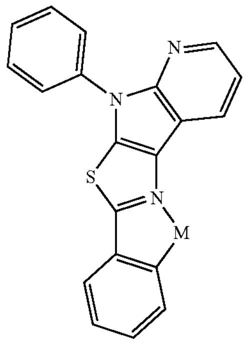
L1904
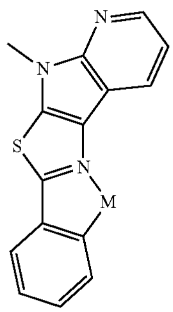
L1905
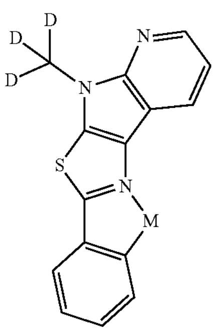
L1906
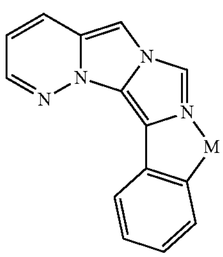
L1907
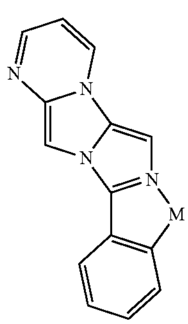
-continued
L1908
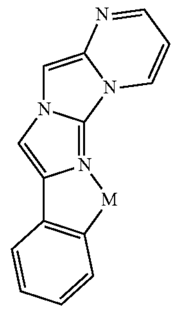
L1909
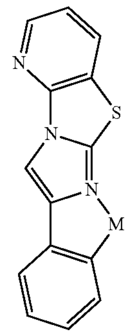
L1910
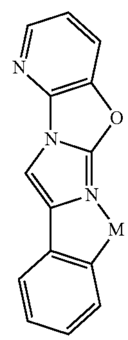
L1911
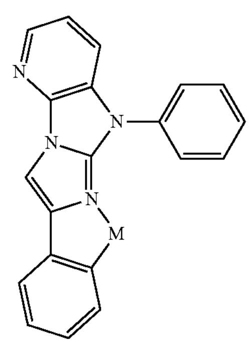

-continued
L1912
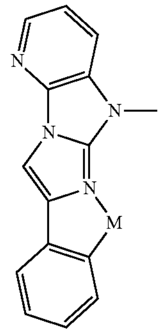
L1913
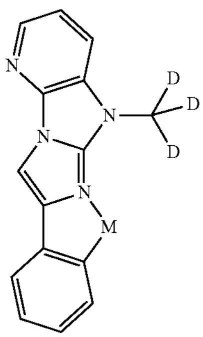
L1914
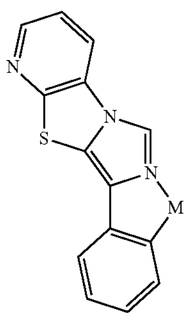
L1915
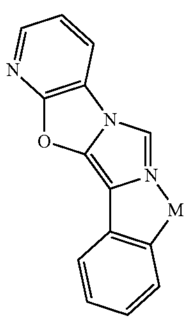
L1916
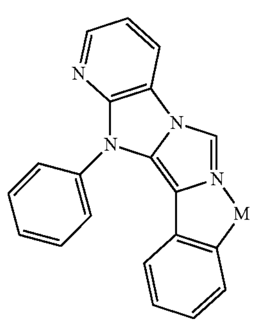
-continued
L1917
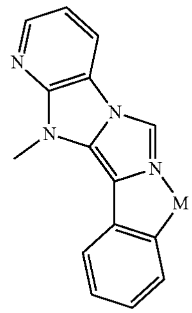
L1918
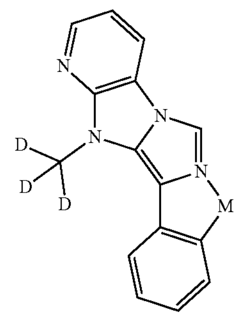
L1919
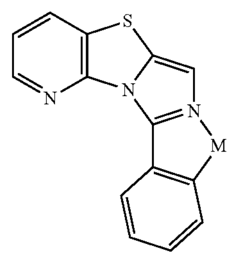
L1920
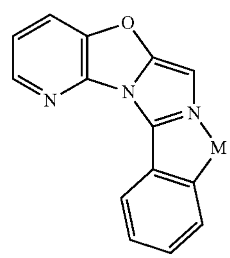
L1921
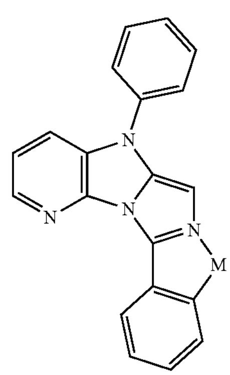

-continued
L1922
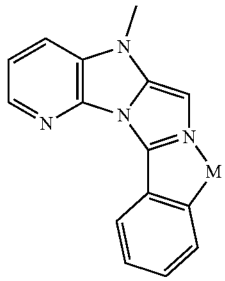
L1923
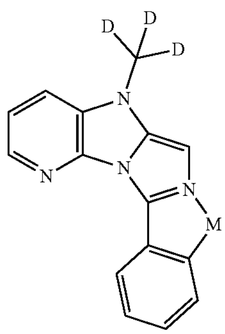
L1924
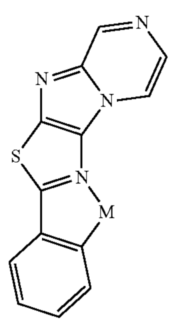
L1925
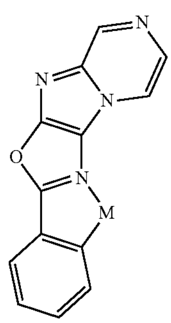
L1926
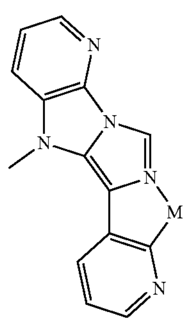
-continued
L1927
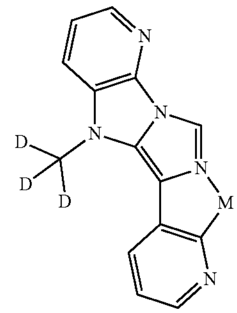
L1928
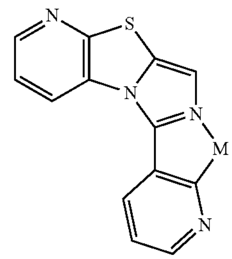
L1929
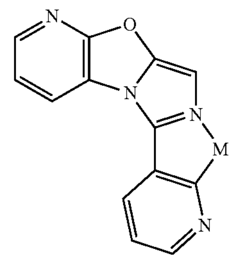
L1930
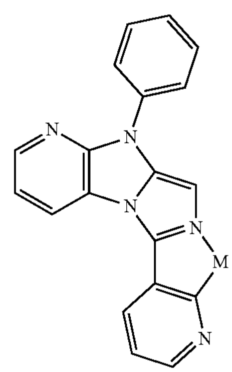
L1931
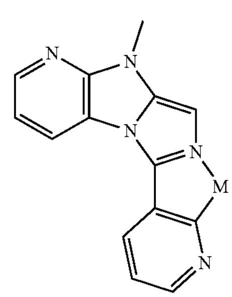

L1932
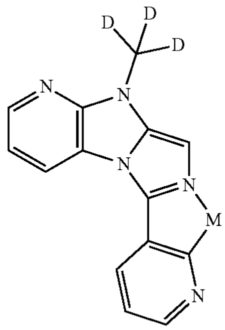
L1933
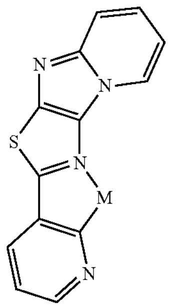
L1934
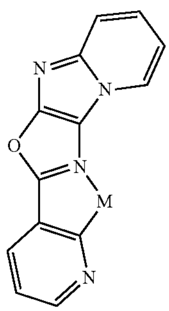
L1935
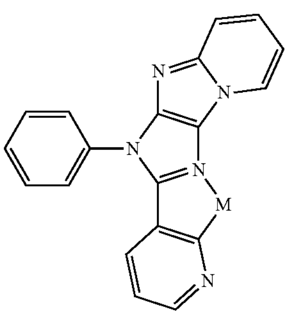
L1936
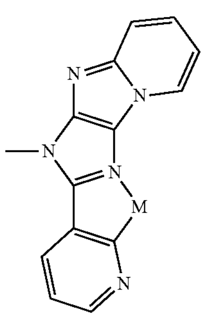
L1937
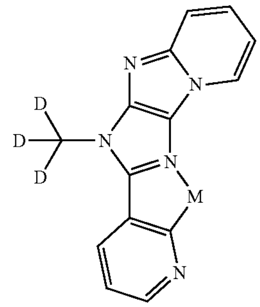
L1938
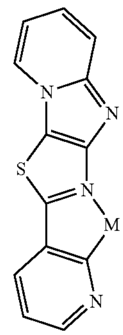
L1939
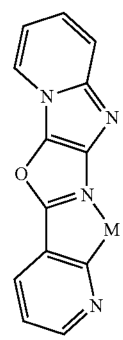
L1940
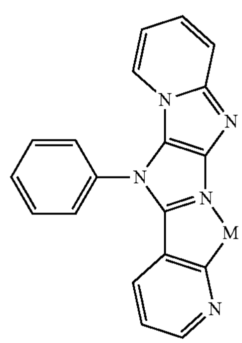

-continued
L1941
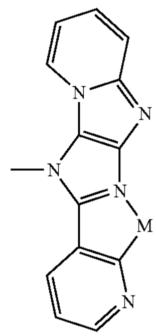
L1942
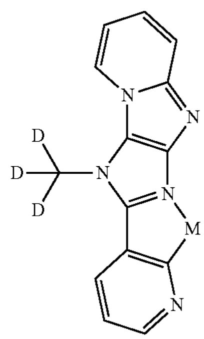
L1943
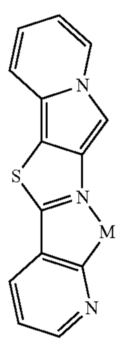
L1944
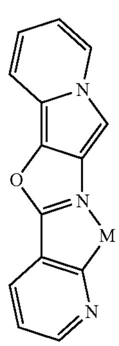
-continued
L1945
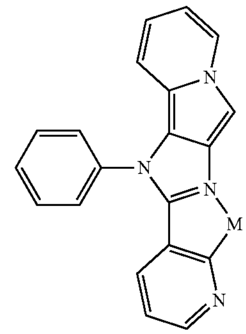
L1946
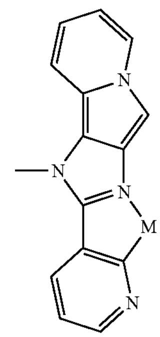
L1947
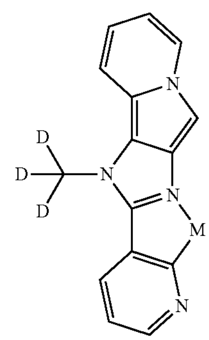
L1948
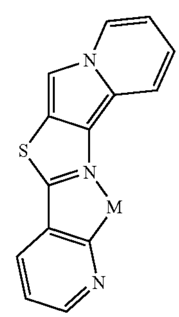
L1949
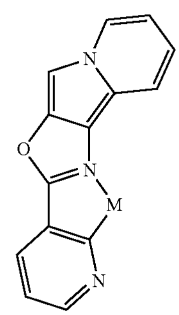

-continued
L1950
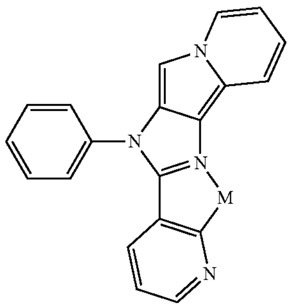
L1951
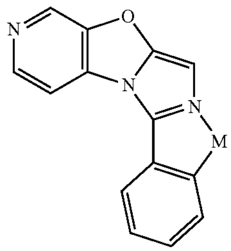
L1952
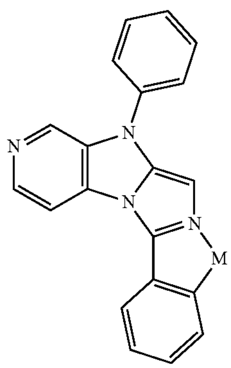
L1953
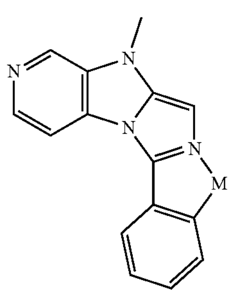
L1954
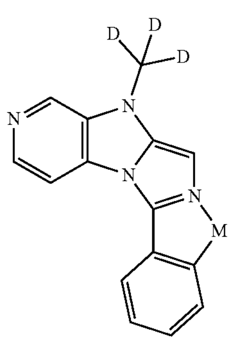
-continued
L1955
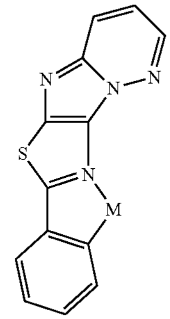
L1956
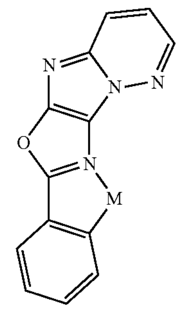
L1957
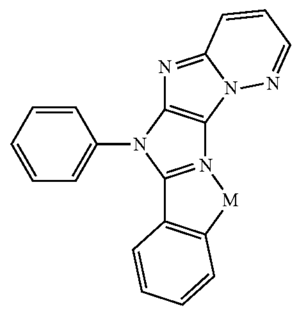
L1958
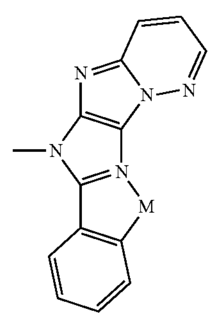
L1959
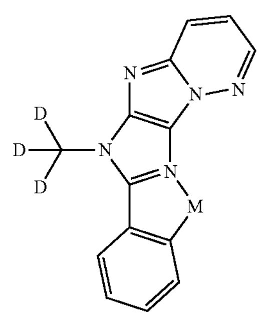

L1960
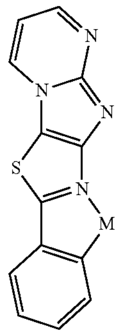
L1961
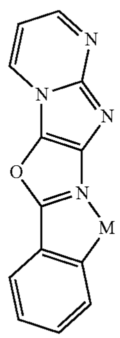
L1962
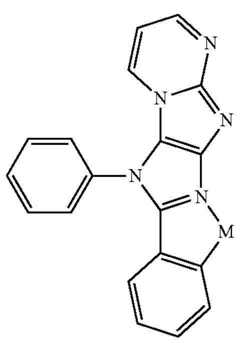
L1963
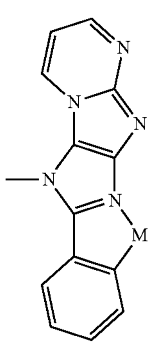
L1964
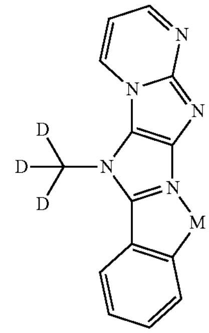
L1965
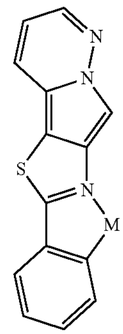
L1966
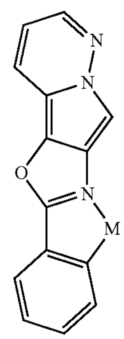
L1967
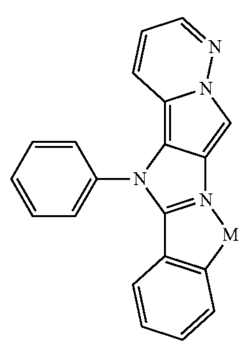

L1968
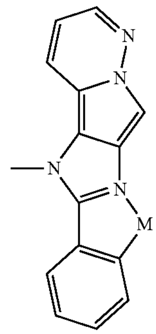
L1969
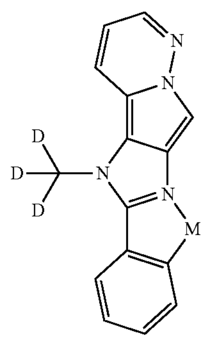
L1970
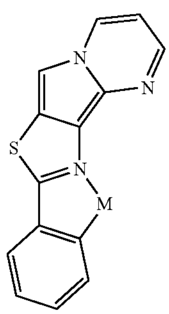
L1971
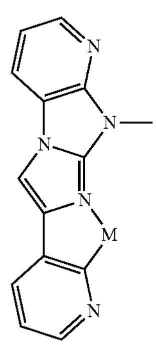
L1972
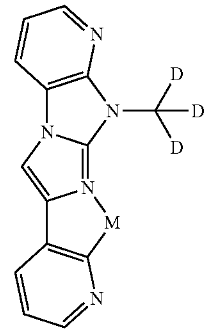
L1973
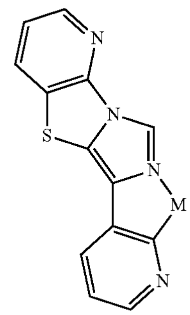
L1974
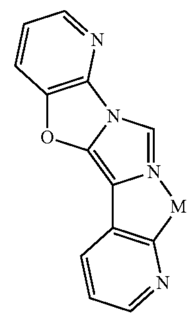
L1975
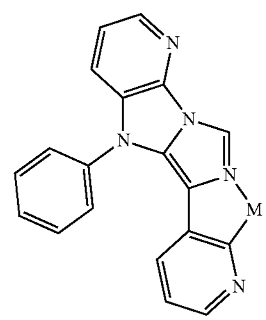
L1976
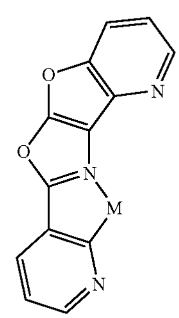

-continued
L1977
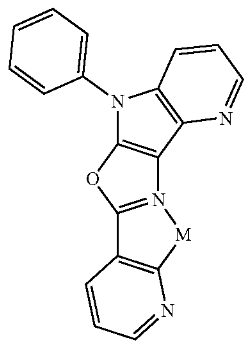
L1978
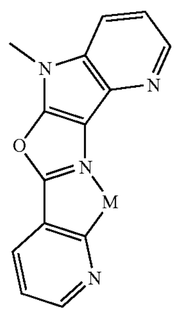
L1979
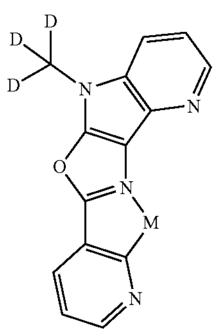
L1980
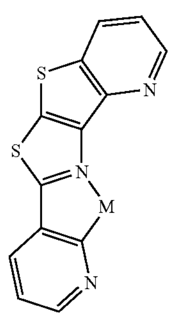
L1981
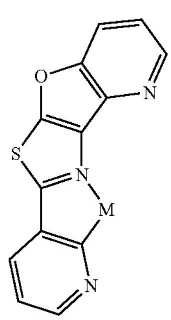
-continued
L1982
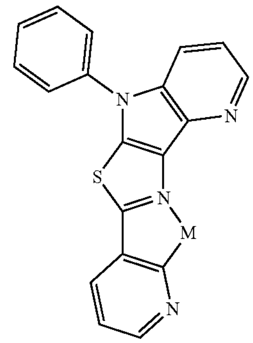
L1983
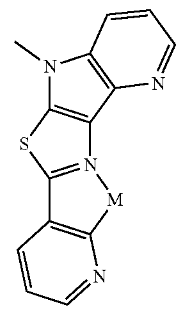
L1984
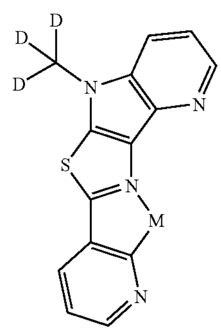
L1985
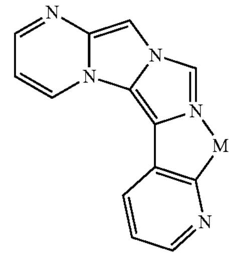
L1986
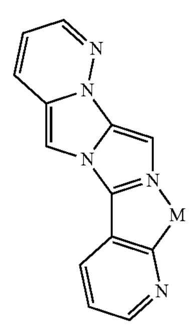

-continued
L1987
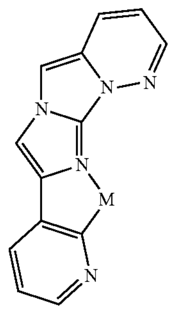
L1988
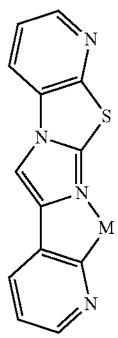
L1989
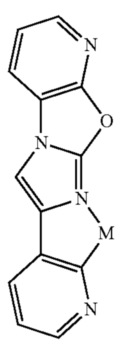
L1990
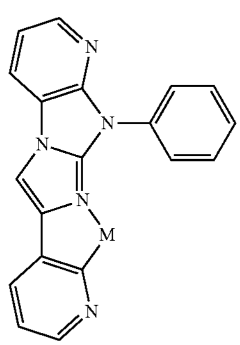
-continued
L1991
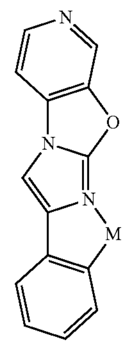
L1992
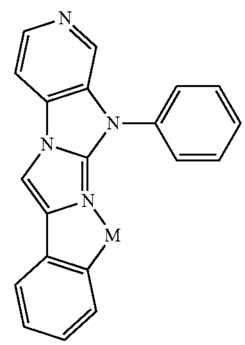
L1993
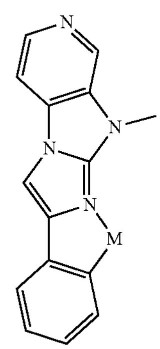
L1994
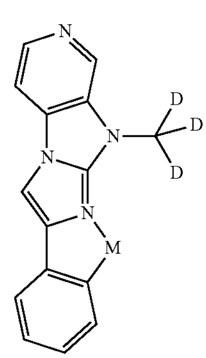

-continued
L1995
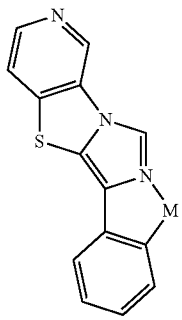
L1996
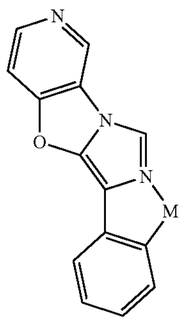
L1997
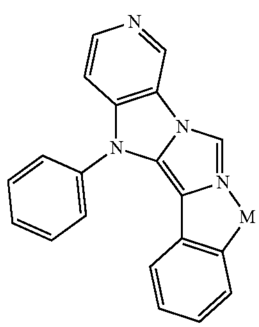
L1998
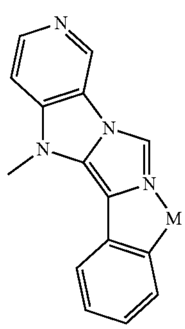
L1999
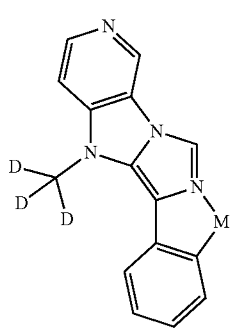
-continued
L2000
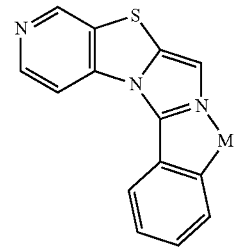
L2001
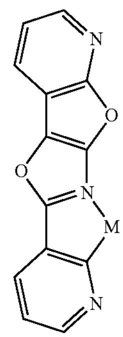
L2002
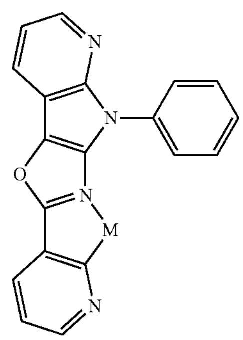
L2003
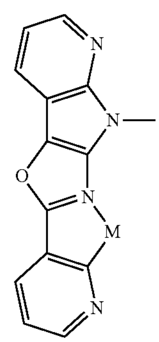
L2004
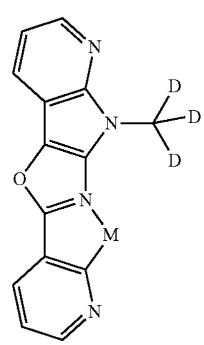

L2005
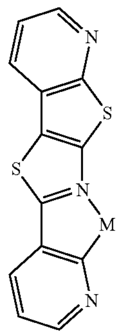
L2006
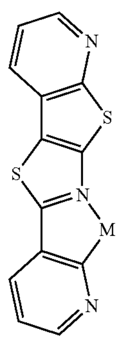
L2007
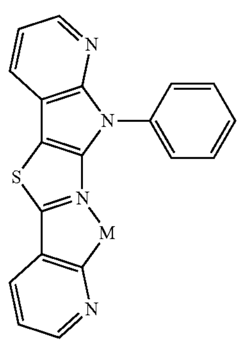
L2008
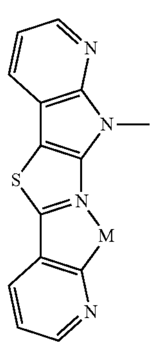
L2009
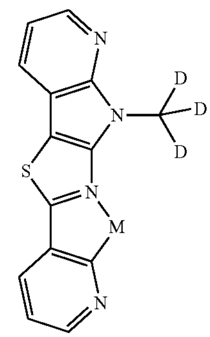
L2010
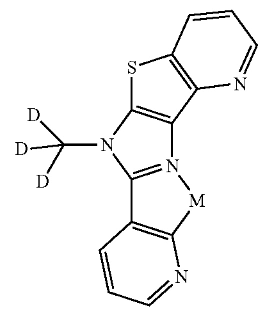
L2011
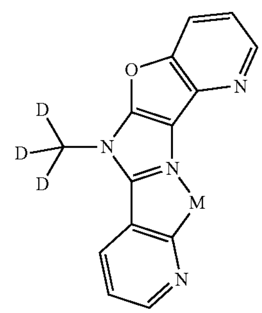
L2012
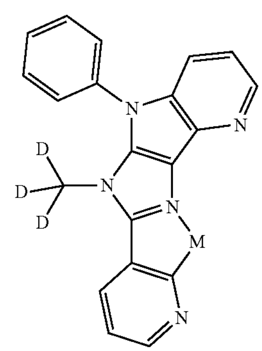
L2013
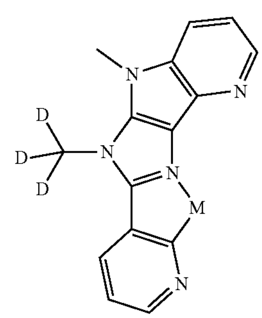

-continued
L2014
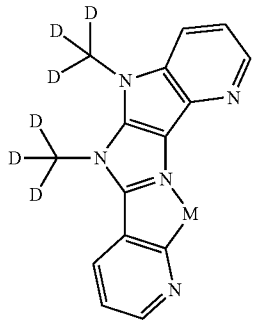
L2015
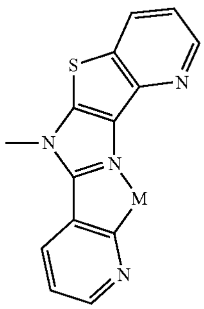
L2016
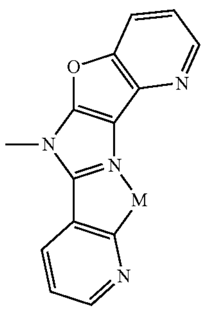
L2017
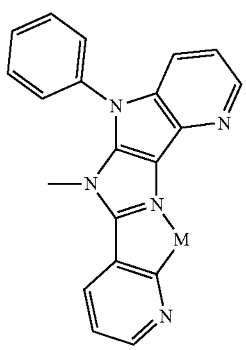
L2018
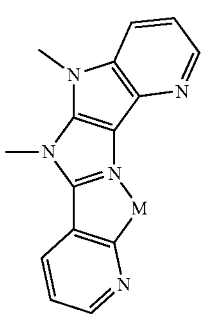
-continued
L2019
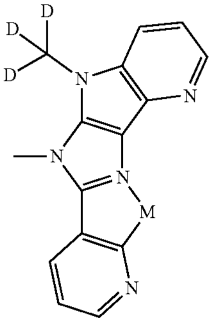
L2020
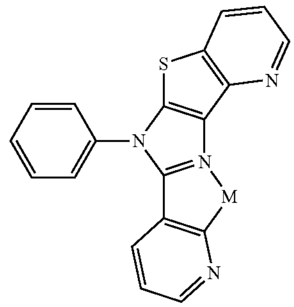
L2021
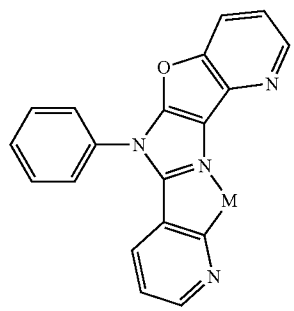
L2022
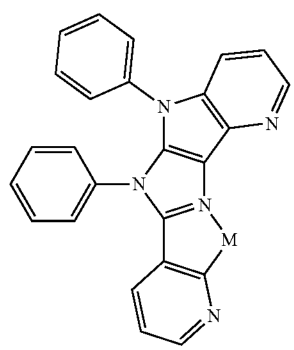
L2023
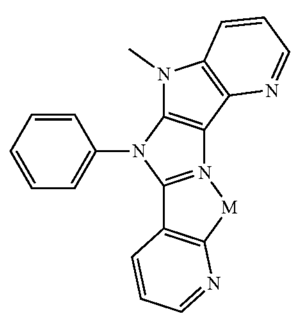

-continued
L2024
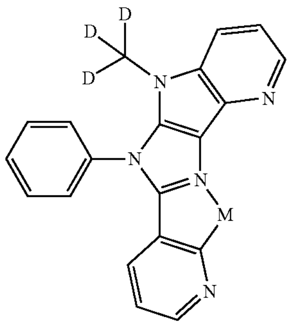
L2025
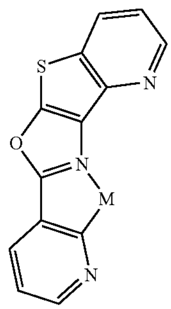
L2026
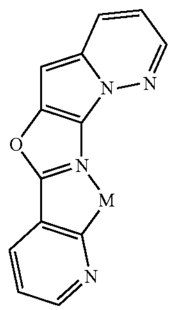
L2027
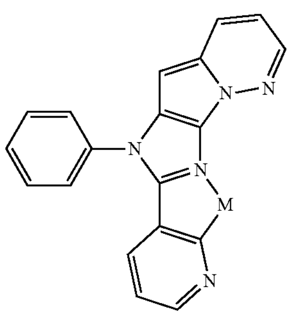
L2028
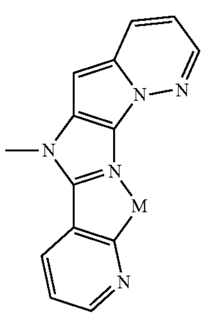
-continued
L2029
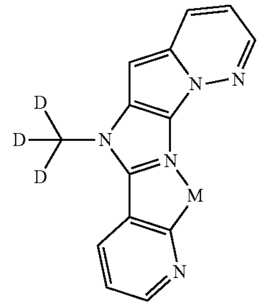
L2030
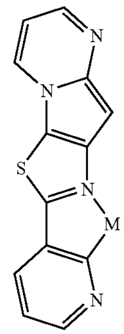
L2031
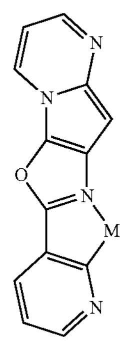
L2032
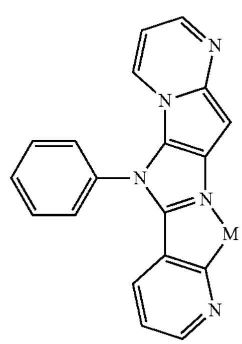

L2033
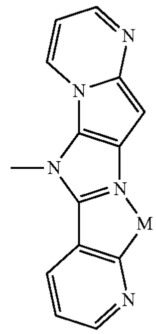
L2034
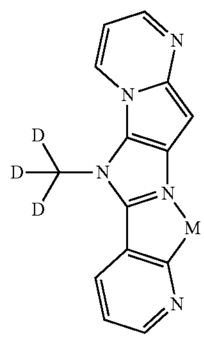
L2035
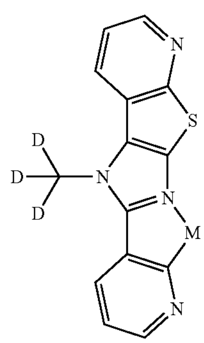
L2036
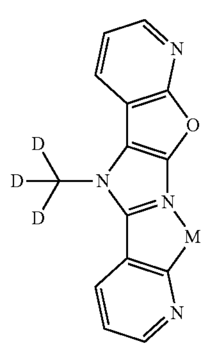
L2037
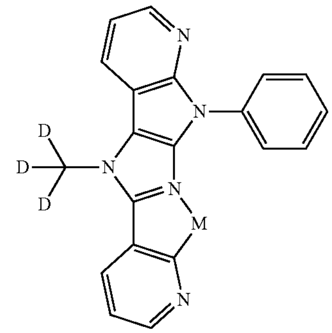
L2038
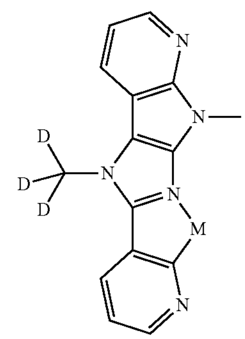
L2039
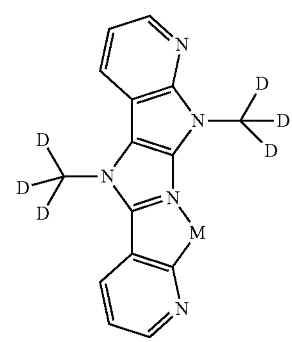
L2040
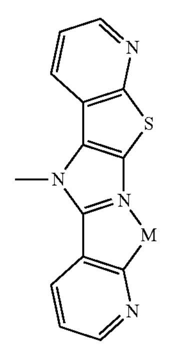

-continued
L2041
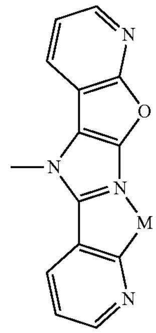
L2042
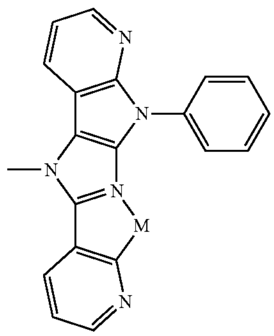
L2043
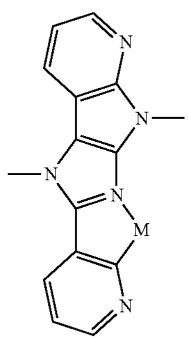
L2044
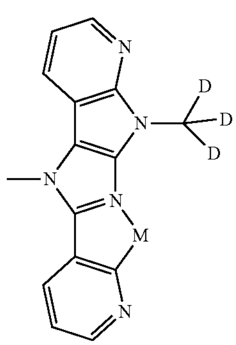
-continued
L2045
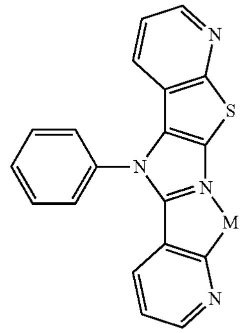
L2046
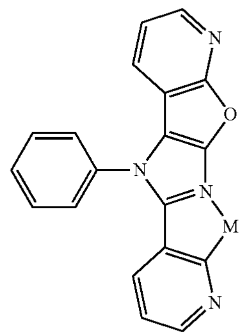
L2047
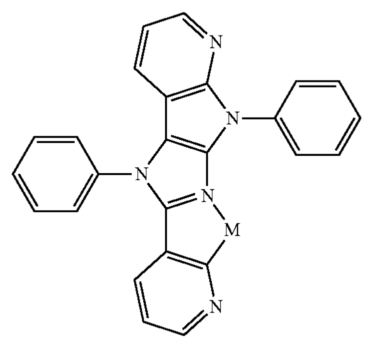
L2048
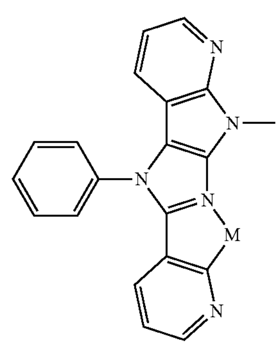

L2049
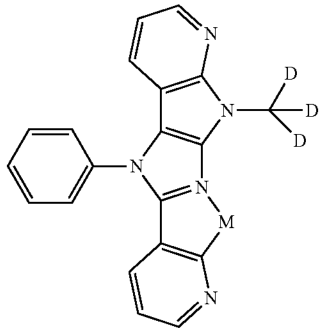
L2050
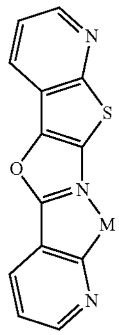
L2051
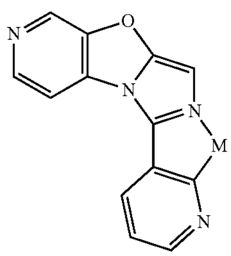
L2052
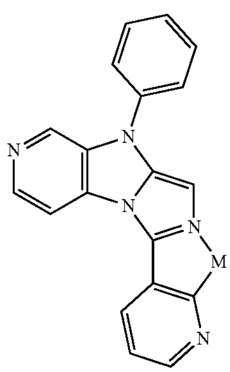
L2053
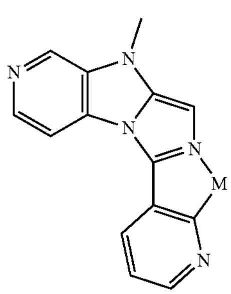
L2054
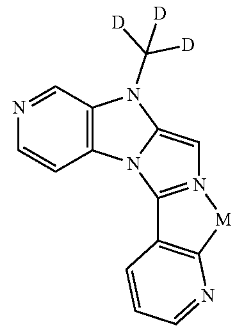
L2055
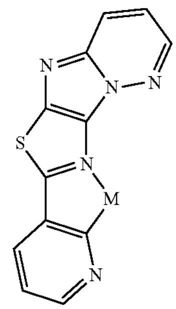
L2056
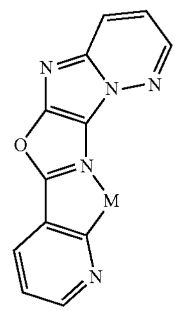
L2057
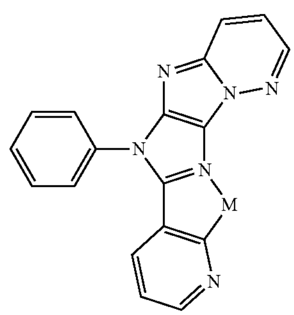
L2058
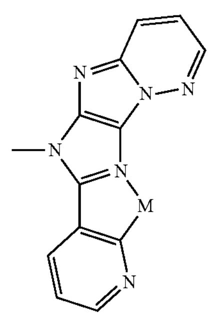

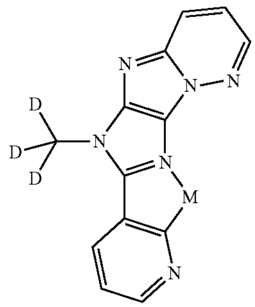
L2059
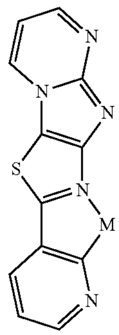
L2060
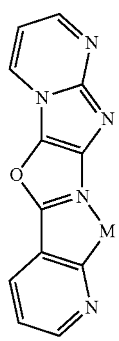
L2061
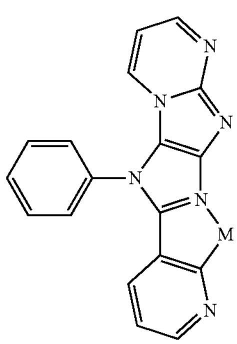
L2062
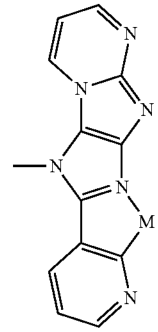
L2063
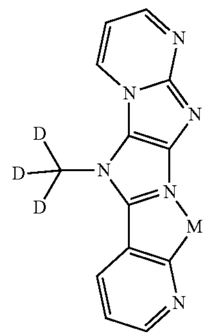
L2064
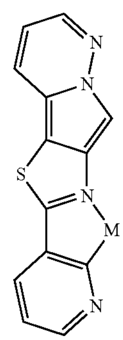
L2065
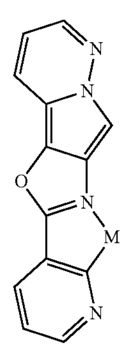
L2066

-continued
L2067
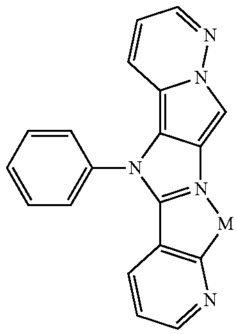
L2068
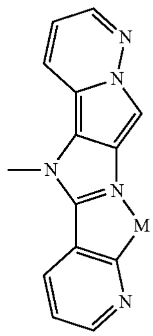
L2069
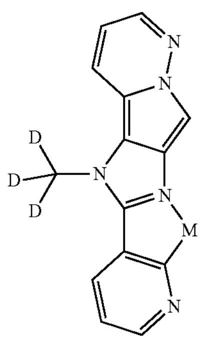
L2070
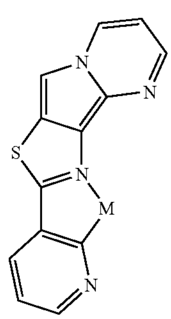
L2071
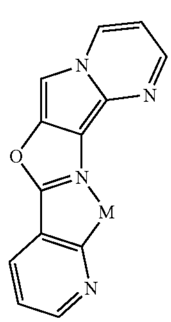
-continued
L2072
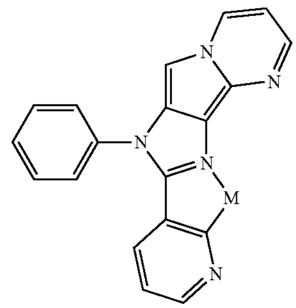
L2073
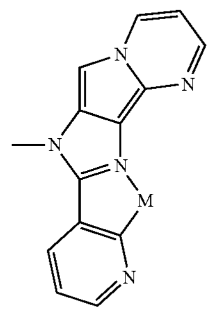
L2074
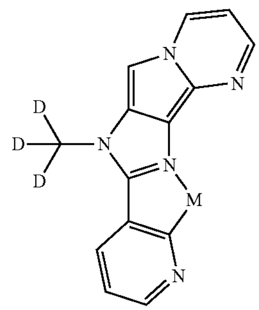
L2075
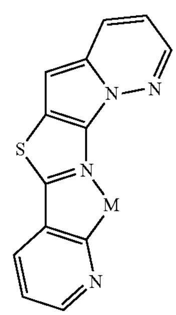
L2076
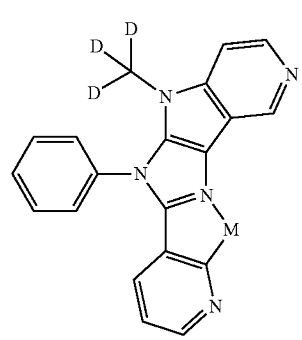

-continued
L2077
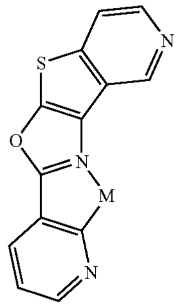
L2078
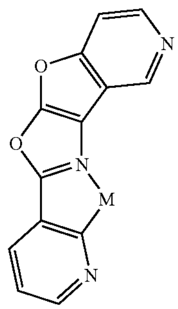
L2079
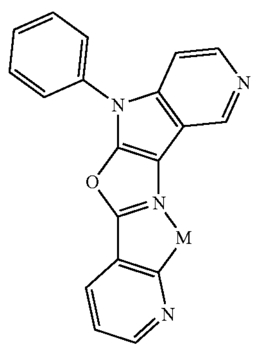
L2080
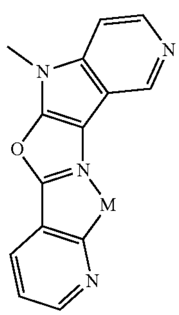
L2081
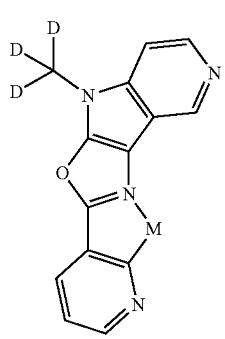
-continued
L2082
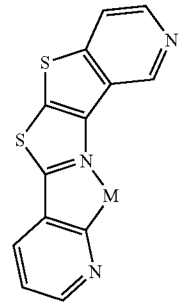
L2083
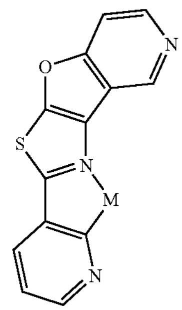
L2084
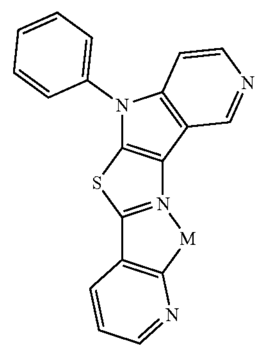
L2085
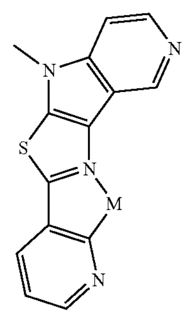
L2086
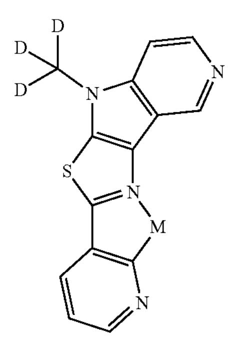

-continued
L2087
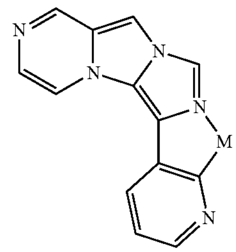
L2088
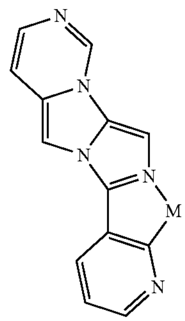
L2089
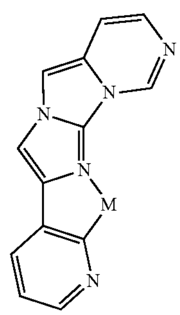
L2090
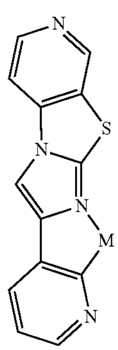
L2091
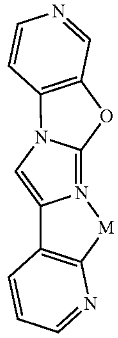
-continued
L2092
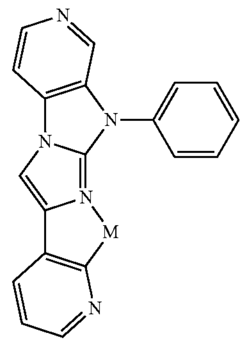
L2093
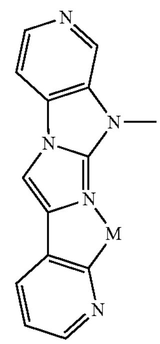
L2094
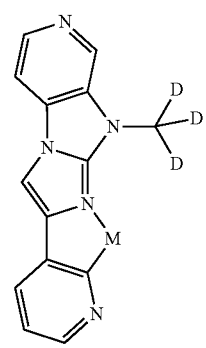
L2095
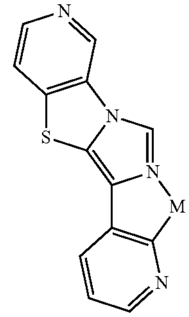

-continued
L2096
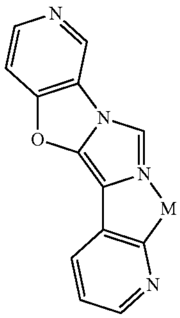
L2097
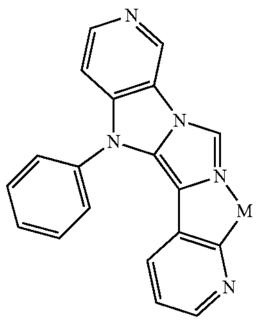
L2098
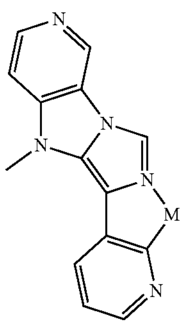
L2099
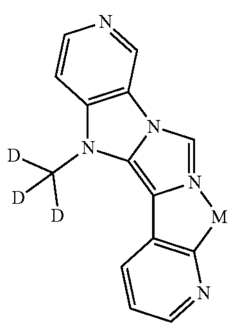
L2100
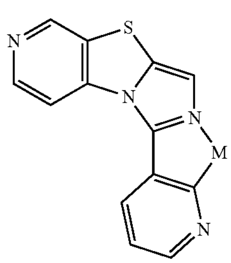
-continued
L2101
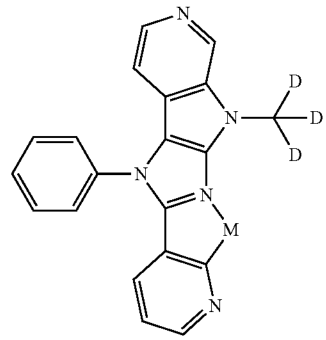
L2102
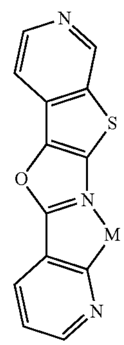
L2103
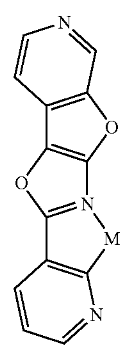
L2104
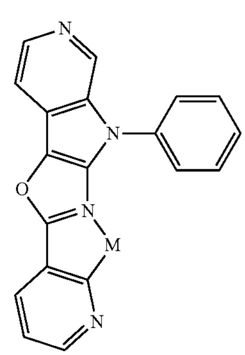

-continued
L2105
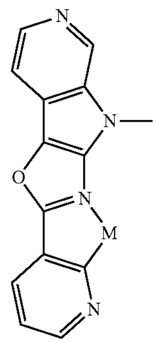
L2106
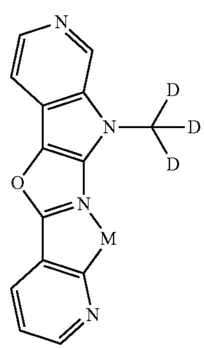
L2107
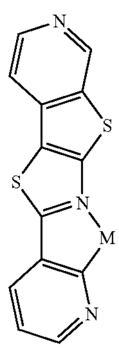
L2108
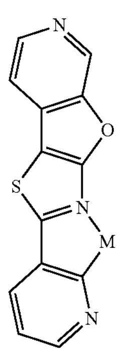
-continued
L2109
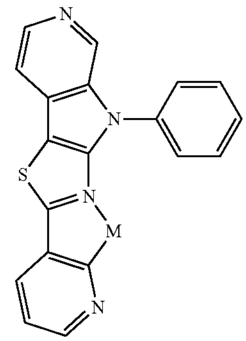
L2110
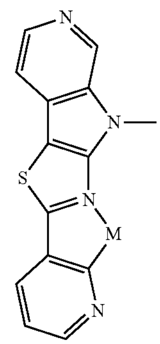
L2111
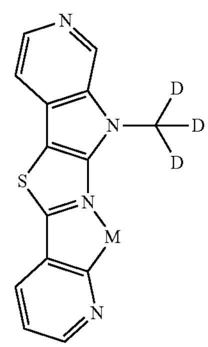
L2112
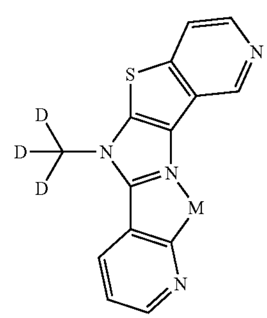
L2113
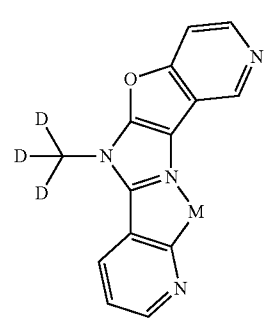

-continued
L2114
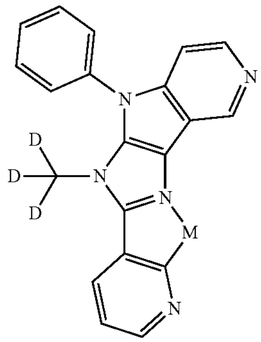
L2115
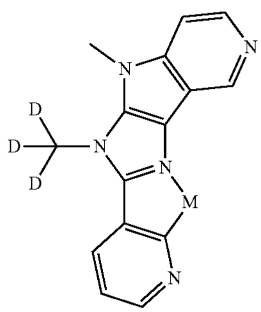
L2116
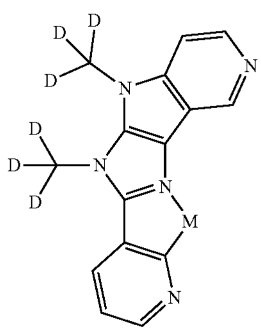
L2117
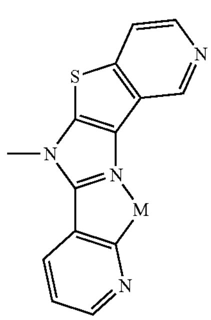
-continued
L2118
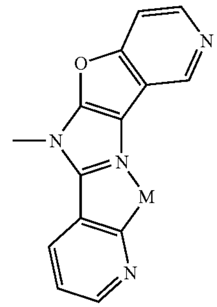
L2119
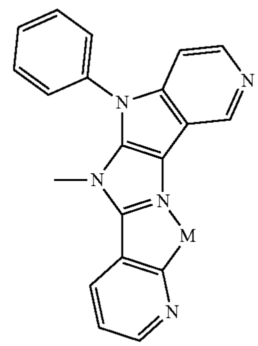
L2120
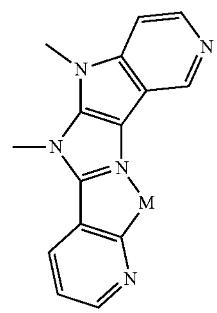
L2121
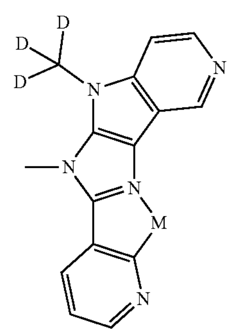
L2122
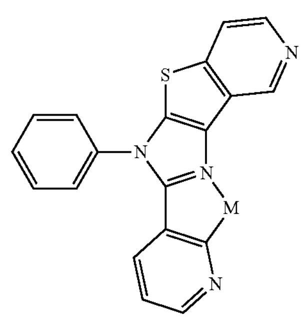

-continued
L2123
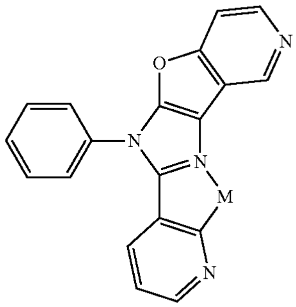
L2124
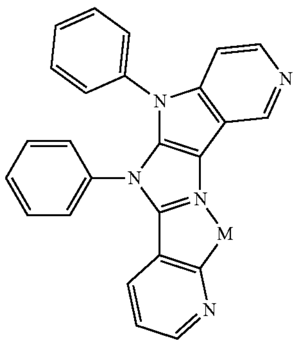
L2125
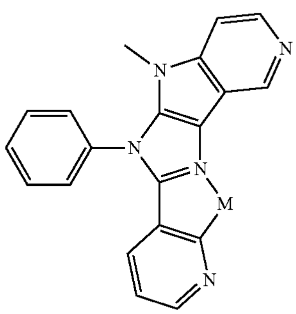
L2126
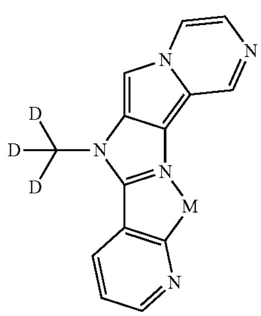
L2127
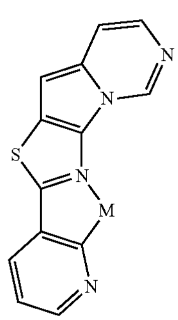
-continued
L2128
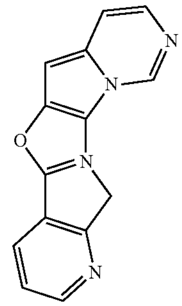
L2129
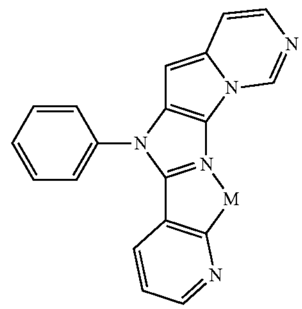
L2130
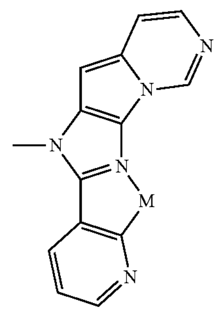
L2131
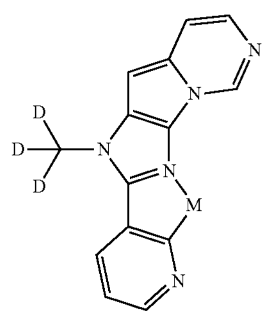
L2132
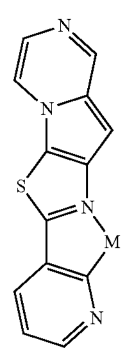

L2133
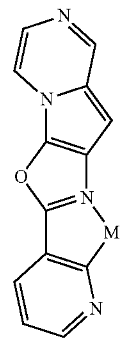
L2134
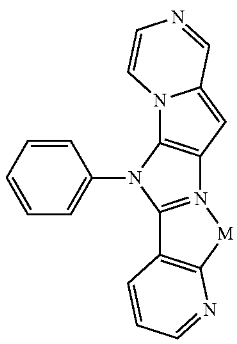
L2135
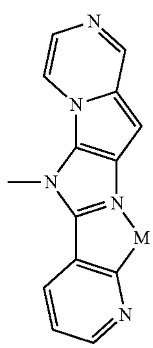
L2136
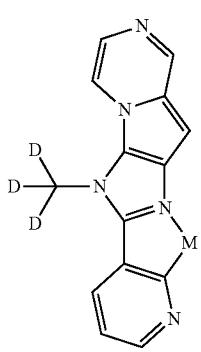
L2137
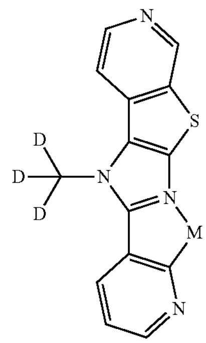
L2138
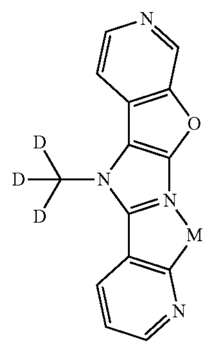
L2139
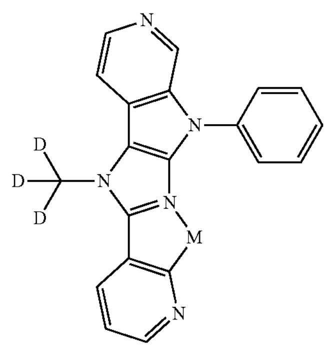
L2140
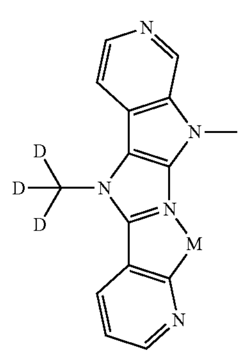

-continued
L2141
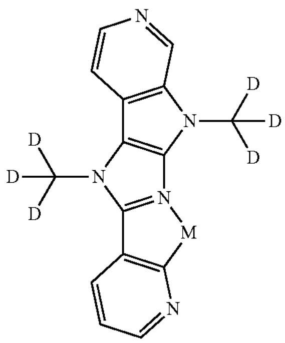
L2142
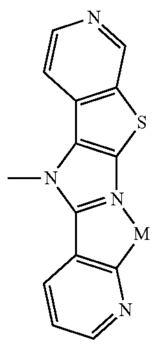
L2143
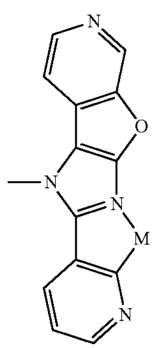
L2144
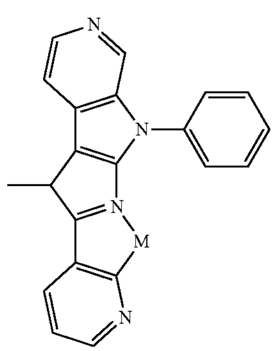
-continued
L2145
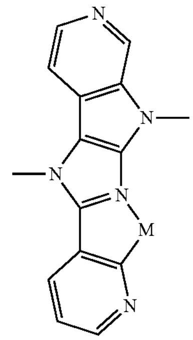
L2146
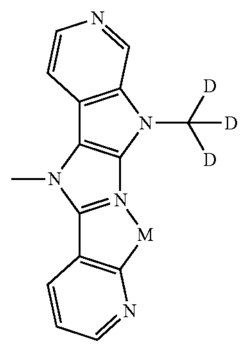
L2147
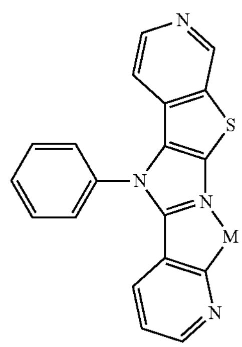
L2148
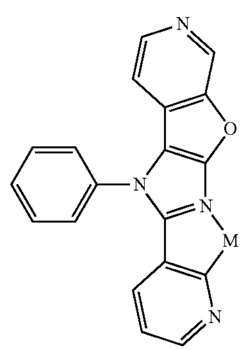

-continued
L2149
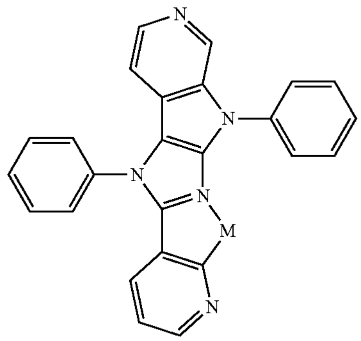
L2150
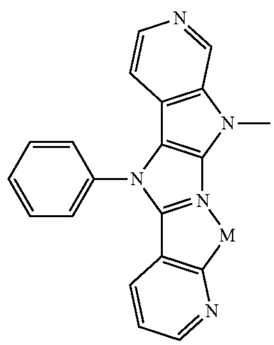
L2151
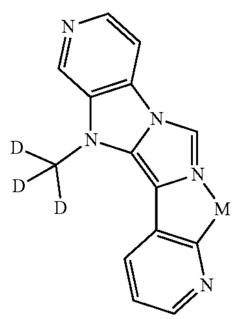
L2152
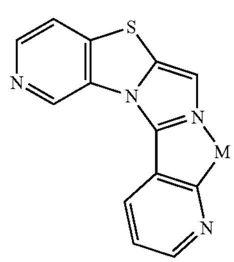
L2153
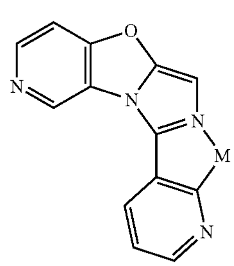
-continued
L2154
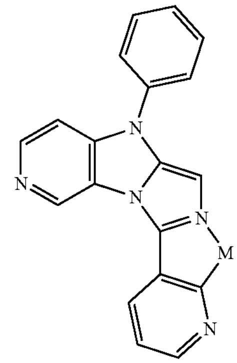
L2155
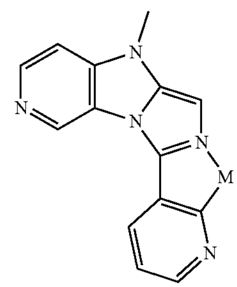
L2156
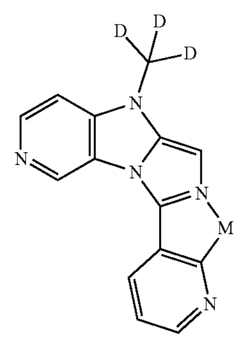
L2157
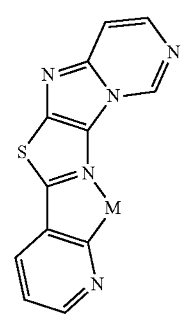
L2158
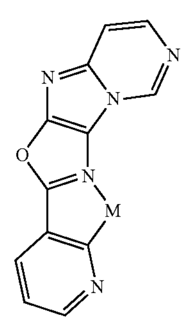

L2159
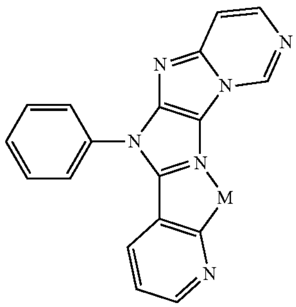
L2160
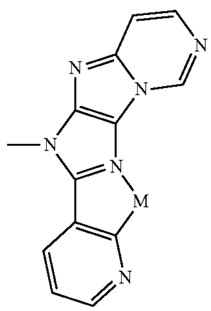
L2161
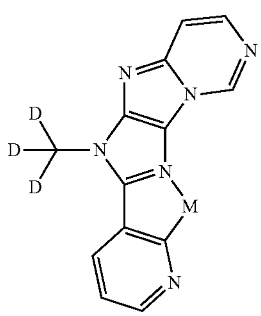
L2162
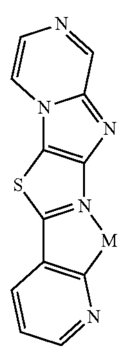
L2163
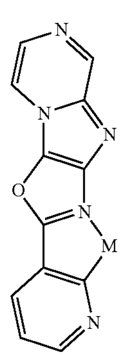
L2164
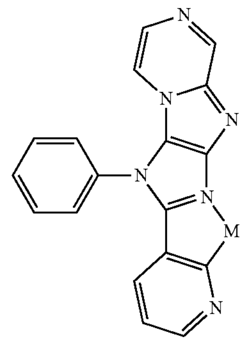
L2165
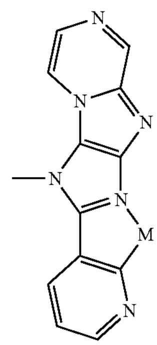
L2166
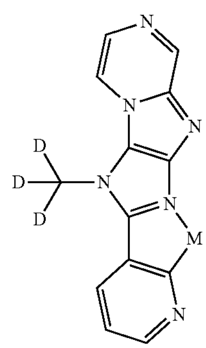
L2167
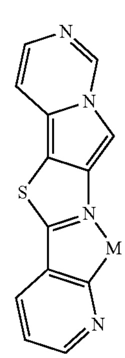

-continued
L2168
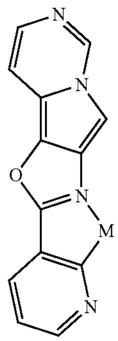
L2169
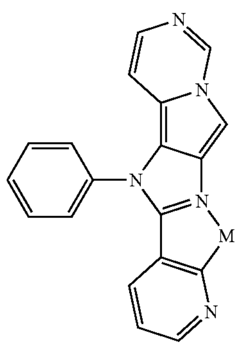
L2170
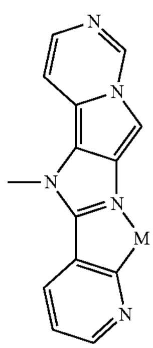
L2171
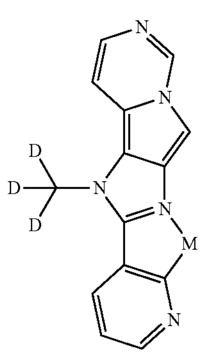
-continued
L2172
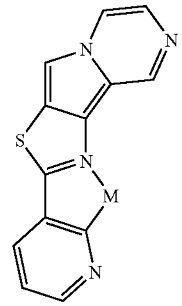
L2173
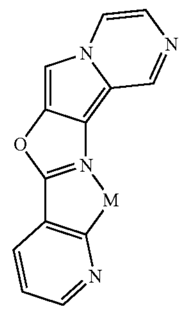
L2174
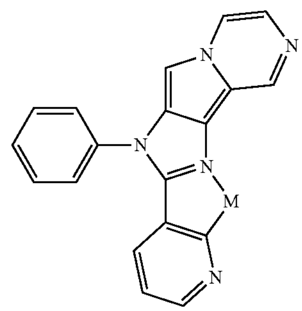
L2175
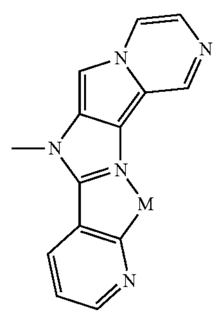
L2176
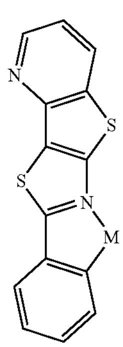

-continued
L2177
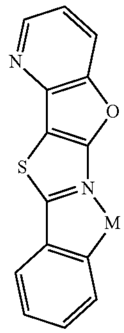
L2178
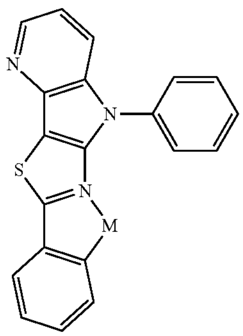
L2179
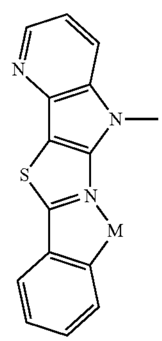
L2180
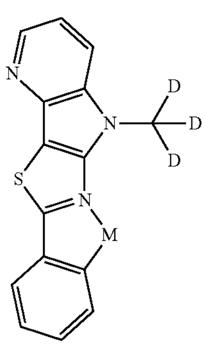
-continued
L2181
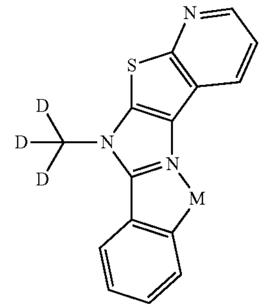
L2182
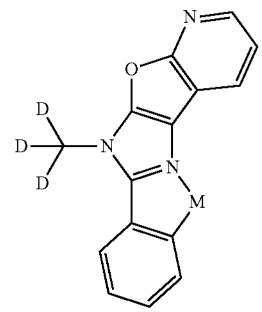
L2183
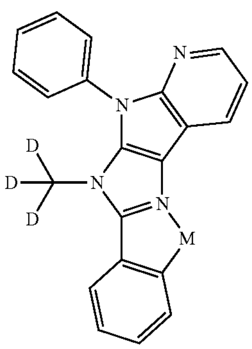
L2184
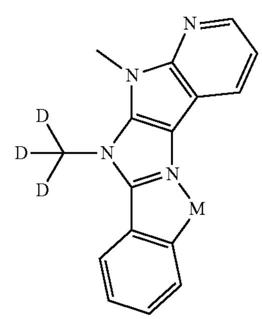
L2185
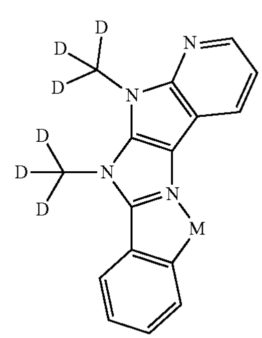

-continued
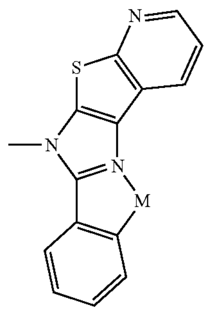
L2186
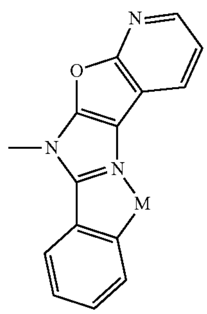
L2187
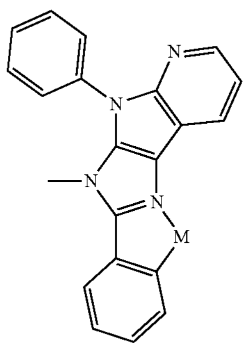
L2188
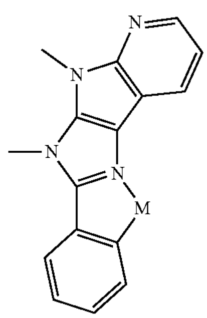
L2189
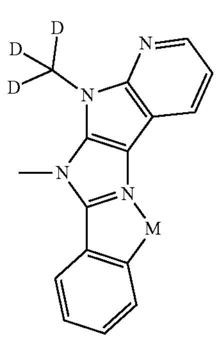
L2190
-continued
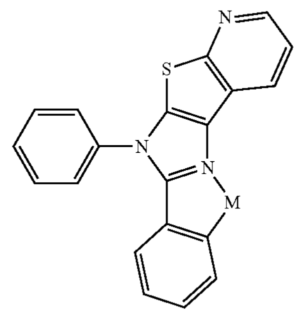
L2191
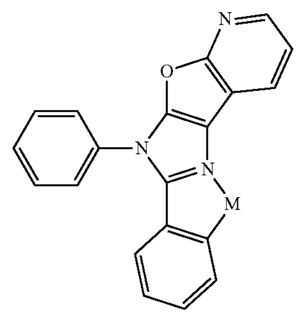
L2192
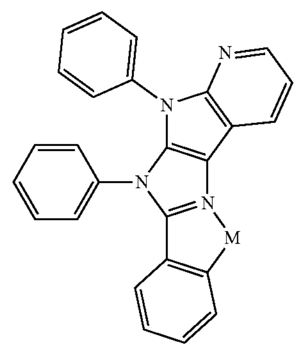
L2193
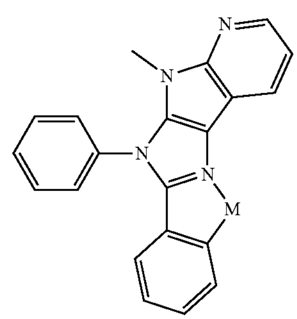
L2194
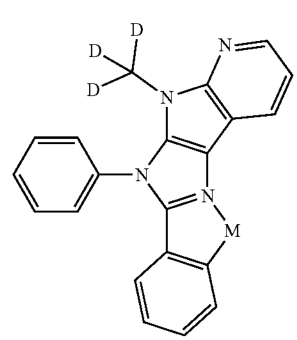
L2195

-continued
L2196
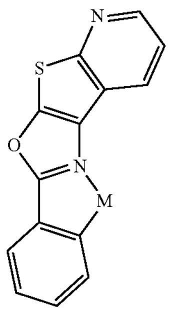
L2197
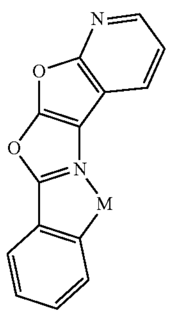
L2198
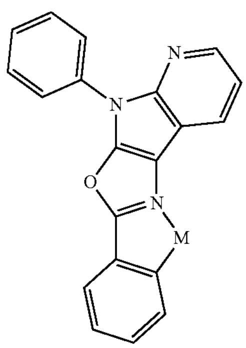
L2199
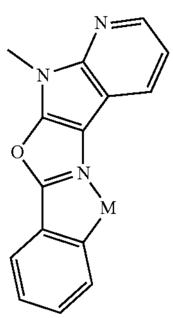
L2200
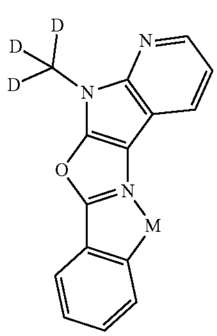
-continued
L2201
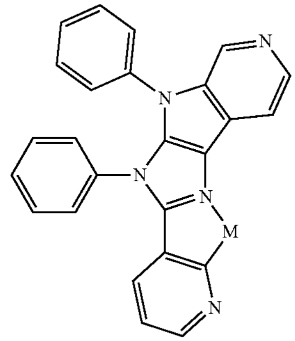
L2202
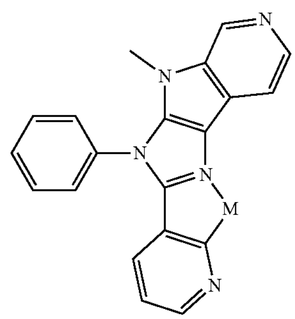
L2203
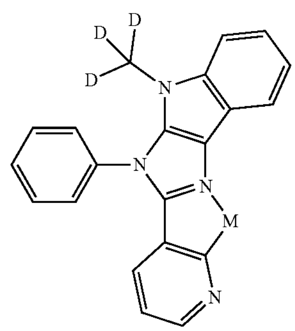
L2204
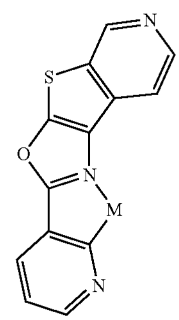
L2205
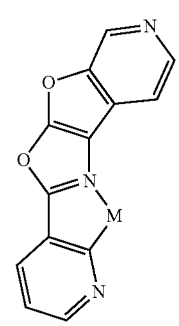

-continued
L2206
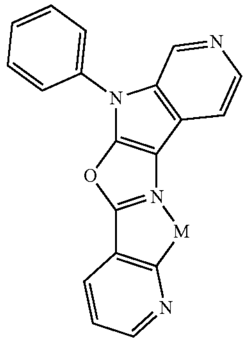
L2207
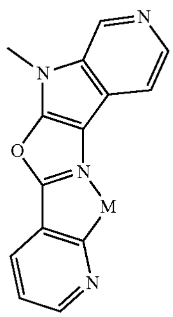
L2208
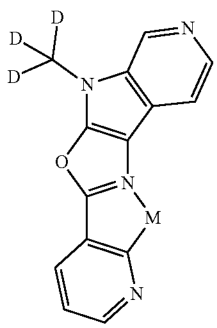
L2209
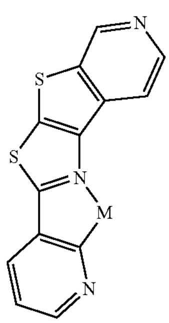
L2210
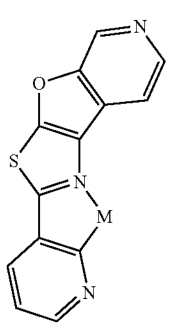
-continued
L2211
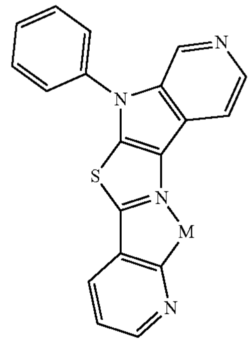
L2212
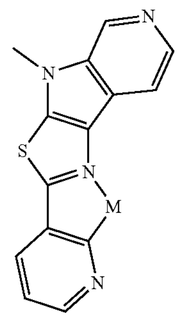
L2213
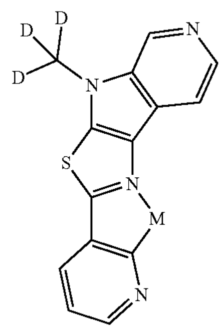
L2214
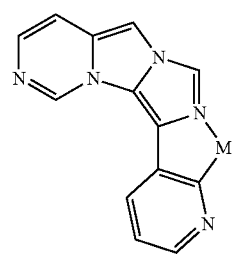
L2215
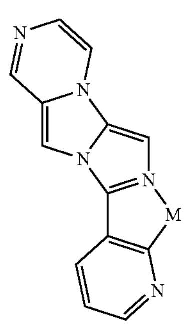

L2216
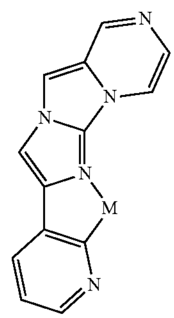
L2217
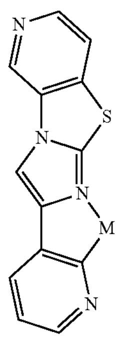
L2218
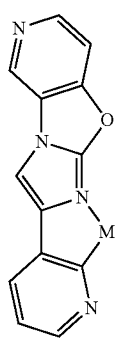
L2219
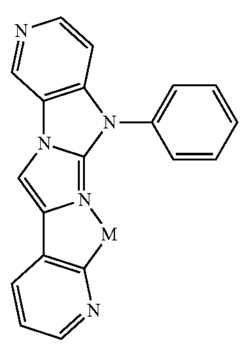
L2220
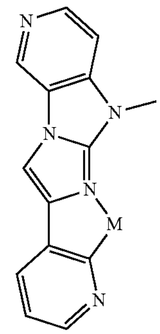
L2221
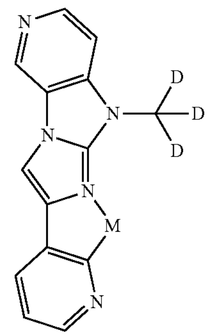
L2222
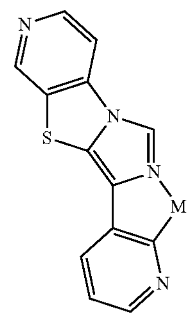
L2223
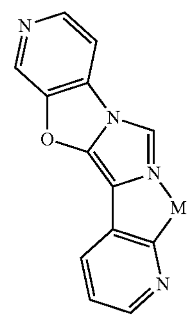
L2224
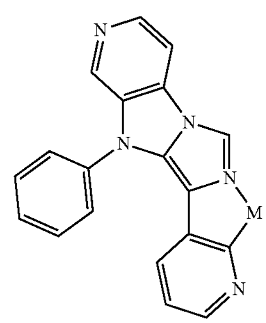

-continued
L2225
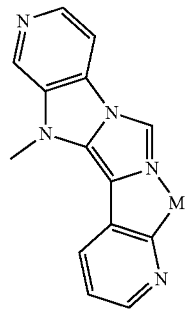
L2226
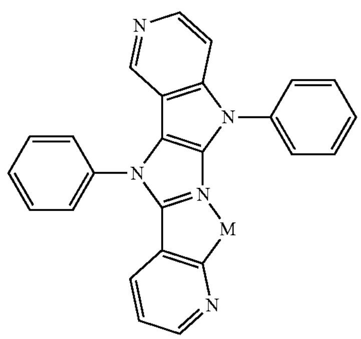
L2227
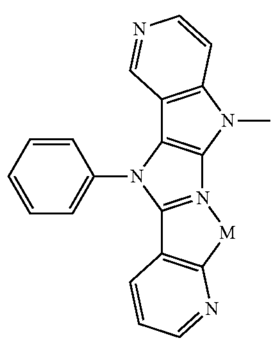
L2228
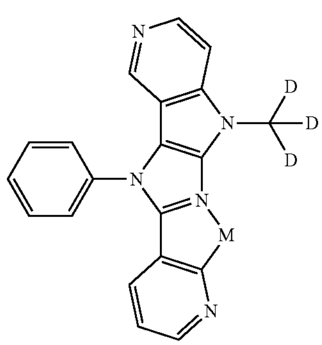
-continued
L2229
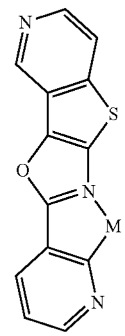
L2230
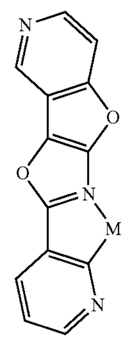
L2231
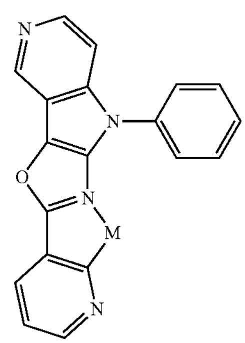
L2232
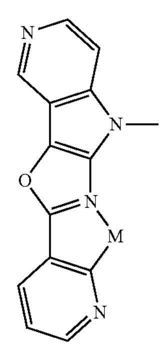

-continued
L2233
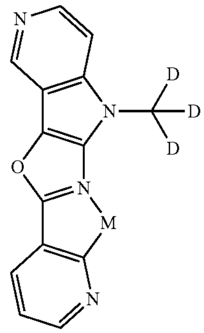
L2234
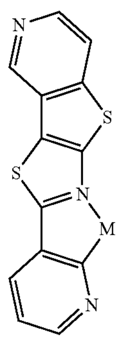
L2235
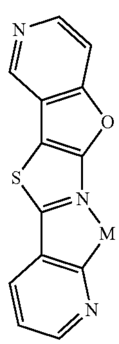
L2236
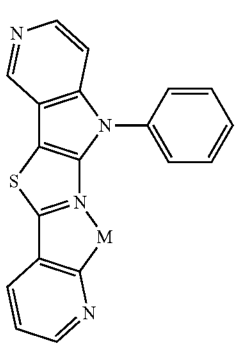
-continued
L2237
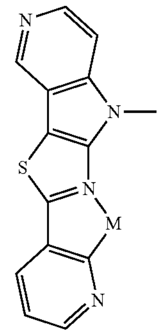
L2238
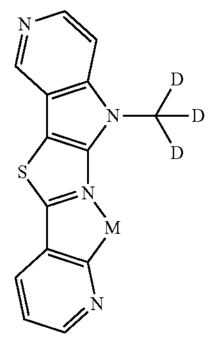
L2239
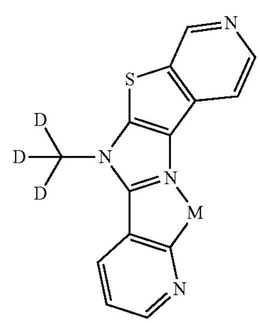
L2240
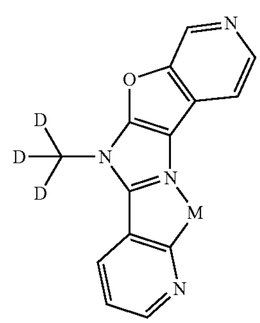
L2241
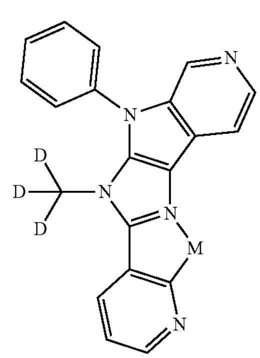

-continued
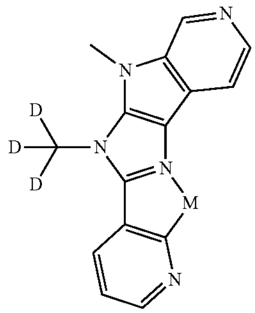
L2242
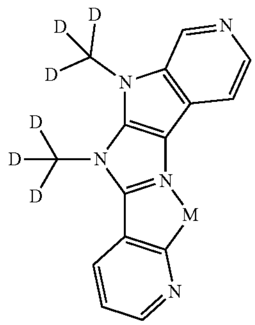
L2243
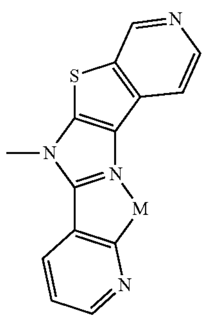
L2244
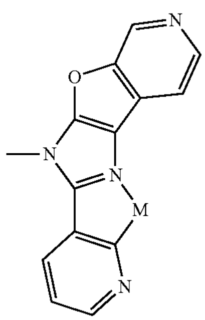
L2245
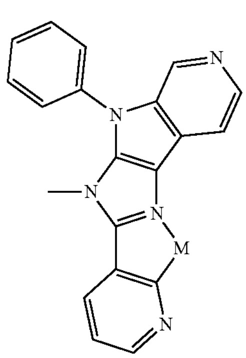
L2246
-continued
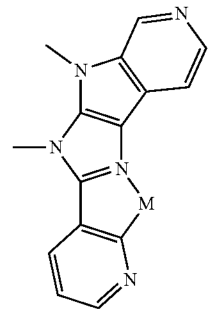
L2247
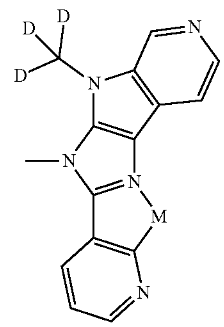
L2248
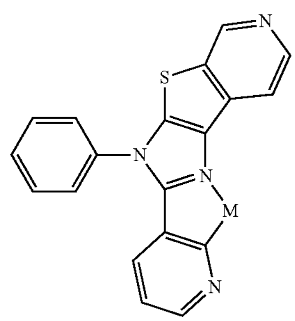
L2249
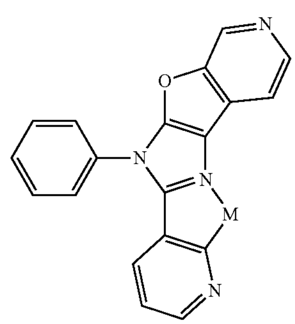
L2250
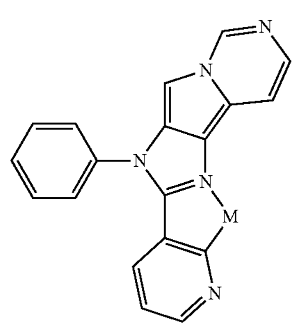
L2251

-continued
L2252
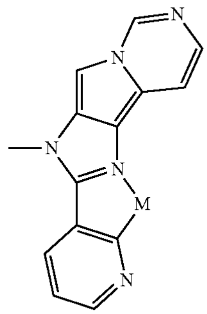
L2253
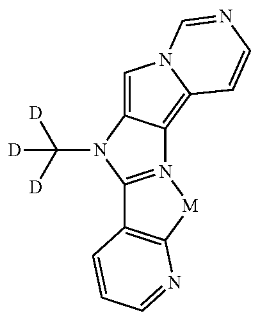
L2254
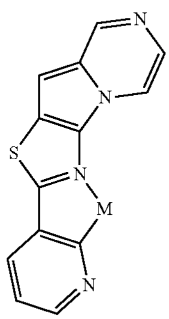
L2255
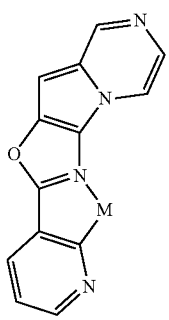
L2256
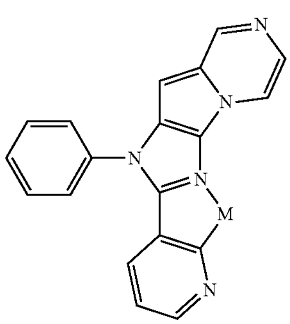
-continued
L2257
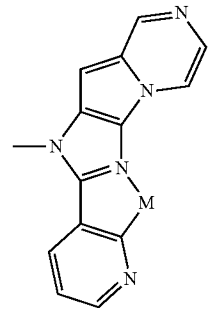
L2258
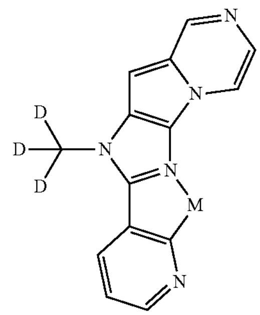
L2259
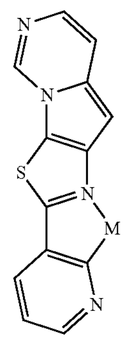
L2260
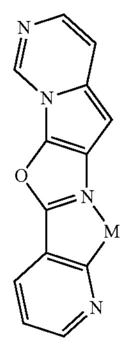
L2261
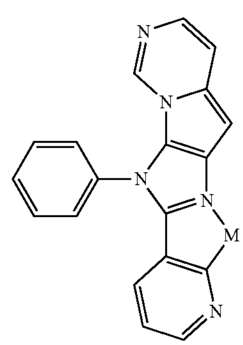

-continued
L2262
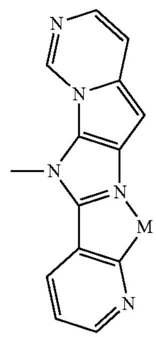
L2263
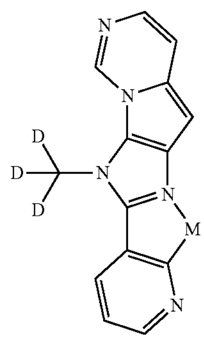
L2264
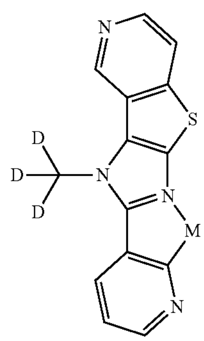
L2265
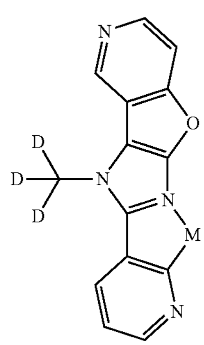
-continued
L2266
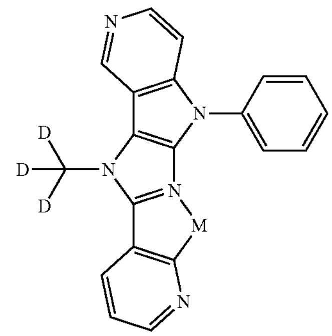
L2267
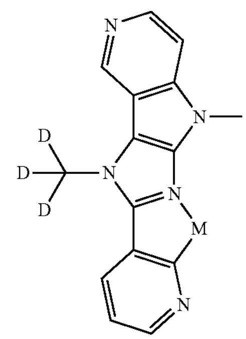
L2268
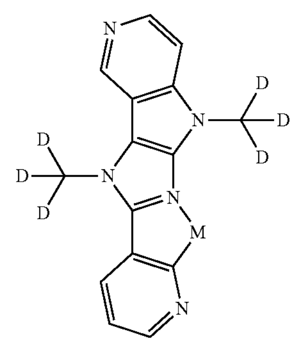
L2269
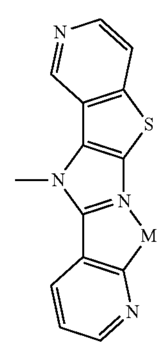

-continued
L2270
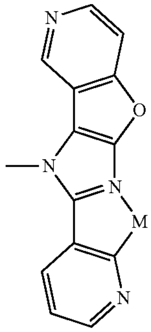
L2271
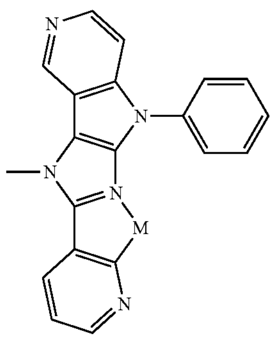
L2272
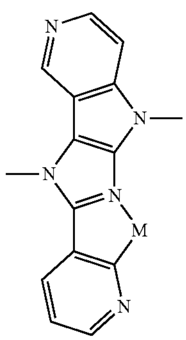
L2273
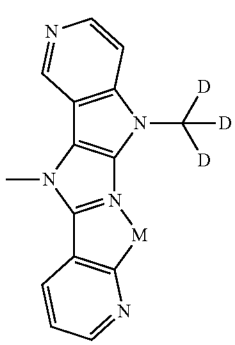
-continued
L2274
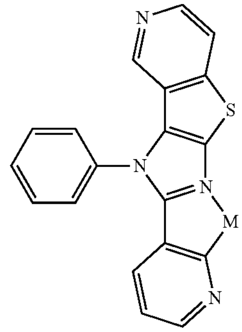
L2275
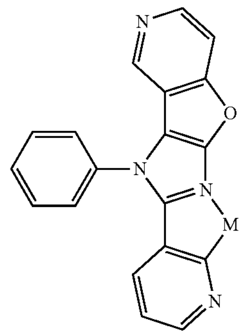
L2276
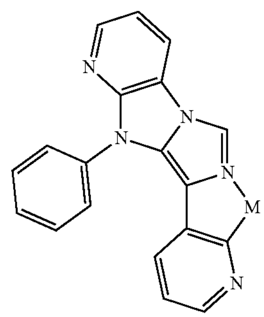
L2277
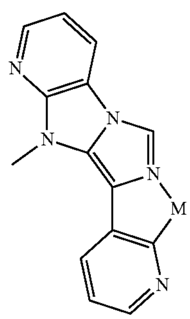
L2278
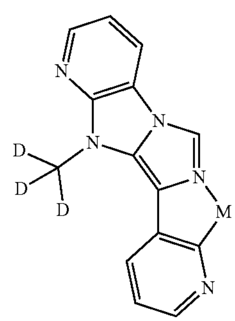

-continued
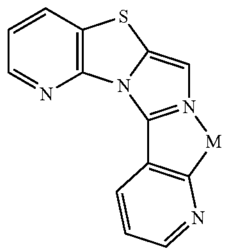
L2279
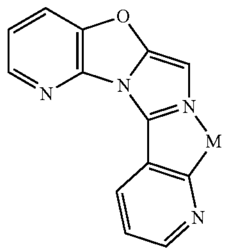
L2280
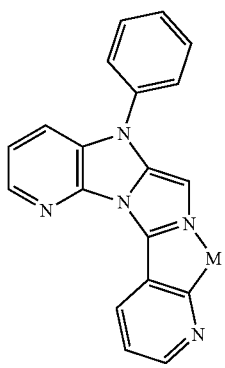
L2281
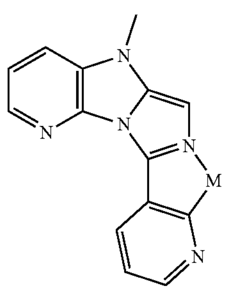
L2282
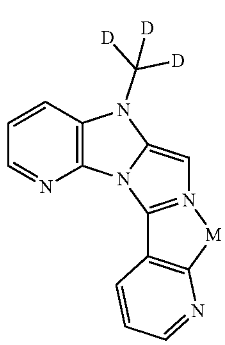
L2283
-continued
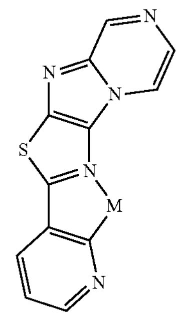
L2284
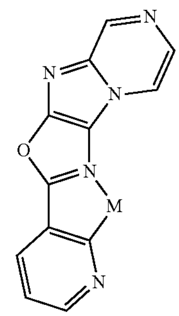
L2285
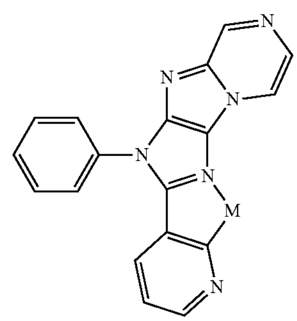
L2286
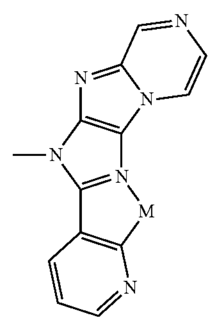
L2287
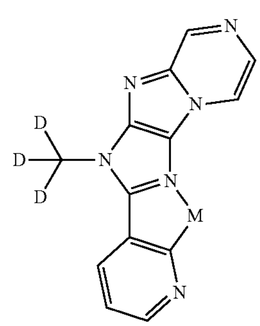
L2288

L2289
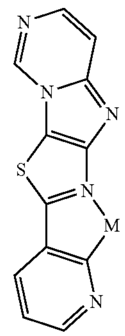
L2290
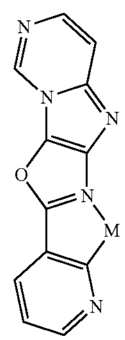
L2291
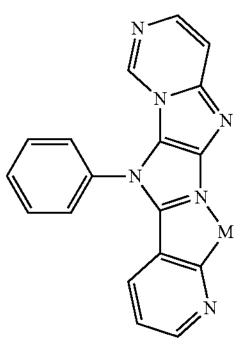
L2292
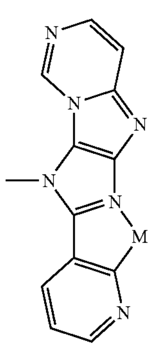
L2293
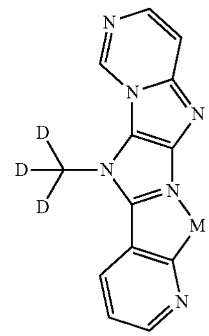
L2294
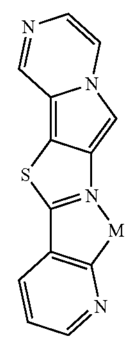
L2295
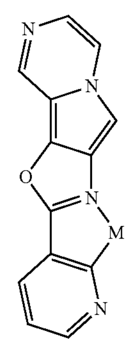
L2296
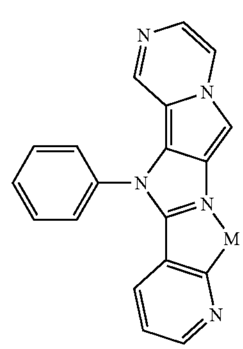

-continued
L2297
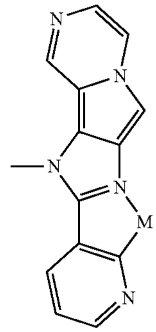
L2298
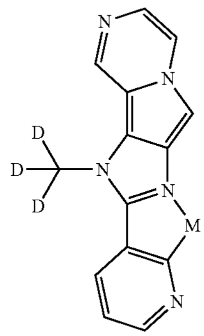
L2299
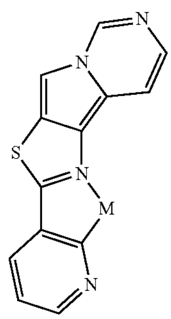
L2300
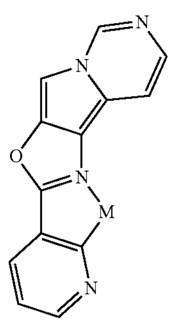
L2301
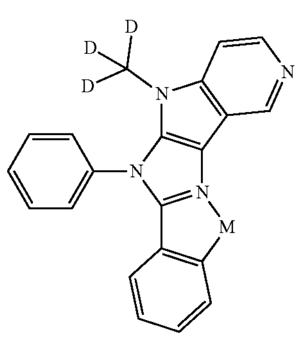
-continued
L2302
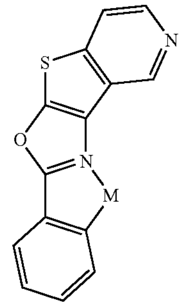
L2303
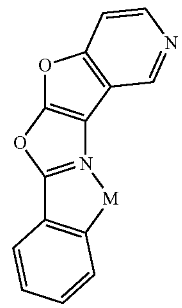
L2304
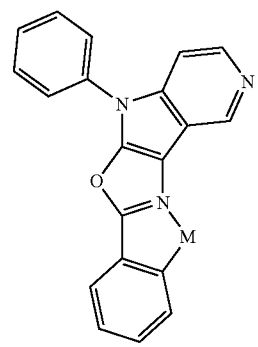
L2305
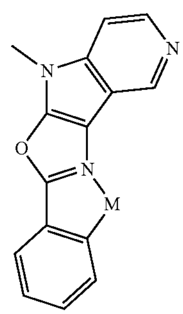
L2306
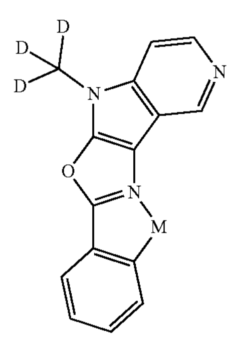

L2307
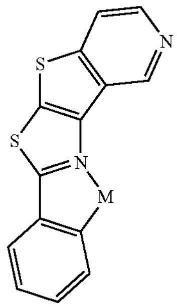
L2308
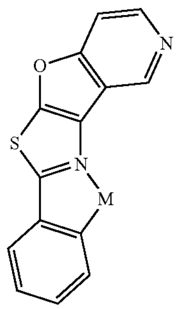
L2309
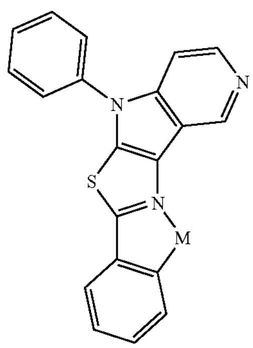
L2310
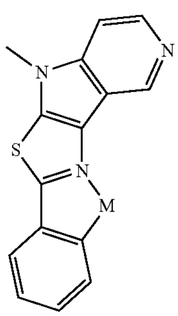
L2311
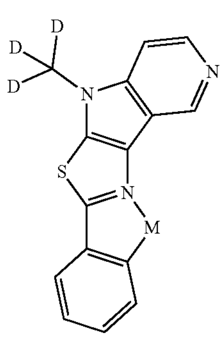
L2312
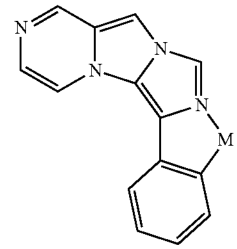
L2313
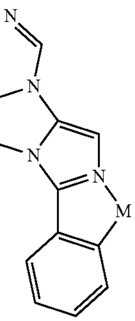
L2314
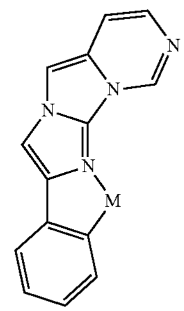
L2315
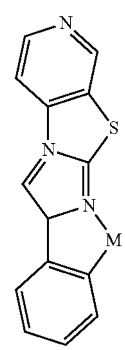
L2316
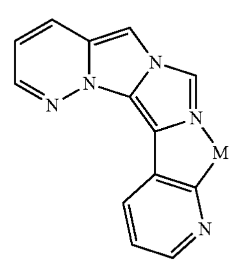

-continued
L2317
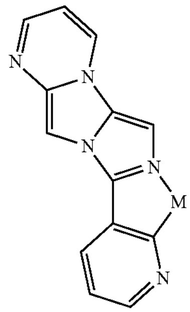
L3218
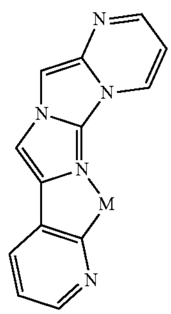
L2319
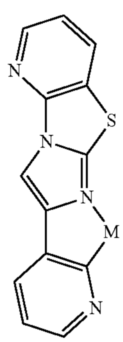
L2320
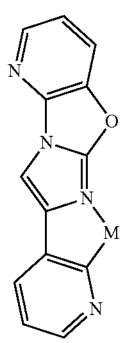
L2321
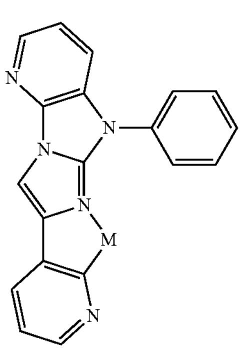
-continued
L2322
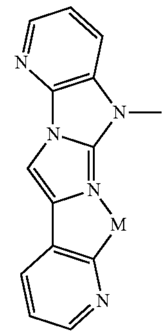
L2323
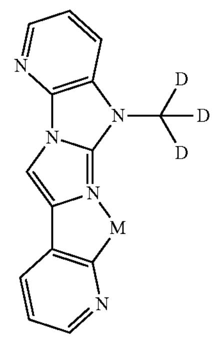
L2324
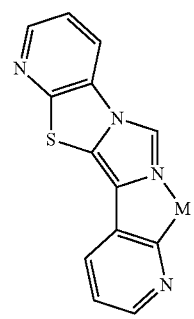
L2325
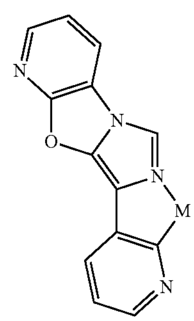
L2326
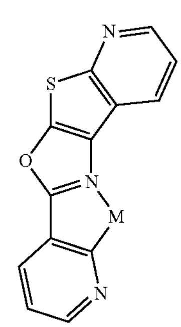

-continued
L2327
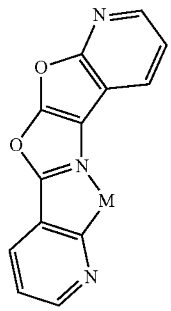
L2328
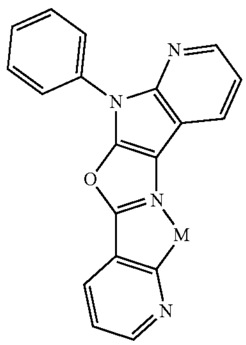
L2329
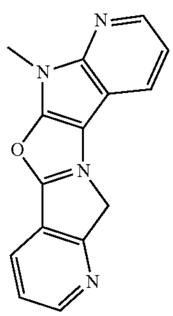
L2330
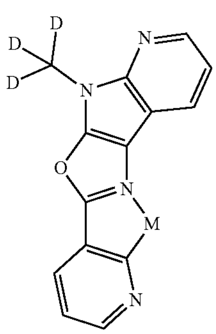
L2331
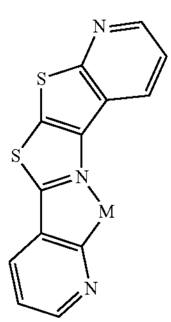
-continued
L2332
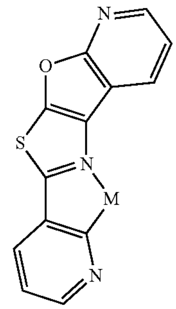
L2333
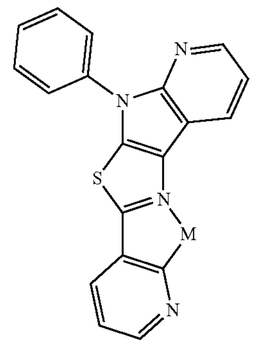
L2334
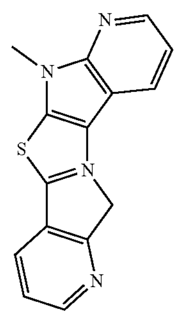
L2335
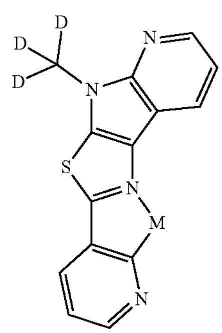
L2336
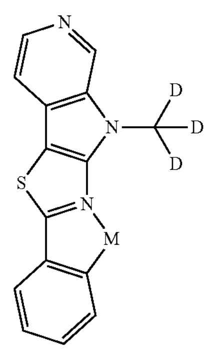

-continued
L2337
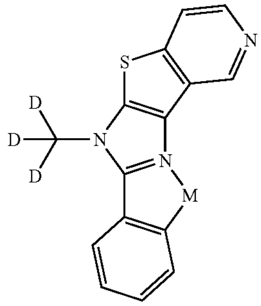
L2338
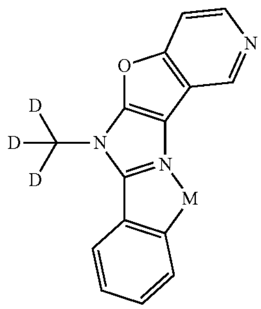
L2339
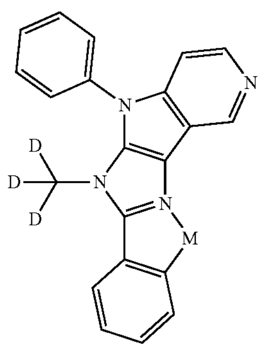
L2340
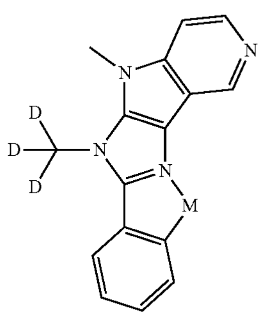
L2341
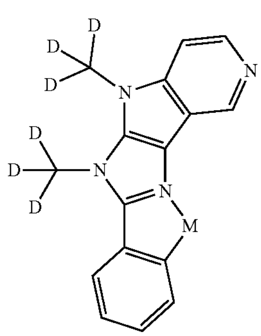
-continued
L2342
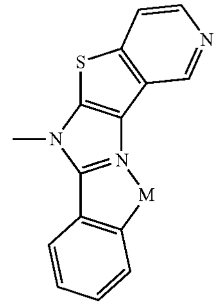
L2343
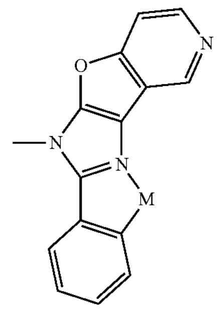
L2344
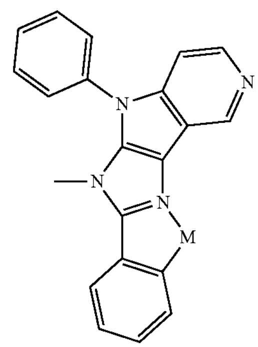
L2345
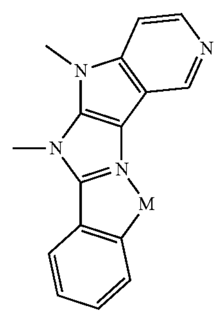
L2346
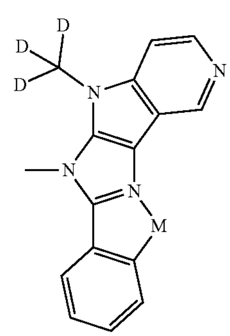

-continued
L2347
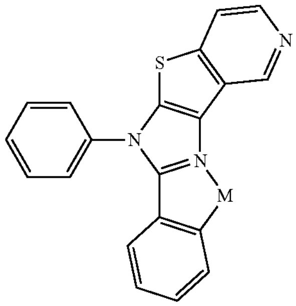
L2348
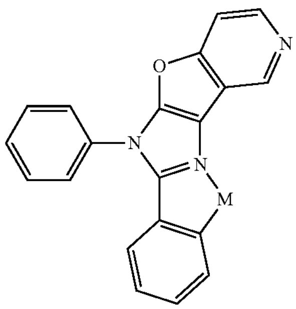
L2349
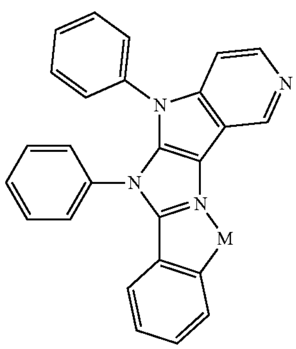
L2350
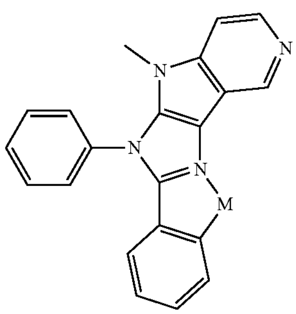
L2351
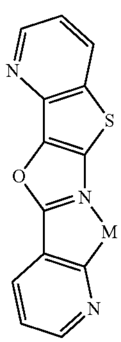
-continued
L2352
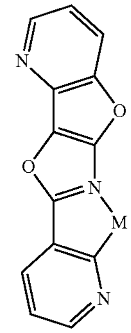
L2353
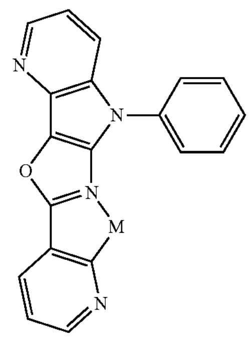
L2354
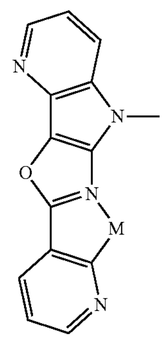
L2355
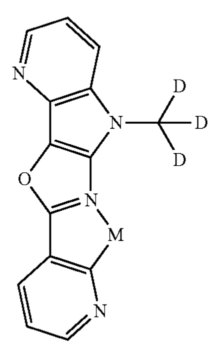

-continued
L2356
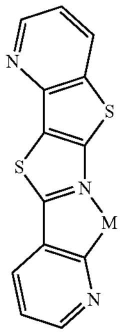
L2357
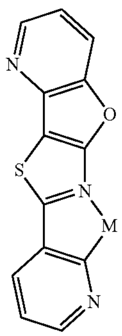
L2358
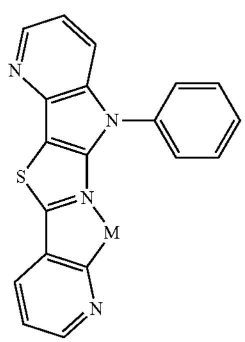
L2359
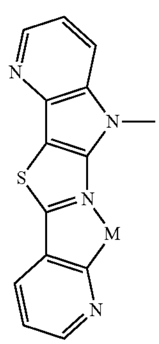
-continued
L2360
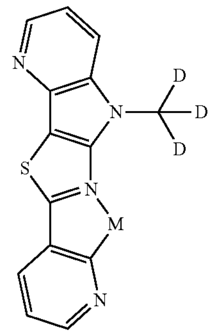
L2361
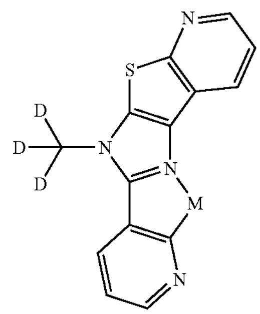
L2362
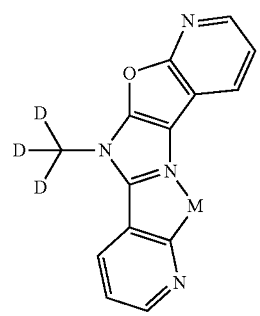
L2363
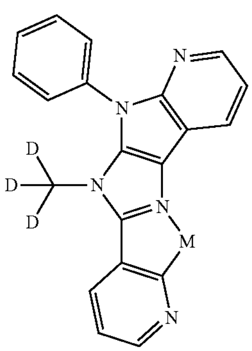
L2364
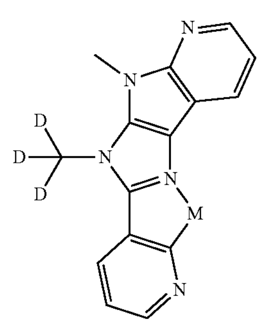

-continued
L2365
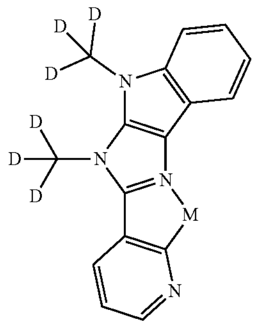
L2366
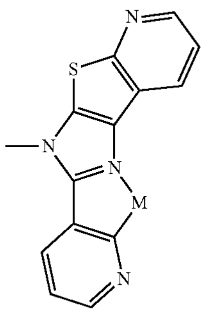
L2367
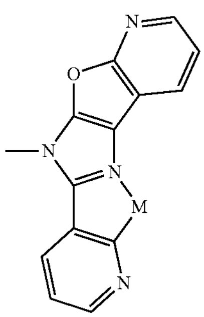
L2368
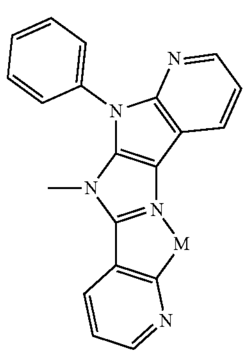
L2369
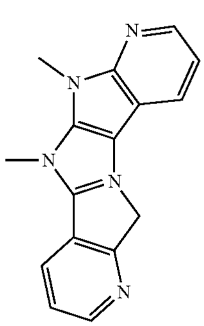
-continued
L2370
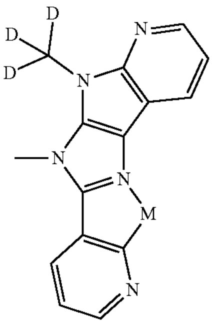
L2371
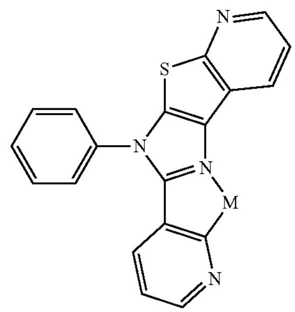
L2372
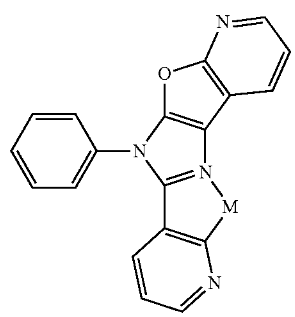
L2373
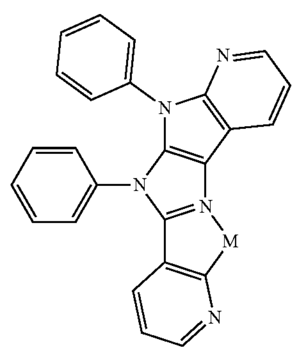
L2374
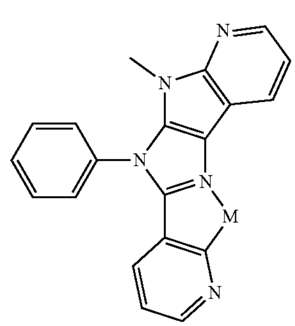

-continued
L2375
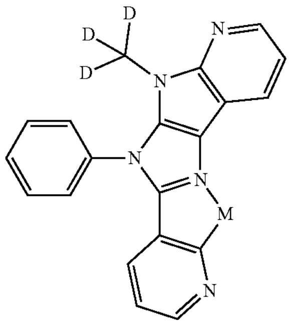
L2376
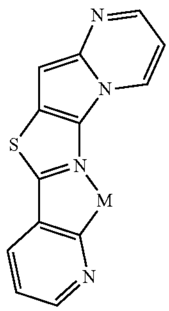
L2377
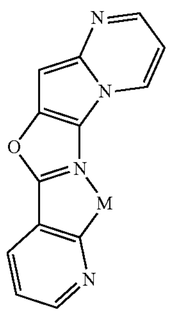
L2378
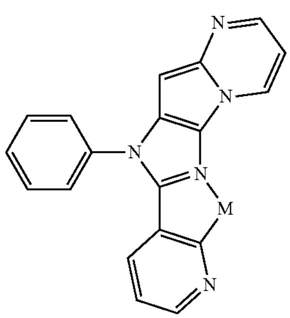
L2379
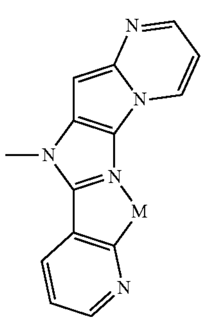
-continued
L2380
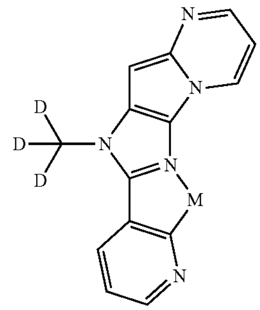
L2381
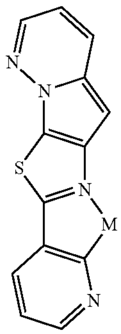
L2382
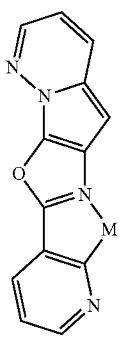
L2383
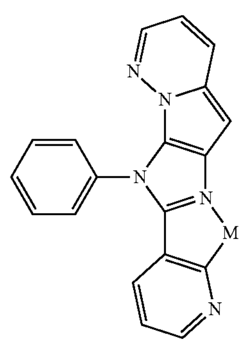

L2384
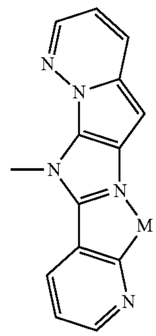
L2385
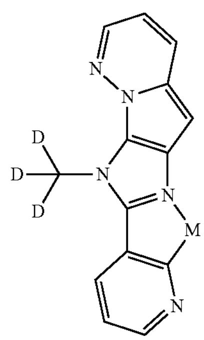
L2386
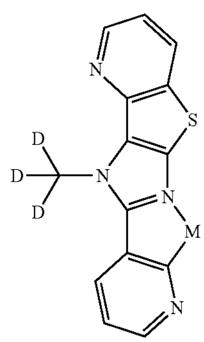
L2387
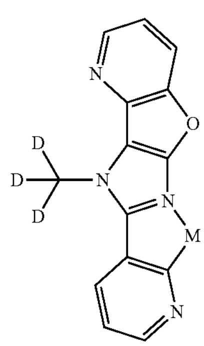
L2388
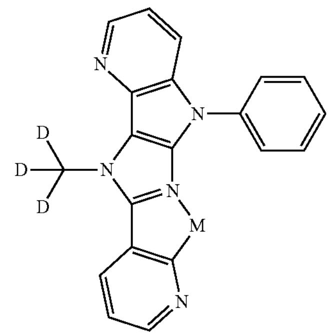
L2389
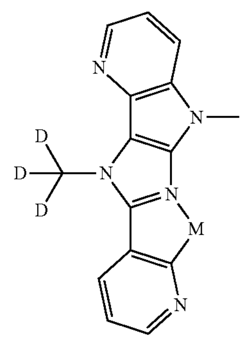
L2390
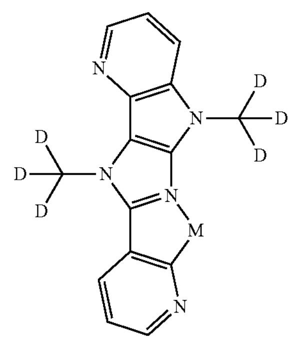
L2391
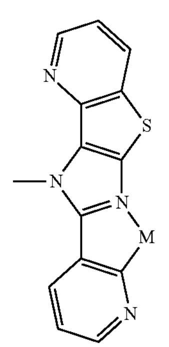

L2392
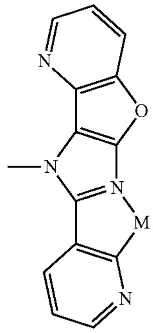
L2393
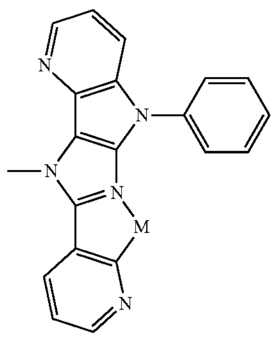
L2394
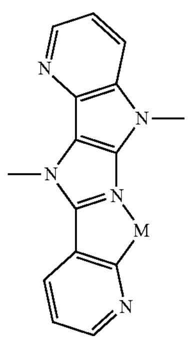
L2395
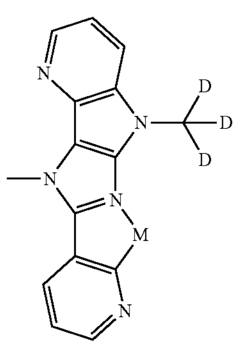
L2396
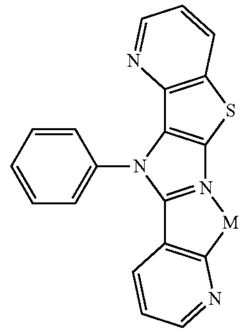
L2397
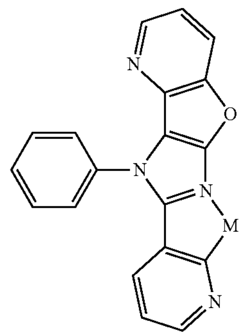
L2398
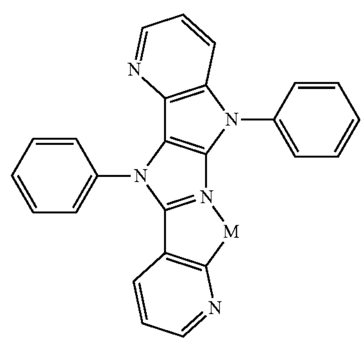
L2399
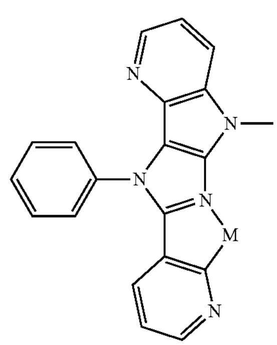

-continued
L2400
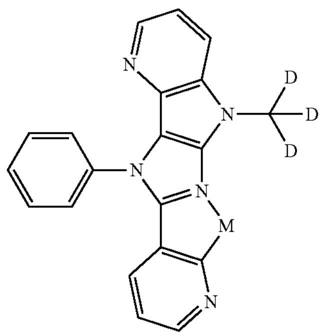
L2401
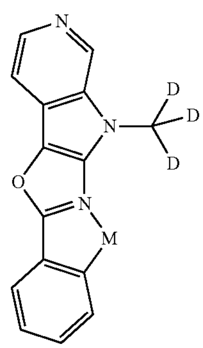
L2402
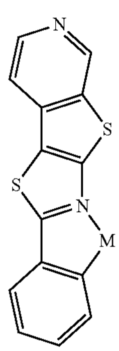
L2403
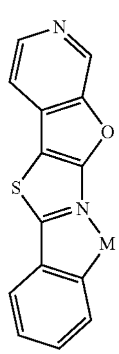
-continued
L2404
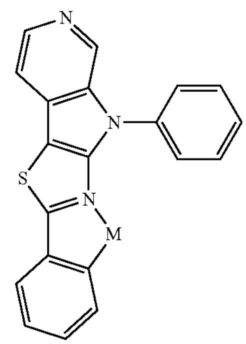
L2405
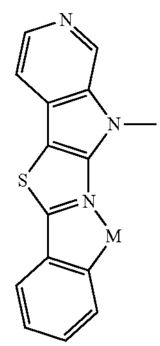
L2406
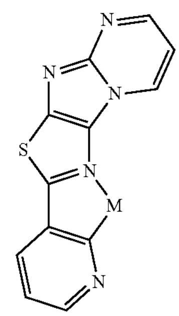
L2407
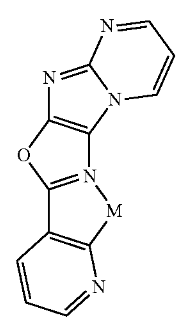
L2408
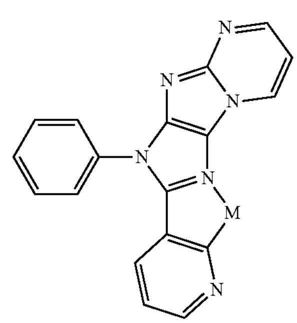

-continued
L2409
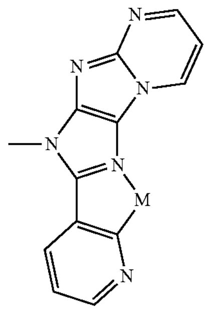
L2410
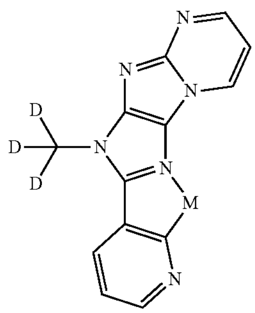
L2411
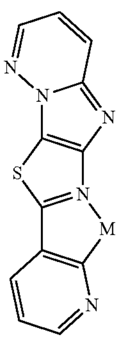
L2412
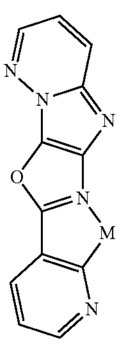
L2413
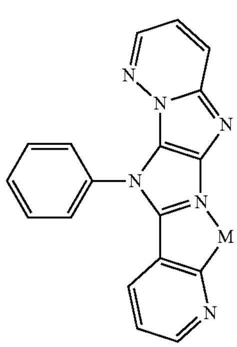
-continued
L2414
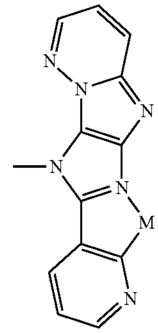
L2415
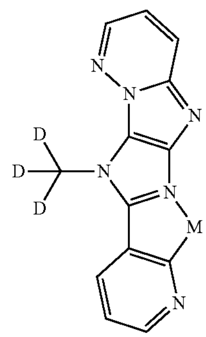
L2416
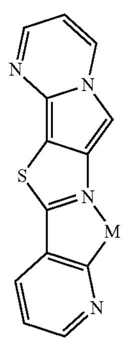
L2417
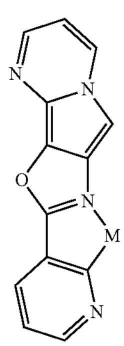

L2418
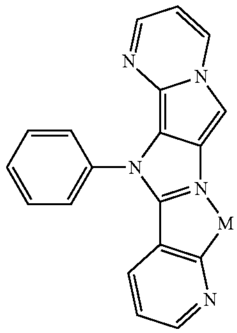
L2419
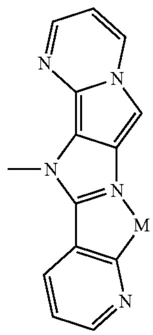
L2420
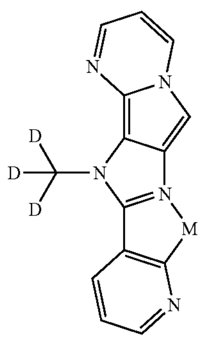
L2421
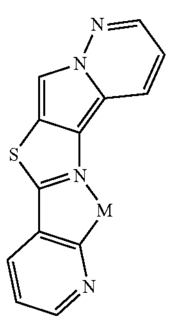
L2422
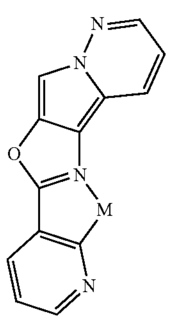
L2423
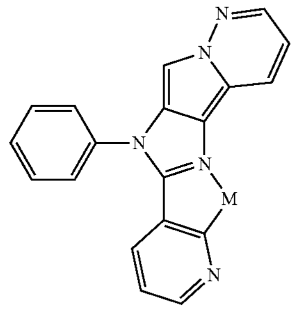
L2424
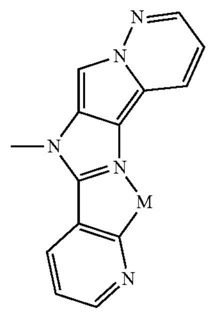
L2425
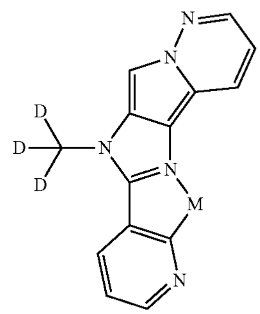
L2426
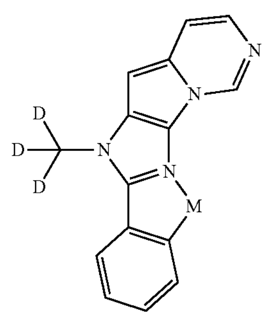
L2427
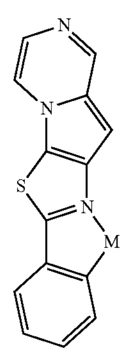

L2428
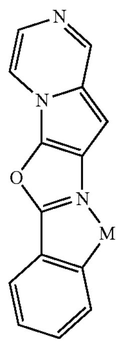
L2429
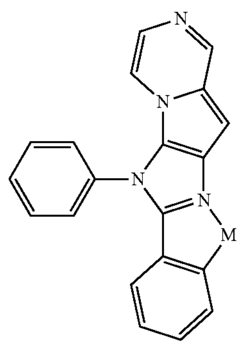
L2430
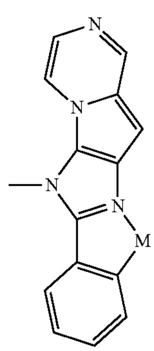
L2431
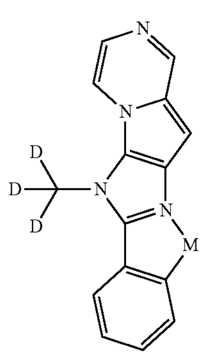
L2432
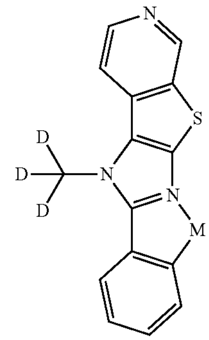
L2433
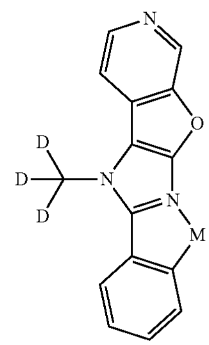
L2434
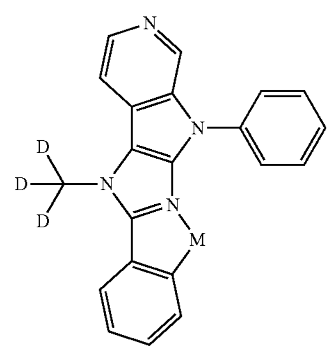
L2435
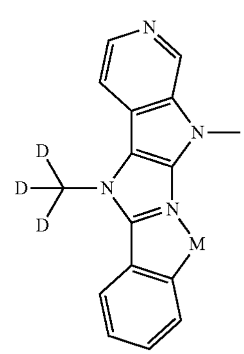

-continued
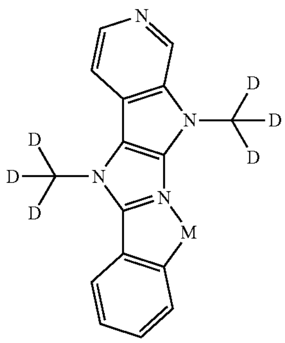
L2436
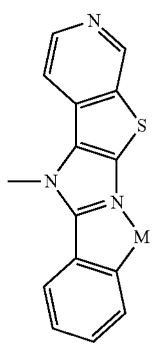
L2437
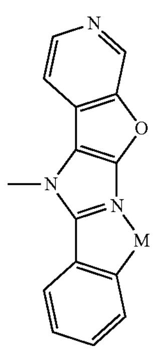
L2438
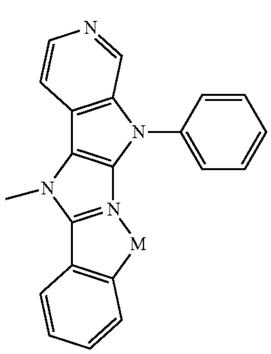
L2439
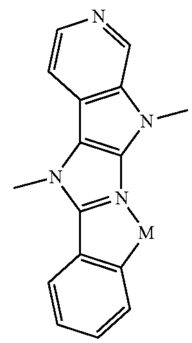
L2440
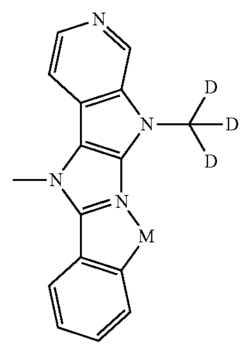
L2441
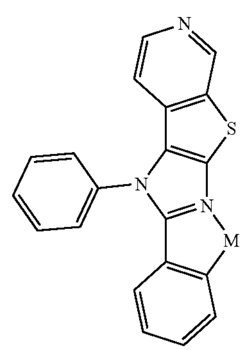
L2442
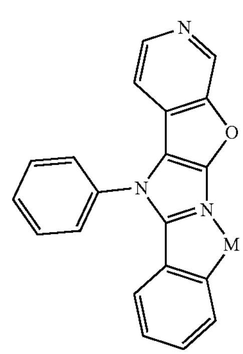
L2443

L2444
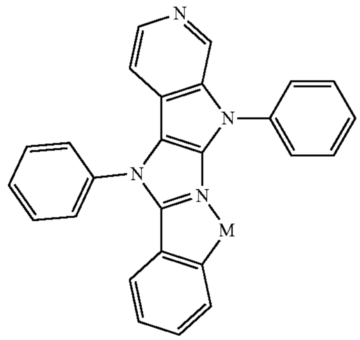
L2445
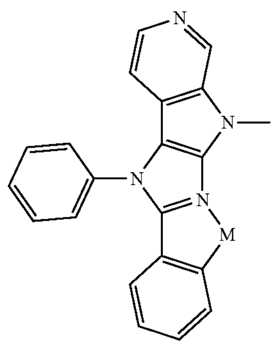
L2446
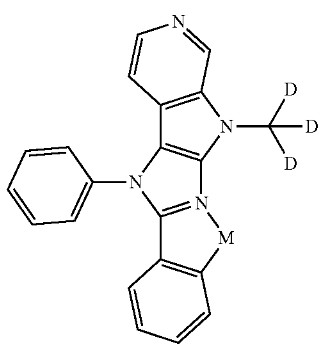
L2447
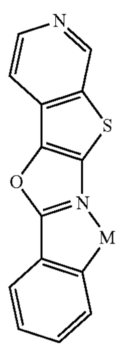
L2448
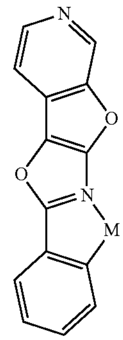
L2449
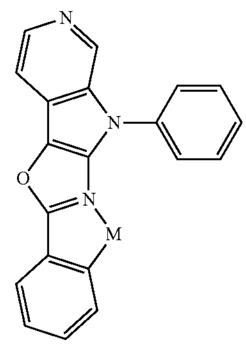
L2450
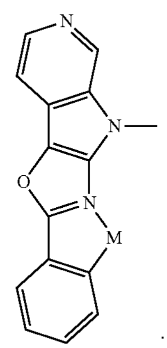
11. The compound of claim 1, wherein each L is independently selected from the group consisting of:
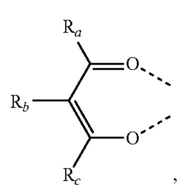
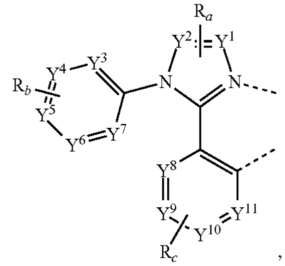

-continued

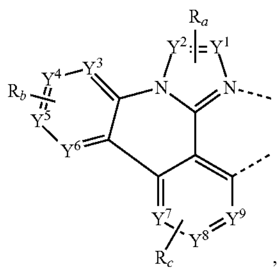
,
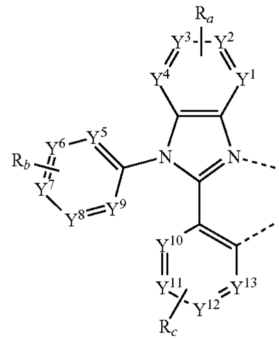
,
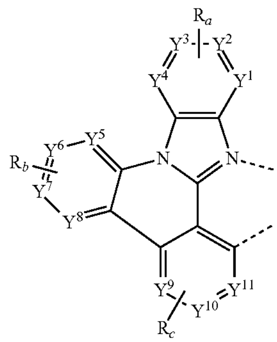
,
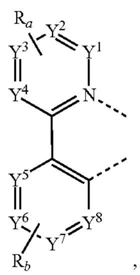
,
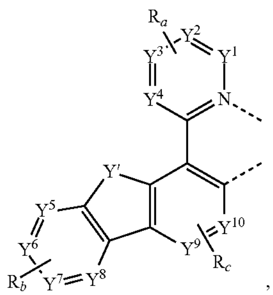
,
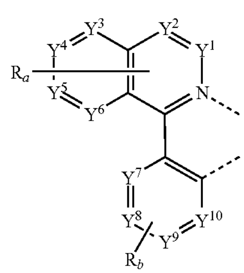
,
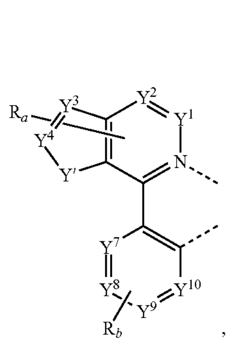
,
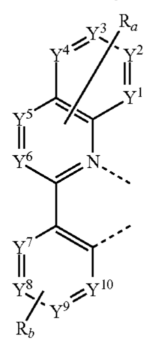
,
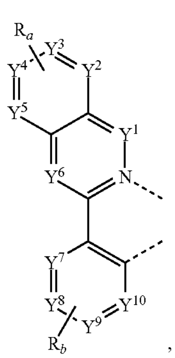
,
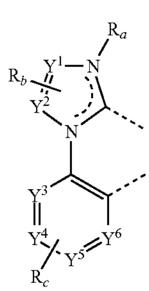
, -continued

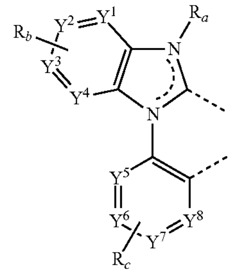
,
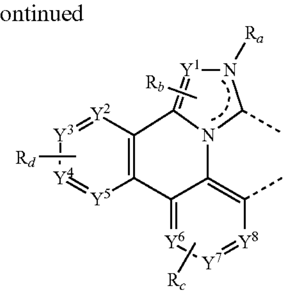
,
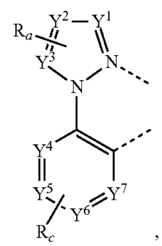
,
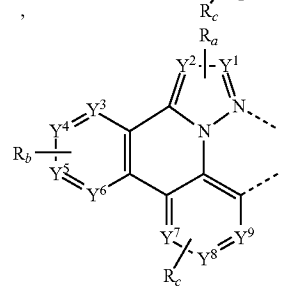
,
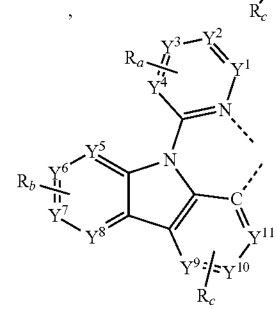
,
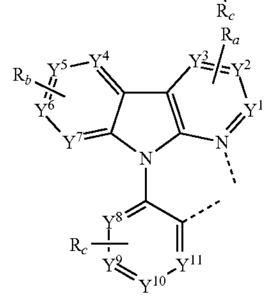
, and
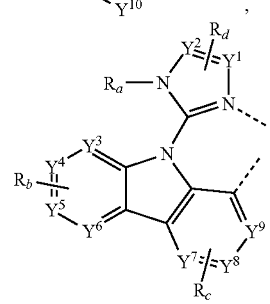
;

wherein each $Y^1$ to $Y^{13}$ are independently selected from the group consisting of carbon and nitrogen;

wherein Y' is selected from the group consisting of B $R_e$, N $R_e$, P $R_e$, O, S, Se, C=O, S=O, $SO_2$, $CR_eR_f$RR, $SiR_eR_f$, and $GeR_eR_f$;

wherein $R_e$ and $R_f$ are optionally fused or joined to form a ring;

wherein each $R_a$, $R_b$, $R_c$, and $R_d$ may independently represent from mono substitution to the maximum possible number of substitution, or no substitution;

wherein each $R_a$, $R_b$, $R_c$, $R_d$, $R_e$ and $R_f$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and wherein any two adjacent substituents of $R_a$, $R_b$, $R_c$, and $R_d$ are optionally fused or joined to form a ring or form a multidentate ligand.

12. The compound of claim 1, wherein each L is independently selected from the group consisting of:

$L_{B1}$

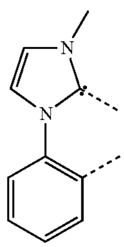

$L_{B2}$

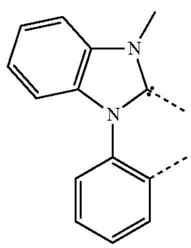

$L_{B3}$

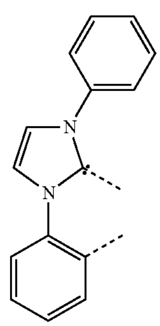

$L_{B4}$

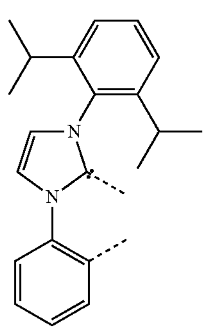

-continued $L_{B5}$

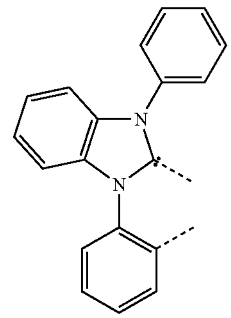

$L_{B6}$

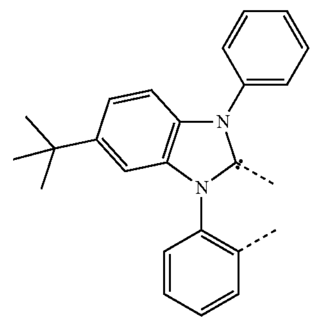

$L_{B7}$

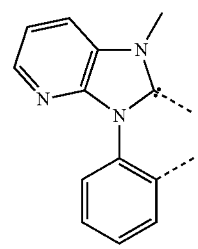

$L_{B8}$

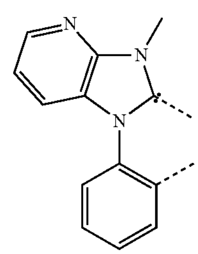

$L_{B9}$

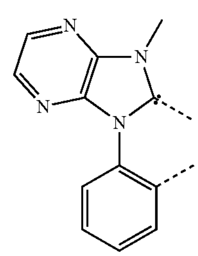

-continued
$L_{B10}$
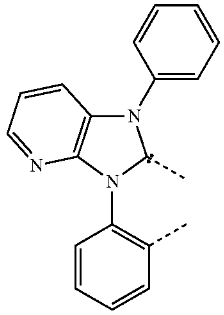
$L_{B11}$
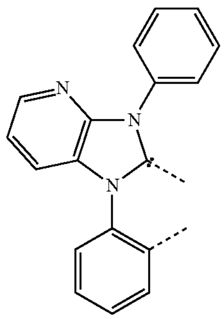
$L_{B12}$
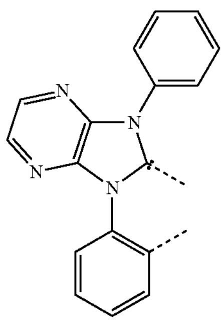
$L_{B13}$
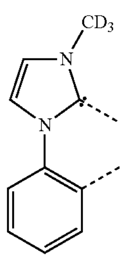
$L_{B14}$
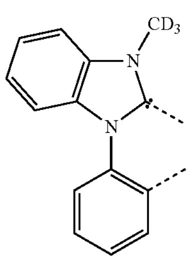
-continued
$L_{B15}$
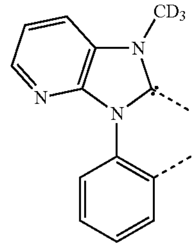
$L_{B16}$
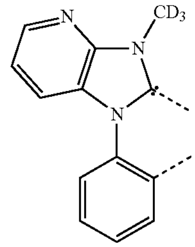
$L_{B17}$
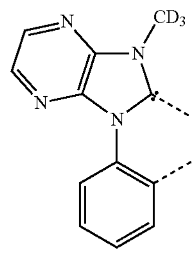
$L_{B18}$
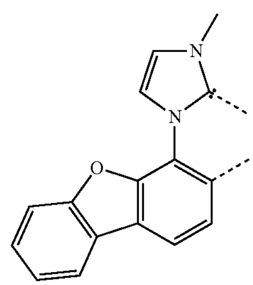
$L_{B19}$
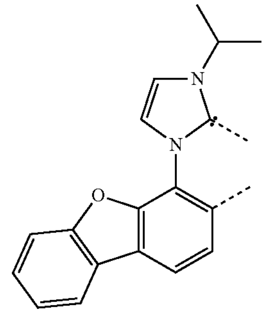

-continued
$L_{B20}$
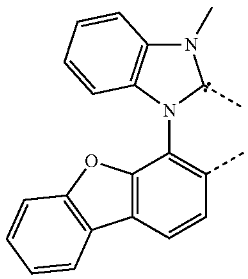
$L_{B21}$
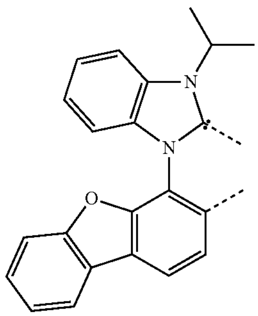
$L_{B22}$
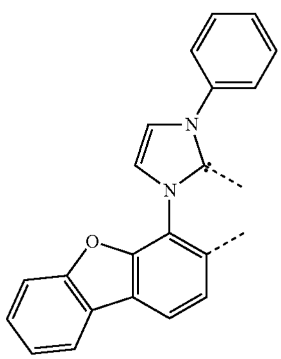
$L_{B23}$
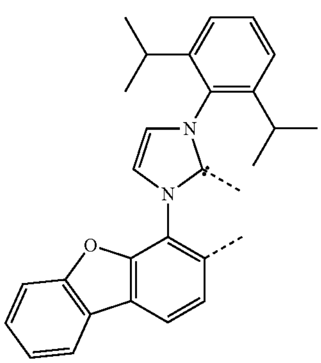
-continued
$L_{B24}$
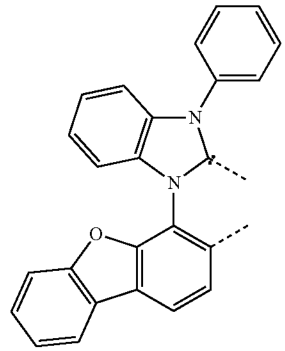
$L_{B25}$
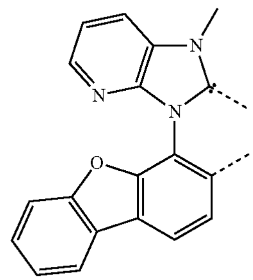
$L_{B26}$
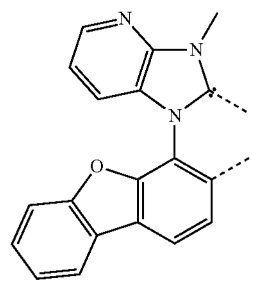
$L_{B27}$
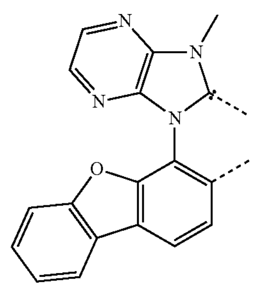
$L_{B28}$
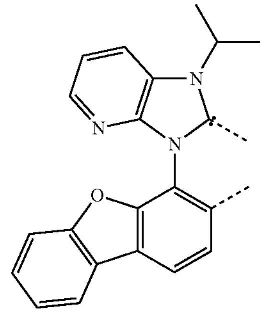

-continued
$L_{B29}$
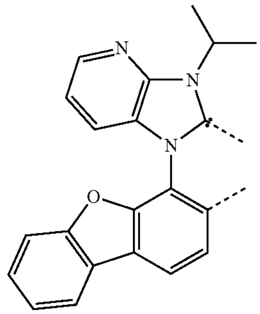
$L_{B30}$
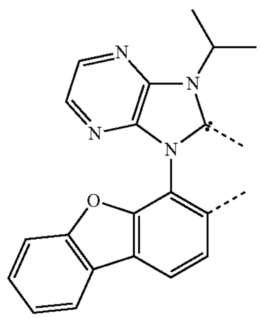
$L_{B31}$
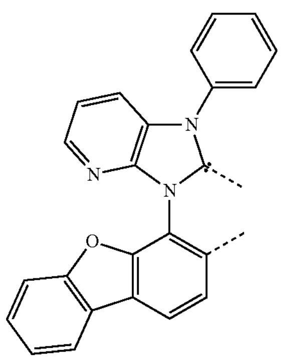
$L_{B32}$
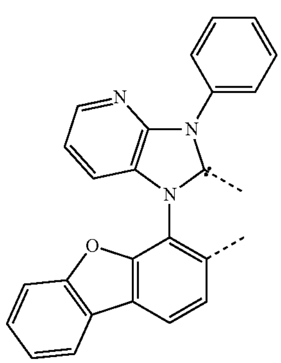
-continued
$L_{B33}$
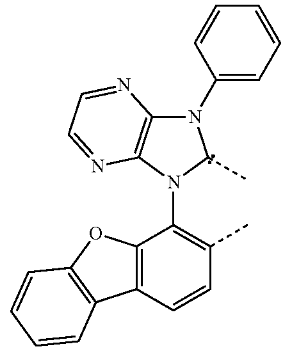
$L_{B34}$
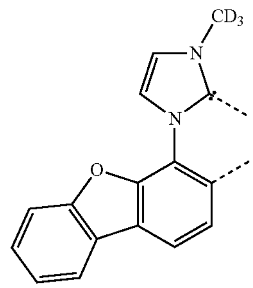
$L_{B35}$
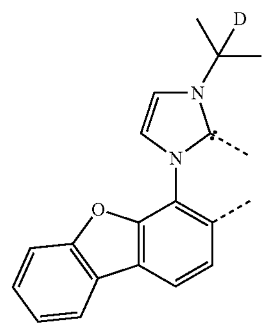
$L_{B36}$
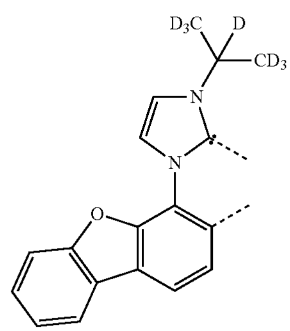
$L_{B37}$
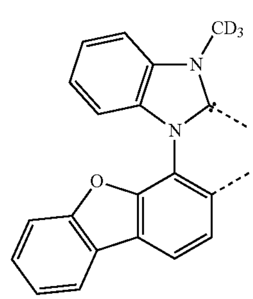

-continued
L$_{B38}$
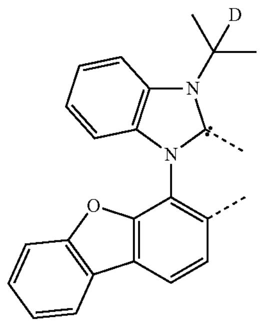
L$_{B39}$
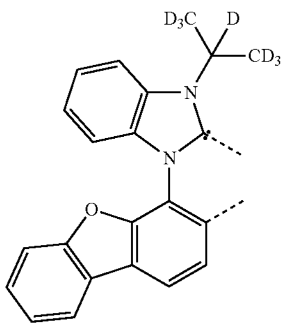
L$_{B40}$
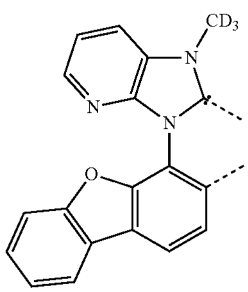
L$_{B41}$
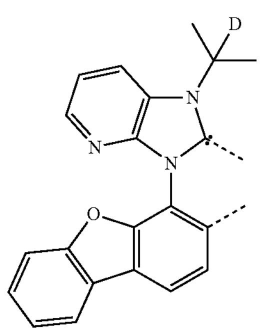
L$_{B42}$
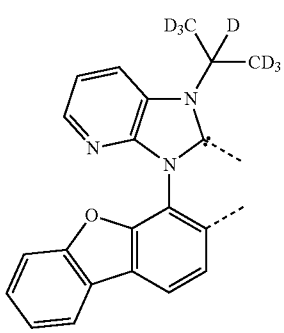
-continued
L$_{B43}$
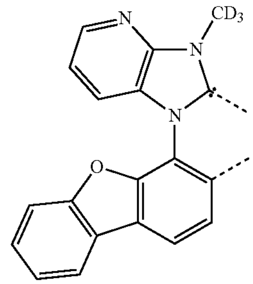
L$_{B44}$
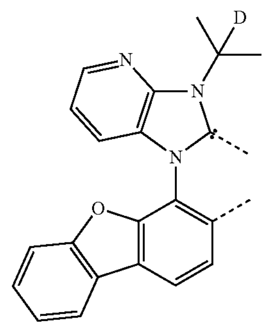
L$_{B45}$
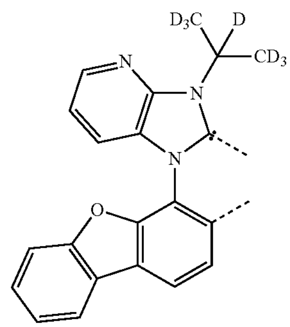
L$_{B46}$
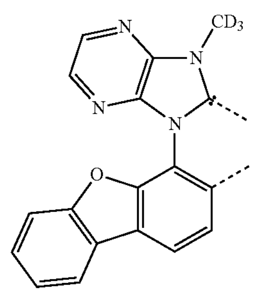
L$_{B47}$
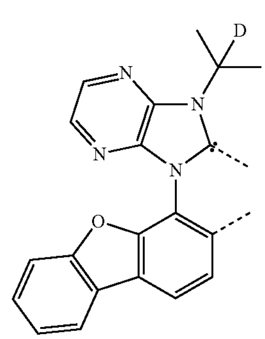

-continued
L_B48
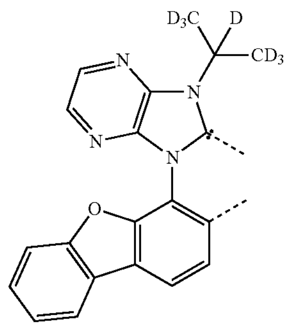
L_B49
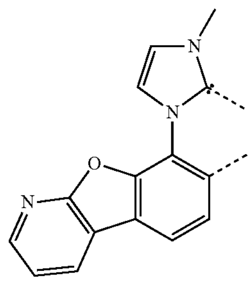
L_B50
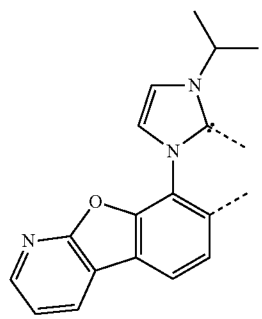
L_B51
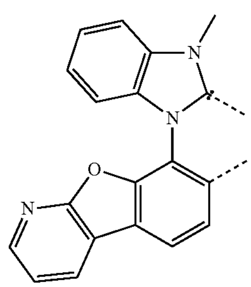
L_B52
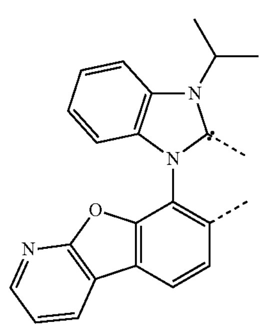
-continued
L_B53
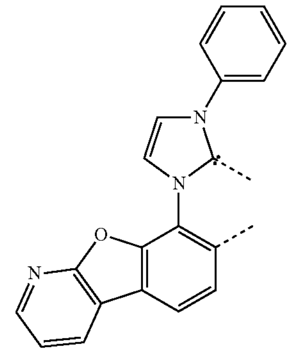
L_B54
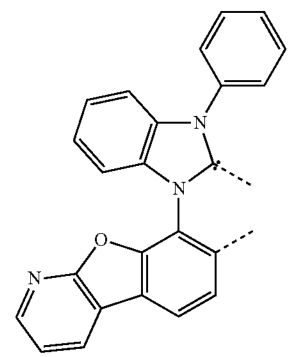
L_B55
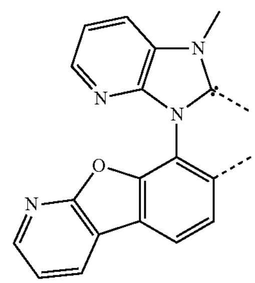
L_B56
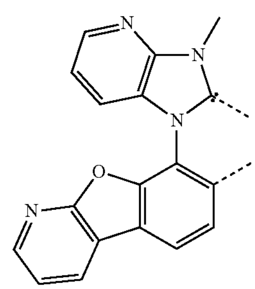
L_B57
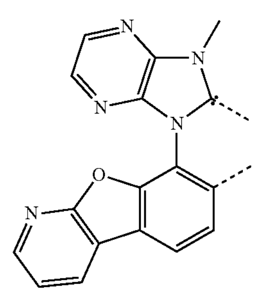

$L_{B58}$
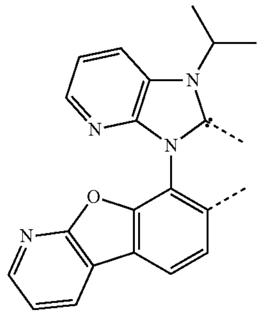
$L_{B59}$
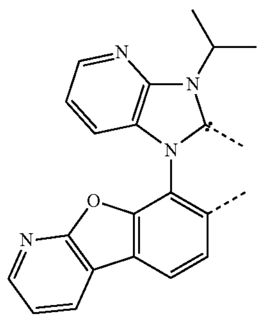
$L_{B60}$
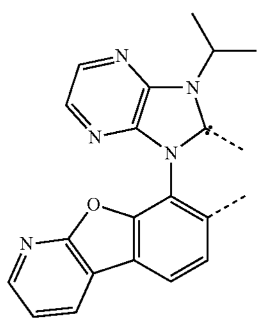
$L_{B61}$
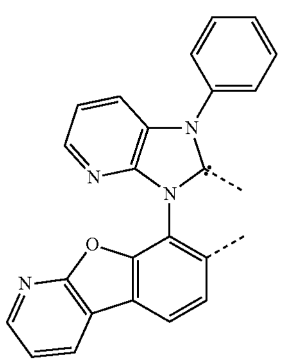
$L_{B62}$
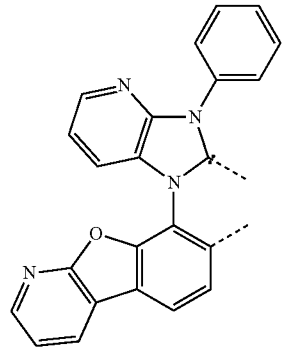
$L_{B63}$
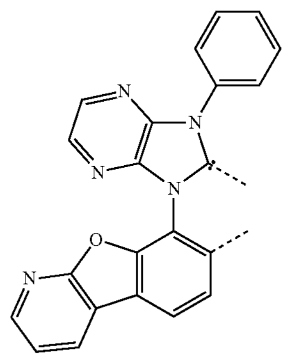
$L_{B64}$
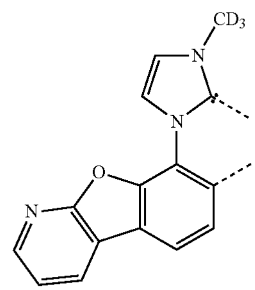
$L_{B65}$
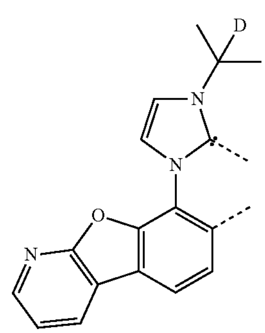

$L_{B66}$
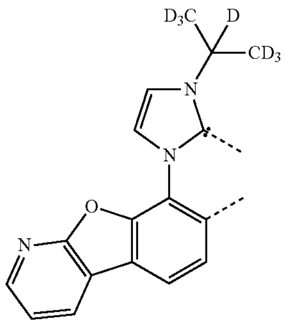
$L_{B67}$
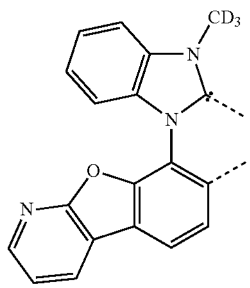
$L_{B68}$
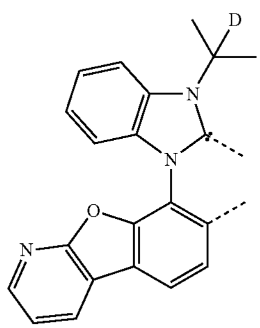
$L_{B69}$
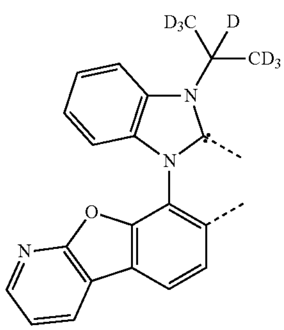
$L_{B70}$
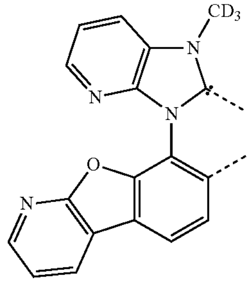
$L_{B71}$
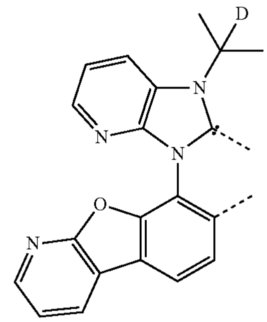
$L_{B72}$
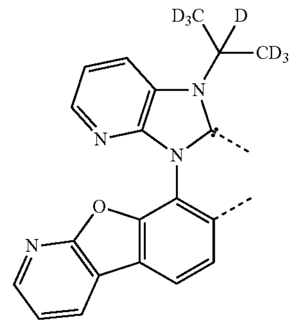
$L_{B73}$
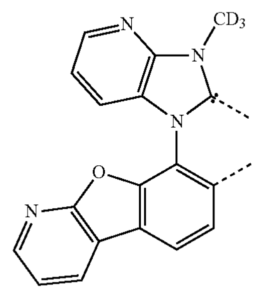
$L_{B74}$
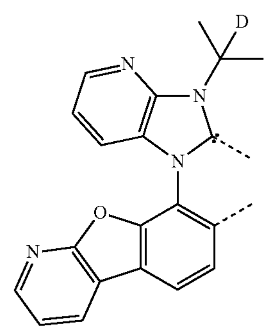
$L_{B75}$
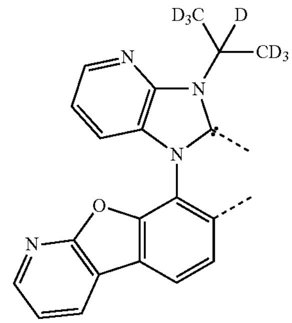

L$_{B76}$
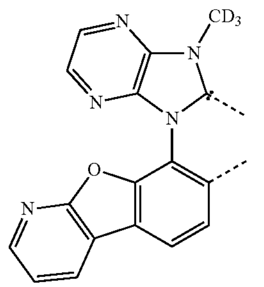
L$_{B77}$
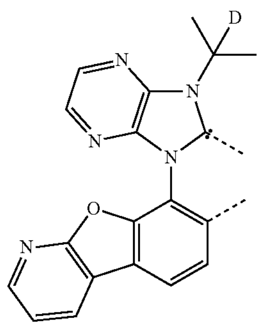
L$_{B78}$
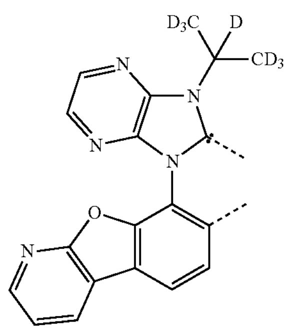
L$_{B79}$
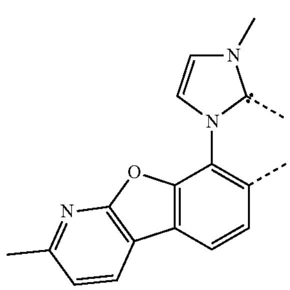
L$_{B80}$
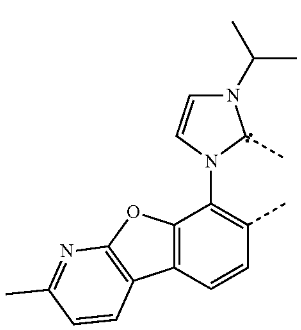
L$_{B81}$
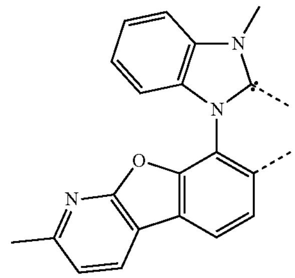
L$_{B82}$
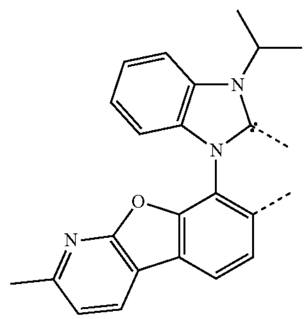
L$_{B83}$
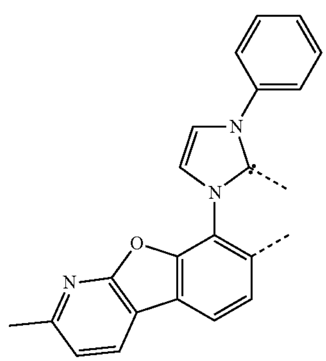
L$_{B84}$
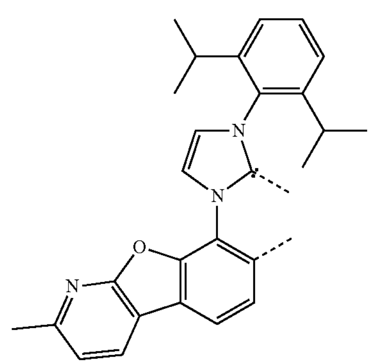

-continued
L$_{B85}$
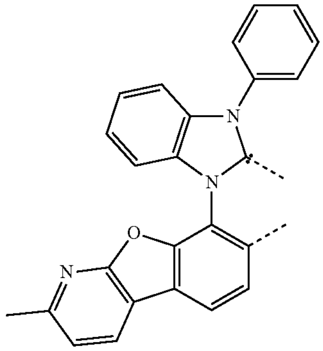
L$_{B86}$
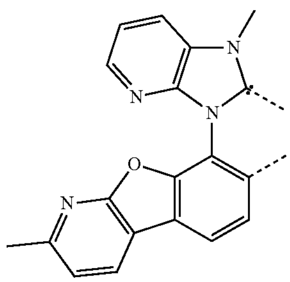
L$_{B87}$
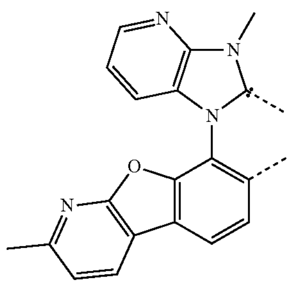
L$_{B88}$
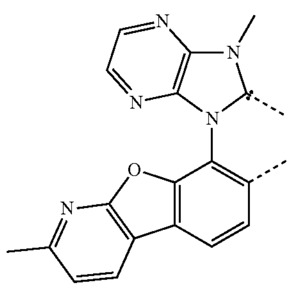
L$_{B89}$
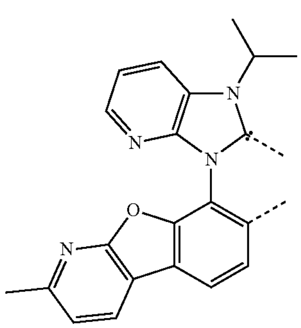
-continued
L$_{B90}$
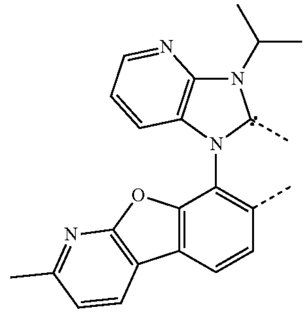
L$_{B91}$
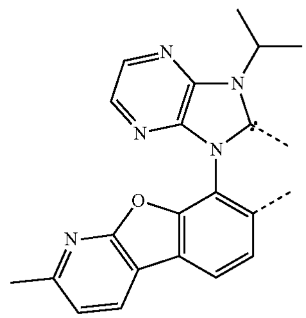
L$_{B92}$
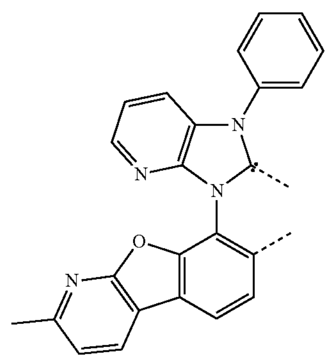
L$_{B93}$
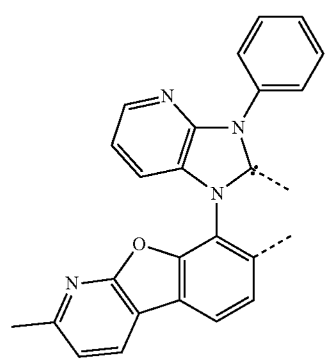

-continued
$L_{B94}$
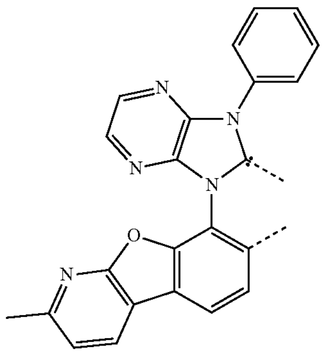
$L_{B95}$
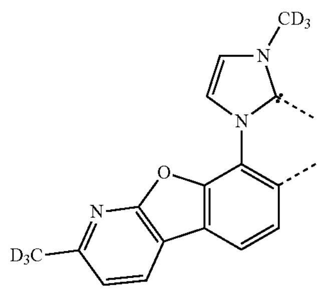
$L_{B96}$
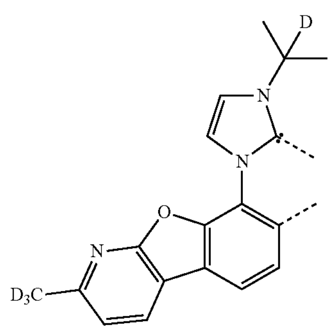
$L_{B97}$
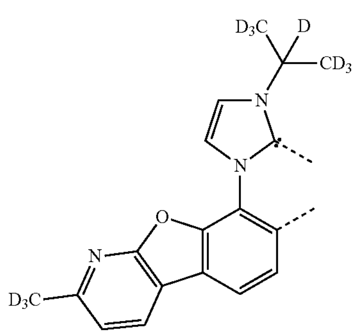
$L_{B98}$
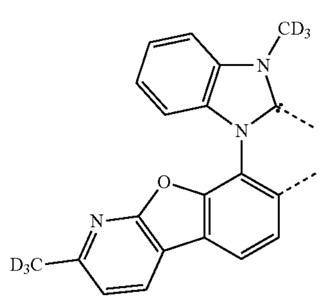
-continued
$L_{B99}$
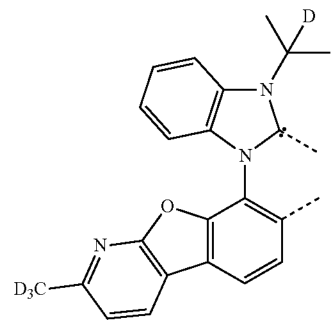
$L_{B100}$
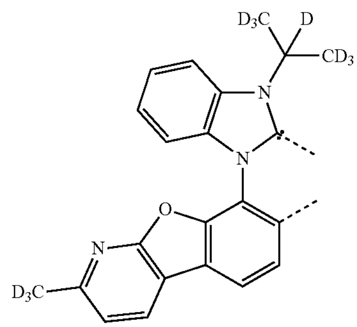
$L_{B101}$
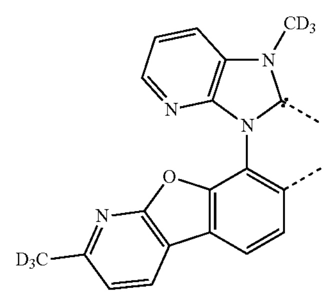
$L_{B102}$
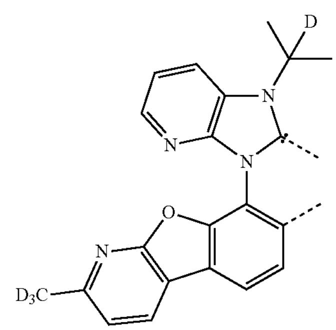
$L_{B103}$
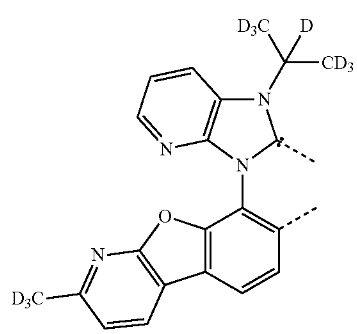

-continued
L$_{B104}$
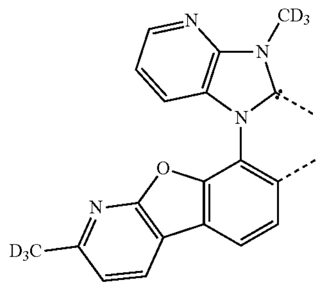
L$_{B105}$
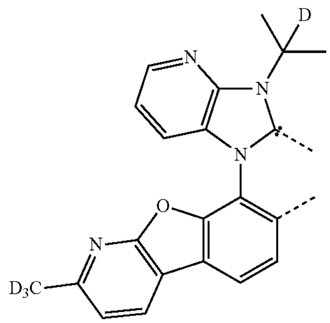
L$_{B106}$
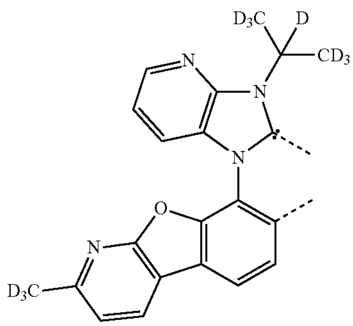
L$_{B107}$
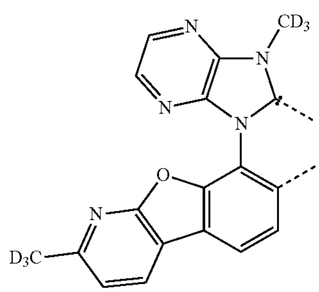
L$_{B108}$
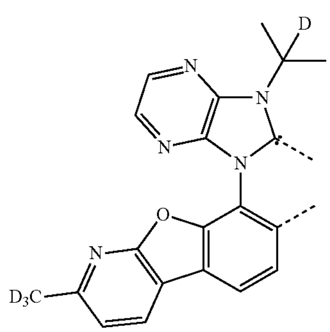
-continued
L$_{B109}$
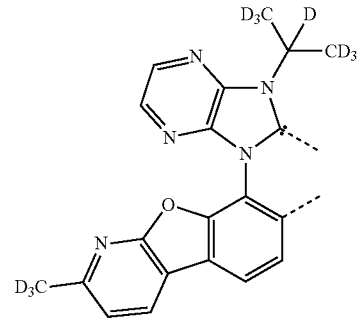
L$_{B110}$
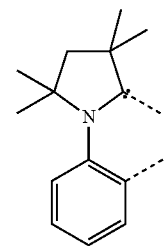
L$_{B111}$
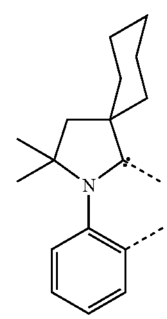
L$_{B112}$
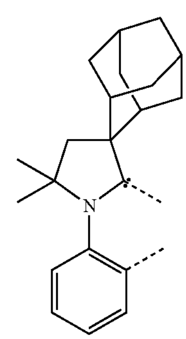
L$_{B113}$
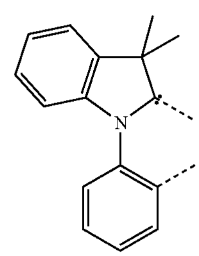

-continued
$L_{B114}$
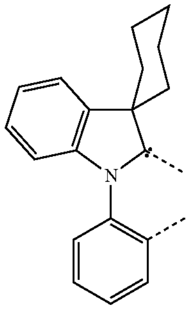
$L_{B115}$
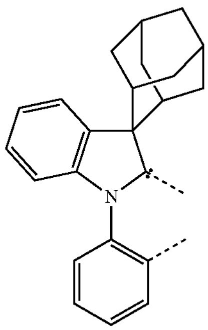
$L_{B116}$
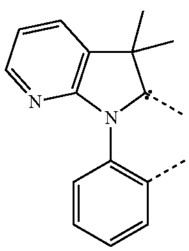
$L_{B117}$
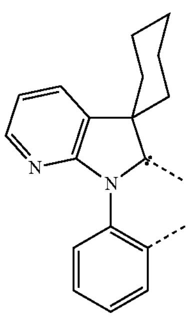
$L_{B118}$
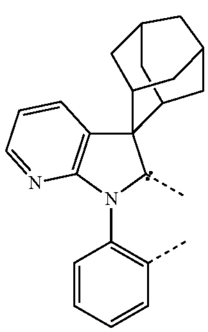
-continued
$L_{B119}$
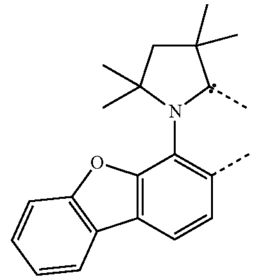
$L_{B120}$
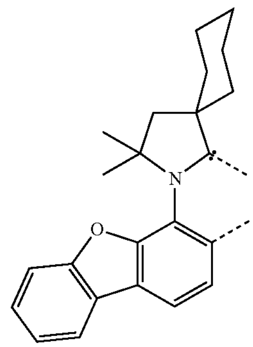
$L_{B121}$
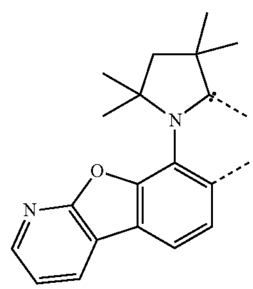
$L_{B122}$
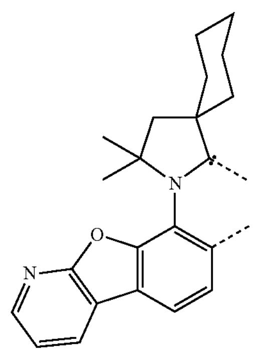
$L_{B123}$
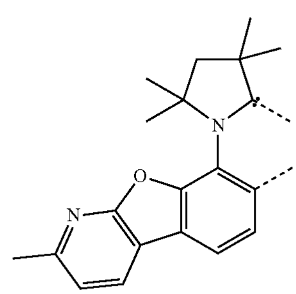

$L_{B124}$
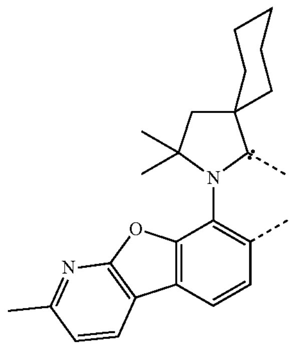
$L_{B125}$
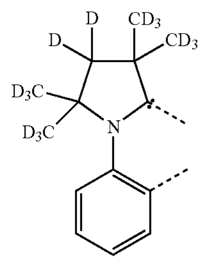
$L_{B126}$
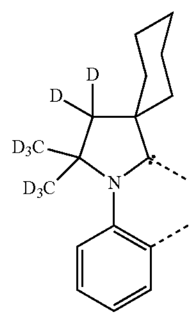
$L_{B127}$
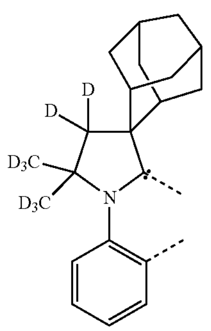
$L_{B128}$
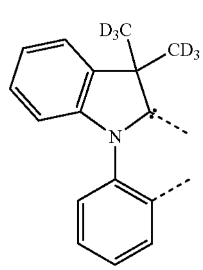
$L_{B129}$
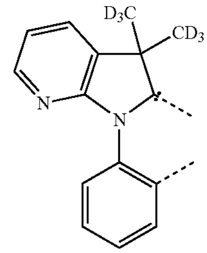
$L_{B130}$
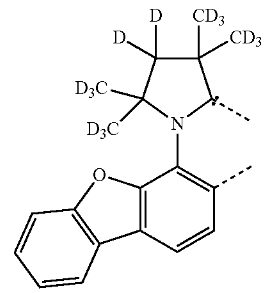
$L_{B131}$
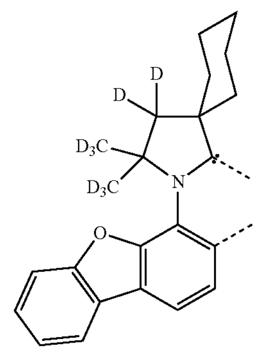
$L_{B132}$
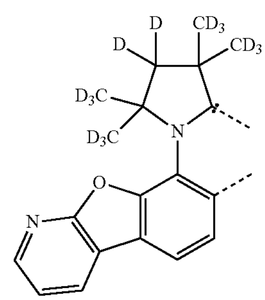
$L_{B133}$
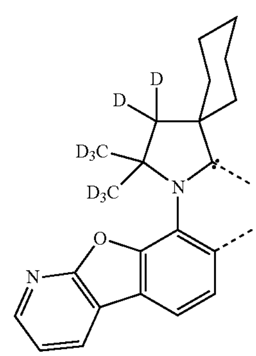

-continued
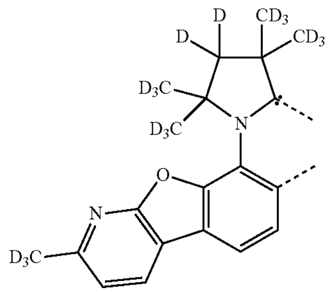
$L_{B134}$
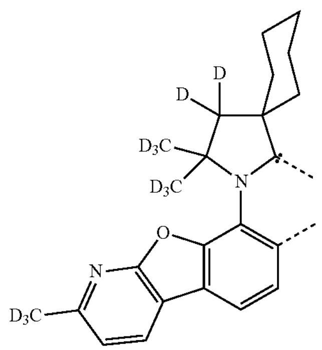
$L_{B135}$
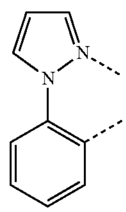
$L_{B136}$
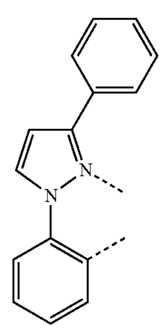
$L_{B137}$
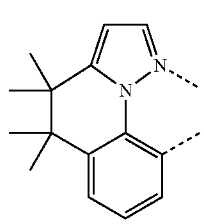
$L_{B138}$
-continued
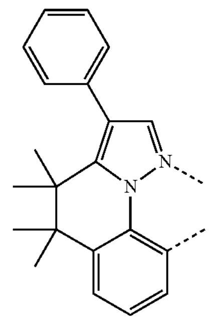
$L_{B139}$
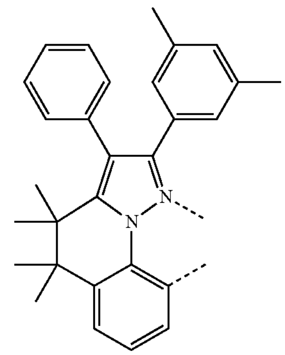
$L_{B140}$
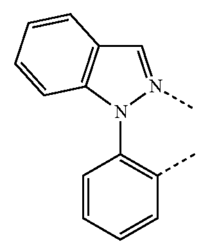
$L_{B141}$
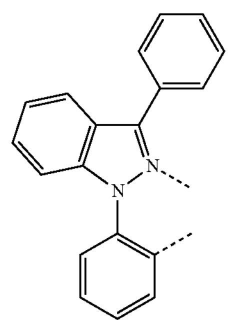
$L_{B142}$
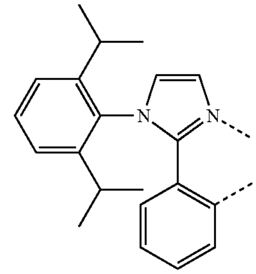
$L_{B143}$ -continued
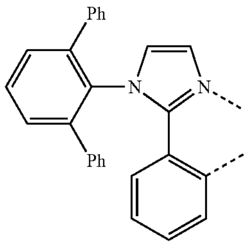
$L_{B144}$
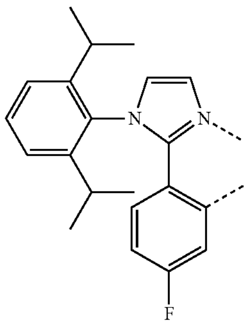
$L_{B145}$
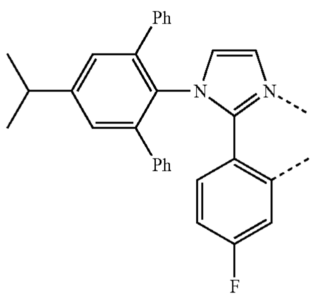
$L_{B146}$
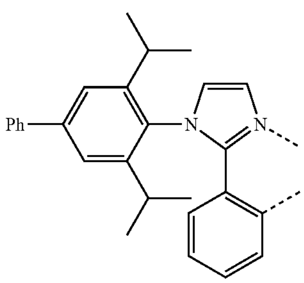
$L_{B147}$
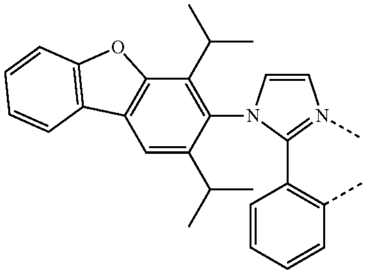
$L_{B148}$
-continued
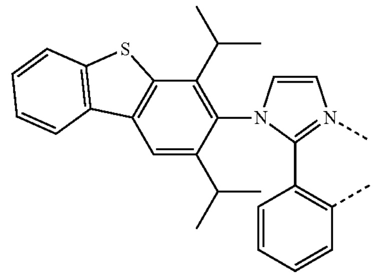
$L_{B149}$
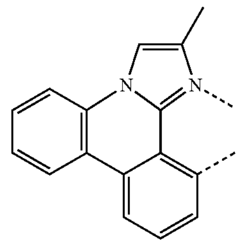
$L_{B150}$
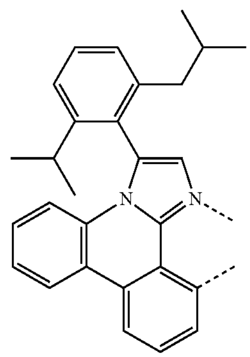
$L_{B151}$
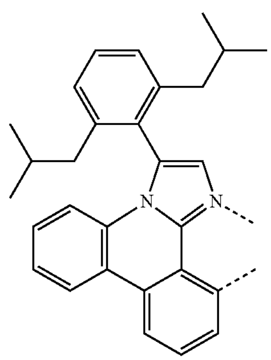
$L_{B152}$
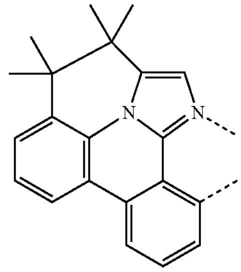
$L_{B153}$ -continued
$L_{B154}$
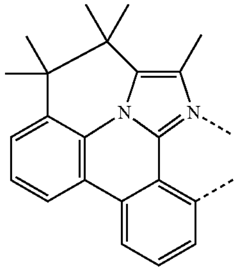
$L_{B155}$
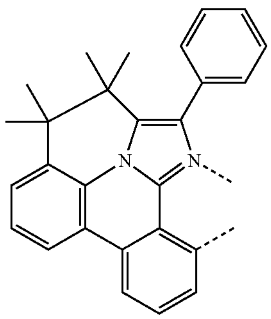
$L_{B156}$
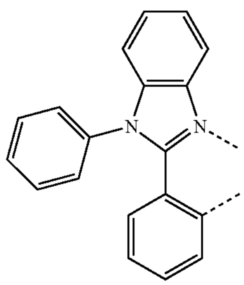
$L_{B157}$
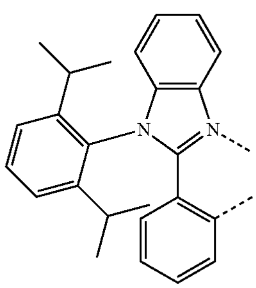
$L_{B158}$
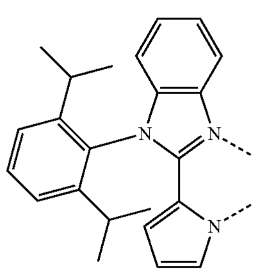
-continued
$L_{B159}$
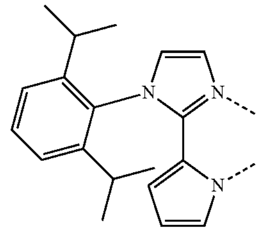
$L_{B160}$
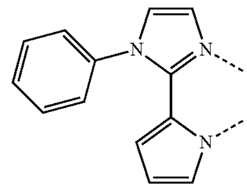
$L_{B161}$
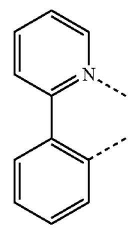
$L_{B162}$
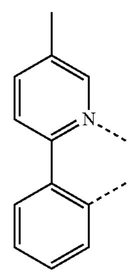
$L_{B163}$
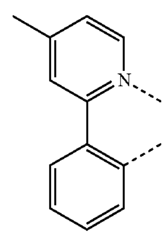
$L_{B164}$
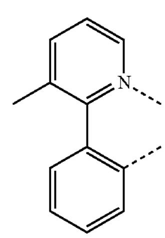

-continued
$L_{B165}$
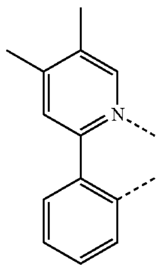
$L_{B166}$
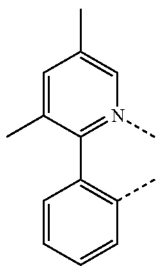
$L_{B167}$
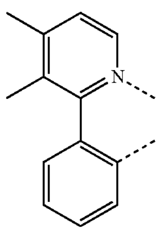
$L_{B168}$
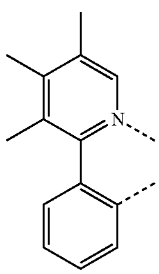
$L_{B169}$
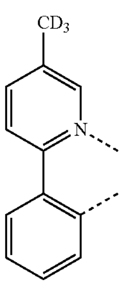
$L_{B170}$
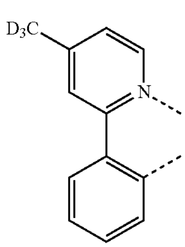
-continued
$L_{B171}$
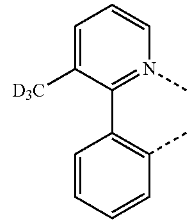
$L_{B172}$
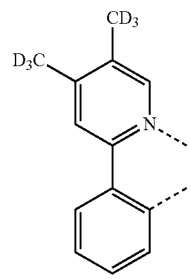
$L_{B173}$
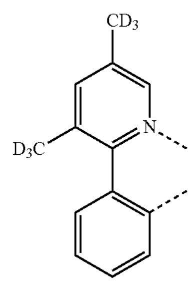
$L_{B174}$
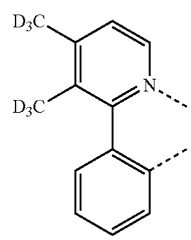
$L_{B175}$
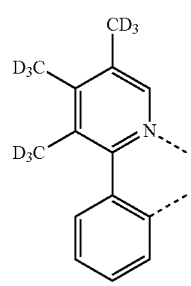
$L_{B176}$
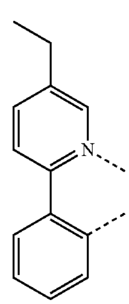

-continued
$L_{B177}$
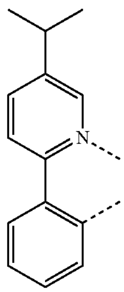
$L_{B178}$
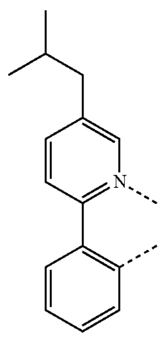
$L_{B179}$
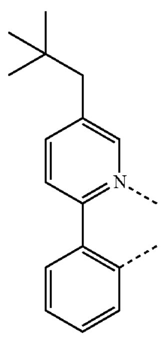
$L_{B180}$
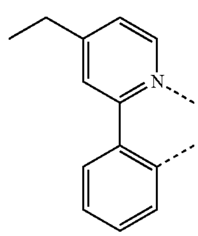
$L_{B181}$
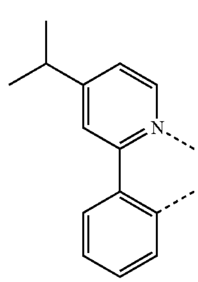
-continued
$L_{B182}$
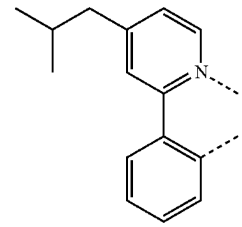
$L_{B183}$
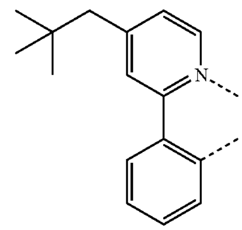
$L_{B184}$
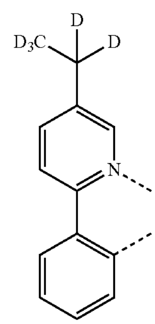
$L_{B185}$
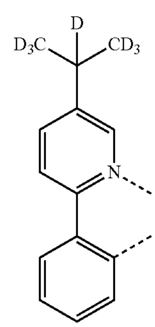
$L_{B186}$
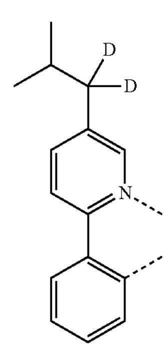

-continued
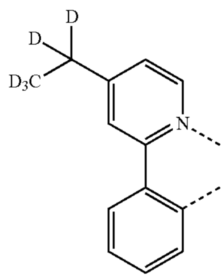
$L_{B187}$
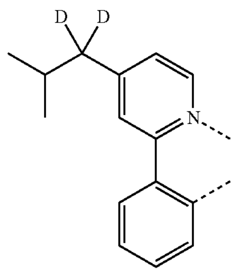
$L_{B188}$
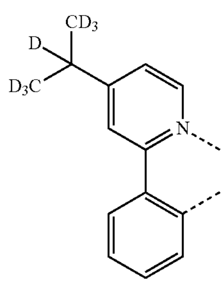
$L_{B189}$
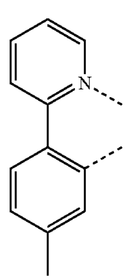
$L_{B190}$
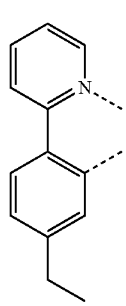
$L_{B191}$
-continued
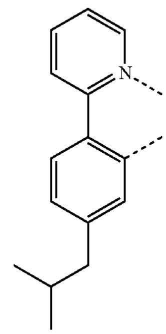
$L_{B192}$
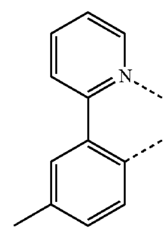
$L_{B193}$
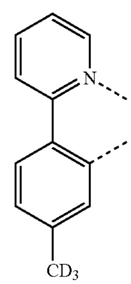
$L_{B194}$
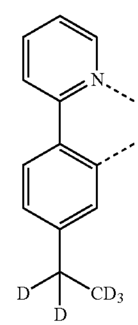
$L_{B195}$
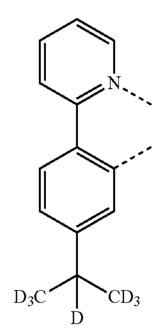
$L_{B196}$ -continued
$L_{B197}$
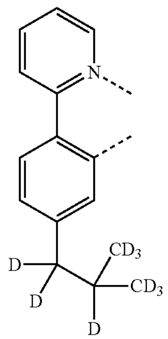
$L_{B198}$
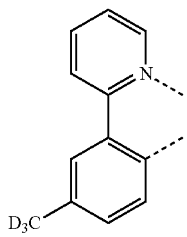
$L_{B199}$
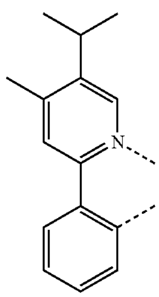
$L_{B200}$
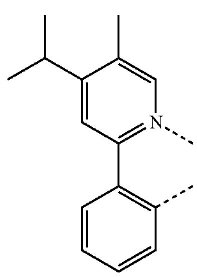
$L_{B201}$
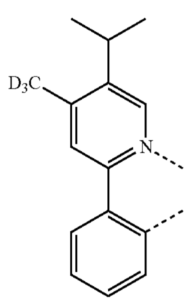
-continued
$L_{B202}$
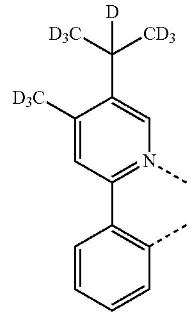
$L_{B203}$
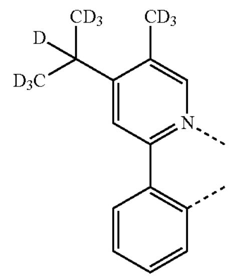
$L_{B204}$
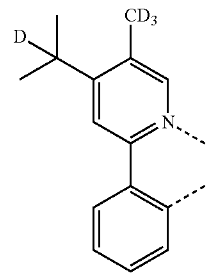
$L_{B205}$
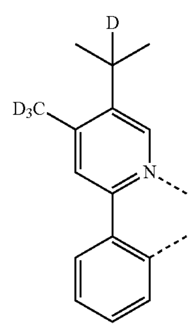
$L_{B206}$
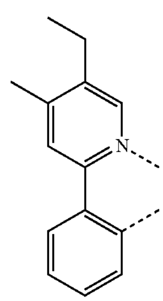

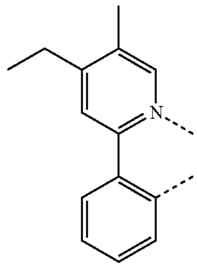
$L_{B207}$
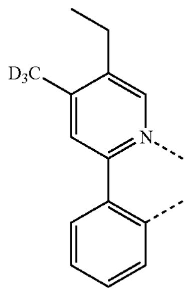
$L_{B208}$
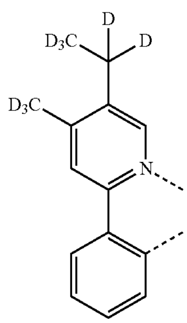
$L_{B209}$
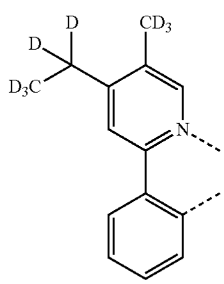
$L_{B210}$
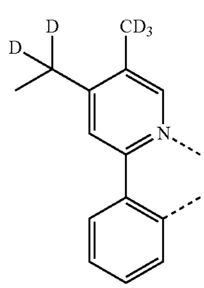
$L_{B211}$
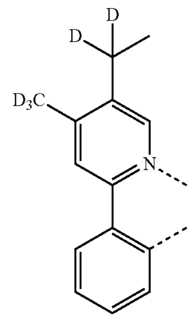
$L_{B212}$
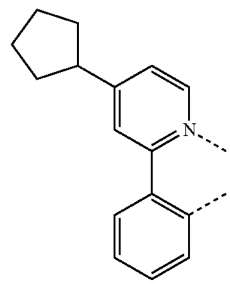
$L_{B213}$
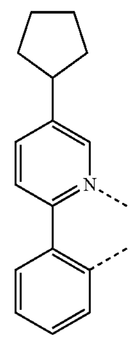
$L_{B214}$
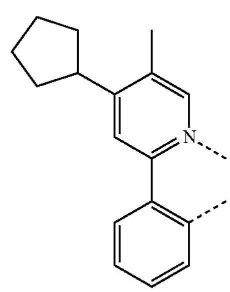
$L_{B215}$
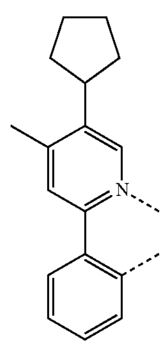
$L_{B216}$ -continued
$L_{B217}$
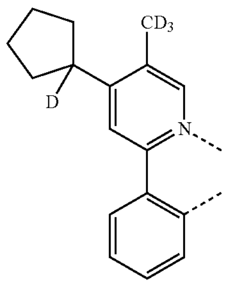
$L_{B218}$
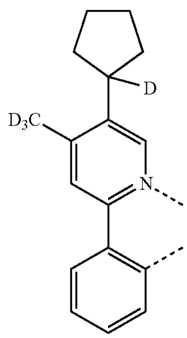
$L_{B219}$
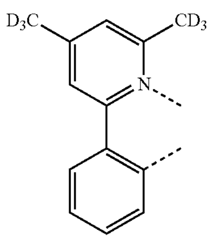
$L_{B220}$
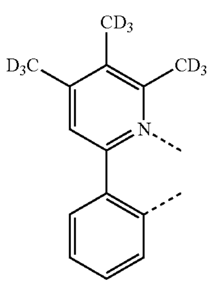
$L_{B221}$
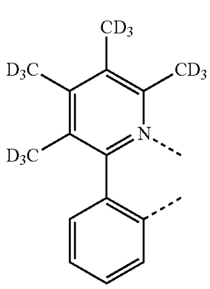
-continued
$L_{B222}$
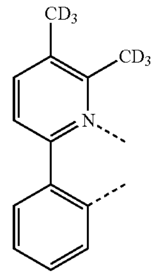
$L_{B223}$
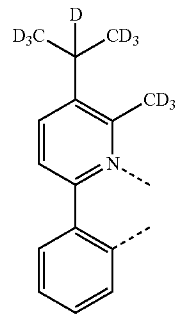
$L_{B224}$
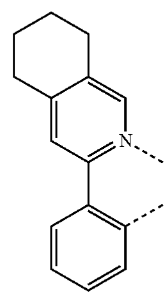
$L_{B225}$
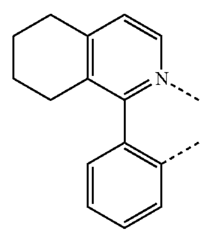
$L_{B226}$
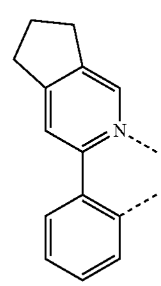

-continued
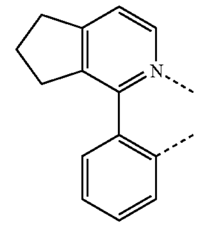
$L_{B227}$
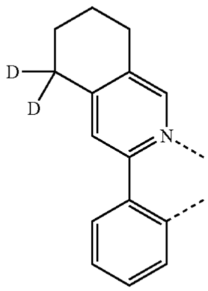
$L_{B228}$
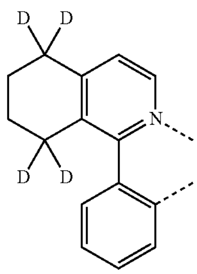
$L_{B229}$
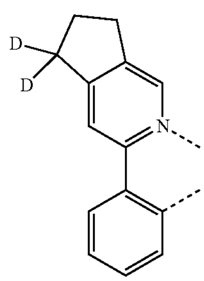
$L_{B230}$
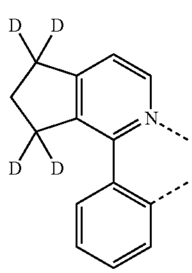
$L_{B231}$
-continued
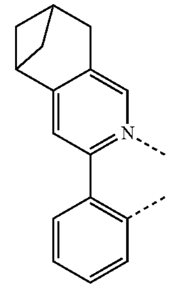
$L_{B232}$
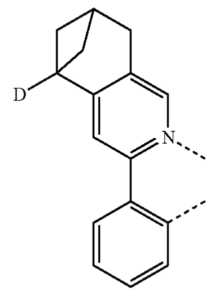
$L_{B233}$
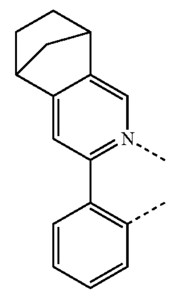
$L_{B234}$
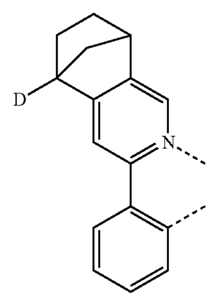
$L_{B235}$
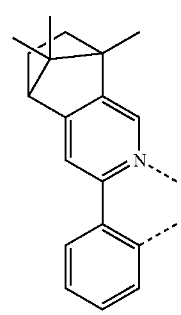
$L_{B236}$ -continued
$L_{B237}$
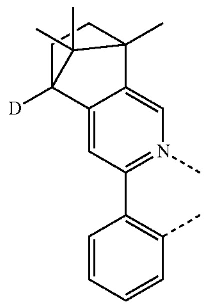
$L_{B238}$
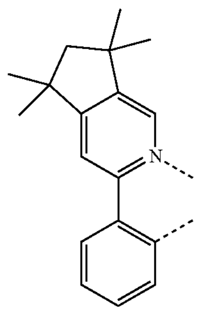
$L_{B239}$
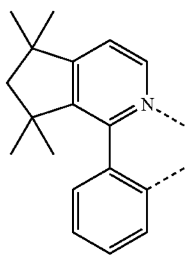
$L_{B240}$
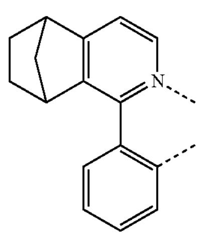
$L_{B241}$
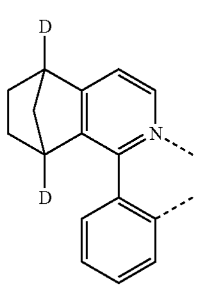
-continued
$L_{B242}$
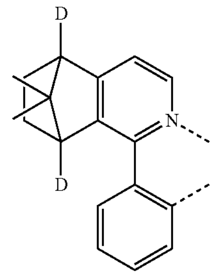
$L_{B243}$
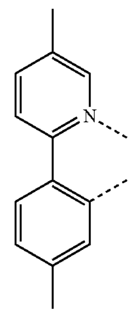
$L_{B244}$
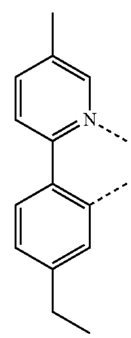
$L_{B245}$
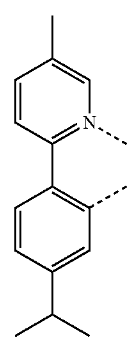
$L_{B246}$
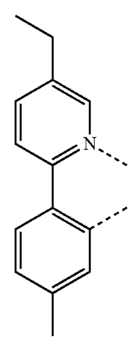

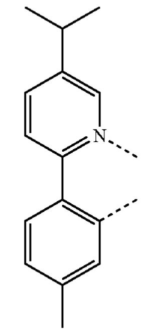
$L_{B247}$
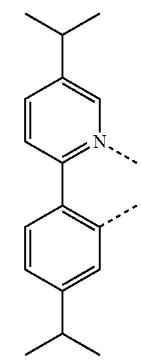
$L_{B248}$
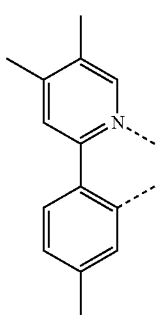
$L_{B249}$
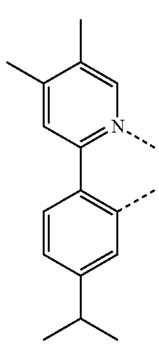
$L_{B250}$
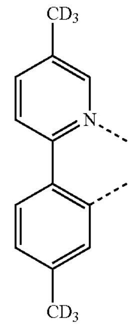
$L_{B251}$
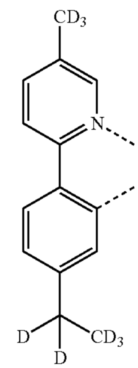
$L_{B252}$
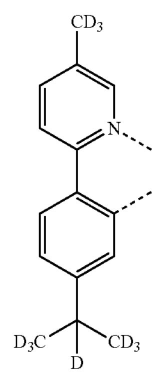
$L_{B253}$
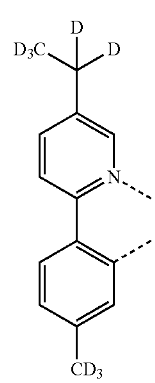
$L_{B254}$ -continued
$L_{B255}$
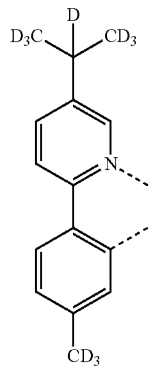
$L_{B256}$
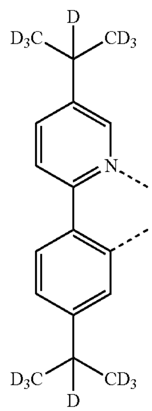
$L_{B257}$
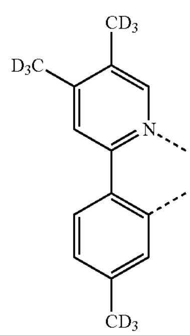
$L_{B258}$
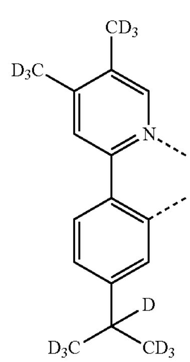
-continued
$L_{B259}$
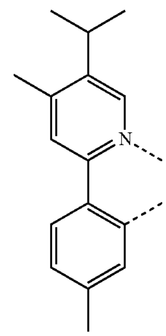
$L_{B260}$
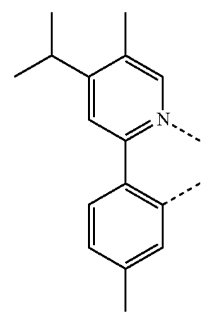
$L_{B261}$
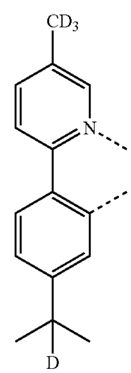
$L_{B262}$
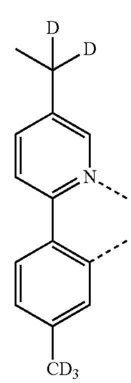

-continued
L$_{B263}$
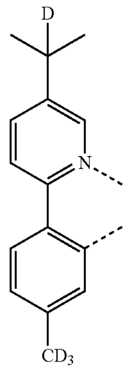
L$_{B264}$
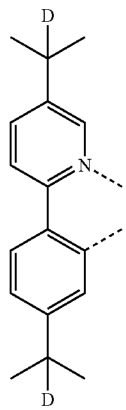
L$_{B265}$
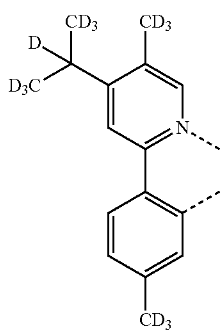
L$_{B266}$
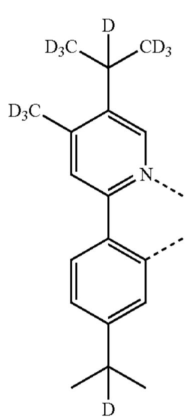
-continued
L$_{B267}$
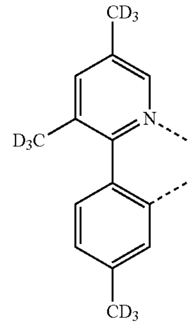
L$_{B268}$
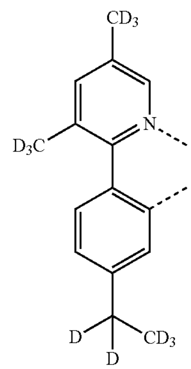
L$_{B269}$
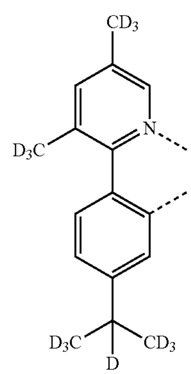
L$_{B270}$
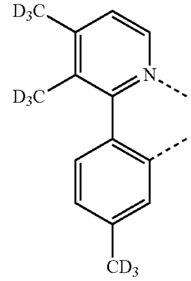

$L_{B271}$
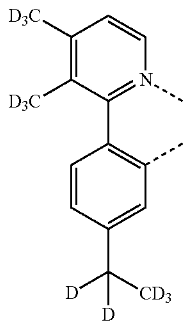
$L_{B272}$
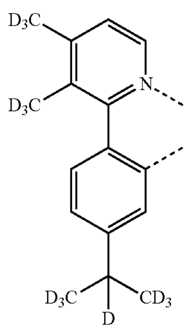
$L_{B273}$
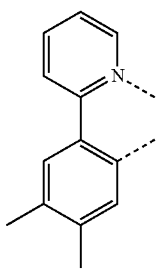
$L_{B274}$
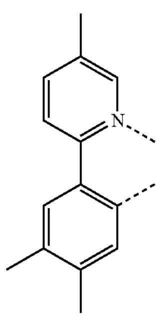
$L_{B275}$
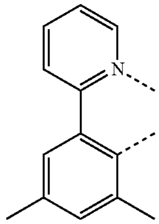
$L_{B276}$
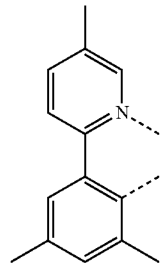
$L_{B277}$
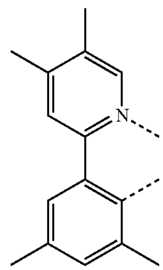
$L_{B278}$
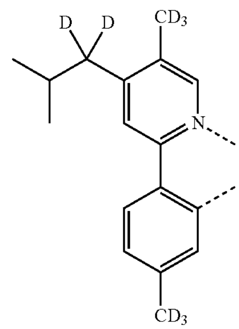
$L_{B279}$
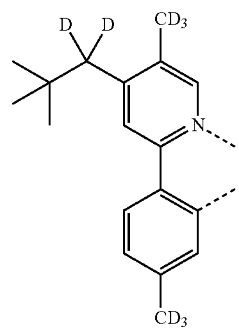
$L_{B280}$
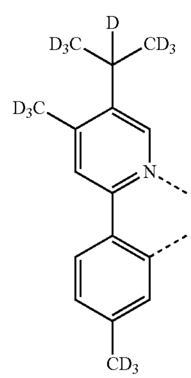

-continued
$L_{B281}$
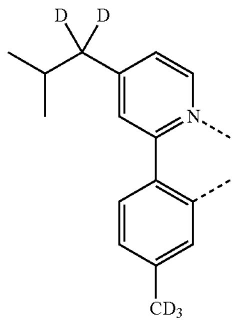
$L_{B282}$
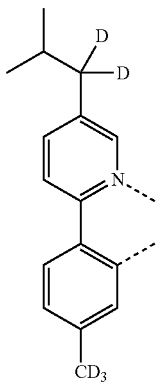
$L_{B283}$
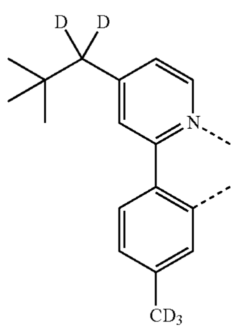
$L_{B284}$
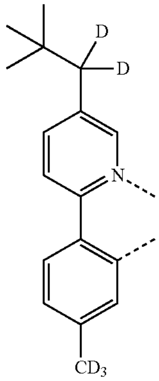
-continued
$L_{B285}$
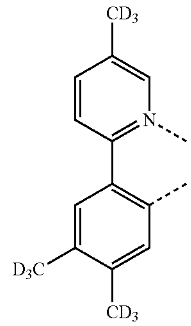
$L_{B286}$
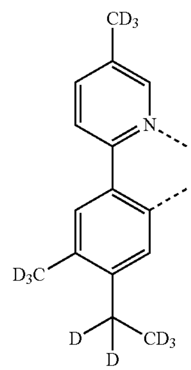
$L_{B287}$
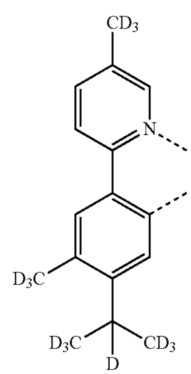
$L_{B288}$
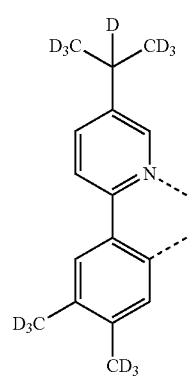

-continued
L$_{B289}$
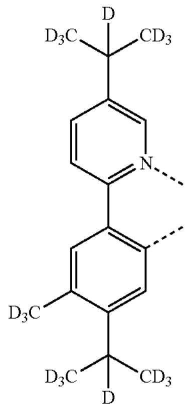
L$_{B290}$
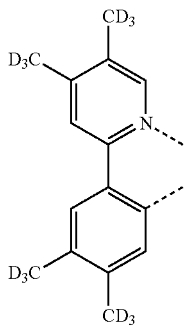
L$_{B291}$
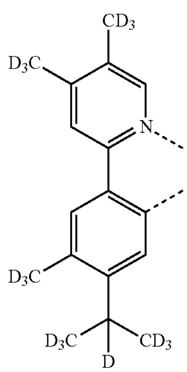
L$_{B292}$
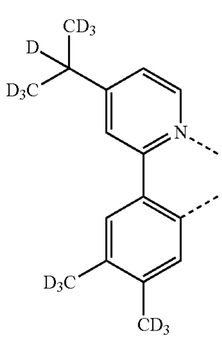
-continued
L$_{B293}$
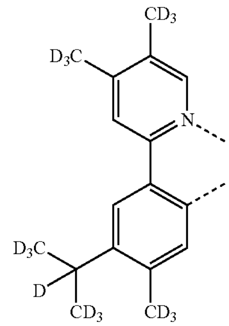
L$_{B294}$
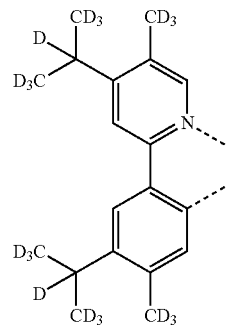
L$_{B295}$
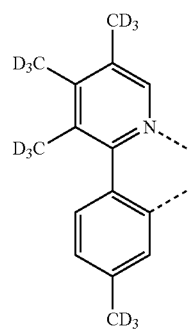
L$_{B296}$
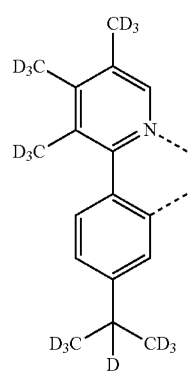

L$_{B297}$
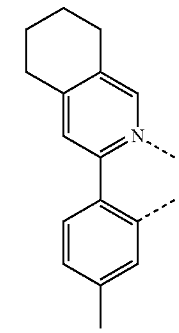
L$_{B298}$
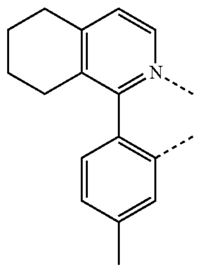
L$_{B299}$
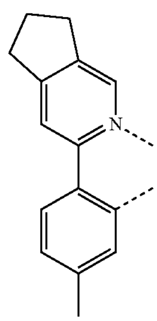
L$_{B300}$
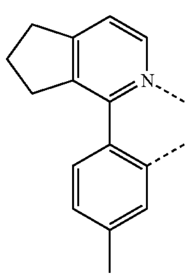
L$_{B301}$
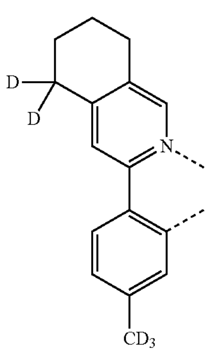
L$_{B302}$
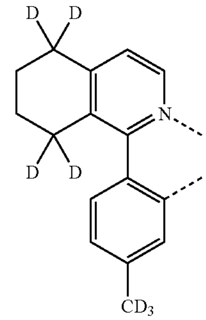
L$_{B303}$
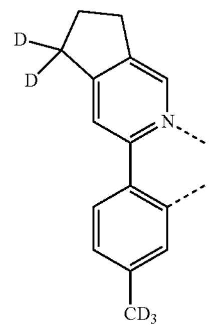
L$_{B304}$
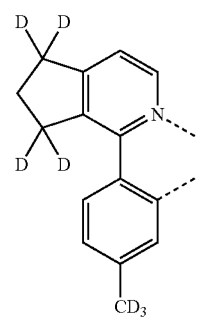
L$_{B305}$
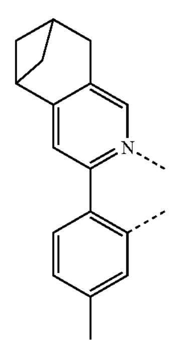

-continued
L$_{B306}$
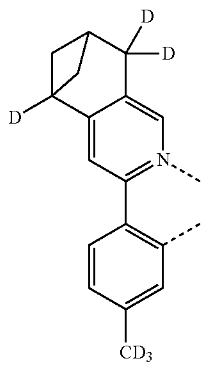
L$_{B307}$
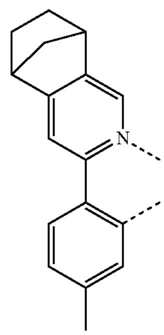
L$_{B308}$
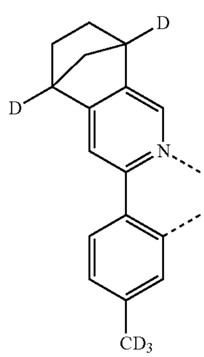
L$_{B309}$
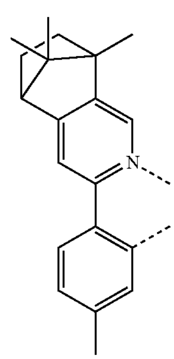
-continued
L$_{B310}$
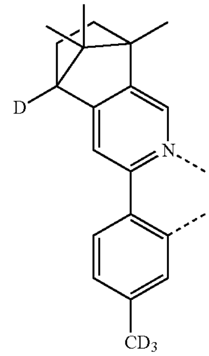
L$_{B311}$
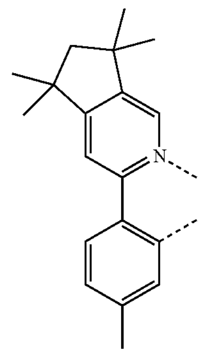
L$_{B312}$
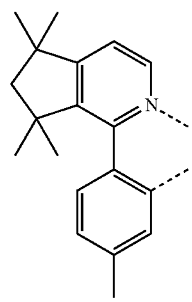
L$_{B313}$
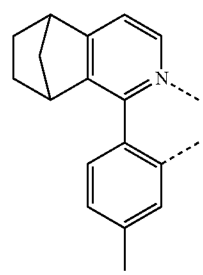
L$_{B314}$
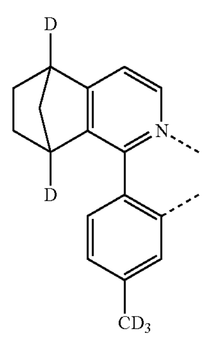

$L_{B315}$
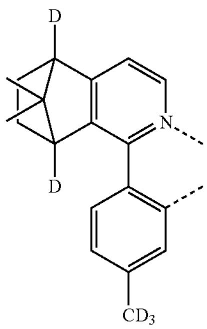
$L_{B316}$
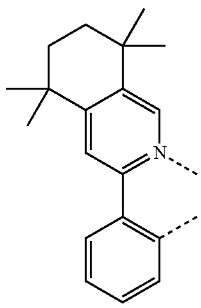
$L_{B317}$
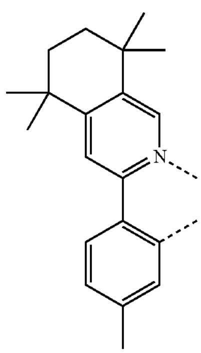
$L_{B318}$
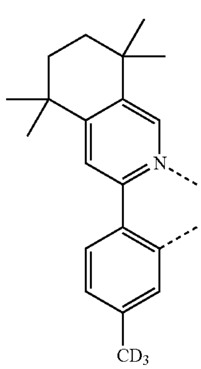
$L_{B319}$
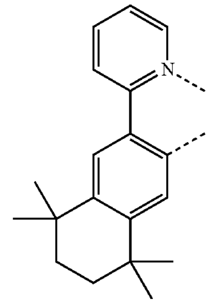
$L_{B320}$
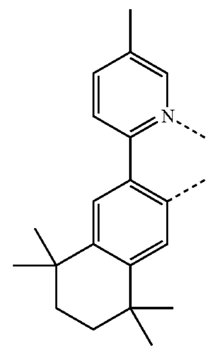
$L_{B321}$
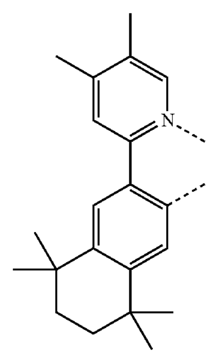
$L_{B322}$
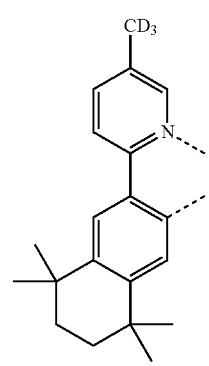

-continued
$L_{B323}$
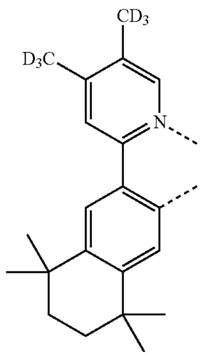
$L_{B324}$
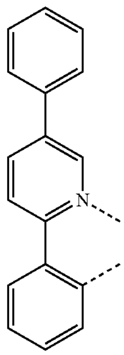
$L_{B325}$
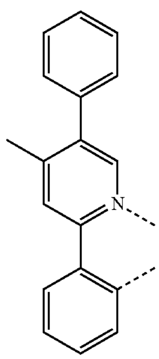
$L_{B326}$
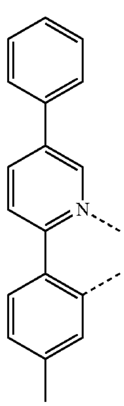
-continued
$L_{B327}$
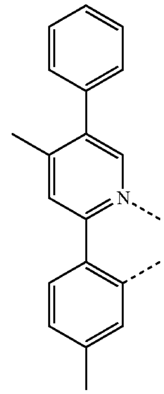
$L_{B328}$
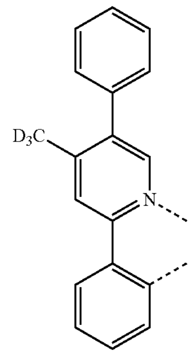
$L_{B329}$
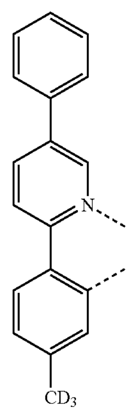
$L_{B330}$
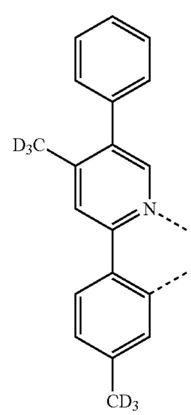

-continued
$L_{B331}$
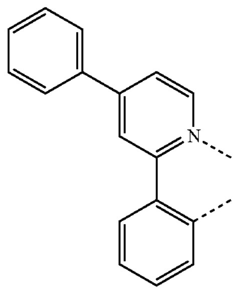
$L_{B332}$
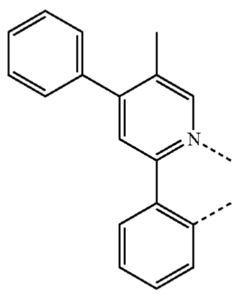
$L_{B333}$
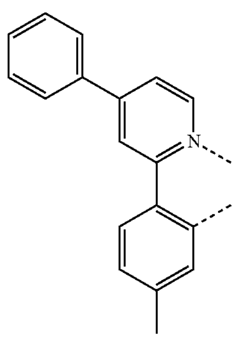
$L_{B334}$
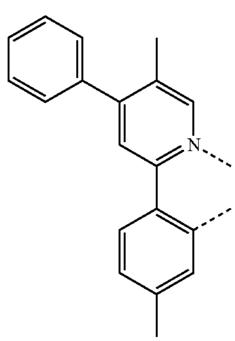
$L_{B335}$
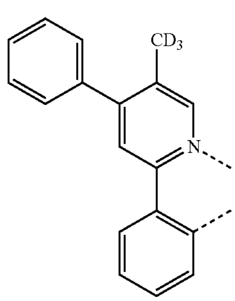
-continued
$L_{B336}$
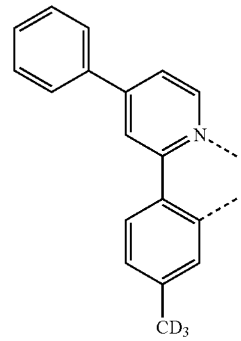
$L_{B337}$
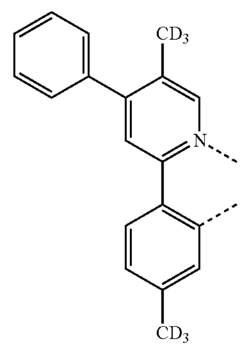
$L_{B338}$
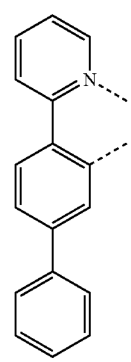
$L_{B339}$
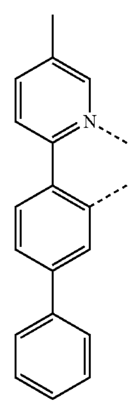

-continued
L$_{B340}$
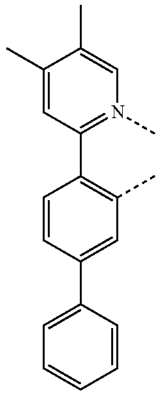
L$_{B341}$
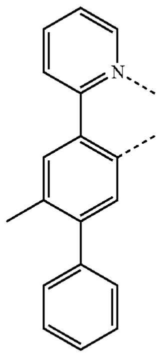
L$_{B342}$
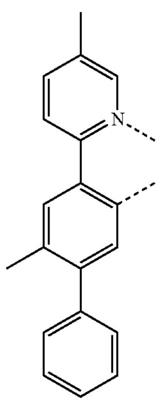
L$_{B343}$
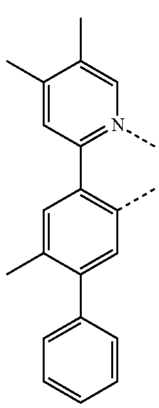
-continued
L$_{B344}$
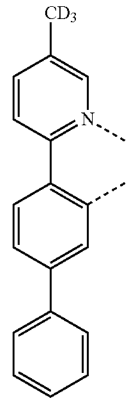
L$_{B345}$
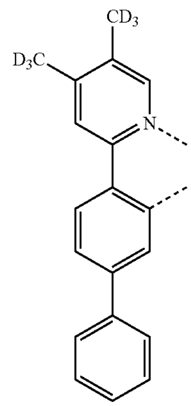
L$_{B346}$
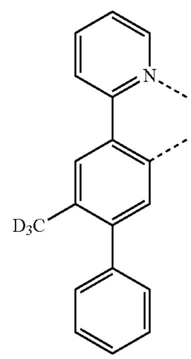
L$_{B347}$
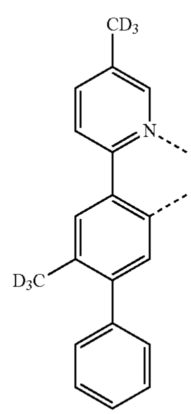

-continued
$L_{B348}$
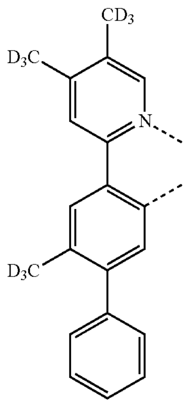
$L_{B349}$
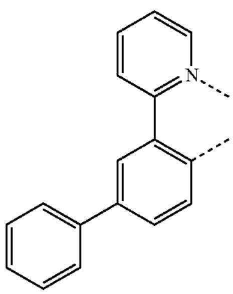
$L_{B350}$
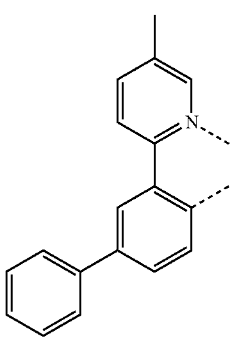
$L_{B351}$
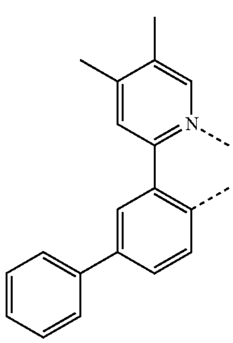
-continued
$L_{B352}$
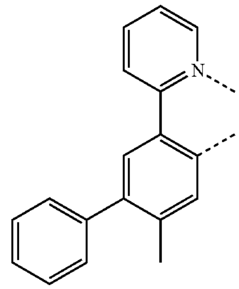
$L_{B353}$
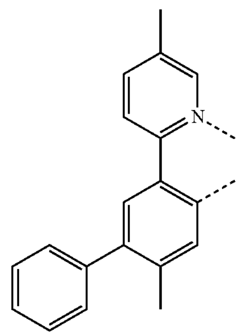
$L_{B354}$
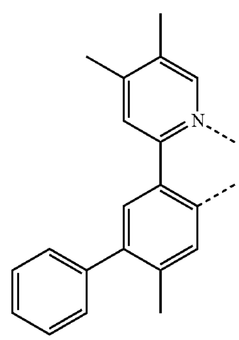
$L_{B355}$
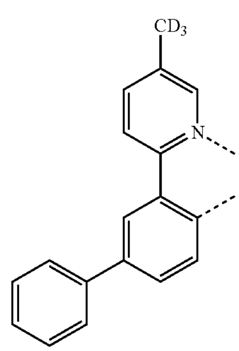

-continued
$L_{B356}$
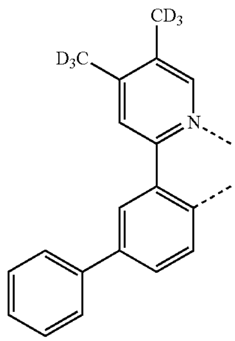
$L_{B357}$
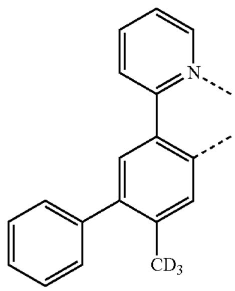
$L_{B358}$
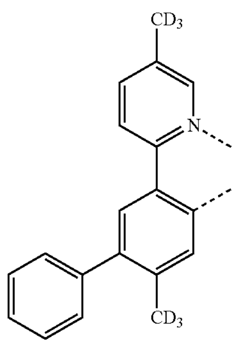
$L_{B359}$
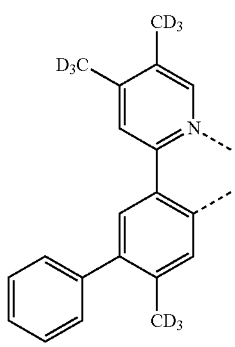
$L_{B360}$
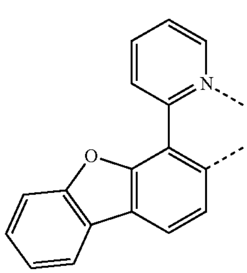
-continued
$L_{B361}$
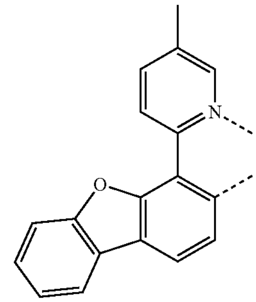
$L_{B362}$
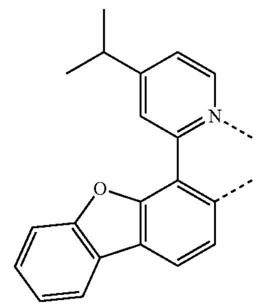
$L_{B363}$
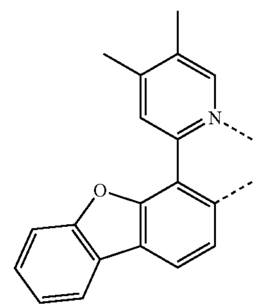
$L_{B364}$
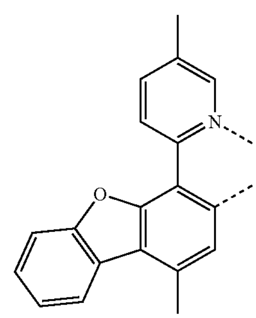
$L_{B365}$
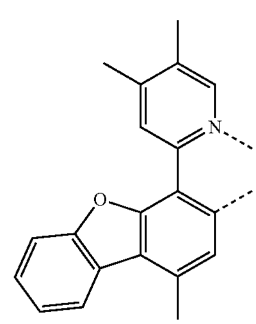

-continued
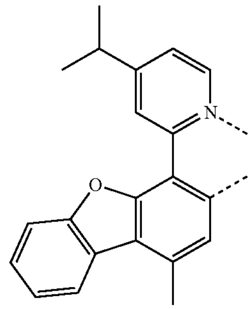
$L_{B366}$
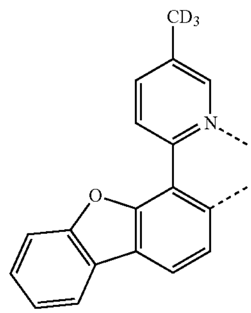
$L_{B367}$
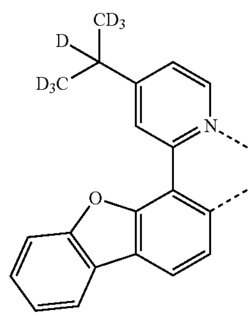
$L_{B368}$
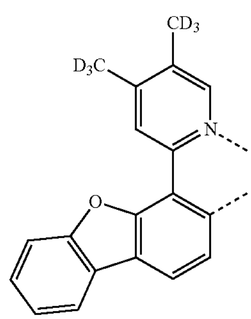
$L_{B369}$
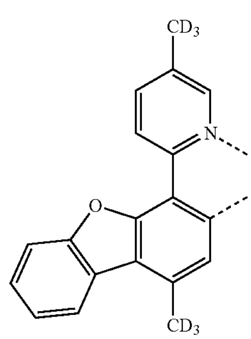
$L_{B370}$
-continued
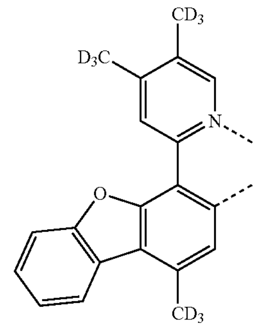
$L_{B371}$
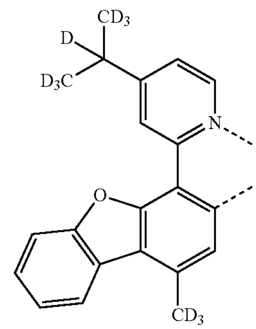
$L_{B372}$
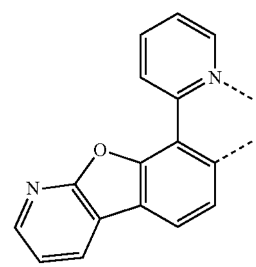
$L_{B373}$
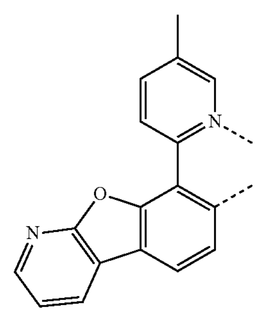
$L_{B374}$
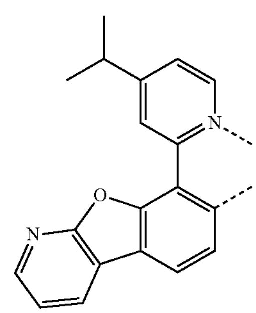
$L_{B375}$ $L_{B376}$
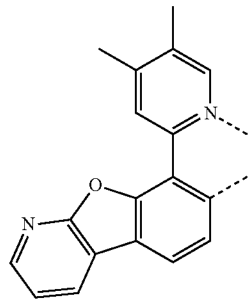
$L_{B377}$
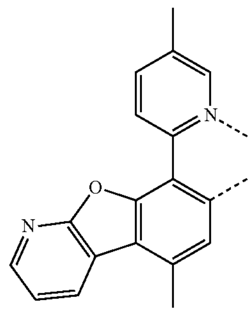
$L_{B378}$
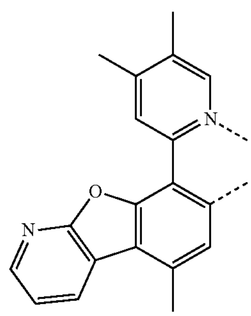
$L_{B379}$
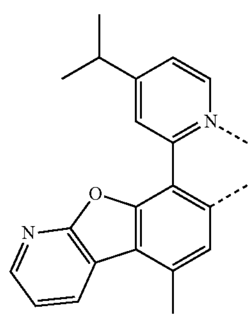
$L_{B380}$
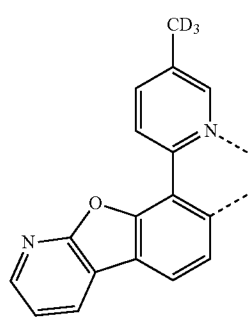
$L_{B381}$
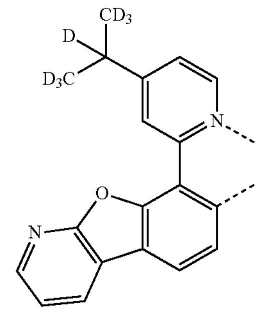
$L_{B382}$
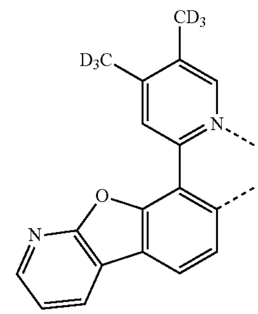
$L_{B383}$
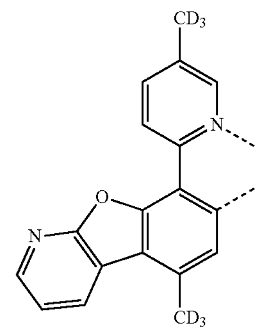
$L_{B384}$
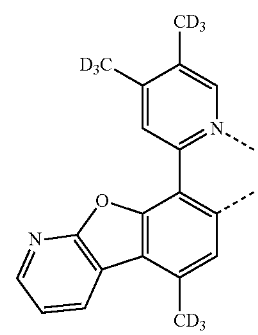
$L_{B385}$
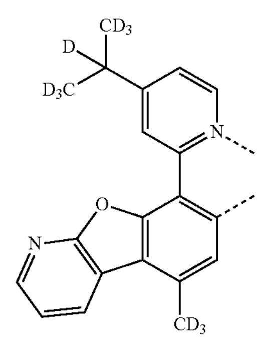

-continued
$L_{B386}$
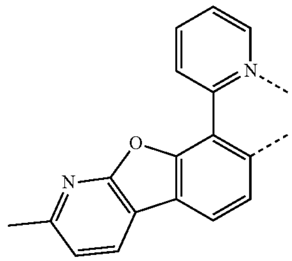
$L_{B387}$
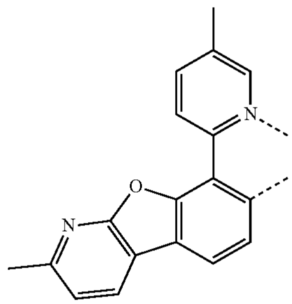
$L_{B388}$
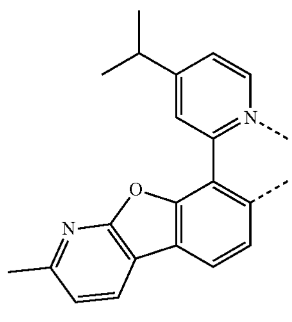
$L_{B389}$
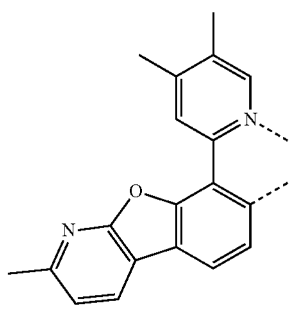
$L_{B390}$
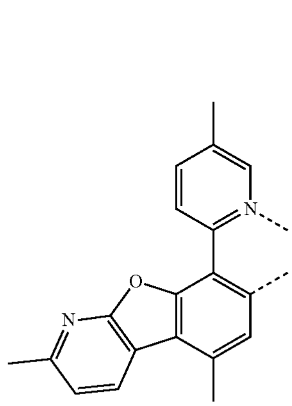
-continued
$L_{B391}$
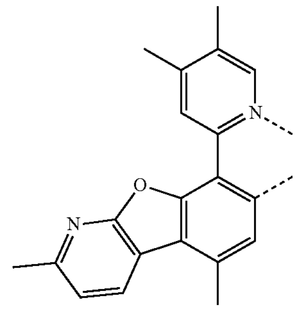
$L_{B392}$
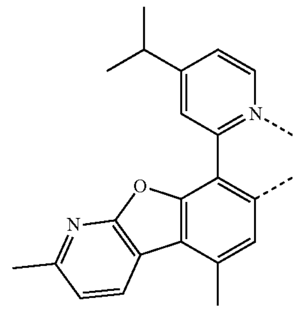
$L_{B393}$
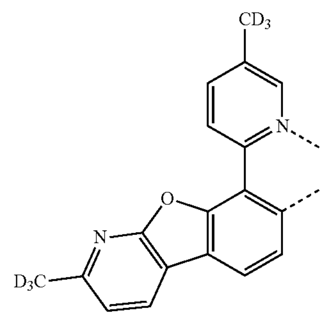
$L_{B394}$
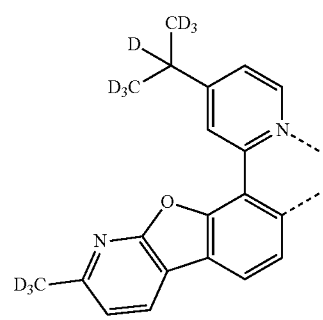
$L_{B395}$
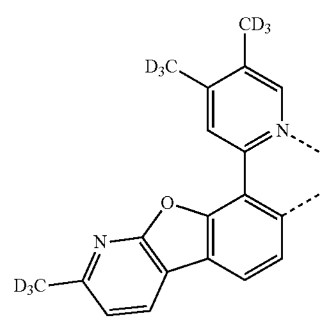

-continued
$L_{B396}$
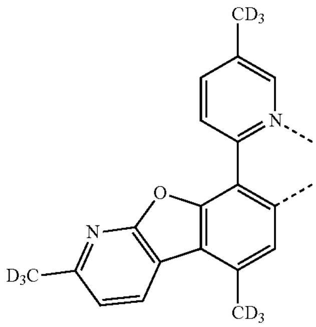
$L_{B397}$
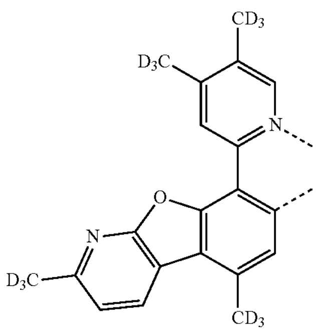
$L_{B398}$
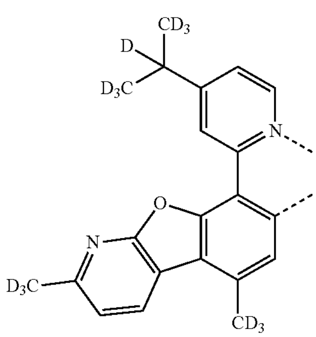
$L_{B399}$
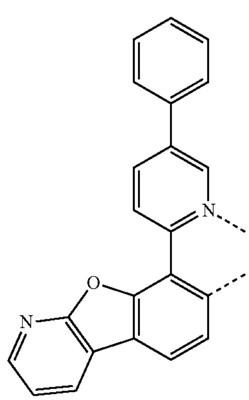
-continued
$L_{B400}$
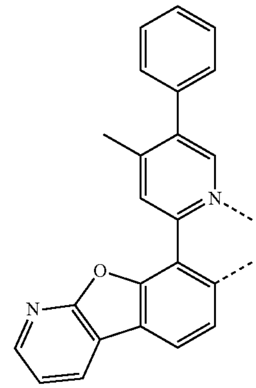
$L_{B401}$
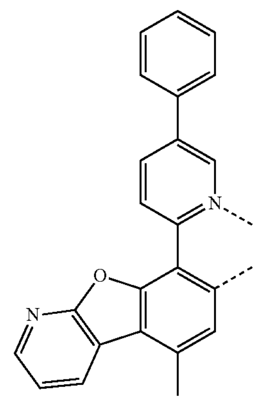
$L_{B402}$
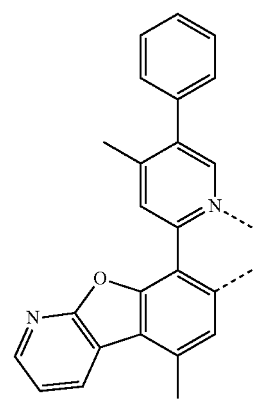
$L_{B403}$
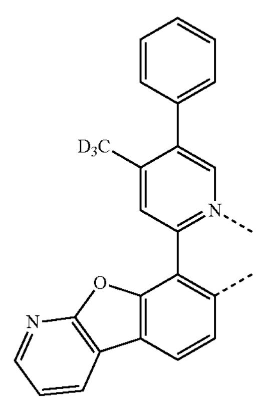

-continued
$L_{B404}$
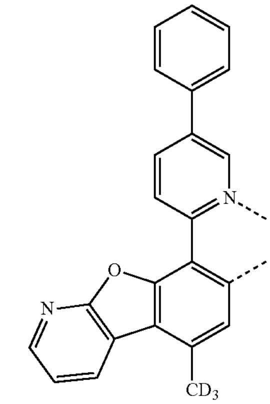
$L_{B405}$
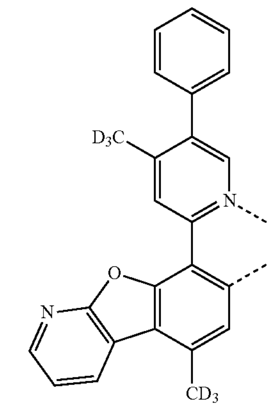
$L_{B406}$
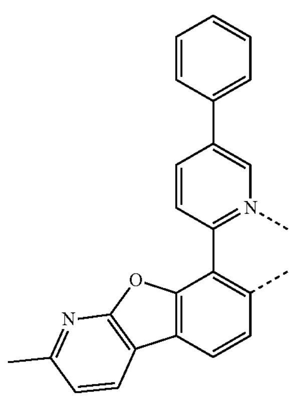
$L_{B407}$
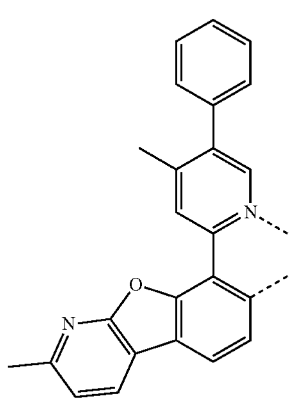
-continued
$L_{B408}$
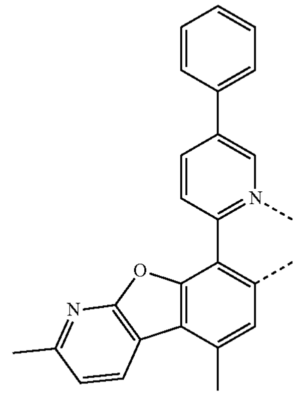
$L_{B409}$
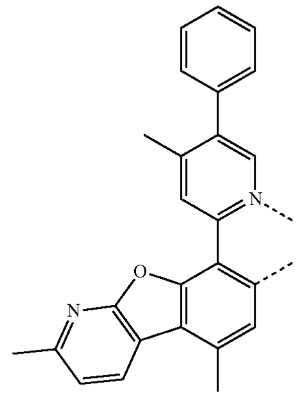
$L_{B410}$
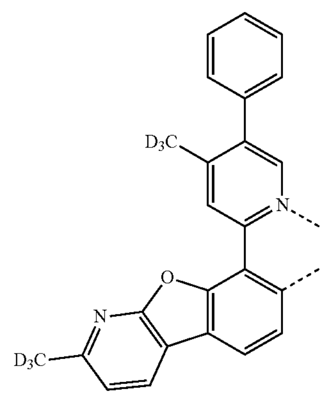
$L_{B411}$
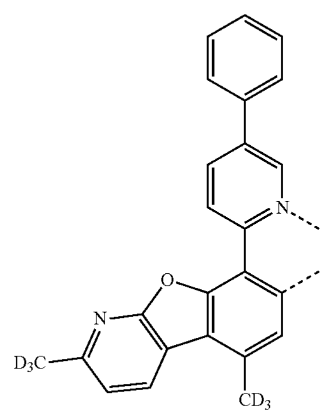

-continued
L$_{B412}$
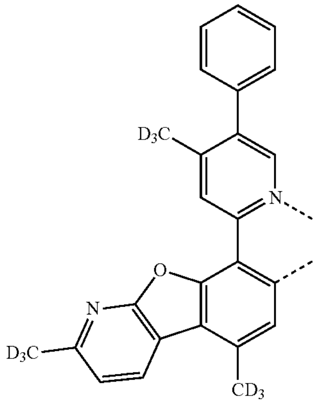
L$_{B413}$
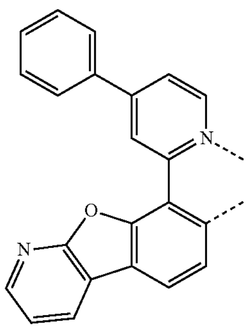
L$_{B414}$
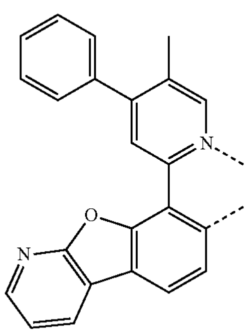
L$_{B415}$
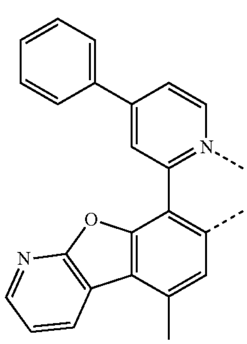
-continued
L$_{B416}$
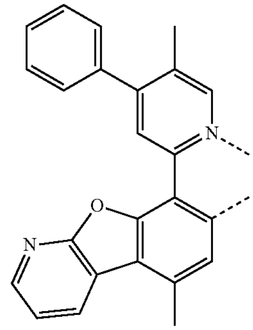
L$_{B417}$
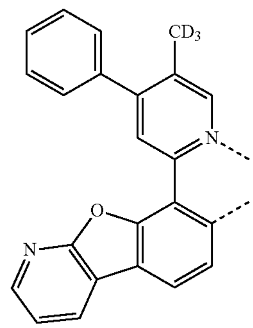
L$_{B418}$
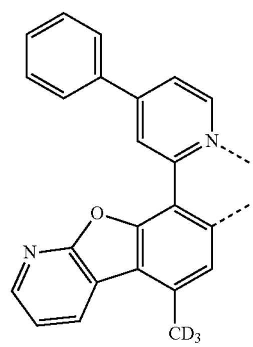
L$_{B419}$
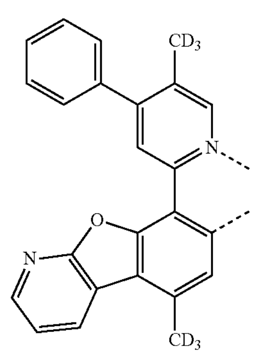

-continued
$L_{B420}$
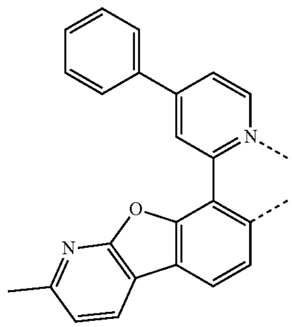
$L_{B421}$
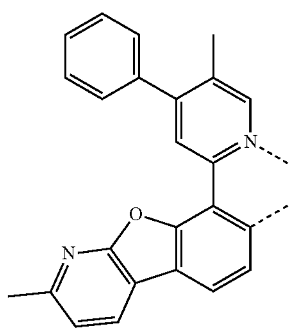
$L_{B422}$
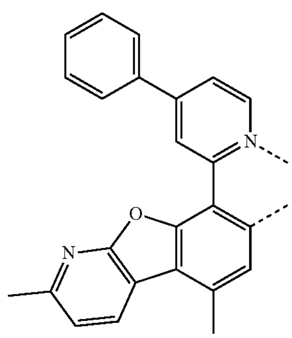
$L_{B423}$
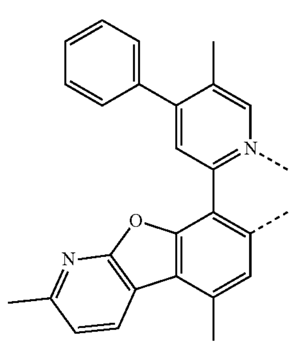
-continued
$L_{B424}$
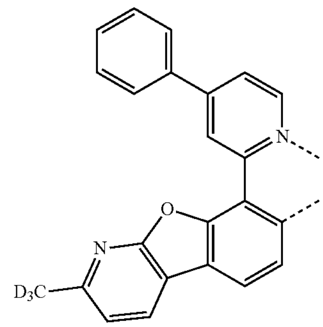
$L_{B425}$
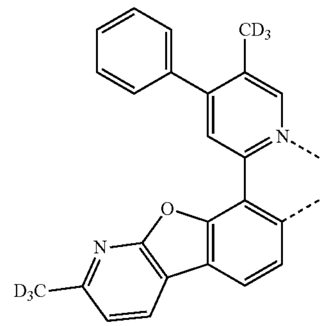
$L_{B426}$
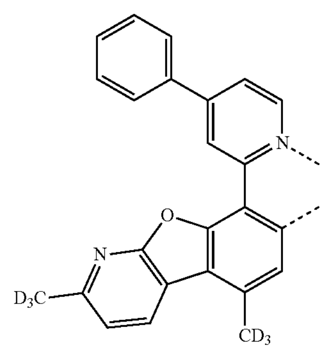
$L_{B427}$
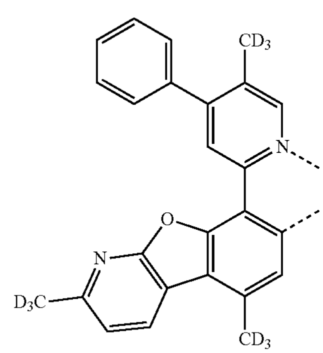
$L_{B428}$
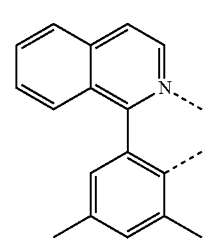

-continued
$L_{B429}$
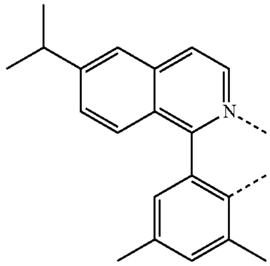
$L_{B430}$
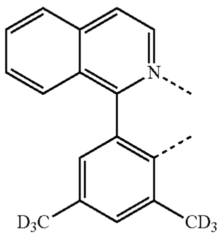
$L_{B431}$
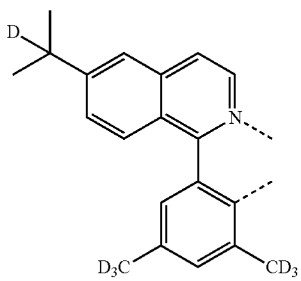
$L_{B432}$
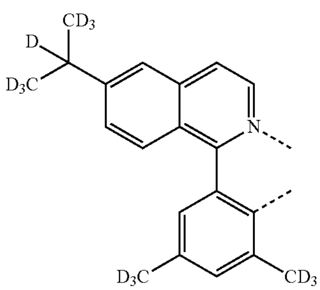
$L_{B433}$
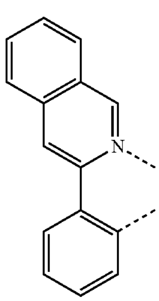
-continued
$L_{B434}$
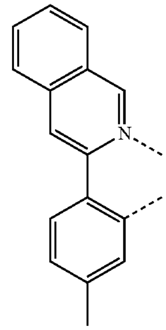
$L_{B435}$
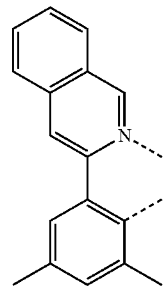
$L_{B436}$
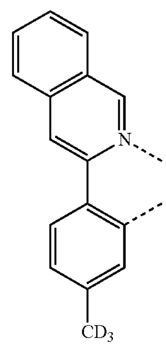
$L_{B437}$
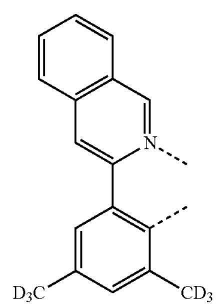
$L_{B438}$
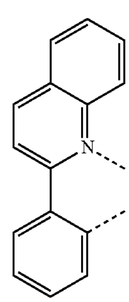

-continued
$L_{B439}$
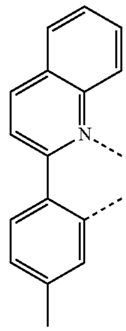
$L_{B440}$
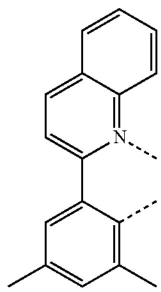
$L_{B441}$
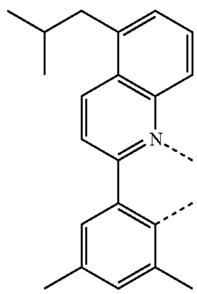
$L_{B442}$
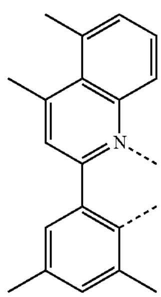
$L_{B443}$
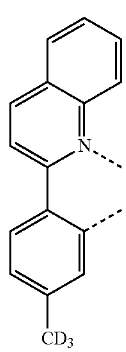
-continued
$L_{B444}$
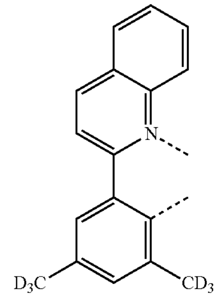
$L_{B445}$
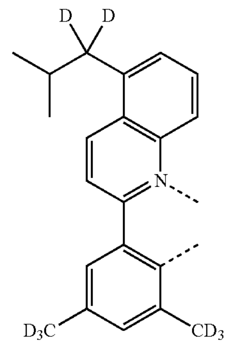
$L_{B446}$
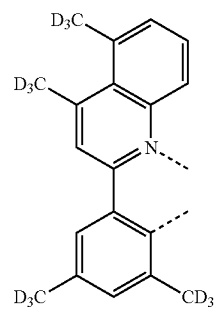
$L_{B447}$
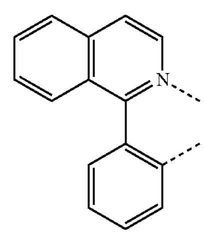
$L_{B448}$
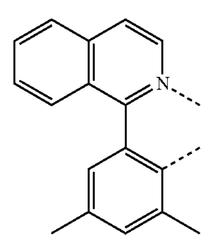

-continued
$L_{B449}$
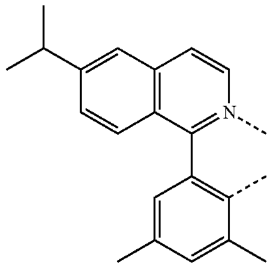
$L_{B450}$
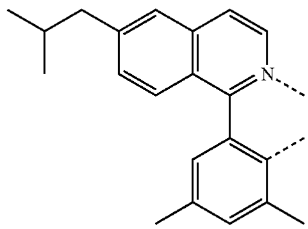
$L_{B451}$
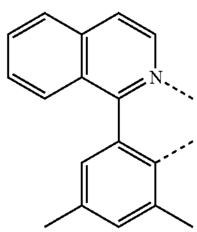
$L_{B452}$
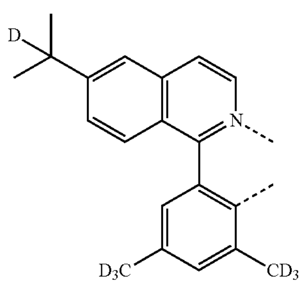
$L_{B453}$
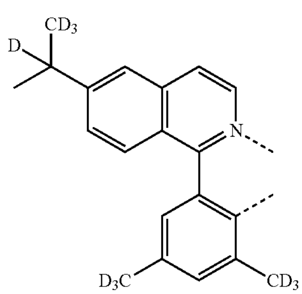
$L_{B454}$
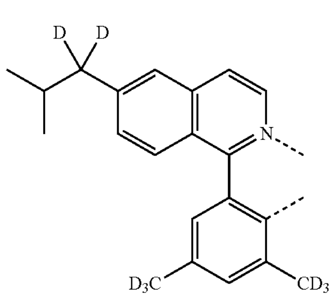
-continued
$L_{B455}$
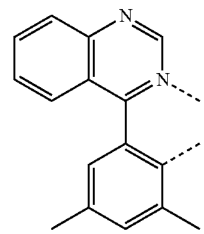
$L_{B456}$
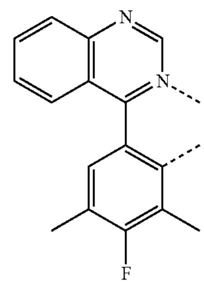
$L_{B457}$
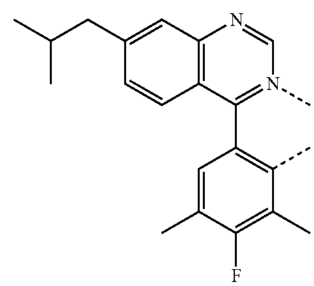
$L_{B458}$
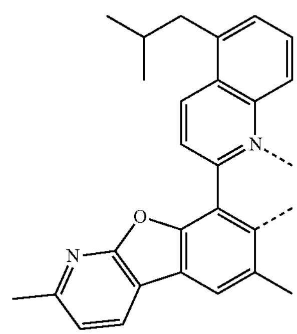
$L_{B459}$
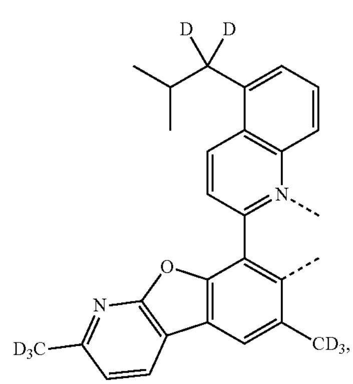
and -continued
$L_{B460}$
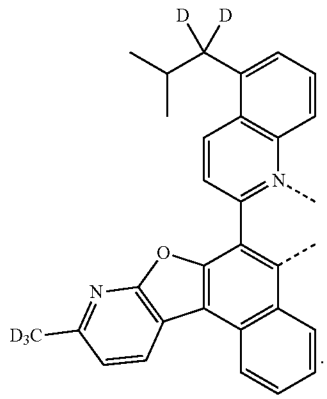
13. The compound of claim 1, wherein each L is independently selected from the group consisting of:
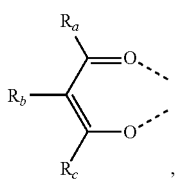
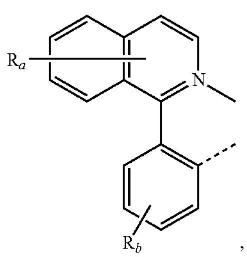
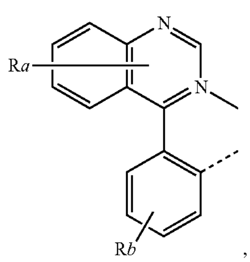
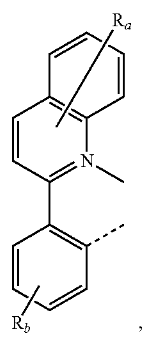
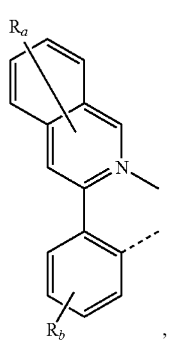
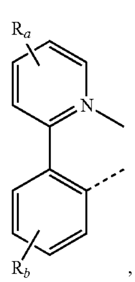
-continued
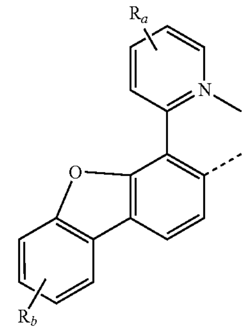
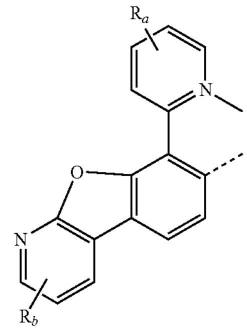
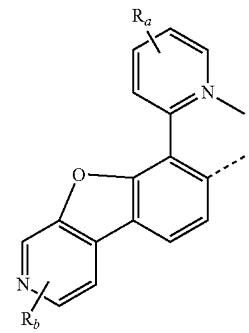
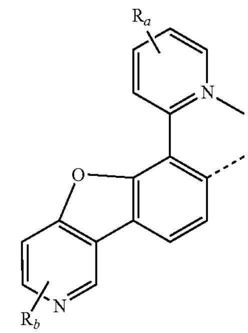
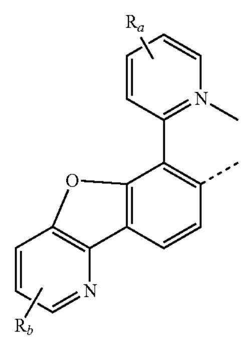
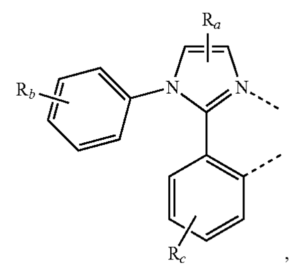
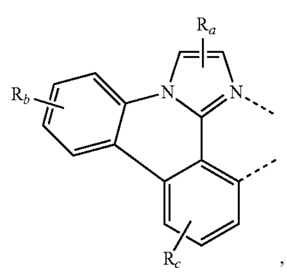
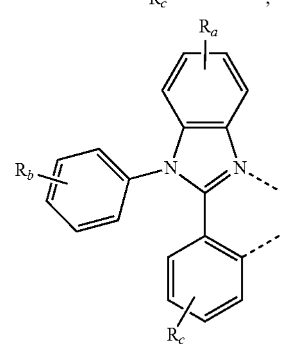
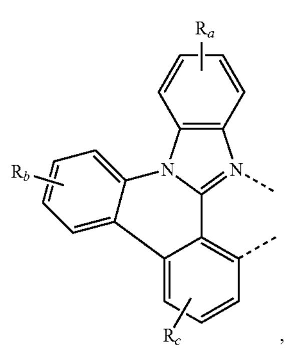
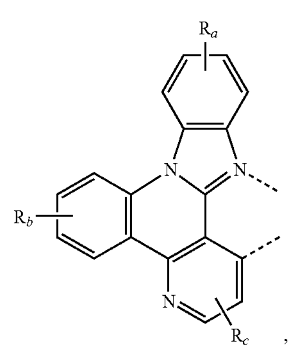

-continued

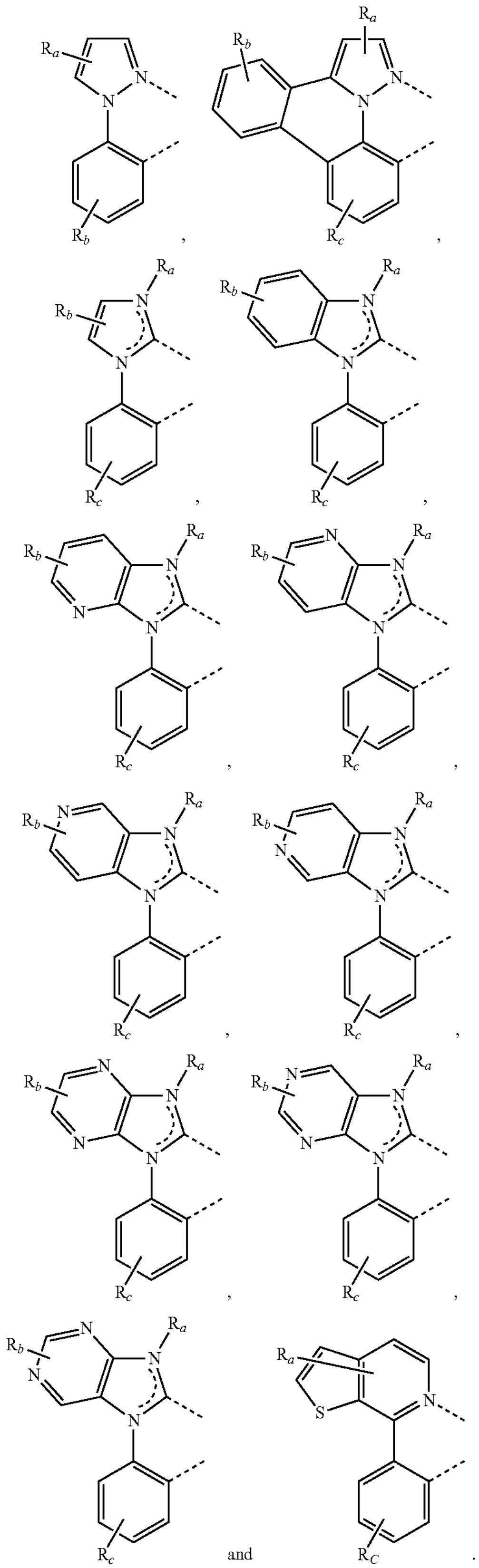

14. A formulation comprising a compound according to claim 1.

15. An organic light emitting device (OLED) comprising:

an anode;

a cathode; and an organic layer, disposed between the anode and the cathode, comprising a compound having Formula I Formula I

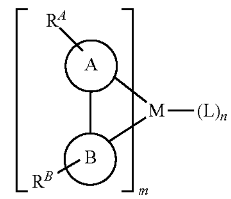

wherein A is a fused ring system comprising a six-membered ring, which is fused to a five-membered ring, wherein the five-membered ring is fused to a second five-membered ring and the second five-membered ring is not a pyrazole ring;

wherein B is a five-membered or six-membered carbocyclic or heterocyclic ring;

wherein A and B are connected by a single bond between a carbon atom of A and an atom of B;

wherein each $R^A$ and $R^B$ independently represents mono to the possible maximum number of substitution, or no substitution;

wherein each $R^A$ and $R^B$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein M is a metal having an atomic weight greater than 40;

wherein A is coordinated to M by a non-carbene dative bond;

wherein B is coordinated to M by a polar covalent bond between a carbon atom and M;

wherein M is bonded to one of the five-membered rings of A;

wherein L is a substituted or unsubstituted cyclometalated ligand, and each L can be the same or different; and wherein m is at least 1, and m+n is the maximum number of ligands that may be attached to M.

16. The OLED of claim 15, wherein the organic layer is an emissive layer and the compound is an emissive dopant or a non-emissive dopant.

17. The OLED of claim 15, wherein the organic layer further comprises a host, wherein the host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

18. A consumer product comprising the OLED of claim 15.

19. The consumer product of claim 18, wherein the consumer product is selected from the group consisting of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, and a sign.

20. An organic light emitting device (OLED) comprising:

an anode;

a cathode; and an organic layer, disposed between the anode and the cathode, comprising a compound having Formula I Formula I

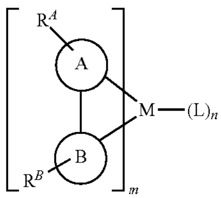

wherein A is a fused ring system comprising a six-membered ring, which is fused to a five-membered ring, wherein the five-membered ring is fused to a second five-membered ring;

wherein B is a five-membered or six-membered carbocyclic or heterocyclic ring;

wherein A and B are connected by a single bond between a carbon atom of A and an atom of B;

wherein each $R^A$ and $R^B$ independently represents mono to the possible maximum number of substitution, or no substitution;

wherein each $R^A$ and $R^B$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein M is a metal having an atomic weight greater than 40;

wherein A is coordinated to M by a non-carbene dative bond;

wherein B is coordinated to M by a polar covalent bond between a carbon atom and M;

wherein M is bonded to one of the five-membered rings of A;

wherein L is a substituted or unsubstituted cyclometalated ligand, and each L can be the same or different and wherein m is at least 1, and m+n is the maximum number of ligands that may be attached to M; and wherein the organic layer further comprises a host, wherein the host is selected from the group consisting of:

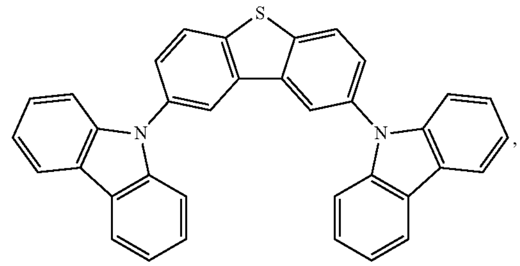

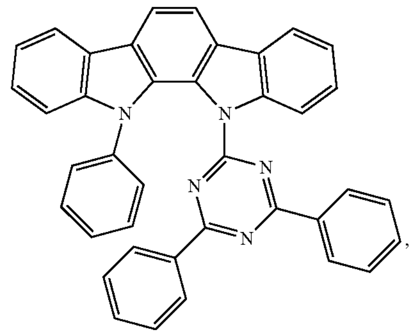

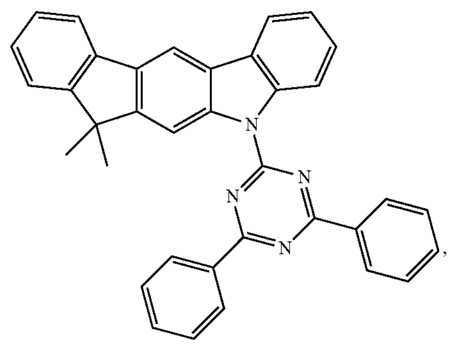

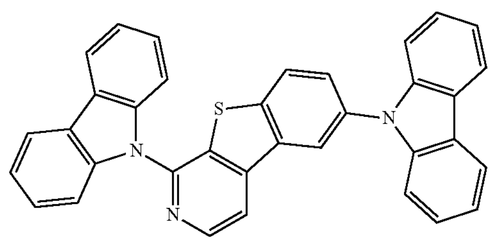

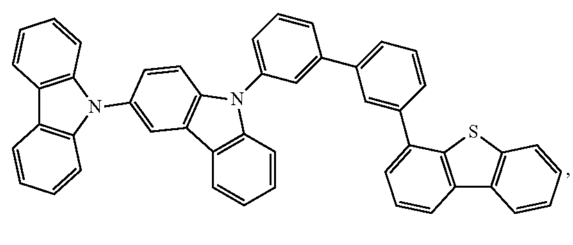

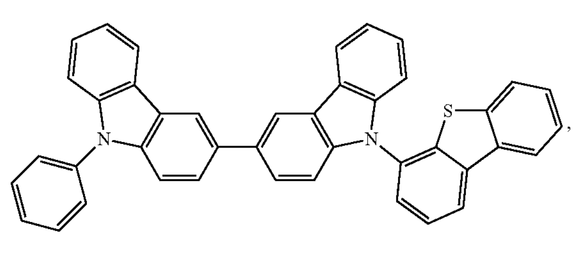

-continued
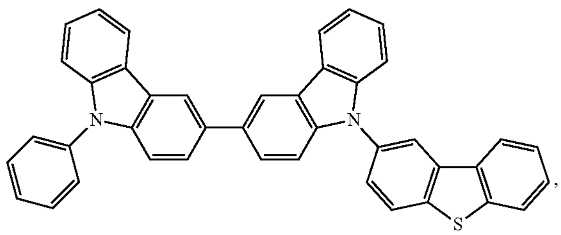
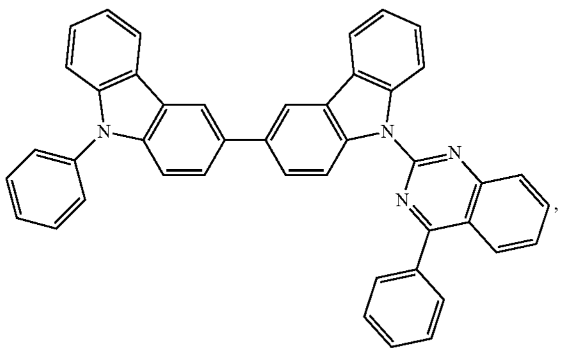
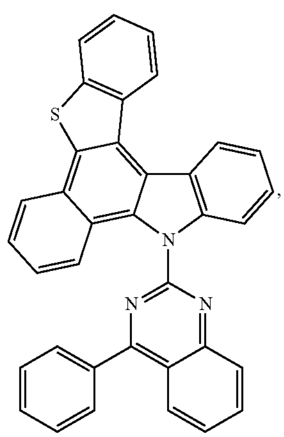
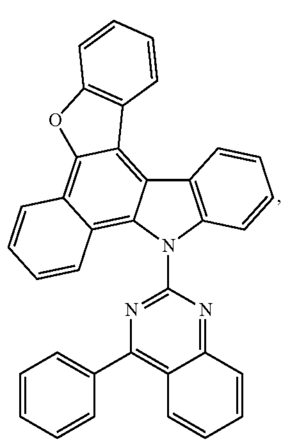
-continued
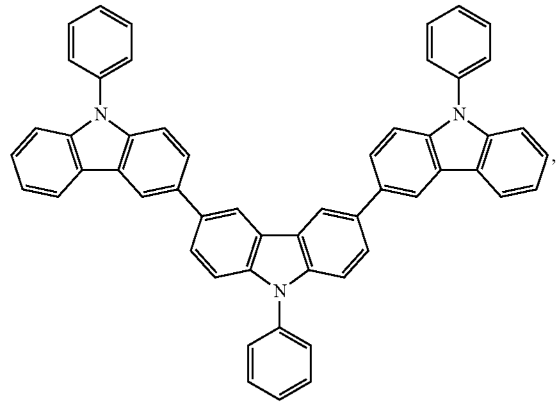
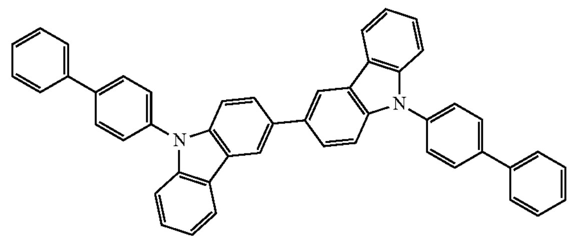
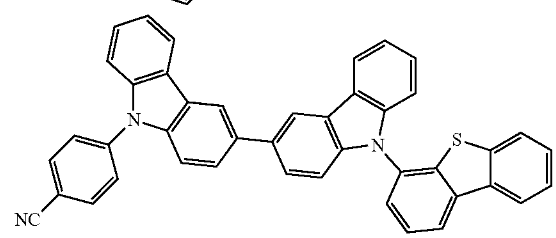
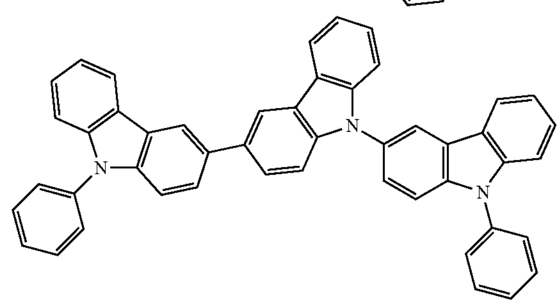
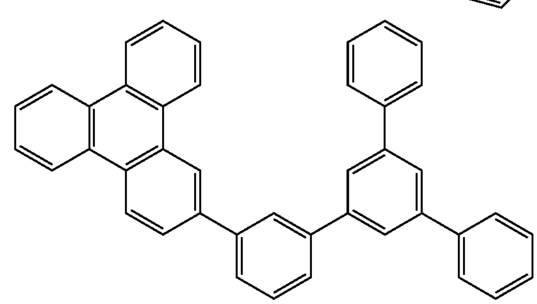
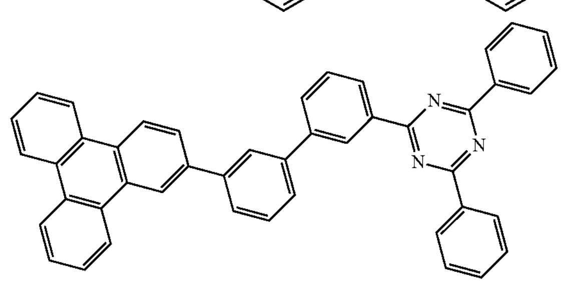

-continued
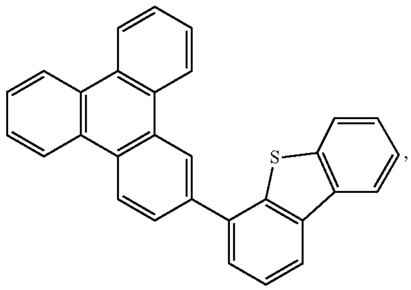
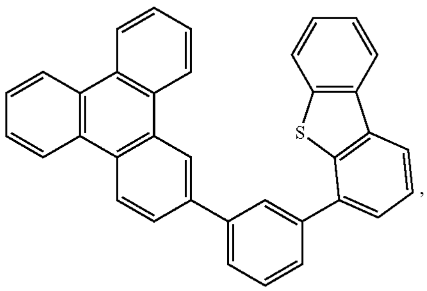
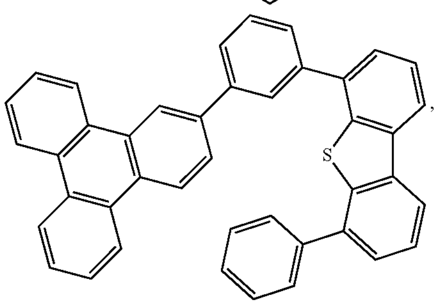
-continued
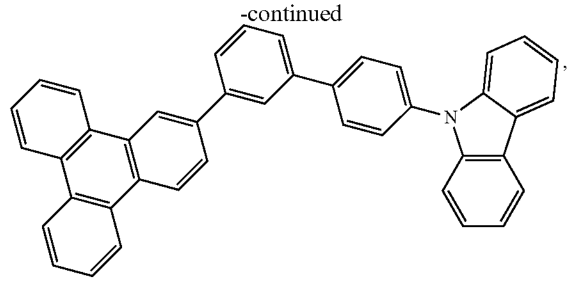
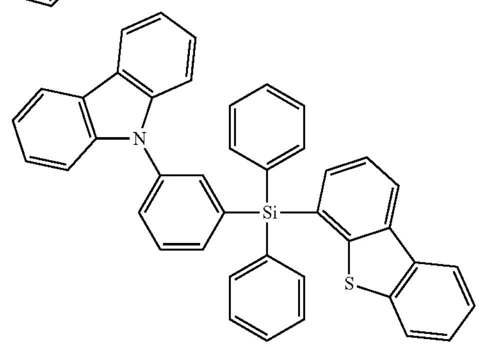
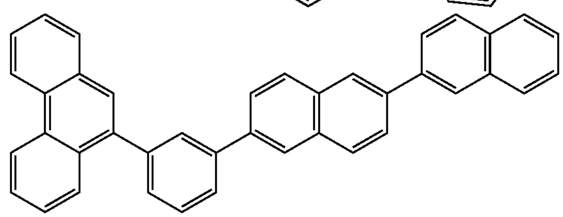
and combinations thereof.
* * * * *